US008273610B2

(12) United States Patent
Or-Bach et al.

(10) Patent No.: US 8,273,610 B2
(45) Date of Patent: Sep. 25, 2012

(54) METHOD OF CONSTRUCTING A SEMICONDUCTOR DEVICE AND STRUCTURE

(75) Inventors: Zvi Or-Bach, San Jose, CA (US); Deepak C. Sekar, San Jose, CA (US); Brian Cronquist, San Jose, CA (US); Israel Beinglass, Sunnyvale, CA (US); Ze'ev Wurman, Palo Alto, CA (US); Paul Lim, Fremont, CA (US)

(73) Assignee: MonolithIC 3D Inc., San Jose, CA (US)

( * ) Notice: Subject to any disclaimer, the term of this patent is extended or adjusted under 35 U.S.C. 154(b) by 0 days.

(21) Appl. No.: 13/273,712

(22) Filed: Oct. 14, 2011

(65) Prior Publication Data

US 2012/0129301 A1 May 24, 2012

Related U.S. Application Data

(63) Continuation-in-part of application No. 13/016,313, filed on Jan. 28, 2011, which is a continuation-in-part of application No. 12/970,602, filed on Dec. 16, 2010, which is a continuation-in-part of application No. 12/949,617, filed on Nov. 18, 2010.

(51) Int. Cl.

| | |
|---|---|
| *H01L 21/335* | (2006.01) |
| *H01L 21/8238* | (2006.01) |
| *H01L 21/30* | (2006.01) |

(52) U.S. Cl. . 438/142; 438/199; 438/458; 257/E23.101; 257/E23.106

(58) Field of Classification Search .................. 438/142, 438/199, 455; 257/E23.101, E23.106
See application file for complete search history.

(56) References Cited

U.S. PATENT DOCUMENTS

| | | | |
|---|---|---|---|
| 3,007,090 | A | 10/1961 | Rutz |
| 3,819,959 | A | 6/1974 | Chang et al. |
| 4,197,555 | A | 4/1980 | Uehara et al. |
| 4,400,715 | A | 8/1983 | Barbee et al. |
| 4,487,635 | A | 12/1984 | Kugimiya et al. |
| 4,522,657 | A | 6/1985 | Rohatgi et al. |
| 4,643,950 | A | 2/1987 | Ogura et al. |
| 4,704,785 | A | 11/1987 | Curran |

(Continued)

FOREIGN PATENT DOCUMENTS

EP 1267594 A2 12/2002

(Continued)

OTHER PUBLICATIONS

Fabrication of Three-Dimensional IC Using "CUmulatively Bonded IC" (CUBIC) Technology, Y. Hayashi, et al, pp. 95-96, 1990 Symposium on VLSI Technology, IEEE (1990).*

(Continued)

*Primary Examiner* — Kevin Parendo
(74) *Attorney, Agent, or Firm* — Venable LLP; Michael A. Satori; Steven J. Schwarz

(57) ABSTRACT

A method of manufacturing a semiconductor device, the method including, providing a first monocrystalline layer including semiconductor regions, overlaying the first monocrystalline layer with an isolation layer, transferring a second monocrystalline layer comprising semiconductor regions to overlay the isolation layer, wherein the first monocrystalline layer and the second monocrystalline layer are formed from substantially different crystal materials; and subsequently etching the second monocrystalline layer as part of forming at least one transistor in the second monocrystalline layer.

12 Claims, 717 Drawing Sheets

U.S. PATENT DOCUMENTS 4,711,858 A 12/1987 Harder et al.
4,721,885 A 1/1988 Brodie
4,732,312 A 3/1988 Kennedy et al.
4,733,288 A 3/1988 Sato
4,829,018 A 5/1989 Wahlstrom
4,854,986 A 8/1989 Raby
4,866,304 A 9/1989 Yu
4,939,568 A 7/1990 Kato et al.
4,956,307 A 9/1990 Pollack et al.
5,012,153 A 4/1991 Atkinson et al.
5,032,007 A 7/1991 Silverstein et al.
5,047,979 A 9/1991 Leung
5,087,585 A 2/1992 Hayashi
5,093,704 A 3/1992 Sato et al.
5,106,775 A 4/1992 Kaga et al.
5,152,857 A 10/1992 Ito et al.
5,162,879 A 11/1992 Gill
5,217,916 A 6/1993 Anderson et al.
5,250,460 A 10/1993 Yamagata et al.
5,258,643 A 11/1993 Cohen
5,265,047 A 11/1993 Leung et al.
5,266,511 A 11/1993 Takao
5,277,748 A 1/1994 Sakaguchi et al.
5,286,670 A 2/1994 Kang et al.
5,294,556 A 3/1994 Kawamura
5,308,782 A 5/1994 Mazure et al.
5,312,771 A 5/1994 Yonehara
5,317,236 A 5/1994 Zavracky et al.
5,324,980 A 6/1994 Kusunoki
5,355,022 A 10/1994 Sugahara et al.
5,371,037 A 12/1994 Yonehara
5,374,564 A 12/1994 Bruel
5,374,581 A 12/1994 Ichikawa et al.
5,424,560 A 6/1995 Norman et al.
5,475,280 A 12/1995 Jones et al.
5,478,762 A 12/1995 Chao
5,485,031 A 1/1996 Zhang et al.
5,498,978 A 3/1996 Takahashi et al.
5,527,423 A 6/1996 Neville et al.
5,535,342 A 7/1996 Taylor
5,554,870 A 9/1996 Fitch et al.
5,563,084 A 10/1996 Ramm et al.
5,583,349 A 12/1996 Norman et al.
5,583,350 A 12/1996 Norman et al.
5,594,563 A 1/1997 Larson
5,604,137 A 2/1997 Yamazaki et al.
5,617,991 A 4/1997 Pramanick et al.
5,627,106 A 5/1997 Hsu
5,656,548 A 8/1997 Zavracky et al.
5,670,411 A 9/1997 Yonehara et al.
5,681,756 A 10/1997 Norman et al.
5,695,557 A 12/1997 Yamagata et al.
5,701,027 A 12/1997 Gordon et al.
5,707,745 A 1/1998 Forrest et al.
5,714,395 A 2/1998 Bruel
5,721,160 A 2/1998 Forrest et al.
5,737,748 A 4/1998 Shigeeda
5,739,552 A 4/1998 Kimura et al.
5,744,979 A 4/1998 Goetting
5,748,161 A 5/1998 Lebby et al.
5,757,026 A 5/1998 Forrest et al.
5,781,031 A 7/1998 Bertin et al.
5,829,026 A 10/1998 Leung et al.
5,835,396 A 11/1998 Zhang
5,854,123 A 12/1998 Sato et al.
5,861,929 A 1/1999 Spitzer
5,877,070 A 3/1999 Goesele et al.
5,882,987 A 3/1999 Srikrishnan
5,883,525 A 3/1999 Tavana et al.
5,889,903 A 3/1999 Rao
5,915,167 A 6/1999 Leedy
5,937,312 A 8/1999 Iyer et al.
5,943,574 A 8/1999 Tehrani et al.
5,952,680 A 9/1999 Strite
5,952,681 A 9/1999 Chen
5,965,875 A 10/1999 Merrill
5,977,579 A 11/1999 Noble
5,977,961 A 11/1999 Rindal
5,980,633 A 11/1999 Yamagata et al.
5,985,742 A 11/1999 Henley et al.
5,998,808 A 12/1999 Matsushita
6,001,693 A 12/1999 Yeouchung et al.
6,009,496 A 12/1999 Tsai
6,020,252 A 2/2000 Aspar et al.
6,020,263 A 2/2000 Shih et al.
6,027,958 A 2/2000 Vu et al.
6,030,700 A 2/2000 Forrest et al.
6,052,498 A 4/2000 Paniccia
6,057,212 A 5/2000 Chan et al.
6,071,795 A 6/2000 Cheung et al.
6,103,597 A 8/2000 Aspar et al.
6,111,260 A 8/2000 Dawson et al.
6,125,217 A 9/2000 Paniccia et al.
6,153,495 A 11/2000 Kub et al.
6,191,007 B1 2/2001 Matsui et al.
6,222,203 B1 4/2001 Ishibashi et al.
6,229,161 B1 5/2001 Nemati et al.
6,242,324 B1 6/2001 Kub et al.
6,259,623 B1 7/2001 Takahashi
6,264,805 B1 7/2001 Forrest et al.
6,281,102 B1 8/2001 Cao et al.
6,294,018 B1 9/2001 Hamm et al.
6,306,705 B1 10/2001 Parekh et al.
6,321,134 B1 11/2001 Henley et al.
6,322,903 B1 11/2001 Siniaguine et al.
6,331,468 B1 12/2001 Aronowitz et al.
6,331,790 B1 12/2001 Or-Bach et al.
6,353,492 B2 3/2002 McClelland et al.
6,355,501 B1 3/2002 Fung et al.
6,358,631 B1 3/2002 Forrest et al.
6,365,270 B2 4/2002 Forrest et al.
6,376,337 B1 4/2002 Wang et al.
6,380,046 B1 4/2002 Yamazaki
6,417,108 B1 7/2002 Akino et al.
6,420,215 B1 7/2002 Knall et al.
6,423,614 B1 7/2002 Doyle
6,429,484 B1 8/2002 Yu
6,430,734 B1 8/2002 Zahar
6,475,869 B1 11/2002 Yu
6,476,493 B2 11/2002 Or-Bach et al.
6,515,511 B2 2/2003 Sugibayashi et al.
6,526,559 B2 2/2003 Schiefele et al.
6,528,391 B1 3/2003 Henley et al.
6,534,352 B1 3/2003 Kim
6,534,382 B1 3/2003 Sakaguchi et al.
6,544,837 B1 4/2003 Divakauni et al.
6,545,314 B2 4/2003 Forbes et al.
6,555,901 B1 4/2003 Yoshihara et al.
6,563,139 B2 5/2003 Hen
6,580,289 B2 6/2003 Cox
6,600,173 B2 7/2003 Tiwari
6,624,046 B1 9/2003 Zavracky et al.
6,627,518 B1 9/2003 Inoue et al.
6,630,713 B2 10/2003 Geusic
6,635,552 B1 10/2003 Gonzalez
6,638,834 B2 10/2003 Gonzalez
6,642,744 B2 11/2003 Or-Bach et al.
6,653,209 B1 11/2003 Yamagata
6,661,085 B2 12/2003 Kellar et al.
6,677,204 B2 1/2004 Cleeves et al.
6,686,253 B2 2/2004 Or-Bach
6,703,328 B2 3/2004 Tanaka et al.
6,756,633 B2 6/2004 Wang et al.
6,756,811 B2 6/2004 Or-Bach
6,759,282 B2 7/2004 Campbell et al.
6,762,076 B2 7/2004 Kim et al.
6,774,010 B2 8/2004 Chu et al.
6,805,979 B2 10/2004 Ogura et al.
6,806,171 B1 10/2004 Ulyashin et al.
6,809,009 B2 10/2004 Aspar et al.
6,815,781 B2 11/2004 Vyvoda et al.
6,819,136 B2 11/2004 Or-Bach
6,821,826 B1 11/2004 Chan et al.
6,844,243 B1 1/2005 Gonzalez
6,864,534 B2 3/2005 Ipposhi et al.
6,875,671 B2 4/2005 Faris
6,882,572 B2 4/2005 Wang et al.

| | | | |
|---|---|---|---|
| 6,888,375 | B2 | 5/2005 | Feng et al. |
| 6,917,219 | B2 | 7/2005 | New |
| 6,930,511 | B2 | 8/2005 | Or-Bach |
| 6,943,067 | B2 | 9/2005 | Greenlaw |
| 6,943,407 | B2 | 9/2005 | Ouyang et al. |
| 6,953,956 | B2 | 10/2005 | Or-Bach et al. |
| 6,967,149 | B2 | 11/2005 | Meyer et al. |
| 6,985,012 | B2 | 1/2006 | Or-Bach |
| 6,989,687 | B2 | 1/2006 | Or-Bach |
| 6,995,430 | B2 | 2/2006 | Langdo et al. |
| 6,995,456 | B2 | 2/2006 | Nowak |
| 7,015,719 | B1 | 3/2006 | Feng et al. |
| 7,016,569 | B2 | 3/2006 | Mule et al. |
| 7,018,875 | B2 | 3/2006 | Madurawe |
| 7,019,557 | B2 | 3/2006 | Madurawe |
| 7,043,106 | B2 | 5/2006 | West et al. |
| 7,052,941 | B2 | 5/2006 | Lee |
| 7,064,579 | B2 | 6/2006 | Madurawe |
| 7,067,396 | B2 | 6/2006 | Aspar et al. |
| 7,068,070 | B2 | 6/2006 | Or-Bach |
| 7,068,072 | B2 | 6/2006 | New et al. |
| 7,078,739 | B1 | 7/2006 | Nemati et al. |
| 7,094,667 | B1 | 8/2006 | Bower |
| 7,098,691 | B2 | 8/2006 | Or-Bach et al. |
| 7,105,390 | B2 | 9/2006 | Brask et al. |
| 7,105,871 | B2 | 9/2006 | Or-Bach et al. |
| 7,109,092 | B2 | 9/2006 | Tong |
| 7,110,629 | B2 | 9/2006 | Bjorkman et al. |
| 7,111,149 | B2 | 9/2006 | Eilert |
| 7,115,945 | B2 | 10/2006 | Lee et al. |
| 7,115,966 | B2 | 10/2006 | Ido et al. |
| 7,141,853 | B2 | 11/2006 | Campbell et al. |
| 7,148,119 | B1 | 12/2006 | Sakaguchi et al. |
| 7,157,787 | B2 | 1/2007 | Kim et al. |
| 7,157,937 | B2 | 1/2007 | Apostol et al. |
| 7,166,520 | B1 | 1/2007 | Henley |
| 7,170,807 | B2 | 1/2007 | Fazan et al. |
| 7,173,369 | B2 | 2/2007 | Forrest et al. |
| 7,180,091 | B2 | 2/2007 | Yamazaki et al. |
| 7,180,379 | B1 | 2/2007 | Hopper et al. |
| 7,189,489 | B2 | 3/2007 | Kunimoto et al. |
| 7,205,204 | B2 | 4/2007 | Ogawa et al. |
| 7,217,636 | B1 | 5/2007 | Atanackovic |
| 7,223,612 | B2 | 5/2007 | Sarma |
| 7,242,012 | B2 | 7/2007 | Leedy |
| 7,245,002 | B2 | 7/2007 | Akino et al. |
| 7,256,104 | B2 | 8/2007 | Ito et al. |
| 7,259,091 | B2 | 8/2007 | Schuehrer et al. |
| 7,265,421 | B2 | 9/2007 | Madurawe |
| 7,271,420 | B2 | 9/2007 | Cao |
| 7,282,951 | B2 | 10/2007 | Huppenthal et al. |
| 7,296,201 | B2 | 11/2007 | Abramovici |
| 7,304,355 | B2 | 12/2007 | Zhang |
| 7,312,109 | B2 | 12/2007 | Madurawe |
| 7,312,487 | B2 | 12/2007 | Alam et al. |
| 7,335,573 | B2 | 2/2008 | Takayama et al. |
| 7,337,425 | B2 | 2/2008 | Kirk |
| 7,338,884 | B2 | 3/2008 | Shimoto et al. |
| 7,351,644 | B2 | 4/2008 | Henley |
| 7,358,601 | B1 | 4/2008 | Plants et al. |
| 7,369,435 | B2 | 5/2008 | Forbes |
| 7,371,660 | B2 | 5/2008 | Henley et al. |
| 7,378,702 | B2 | 5/2008 | Lee |
| 7,393,722 | B1 | 7/2008 | Issaq et al. |
| 7,419,844 | B2 | 9/2008 | Lee et al. |
| 7,436,027 | B2 | 10/2008 | Ogawa et al. |
| 7,439,773 | B2 | 10/2008 | Or-Bach et al. |
| 7,446,563 | B2 | 11/2008 | Madurawe |
| 7,459,752 | B2 | 12/2008 | Doris et al. |
| 7,459,763 | B1 | 12/2008 | Issaq et al. |
| 7,459,772 | B2 | 12/2008 | Speers |
| 7,463,062 | B2 | 12/2008 | Or-Bach et al. |
| 7,470,142 | B2 | 12/2008 | Lee |
| 7,470,598 | B2 | 12/2008 | Lee |
| 7,476,939 | B2 | 1/2009 | Okhonin et al. |
| 7,477,540 | B2 | 1/2009 | Okhonin et al. |
| 7,485,968 | B2 | 2/2009 | Enquist et al. |
| 7,486,563 | B2 | 2/2009 | Waller et al. |
| 7,488,980 | B2 | 2/2009 | Takafuji et al. |
| 7,492,632 | B2 | 2/2009 | Carman |
| 7,495,473 | B2 | 2/2009 | McCollum et al. |
| 7,498,675 | B2 | 3/2009 | Farnworth et al. |
| 7,499,352 | B2 | 3/2009 | Singh |
| 7,499,358 | B2 | 3/2009 | Bauser |
| 7,508,034 | B2 | 3/2009 | Takafuji et al. |
| 7,514,748 | B2 | 4/2009 | Fazan et al. |
| 7,541,616 | B2 | 6/2009 | Fazan et al. |
| 7,547,589 | B2 | 6/2009 | Iriguchi |
| 7,557,367 | B2 | 7/2009 | Rogers et al. |
| 7,563,659 | B2 | 7/2009 | Kwon et al. |
| 7,566,855 | B2 | 7/2009 | Olsen et al. |
| 7,586,778 | B2 | 9/2009 | Ho et al. |
| 7,589,375 | B2 | 9/2009 | Jang et al. |
| 7,608,848 | B2 | 10/2009 | Ho et al. |
| 7,622,367 | B1 | 11/2009 | Nuzzo et al. |
| 7,632,738 | B2 | 12/2009 | Lee |
| 7,633,162 | B2 | 12/2009 | Lee |
| 7,671,371 | B2 | 3/2010 | Lee |
| 7,674,687 | B2 | 3/2010 | Henley |
| 7,687,372 | B2 | 3/2010 | Jain |
| 7,688,619 | B2 | 3/2010 | Lung et al. |
| 7,692,202 | B2 | 4/2010 | Bensch |
| 7,692,448 | B2 | 4/2010 | Solomon |
| 7,692,944 | B2 | 4/2010 | Bernstein et al. |
| 7,697,316 | B2 | 4/2010 | Lai et al. |
| 7,709,932 | B2 | 5/2010 | Nemoto et al. |
| 7,718,508 | B2 | 5/2010 | Lee |
| 7,723,207 | B2 | 5/2010 | Alam et al. |
| 7,728,326 | B2 | 6/2010 | Yamazaki et al. |
| 7,732,301 | B1 | 6/2010 | Pinnington et al. |
| 7,749,884 | B2 | 7/2010 | Mathew et al. |
| 7,759,043 | B2 | 7/2010 | Tanabe et al. |
| 7,768,115 | B2 | 8/2010 | Lee et al. |
| 7,776,715 | B2 | 8/2010 | Wells et al. |
| 7,777,330 | B2 | 8/2010 | Pelley et al. |
| 7,786,460 | B2 | 8/2010 | Lung et al. |
| 7,795,619 | B2 | 9/2010 | Hara |
| 7,799,675 | B2 | 9/2010 | Lee |
| 7,800,099 | B2 | 9/2010 | Yamazaki et al. |
| 7,800,199 | B2 | 9/2010 | Oh et al. |
| 7,846,814 | B2 | 12/2010 | Lee |
| 7,867,822 | B2 | 1/2011 | Lee |
| 7,888,764 | B2 | 2/2011 | Lee |
| 8,031,544 | B2 | 10/2011 | Kim et al. |
| 8,044,464 | B2 | 10/2011 | Yamazaki et al. |
| 2001/0000005 | A1 | 3/2001 | Forrest et al. |
| 2001/0014391 | A1 | 8/2001 | Forrest et al. |
| 2002/0024140 | A1 | 2/2002 | Nakajima et al. |
| 2002/0025604 | A1 | 2/2002 | Tiwari |
| 2002/0081823 | A1 | 6/2002 | Cheung et al. |
| 2002/0141233 | A1 | 10/2002 | Hosotani et al. |
| 2002/0153243 | A1 | 10/2002 | Forrest et al. |
| 2002/0199110 | A1 | 12/2002 | Kean |
| 2003/0015713 | A1 | 1/2003 | Yoo |
| 2003/0059999 | A1 | 3/2003 | Gonzalez |
| 2003/0060034 | A1 | 3/2003 | Beyne et al. |
| 2003/0067043 | A1 | 4/2003 | Zhang |
| 2003/0102079 | A1 | 6/2003 | Kalvesten et al. |
| 2003/0113963 | A1 | 6/2003 | Wurzer |
| 2003/0119279 | A1 | 6/2003 | Enquist |
| 2003/0139011 | A1 | 7/2003 | Cleeves et al. |
| 2003/0157748 | A1 | 8/2003 | Kim et al. |
| 2003/0213967 | A1 | 11/2003 | Forrest et al. |
| 2003/0224582 | A1 | 12/2003 | Shimoda et al. |
| 2004/0014299 | A1 | 1/2004 | Moriceau et al. |
| 2004/0047539 | A1 | 3/2004 | Okubora et al. |
| 2004/0061176 | A1 | 4/2004 | Takafuji et al. |
| 2004/0113207 | A1 | 6/2004 | Hsu et al. |
| 2004/0155301 | A1 | 8/2004 | Zhang |
| 2004/0156233 | A1 | 8/2004 | Bhattacharyya |
| 2004/0166649 | A1 | 8/2004 | Bressot et al. |
| 2004/0178819 | A1 | 9/2004 | New |
| 2004/0259312 | A1 | 12/2004 | Schlosser et al. |
| 2004/0262635 | A1 | 12/2004 | Lee |
| 2004/0262772 | A1* | 12/2004 | Ramanathan et al. ........ 257/777 |
| 2005/0003592 | A1 | 1/2005 | Jones |
| 2005/0067620 | A1 | 3/2005 | Chan et al. |
| 2005/0067625 | A1 | 3/2005 | Hata |

2005/0098822 A1 5/2005 Mathew
2005/0110041 A1 5/2005 Boutros et al.
2005/0130429 A1 6/2005 Rayssac et al.
2005/0225237 A1 10/2005 Winters
2005/0280061 A1 12/2005 Lee
2005/0280090 A1 12/2005 Anderson et al.
2005/0280154 A1 12/2005 Lee
2005/0280155 A1 12/2005 Lee
2005/0280156 A1 12/2005 Lee
2006/0014331 A1 1/2006 Tang et al.
2006/0024923 A1 2/2006 Sarma et al.
2006/0033124 A1 2/2006 Or-Bach et al.
2006/0067122 A1 3/2006 Verhoeven
2006/0071322 A1 4/2006 Kitamura
2006/0071332 A1 4/2006 Speers
2006/0083280 A1 4/2006 Tauzin et al.
2006/0113522 A1 6/2006 Lee et al.
2006/0121690 A1 6/2006 Pogge et al.
2006/0179417 A1 8/2006 Madurawe
2006/0181202 A1 8/2006 Liao et al.
2006/0195729 A1 8/2006 Huppenthal et al.
2006/0207087 A1 9/2006 Jafri et al.
2006/0275962 A1 12/2006 Lee
2007/0014508 A1 1/2007 Chen et al.
2007/0063259 A1 3/2007 Derderian et al.
2007/0072391 A1 3/2007 Pocas et al.
2007/0076509 A1 4/2007 Zhang
2007/0077694 A1 4/2007 Lee
2007/0090416 A1 4/2007 Doyle et al.
2007/0102737 A1 5/2007 Kashiwabara et al.
2007/0108523 A1 5/2007 Ogawa et al.
2007/0111386 A1 5/2007 Kim et al.
2007/0132049 A1 6/2007 Stipe
2007/0132369 A1 6/2007 Forrest et al.
2007/0158659 A1 7/2007 Bensce
2007/0187775 A1 8/2007 Okhonin et al.
2007/0190746 A1 8/2007 Ito et al.
2007/0194453 A1 8/2007 Chakraborty et al.
2007/0210336 A1 9/2007 Madurawe
2007/0228383 A1 10/2007 Bernstein et al.
2007/0262457 A1 11/2007 Lin
2007/0275520 A1 11/2007 Suzuki
2007/0283298 A1 12/2007 Bernstein et al.
2007/0287224 A1 12/2007 Alam et al.
2008/0032463 A1 2/2008 Lee
2008/0038902 A1 2/2008 Lee
2008/0048327 A1 2/2008 Lee
2008/0099780 A1 5/2008 Tran
2008/0124845 A1* 5/2008 Yu et al. ........................ 438/143
2008/0128745 A1 6/2008 Mastro et al.
2008/0136455 A1 6/2008 Diamant et al.
2008/0160431 A1 7/2008 Scott et al.
2008/0160726 A1 7/2008 Lim et al.
2008/0179678 A1 7/2008 Dyer et al.
2008/0194068 A1 8/2008 Temmler et al.
2008/0203452 A1 8/2008 Moon et al.
2008/0220558 A1 9/2008 Zehavi et al.
2008/0220565 A1 9/2008 Hsu et al.
2008/0224260 A1 9/2008 Schmit et al.
2008/0237591 A1 10/2008 Leedy
2008/0251862 A1 10/2008 Fonash et al.
2008/0254561 A2 10/2008 Yoo
2008/0254572 A1 10/2008 Leedy
2008/0261378 A1 10/2008 Yao et al.
2008/0277778 A1* 11/2008 Furman et al. ................ 257/713
2008/0283875 A1 11/2008 Mukasa et al.
2008/0284611 A1 11/2008 Leedy
2008/0296681 A1 12/2008 Georgakos et al.
2008/0315351 A1* 12/2008 Kakehata ...................... 257/507
2009/0001469 A1 1/2009 Yoshida et al.
2009/0016716 A1 1/2009 Ishida
2009/0052827 A1 2/2009 Durfee et al.
2009/0055789 A1 2/2009 McIlrath
2009/0064058 A1 3/2009 McIlrath
2009/0066365 A1 3/2009 Solomon
2009/0066366 A1 3/2009 Solomon
2009/0070727 A1 3/2009 Solomon
2009/0081848 A1 3/2009 Erokhin
2009/0087759 A1 4/2009 Matsumoto et al.
2009/0096009 A1 4/2009 Dong et al.
2009/0096024 A1 4/2009 Shingu et al.
2009/0128189 A1 5/2009 Madurawe et al.
2009/0144669 A1 6/2009 Bose et al.
2009/0144678 A1 6/2009 Bose et al.
2009/0146172 A1 6/2009 Pumyea
2009/0159870 A1 6/2009 Lin et al.
2009/0160482 A1 6/2009 Karp et al.
2009/0161401 A1 6/2009 Bilger et al.
2009/0194152 A1 8/2009 Liu et al.
2009/0194768 A1 8/2009 Leedy
2009/0204933 A1 8/2009 Rezgui
2009/0212317 A1 8/2009 Kolodin et al.
2009/0218627 A1 9/2009 Zhu
2009/0221110 A1 9/2009 Lee et al.
2009/0224364 A1 9/2009 Oh et al.
2009/0234331 A1 9/2009 Langereis et al.
2009/0242893 A1 10/2009 Tomiyasu
2009/0250686 A1 10/2009 Sato et al.
2009/0262583 A1 10/2009 Lue
2009/0263942 A1 10/2009 Ohnuma et al.
2009/0267233 A1 10/2009 Lee
2009/0272989 A1 11/2009 Shum et al.
2009/0302394 A1 12/2009 Fujita
2009/0321830 A1 12/2009 Maly
2009/0321948 A1 12/2009 Wang et al.
2009/0325343 A1 12/2009 Lee
2010/0001282 A1 1/2010 Mieno
2010/0038743 A1 2/2010 Lee
2010/0052134 A1 3/2010 Werner et al.
2010/0058580 A1 3/2010 Yazdani
2010/0081232 A1 4/2010 Furman et al.
2010/0112753 A1 5/2010 Lee
2010/0112810 A1 5/2010 Lee et al.
2010/0133695 A1 6/2010 Lee
2010/0133704 A1 6/2010 Marimuthu et al.
2010/0190334 A1 7/2010 Lee
2010/0193884 A1* 8/2010 Park et al. ..................... 257/414
2010/0193964 A1 8/2010 Farooq et al.
2010/0276662 A1 11/2010 Colinge
2010/0307572 A1 12/2010 Bedell et al.
2010/0308211 A1 12/2010 Cho et al.
2011/0001172 A1 1/2011 Lee
2011/0003438 A1 1/2011 Lee
2011/0024724 A1 2/2011 Frolov et al.
2011/0026263 A1 2/2011 Xu
2011/0037052 A1 2/2011 Schmidt et al.
2011/0042696 A1 2/2011 Smith et al.
2011/0050125 A1 3/2011 Medendorp et al.
2011/0053332 A1 3/2011 Lee
2011/0101537 A1 5/2011 Barth et al.
2011/0143506 A1 6/2011 Lee
2011/0147791 A1 6/2011 Norman et al.
2011/0241082 A1 10/2011 Bernstein et al.
2012/0001184 A1 1/2012 Ha et al.
2012/0003815 A1 1/2012 Lee

FOREIGN PATENT DOCUMENTS

EP 1909311 A2 4/2008
WO PCT/US2008/063483 5/2008

OTHER PUBLICATIONS

A New Three Dimensional IC Fabrication Technology, Stacking Thin Film Dual-CMOS Layers, Y. Hayashi, et al, IEDM, pp. 25.6.1-25.6.4, IEEE (1991).*

Three-Dimensional IC Trends, Yoichi Akasaka, Proceedings of the IEEE, vol. 24, No. 12, IEEE, Dec. 1986.*

Colinge, J. P., et al., "Nanowire transistors without Junctions", Nature Nanotechnology, Feb. 21, 2010, pp. 1-5.

Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.

Kim, J.Y., et al., "The excellent scalability of the RCAT (recess-channel-array-transistor) technology for sub-70nm DRAM feature size and beyond," 2005 IEEE VLSI-TSA International Symposium, pp. 33-34, Apr. 25-27, 2005.

Abramovici, Breuer and Friedman, Digital Systems Testing and Testable Design, Computer Science Press, 1990, pp. 432-447.
Topol, A.W., et al., "Enabling SOI-Based Assembly Technology for Three-Dimensional (3D) Integrated Circuits (ICs)," IEDM Tech. Digest, Dec. 5, 2005, pp. 363-366.
Demeester, P., et al., "Epitaxial lift-off and its applications," Semicond. Sci. Technol., 1993, pp. 1124-1135, vol. 8.
Yoon, J., et al., "GaAs Photovoltaics and optoelectronics using releasable multilayer epitaxial assemblies", Nature, vol. 465, May 20, 2010, pp. 329-334.
Yonehara, T., et al., "ELTRAN: SOI-Epi Wafer by Epitaxial Layer transfer from porous Silicon", the 198th Electrochemical Society Meeting, abstract No. 438 (2000).
Yonehara, T., et al., "Eltran®, Novel SOI Wafer Technology," JSAP International, Jul. 2001, pp. 10-16, No. 4.
Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.
Bangsaruntip, S., et al., "High performance and highly uniform gate-all-around silicon nanowire MOSFETs with wire size dependent scaling," Electron Devices Meeting (IEDM), 2009 IEEE International, pp. 297-300, Dec. 7-9, 2009.
Bakir and Meindl, "Integrated Interconnect Technologies for 3D Nanoelectronic Systems", Artech House, 2009, Chapter 13, pp. 389-419.
Tanaka, H., et al., "Bit Cost Scalable Technology with Punch and Plug Process for Ultra High Density Flash Memory," VLSI Technology, 2007 IEEE Symposium on, vol., No., pp. 14-15, Jun. 12-14, 2007.
Burr, G. W., et al., "Overview of candidate device technologies for storage-class memory," IBM Journal of Research and Development, vol. 52, No. 4.5, pp. 449-464, Jul. 2008.
Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.
Bez, R., et al., "Introduction to Flash memory," Proceedings IEEE, 91(4), 489-502 (2003).
Kim, W., et al., "Multi-layered Vertical Gate NAND Flash overcoming stacking limit for terabit density storage", Symposium on VLSI Technology Digest of Technical Papers, 2009, pp. 188-189.
Auth, C., et al., "45nm High-k + Metal Gate Strain-Enhanced Transistors," Symposium on VLSI Technology Digest of Technical Papers, 2008, pp. 128-129.
Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.
Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.
Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.
Sen, P. & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.
Iwai, H., et.al., "NiSi Salicide Technology for Scaled CMOS," Microelectronic Engineering, 60 (2002), pp. 157-169.
Froment, B., et al., "*Nickel* vs. *Cobalt Silicide* integration for sub-50nm CMOS", IMEC ESS Circuits, 2003. pp. 215-219.
James, D., "65 and 45-nm Devices—An Overview", Semicon West, Jul. 2008, paper No. ctr_024377.
Davis, J.A., et.al., "Interconnect Limits on Gigascale Integration(GSI) in the 21st Century", Proc. IEEE, vol. 89, No. 3, pp. 305-324, Mar. 2001.
Dicioccio, L., et. al., "Direct bonding for wafer level 3D integration", ICICDT 2010, pp. 110-113.
Shino, T., et al., "Floating Body RAM Technology and its Scalability to 32nm Node and Beyond," Electron Devices Meeting, 2006, IEDM '06, International, pp. 1-4, Dec. 11-13, 2006.
Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.
Okhonin, S., et al., "New Generation of Z-RAM", Electron Devices Meeting, 2007. IEDM 2007. IEEE International, pp. 925-928, Dec. 10-12, 2007.
Kim, W., et al., "Multi-Layered Vertical Gate NAND Flash Overcoming Stacking Limit for Terabit Density Storage," Symposium on VLSI Technology, 2009, pp. 188-189.
Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.
Hubert, A., et al., "A Stacked SONOS Technology, Up to 4 Levels and 6nm Crystalline Nanowires, with Gate-All-Around or Independent Gates (ΦFlash), Suitable for Full 3D Integration", International Electron Devices Meeting, 2009, pp. 637-640.
Celler, G.K., et al., "Frontiers of silicon-on-insulator," J. App. Phys., May 1, 2003, pp. 4955-4978, vol. 93, No. 9.
Henttinen, K. et al., "Mechanically Induced Si Layer Transfer in Hydrogen-Implanted Si Wafers," Applied Physics Letters, Apr. 24, 2000, p. 2370-2372, vol. 76, No. 17.
Lee, C.-W., et al., "Junctionless multigate field-effect transistor," Applied Physics Letters, vol. 94, pp. 053511-1 to 053511-2, 2009.
Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515- 518, Dec. 13-15, 2004.
Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.
Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European, pp. 177-180, Sep. 12-16, 2005.
Chung, S.-W., et al., "Highly Scalable Saddle-Fin (S-Fin) Transistor for Sub-50nnn DRAM Technology," 2006 Symposium on VLSI Technology Digest of Technical Papers, pp. 32-33.
Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.
Henttinen, K. et al., "Cold ion-cutting of hydrogen implanted Si," J. Nucl. Instr. and Meth. in Phys. Res. B, 2002, pp. 761-766, vol. 190.
Brumfiel, G., "Solar cells sliced and diced", May 19, 2010, Nature News.
Dragoi, et al., "Plasma-activated wafer bonding: the new low-temperature tool for MEMS fabrication", Proc. SPIE, vol. 6589, 65890T (2007).
Rajendran, B., et al., "Electrical Integrity of MOS Devices in Laser Annealed 3D IC Structures", proceedings VLSI Multi Level Interconnect Conference 2004, pp. 73-74.
Rajendran, B., "Sequential 3D IC Fabrication: Challenges and Prospects", Proceedings of VLSI Multi Level Interconnect Conference 2006, pp. 57-64.
Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.

Vengurlekar, A., et al., "Mechanism of Dopant Activation Enhancement in Shallow Junctions by Hydrogen", Proceedings of the Materials Research Society, vol. 864, Spring 2005, E9.28.1-6.
Hui, K. N., et al., "Design of vertically-stacked polychromatic light-emitting diodes," Optics Express, Jun. 8, 2009, pp. 9873-9878, vol. 17, No. 12.
Yamada, M., et al., "Phosphor Free High-Luminous-Efficiency White Light-Emitting Diodes Composed of InGaN Multi-Quantum Well," Japanese Journal of Applied Physics, 2002, pp. L246-L248, vol. 41.
Guo, X., et al., "Cascade single-chip phosphor-free white light emitting diodes," Applied Physics Letters, 2008, pp. 013507-1-013507-3, vol. 92.
Chuai, D. X., et al., "A Trichromatic Phosphor-Free White Light-Emitting Diode by Using Adhesive Bonding Scheme," Proc. SPIE, 2009, vol. 7635.
Suntharalingam, V., et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.
Coudrain, P., et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.
Takafuji, Y., et al., "Integration of Single Crystal Si TFTs and Circuits on a Large Glass Substrate," IEEE International Electron Devices Meeting (IEDM), Dec. 7-9, 2009, pp. 1-4.
Flamand, G., et al., "Towards Highly Efficient 4-Terminal Mechanical Photovoltaic Stacks," III-Vs Review, Sep.-Oct. 2006, pp. 24-27, vol. 19, Issue 7.
Zahler, J.M., et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.
Wierer, J.J., et al., "High-power AlGaInN flip-chip light-emitting diodes," Applied Physics Letters, May 28, 2001, pp. 3379-3381, vol. 78, No. 22.
El-Gamal, A., "Trends in CMOS Image Sensor Technology and Design," International Electron Devices Meeting Digest of Technical Papers, Dec. 2002.
Ahn, S.W., "Fabrication of a 50 nm half-pitch wire grid polarizer using nanoimprint lithography," Nanotechnology, 2005, pp. 1874-1877, vol. 16, No. 9.
Johnson, R.C., "Switching LEDs on and off to enlighten wireless communications," EE Times, Jun. 2010, last accessed Oct. 11, 2010, <http://www.embeddedinternetdesign.com/design/225402094>.
Ohsawa, et al.,"Autonomous Refresh of Floating Body Cell (FBC)", International Electron Device Meeting, 2008, pp. 801-804.
Sekar, D. C., et al., "A 3D-IC Technology with Integrated Microchannel Cooling", Proc. Intl. Interconnect Technology Conference, 2008, pp. 13-15.
Brunschweiler, T., et al., "Forced Convective Interlayer Cooling in Vertically Integrated Packages," Proc. Intersoc. Conference on Thermal Management (ITHERM), 2008, pp. 1114-1125.
Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.
Chen, P., et al., "Effects of Hydrogen Implantation Damage on the Performance of InP/InGaAs/InP p-i-n Photodiodes, Transferred on Silicon," Applied Physics Letters, vol. 94, No. 1, Jan. 2009, pp. 012101-1 to 012101-3.
Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.
Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.
Chen, W., et al., "InP Layer Transfer with Masked Implantation," Electrochemical and Solid-State Letters, Issue 12, No. 4, Apr. 2009, H149-150.
Motoyoshi, M., "3D-IC Integration," 3rd Stanford and Tohoku University Joint Open Workshop, Dec. 4, 2009, pp. 1-52.
Wong, S., et al., "Monolithic 3D Integrated Circuits," VLSI Technology, Systems and Applications, 2007, International Symposium on VLSI-TSA 2007, pp. 1-4.
Feng, J., et al., "Integration of Germanium-on-Insulator and Silicon MOSFETs on a Silicon Substrate," IEEE Electron Device Letters, vol. 27, No. 11, Nov. 2006, pp. 911-913.
Zhang, S., et al., "Stacked CMOS Technology on SOI Substrate," IEEE Electron Device Letters, vol. 25, No. 9, Sep. 2004, pp. 661-663.
Batude, P., et al., "Advances in 3D CMOS Sequential Integration," 2009 IEEE International Electron Devices Meeting (Baltimore, Maryland), Dec. 7-9, 2009, pp. 345-348.
Tan, C.S., et al., "Wafer Level 3-D ICs Process Technology," ISBN-10: 0387765328, Springer, 1st Ed., Sep. 19, 2008, pp. v-xii, 34, 58, and 59.
Yoon, S.W. et al., "Fabrication and Packaging of Microbump Interconnections for 3D TSV," IEEE International Conference on 3D System Integration (3DIC), Sep. 28-30, 2009, pp. 1-5.
Franzon, P.D., et al., "Design and CAD for 3D Integrated Circuits," 45th ACM/IEEE Design, Automation Conference (DAC), Jun. 8-13, 2008, pp. 668-673.
Brebner, G., "Tooling up for Reconfigurable System Design," IEE Colloquium on Reconfigurable Systems, 1999, Ref. No. 1999/061, pp. 2/1-2/4.
Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.
Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Dong, C., et al., "Reconfigurable Circuit Design with Nanomaterials," Design, Automation & Test in Europe Conference & Exhibition, Apr. 20-24, 2009, pp. 442-447.
Razavi, S.A., et al., "A Tileable Switch Module Architecture for Homogeneous 3D FPGAs," IEEE International Conference on 3D System Integration (3DIC), Sep. 28-30, 2009, 4 pages.
Bakir M., et al., "3D Device-Stacking Technology for Memory," pp. 407-410.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P., et al., "Silicon Substrate Removal of GaN DHFETs for enhanced (>1100V) Breakdown Voltage," Aug. 2010, IEEE Electron Device Letters, vol. 31, No. 8, pp. 851-852.
Weis, M., et al., "Stacked 3-Dimensional 6T SRAM Cell with Independent Double Gate Transistors," IC Design and Technology, May 18-20, 2009.
Doucette, P., "Integrating Photonics: Hitachi, Oki Put LEDs on Silicon," Solid State Technology, Jan. 2007, p. 22, vol. 50, No. 1.
Gosele, U., et al., "Semiconductor Wafer Bonding," Annual Review of Materials Science, Aug. 1998, pp. 215-241, vol. 28.
Spangler, L.J., et al., "A Technology for High Performance Single-Crystal Silicon-on-Insulator Transistors," IEEE Electron Device Letters, Apr. 1987, pp. 137-139, vol. 8, No. 4.
Luo, Z.S., et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.
Zahler, J.M. et al., "Wafer Bonding and Layer Transfer Processes for High Efficiency Solar Cells," NCPV and Solar Program Review Meeting, 2003, pp. 723-726.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.

Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.

Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.

Abramovici, M., "In-system silicon validation and debug", (2008) IEEE Design and Test of Computers, 25 (3), pp. 216-223.

Saxena, P., et al., "Repeater Scaling and Its Impact on CAD", IEEE Transactions on Computer-Aided Design of Integrated Circuits and Systems, vol. 23, No. 4, Apr. 2004.

Abrmovici, M., et al., A reconfigurable design-for-debug infrastructure for SoCs, (2006) Proceedings—Design Automation Conference, pp. 7-12.

Anis, E., et al., "Low cost debug architecture using lossy compression for silicon debug", (2007) Proceedings of the IEEE/ACM Design, pp. 225-230.

Anis, E., et al., "On using lossless compression of debug data in embedded logic analysis", (2007) Proceedings of the IEEE International Test Conference, paper 18.3, pp. 1-10.

Boule, M., et al., "Adding debug enhancements to assertion checkers for hardware emulation and silicon debug", (2006) Proceedings of the IEEE International Conference on Computer Design, pp. 294-299.

Boule, M., et al., "Assertion checkers in verification, silicon debug and in-field diagnosis", (2007) Proceedings—Eighth International Symposium on Quality Electronic Design, ISQED 2007, pp. 613-618.

Burtscher, M., et al., "The VPC trace-compression algorithms", (2005) IEEE Transactions on Computers, 54 (11), Nov. 2005, pp. 1329-1344.

Frieden, B., "Trace port on powerPC 405 cores", (2007) Electronic Product Design, 28 (6), pp. 12-14.

Hopkins, A.B.T., et al., "Debug support for complex systems on-chip: A review", (2006) IEEE Proceedings: Computers and Digital Techniques, 153 (4), Jul. 2006, pp. 197-207.

Hsu, Y.-C., et al., "Visibility enhancement for silicon debug", (2006) Proceedings—Design Automation Conference, Jul. 24-28, 2006, San Francisco, pp. 13-18.

Josephson, D., et al., "The crazy mixed up world of silicon debug", (2004) Proceedings of the Custom Integrated Circuits Conference, paper 30-1, pp. 665-670.

Josephson, D.D., "The manic depression of microprocessor debug", (2002) IEEE International Test Conference (TC), paper 23.4, pp. 657-663.

Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.

Ko, H.F., et al., "Distributed embedded logic analysis for post-silicon validation of SOCs", (2008) Proceedings of the IEEE International Test Conference, paper 16.3, pp. 755-763.

Ko, H.F., et al., "Functional scan chain design at RTL for skewed-load delay fault testing", (2004) Proceedings of the Asian Test Symposium, pp. 454-459.

Ko, H.F., et al., "Resource-efficient programmable trigger units for post-silicon validation", (2009) Proceedings of the 14th IEEE European Test Symposium, ETS 2009, pp. 17-22.

Liu, X., et al., "On reusing test access mechanisms for debug data transfer in SoC post-silicon validation", (2008) Proceedings of the Asian Test Symposium, pp. 303-308.

Liu, X., et al., "Trace signal selection for visibility enhancement in post-silicon validation", (2009) Proceedings Date, pp. 1338-1343.

McLaughlin, R., et al., "Automated debug of speed path failures using functional tests", (2009) Proceedings of the IEEE VLSI Test Symposium, pp. 91-96.

Morris, K., "On-Chip Debugging—Built-in Logic Analyzers on your FPGA", (2004) Journal of FPGA and Structured ASIC, 2 (3).

Nicolici, N., et al., "Design-for-debug for post-silicon validation: Can high-level descriptions help?", (2009) Proceedings—IEEE International High-Level Design Validation and Test Workshop, HLDVT, pp. 172-175.

Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.

Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.

Moore, B., et al., "High Throughput Non-contact SiP Testing", (2007) Proceedings—International Test Conference, paper 12.3.

Riley, M.W., et al., "Cell broadband engine debugging for unknown events", (2007) IEEE Design and Test of Computers, 24 (5), pp. 486-493.

Vermeulen, B., "Functional debug techniques for embedded systems", (2008) IEEE Design and Test of Computers, 25 (3), pp. 208-215.

Vermeulen, B., et al., "Automatic Generation of Breakpoint Hardware for Silicon Debug", Proceeding of the 41st Design Automation Conference, Jun. 7-11, 2004, p. 514-517.

Vermeulen, B., et al., "Design for debug: Catching design errors in digital chips", (2002) IEEE Design and Test of Computers, 19 (3), pp. 37-45.

Vermeulen, B., et al., "Core-based scan architecture for silicon debug", (2002) IEEE International Test Conference (TC), pp. 638-647.

Vanrootselaar, G. J., et al., "Silicon debug: scan chains alone are not enough", (1999) IEEE International Test Conference (TC), pp. 892-902.

Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D IC Conference, Proceedings.

Kada, M., "Development of functionally innovative 3D-integrated circuit (dream chip) technology / high-density 3D-integration technology for multifunctional devices", (2009) IEEE International Conference on 3D System Integration, 3DIC 2009.

Kim, G.-S., et al., "A 25-mV-sensitivity 2-Gb/s optimum-logic-threshold capacitive-coupling receiver for wireless wafer probing systems", (2009) IEEE Transactions on Circuits and Systems II: Express Briefs, 56 (9), pp. 709-713.

Marchal, P., et al., "3-D technology assessment: Path-finding the technology/design sweet-spot", (2009) Proceedings of the IEEE, 97 (1), pp. 96-107.

Xie, Y., et al., "Design space exploration for 3D architectures", (2006) ACM Journal on Emerging Technologies in Computing Systems, 2 (2), Apr. 2006, pp. 65-103.

Sellathamby, C.V., et al., "Non-contact wafer probe using wireless probe cards", (2005) Proceedings—International Test Conference, 2005, pp. 447-452.

Souri, S., et al., "Multiple Si layers ICs: motivation, performance analysis, and design Implications", (2000) Proceedings—Design Automation Conference, pp. 213-220.

Vinet, M., et.al., "3D monolithic integration: Technological challenges and electrical results", Microelectronic Engineering Apr. 2011. vol. 88, Issue 4, pp. 331-335.

Bobba, S., et al., "*CELONCEL: Effective Design Technique for 3-D Monolithic Integration targeting High Performance Integrated Circuits", Asia pacific DAC 2011*, paper 4A-4.

Choudhury, D., "3D Integration Technologies for Emerging Microsystems", IEEE Proceedings of the IMS 2010, pp. 1-4.

Lee, Y.-J., et. al, "3D 65nm CMOS with 320°C Microwave Dopant Activation", IEDM 2010, pp. 1-4.

Crnogorac, F., et al., "Semiconductor crystal islands for three-dimensional integration", J. Vac. Sci. Technol. B 28(6), Nov./Dec. 2010, pp. C6P53-C6P58.
Park, J.-H., et al., "N-Channel Germanium MOSFET Fabricated Below 360 °C by Cobalt-Induced Dopant Activation for Monolithic Three-Dimensional-ICs", IEEE Electron Device Letters, vol. 32, No. 3, Mar. 2011, pp. 234-236.
Jung, S.-M., et al., "Soft Error Immune 0.46pm2 SRAM Cell with MIM Node Capacitor by 65nm CMOS Technology for Ultra High Speed SRAM", IEDM 2003, pp. 289-292.
Brillouet, M., "Emerging Technologies on Silicon", IEDM 2004, pp. 17-24.
Jung, S.-M., et al., "Highly Area Efficient and Cost Effective Double Stacked S3( Stacked Single-crystal Si ) Peripheral CMOS SSTFT and SRAM Cell Technology for 512M bit density SRAM", IEDM 2003, pp. 265-268.
Joyner, J.W., "Opportunities and Limitations of Three-dimensional Integration for Interconnect Design", PhD Thesis, Georgia Institute of Technology, Jul. 2003.
Choi, S.-J., "A Novel TFT with a Laterally Engineered Bandgap for of 3D Logic and Flash Memory", 2010 Symposium of VLSI Technology Digest, pp. 111-112.
Meindl, J. D., "Beyond Moore'S Law: The Interconnect ERA", IEEE Computing in Science & Engineering, Jan./Feb. 2003, pp. 20-24.
Radu, I., et al., "Recent Developments of Cu-Cu non-thermo compression bonding for wafer-to-wafer 3D stacking", IEEE 3D Systems Integration Conference (3DIC), Nov. 16-18, 2010.
Gaudin, G., et al., "Low temperature direct wafer to wafer bonding for 3D integration", 3D Systems Integration Conference (3DIC), IEEE, 2010, Munich, Nov. 16-18, 2010, pp. 1-4.
Jung, S.-M., et al., "Three Dimensionally Stacked NAND Flash Memory Technology Using Stacking Single Crystal Si Layers on ILD and TANOS Structure for Beyond 30nm Node", IEDM 2006, Dec. 11-13, 2006.
Souri, S. J., "Interconnect Performance in 3-Dimensional Integrated Circuits", PhD Thesis, Stanford, Jul. 2003.
Uemoto, Y., et al., "A High-Performance Stacked-CMOS SRAM Cell by Solid Phase Growth Technique", Symposium on VLSI Technology, 2010, pp. 21-22.
Jung, S.-M., et al., "Highly Cost Effective and High Performance 65nm S3( Stacked Single-crystal Si) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.
Steen, S.E., et al., "Overlay as the key to drive wafer scale 3D integration", Microelectronic Engineering 84 (2007) 1412-1415.
Maeda, N., et al., "Development of Sub 10-μm Ultra-Thinning Technology using Device Wafers for 3D Manufacturing of Terabit Memory", 2010 Symposium on VLSI Technology Digest of Technical Papers, pp. 105-106.
Lin, X., et al., "Local Clustering 3-D Stacked CMOS Technology for Interconnect Loading Reduction", IEEE Transactions on electron Devices, vol. 53, No. 6, Jun. 2006, pp. 1405-1410.
Chan, M., et al., "3-Dimensional Integration for Interconnect Reduction in for Nano-CMOS Technologies", IEEE Tencon, Nov. 23, 2006, Hong Kong.
Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.
Naito, T., et al., "World's first monolithic 3D-FPGA with TFT SRAM over 90nm 9 layer Cu CMOS", 2010 Symposium on VLSI Technology Digest of Technical Papers, pp. 219-220.
Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.
Cong, J., et al., "Quantitative Studies of Impact of 3D IC Design on Repeater Usage", Proceedings of International VLSI/ULSI Multilevel Interconnection Conference, pp. 344-348, 2008.
Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.
Crnogorac, F., et al., "Nano-graphoepitaxy of semiconductors for 3D integration", Microelectronic Engineering 84 (2007) 891-894.
Koyanagi, M, "Different Approaches to 3D Chips", 3D IC Review, Stanford University, May 2005.
Koyanagi, M, "Three-Dimensional Integration Technology and Integrated Systems", ASPDAC 2009 presentation.
Koyanagi, M., et al., "Three-Dimensional Integration Technology and Integrated Systems", ASPDAC 2009, paper 4D-1, pp. 409-415.
Hayashi, Y., et al., "A New Three Dimensional IC Fabrication Technology Stacking Thin Film Dual-CMOS Layers", IEDM 1991, paper 25.6.1, pp. 657-660.
Clavelier, L., et al., "Engineered Substrates for Future More Moore and More Than Moore Integrated Devices", IEDM 2010, paper 2.6.1, pp. 42-45.
Kim, K., "From the Future Si Technology Perspective: Challenges and Opportunities", IEDM 2010, pp 1.1.1-1.1.9.
Ababei, C., et al., "Exploring Potential Benefits of 3D FPGA Integration", in book by Becker, J.et al. Eds., "Field Programmable Logic 2004", LNCS 3203, pp. 874-880, 2004, Springer-Verlag Berlin Heidelberg.
Ramaswami, S., "3D TSV IC Processing", 3DIC Technology Forum Semicon Taiwan 2010, Sep. 9, 2010.
Davis, W.R., et al., "Demystifying 3D Ics: Pros and Cons of Going Vertical", IEEE Design and Test of Computers, Nov.-Dec. 2005, pp. 498-510.
Lin, M., et al., "Performance Benefits of Monolithically Stacked 3DFPGA", FPGA06, Feb. 22-24, 2006, Monterey, California, pp. 113-122.
Dong, C., et al., "Performance and Power Evaluation of a 3D CMOS/Nanomaterial Reconfigurable Architecture", ICCAD 2007, pp. 758-764.
Gojman, B., et al., "3D Nanowire-Based Programmable Logic", International Conference on Nano-Networks (Nanonets 2006), Sep. 14-16, 2006.
He, T., et al., "Controllable Molecular Modulation of Conductivity in Silicon-Based Devices", J. Am. Chem. Soc. 2009, 131, 10023-10030.
Henley, F., "Engineered Substrates Using the Nanocleave Process", SemiconWest, TechXPOT Conference—Challenges in Device Scaling, Jul. 19, 2006, San Francisco.
Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.
Diamant, G., et al., "Integrated Circuits based on Nanoscale Vacuum Phototubes", Applied Physics Letters 92, 262903-1 to 262903-3 (2008).
Landesberger, C., et al., "Carrier techniques for thin wafer processing", CS Mantech Conference, May 14-17, 2007 Austin, Texas, pp. 33-36.
Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.
Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.
Rajendran, B., et al., "Thermal Simulation of laser Annealing for 3D Integration", Proceedings VMIC 2003.
Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.
Borland, J.O., "Low Temperature Activation of Ion Implanted Dopants: A Review", International Workshop on Junction technology 2002, S7-3, Japan Society of Applied Physics, pp. 85-88.

Vengurlekar, A., et al., "Hydrogen Plasma Enhancement of Boron Activation in Shallow Junctions", Applied Physics Letters, vol. 85, No. 18, Nov. 1, 2004, pp. 4052-4054.

El-Maleh, A. H., et al., "Transistor-Level Defect Tolerant Digital System Design at the Nanoscale", Research Proposal Submitted to Internal Track Research Grant Programs, 2007. Internal Track Research Grant Programs.

Austin, T., et al., "Reliable Systems on Unreliable Fabrics", IEEE Design & Test of Computers, Jul./Aug. 2008, vol. 25, issue 4, pp. 322-332.

Borkar, S., "Designing Reliable Systems from Unreliable Components: The Challenges of Transistor Variability and Degradation", IEEE Micro, IEEE Computer Society, Nov.-Dec. 2005, pp. 10-16.

Zhu, S., et al., "N-Type Schottky Barrier Source/Drain MOSFET Using Ytterbium Silicide", IEEE Electron Device Letters, vol. 25, No. 8, Aug. 2004, pp. 565-567.

Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.

Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.

Awano, M., et al., "Advanced DSS MOSFET Technology for Ultrahigh Performance Applications", 2008 Symposium on VLSI Technology Digest of Technical Papers, pp. 24-25.

Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.

Zhang, M., et al., "Schottky barrier height modulation using dopant segregation in Schottky-barrier SOI-MOSFETs", Proceeding of ESSDERC, Grenoble, France, 2005, pp. 457-460.

Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.

Ko, C.H., et al., "NiSi Schottky Barrier Process-Strained Si (SB-PSS) CMOS Technology for High Performance Applications", 2006 Symposium on VLSI Technology Digest of Technical Papers.

Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.

Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.

Kaneko, A., et al., "High-Performance FinFET with Dopant-Segregated Schottky Source/Drain", IEDM 2006.

Kinoshita, A., et al., "Ultra Low Voltage Operations in Bulk CMOS Logic Circuits with Dopant Segregated Schottky Source/Drain Transistors", IEDM 2006.

Kinoshita, A., et al., "Comprehensive Study on Injection Velocity Enhancement in Dopant-Segregated Schottky MOSFETs", IEDM 2006.

Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.

Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.

Agoura Technologies white paper, "Wire Grid Polarizers: a New High Contrast Polarizer Technology for Liquid Crystal Displays", 2008, pp. 1-12.

Unipixel Displays, Inc. white paper, "Time Multi-plexed Optical Shutter (TMOS) Displays", Jun. 2007, pp. 1-49.

Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.

Azevedo, I. L., et al., "The Transition to Solid-State Lighting", Proc. IEEE, vol. 97, No. 3, Mar. 2009, pp. 481-510.

Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.

Tong, Q.-Y., et al., "A "smarter-cut" approach to low temperature silicon layer transfer", Applied Physics Letters, vol. 72, No. 1, Jan. 5, 1998, pp. 49-51.

Sadaka, M., et al., "Building Blocks for wafer level 3D integration", www.electroiq.com, Aug. 18, 2010, last accessed Aug. 18, 2010.

Tong, Q.-Y., et al., "Low Temperature Si Layer Splitting", Proceedings 1997 IEEE International SOI Conference, Oct. 1997, pp. 126-127.

Nguyen, P., et al., "Systematic study of the splitting kinetic of H/He co-implanted substrate", SOI Conference, 2003, pp. 132-134.

Ma, X., et al., "A high-quality SOI structure fabricated by low-temperature technology with B+/H+ co-implantation and plasma bonding", Semiconductor Science and Technology, vol. 21, 2006, pp. 959-963.

Yu, C.Y., et al., "Low-temperature fabrication and characterization of Ge-on-insulator structures", Applied Physics Letters, vol. 89, 101913-1 to 101913-2 (2006).

Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.

Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.

Aspar, B., et al., "Transfer of structured and patterned thin silicon films using the Smart-Cut process", Electronics Letters, Oct. 10, 1996, vol. 32, No. 21, pp. 1985-1986.

Madan, N., et al., "Leveraging 3D Technology for Improved Reliability," Proceedings of the 40th Annual IEEE/ACM International Symposium on Microarchitecture (MICRO 2007), IEEE Computer Society.

Hayashi, Y., et al., "Fabrication of Three Dimensional IC Using "Cumulatively Bonded IC" (CUBIC) Technology", 1990 Symposium on VLSI Technology, pp. 95-96.

Akasaka, Y., "Three Dimensional IC Trends," Proceedings of the IEEE, vol. 24, No. 12, Dec. 1986.

Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.

Kunio, T., et al., "Three Dimensional ICs, Having Four Stacked Active Device Layers," IEDM 1989, paper 34.6, pp. 837-840.

Agarwal, A., et al., "Efficient production of silicon-on-insulator films by co-implantation of He+ with H+" Applied Physics Letters, vol. 72, No. 9, Mar. 1998, pp. 1086-1088.

Cook III, G. O., et al., "Overview of transient liquid phase and partial transient liquid phase bonding," Journal of Material Science, vol. 46, 2011, pp. 5305-5323.

Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.

Gaillardon, P-E., et al., "Can We Go Towards True 3-D Architectures?," DAC 2011, paper 58, pp. 282-283.

Subbarao, M., et al., "Depth from Defocus: A Spatial Domain Approach," International Journal of Computer Vision, vol. 13, No. 3, pp. 271-294 (1994).

Subbarao, M., et al., "Focused Image Recovery from Two Defocused Images Recorded with Different Camera Settings," IEEE Transactions on Image Processing, vol. 4, No. 12, Dec. 1995, pp. 1613-1628.
Yun, J-G., et al., "Single-Crystalline Si Stacked Array (STAR) NAND Flash Memory," IEEE Transactions on Electron Devices, vol. 58, No. 4, Apr. 2011, pp. 1006-1014.
Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.
Goplen, B., et al., "Thermal Via Placement in 3DICs," Proceedings of the International Symposium on Physical Design, Apr. 3-6, 2005, San Francisco.
Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).
Gawlik, G., et al., "GaAs on Si: towards a low-temperature "smart-cut" technology", Vacuum, vol. 70, pp. 103-107 (2003).
Weldon, M. K., et al., "Mechanism of Silicon Exfoliation Induced by Hydrogen/Helium Co-implantation," Applied Physics Letters, vol. 73, No. 25, pp. 3721-3723 (1998).
Bobba, S., et al., "Performance Analysis of 3-D Monolithic Integrated Circuits," 2010 IEEE International 3D Systems Integration Conference (3DIC), Nov. 2010, Munich, pp. 1-4.
Batude, P., et al., "Demonstration of low temperature 3D sequential FDSOI integration down to 50nm gate length," 2011 Symposium on VLSI Technology Digest of Technical Papers, pp. 158-159.
Batude, P., et al., "Advances, Challenges and Opportunities in 3D CMOS Sequential Integration," 2011 IEEE International Electron Devices Meeting, paper 7.3, Dec. 2011, pp. 151-154.
Miller, D.A.B., "Optical interconnects to electronic chips," Applied Optics, vol. 49, No. 25, Sep. 1, 2010, pp. F59-F70.

* cited by examiner

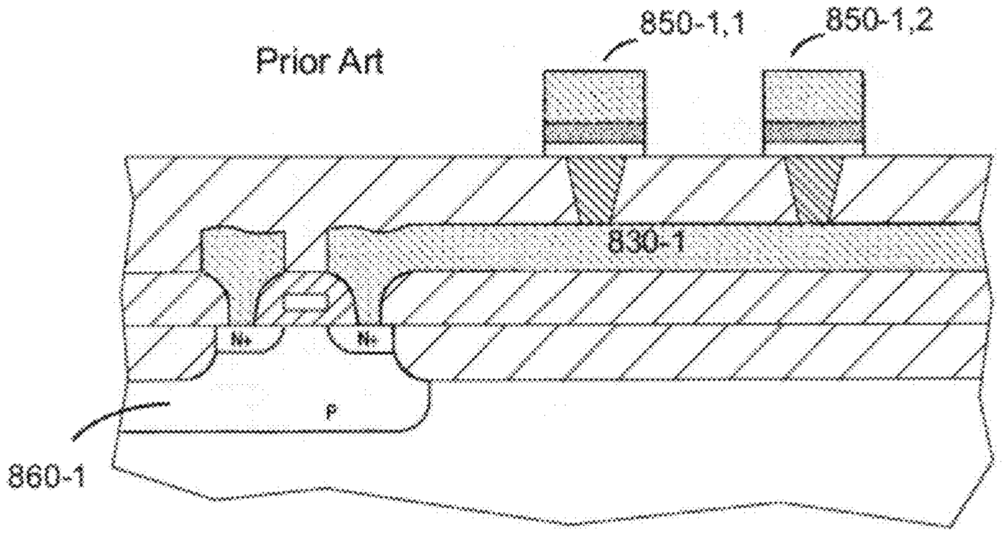
Fig. 2 - prior art

Flow for '3D Partition' (To two dies connected by TSV):

2104
2106
2108
N+
P-
P+
808

29B02
29B04
N+
P-
P+
808

29C06
29C02
29C04
N+
P-
P+

Alignment of "through layer via" mask to connect object in the transferred wafer top layer 3000L with a landing strip 33A04 in the preprocessed base wafer 3100

Alignment of transferred wafer top layer 3000L landing strip 33B04 mask to connect with via 33B02 that is aligned to preprocessed base wafer 3100

Power up and initialize an FPGA device diced from a Continuous Array to accept bit-stream and other control data from external source.
MCU Power up Program Single Gated N+ Resistor with P+ gate, Gate-ox = 10nm, Channel Length = 1um; D (Depth) = 20nm

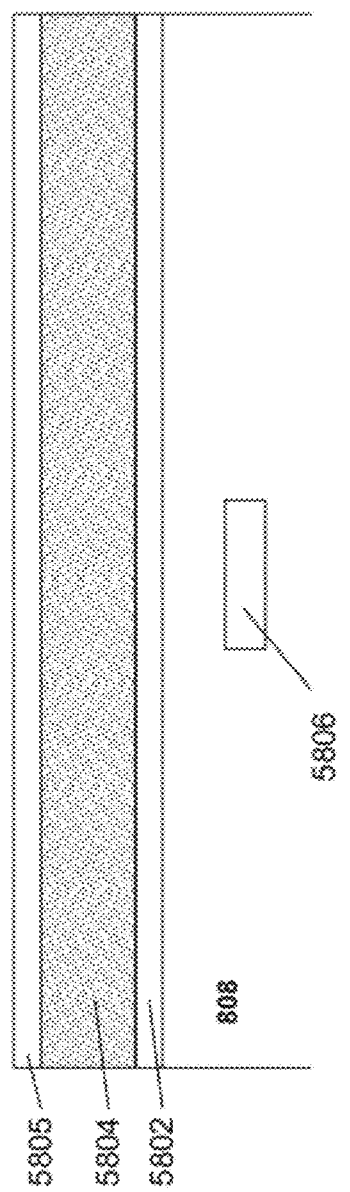
Fig, 58C
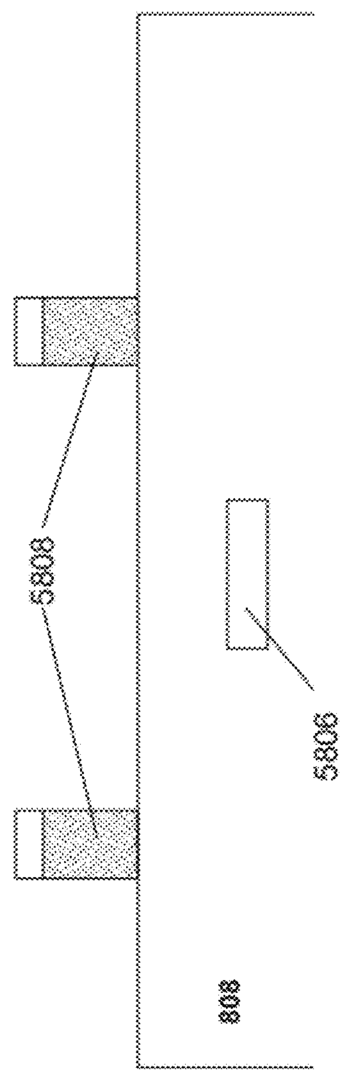
Fig, 58D

Alignment of "through layer via" mask to connect landing strip 77A06 in the transferred wafer top layer 7000 with a landing strip 77A04 in the acceptor wafer 3100

Alignment of transferred wafer top layer 7000 landing strip 77A06 to connect with through layer via 77A02 that is aligned to landing strip 77A04 in the top layer of the underlying acceptor wafer.

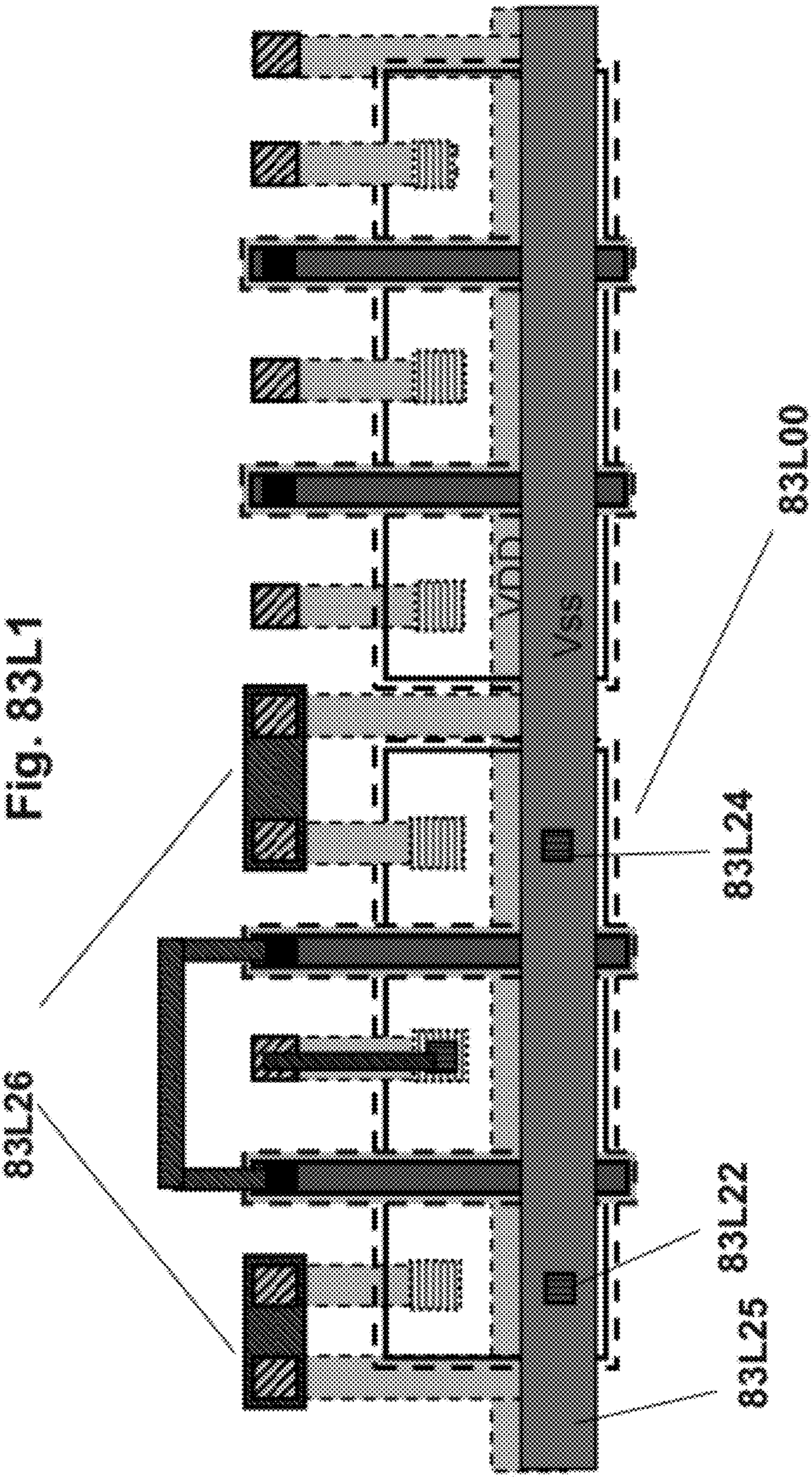
Fig. 83L1

Fig. 83L2
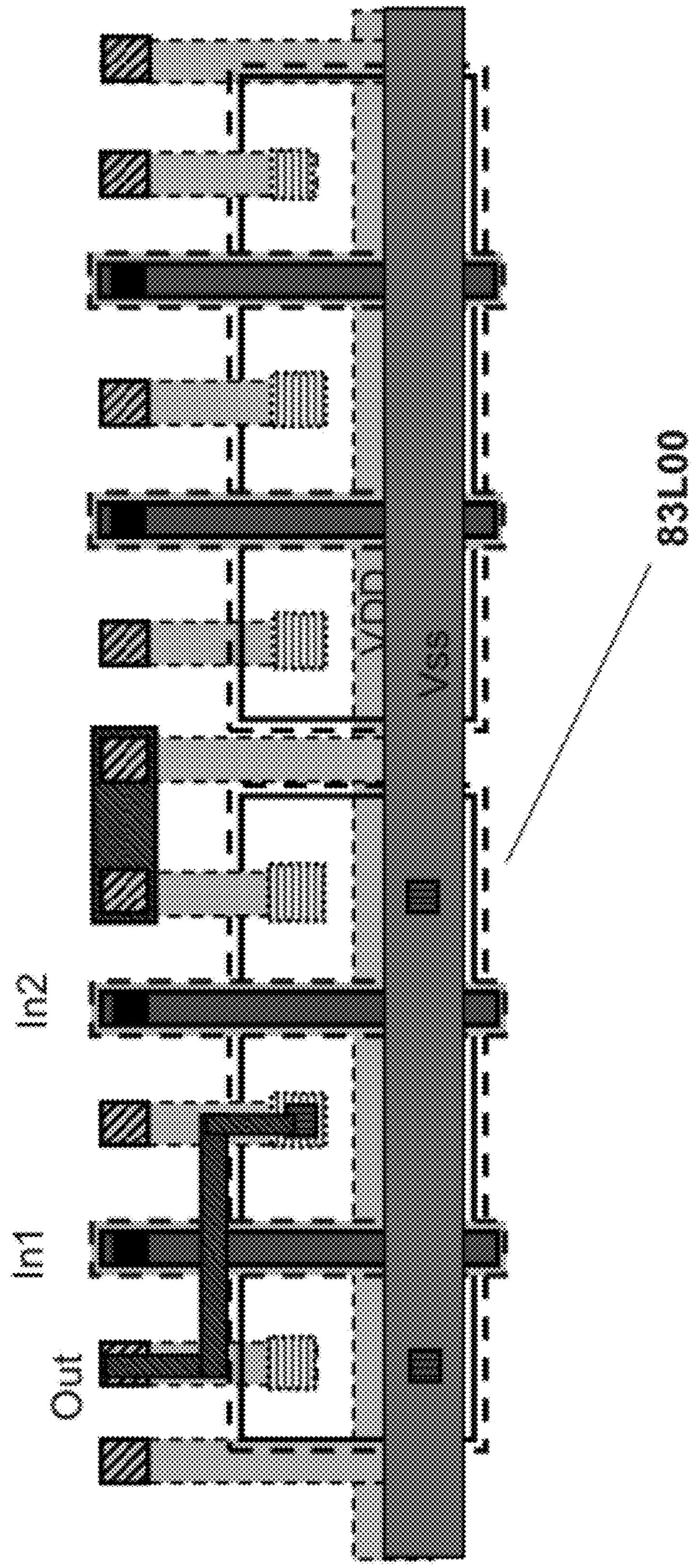

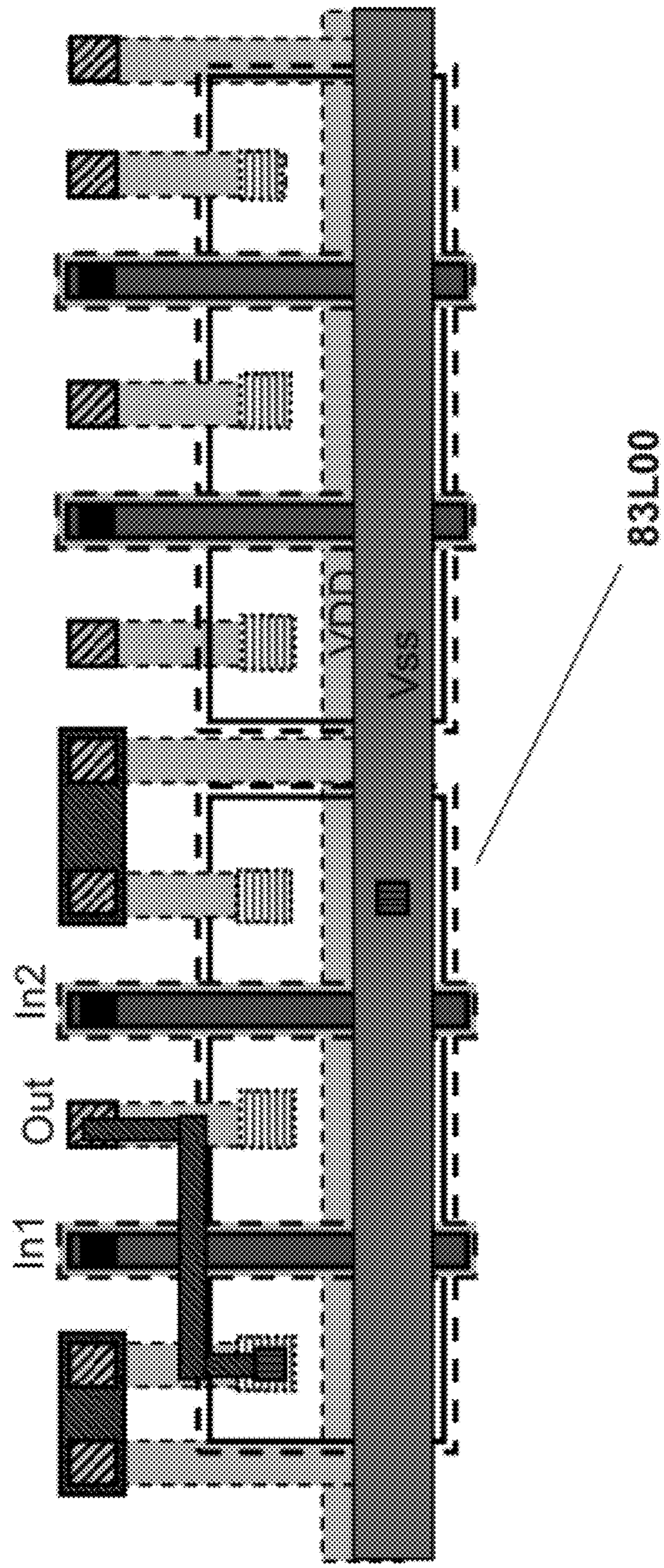
Fig. 83L3

Fig. 83L4
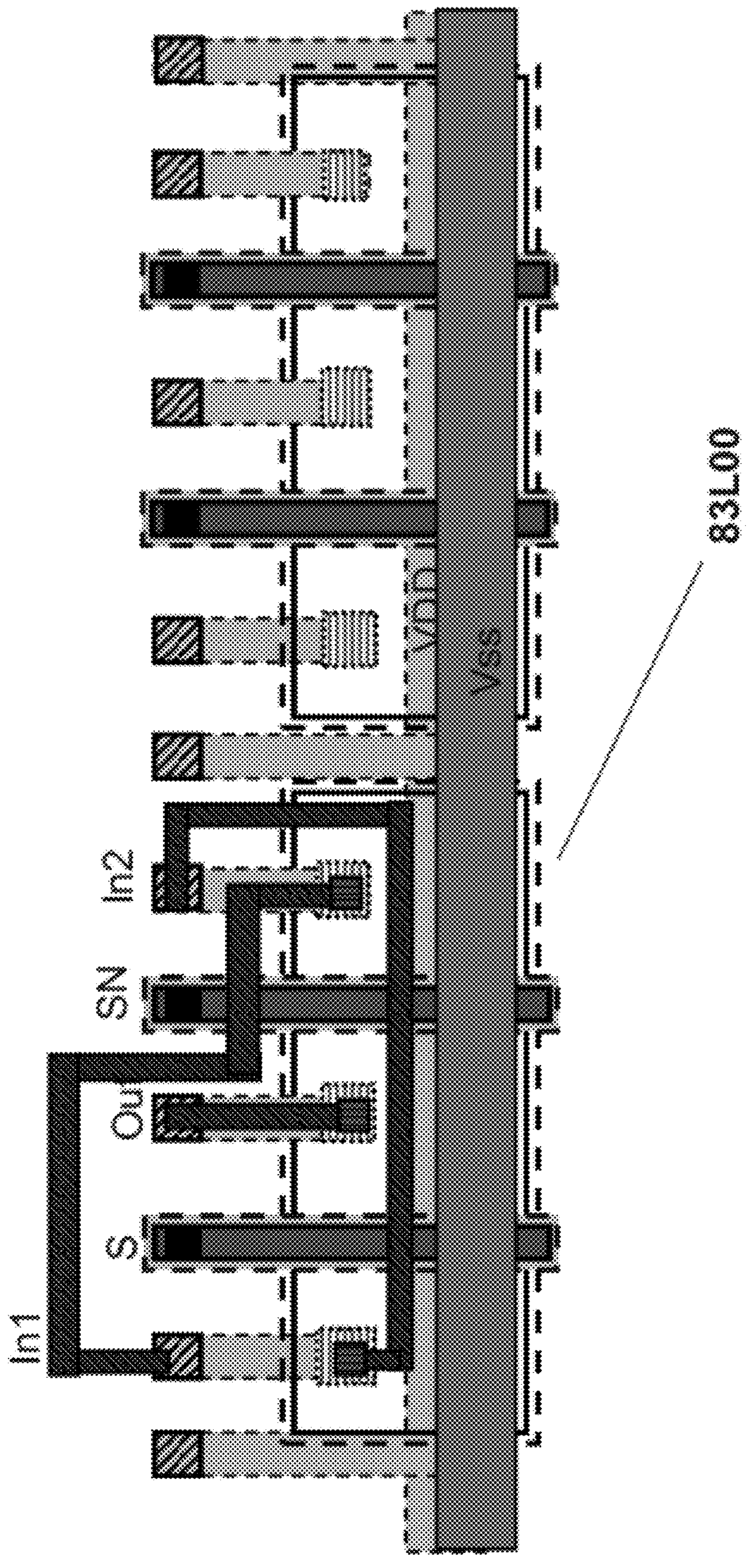

8402

8402

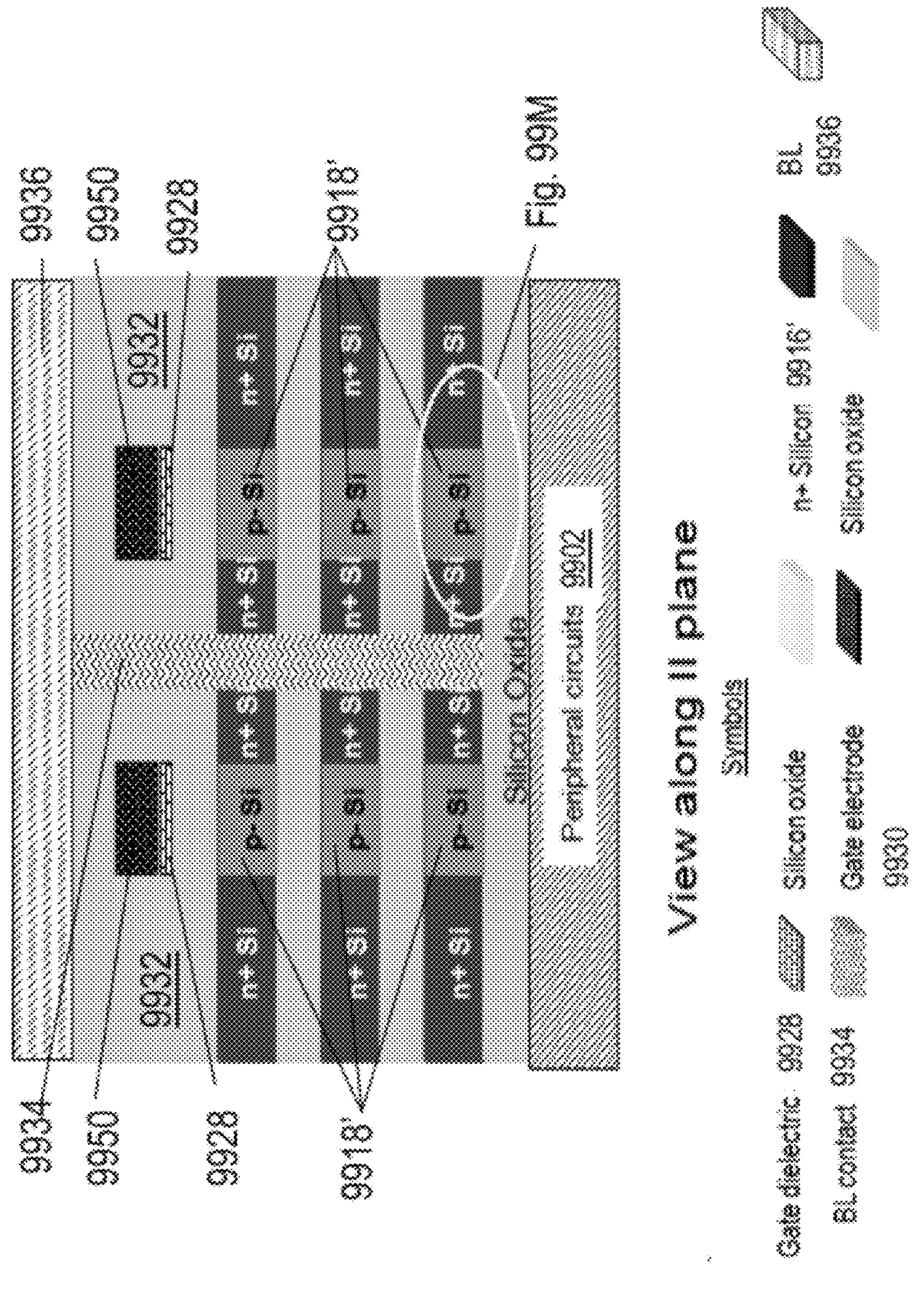
Fig. 99L1

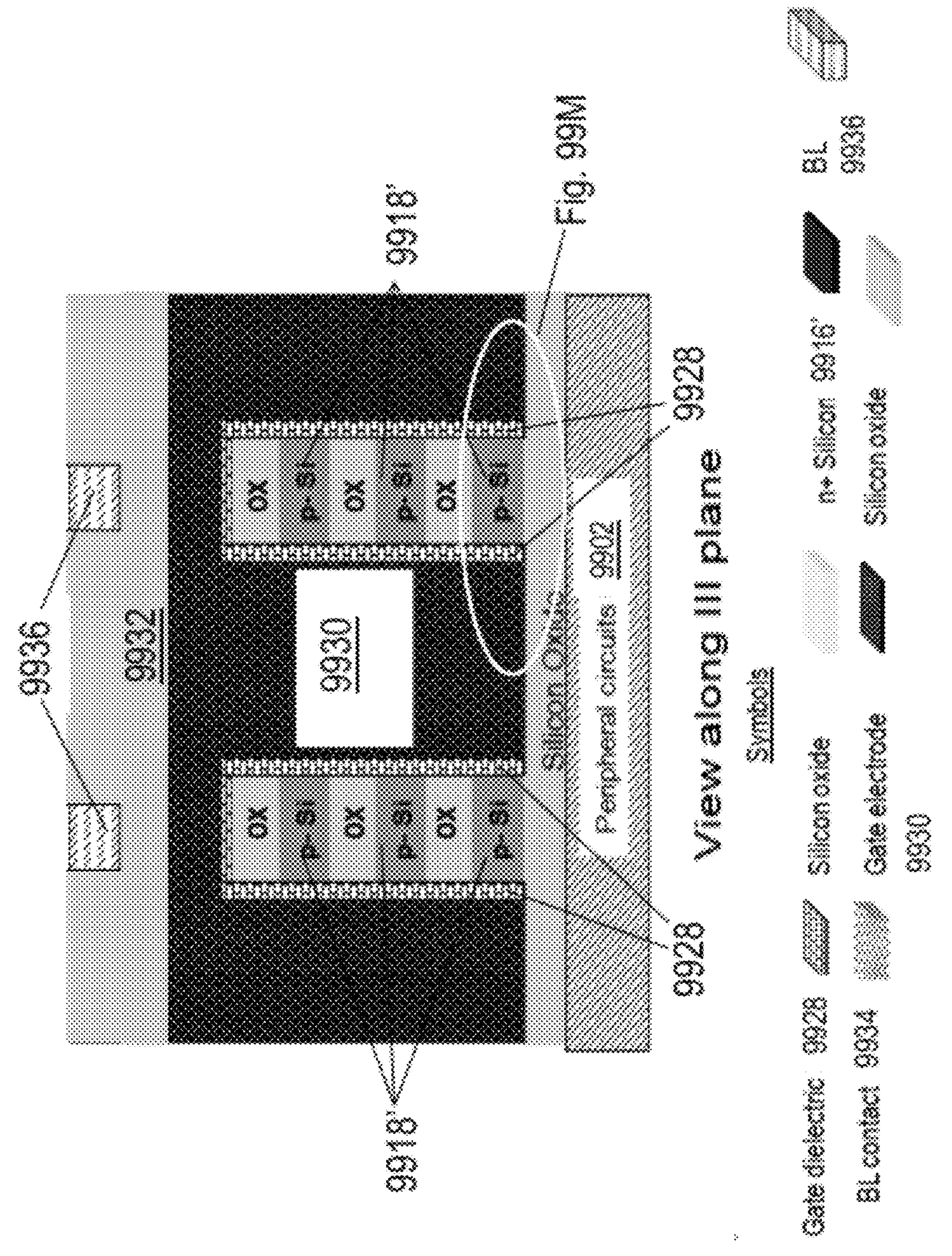
Fig. 99L2

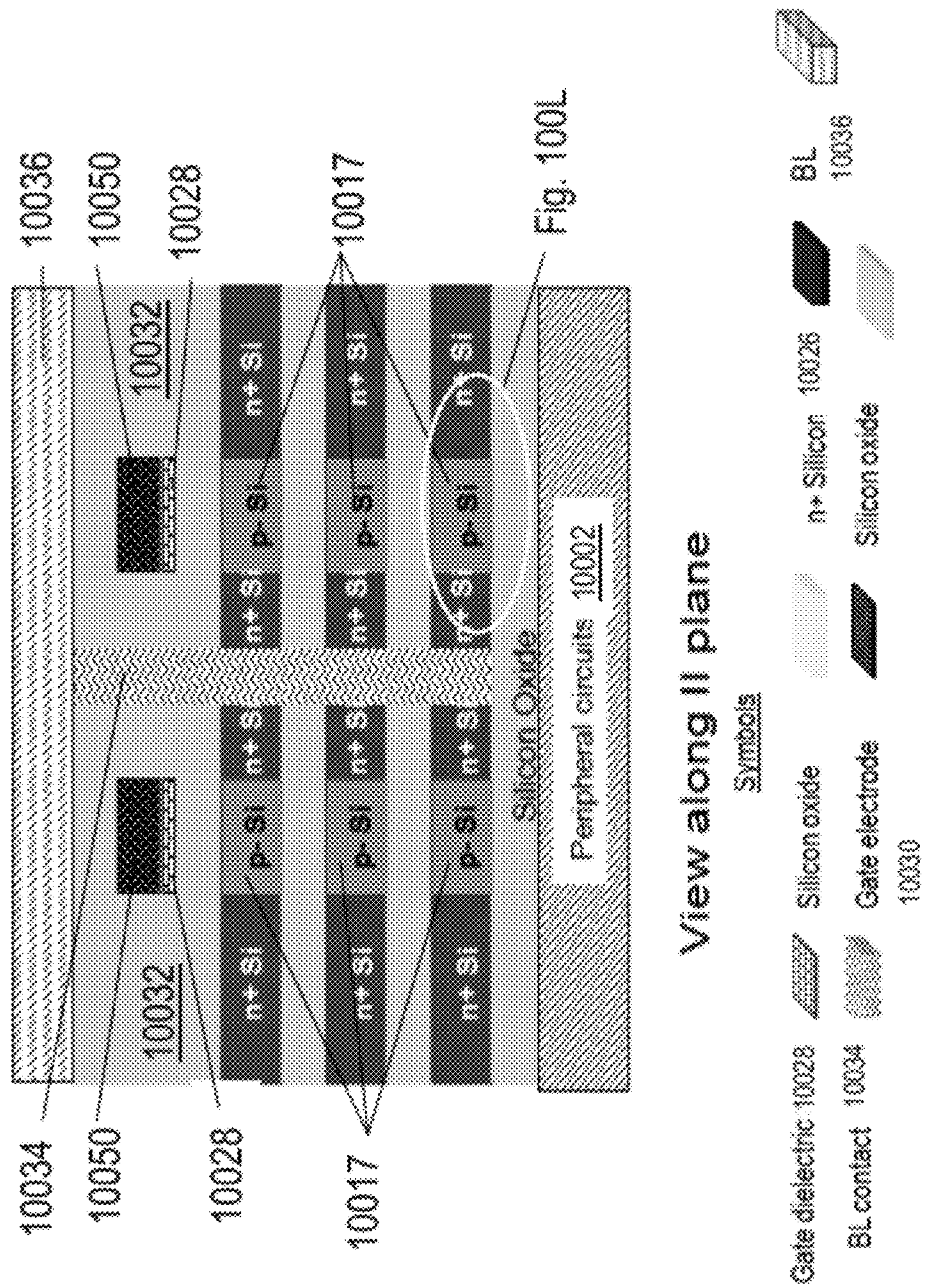
Fig. 100K1

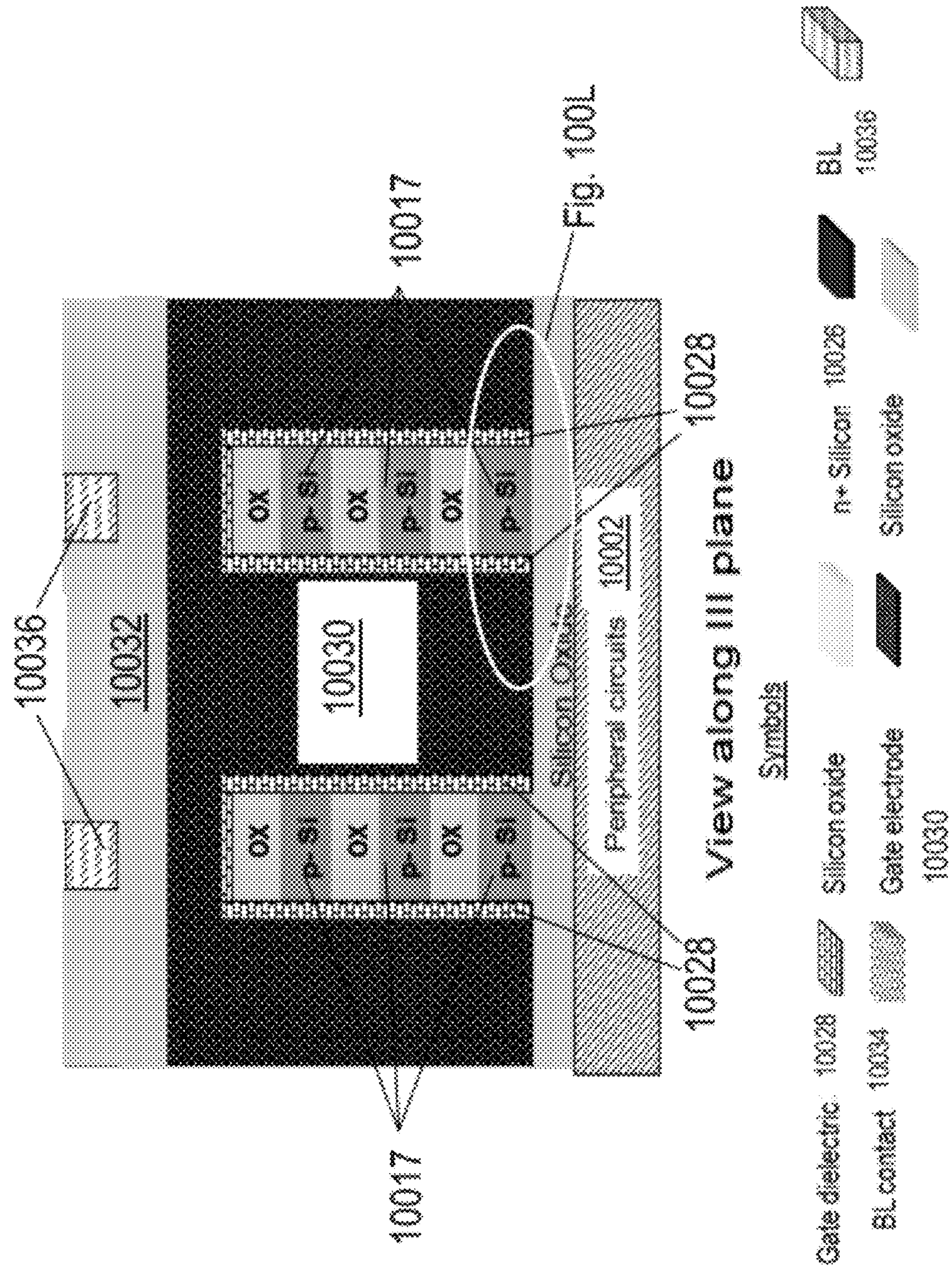
Fig. 100K2

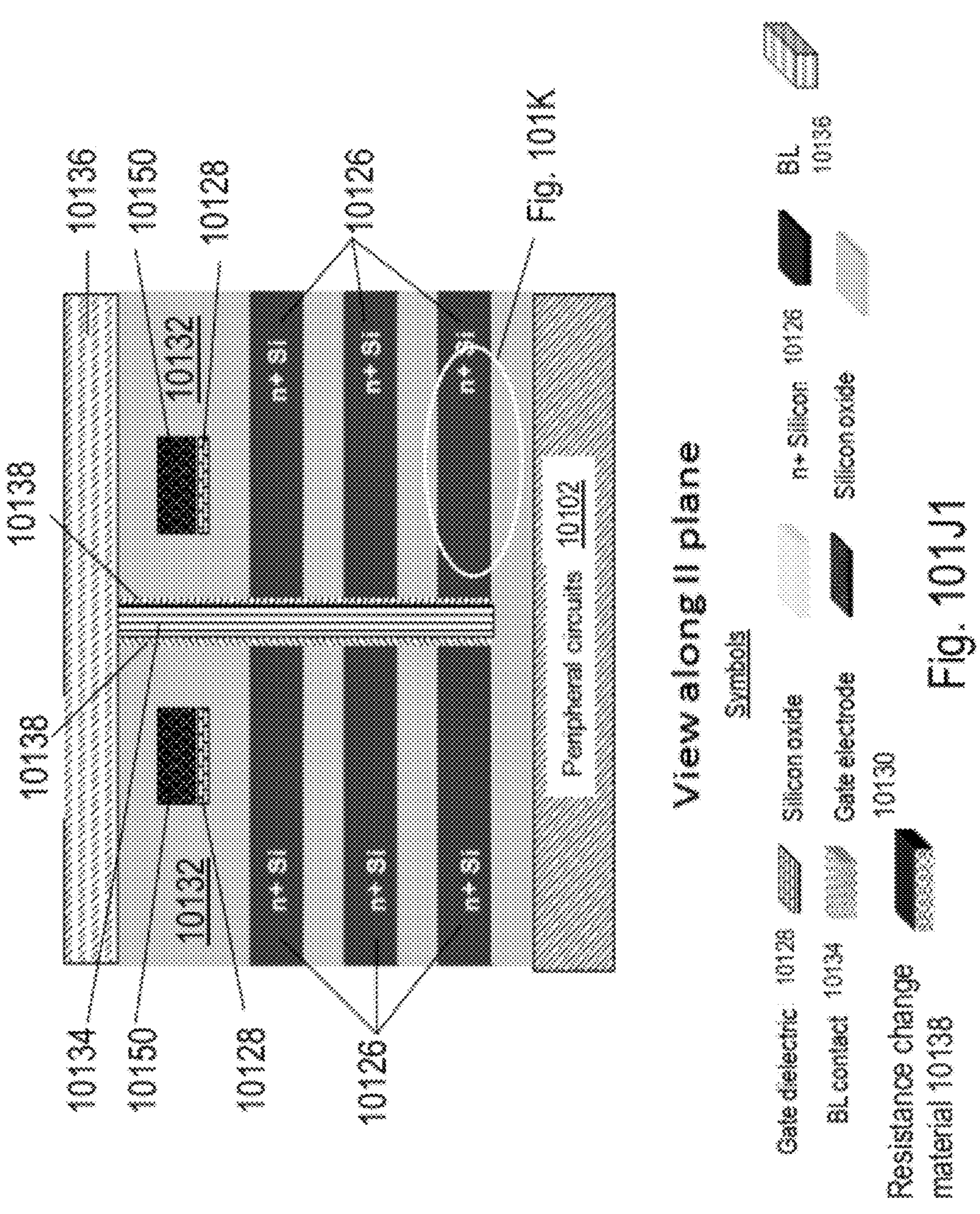
Fig. 101J1

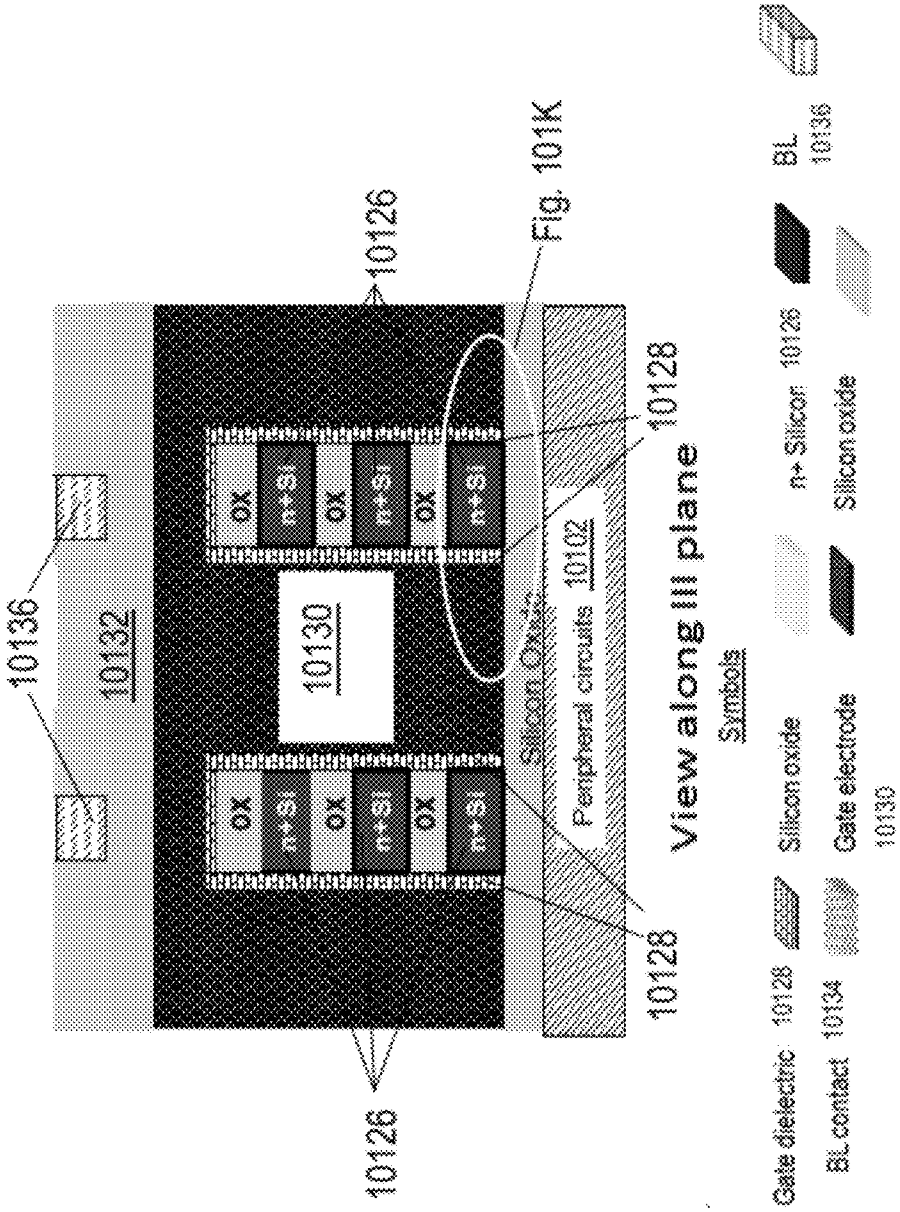
Fig. 101J2

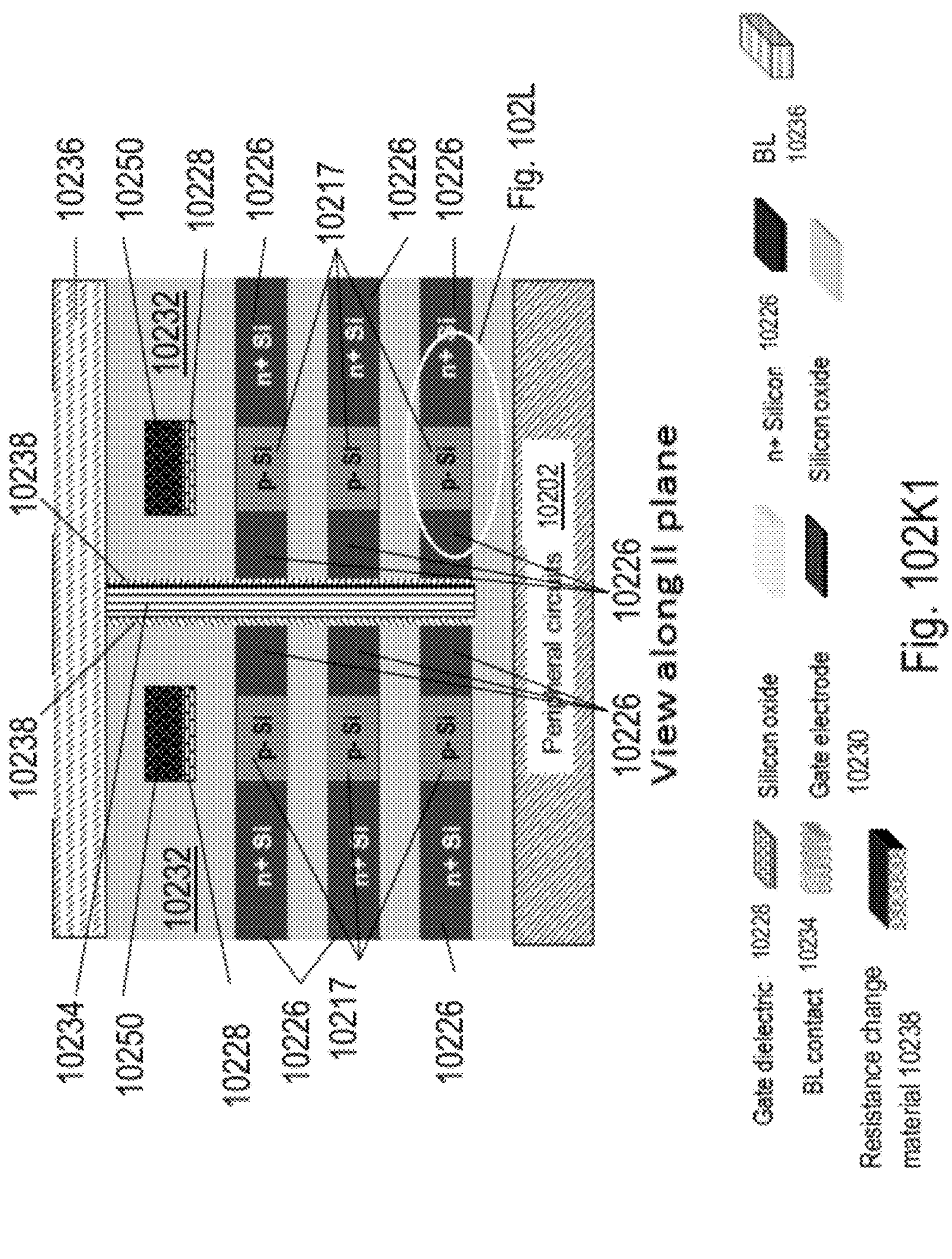
Fig. 102K1

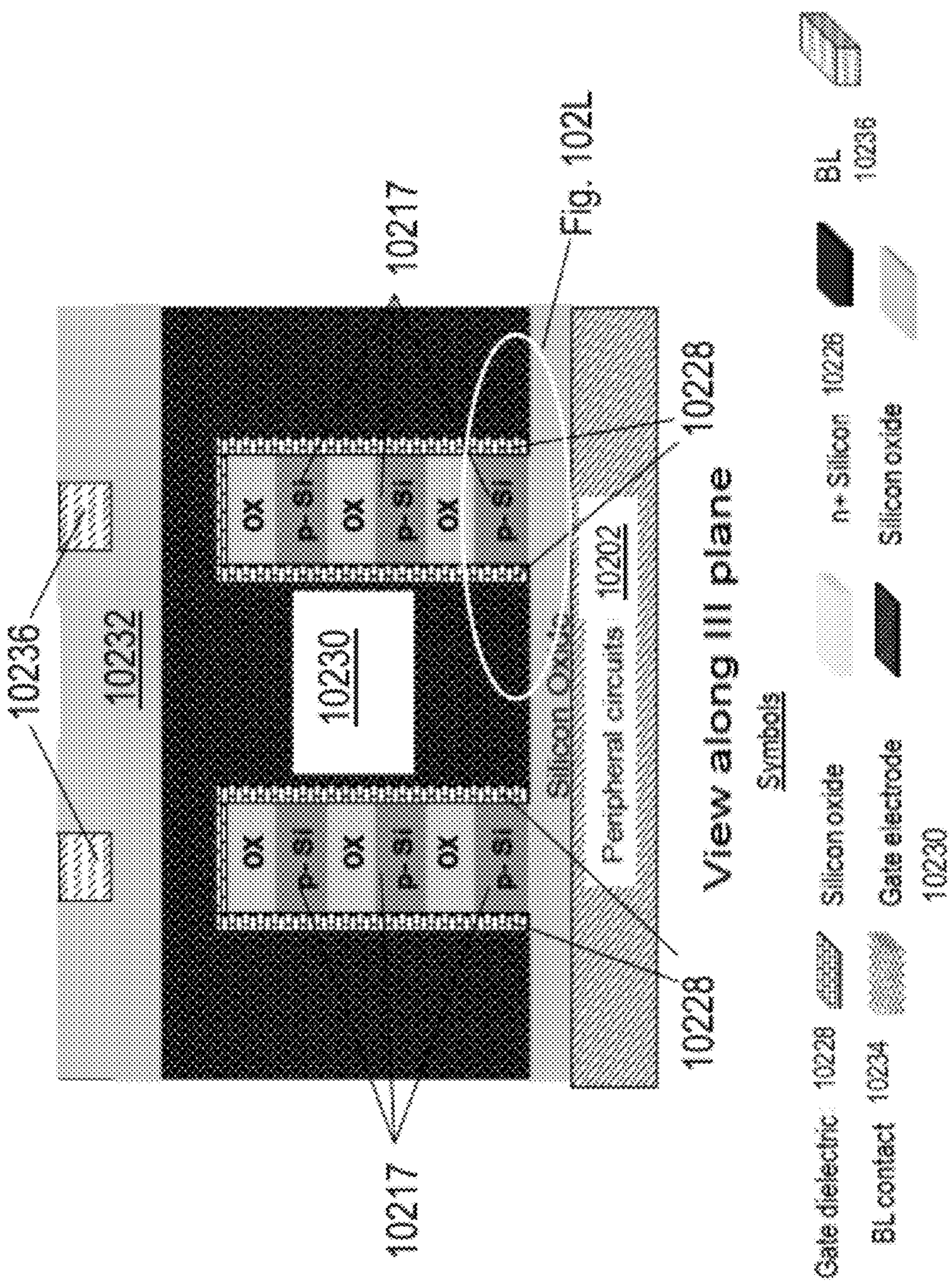
Fig. 102K2

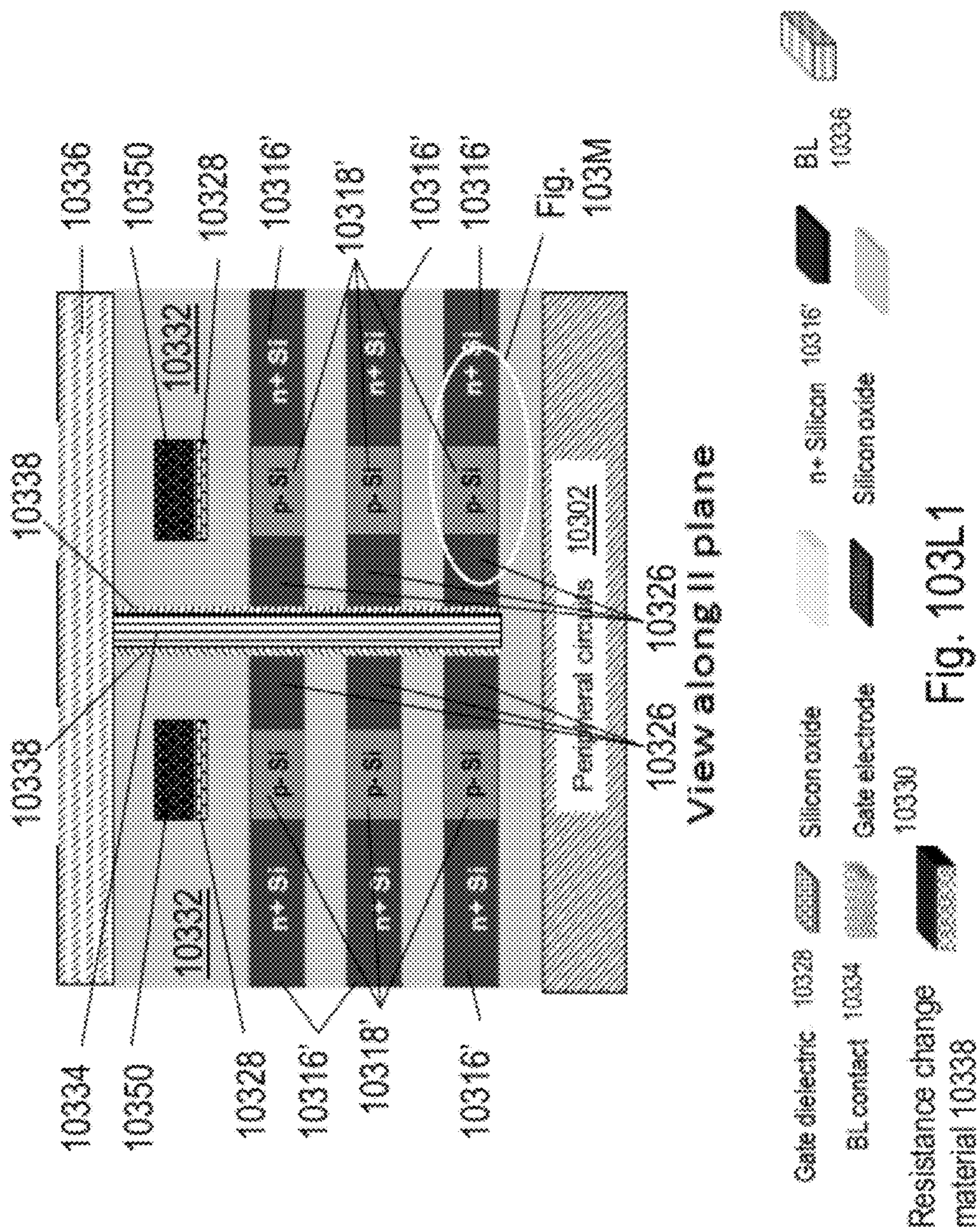
Fig. 103L1

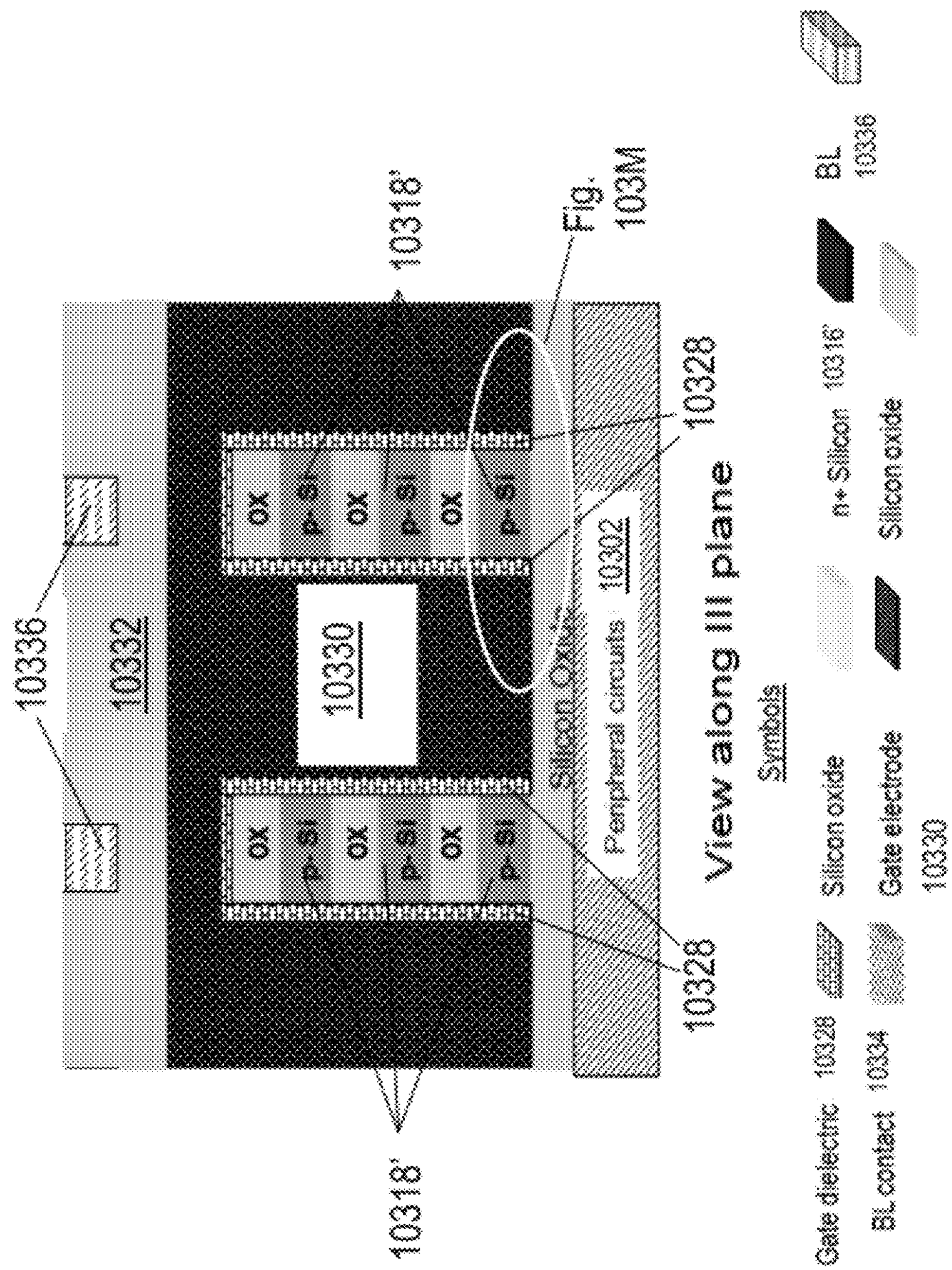
Fig. 103L2

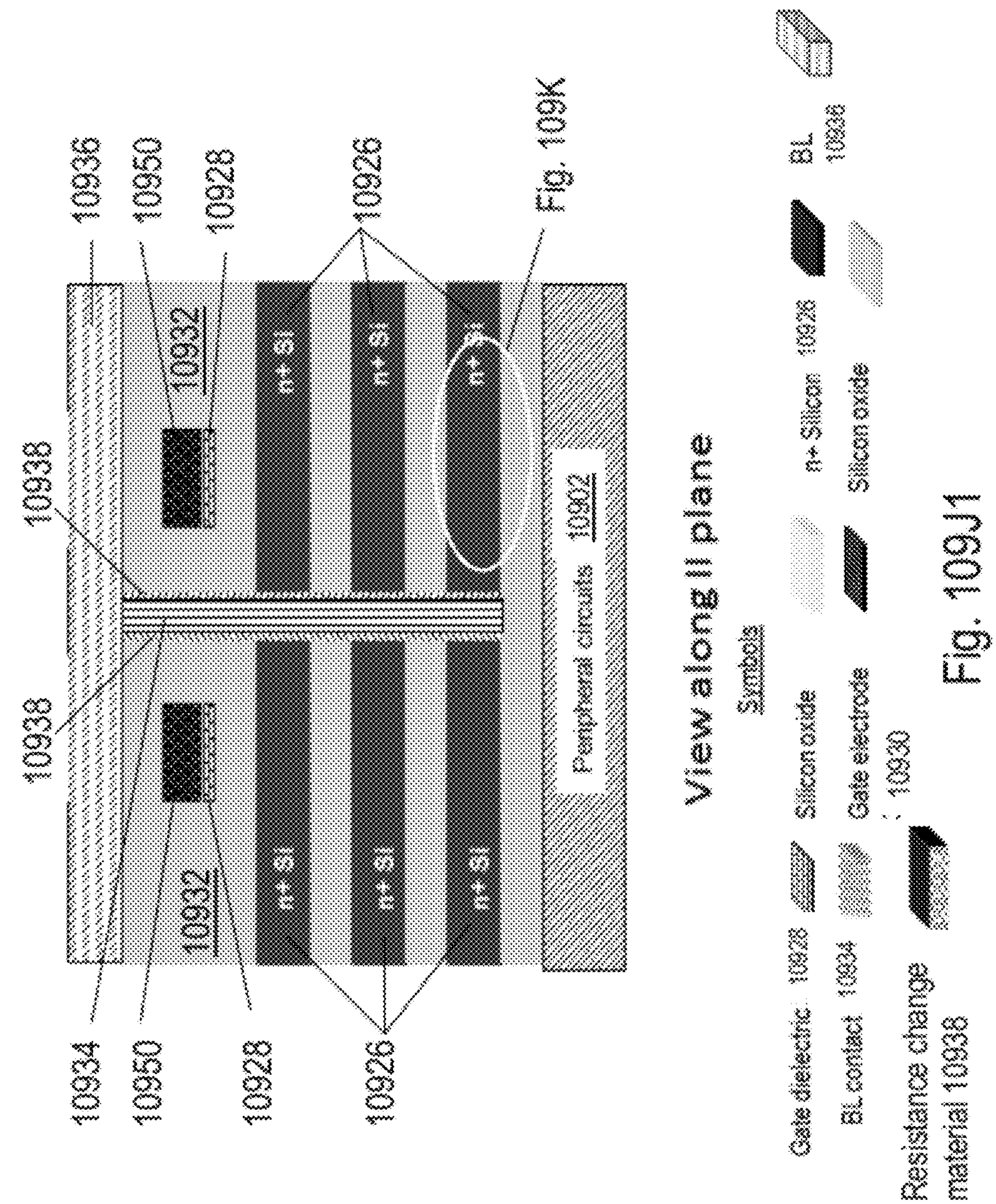
Fig. 109J1

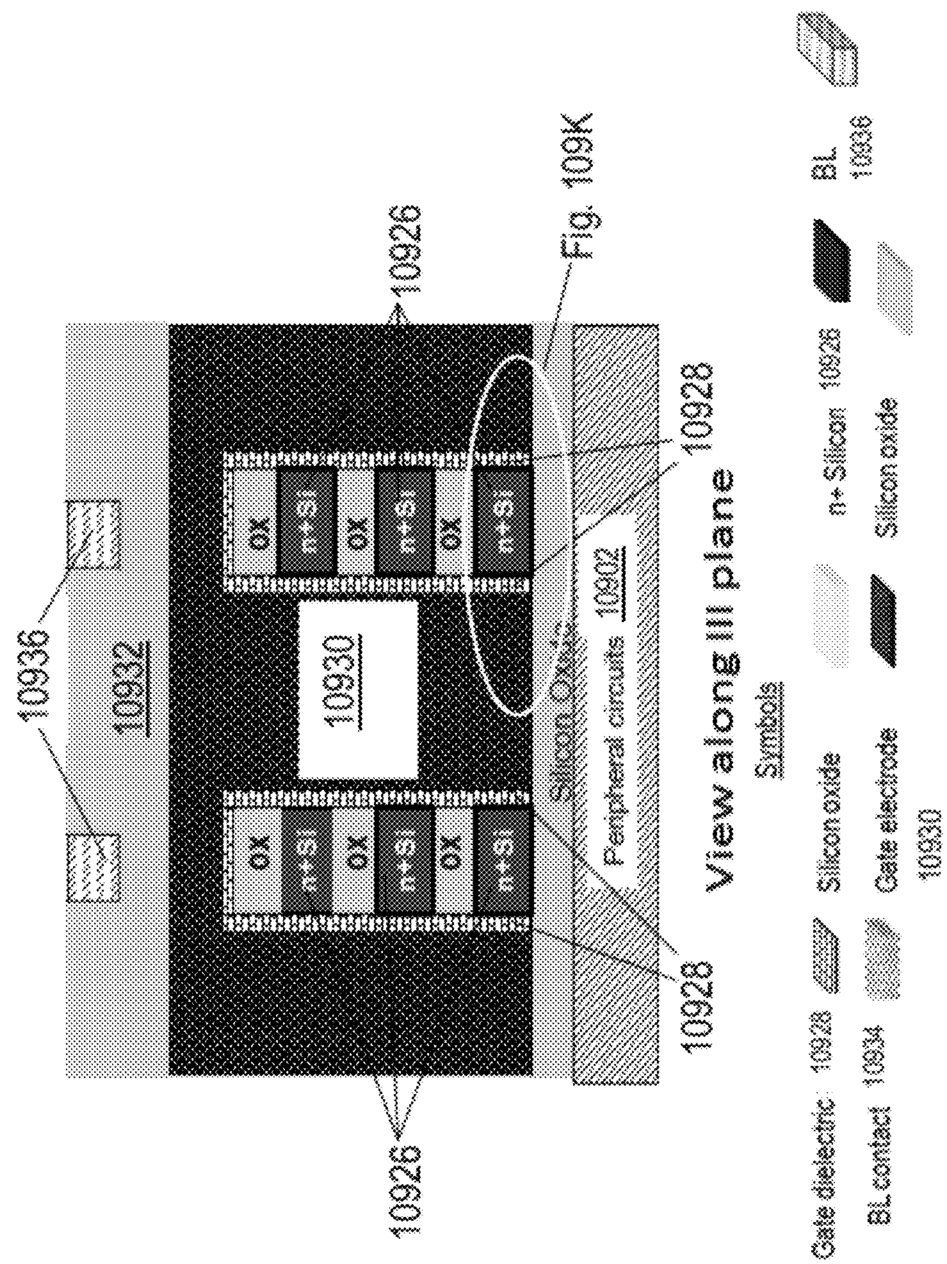
Fig. 109J2

METHOD OF CONSTRUCTING A SEMICONDUCTOR DEVICE AND STRUCTURE

CROSS-REFERENCE OF RELATED APPLICATION

This application is a continuation-in-part of co-pending U.S. patent application No. 13/016,313, filed on Jan. 28, 2011, which is a continuation-in-part of U.S. patent application Ser. No. 12/970,602, filed on Dec. 16, 2010, which is a continuation-in-part of U.S. patent application Ser. No. 12/949,617, filed on Nov. 18, 2010. The contents of the foregoing applications are incorporated herein by reference.

BACKGROUND OF THE INVENTION

1. Field of the Invention

This application relates to the general field of Integrated Circuit (IC) devices and fabrication methods, and more particularly to multilayer or Three Dimensional Integrated Circuit (3D IC) devices and fabrication methods.

2. Discussion of Background Art

Semiconductor manufacturing is known to improve device density in an exponential manner over time, but such improvements come with a price. The mask set cost required for each new process technology has also been increasing exponentially. While 20 years ago a mask set cost less than $20,000, it is now quite common to be charged more than $1M for today's state of the art device mask set.

These changes represent an increasing challenge primarily to custom products, which tend to target smaller volume and less diverse markets therefore making the increased cost of product development very hard to accommodate.

Custom Integrated Circuits can be segmented into two groups. The first group includes devices that have all their layers custom made. The second group includes devices that have at least some generic layers used across different custom products. Well-known examples of the second kind may include Gate Arrays, which use generic layers for all layers up to a contact layer that couples the silicon devices to the metal conductors, and Field Programmable Gate Array (FPGA) devices where all the layers are generic. The generic layers in such devices may mostly be a repeating pattern structure, called a Master Slice, in an array form.

The logic array technology may be based on a generic fabric customized for a specific design during the customization stage. For an FPGA the customization may be done through programming by electrical signals. For Gate Arrays, which in their modern form are sometimes called Structured Application Specific Integrated Circuits (or Structured ASICs), the customization may be by at least one custom layer, which might be done with Direct Write eBeam or with a custom mask. As designs tend to be highly variable in the amount of logic and memory and type of input & output (I/O) each one may need, vendors of logic arrays create product families, each product having a different number of Master Slices covering a range of logic, memory size and I/O options. Yet, it is typically a challenge to come up with minimum set of Master Slices that can provide a good fit for the maximal number of designs because it may be quite costly to use a dedicated mask set for each product.

U.S. Pat. No. 4,733,288 issued to Sato in March 1988 ("Sato"), discloses a method "to provide a gate-array LSI chip which can be cut into a plurality of chips, each of the chips having a desired size and a desired number of gates in accordance with a circuit design." The references cited in Sato present a few alternative methods to utilize a generic structure for different sizes of custom devices.

The array structure may fit the objective of variable sizing. The difficulty to provide variable-sized array structure devices may result from the need of providing I/O cells and associated pads to connect the device to the package. To overcome this difficulty Sato suggests a method wherein I/O could be constructed from the transistors also used for the general logic gates. Anderson also suggested a similar approach. U.S. Pat. No. 5,217,916 issued to Anderson et al. on Jun. 8, 1993, discloses a borderless configurable gate array free of predefined boundaries using transistor gate cells, of the same type of cells used for logic, to serve the input and output function. Accordingly, the input and output functions may be placed to surround the logic array sized for the specific application. This method may place a potential limitation on the I/O cell to use the same type of transistors as used for the logic and; hence, may not allow the use of higher operating voltages for the I/O.

U.S. Pat. No. 7,105,871 issued to Or-Bach et al. on Sep. 12, 2006, discloses a semiconductor device that includes a borderless logic array and area I/Os. The logic array may comprise a repeating core, and at least one of the area I/Os may be a configurable I/O.

In the past it was reasonable to design an I/O cell that could be configured to the various needs of most customers. The ever increasing need of higher data transfer rate in and out of the device drove the development of special serial I/O circuits called SerDes (Serializer/Deserializer) transceivers. These circuits are complex and may lead to a far larger silicon area than conventional I/Os. Consequently, the variations may be combinations of various amounts of logic, various amounts and types of memories, and various amounts and types of I/O. This implies that even the use of the borderless logic array of the prior art may still lead to multiple expensive mask sets.

The most common FPGAs in the market today may be based on Static Random Access Memory (SRAM) as the programming element. Floating-Gate Flash programmable elements may also be utilized to some extent. Less commonly, FPGAs may use an antifuse as the programming element. The first generation of antifuse FPGAs used antifuses that were built directly in contact with the silicon substrate itself. The second generation moved the antifuse to the metal layers to utilize what is called the Metal to Metal Antifuse. These antifuses function like programmable vias. However, unlike vias made with the same metal and used for the interconnection, these antifuses may generally use amorphous silicon and some additional interface layers. While in theory antifuse technology could support a higher density than SRAM, the SRAM FPGAs are dominating the market today. In fact, it seems that no one is advancing Antifuse FPGA devices anymore. One of the potential disadvantages of antifuse technology has been their lack of re-programmability. Another potential disadvantage has been the special silicon manufacturing process required for the antifuse technology which results in extra development costs and the associated time lag with respect to baseline IC technology scaling.

The general potential disadvantage of common FPGA technologies may be their relatively poor use of silicon area. While the end customer may only care to have the device perform his desired function, the need to program the FPGA to any function may require the use of a very significant portion of the silicon area for the programming and programming check functions.

Some embodiments of the invention seek to overcome the prior-art limitations and provide some additional illustrative benefits by making use of special types of transistors that are fabricated above or below the antifuse configurable interconnect circuits and thereby allow far better use of the silicon area.

One type of such transistors is commonly known in the art as Thin Film Transistors or TFT. Thin Film Transistors has been proposed and used for over three decades. One of the better-known usages has been for displays where the TFT are fabricated on top of the glass used for the display. Other type of transistors that could be fabricated above the antifuse configurable interconnect circuits are called Vacuum Field Effect Transistor (FET) and was introduced three decades ago such as in U.S. Pat. No. 4,721,885.

Other techniques could also be used such as employing Silicon On Insulator (SOI) technology. In U.S. Pat. Nos. 6,355,501 and 6,821,826, both assigned to IBM, a multilayer three-dimensional Complementary Metal-Oxide-Semiconductor (CMOS) Integrated Circuit is proposed. It suggests bonding an additional thin SOI wafer on top of another SOI wafer forming an integrated circuit on top of another integrated circuit and connecting them by the use of a through-silicon-via, or through layer via (TLV). Substrate supplier Soitec SA, of Bernin, France is now offering a technology for stacking of a thin layer of a processed wafer on top of a base wafer.

Integrating top layer transistors above an insulation layer is not common in an IC because the quality and density of prior art top layer transistors may be inferior to those formed in the base (or substrate) layer. The substrate may be formed of mono-crystalline silicon and may be feasible for producing high density and high quality transistors, and hence suitable. There may be some applications where it has been suggested to build memory bit cells using such transistors as in U.S. Pat. Nos. 6,815,781, 7,446,563 and a portion of an SRAM based FPGA such as in U.S. Pat. Nos. 6,515,511 and 7,265,421.

Some embodiments of the invention may provide a much higher density antifuse-based programmable logic by utilizing the top layer transistor. An additional illustrated advantage for such use may be the option to further reduce cost in high volume production by utilizing custom mask(s) to replace the antifuse function, thereby eliminating the top layer(s) anti-fuse programming logic altogether.

Additionally some embodiments of the invention may provide innovative alternatives for multi-layer 3D IC technology. As on-chip interconnects are becoming the limiting factor for performance and power enhancement with device scaling, 3D IC may be a potential technology for future generations of ICs. Currently the only viable technology for 3D IC is to finish the IC by the use of Through-Silicon-Via (TSV). The problem with TSVs is that they are relatively large (a few microns each in area) and therefore may lead to highly limited vertical connectivity. Some embodiments of the invention may provide multiple alternatives for 3D IC with an order of magnitude improvement in vertical connectivity.

Constructing future 3D ICs may require new architectures and new ways of thinking. In particular, yield and reliability of extremely complex three dimensional systems may have to be addressed, particularly given the yield and reliability difficulties encountered in building complex Application Specific Integrated Circuits (ASIC) of recent deep submicron process generations.

Fortunately, current testing techniques may likely prove applicable to 3D IC manufacturing, though they will be applied in very different ways. FIG. 116 illustrates a prior art set scan architecture in a 2D IC ASIC 11600. The ASIC functionality may be present in logic clouds 11620, 11622, 11624 and 11626 which are interspersed with sequential cells like, for example, pluralities of flip-flops indicated at 11612, 11614 and 11616. The 2D IC ASIC 11600 may also include input pads 11630 and output pads 11640. The flip-flops may be typically provided with circuitry to allow them to function as a shift register in a test mode. In FIG. 116 the flip-flops form a scan register chain where pluralities of flip-flops 11612, 11614 and 11616 are coupled together in series with Scan Test Controller 11610. One scan chain is shown in FIG. 116, but in a practical design with millions of flip-flops, many sub-chains may be used.

In the test architecture of FIG. 116, test vectors may be shifted into the scan chain in a test mode. Then the part may be placed into operating mode for one or more clock cycles, after which the contents of the flip-flops are shifted out and compared with the expected results. This may provide an excellent way to isolate errors and diagnose problems, though the number of test vectors in a practical design can be very large and an external tester may be utilized.

FIG. 117 shows a prior art boundary scan architecture as illustrated in an example ASIC 11700. The part functionality may be shown in logic function block 11710. The part may also have a variety of input/output cells 11720, each comprising a bond pad 11722, an input buffer 11724, and a tri-state output buffer 11726. Boundary Scan Register Chains 11732 and 11734 are shown coupled in series with Scan Test Control block 11730. This architecture may operate in a similar manner as the set scan architecture of FIG. 116. Test vectors may be shifted in, the part may be clocked, and the results may then be shifted out to compare with expected results. Typically, set scan and boundary scan may be used together in the same ASIC to provide complete test coverage.

FIG. 118 shows a prior art Built-In Self Test (BIST) architecture for testing a logic block 11800 which includes a core block function 11810 (what is being tested), inputs 11812, outputs 11814, a BIST Controller 11820, an input Linear Feedback Shift Register (LFSR) 11822, and an output Cyclical Redundancy Check (CRC) circuit 11824. Under control of BIST Controller 11820, LFSR 11822 and CRC 11824 may be seeded (i.e., set to a known starting value), the logic block 11800 may be clocked a predetermined number of times with LFSR 11822 presenting pseudo-random test vectors to the inputs of Block Function 11810 and CRC 11824 monitoring the outputs of Block Function 11810. After the predetermined number of clocks, the contents of CRC 11824 may be compared to the expected value (or signature). If the signature matches, logic block 11800 may pass the test and may be deemed good. This sort of testing may be good for fast "go" or "no go" testing as it is self-contained to the block being tested and does not require storing a large number of test vectors or use of an external tester. BIST, set scan, and boundary scan techniques may often be combined in complementary ways on the same ASIC. A detailed discussion of the theory of LSFRs and CRCs can be found in *Digital Systems Testing and Testable Design*, by Abramovici, Breuer and Friedman, Computer Science Press, 1990, pp 432-447.

Another prior art technique applicable to the yield and reliability of 3D ICs may be Triple Modular Redundancy. This is a technique where the circuitry may be instantiated in a design in triplicate and the results may be compared. Because two or three of the circuit outputs may always be in agreement (as is the case with binary signals) voting circuitry (or majority-of-three or MAJ3) takes that as the result. While primarily a technique used for noise suppression in high reliability or radiation tolerant systems in military, aerospace and space applications, it also can be used as a way of masking errors in faulty circuits since if any two of three replicated circuits are functional the system may behave as if it is fully functional. A discussion of the radiation tolerant aspects of TMR systems, Single Event Effects (SEE), Single Event Upsets (SEU) and Single Event Transients (SET) can be found in U.S. Patent Application Publication 2009/0204933 to Rezgui ("Rezgui").

Additionally the 3D technology according to some embodiments of the invention may enable some very innovative IC alternatives with reduced development costs, increased yield, and other illustrative benefits.

SUMMARY

The invention may be directed to multilayer or Three Dimensional Integrated Circuit (3D IC) devices and fabrication methods.

In one aspect, a method of manufacturing a semiconductor device, the method including, providing a first monocrystalline layer including semiconductor regions, overlaying the first monocrystalline layer with an isolation layer, transferring a second monocrystalline layer comprising semiconductor regions to overlay the isolation layer, wherein the first monocrystalline layer and the second monocrystalline layer are formed from substantially different crystal materials; and subsequently etching the second monocrystalline layer as part of forming at least one transistor in the second monocrystalline layer.

In another aspect, a method of manufacturing a semiconductor device, the method including, providing a first monocrystalline layer including first semiconductor regions, overlaying the first monocrystalline layer with an isolation layer, transferring a second monocrystalline layer including second semiconductor regions to overlay the isolation layer, the second semiconductor regions includes a prefabricated transistor structure, and etching at least a portion of the prefabricated transistor structure as part of customizing the device to a specific use.

In another aspect, a method of manufacturing a semiconductor device, the method including, providing a first monocrystalline layer including semiconductor regions, overlaying the first mono crystalline layer with at least one metal layer including aluminum or copper, transferring a second monocrystalline layer including semiconductor regions to overlay the metal layer, and annealing to repair damage of second monocrystalline layer caused by transferring the second monocrystalline layer to overlay the metal layer.

In another aspect, a method of manufacturing a semiconductor device, the method including, providing a first monocrystalline layer including semiconductor regions, overlaying the first mono crystalline layer with at least one metal layer including aluminum or copper, transferring a second monocrystalline layer including semiconductor regions to overlay the metal layer, and annealing to completely form at least one transistor on the second monocrystalline layer.

BRIEF DESCRIPTION OF THE DRAWINGS

Various embodiments of the invention will be understood and appreciated more fully from the following detailed description, taken in conjunction with the drawings in which:

FIG. 83 L1-L4 are exemplary drawing illustrations of a formation of top planar transistors;

Figure 88:
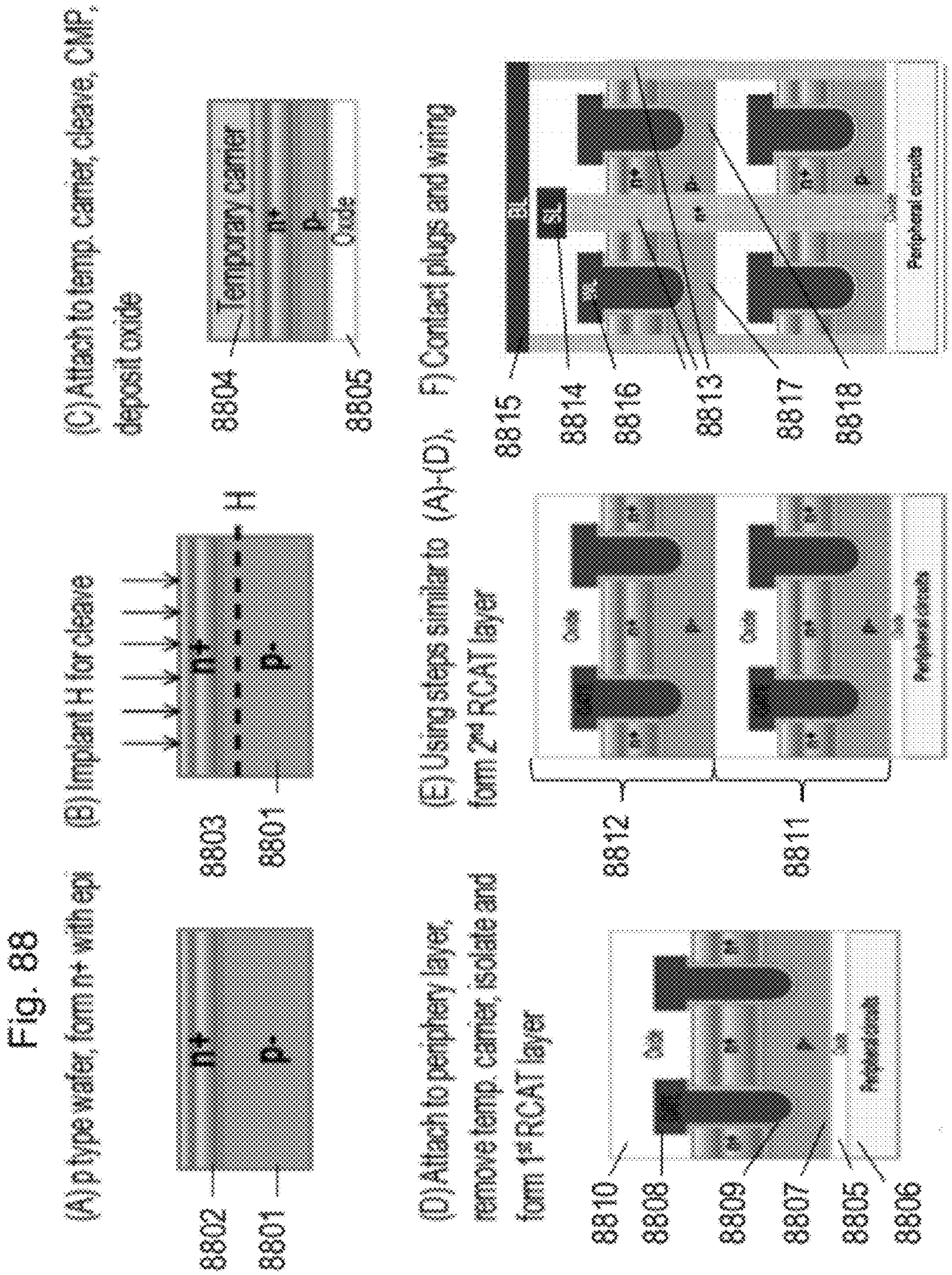
Figure 89:
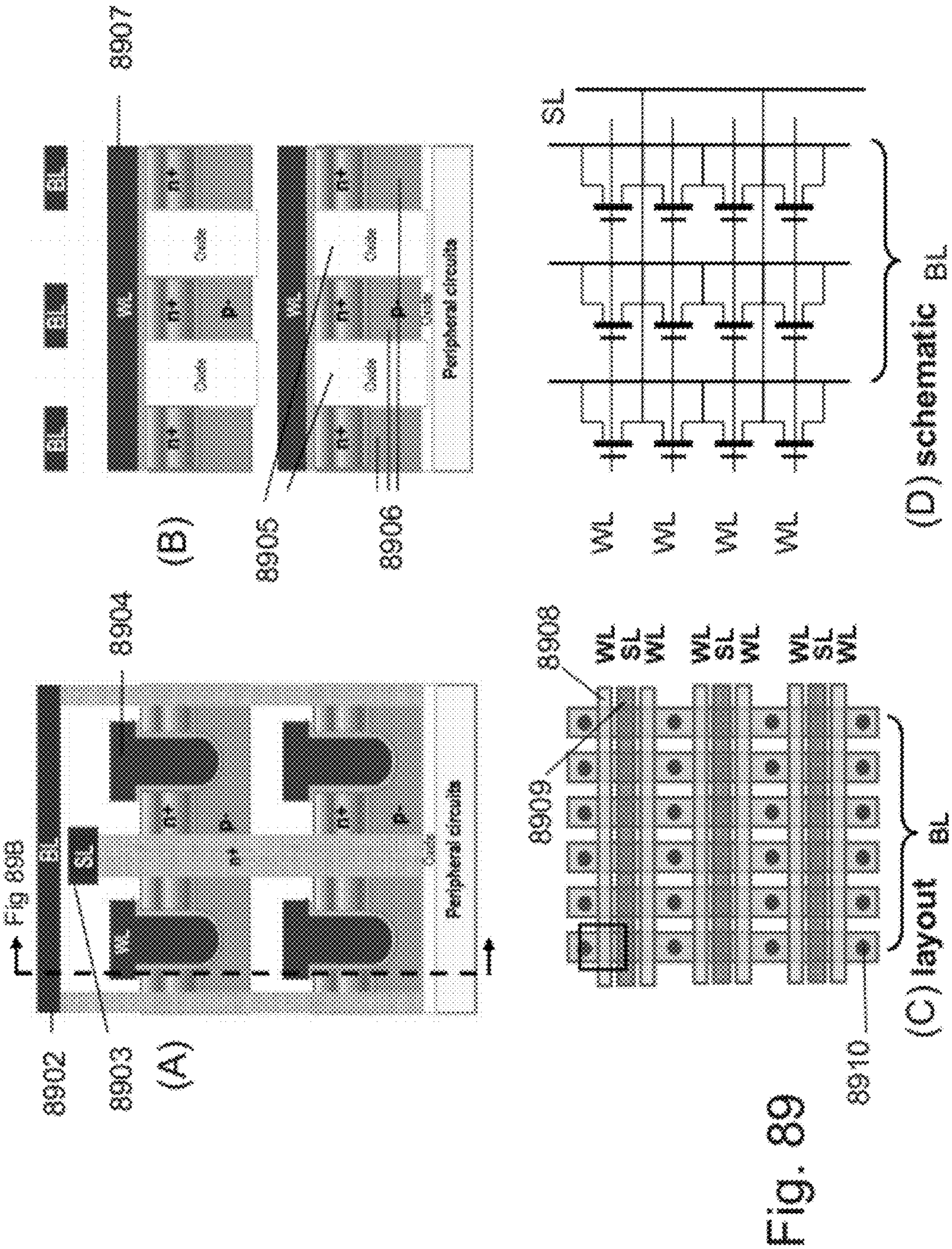
Figure 90:
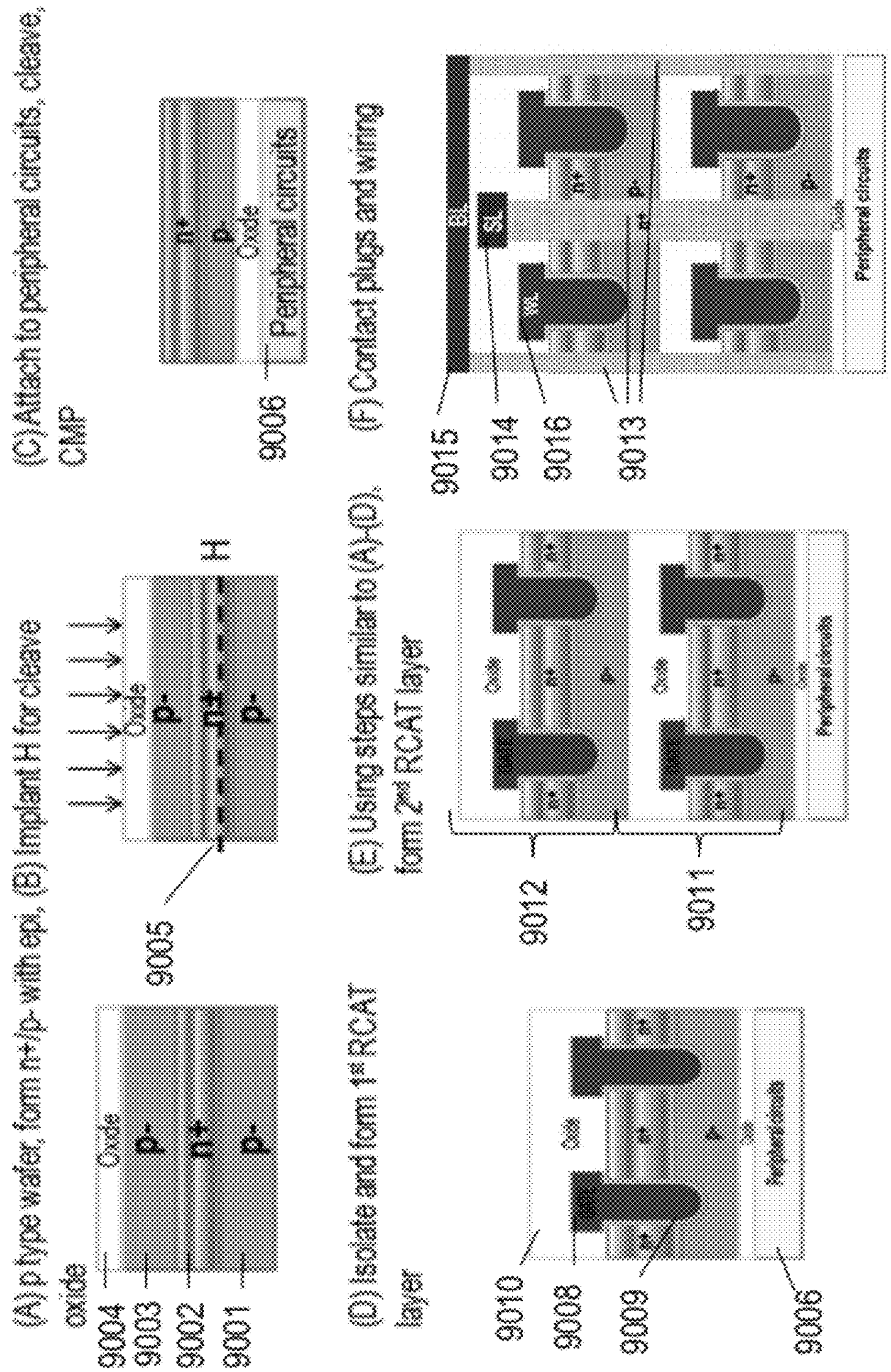
Figure 92:
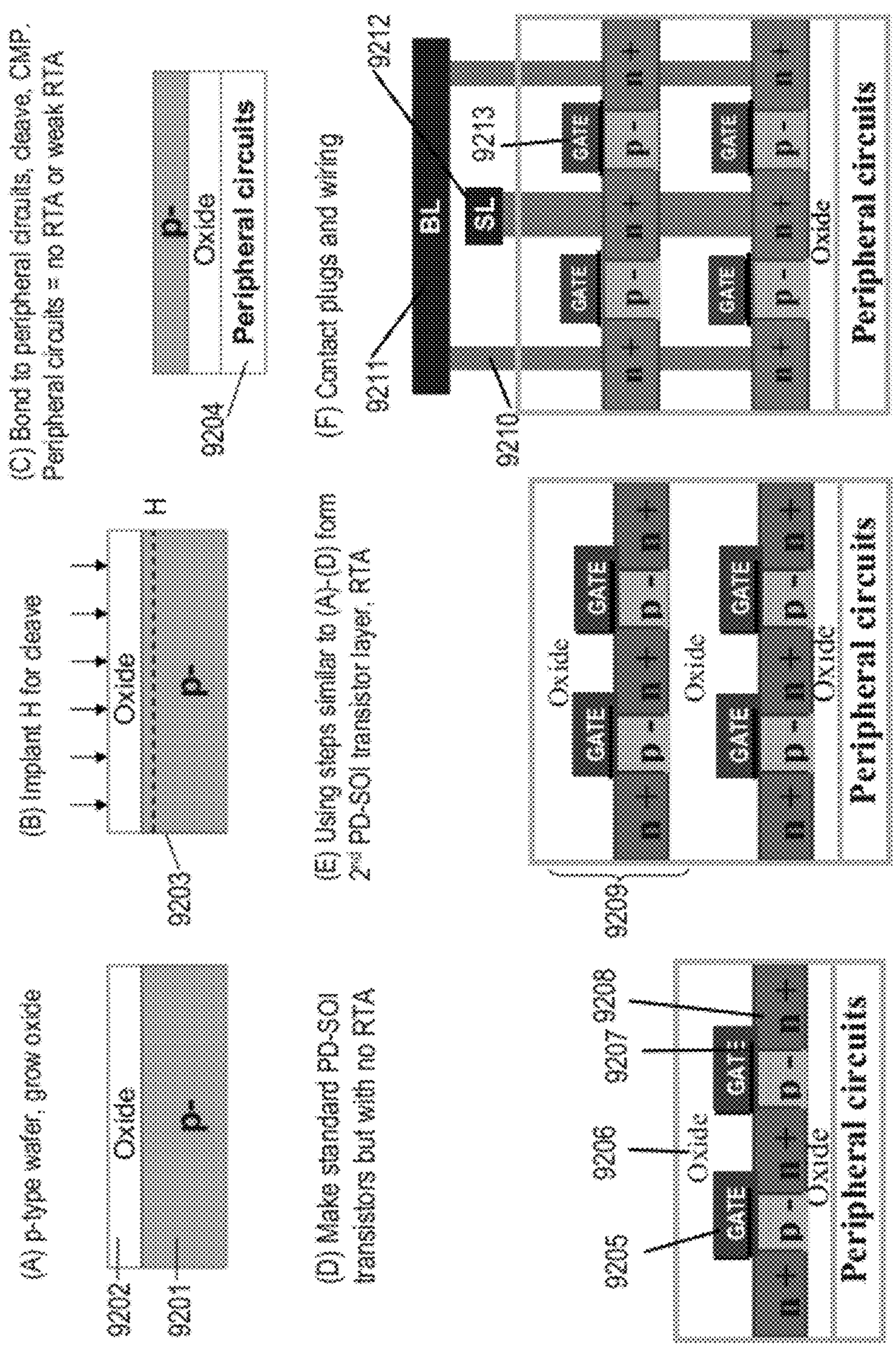
Figure 97:
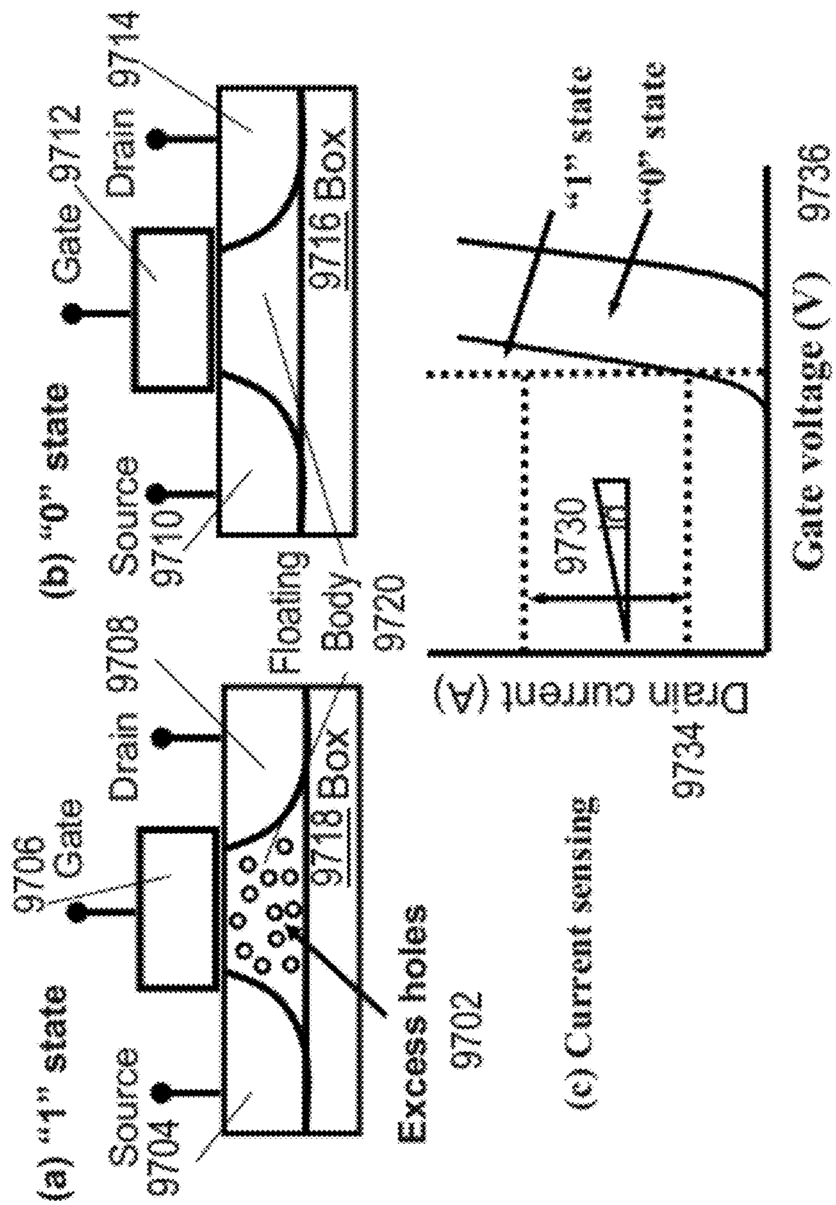
Figure 112:
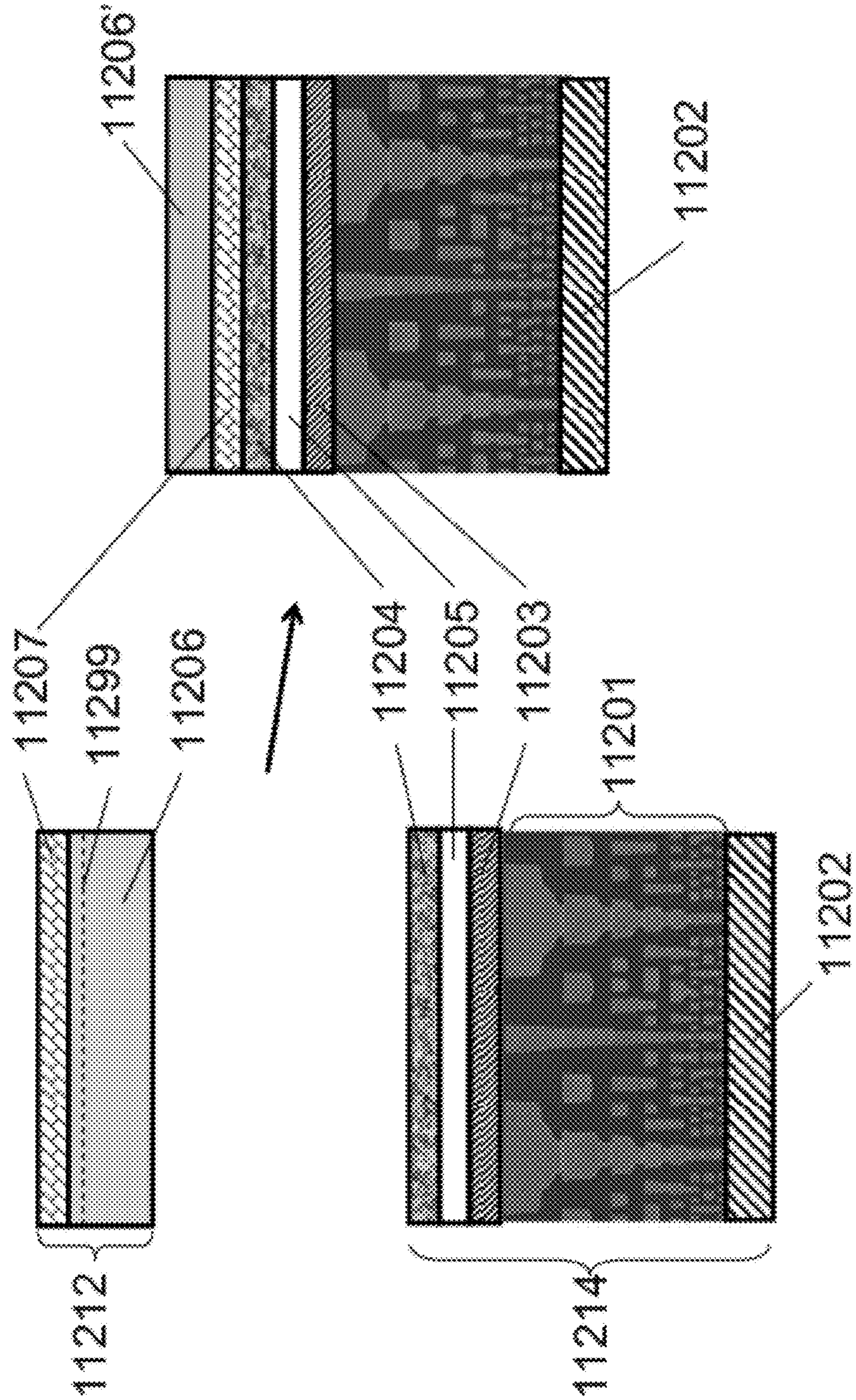
Figure 114:
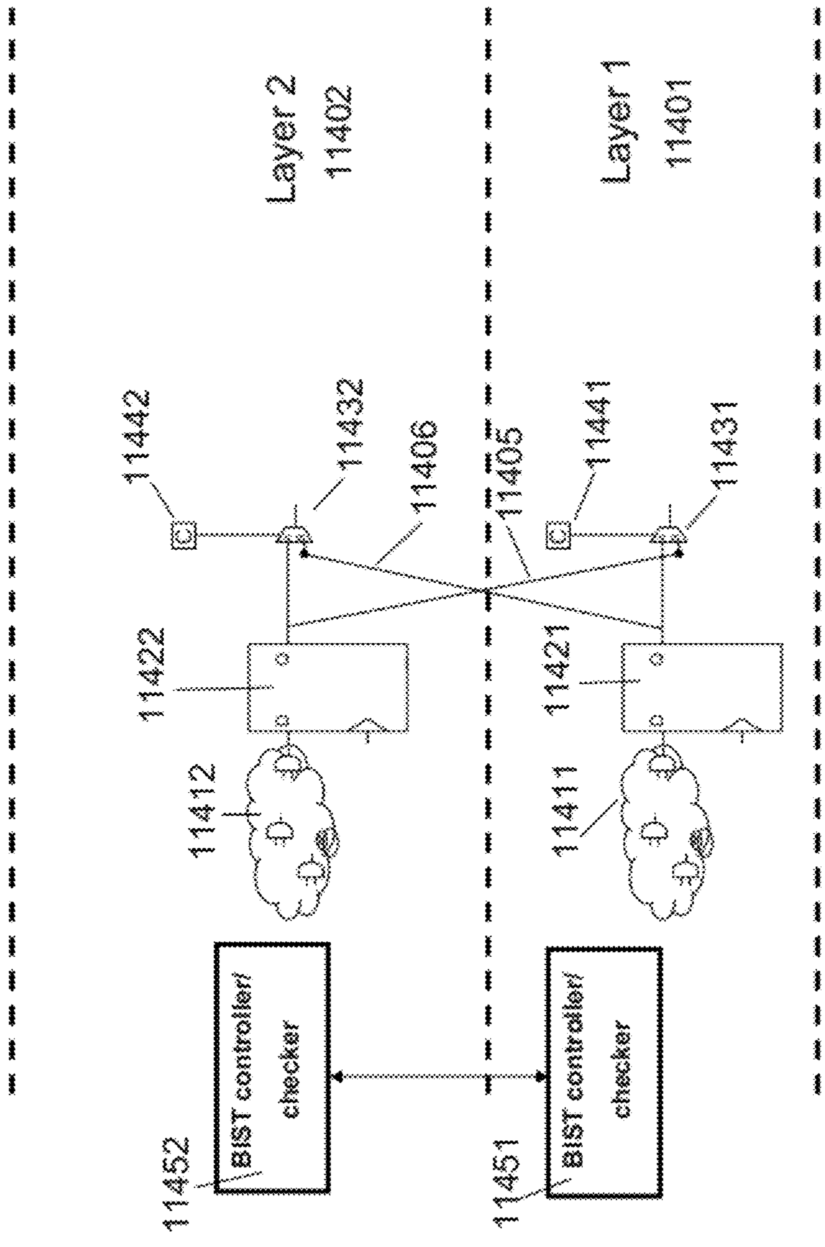
Figure 114A:
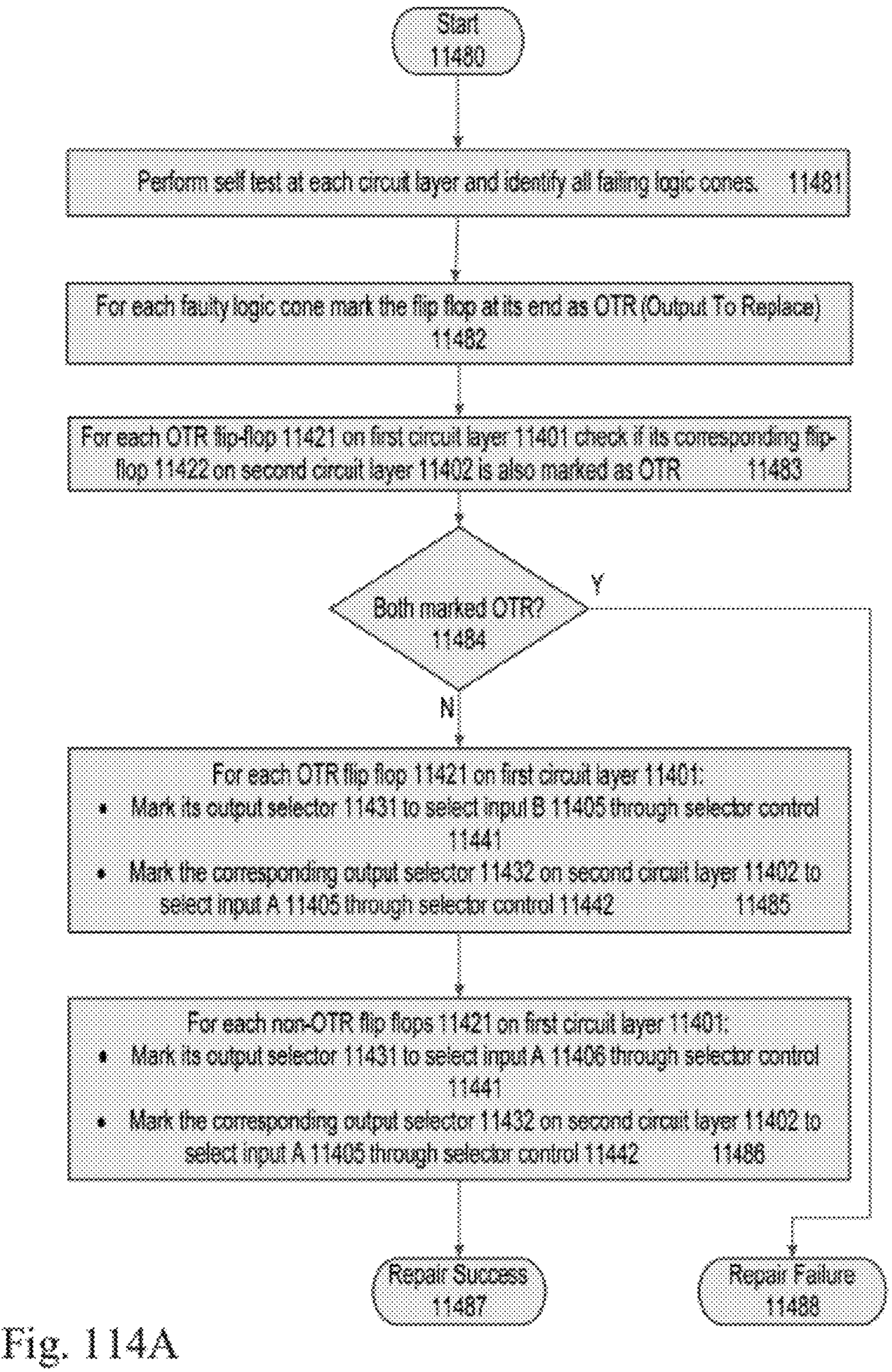
Figure 115:
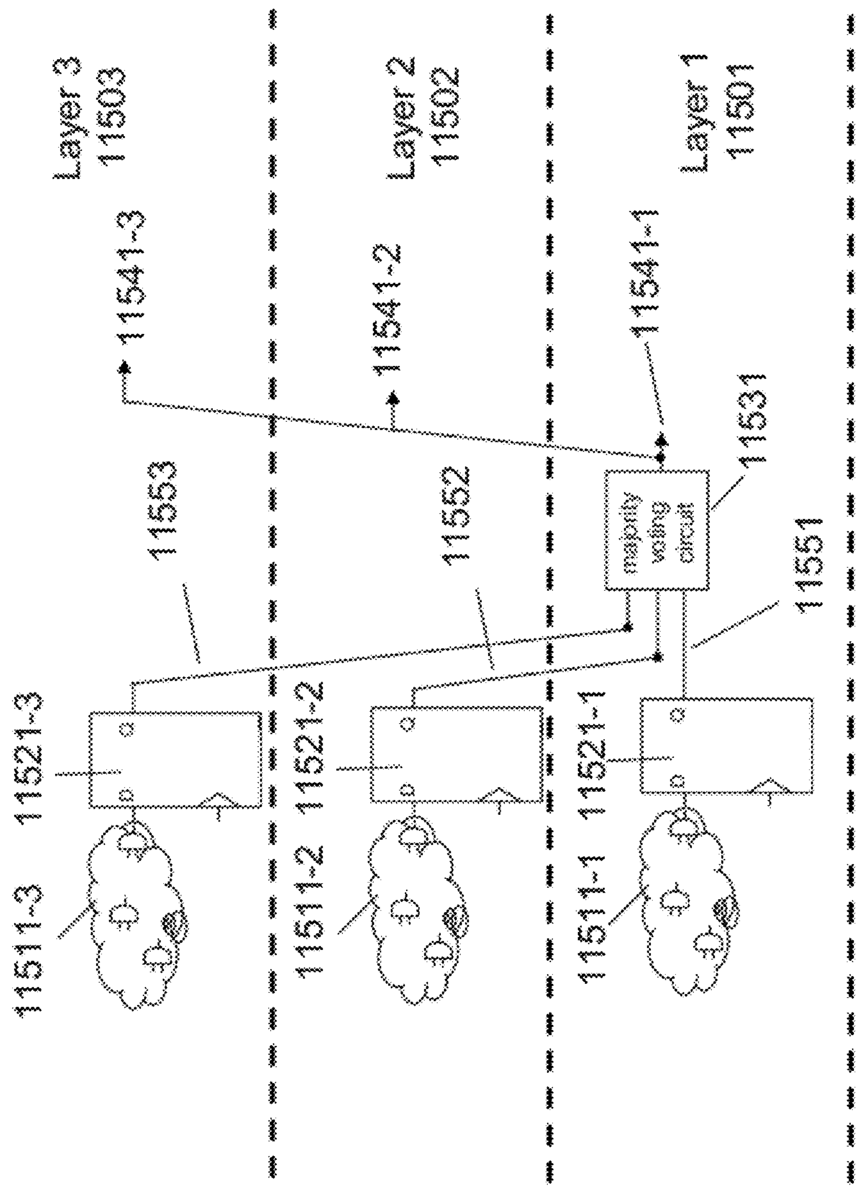
Figure 116:
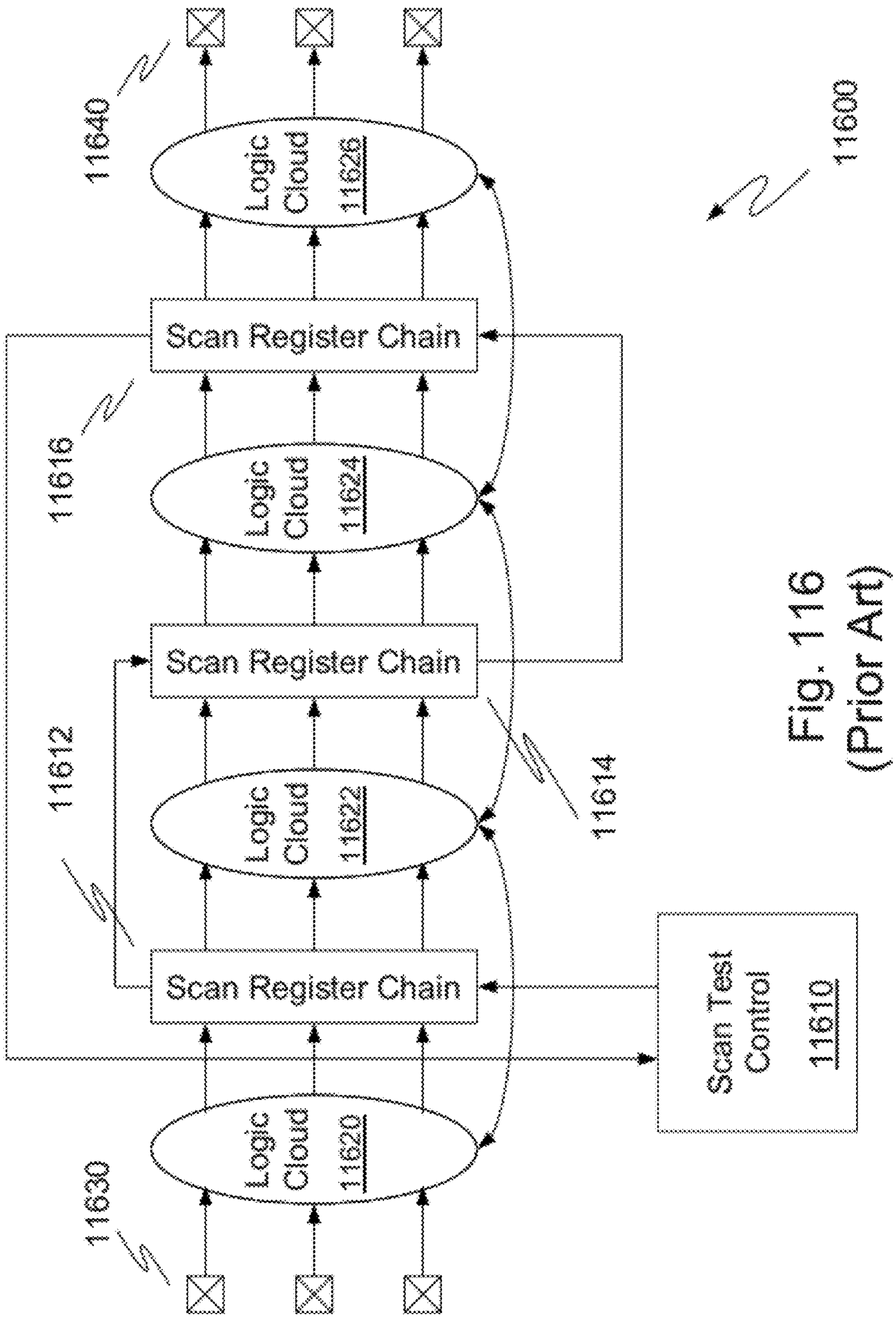
Figure 117:
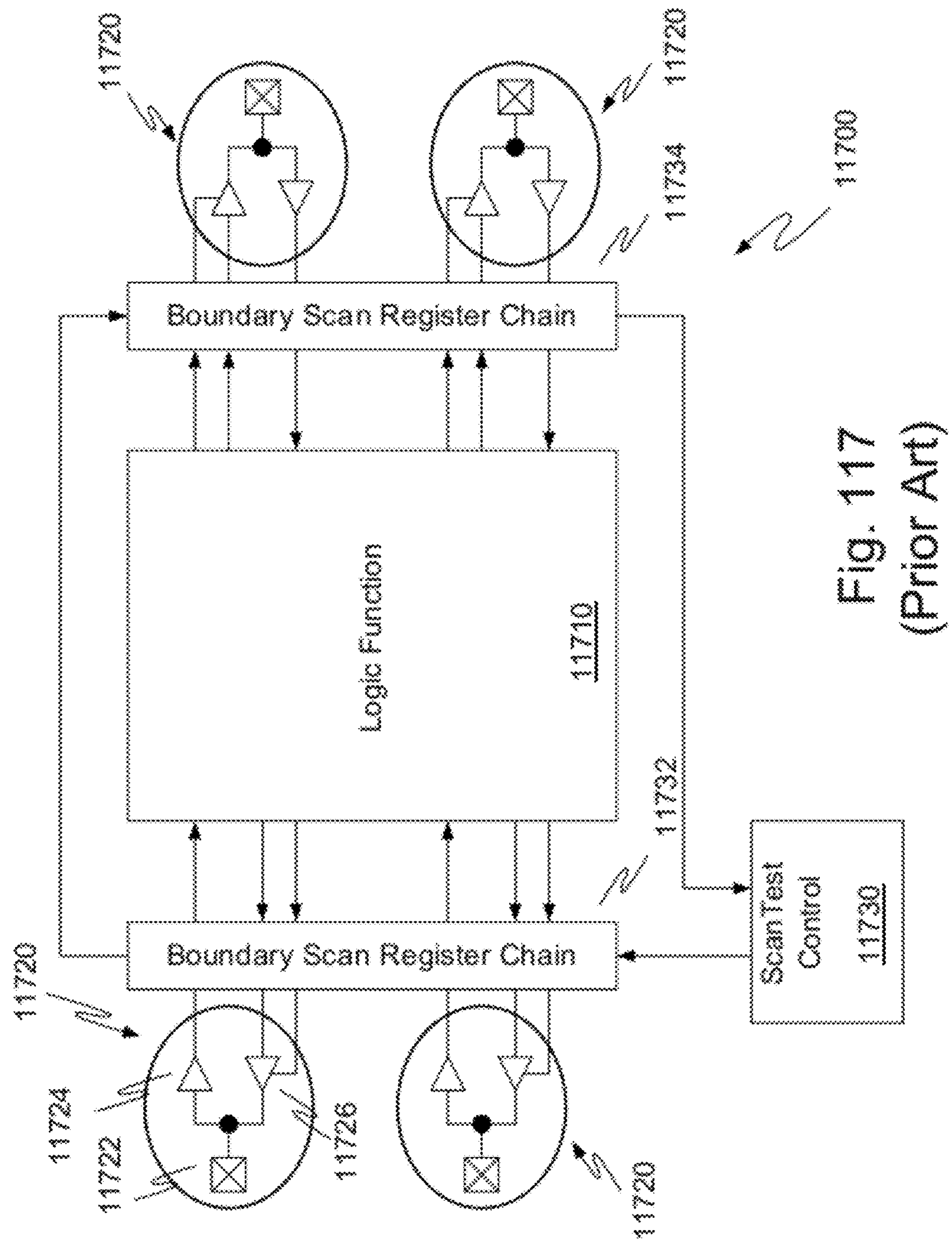
Figure 118:
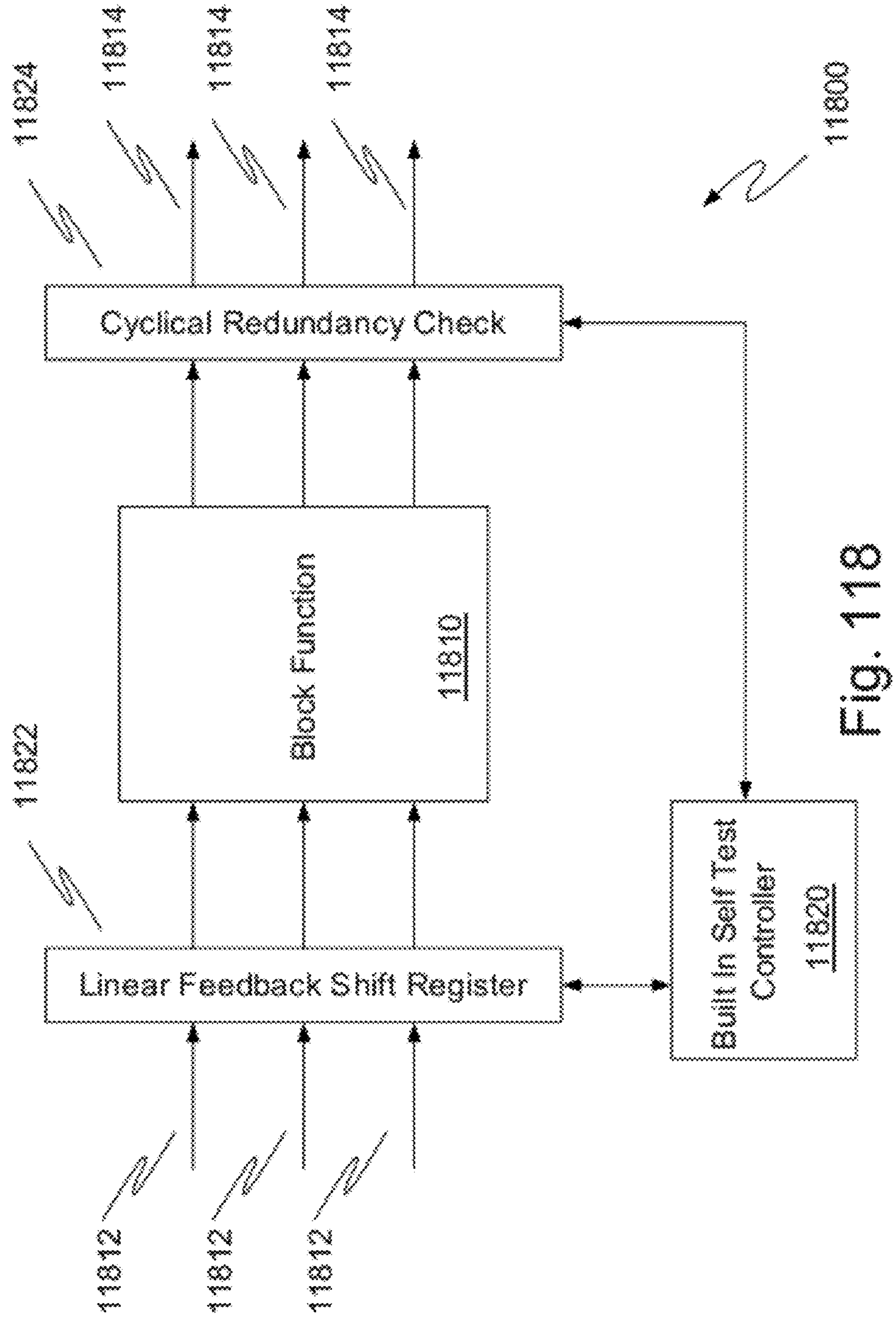
Figure 119:
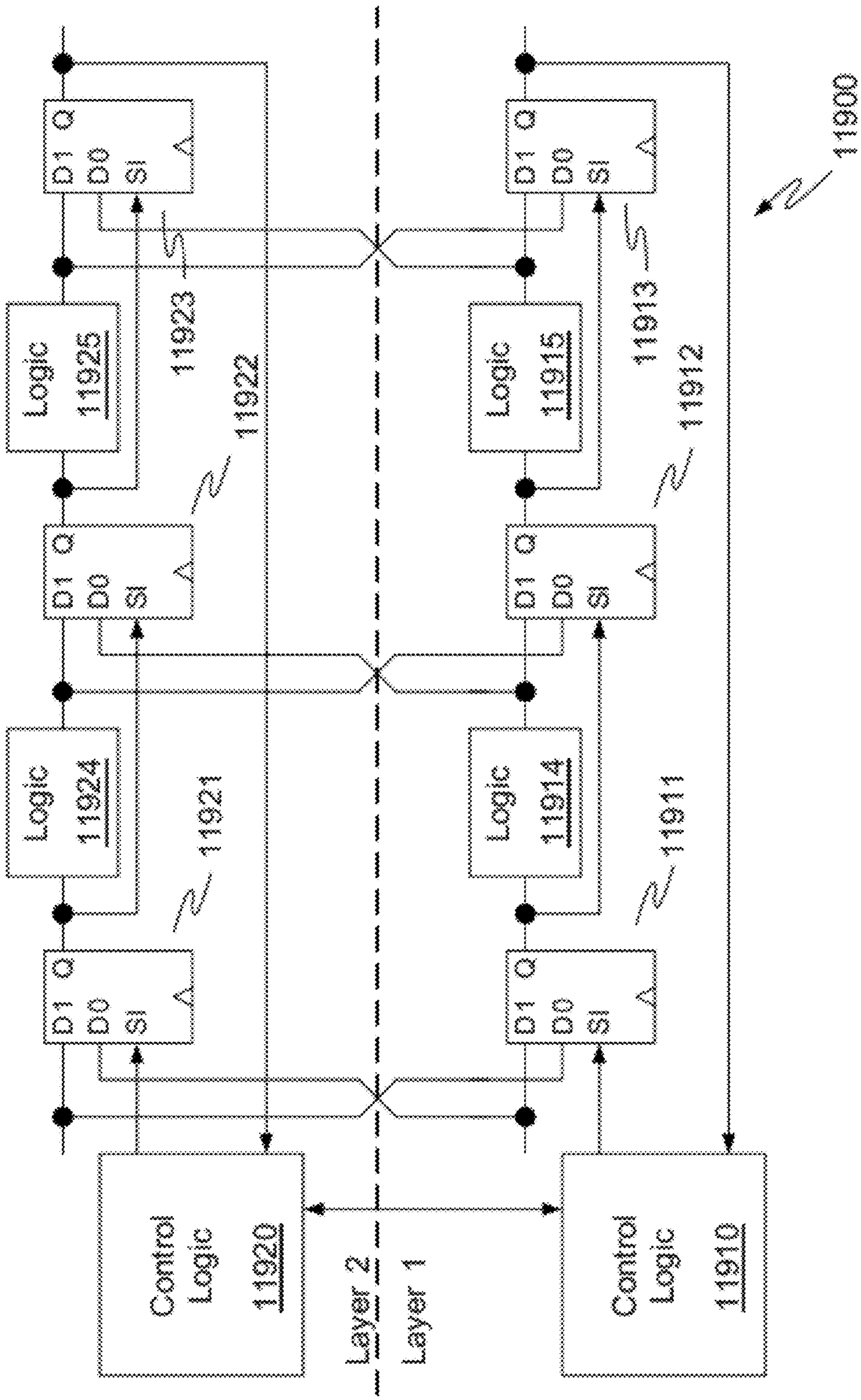
Figure 120:
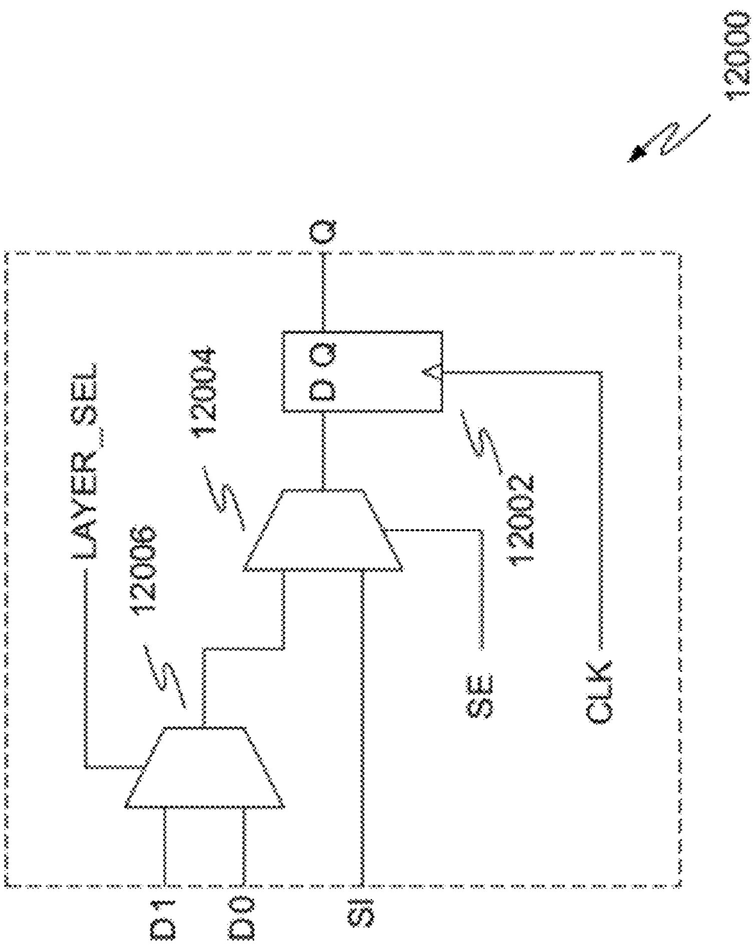
Figure 121:
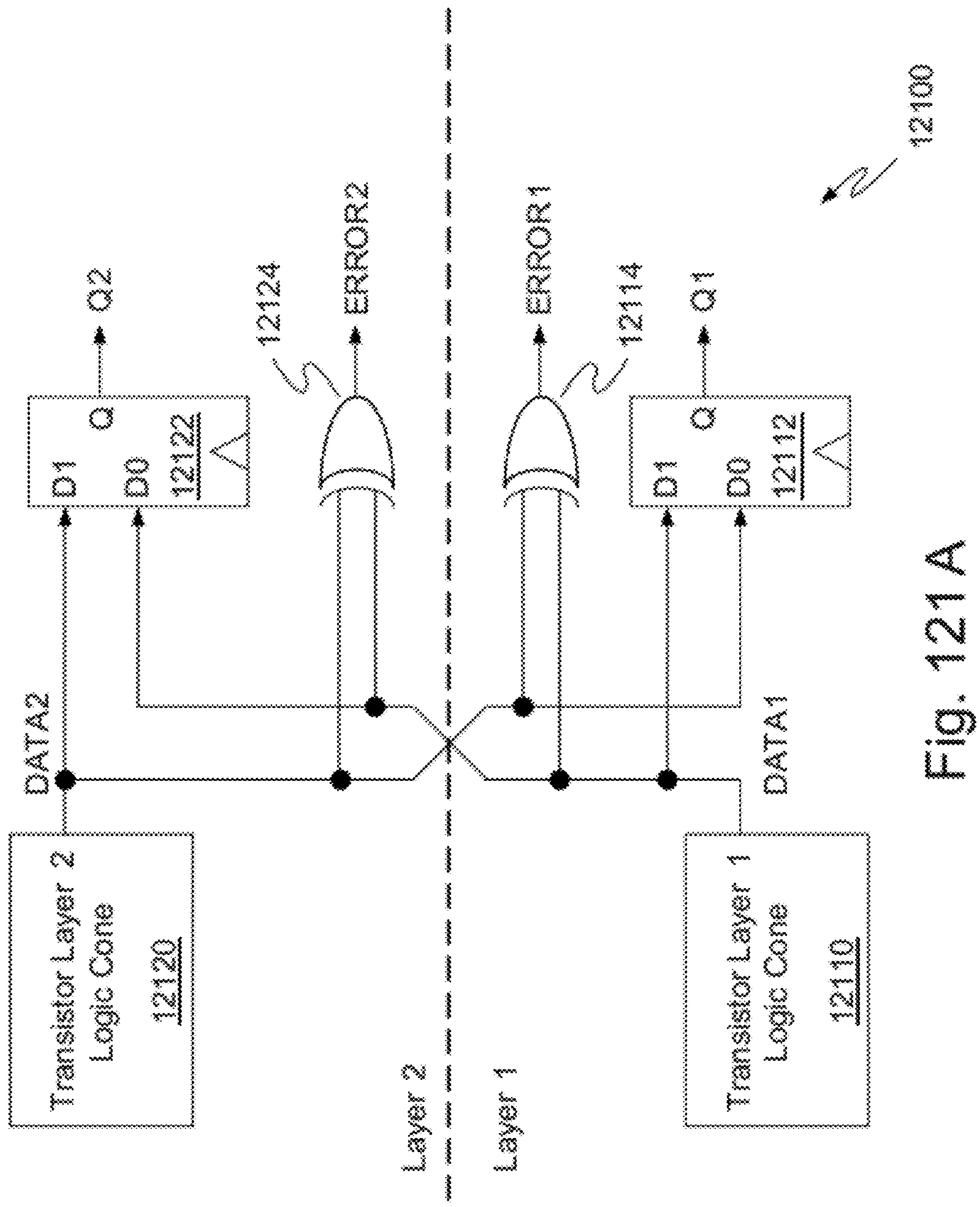
Figure 121B:
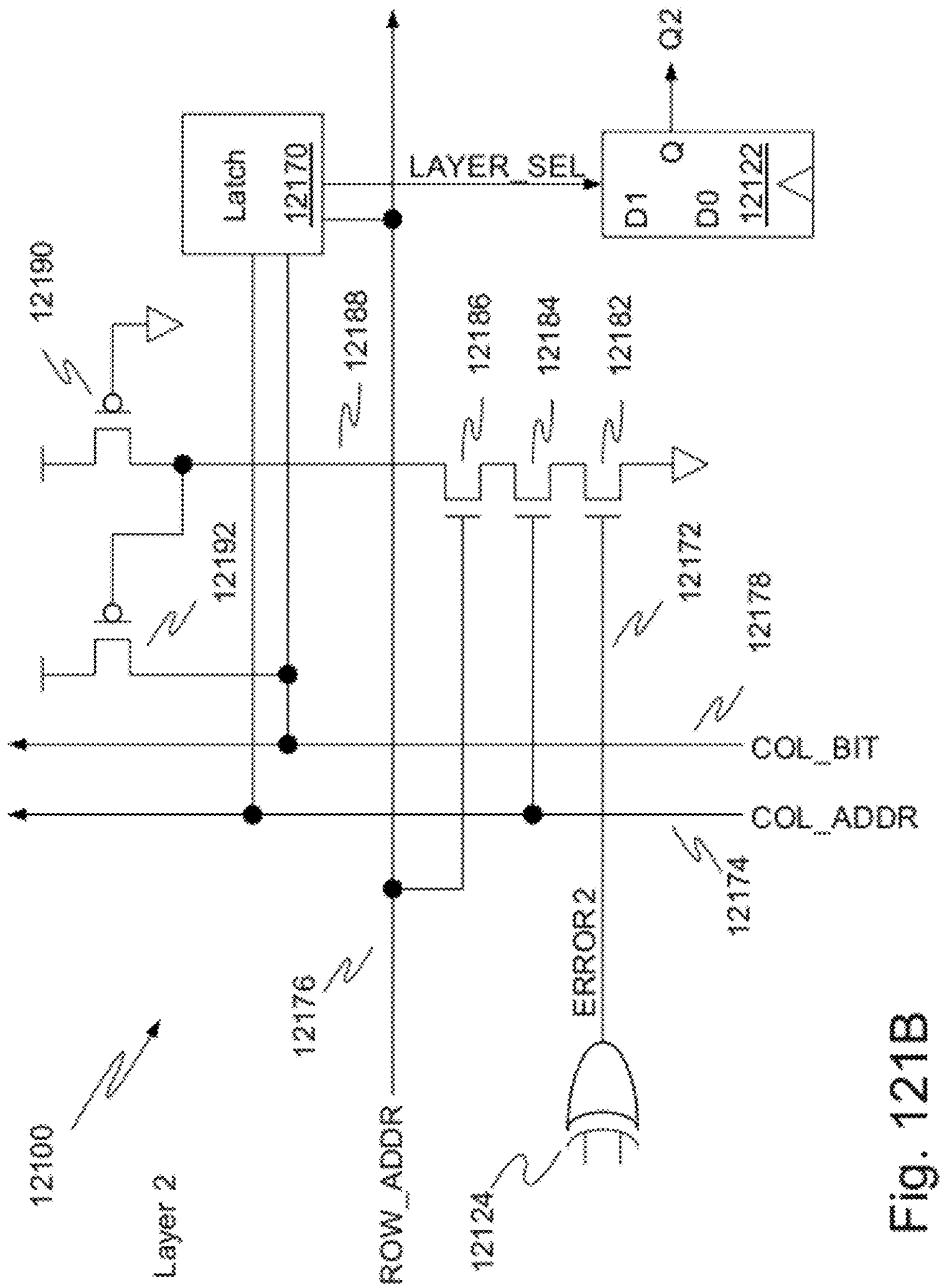
Figure 122:
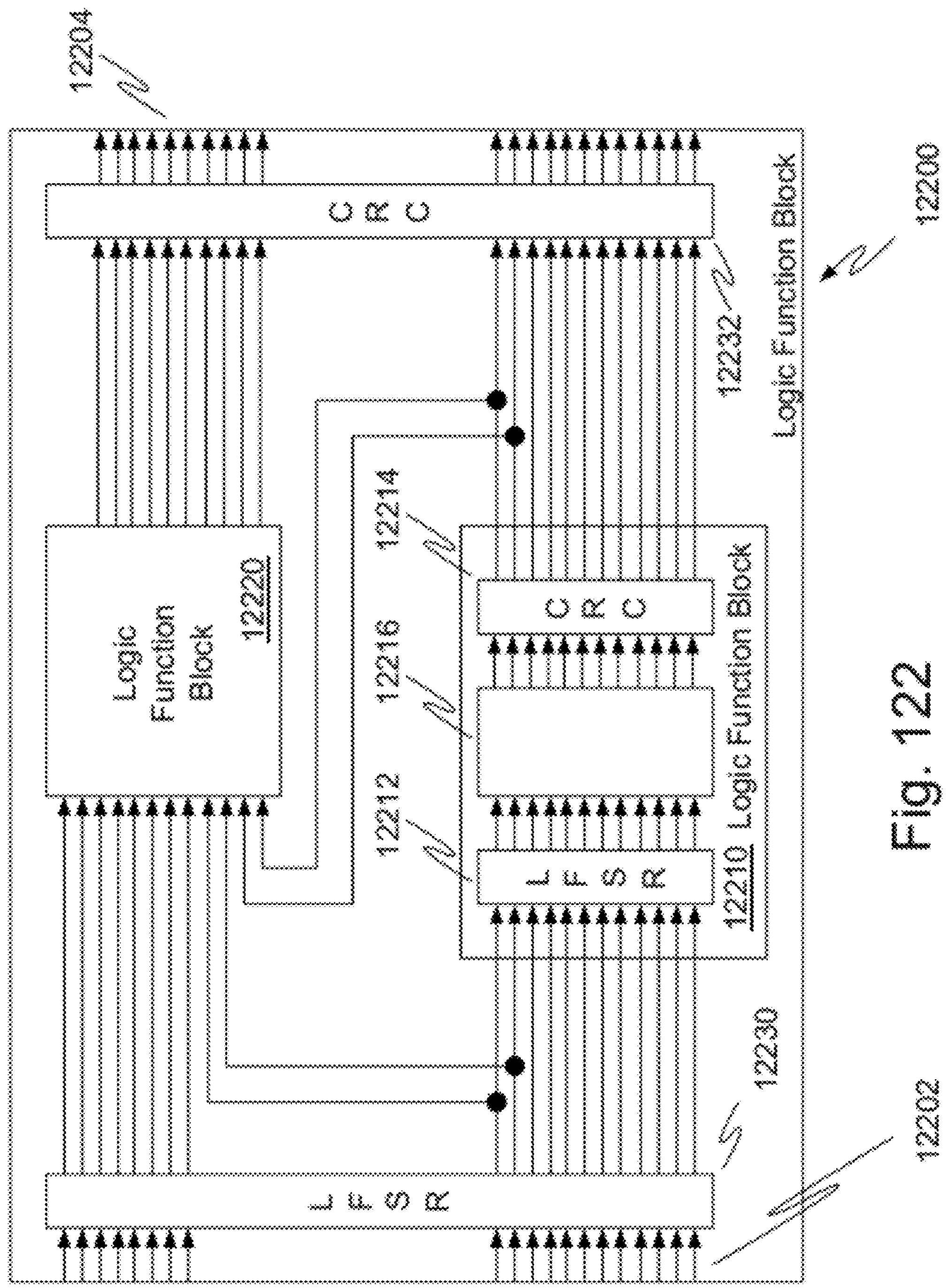
Figure 123:
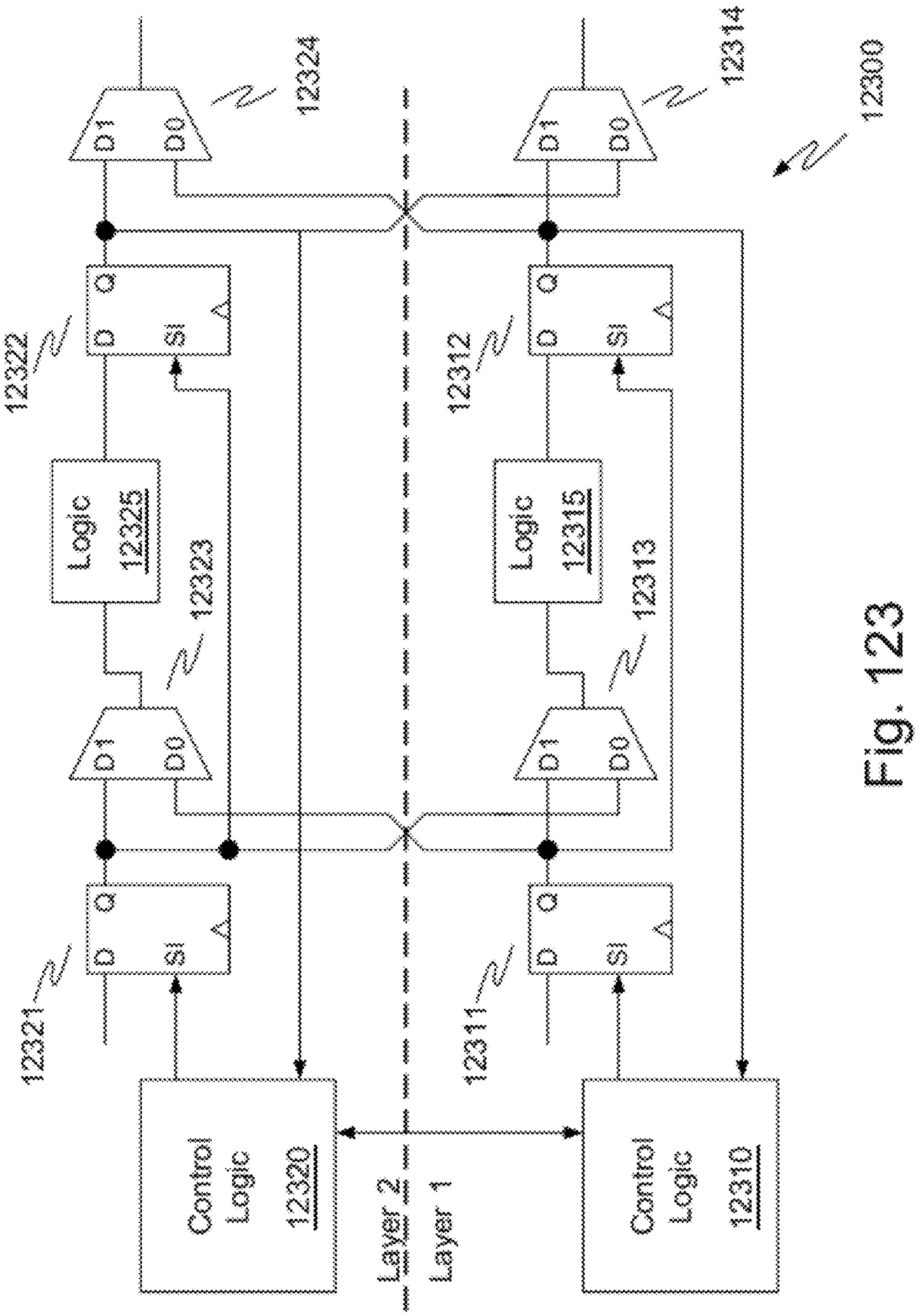
Figure 124:
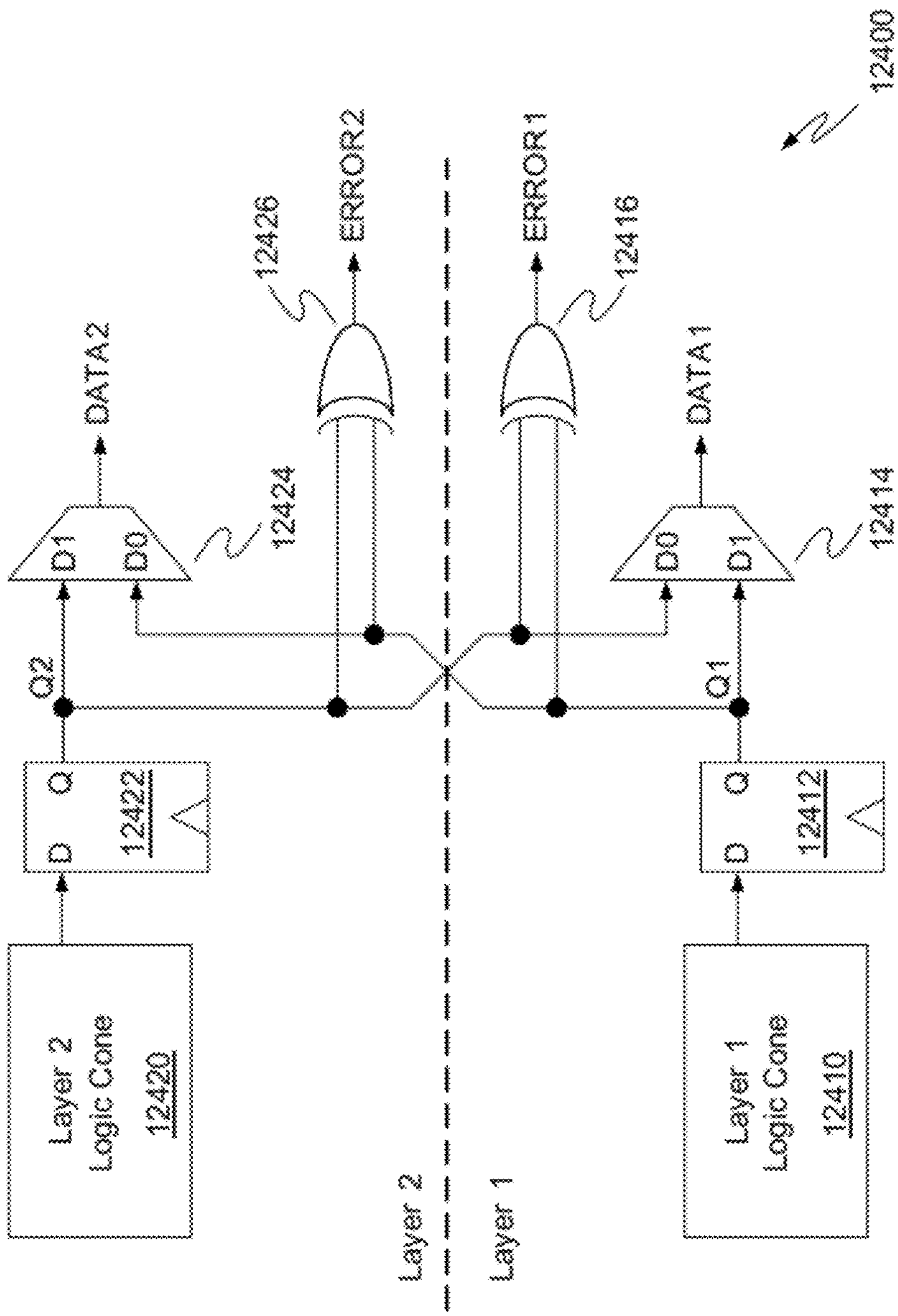
Figure 125:
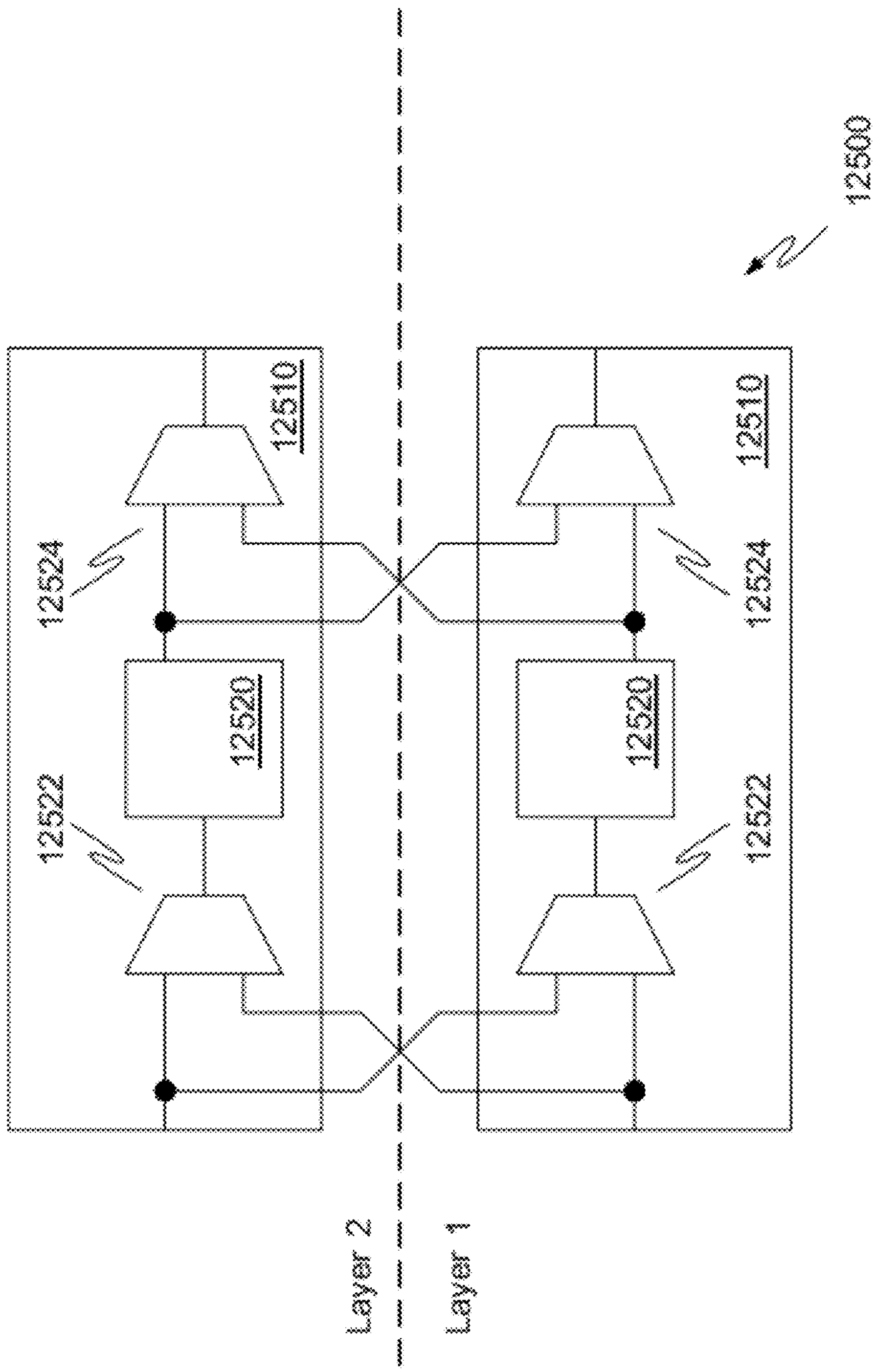
Figure 125B:
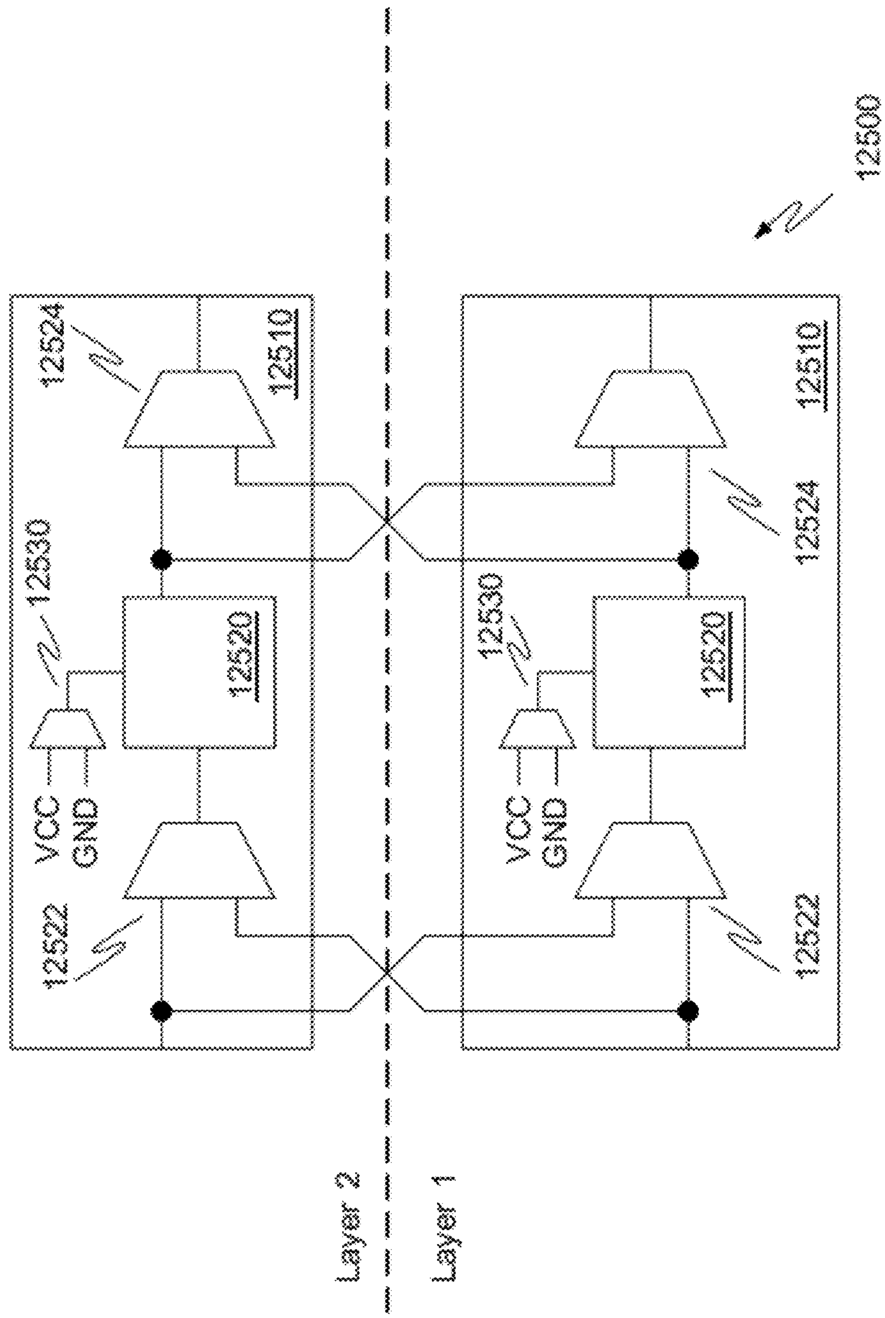
Figure 125C:
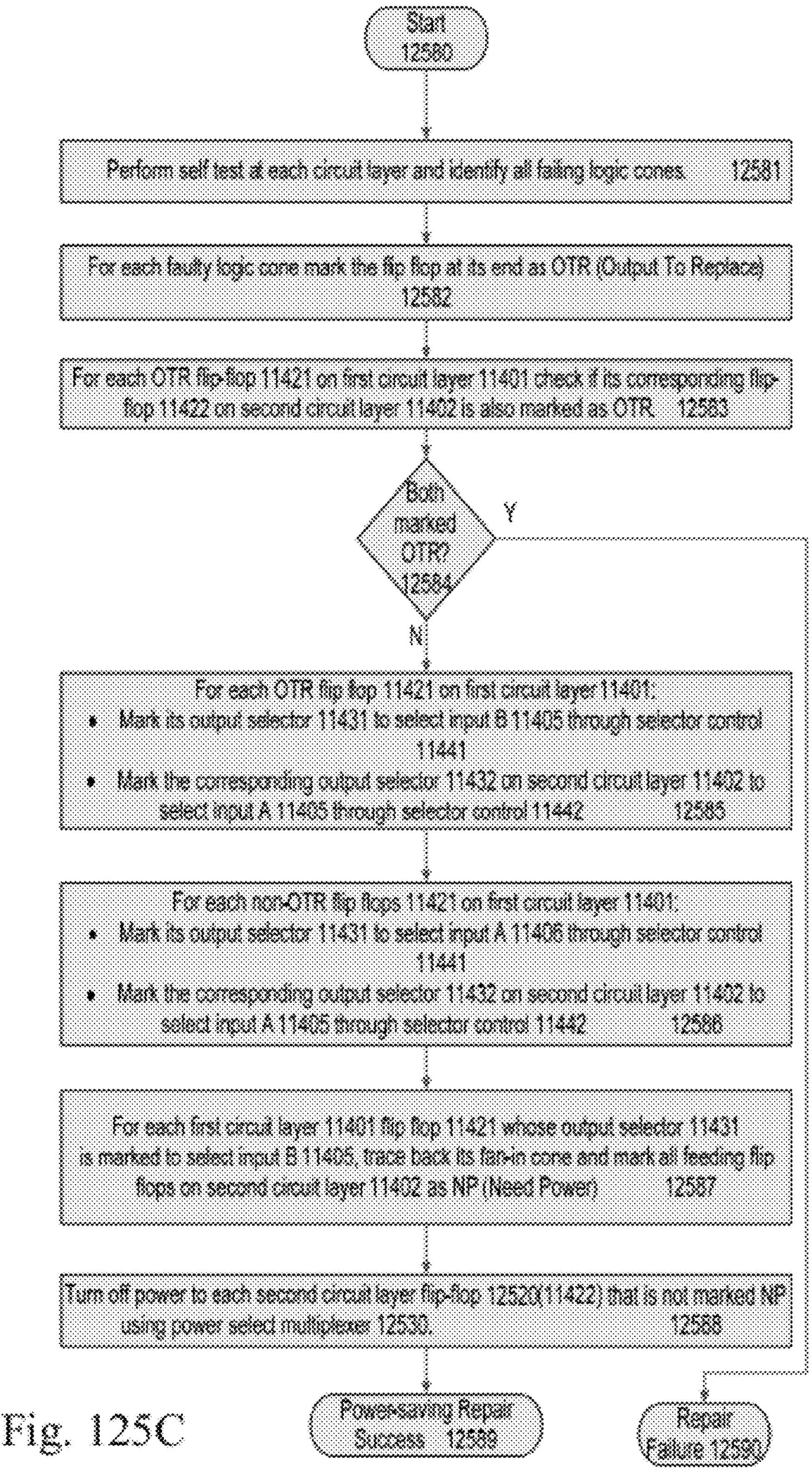
Figure 126:
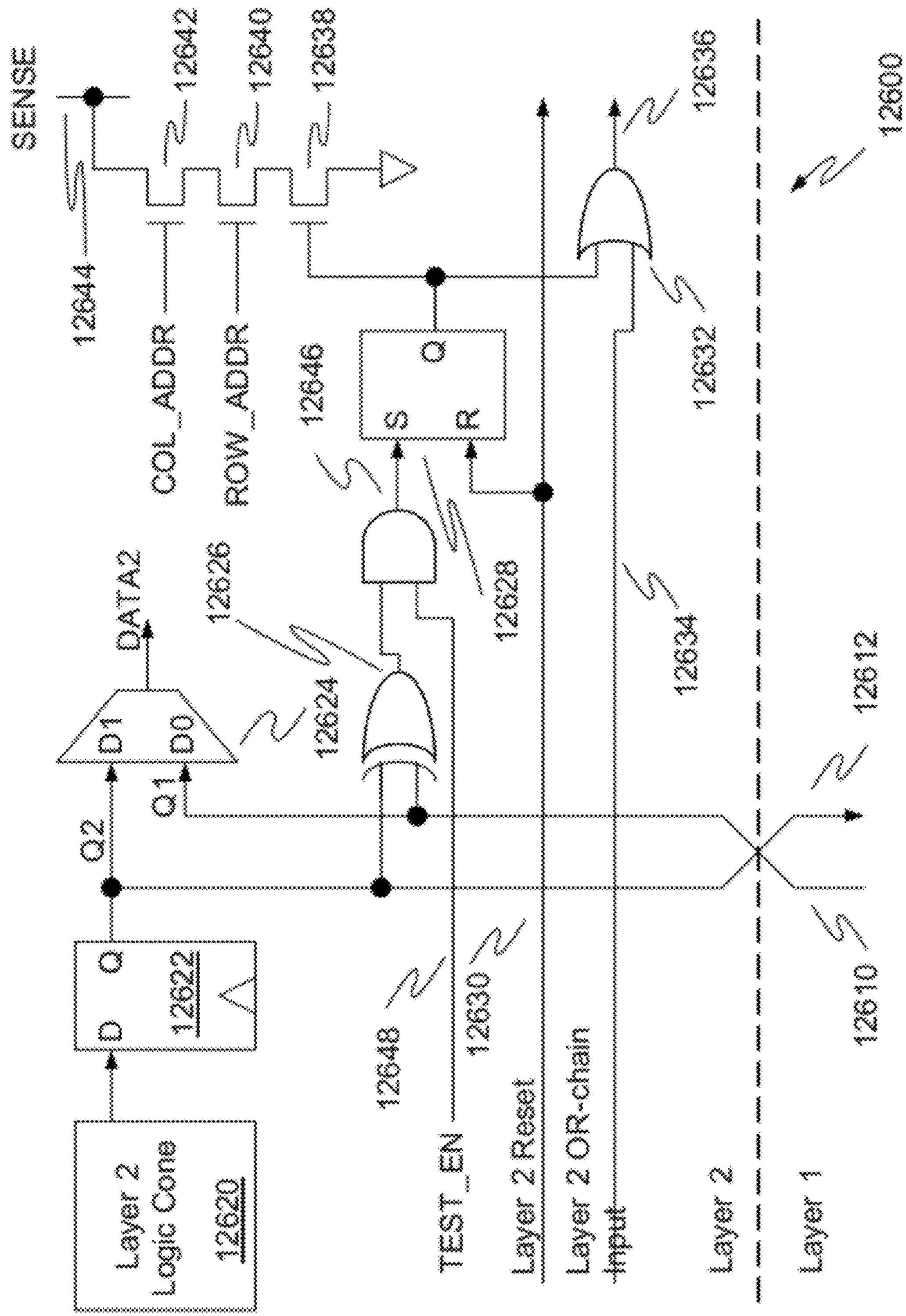
Figure 127:
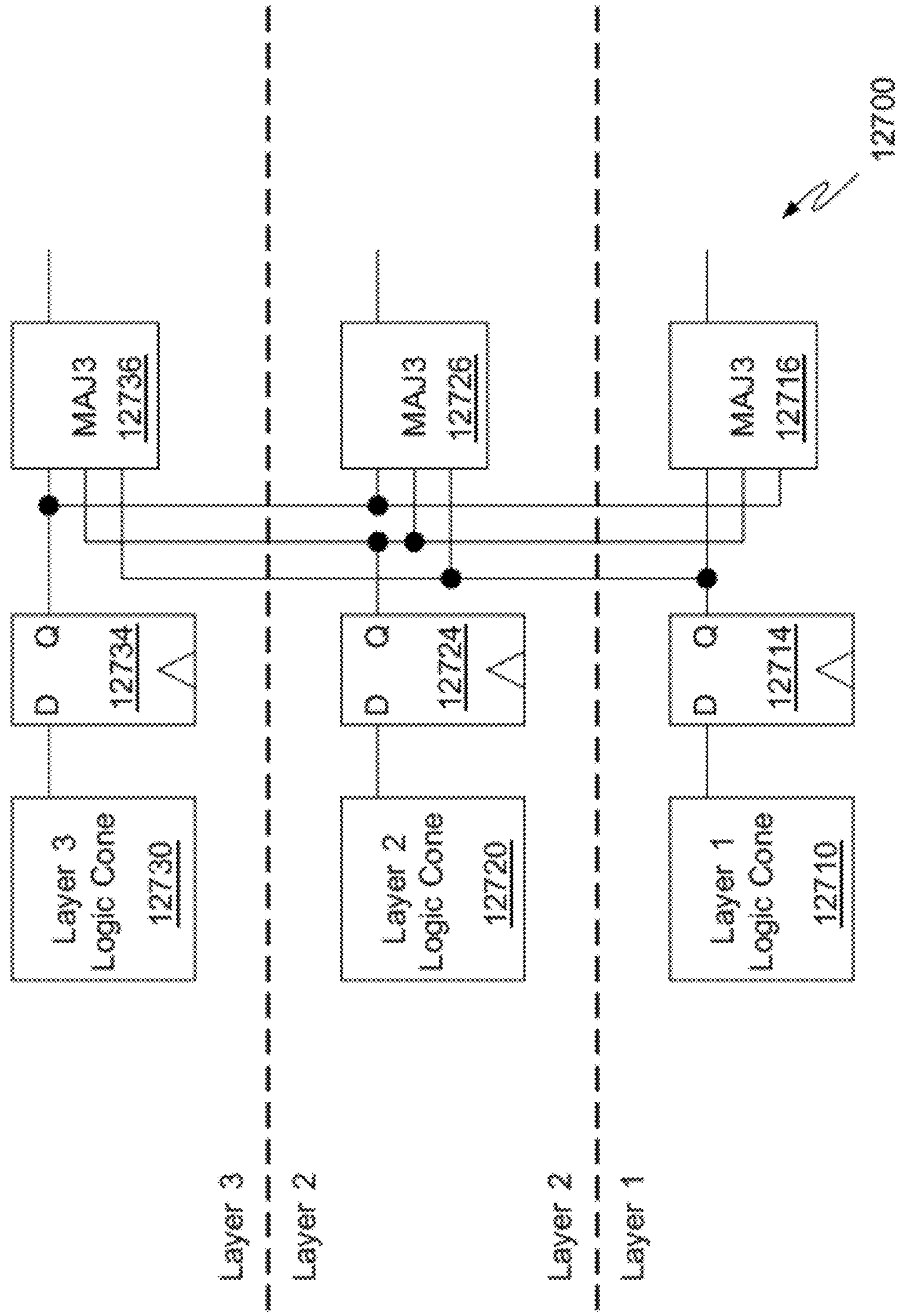
Figure 128:
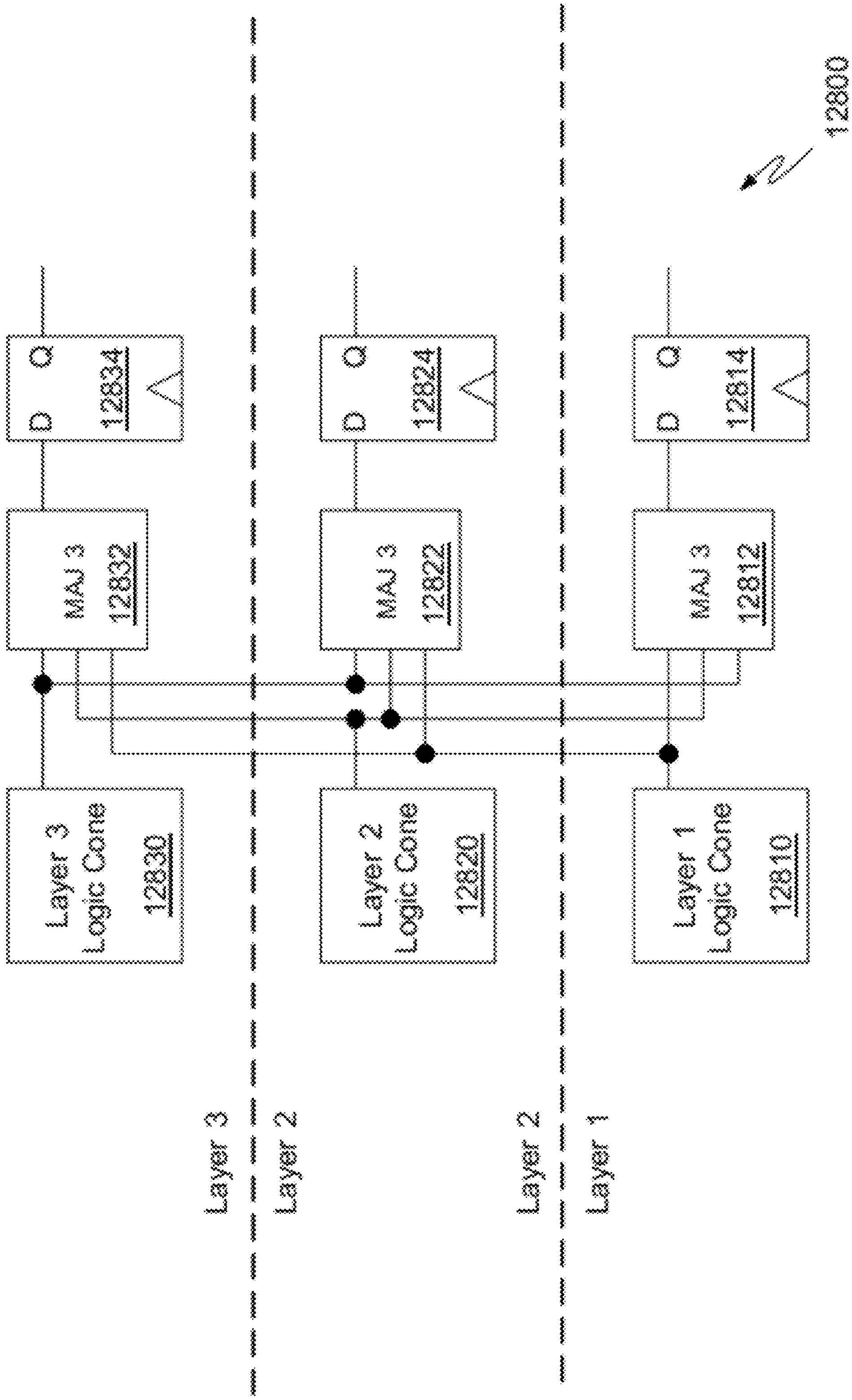
Figure 129:
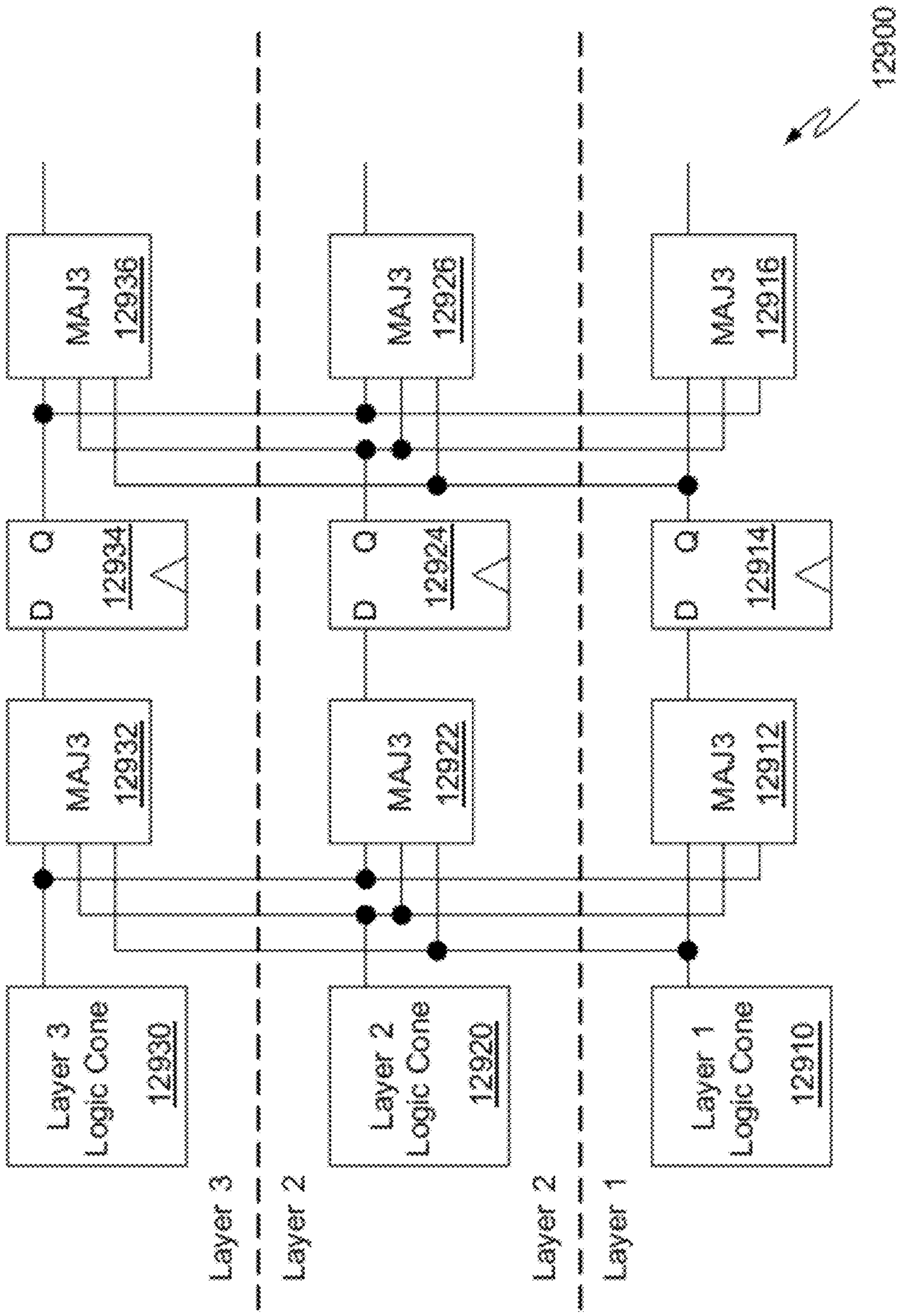
Figure 130B:
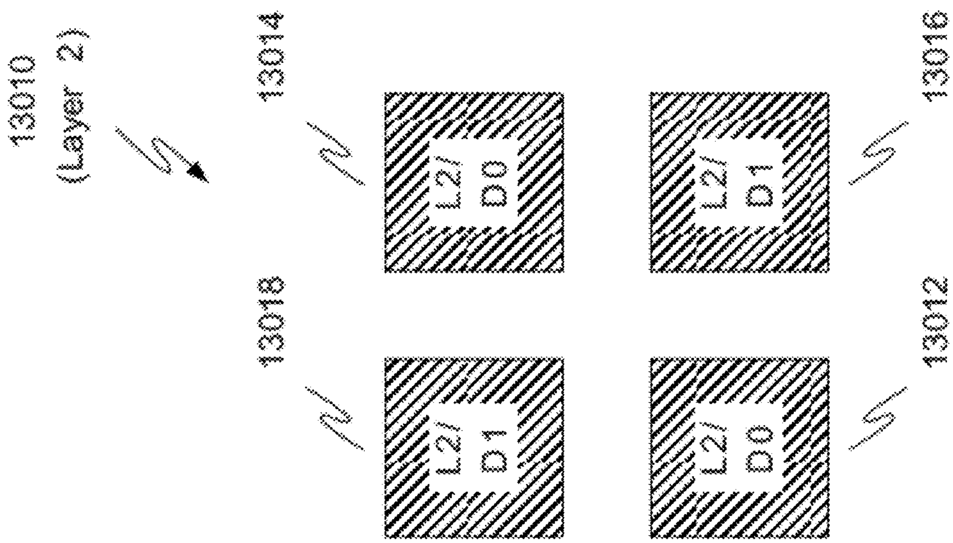
Figure 130A:
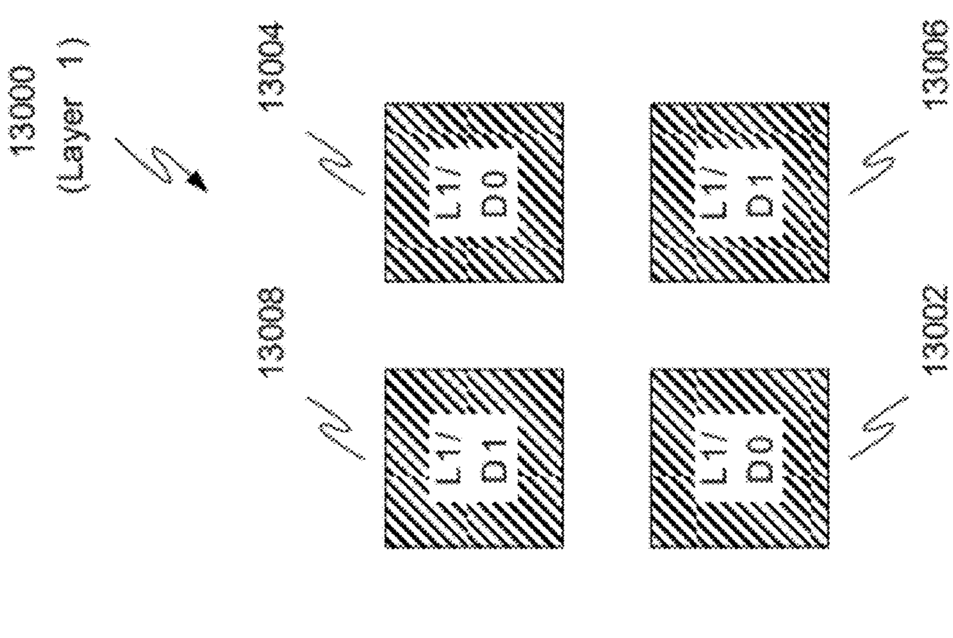
Figure 130C:
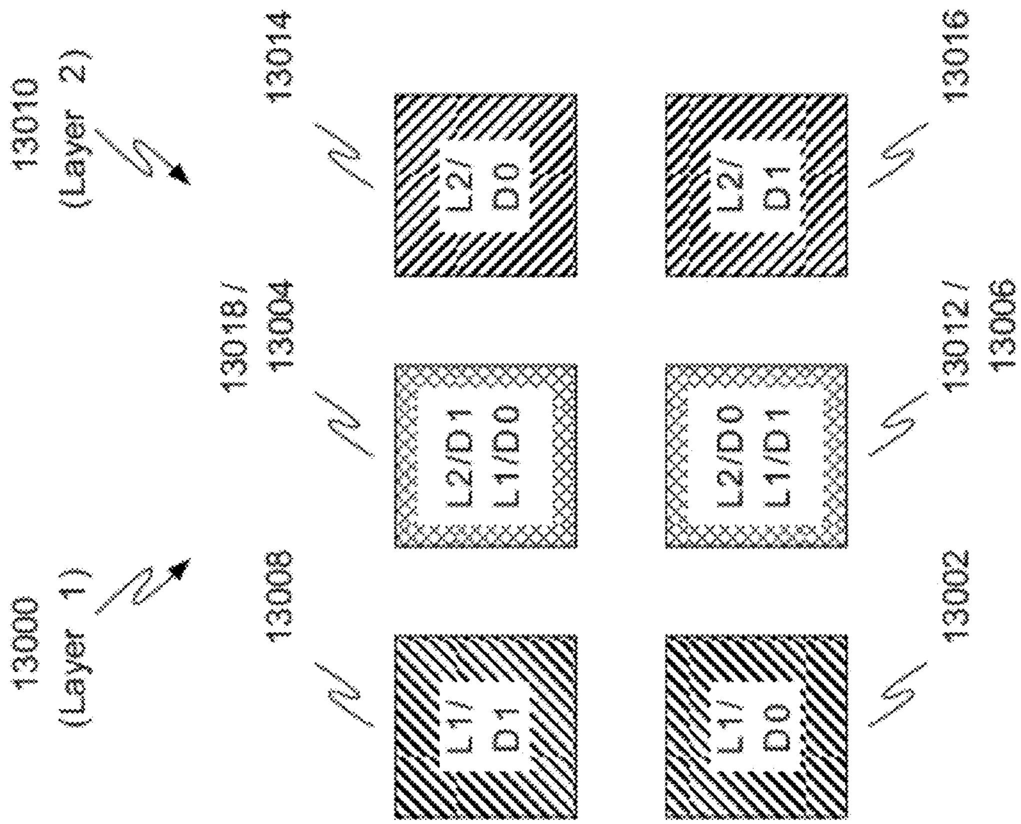
Figure 130D:
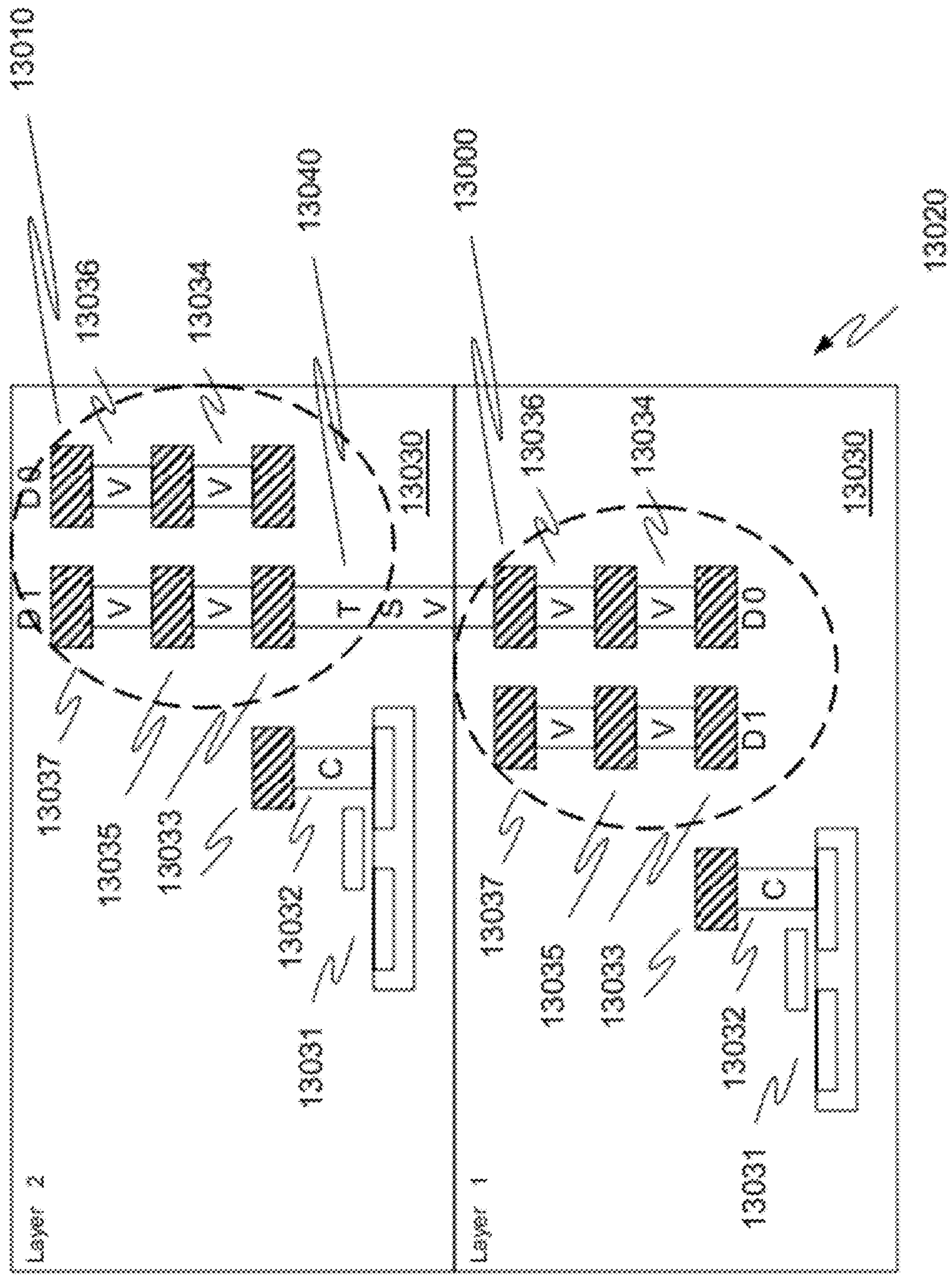
Figure 131B:
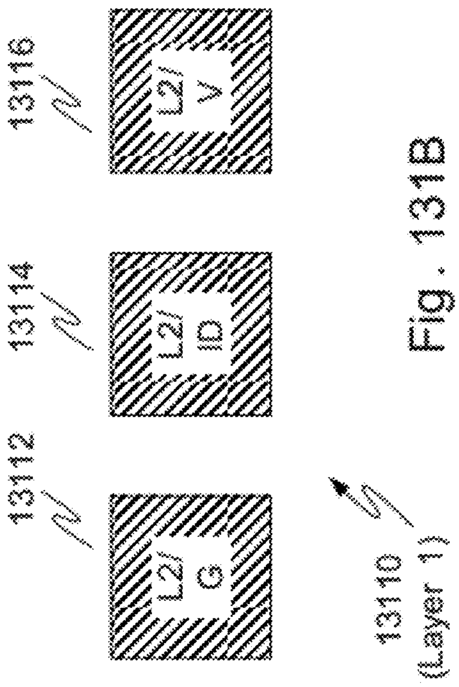
Figure 131A:
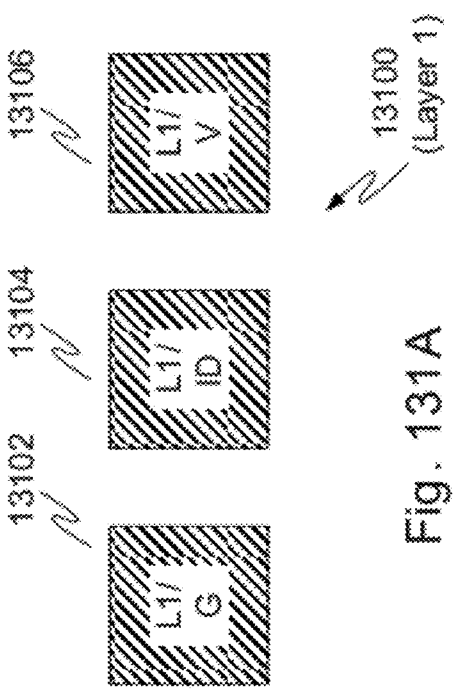
Figure 131C:
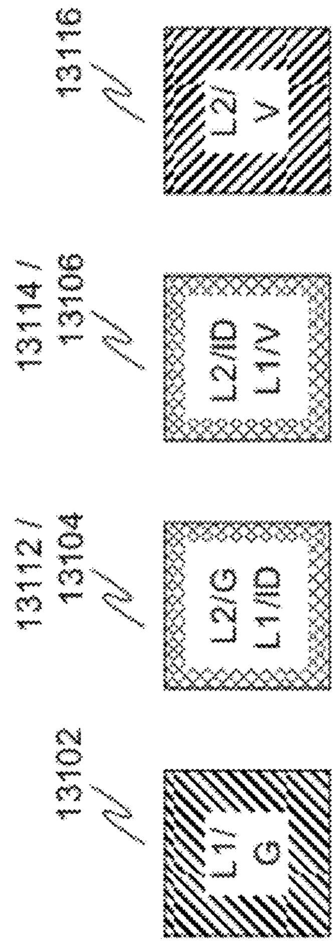
Figure 132A:
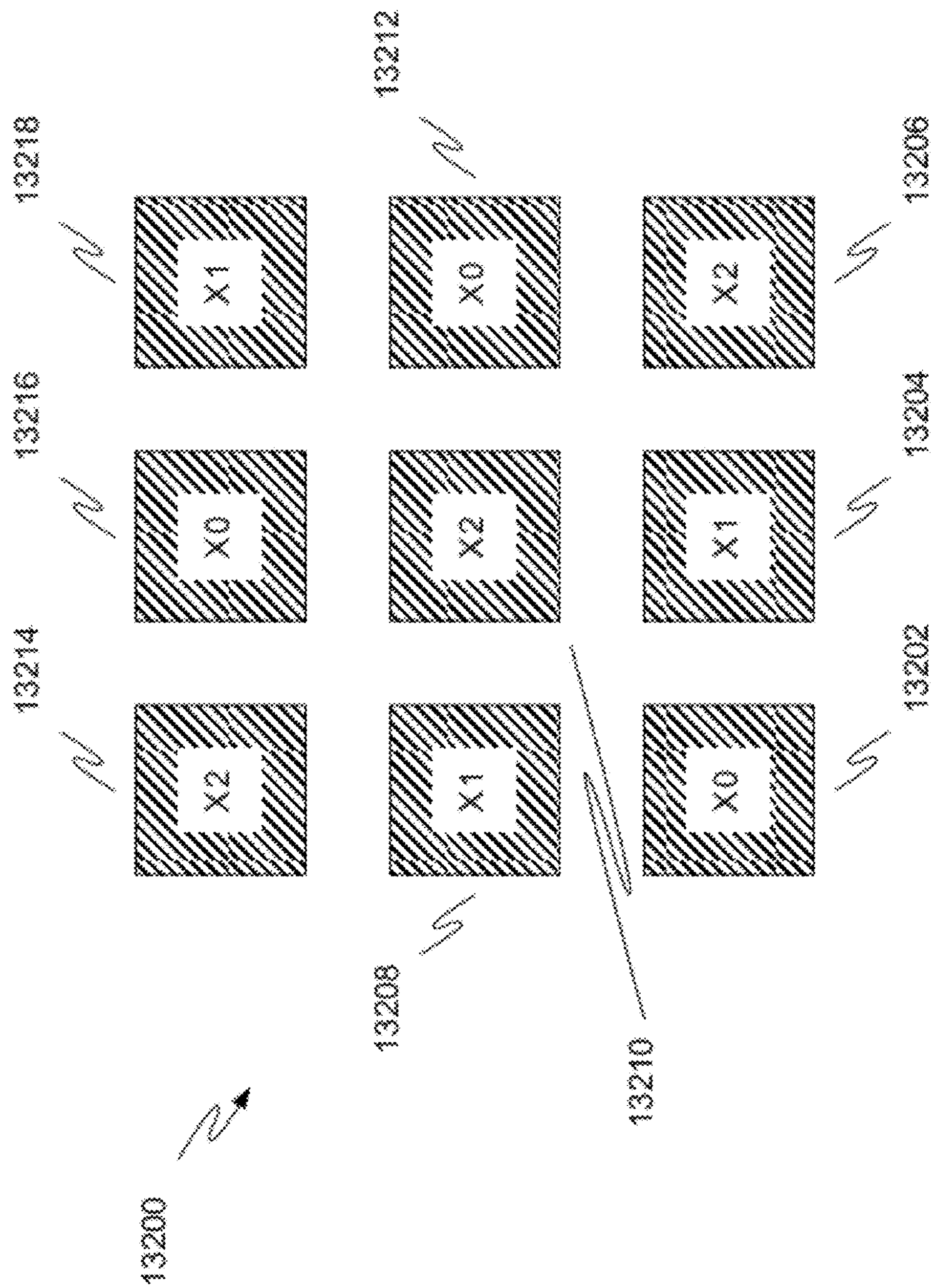
Figure 132B:
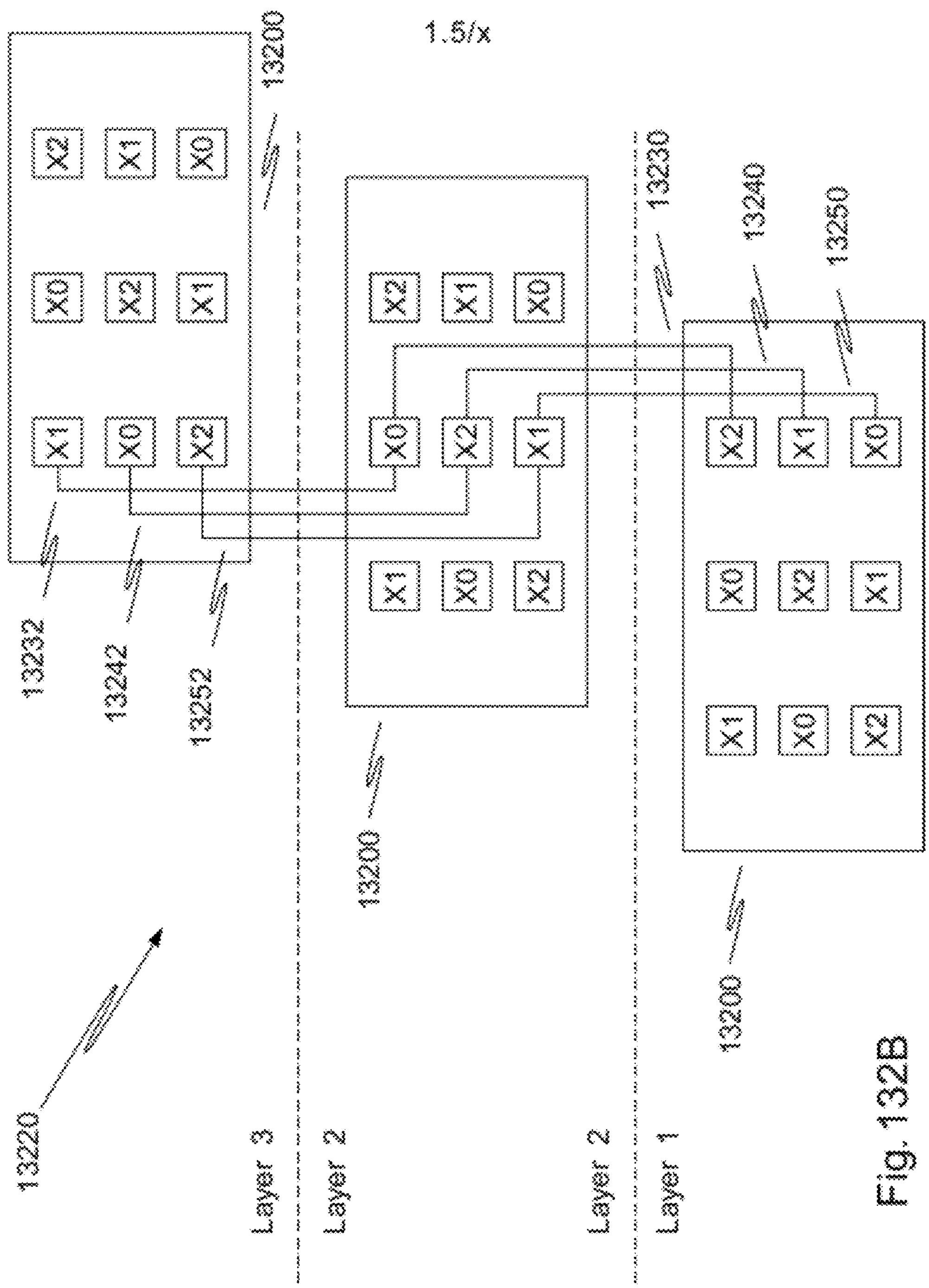
Figure 136:
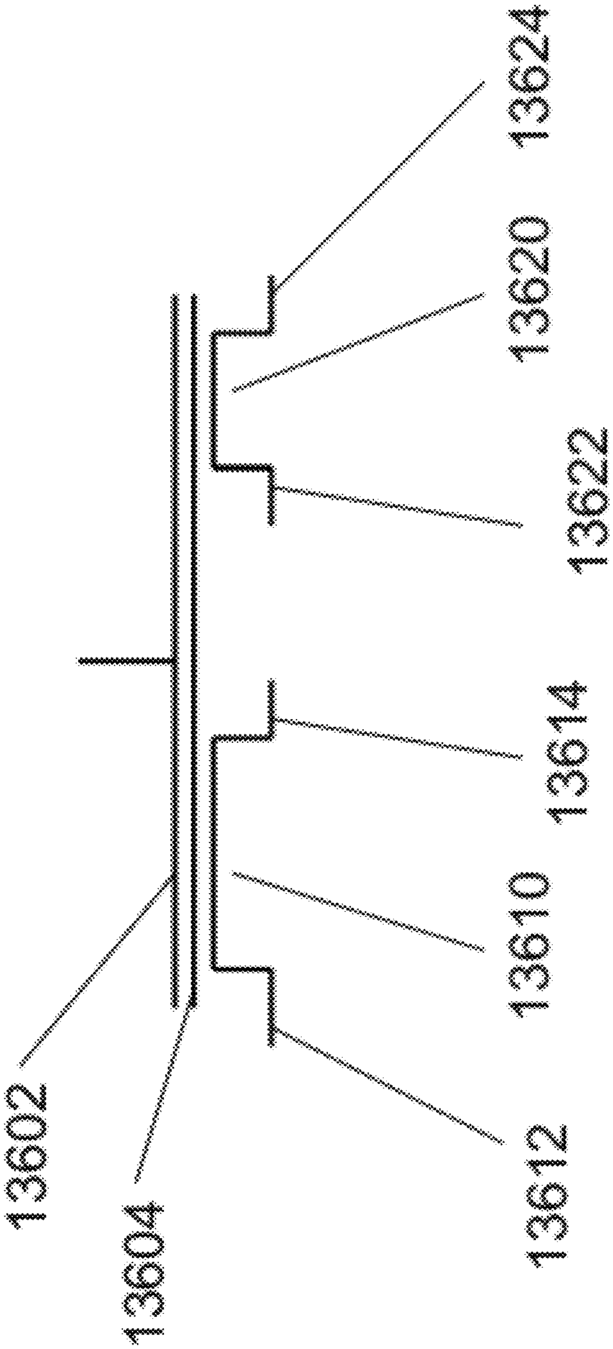
Figure 138A:
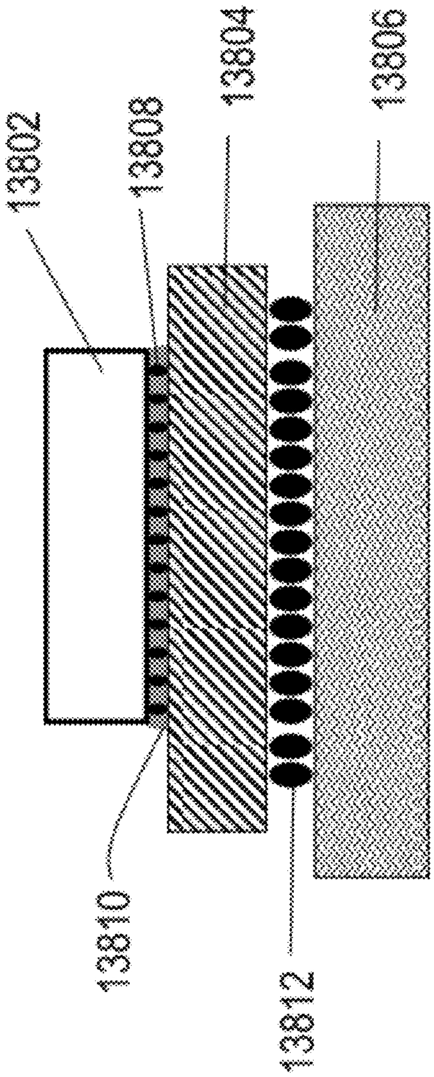
Figure 138B:
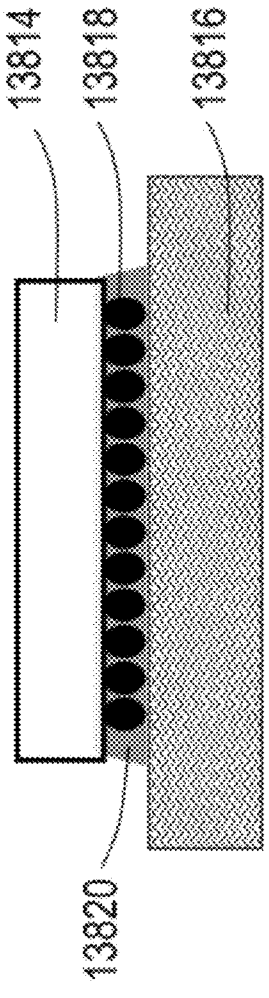
Figure 141:
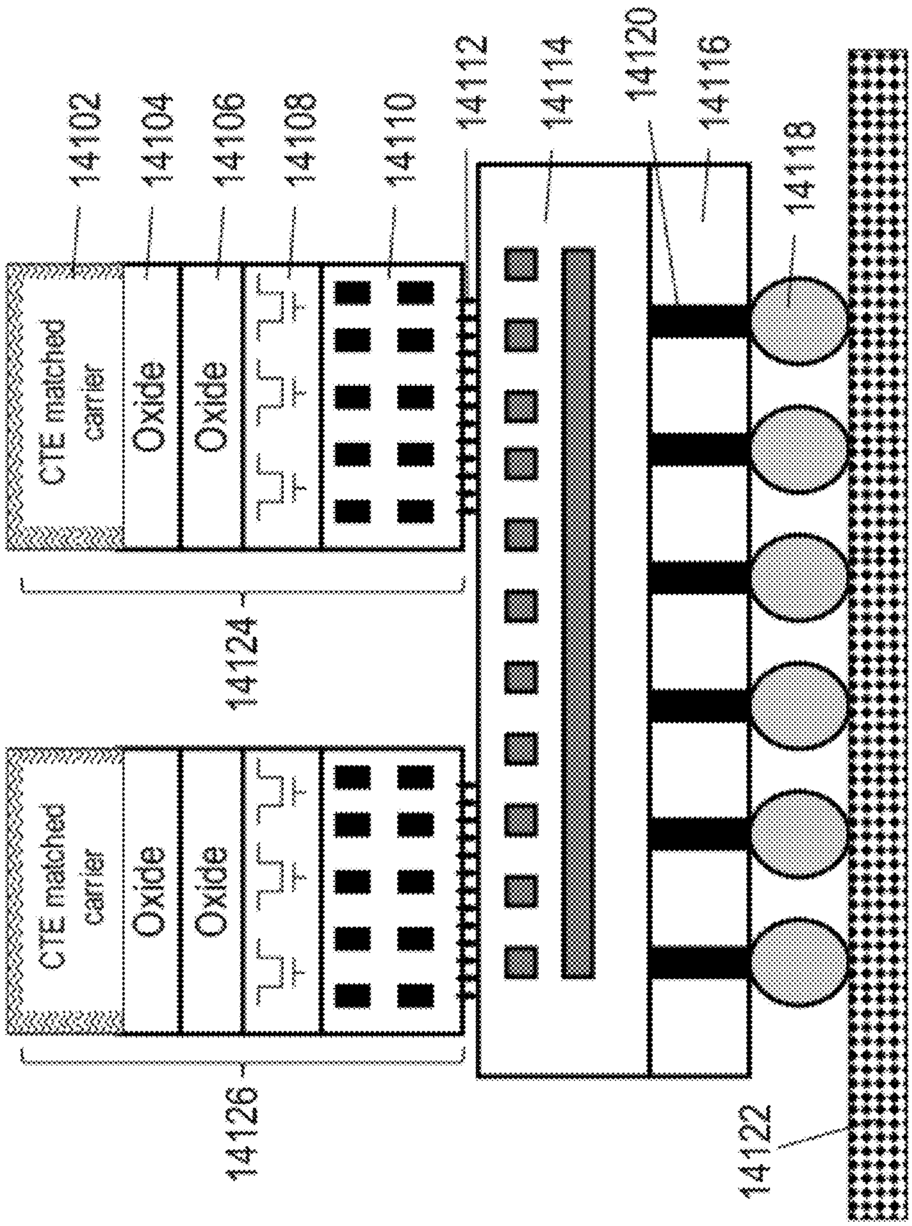
Figure 149:
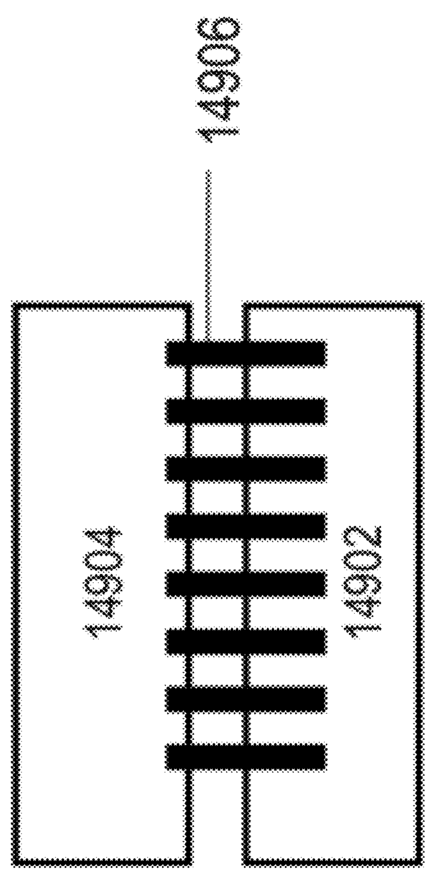

FIG. 88 A-F are exemplary drawing illustrations of a formation of 3D DRAM;

FIG. 89 A-D are exemplary drawing illustrations of a formation of 3D DRAM;

FIG. 90 A-F are exemplary drawing illustrations of a formation of 3D DRAM;

FIG. 91 A-L are exemplary drawing illustrations of a formation of 3D DRAM;

FIG. 92 A-F are exemplary drawing illustrations of a formation of 3D DRAM;

FIG. 93 A-D are exemplary drawing illustrations of an advanced TSV flow;

FIG. 94 A-C are exemplary drawing illustrations of an advanced TSV multi-connections flow;

FIG. 95 A-J are exemplary drawing illustrations of formation of CMOS recessed channel array transistors;

FIG. 96 A-J are exemplary drawing illustrations of the formation of a junction-less transistor;

FIG. 97 is an exemplary drawing illustration of the basics of floating body DRAM;

FIG. 98 A-H are exemplary drawing illustrations of the formation of a floating body DRAM transistor;

FIG. 99 A-M are exemplary drawing illustrations of the formation of a floating body DRAM transistor;

FIG. 100 A-L are exemplary drawing illustrations of the formation of a floating body DRAM transistor;

FIG. 101 A-K are exemplary drawing illustrations of the formation of a resistive memory transistor;

FIG. 102 A-L are exemplary drawing illustrations of the formation of a resistive memory transistor;

FIG. 103 A-M are exemplary drawing illustrations of the formation of a resistive memory transistor;

FIG. 104 A-F are exemplary drawing illustrations of the formation of a resistive memory transistor;

FIG. 105 A-G are exemplary drawing illustrations of the formation of a charge trap memory transistor;

FIG. 106 A-G are exemplary drawing illustrations of the formation of a charge trap memory transistor;

FIG. 107 A-G are exemplary drawing illustrations of the formation of a floating gate memory transistor;

FIG. 108 A-H are exemplary drawing illustrations of the formation of a floating gate memory transistor;

FIG. 109 A-K are exemplary drawing illustrations of the formation of a resistive memory transistor;

FIG. 110 A-J are exemplary drawing illustrations of the formation of a resistive memory transistor with periphery on top;

FIG. 111 A-D are exemplary drawing illustrations of a generalized layer transfer process flow with alignment windows;

FIG. 112 is an exemplary drawing illustration of a heat spreader in a 3D IC;

FIG. 113 A-B are exemplary drawing illustrations of an integrated heat removal configuration for 3D ICs;

FIG. 114 is an exemplary drawing illustration of a field repairable 3D IC;

FIG. 114A is an exemplary drawing illustration of a methodology for yield repair of failing logic cones of a field repairable 3D IC described with respect to FIG. 114;

FIG. 115 is an exemplary drawing illustration of a Triple Modular Redundancy 3D IC;

FIG. 116 is an exemplary drawing illustration of a set scan architecture of the prior art;

FIG. 117 is an exemplary drawing illustration of a boundary scan architecture of the prior art;

FIG. 118 is an exemplary drawing illustration of a BIST architecture of the prior art;

FIG. 119 is an exemplary drawing illustration of a second field repairable 3D IC;

FIG. 120 is an exemplary drawing illustration of a scan flip-flop suitable for use with the 3D IC of FIG. 119;

FIG. 121A is an exemplary drawing illustration of a third field repairable 3D IC;

FIG. 121B is an exemplary drawing illustration of additional aspects of the field repairable 3D IC of FIG. 121A;

FIG. 122 is an exemplary drawing illustration of a fourth field repairable 3D IC;

FIG. 123 is an exemplary drawing illustration of a fifth field repairable 3D IC;

FIG. 124 is an exemplary drawing illustration of a sixth field repairable 3D IC;

FIG. 125A is an exemplary drawing illustration of a seventh field repairable 3D IC;

FIG. 125B is an exemplary drawing illustration of additional aspects of the field repairable 3D IC of FIG. 125A;

FIG. 125C is an exemplary drawing illustration of a methodology for power saving yield repair of a filed repairable 3D logic IC as described with respect to FIGS. 114, 125A and 125B;

FIG. 126 is an exemplary drawing illustration of an eighth field repairable 3D IC;

FIG. 127 is an exemplary drawing illustration of a second Triple Modular Redundancy 3D IC;

FIG. 128 is an exemplary drawing illustration of a third Triple Modular Redundancy 3D IC;

FIG. 129 is an exemplary drawing illustration of a fourth Triple Modular Redundancy 3D IC;

FIG. 130A is an exemplary drawing illustration of a first via metal overlap pattern;

FIG. 130B is an exemplary drawing illustration of a second via metal overlap pattern;

FIG. 130C is an exemplary drawing illustration of the alignment of the via metal overlap patterns of FIGS. 130A and 130B in a 3D IC;

FIG. 130D is an exemplary drawing illustration of a side view of the structure of FIG. 130C;

FIG. 131A is an exemplary drawing illustration of a third via metal overlap pattern;

FIG. 131B is an exemplary drawing illustration of a fourth via metal overlap pattern;

FIG. 131C is an exemplary drawing illustration of the alignment of the via metal overlap patterns of FIGS. 131A and 131B in a 3D IC;

FIG. 132A is an exemplary drawing illustration of a fifth via metal overlap pattern;

FIG. 132B is an exemplary drawing illustration of the alignment of three instances of the via metal overlap patterns of FIG. 132A in a 3D IC;

FIG. 133 A-I are exemplary drawing illustrations of formation of a recessed channel array transistor with source and drain silicide;

FIG. 134 A-F are exemplary drawing illustrations of a 3D IC FPGA process flow;

FIG. 135 A-D are exemplary drawing illustrations of an alternative 3D IC FPGA process flow;

FIG. 136 is an exemplary drawing illustration of an NVM FPGA configuration cell;

FIG. 137 A-G are exemplary drawing illustrations of a 3D IC NVM FPGA configuration cell process flow;

FIG. 138 A-B are exemplary drawing illustrations of prior-art packaging schemes;

FIG. 139 A-F are exemplary drawing illustrations of a process flow to construct packages;

FIG. 140 A-F are exemplary drawing illustrations of a process flow to construct packages;

FIG. 141 is an exemplary drawing illustration of a technique to provide a high density of connections between different chips on the same packaging substrate;

FIG. 142 A-C are exemplary drawing illustrations of process to reduce surface roughness after a cleave;

FIG. 143 A-D are exemplary drawing illustrations of a prior art process to construct shallow trench isolation regions;

FIG. 144 A-D are exemplary drawing illustrations of a sub-400° C. process to construct shallow trench isolation regions;

FIG. 145 A-J are exemplary drawing illustrations of a process flow for manufacturing junction-less transistors with reduced lithography steps;

FIG. 146 A-K are exemplary drawing illustrations of a process flow for manufacturing FinFET transistors with reduced lithography steps;

FIG. 147 A-G are exemplary drawing illustrations of a process flow for manufacturing planar transistors with reduced lithography steps;

FIG. 148 A-H are exemplary drawing illustrations of a process flow for manufacturing 3D stacked planar transistors with reduced lithography steps;

FIG. 149 is an exemplary drawing illustration of 3D stacked peripheral transistors constructed above a memory layer;

FIG. 150 A-C are exemplary drawing illustrations of a process to transfer thin layers;

FIG. 151 A-F are exemplary drawing illustrations of a process flow for manufacturing junction-less recessed channel array transistors;

FIG. 152 A-I are exemplary drawing illustrations of a process flow for manufacturing trench MOSFETs.

Figure 155A:
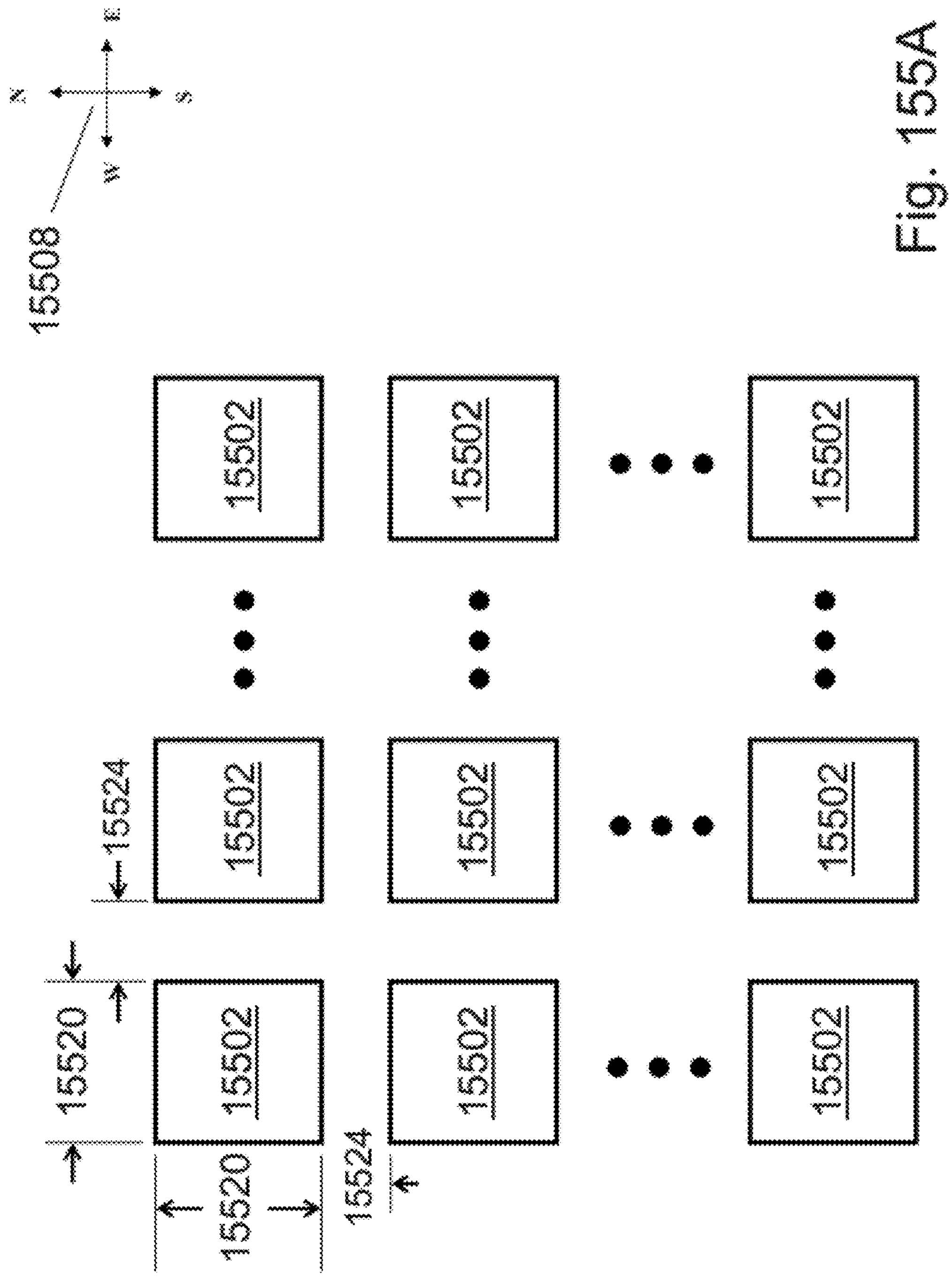
Figure 155B:
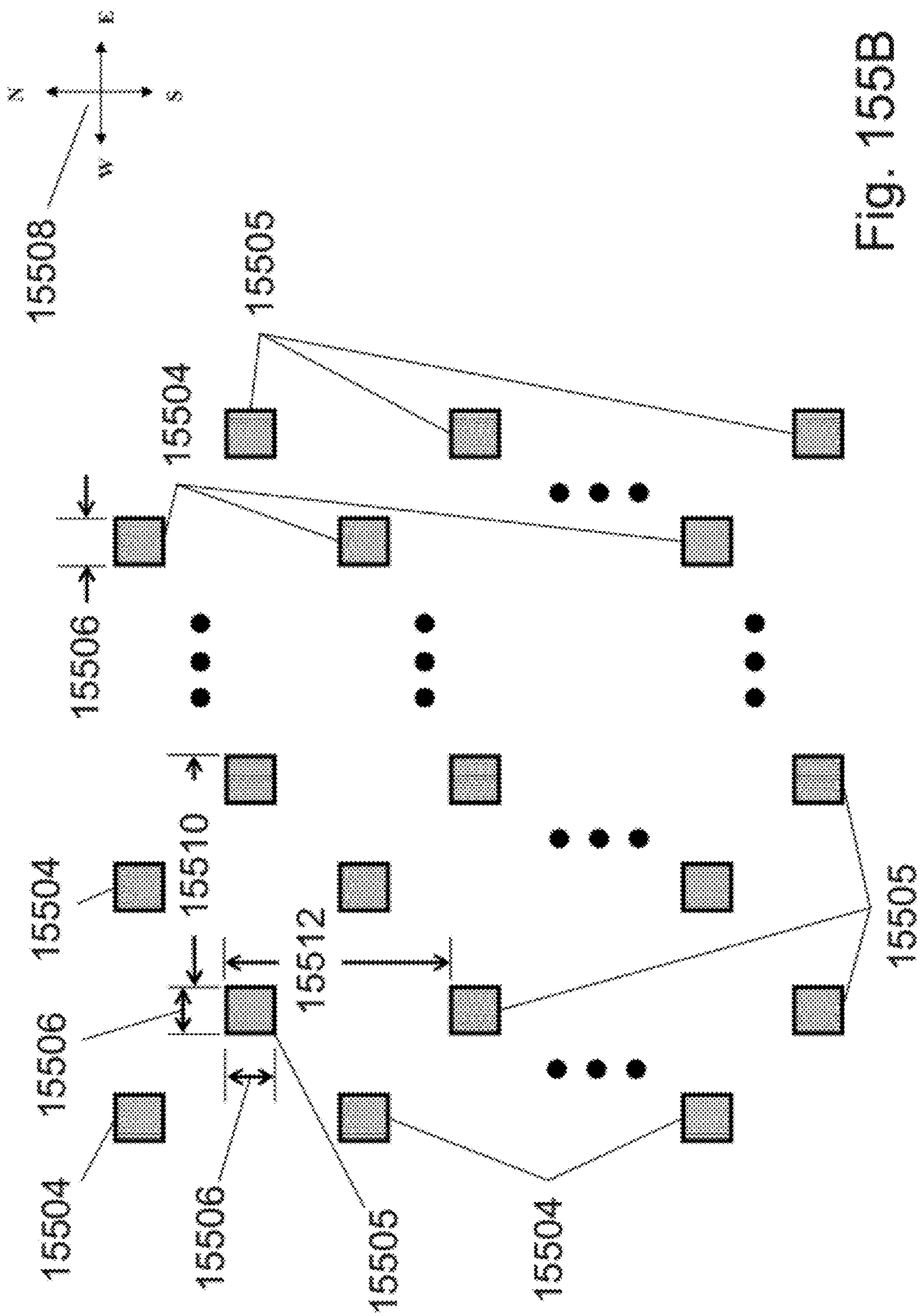
Figure 155C:
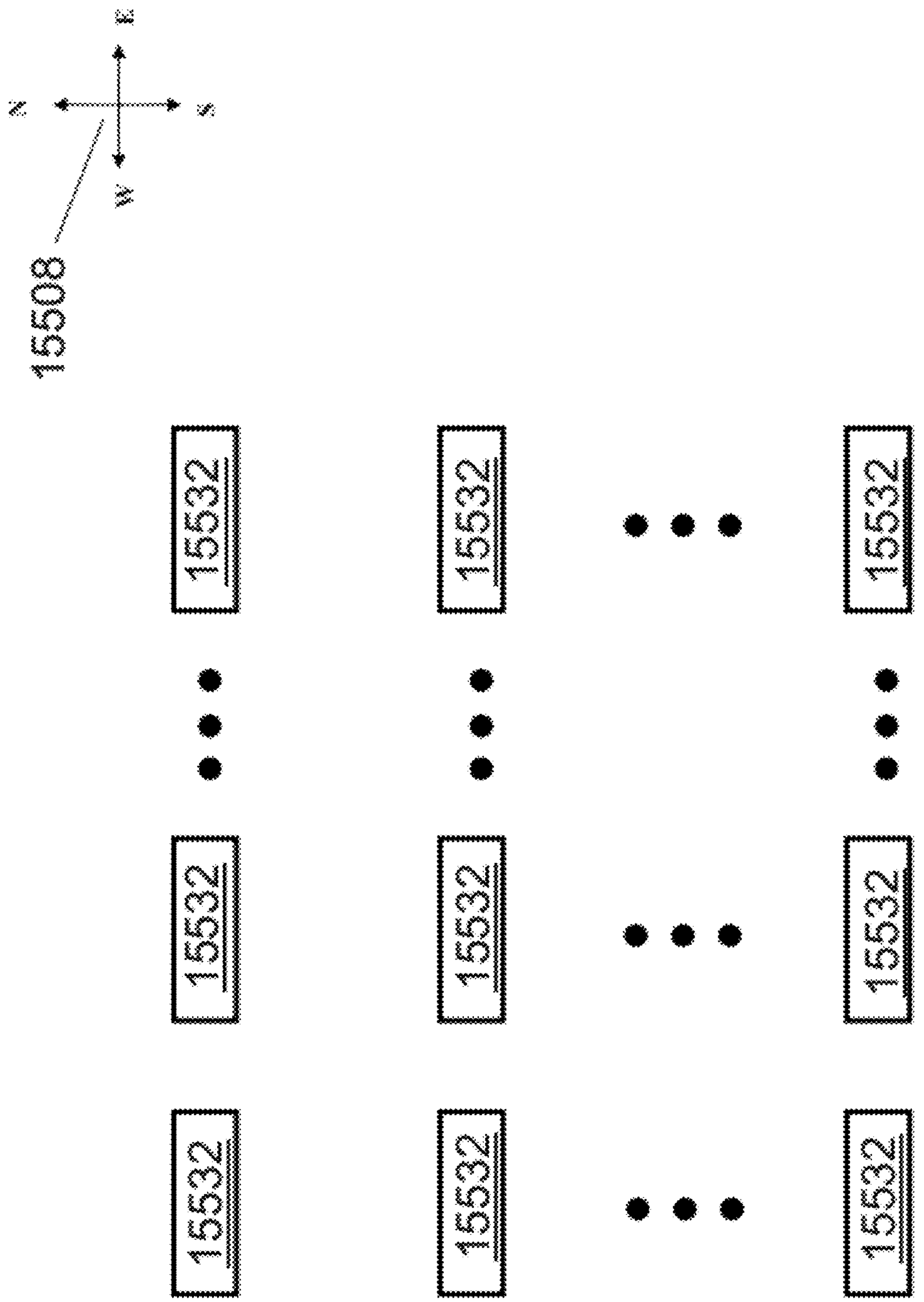
Figure 155D:
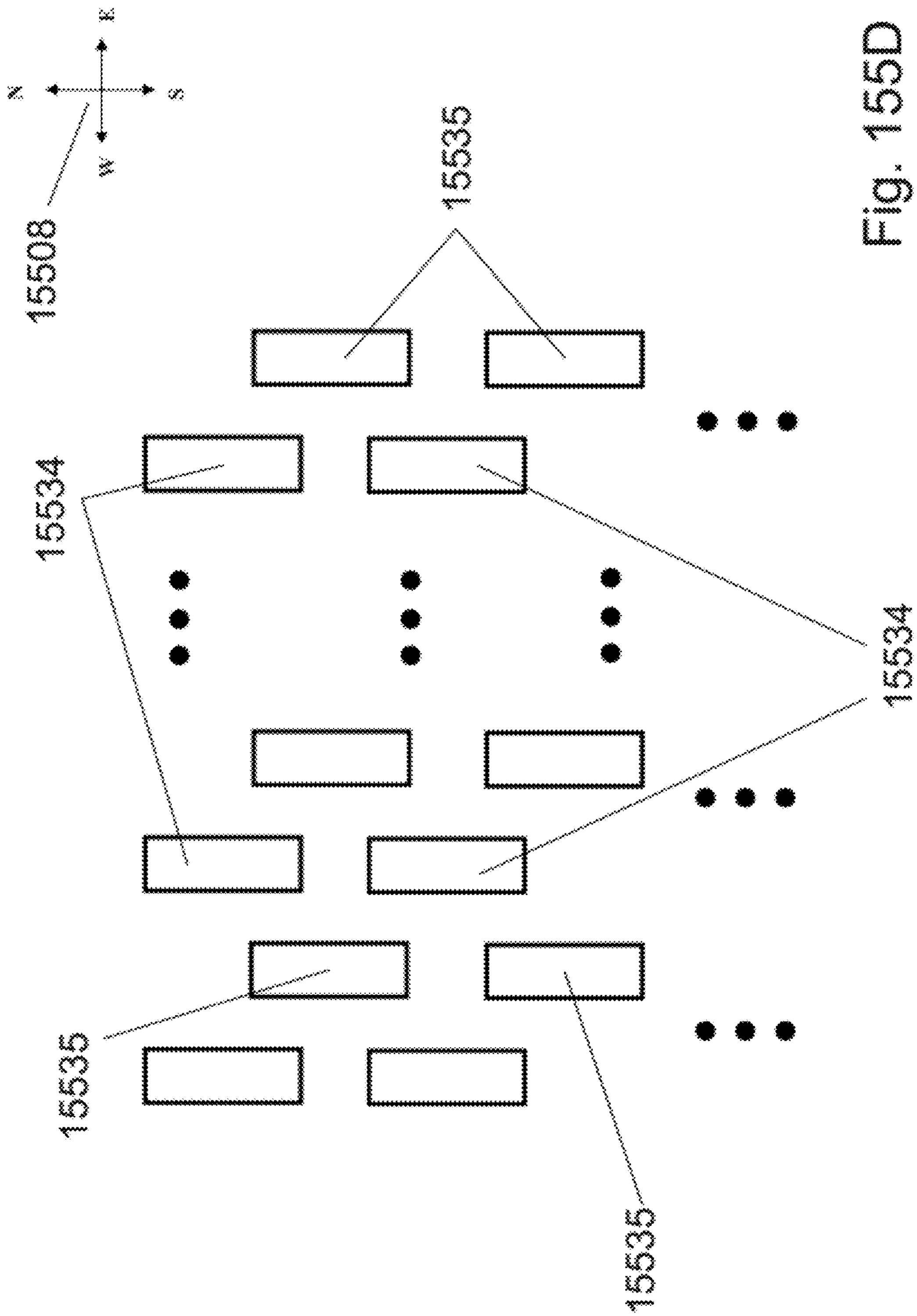
Figure 156:
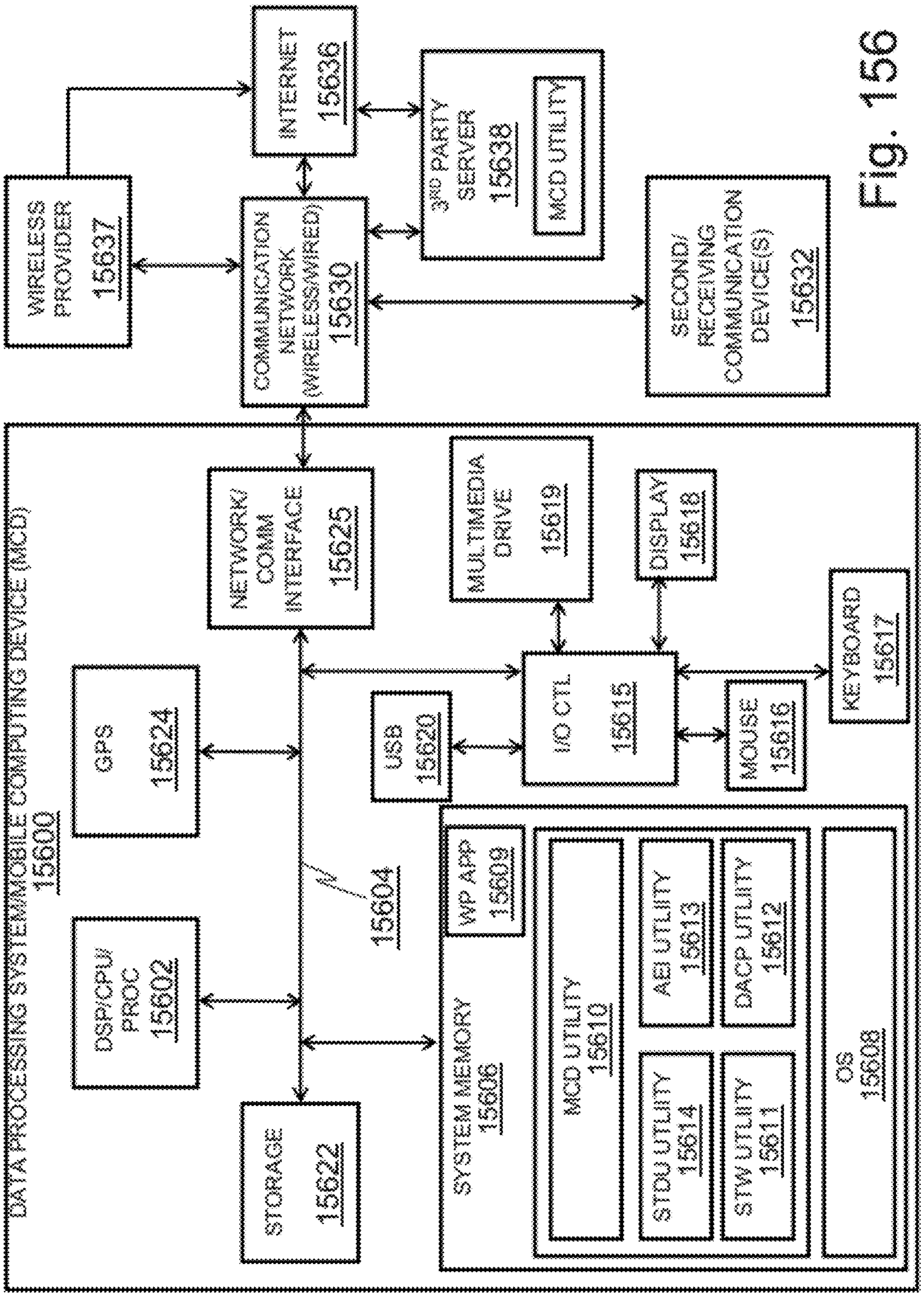
Figure 160:
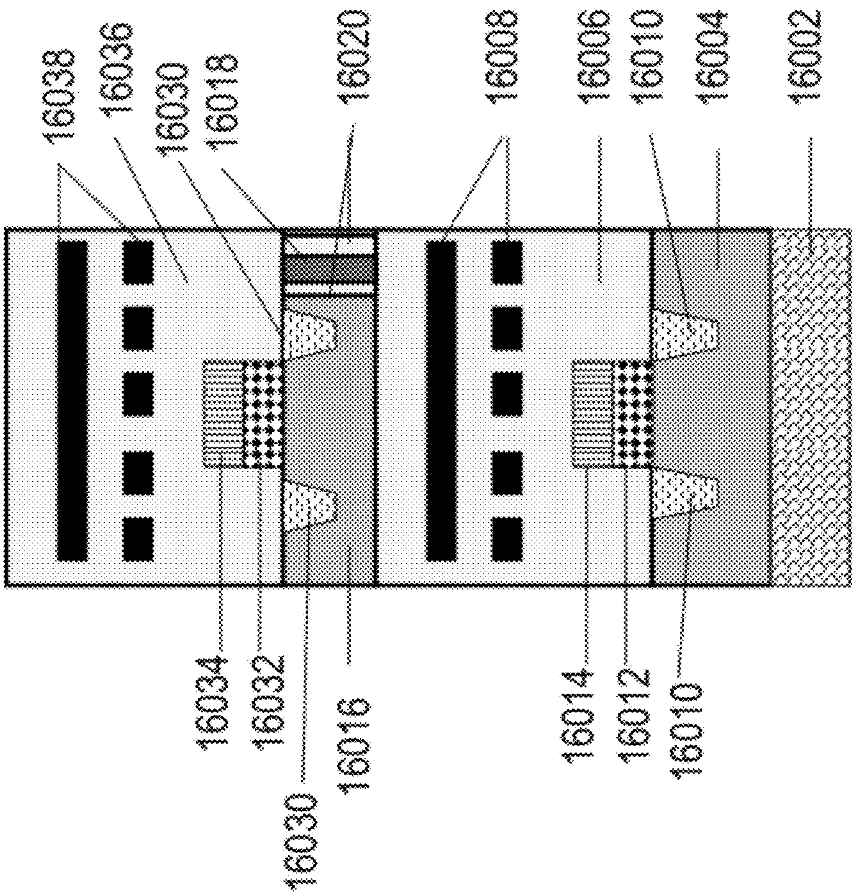
Figure 161:
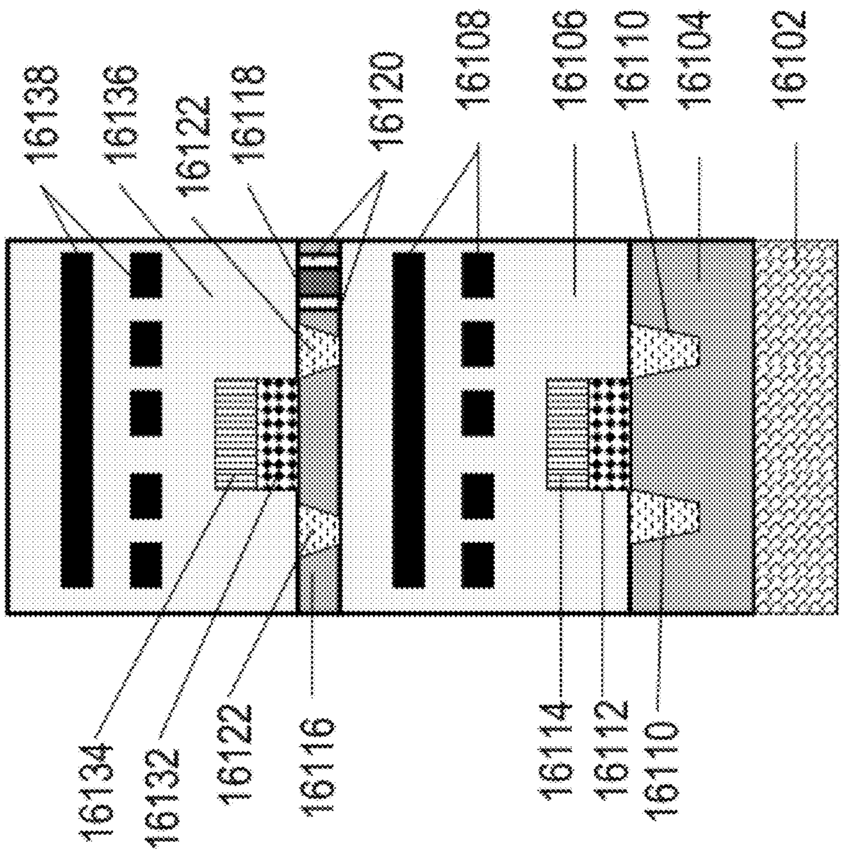
Figure 162:
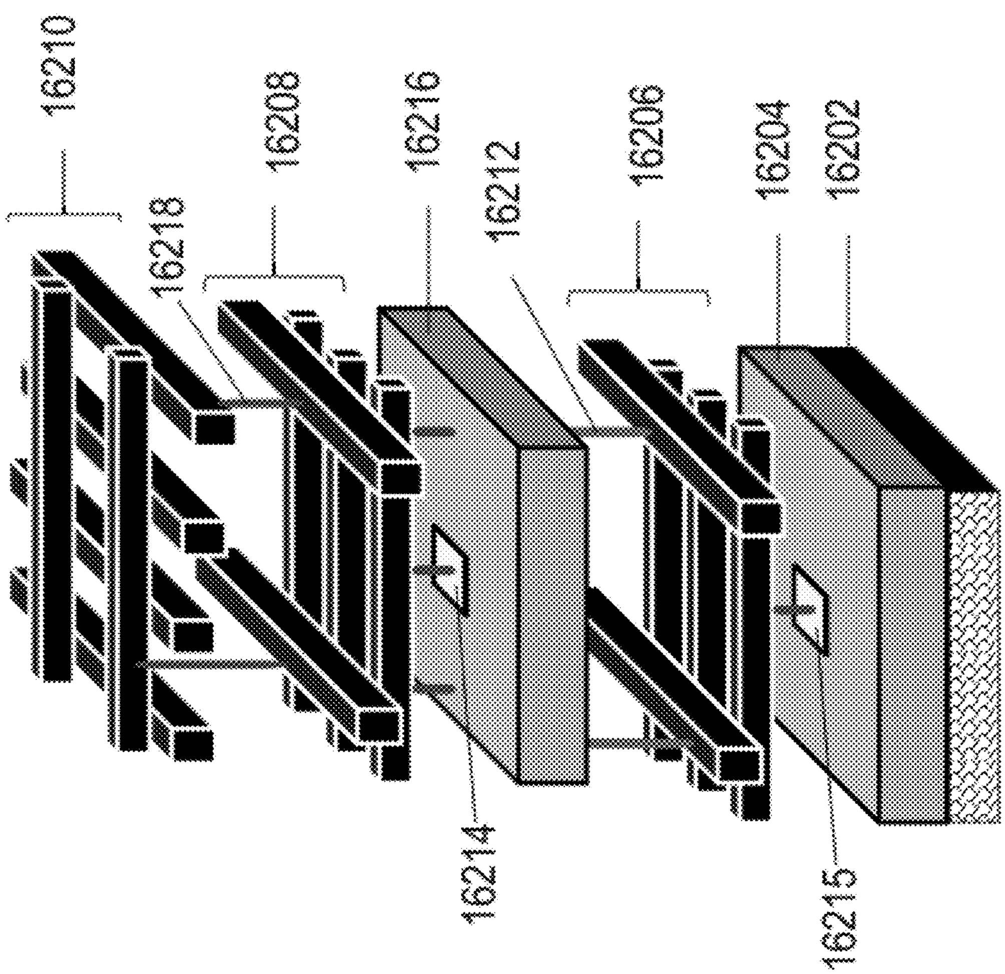
Figure 163:
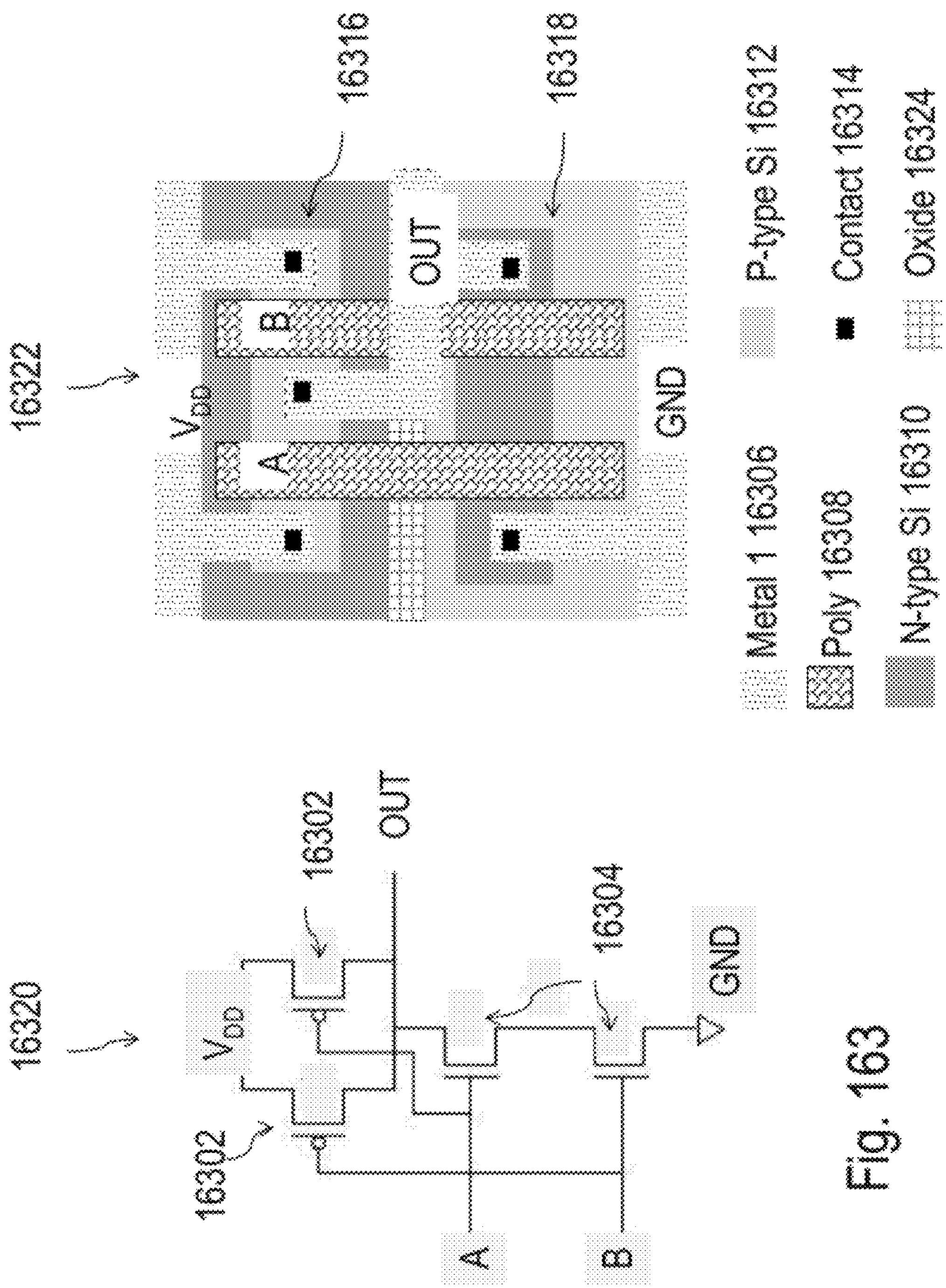
Figure 164:
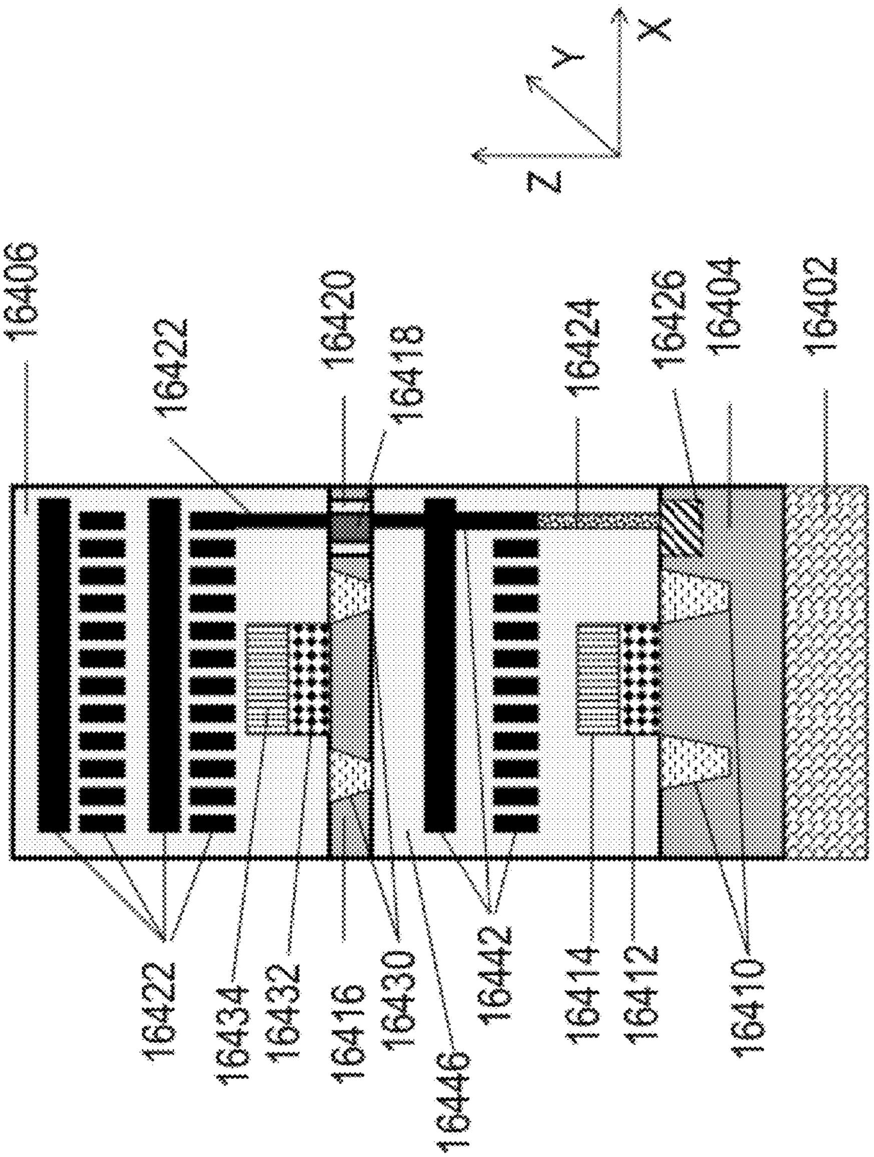
Figure 165:
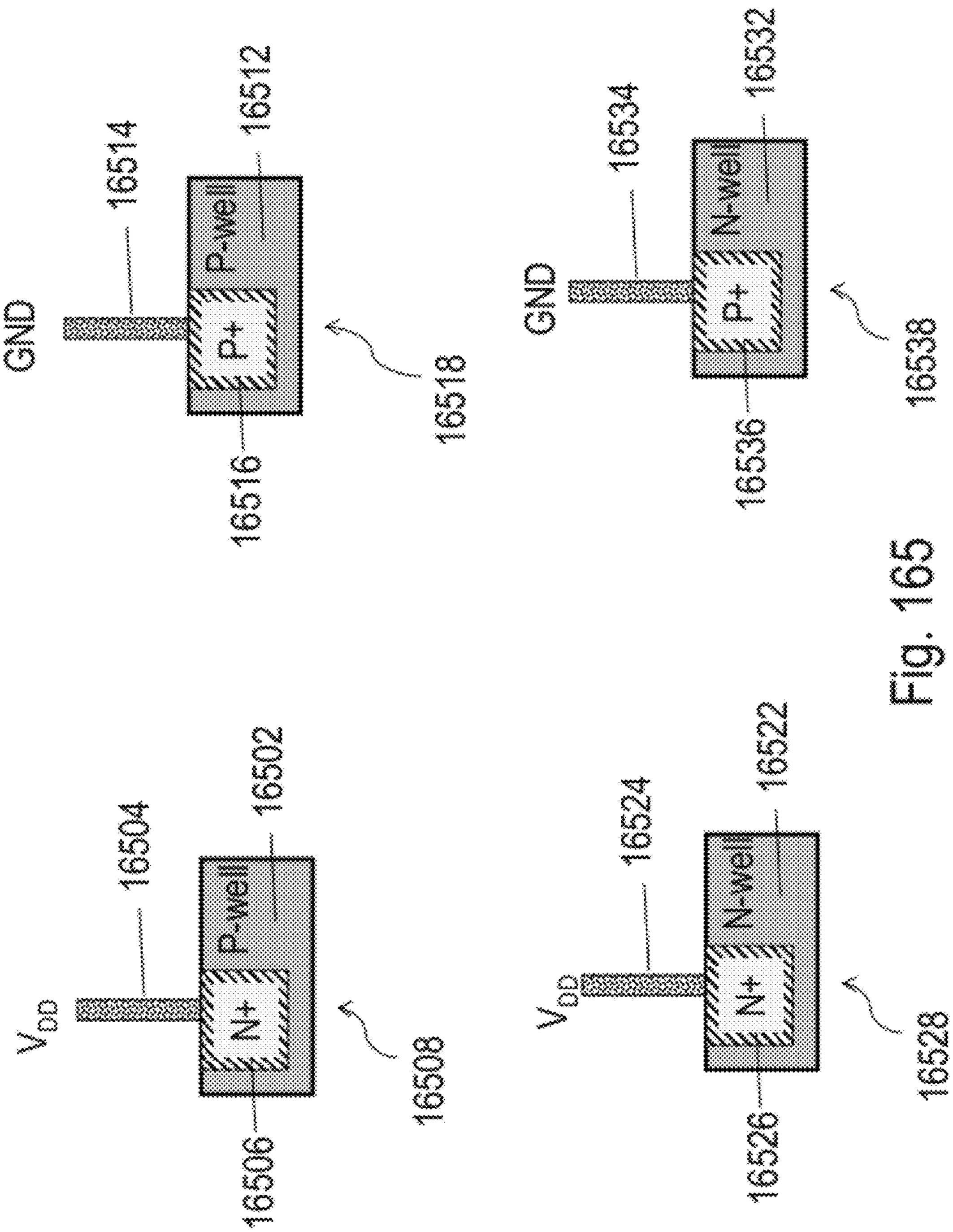
Figure 166:
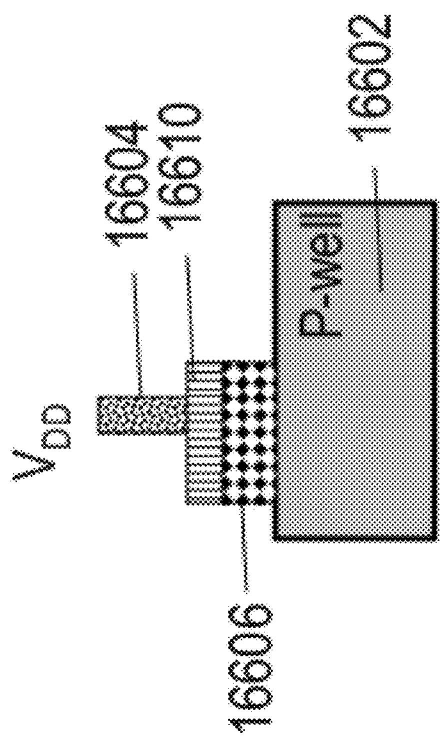
Figure 167:
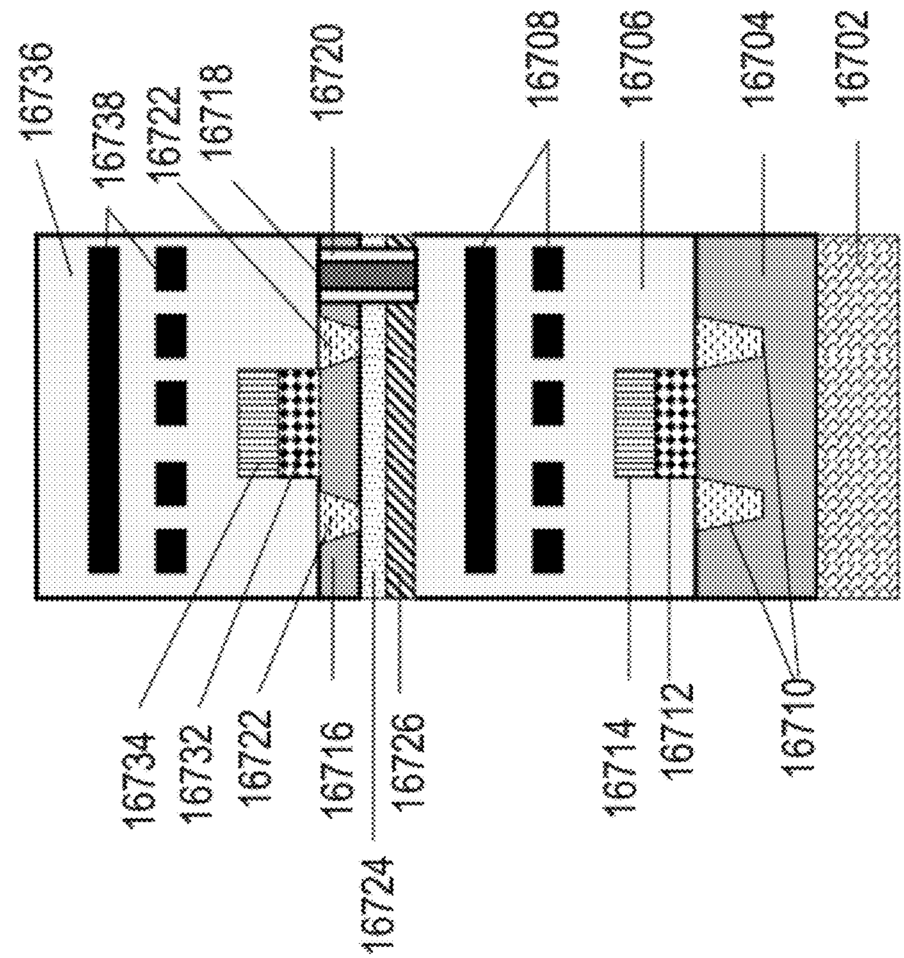
Figure 168:
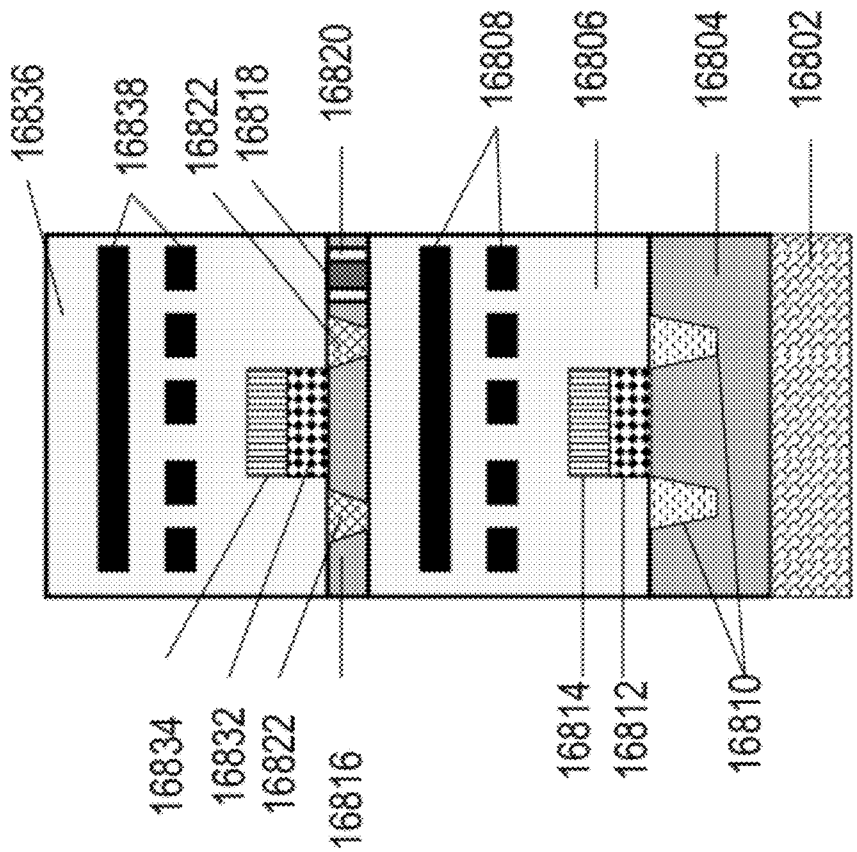
Figure 169:
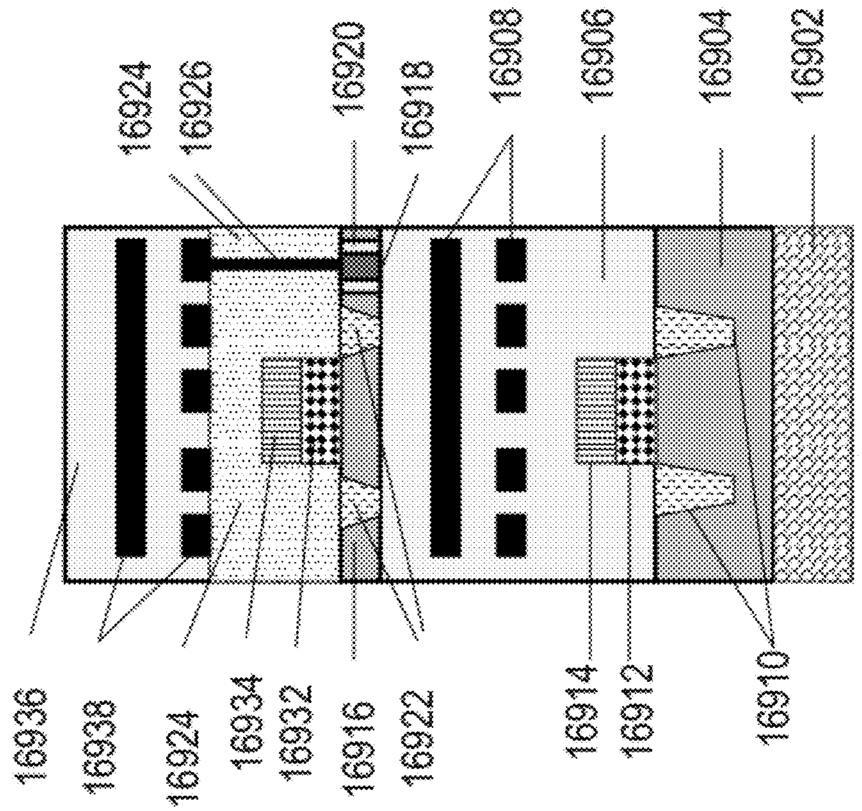
Figure 170:
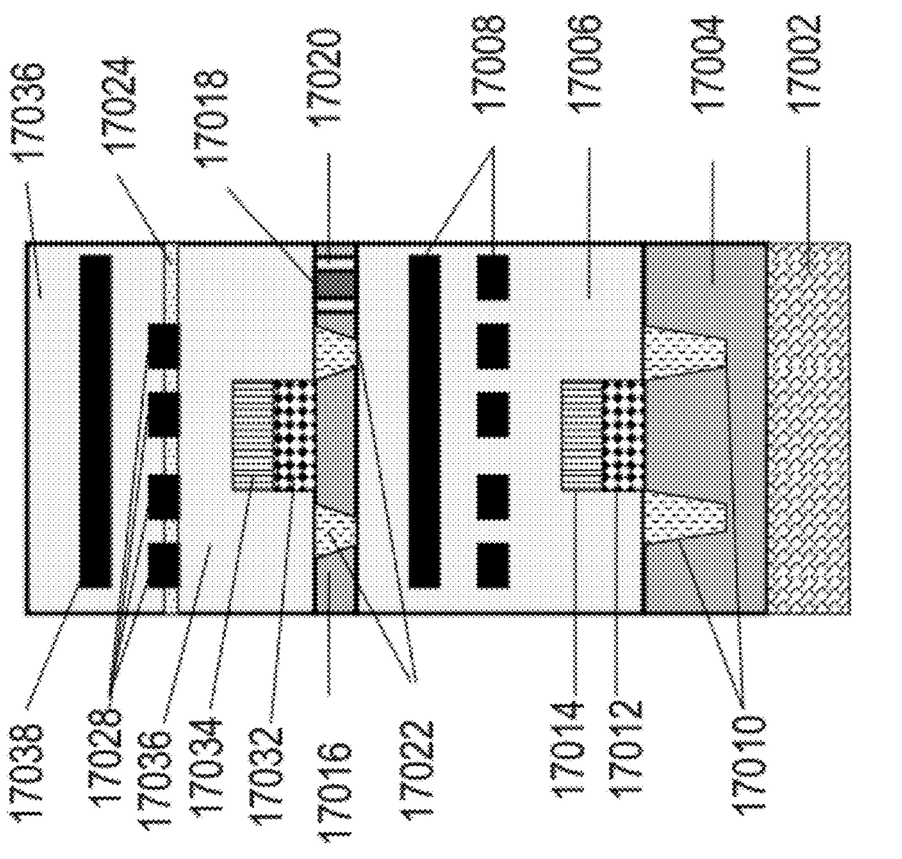
Figure 172:
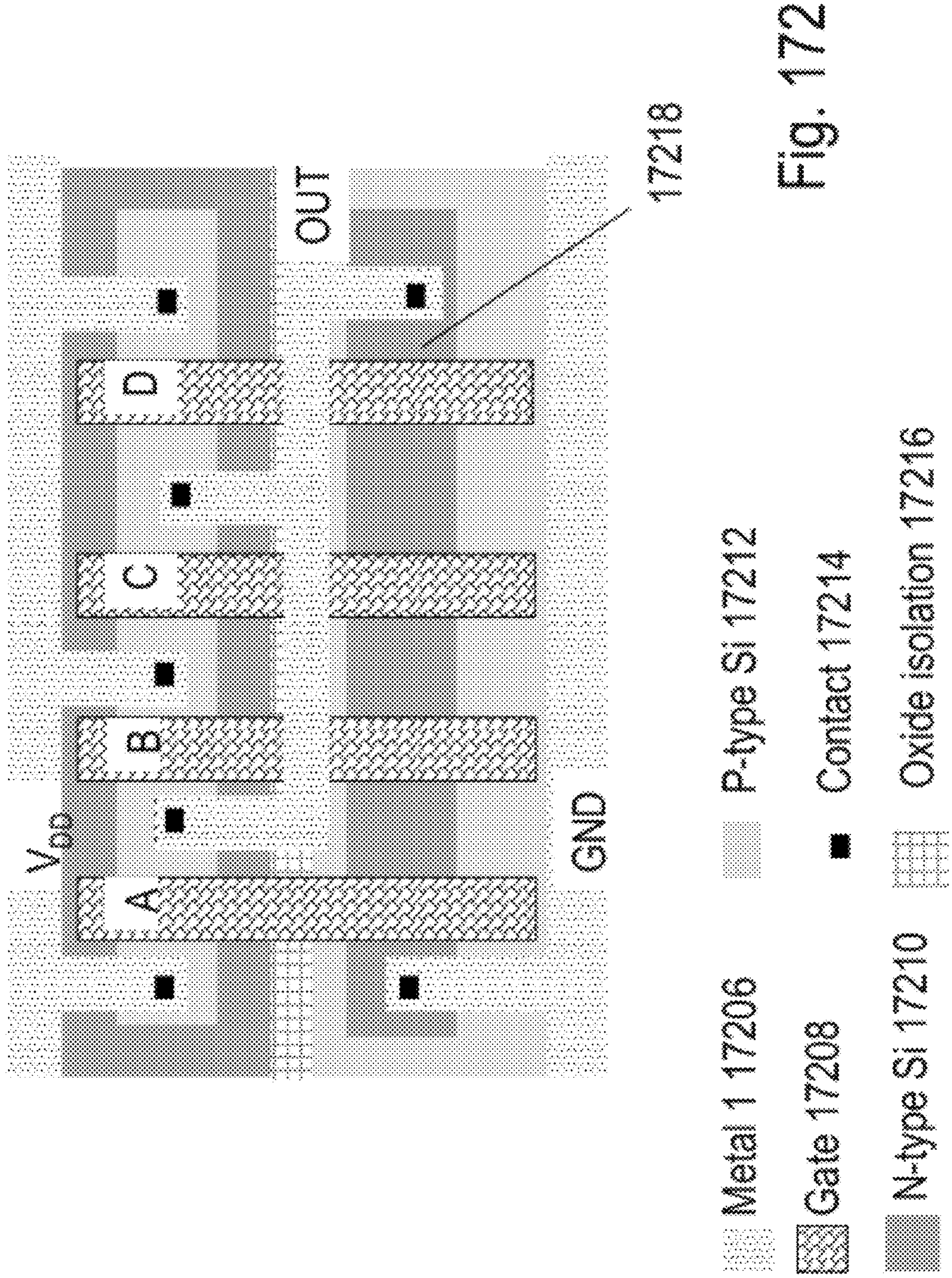
Figure 173:
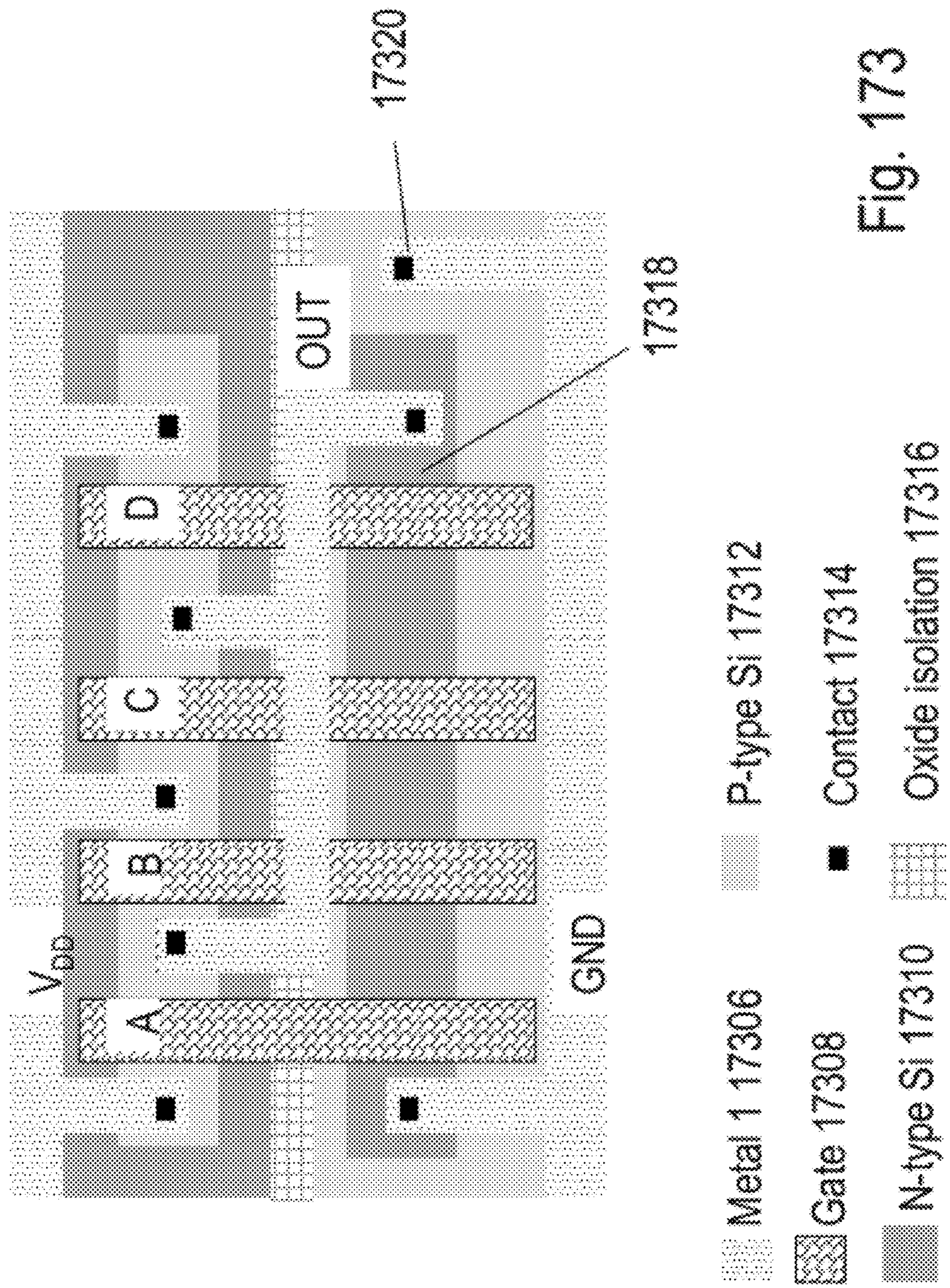
Figure 174:
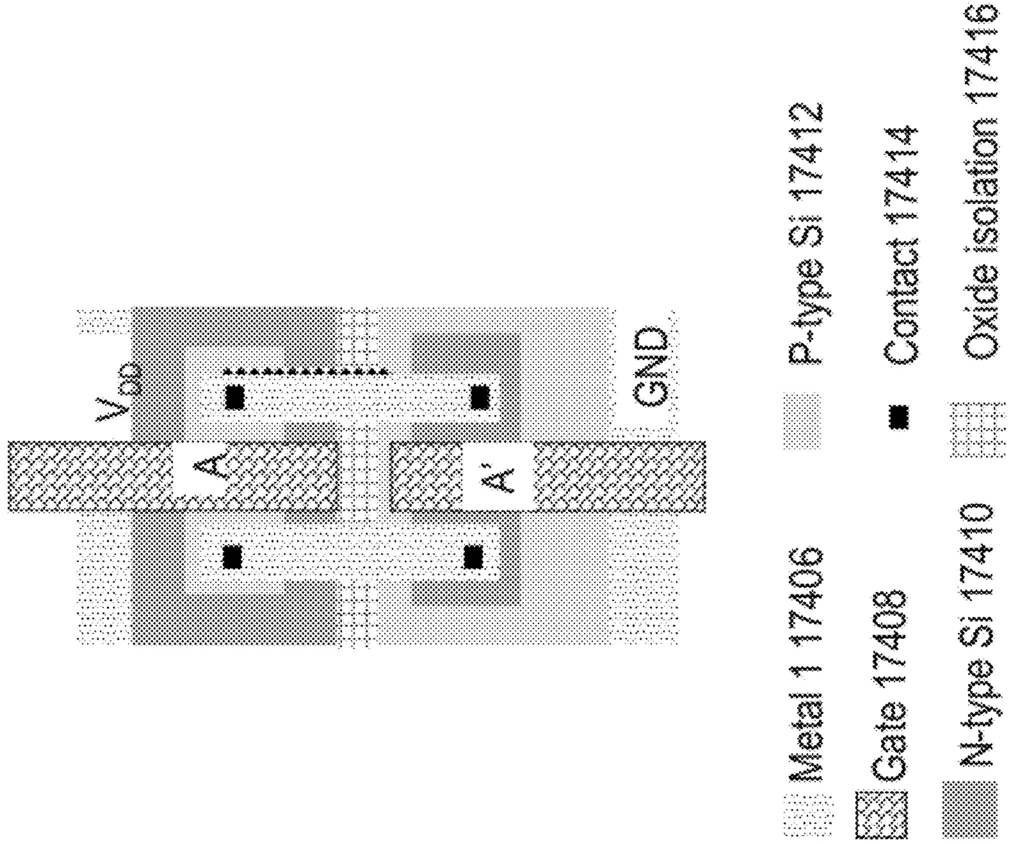
Figure 175:
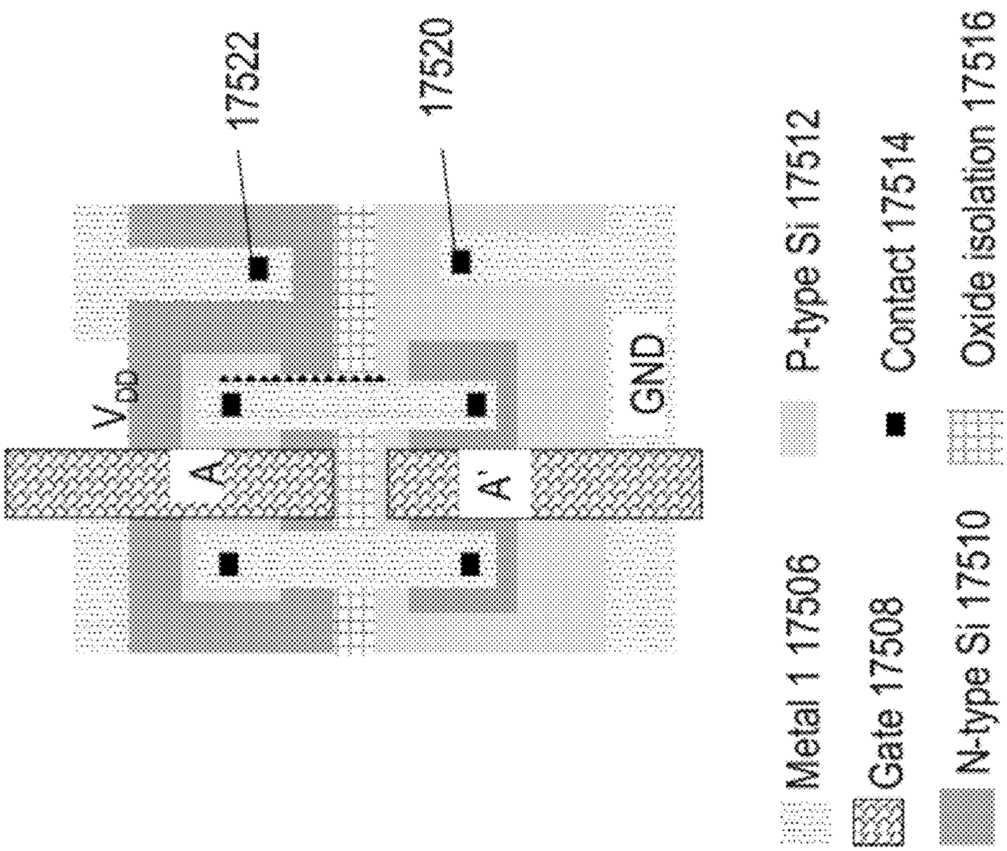
Figure 177:
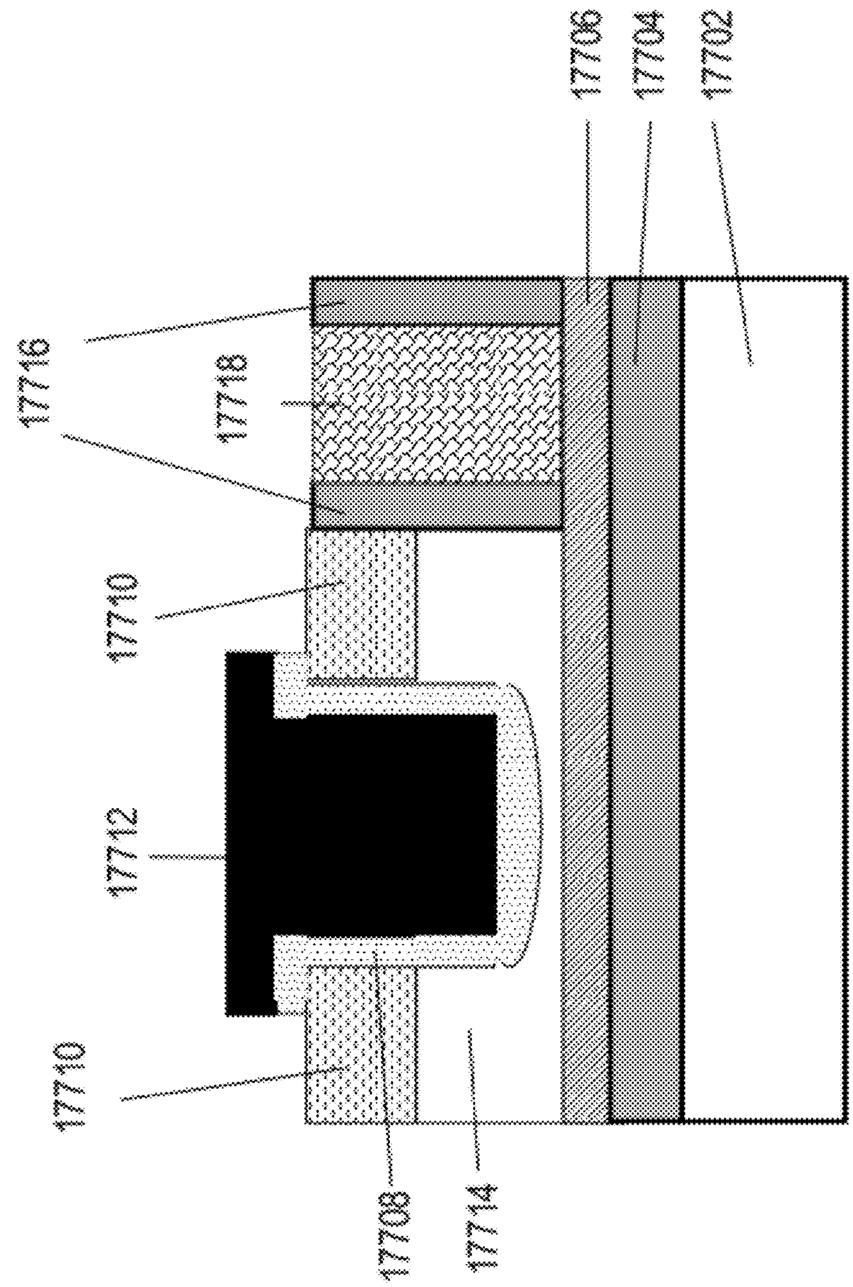
Figure 178:
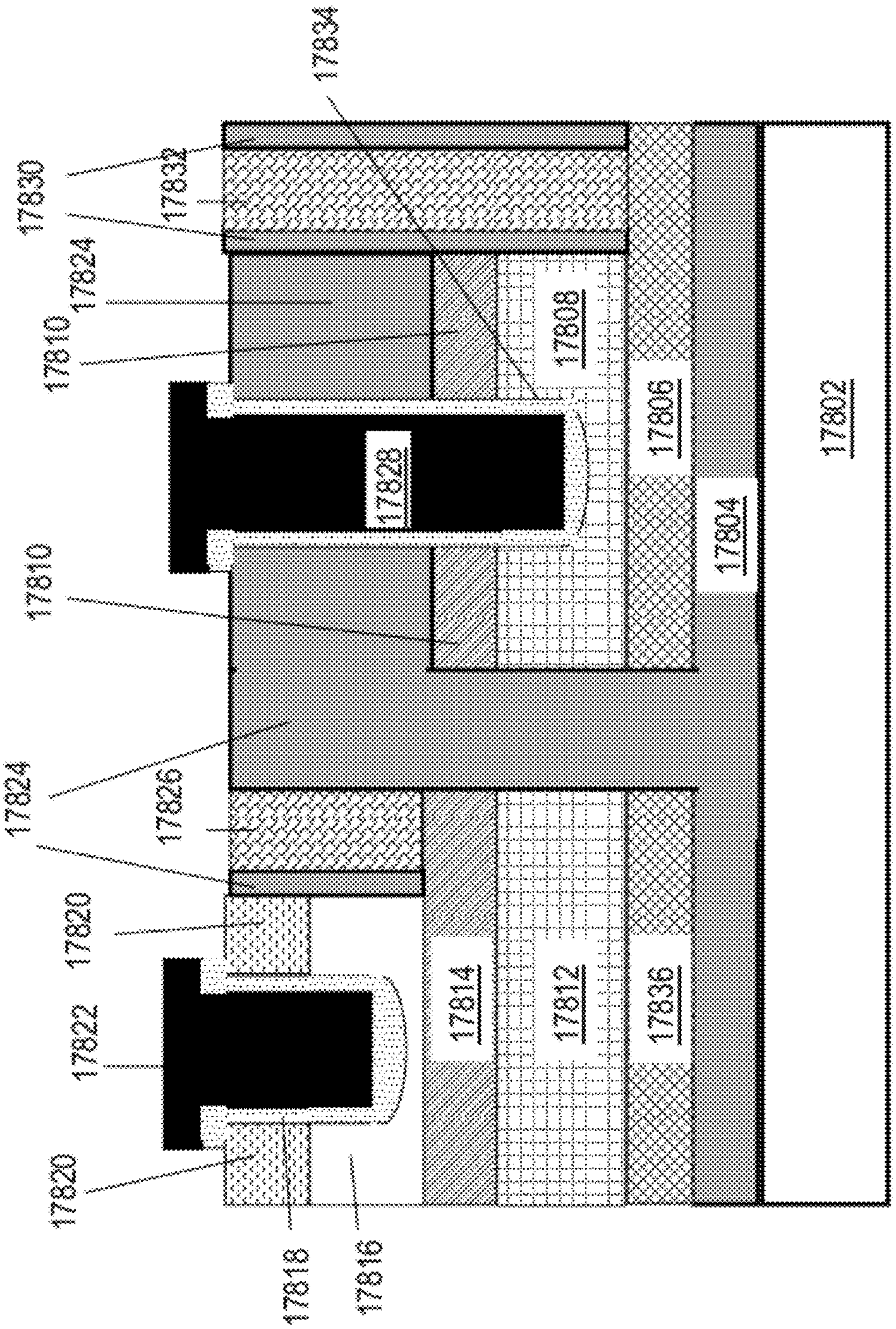
Figure 179:
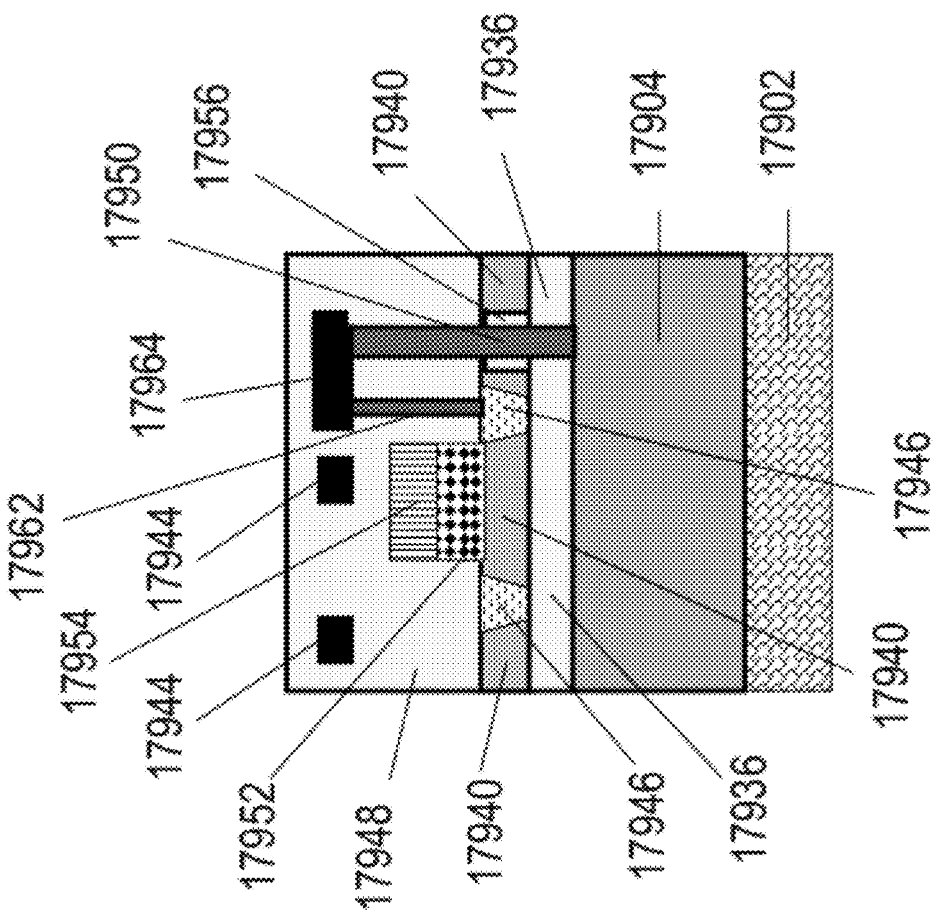
Figure 180:
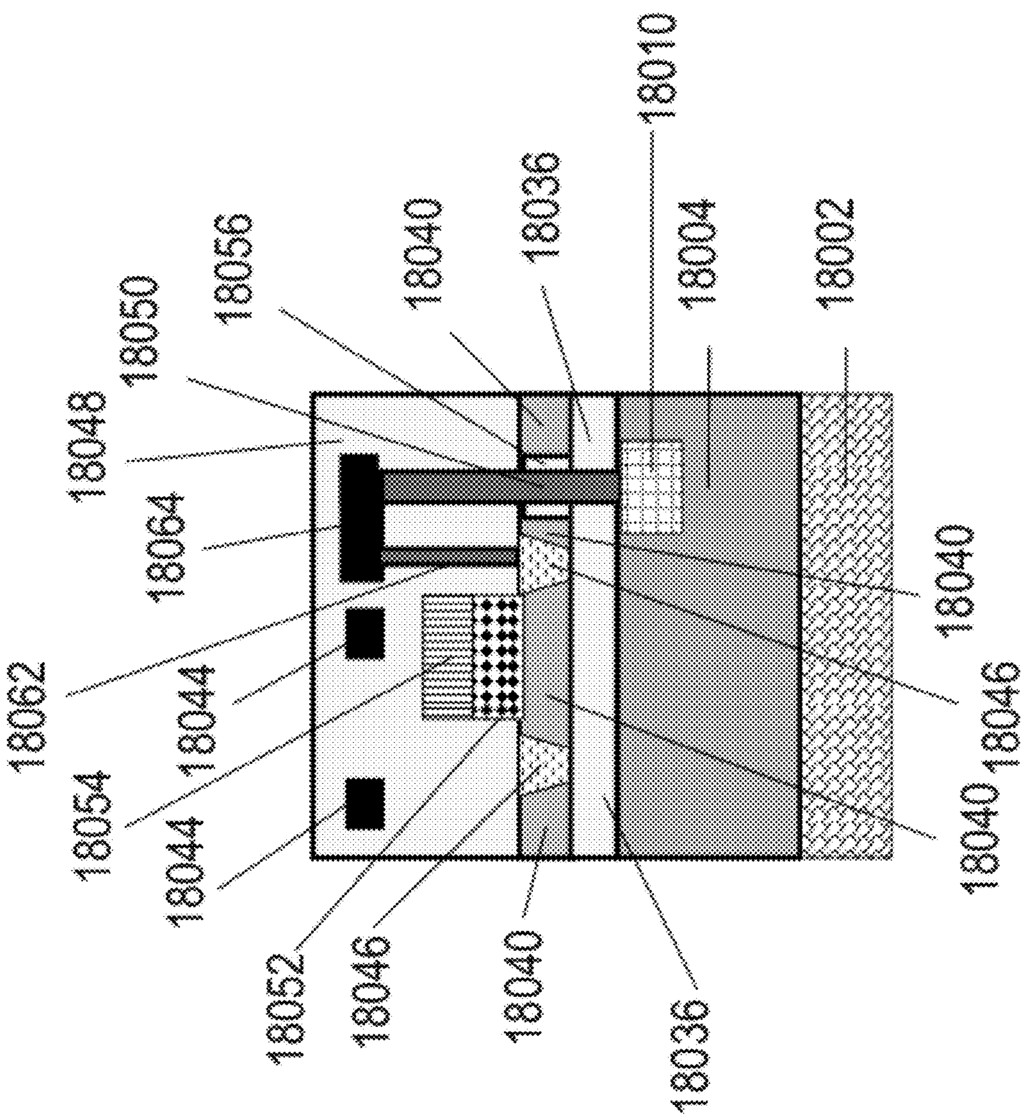
Figure 181:
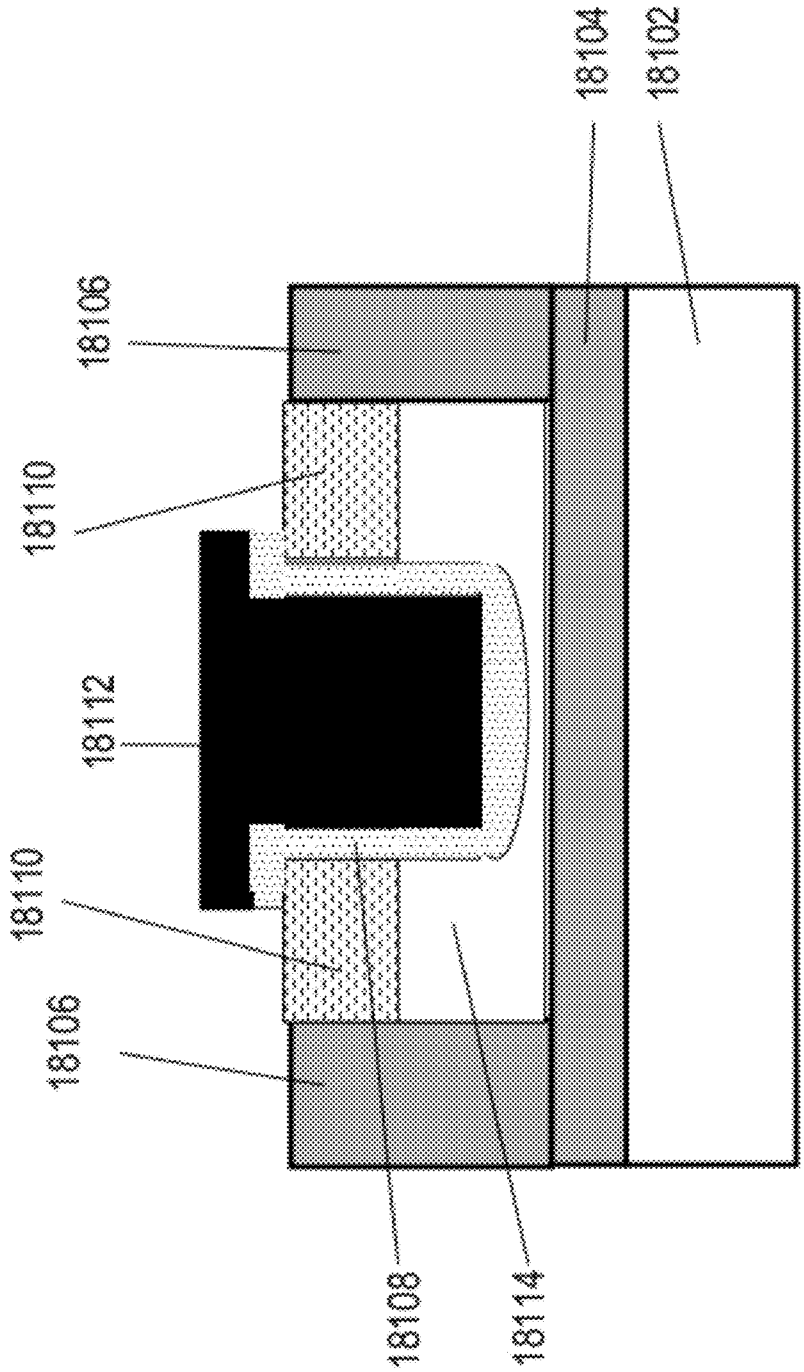
Figure 182:
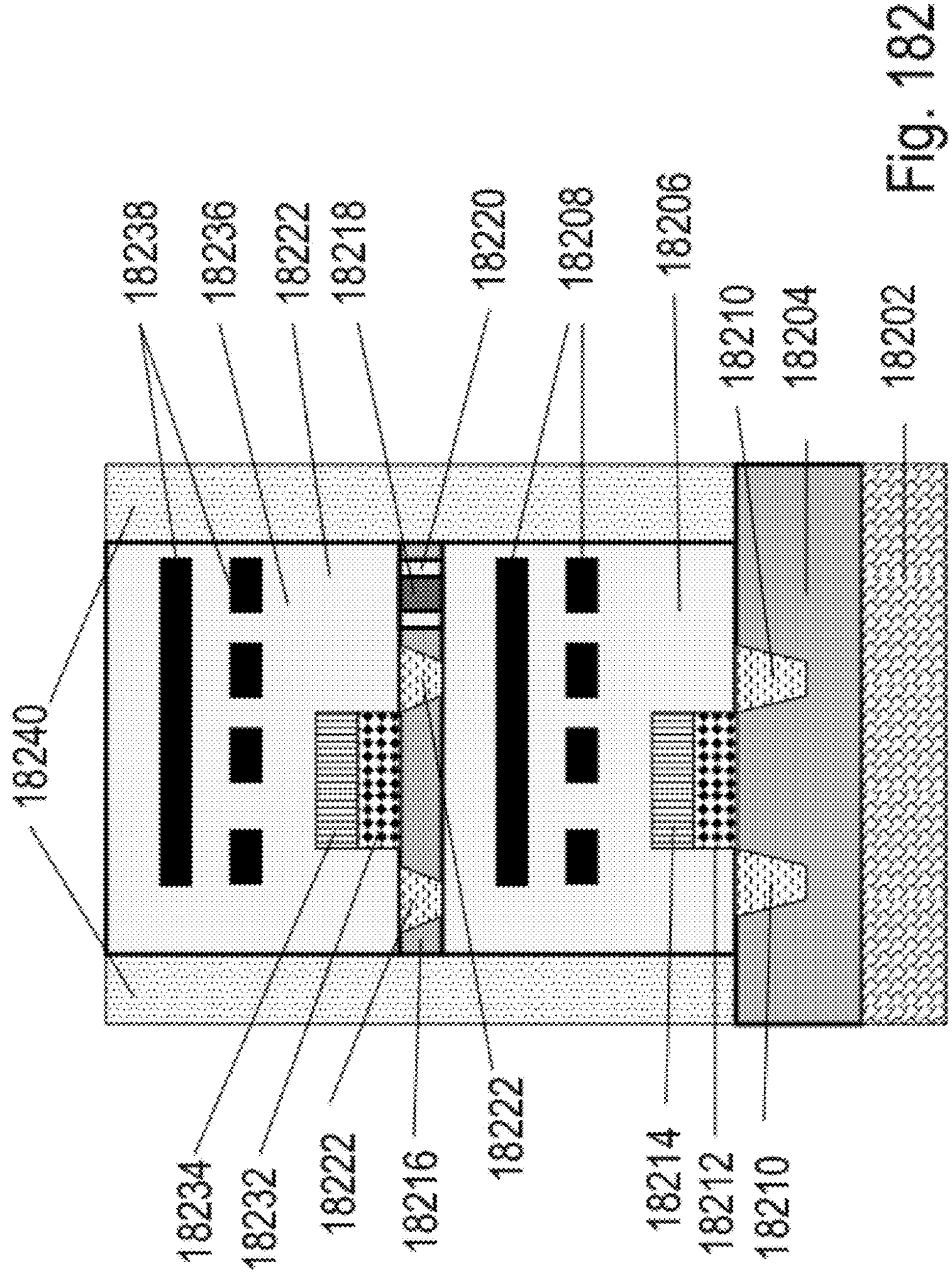
Figure 183A:
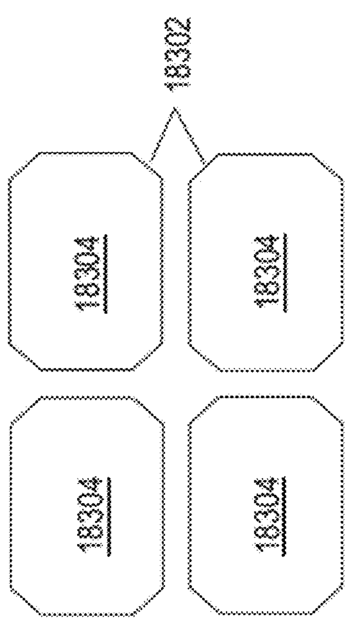
Figure 183B:
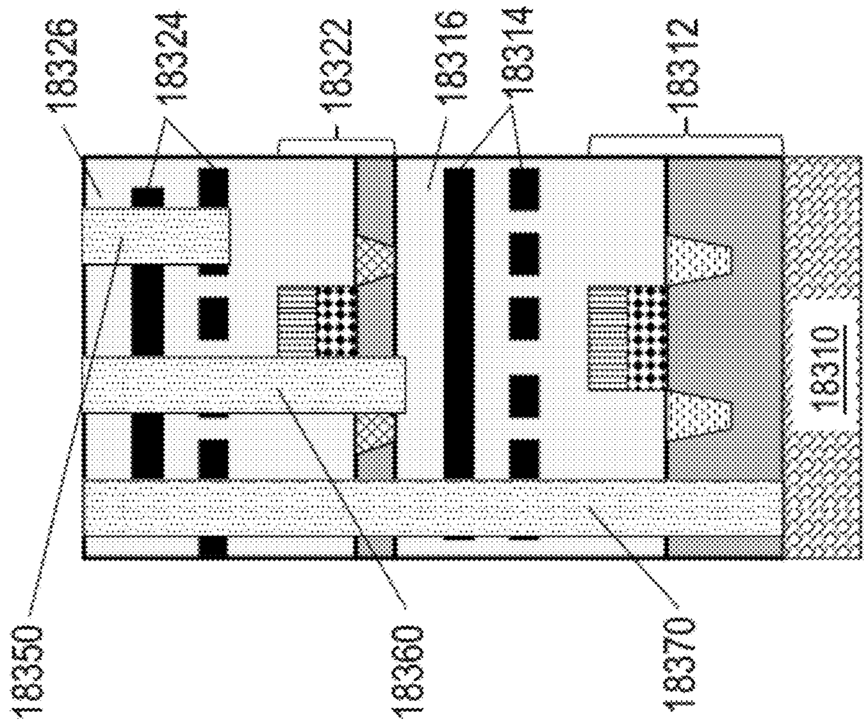
Figure 183C:
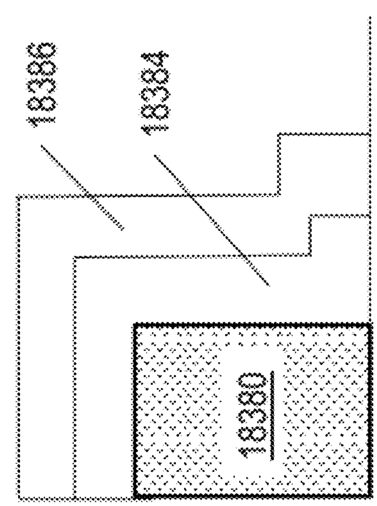
Figure 184:
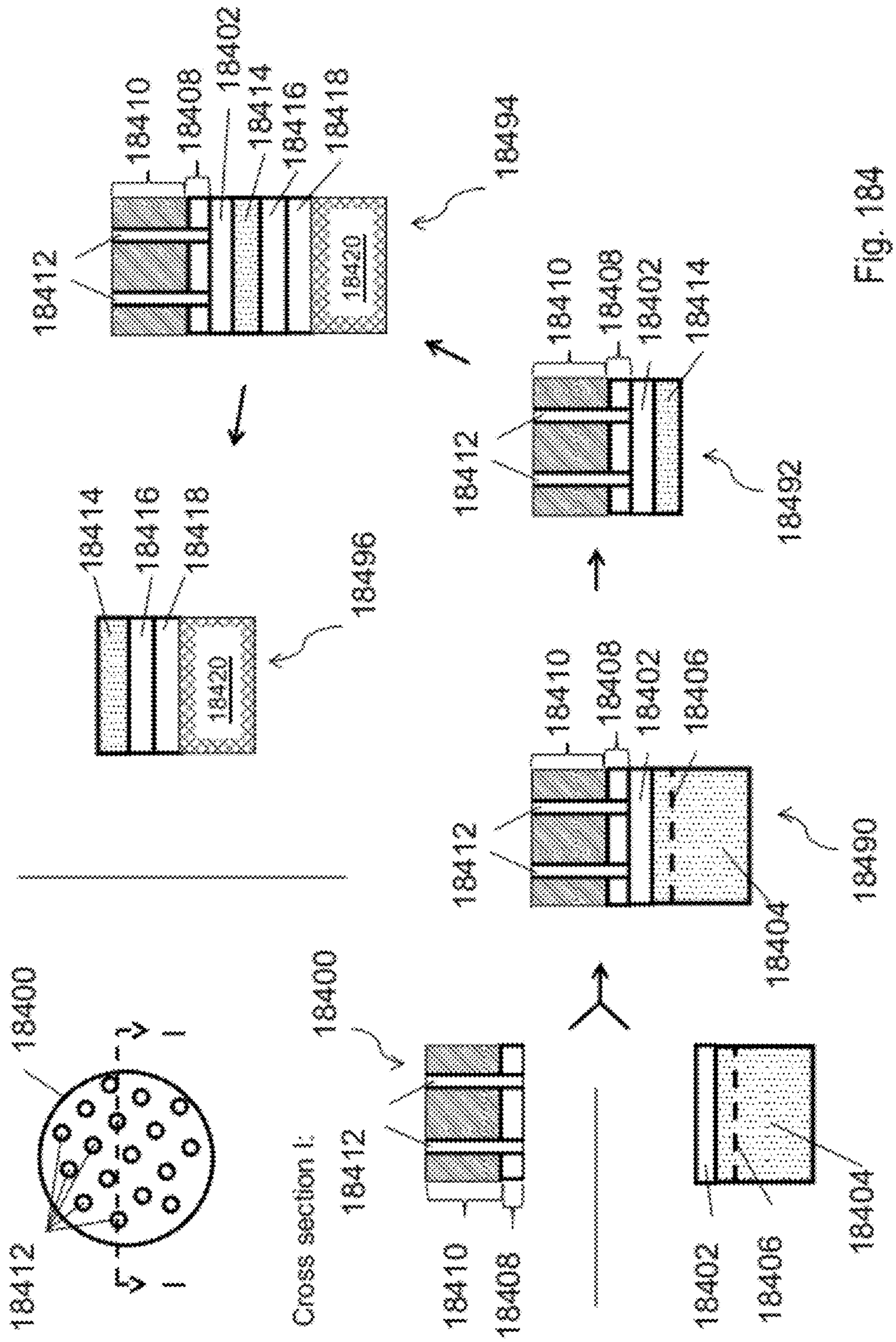
Figure 186:
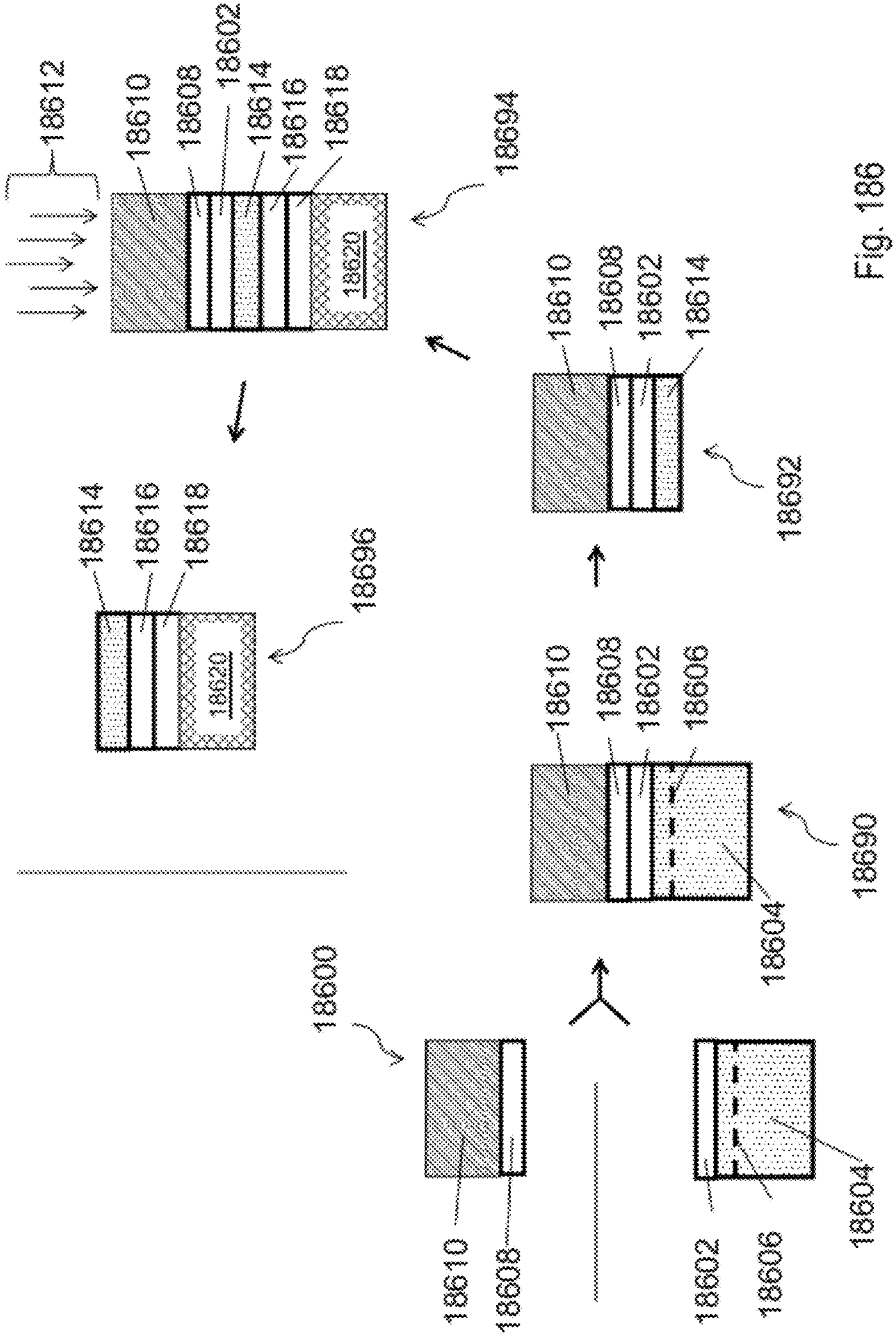
Figure 187:
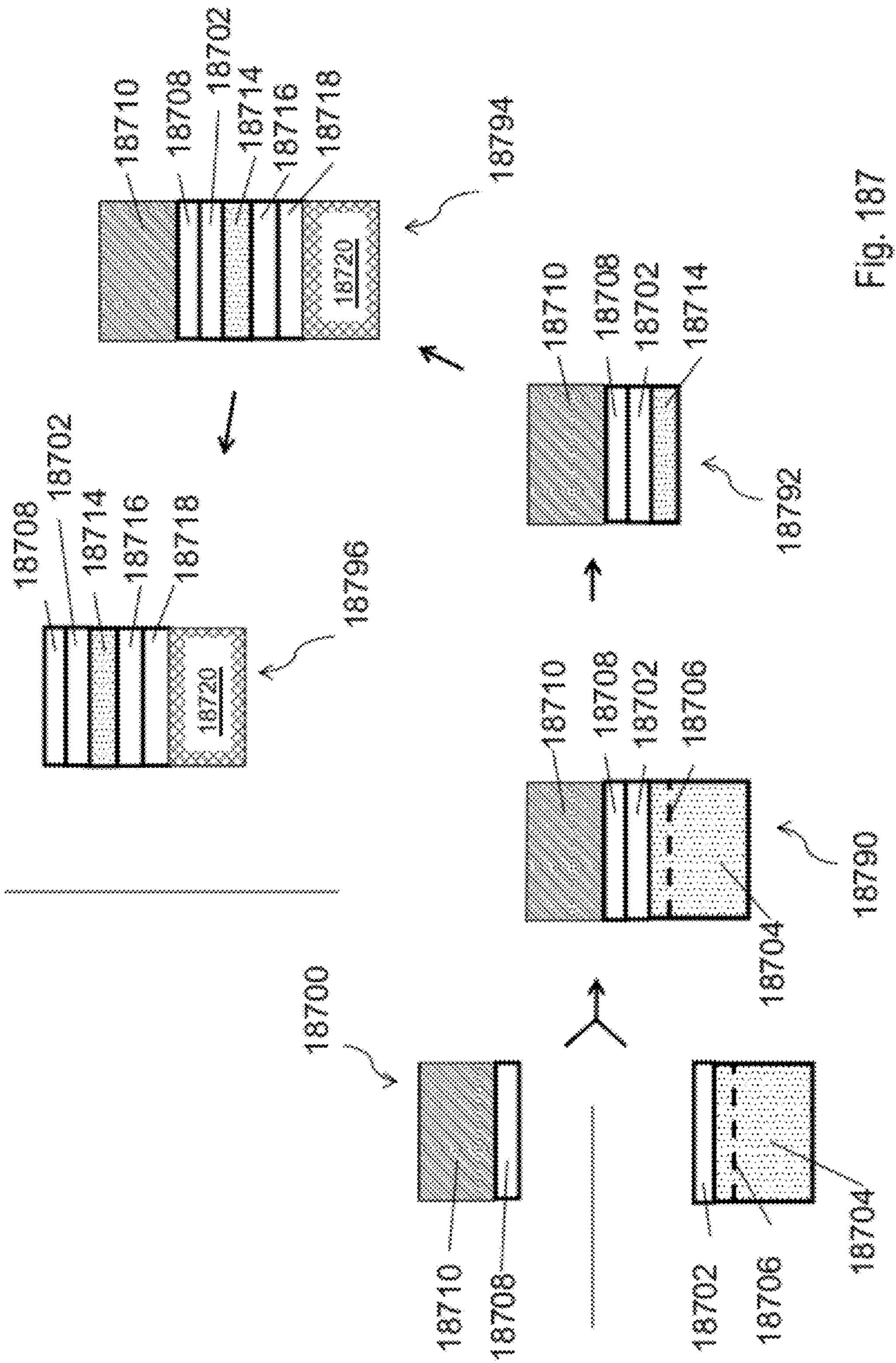
Figure 188:
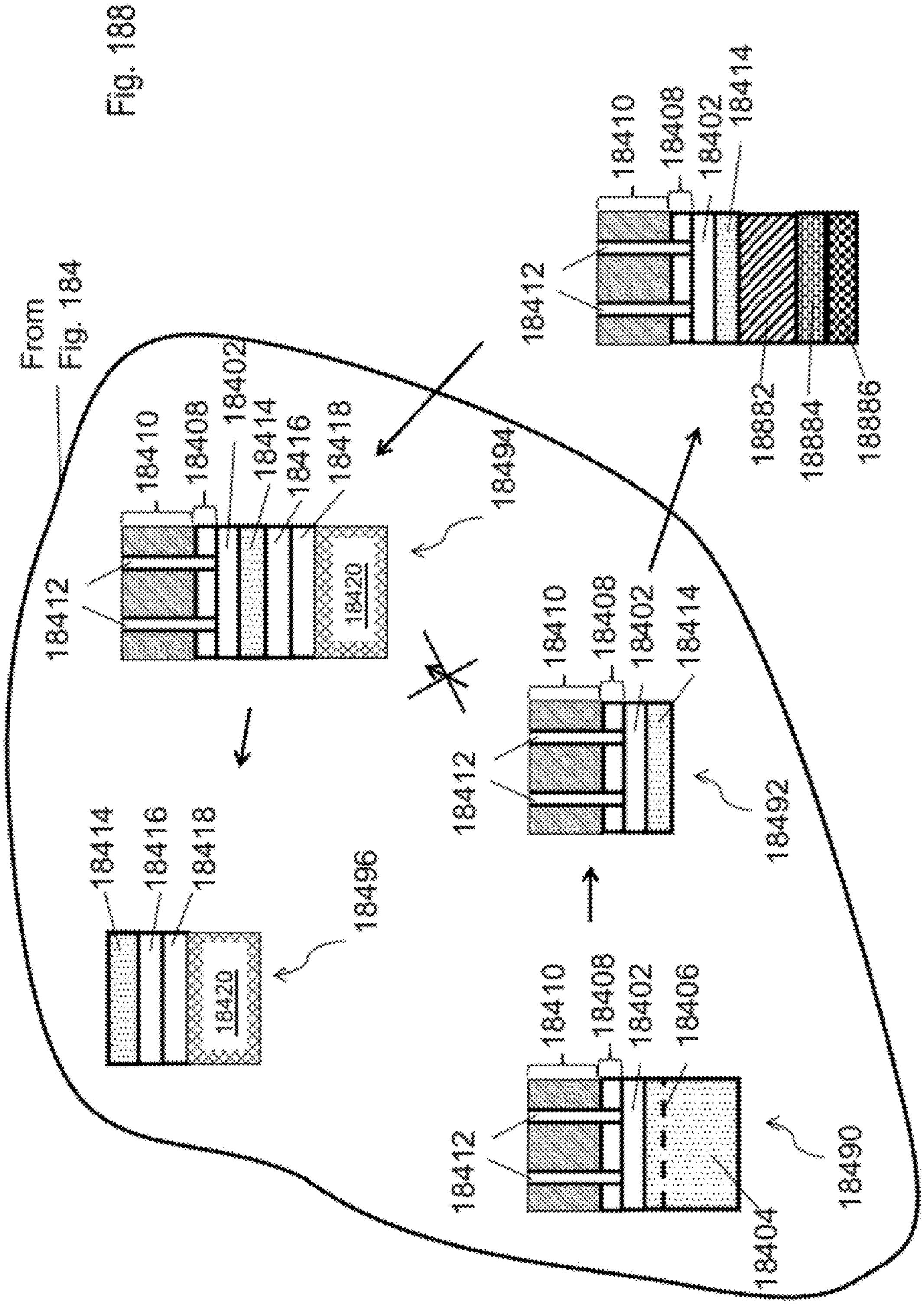
Figure 189:
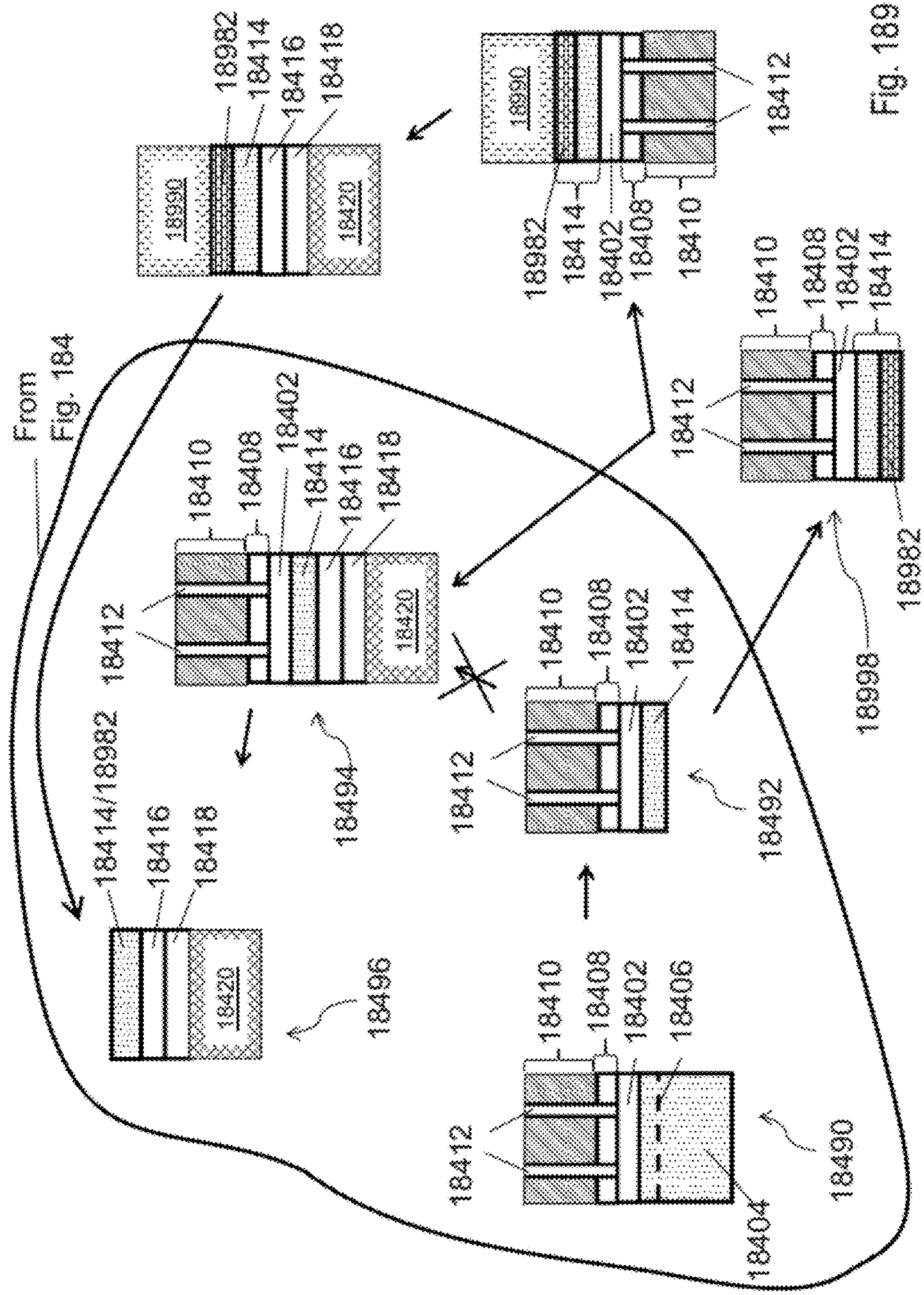
Figure 190:
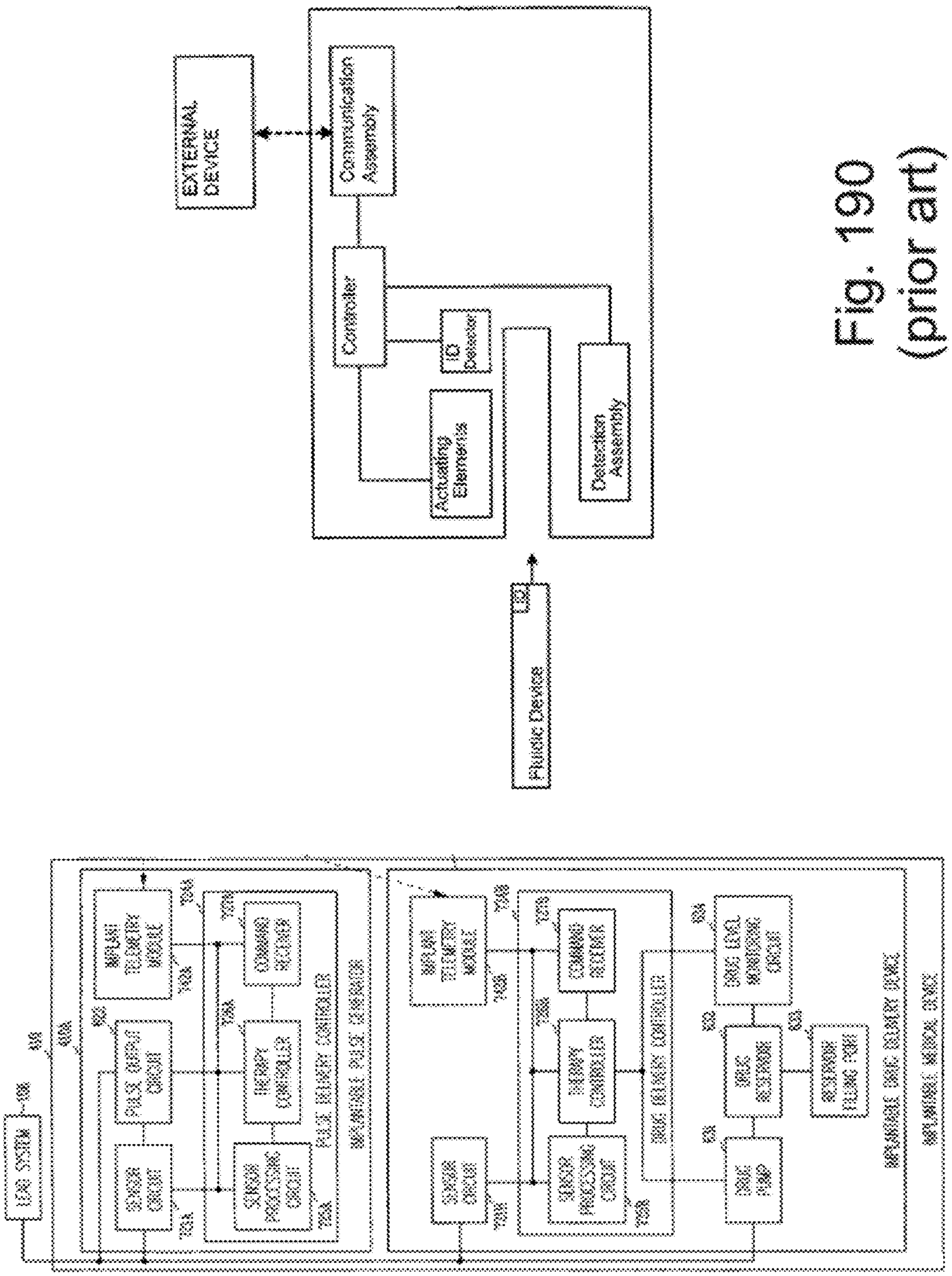
Figure 191:
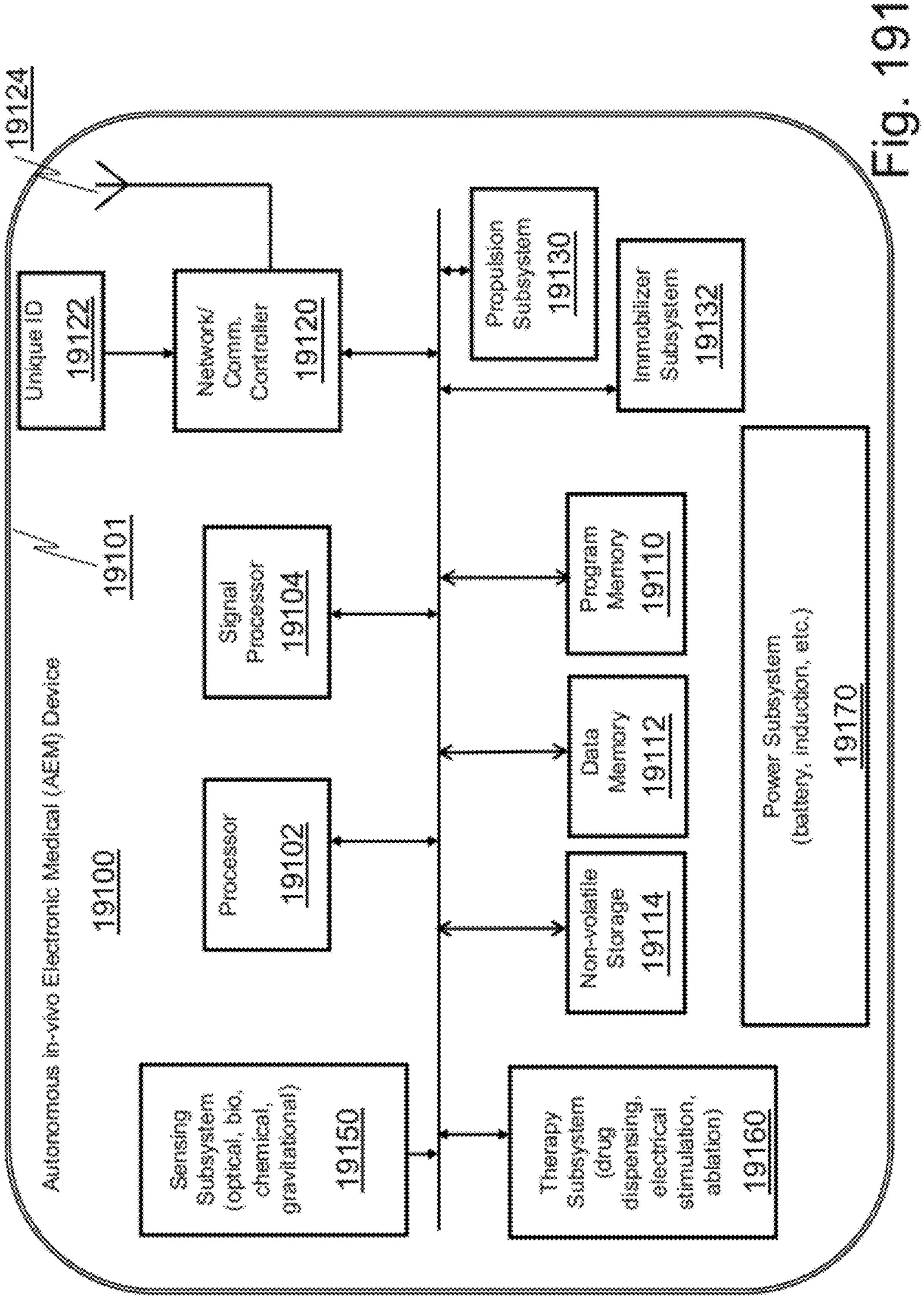
Figure 193:
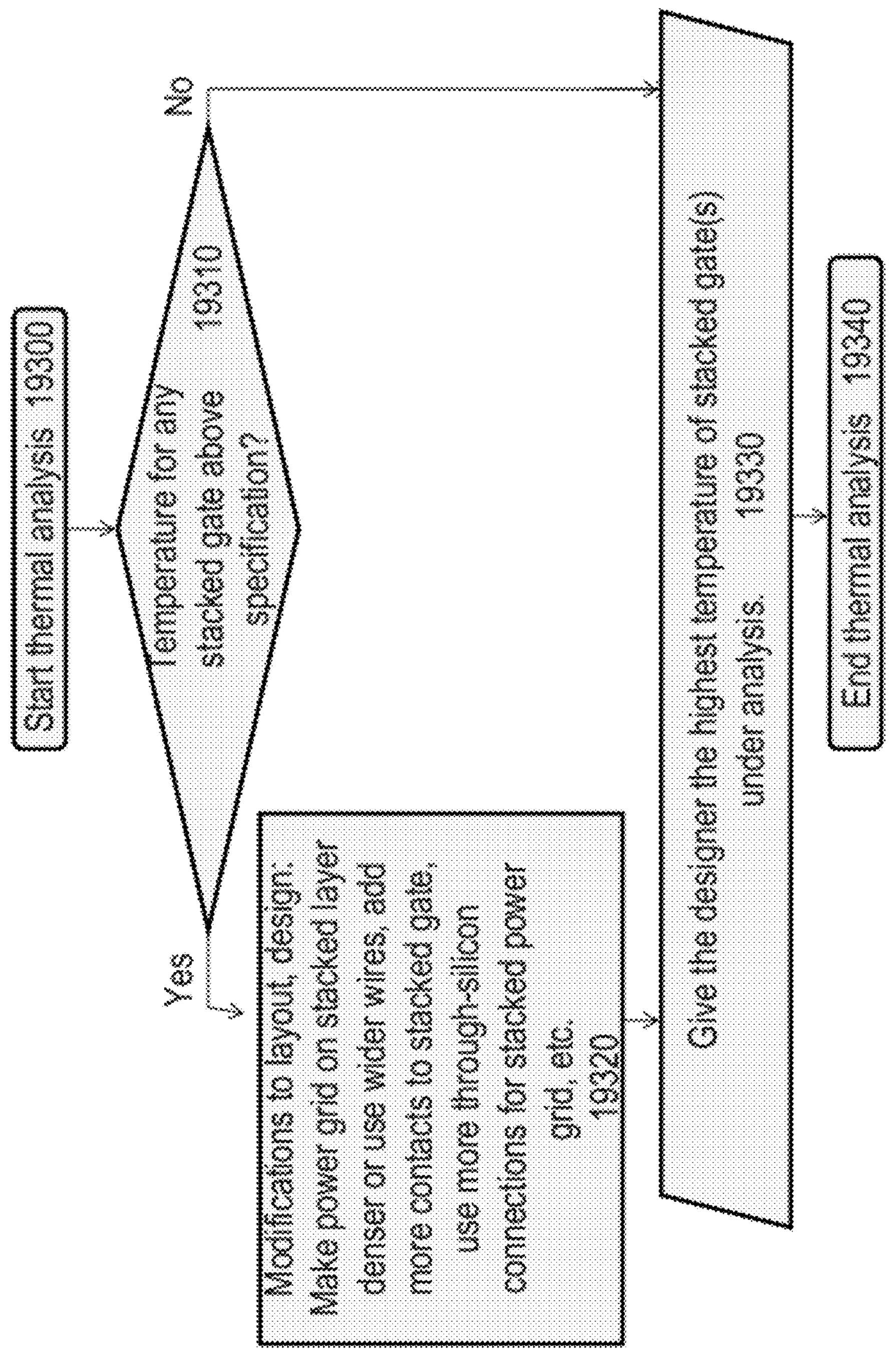
Figure 194:
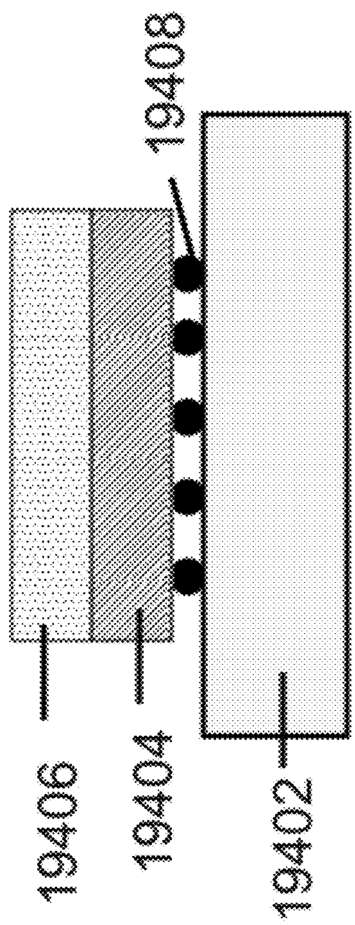
Figure 195:
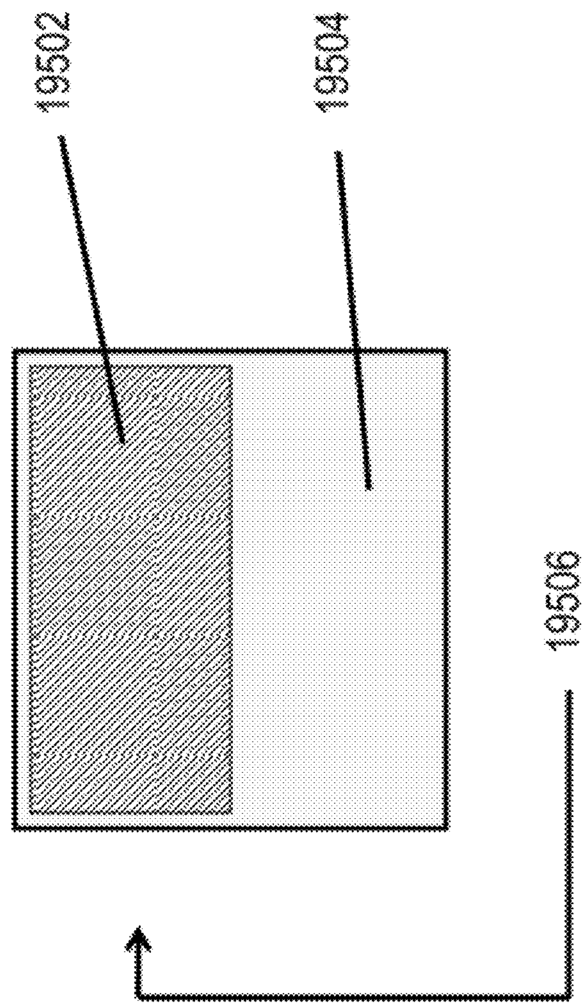
Figure 196:
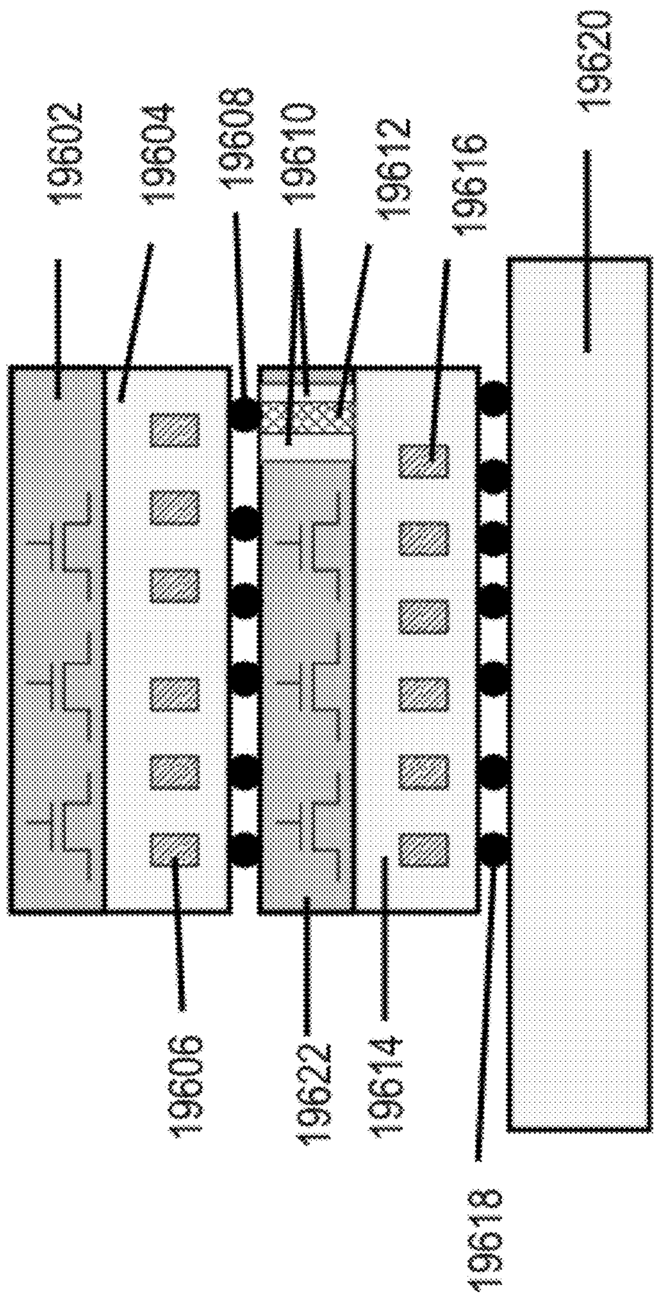
Figure 197:
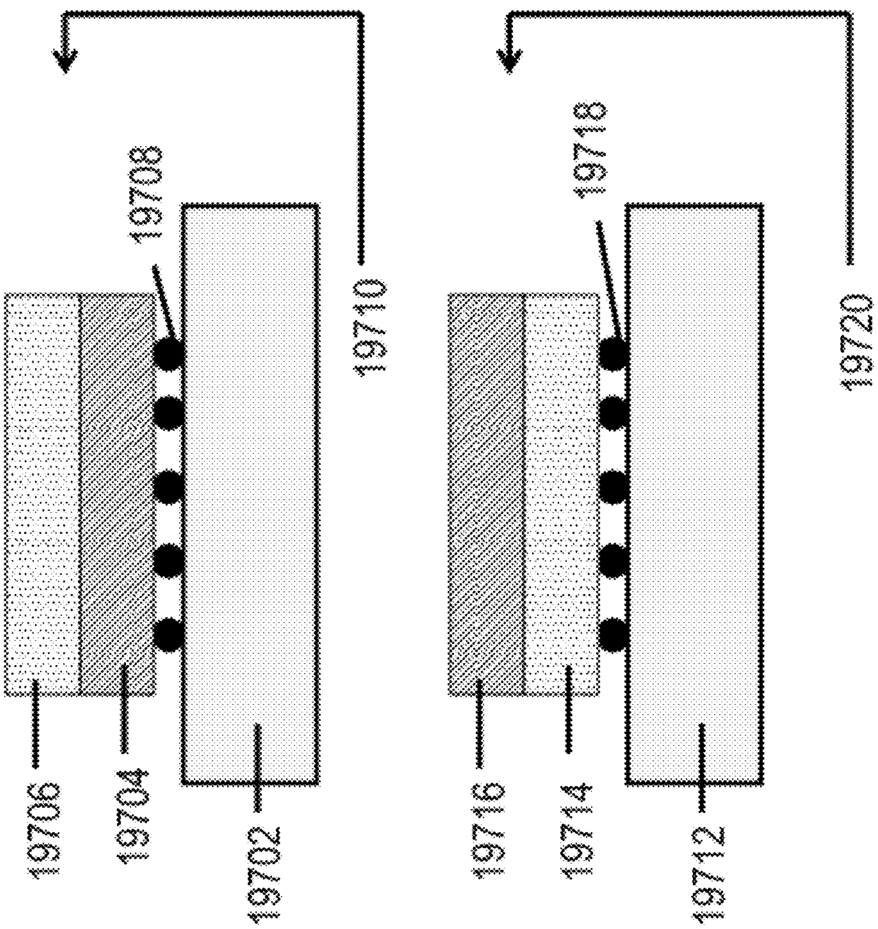
Figure 199:
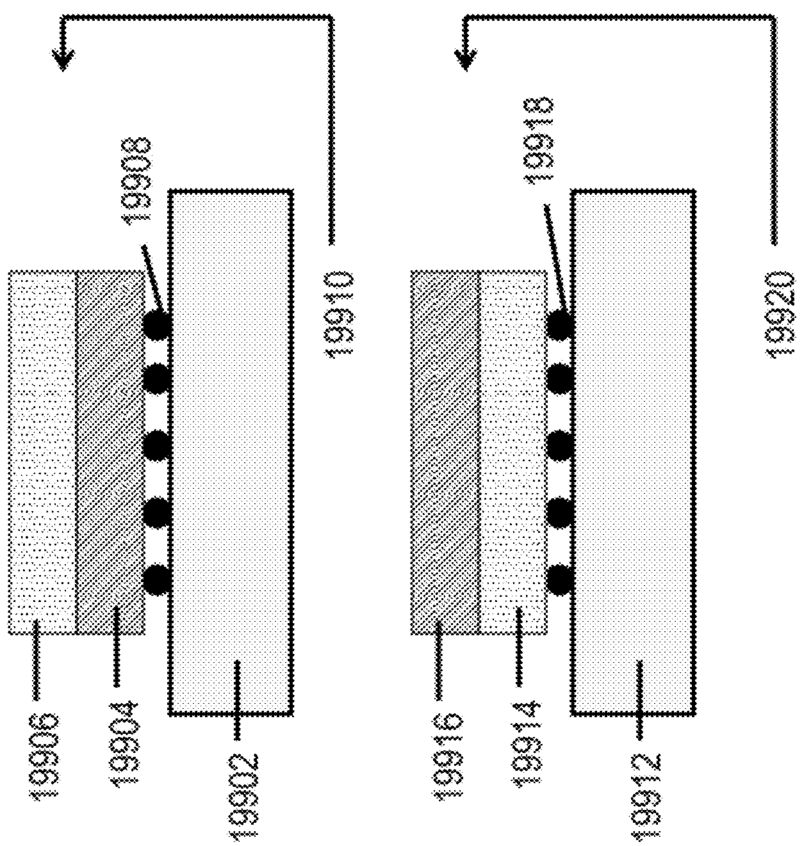
Figure 201:
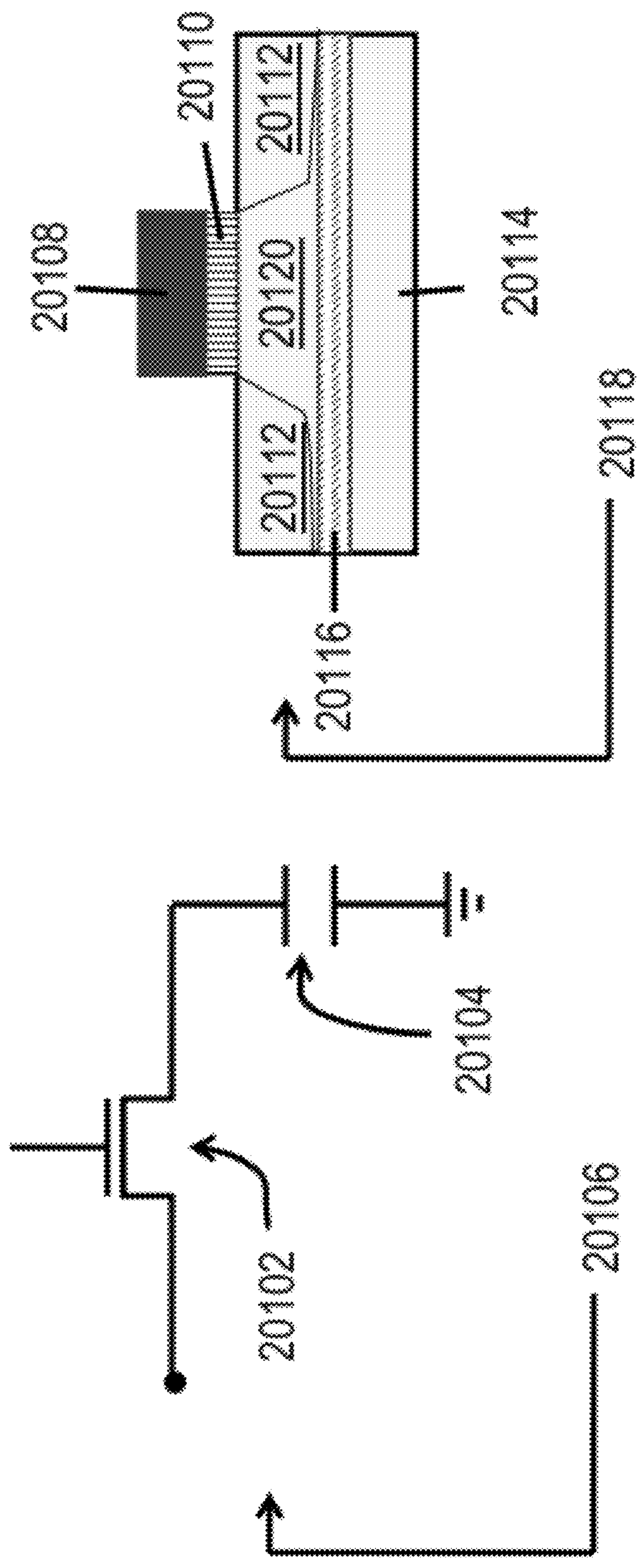
Figure 203:
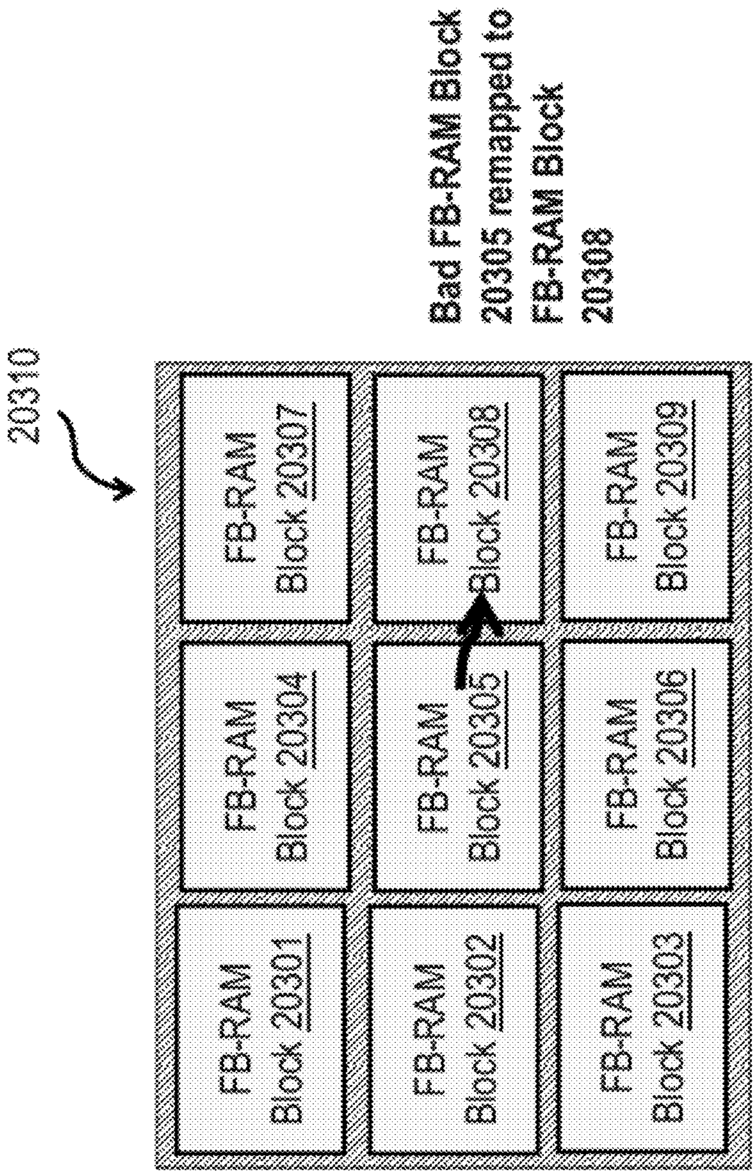
Figure 204:
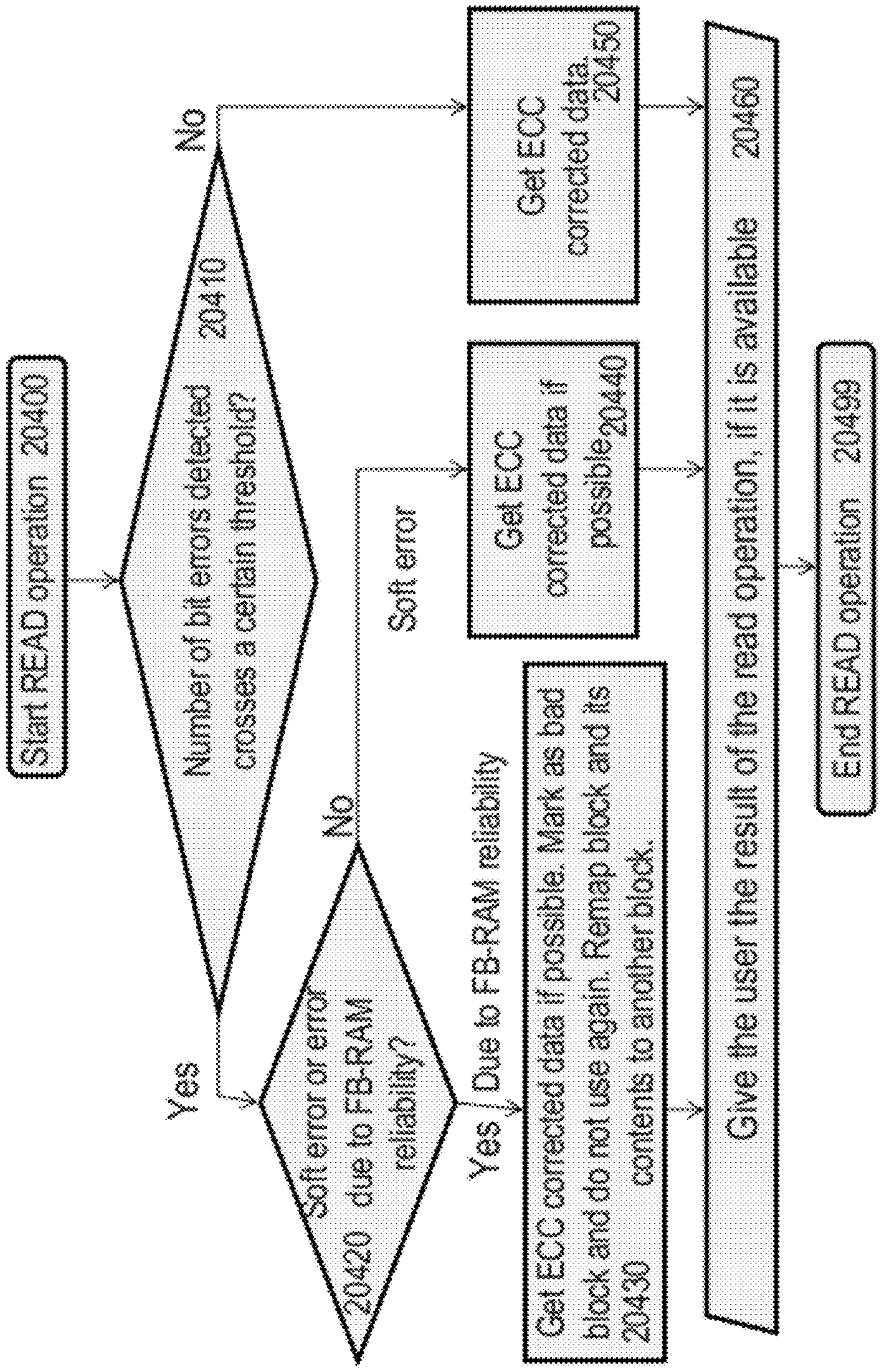
Figure 205:
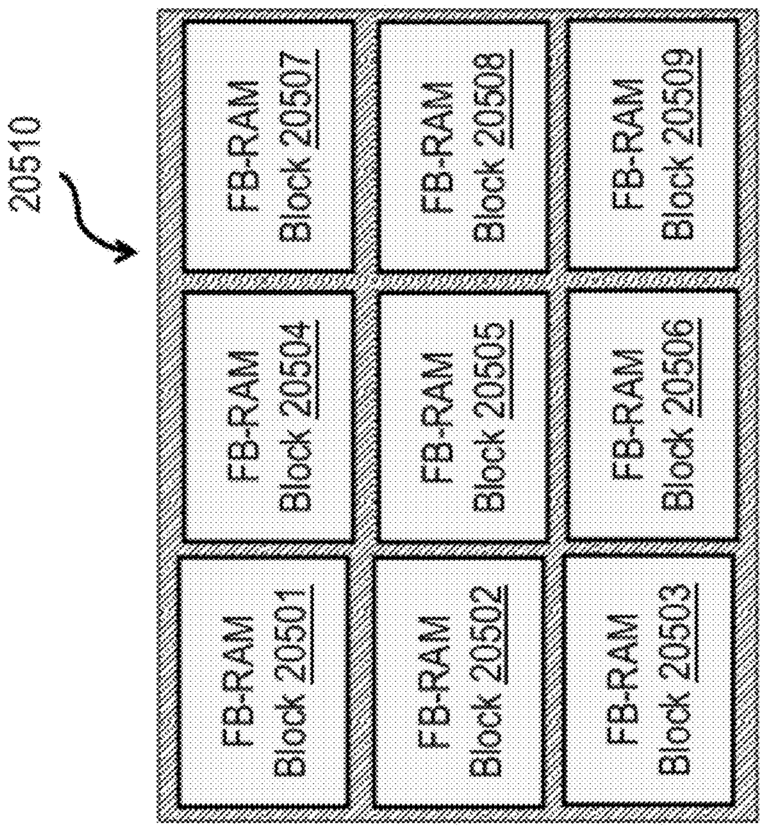
Figure 207:
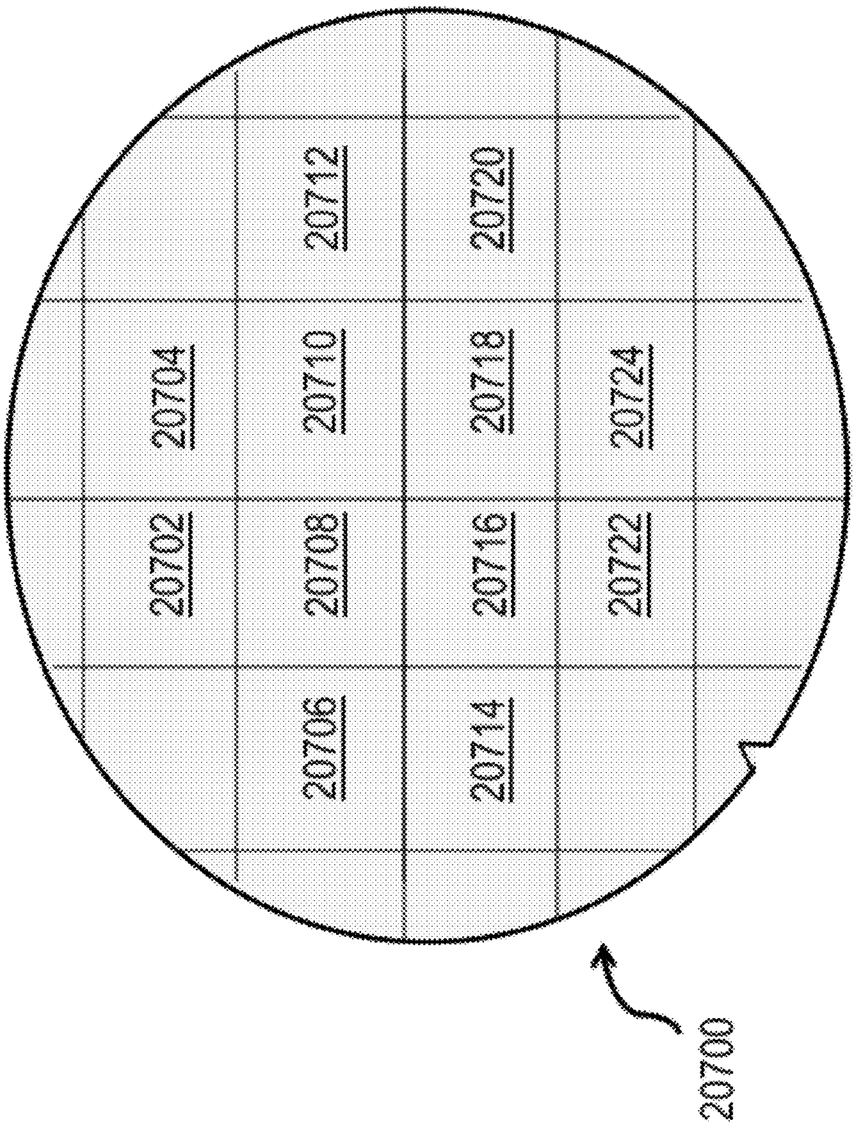
Figure 208:
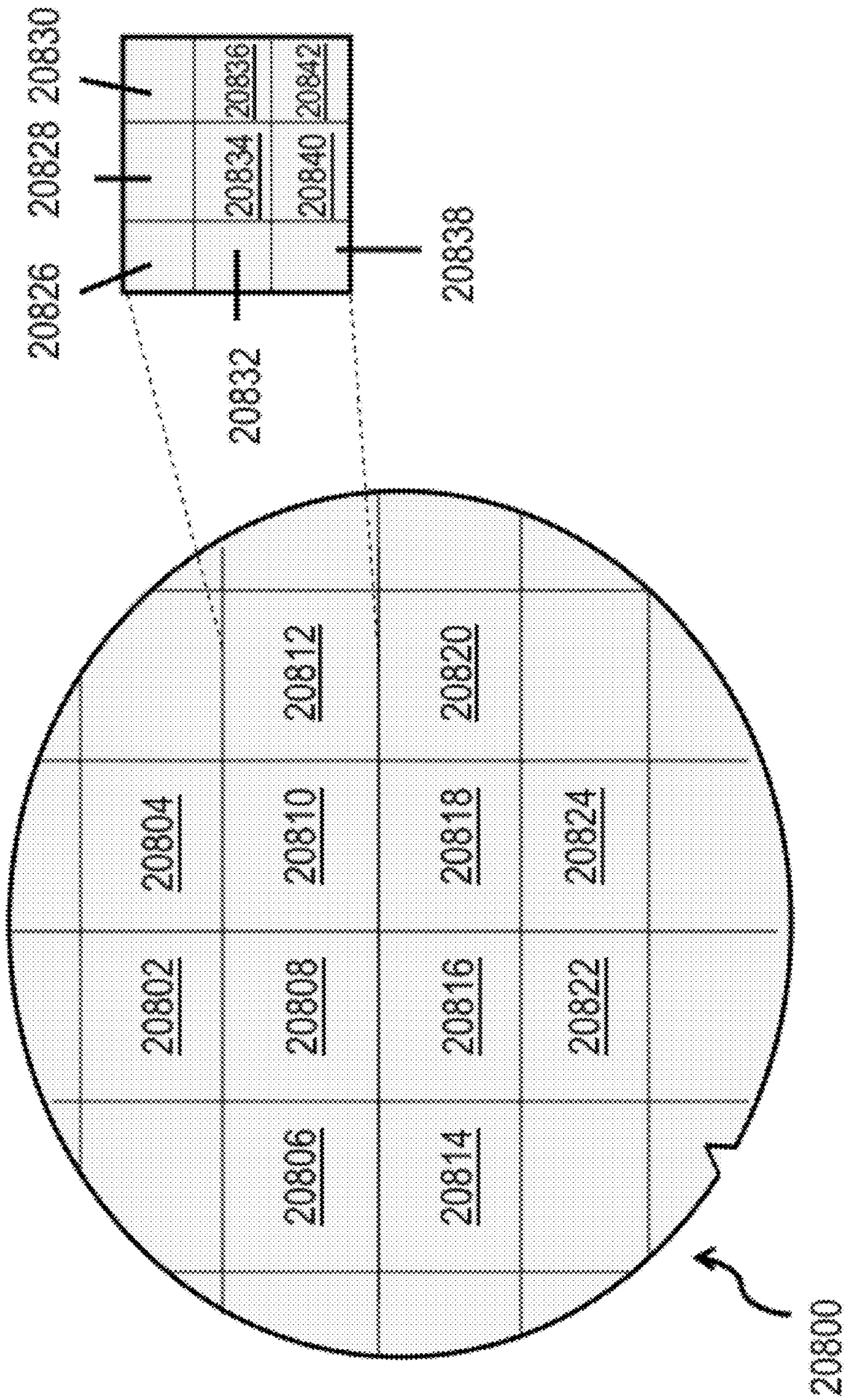
Figure 209:
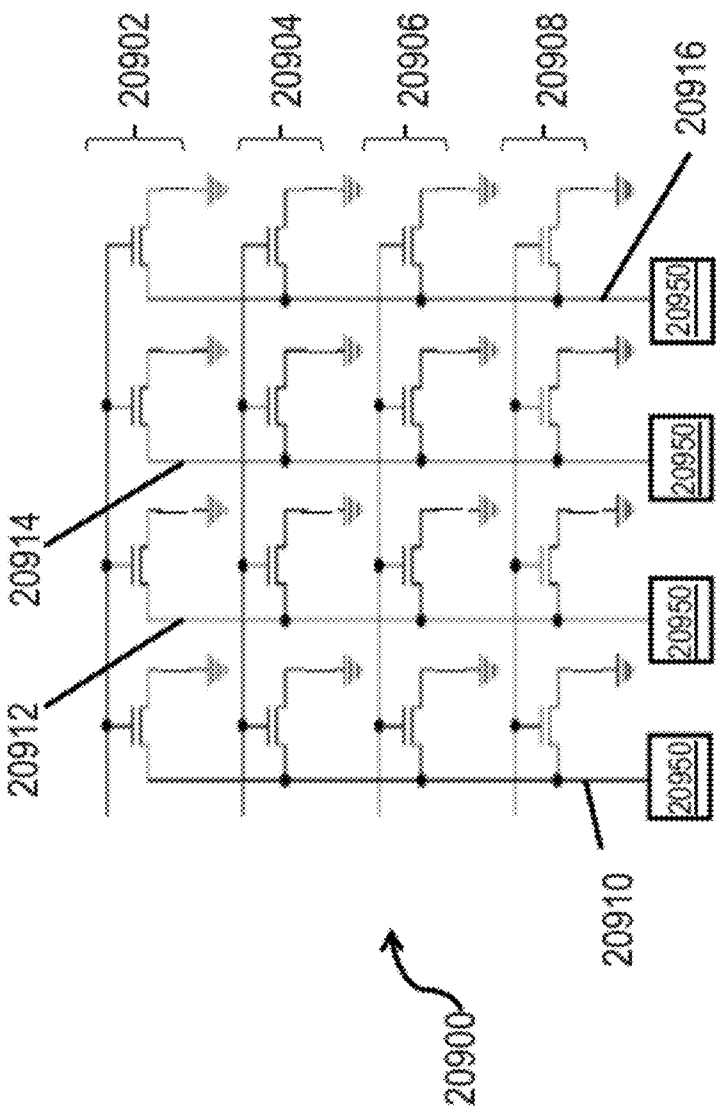
Figure 212:
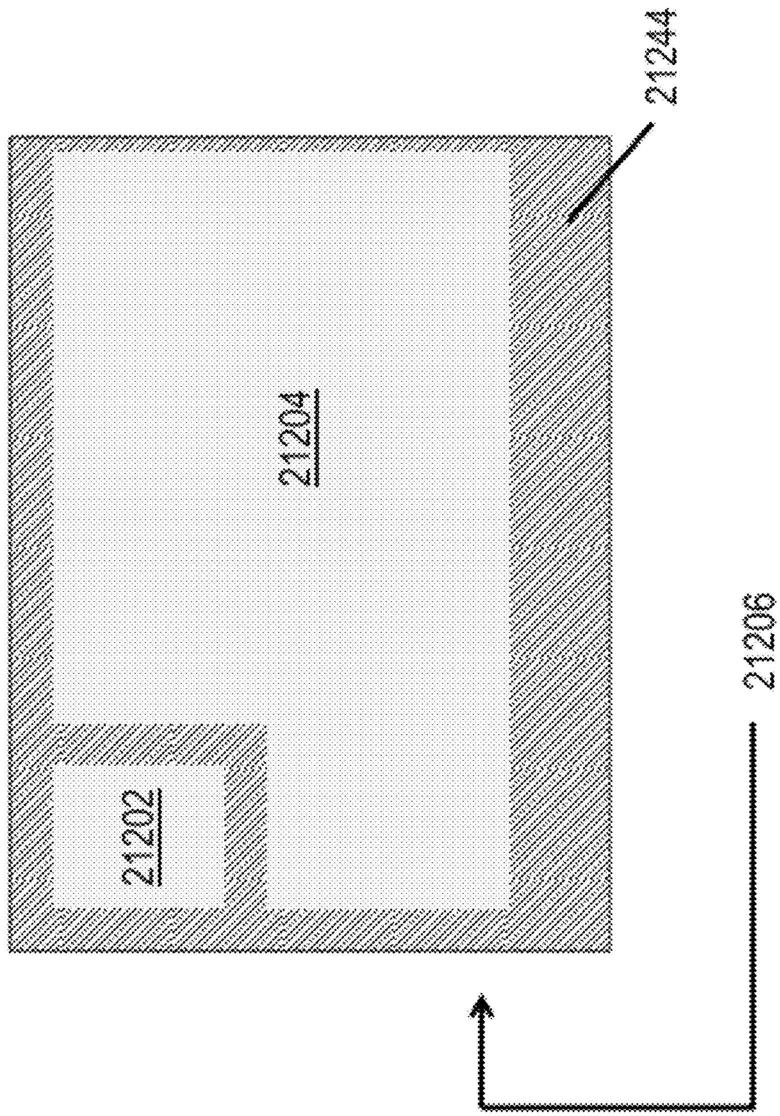
Figure 213:
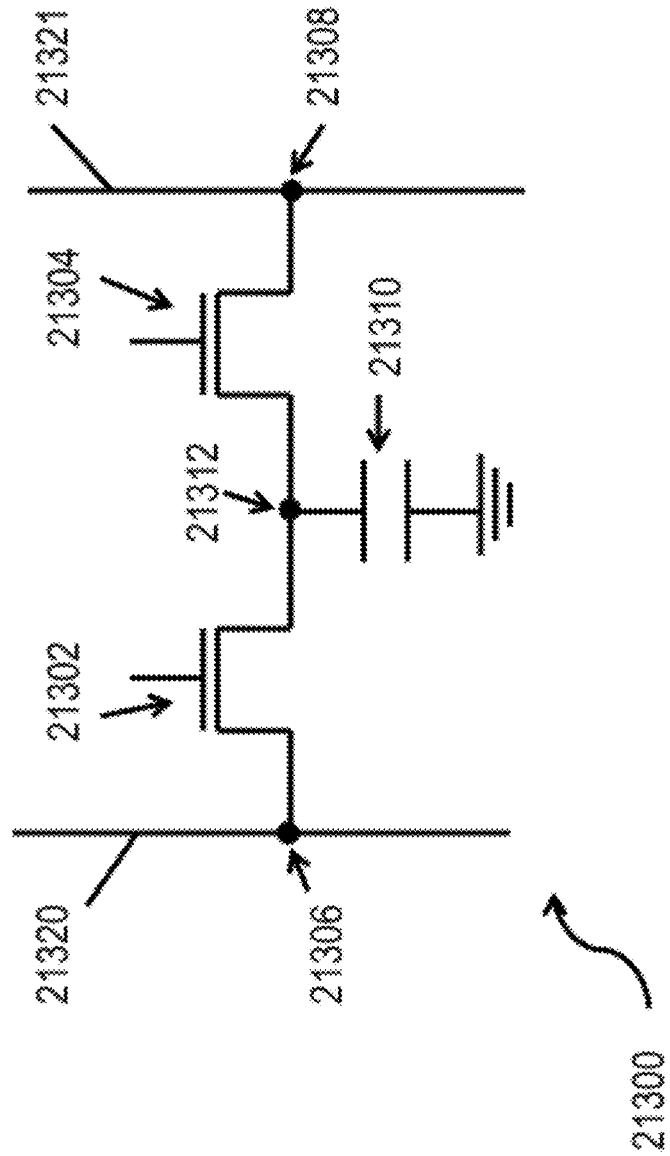
Figure 214:
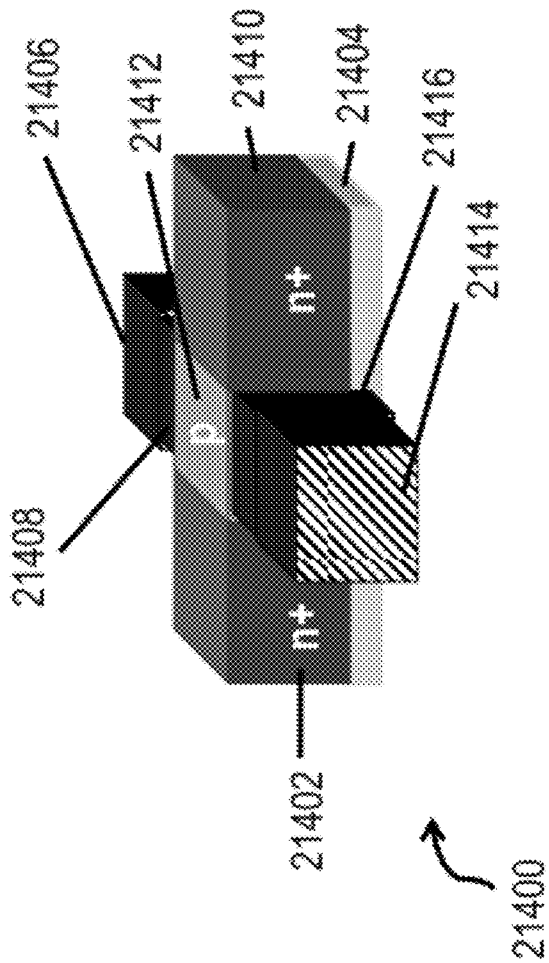
Figure 215A:
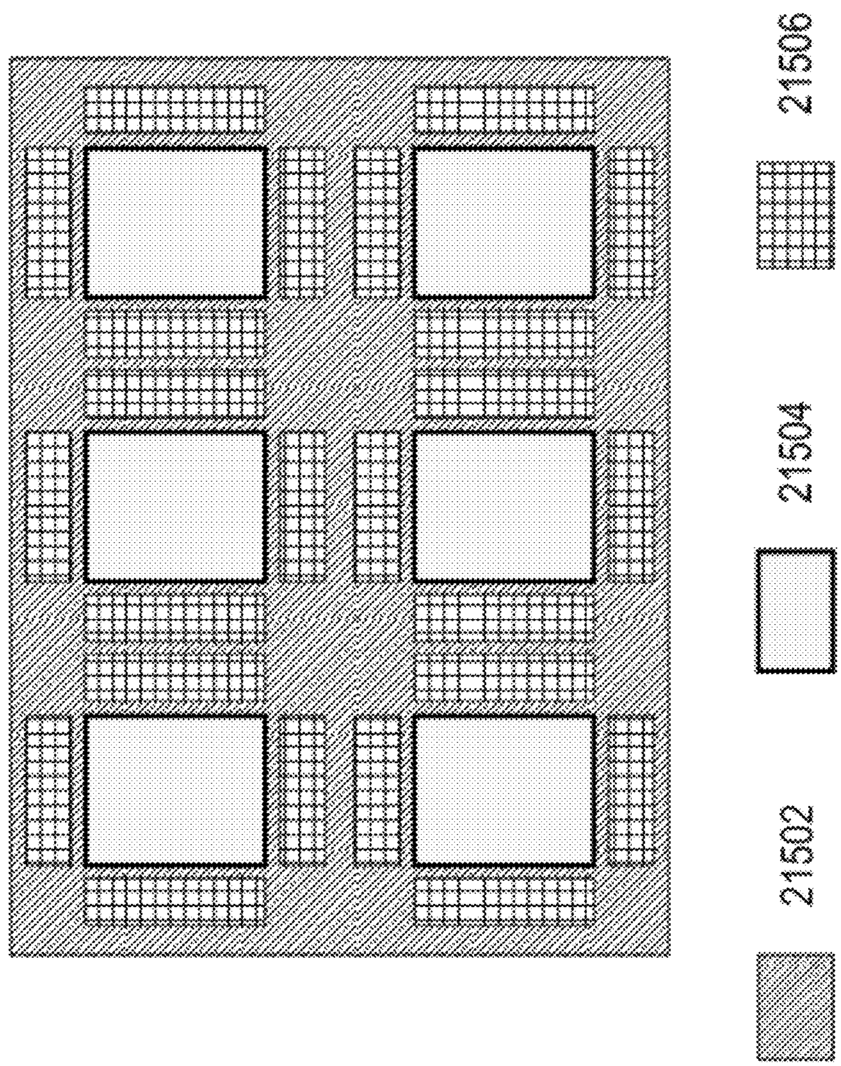
Figure 215B:
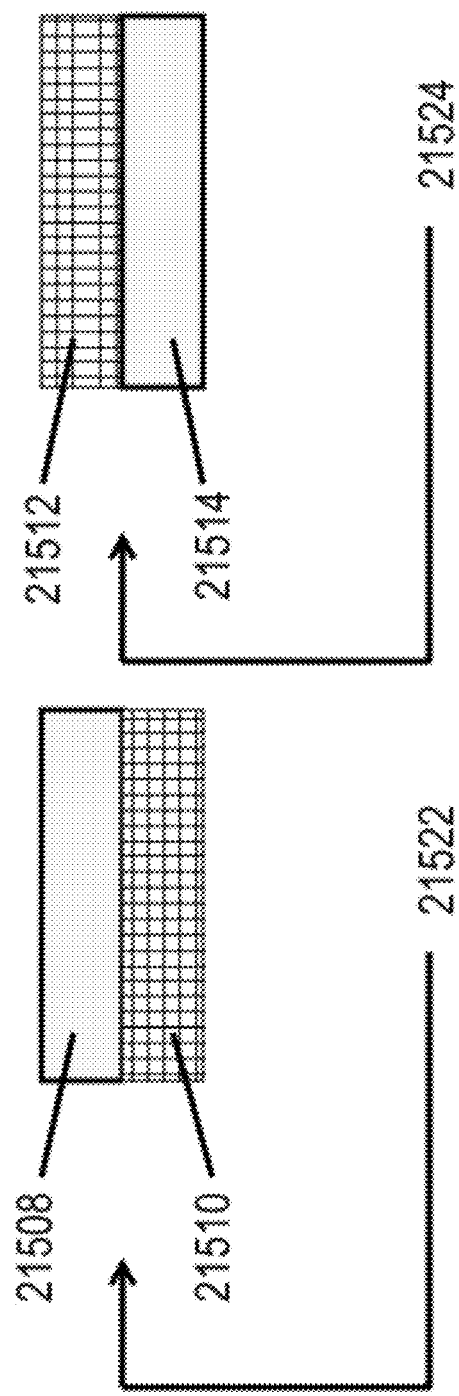
Figure 215C:
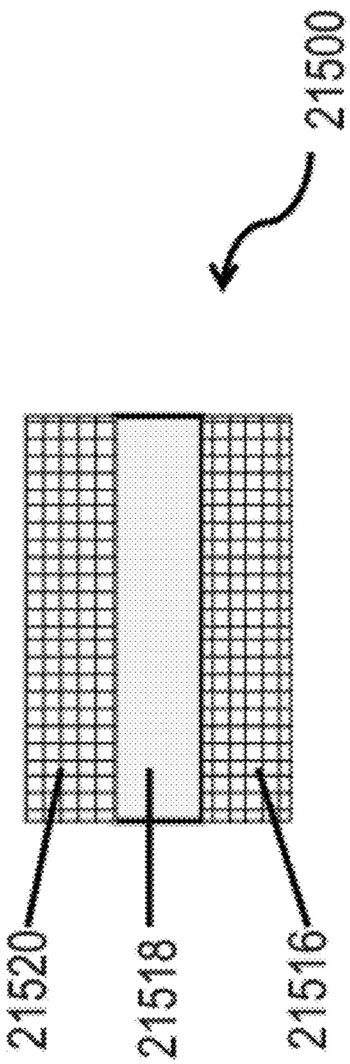
Figure 216:
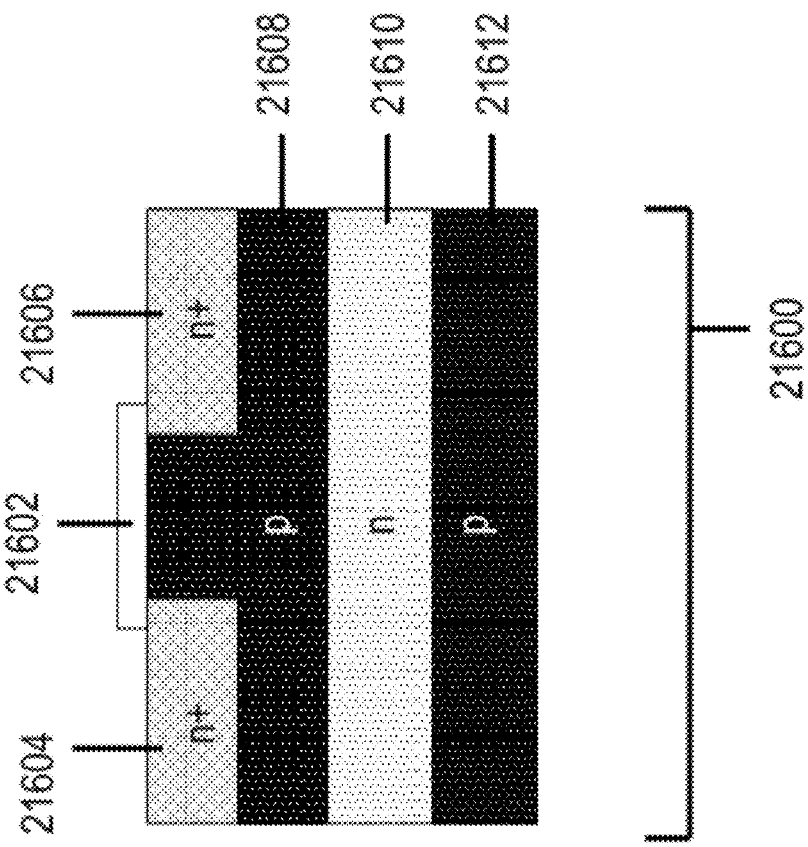

FIG. 153 A-D are exemplary drawing illustrations of a generalized layer transfer process flow with alignment windows for stacking sub-stacks; and FIG. 154 A-F are exemplary drawing illustrations of a generalized layer transfer process flow with alignment windows for stacking sub-stacks utilizing a carrier substrate;

FIG. 155A is a drawing illustration of an exemplary portion of a wafer sized or die sized plurality of bottom-pads;

FIG. 155B is a drawing illustration of an exemplary portion of a wafer sized or die sized plurality of upper-pads;

FIG. 155C is a drawing illustration of an exemplary portion of a wafer sized or die sized plurality of bottom-strips;

FIG. 155D is a drawing illustration of an exemplary portion of a wafer sized or die sized plurality of upper-strips;

FIG. 156 is a drawing illustration of a block diagram representation of an exemplary mobile computing device;

FIG. 157 A-H are exemplary drawing illustrations of forming 3DICs with layers or strata that may be of dissimilar materials;

FIG. 158 A-G are exemplary drawing illustrations of forming 3DICs with layers or strata that may be of dissimilar materials;

FIG. 159 A-E are exemplary drawing illustrations of forming 2DICs with layers or strata that may be of dissimilar materials;

FIG. 160 is an exemplary drawing illustration of a 3D integrated circuit;

FIG. 161 is an exemplary drawing illustration of another 3D integrated circuit;

FIG. 162 is an exemplary drawing illustration of the power distribution network of a 3D integrated circuit;

FIG. 163 is an exemplary drawing illustration of a NAND gate;

FIG. 164 is an exemplary drawing illustration of the thermal contact concept;

FIG. 165 is an exemplary drawing illustration of various types of thermal contacts;

FIG. 166 is an exemplary drawing illustration of another type of thermal contact;

FIG. 167 is an exemplary drawing illustration of the use of heat spreaders in 3D stacked device layers;

FIG. 168 is an exemplary drawing illustration of the use of thermally conductive shallow trench isolation (STI) in 3D stacked device layers;

FIG. 169 is an exemplary drawing illustration of the use of thermally conductive pre-metal dielectric regions in 3D stacked device layers;

FIG. 170 is an exemplary drawing illustration of the use of thermally conductive etch stop layers for the first metal layer of 3D stacked device layers;

FIG. 171 A-B are exemplary drawing illustrations of the use and retention of thermally conductive hard mask layers for patterning contact layers of 3D stacked device layers;

FIG. 172 is an exemplary drawing illustration of a 4 input NAND gate;

FIG. 173 is an exemplary drawing illustration of a 4 input NAND gate where all parts of the logic cell can be within desirable temperature limits;

FIG. 174 is an exemplary drawing illustration of a transmission gate;

FIG. 175 is an exemplary drawing illustration of a transmission gate where all parts of the logic cell can be within desirable temperature limits;

FIG. 176 A-D are exemplary drawing illustrations of a process flow for constructing recessed channel transistors with thermal contacts;

FIG. 177 is an exemplary drawing illustration of a pMOS recessed channel transistor with thermal contacts;

FIG. 178 is an exemplary drawing illustration of a CMOS circuit with recessed channel transistors and thermal contacts;

FIG. 179 is an exemplary drawing illustration of a technique to remove heat more effectively from silicon-on-insulator (SOI) circuits;

FIG. 180 is an exemplary drawing illustration of an alternative technique to remove heat more effectively from silicon-on-insulator (SOI) circuits;

FIG. 181 is an exemplary drawing illustration of a recessed channel transistor (RCAT);

FIG. 182 is an exemplary drawing illustration of a 3D-IC with thermally conductive material on the sides;

FIG. 183A is an exemplary drawing illustration of chamfering the custom function etching shape for stress relief;

FIG. 183B is an exemplary drawing illustration of potential depths of custom function etching a continuous array in 3DIC;

FIG. 183C is an exemplary drawing illustration of a method to passivate the edge of a custom function etch of a continuous array in 3DIC;

FIG. 184 is an exemplary drawing illustration of a method to repair defects or anneal a transferred layer utilizing a carrier wafer or substrate;

FIG. 185 A-B are exemplary drawing illustrations of an additional method to repair defects or anneal a transferred layer utilizing a carrier wafer or substrate;

FIG. 186 is an exemplary drawing illustration of a method to repair defects or anneal a transferred layer utilizing laser liftoff techniques;

FIG. 187 is an exemplary drawing illustration of a method to repair defects or anneal a transferred layer utilizing carrier wafer or substrate wherein the carrier is sacrificed or not reusable;

FIG. 188 is an exemplary drawing illustration of a method to repair defects or anneal a transferred layer utilizing a sonic energy anneal;

FIG. 189 is an exemplary drawing illustration of a method to form transistors on a desired transfer layer utilizing a carrier wafer or substrate;

FIG. 190 is an exemplary block diagram representation of an example prior art of Autonomous in-vivo Electronic Medical device;

FIG. 191 is an exemplary block diagram representation of an exemplary Autonomous in-vivo Electronic Medical device;

FIG. 192 A-M are exemplary drawing illustrations of the formation of a 3D resistive memory array;

FIG. 193 is an exemplary procedure for a chip designer to ensure a good thermal profile for a design;

FIG. 194 is an exemplary drawing illustration of sub-threshold circuits that may be stacked above or below a logic chip layer;

FIG. 195 illustrates the embedded memory portion of a standard 2D integrated circuit (prior art);

FIG. 196 illustrates the 3D stacking of embedded memory using through-silicon via (TSV) technology (prior art);

FIG. 197 is an exemplary drawing illustration of the 3D stacking of monolithic 3D DRAM with logic with TSV technology;

FIG. 198 A-G are exemplary drawing illustrations of a process for monolithic 3D stacking of logic with DRAM produced using multiple memory layers and shared lithography steps;

FIG. 199 is an exemplary drawing illustration of different configurations possible for monolithically stacked embedded memory and logic;

FIG. 200 A-J are exemplary drawing illustrations of a process flow for constructing monolithic 3D capacitor-based DRAMs with lithography steps shared among multiple memory layers;

FIG. 201 illustrates a capacitor-based DRAM cell and capacitor-less floating-body RAM cell prior art);

FIG. 202 A-B are exemplary drawing illustrations of potential challenges associated with high field effects in floating-body RAM;

FIG. 203 is an exemplary drawing illustration of how a floating-body RAM chip may be managed when some memory cells may have been damaged;

FIG. 204 is an exemplary drawing illustration of a methodology for implementing the bad block management scheme described with respect to FIG. 203;

FIG. 205 is an exemplary drawing illustration of wear leveling techniques and methodology utilized in floating body RAM;

FIG. 206 A-B are exemplary drawing illustrations of incremental step pulse programming techniques and methodology utilized for floating-body RAM;

FIG. 207 is an exemplary drawing illustration of different write voltages utilized for different dice across a wafer;

FIG. 208 is an exemplary drawing illustration of different write voltages utilized for different parts of a chip (or die);

FIG. 209 is an exemplary drawing illustration of write voltages for floating-body RAM cells may be based on the distance of the memory cell from its write circuits;

FIG. 210 A-C are exemplary drawing illustrations of configurations useful for controller functions;

FIG. 211 A-B are exemplary drawing illustrations of controller functionality and architecture applied to applications;

FIG. 212 is an exemplary drawing illustration of a cache structure in a floating body RAM chip;

FIG. 213 is an exemplary drawing illustration of a dual-port refresh scheme for capacitor-based DRAM;

FIG. 214 is an exemplary drawing illustration of a double gate device used for monolithic 3D floating-body RAM;

FIG. 215A is an exemplary drawing illustration of a 2D chip with memory, peripheral circuits, and logic circuits;

FIG. 215B is an exemplary drawing illustration of peripheral circuits may be stacked monolithically above or below memory arrays;

FIG. 215C is an exemplary drawing illustration of peripheral circuits may be monolithically stacked above and below memory arrays;

FIG. 216 is an exemplary drawing illustration of a Bipolar Junction Transistor;

FIG. 217 A-C are exemplary drawing illustrations of the behavior of the embedded BJT during the floating body operation, programming, and erase.

Figure 218:
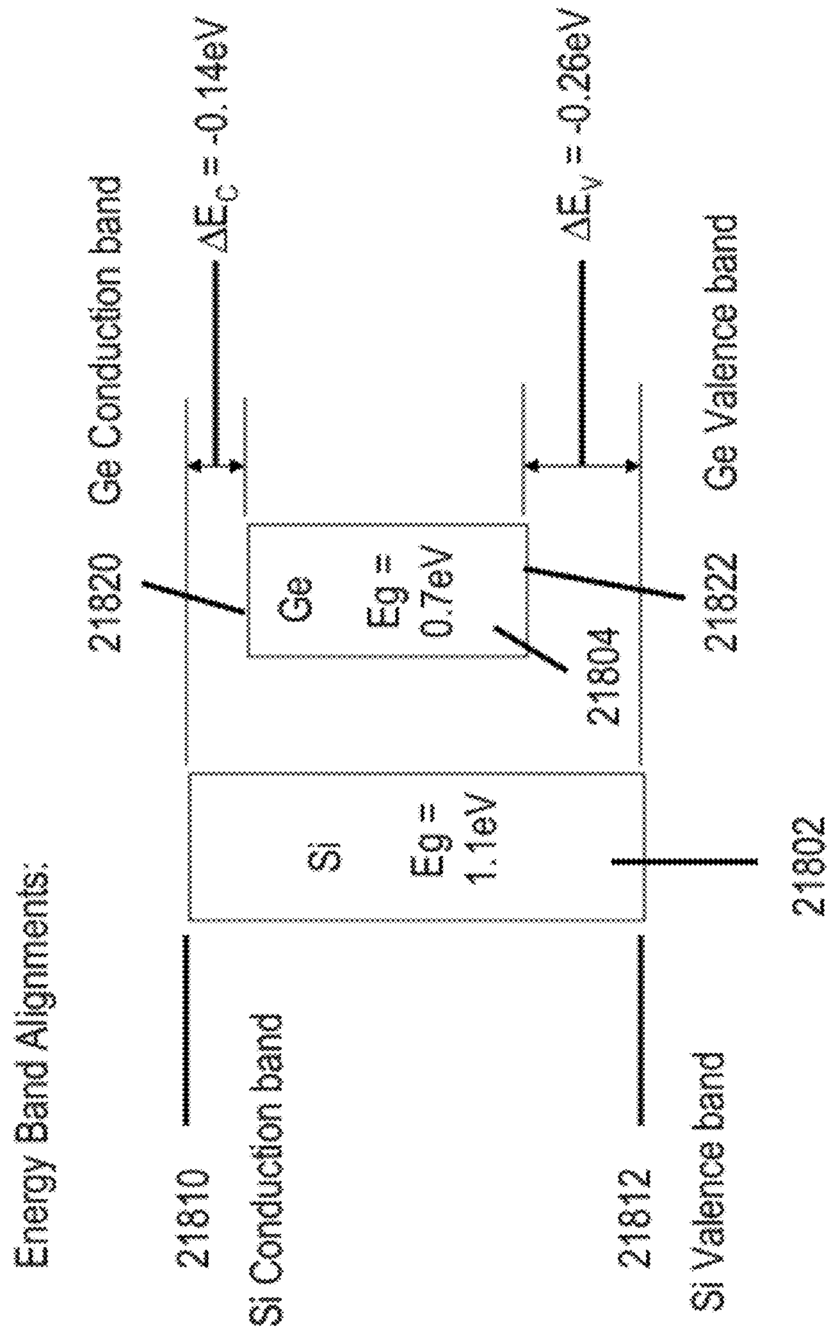
Figure 220:
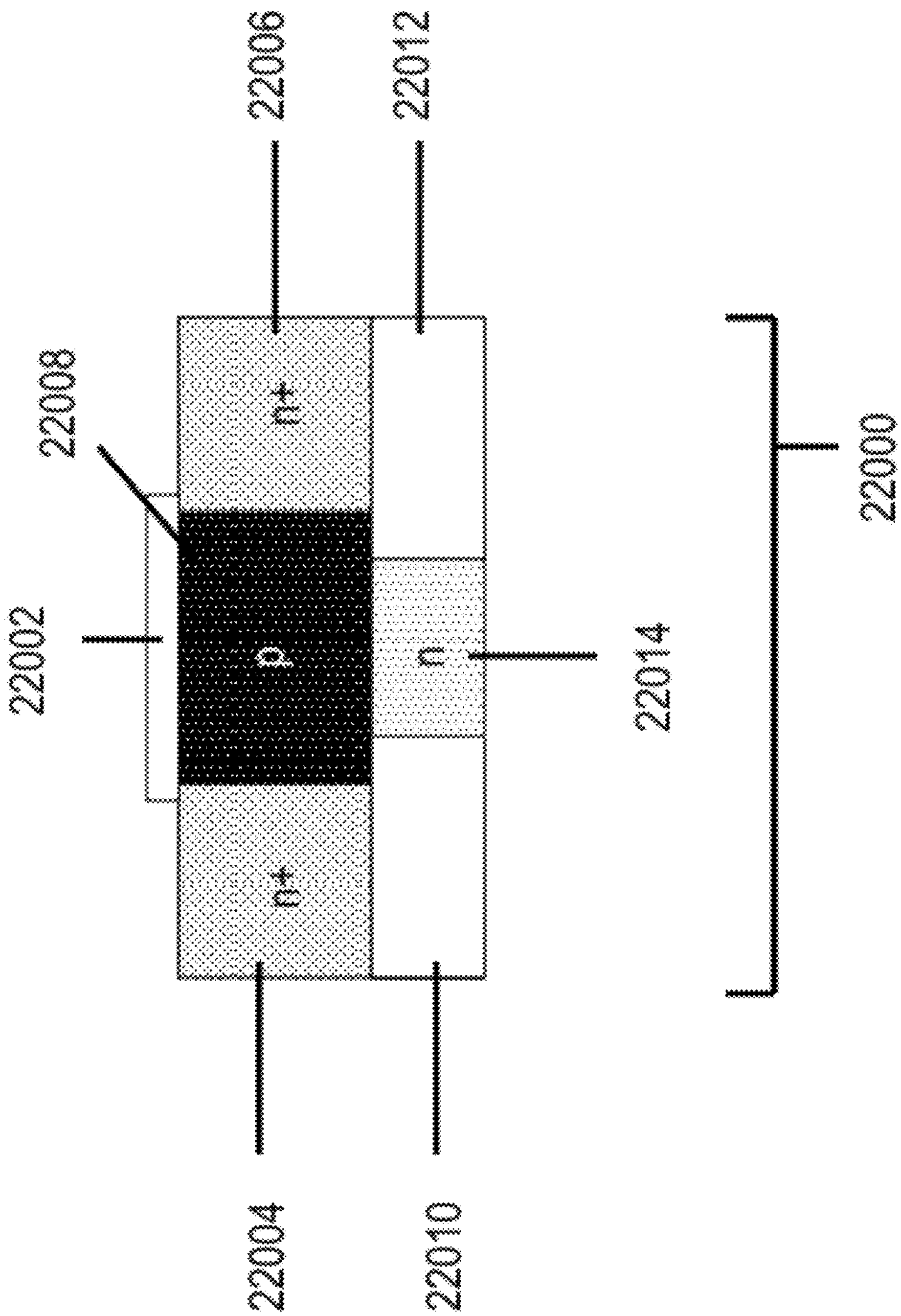
Figure 221:
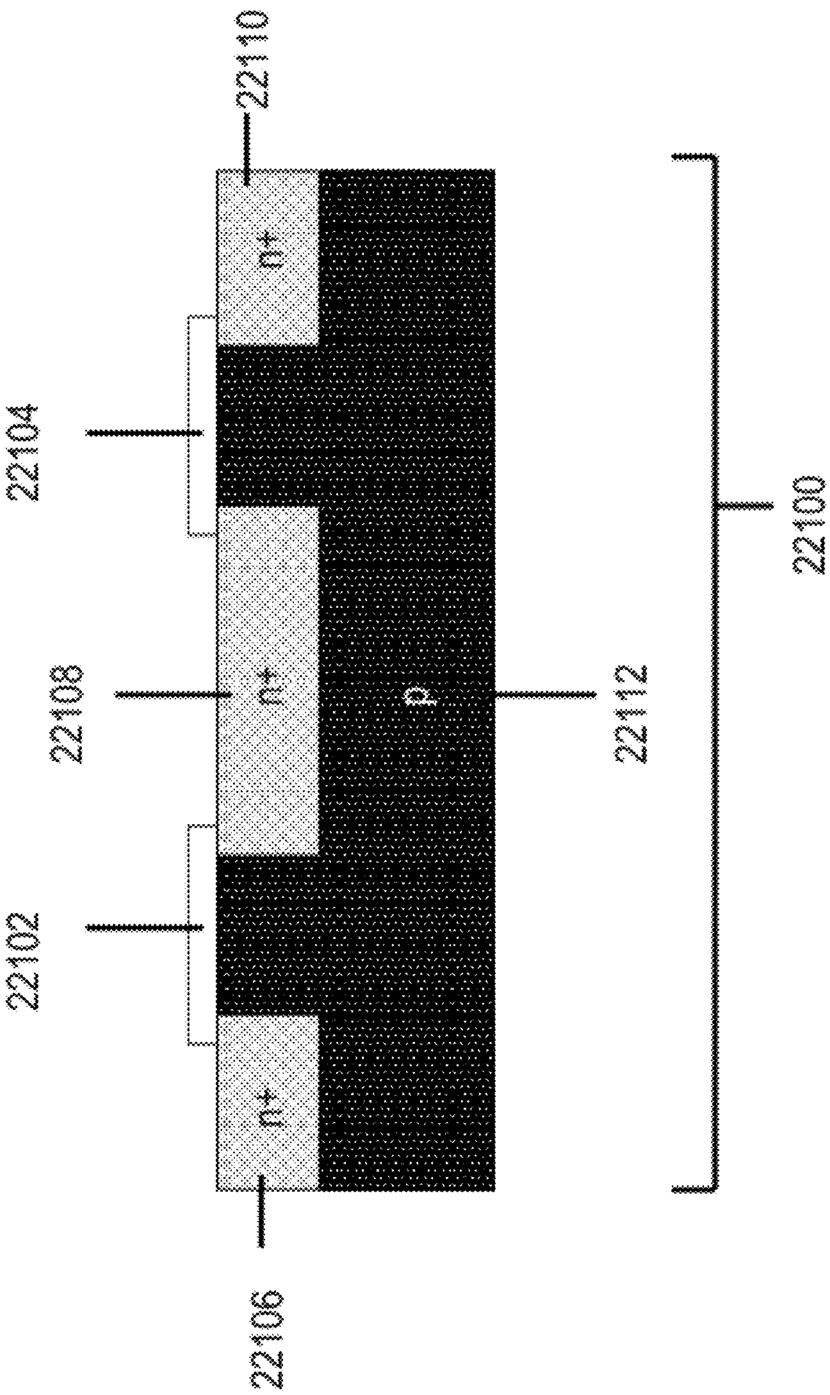
Figure 222:
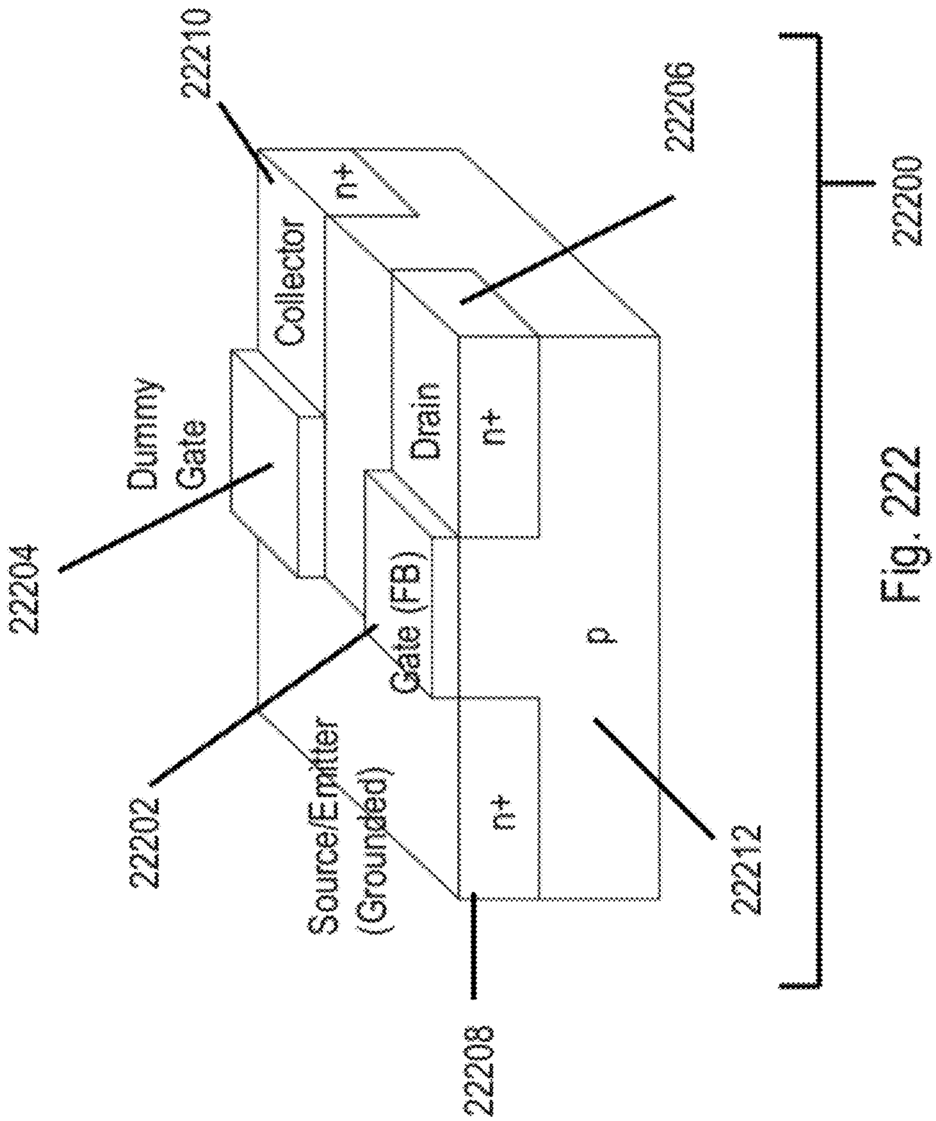
Figure 224:
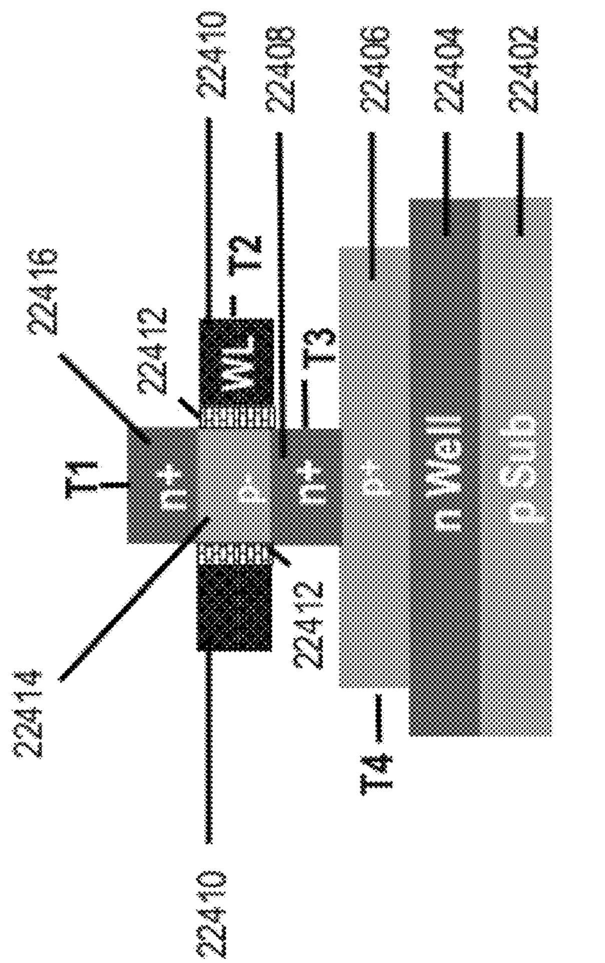
Figure 233B:
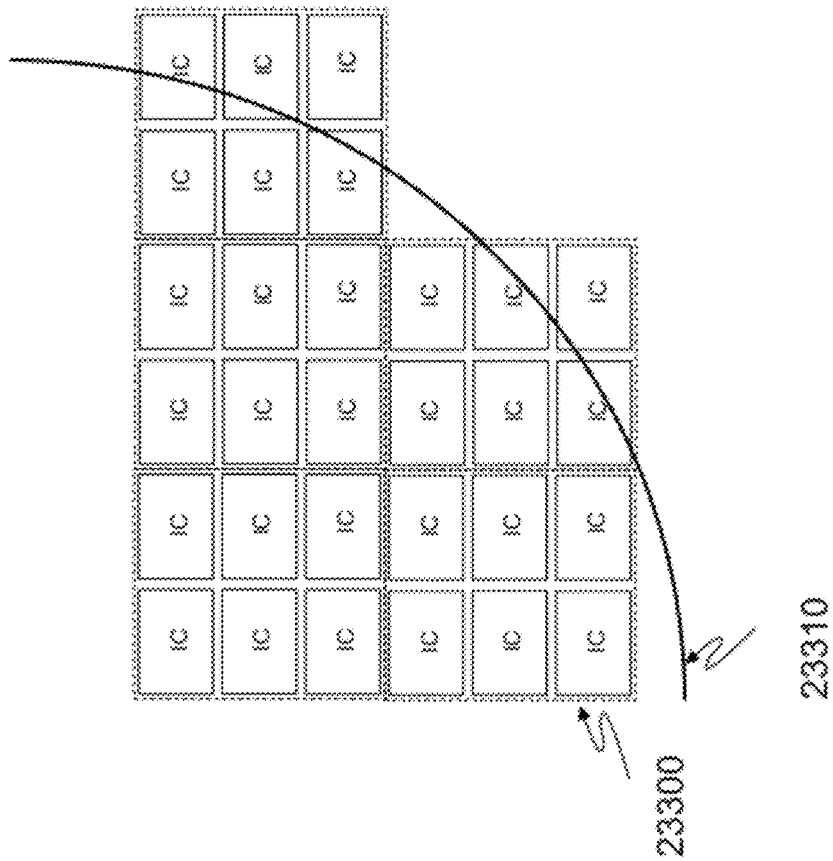
Figure 233A:
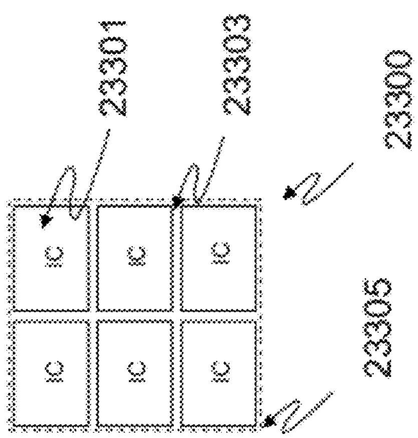
Figure 234B:
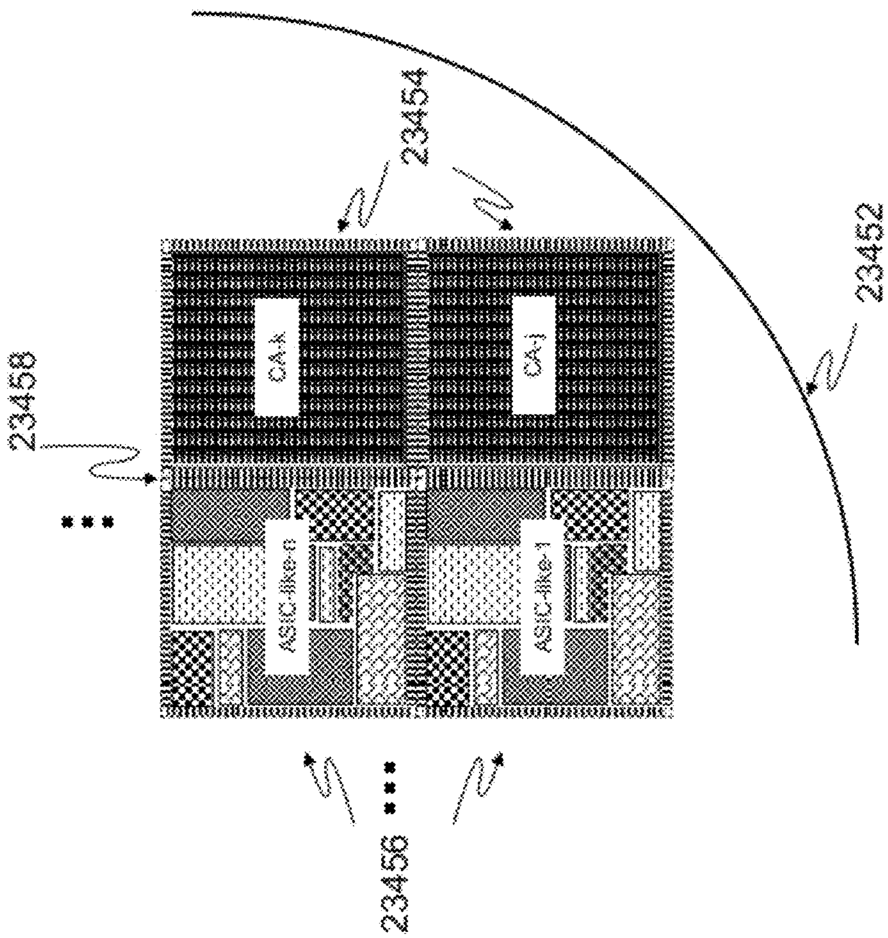
Figure 234A:
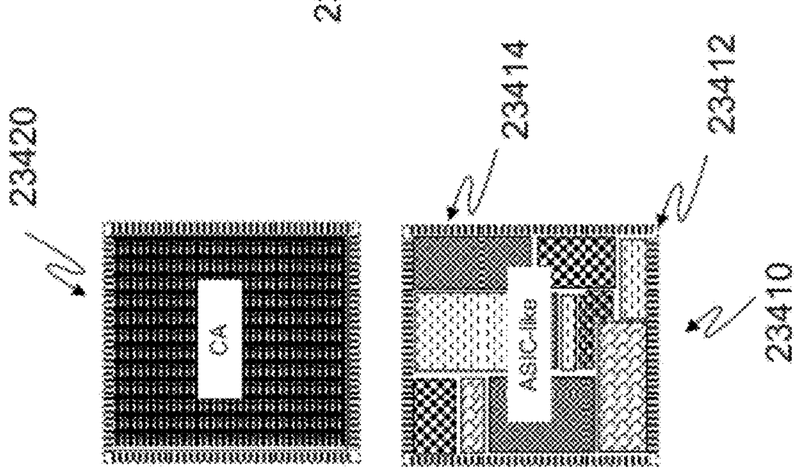
Figure 235:
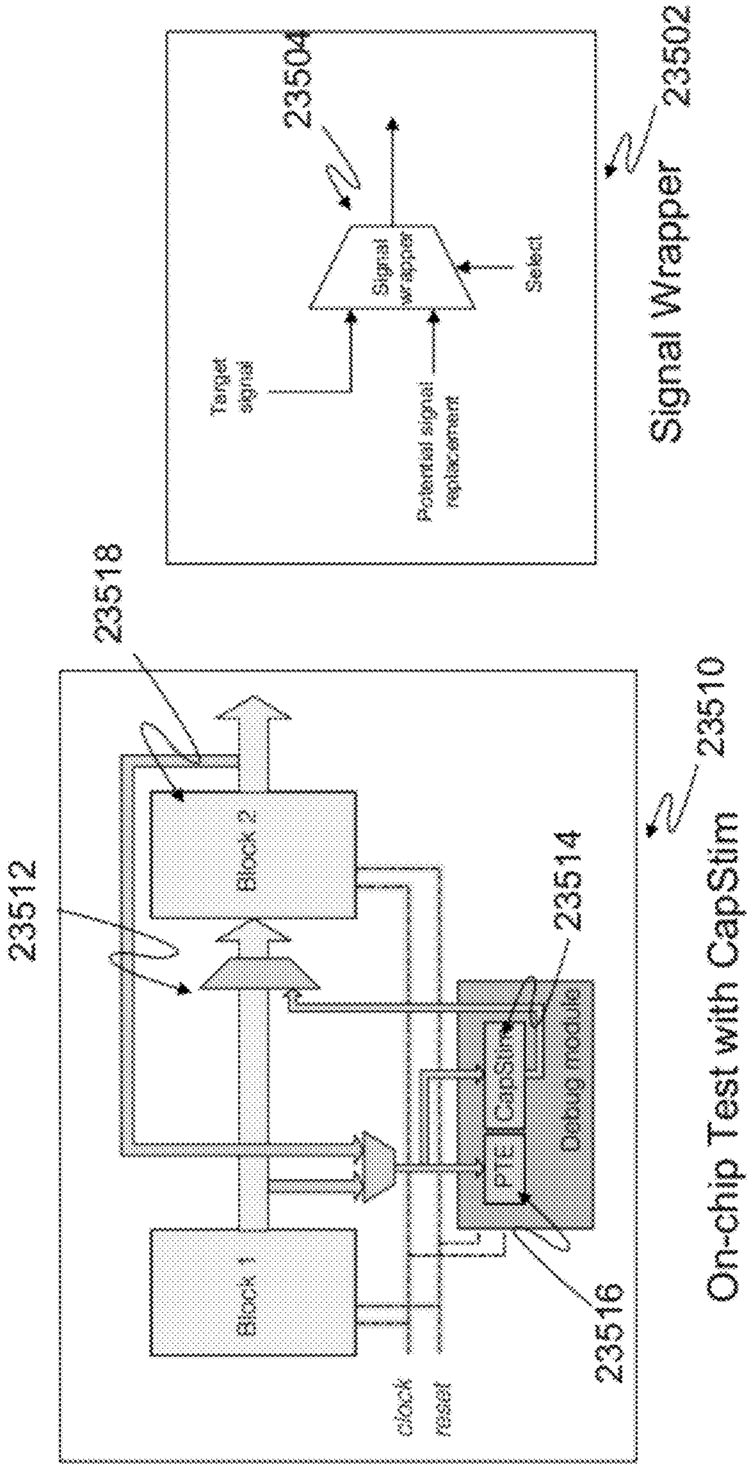
Figure 236:
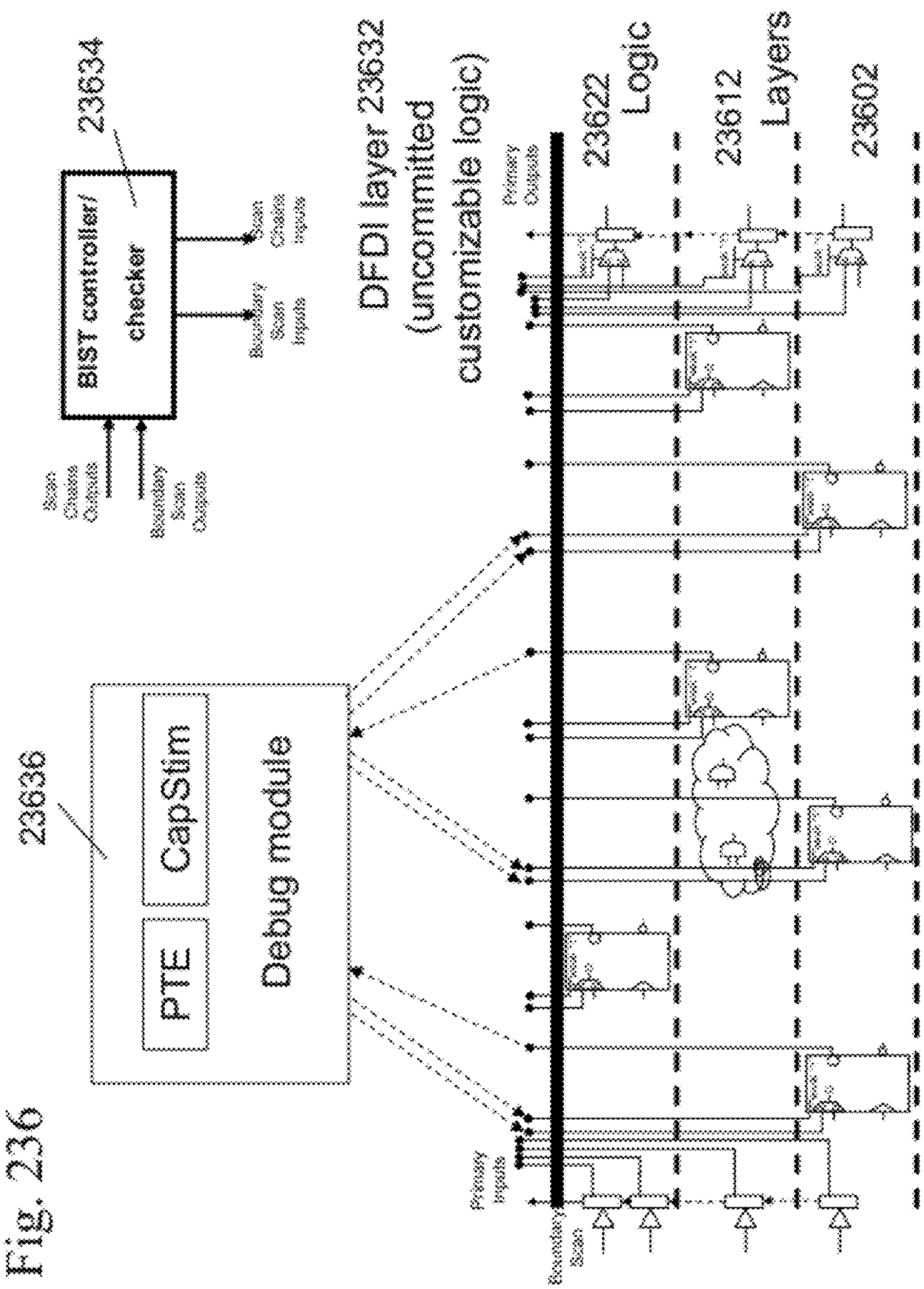
Figure 237:
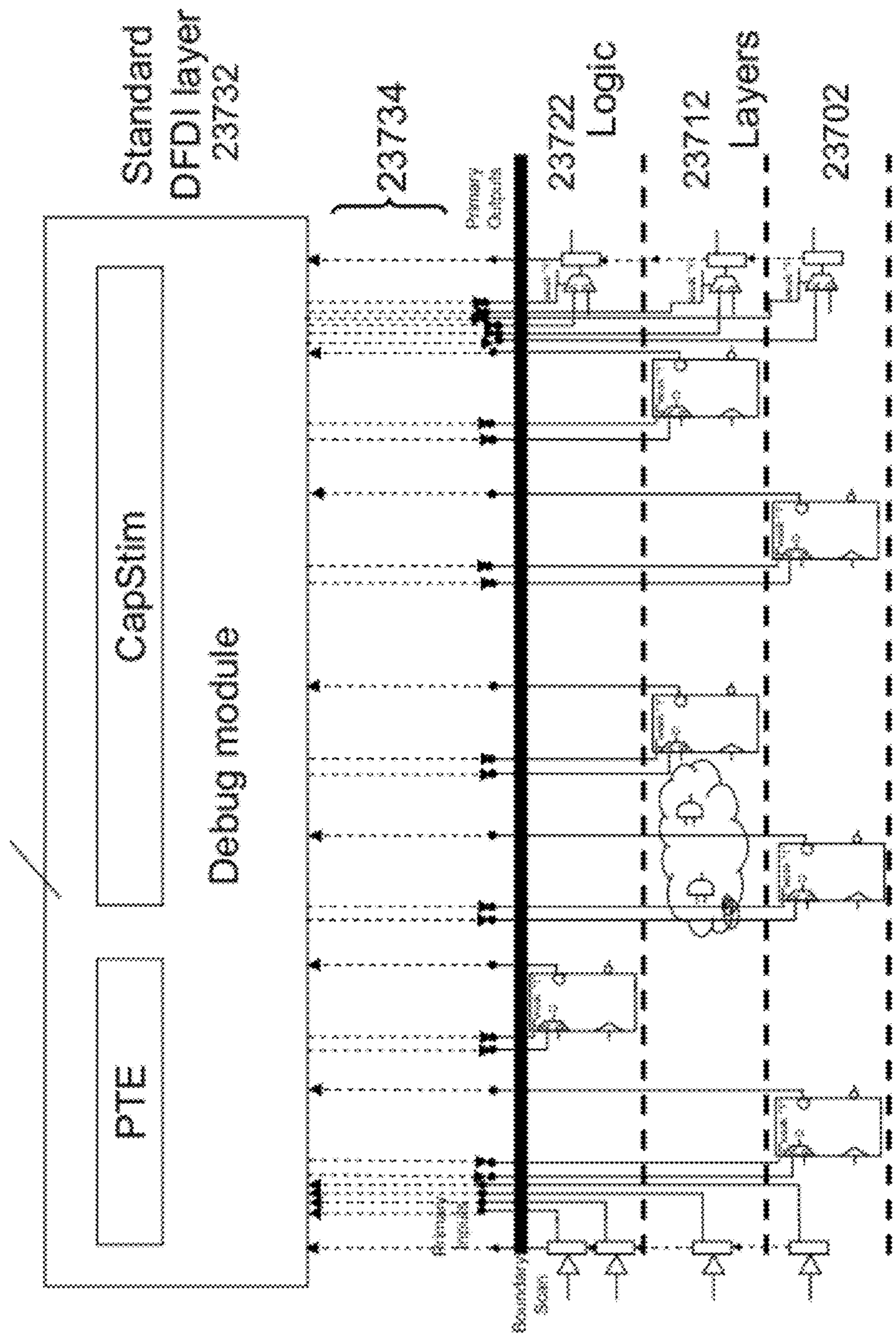
Figure 238:
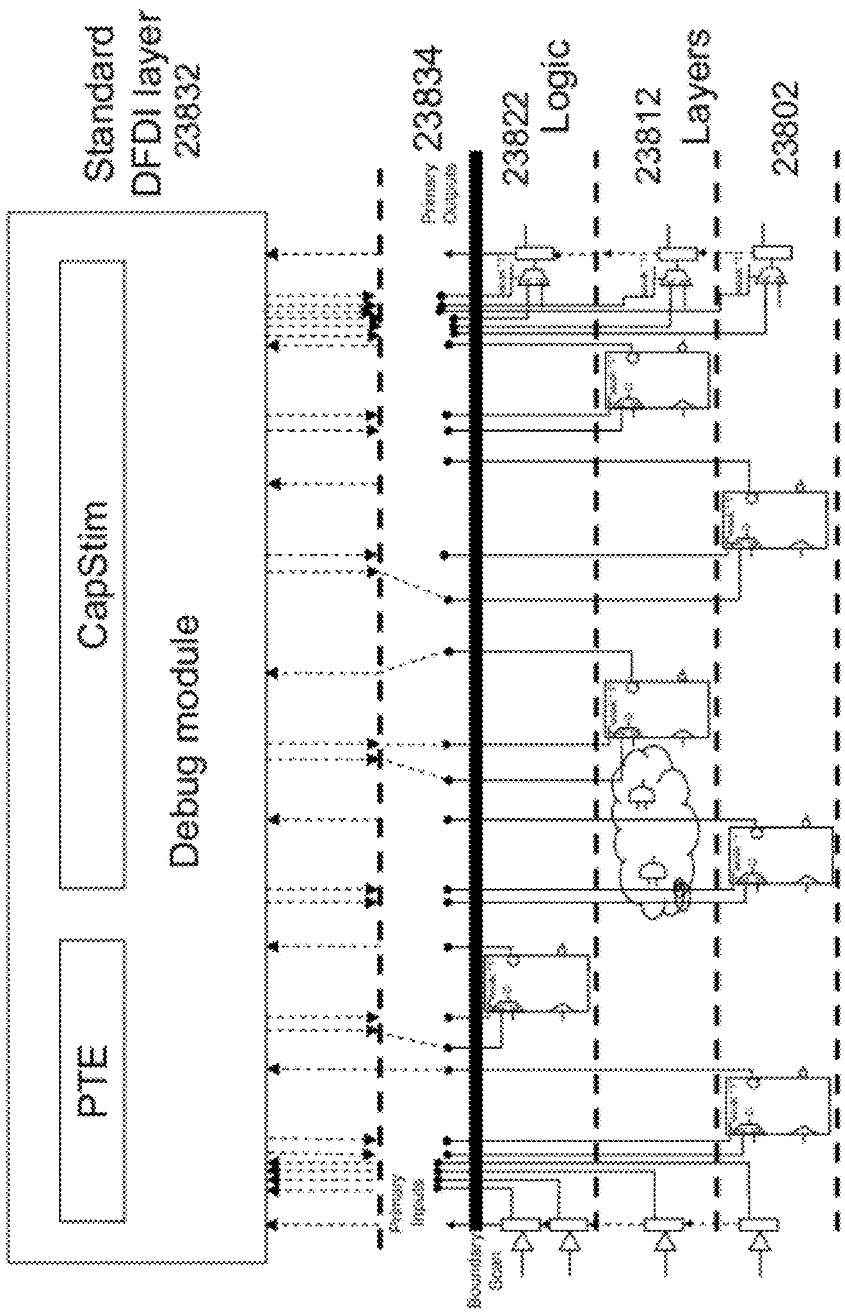
Figure 239:
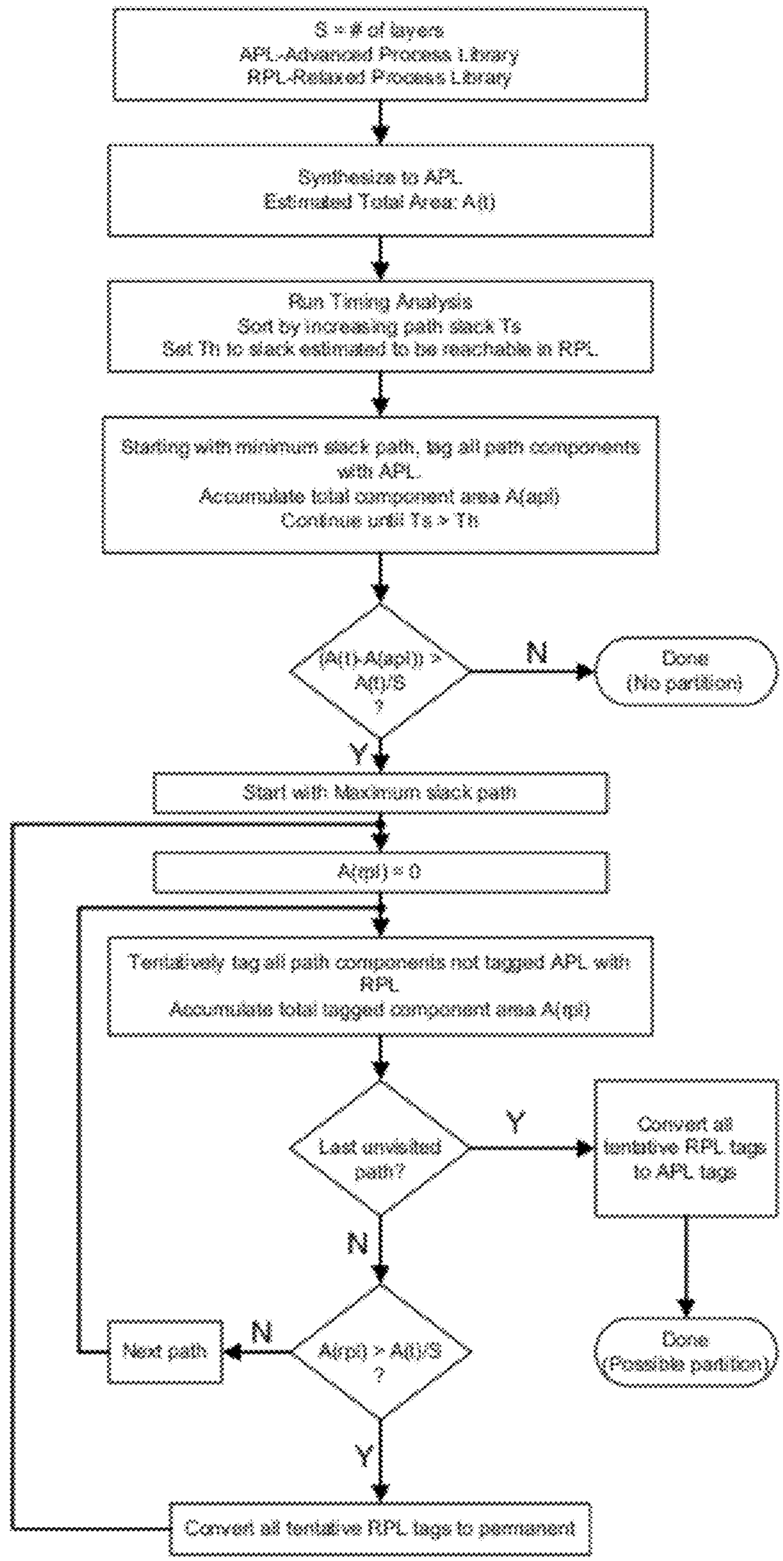

FIG. 218 is an exemplary drawing illustration of energy band alignments;

FIG. 219 A-B is an exemplary drawing illustration of a double-gated floating body NMOSFET;

FIG. 220 is an exemplary drawing illustration of FinFET floating body structure;

FIG. 221 is an exemplary drawing illustration of back-to-back two-transistor floating body structure;

FIG. 222 is an exemplary drawing illustration of a side-to-side two-transistor floating body structure;

FIG. 223 A-J are exemplary drawing illustrations of a process flow for constructing monolithic 3D capacitor-based DRAMs with lithography steps shared among multiple memory layers;

FIG. 224 is an exemplary drawing illustration of a floating body RAM that may not require high electric fields for write;

FIG. 225 A-L are exemplary drawing illustrations of a process flow for constructing monolithic 3D DRAMs with lithography steps shared among multiple memory layers that may not require high electric fields for write;

FIG. 226 A-H are exemplary drawing illustrations of a technique to construct a floating-gate memory on a fully depleted Silicon on Insulator (FD-SOI) substrate;

FIG. 227 A-J are exemplary drawing illustrations of a technique to construct a horizontally-oriented monolithic 3D DRAM that utilizes the floating body effect and has independently addressable double-gate transistors;

FIG. 228 A-F are exemplary drawing illustrations of a technique to construct sub-400° C. 3D stacked transistors by reducing temperatures needed for source and drain anneals;

FIG. 229 A-C are exemplary drawing illustrations of a technique to construct dopant segregated transistors, such as DSS Schottky transistors, compatible with 3D stacking;

FIG. 230 A-F are exemplary drawing illustrations of a procedure for accurate layer transfer of thin silicon regions;

FIG. 231 A-F are exemplary drawing illustrations of an alternative procedure for accurate layer transfer of thin silicon regions;

FIG. 232 A-F are exemplary drawing illustrations of a procedure for layer transfer using an etch-stop layer controlled etch-back;

FIG. 233A is a drawing illustration of a prior art of reticle design;

FIG. 233B is a drawing illustration of a prior art of how such reticle image from FIG. 233A can be used to pattern the surface of a wafer;

FIG. 234A is an exemplary drawing illustration of a reticle design for a WSI design and process;

FIG. 234B is an exemplary drawing illustration of how such reticle image from FIG. 234A can be used to pattern the surface of a wafer;

FIG. 235 is a drawing illustration of prior art of Design for Debug Infrastructure;

FIG. 236 is an exemplary drawing illustration of implementation of Design for Debug Infrastructure using repair layer's uncommitted logic;

FIG. 237 is an exemplary drawing illustration of customized dedicated Design for Debug Infrastructure layer with connections on a regular grid to connect to flip-flops on other layers with connections on a similar grid;

FIG. 238 is an exemplary drawing illustration of customized dedicated Design for Debug Infrastructure layer with connections on a regular grid that uses interposer to connect to flip-flops on other layers with connections not on a similar grid;

FIG. 239 is an exemplary drawing illustration of a flowchart of partitioning a design into two disparate target technologies based on timing requirements;

DETAILED DESCRIPTION

Embodiments of the invention are described herein with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing figures may describe process flows for building devices. These process flows, which may be a sequence of steps for building a device, may have many structures, numerals and labels that may be common between two or more adjacent steps. In such cases, some labels, numerals and structures used for a certain step's figure may have been described in the previous steps' figures.

Some embodiments of the invention may provide a new method for semiconductor device fabrication that may be highly desirable for custom products. Some embodiments of the invention may suggest the use of a re-programmable antifuse in conjunction with 'Through Silicon Via' to construct a new type of configurable logic, or as usually called, FPGA devices. Some embodiments of the invention may provide a solution to the challenge of high mask-set cost and low flexibility that exists in the current common methods of semiconductor fabrication. An additional illustrated advantage of some embodiments of the present invention may be that it could reduce the high cost of manufacturing the many different mask sets needed in order to provide a commercially viable logic family with a range of products each with a different set of master slices. Some embodiments of the invention may improve upon the prior art in many respects, including, for example, the structuring of the semiconductor device and methods related to the fabrication of semiconductor devices.

Some embodiments of the invention may reflect the motivation to save on the cost of masks with respect to the investment that would otherwise have been necessary to put in place a commercially viable set of master slices. Some embodiments of the invention may also provide the ability to incorporate various types of memory blocks in the configurable device. Some embodiments of the invention may provide a method to construct a configurable device with the desired amount of logic, memory, I/Os, and analog functions.

In addition, some embodiments of the invention may allow the use of repeating logic tiles that provide a continuous terrain of logic. Some embodiments of the invention may use a modular approach to construct various configurable systems with Through-Silicon-Via (TSV). Once a standard size and location of TSV has been defined one could build various configurable logic dies, configurable memory dies, configurable I/O dies and configurable analog dies which could be connected together to construct various configurable systems. In fact, these embodiments of the invention may allow mixing and matching among configurable dies, fixed function dies, and dies manufactured in different processes.

Some embodiments of the invention may provide additional illustrated benefits by making use of special type of transistors placed above or below the antifuse configurable interconnect circuits to allow for a far better use of the silicon area. In general an FPGA device that utilizes antifuses to configure the device function may include the electronic circuits to program the antifuses. The programming circuits may be used primarily to configure the device and may be mostly an overhead once the device is configured. The programming voltage used to program the antifuse may typically be significantly higher than the voltage used for the operating circuits of the device. The design of the antifuse structure may be designed such that an unused antifuse may not accidentally get fused. Accordingly, the incorporation of the antifuse programming in the silicon substrate may entail special attention for a resulting higher voltage, and additional silicon area may, accordingly, be allocated.

Unlike the operating transistors designed to operate as fast as possible and to enable fast system performance, the programming circuits could operate relatively slowly. Accordingly using a thin film transistor for the programming circuits could fit very well with the function and may reduce the needed silicon area.

The programming circuits may, therefore, be constructed with thin film transistors, which may be fabricated after the fabrication of the operating circuitry, on top of the configurable interconnection layers that incorporate and use the antifuses. An additional illustrated advantage of such embodiments of the invention may be the ability to reduce cost of the high volume production. One may only need to use mask-defined links instead of the antifuses and their programming circuits. One custom via mask may be used, and this may save steps associated with the fabrication of the antifuse layers, the thin film transistors, and/or the associated connection layers of the programming circuitry.

In accordance with an embodiment of the invention an Integrated Circuit device may thus be provided, including a plurality of antifuse configurable interconnect circuits and a plurality of transistors to configure at least one of said antifuses; wherein said transistors are fabricated after said antifuse.

Further provided in accordance with an embodiment of the invention may provide an Integrated Circuit device including: a plurality of antifuse configurable interconnect circuits and plurality of transistors to configure at least one of said antifuses; wherein said transistors are placed over said antifuse.

Still further in accordance with an embodiment of the illustrated invention of the Integrated Circuit device may include second antifuse configurable logic cells and a plurality of second transistors to configure said second antifuses wherein these second transistors may be fabricated before said second antifuses.

Still further in accordance with an embodiment of the illustrated invention the Integrated Circuit device may also include second antifuse configurable logic cells and a plurality of second transistors to configure said second antifuses wherein said second transistors may be placed underneath said second antifuses.

Further provided in accordance with an embodiment of the illustrated invention may be an Integrated Circuit device including: first antifuse layer, at least two metal layers over it and a second antifuse layer overlaying the two metal layers.

In accordance with an embodiment of the invention a configurable logic device may be presented, including: antifuse configurable look up table logic interconnected by antifuse configurable interconnect.

In accordance with an embodiment of the illustrated invention a configurable logic device may also be provided, including: a plurality of configurable look up table logic, a plurality of configurable programmable logic array (PLA) logic, and a plurality of antifuse configurable interconnect.

In accordance with an embodiment of the invention a configurable logic device may also be provided, including: a plurality of configurable look up table logic and a plurality of configurable drive cells wherein the drive cells may be configured by plurality of antifuses.

In accordance with an embodiment of the illustrated invention, a configurable logic device may additionally be provided, including: configurable logic cells interconnected by a plurality of antifuse configurable interconnect circuits wherein at least one of the antifuse configurable interconnect circuits may be configured as part of a non volatile memory.

Further in accordance with an embodiment of the invention, the configurable logic device may include at least one antifuse configurable interconnect circuit, which may also be configurable to a PLA function.

In accordance with an alternative embodiment of the invention, an integrated circuit system may also be provided, including a configurable logic die and an I/O die wherein the configurable logic die may be connected to the I/O die by the use of Through-Silicon-Via.

Further in accordance with an embodiment of the invention, the integrated circuit system may include; a configurable logic die and a memory die wherein the configurable logic die and the memory die may be connected by the use of Through-Silicon-Via.

Still further in accordance with an embodiment of the invention the integrated circuit system may include a first configurable logic die and second configurable logic die wherein the first configurable logic die and the second configurable logic die may be connected by the use of Through-Silicon-Via.

Moreover in accordance with an embodiment of the invention, the integrated circuit system may include an I/O die that may be fabricated utilizing a different process than the process utilized to fabricate the configurable logic die.

Further in accordance with an embodiment of the invention, the integrated circuit system may include at least two logic dies connected by the use of Through-Silicon-Via and wherein some of the Through-Silicon-Vias may be utilized to carry the system bus signal.

Moreover in accordance with an embodiment of the invention, the integrated circuit system may include at least one configurable logic device.

Further in accordance with an embodiment of the invention, the integrated circuit system may include, an antifuse configurable logic die and programmer die which may be connected by the use of Through-Silicon-Via.

Additionally there is a growing need to reduce the impact of inter-chip interconnects. In fact, interconnects may be now dominating IC performance and power. One solution to shorten interconnect may be to use a 3D IC. Currently, the only known way for general logic 3D IC is to integrate finished device one on top of the other by utilizing Through-Silicon-Vias as now called TSVs. The problem with TSVs may be that their large size, usually a few microns each, may severely limit the number of connections that can be made. Some embodiments of the invention may provide multiple alternatives to constructing a 3D IC wherein many connections may be made less than one micron in size, thus enabling the use of 3D IC technology for most device applications.

Figure 1:
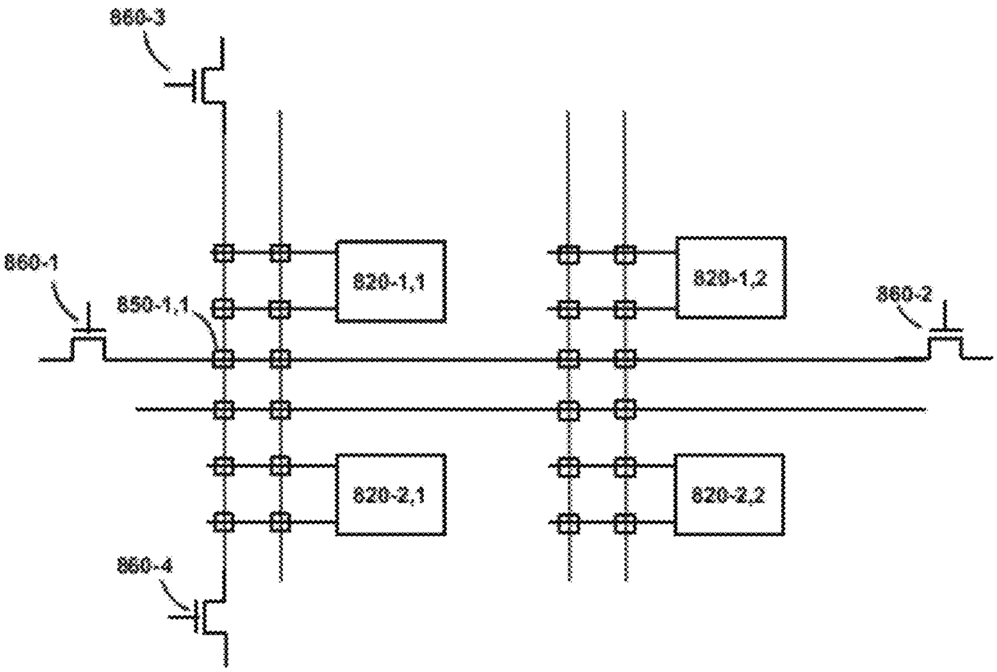
FIG. 1 is a circuit diagram illustration of a prior art.

Additionally some embodiments of the invention may offer new device alternatives by utilizing the proposed 3D IC technology FIG. 1 illustrates a circuit diagram illustration of a prior art, where, for example, 860-1 to 860-4 are the programming transistors to program antifuse 850-1,1.

Figure 81A:
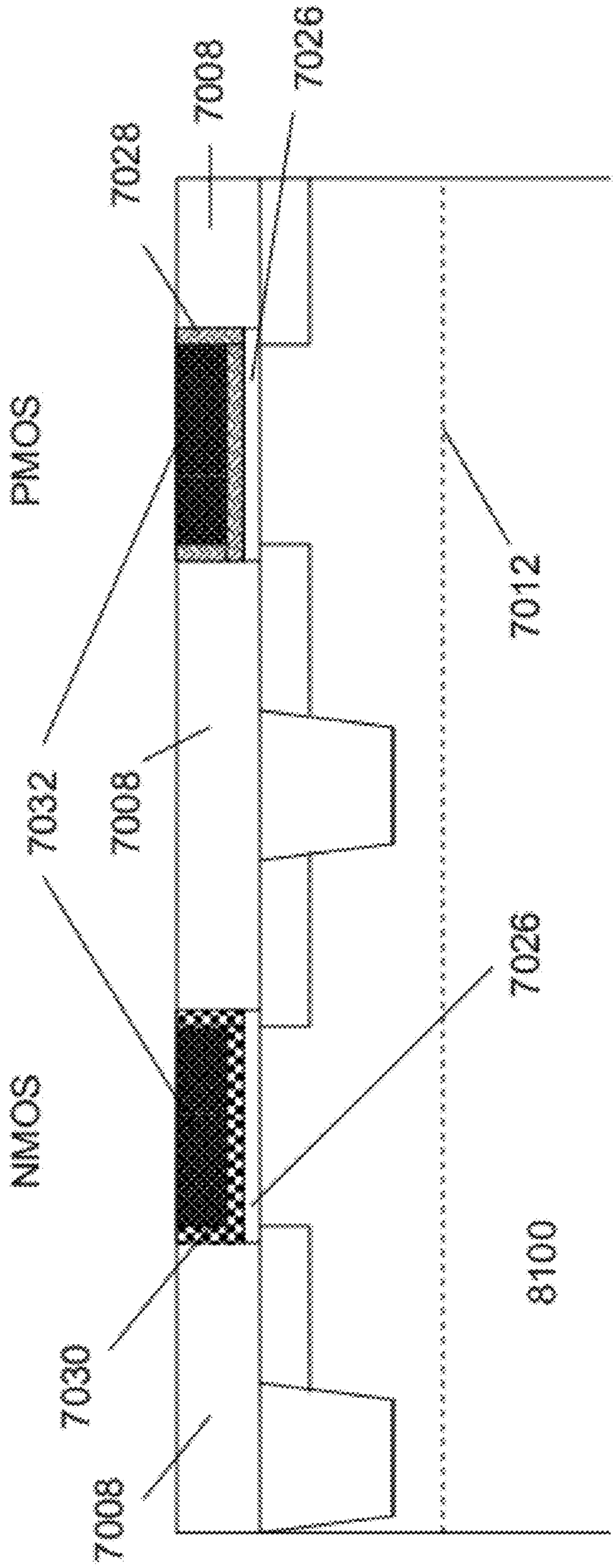
FIG. 81 A-E, 81E-1, 81F, 81F-1, 81F-2 are exemplary drawing illustrations of a formation of top planar transistors.
Figure 81B:
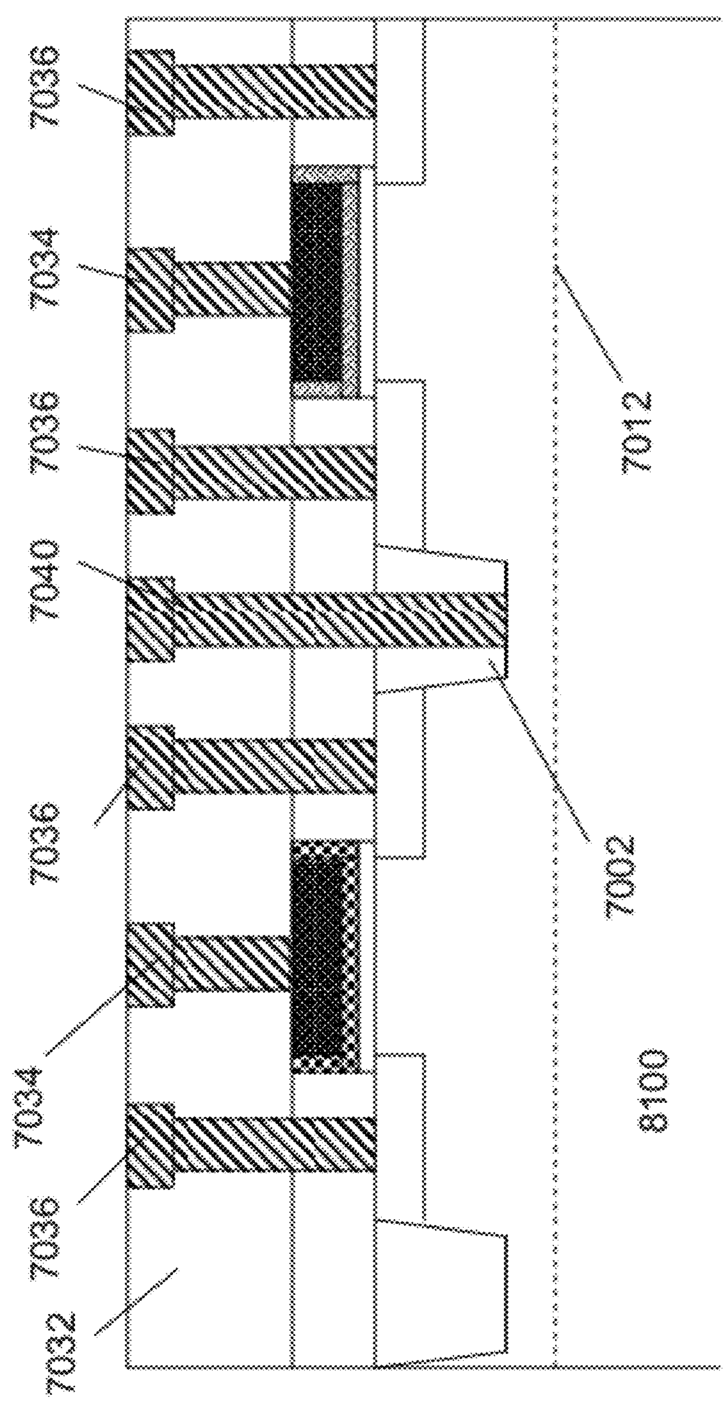
Figure 81C:
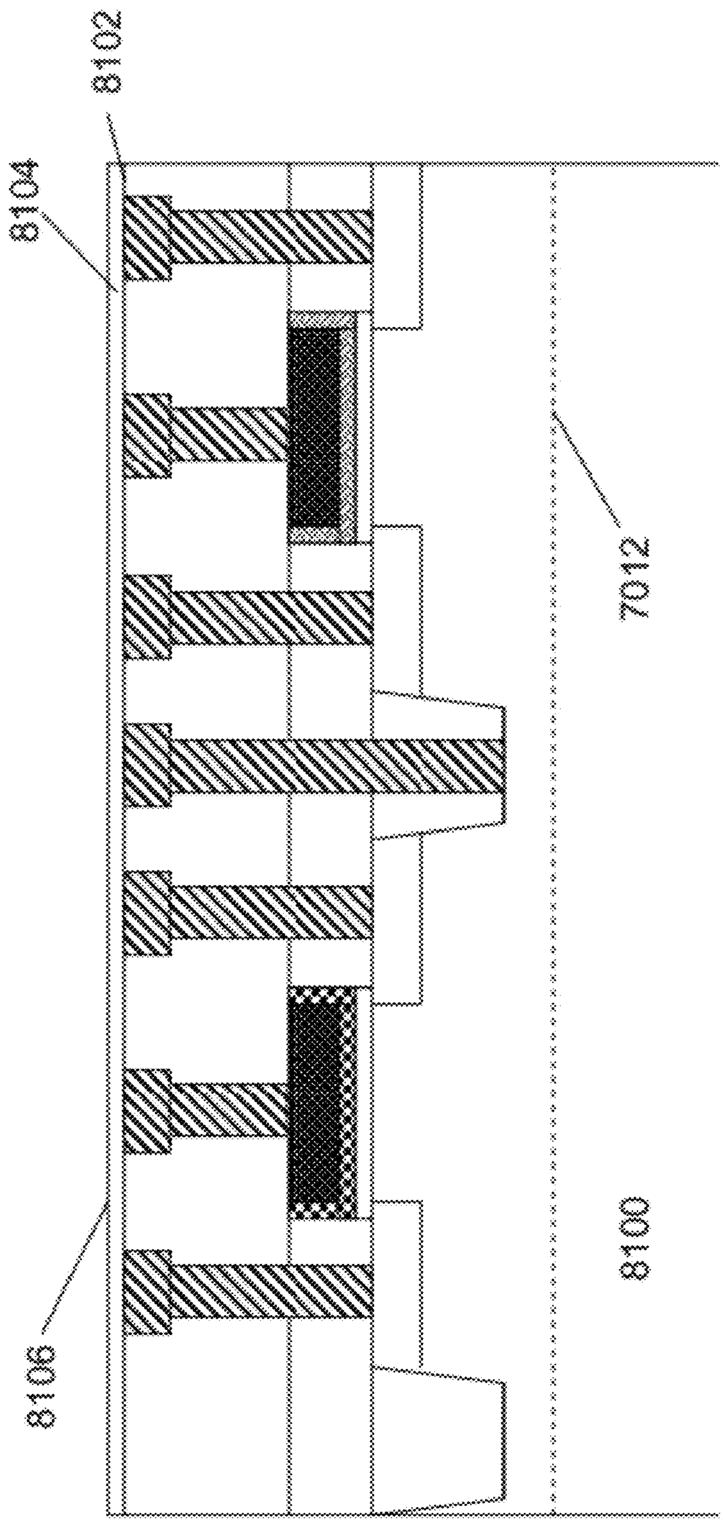
Figure 81D:
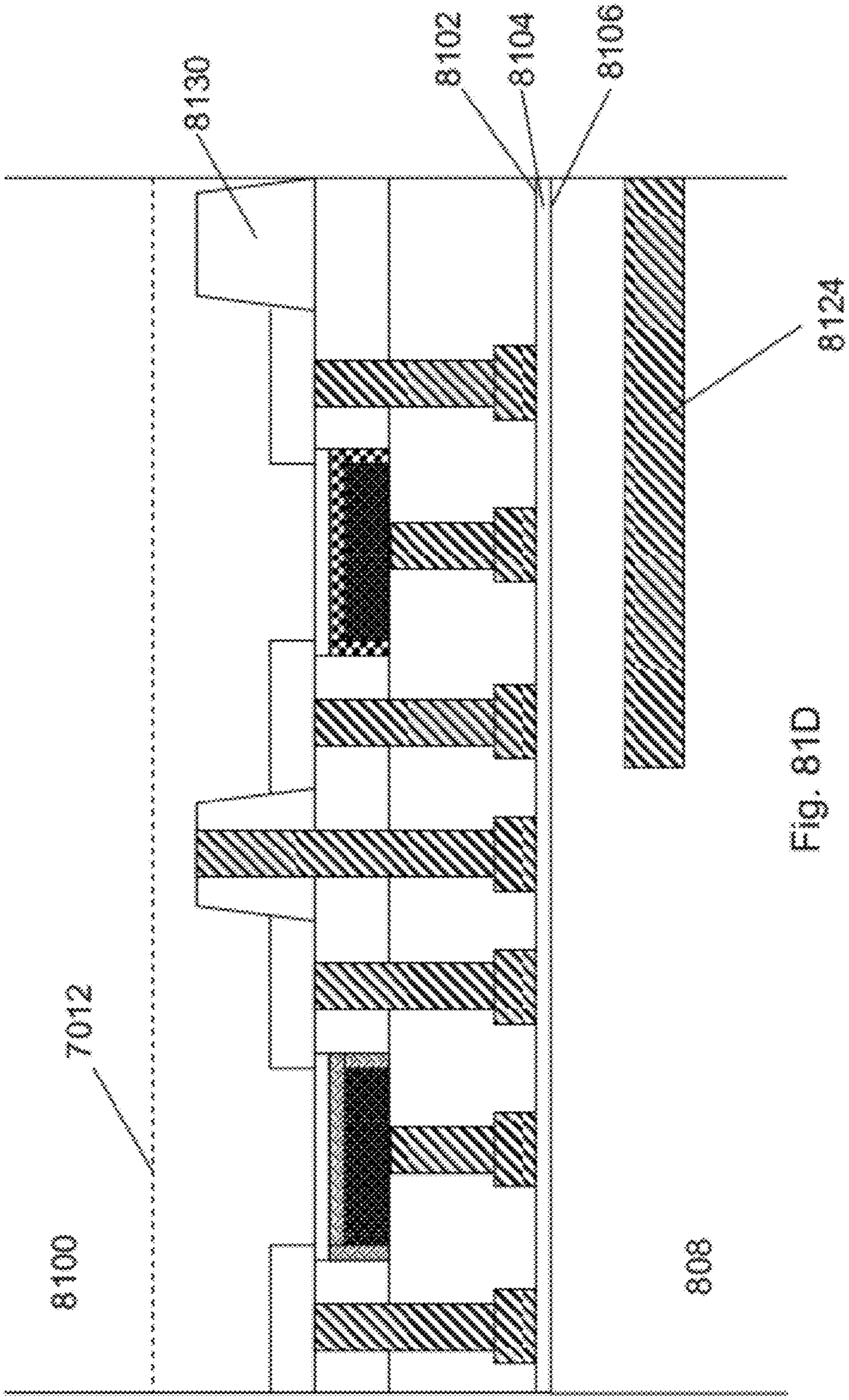
Figure 81E:
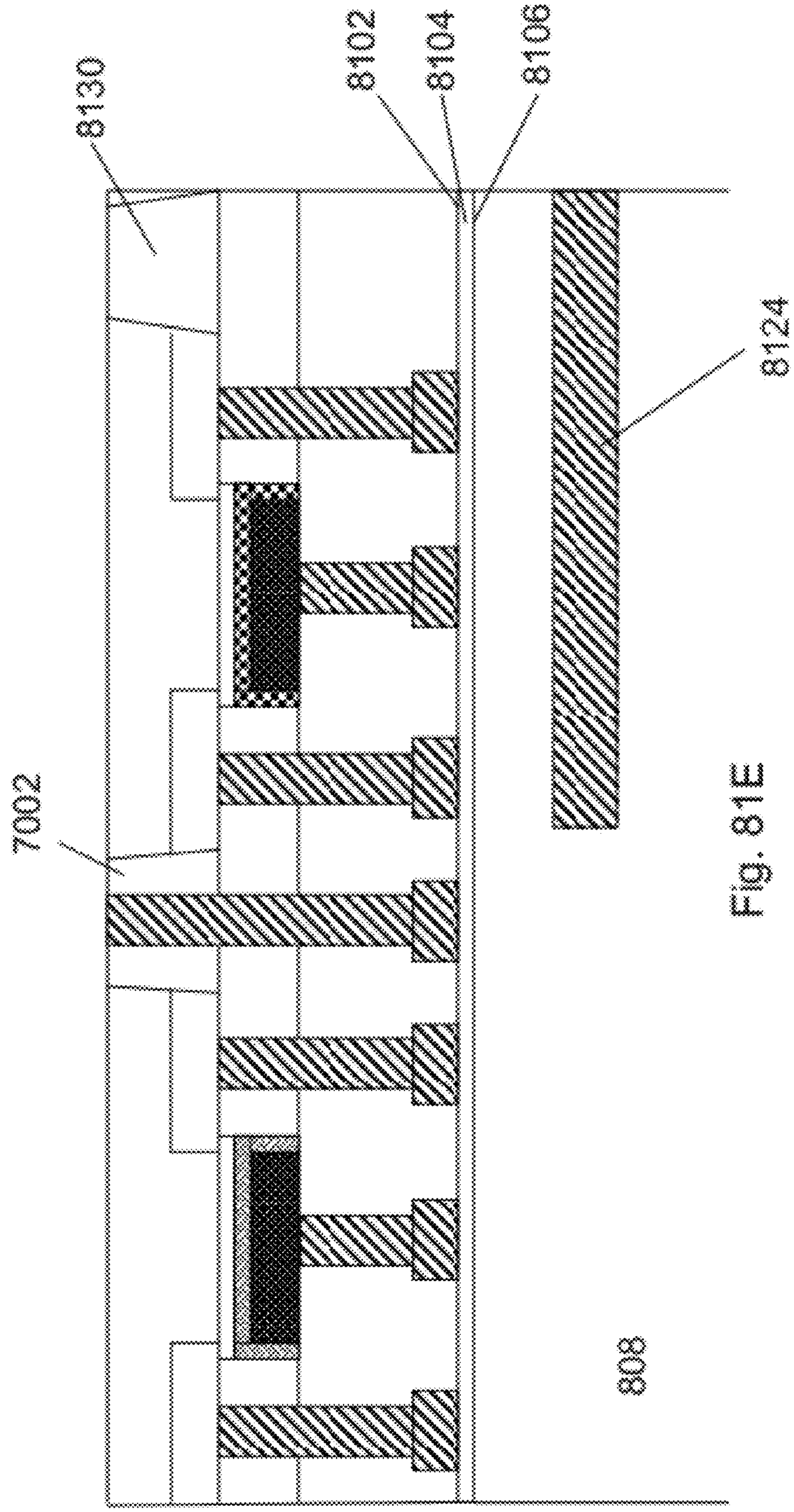
Figures 1, 81E:
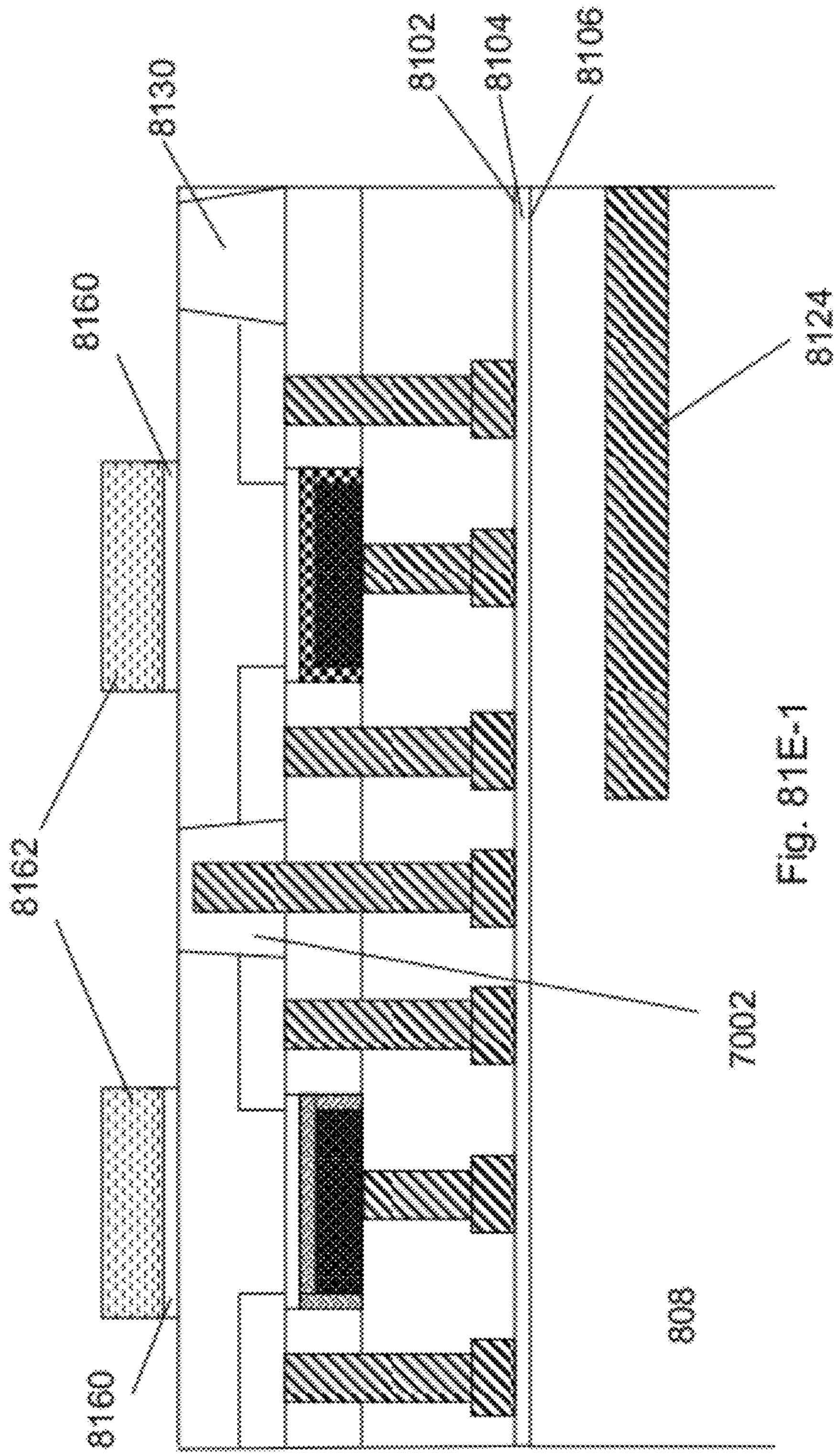
Figure 81F:
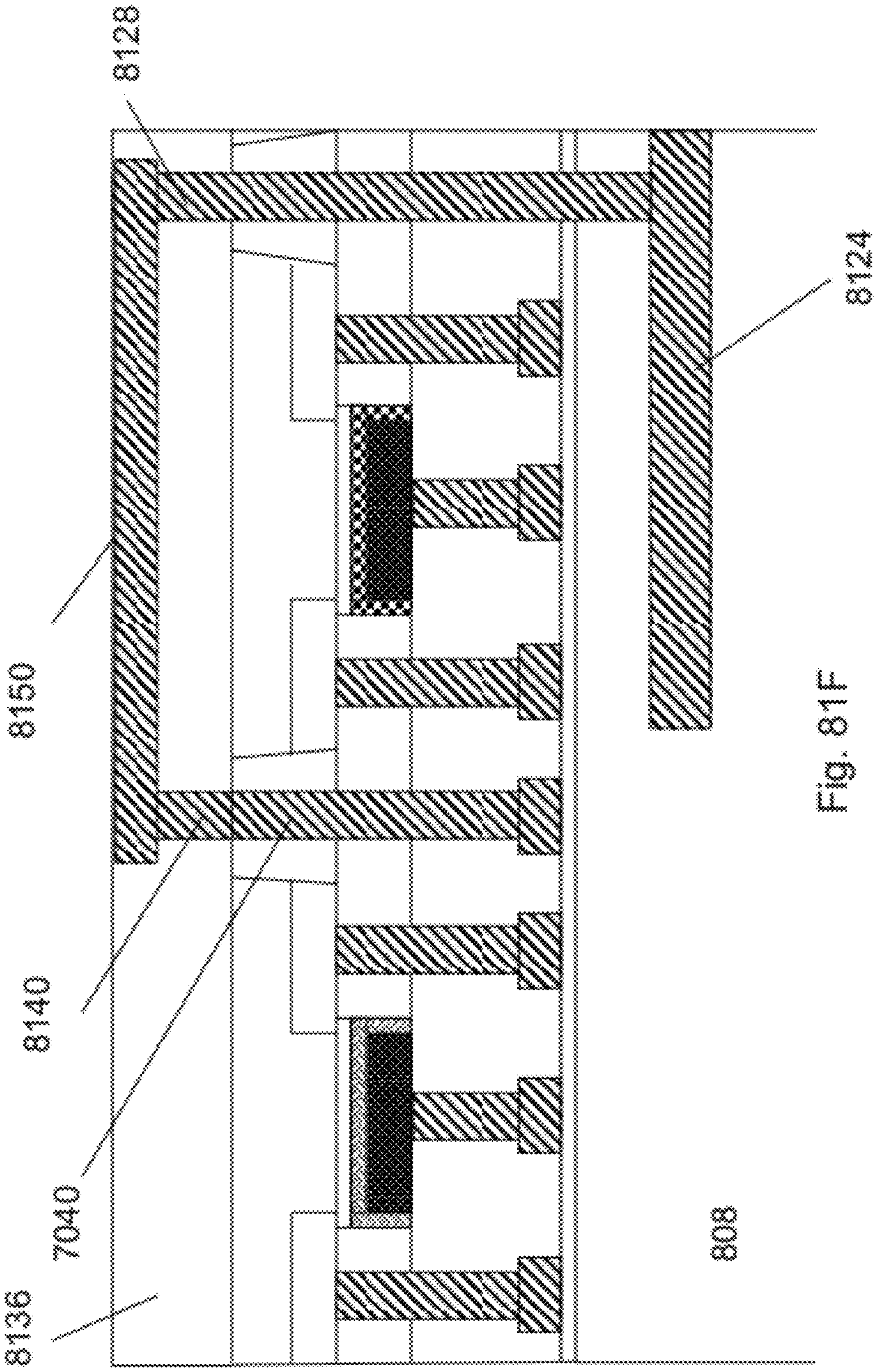
Figures 1, 81F:
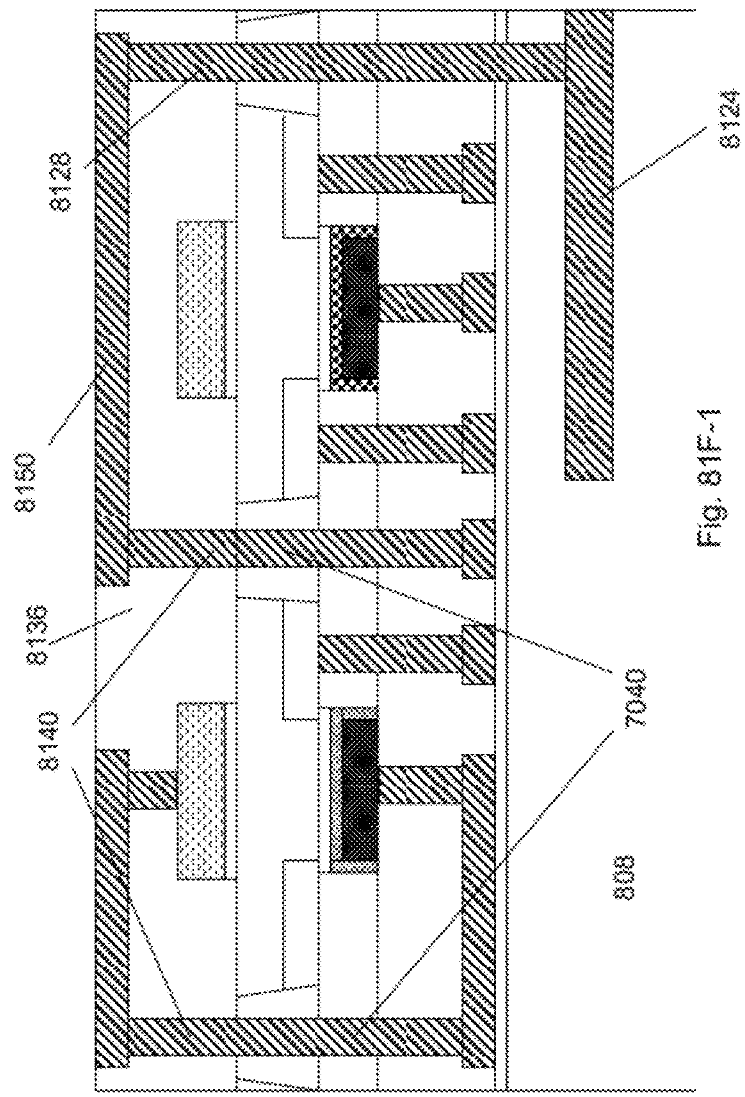
Figures 2, 81F:
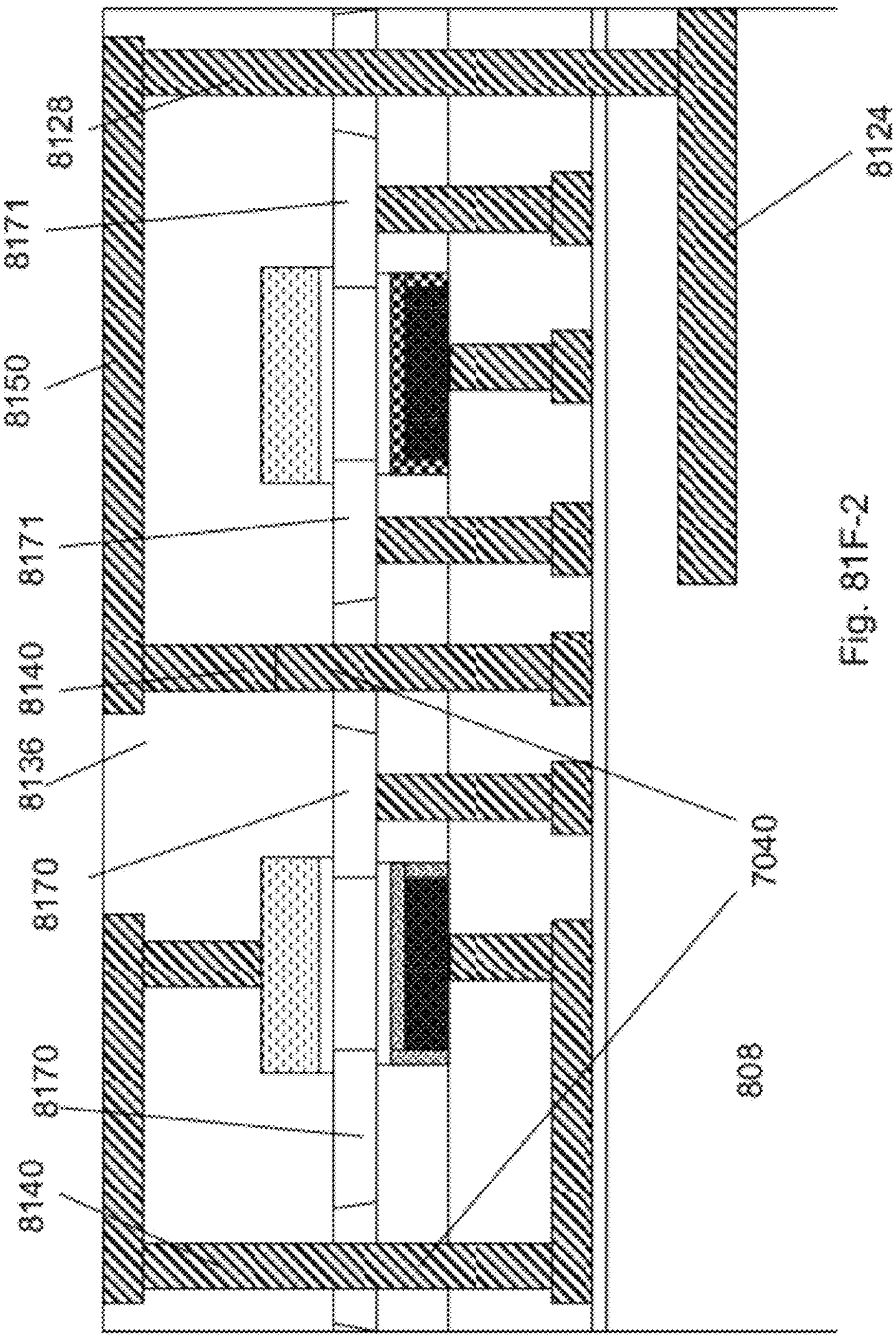
FIG. 2 is a cross-section illustration of a portion of a prior art represented by the circuit diagram of FIG. 1.

FIG. 2 illustrates a cross-section view of a portion of a prior art represented by the circuit diagram of FIG. 1 showing the programming transistor 860-1 built as part of the silicon substrate.

Figure 3A:
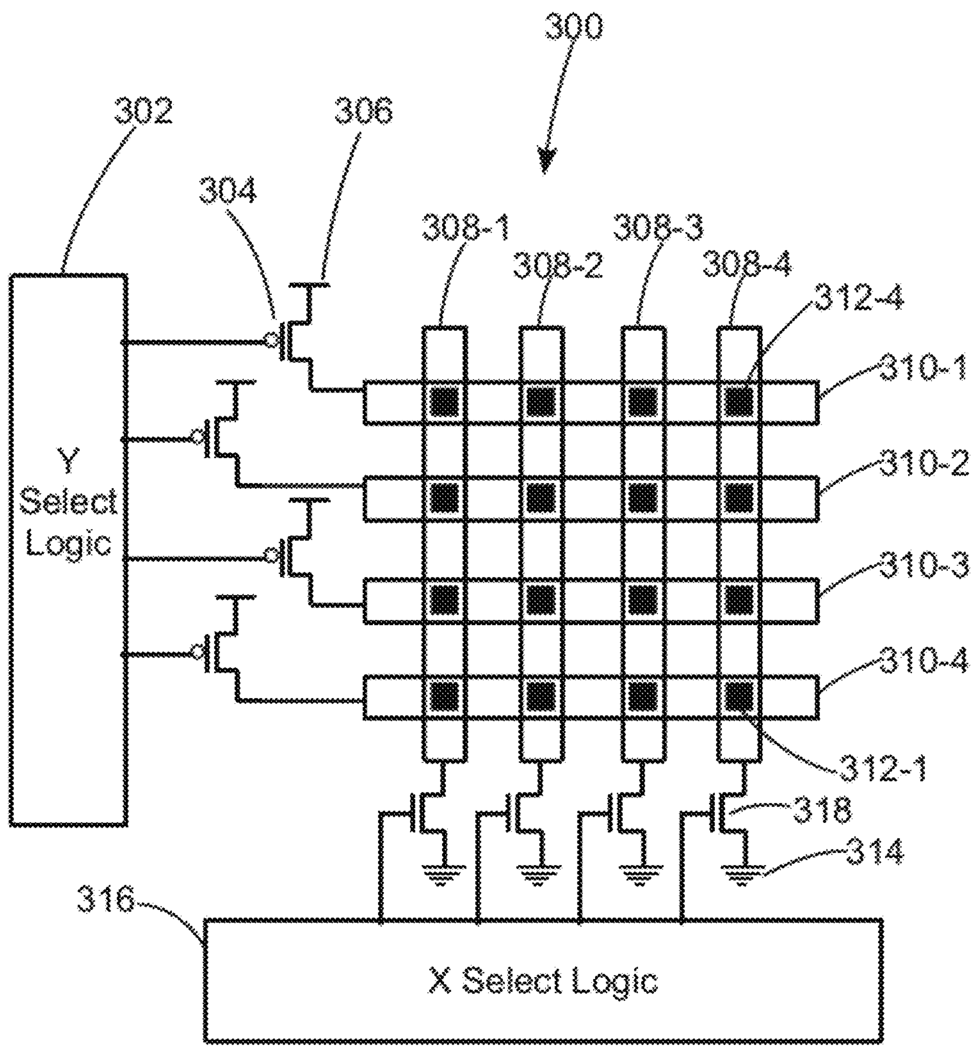
FIG. 3A is an exemplary drawing illustration of a programmable interconnect structure.

FIG. 3A illustrates a programmable interconnect tile. 310-1 may be one of 4 horizontal metal strips, which form a band of strips. The typical IC today may have many metal layers. Metal layers described herein may include metal lines and strips, wherein the metal may include, for example, copper or aluminum, and the metal lines and strips may be encased in a dielectric material, for example silicon dioxide, carbon containing oxides, and/or low-k materials. The metal lines or strips may be constructed with refractory metals such as tungsten to provide high temperature utility at greater than about 400° C. In a typical programmable device the first two or three metal layers may be used to construct the logic elements. On top of them metal 4 to metal 7 may be used to construct the interconnection of those logic elements. In an FPGA device the logic elements may be programmable, as well as the interconnects between the logic elements. The configurable interconnect of the present invention may be constructed from 4 metal layers or more. For example, metal 4 and 5 could be used for long strips and metal 6 and 7 may include short strips. Typically the strips forming the programmable interconnect have mostly the same length and are oriented in the same direction, forming a parallel band of strips as 310-1, 310-2, 310-3 and 310-4. Typically one band may include 10 to 40 strips. Typically the strips of the following layer may be oriented perpendicularly as illustrated in FIG. 3A, wherein strips 310 are of metal 6 and strips 308 are of metal 7. In this example the dielectric between metal 6 and metal 7 may include antifuse positions at the crossings between the strips of metal 6 and metal 7. Tile 300 may include 16 of these antifuses. 312-1 may be the antifuse at the cross of strip 310-4 and 308-4. If activated, it may electrically connect strip 310-4 with strip 308-4. FIG. 3A may be made simplified, as the typical tile may include 10-40 strips in each layer and multiplicity of such tiles, which may include the antifuse configurable interconnect structure.

304 may be one of the Y programming transistors connected to strip 310-1. 318 may be one of the X programming transistors connected to strip 308-4 and ground 314. 302 may be the Y select logic which at the programming phase may allow the selection of a Y programming transistor. 316 may be the X select logic which at the programming phase may allow the selection of an X programming transistor. Once 304 and 318 are selected the programming voltage 306 may be applied to strip 310-1 while strip 308-4 may be grounded causing the antifuse 312-4 to be activated.

The term strip in the use herein of, for example, metal interconnect strip, long strips, landing zone strip, may be defined as line segments of metal, for example, copper or aluminum, that may reside in, for example, a transferred layer, a substrate base layer, a monocrystalline layer, and/or a metal layer. The strip or strips may be utilized, for example, for enabling reliable vertical layer-to-layer interconnect and electrical coupling (such as, for example, for TLVs to connect to) and/or for horizontal interconnect and electrical coupling (such as, for example, conventional metal interconnect between circuit elements and devices).

Figure 3B:
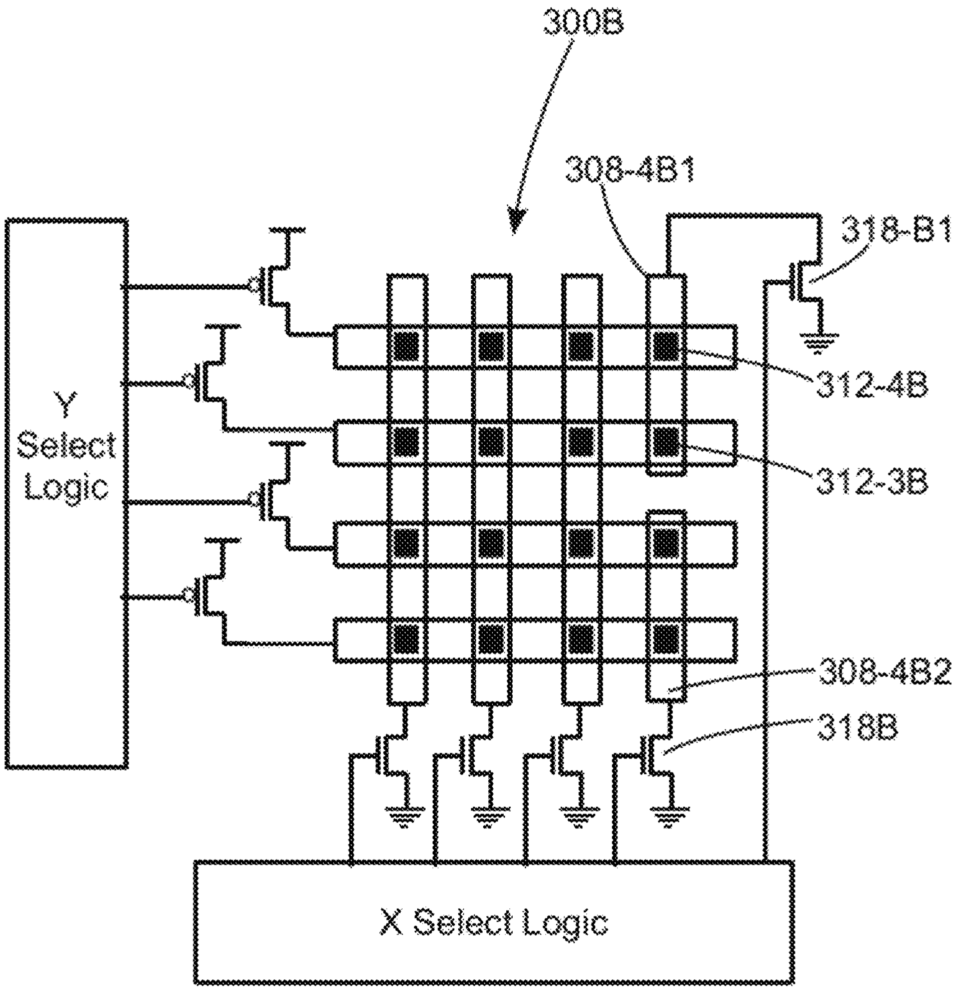
FIG. 3B is an exemplary drawing illustration of a programmable interconnect structure.

FIG. 3B illustrates a programmable interconnect structure 300B. 300B may be a variation of 300A wherein some strips in the band are of a different length. Instead of strip 308-4 in this variation, there may be two shorter strips 308-4B1 and 308-4B2. This might be useful for bringing signals in or out of the programmable interconnect structure 300B in order to reduce the number of strips in the tile, that may be dedicated to bringing signals in and out of the interconnect structure versus strips that may be available to perform the routing. In such variation the programming circuit may need to be augmented to support the programming of antifuses 312-3B and 312-4B.

Unlike the prior art, various embodiments of the present invention suggest constructing the programming transistors not in the base silicon diffusion layer but rather above or below the antifuse configurable interconnect circuits. The programming voltage used to program the antifuse may be typically significantly higher than the voltage used for the operational circuits of the device. This may be part of the design of the antifuse structure so that the antifuse may not become accidentally activated. In addition, extra attention, design effort, and silicon resources might be needed to make sure that the programming phase may not damage the operating circuits. Accordingly the incorporation of the antifuse programming transistors in the silicon substrate may need attention and extra silicon area.

Unlike the operational transistors designed to operate as fast as possible and so to enable fast system performance, the programming circuits could operate relatively slowly. Accordingly, a thin film transistor for the programming circuits could provide the function and could reduce the silicon area.

Alternatively other type of transistors, such as Vacuum FET, bipolar, etc., could be used for the programming circuits and may be placed not in the base silicon but rather above or below the antifuse configurable interconnect.

Yet in another alternative the programming transistors and the programming circuits could be fabricated on SOI wafers which may then be bonded to the configurable logic wafer and connected to it by the use of through-silicon-via (TSV), or through layer via (TLV). An illustrated advantage of using an SOI wafer for the antifuse programming function may be that the high voltage transistors that could be built on it are very efficient and could be used for the programming circuitry including support functions such as the programming controller function. Yet as an additional variation, the programming circuits could be fabricated by an older process on SOI wafers to further reduce cost. Moreover, the programming circuits could be fabricated by a different process technology than the logic wafer process technology. Furthermore, the wafer fab that the programing circuits may be fabricated at may be different than the wafer fab that the logic circuits are fabricated at and located anywhere in the world.

Also there are advanced technologies to deposit silicon or other semiconductors layers that could be integrated on top of the antifuse configurable interconnect for the construction of the antifuse programming circuit. As an example, a recent technology proposed the use of a plasma gun to spray semiconductor grade silicon to form semiconductor structures including, for example, a p-n junction. The sprayed silicon may be doped to the respective semiconductor type. In addition there may be additional techniques which may use graphene and Carbon Nano Tubes (CNT) to perform a semiconductor function. For ease of discussion, the term "Thin-Film-Transistors" may be used as a general name for all those technologies, as well as any similar technologies, known or yet to be discovered.

A common objective may be to reduce cost for high volume production without redesign and with minimal additional mask cost. The use of thin-film-transistors, for the programming transistors, may enable a relatively simple and direct volume cost reduction. Instead of embedding antifuses in the isolation layer a custom mask could be used to define vias on substantially all the locations that used to have their respective antifuse activated. Accordingly the same connection between the strips that used to be programmed may now be connected by fixed vias. This may allow saving the cost associated with the fabrication of the antifuse programming layers and their programming circuits. It should be noted that there might be differences between the antifuse resistance and the mask defined via resistance. A conventional way to handle it may be by providing the simulation models for both options so the designer could validate that the design may work properly in both cases.

An additional objective for having the programming circuits above the antifuse layer may be to achieve better circuit density. Many connections may be needed to connect the programming transistors to their respective metal strips. If those connections are going upward they could reduce the circuit overhead by not blocking interconnection routes on the connection layers underneath.

While FIG. 3A illustrates an interconnection structure of 4×4 strips, the typical interconnection structure may have far more strips and in many cases more than 20×30. For a 20×30 tile there is needed about 20+30=50 programming transistors. The 20×30 tile area is about 20hp×30vp where 'hp' is the horizontal pitch and 'vp' is the vertical pitch. This may result in a relatively large area for the programming transistor of about 12hp×vp (20hp×30vp/50=12hp×vp). Additionally, the area available for each connection between the programming layer and the programmable interconnection fabric may need to be handled. Accordingly, one or two redistribution layers might be needed in order to redistribute the connection within the available area and then bring those connections down, for example, aligned so to create minimum blockage as they are routed to the underlying strip 310 of the programmable interconnection structure.

Figure 4A:
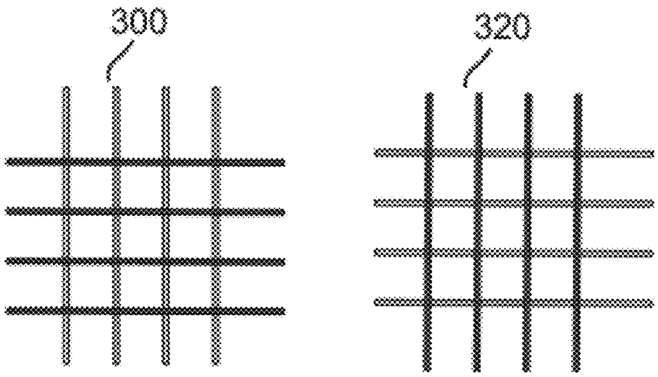
FIG. 4A is an exemplary drawing illustration of a programmable interconnect tile.
Figure 4B:
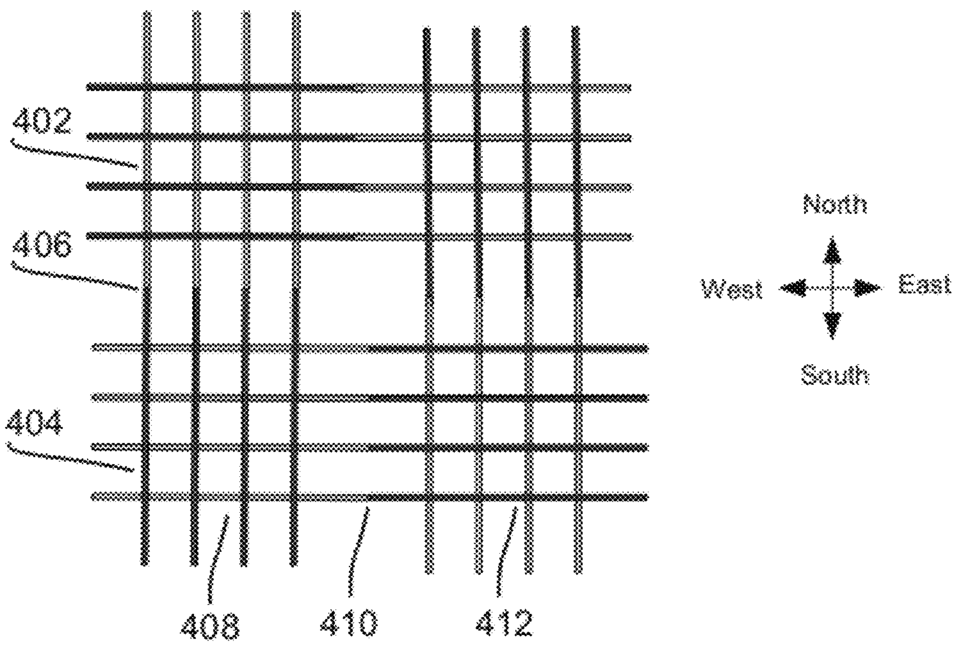
FIG. 4B is an exemplary drawing illustration of a programmable interconnect of 2×2 tiles.

FIG. 4A is a drawing illustration of a programmable interconnect tile 300 and another programmable interface tile 320. As a higher silicon density is achieved it may become desirable to construct the configurable interconnect in the most compact fashion. FIG. 4B is a drawing illustration of a programmable interconnect of 2×2 tiles. It may include checkerboard style of tiles 300 and tiles 320 which is a tile 300 rotated by 90 degrees. For a signal to travel South to North, south to north strips 402 and 404 may need to be connected with antifuses such as 406. 406 and 410 are positioned at the end of a strip such as 402, 404, 408, 412 to allow it to connect to another strip in the same direction. The signal traveling from South to North is alternating from metal 6 to metal 7. Once the direction is in need of a change, an antifuse such as 312-1 may be used.

The configurable interconnection structure function may be used to interconnect the output of logic cells to the input of logic cells to construct the semi-custom logic. The logic cells themselves may be constructed by utilizing the first few metal layers to connect transistors built in the silicon substrate. Usually the metal 1 layer and metal 2 layer may be used for the construction of the logic cells. Sometimes it may be effective to also use metal 3 or a part of it.

Figure 5A:
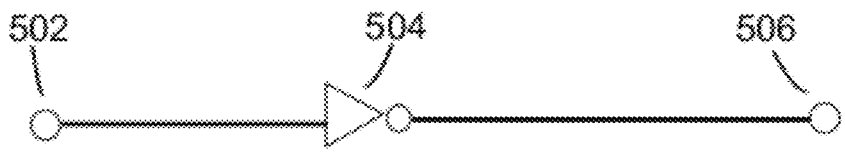
FIG. 5A is an exemplary drawing illustration of an inverter logic cell.

FIG. 5A is a drawing illustration of inverter 504 with an input 502 and an output 506. An inverter may be the simplest logic cell. The input 502 and the output 506 might be connected to strips in the configurable interconnection structure.

Figure 5B:
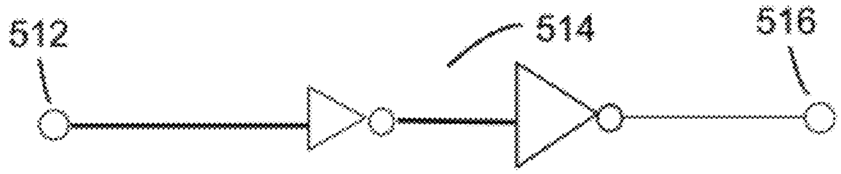
FIG. 5B is an exemplary drawing illustration of a buffer logic cell.

FIG. 5B is a drawing illustration of a buffer 514 with an input 512 and an output 516. The input 512 and the output 516 might be connected to strips in the configurable interconnection structure.

Figure 5C:
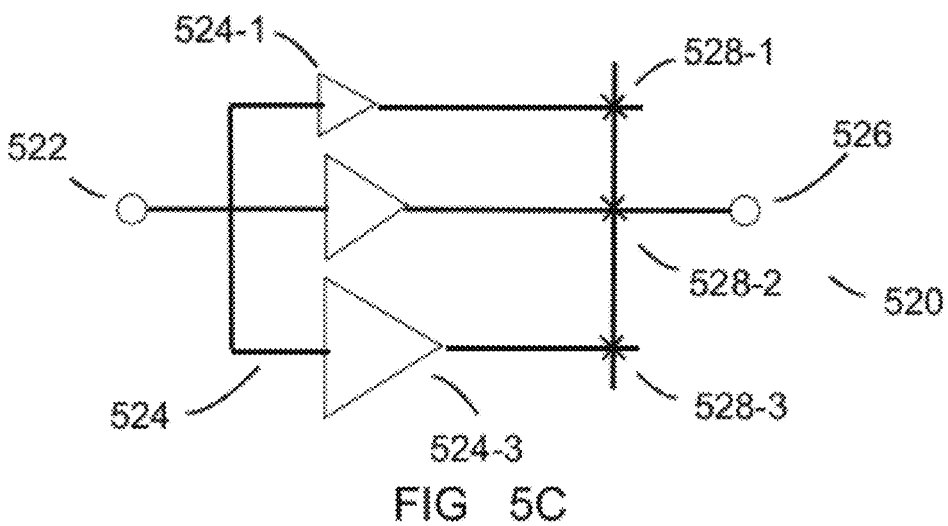
FIG. 5C is an exemplary drawing illustration of a configurable strength buffer logic cell.

FIG. 5C is a drawing illustration of a configurable strength buffer 524 with an input 522 and an output 526, and smallest size buffer 524-1 and largest size buffer 524-3 marked. The input 522 and the output 526 might be connected to strips in the configurable interconnection structure. Configurable strength buffer 524 may be configurable by means of antifuses 528-1, 528-2 and 528-3 constructing an antifuse configurable drive cell.

Figure 5D:
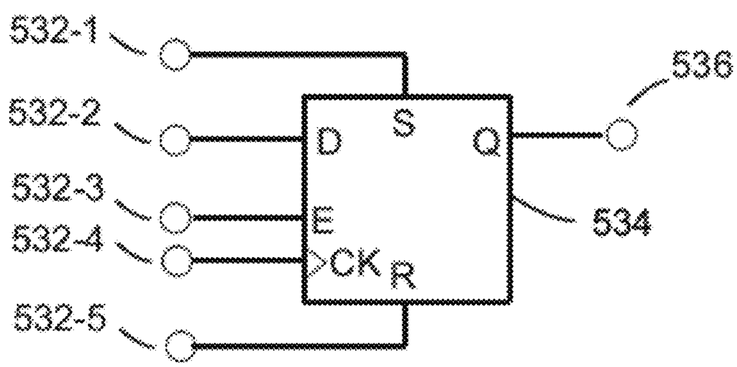
FIG. 5D is an exemplary drawing illustration of a D-Flip Flop logic cell.

FIG. 5D is a drawing illustration of D-Flip Flop 534 with inputs 532-2, and output 536 with control inputs 532-1, 532-3, 532-4 and 532-5. The control signals could be connected to the configurable interconnects or to local or global control signals.

Figure 6:
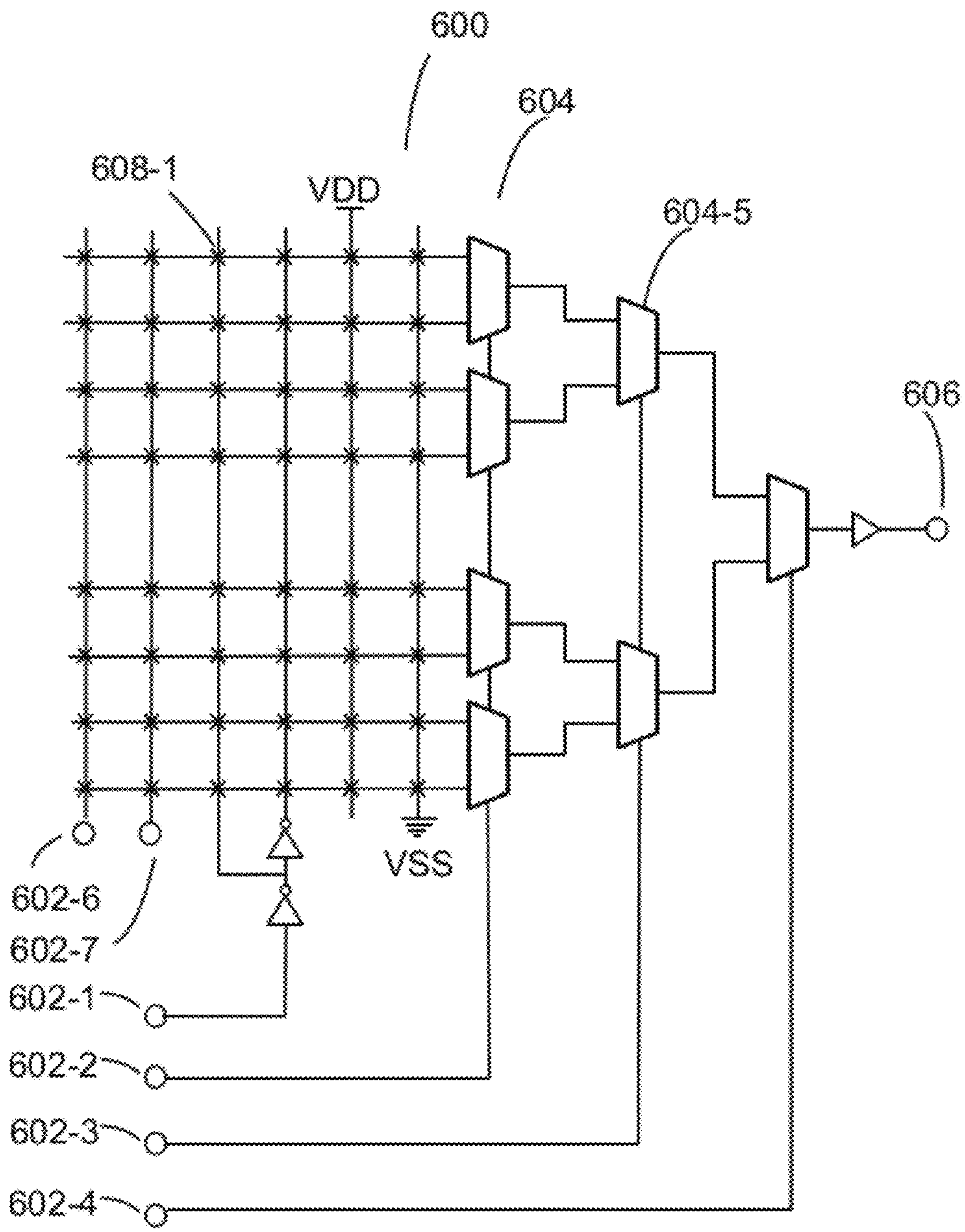
FIG. 6 is an exemplary drawing illustration of a LUT 4 logic cell.

FIG. 6 is a drawing illustration of a LUT 4. LUT4 604 is a well-known logic element in the FPGA art called a 16 bit Look-Up-Table or in short LUT4. LUT4 604 may have 4 inputs 602-1, 602-2, 602-3 and 602-4. LUT4 604 may have an output 606. In general a LUT4 can be programmed to perform any logic function of 4 inputs or less. The LUT function of FIG. 6 may be implemented by 32 antifuses such as 608-1. 604-5 is a two to one multiplexer. The common way to implement a LUT4 in FPGA is by using 16 SRAM bit-cells and 15 multiplexers. The illustration of FIG. 6 demonstrates an antifuse configurable look-up-table implementation of a LUT4 by 32 antifuses and 7 multiplexers. The programmable cell of FIG. 6 may include additional inputs 602-6, 602-7 with an additional 8 antifuses for each input to allow some functionality in addition to just LUT4 functionality.

Figure 6A:
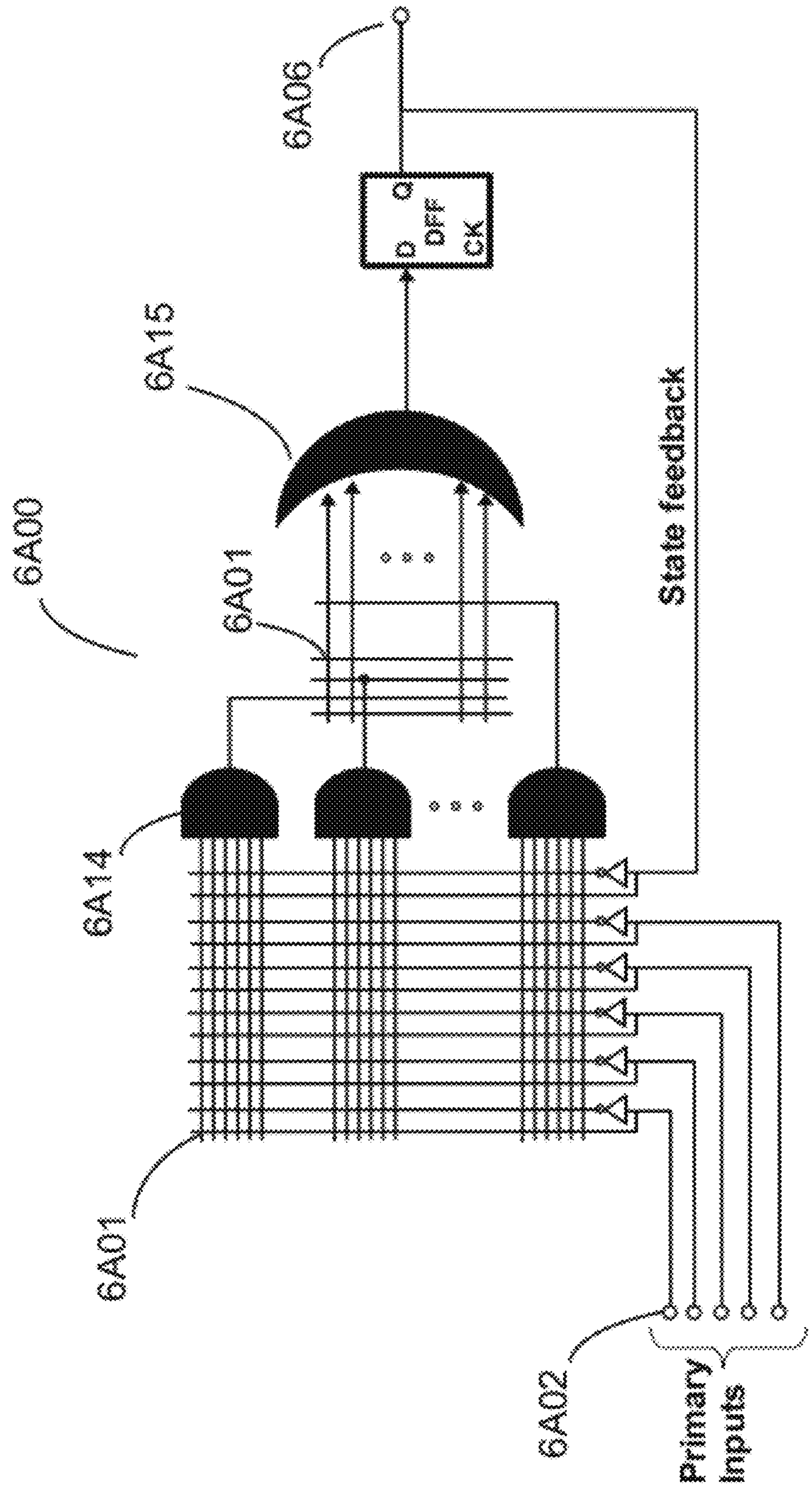
FIG. 6A is an exemplary drawing illustration of a PLA logic cell.

FIG. 6A is a drawing illustration of a PLA logic cell 6A00. PLA logic cells used to be the most popular programmable logic primitive until LUT logic took the leadership. Other acronyms used for this type of logic are PLD and PAL. 6A01 is one of the antifuses that enables the selection of the signal fed to the multi-input AND cell 6A14. In this drawing any cross between vertical line and horizontal line may include an antifuse to allow the connection to be made according to the desired end function. The large AND cell 6A14 may construct the product term by performing the AND function on the selection of inputs 6A02 or the corresponding inverted replicas. A multi-input OR 6A15 may perform the OR function on a selection of those product terms to construct an output 6A06. FIG. 6A illustrates an antifuse configurable PLA logic.

The logic cells presented in FIG. 5, FIG. 6 and FIG. 6A are just representatives. There exist many options for construction of programmable logic fabric including additional logic cells such as AND, MUX and many others, and variations on those cells. Also, in the construction of the logic fabric there might be variation with respect to which of their inputs and outputs may be connected by the configurable interconnect fabric and which of their inputs and outputs may be connected directly in a non-configurable way.

Figure 7:
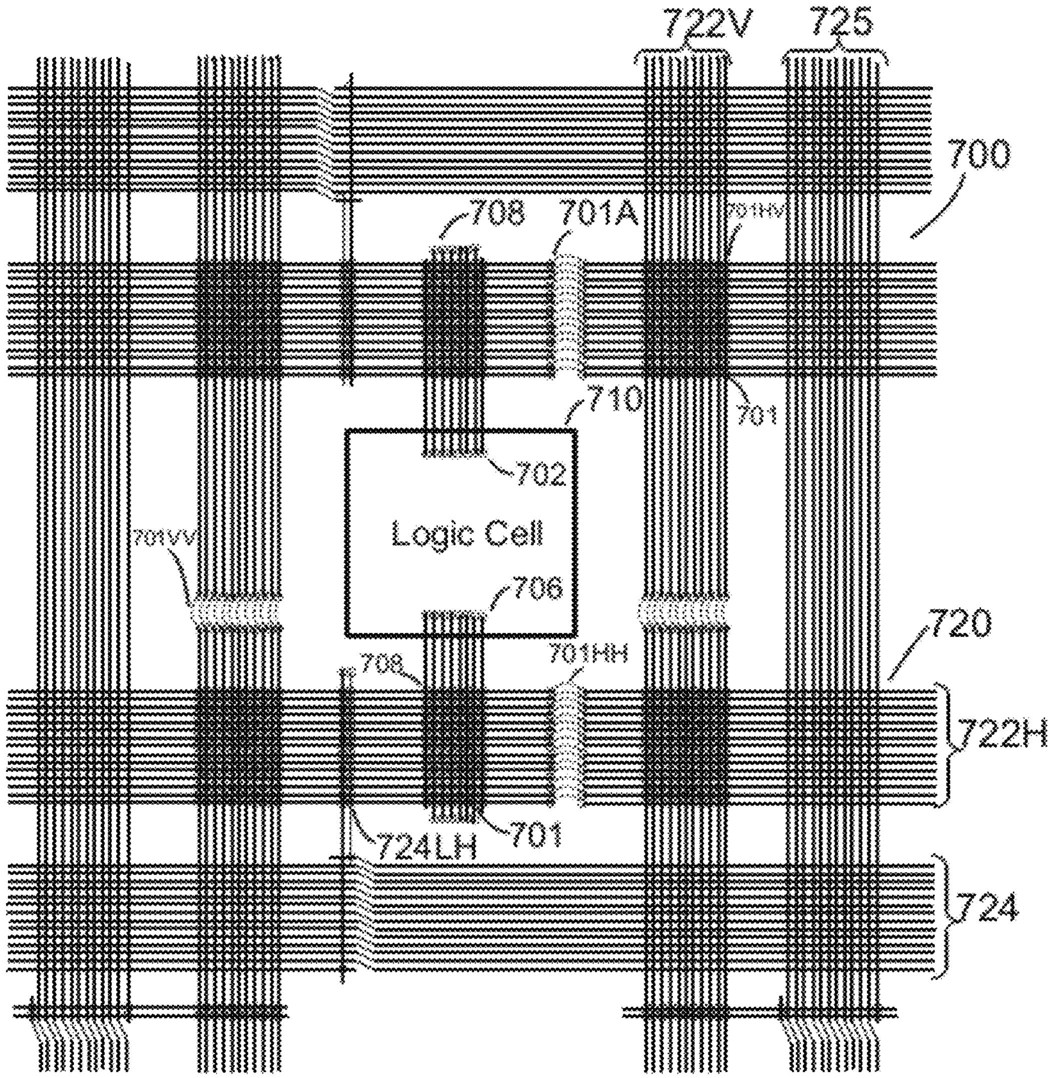
FIG. 7 is an exemplary drawing illustration of a programmable cell.

FIG. 7 is a drawing illustration of a logic programmable cell 700. By tiling such cells a programmable fabric may be constructed. The tiling could be of the same cell being repeated over and over to form a homogenous fabric. Alternatively, a blend of different cells could be tiled for heterogeneous fabric. The logic programmable cell 700 could be any of those presented in FIGS. 5 and 6, a mix and match of the logic cells or other primitives as discussed before. The logic cell 710 inputs 702 and output 706 are connected to the configurable interconnection fabric 720 with input and output strips 708 with associated antifuses 701. The short interconnects may include metal strips about the length of the tile, such as, for example, horizontal strips 722H on one metal layer and vertical strips 722V on another layer, with antifuse 701HV in the cross between the horizontal strips and the vertical strips, to allow selectively connecting horizontal strip to vertical strip. The connection of a horizontal strip to another horizontal strip may be with antifuse 701HH that functions like antifuse 410 of FIG. 4. The connection of a vertical strip to another vertical strip may be with antifuse 701VV that functions like fuse 406 of FIG. 4. The long horizontal strips 724 may be used to route signals that travel a longer distance, usually the length of 8 or more tiles. Usually one strip of the long bundle may have a selective connection by antifuse 724LH to the short strips, and similarly, for the vertical long strips 725. FIG. 7 illustrates the logic programmable cell 700 as a two dimensional illustration. In real life logic programmable cell 700 may be a three dimensional construct where the logic cell 710 may utilize the base silicon with Metal 1, Metal 2, and sometimes Metal 3. The programmable interconnect fabric including the associated antifuses may be constructed on top of it.

Figure 8:
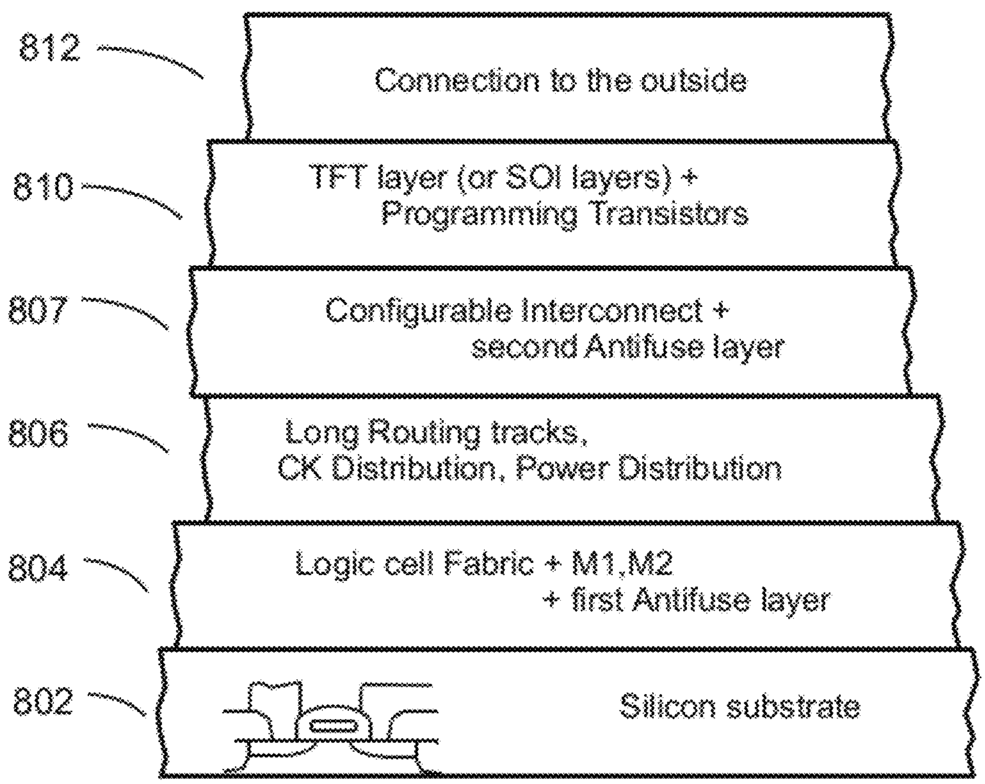
FIG. 8 is an exemplary drawing illustration of a programmable device layers structure.

FIG. 8 is a drawing illustration of a programmable device layers structure according to an alternative embodiment of the invention. In this alternative embodiment, there are two layers including antifuses. The first may be designated to configure the logic terrain and, in some cases, may also configure the logic clock distribution. The first antifuse layer could also be used to manage some of the power distribution to save power by not providing power to unused circuits. This layer could also be used to connect some of the long routing tracks and/or connections to the inputs and outputs of the logic cells.

The device fabrication of the example shown in FIG. 8 may start with the semiconductor substrate, such as monocrystalline silicon substrate 802, comprising the transistors used for the logic cells and also the first antifuse layer programming transistors. Thereafter, logic fabric/first antifuse layer 804 may be constructed, which may include multiple layers, such as Metal 1, dielectric, Metal 2, and sometimes Metal 3. These layers may be used to construct the logic cells and often I/O and other analog cells. In this alternative embodiment of the invention, a plurality of first antifuses may be incorporated in the isolation layer between metal 1 and metal 2 or in the isolation layer between metal 2 and metal 3 and the corresponding programming transistors could be embedded in the silicon substrate 802 being underneath the first antifuses. The first antifuses could be used to program logic cells such as 520, 600 and 700 and to connect individual cells to construct larger logic functions. The first antifuses could also be used to configure the logic clock distribution. The first antifuse layer could also be used to manage some of the power distribution to save power by not providing power to unused circuits. This layer could also be used to connect some of the long routing tracks and/or one or more connections to the inputs and outputs of the cells.

Interconnection layer 806 could include multiple layers of long interconnection tracks for power distribution and clock networks, or a portion thereof, in addition to structures already fabricated in the first few layers, for example, logic fabric/first antifuse layer 804.

Second antifuse layer 807 could include many layers, including the antifuse configurable interconnection fabric. It might be called the short interconnection fabric, too. If metal 6 and metal 7 are used for the strips of this configurable interconnection fabric then the second antifuse may be embedded in the dielectric layer between metal 6 and metal 7.

The programming transistors and the other parts of the programming circuit could be fabricated afterward and be on top of the configurable interconnection fabric programming transistors 810. The programming element could be a thin film transistor or other alternatives for over oxide transistors as was mentioned previously. In such case the antifuse programming transistors may be placed over the antifuse layer, which may thereby enable the configurable interconnect in second antifuse layer 807 or logic fabric/first antifuse layer 804. It should be noted that in some cases it might be useful to construct part of the control logic for the second antifuse programming circuits, in the base layers such as silicon substrate 802 and logic fabric/first antifuse layer 804.

The final step may include constructing the connection to the outside 812. The connection could be pads for wire bonding, soldering balls for flip chip, optical, or other connection structures such as those connection structures for TSV.

In another alternative embodiment of the invention the antifuse programmable interconnect structure could be designed for multiple use. The same structure could be used as a part of the interconnection fabric, or as a part of the PLA logic cell, or as part of a Read Only Memory (ROM) function. In an FPGA product it might be desirable to have an element that could be used for multiple purposes. Having resources that could be used for multiple functions could increase the utility of the FPGA device.

Figure 8A:
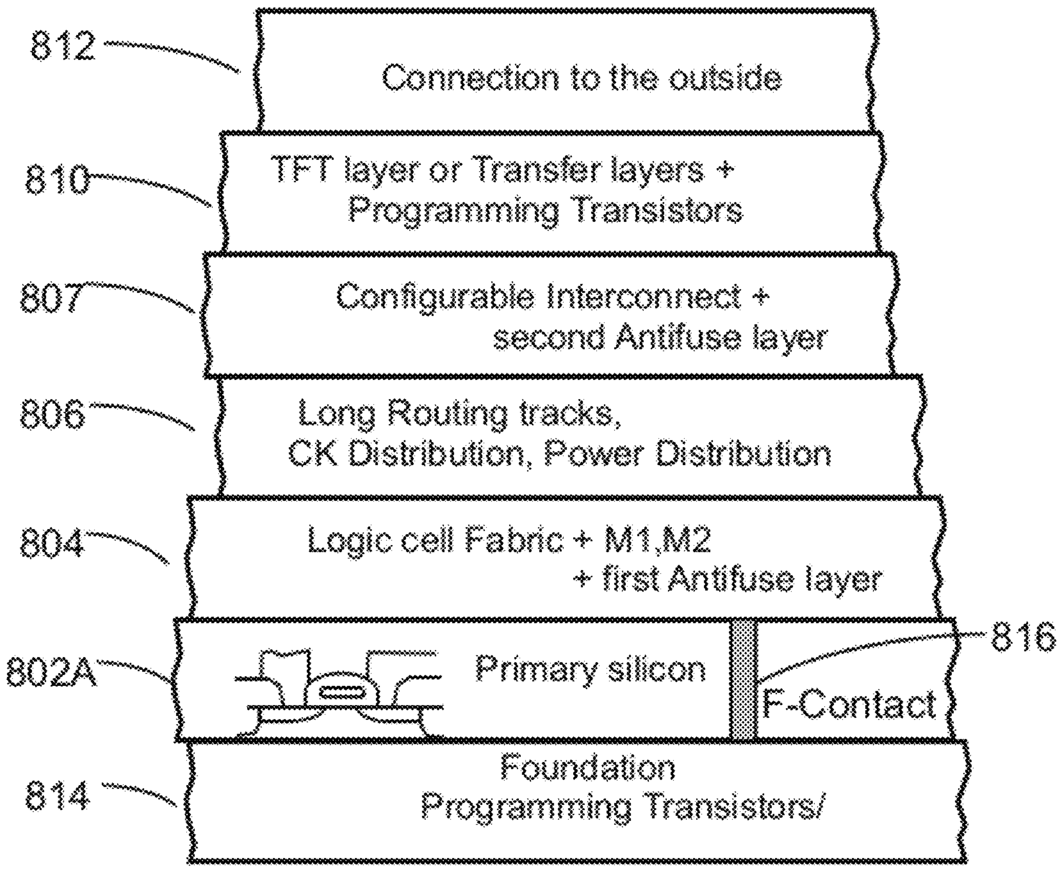
FIG. 8A is an exemplary drawing illustration of a programmable device layers structure.

FIG. 8A is a drawing illustration of a programmable device layers structure according to another alternative embodiment of the invention. In this alternative embodiment, there may be an additional circuit of Foundation layer 814 connected by through silicon via connections 816 to the fabric/first antifuse layer 804 logic or antuifuses. This underlying device of circuit of Foundation layer 814 may provide the programming transistor for the logic fabric/first antifuse layer 804. In this way, the programmable device substrate diffusion, such as primary silicon layer 802A, may not be prone to the cost penalty of the programming transistors for the logic fabric/first antifuse layer 804. Accordingly the programming connection of the logic fabric/first antifuse layer 804 may be directed downward to connect to the underlying programming device of Foundation layer 814 while the programming connection to the second antifuse layer 807 may be directed upward to connect to the programming circuit programming transistors 810. This could provide less congestion of the circuit internal interconnection routes.

FIG. 8A is a cut illustration of a programmable device, with two antifuse layers. The programming transistors for the first logic fabric/first antifuse layer 804 could be prefabricated on Foundation layer 814, and then, utilizing "smart-cut", a single crystal, or mono-crystalline, transferred silicon layer 1404 may be transferred on which the primary programmable logic of primary silicon layer 802A may be fabricated with advanced logic transistors and other circuits. Then multi-metal layers are fabricated including a lower layer of antifuses in logic fabric/first antifuse layer 804, interconnection layer 806 and second antifuse layer 807 with its configurable interconnects. For the second antifuse layer 807 the programming transistors 810 could be fabricated also utilizing a second "smart-cut" layer transfer.

The term layer transfer in the use herein may be defined as the technological process or method that enables the transfer of very fine layers of crystalline material onto a mechanical support, wherein the mechanical support may be another layer or substrate of crystalline material. For example, the "SmartCut" process, also used herein as the term 'ion-cut' process, together with wafer bonding technology, may enable a "Layer Transfer" whereby a thin layer of a single or monocrystalline silicon wafer may be transferred from one wafer or substrate to another wafer or substrate. Other specific layer transfer processes may be described or referenced herein.

The terms monocrystalline or mono-crystalline in the use herein of, for example, monocrystalline or mono-crystalline layer, material, or silicon, may be defined as "a single crystal body of crystalline material that contains no large-angle boundaries or twin boundaries as in ASTM F1241, also called monocrystal" and "an arrangement of atoms in a solid that has perfect periodicity (that is, no defects)" as in the SEMATECH dictionary. The terms single crystal and monocrystal are equivalent in the SEMATECH dictionary. The term single crystal in the use herein of, for example, single crystal silicon layer, single crystal layer, may be equivalently defined as monocrystalline.

The term via in the use herein may be defined as "an opening in the dielectric layer(s) through which a riser passes, or in which the walls are made conductive; an area that provides an electrical pathway [connection path] from one metal layer to the metal layer above or below," as in the SEMAT- ECH dictionary. The term through silicon via (TSV) in the use herein may be defined as an opening in a silicon layer(s) through which an electrically conductive riser passes, and in which the walls are made isolative from the silicon layer; a riser that provides an electrical pathway [connection path] from one metal layer to the metal layer above or below. The term through layer via (TLV) in the use herein may be defined as an opening in a layer transferred layer(s) through which an electrically conductive riser passes, wherein the riser may pass through at least one isolating region, for example, a shallow trench isolation (STI) region in the transferred layer, may typically have a riser diameter of less than 200 nm, a riser that provides an electrical pathway [connection path] from one metal layer to the metal layer above or below. In some cases, a TLV may additionally pass thru an electrically conductive layer, and the walls may be made isolative from the conductive layer.

The reference 808 in subsequent figures can be any one of a vast number of combinations of possible preprocessed wafers or layers containing many combinations of transfer layers that fall within the scope of the invention. The term "preprocessed wafer or layer" may be generic and reference number 808 when used in a drawing figure to illustrate an embodiment of the present invention may represent many different preprocessed wafer or layer types including but not limited to underlying prefabricated layers, a lower layer interconnect wiring, a base layer, a substrate layer, a processed house wafer, an acceptor wafer, a logic house wafer, an acceptor wafer house, an acceptor substrate, target wafer, preprocessed circuitry, a preprocessed circuitry acceptor wafer, a base wafer layer, a lower layer, an underlying main wafer, a foundation layer, an attic layer, or a house wafer.

Figure 8B:
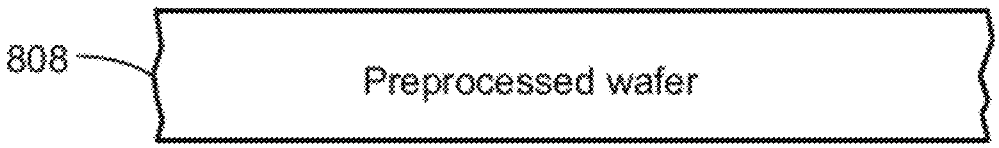
FIG. 8B-I are exemplary drawing illustrations of the preprocessed wafers and layers and generalized layer transfer.

FIG. 8B is a drawing illustration of a generalized preprocessed wafer or layer 808. The wafer or layer 808 may have preprocessed circuitry, such as, for example, logic circuitry, microprocessors, MEMS, circuitry comprising transistors of various types, and other types of digital or analog circuitry including, but not limited to, the various embodiments described herein. Preprocessed wafer or layer 808 may have preprocessed metal interconnects and may include copper or aluminum. The metal layer or layers of interconnect may be constructed of lower (less than about 400° C.) thermal damage resistant metals such as, for example, copper or aluminum, or may be constructed with refractory metals such as tungsten to provide high temperature utility at greater than about 400° C. The preprocessed metal interconnects may be designed and prepared for layer transfer and electrical coupling from preprocessed wafer or layer 808 to the layer or layers to be transferred.

Figure 8C:
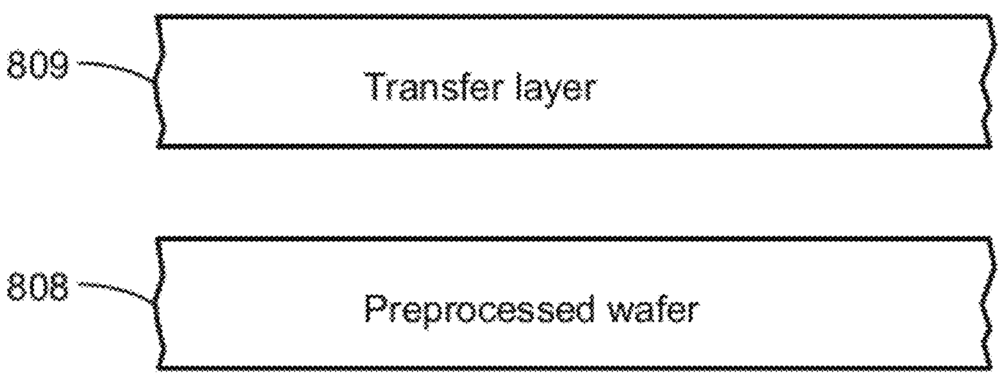

FIG. 8C is a drawing illustration of a generalized transfer layer 809 prior to being attached to preprocessed wafer or layer 808. Transfer layer 809 may be attached to a carrier wafer or substrate during layer transfer. Preprocessed wafer or layer 808 may be called a target wafer, acceptor substrate, or acceptor wafer. The acceptor wafer may have acceptor wafer metal connect pads or strips designed and prepared for electrical coupling to transfer layer 809. Transfer layer 809 may be attached to a carrier wafer or substrate during layer transfer. Transfer layer 809 may have metal interconnects designed and prepared for layer transfer and electrical coupling to preprocessed wafer or layer 808. The metal interconnects now on transfer layer 809 may include copper or aluminum. Electrical coupling from transferred layer 809 to preprocessed wafer or layer 808 may utilize through layer vias (TLVs) as the connection path. Transfer layer 809 may be comprised of single crystal silicon, or mono-crystalline silicon, or doped mono-crystalline layer or layers, or other semiconductor, metal, and insulator materials, layers; or multiple regions of single crystal silicon, or mono-crystalline silicon, or doped mono-crystalline silicon, or other semiconductor, metal, or insulator materials.

Figure 8D:
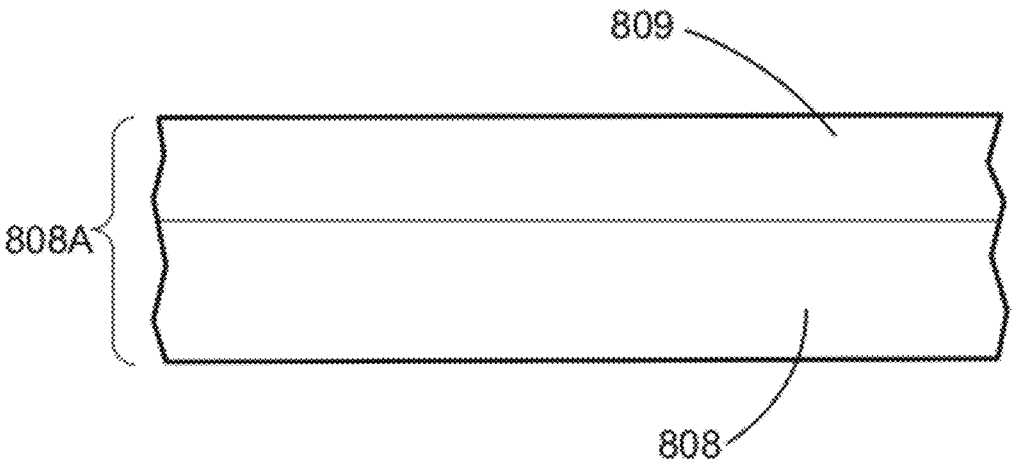

FIG. 8D is a drawing illustration of a preprocessed wafer or layer 808A created by the layer transfer of transfer layer 809 on top of preprocessed wafer or layer 808. The top of preprocessed wafer or layer 808A may be further processed with metal interconnects designed and prepared for layer transfer and electrical coupling from preprocessed wafer or layer 808A to the next layer or layers to be transferred.

Figure 8E:
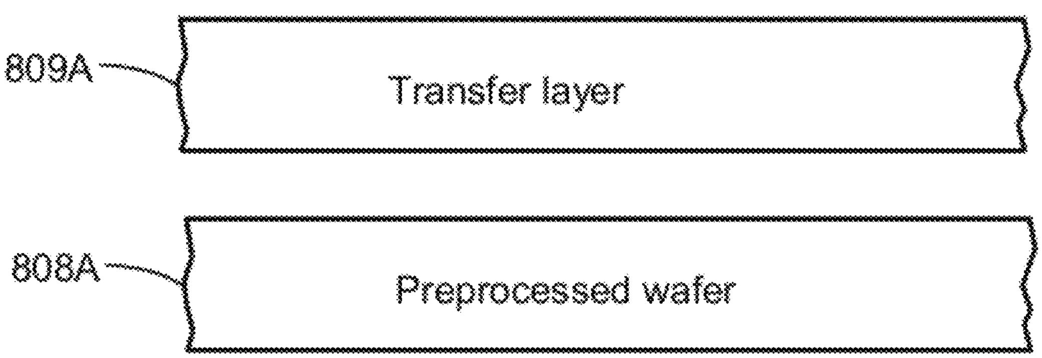

FIG. 8E is a drawing illustration of a generalized transfer layer 809A prior to being attached to preprocessed wafer or layer 808A. Transfer layer 809A may be attached to a carrier wafer or substrate during layer transfer. Transfer layer 809A may have metal interconnects designed and prepared for layer transfer and electrical coupling to preprocessed wafer or layer 808A.

Figure 8F:
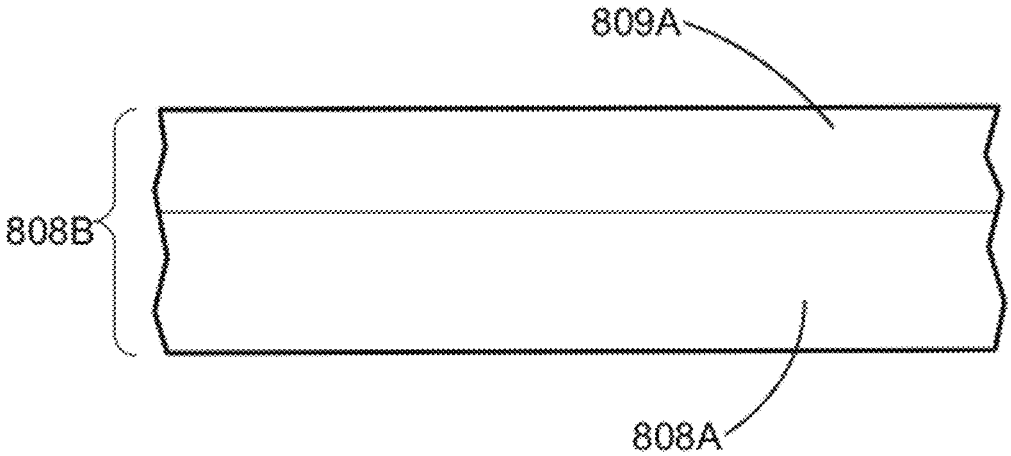

FIG. 8F is a drawing illustration of a preprocessed wafer or layer 808B created by the layer transfer of transfer layer 809A on top of preprocessed wafer or layer 808A. The top of preprocessed wafer or layer 808B may be further processed with metal interconnects designed and prepared for layer transfer and electrical coupling from preprocessed wafer or layer 808B to the next layer or layers to be transferred.

Figure 8G:
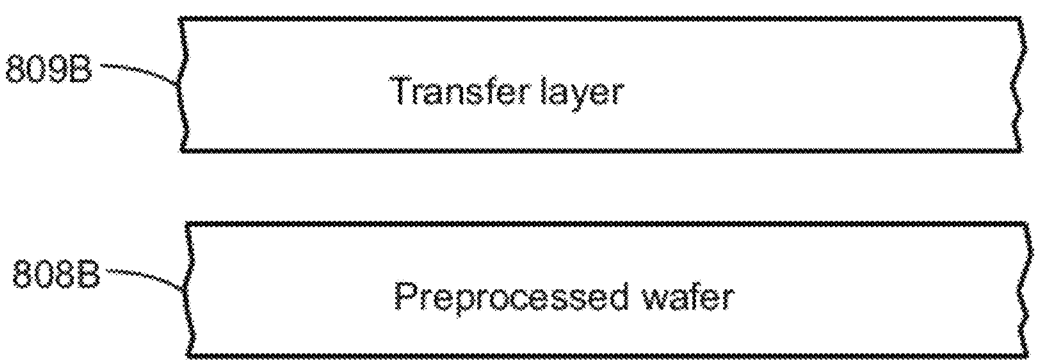

FIG. 8G is a drawing illustration of a generalized transfer layer 809B prior to being attached to preprocessed wafer or layer 808B. Transfer layer 809B may be attached to a carrier wafer or substrate during layer transfer. Transfer layer 809B may have metal interconnects designed and prepared for layer transfer and electrical coupling to preprocessed wafer or layer 808B.

Figure 8H:

FIG. 8H is a drawing illustration of preprocessed wafer or layer 808C created by the layer transfer of transfer layer 809B on top of preprocessed wafer or layer 808B. The top of preprocessed wafer or layer 808C may be further processed with metal interconnect designed and prepared for layer transfer and electrical coupling from preprocessed wafer or layer 808C to the next layer or layers to be transferred.

Figure 8I:
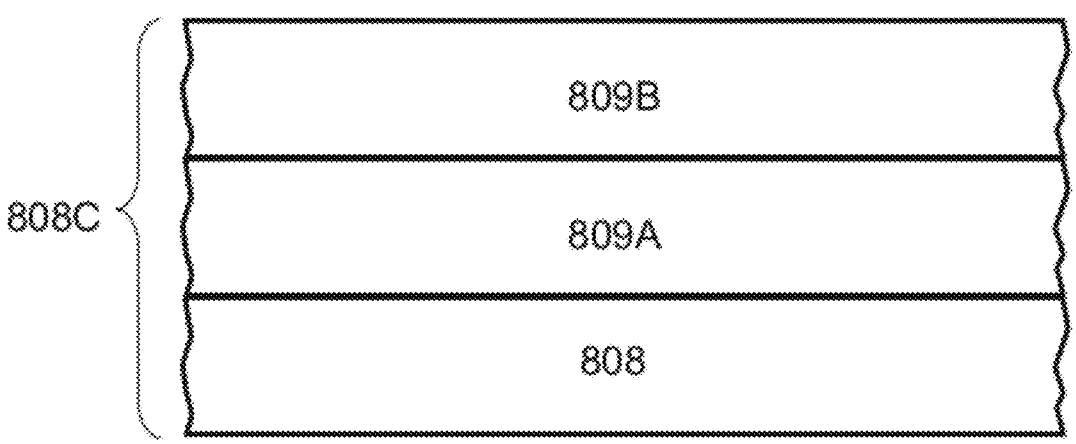

FIG. 8I is a drawing illustration of preprocessed wafer or layer 808C, a 3D IC stack, which may comprise transferred layers 809A and 809B on top of the original preprocessed wafer or layer 808. Transferred layers 809A and 809B and the original preprocessed wafer or layer 808 may include transistors of one or more types in one or more layers, metallization such as, for example, copper or aluminum in one or more layers, interconnections to and between layers above and below, and interconnections within the layer. The transistors may be of various types that may be different from layer to layer or within the same layer. The transistors may be in various organized patterns. The transistors may be in various pattern repeats or bands. The transistors may be in multiple layers involved in the transfer layer. The transistors may be junction-less transistors or recessed channel array transistors. Transferred layers 809A and 809B and the original preprocessed wafer or layer 808 may further comprise semiconductor devices such as resistors and capacitors and inductors, one or more programmable interconnects, memory structures and devices, sensors, radio frequency devices, or optical interconnect with associated transceivers. Transferred layers 809A and 809B and the original preprocessed wafer or layer 808 may further include isolation layers, such as, for example, silicon and/or carbon containing oxides and/or low-k dielectrics and/or polymers, which may facilitate oxide to oxide wafer or substrate bonding and may electrically isolate, for example, one layer, such as transferred layer 809A, from another layer, such as preprocessed wafer or layer 808. The terms carrier wafer or carrier substrate may also be called holder wafer or holder substrate. The terms carrier wafer or substrate used herein may be a wafer, for example, a monocrystalline silicon wafer, or a substrate, for example, a glass substrate, used to hold, flip, or move, for example, other wafers, layers, or substrates, for further processing. The attachment of the carrier wafer or substrate to the carried wafer, layer, or substrate may be permanent or temporary.

This layer transfer process can be repeated many times, thereby creating preprocessed wafers comprising many different transferred layers which, when combined, can then become preprocessed wafers or layers for future transfers. This layer transfer process may be sufficiently flexible that preprocessed wafers and transfer layers, if properly prepared, can be flipped over and processed on either side with further transfers in either direction as a matter of design choice.

The thinner the transferred layer, the smaller the through layer via (TLV) diameter obtainable, due to the potential limitations of manufacturable via aspect ratios. Thus, the transferred layer may be, for example, less than about 2 microns thick, less than about 1 micron thick, less than about 0.4 microns thick, less than about 200 nm thick, or less than about 100 nm thick. The TLV diameter may be less than about 400 nm, less than about 200 nm, less than about 80 nm, less than about 40 nm, or less than about 20 nm. The thickness of the layer or layers transferred according to some embodiments of the present invention may be designed as such to match and enable the best obtainable lithographic resolution capability of the manufacturing process employed to create the through layer vias or any other structures on the transferred layer or layers.

In many of the embodiments of the invention, the layer or layers transferred may be of a crystalline material, for example, mono-crystalline silicon, and after layer transfer, further processing, such as, for example, plasma/RIE or wet etching, may be done on the layer or layers that may create islands or mesas of the transferred layer or layers of crystalline material, for example, mono-crystalline silicon, the crystal orientation of which has not changed. Thus, a mono-crystalline layer or layers of a certain specific crystal orientation may be layer transferred and then processed whereby the resultant islands or mesas of mono-crystalline silicon have the same crystal specific orientation as the layer or layers before the processing. After this processing, the resultant islands or mesas of crystalline material, for example, mono-crystalline silicon, may be still referred to herein as a layer, for example, mono-crystalline layer, layer of mono-crystalline silicon, and so on.

Persons of ordinary skill in the art will appreciate that the illustrations in FIGS. 8 through 8I are exemplary only and are not drawn to scale. Such skilled persons will further appreciate that many variations may be possible such as, for example, the preprocessed wafer or layer 808 may act as a base or substrate layer in a wafer transfer flow, or as a preprocessed or partially preprocessed circuitry acceptor wafer in a wafer transfer process flow. Moreover, layer transfer techniques, such as 'ion-cut' that may form a layer transfer demarcation plane by ion implantation of hydrogen molecules or atoms, or any other layer transfer technique described herein or utilized in industry, may be utilized in the generalized FIG. 8 flows and applied throughout herein. Furthermore, metal interconnect strips may be formed on the acceptor wafer and/or transferred layer to assist the electrical coupling of circuitry between the two layers, and may utilize TLVs. Many other modifications within the scope of the illustrated embodiments of the invention described herein will suggest themselves to such skilled persons after reading this specification. Thus the invention is to be limited only by the appended claims.

A technology for such underlying circuitry may be to use the "SmartCut" process. The "SmartCut" process is a well understood technology used for fabrication of SOI wafers. The "SmartCut" process, together with wafer bonding technology, may enable a "Layer Transfer" whereby a thin layer of a single or mono-crystalline silicon wafer may be transferred from one wafer to another wafer. The "Layer Transfer" could be done at less than about 400° C. and the resultant transferred layer could be even less than about 100 nm thick. The transferred layer thickness may typically be about 100 nm, and may be a thin as about 5 nm in currently demonstrated fully depleted SOI (FDSOI) wafer manufacturing by Soitec. In most applications described herein in this invention the transferred layer thickness may be less than about 400 nm and may be less than about 200 nm for logic applications. The process with some variations and under different names may be commercially available by two companies, namely, Soitec (Crolles, France) and SiGen—Silicon Genesis Corporation (San Jose, Calif.). A room temperature wafer bonding process utilizing ion-beam preparation of the wafer surfaces in a vacuum has been recently demonstrated by Mitsubishi Heavy Industries Ltd., Tokyo, Japan. This process may allow for room temperature layer transfer.

Alternatively, other technology may also be used. For example, other technologies may be utilized for layer transfer as described in, for example, IBM's layer transfer method shown at IEDM 2005 by A. W. Topol, et. al. The IBM's layer transfer method employs a SOI technology and utilizes glass handle wafers. The donor circuit may be high-temperature processed on an SOI wafer, temporarily bonded to a borosilicate glass handle wafer, backside thinned by chemical mechanical polishing of the silicon and then the Buried Oxide (BOX) is selectively etched off. The now thinned donor wafer may be subsequently aligned and low-temperature oxide-to-oxide bonded to the acceptor wafer topside. A low temperature release of the glass handle wafer from the thinned donor wafer may be performed, and then through bond via connections may be made. Additionally, epitaxial liftoff (ELO) technology as shown by P. Demeester, et. al, of IMEC in Semiconductor Science Technology 1993 may be utilized for layer transfer. ELO may make use of the selective removal of a very thin sacrificial layer between the substrate and the layer structure to be transferred. The to-be-transferred layer of GaAs or silicon may be adhesively 'rolled' up on a cylinder or removed from the substrate by utilizing a flexible carrier, such as, for example, black wax, to bow up the to-be-transferred layer structure when the selective etch, such as, for example, diluted Hydrofluoric (HF) Acid, may etch the exposed release layer, such as, for example, silicon oxide in SOI or AlAs. After liftoff, the transferred layer may then be aligned and bonded to the acceptor substrate or wafer. The manufacturability of the ELO process for multilayer layer transfer use was recently improved by J. Yoon, et. al., of the University of Illinois at Urbana-Champaign as described in Nature May 20, 2010. Canon developed a layer transfer technology called ELTRAN—Epitaxial Layer TRANsfer from porous silicon. ELTRAN may be utilized. The Electrochemical Society Meeting abstract No. 438 from year 2000 and the JSAP International July 2001 paper show a seed wafer being anodized in an HF/ethanol solution to create pores in the top layer of silicon, the pores may be treated with a low temperature oxidation and then high temperature hydrogen annealed to seal the pores. Epitaxial silicon may then be deposited on top of the porous silicon and then oxidized to form the SOI BOX. The seed wafer may be bonded to a handle wafer and the seed wafer may be split off by high pressure water directed at the porous silicon layer. The porous silicon may then be selectively etched off leaving a uniform silicon layer.

Figure 14:
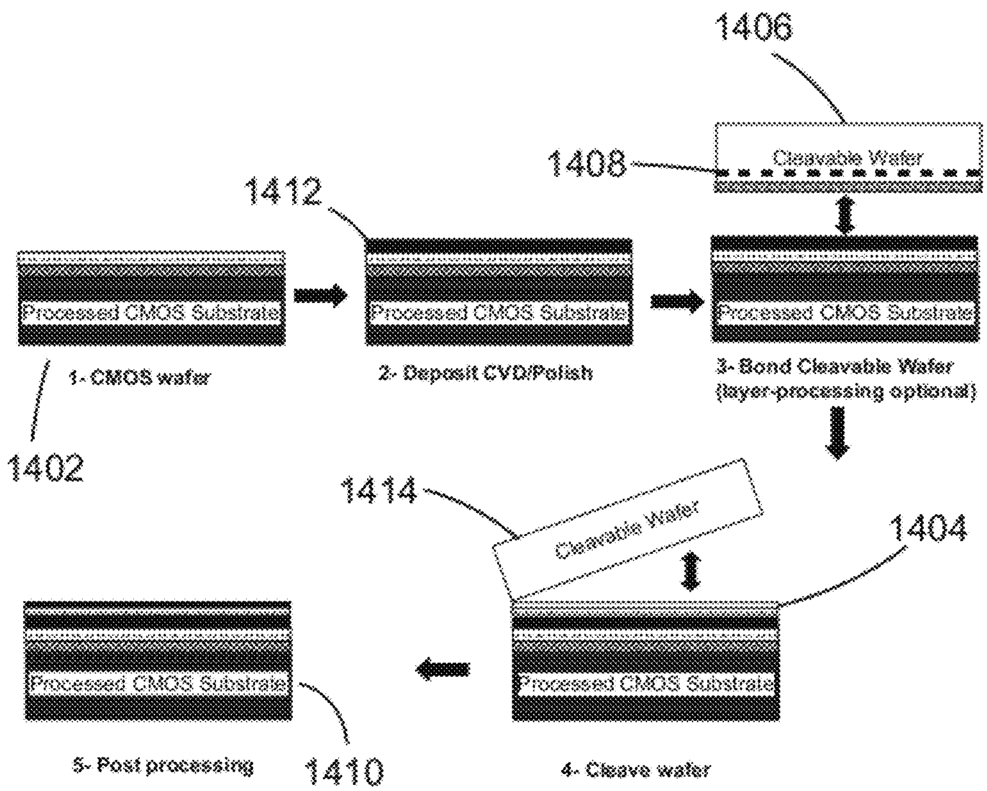
FIG. 14 is an exemplary drawing illustration of a layer transfer process flow.

FIG. 14 is a drawing illustration of a layer transfer process flow. In another illustrative embodiment of the invention, "Layer-Transfer" may be used for construction of the underlying circuitry of Foundation layer 814. Wafer 1402 may include a monocrystalline silicon wafer that was processed to construct the underlying circuitry. The wafer 1402 could be of the most advanced process or more likely a few generations behind. It could include the programming circuits of Foundation layer 814 and other useful structures and may be a preprocessed CMOS silicon wafer, or a partially processed CMOS, or other prepared silicon or semiconductor substrate. Wafer 1402 may also be called an acceptor substrate or a target wafer. An oxide layer 1412 may then be deposited on top of the wafer 1402 and thereafter may be polished for better planarization and surface preparation. A donor wafer 1406 may then be brought in to be bonded to wafer 1402. The surfaces of both donor wafer 1406 and wafer 1402 may be pre-processed for low temperature bonding by various surface treatments, such as an RCA pre-clean that may comprise dilute ammonium hydroxide or hydrochloric acid, and may include plasma surface preparations to lower the bonding energy and enhance the wafer to wafer bond strength. The donor wafer 1406 may be pre-prepared for "SmartCut" by an ion implant of an atomic species, such as H+ ions, at the desired depth to prepare the SmartCut line 1408. SmartCut line 1408 may also be called a layer transfer demarcation plane, shown as a dashed line. The SmartCut line 1408 or layer transfer demarcation plane may be formed before or after other processing on the donor wafer 1406. Donor wafer 1406 may be bonded to wafer 1402 by bringing the donor wafer 1406 surface in physical contact with the wafer 1402 surface, and then applying mechanical force and/or thermal annealing to strengthen the oxide to oxide bond. Alignment of the donor wafer 1406 with the wafer 1402 may be performed immediately prior to the wafer bonding. Acceptable bond strengths may be obtained with bonding thermal cycles that do not exceed about 400° C. After bonding the two wafers a SmartCut step may be performed to cleave and remove the top portion 1414 of the donor wafer 1406 along the SmartCut line 1408. The cleaving may be accomplished by various applications of energy to the SmartCut line 1408, or layer transfer demarcation plane, such as a mechanical strike by a knife or jet of liquid or jet of air, or by local laser heating, by application of ultrasonic or megasonic energy, or other suitable methods. The result may be a 3D wafer 1410 which may include wafer 1402 with a transferred silicon layer 1404 of monocrystalline silicon, or multiple layers of materials. Transferred silicon layer 1404 may be polished chemically and mechanically to provide a suitable surface for further processing. Transferred silicon layer 1404 could be quite thin at the range of about 50-200 nm. The described flow may be called "layer transfer". Layer transfer may be commonly utilized in the fabrication of SOI—Silicon On Insulator—wafers. For SOI wafers the upper surface may be oxidized so that after "layer transfer" a buried oxide—BOX—may provide isolation between the top thin mono-crystalline silicon layer and the bulk of the wafer. The use of an implanted atomic species, such as Hydrogen or Helium or a combination, to create a cleaving plane as described above may be referred to in this document as "SmartCut" or "ion-cut" and may be generally the illustrated layer transfer method.

Persons of ordinary skill in the art will appreciate that the illustrations in FIG. 14 are exemplary only and are not drawn to scale. Such skilled persons will further appreciate that many variations may be possible such as, for example, a heavily doped (greater than 1e20 atoms/cm3) boron layer or silicon germanium (SiGe) layer may be utilized as an etch stop either within the ion-cut process flow, wherein the layer transfer demarcation plane may be placed within the etch stop layer or into the substrate material below, or the etch stop layers may be utilized without an implant cleave process and the donor wafer may be, for example, etched away until the etch stop layer is reached. Such skilled persons will further appreciate that the oxide layer within an SOI or GeOI donor wafer may serve as the etch stop layer, and hence one edge of the oxide layer may function as a layer transfer demarcation plane. Moreover, the dose and energy of the implanted specie or species may be uniform across the surface area of the wafer or may have a deliberate variation, including, for example, a higher dose of hydrogen at the edges of a monocrystalline silicon wafer to promote cleaving. Many other modifications within the scope of the illustrated embodiments of the invention will suggest themselves to such skilled persons after reading this specification. Thus the invention is to be limited only by the appended claims.

Now that a "layer transfer" process may be used to bond a thin mono-crystalline silicon layer transferred silicon layer 1404 on top of the preprocessed wafer 1402, a standard process could ensue to construct the rest of the desired circuits as illustrated in FIG. 8A, starting with primary silicon layer 802A on the transferred silicon layer 1404. The lithography step may use alignment marks on wafer 1402 so the following circuits of primary silicon layer 802A and logic fabric/first antifuse layer 804 and so forth could be properly connected to the underlying circuits of Foundation layer 814. An aspect that should be accounted for is the high temperature that may be needed for the processing of circuits of primary silicon layer 802A. The pre-processed circuits on wafer 1402 may need to withstand this high temperature associated with the activation of the semiconductor transistors of primary silicon layer 802A fabricated on the transferred silicon layer 1404. Those circuits on wafer 1402 may include transistors and local interconnects of poly-crystalline silicon (polysilicon or poly) and some other type of interconnection that could withstand high temperature such as tungsten. A processed wafer that can withstand subsequent processing of transistors on top at high temperatures may be a called the "Foundation" or a foundation wafer, layer or circuitry. An illustrated advantage of using layer transfer for the construction of the underlying circuits may include having the transferred silicon layer 1404 be very thin which may enable the through silicon via connections 816, or through layer vias (TLVs), to have low aspect ratios and be more like normal contacts, which could be made very small and with minimum area penalty. The thin transferred layer may also allow conventional direct through-layer alignment techniques to be performed, thus increasing the density of through silicon via connections 816.

Figure 15:
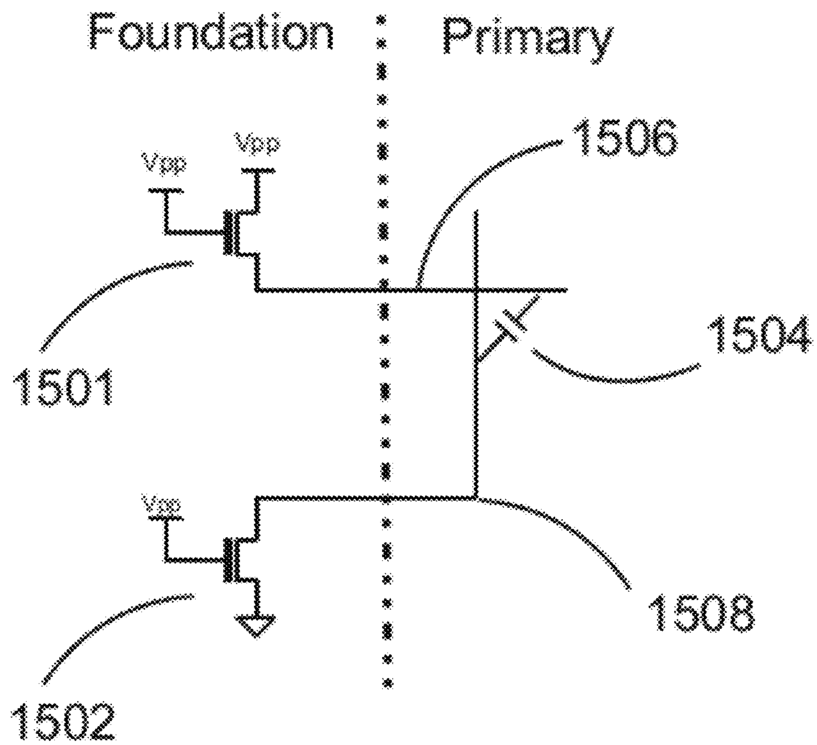
FIG. 15 is an exemplary drawing illustration of an underlying programming circuits.

FIG. 15 is a drawing illustration of an underlying programming circuit. Programming Transistors 1501 and 1502 may be pre-fabricated on the foundation wafer 1402 and then the programmable logic circuits and the antifuse 1504 may be built on the transferred silicon layer 1404. The programming connections 1506, 1508 may be connected to the programming transistors by contact holes through transferred silicon layer 1404 as illustrated in FIG. 8A by through silicon via connections 816. The programming transistors may be designed to withstand the relatively higher programming voltage for the antifuse 1504 programming.

Figure 16:
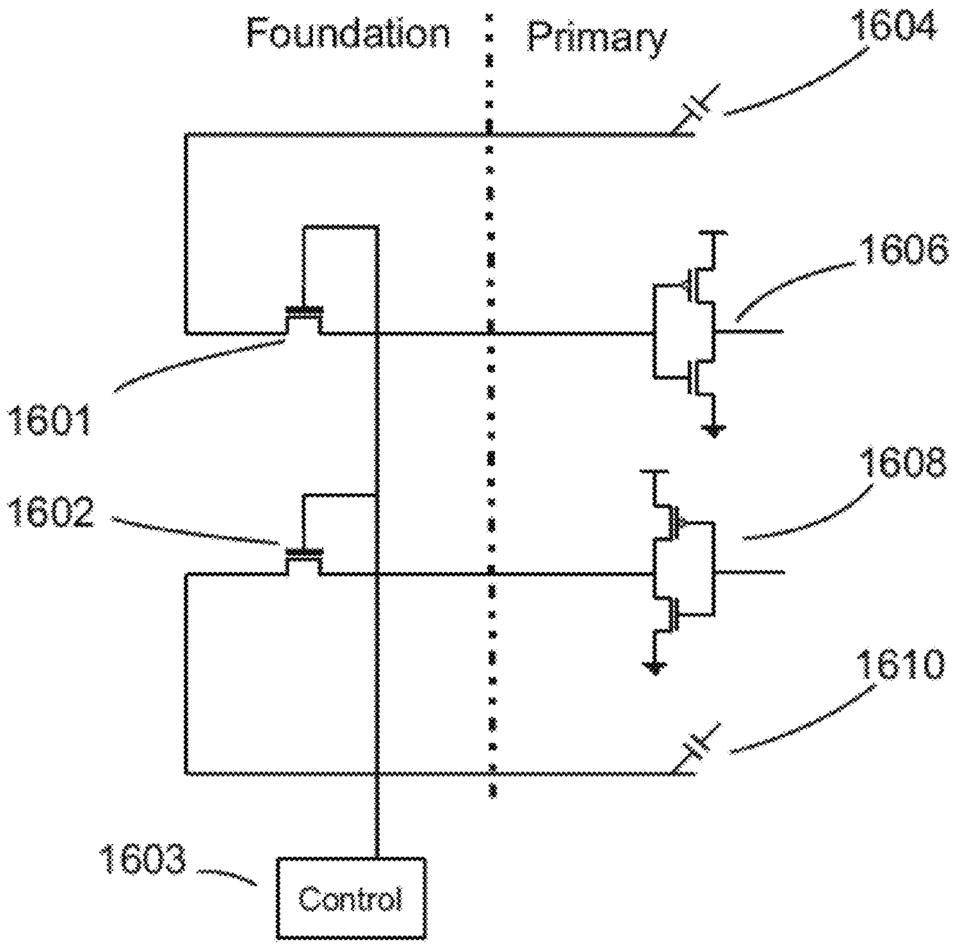
FIG. 16 is an exemplary drawing illustration of an underlying isolation transistors circuits.

FIG. 16 is a drawing illustration of an underlying isolation transistor circuit. The higher voltage used to program antifuse 1604 or antifuse 1610 might damage the logic transistors 1606, 1608. To protect the logic circuits, isolation transistors 1601, 1602, designed to withstand higher voltage, may be used. The higher programming voltage may be only used at the programming phase at which time the isolation transistors may be turned off by the control circuit 1603. The underlying wafer 1402 could also be used to carry the isolation transistors. Having the relatively large programming transistors and isolation transistor on the foundation silicon wafer 1402 may allow far better use of the primary silicon layer 802A (1404). Usually the primary silicon may be built in an advanced process to provide high density and performance. The foundation silicon wafer 1402 could be built in a less advanced process to reduce costs and support the higher voltage transistors. It could also be built with other than CMOS transistors such as Double Diffused Metal Oxide Semiconductor (DMOS) or bi-polar junction transistors when such transistor may be, for example, advantageous for the programming and the isolation function. In many cases there may be a need to have protection diodes for the gate input that may be called Antennas. Such protection diodes could be also effectively integrated in the foundation alongside the input related Isolation Transistors. On the other hand the isolation transistors 1601, 1602 would provide the protection for the antenna effect so no additional diodes would be needed.

An additional alternative embodiment of the invention is where the foundation wafer 1402 layer may be pre-processed to carry a plurality of back bias voltage generators. A known challenge in advanced semiconductor logic devices may be die-to-die and within-a-die parameter variations. Various sites within the die might have different electrical characteristics due to dopant variations and such. The parameters that can affect the variation may include the threshold voltage of the transistor. Threshold voltage variability across the die may be mainly due to channel dopant, gate dielectric, and critical dimension variability. This variation may become profound in sub 45 nm node devices. The usual implication may be that the design should be done for the worst case, resulting in a quite significant performance penalty. Alternatively complete new designs of devices are being proposed to solve this variability problem with significant uncertainty in yield and cost. A possible solution may be to use localized back bias to drive upward the performance of the worst zones and allow better overall performance with minimal additional power. The foundation-located back bias could also be used to minimize leakage due to process variation.

Figure 17A:
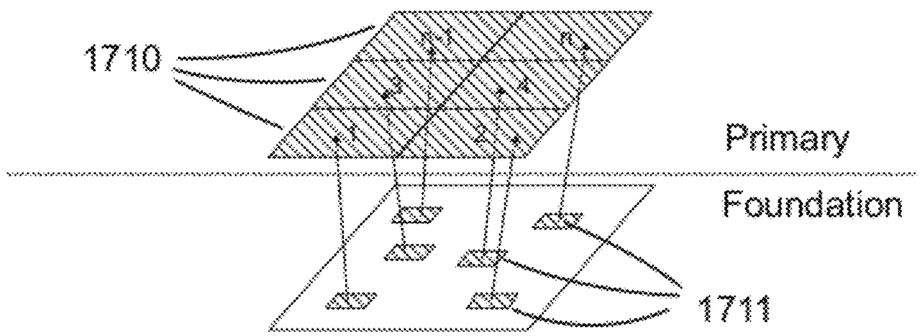
FIG. 17A is an exemplary topology drawing illustration of underlying back bias circuitry.

FIG. 17A is a topology drawing illustration of back bias circuitry. The foundation wafer 1402 layer may carry back bias circuits 1711 to allow enhancing the performance of some of the zones 1710 on the primary device which otherwise will have lower performance.

Figure 17B:
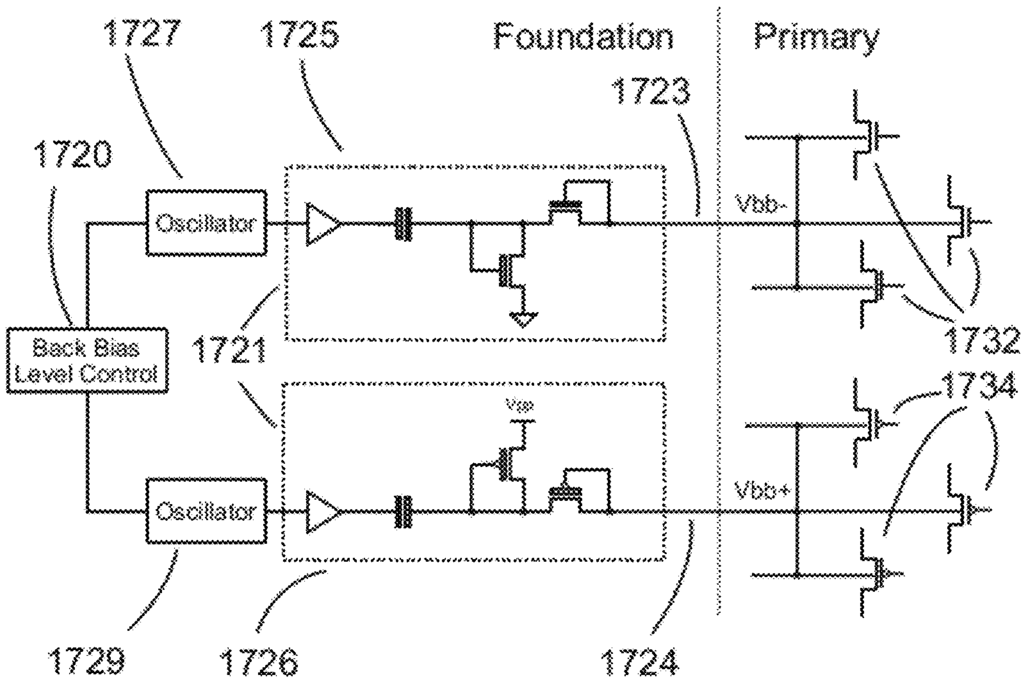
FIG. 17B is an exemplary drawing illustration of underlying back bias circuits.

FIG. 17B is a drawing illustration of back bias circuits. A back bias level control circuit 1720 may be controlling the oscillators 1727 and 1729 to drive the voltage generators 1721. The negative voltage generator 1725 may generate the desired negative bias which may be connected to the primary circuit by connection 1723 to back bias the N-channel Metal-Oxide-Semiconductor (NMOS) transistors 1732 on the primary silicon transferred silicon layer 1404. The positive voltage generator 1726 may generate the desired negative bias which may be connected to the primary circuit by connection 1724 to back bias the P-channel Metal-Oxide-Semiconductor (PMOS) transistors 1734 on the primary silicon transferred silicon layer 1404. The setting of the proper back bias level per zone may be done in the initiation phase. It could be done by using external tester and controller or by on-chip self test circuitry. As an example, a non volatile memory may be used to store the per zone back bias voltage level so the device could be properly initialized at power up. Alternatively a dynamic scheme could be used where different back bias level(s) are used in different operating modes of the device. Having the back bias circuitry in the foundation allows better utilization of the primary device silicon resources and less distortion for the logic operation on the primary device.

Figure 17C:
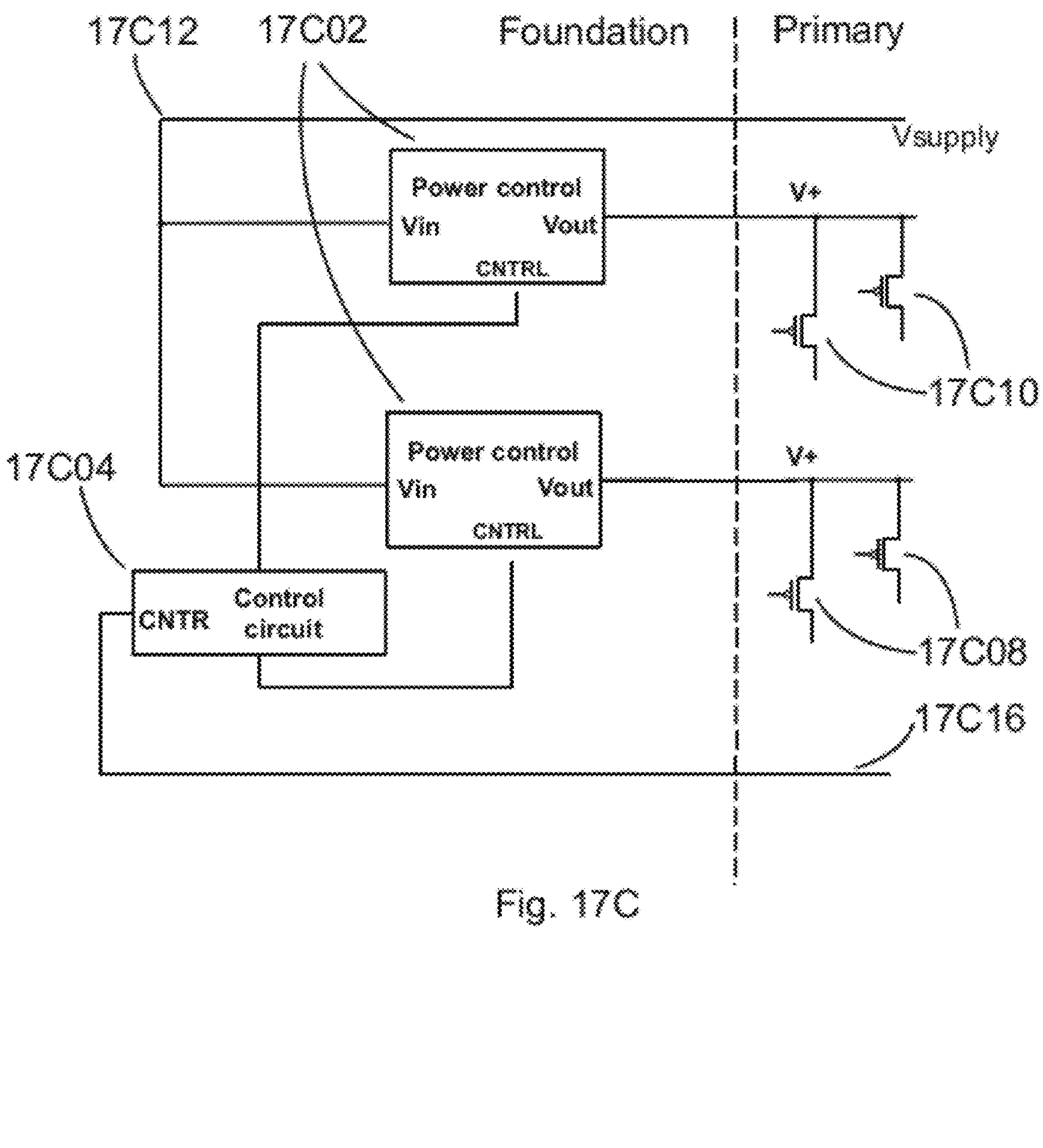
FIG. 17C is an exemplary drawing illustration of power control circuits.

FIG. 17C illustrates an alternative circuit function that may fit well in the "Foundation." In many IC designs it may be desired to integrate power control to reduce either voltage to sections of the device or to substantially totally power off these sections when those sections may not be needed or in an almost 'sleep' mode. In general such power control may be best done with higher voltage transistors. Accordingly a power control circuit cell 17C02 may be constructed in the Foundation. Such power control circuit cell 17C02 may have its own higher voltage supply and control or regulate supply voltage for sections 17C10 and 17C08 in the "Primary" device. The control may come from the primary device 17C16 and be managed by control circuit 17C04 in the Foundation.

Figure 17D:
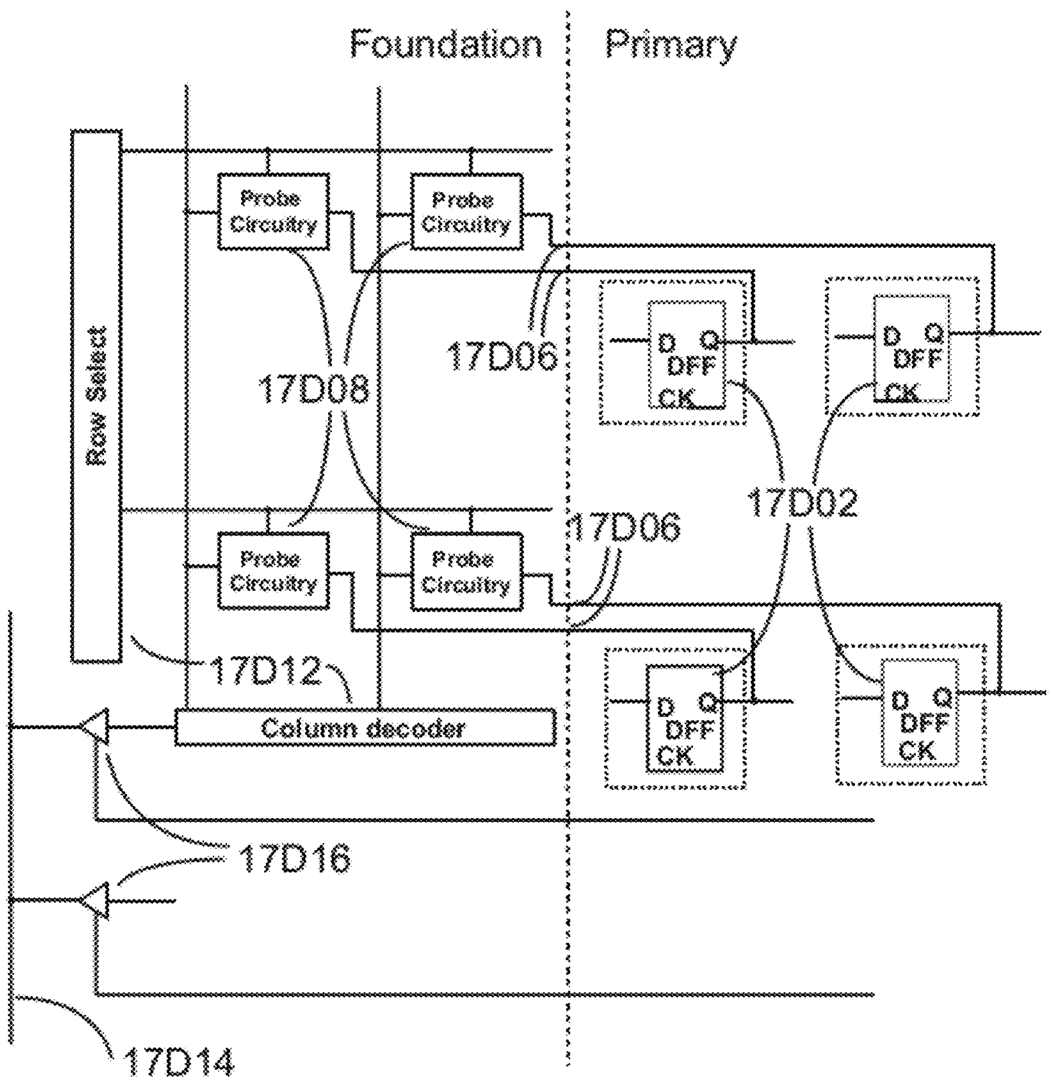
FIG. 17D is an exemplary drawing illustration of probe circuits.

FIG. 17D illustrates an alternative circuit function that may fit well in the "Foundation." In many IC designs it may be desired to integrate a probe auxiliary system that may make it very easy to probe the device in the debugging phase, and to support production testing. Probe circuits have been used in the prior art sharing the same transistor layer as the primary circuit. FIG. 17D illustrates a probe circuit constructed in the Foundation underneath the active circuits in the primary layer. FIG. 17D illustrates that the connections are made to the sequential active circuit elements 17D02. Those connections may be routed to the Foundation through interconnect lines 17D06 where high impedance probe circuits 17D08 may be used to sense the sequential element output. A selector circuit 17D12 may allow one or more of those sequential outputs to be routed out through one or more buffers 17D16 which may be controlled by signals from the Primary circuit to supply the drive of the sequential output signal to the probe output signal 17D14 for debugging or testing. Persons of ordinary skill in the art will appreciate that other configurations are possible like, for example, having multiple groups of probe circuits 17D08, multiple probe output signals 17D14, and controlling buffers 17D16 with signals not originating in the primary circuit.

Figure 18:
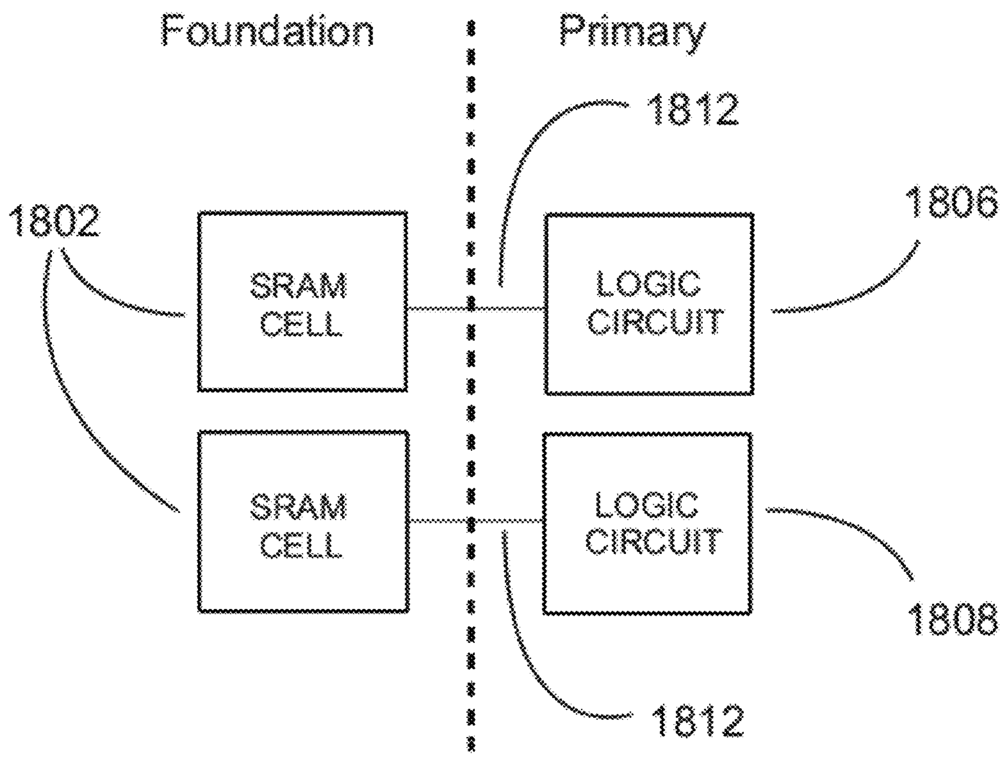
FIG. 18 is an exemplary drawing illustration of an underlying SRAM.

In another alternative the foundation substrate wafer 1402 could additionally carry SRAM cells as illustrated in FIG. 18. The SRAM cells 1802 pre-fabricated on the underlying substrate wafer 1402 could be connected 1812 to the primary logic circuit 1806, 1808 built on transferred silicon layer 1404. As mentioned before, the layers built on transferred silicon layer 1404 could be aligned to the pre-fabricated structure on the underlying substrate wafer 1402 so that the logic cells could be properly connected to the underlying RAM cells.

Figure 19A:
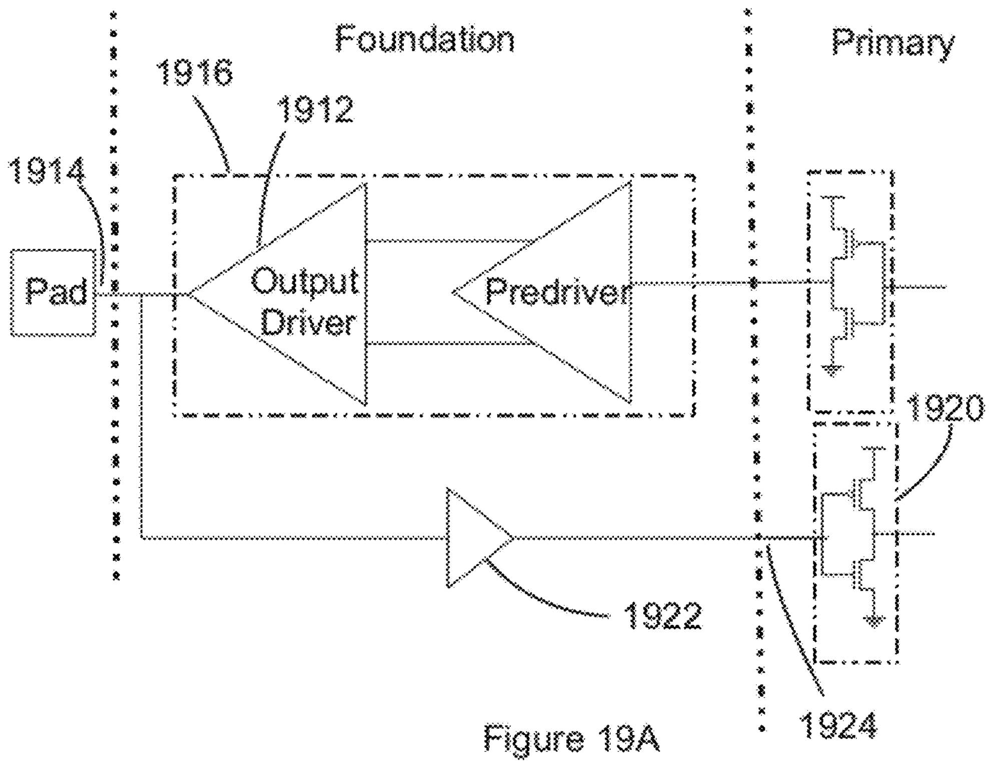
FIG. 19A is an exemplary drawing illustration of an underlying I/O.
Figure 19B:
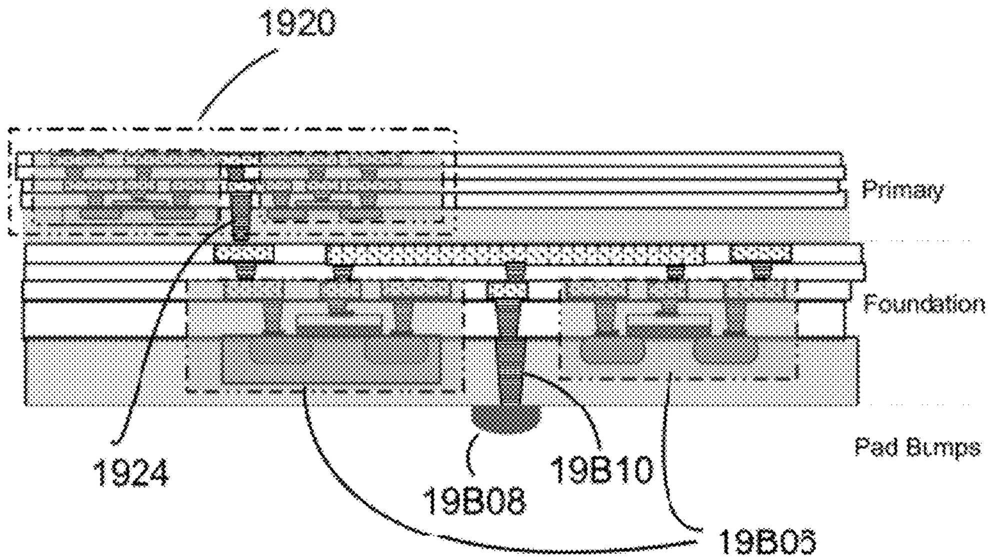
FIG. 19B is an exemplary drawing illustration of side "cut"

FIG. 19A is a drawing illustration of an underlying I/O. The foundation wafer 1402 could also be preprocessed to carry the I/O circuits or part of it, such as the relatively large transistors of the output drive 1912. Additionally TSV in the foundation could be used to bring the I/O connection 1914 all the way to the back side of the foundation. FIG. 19B is a drawing illustration of a side "cut" of an integrated device according to an embodiment of the present invention. The Output Driver may be illustrated by PMOS and NMOS output transistors 19B06 coupled through TSV 19B10 to connect to a backside pad or pad bump 19B08. The connection material used in the foundation wafer 1402 can be selected to withstand the temperature of the following process constructing the full device on transferred silicon layer 1404 as illustrated in FIG. 8A—802, 804, 806, 807, 810, 812, such as tungsten. The foundation could also carry the input protection circuit 1916 connecting the pad or pad bump 19B08 to the primary silicon circuitry, such as input logic 1920, in the primary circuits or buffer 1922.

An additional embodiment may use TSVs in the foundation such as TSV 19B10 to connect between wafers to form 3D Integrated Systems. In general each TSV may take a relatively large area, typically a few square microns. When the need is for many TSVs, the overall cost of the area for these TSVs might be high if the use of that area for high density transistors is substantially precluded. Pre-processing these TSVs on the donor wafer on a relatively older process line may significantly reduce the effective costs of the 3D TSV connections. The connection 1924 to the primary silicon circuitry, such as input logic 1920, could be then made at the minimum contact size of few tens of square nanometers, which may be two orders of magnitude lower than the few square microns needed by the TSVs. Those of ordinary skill in the art will appreciate that FIG. 19B is for illustration only and is not drawn to scale. Such skilled persons will understand there are many alternative embodiments and component arrangements that could be constructed using the inventive principles shown and that FIG. 19B is not limiting in any way.

Figure 19C:
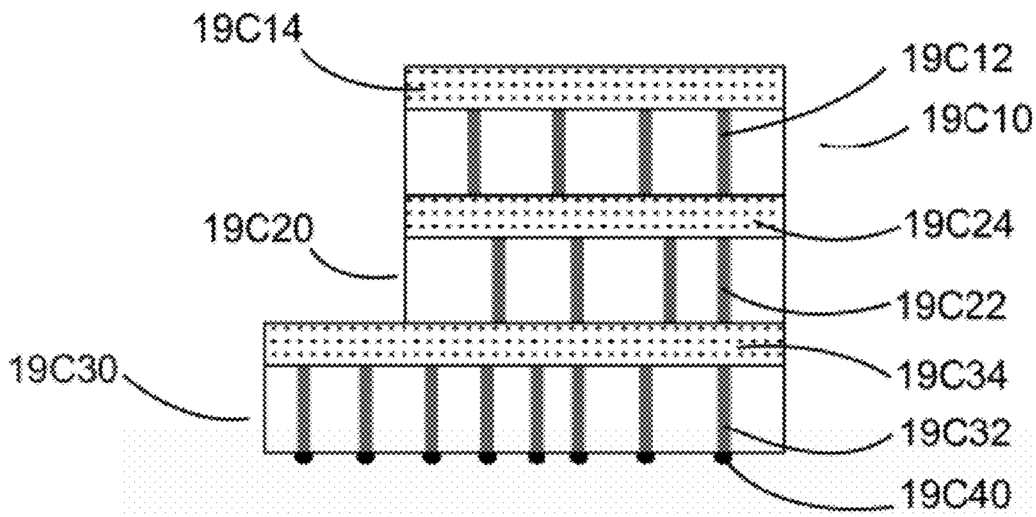
FIG. 19C is an exemplary drawing illustration of a 3D IC system.

FIG. 19C demonstrates a 3D system including three dice 19C10, 19C20 and 19C30 coupled together with TSVs 19C12, 19C22 and 19C32 similar to TSV 19B10 as described in association with FIG. 19A. The stack of three dice may utilize TSV in the Foundations 19C12, 19C22, and 19C32 for the 3D interconnect which may allow for minimum effect or silicon area loss of the Primary silicon 19C14, 19C24 and 19C34 connected to their respective Foundations with minimum size via connections. The three die stacks may be connected to a PC Board using bumps 19C40 connected to the bottom die TSVs 19C32. Those of ordinary skill in the art will appreciate that FIG. 19C is for illustration only and is not drawn to scale. Such skilled persons will understand there are many alternative embodiments and component arrangements that could be constructed using the inventive principles shown and that FIG. 19C is not limiting in any way. For example, a die stack could be placed in a package using flip chip bonding or the bumps 19C40 could be replaced with bond pads and the part flipped over and bonded in a conventional package with bond wires.

Figure 19D:
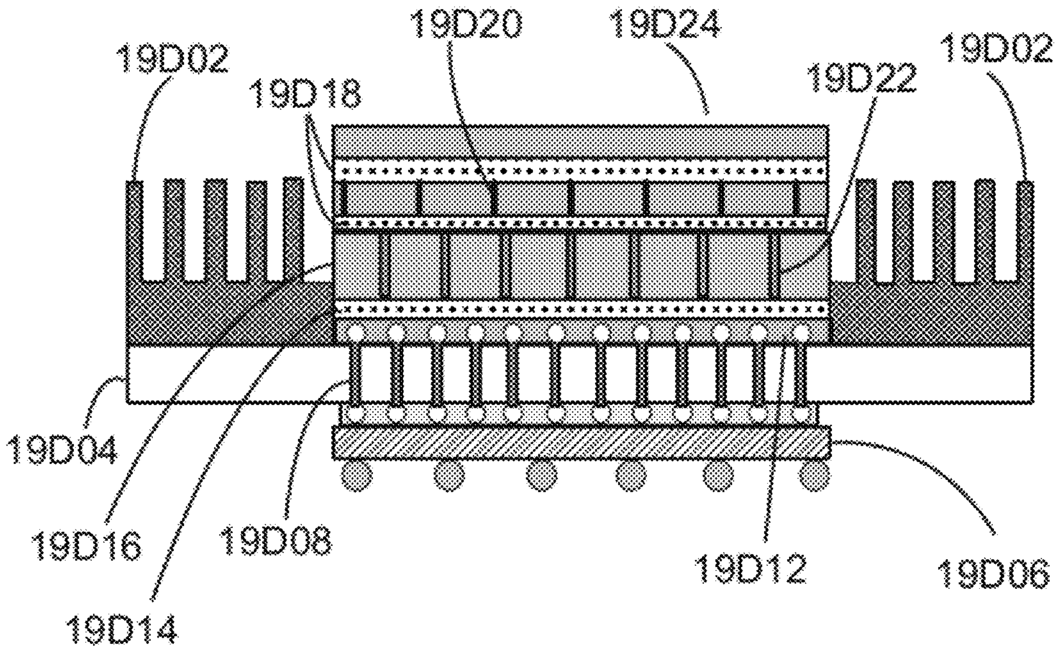
FIG. 19D is an exemplary drawing illustration of a 3D IC processor and DRAM system.

FIG. 19D illustrates a 3D IC processor and DRAM system. A well known problem in the computing industry is the "memory wall" that may relate to the speed the processor can access the DRAM. The prior art proposed solution was to connect a DRAM stack using TSV directly on top of the processor and use a heat spreader attached to the processor back to remove the processor heat. But in order to do so, a special via needs to go "through DRAM" so that the processor I/Os and power could be connected. Having many processor-related 'through-DRAM vias" may lead to a few severe potential disadvantages. First, it may reduce the usable silicon area of the DRAM by a few percent. Second, it may increase the power overhead by a few percent. Third, it may require that the DRAM design be coordinated with the processor design which may be very commercially challenging. The embodiment of FIG. 19D illustrates one solution to mitigate the above mentioned disadvantages by having a foundation with TSVs as illustrated in FIGS. 19B and 19C. The use of the foundation and primary structure may enable the connections of the processor without going through the DRAM.

In FIG. 19D the processor I/Os and power may be coupled from the face-down microprocessor active area 19D14—the primary layer, by vias 19D08 through heat spreader substrate 19D04 to an interposer 19D06. Heat spreader 19D12, heat spreader substrate 19D04, and heat sink 19D02 may be used to spread the heat generated on the microprocessor active area 19D14. TSVs 19D22 through the Foundation 19D16 may be used for the connection of the DRAM stack 19D24. The DRAM stack may include multiple thinned DRAM chips 19D18 interconnected by TSV 19D20. Accordingly the DRAM stack may not need to pass through the processor I/O and power planes and could be designed and produced independent of the processor design and layout. The thinned DRAM chip 19D18 substantially closest to the Foundation 19D16 may be designed to connect to the Foundation TSVs 19D22, or a separate ReDistribution Layer (or RDL, not shown) may be added in between, or the Foundation 19D16 could serve that function with preprocessed high temperature interconnect layers, such as Tungsten, as described previously. And the processor's active area may not be compromised by having TSVs through it as those are done in the Foundation 19D16.

Alternatively the Foundation TSVs 19D22 could be used to pass the processor I/O and power to the heat spreader substrate 19D04 and to the interposer 19D06 while the DRAM stack would be coupled directly to the microprocessor active area 19D14. Persons of ordinary skill in the art will appreciate that many more combinations are possible within the scope of the disclosed embodiments illustrating the invention.

Figure 19E:
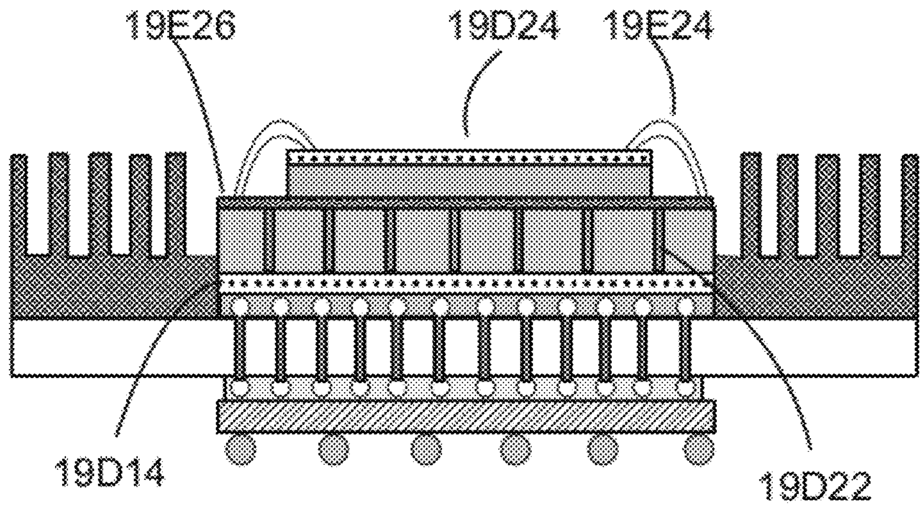
FIG. 19E is an exemplary drawing illustration of a 3D IC processor and DRAM system.

FIG. 19E illustrates another embodiment of the present invention wherein the DRAM stack 19D24 may be coupled by wire bonds 19E24 to an RDL (ReDistribution Layer) 19E26 that may couple the DRAM to the Foundation vias 19D22, and thus may couple them to the face-down microprocessor active area 19D14.

Figure 19F:
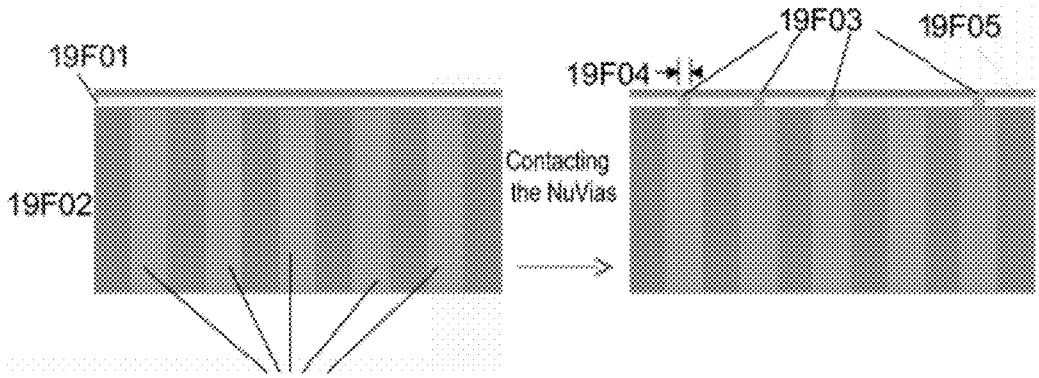
FIG. 19F is an exemplary drawing illustration of a custom SOI wafer used to build through-silicon connections.
Figure 19G:
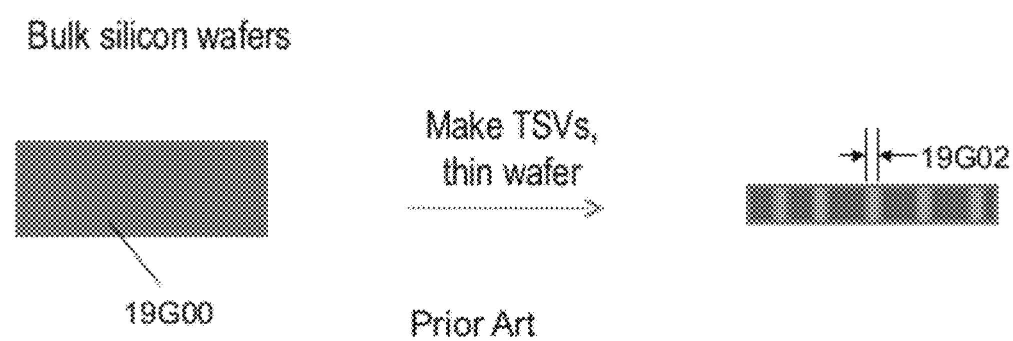
FIG. 19G is an exemplary drawing illustration of a prior art method to make through-silicon vias.

In yet another embodiment, custom SOI wafers may be used where NuVias 19F00 may be processed by the wafer supplier. NuVias 19F00 may be conventional TSVs that may be 1 micron or larger in diameter and may be preprocessed by an SOI wafer vendor. This is illustrated in FIG. 19F with handle wafer 19F02 and Buried Oxide (BOX) 19F01. The handle wafer 19F02 may typically be many hundreds of microns thick, and the BOX 19F01 may typically be a few hundred nanometers thick. The Integrated Device Manufacturer (IDM) or foundry may then process NuContacts 19F03 to connect to the NuVias 19F00. NuContacts may be conventionally dimensioned contacts etched through the thin silicon 19F05 and the BOX 19F01 of the SOI and filled with metal. The NuContact diameter DNuContact 19F04, in FIG. 19F may then be processed having diameters in the tens of nanometer range. The prior art of construction with bulk silicon wafers 19G00 as illustrated in FIG. 19G typically may have a TSV diameter, DTSV_prior_art 19G02, in the micron range. The reduced dimension of NuContact DNuContact 19F04 in FIG. 19F may have implications for semiconductor designers. The use of NuContacts may provide reduced die size penalty of through-silicon connections, reduced handling of very thin silicon wafers, and reduced design complexity. The arrangement of TSVs in custom SOI wafers can be based on a high-volume integrated device manufacturer (IDM) or foundry's request, or may be based on a commonly agreed industry standard.

Figure 19H:
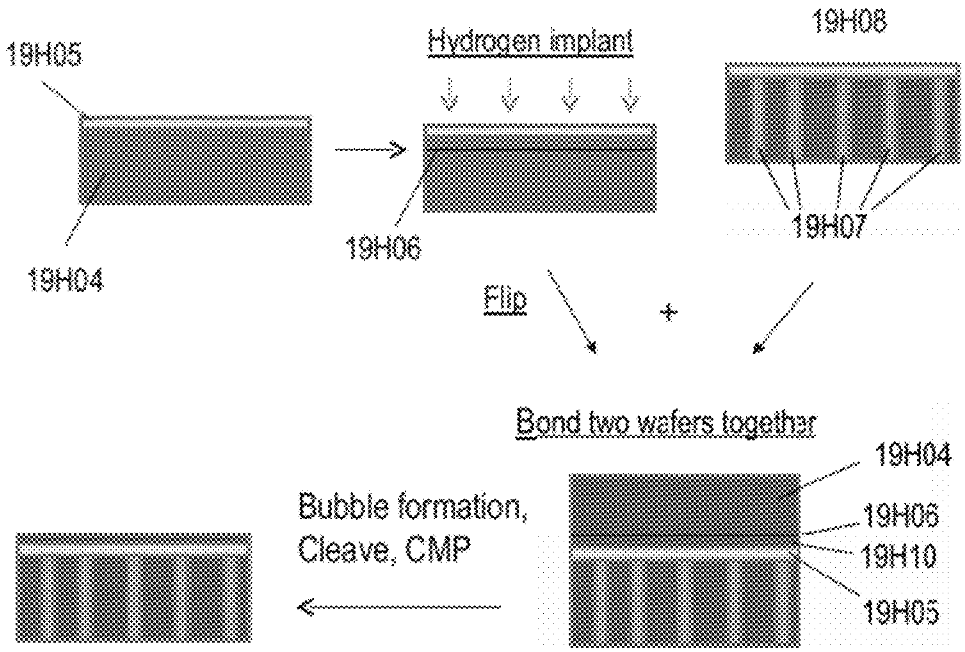
FIG. 19H is an exemplary drawing illustration of a process flow for making custom SOI wafers.

A process flow as illustrated in FIG. 19H may be utilized to manufacture these custom SOI wafers. Such a flow may be used by a wafer supplier. A silicon donor wafer 19H04 may be taken and its surface 19H05 may be oxidized. An atomic species, such as, for example, hydrogen, may then be implanted at a certain depth 19H06. Oxide-to-oxide bonding as described in other embodiments may then be used to bond this wafer with an acceptor wafer 19H08 having pre-processed NuVias 19H07. The NuVias 19H07 may be constructed with a conductive material, such as tungsten or doped silicon, which can withstand high-temperature processing. An insulating barrier, such as, for example, silicon oxide, may be utilized to electrically isolate the NuVias 19H07 from the silicon of the acceptor wafer 19H08. Alternatively, the wafer supplier may construct NuVias 19H07 with silicon oxide. The integrated device manufacturer or foundry may etch out the silicon oxide after the high-temperature (more than about 400° C.) transistor fabrication may be complete and may replace this oxide with a metal such as copper or aluminum. This process may allow a low-melting point, but highly conductive metal, such as, for example, copper or aluminum to be used. Following the bonding, a portion 19H10 of the silicon donor wafer 19H04 may be cleaved at 19H06 and then chemically mechanically polished as described in other embodiments.

Figure 19I:
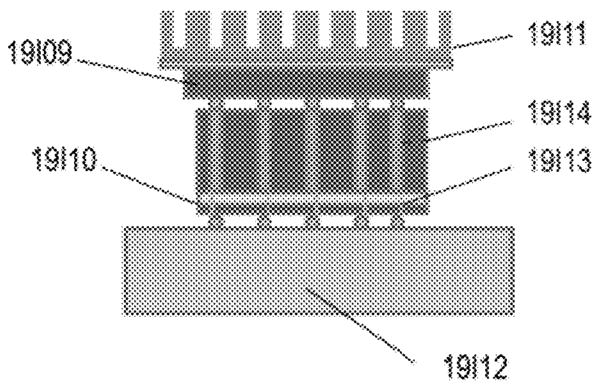
FIG. 19I is an exemplary drawing illustration of a processor-DRAM stack.
Figure 19J:
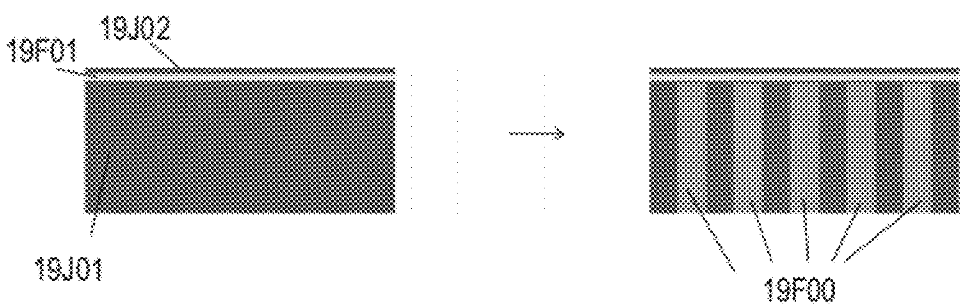
FIG. 19J is an exemplary drawing illustration of a process flow for making custom SOI wafers.

FIG. 19J depicts another technique to manufacture custom SOI wafers. A standard SOI wafer with substrate 19J01, BOX 19F01, and top silicon layer 19J02 may be taken and NuVias 19F00 may be formed from the back-side up to the oxide layer. This technique might have a thicker BOX 19F01 than a standard SOI process.

FIG. 19I depicts how a custom SOI wafer may be used for 3D stacking of a processor 19I09 and a DRAM 19I10. In this configuration, a processor's power distribution and I/O connections may pass from the substrate 19I12, go through the DRAM 19I10 and then connect onto the processor 19I09. The above described technique in FIG. 19F may result in a small contact area on the DRAM active silicon, which may be very convenient for this processor-DRAM stacking application. The transistor area lost on the DRAM die due to the through-silicon connection 19I13 and 19I14 may be very small due to the tens of nanometer diameter of NuContact 19I13 in the active DRAM silicon. It may be difficult to design a DRAM when large areas in its center may be blocked by large through-silicon connections. Having small size through-silicon connections may help tackle this issue. Persons of ordinary skill in the art will appreciate that this technique may be applied to building processor-SRAM stacks, processor-flash memory stacks, processor-graphics-memory stacks, any combination of the above, and any other combination of related integrated circuits such as, for example, SRAM-based programmable logic devices and their associated configuration ROM/PROM/EPROM/EEPROM devices, ASICs and power regulators, microcontrollers and analog functions, etc. Additionally, the silicon on insulator (SOI) may be a material such as polysilicon, GaAs, GaN, Ge, etc. on an insulator. Such skilled persons will appreciate that the applications of NuVia and NuContact technology are extremely general and the scope of the illustrated embodiments of the invention is to be limited only by the appended claims.

In another embodiment of the present invention the foundation substrate wafer 1402 could additionally carry re-drive cells (often called buffers). Re-drive cells may be common in the industry for signals which may be routed over a relatively long path. As the routing may have a severe resistance and capacitance penalty it may be helpful to insert re-drive circuits along the path to avoid a severe degradation of signal timing and shape. An illustrated advantage of having re-drivers in the foundation wafer 1402 may be that these re-drivers could be constructed from transistors that could withstand the programming voltage. Otherwise isolation transistors such as 1601 and 1602 or other isolation scheme may be used at the logic cell input and output.

Figure 20:
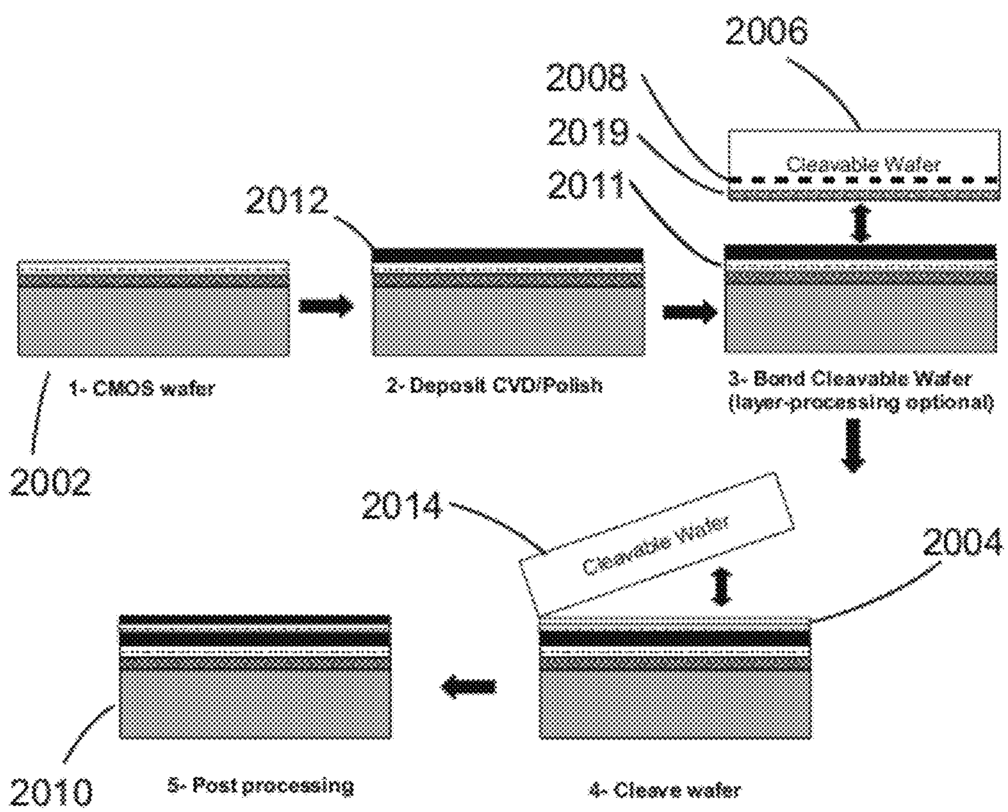
FIG. 20 is an exemplary drawing illustration of a layer transfer process flow.

FIG. 20 is a drawing illustration of the second layer transfer process flow. The primary processed wafer 2002 may include all the prior layers—814, 802, 804, 806, and 807. Layer 2011 may include metal interconnect for said prior layers. An oxide layer 2012 may then be deposited on top of the wafer 2002 and then be polished for better planarization and surface preparation. A donor wafer 2006 (or cleavable wafer as labeled in the drawing) may be then brought in to be bonded to 2002. The donor wafer 2006 may be pre-processed to include the semiconductor layers 2019 which may be later used to construct the top layer of programming transistors 810 as an alternative to the TFT transistors. The donor wafer 2006 may also be prepared for "SmartCut" by ion implant of an atomic species, such as H+, at the desired depth to prepare the SmartCut line 2008. After bonding the two wafers a SmartCut step may be performed to pull out the top portion 2014 of the donor wafer 2006 along the ion-cut layer/plane 2008. This donor wafer may now also be processed and reused for more layer transfers. The result may be a 3D wafer 2010 which may include wafer 2002 with an added transferred layer 2004 of single crystal silicon pre-processed to carry additional semiconductor layers. The transferred layer 2004 could be quite thin at the range of about 10-200 nm. Utilizing "SmartCut" layer transfer may provide single crystal semiconductors layer on top of a pre-processed wafer without heating the pre-processed wafer to more than 400° C.

There may be a few alternative methods to construct the top transistors precisely aligned to the underlying pre-fabricated layers such as pre-processed wafer or layer 808, utilizing "SmartCut" layer transfer and not exceeding the temperature limit, typically about 400° C., of the underlying pre-fabricated structure, which may include low melting temperature metals or other construction materials such as, for example, aluminum or copper. As the layer transfer may be less than about 200 nm thick, then the transistors defined on it could be aligned precisely to the top metal layer of the pre-processed wafer or layer 808 as may be needed and those transistors may have state of the art layer to layer misalignment capability, for example, less than about 40 nm misalignment or less than about 4 nm misalignment, as well as through layer via, or layer to layer metal connection, diameters of less than about 50 nm, or even less than about 20 nm. The thinner the transferred layer, the smaller the through layer via diameter obtainable, due to the potential limitations of manufacturable via aspect ratios. The transferred layer may be, for example, less than about 2 microns thick, less than about 1 micron thick, less than about 0.4 microns thick, less than about 200 nm thick, or less than about 100 nm thick.

One alternative method may be to have a thin layer transfer of single crystal silicon which will be used for epitaxial Ge crystal growth using the transferred layer as the seed for the germanium. Another alternative method may be to use the thin layer transfer of mono-crystalline silicon for epitaxial growth of GexSi1-x. The percent Ge in Silicon of such layer may be determined by the transistor specifications of the circuitry. Prior art have presented approaches whereby the base silicon may be used to crystallize the germanium on top of the oxide by using holes in the oxide to drive crystal or lattice seeding from the underlying silicon crystal. However, it may be very hard to do such on top of multiple interconnection layers. By using layer transfer a mono-crystalline layer of silicon crystal may be constructed on top, allowing a relatively easy process to seed and crystallize an overlying germanium layer. Amorphous germanium could be conformally deposited by CVD at about 300° C. and a pattern may be aligned to the underlying layer, such as the pre-processed wafer or layer 808, and then encapsulated by a low temperature oxide. A short microsecond-duration heat pulse may melt the Ge layer while keeping the underlying structure below about 400° C. The Ge/Si interface may start the crystal or lattice epitaxial growth to crystallize the germanium or GexSi1-x layer. Then implants may be made to form Ge transistors and activated by laser pulses without damaging the underlying structure taking advantage of the low activation temperature of dopants in germanium.

Figure 21A:
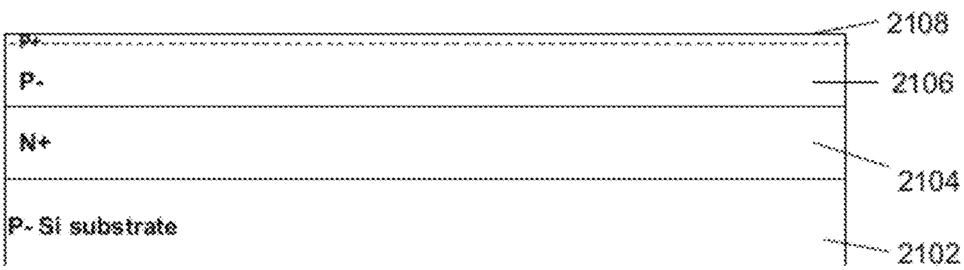
FIG. 21A is an exemplary drawing illustration of a pre-processed wafer used for a layer transfer.
Figure 21B:
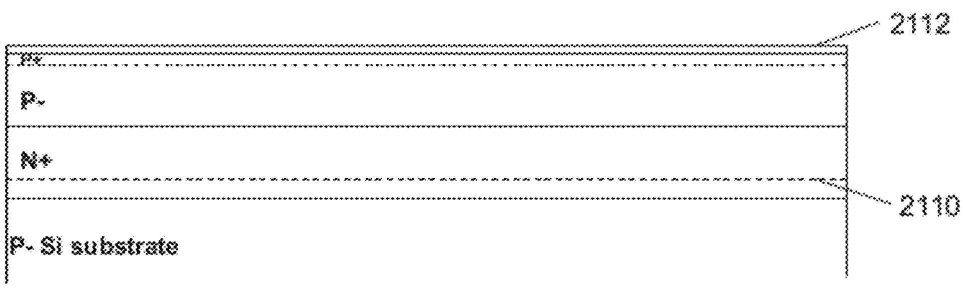
FIG. 21B is an exemplary drawing illustration of a pre-processed wafer ready for a layer transfer.

Another alternative method as an embodiment of the invention may be to preprocess the wafer used for layer transfer as illustrated in FIG. 21. FIG. 21A is a drawing illustration of a pre-processed wafer used for a layer transfer. A lightly doped P-type wafer (P− wafer) 2102 may be processed to have a "buried" layer of highly doped N-type silicon (N+) 2104, by implant and activation, or by shallow N+ implant and diffusion followed by a P− epi growth (epitaxial growth) 2106. For example, if a substrate contact is needed for transistor performance, an additional shallow P+ layer 2108 may be implanted and activated. FIG. 21B is a drawing illustration of the pre-processed wafer made ready for a layer transfer by an implant of an atomic species, such as H+, preparing the SmartCut "cleaving plane" 2110 in the lower part of the N+ region and an oxide deposition or growth 2112 in preparation for oxide to oxide bonding. Now a layer-transfer-flow may be performed to transfer the pre-processed single crystal P− silicon with N+ layer, on top of pre-processed wafer or layer 808. The top of pre-processed wafer or layer 808 may be prepared for bonding by deposition of an oxide, or surface treatments, or both. Persons of ordinary skill in the art will appreciate that the processing methods presented above are illustrative only and that other embodiments of the inventive principles described herein are possible and thus the scope if the invention is only limited by the appended claims.

Figure 22A:
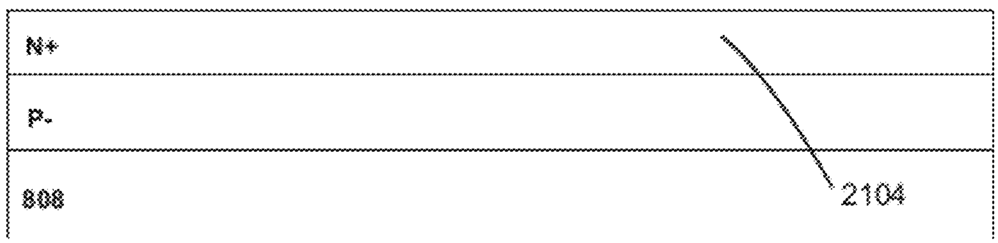
FIG. 22A-H are exemplary drawing illustrations of formation of top planar transistors.
Figure 22B:
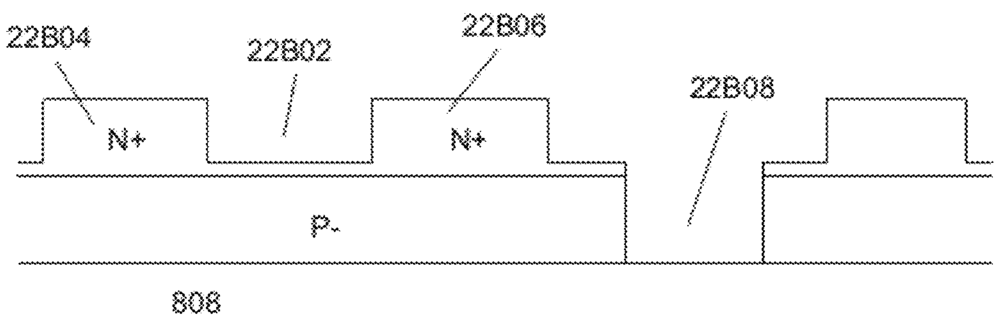
Figure 22C:
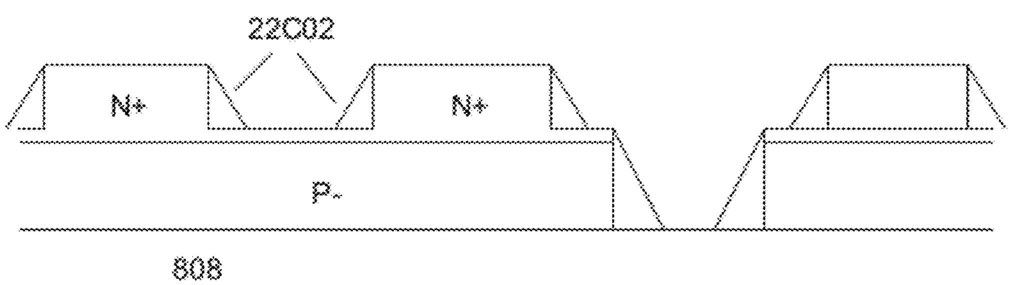
Figure 22D:
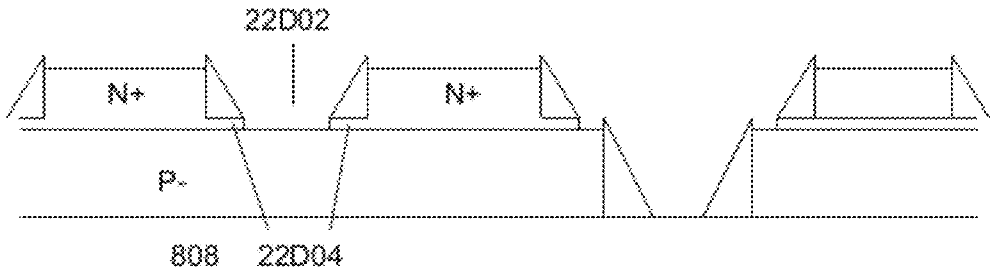
Figure 22E:
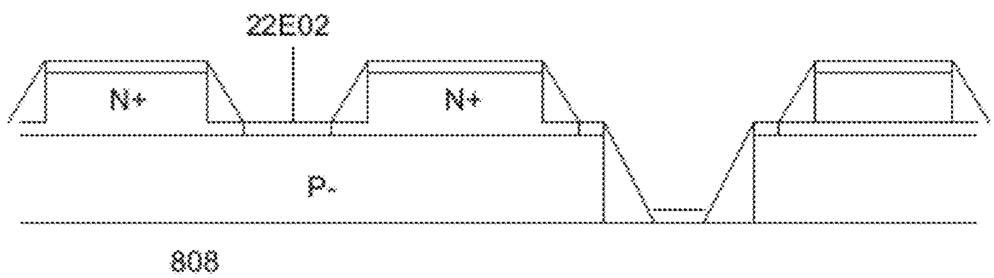

FIGS. 22A-22H are drawing illustrations of the formation of planar top source extension transistors. FIG. 22A illustrates the layer transferred on top of preprocessed wafer or layer 808 after the smart cut wherein the N+ 2104 may be on top. Then the top transistor source 22B04 and drain 22B06 may be defined by etching away the N+ from the region designated for gates 22B02, leaving a thin more lightly doped N+ layer for the future source and drain extensions, and the isolation region 22B08 between transistors. Utilizing an additional masking layer, the isolation region 22B08 may be defined by an etch substantially all the way to the top of pre-processed wafer or layer 808 to provide substantially full isolation between transistors or groups of transistors. Etching away the N+ layer between transistors may be helpful as the N+ layer is conducting. This step may be aligned to the top of the pre-processed wafer or layer 808 so that the formed transistors could be properly connected to metal layers of the pre-processed wafer or layer 808. Then a highly conformal Low-Temperature Oxide 22C02 (or Oxide/Nitride stack) may be deposited and etched resulting in the structure illustrated in FIG. 22C. FIG. 22D illustrates the structure following a self-aligned etch step in preparation for gate formation 22D02, thereby forming the source and drain extensions 22D04. FIG. 22E illustrates the structure following a low temperature microwave oxidation technique, such as, for example, the TEL SPA (Tokyo Electron Limited Slot Plane Antenna) oxygen radical plasma, that may grow or deposit a low temperature Gate Dielectric 22E02 to serve as the MOSFET gate oxide, or an atomic layer deposition (ALD) technique may be utilized. Alternatively, the gate structure may be formed by a high k metal gate process flow as follows. Following an industry standard HF/SC1/SC2 clean protocol to create an atomically smooth surface, a high-k gate dielectric 22E02 may be deposited. The semiconductor industry has chosen Hafnium-based dielectrics as the leading material of choice to replace SiO2 and Silicon oxynitride. The Hafnium-based family of dielectrics may include hafnium oxide and hafnium silicate/hafnium silicon oxynitride. Hafnium oxide, HfO2, may have a dielectric constant twice as much as that of hafnium silicate/hafnium silicon oxynitride (HfSiO/HfSiON k~15). The choice of the metal may affect proper device performance. A metal replacing N+ poly as the gate electrode may need to have a work function of about 4.2 eV for the device to operate properly and at the right threshold voltage. Alternatively, a metal replacing P+ poly as the gate electrode may need to have a work function of about 5.2 eV to operate properly. The TiAl and TiAlN based family of metals, for example, could be used to tune the work function of the metal from about 4.2 eV to about 5.2 eV.

Figure 22F:
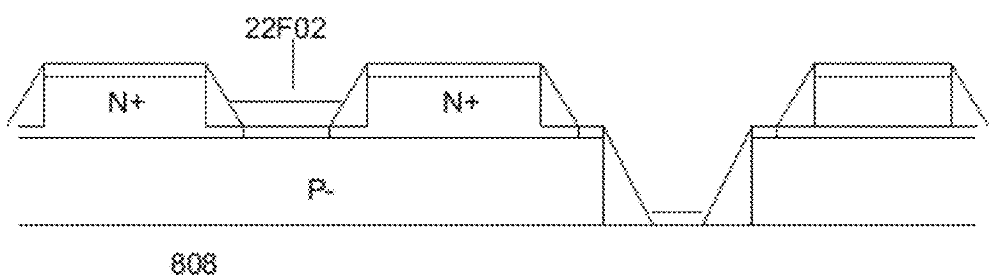

FIG. 22F illustrates the structure following deposition, mask, and etch of metal gate 22F02. For example, to improve transistor performance, a targeted stress layer to induce a higher channel strain may be employed. A tensile nitride layer may be deposited at low temperature to increase channel stress for the NMOS devices illustrated in FIG. 22. A PMOS transistor may be constructed via the above process flow by changing the initial P− wafer or epi-formed P− on N+ layer 2104 to an N− wafer or an N− on P+ epi layer; and the N+ layer 2104 to a P+ layer. Then a compressively stressed nitride film would be deposited post metal gate formation to improve the PMOS transistor performance.

Figure 22G:
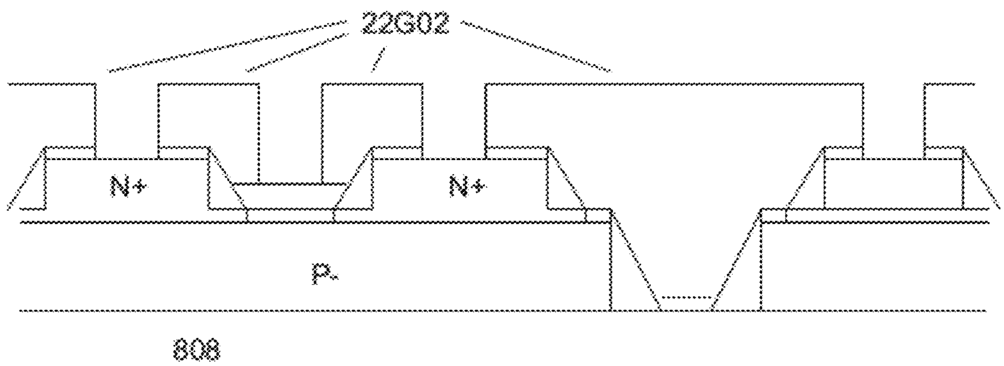
Figure 22H:
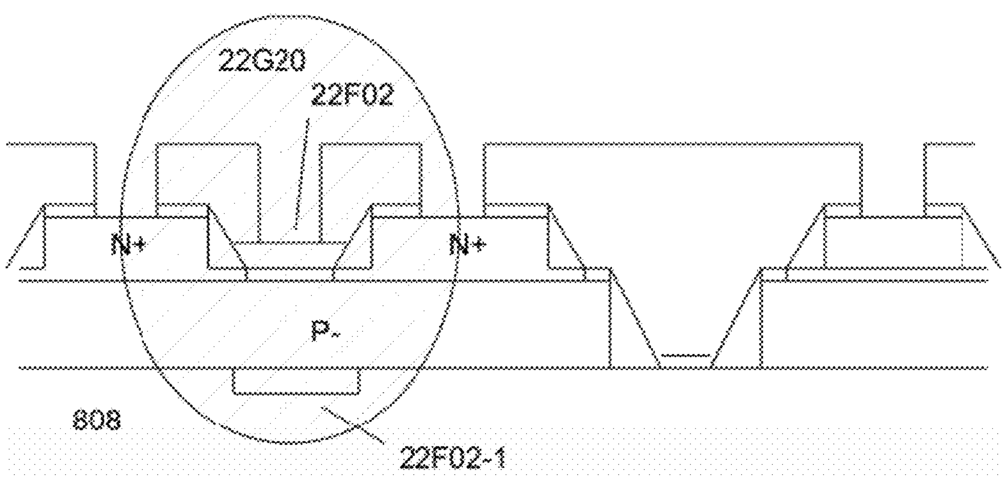

Finally a thick oxide 22G02 may be deposited and contact openings may be masked and etched preparing the transistors to be connected as illustrated in FIG. 22G. This thick or any low-temperature oxide in this document may be deposited via Chemical Vapor Deposition (CVD), Physical Vapor Deposition (PVD), or Plasma Enhanced Chemical Vapor Deposition (PECVD) techniques. This flow may enable the formation of mono-crystalline top MOS transistors that could be connected to the underlying multi-metal layer semiconductor device without exposing the underlying devices and interconnects metals to high temperature. These transistors could be used as programming transistors of the Antifuse on second antifuse layer 807, coupled to the pre-processed wafer or layer 808 to create a monolithic 3D circuit stack, or for other functions in a 3D integrated circuit. These transistors can be considered "planar transistors," meaning that the current flow in the transistor channel is substantially in the horizontal direction, and may be substantially between drain and source. The horizontal direction may be defined as the direction being parallel to the largest area of surface ('face') of the substrate or wafer that the transistor may be built or layer transferred onto. These transistors, as well as others herein this document wherein the current flow in the transistor channel is substantially in the horizontal direction, can also be referred to as horizontal transistors, horizontally oriented transistors, or lateral transistors. In some embodiments of the invention the horizontal transistor may be constructed in a two-dimensional plane where the source and the drain may be within the same monocrystalline layer. Additionally, the gates of transistors described herein that include gates on 2 or more sides of the transistor channel may be referred to as side gates. A gate may be an electrode that regulates the flow of current in a transistor, for example, a metal oxide semiconductor transistor. An additional advantage of this flow is that the SmartCut H+, or other atomic species, implant step may be done prior to the formation of the MOS transistor gates avoiding potential damage to the gate function. If needed the top layer of the pre-processed wafer or layer 808 could include a back-gate 22F02-1 whereby gate 22F02 may be aligned to be directly on top of the back-gate 22F02-1 as illustrated in FIG.

22H. The back gate 22F02-1 may be formed from the top metal layer in the pre-processed wafer or layer 808 and may utilize the oxide layer deposited on top of the metal layer for the wafer bonding (not shown) to act as a gate oxide for the back gate.

According to some embodiments of the invention, during a normal fabrication of the device layers as illustrated in FIG. 8, every new layer may be aligned to the underlying layers using prior alignment marks. Sometimes the alignment marks of one layer could be used for the alignment of multiple layers on top of it and sometimes the new layer may also have alignment marks to be used for the alignment of additional layers put on top of it in the following fabrication step. So layers of logic fabric/first antifuse layer 804 may be aligned to layers of 802, layers of interconnection layer 806 may be aligned to layers of logic fabric/first antifuse layer 804 and so forth. An advantage of the described process flow may be that the layer transferred may be thin enough so that during the following patterning step as described in connection to FIG. 22B, the transferred layer may be aligned to the alignment marks of the pre-processed wafer or layer 808 or those of underneath layers such as layers 806, 804, 802, or other layers, to form the 3D IC. Therefore the back-gate 22F02-1 which may be part of the top metal layer of the pre-processed wafer or layer 808 would be precisely underneath gate 22F02 as all the layers may be patterned as being aligned to each other. In this context alignment precision may be highly dependent on the equipment used for the patterning steps. For processes of 45 nm and below, overlay alignment of better than 5 nm may be usually needed. The alignment requirement may only get tighter with scaling where modern steppers now can do better than about 2 nm. This alignment requirement can be orders of magnitude better than what could be achieved for TSV based 3D IC systems as described below in relation to FIG. 12 where even 0.5 micron overlay alignment may be extremely hard to achieve. Connection between top-gate and back-gate would be made through a top layer via, or TLV. This may allow further reduction of leakage as both the gate 22F02 and the back-gate 22F02-1 could be connected together to better shut off the transistor 22G20. As well, one could create a sleep mode, a normal speed mode, and fast speed mode by dynamically changing the threshold voltage of the top gated transistor by independently changing the bias of the back-gate 22F02-1. Additionally, an accumulation mode (fully depleted) MOSFET transistor could be constructed via the above process flow by changing the initial P− wafer 2102 or epi-formed P− 2106 on N+ layer 2104 to an N− wafer or an N− epi layer on N+.

The term alignment mark in the use herein may be defined as "an image selectively placed within or outside an array for either testing or aligning, or both [ASTM F127-84], also called alignment key and alignment target," as in the SEMATECH dictionary. The alignment mark may, for example, be within a layer, wafer, or substrate of material processing or to be processed, and/or may be on a photomask or photoresist image, or may be a calculated position within, for example, a lithographic wafer stepper's software or memory.

An additional aspect of this technique for forming top transistors may be the size of the via, or TLV, used to connect the top transistors 22G20 to the metal layers in pre-processed wafer and layer 808 underneath. The general rule of thumb may be that the size of a via should be larger than one tenth the thickness of the layer that the via is going through. Since the thickness of the layers in the structures presented in FIG. 12 may be usually more than 50 micron, the TSV used in such structures may be about 10 micron on the side. The thickness of the transferred layer in FIG. 22A may be less than 100 nm and accordingly the vias to connect top transistors 22G20 to the metal layers in pre-processed wafer and layer 808 underneath could have diameters of less than about 10 nm. As the process may be scaled to smaller feature sizes, the thickness of the transferred layer and accordingly the size of the via to connect to the underlying structures could be scaled down. For some advanced processes, the end thickness of the transferred layer could be made below about 10 nm.

Figures 29A, 29B, 29C:
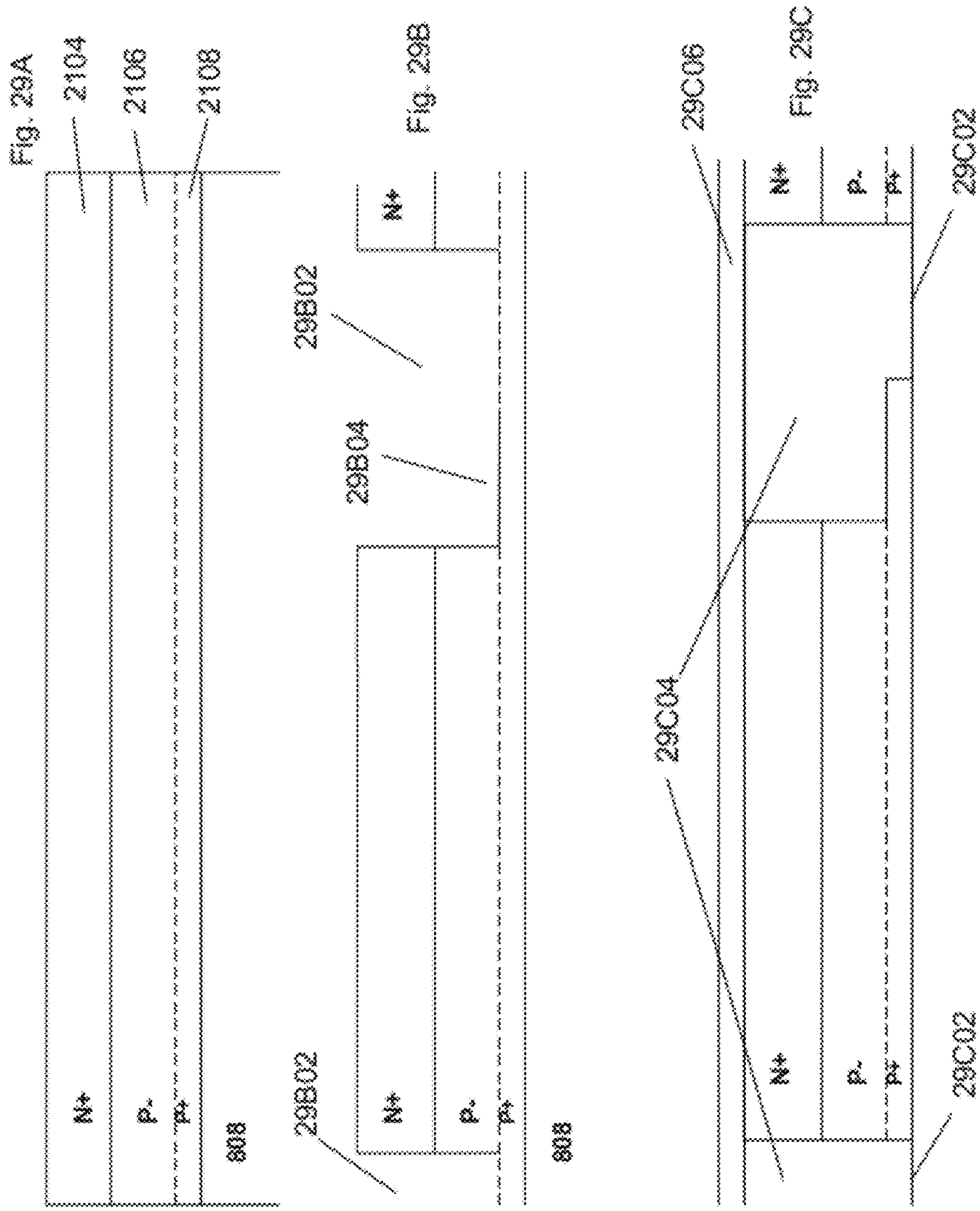
FIG. 29 A-G are exemplary drawing illustrations of formations of top planar transistors.
Figure 29D:
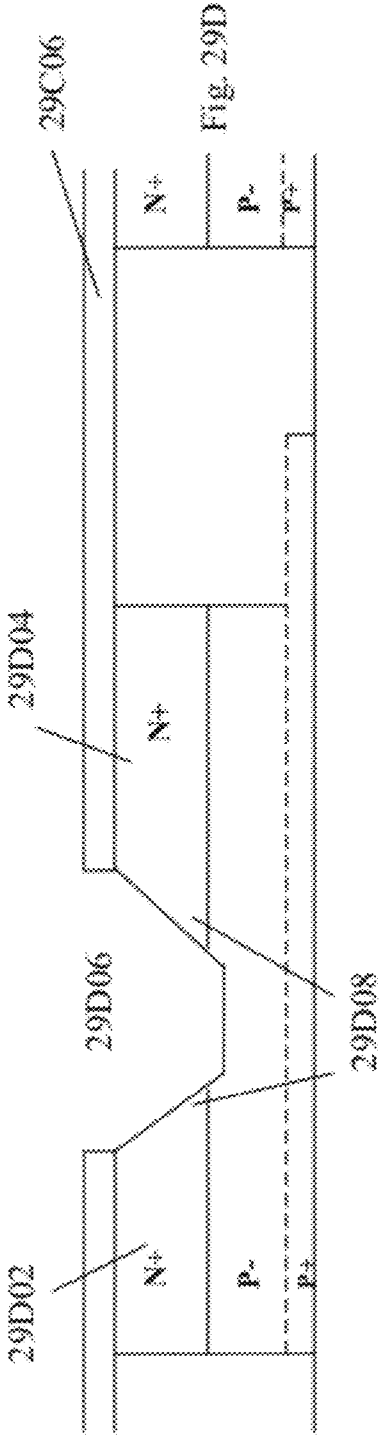
Figure 29E:
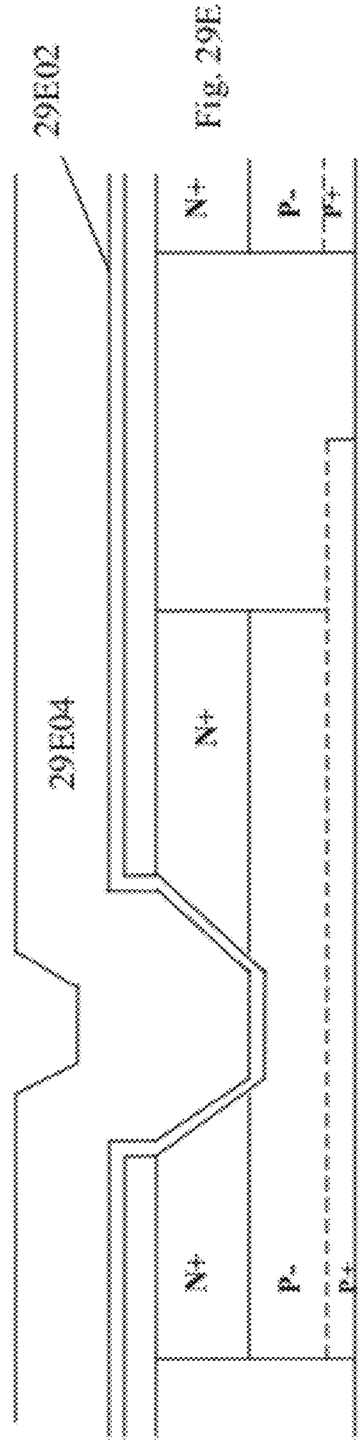

Another alternative for forming the planar top transistors with source and drain extensions may be to process the prepared wafer of FIG. 21B as shown in FIGS. 29A-29G. FIG. 29A illustrates the layer transferred on top of pre-processed wafer or layer 808 after the smart cut wherein the N+ 2104 may be on top, the P− 2106, and P+ 2108. The oxide layers used to facilitate the wafer to wafer bond are not shown. Then the substrate P+ source 29B04 contact opening and transistor isolation 29B02 may be masked and etched as shown in FIG. 29B. Utilizing an additional masking layer, the isolation region 29C02 may be defined by etch substantially all the way to the top of the pre-processed wafer or layer 808 to provide substantially full isolation between transistors or groups of transistors in FIG. 29C. Etching away the P+ layer between transistors may be helpful as the P+ layer may be conducting. Then a Low-Temperature Oxide 29C04 may be deposited and chemically mechanically polished. Then a thin polish stop layer 29C06 such as low temperature silicon nitride may be deposited resulting in the structure illustrated in FIG. 29C. Source 29D02, drain 29D04 and self-aligned Gate 29D06 may be defined by masking and etching the thin polish stop layer 29C06 and then a sloped N+ etch as illustrated in FIG. 29D. The sloped (30-90 degrees, 45 is shown) etch or etches may be accomplished with wet chemistry or plasma etching techniques. This process may form angular source and drain extensions 29D08. FIG. 29E illustrates the structure following deposition and densification of a low temperature based Gate Dielectric 29E02, or alternatively a low temperature microwave plasma oxidation of the silicon surfaces, or an atomic layer deposited (ALD) gate dielectric, to serve as the MOSFET gate oxide, and then deposition of a gate material 29E04, such as aluminum or tungsten.

Alternatively, a high-k metal gate (HKMG) structure may be formed as follows. Following an industry standard HF/SC1/SC2 cleaning to create an atomically smooth surface, a high-k gate dielectric 29E02 may be deposited. The semiconductor industry has chosen Hafnium-based dielectrics as the leading material of choice to replace $SiO_2$ and Silicon oxynitride. The Hafnium-based family of dielectrics includes hafnium oxide and hafnium silicate/hafnium silicon oxynitride. Hafnium oxide, $HfO_2$, has a dielectric constant twice as much as that of hafnium silicate/hafnium silicon oxynitride (HfSiO/HfSiON k~15). The choice of the metal may affect proper device performance. A metal replacing $N^+$ poly as the gate electrode may need to have a work function of about 4.2 eV for the device to operate properly and at the right threshold voltage. Alternatively, a metal replacing $P^+$ poly as the gate electrode may need to have a work function of about 5.2 eV to operate properly. The TiAl and TiAlN based family of metals, for example, could be used to tune the work function of the metal from about 4.2 eV to about 5.2 eV.

Figure 29F:
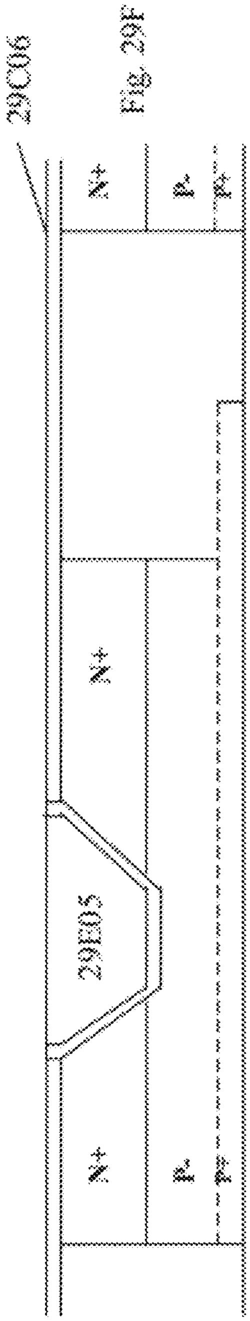

FIG. 29F illustrates the structure following a chemical mechanical polishing of the gate material 29E04, thus forming metal gate 29E04, and utilizing the nitride polish stop layer 29C06. A PMOS transistor could be constructed via the above process flow by changing the initial P− wafer or epi-formed P− on N+ layer 2104 to an N− wafer or an N− on P+ epi layer; and the N+ layer 2104 to a P+ layer. Similarly, layer 2108 may be changed from P+ to N+ if the substrate contact option was used.

Figure 29G:
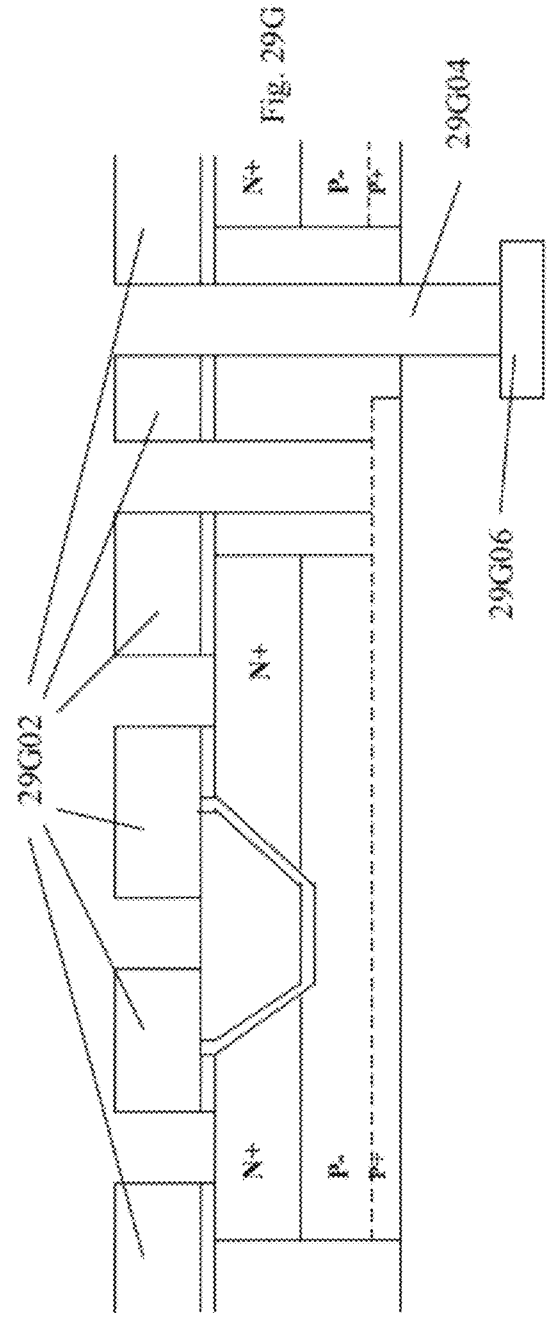

Finally a thick oxide 29G02 may be deposited and contact openings may be masked and etched preparing the transistors to be connected, for example, as illustrated in FIG. 29G. This figure also illustrates the layer transfer silicon via 29G04 masked and etched to provide interconnection of the top transistor wiring to the lower layer 808 interconnect wiring 29G06. This flow may enable the formation of mono-crystalline top MOS transistors that may be connected to the underlying multi-metal layer semiconductor device without exposing the underlying devices and interconnects metals to high temperature. These transistors may be used as programming transistors of the antifuses on second antifuse layer 807, to couple with the pre-processed wafer or layer 808 to form monolithic 3D ICs, or for other functions in a 3D integrated circuit. These transistors can be considered to be "planar transistors". These transistors can also be referred to as horizontal transistors or lateral transistors. An additional illustrated advantage of this flow may be that the SmartCut H+, or other atomic species, implant step may be done prior to the formation of the MOS transistor gates avoiding potential damage to the gate function. Additionally, an accumulation mode (fully depleted) MOSFET transistor may be constructed via the above process flow by changing the initial P− wafer or epi-formed P− on N+ layer 2104 to an N− wafer or an N− epi layer on N+. Additionally, a back gate similar to that shown in FIG. 22H may be utilized.

Figure 23A:
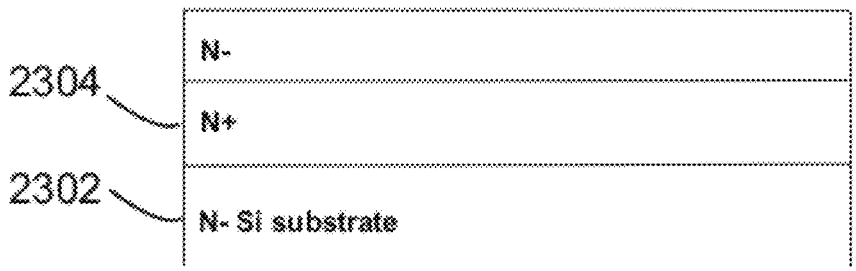
FIG. 23A, 23B is an exemplary drawing illustration of a pre-processed wafer used for a layer transfer.
Figure 23B:
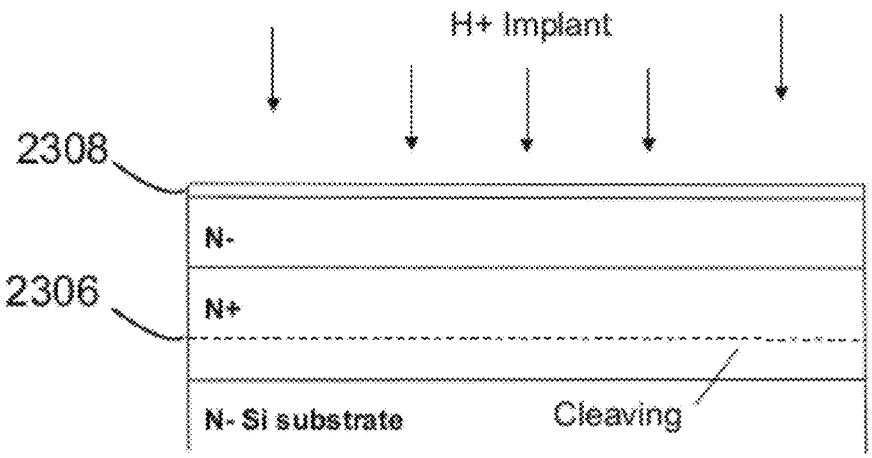

Another alternative method may be to preprocess the wafer used for layer transfer as illustrated in FIG. 23. FIG. 23A is a drawing illustration of a pre-processed wafer used for a layer transfer. An N− wafer 2302 may be processed to have a "buried" layer of N+ 2304, by implant and activation, or by shallow N+ implant and diffusion followed by an N− epi growth (epitaxial growth). FIG. 23B is a drawing illustration of the pre-processed wafer which may be made ready for a layer transfer by a deposition or growth of an oxide 2308 and by an implant of an atomic species, such as H+, preparing the SmartCut cleaving plane 2306 in the lower part of the N+ region. Now a layer-transfer-flow may be performed to transfer the pre-processed mono-crystalline N− silicon with N+ layer, on top of the pre-processed wafer or layer 808.

Figure 24A:
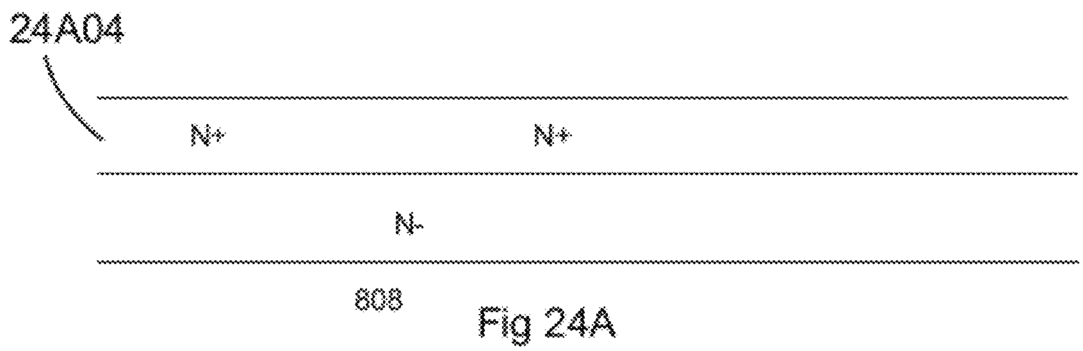
FIG. 24 A-F are exemplary drawing illustrations of formation of top planar transistors.
Figure 24B:
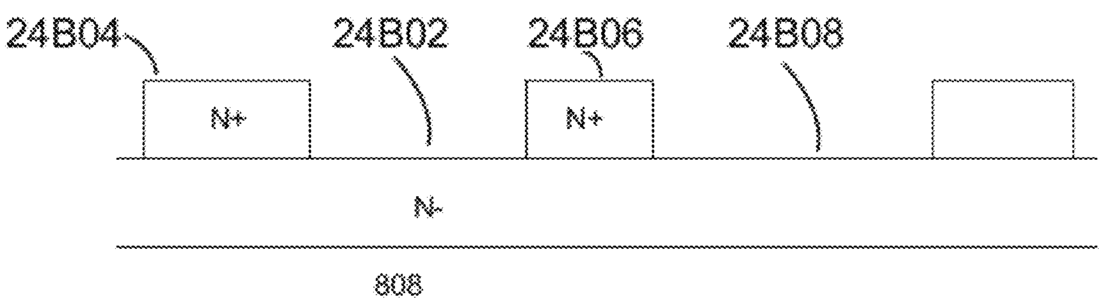
Figure 24C:
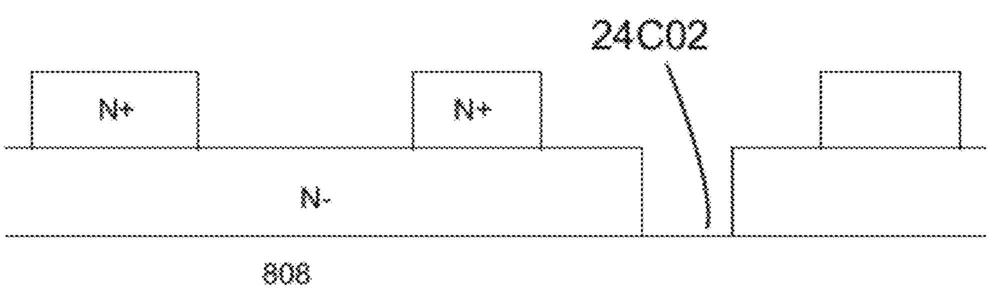
Figure 24D:
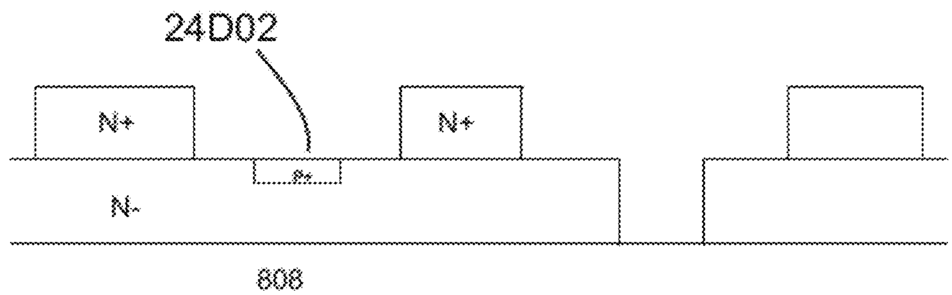
Figure 24E:
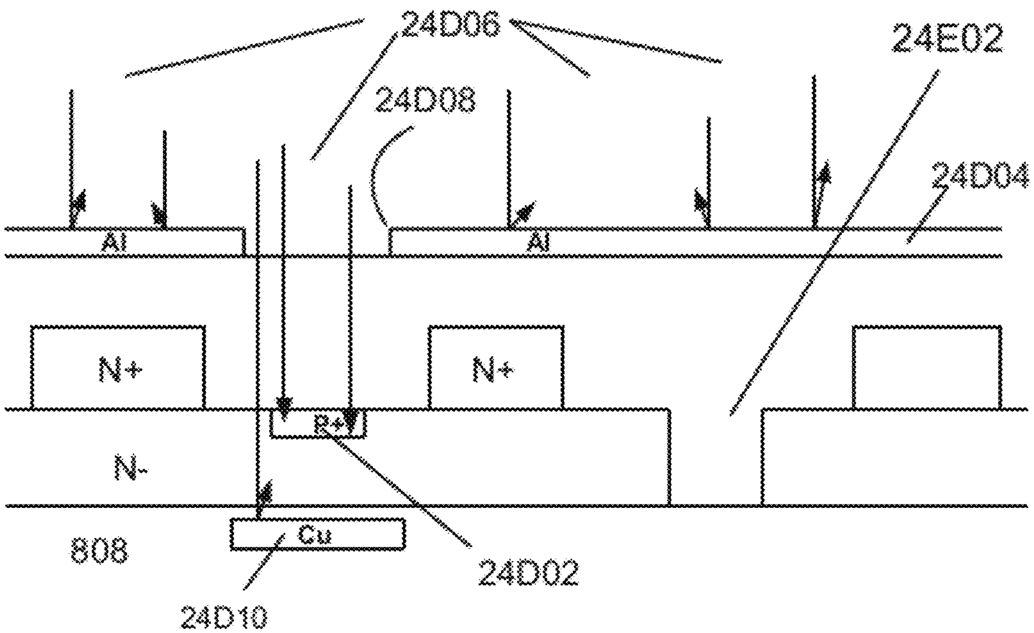
Figures 1, 24E:
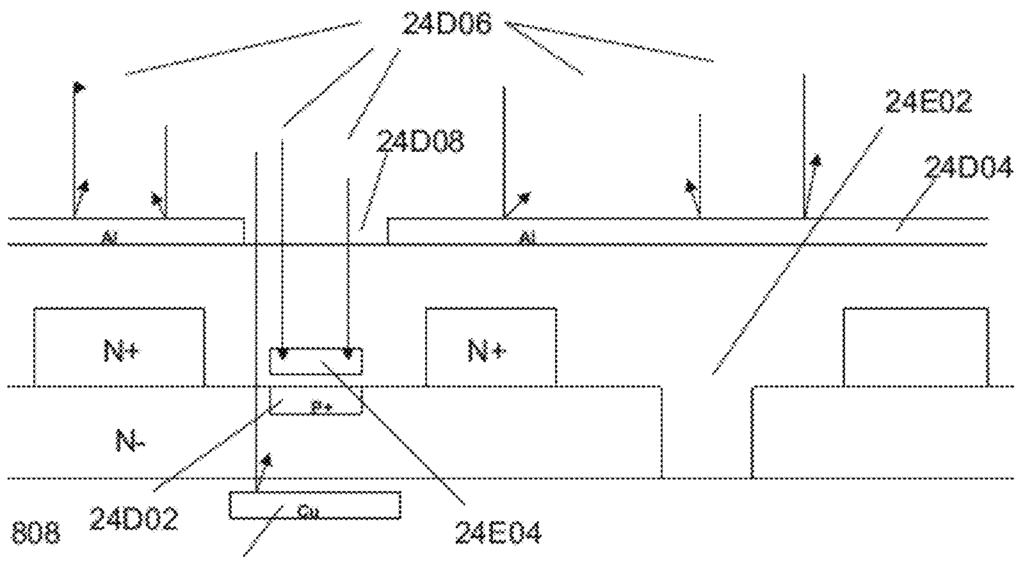

FIGS. 24A-24F are drawing illustrations of the formation of planar Junction Gate Field Effect Transistor (JFET) top transistors. FIG. 24A illustrates the structure after the layer is transferred on top of the pre-processed wafer or layer 808. So, after the smart cut, the N+ 2304 may be on top and now marked as 24A04. Then the top transistor source 24B04 and drain 24B06 may be defined by etching away the N+ from the region designated for gates 24B02 and the isolation region between transistors 24B08. This step may be aligned to the pre-processed wafer or layer 808 so the formed transistors could be properly connected to the underlying layers of pre-processed wafer or layer 808. Then an additional masking and etch step may be performed to remove the N− layer between transistors, shown as 24C02, thus providing better transistor isolation as illustrated in FIG. 24C. FIG. 24D illustrates an example formation of shallow P+ region 24D02 for the JFET gate formation. In this option there might be a need for laser or other method of optical annealing to activate the P+. FIG. 24E illustrates how to utilize the laser anneal and minimize the heat transfer to pre-processed wafer or layer 808. After the thick oxide deposition 24E02, a layer of Aluminum, or other light reflecting material, may be applied as a reflective layer. An opening 24D08 in the reflective layer may be masked and etched, thus forming reflective regions 24D04, allowing the laser/optical energy 24D06 to heat the P+ 24D02 implanted area, and reflecting the majority of the laser/optical energy 24D06 away from pre-processed wafer or layer 808. Normally, the open area 24D08 may be less than about 10% of the total wafer area. Additionally, a copper region 24D10, or, alternatively, a reflective Aluminum layer or other reflective material, may be formed in the pre-processed wafer or layer 808 that will additionally reflect any of the unwanted laser/optical energy 24D06 that might travel to pre-processed wafer or layer 808. Copper region 24D10 could also be utilized as a ground plane or backgate electrically when the formed devices and circuits are in operation. Certainly, openings in copper region 24D10 may be made through which later through layer vias connecting the second top transferred layer to the pre-processed wafer or layer 808 may be constructed. This same reflective laser anneal or other methods of optical anneal technique might be utilized on any of the other illustrated structures to enable implant activation for transistor gates in the second layer transfer process flow. In addition, absorptive materials may, alone or in combination with reflective materials, also be utilized in the above laser or other method of optical annealing techniques. As shown in FIG. 24E-1, a photonic energy absorbing layer 24E04, such as amorphous carbon, may be deposited or sputtered at low temperature over the area that need to be laser heated, and then masked and etched as appropriate. This may allow the minimum laser or other optical energy to be employed to effectively heat the area to be implant activated, and thereby may minimize the heat stress on the reflective layers/regions reflective regions 24D04 & copper region 24D10 and the base layer of pre-processed wafer or layer 808. The laser annealing could be done to cover the complete wafer surface or be directed to the specific regions where the gates are to further reduce the overall heat and further guarantee that no damage, such as thermal damage, has been caused to the underlying layers, which may include metals such as, for example, copper or aluminum.

Figure 24F:
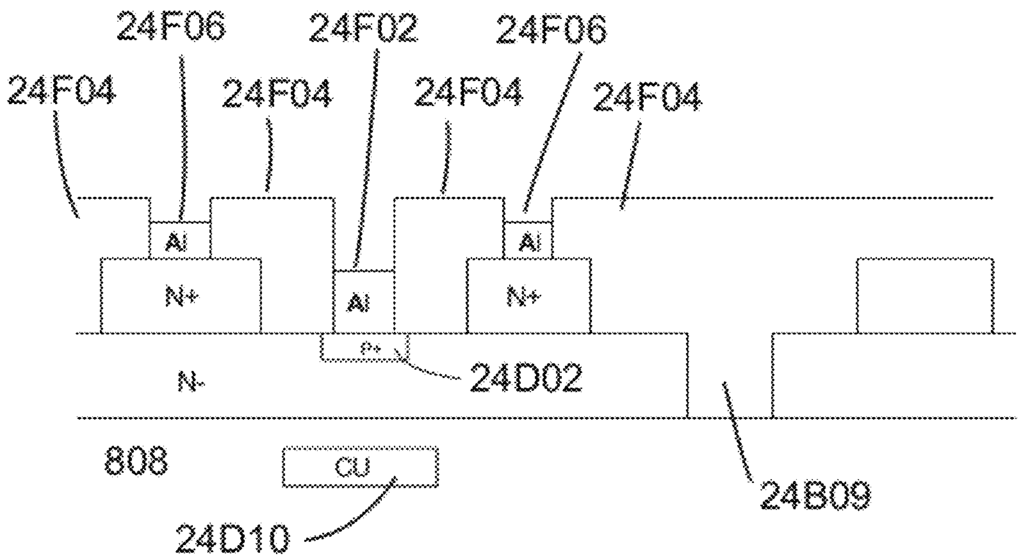

FIG. 24F illustrates the structure, following etching away of the laser/optical reflective regions 24D04, and the deposition, masking, and etch of a thick oxide 24F04 to open N+ contacts 24F06 and gate contact 24F02, and deposition and partial etch-back (or Chemical Mechanical Polishing (CMP)) of aluminum (or other metal to obtain an optimal Schottky or ohmic contact at gate contact 24F02) to form N+ contacts 24F06 and gate contact 24F02. If necessary, N+ contacts 24F06 and gate contact 24F02 may be masked and etched separately to allow a different metal to be deposited in each to create a Schottky or ohmic contact in the gate contact 24F02 and ohmic connections in the N+ contacts 24F06. The thick oxide 24F04 may be a non conducting dielectric material also filling the etched space 24B08 and 24B09 between the top transistors and could include other isolating material such as silicon nitride. The top transistors may therefore end up being surrounded by isolating dielectric unlike conventional bulk integrated circuits transistors that are built in single crystal silicon wafer and may only get covered by non conducting isolating material. This flow may enable the formation of mono-crystalline top JFET transistors that could be connected to the underlying multi-metal layer semiconductor device without exposing the underlying device to high temperature.

Another variation of the above-mentioned flow could be in utilizing a transistor technology called pseudo-MOSFET utilizing a molecular monolayer covalently grafted onto the channel region between the drain and source. The process can be done at relatively low temperatures (less than about 400° C.).

Figure 25A:
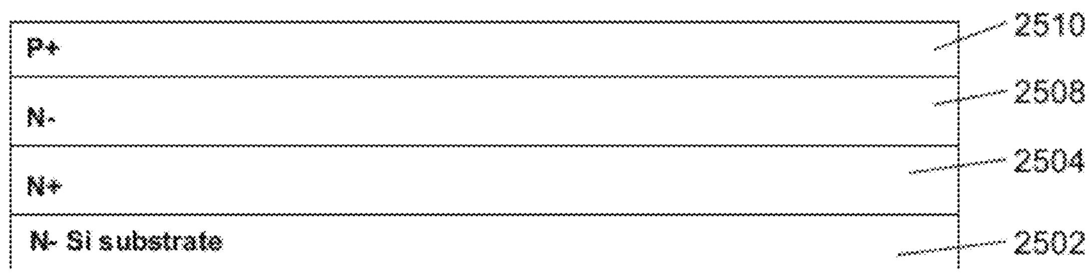
FIG. 25A, 25B is an exemplary drawing illustration of a pre-processed wafer used for a layer transfer.
Figure 25B:
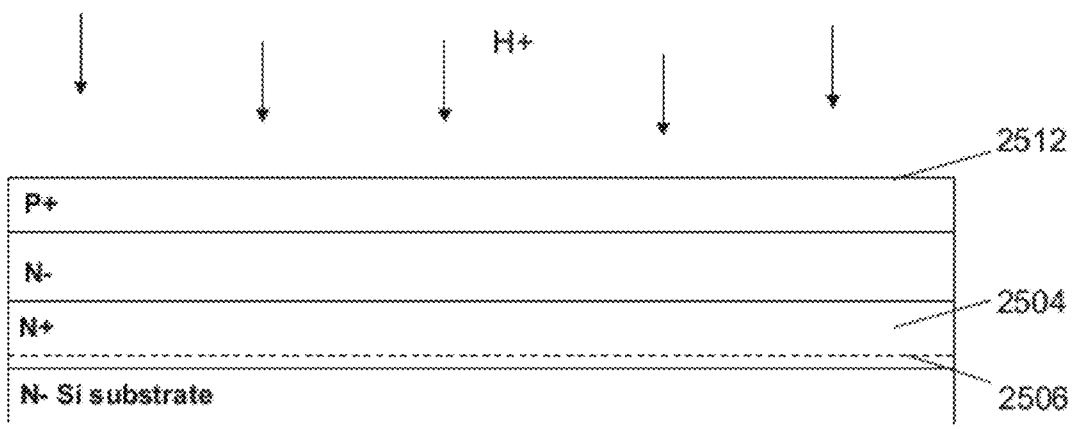

Another variation may be to preprocess the wafer used for layer transfer as illustrated in FIG. 25. FIG. 25A is a drawing illustration of a pre-processed wafer used for a layer transfer. An N− wafer 2502 may be processed to have a "buried" layer of N+ 2504, by implant and activation, or by shallow N+ implant and diffusion followed by an N− epi growth (epitaxial growth) 2508. An additional P+ layer 2510 may be processed on top. This P+ layer 2510 could again be processed, by implant and activation, or by P+ epi growth. FIG. 25B is a drawing illustration of the pre-processed wafer made ready for a layer transfer by a deposition or growth of an oxide 2512 and by an implant of an atomic species, such as H+, preparing the SmartCut cleaving plane 2506 in the lower part of the N+ 2504 region. Now a layer-transfer-flow may be performed to transfer the pre-processed single crystal silicon with N+ and N− layers, on top of the pre-processed wafer or layer 808.

Figure 26A:
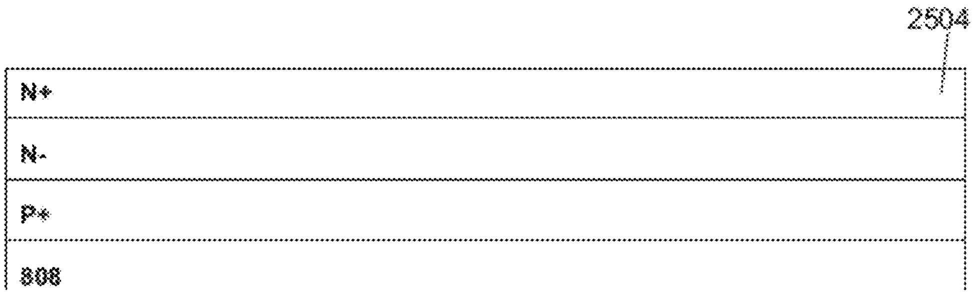
FIG. 26 A-E are exemplary drawing illustrations of formation of top planar transistors.
Figure 26B:
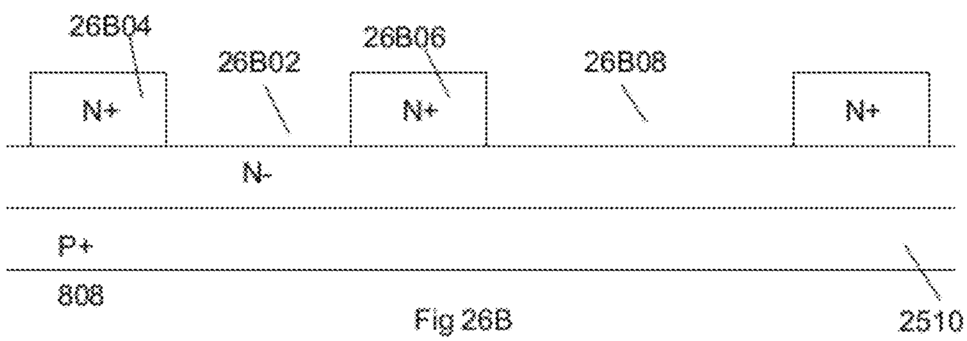
Figure 26C:
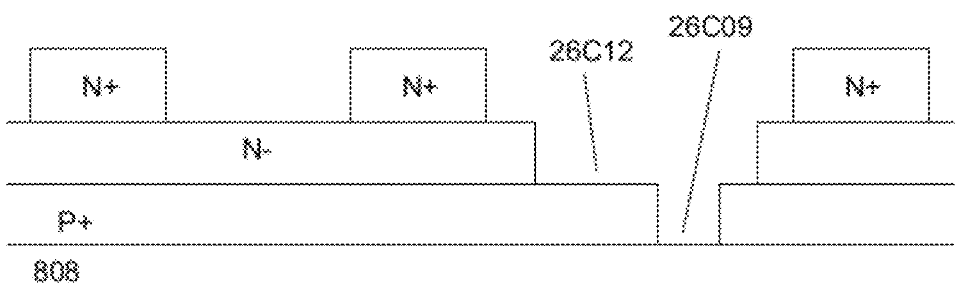
Figure 26D:
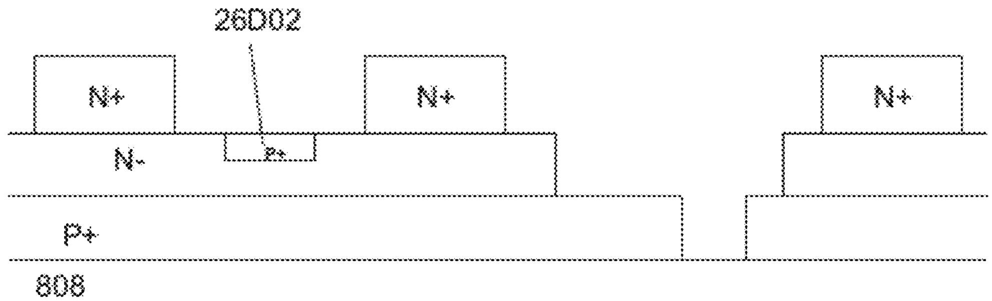
Figure 26E:
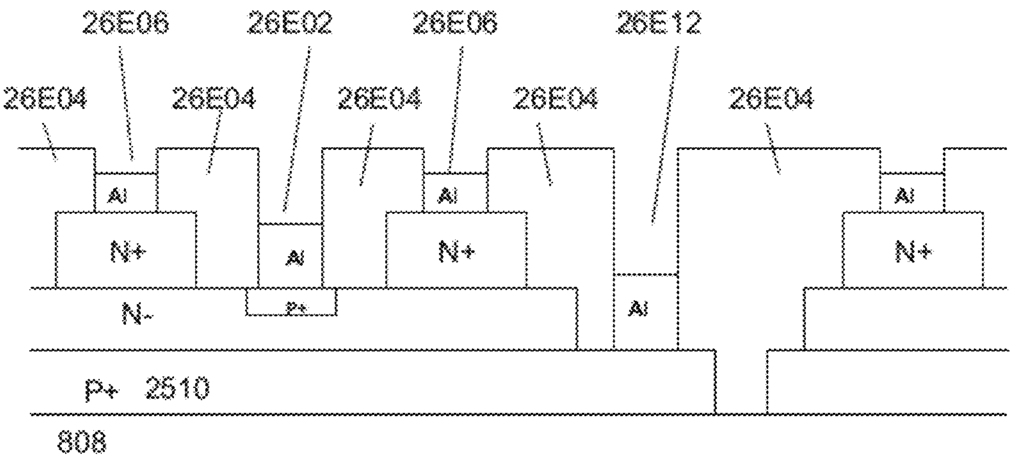

FIGS. 26A-26E are drawing illustrations of the formation of top planar JFET transistors with back bias or double gate. FIG. 26A illustrates the layer transferred on top of the pre-processed wafer or layer 808 after the smart cut wherein the N+ 2504 may be on top. Then the top transistor source 26B04 and drain 26B06 may be defined by etching away the N+ from the region designated for gates 26B02 and the isolation region between transistors 26B08. This step may be aligned to the pre-processed wafer or layer 808 so that the formed transistors could be properly connected to the underlying layers of pre-processed wafer or layer 808. Then a masking and etch step may be performed to remove the N− between transistors 26C12 and to allow contact to the now buried P+ layer 2510. And then a masking and etch step may be performed to remove in between transistors 26C09 the buried P+ layer 2510 for full isolation as illustrated in FIG. 26C. FIG. 26D illustrates an example formation of a shallow P+ region 26D02 for gate formation. In this option there might be a need for laser anneal to activate the P+. FIG. 26E illustrates the structure, following deposition and etch, or CMP, of a thick oxide 26E04, and deposition and partial etch-back of aluminum (or other metal to obtain an optimal Schottky or ohmic contact at gate contact 26E02) within contacts N+ contacts 26E06, back contact 26E12 and gate contact 26E02. If necessary, N+ contacts 26E06 and gate contact 26E02 may be masked and etched separately to allow a different metal to be deposited in each to create a Schottky or ohmic contact in the gate contact 26E02 and Schottky or ohmic connections in the N+ contacts 26E06 & back contact 26E12. The thick oxide 26E04 may be a non conducting dielectric material also filling the etched space 26B08 and 26C09 between the top transistors and could be comprised from other isolating material such as silicon nitride. Back contact 26E12 may be to allow a back bias of the transistor or can be connected to the gate contact 26E02 to provide a double gate JFET. Alternatively the connection for back bias could be included in layers of the pre-processed wafer or layer 808 connecting to layer 2510 from underneath. This flow may enable the formation of mono-crystalline top ultra thin body planar JFET transistors with back bias or double gate capabilities that may be connected to the underlying multi-metal layer semiconductor device without exposing the underlying device to high temperature. The connection for back bias may be utilized to create regions of transistors with various effective transistor threshold voltages.

Figure 27A:
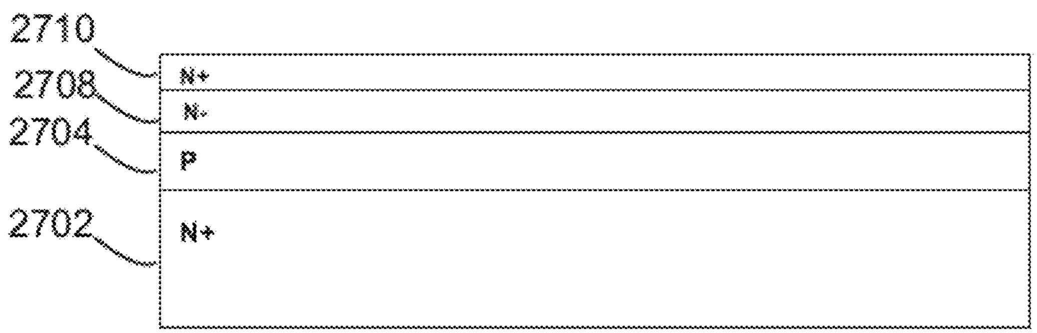
FIG. 27A, 27B are exemplary drawing illustrations of a pre-processed wafer used for a layer transfer.
Figure 27B:
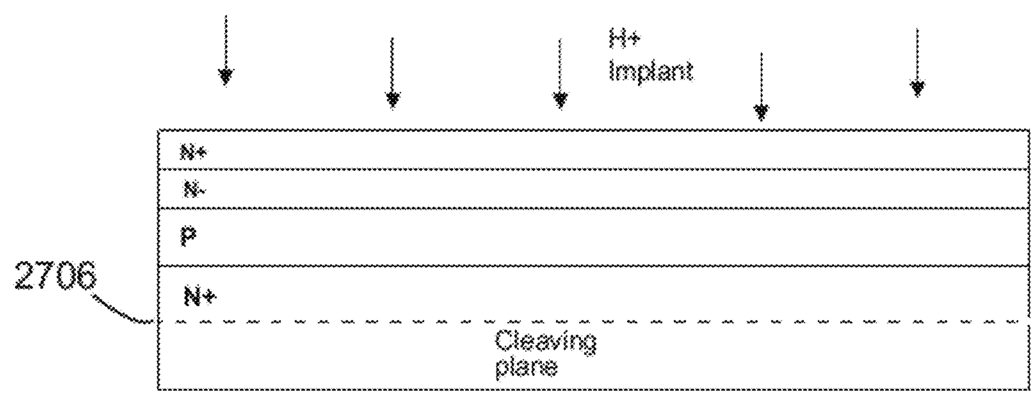

Another alternative may be to preprocess the wafer used for layer transfer as illustrated in FIG. 27. FIG. 27A is a drawing illustration of a pre-processed wafer used for a layer transfer. An N+ wafer 2702 may be processed to have "buried" layers either by ion implantation and activation anneals, or by diffusion to create a vertical structure to be the building block for NPN (or PNP) bipolar junction transistors. Multi layer epitaxial growth of the layers may also be utilized to create the doping layered structure; for example, the wafer sized doping layered structure may be formed with p layer 2704, then N− layer 2708, and finally N+ layer 2710 and then activating these layers by heating to a high activation temperature. FIG. 27B is a drawing illustration of the pre-processed wafer which may be made ready for a layer transfer by a deposition or growth of an oxide (not shown) and by an implant of an atomic species, such as H+, preparing the SmartCut cleaving plane 2706 in the N+ region. Now a layer-transfer-flow may be performed to transfer the pre-processed layers, on top of pre-processed wafer or layer 808.

Figure 28A:
FIG. 28 A-E are exemplary drawing illustrations of formations of top transistors.
Figure 28B:
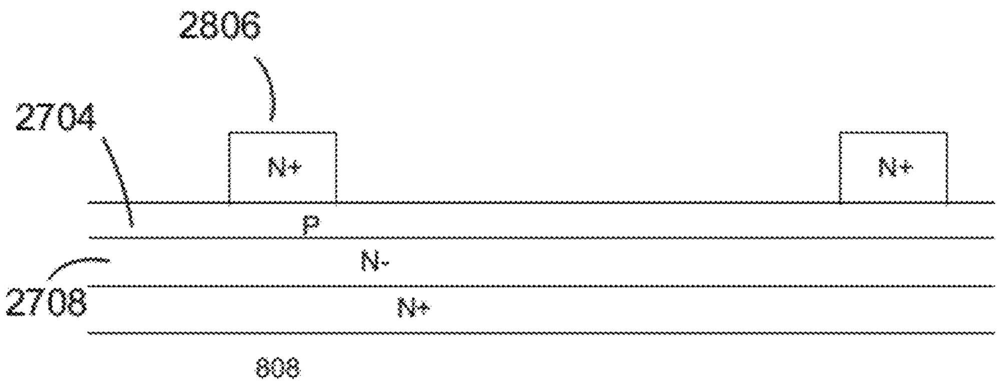
Figure 28C:
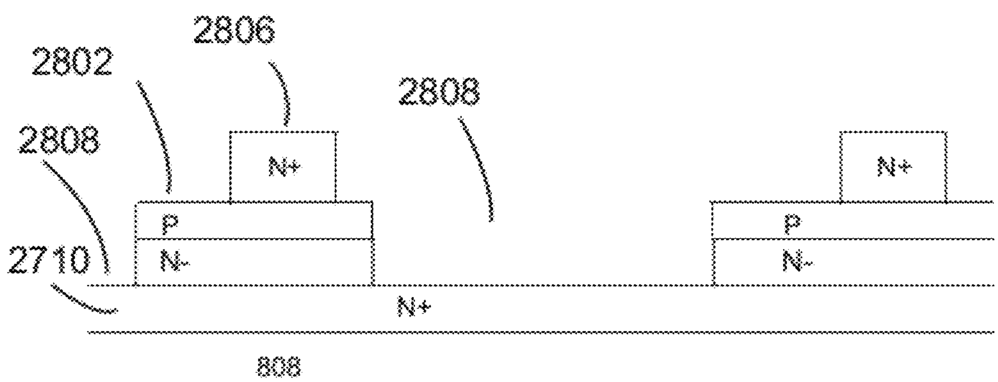
Figure 28D:
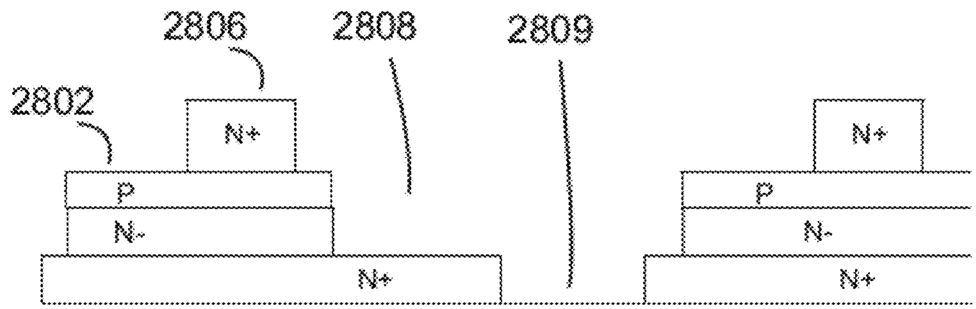
Figure 28E:
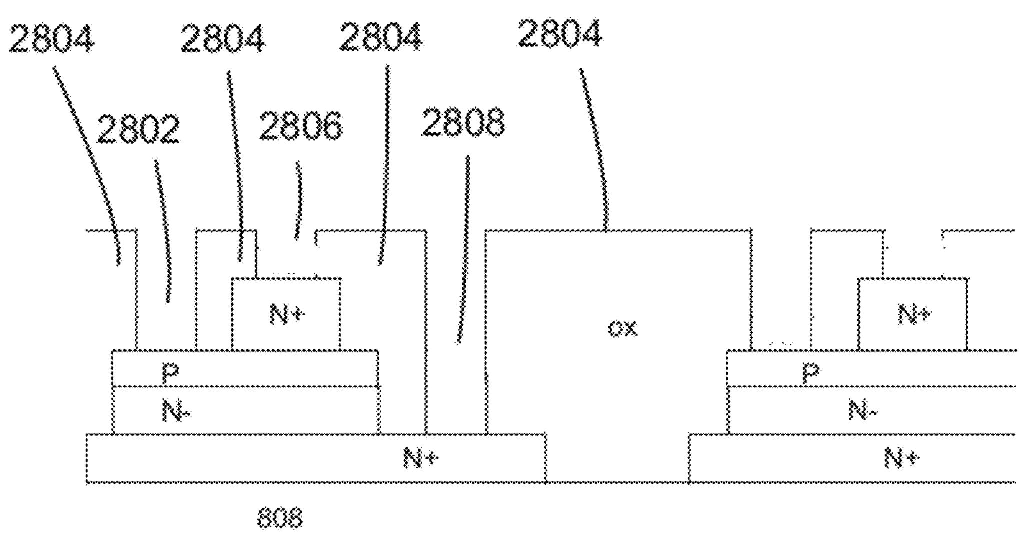

FIGS. 28A-28E are drawing illustrations of the formation of top layer bipolar junction transistors. FIG. 28A illustrates the layer transferred on top of wafer or layer 808 after the smart cut wherein the N+ 28A02 which used to be part of 2702 may now be on top. Effectively at this point there may be a giant transistor overlaying the entire wafer. The following steps are multiple etch steps as illustrated in FIG. 28B to 28D where the giant transistor may be cut and defined as needed and aligned to the underlying layers of pre-processed wafer or layer 808. These etch steps also expose the different layers including the bipolar transistors to allow contacts to be made with the emitter 2806, base 2802 and collector 2808, and etching substantially all the way to the top oxide of pre-processed wafer or layer 808 to isolate between transistors as isolation 2809 in FIG. 28D. The top N+ doped layer 28A02 may be masked and etched as illustrated in FIG. 28B to form the emitter 2806. Then the p layer 2704 and N− layer 2708 doped layers may be masked and etched as illustrated in FIG. 28C to form the base 2802. Then the collector layer 2710 may be masked and etched to the top oxide of pre-processed wafer or layer 808, thereby creating isolation 2809 between transistors as illustrated in FIG. 28D. Then the entire structure may be covered with a Low Temperature Oxide 2804, the oxide planarized with CMP, and then masked and etched to form contacts to the emitter 2806, base 2802 and collector 2808 as illustrated in FIG. 28E. The oxide 2804 may be a non-conducting dielectric material also filling the etched space isolation 2809 between the top transistors and could include other isolating material such as silicon nitride. This flow may enable the formation of mono-crystalline top bipolar transistors that could be connected to the underlying multi-metal layer semiconductor device without exposing the underlying device to high temperature.

The bipolar transistors formed with reference to FIGS. 27 and 28 may be used to form analog or digital BiCMOS circuits where the CMOS transistors may be on the substrate primary layer 802 with pre-processed wafer or layer 808 and the bipolar transistors may be formed in the transferred top layer.

Another class of devices that may be constructed partly at high temperature before layer transfer to a substrate with metal interconnects and may then be completed at low temperature after a layer transfer may be a junction-less transistor (JLT). For example, in deep sub-micron processes copper metallization may be utilized, so a high temperature would be above about 400° C., whereby a low temperature would be about 400° C. and below. The junction-less transistor structure may avoid the sharply graded junctions that may be needed as silicon technology scales, and may provide the ability to have a thicker gate oxide for an equivalent performance when compared to a traditional MOSFET transistor. The junction-less transistor may also be known as a nanowire transistor without junctions, or gated resistor, or nanowire transistor as described in a paper by Jean-Pierre Colinge, et.

al., published in Nature Nanotechnology on Feb. 21, 2010. The junction-less transistors may be constructed whereby the transistor channel is a thin solid piece of evenly and heavily doped single crystal silicon. The doping concentration of the channel may be identical to that of the source and drain. The considerations may include that the nanowire channel be thin and narrow enough to allow for full depletion of the carriers when the device is turned off, and the channel doping be high enough to allow a reasonable current to flow when the device is on. These considerations may lead to tight process variation boundaries for channel thickness, width, and doping for a reasonably obtainable gate work function and gate oxide thickness.

Figure 52A:
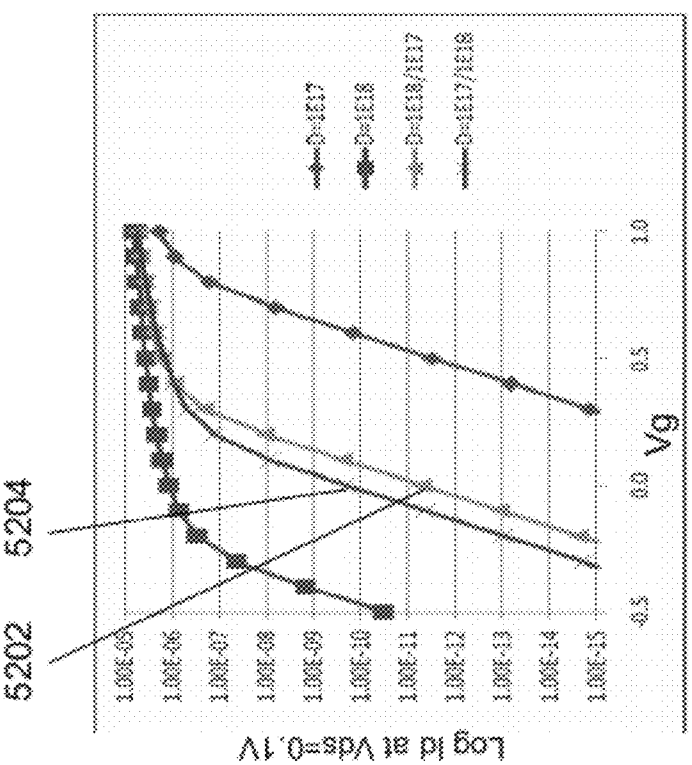
FIG. 52A, 52B are device simulations of a junction-less transistor.
Figure 52B:
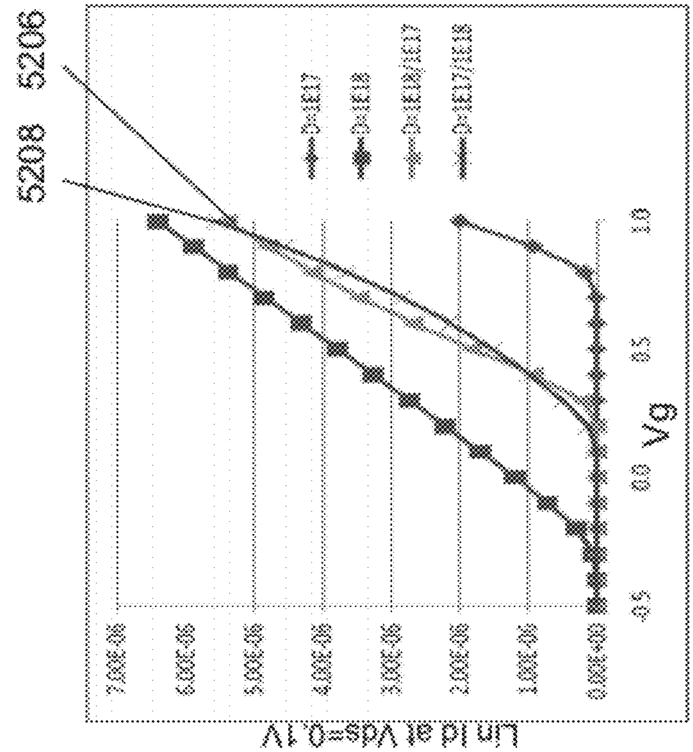

One of the challenges of a junction-less transistor device is turning the channel off with minimal leakage at a zero gate bias. As an embodiment of the invention, to enhance gate control over the transistor channel, the channel may be doped unevenly; whereby the heaviest doping may be closest to the gate or gates and the channel doping may be lighter the farther away from the gate electrode. One example may be where the center of a 2, 3, or 4 gate sided junction-less transistor channel is more lightly doped than the edges towards the gates. This may enable much lower off currents for the same gate work function and control. FIGS. 52 A and 52B show, on logarithmic and linear scales respectively, simulated drain to source current Ids as a function of the gate voltage Vg for various junction-less transistor channel dopings where the total thickness of the n-channel is 20 nm. Two of the four curves in each figure may correspond to evenly doping the nm channel thickness to 1E17 and 1E18 atoms/cm3, respectively. The remaining two curves show simulation results where the 20 nm channel may have two layers of 10 nm thickness each. In the legend denotations for the remaining two curves, the first number may correspond to the 10 nm portion of the channel that is the closest to the gate electrode. For example, the curve D=1E18/1E17 shows the simulated results where the 10 nm channel portion doped at 1E18 is closest to the gate electrode while the 10 nm channel portion doped at 1E17 is farthest away from the gate electrode. In FIG. 52A, curves 5202 and 5204 may correspond to doping patterns of D=1E18/1E17 and D=1E17/1E18, respectively. According to FIG. 52A, at a Vg of 0 volts, the off current for the doping pattern of D=1E18/1E17 is about 50 times lower than that of the reversed doping pattern of D=1E17/1E18. Likewise, in FIG. 52B, curves 5206 and 5208 correspond to doping patterns of D=1E18/1E17 and D=1E17/1E18, respectively. FIG. 52B shows that at a Vg of 1 volt, the Ids of both doping patterns may be within a few percent of each other.

The junction-less transistor channel may be constructed with even, graded, or discrete layers of doping. The channel may be constructed with materials other than doped mono-crystalline silicon, such as poly-crystalline silicon, or other semi-conducting, insulating, or conducting material, such as graphene or other graphitic material, and may be in combination with other layers of similar or different material. For example, the center of the channel may include a layer of oxide, or of lightly doped silicon, and the edges towards the gates more heavily doped single crystal silicon. This may enhance the gate control effectiveness for the off state of the junction-less transistor, and may also increase the on-current due to strain effects on the other layer or layers in the channel. Strain techniques may also be employed from covering and insulator material above, below, and surrounding the transistor channel and gate. Lattice modifiers may also be employed to strain the silicon, such as an embedded SiGe implantation and anneal. The cross section of the transistor channel may be rectangular, circular, or oval shaped, to enhance the gate control of the channel. Alternatively, to optimize the mobility of the P-channel junction-less transistor in the 3D layer transfer method, the donor wafer may be rotated 90 degrees with respect to the acceptor wafer prior to bonding to facilitate the creation of the P-channel in the <110> silicon plane direction.

Figure 56A:
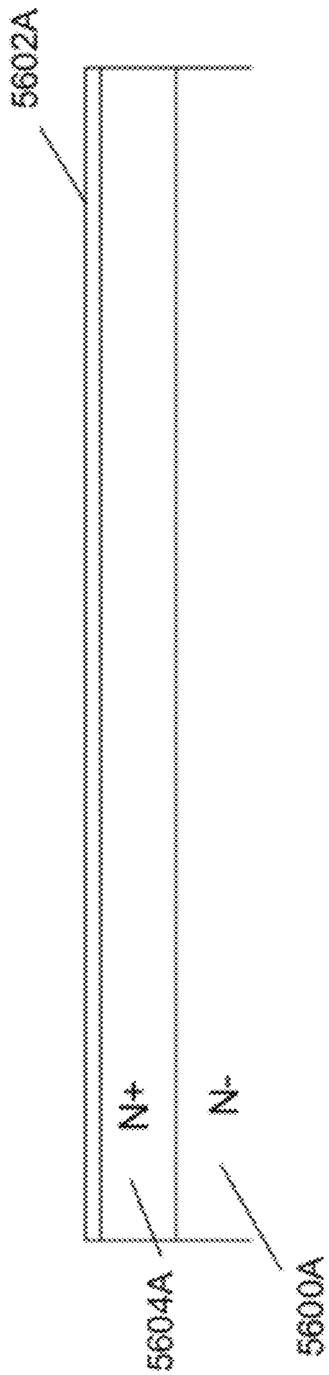
FIG. 56 A-M are exemplary drawing illustrations of the formation of a junction-less transistor.
Figure 56B:
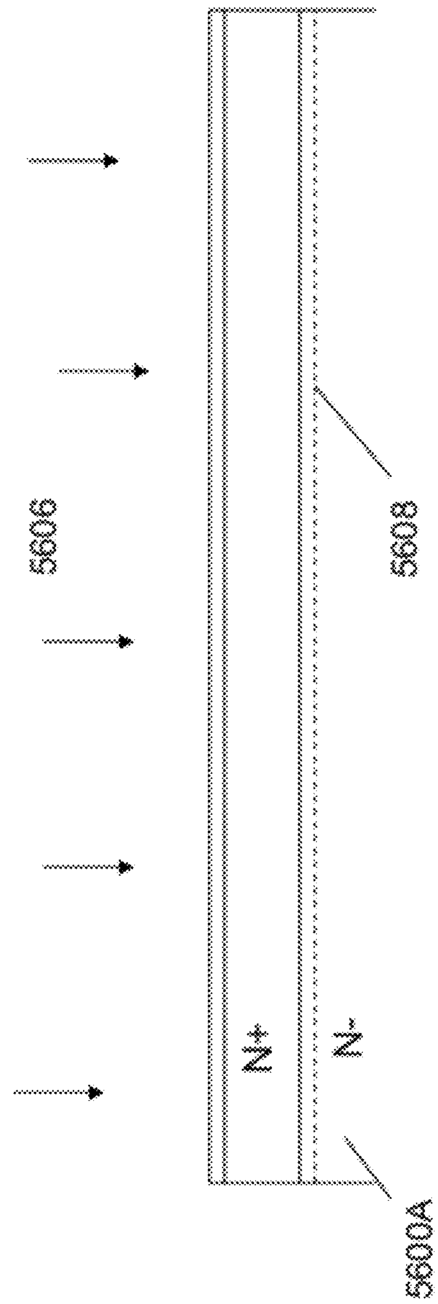
Figure 56C:
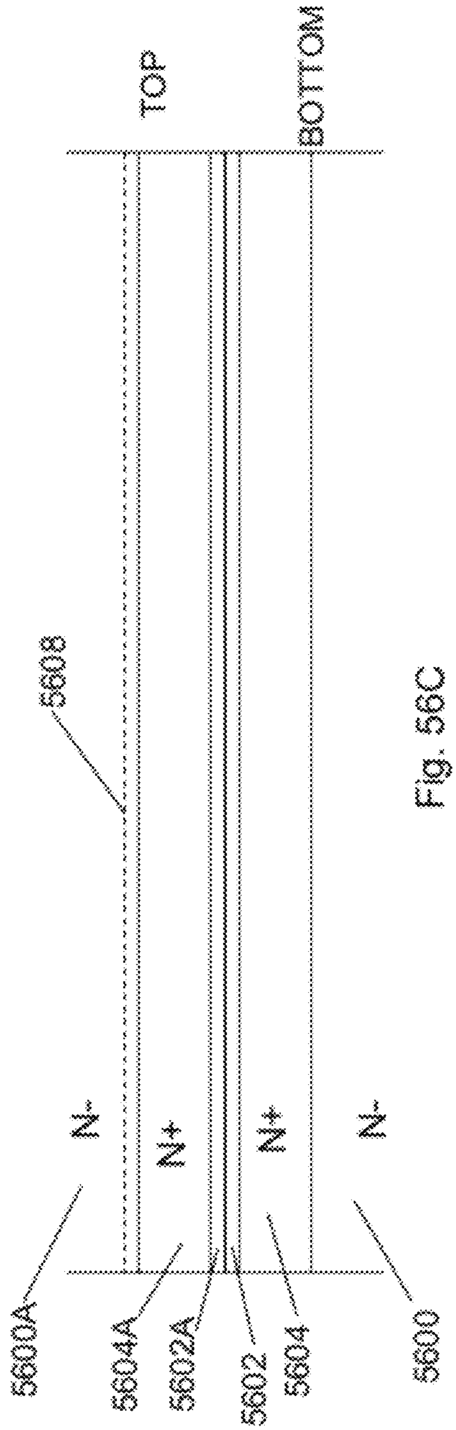
Figure 56D:
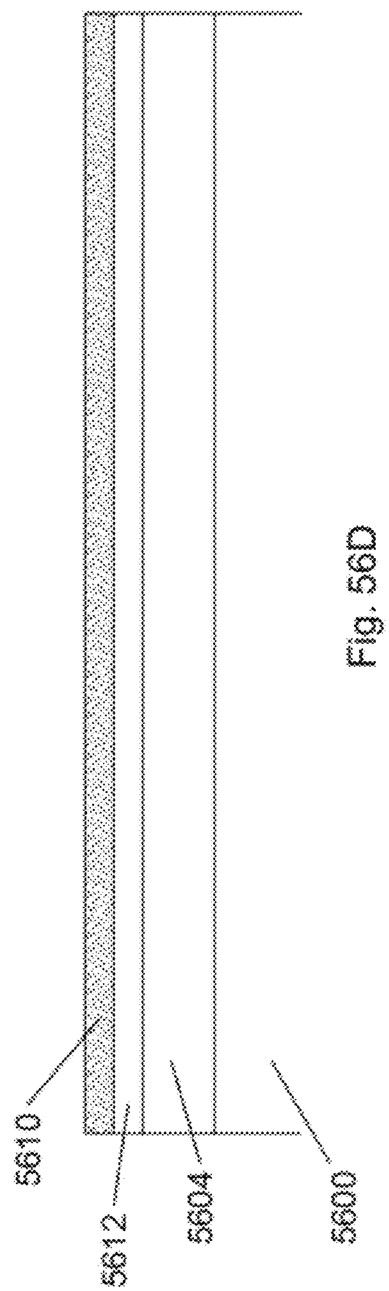

To construct an n-type 4-sided gated junction-less transistor a silicon wafer may be preprocessed to be used for layer transfer as illustrated in FIG. 56A-56G. These processes may be at temperatures above about 400 degrees Centigrade as the layer transfer to the processed substrate with metal interconnects has yet to be done. As illustrated in FIG. 56A, an N− wafer 5600A may be processed to have a layer of N+ 5604A, by implant and activation, by an N+ epitaxial growth, or may be a deposited layer of heavily N+ doped polysilicon. A gate oxide 5602A may be grown before or after the implant, to a thickness about half of the final top-gate oxide thickness. FIG. 56B is a drawing illustration of the pre-processed wafer made ready for a layer transfer by an implant 5606 of an atomic species, such as H+, preparing the “cleaving plane” 5608 in the N− region 5600A of the substrate, and plasma or other surface treatments to prepare the oxide surface for wafer oxide to oxide bonding. Another wafer may be prepared as above without the H+ implant and the two are bonded as illustrated in FIG. 56C, to transfer the pre-processed single crystal N− silicon with N+ layer and half gate oxide, on top of a similarly pre-processed, but not cleave implanted, N− wafer 5600 with N+ layer 5604 and oxide 5602. The top wafer may be cleaved and removed from the bottom wafer. This top wafer may now also be processed and reused for more layer transfers to form the resistor layer. The remaining top wafer N− and N+ layers may be chemically and mechanically polished to a very thin N+ silicon layer 5610 as illustrated in FIG. 56D. This thin N+ silicon layer 5610 may be on the order of 5 to 40 nm thick and will eventually form the junction-less transistor channel, or resistor, that may be gated on four sides. The two ‘half’ gate oxides 5602, 5602A may now be atomically bonded together to form the gate oxide 5612, which may eventually become the top gate oxide of the junction-less transistor in FIG. 56E. A high temperature anneal may be performed to remove any residual oxide or interface charges.

Alternatively, the wafer that becomes the bottom wafer in FIG. 56C may be constructed wherein the N+ layer 5604 may be formed with heavily doped polysilicon and the half gate oxide 5602 may be deposited or grown prior to layer transfer. The bottom wafer N+ silicon or polysilicon layer 5604 may eventually become the top-gate of the junction-less transistor.

Figure 56E:
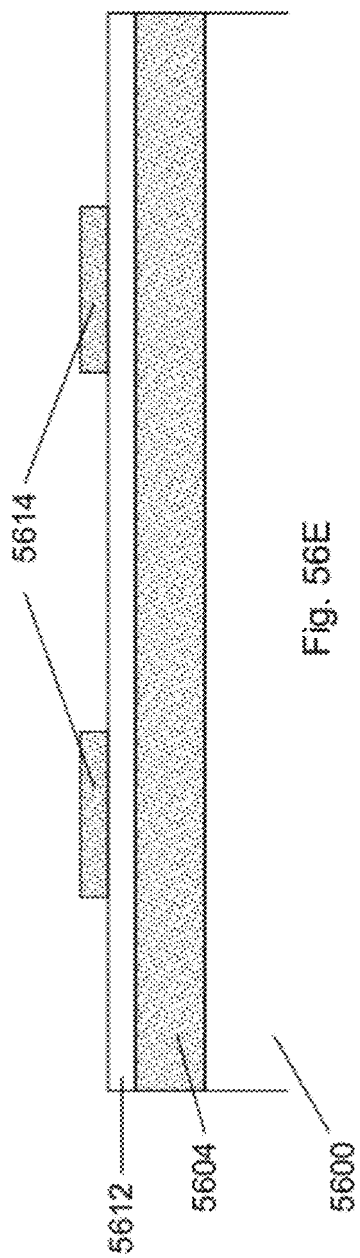
Figure 56F:
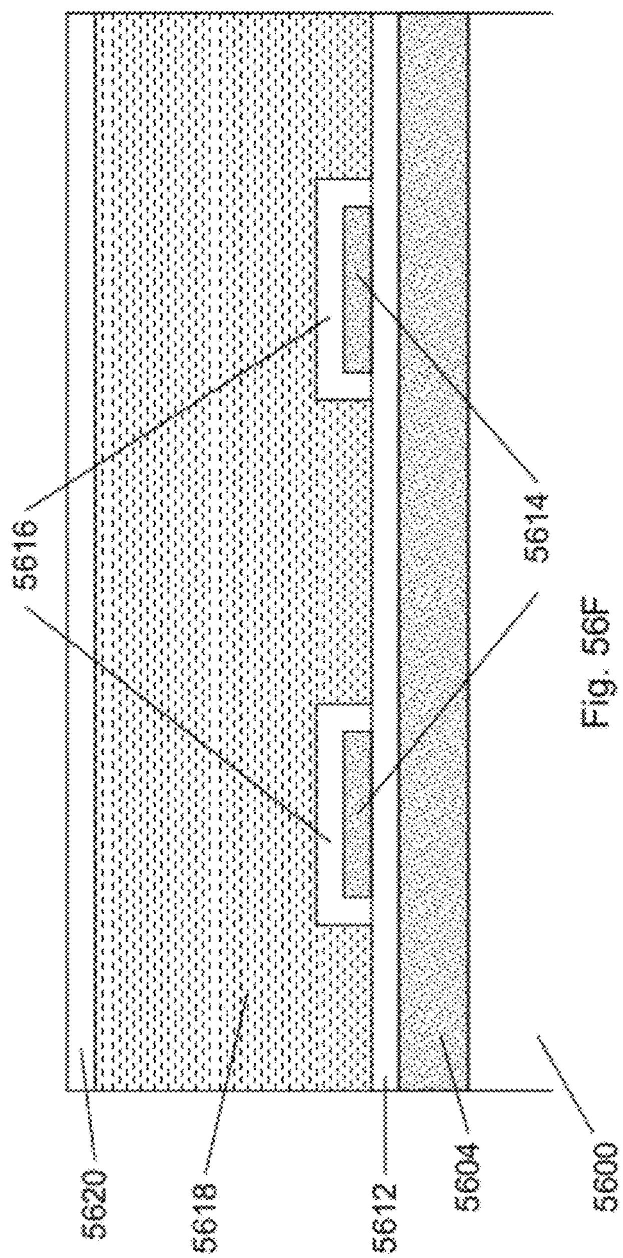
Figure 56G:
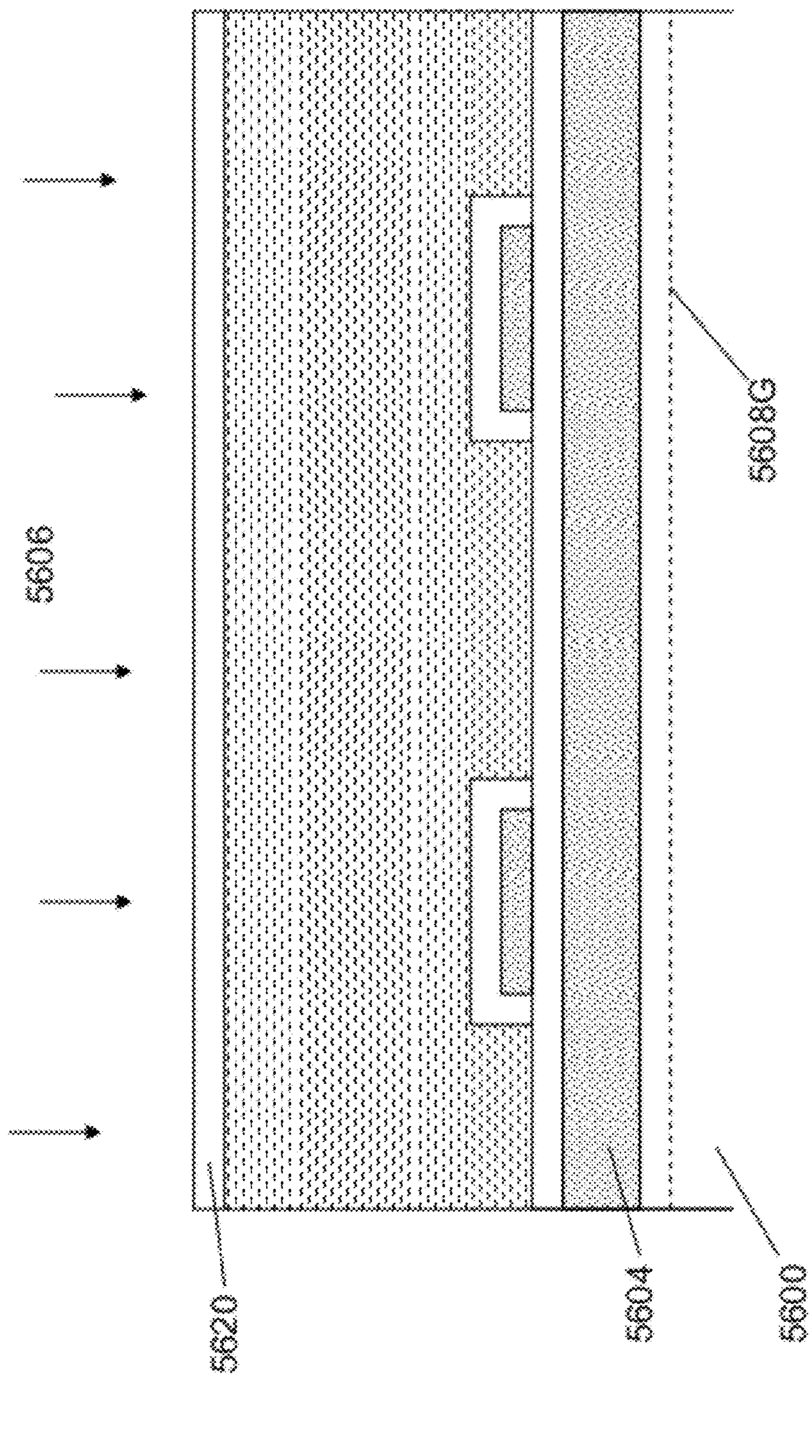
Figure 56H:
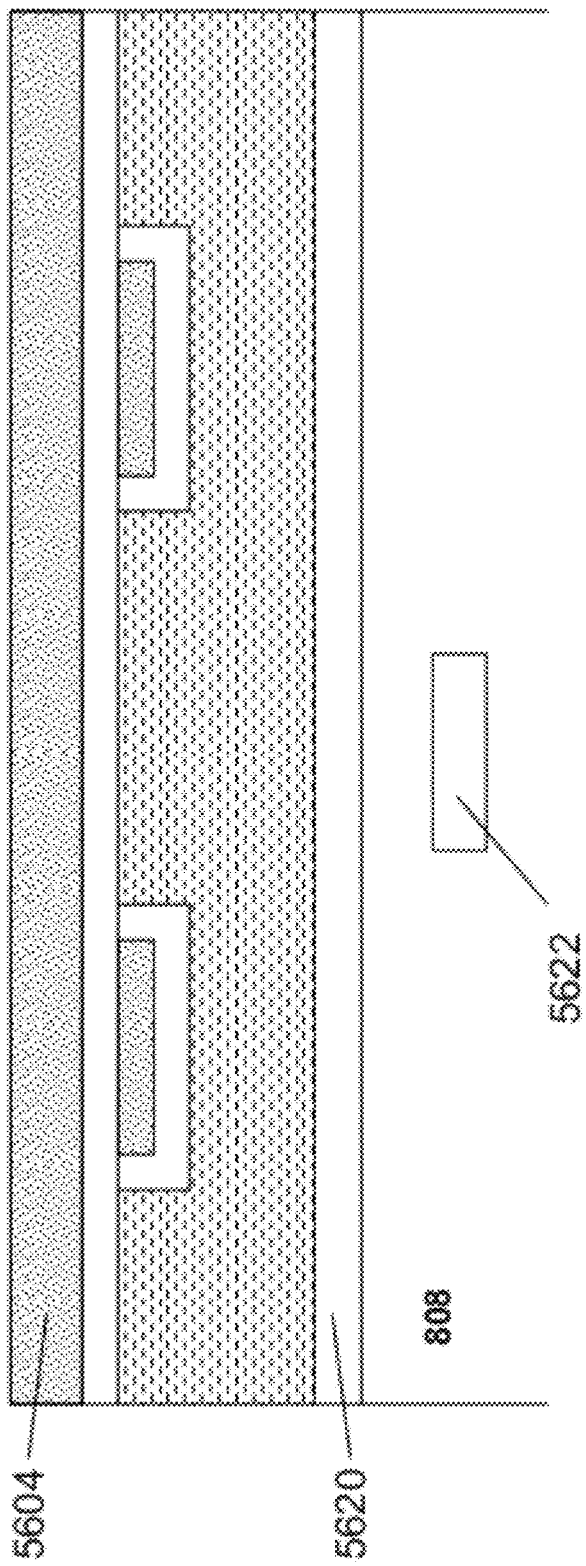

As illustrated in FIGS. 56E to 56G, the wafer may be conventionally processed, at temperatures higher than about 400° C. as necessary, in preparation to layer transfer the junction-less transistor structure to the processed ‘house’ wafer 808. A thin oxide may be grown to protect the resistor silicon thin N+ silicon layer 5610 top, and then parallel wires, resistors 5614, of repeated pitch of the thin resistor layer may be masked and etched as illustrated in FIG. 56E and then the photoresist is removed. The thin oxide, if present, may be striped in a dilute hydrofluoric acid (HF) solution and a conventional gate oxide 5616 may be grown and polysilicon 5618, doped or undoped, may be deposited as illustrated in FIG. 56F. The polysilicon may be chemically and mechanically polished (CMP’ed) flat and a thin oxide 5620 may be grown or deposited to facilitate a low temperature oxide to oxide wafer bonding in the next step. The polysilicon 5618 may be implanted for additional doping either before or after the CMP. This polysilicon 5618, may eventually become the bottom and side gates of the junction-less transistor. FIG. 56G is a drawing illustration of the wafer being made ready for a layer transfer by an implant 5606 of an atomic species, such as H+, preparing the "cleaving plane" 5608G in the N− region 5600 of the substrate and plasma or other surface treatments to prepare the oxide surface for wafer oxide to oxide bonding. The acceptor wafer 808 with logic transistors and metal interconnects may be prepared for a low temperature oxide to oxide wafer bond with surface treatments of the top oxide and the two are bonded as illustrated in FIG. 56H. The top donor wafer may be cleaved and removed from the bottom acceptor wafer 808 and the top N− substrate may be removed by CMP (chemical mechanical polish). A metal interconnect strip 5622 in the house 808 may be also illustrated in FIG. 56H.

Figure 56I:
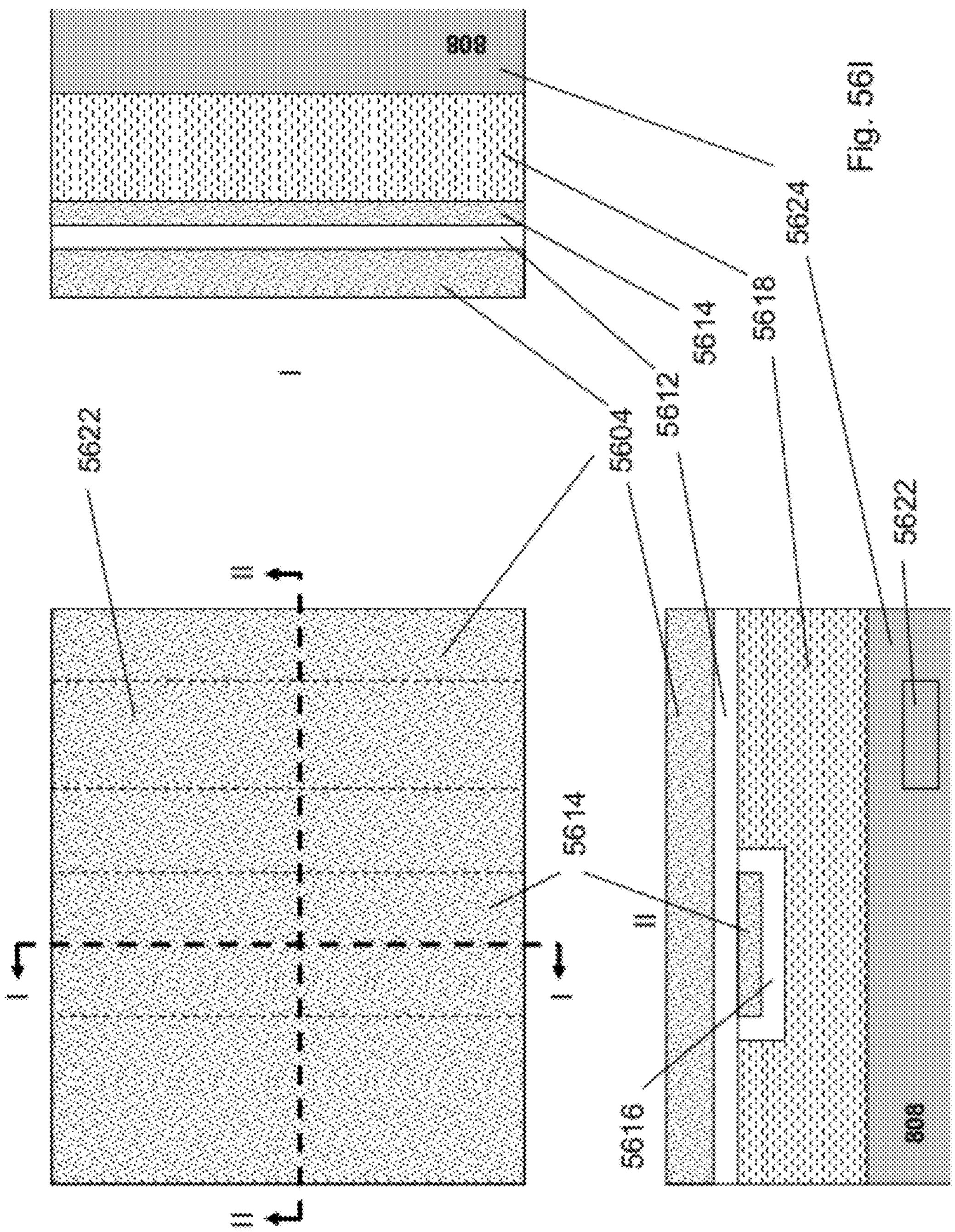

FIG. 56I is a top view of a wafer at the same step as FIG. 56H with two cross-sectional views I and II. The N+ layer 5604, which may eventually form the top gate of the resistor, and the top gate oxide 5612 may gate one side of the resistor 5614 line, and the bottom and side gate oxide 5616 with the polysilicon bottom and side gates 5618 may gate the other three sides of the resistor 5614 line. The logic house wafer 808 may have a top oxide layer 5624 that may also encase the top metal interconnect strip 5622, to an extent shown as dotted lines in the top view.

Figure 56J:
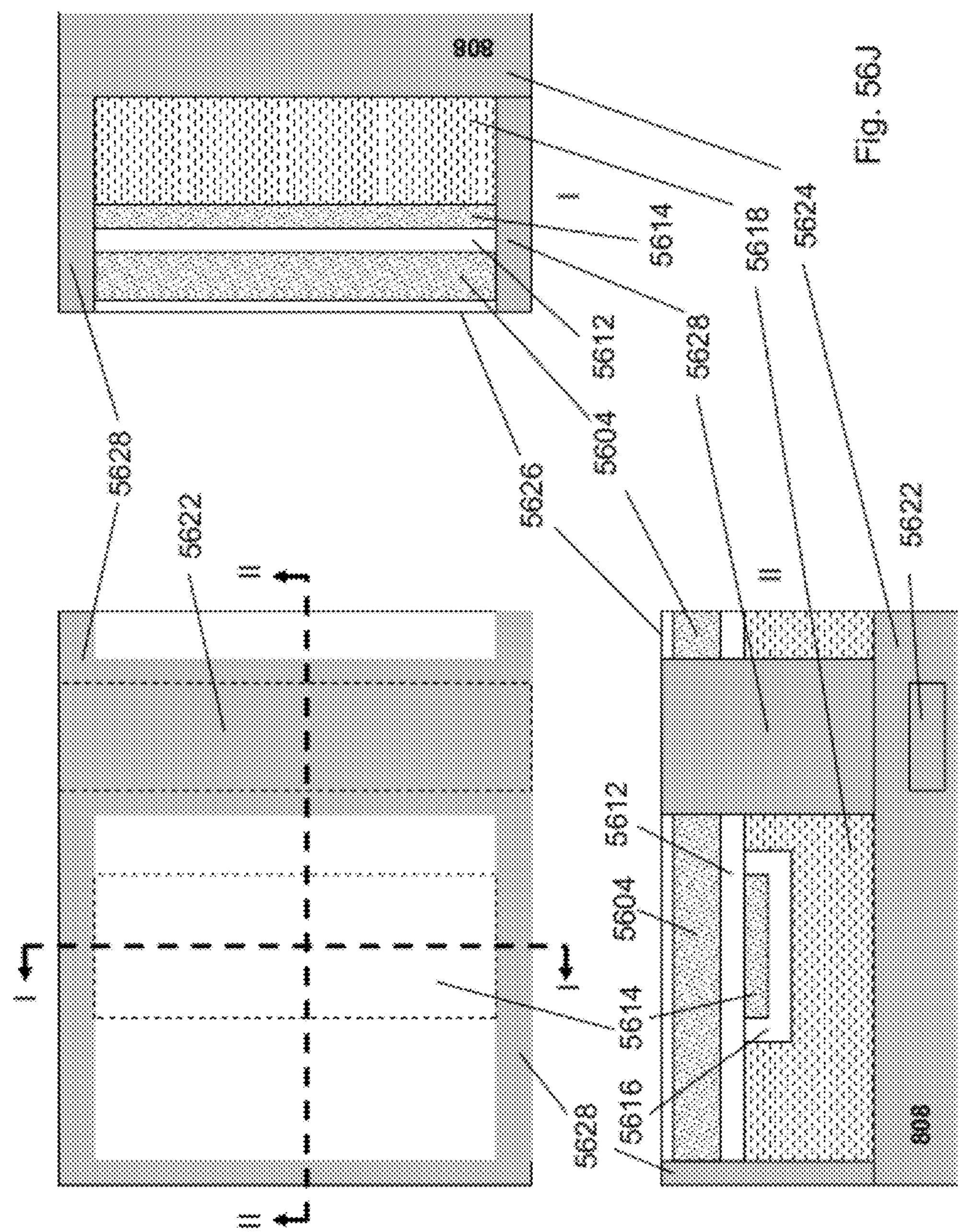
Figure 56K:
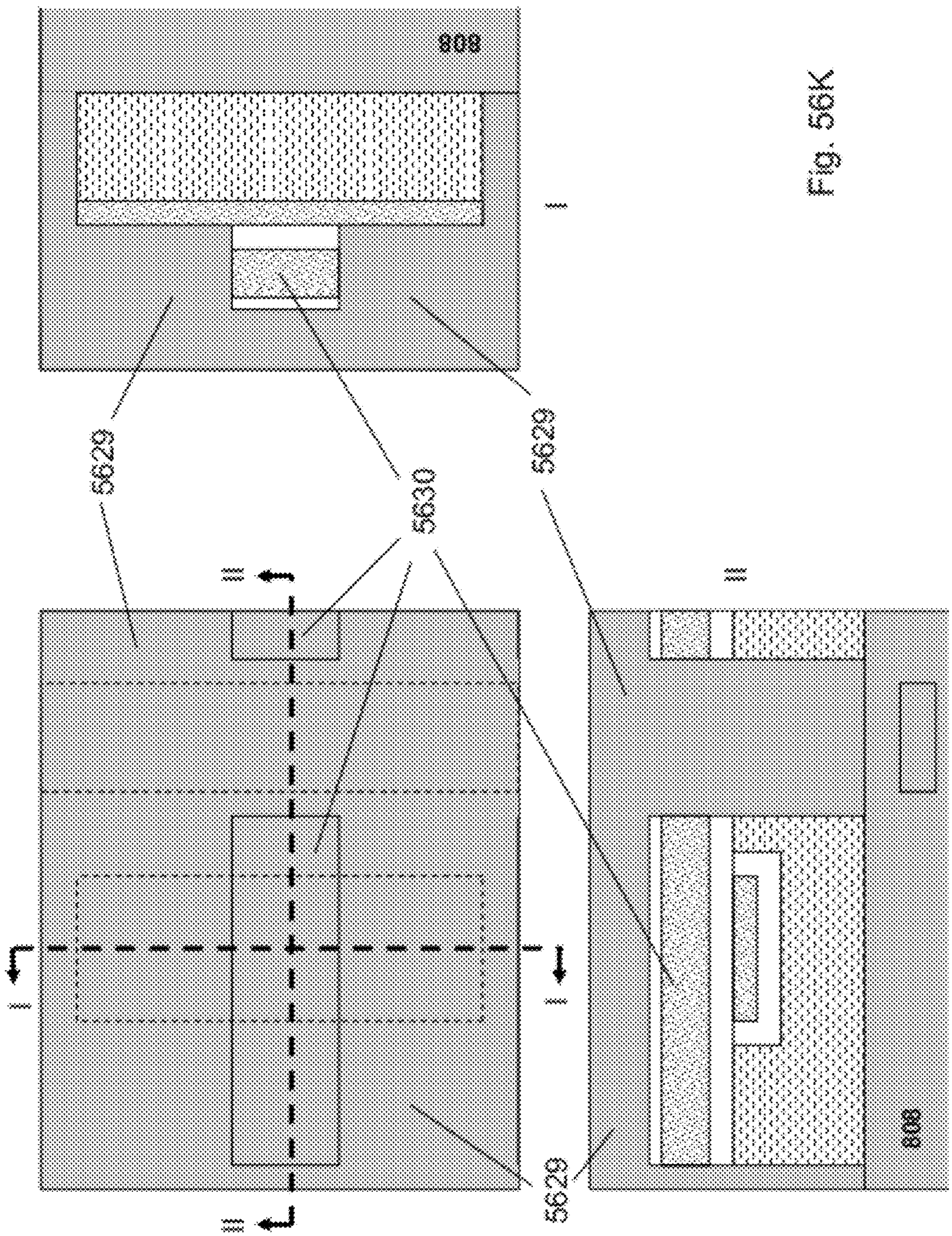

In FIG. 56J, a polish stop layer 5626 of a material such as oxide and silicon nitride may be deposited on the top surface of the wafer, and isolation openings 5628 may be masked and etched to the depth of the house 808 oxide layer 5624 to fully isolate transistors. The isolation openings 5628 may be filled with a low temperature gap fill oxide, and chemically and mechanically polished (CMP'ed) flat. The top gate 5630 may be masked and etched as illustrated in FIG. 56K, and then the etched openings 5629 may be filled with a low temperature gap fill oxide deposition, and chemically and mechanically (CMP'ed) polished flat, then an additional oxide layer may be deposited to enable interconnect metal isolation.

Figure 56L:
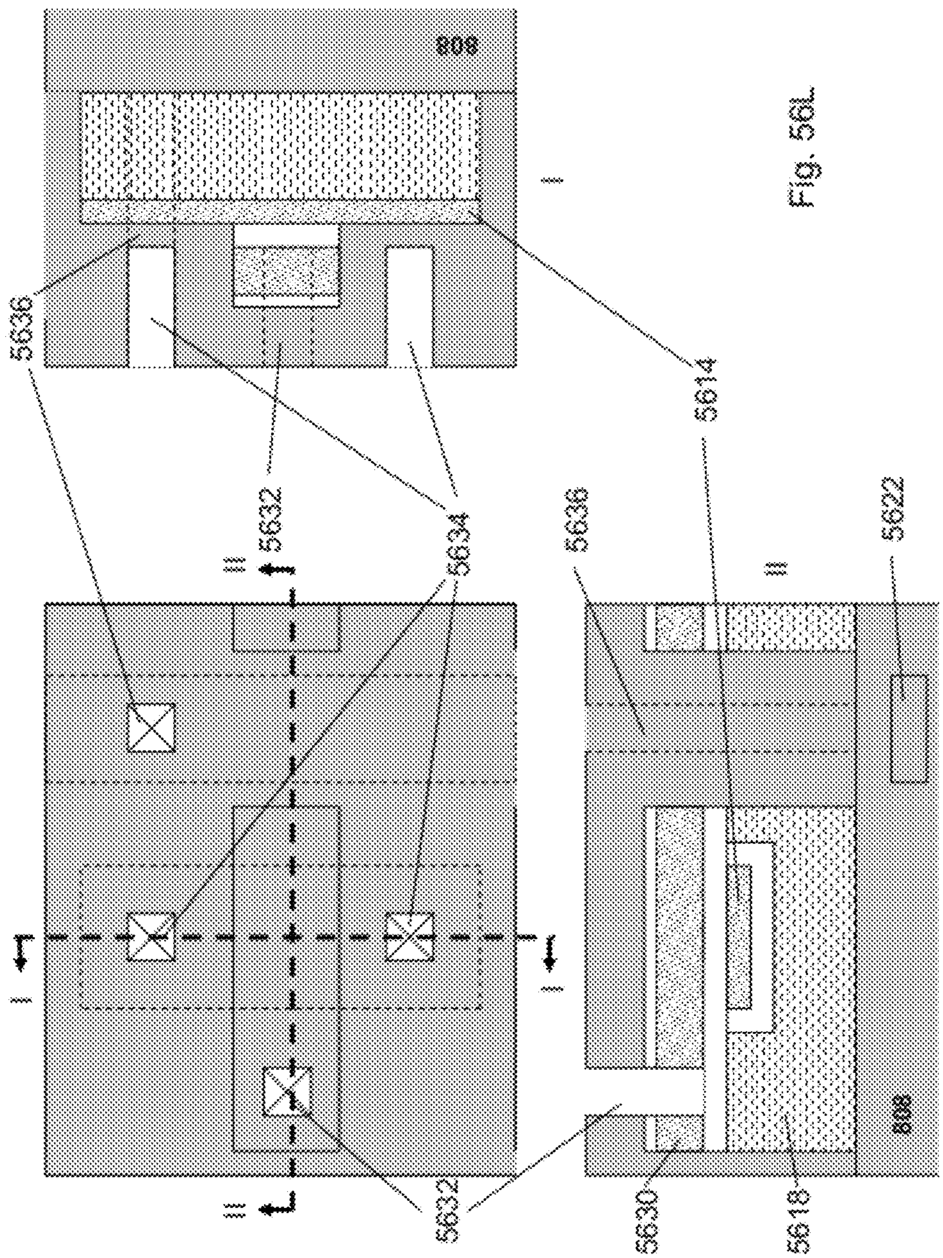

The contacts may be masked and etched as illustrated in FIG. 56L. The gate contact 5632 may be masked and etched, so that the contact etches through the top gateb 5630 layer, and during the metal opening mask and etch process the gate oxide may be etched and the top gate 5630 and bottom gate 5618 gates may be connected together. The contacts 5634 to the two terminals of the resistor 5614 may be masked and etched. And then the through vias 5636 to the house wafer 808 and metal interconnect strip 5622 may be masked and etched.

Figure 56M:
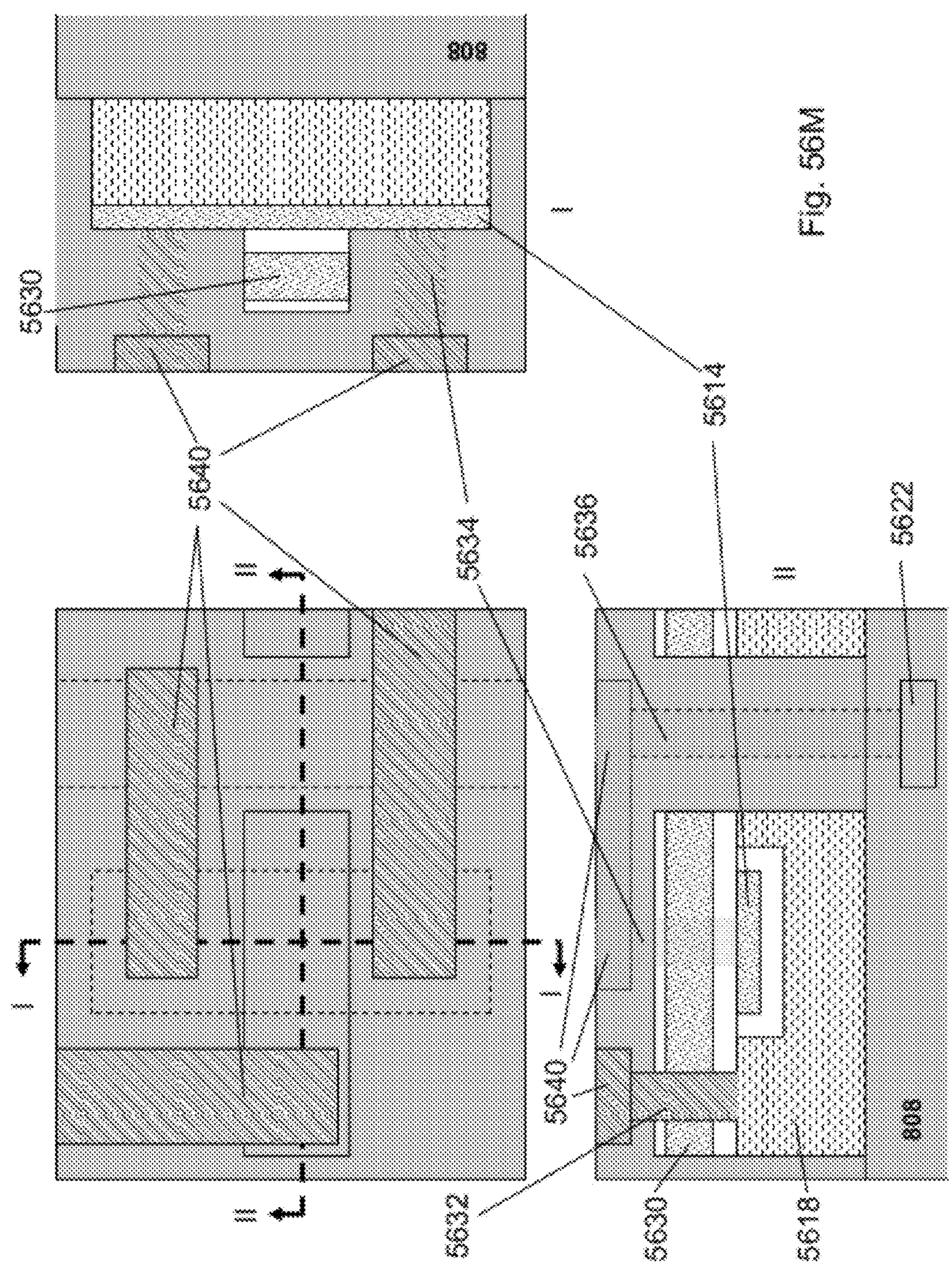

As illustrated in FIG. 56M, the metal lines 5640 may be mask defined and etched, filled with barrier metals and copper interconnect, and CMP'ed in a normal metal interconnect scheme, thereby completing the contact via 5632 simultaneous coupling to the top gate 5630 and bottom gate 5618 gates, the two terminal contacts 5634 of the resistor 5614, and the through via to the house wafer 808 metal interconnect strip 5622. This flow may enable the formation of a monocrystalline 4-sided gated junction-less transistor that could be connected to the underlying multi-metal layer semiconductor device without exposing the underlying devices to high temperature.

Alternatively, as illustrated in FIGS. 96A to 96J, an n-channel 4-sided gated junction-less transistor (JLT) may be constructed that is suitable for 3D IC manufacturing. 4-sided gated JLTs can also be referred to as gate-all around JLTs or silicon nano-wire JLTs.

Figure 96A:
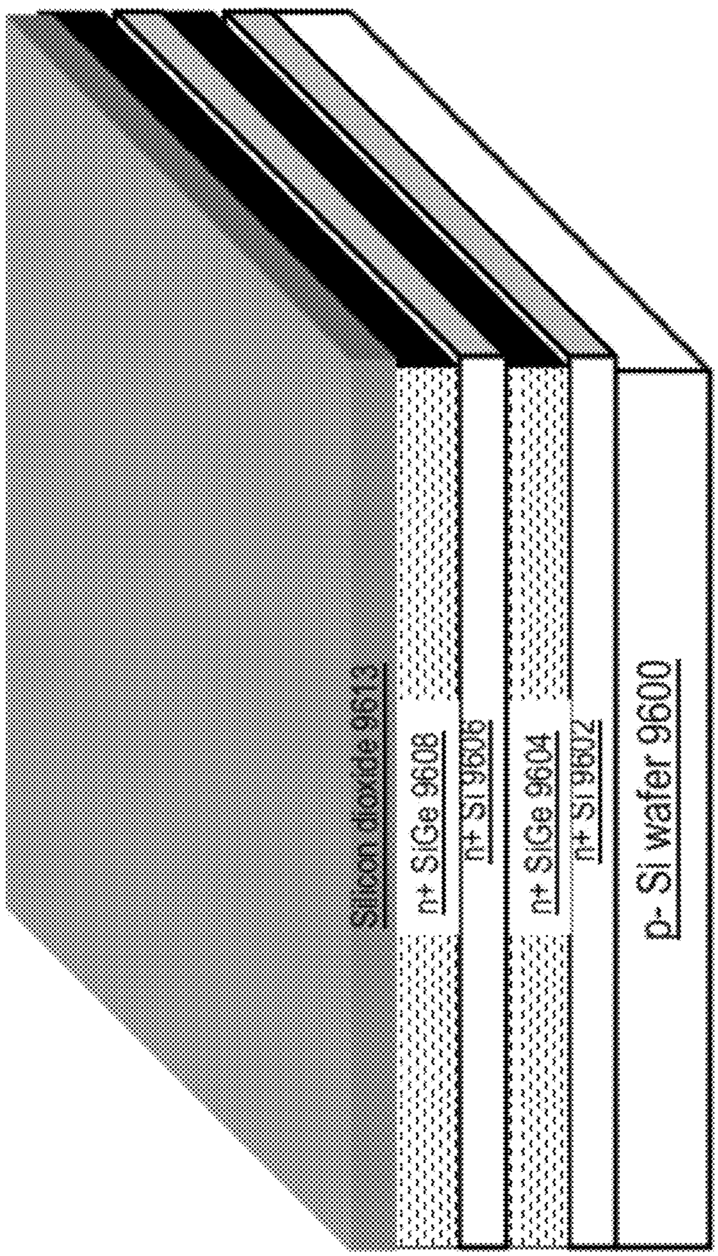

As illustrated in FIG. 96A, a P− (shown) or N− substrate donor wafer 9600 may be processed to include wafer sized layers of N+ doped silicon 9602 and 9606, and wafer sized layers of n+ SiGe 9604 and 9608. Layers 9602, 9604, 9606, and 9608 may be grown epitaxially and are carefully engineered in terms of thickness and stoichiometry to keep the defect density due to the lattice mismatch between Si and SiGe low. The stoichiometry of the SiGe may be unique to each SiGe layer to provide for different etch rates as will be utilized later. Some techniques for achieving the defect density low include keeping the thickness of the SiGe layers below the critical thickness for forming defects. The top surface of donor wafer 9600 may be prepared for oxide wafer bonding with a deposition of an oxide 9613. These processes may be done at temperatures above about 400° C. as the layer transfer to the processed substrate with metal interconnects may have yet to be done. A wafer sized layer denotes a continuous layer of material or combination of materials that may extend across the wafer to the full extent of the wafer edges and may be about uniform in thickness. If the wafer sized layer may include dopants, then the dopant concentration may be substantially the same in the x and y direction across the wafer, but may vary in the z direction perpendicular to the wafer surface.

Figure 96B:
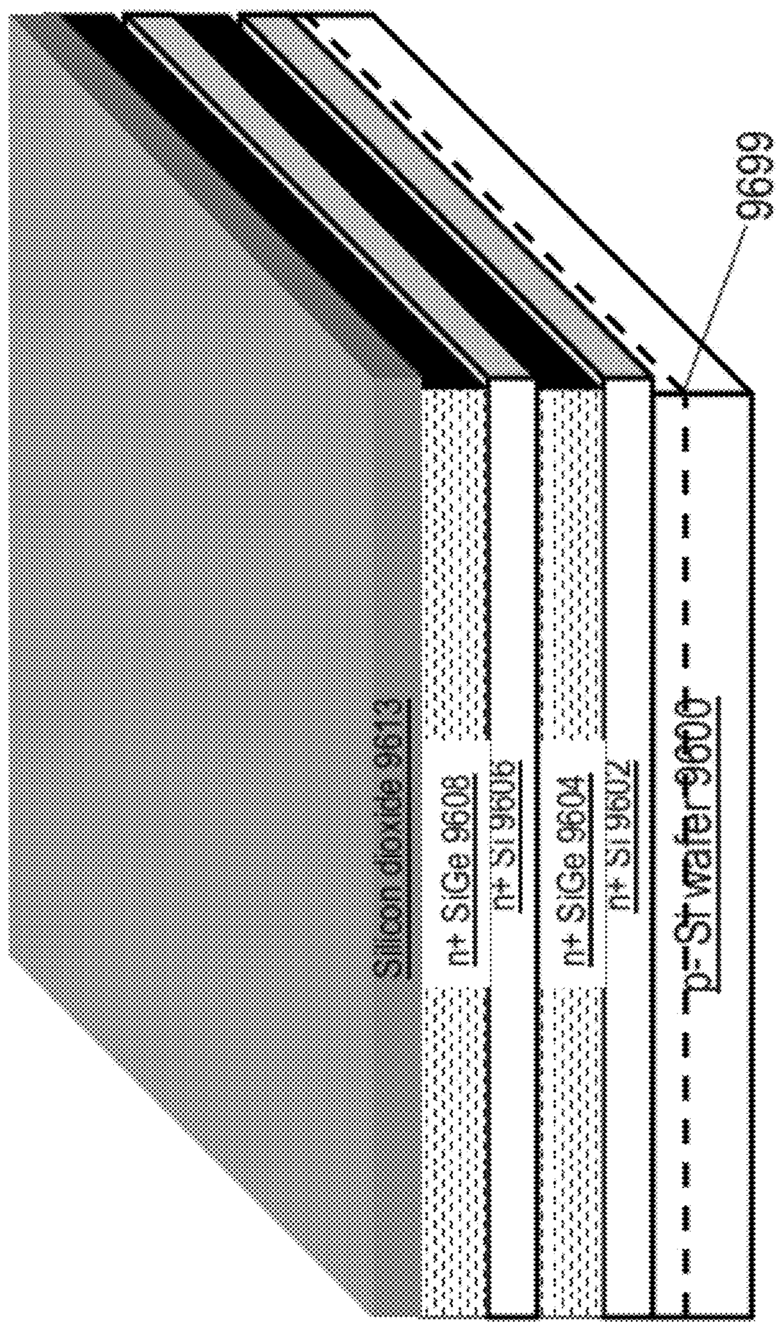

As illustrated in FIG. 96B, a layer transfer demarcation plane 9699 (shown as a dashed line) may be formed in donor wafer 9600 by hydrogen implantation or other layer transfer methods as previously described.

Figure 96C:
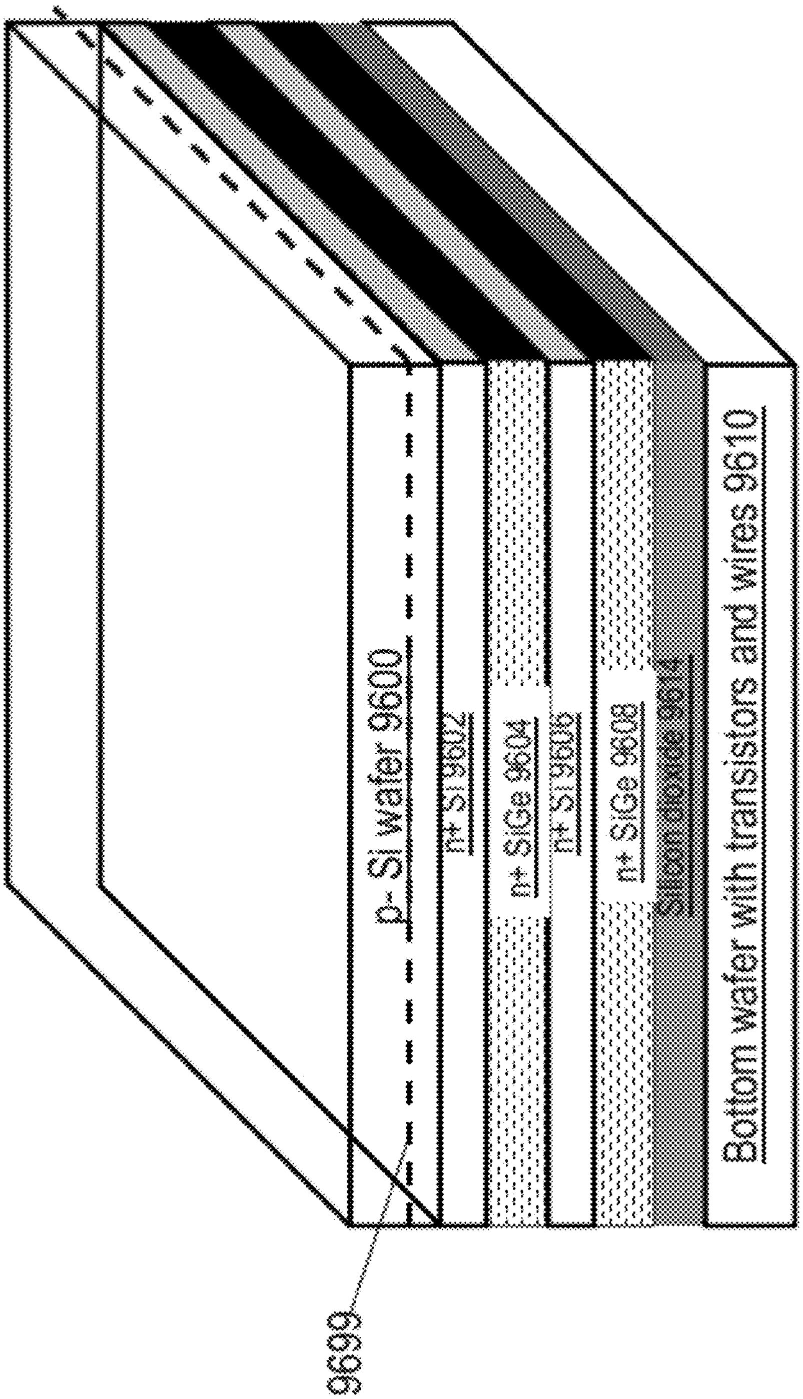

As illustrated in FIG. 96C, both the donor wafer 9600 and acceptor wafer 9610 top layers and surfaces may be prepared for wafer bonding as previously described and then donor wafer 9600 may be flipped over, aligned to the acceptor wafer 9610 alignment marks (not shown) and bonded together at a low temperature (less than about 400° C.). Oxide 9613 from the donor wafer and the oxide of the surface of the acceptor wafer 9610 may thus be atomically bonded together are designated as oxide 9614.

Figure 96D:
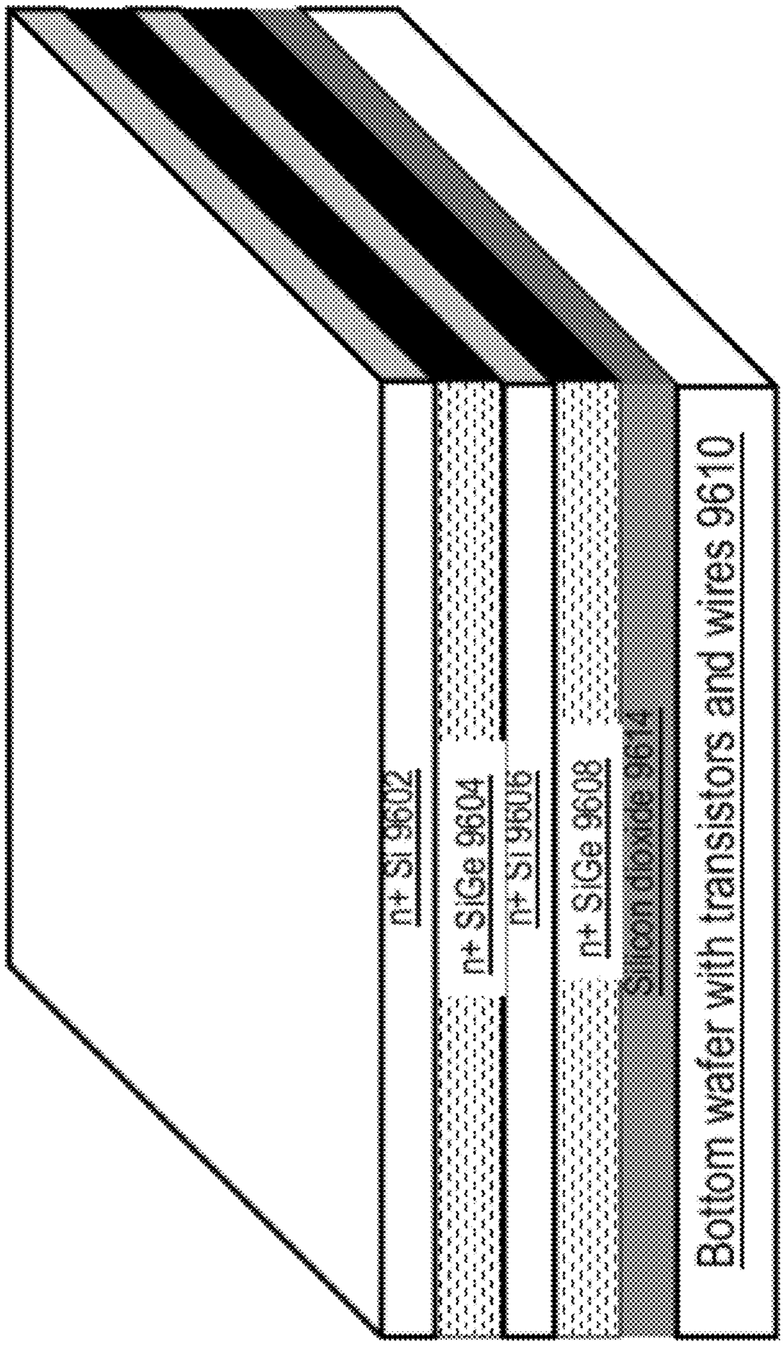

As illustrated in FIG. 96D, the portion of the P− donor wafer 9600 that may be above the layer transfer demarcation plane 9699 may be removed by cleaving and polishing, etching, or other low temperature processes as previously described. A CMP process may be used to remove the remaining P− layer until the N+ silicon layer 9602 is reached. This process of an ion implanted atomic species, such as Hydrogen, forming a layer transfer demarcation plane, and subsequent cleaving or thinning, may be called 'ion-cut'. Acceptor wafer 9610 may have similar meanings as wafer 808 previously described with reference to FIG. 8.

Figure 96E:
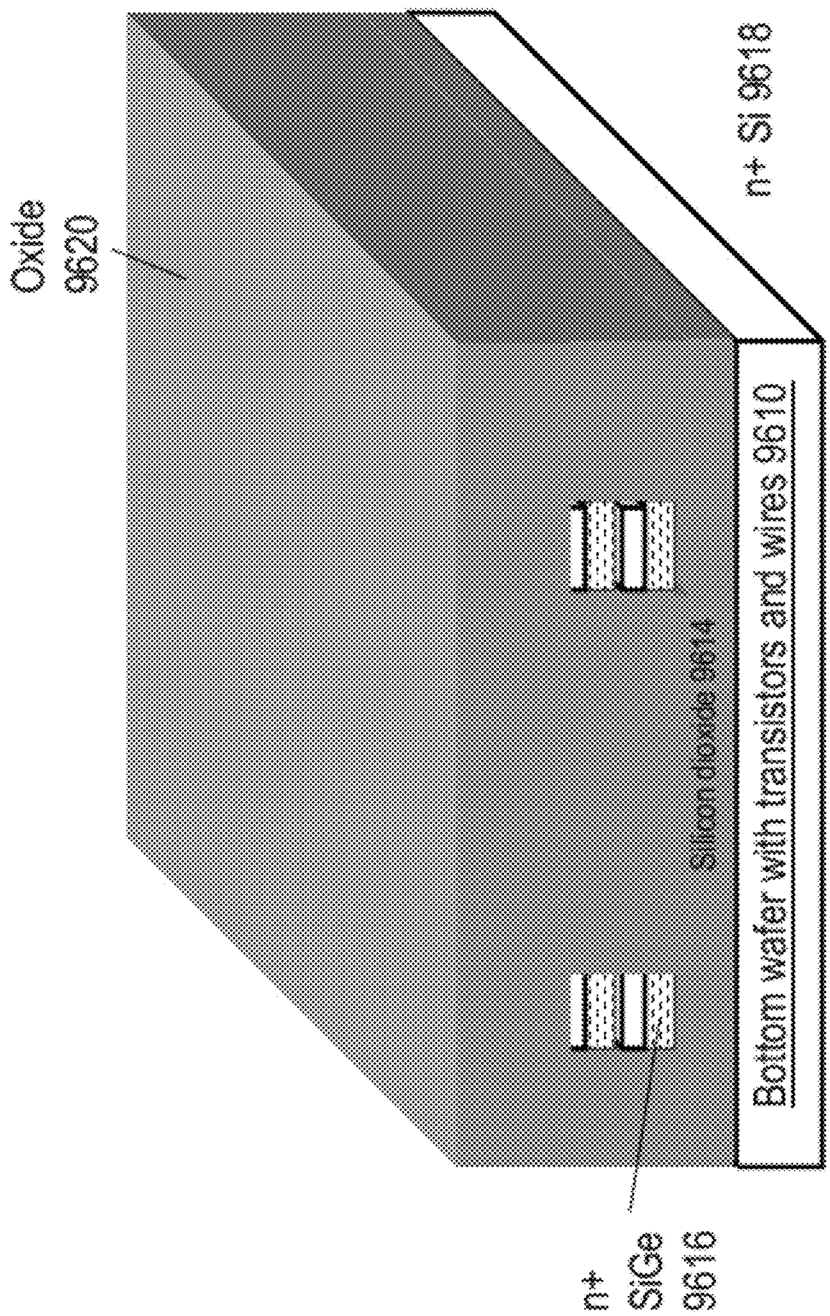

As illustrated in FIG. 96E, stacks of N+ silicon and n+ SiGe regions that may become transistor channels and gate areas may be formed by lithographic definition and plasma/RIE etching of N+ silicon layers 9602 & 9606 and n+ SiGe layers 9604 & 9608. The result may be stacks of n+ SiGe 9616 and N+ silicon 9618 regions. The isolation between stacks may be filled with a low temperature gap fill oxide 9620 and chemically and mechanically polished (CMP'ed) flat. This may fully isolate the transistors from each other. The stack ends may be exposed in the illustration for clarity of understanding.

Figure 96F:
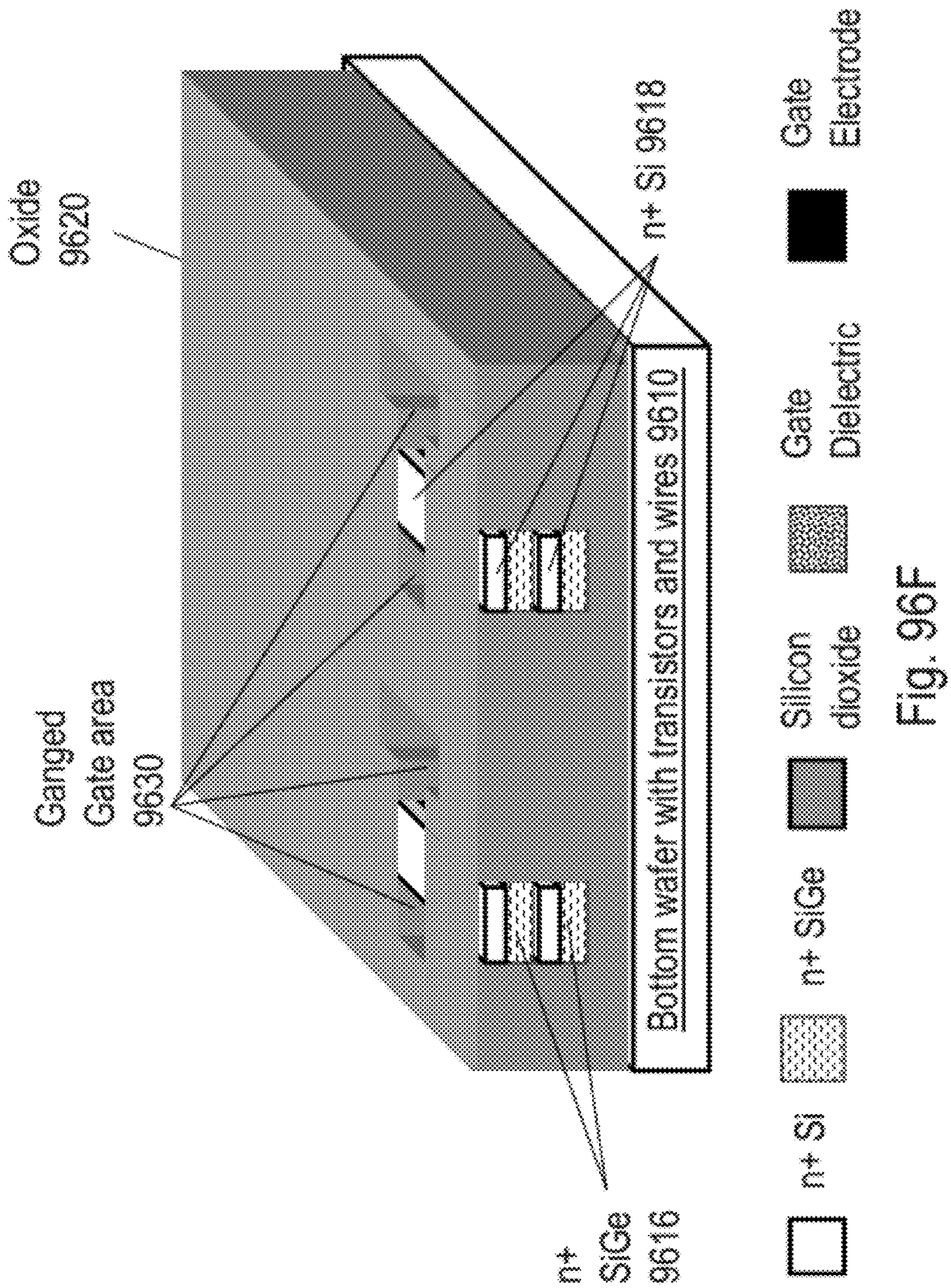

As illustrated in FIG. 96F, eventual ganged or common gate area 9630 may be lithographically defined and oxide etched. This may expose the transistor channels and gate area stack sidewalls of alternating N+ silicon 9618 and n+ SiGe 9616 regions to the eventual ganged or common gate area 9630. The stack ends may be exposed in the illustration for clarity of understanding.

Figure 96G:
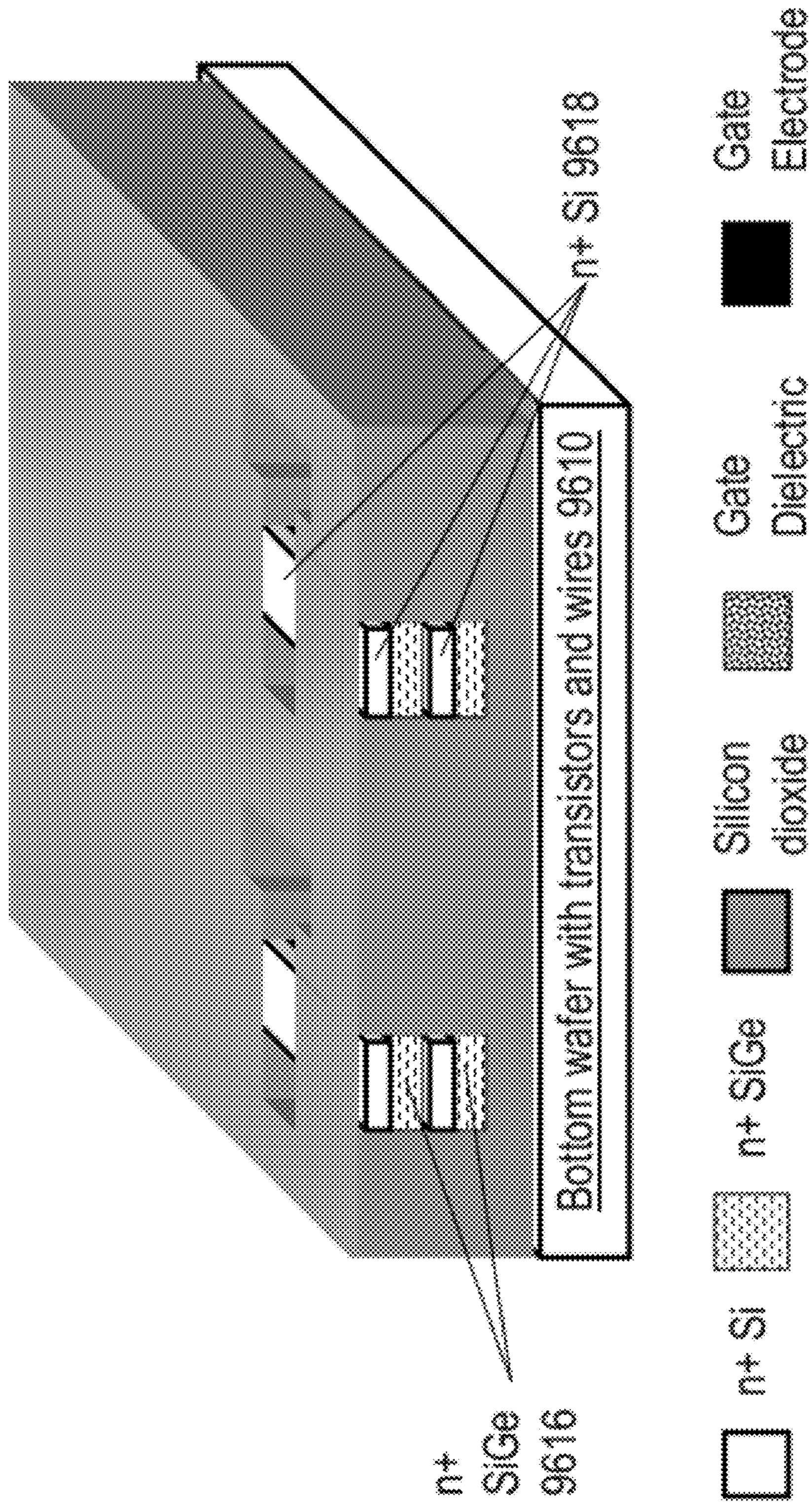

As illustrated in FIG. 96G, the exposed n+ SiGe regions 9616 may be removed by a selective etch recipe that does not attack the N+ silicon regions 9618. This may create air gaps between the N+ silicon regions 9618 in the eventual ganged or common gate area 9630. Such etching recipes are described in "High performance 5 nm radius twin silicon nanowire MOSFET(TSNWFET): Fabrication on bulk Si wafer, characteristics, and reliability," in *Proc. IEDM Tech. Dig.,* 2005, pp. 717-720 by S. D. Suk, et. al. The n+ SiGe layers farthest from the top edge may be stoichiometrically crafted such that the etch rate of the layer (now region) farthest from the top (such as n+ SiGe layer 9608) may etch slightly faster than the layer (now region) closer to the top (such as n+ SiGe layer 9604), thereby equalizing the eventual gate lengths of the two stacked transistors. The stack ends are exposed in the illustration for clarity of understanding.

Figure 96H:
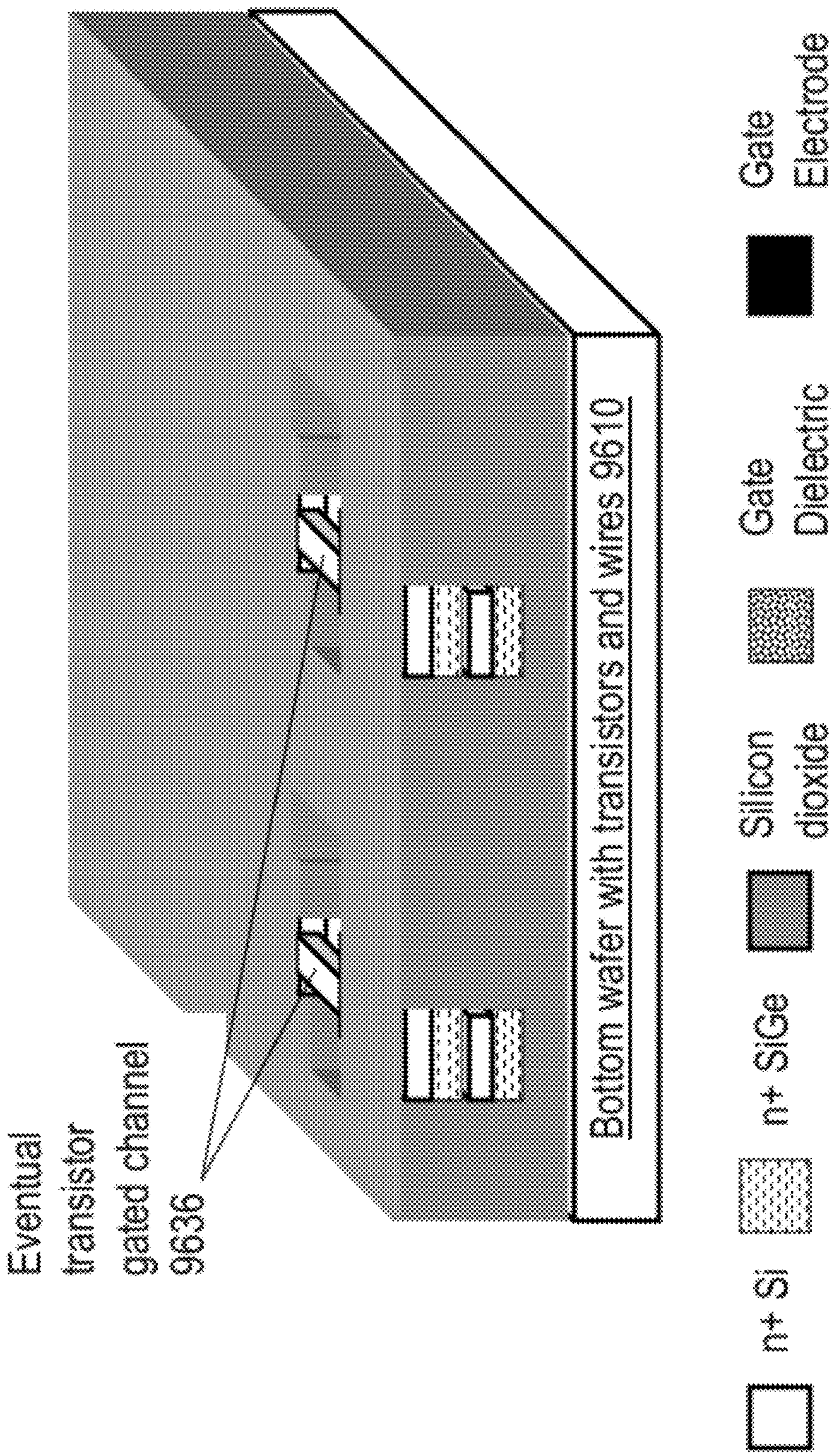

As illustrated in FIG. 96H, an example step of reducing the surface roughness, rounding the edges, and thinning the diameter of the N+ silicon regions 9618 that are exposed in the ganged or common gate area may utilize a low temperature oxidation and subsequent HF etch removal of the oxide just formed. This may be repeated multiple times. Hydrogen may be added to the oxidation or separately utilized atomically as a plasma treatment to the exposed N+ silicon surfaces. The result may be a rounded silicon nanowire-like structure to form the eventual transistor gated channel 9636. These methods of reducing surface roughness of silicon may be utilized in combination with other embodiments of the invention. The stack ends are exposed in the illustration for clarity of understanding.

Figure 96I:
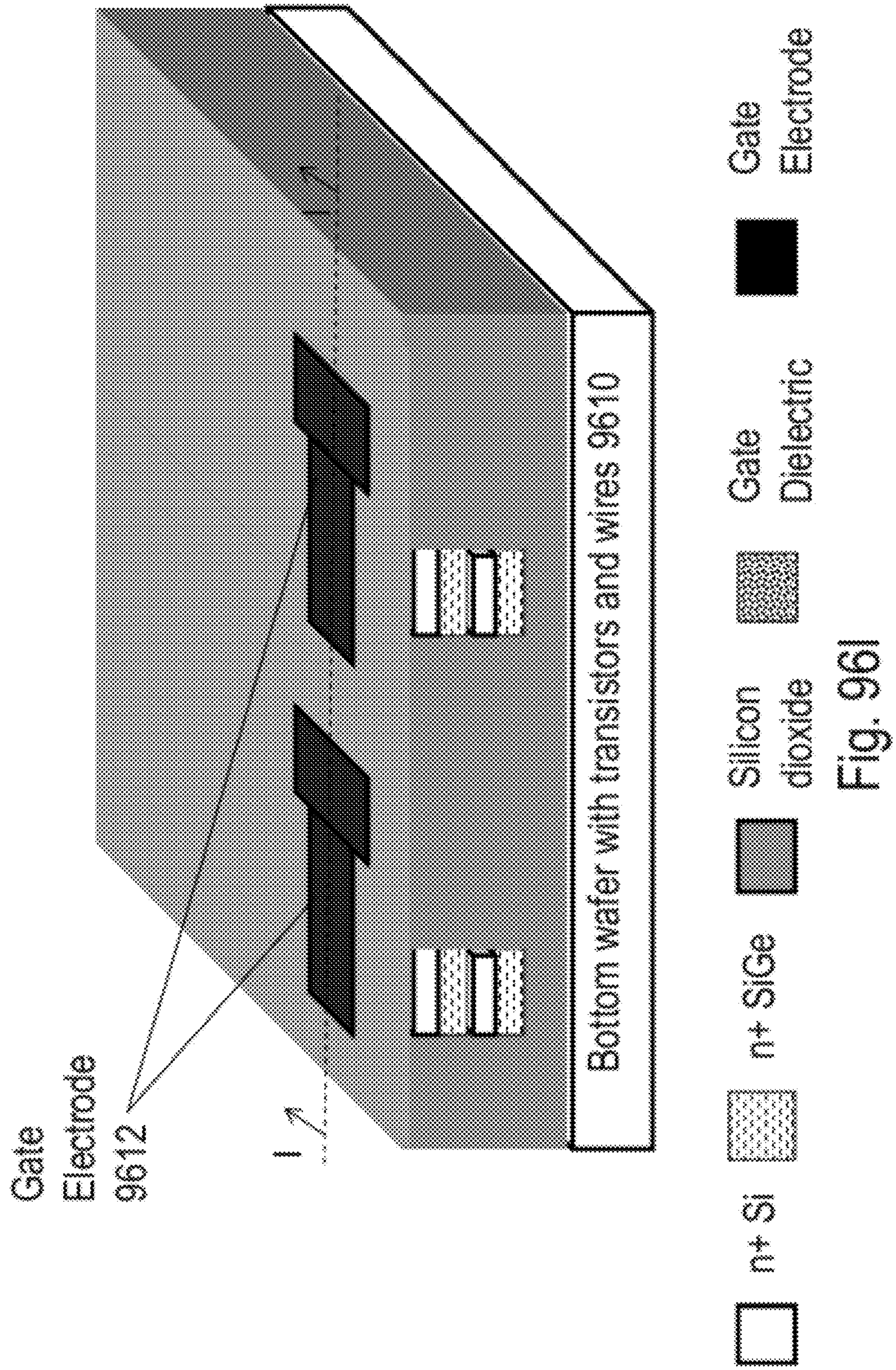

As illustrated in FIG. 96I a low temperature based gate dielectric 9611 may be deposited and densified to serve as the junction-less transistor gate oxide. Alternatively, a low temperature microwave plasma oxidation of the eventual transistor gated channel 9636 silicon surfaces may serve as the JLT gate oxide or an atomic layer deposition (ALD) technique may be utilized to form the HKMG gate oxide as previously described. Then deposition of a low temperature gate material, such as P+ doped amorphous silicon, may be performed. Alternatively, a HKMG gate structure may be formed as described previously. A CMP may be performed after the gate material deposition, thus forming gate electrode 9612. The stack ends may be exposed in the illustration for clarity of understanding.

Figure 96J:
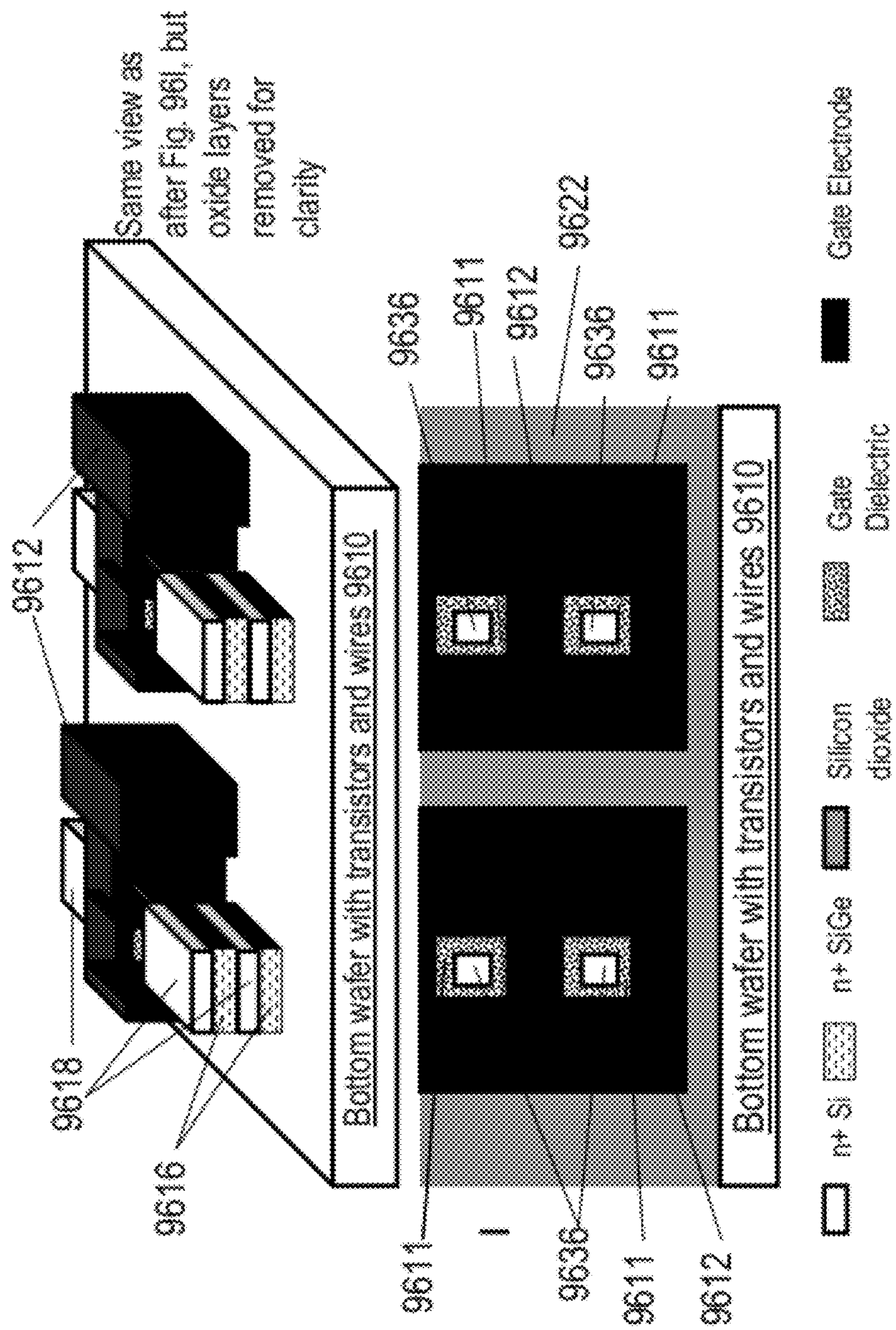

FIG. 96J shows the complete JLT transistor stack formed in FIG. 96I with the oxide removed for clarity of viewing, and a cross-sectional cut I of FIG. 96I. Gate electrode 9612 and gate dielectric 9611 may surround the transistor gated channel 9636 and each ganged transistor stack may be isolated from one another by oxide 9622. The source and drain connections of the transistor stacks can be made to the N+ Silicon 9618 and n+ SiGe 9616 regions that may not be covered by the gate electrode 9612.

Contacts to the 4-sided gated JLT's source, drain, and gate may be made with conventional Back end of Line (BEOL) processing as described previously and coupling from the formed JLTs to the acceptor wafer may be accomplished with formation of a through layer via (TLV) connection to an acceptor wafer metal interconnect pad. This flow may enable the formation of a mono-crystalline silicon channel 4-sided gated junction-less transistor that may be formed and connected to the underlying multi-metal layer semiconductor device without exposing the underlying devices to a high temperature.

A p channel 4-sided gated JLT may be constructed as above with the N+ silicon layers 9602 and 9608 formed as P+ doped, and the metals/materials of gate electrode 9612 may be of appropriate work function to shutoff the p channel at a gate voltage of zero.

While the process flow shown in FIG. 96A-J illustrates the example steps involved in forming a four-sided gated JLT with 3D stacked components, it is conceivable to one skilled in the art that changes to the process can be made. For example, process steps and additional materials/regions to add strain to JLTs may be added. Moreover, N+ SiGe layers 9604 and 9608 may instead be comprised of p+ SiGe or undoped SiGe and the selective etchant formula adjusted. Furthermore, more than two layers of chips or circuits can be 3D stacked. Also, there are many methods to construct silicon nanowire transistors. These methods may be described in "High performance and highly uniform gate-all-around silicon nanowire MOSFETs with wire size dependent scaling," *Electron Devices Meeting* (*IEDM*), 2009 *IEEE International*, vol., no., pp. 1-4, 7-9 Dec. 2009 by Bangsaruntip, S.; Cohen, G. M.; Majumdar, A.; et al. ("Bangsaruntip") and in "High performance 5 nm radius twin silicon nanowire MOSFET (TSNWFET): Fabrication on bulk Si wafer, characteristics, and reliability," in *Proc. IEDM Tech. Dig.,* 2005, pp. 717-720 by S. D. Suk, S.-Y. Lee, S.-M. Kim, et al. ("Suk"). Contents of these publications are incorporated in this document by reference. The techniques described in these publications can be utilized for fabricating four-sided gated JLTs.

Alternatively, an n-type 3-sided gated junction-less transistor may be constructed as illustrated in FIGS. 57 A to 57G. A silicon wafer is preprocessed to be used for layer transfer as illustrated in FIGS. 57A and 57B. These processes may be at temperatures above about 400° C. as the layer transfer to the processed substrate with metal interconnects is yet to be done. As illustrated in FIG. 57A, an N− wafer 5700 may be processed to have a layer of N+ 5704, by implant and activation, by an N+ epitaxial growth, or may be a deposited layer of heavily N+ doped polysilicon. A screen oxide 5702 may be grown before the implant to protect the silicon from implant contamination and to provide an oxide surface for later wafer to wafer bonding. FIG. 57B is a drawing illustration of the pre-processed wafer made ready for a layer transfer by an implant 5707 of an atomic species, such as H+, preparing the "cleaving plane" 5799 in the N− region of N− wafer 5700, or the donor substrate, and plasma or other surface treatments to prepare the oxide surface for wafer oxide to oxide bonding. The acceptor wafer or house 808 with logic transistors and metal interconnects may be prepared for a low temperature oxide to oxide wafer bond with surface treatments of the top oxide and the two may be bonded as illustrated in FIG. 57C. The top donor wafer may be cleaved and removed from the bottom acceptor wafer 808 and the top N− substrate may be chemically and mechanically polished (CMP'ed) into the N+ layer 5704 to form the top gate layer of the junction-less transistor. A metal interconnect layer/strip 5706 in the acceptor wafer or house 808 is also illustrated in FIG. 57C. For illustration simplicity and clarity, the donor wafer oxide layer screen oxide 5702 will not be drawn independent of the acceptor wafer or house 808 oxides in FIGS. 57D through 57G.

Figure 57A:
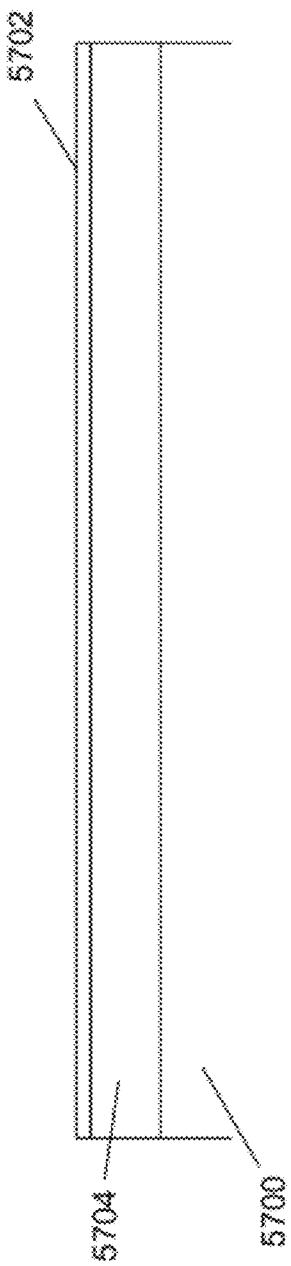
FIG. 57 A-G are exemplary drawing illustrations of the formation of a junction-less transistor.
Figure 57B:
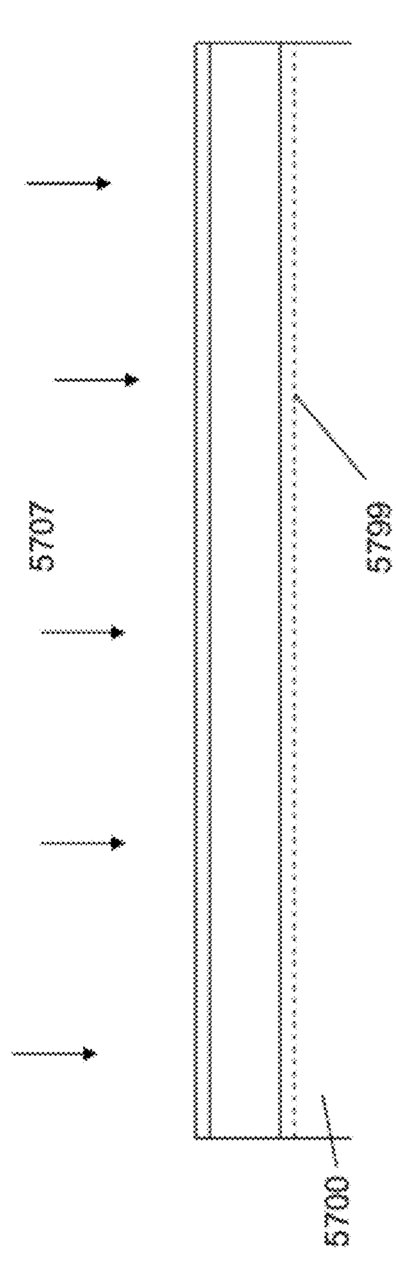
Figure 57C:
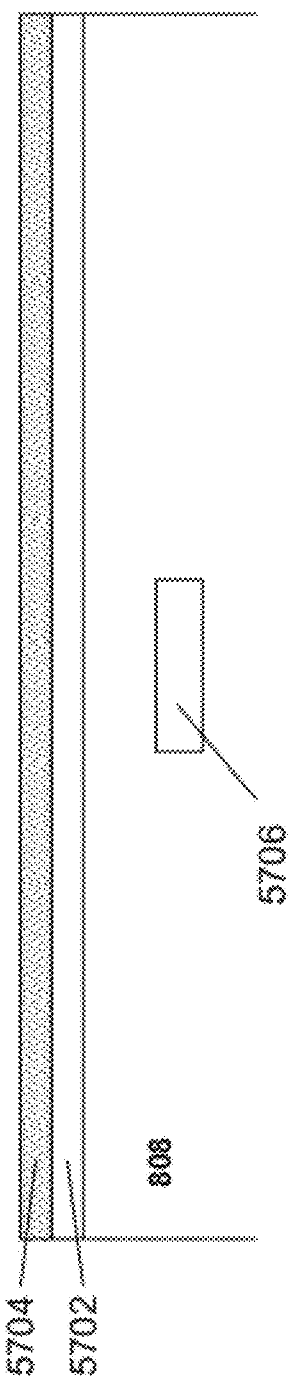
Figure 57D:
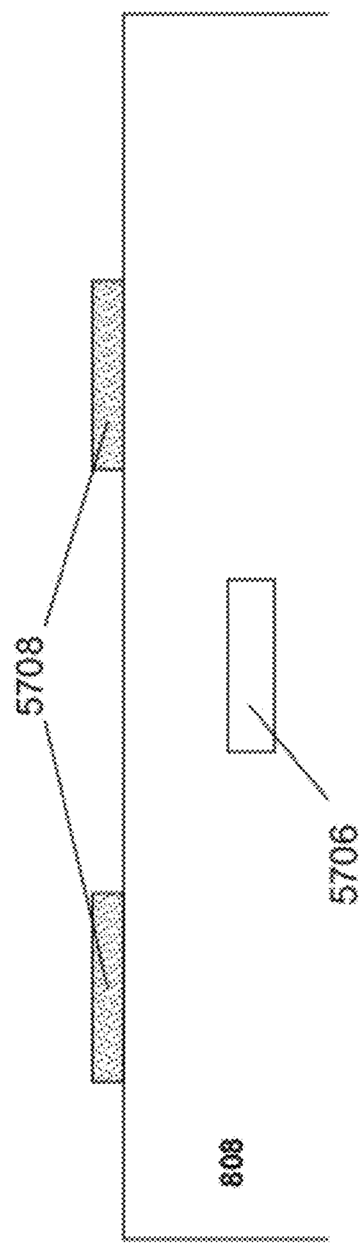

A thin oxide may be grown to protect the thin transistor silicon 5704 layer top, and then the transistor channel elements 5708 may be masked and etched as illustrated in FIG. 57D and then the photoresist may be removed. The thin oxide may be striped in a dilute HF solution and a low temperature based Gate Dielectric may be deposited and densified to serve as the junction-less transistor gate oxide 5710. Alternatively, a low temperature microwave plasma oxidation of the silicon surfaces may serve as the junction-less transistor gate oxide 5710 or an atomic layer deposition (ALD) technique, such as described herein HKMG processes, may be utilized.

Figure 57E:
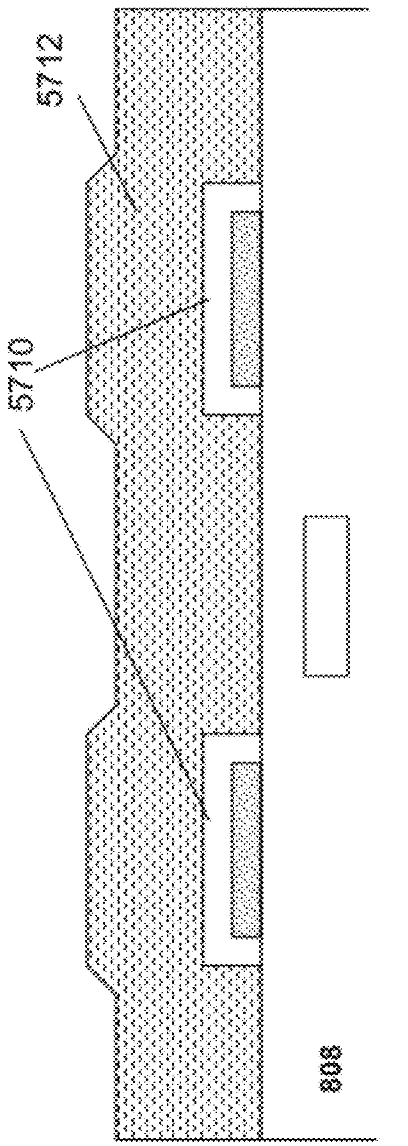
Figure 57F:
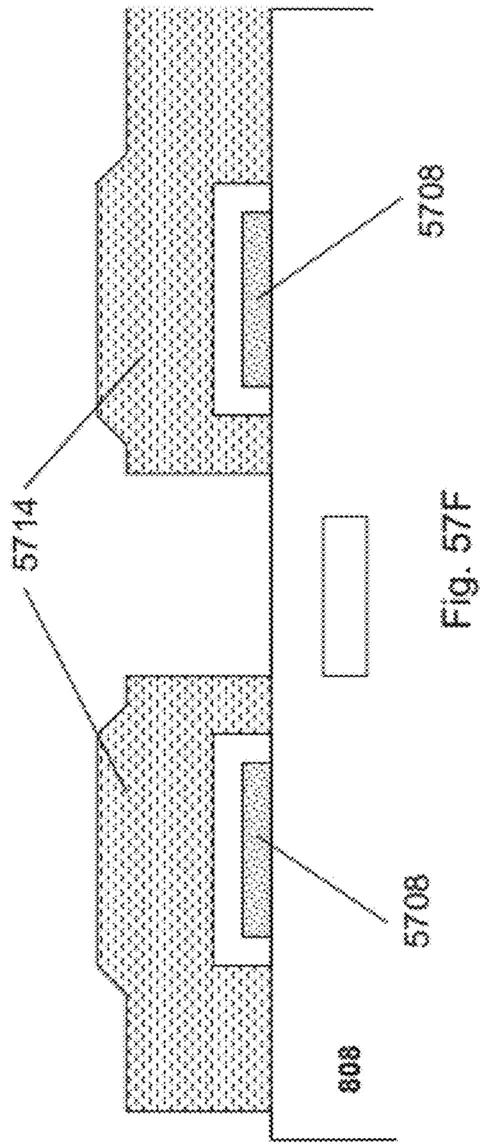

Then deposition of a low temperature gate material 5712, such as doped or undoped amorphous silicon as illustrated in FIG. 57E, may be performed. Alternatively, a high-k metal gate structure may be formed as described previously. The gate material 5712 may be then masked and etched to define the top and side gate 5714 of the transistor channel elements 5708 in a crossing manner, generally orthogonally as shown in FIG. 57F.

Figure 57G:
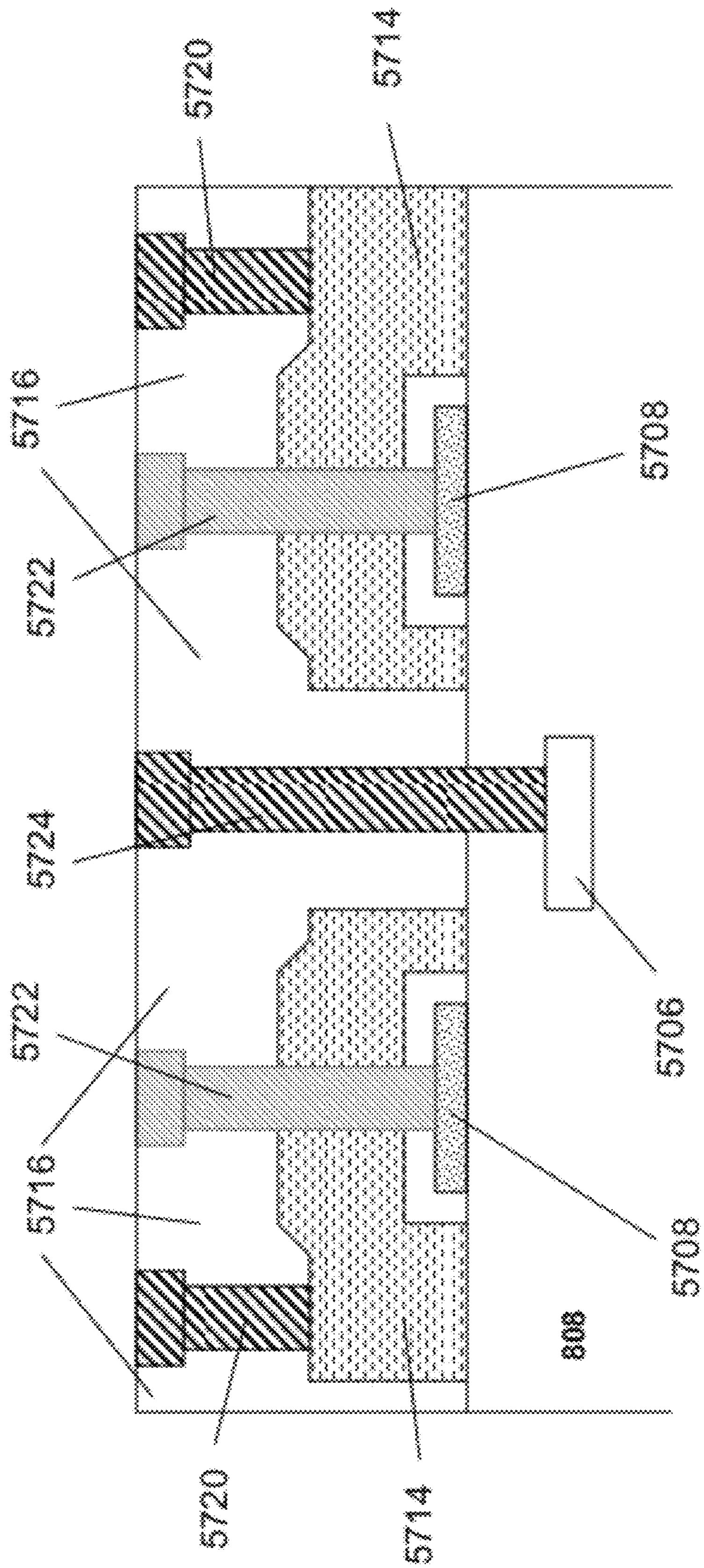

Then the entire structure may be covered with a Low Temperature Oxide 5716, the oxide planarized with chemical mechanical polishing, and then contacts and metal interconnects may be masked and etched as illustrated FIG. 57G. The gate contact 5720 may connect to the top and side gate 5714. The two transistor channel terminal contacts 5722 may independently connect to transistor element 5708 on each side of the top and side gate 5714. The through via 5724 may connect the transistor layer metallization to the acceptor wafer or house 808 at metal interconnect layer/strip 5706. This flow may enable the formation of mono-crystalline 3-sided gated junction-less transistor that may be formed and connected to the underlying multi-metal layer semiconductor device without exposing the underlying devices to a high temperature.

Figures 58A, 58B:
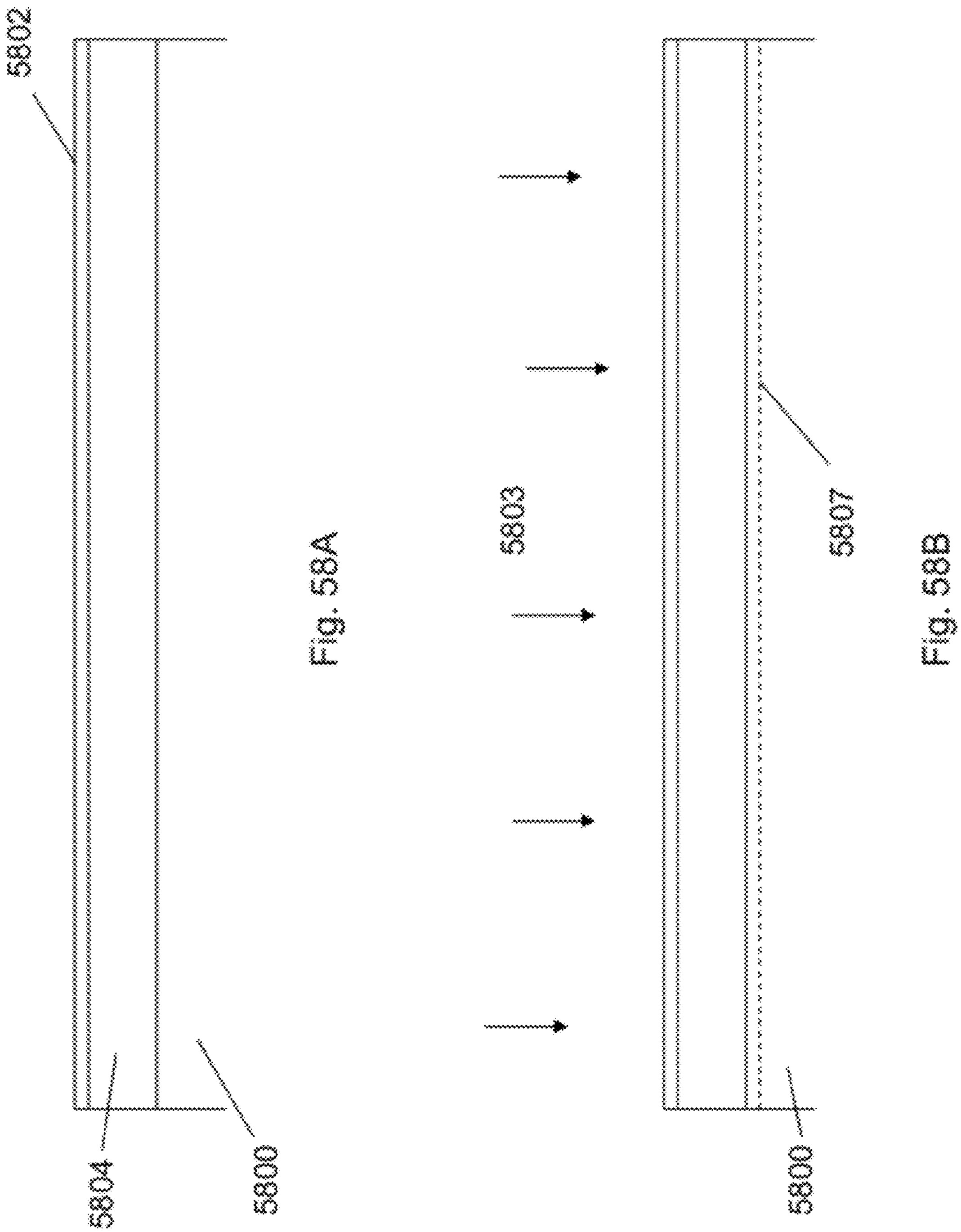
FIG. 58 A-G are exemplary drawing illustrations of the formation of a junction-less transistor.
Figures 58E, 58F:
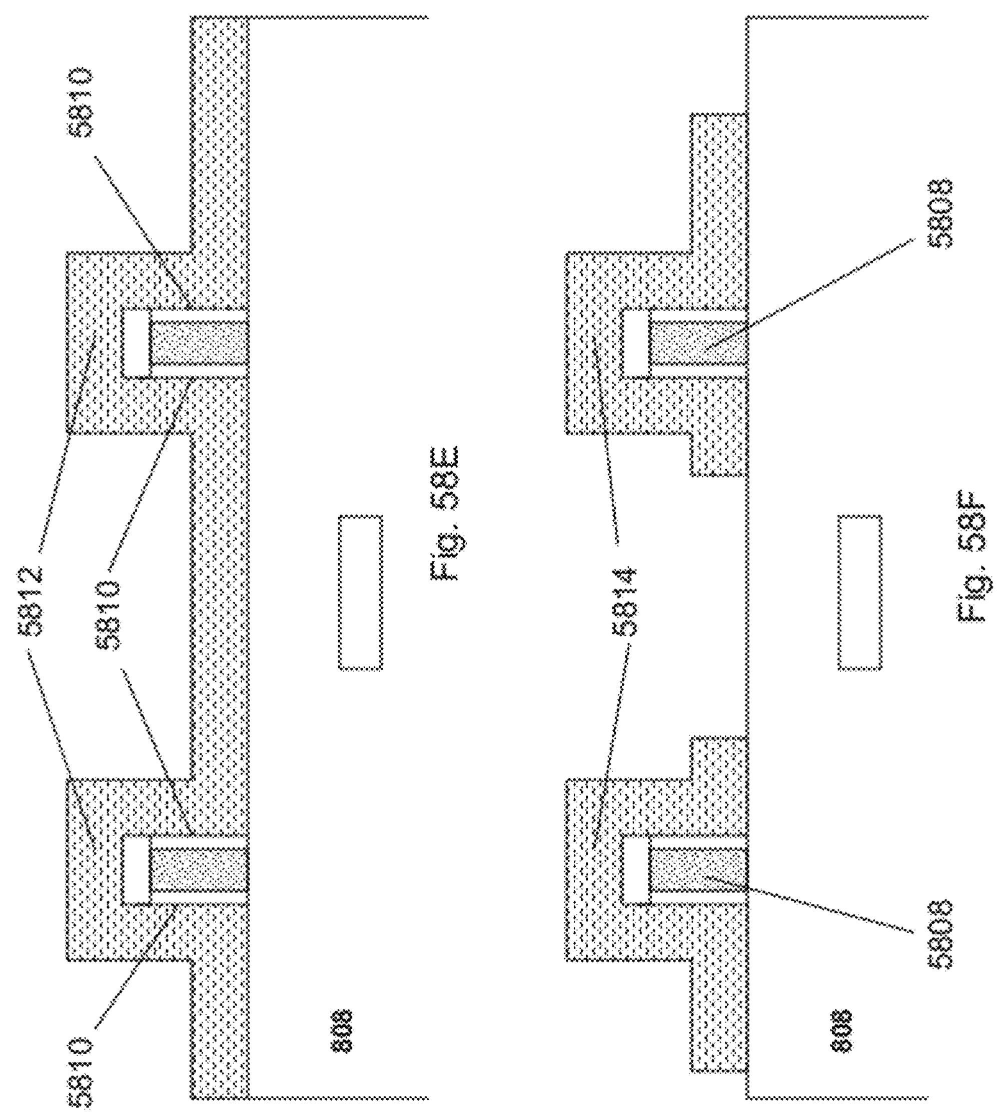
Figure 58G:
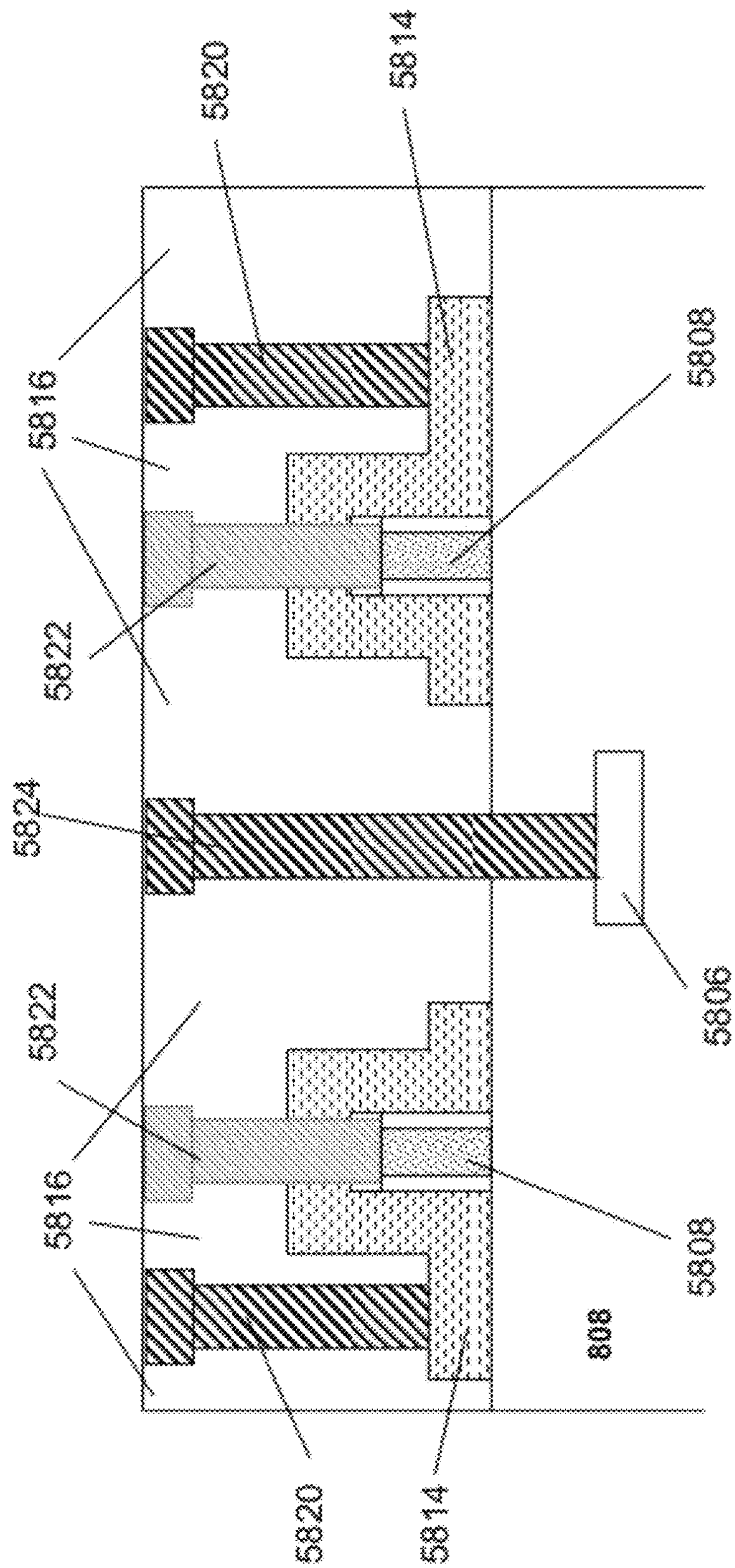

Alternatively, an n-type 3-sided gated thin-side-up junction-less transistor may be constructed as follows in FIGS. 58 A to 58G. A thin-side-up transistor, for example, a junction-less thin-side-up transistor, may have the thinnest dimension of the channel cross-section facing up (when oriented horizontally), that face being parallel to the silicon base substrate largest area surface or face. Previously and subsequently described junction-less transistors may have the thinnest dimension of the channel cross section oriented vertically and perpendicular to the silicon base substrate surface. A silicon wafer may be preprocessed to be used for layer transfer, as illustrated in FIGS. 58A and 58B. These processes may be at temperatures above about 400° C. as the layer transfer to the processed substrate with metal interconnects is yet to be done. As illustrated in FIG. 58A, an N− wafer 5800 may be processed to have a layer of N+ 5804, by ion implantation and activation, by an N+ epitaxial growth, or may be a deposited layer of heavily N+ doped polysilicon. A screen oxide 5802 may be grown before the implant to protect the silicon from implant contamination and to provide an oxide surface for later wafer to wafer bonding. FIG. 58B is a drawing illustration of the pre-processed wafer made ready for a layer transfer by an implant 5803 of an atomic species, such as H+, preparing the “cleaving plane” 5807 in the N− region of N− wafer 5800, or the donor substrate, and plasma or other surface treatments to prepare the oxide surface for wafer oxide to oxide bonding. The acceptor wafer 808 with logic transistors and metal interconnects may be prepared for a low temperature oxide to oxide wafer bond with surface treatments of the top oxide and the two may be bonded as illustrated in FIG. 58C. The top donor wafer may be cleaved and removed from the bottom acceptor wafer 808 and the top N− substrate may be chemically and mechanically polished (CMP’ed) into the N+ layer 5804 to form the junction-less transistor channel layer. FIG. 58C also illustrates the deposition of a CMP and plasma etch stop layer 5805, such as low temperature SiN on oxide, on top of the N+ layer 5804. A metal interconnect layer 5806 in the acceptor wafer or house 808 is also shown in FIG. 58C. For illustration simplicity and clarity, the donor wafer oxide layer screen oxide 5802 will not be drawn independent of the acceptor wafer or house 808 oxide in FIGS. 58D through 58G.

The transistor channel elements 5808 may be masked and etched as illustrated in FIG. 58D and then the photoresist may be removed. As illustrated in FIG. 58E, a low temperature based Gate Dielectric may be deposited and densified to serve as the junction-less transistor gate oxide 5810. Alternatively, a low temperature microwave plasma oxidation of the silicon surfaces may serve as the junction-less transistor gate oxide 5810 or an atomic layer deposition (ALD) technique may be utilized. Then deposition of a low temperature gate material 5812, such as P+ doped amorphous silicon may be performed. Alternatively, a high-k metal gate structure may be formed as described previously. The gate material 5812 may be then masked and etched to define the top and side gate 5814 of the transistor channel elements 5808. As illustrated in FIG. 58G, the entire structure may be covered with a Low Temperature Oxide 5816, the oxide planarized with chemical mechanical polishing (CMP), and then contacts and metal interconnects may be masked and etched. The gate contact 5820 may connect to the transistor top and side gate 5814 (i.e., in front of and behind the plane of the other elements shown in FIG. 58G). The two transistor channel terminal contacts 5822 per transistor may independently connect to the transistor channel element 5808 on each side of the top and side gate 5814. The through via 5824 may connect the transistor layer metallization to the acceptor wafer or house 808 interconnect 5806. This flow may enable the formation of mono-crystalline 3-gated sided thin-side-up junction-less transistor that may be formed and connected to the underlying multi-metal layer semiconductor device without exposing the underlying devices to a high temperature. Persons of ordinary skill in the art will appreciate that the illustrations in FIGS. 57A through 57G and FIGS. 58A through 58G are exemplary only and are not drawn to scale. Such skilled persons will further appreciate that many variations may be possible, for example, the process described in conjunction with FIGS. 57A through 57G could be used to make a junction-less transistor where the channel is taller than its width or that the process described in conjunction with FIGS. 58A through 58G could be used to make a junction-less transistor that is wider than its height. Many other modifications within the scope of the illustrated embodiments of the invention will suggest themselves to such skilled persons after reading this specification. Thus the invention is to be limited only by the appended claims.

Figure 61A:
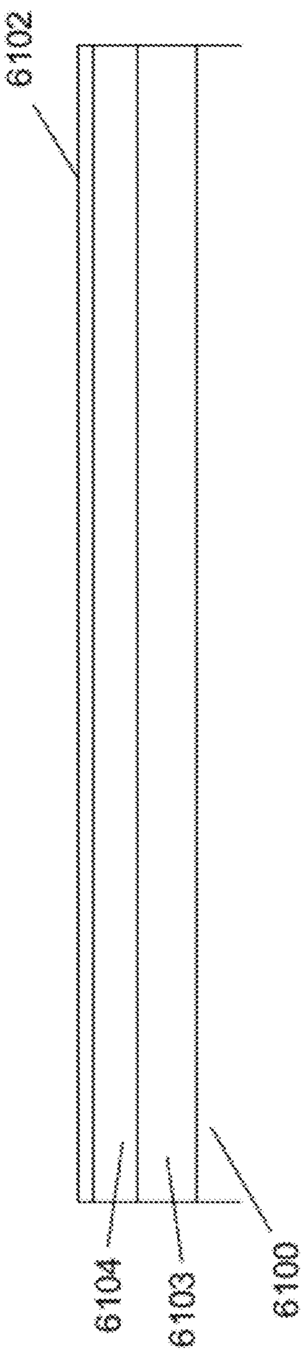
FIG. 61 A-I are exemplary drawing illustrations of a junction-less transistor.
Figure 61B:
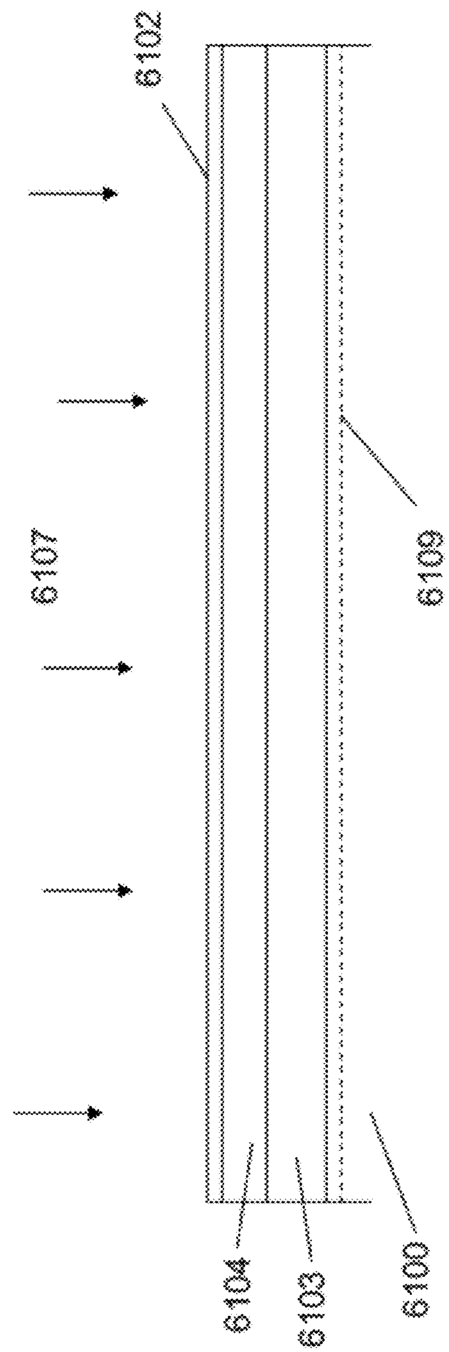

Alternatively, a two layer n-type 3-sided gated junction-less transistor may be constructed as shown in FIGS. 61A to 61I. This structure may improve the source and drain contact resistance by providing for a higher doping at the contact surface than the channel. Additionally, this structure may be utilized to create a two layer channel wherein the layer closest to the gate may be more highly doped. A silicon wafer may be preprocessed for layer transfer as illustrated in FIGS. 61A and 61B. The above-mentioned preprocessing may be performed at temperatures above about 400° C. as the layer transfer to the processed substrate with metal interconnects has yet to be done. As illustrated in FIG. 61A, an N− wafer 6100 may be processed to have two layers of N+, the top N+ layer 6104 with a lower doping concentration than the bottom N+ layer 6103, by an implant and activation, or an N+ epitaxial growth, or combinations thereof. One or more depositions of in-situ doped amorphous silicon may also be utilized to create the vertical dopant layers or gradients. A screen oxide 6102 may be grown before the implant to protect the silicon from implant contamination and to provide an oxide surface for later wafer-to-wafer bonding. FIG. 61B is a drawing illustration of the pre-processed wafer for a layer transfer by an implant 6107 of an atomic species, such as H+, preparing the “cleaving plane” 6109 in the N− region of the donor substrate N− wafer 6100 and plasma or other surface treatments to prepare the oxide surface for wafer oxide to oxide bonding.

Figure 61C:
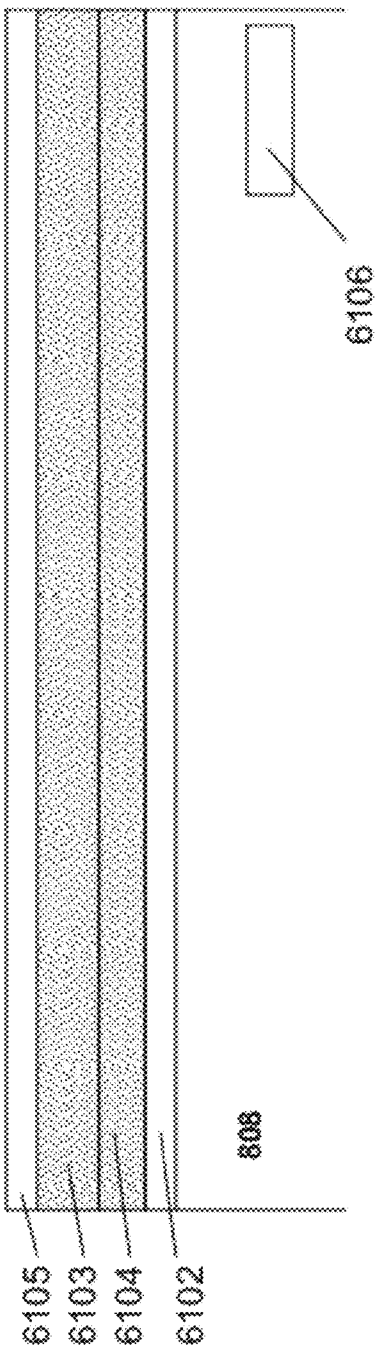

The acceptor wafer or house 808 with logic transistors and metal interconnects may be prepared for a low temperature oxide-to-oxide wafer bond with surface treatments of the top oxide and the two may be bonded as illustrated in FIG. 61C. The top donor wafer may be cleaved and removed from the bottom acceptor wafer 808 and the top N− substrate may be chemically and mechanically polished (CMP’ed) into the more highly doped N+ layer bottom N+ layer 6103. An etch hard mask layer of low temperature silicon nitride 6105 may be deposited on the surface of bottom N+ layer 6103, including a thin oxide stress buffer layer. A metal interconnect metal pad or strip 6106 in the acceptor wafer or house 808 may be also illustrated in FIG. 61C. For illustration simplicity and clarity, the donor wafer screen oxide 6102 will not be drawn independent of the acceptor wafer or house 808 oxide in subsequent FIGS. 61D through 61I.

Figure 61D:
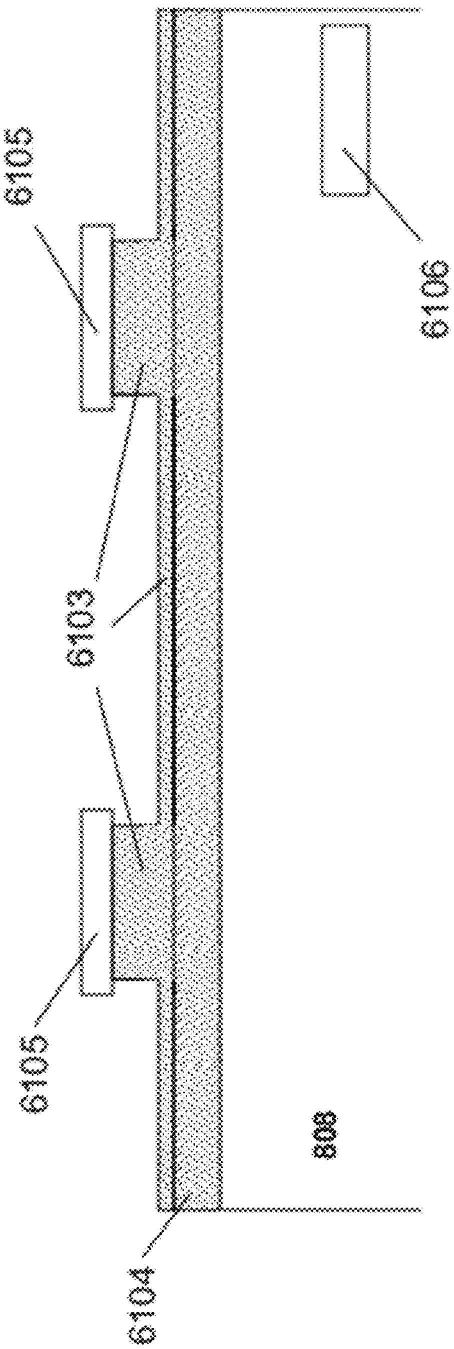

The source and drain connection areas may be masked, the silicon nitride 6105 layer may be etched, and the photoresist may be stripped. A partial or full silicon plasma etch may be performed, or a single or multiple low temperature oxidation and then etch, for example, with Hydrofluoric Acid, of the oxide sequences may be performed, to thin bottom N+ layer 6103. FIG. 61D illustrates a two-layer channel, as described and simulated above in conjunction with FIGS. 52A and 52B, which may be formed by thinning bottom N+ layer 6103 with the above etch process to almost complete removal, leaving some of bottom N+ layer 6103 remaining on top of top N+ layer 6104 and the full thickness of bottom N+ layer 6103 still remaining underneath silicon nitride 6105. A substantially complete removal of the top channel layer, bottom N+ layer 6103, may also be performed. This etch process may also be utilized to adjust for wafer-to-wafer CMP variations of the remaining donor wafer layers, such as N− wafer 6100 and bottom N+ layer 6103, after the layer transfer cleave to provide less variability in the channel thickness.

Figure 61E:
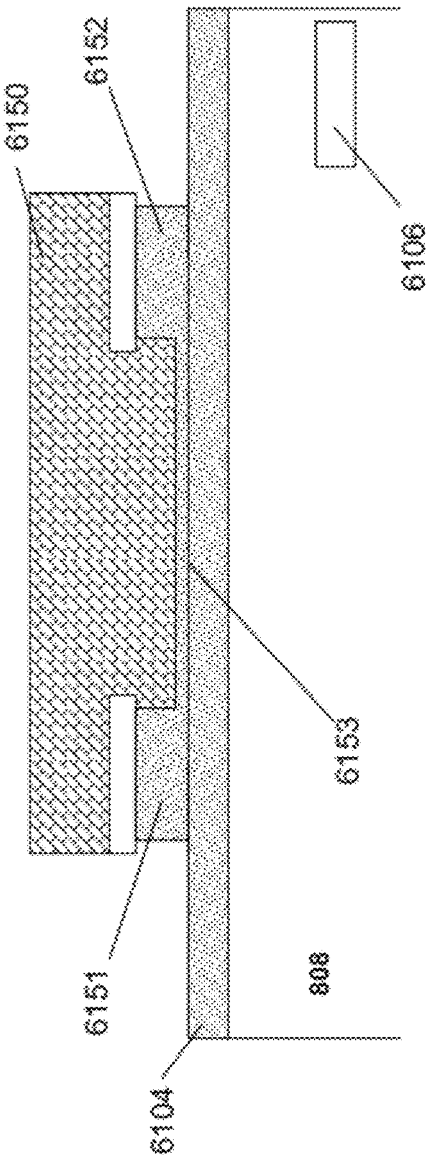

FIG. 61E illustrates the photoresist 6150 definition of the source 6151 (one full thickness bottom N+ layer 6103 region), drain 6152 (the other full thickness 6103 region), and channel 6153 (region of partial bottom N+ layer 6103 thickness and full top N+ layer 6104 thickness) of the junction-less transistor.

Figure 61F:
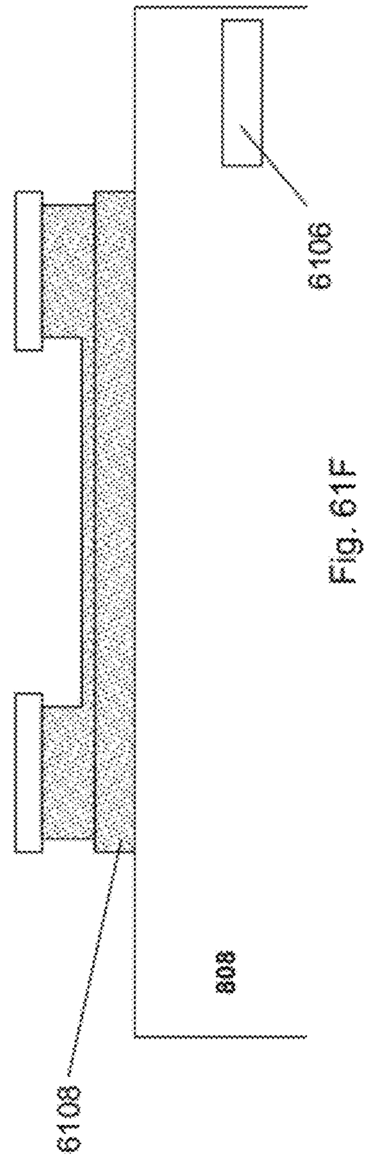

The exposed silicon remaining on top N+ layer 6104, as illustrated in FIG. 61F, may be plasma etched and the photoresist 6150 may be removed. This process may provide for an isolation between devices and may define the channel width of the junction-less transistor channel element 6108.

Figure 61G:
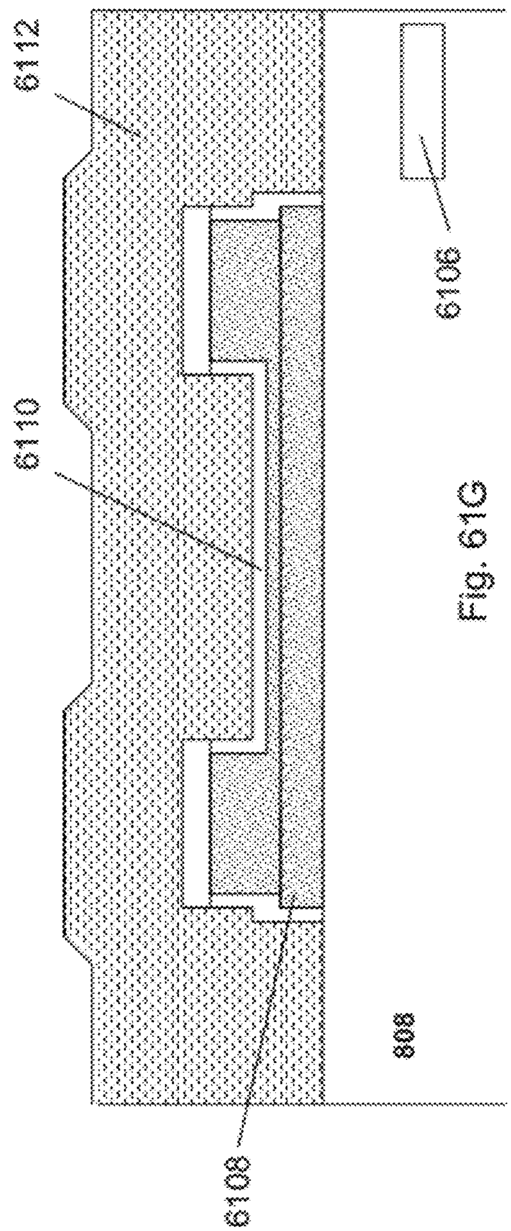

A low temperature based Gate Dielectric may be deposited and densified to serve as the junction-less transistor gate oxide 6110 as illustrated in FIG. 61G. Alternatively, a low temperature microwave plasma oxidation of the silicon surfaces may provide the junction-less transistor gate oxide 6110 or an atomic layer deposition (ALD) technique may be utilized. Then deposition of a low temperature gate material 6112, such as, for example, doped amorphous silicon, may be performed, as illustrated in FIG. 61G. Alternatively, a high-k metal gate structure may be formed as described previously.

Figure 61H:
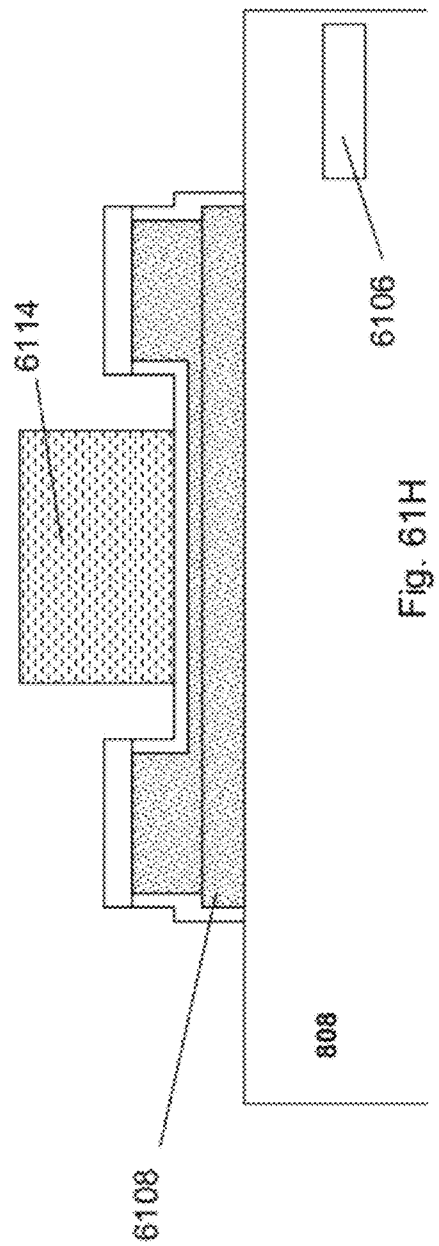
Figure 6I:
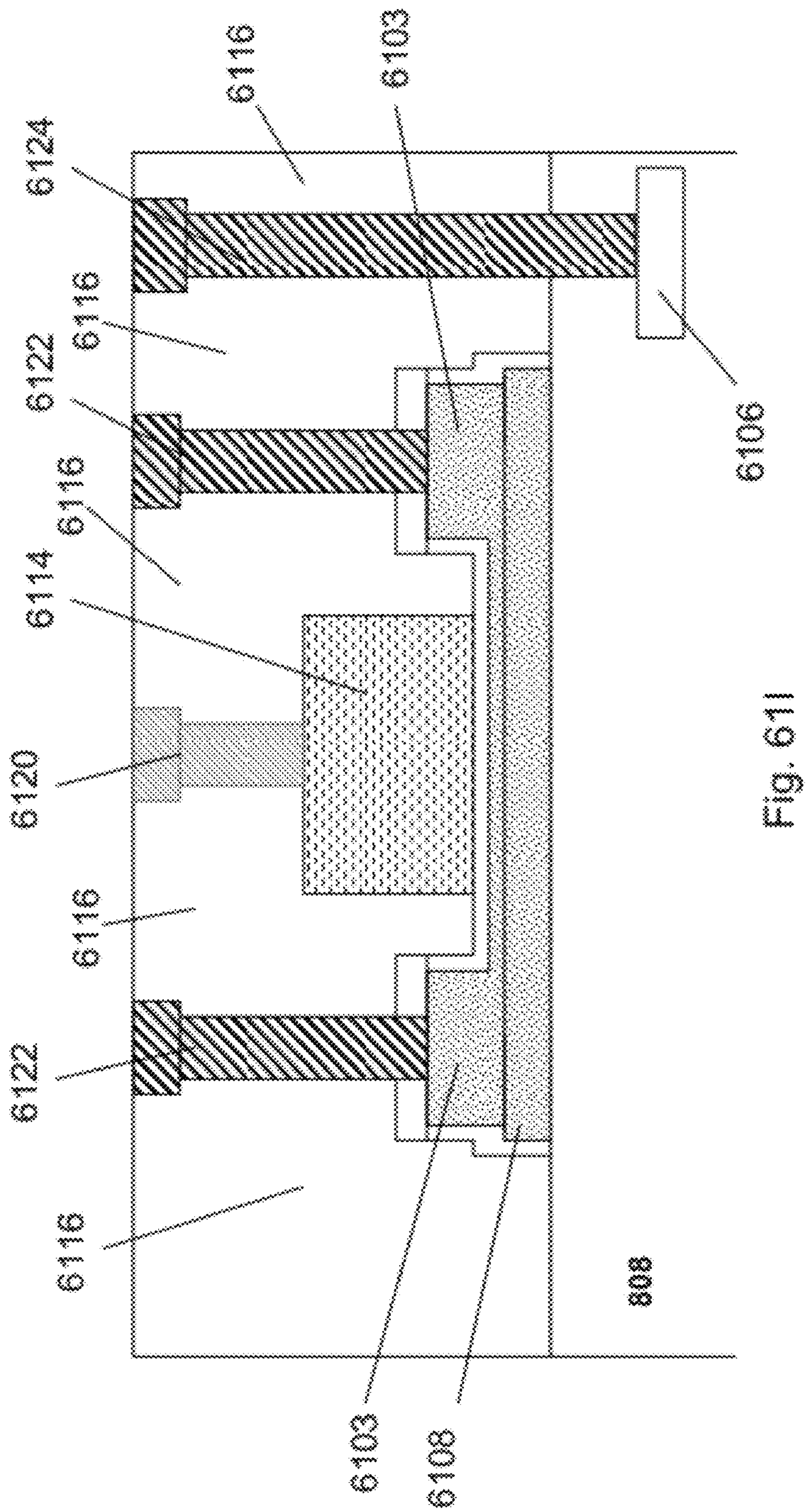

The gate material 6112 may then be masked and etched to define the top and side gate 6114 of the transistor channel elements 6108 in a crossing manner, generally orthogonally, as illustrated in FIG. 61H. Then the entire structure may be covered with a Low Temperature Oxide 6116, the oxide may be planarized by chemical mechanical polishing.

Then contacts and metal interconnects may be masked and etched as illustrated in FIG. 61I. The gate contact 6120 may be connected to the top and side gate 6114. The two transistor source/drain terminal contacts 6122 may be independently connected to the heavier doped bottom N+ layer 6103 and then to transistor channel element 6108 on each side of the top and side gate 6114. The through via 6124 may connect the junction-less transistor layer metallization to the acceptor wafer or house 808 at interconnect pad or strip 6106. The through via 6124 may be independently masked and etched to provide process margin with respect to the other contacts 6122 and 6120. This flow may enable the formation of mono-crystalline two layer 3-sided gated junction-less transistor that may be formed and connected to the underlying multi-metal layer semiconductor device without exposing the underlying devices to a high temperature.

Figure 65A:
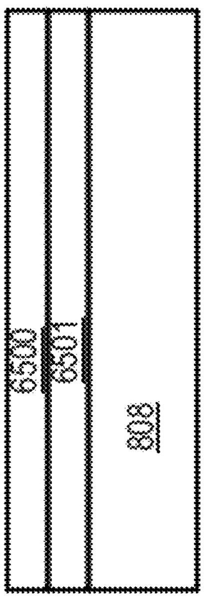
FIG. 65A-C are exemplary drawing illustrations of the formation of a junction-less transistor.
Figure 65B:
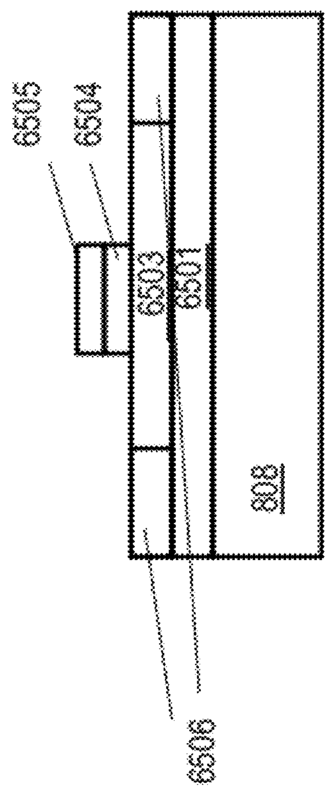
Figure 65C:
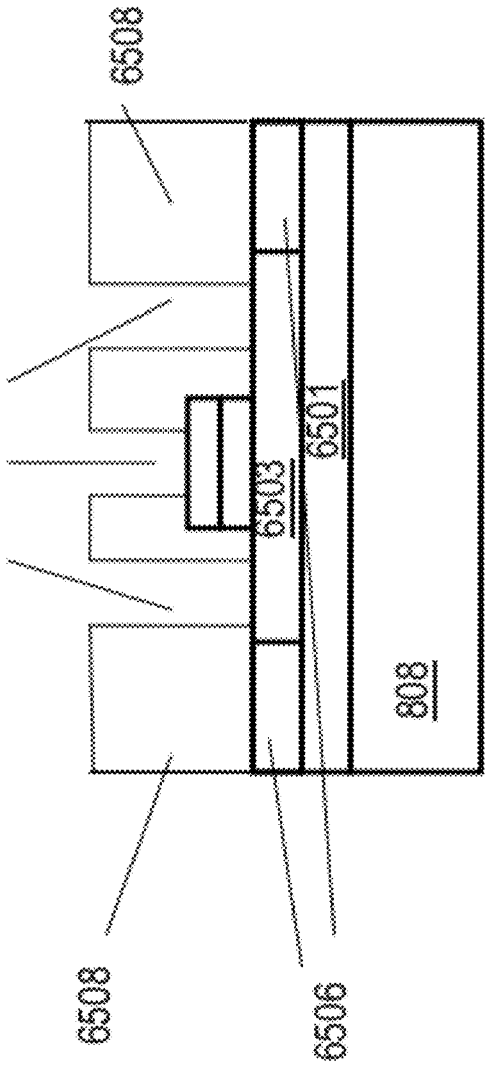

Alternatively, a 1-sided gated junction-less transistor can be constructed as shown in FIG. 65A-C. A thin layer of heavily doped silicon, such as transferred doped layer 6500, may be transferred on top of the acceptor wafer or house 808 using layer transfer techniques described previously wherein the donor wafer oxide layer 6501 may be utilized to form an oxide to oxide bond with the top of the acceptor wafer or house 808. The transferred doped layer 6500 may be N+ doped for an n-channel junction-less transistor or may be P+ doped for a p-channel junction-less transistor. As illustrated in FIG. 65B, oxide isolation 6506 may be formed by masking and etching transferred doped layer 6500, thus forming the N+ doped region 6503. Subsequent deposition of a low temperature oxide which may be chemical mechanically polished to form transistor isolation between N+ doped regions 6503. The channel thickness, i.e. thickness of N+ doped regions 6503, may also be adjusted at this step. A low temperature gate dielectric 6504 and gate metal 6505 may be deposited or grown as previously described and then photo-lithographically defined and etched. As shown in FIG. 65C, a low temperature oxide 6508 may then be deposited, which also may provide a mechanical stress on the channel for improved carrier mobility. Contact openings 6510 may then be opened to various terminals of the junction-less transistor. Persons of ordinary skill in the art will appreciate that the processing methods presented above are illustrative only and that other embodiments of the inventive principles described herein are possible and thus the scope if the invention is only limited by the appended claims.

A family of vertical devices can also be constructed as top transistors that are precisely aligned to the underlying pre-fabricated acceptor wafer or house 808. These vertical devices have implanted and annealed single crystal silicon layers in the transistor by utilizing the "SmartCut" layer transfer process that may not exceed the temperature limit of the underlying pre-fabricated structure. For example, vertical style MOSFET transistors, floating gate flash transistors, floating body DRAM, thyristor, bipolar, and Schottky gated JFET transistors, as well as memory devices, can be constructed. Junction-less transistors may also be constructed in a similar manner. The gates of the vertical transistors or resistors may be controlled by memory or logic elements such as MOSFET, DRAM, SRAM, floating flash, anti-fuse, floating body devices, etc. that are in layers above or below the vertical device, or in the same layer. As an example, a vertical gate-all-around n-MOSFET transistor construction is described below.

Figure 39A:
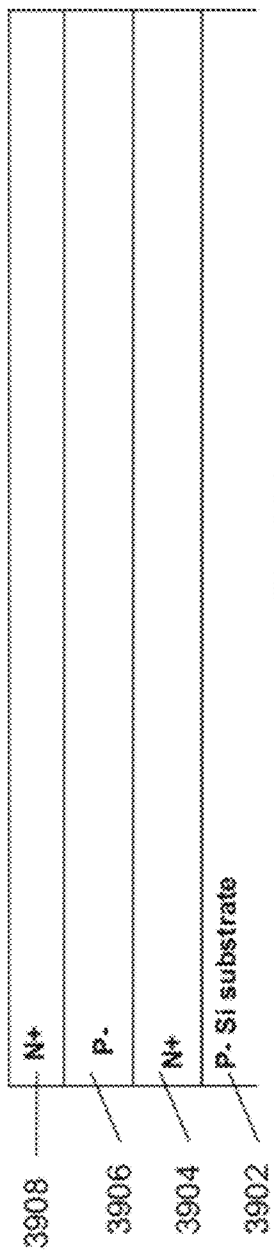
FIG. 39 A-C are exemplary drawing illustrations of pre-processed wafers used for vertical transistors.

The donor wafer preprocessed for the general layer transfer process is illustrated in FIG. 39. A P− wafer 3902 may be processed to have a "buried" layer of N+ 3904, by either implant and activation, or by shallow N+ implant and diffusion. This process may be followed by depositing a P− epi growth (epitaxial growth) layer 3906 and finally an additional N+ layer 3908 may be processed on top. This N+ layer 2510 could again be processed, by implant and activation, or by N+ epi growth.

Figure 39B:
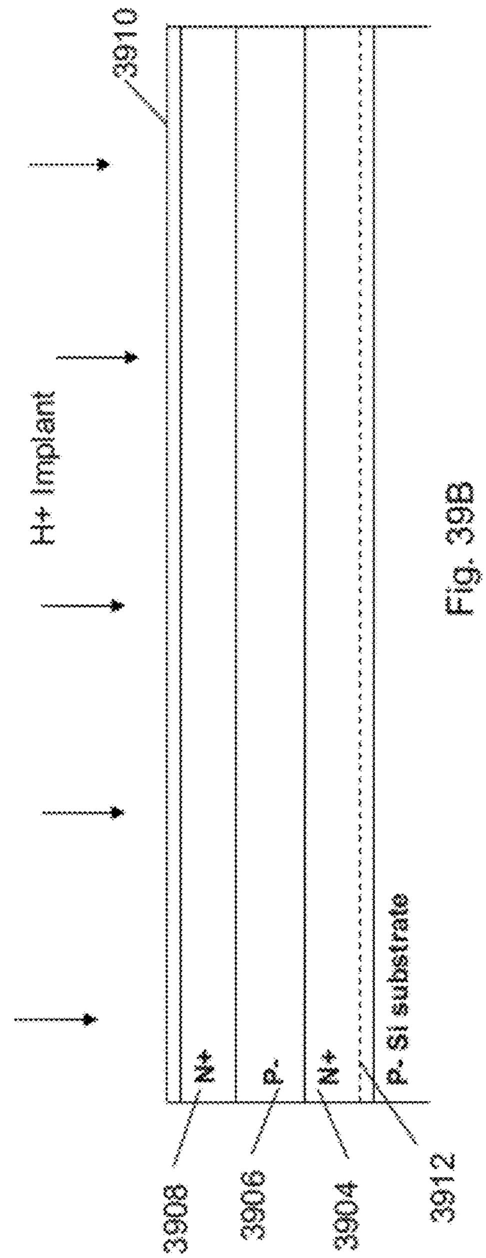

FIG. 39B is a drawing illustration of the pre-processed donor wafer which may be made ready for a conductive bond layer transfer by a deposition of a conductive barrier layer 3910 such as TiN or TaN on top of N+ layer 3908 and an implant of an atomic species, such as H+, preparing the SmartCut cleaving plane 3912 in the lower part of the N+ 3904 region.

Figure 39C:
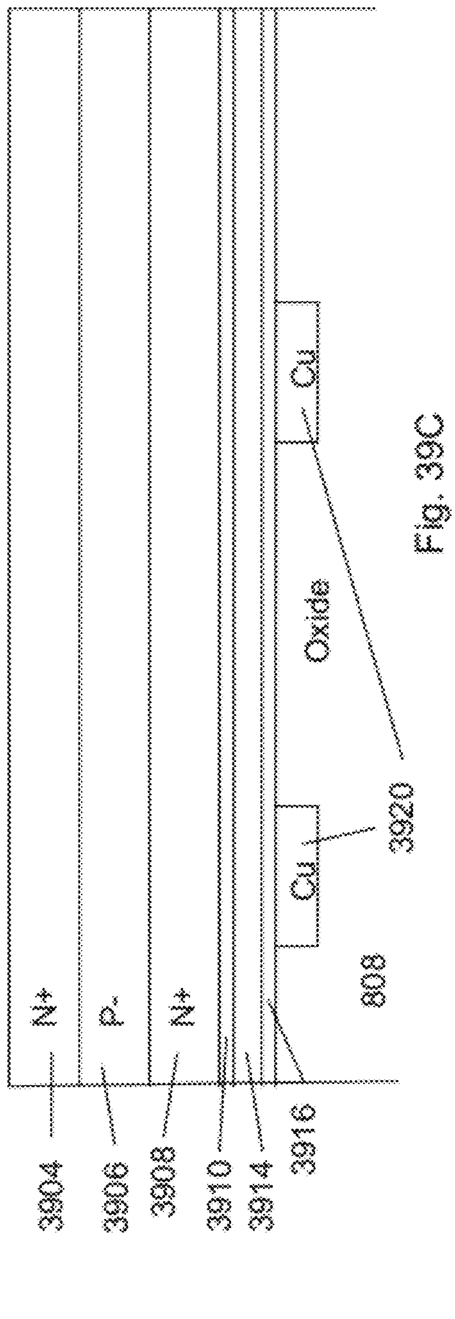

As shown in FIG. 39C, the acceptor wafer may be prepared with an oxide pre-clean and deposition of a conductive barrier layer 3916 and Al—Ge eutectic layer 3914. Al—Ge eutectic layer 3914 may form an Al—Ge eutectic bond with the conductive barrier layer 3910 during a thermo-compressive wafer to wafer bonding process as part of the layer-transfer-flow, thereby transferring the pre-processed single crystal silicon with N+ and P− layers. Thus, a conductive path may be made from the house 808 top metal layer metal lines/strips 3920 to the now bottom N+ layer 3908 of the transferred donor wafer. Alternatively, the Al—Ge eutectic layer 3914 may be made with copper and a copper-to-copper or copper-to-barrier layer thermo-compressive bond may be formed. Likewise, a conductive path from donor wafer to house 808 may be made by house top metal lines/strips 3920 of copper with barrier metal thermo-compressively bonded with the copper layer of conductive barrier layer 3910 directly, where a majority of the bonded surface is donor copper to house oxide bonds and the remainder of the surface may be donor copper to house 808 copper and barrier metal bonds.

Figure 40A:
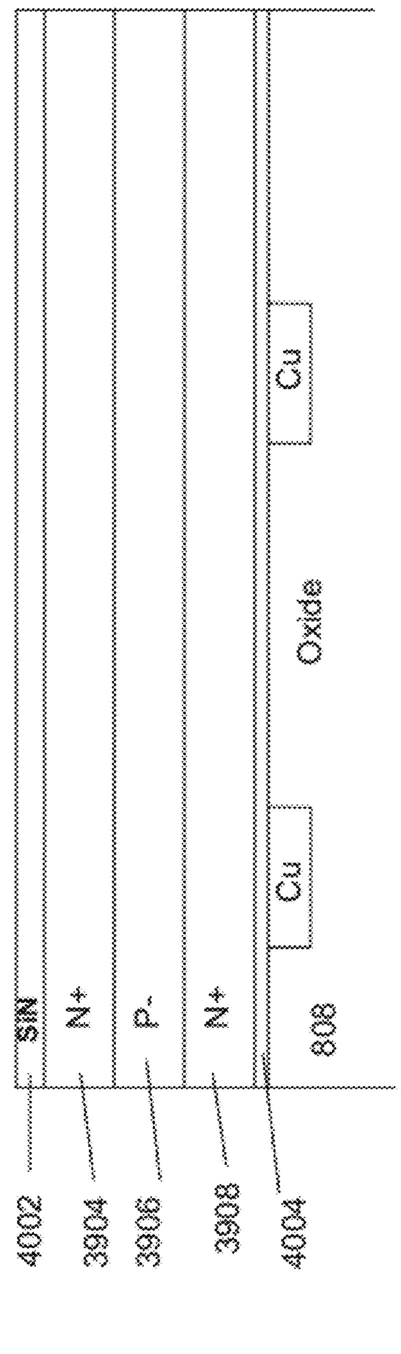
FIG. 40 A-I are exemplary drawing illustrations of a vertical n-MOSFET top transistor.

FIGS. 40A-40I are drawing illustrations of the formation of a vertical gate-all-around n-MOSFET top transistor. FIG. 40A illustrates the first step. After the conductive path layer transfer described above, a deposition of a CMP and plasma etch stop layer 4002, such as low temperature SiN, may be deposited on top of the top N+ layer 3904. For simplicity, the conductive barrier clad Al—Ge eutectic layers 3910, 3914, and 3916 are represented by conductive metal bonding layer 4004 in FIG. 40A.

Figure 40B:
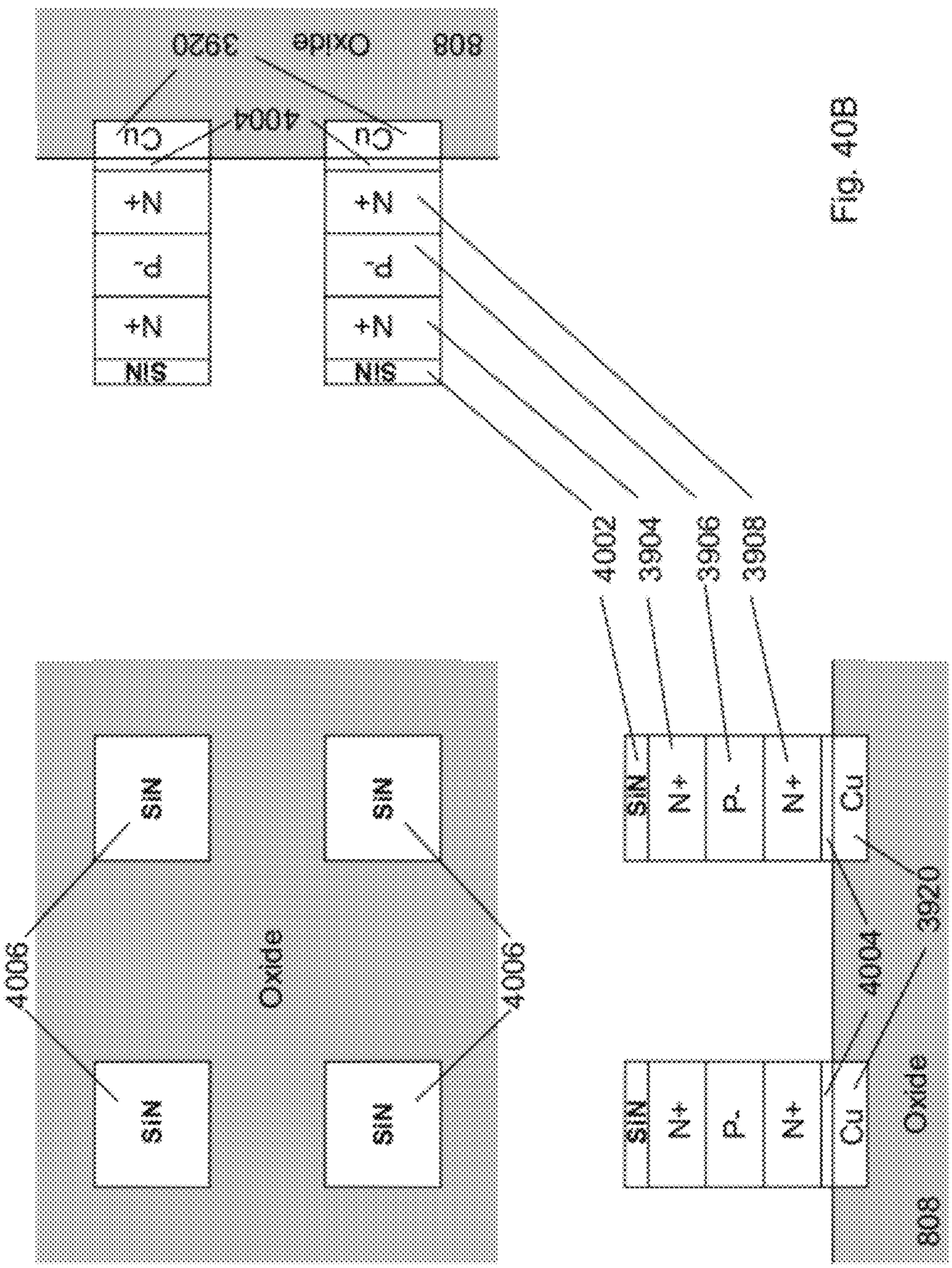

FIGS. 40B-H are drawn as orthographic projections (i.e., as top views with horizontal and vertical cross sections) to illustrate some process and topographical details. The transistor illustrated is square shaped when viewed from the top, but may be constructed in various rectangular shapes to provide different transistor widths and gate control effects. In addition, the square shaped transistor illustrated may be intentionally formed as a circle or oval when viewed from the top and hence form a vertical cylinder shape, or it may become that shape during processing subsequent to forming the vertical towers. Turning now to FIG. 40B, vertical transistor towers 4006 may be mask defined and then plasma/Reactive-ion Etching (RIE) etched substantially through the Chemical Mechanical Polishing (CMP) stop layer 4002, N+ layers 3904 and 3908, the P− layer 3906, the conductive metal bonding layer 4004, and into the house 808 oxide, and then the photoresist may be removed as illustrated in FIG. 40B. This definition and etch may now create N-P-N stacks where the bottom N+ layer 3908 may be electrically coupled to the house metal lines/strips 3920 through conductive metal bonding layer 4004.

Figure 40C:
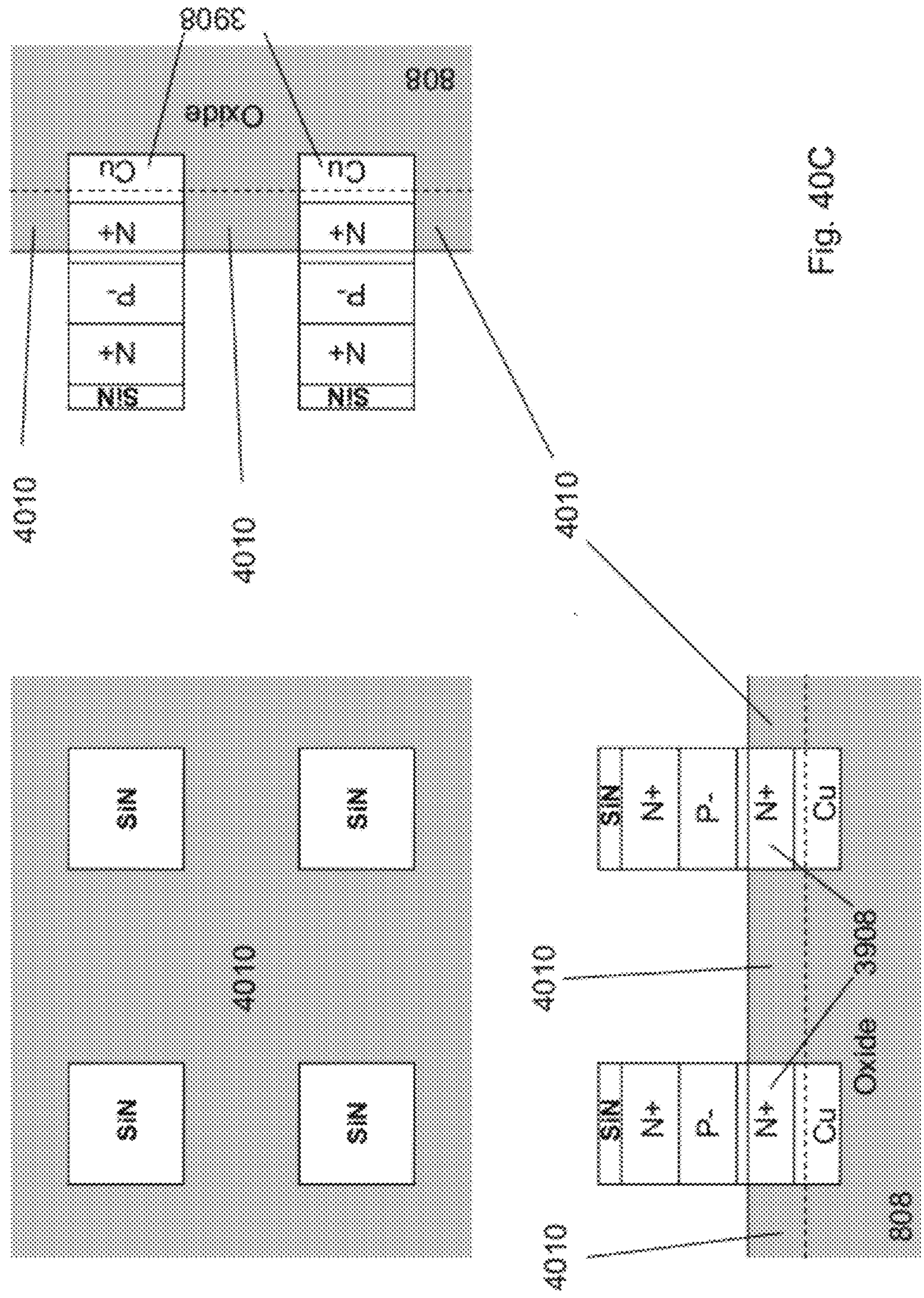

The area between the towers may be partially filled with oxide 4010 via a Spin On Glass (SPG) spin, cure, and etch back sequence as illustrated in FIG. 40C. Alternatively, a low temperature CVD gap fill oxide may be deposited, then Chemically Mechanically Polished (CMP'ed) substantially flat, and then selectively etched back to achieve a similar oxide 4010 shape as shown in FIG. 40C. The level of the oxide 4010 may be constructed such that a small amount of the bottom N+ tower layer 3908 may not be covered by oxide. Alternatively, this step may also be accomplished by a conformal low temperature oxide CVD deposition and etch back sequence, creating a spacer profile coverage of the bottom N+ tower layer 3908.

Figure 40D:
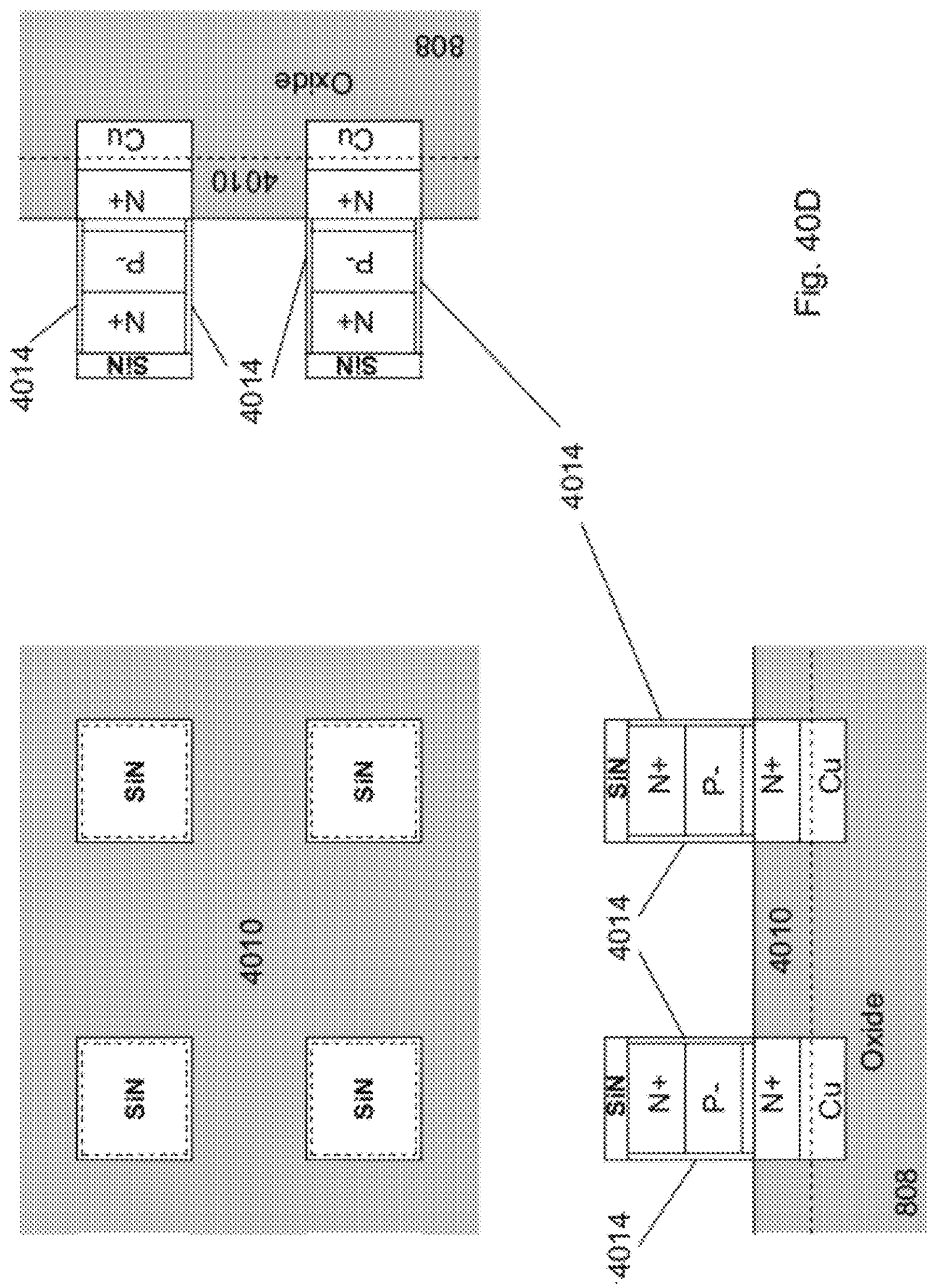

Next, the sidewall gate oxide 4014 may be formed by a low temperature microwave oxidation technique, such as the TEL SPA (Tokyo Electron Limited Slot Plane Antenna) oxygen radical plasma, then substantially stripped by wet chemicals such as dilute HF, and grown again 4014 as illustrated in FIG. 40D.

Figure 40E:
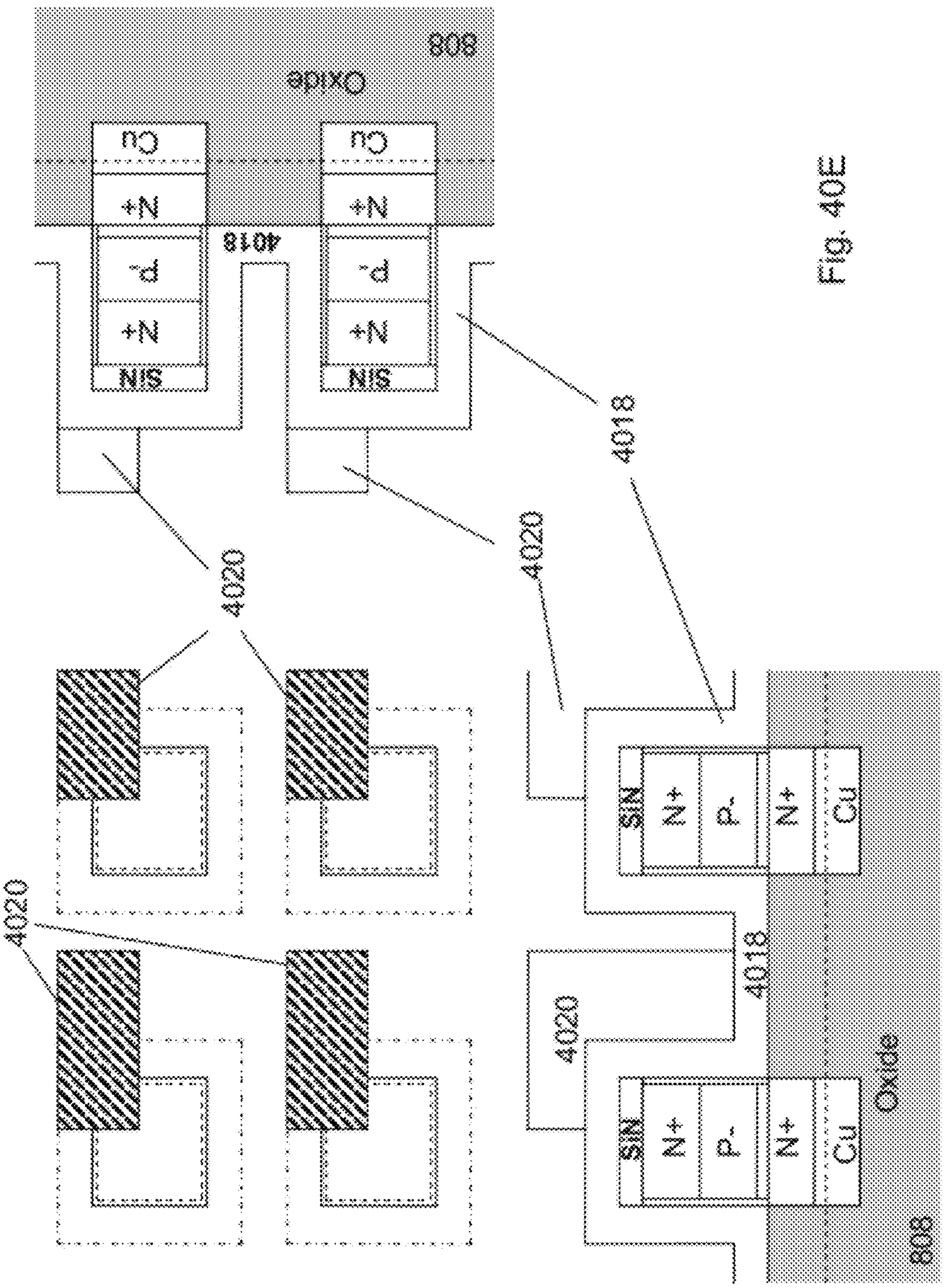

The gate electrode may then be deposited, such as a conformal doped amorphous silicon gate layer 4018, as illustrated in FIG. 40E. The gate mask photoresist 4020 may then be defined.

Figure 40F:
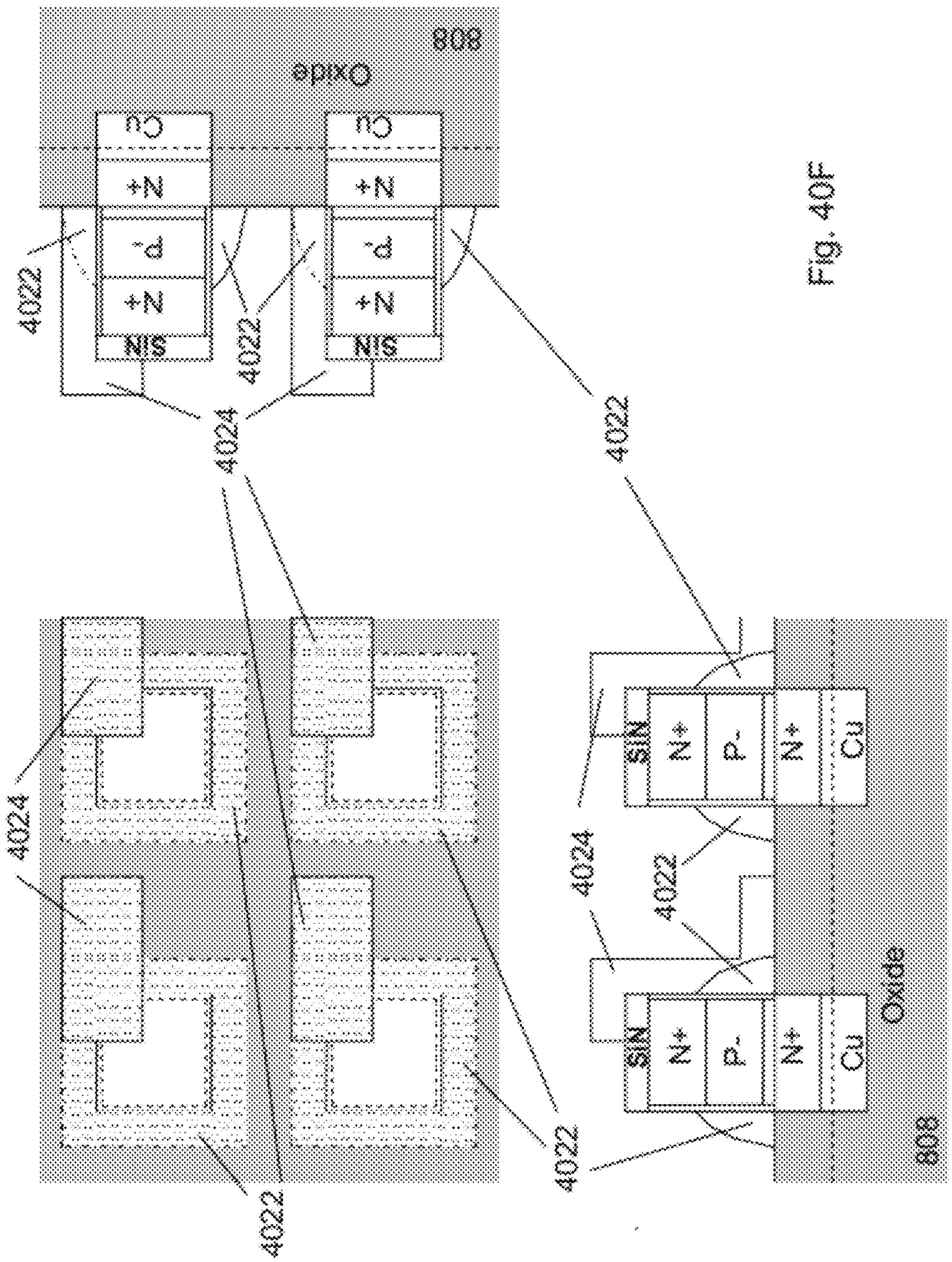

As illustrated in FIG. 40F, the gate layer 4018 may be etched such that a spacer shaped gate electrode 4022 may remain in regions not covered by the photoresist 4020. The substantially full thickness of gate layer 4018 may remain under the area covered by the photoresist 4020 and the gate layer 4018 may also be substantially fully cleared from between the towers. Finally the photoresist 4020 may be stripped. This approach may substantially minimize the gate to drain overlap and eventually may provide a clear contact connection to the gate electrode.

Figure 40G:
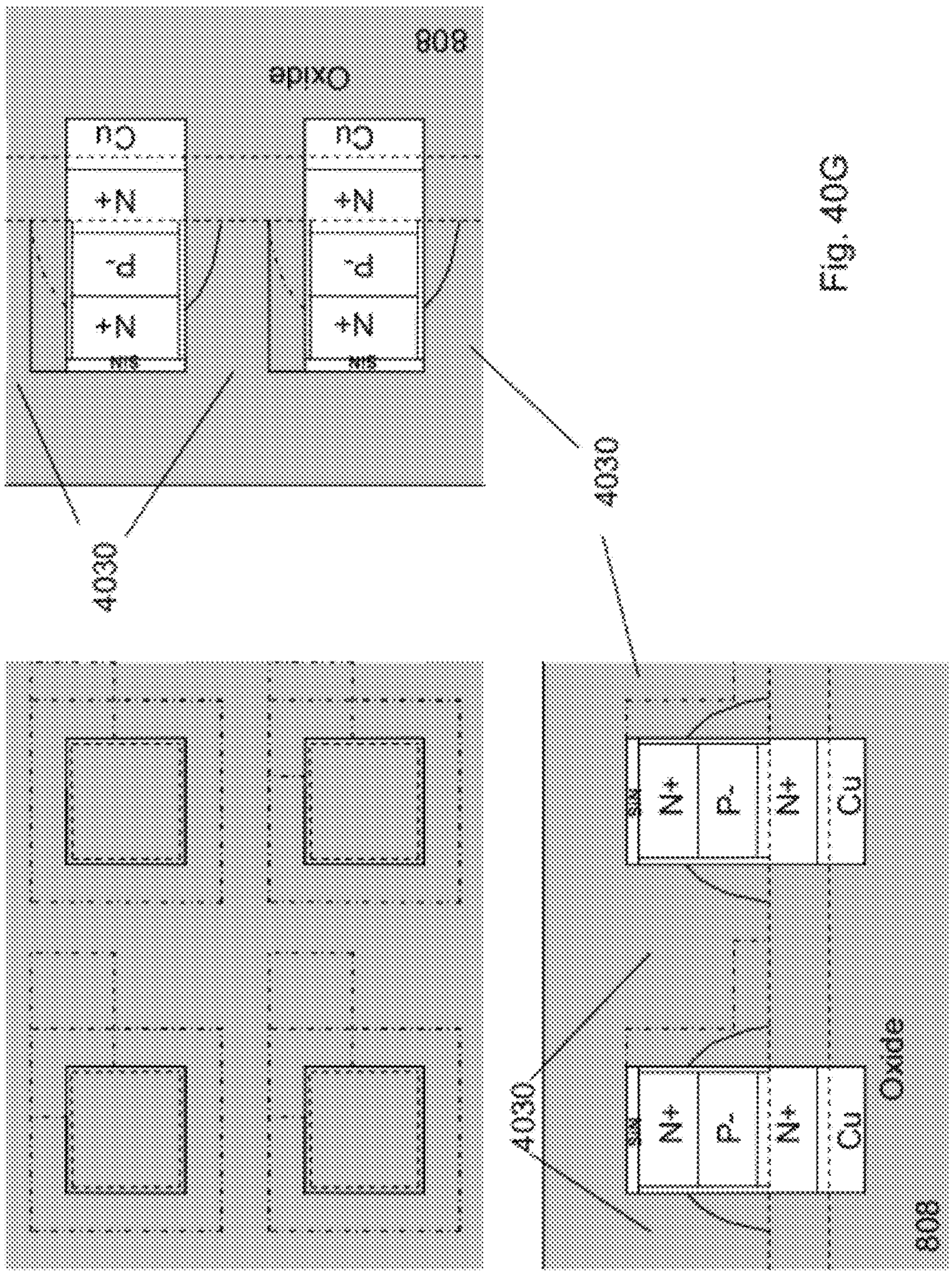

As illustrated in FIG. 40G, the spaces between the towers may be filled and the towers may be covered with oxide 4030 by low temperature gap fill deposition and CMP.

Figure 40H:
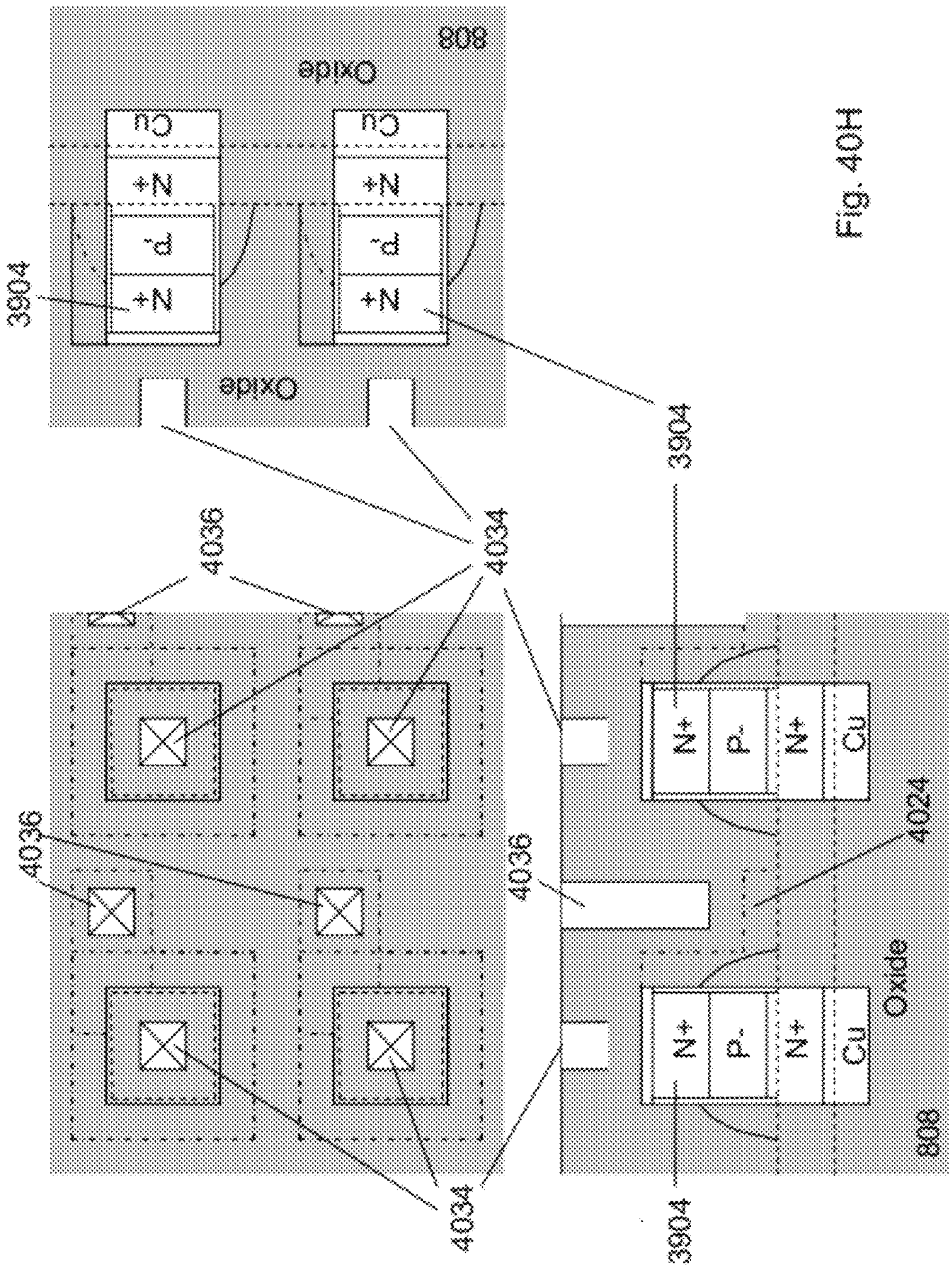

In FIG. 40H, the via contacts 4034 to the tower N+ layer 3904 may be masked and etched, and then the via contacts 4036 to the gate electrode poly 4024 may be masked and etch.

Figure 40I:
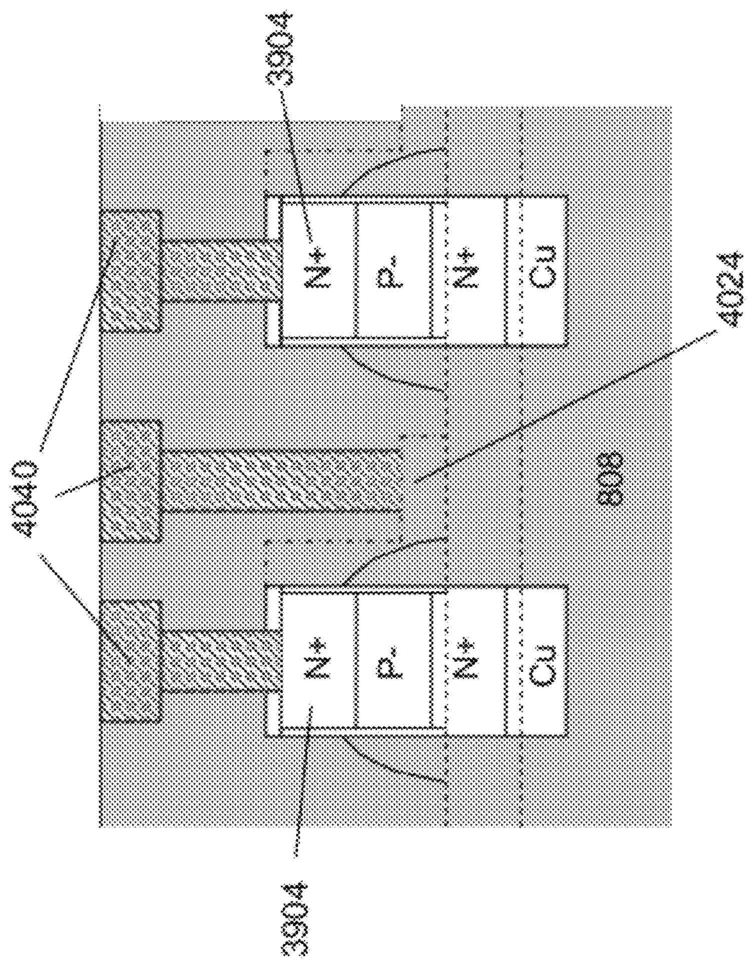

The metal lines 4040 may be mask defined and etched, filled with barrier metals and copper interconnect, and CMP'd in a normal interconnect scheme, thereby completing the contact via connections to the tower N+ 3904 and the gate electrode 4024 as illustrated in FIG. 40I.

This flow may enable the formation of mono-crystalline silicon top MOS transistors that may be connected to the underlying multi-metal layer semiconductor device without exposing the underlying devices and interconnect metals to high temperature. These transistors could be used as programming transistors of the antifuses on second antifuse layer 807, or be coupled to metal layers in wafer or layer 808 to form monolithic 3D ICs, or as a pass transistor for logic on wafer or layer 808, or FPGA use, or for additional uses in a 3D semiconductor device.

Figure 54A:
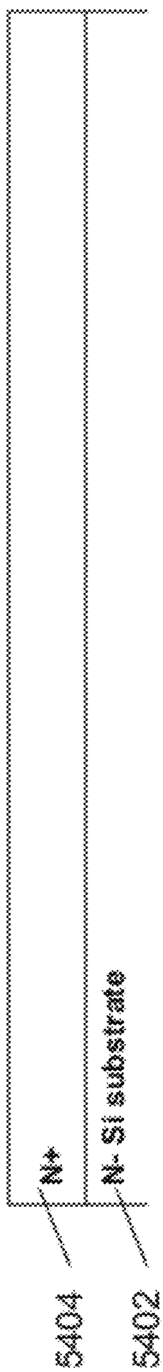
FIG. 54 A-C are exemplary drawing illustrations of the formation of a junction-less transistor.
Figure 54B:
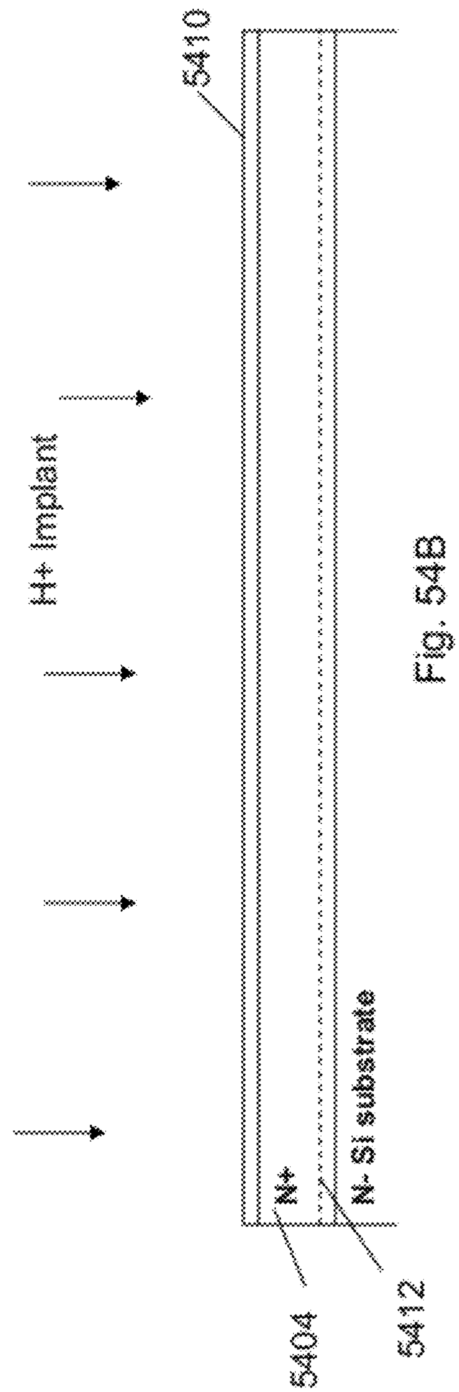

Additionally, a vertical gate all around junction-less transistor may be constructed as illustrated in FIGS. 54 and 55. The donor wafer preprocessed for the general layer transfer process is illustrated in FIG. 54. FIG. 54A is a drawing illustration of a pre-processed wafer that may be used for a layer transfer. An N− wafer 5402 may be processed to have a layer of N+ 5404, by ion implantation and activation, or an N+ epitaxial growth. FIG. 54B is a drawing illustration of the pre-processed wafer that may be made ready for a conductive bond layer transfer by a deposition of a conductive barrier layer 5410 such as TiN or TaN and by an implant of an atomic species, such as H+, preparing the SmartCut cleaving plane 5412 in the lower part of the N+ 5404 region.

Figure 54C:
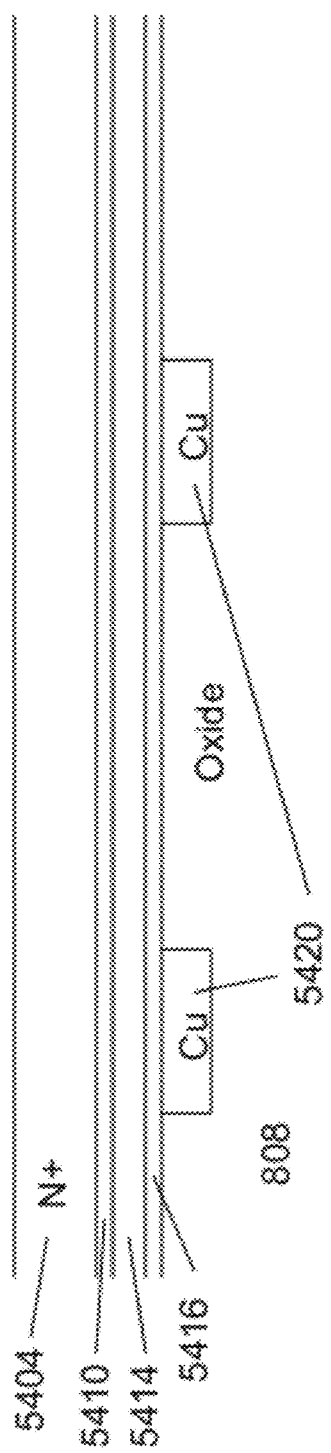

The acceptor wafer or house 808 may also be prepared with an oxide pre-clean and deposition of a conductive barrier layer 5416 and Al and Ge layers to form a Ge—Al eutectic bond, Al—Ge eutectic layer 5414, during a thermo-compressive wafer to wafer bonding as part of the layer-transfer-flow, thereby transferring the pre-processed single crystal silicon of FIG. 54B with an N+ layer 5404, on top of acceptor wafer or house 808, as illustrated in FIG. 54C. The N+ layer 5404 may be polished to remove damage from the cleaving procedure. Thus, a conductive path may be made from the acceptor wafer or house 808 top metal layers/lines 5420 to the N+ layer 5404 of the transferred donor wafer. Alternatively, the Al—Ge eutectic layer 5414 may be made with copper and a copper-to-copper or copper-to-barrier layer thermo-compressive bond may be formed. Likewise, a conductive path from donor wafer to acceptor wafer or house 808 may be made by house top metal layers/lines 5420 of copper with associated barrier metal thermo-compressively bonded with the copper layer 5420 directly, where a majority of the bonded surface may be donor copper to house oxide bonds and the remainder of the surface may be donor copper to acceptor wafer or house 808 copper and barrier metal bonds.

Figure 55A:
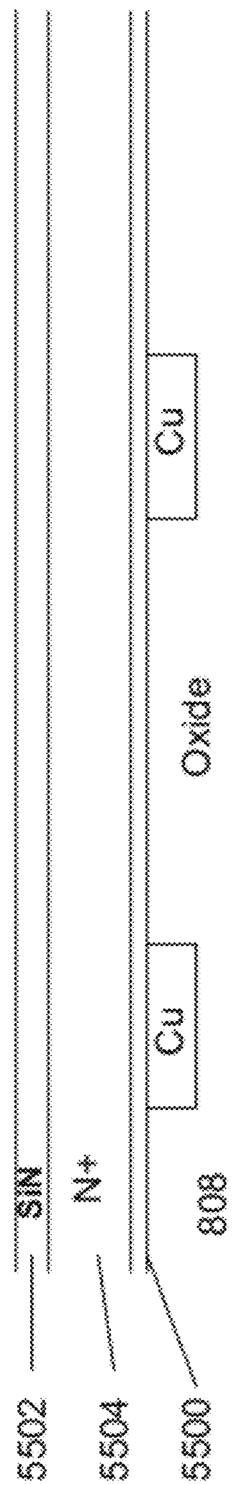
FIG. 55 A-I are exemplary drawing illustrations of the formation of a junction-less transistor.

FIGS. 55A-55I are drawing illustrations of the formation of a vertical gate-all-around junction-less transistor utilizing the above preprocessed acceptor wafer or house 808 of FIG. 54C. FIG. 55A illustrates the deposition of a CMP and plasma etch stop layer 5502, such as low temperature SiN, on top of the N+ layer 5504. For simplicity, the barrier clad Al—Ge eutectic layers 5410, 5414, and 5416 of FIG. 54C are represented by one illustrated layer 5500.

Figure 55B:
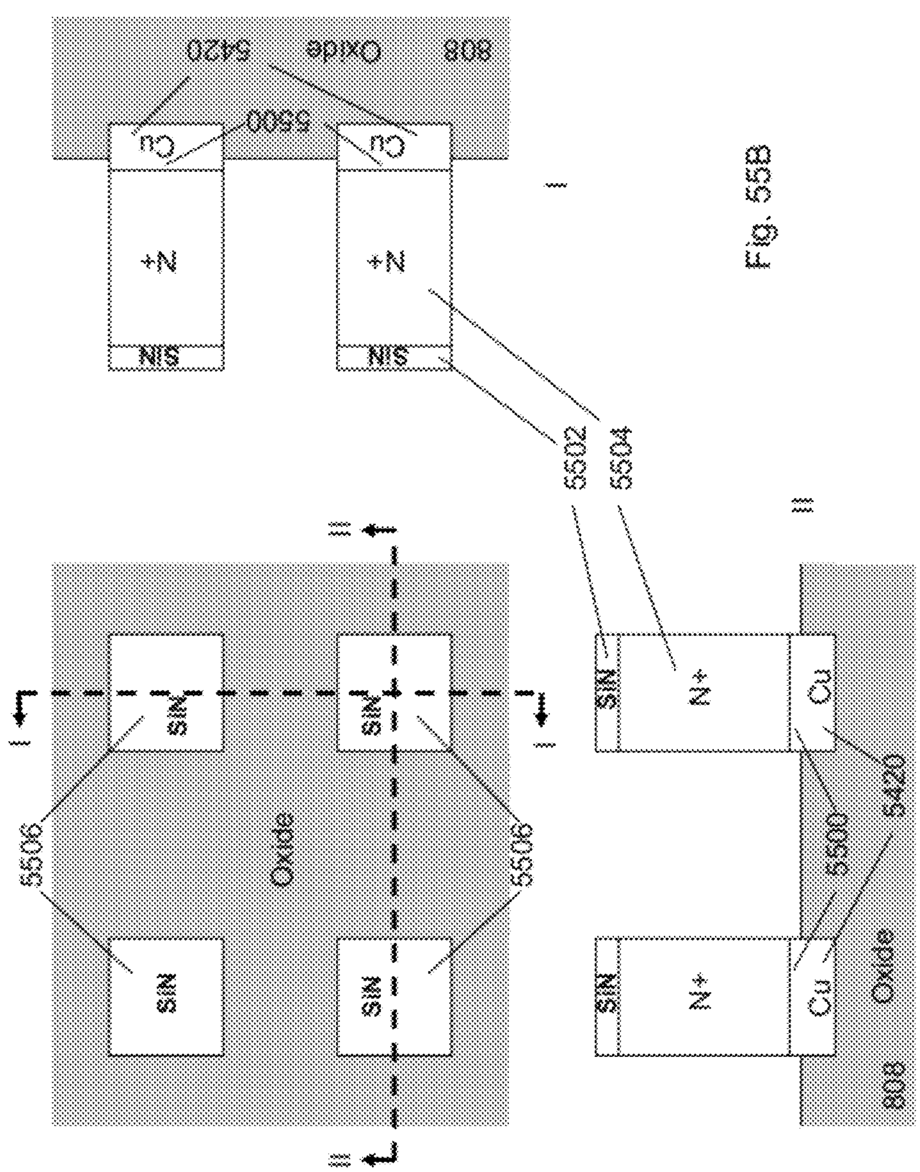

Similarly, FIGS. 55B-H are drawn as an orthographic projection to illustrate some process and topographical details. The junction-less transistor illustrated is square shaped when viewed from the top, but may be constructed in various rectangular shapes to provide different transistor channel thicknesses, widths, and gate control effects. In addition, the square shaped transistor illustrated may be intentionally formed as a circle or oval when viewed from the top and hence form a vertical cylinder shape, or it may become that shape during processing subsequent to forming the vertical towers. The vertical transistor towers 5506 may be mask defined and then plasma/Reactive-ion Etching (RIE) etched substantially through the Chemical Mechanical Polishing (CMP) stop layer 5502, N+ transistor channel layer 5504, the metal bonding layer 5500, and down to the acceptor wafer or house 808 oxide, and then the photoresist is removed, as illustrated in FIG. 55B. This definition and etch may now create N+ transistor channel stacks that are electrically isolated from each other yet the bottom of N+ layer 5404 is electrically connected to the house top metal layers/lines 5420.

Figure 55C:
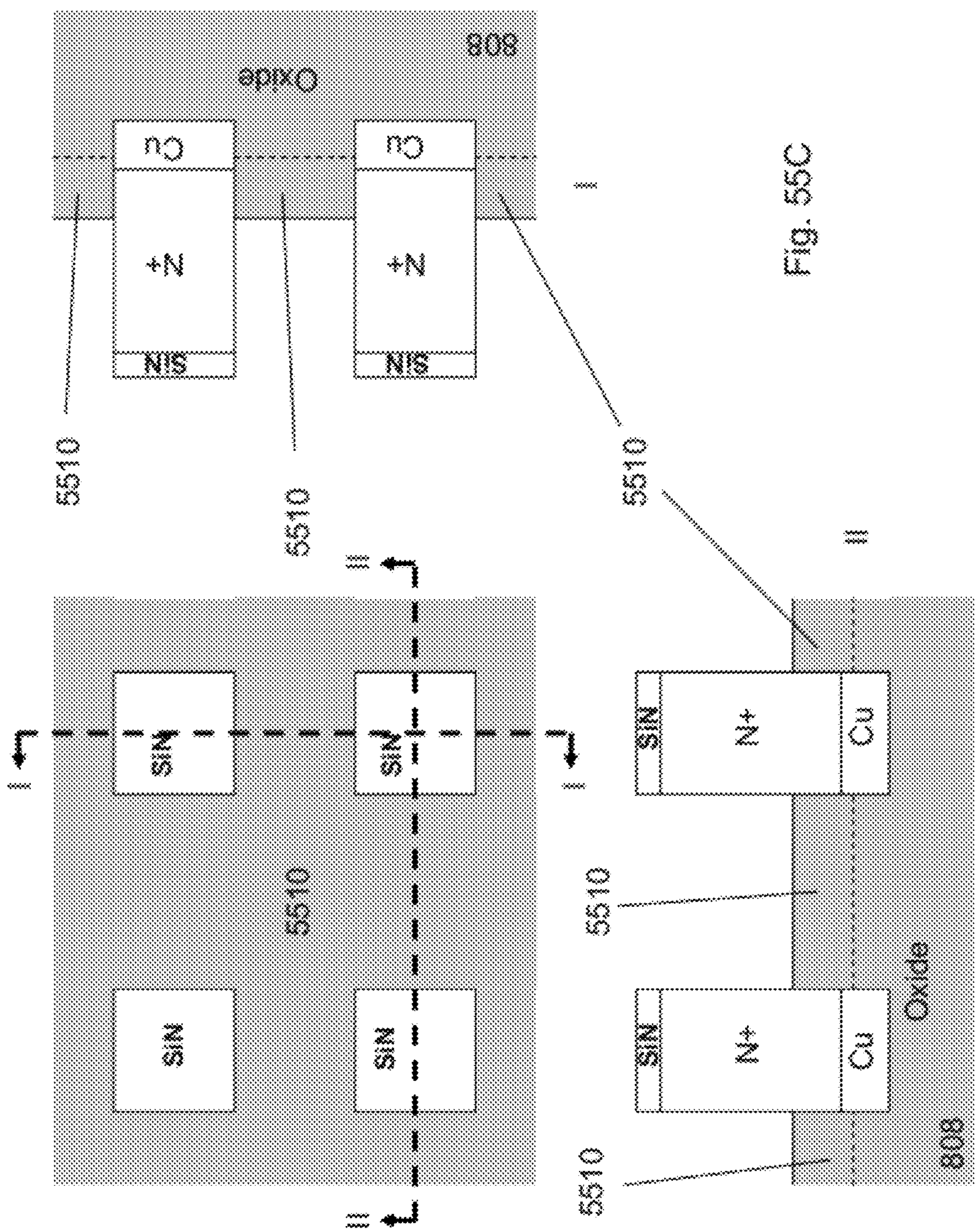

The area between the towers may then be partially filled with oxide 5510 via a Spin On Glass (SPG) spin, low temperature cure, and etch back sequence as illustrated in FIG. 55C. Alternatively, a low temperature CVD gap fill oxide may be deposited, then Chemically Mechanically Polished (CMP'ed) flat, and then selectively etched back to achieve the same shaped 5510 as shown in FIG. 55C. Alternatively, this step may also be accomplished by a conformal low temperature oxide CVD deposition and etch back sequence, creating a spacer profile coverage of the N+ resistor tower layer 5504.

Figure 55D:
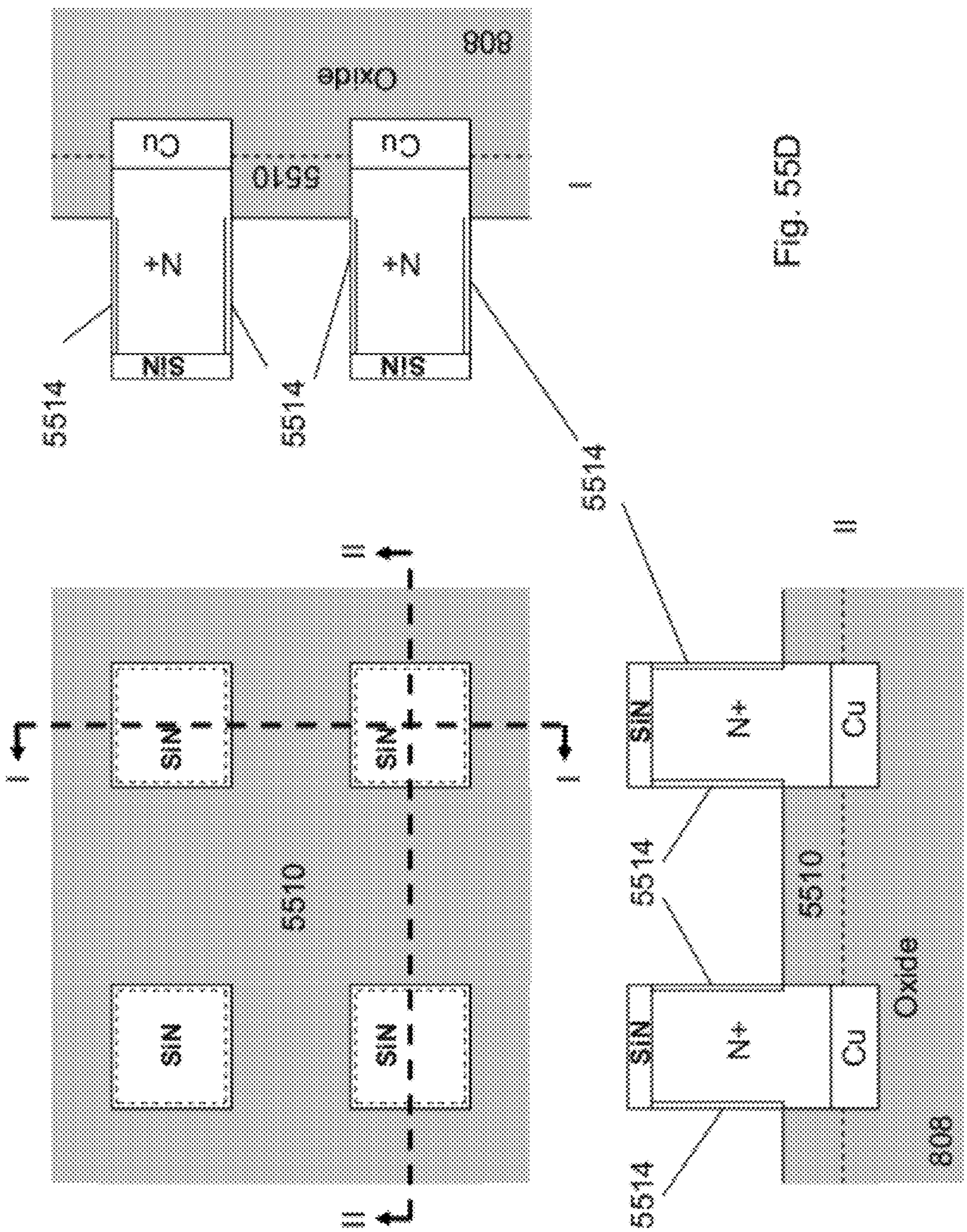

Next, the sidewall gate oxide 5514 may be formed by a low temperature microwave oxidation technique, such as the TEL SPA (Tokyo Electron Limited Slot Plane Antenna) oxygen radical plasma; and may be stripped by wet chemicals such as dilute HF, and grown again 5514 as illustrated in FIG. 55D.

Figure 55E:
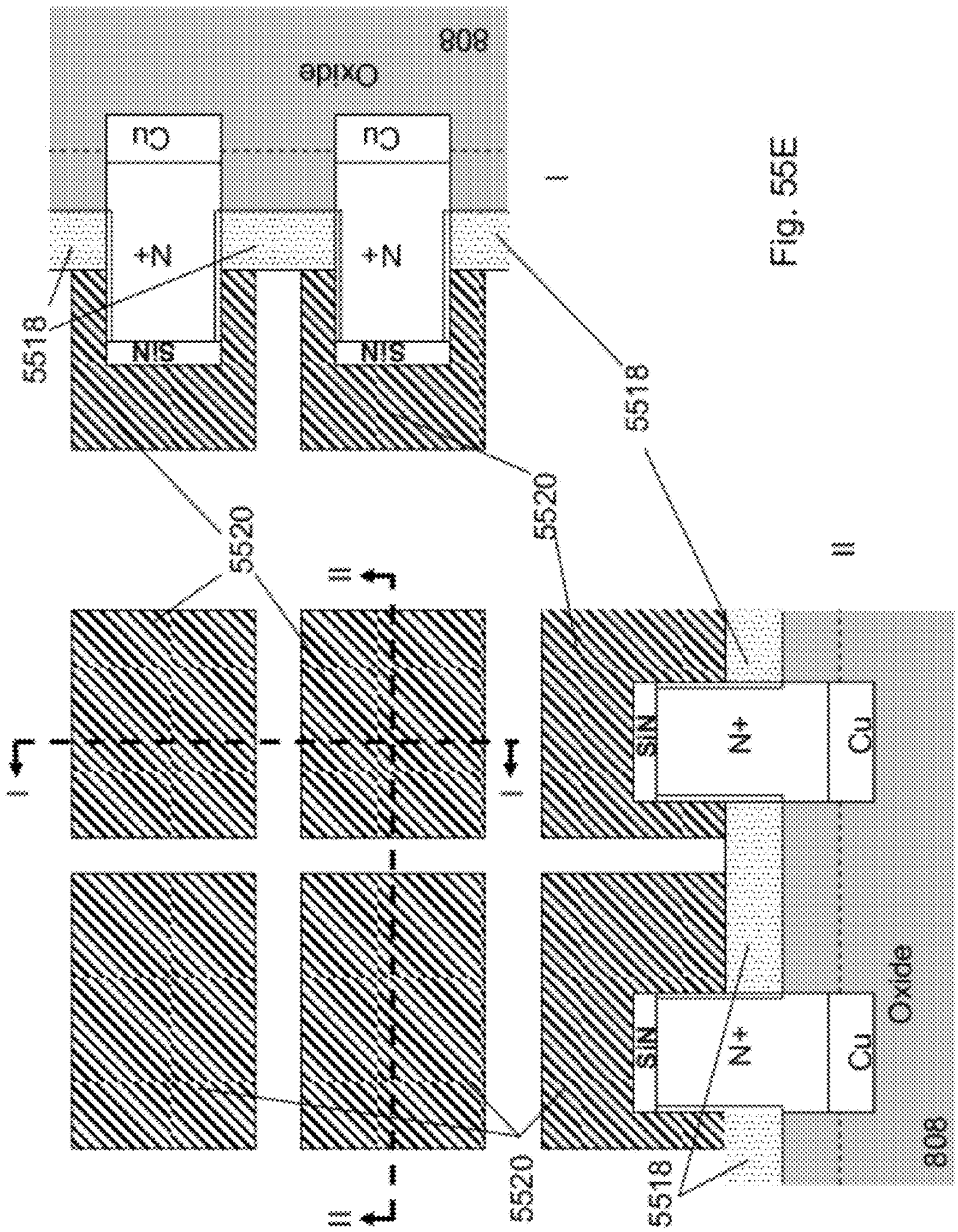

The gate electrode may then be deposited, such as a P+ doped amorphous silicon gate layer 5518, then Chemically Mechanically Polished (CMP'ed) flat, and then selectively etched back to achieve the shape as shown in FIG. 55E, and then the gate mask photoresist 5520 may be defined as illustrated in FIG. 55E.

Figure 55F:
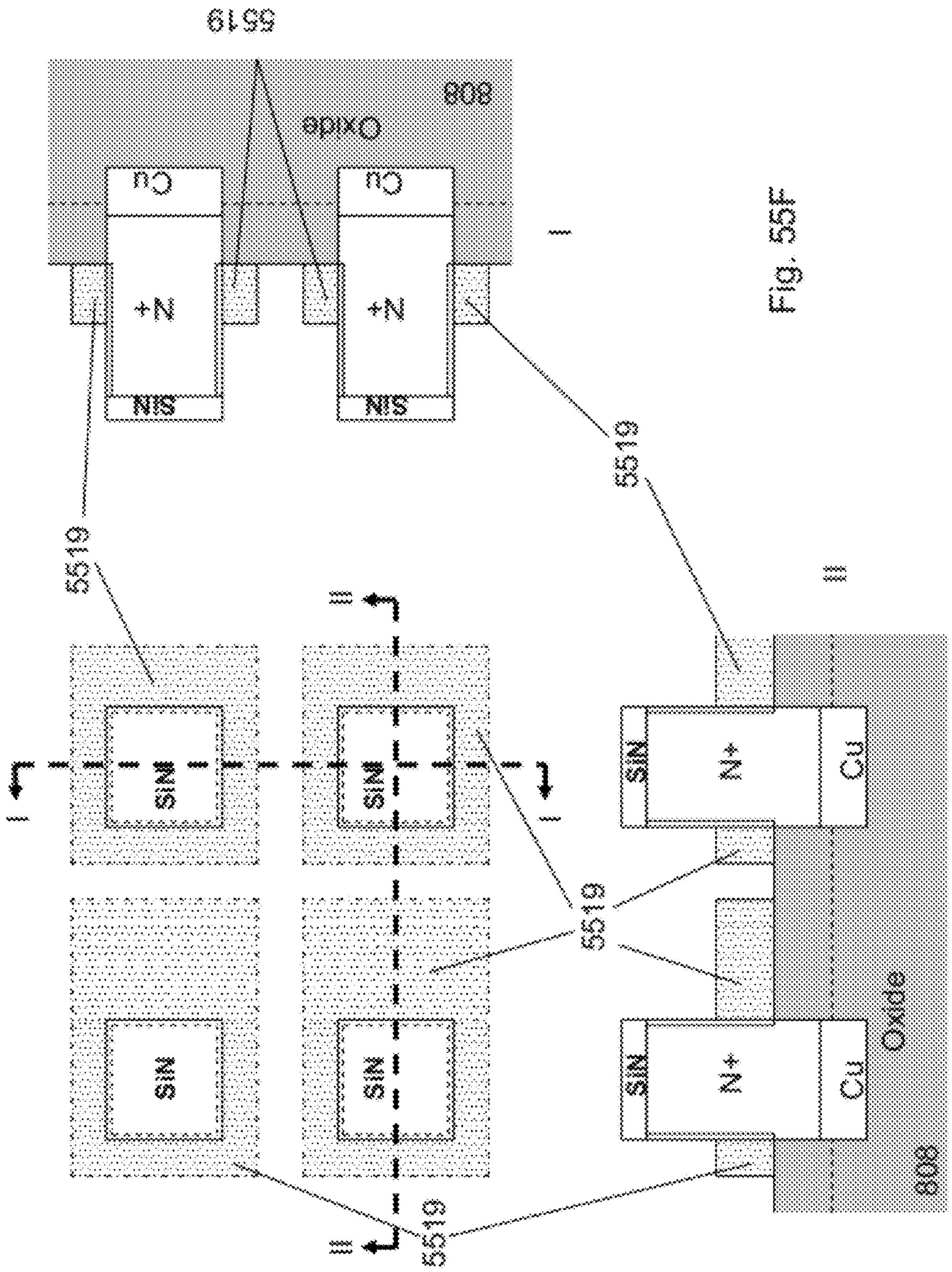

The gate layer 5518 may be etched such that the gate layer may be substantially fully cleared from between the towers and then the photoresist may be stripped as illustrated in FIG. 55F, thus forming gate electrodes 5519.

Figure 55G:
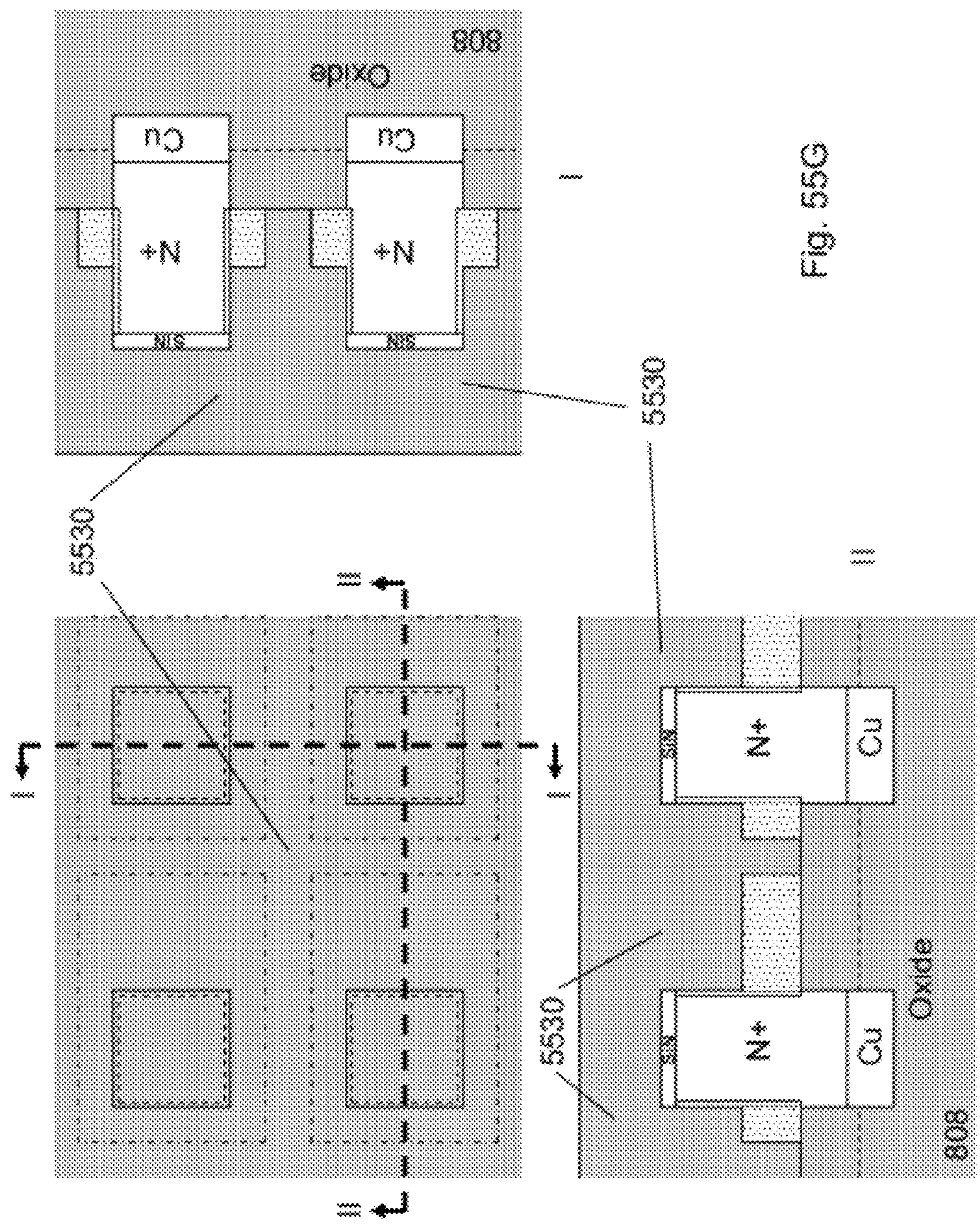

The spaces between the towers may be filled and the towers may be covered with oxide 5530 by a low temperature gap fill deposition, then a CMP, then another oxide deposition as illustrated in FIG. 55G.

Figure 55H:
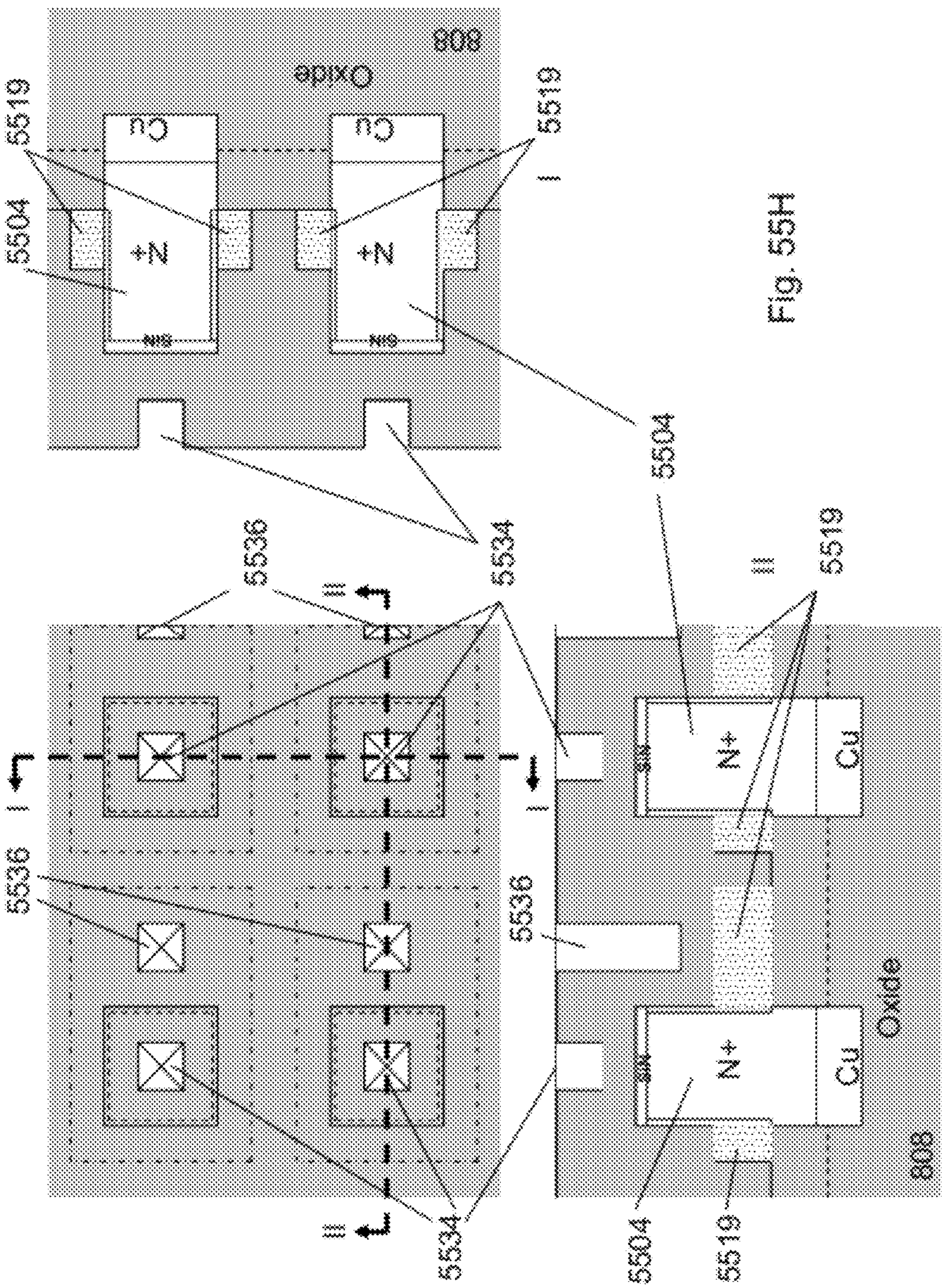
Figure 55I:
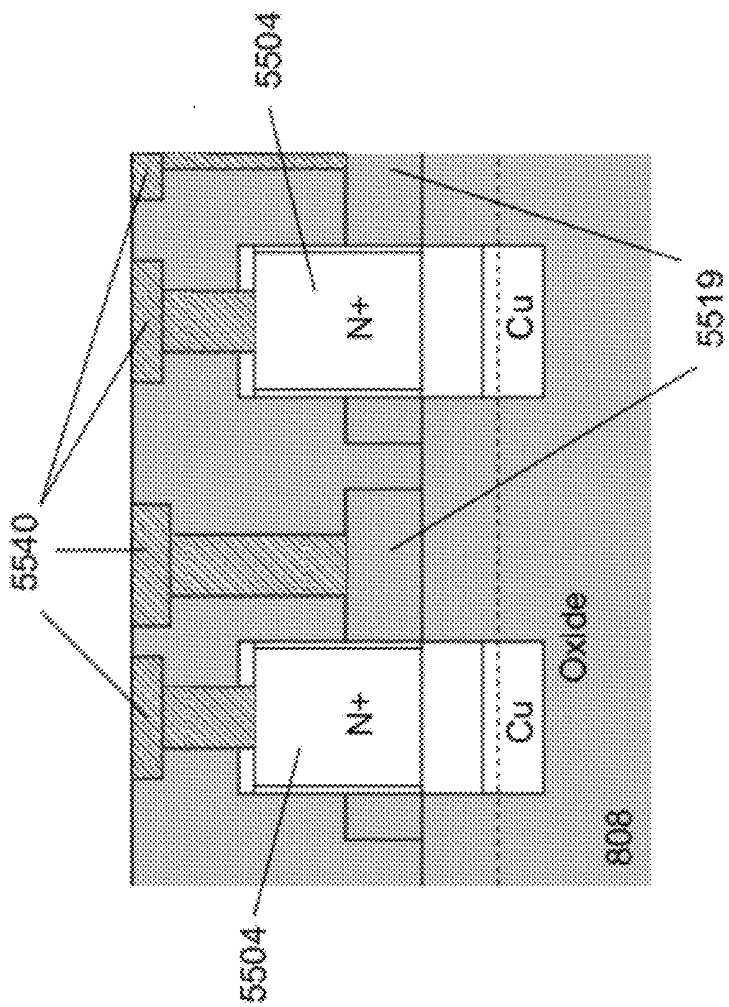

In FIG. 55H, the contacts 5534 to the transistor channel tower N+ 5504 may be masked and etched, and then the contacts 5536 to the gate electrodes 5519 may be masked and etched. The metal lines 5540 may be mask defined and etched, filled with barrier metals and copper interconnect, and CMP'ed in a normal Dual Damascene interconnect scheme, thereby completing the contact via connections to the transistor channel tower N+ 5504 and the gate electrode 5519 as illustrated in FIG. 55I.

This flow may enable the formation of mono-crystalline silicon top vertical junction-less transistors that may be connected to the underlying multi-metal layer semiconductor device without exposing the underlying devices and interconnect metals to high temperature. These junction-less transistors may be used as programming transistors of the Antifuse on acceptor wafer or house 808 or as a pass transistor for logic or FPGA use, or for additional uses in a 3D semiconductor device.

Figure 66:
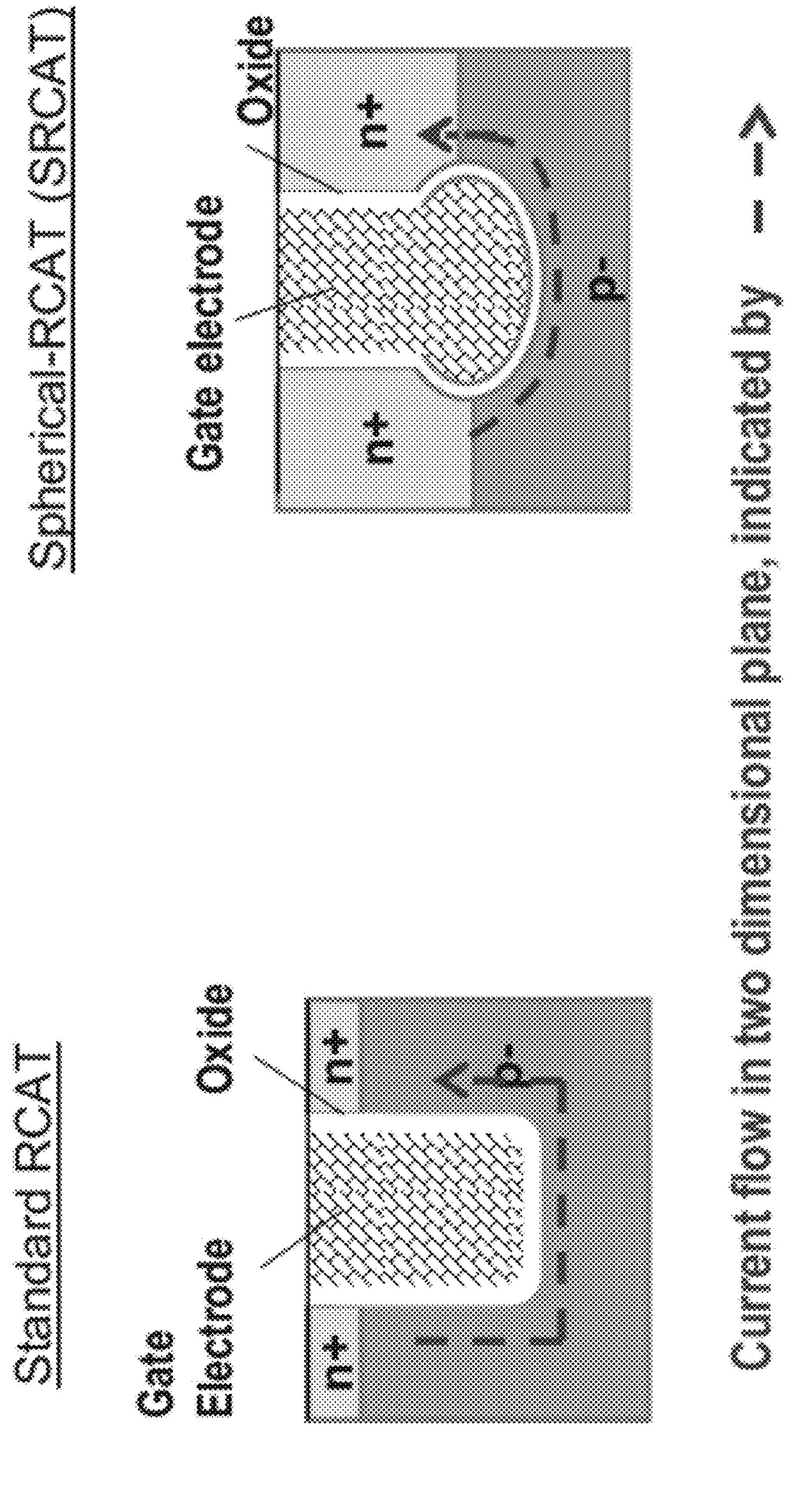
FIG. 66 are exemplary drawing illustrations of recessed channel array transistors.

Recessed Channel Array Transistors (RCATs) may be another transistor family that can utilize layer transfer and etch definition to construct a low-temperature monolithic 3D Integrated Circuit. The recessed channel array transistor may sometimes be referred to as a recessed channel transistor. Two types of RCAT device structures are shown in FIG. 66. These were described by J. Kim, et al. at the Symposium on VLSI Technology, in 2003 and 2005. Note that this prior art of J. Kim, et al. is for a single layer of transistors and no layer transfer techniques were ever employed. Their work also used high-temperature processes such as source-drain activation anneals, wherein the temperatures were above 400° C. In contrast, some embodiments of the invention employ this transistor family in a two-dimensional plane. Transistors in this document, such as, for example, junction-less, recessed channel array, or depletion, with the source and the drain in the same two dimensional planes may be considered planar transistors. The terms horizontal transistors, horizontally oriented transistors, or lateral transistors may also refer to planar transistors. Additionally, the gates of transistors in some embodiments of the invention that include gates on two or more sides of the transistor channel may be referred to as side gates.

Figure 67A:
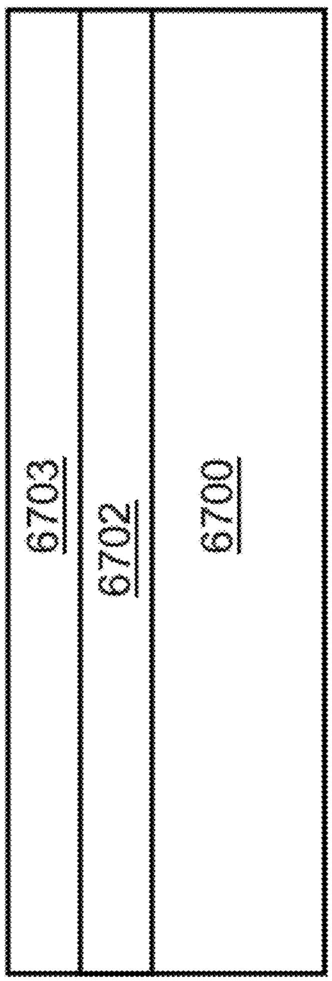
FIG. 67 A-F are exemplary drawing illustrations of formation of recessed channel array transistors.

A layer stacking approach to construct 3D integrated circuits with standard RCATs is illustrated in FIG. 67A-F. For an n-channel MOSFET, a p− silicon wafer 6700 may be the starting point. A buried layer of n+ Si 6702 may then be implanted as shown in FIG. 67A, resulting in p− layer 6703 that may be at the surface of the donor wafer. An alternative may be to implant a shallow layer of n+ Si and then epitaxially deposit a layer of p− Si, thus forming p− layer 6703. To activate dopants in the n+ layer 6702, the wafer may be annealed, with standard annealing procedures such as thermal, or spike, or laser anneal.

Figure 67B:
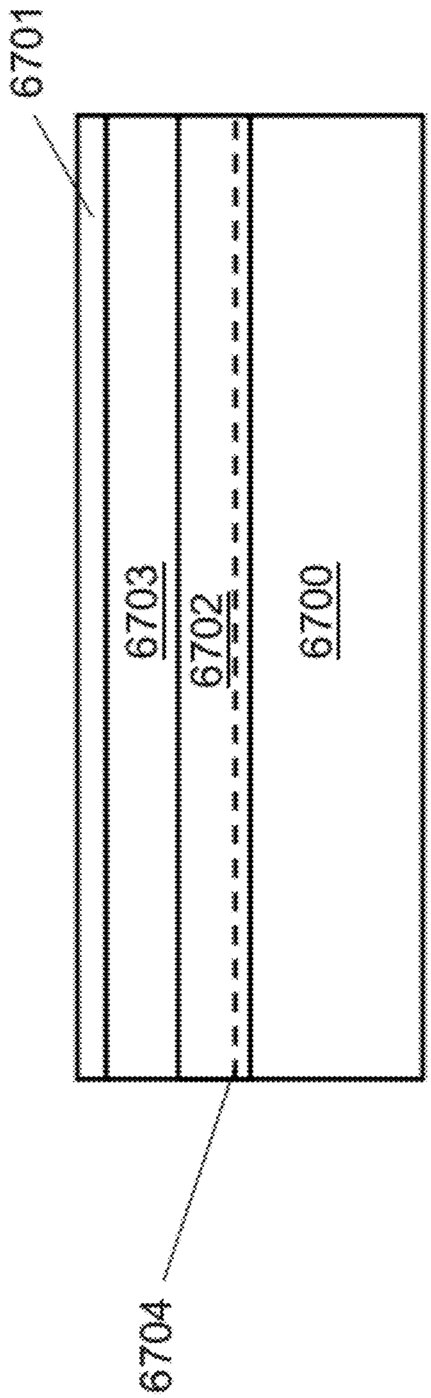

An oxide layer 6701 may be grown or deposited, as illustrated in FIG. 67B. Hydrogen may be implanted into the p silicon wafer 6700 to enable a "smart cut" process, as indicated in FIG. 67B as a dashed line for hydrogen cleave plane 6704.

Figure 67C:
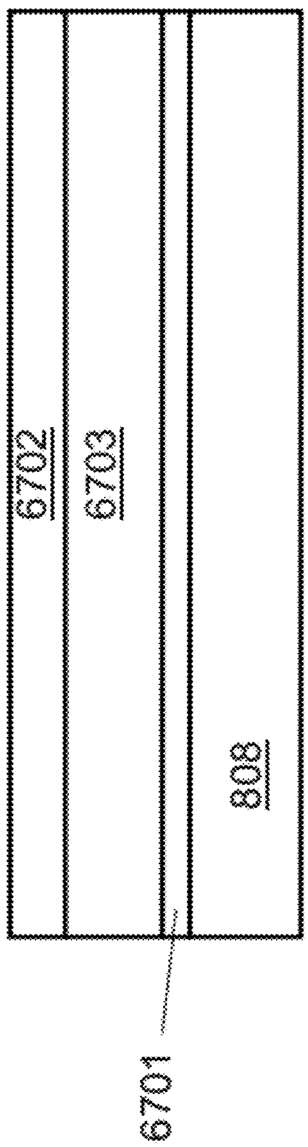

A layer transfer process may be conducted to attach the donor wafer in FIG. 67B to a pre-processed circuits acceptor wafer 808 as illustrated in FIG. 67C. The hydrogen cleave plane 6704 may now be utilized for cleaving away the remainder of the p silicon wafer 6700.

Figure 67D:
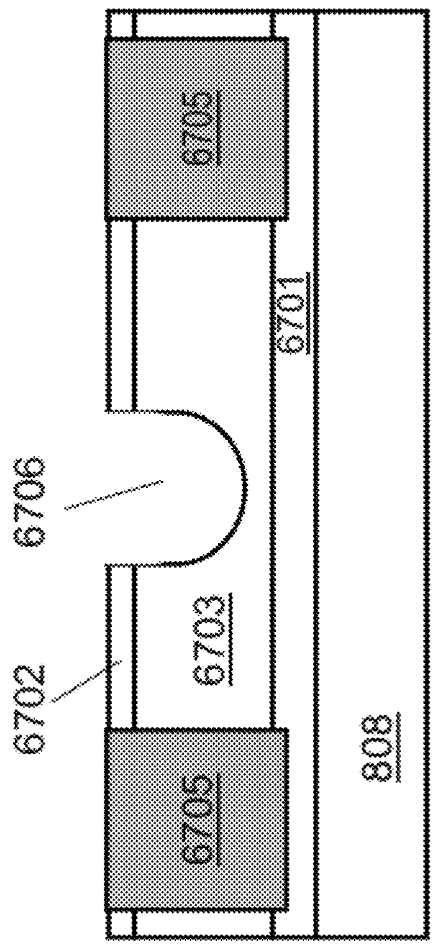

After the cut, chemical mechanical polishing (CMP) may be performed. Oxide isolation regions 6705 may be formed and an etch process may be conducted to form the recessed channel 6706 as illustrated in FIG. 67D. This etch process may be further customized so that corners are rounded to avoid high field issues.

Figure 67E:
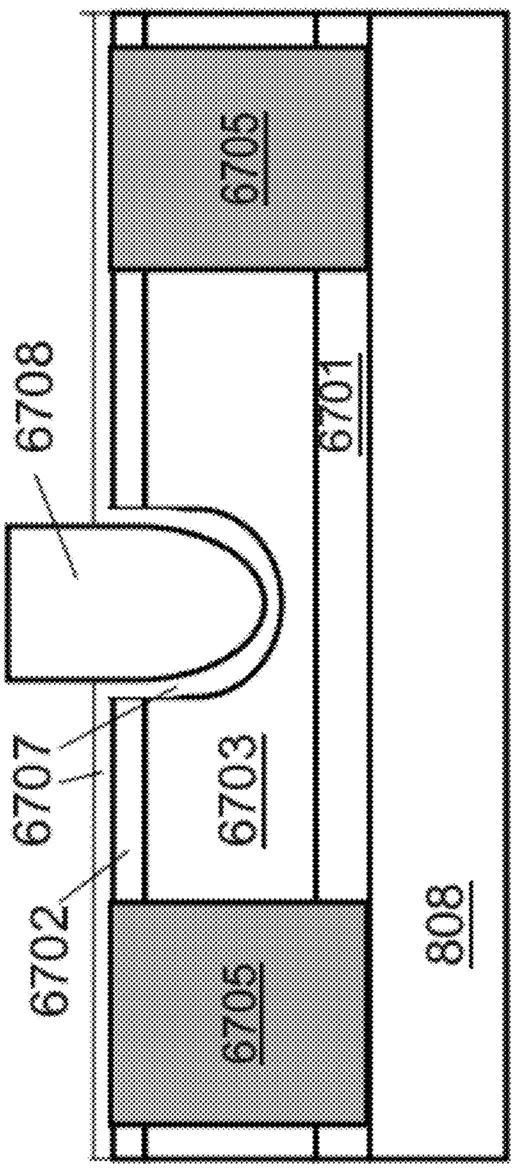

A gate dielectric 6707 may then be deposited, either through atomic layer deposition or through other low-temperature oxide formation procedures described previously. A metal gate 6708 may then be deposited to fill the recessed channel, followed by a CMP and gate patterning as illustrated in FIG. 67E.

Figure 67F:
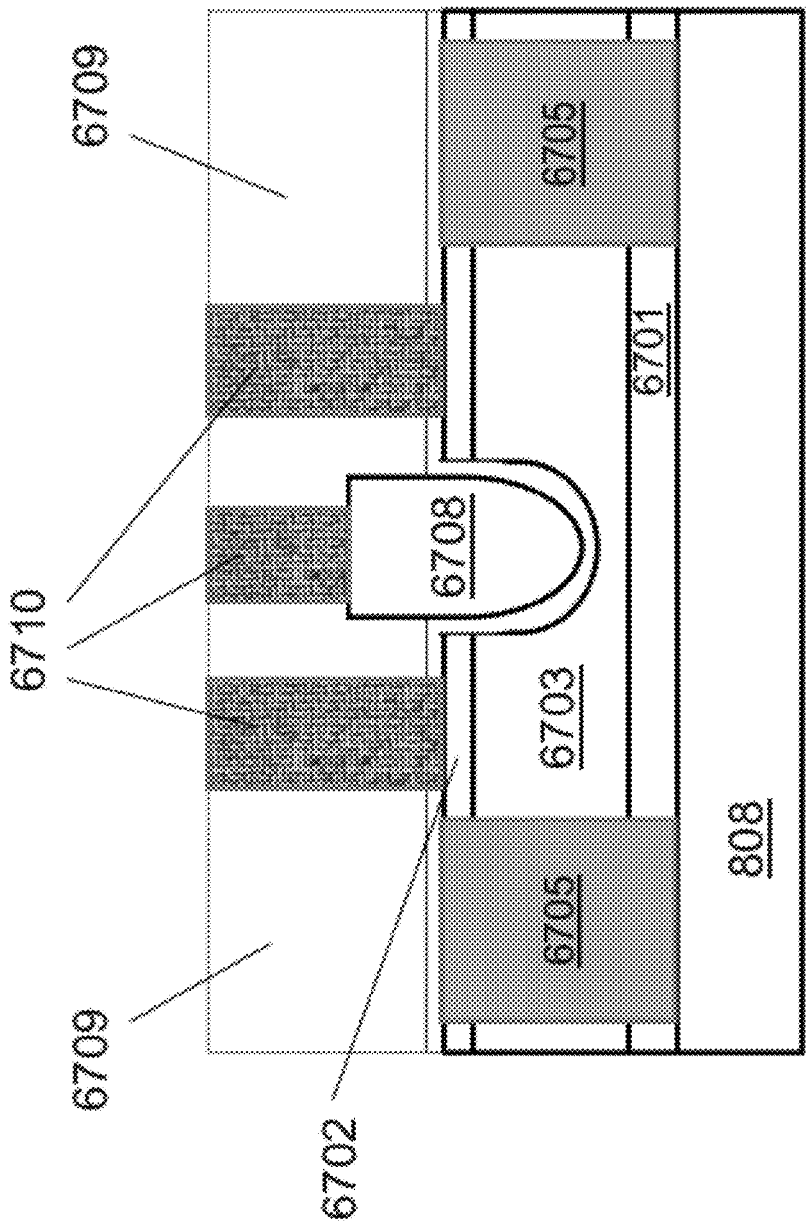

A low temperature oxide 6709 may be deposited and planarized by CMP. Contacts 6710 may be formed to connect to all electrodes of the transistor as illustrated in FIG. 67F. This flow may enable the formation of a low temperature RCAT monolithically on top of pre-processed circuitry 808. A p-channel MOSFET may be formed with an analogous process. The p and n channel RCATs may be utilized to form a monolithic 3D CMOS circuit library as described later.

Figure 68A:
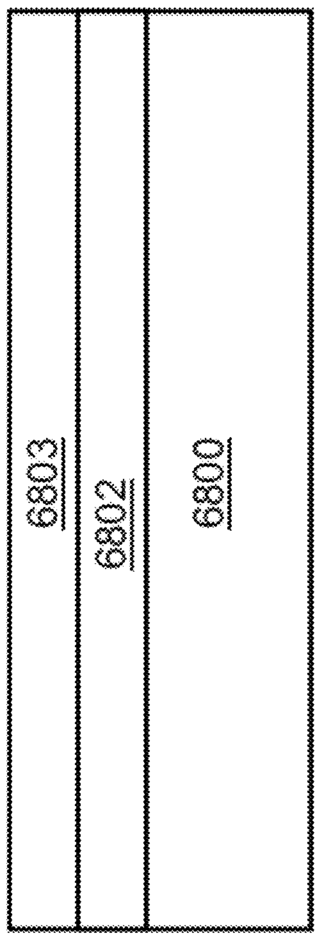
FIG. 68 A-F are exemplary drawing illustrations of formation of spherical recessed channel array transistors.

A layer stacking approach to construct 3D integrated circuits with spherical-RCATs (S-RCATs) is illustrated in FIG. 68A-F. For an n-channel MOSFET, a p− silicon wafer 6800 may be the starting point. A buried layer of n+ Si 6802 may then implanted as shown in FIG. 68A, resulting in p− layer 6803 at the surface of the donor wafer. An alternative is to implant a shallow layer of n+ Si and then epitaxially deposit a p− layer 6803 of silicon. To activate dopants in the n+ layer 6802, the wafer may be annealed, with standard annealing procedures such as thermal, or spike, or laser anneal.

Figure 68B:
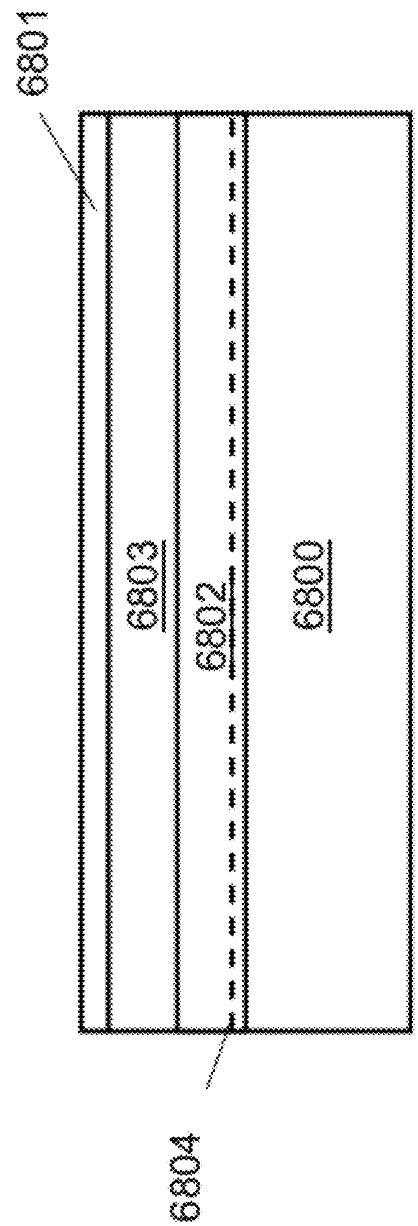

An oxide layer 6801 may be grown or deposited, as illustrated in FIG. 68B. Hydrogen may be implanted into the wafer to enable “smart cut” process, as indicated in FIG. 68B as a dashed line for hydrogen cleave plane 6804.

Figure 68C:
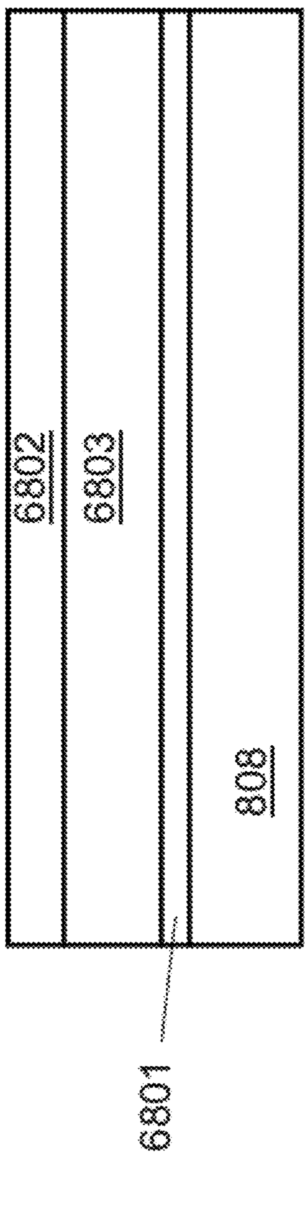

A layer transfer process may be conducted to attach the donor wafer in FIG. 68B to a pre-processed circuits acceptor wafer 808 as illustrated in FIG. 68C. The hydrogen cleave plane 6804 may now be utilized for cleaving away the remainder of the p− silicon wafer 6800. After the cut, chemical mechanical polishing (CMP) may be performed.

Figure 68D:
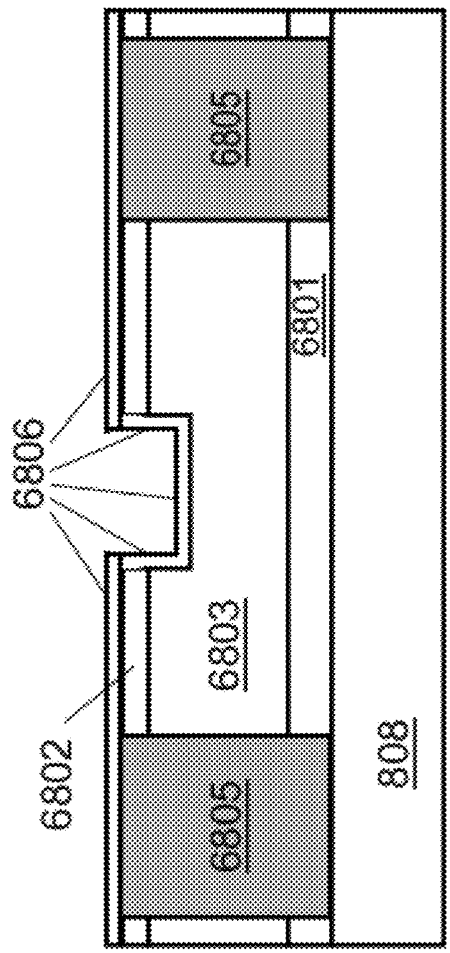

Oxide isolation regions 6805 may be formed as illustrated in FIG. 68D. The eventual gate electrode recessed channel may be masked and partially etched, and a spacer deposition 6806 may be performed with a conformal low temperature deposition such as, for example, silicon oxide or silicon nitride or a combination.

Figure 68E:
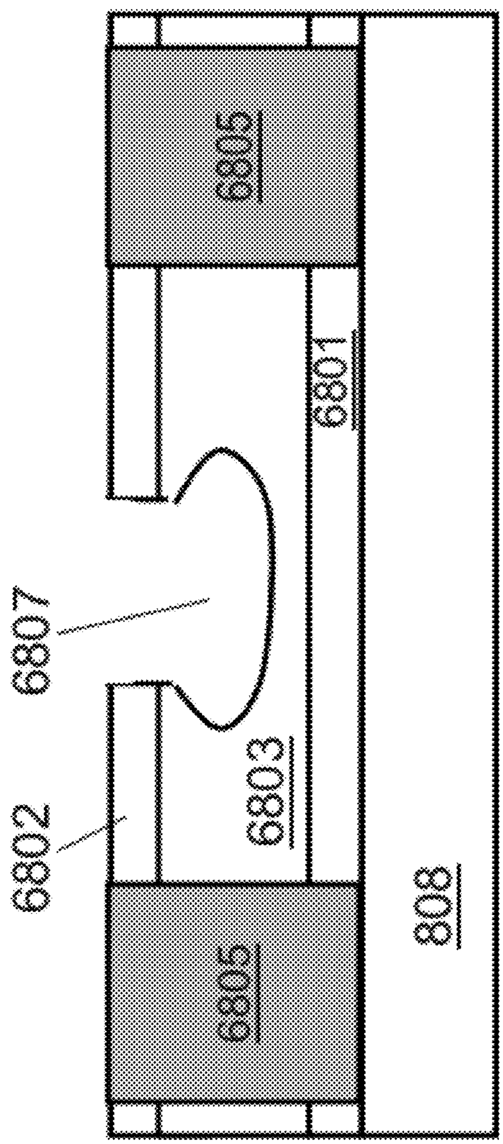

An anisotropic etch of the spacer may be performed to leave spacer material substantially only on the vertical sidewalls of the recessed gate channel opening. An isotropic silicon etch may then be conducted to form the spherical recess 6807 as illustrated in FIG. 68E. The spacer on the sidewall may be removed with a selective etch.

Figure 68F:
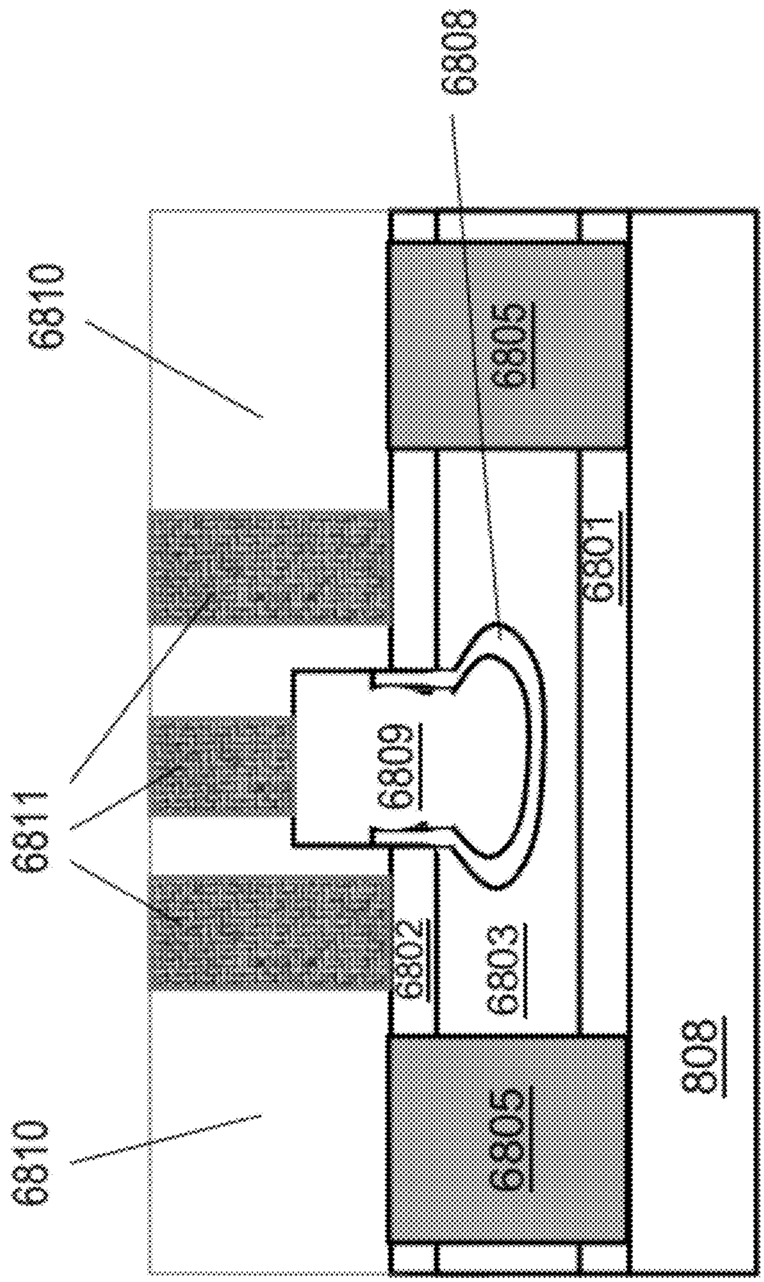

A gate dielectric 6808 may then be deposited, either through atomic layer deposition or through other low-temperature oxide formation procedures described previously. A metal gate 6809 may be deposited to fill the recessed channel, followed by a CMP and gate patterning as illustrated in FIG. 68F. The gate material may also be doped amorphous silicon or other low temperature conductor with the proper work function. A low temperature oxide 6810 may be deposited and then planarized by CMP. Contacts 6811 may be formed to connect to all electrodes of the transistor as illustrated in FIG. 68F.

This flow may enable the formation of a low temperature S-RCAT monolithically on top of pre-processed circuitry 808. A p-channel MOSFET may be formed with an analogous process. The p and n channel S-RCATs may be utilized to form a monolithic 3D CMOS circuit library as described later. In addition, SRAM circuits constructed with RCATs may have different trench depths compared to logic circuits. The RCAT and S-RCAT devices may be utilized to form BiCMOS inverters and other mixed circuitry when, for example, the house 808 layer has conventional Bipolar Junction Transistors and the transferred layer or layers may be utilized to form the RCAT devices monolithically.

A planar n-channel junction-less recessed channel array transistor (JLRCAT) suitable for a 3D IC may be constructed. The JLRCAT may provide an improved source and drain contact resistance, thereby allowing for lower channel doping, and the recessed channel may provide for more flexibility in the engineering of channel lengths and characteristics, and increased immunity from process variations.

Figure 151A:
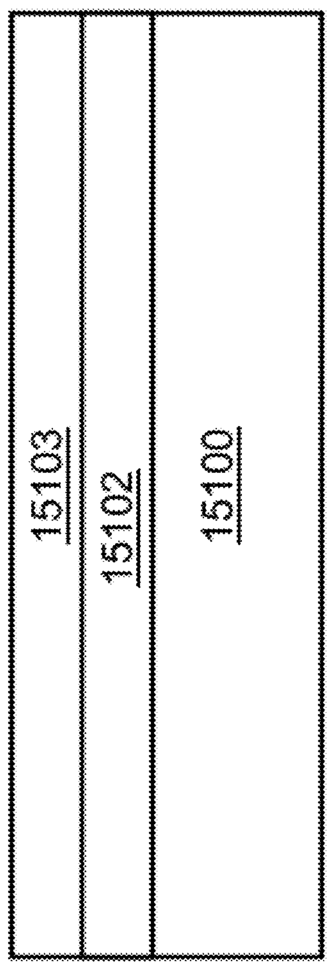

As illustrated in FIG. 151A, an N− substrate donor wafer 15100 may be processed to include wafer sized layers of N+ doping 15102, and N− doping 15103 across the wafer. The N+ doped layer 15102 may be formed by ion implantation and thermal anneal. In addition, N− doped layer 15103 may have additional ion implantation and anneal processing to provide a different dopant level than N− substrate donor wafer 15100. N− doped layer 15103 may also have graded N− doping to mitigate transistor performance issues, such as, for example, short channel effects, after the formation of the JLRCAT. The layer stack may alternatively be formed by successive epitaxially deposited doped silicon layers of N+ doping 15102 and N− doping 15103, or by a combination of epitaxy and implantation Annealing of implants and doping may utilize optical annealing techniques or types of Rapid Thermal Anneal (RTA or spike) or flash anneal.

Figure 151B:
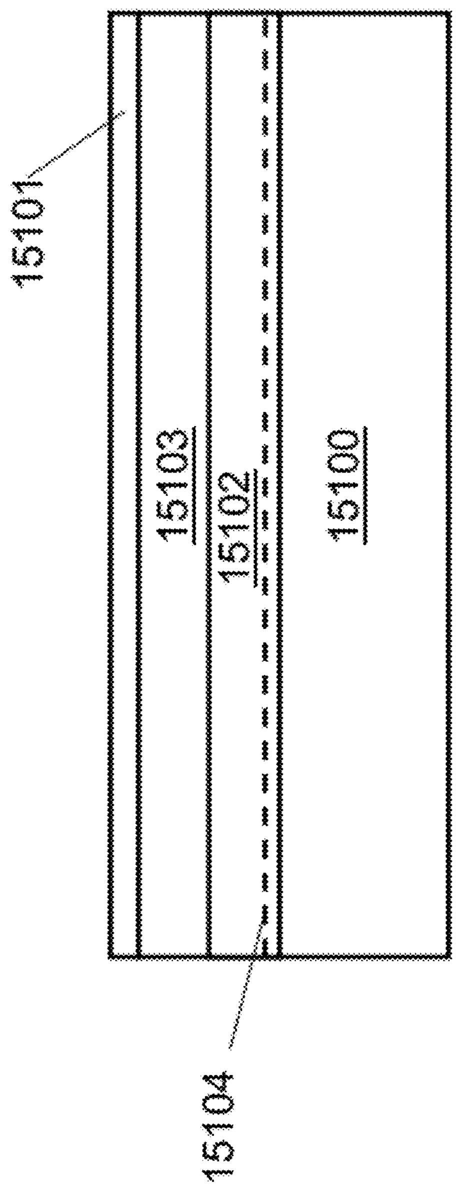

As illustrated in FIG. 151B, the top surface of N− substrate donor wafer 15100 layers stack from FIG. 151A may be prepared for oxide wafer bonding with a deposition of an oxide to form oxide layer 15101 on top of N− doped layer 15103. A layer transfer demarcation plane (shown as dashed line) 15104 may be formed by hydrogen implantation, co-implantation such as hydrogen and helium, or other methods as previously described.

Figure 151C:
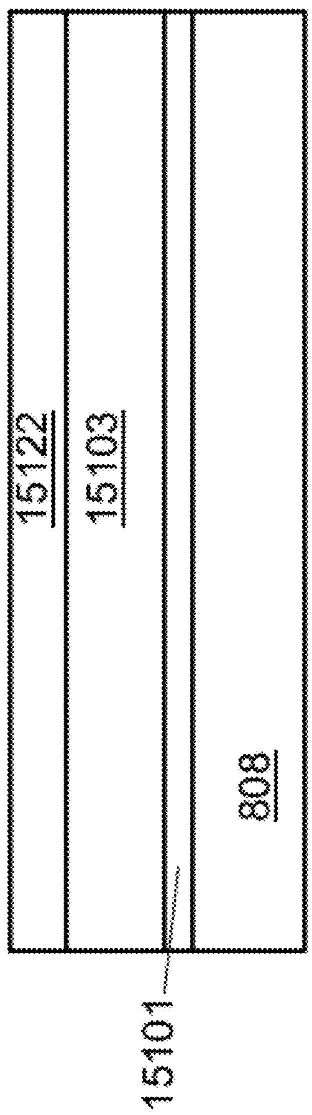

As illustrated in FIG. 151C, both the N− substrate donor wafer 15100 and acceptor substrate 808 may be prepared for wafer bonding as previously described and then low temperature (less than about 400° C.) aligned and oxide to oxide bonded. Acceptor substrate 808, as described previously, may include, for example, transistors, circuitry, metal, such as, for example, aluminum or copper, interconnect wiring, and through layer via metal interconnect strips or pads. The portion of the N− substrate donor wafer 15100 and N+ doped layer 15102 that is below the layer transfer demarcation plane 15104 may be removed by cleaving or other processes as previously described, such as, for example, ion-cut or other methods. Oxide layer 15101, N− doped layer 15103, and N+ doped layer 15122 may have been layer transferred to acceptor wafer 808. Now JLRCAT transistors may be formed with low temperature (less than about 400° C.) processing and may be aligned to the acceptor wafer 808 alignment marks (not shown).

Figure 151D:
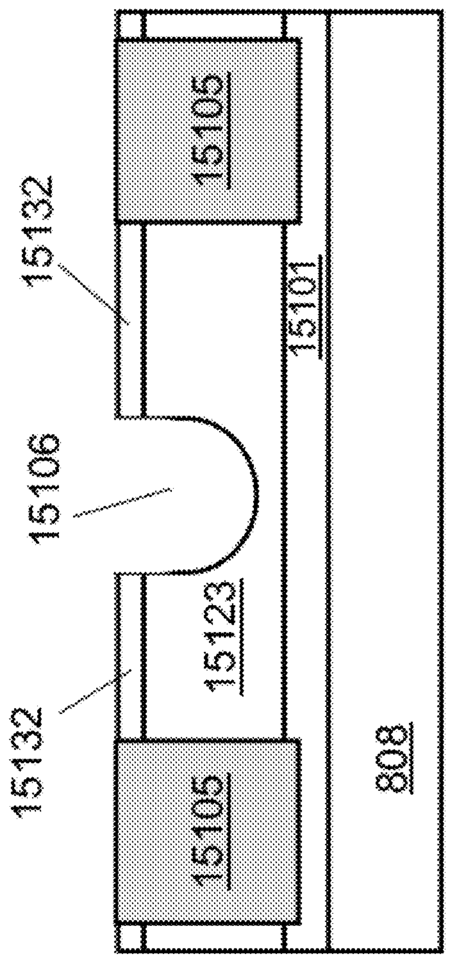

As illustrated in FIG. 151D, the transistor isolation regions 15105 may be formed by mask defining and then plasma/RIE etching N+ doped layer 15122, and N− doped layer 15103 to the top of oxide layer 15101 or into oxide layer 15101. A low-temperature gap fill oxide may be deposited and chemically mechanically polished, with the oxide remaining in isolation regions 15105. Recessed channel 15106 may be mask defined and etched through N+ doped layer 15122 and partially into N− doped layer 15103. The recessed channel 15106 surfaces and edges may be smoothed by processes such as, for example, wet chemical, plasma/RIE etching, low temperature hydrogen plasma, or low temperature oxidation and strip techniques, to mitigate high field and other effects. These process steps may form isolation regions 15105, N+ source and drain regions 15132 and N− channel region 15123.

Figure 151E:
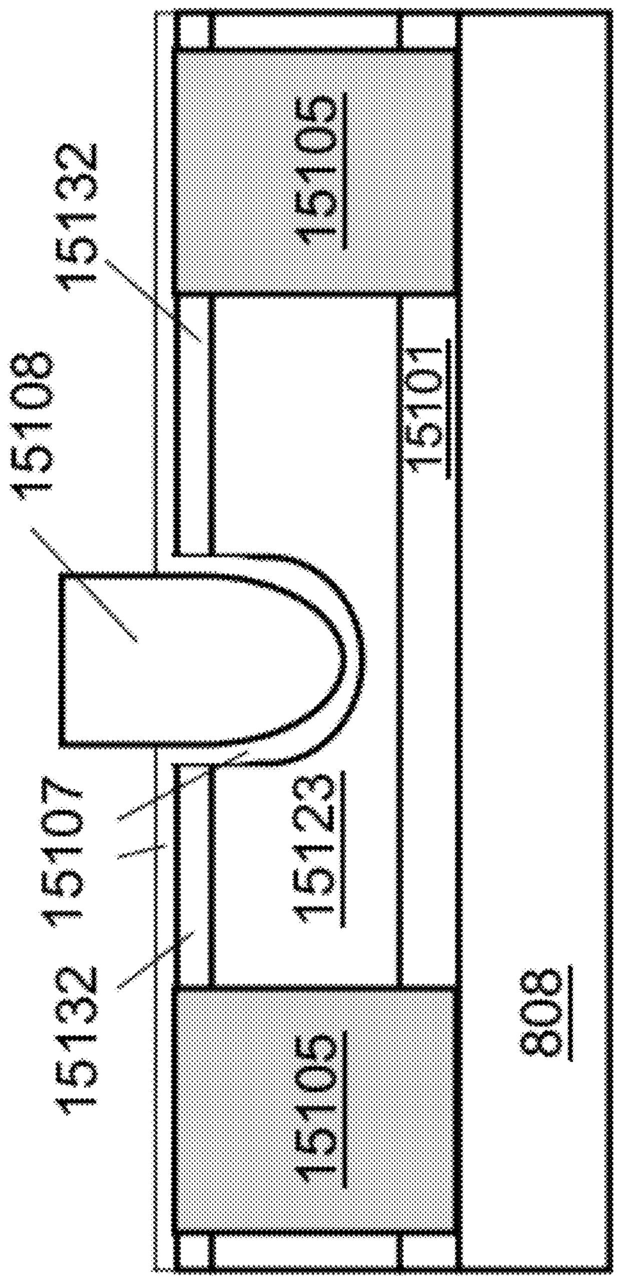

As illustrated in FIG. 151E, a gate dielectric 15107 may be formed and a gate metal material may be deposited. The gate dielectric 15107 may be an atomic layer deposited (ALD)

gate dielectric that may be paired with a work function specific gate metal in the industry standard high k metal gate process schemes described previously. Or the gate dielectric 15107 may be formed with a low temperature oxide deposition or low temperature microwave plasma oxidation of the silicon surfaces and then a gate metal material such as, for example, tungsten or aluminum may be deposited. The gate metal material may be chemically mechanically polished, and the gate area defined by masking and etching, thus forming gate electrode 15108.

Figure 151F:
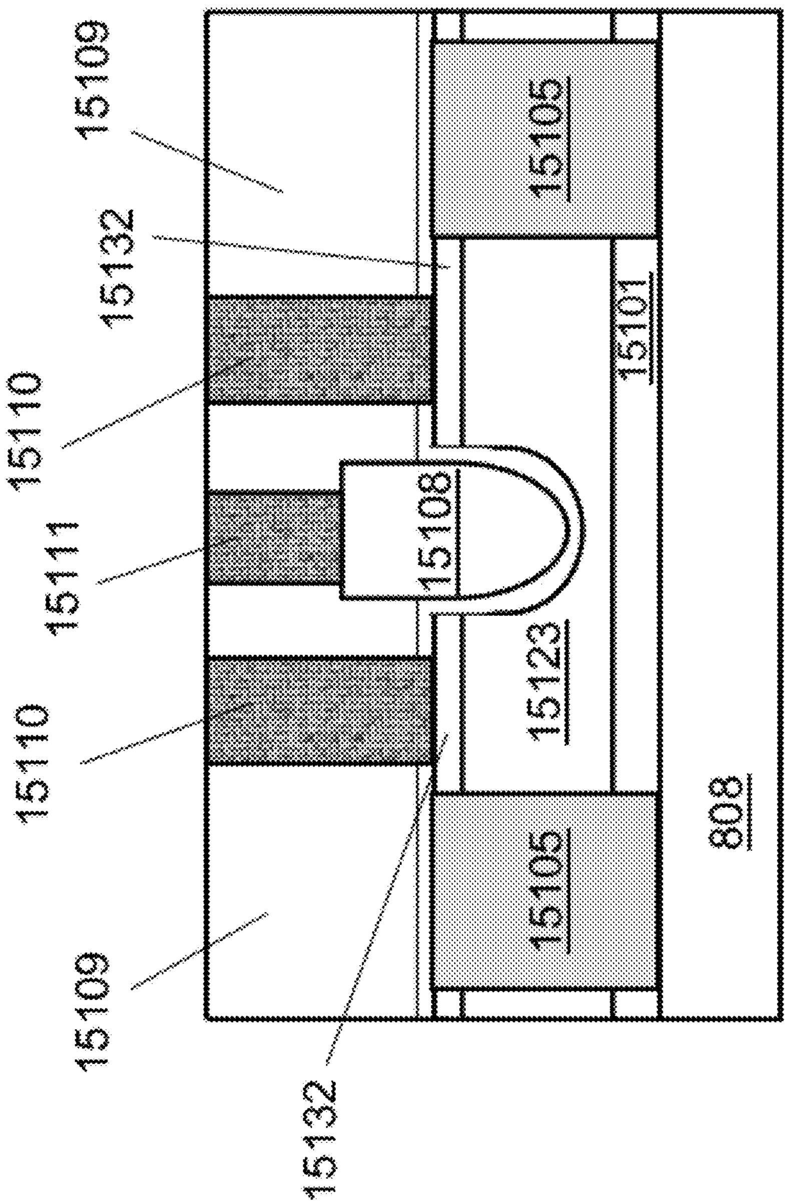

As illustrated in FIG. 151F, a low temperature thick oxide 15109 may be deposited and planarized, and source, gate, and drain contacts, and through layer via (not shown) openings may be masked and etched, thereby preparing the transistors to be connected via metallization. Thus gate contact 15111 may connect to gate electrode 15108, and source & drain contacts 15110 may connect to N+ source and drain regions 15132. Thru layer vias (not shown) may be formed to connect to the acceptor substrate connect strips (not shown) as described herein.

Persons of ordinary skill in the art will appreciate that the illustrations in FIGS. 151A through 151F are exemplary only and are not drawn to scale. Such skilled persons will further appreciate that many variations may be possible such as, for example, a p-channel JLRCAT may be formed with changing the types of dopings appropriately. Moreover, the N− substrate donor wafer 15100 may be p type as well as the n type described above. Further, N− doped layer 15103 may include multiple layers of different doping concentrations and gradients to fine tune the eventual JLRCAT channel for electrical performance and reliability characteristics, such as, for example, off-state leakage current and on-state current. Furthermore, isolation regions 15105 may be formed by a hard mask defined process flow, wherein a hard mask stack, such as, for example, silicon oxide and silicon nitride layers, or silicon oxide and amorphous carbon layers. Moreover, CMOS JLRCATs may be constructed with n-JLRCATs in one mono-crystalline silicon layer and p-JLRCATs in a second mono-crystalline layer, which may include different crystalline orientations of the mono-crystalline silicon layers, such as, for example, <100>, <111> or <551>, and may include different contact silicides for substantially optimum contact resistance to p or n type source, drains, and gates. Furthermore, a back-gate or double gate structure may be formed for the JLRCAT and may utilize techniques described elsewhere in this document. Many other modifications within the scope of the illustrated embodiments of the invention will suggest themselves to such skilled persons after reading this specification. Thus the invention is to be limited only by the appended claims.

An n-channel Trench MOSFET transistor suitable for a 3D IC may be constructed. The trench MOSFET may provide an improved drive current and the channel length can be tuned without area penalty. The trench MOSFET can be formed utilizing layer transfer techniques.

Figure 152A:
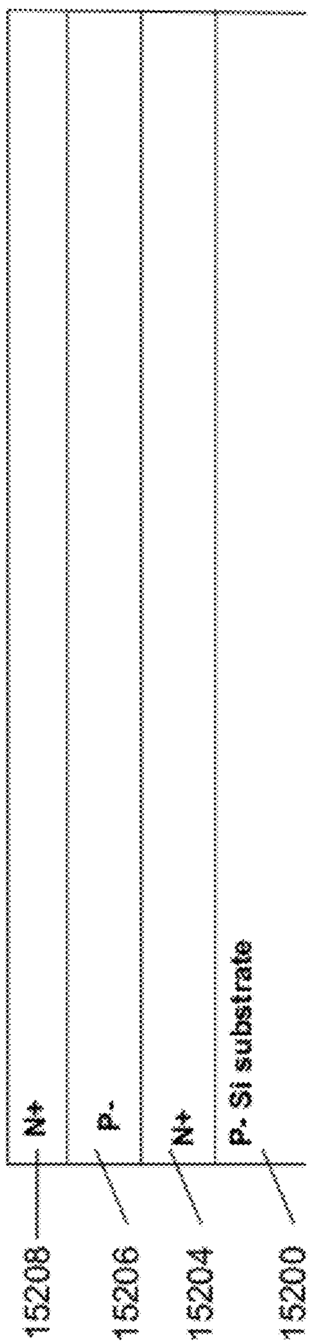

As illustrated in FIG. 152A, a P− substrate donor wafer 15200 may be processed to include wafer sized layers of N+ doping 15204 and 15208, and P− doping 15206 across the wafer. The N+ doped layers 15204 and 15208 may be formed by ion implantation and thermal anneal. In addition, P− doped layer 15206 may have additional ion implantation and anneal processing to provide a different dopant level than P− substrate donor wafer 15200. P− doped layer 15206 may also have graded P− doping to mitigate transistor performance issues, such as, for example, short channel effects, after the formation of the trench MOSFET. The layer stack may alternatively be formed by successive epitaxially deposited doped silicon layers of N+ doping 15204, P− doping 15206, and N+ doping 15208, or by a combination of epitaxy and implantation, or other formation techniques. Annealing of implants and doping may utilize techniques, such as, for example, optical annealing or types of Rapid Thermal Anneal (RTA or spike) or flash anneal.

Figure 152B:
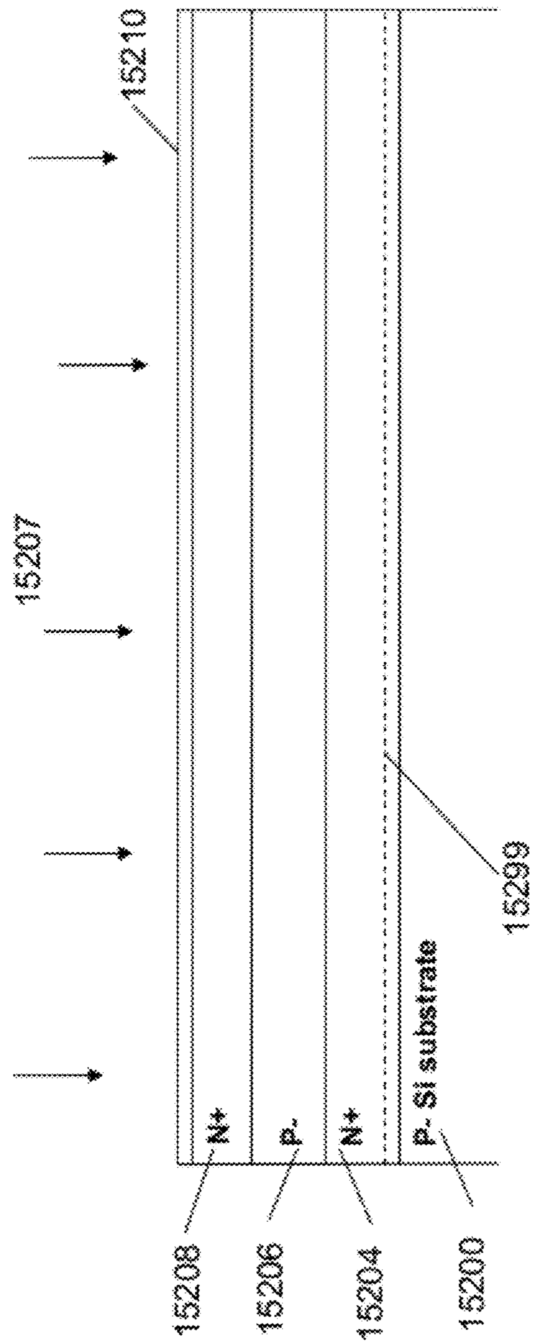

As illustrated in FIG. 152B, the top surface of P− substrate donor wafer 15200 layers stack from FIG. 152A may be prepared for oxide wafer bonding with a deposition of an oxide to form oxide layer 15210 on top of N+ doped layer 15208. A layer transfer demarcation plane 15299 (shown as dashed line) may be formed by hydrogen implantation 15207, co-implantation such as hydrogen and helium, or other methods as described herein. The layer transfer demarcation plane 15299 may be formed within N+ layer 15204 (shown) or P− substrate donor wafer 15200 (not shown).

Figure 152C:
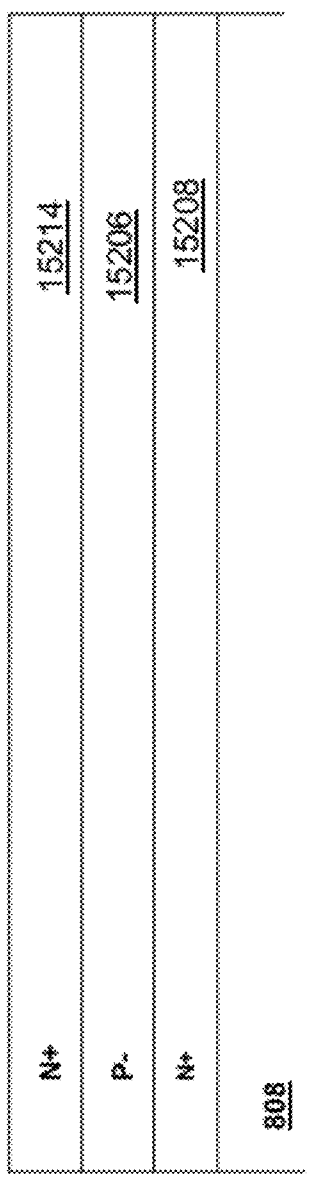

As illustrated in FIG. 152C, both the P− substrate donor wafer 15200 and acceptor substrate 808 may be prepared for wafer bonding as previously described and then low temperature (less than about 400° C.) aligned and oxide to oxide bonded. Acceptor substrate 808, as described previously, may include, for example, transistors, circuitry, metal, such as, for example, aluminum or copper, interconnect wiring, and through layer via metal interconnect strips or pads. The portion of the P− substrate donor wafer 15200 and N+ doped layer 15204 that is below the layer transfer demarcation plane 15299 may be removed by cleaving or other processes as described herein, such as, for example, ion-cut or other methods. Oxide layer 15210 (not shown), N+ layer 15208, P− doped layer 15206, and N+ doped layer 15214 may have been layer transferred to acceptor wafer 808. Now trench MOSFET transistors may be formed with low temperature (less than about 400° C.) processing and may be aligned to the acceptor wafer 808 alignment marks (not shown).

Figure 152D:
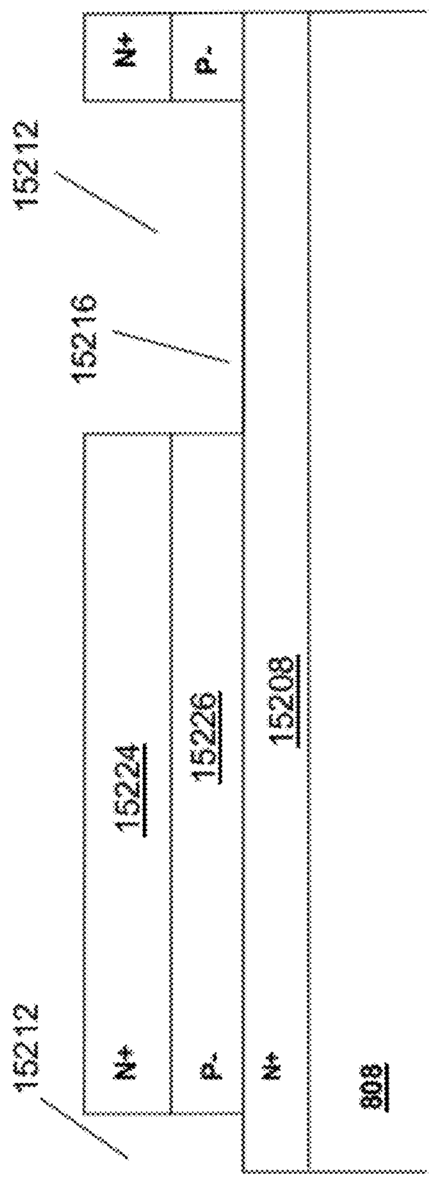

As illustrated in FIG. 152D, the transistor isolation regions 15212 and MOSFET N+ source contact opening region 15216 may be formed by mask defining and then plasma/RIE etching N+ doped layer 15214 and P− doped layer 15206, thus forming N+ regions 15224 and P− regions 15226.

Figure 152E:
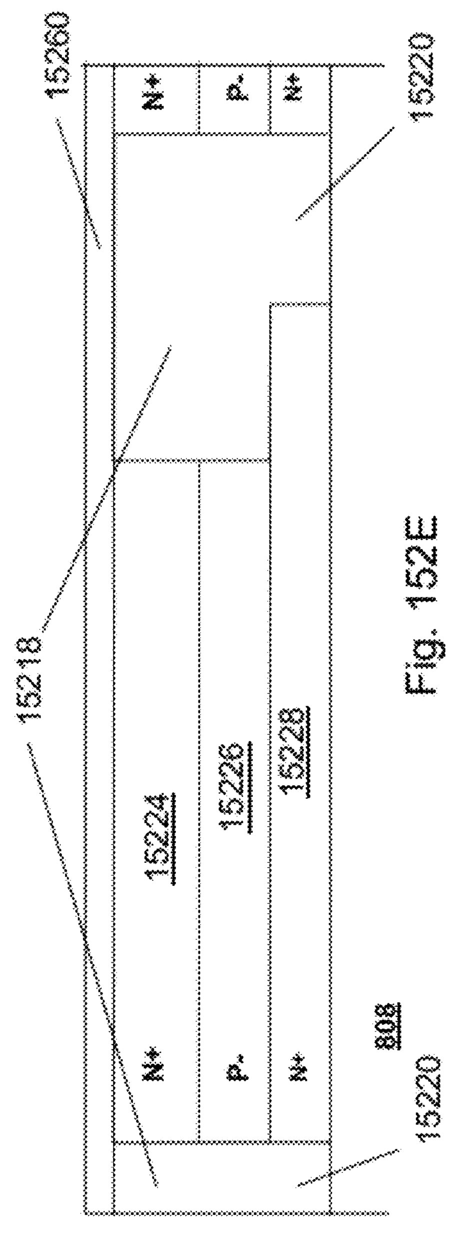

As illustrated in FIG. 152E, the transistor isolation regions 15220 may be formed by mask defining and then plasma/RIE etching N+ doped layer 15208, thus forming bottom N+ regions 15228. Then a low-temperature gap fill oxide may be deposited and chemically mechanically polished, with the oxide remaining in isolation regions 15218. A polish stop layer or hard mask etch stack 15260, such as, for example, silicon oxide and silicon nitride layers, or silicon oxide and amorphous carbon layers, may be deposited.

Figure 152F:
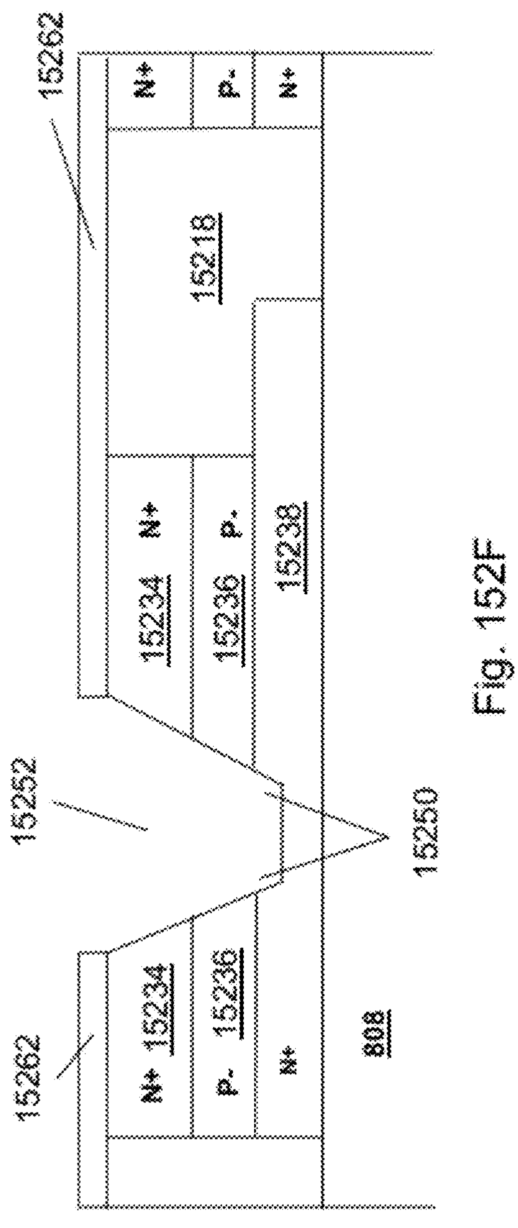

As illustrated in FIG. 152F, gate trench 15252 may be formed by mask defining and then plasma/RIE etching the hard mask etch stack 15260, and then etching through N+ region 15224, P− region 15226, and partially into bottom N+ region 15228, thus forming N+ drain regions 15234, P− channel regions 15236, and N+ source region 15238. The trench may have slopes from 45 to 160 degrees at vertices 15250, 135 degrees is shown, and may also be accomplished by wet etching techniques. The gate trench 15252 surfaces and edges may be smoothed by processes such as, for example, wet chemical, plasma/RIE etching, low temperature hydrogen plasma, or low temperature oxidation and strip techniques, to mitigate high field and other effects. The hard mask etch stack 15260 may also be thus formed into hard mask etch stack regions 15262.

Figure 152G:
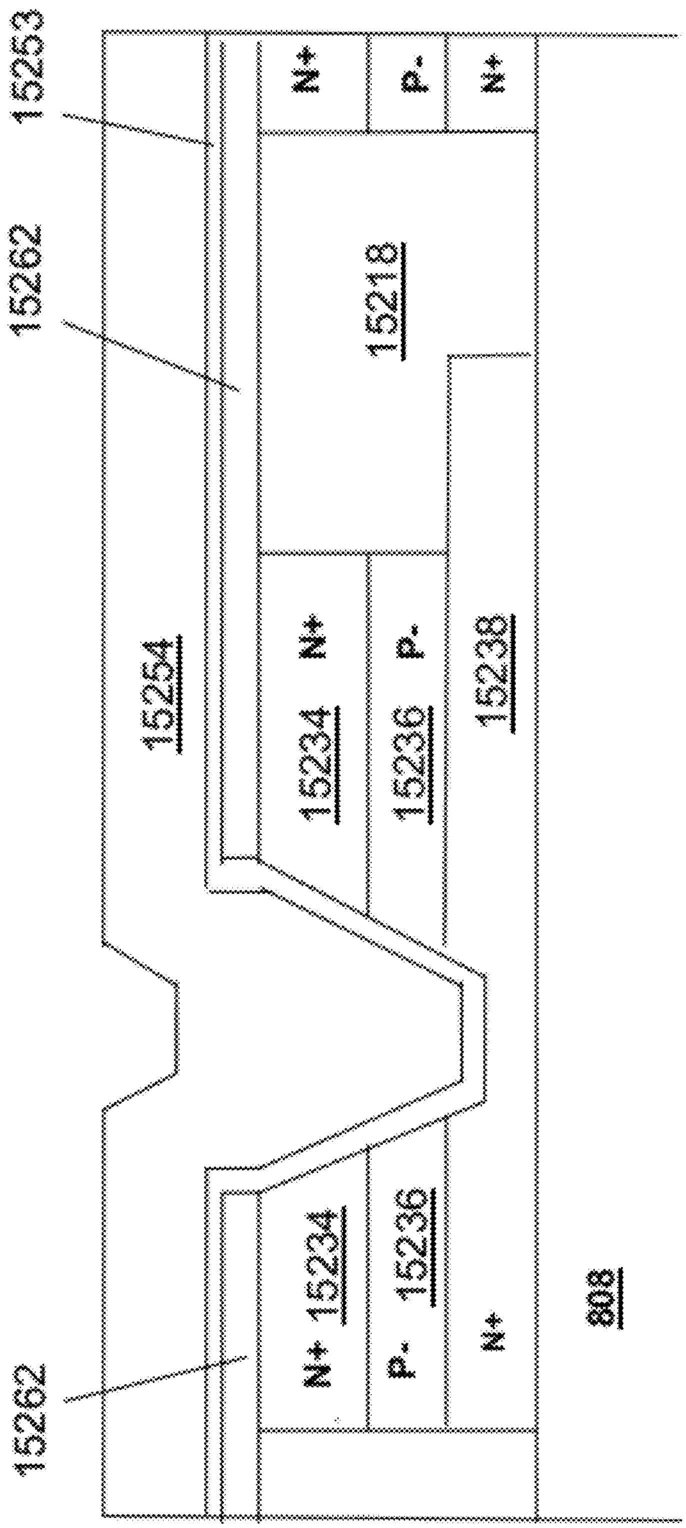

As illustrated in FIG. 152G, a gate dielectric 15253 may be formed and a gate metal material may be deposited. The gate dielectric 15253 may be an atomic layer deposited (ALD) gate dielectric that may be paired with a work function specific gate metal material 15254 in the industry standard high k metal gate process schemes described previously. Or the gate dielectric 15253 may be formed with a low temperature oxide deposition or low temperature microwave plasma oxidation of the silicon surfaces and then a gate metal material 15254, such as, for example, tungsten or aluminum, may be deposited.

Figure 152H:
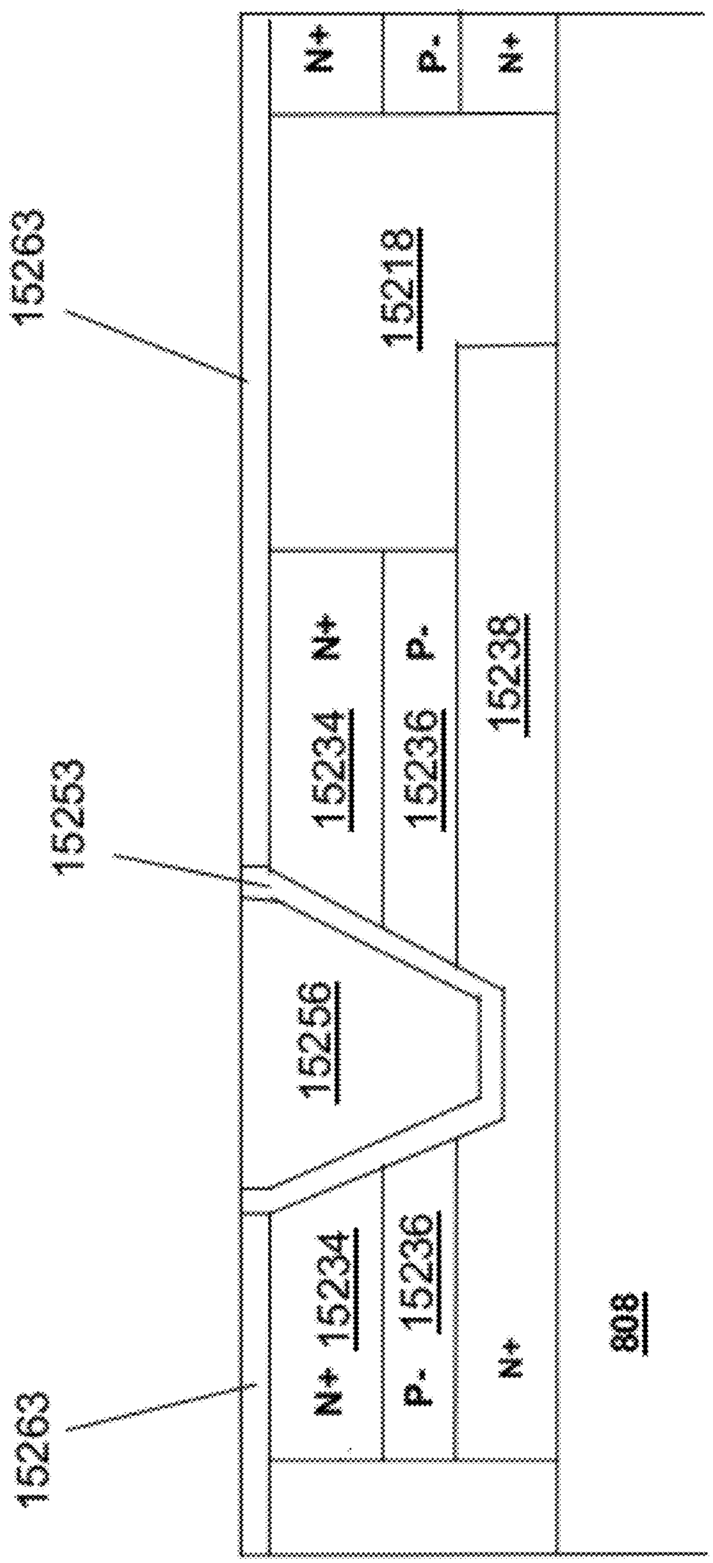

As illustrated in FIG. 152H, the gate metal material 15254 may be chemically mechanically polished, thus forming gate electrode 15256 and thinned polish stop regions or hard mask etch stack regions 15263. The gate electrode 15256 may also be defined by masking and etching.

Figure 152I:
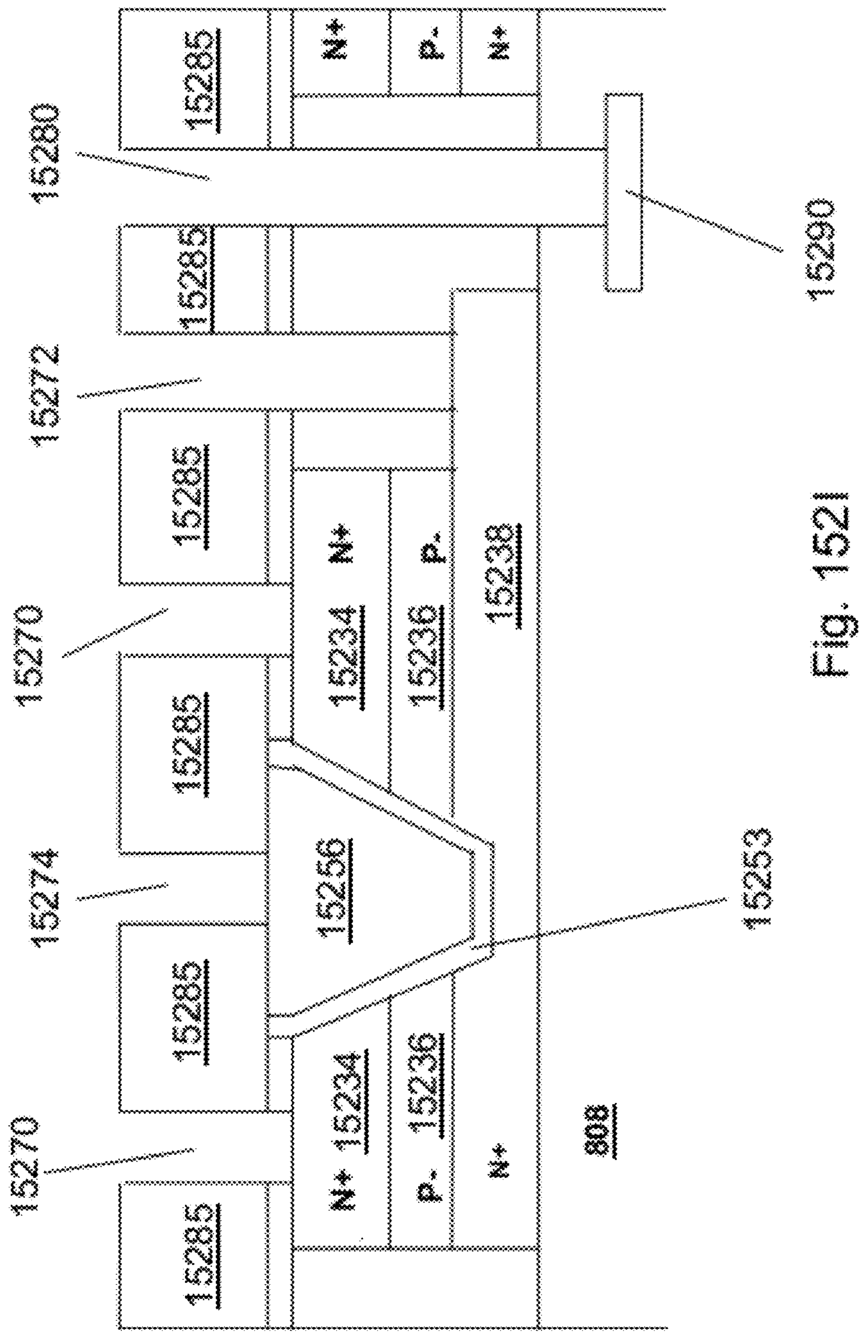

As illustrated in FIG. 152I, a low temperature thick oxide may be deposited and planarized, and source, gate, and drain contacts, and through layer via openings may be masked and etched, thereby preparing the transistors to be connected via metallization, thus forming oxide regions 15285. Thus gate contact 15274 may connect to gate electrode 15256, drain contacts 15270 may connect to N+ drain regions 15234, and source contact 15272 may connect to N+ source region 15238. Thru layer vias 15280 may be formed to electrically connect to the acceptor substrate 808 metal connect strips 15290 as previously described.

Persons of ordinary skill in the art will appreciate that the illustrations in FIGS. 152A through 152I are exemplary only and are not drawn to scale. Such skilled persons will further appreciate that many variations may be possible such as, for example, a p-channel trench MOSFET may be formed with changing the types of dopings appropriately. Moreover, the P− substrate donor wafer 15200 may be n type. Further, P− doped layer 15206 may include multiple layers of different doping concentrations and gradients to fine tune the eventual trench MOSFET channel for electrical performance and reliability characteristics, such as, for example, off-state leakage current and on-state current. Furthermore, P− regions 15226 may be side etched to recess and narrow the eventual P− channel regions 15236 so that gate control may be more effective. The recess may be filled with oxide for improved N+ source region 15238 to N+ drain region 15234 isolation. Many other modifications within the scope of the illustrated embodiments of the invention will suggest themselves to such skilled persons after reading this specification. Thus the invention is to be limited only by the appended claims.

3D memory device structures may also be constructed in layers of mono-crystalline silicon and utilize the pre-processing of a donor wafer by forming wafer sized layers of various materials without a process temperature restriction, then layer transferring the pre-processed donor wafer to the acceptor wafer, followed by some example processing steps, and repeating this procedure multiple times, and then processing with either low temperature (below about 400° C.) or high temperature (greater than about 400° C.) after the final layer transfer to form memory device structures, such as, for example, transistors or memory bit cells, on or in the multiple transferred layers that may be physically aligned and may be electrically coupled to the acceptor wafer. The term memory cells may also describe memory bit cells in this document.

Novel monolithic 3D Dynamic Random Access Memories (DRAMs) may be constructed in the above manner. Some embodiments of this present invention utilize the floating body DRAM type.

Floating-body DRAM may be a next generation DRAM being developed by many companies such as Innovative Silicon, Hynix, and Toshiba. These floating-body DRAMs store data as charge in the floating body of an SOI MOSFET or a multi-gate MOSFET. Further details of a floating body DRAM and its operation modes can be found in U.S. Pat. Nos. 7,541,616, 7,514,748, 7,499,358, 7,499,352, 7,492,632, 7,486,563, 7,477,540, and 7,476,939, besides other literature. A monolithic 3D integrated DRAM can be constructed with floating-body transistors. Prior art for constructing monolithic 3D DRAMs used planar transistors where crystalline silicon layers were formed with either selective epi technology or laser recrystallization. Both selective epi technology and laser recrystallization may not provide perfectly single crystal silicon and often require a high thermal budget. A description of these processes is given in Chapter 13 of the book entitled “Integrated Interconnect Technologies for 3D Nanoelectronic Systems” by Bakir and Meindl.

As illustrated in FIG. 97 the fundamentals of operating a floating body DRAM are described. In order to store a ‘1’ bit, excess holes 9702 may exist in the floating body region 9720 and change the threshold voltage of the memory cell transistor including source 9704, gate 9706, drain 9708, floating body region 9720, and buried oxide (BOX) 9718. This is shown in FIG. 97(*a*). The ‘0’ bit may correspond to no charge being stored in the floating body region 9720 and may affect the threshold voltage of the memory cell transistor including source 9710, gate 9712, drain 9714, floating body region 9720, and buried oxide (BOX) 9716. This is shown in FIG. 97(*b*). The difference in threshold voltage between the memory cell transistor depicted in FIG. 97(*a*) and FIG. 97(*b*) manifests itself as a change in the drain current 9734 of the transistor at a particular gate voltage 9736. This is described in FIG. 97(*c*). This current differential 9730 may be sensed by a sense amplifier circuit to differentiate between ‘0’ and ‘1’ states and thus function as a memory bit.

As illustrated in FIGS. 98A to 98H, a horizontally-oriented monolithic 3D DRAM that may utilize two masking steps per memory layer may be constructed that is suitable for 3D IC manufacturing.

Figure 98A:
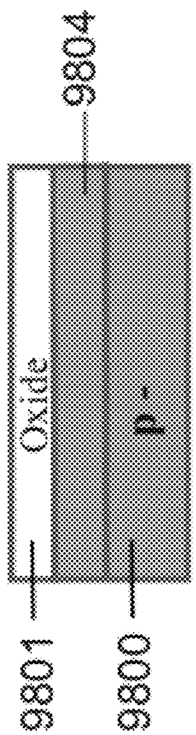

As illustrated in FIG. 98A, a P− substrate donor wafer 9800 may be processed to include a wafer sized layer of P− doping 9804. The P− layer 9804 may have the same or a different dopant concentration than the P− substrate 9800. The P− layer 9804 may be formed by ion implantation and thermal anneal. A screen oxide 9801 may be grown or deposited before the implant to protect the silicon from implant contamination and to provide an oxide surface for later wafer to wafer bonding.

Figure 98B:
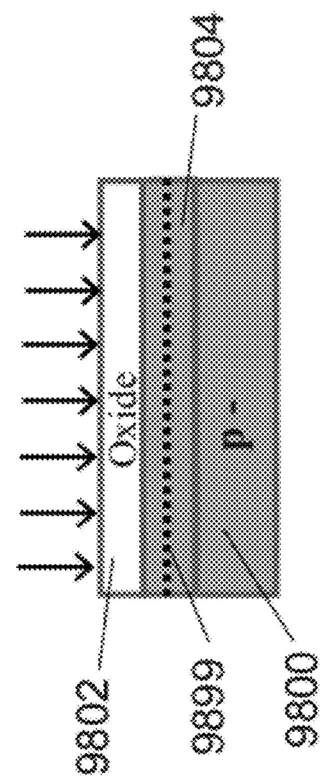

As illustrated in FIG. 98B, the top surface of donor wafer 9800 may be prepared for oxide to oxide wafer bonding with a deposition of an oxide layer 9802 or by thermal oxidation of the P− layer 9804 to form oxide layer 9802, or a re-oxidation of implant screen oxide 9801. A layer transfer demarcation plane 9899 (shown as a dashed line) may be formed in donor wafer 9800 or P− layer 9804 (shown) by hydrogen implantation 9807 or other methods as described herein. Both the donor wafer 9800 and acceptor wafer 9810 (or substrates) may be prepared for wafer bonding as previously described and then bonded, for example, at a low temperature (less than about 400° C.) to minimize stresses. The portion of the P− layer 9804 and the P− donor wafer substrate 9800 that may be above the layer transfer demarcation plane 9899 may be removed by cleaving and polishing, or other processes as previously described, such as ion-cut or other methods.

Figure 98C:
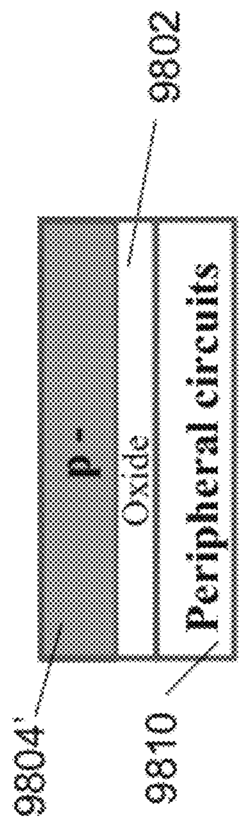

As illustrated in FIG. 98C, the remaining P− doped layer 9804', and oxide layer 9802 may have been layer transferred to acceptor wafer 9810. Acceptor wafer 9810 may include peripheral circuits such that they can withstand an additional rapid-thermal-anneal (RTA) or flash anneal and still remain operational and retain good performance. For this purpose, the peripheral circuits may be formed such that they may have not had an RTA for activating dopants or have had a weak RTA. Also, the peripheral circuits may utilize a refractory metal such as tungsten that can withstand high temperatures greater than about 400° C. The top surface of P− doped layer 9804' may be chemically or mechanically polished smooth and flat. Now transistors may be formed and aligned to the acceptor wafer 9810 alignment marks (not shown).

Figure 98D:
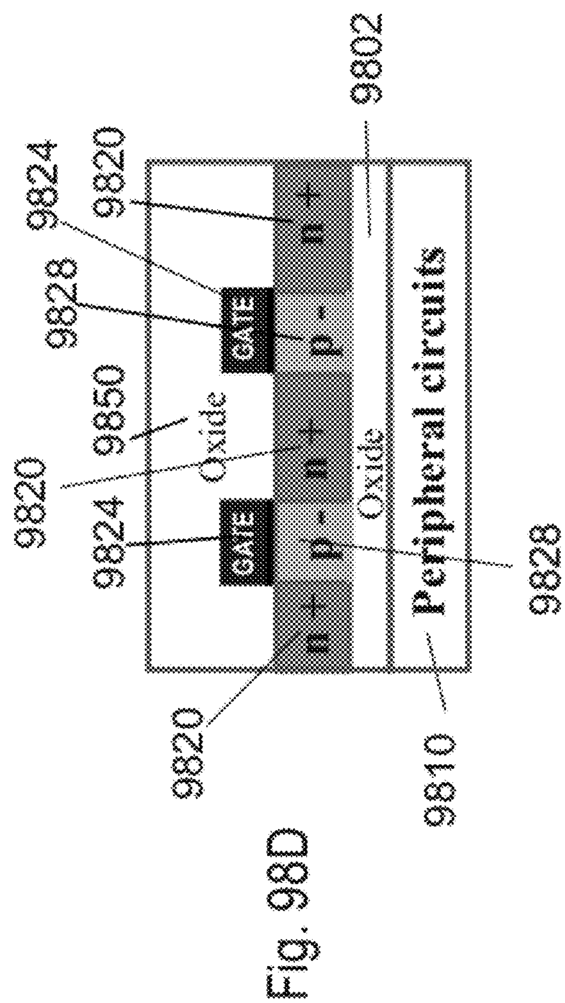

As illustrated in FIG. 98D shallow trench isolation (STI) oxide regions (not shown) may be lithographically defined and plasma/RIE etched to at least the top level of oxide layer 9802 removing regions of mono-crystalline silicon P− doped layer 9804'. A gap-fill oxide may be deposited and CMP'ed flat to form conventional STI oxide regions and P− doped mono-crystalline silicon regions (not shown) for forming the transistors. Threshold adjust implants may or may not be performed at this time. A gate stack 9824 may be formed with a gate dielectric, such as thermal oxide, and a gate metal material, such as polycrystalline silicon. Alternatively, the gate oxide may be an atomic layer deposited (ALD) gate dielectric that may be paired with a work function specific gate metal according to industry standard high k metal gate process schemes described previously. Or the gate oxide may be formed with a rapid thermal oxidation (RTO), a low temperature oxide deposition or low temperature microwave plasma oxidation of the silicon surfaces and then a gate material such as tungsten or aluminum may be deposited. Gate stack self-aligned LDD (Lightly Doped Drain) and halo punch-thru implants may be performed at this time to adjust junction and transistor breakdown characteristics. A conventional spacer deposition of oxide and/or nitride and a subsequent etchback may be done to form implant offset spacers (not shown) on the gate stacks 9824. Then a self-aligned N+ source and drain implant may be performed to create transistor source and drains 9820 and remaining P− silicon NMOS transistor channels 9828. High temperature anneal steps may or may not be done at this time to activate the implants and set initial junction depths. Finally, the entire structure may be covered with a gap fill oxide 9850, which may be planarized with chemical mechanical polishing. The oxide surface may be prepared for oxide to oxide wafer bonding as previously described.

Figure 98E:
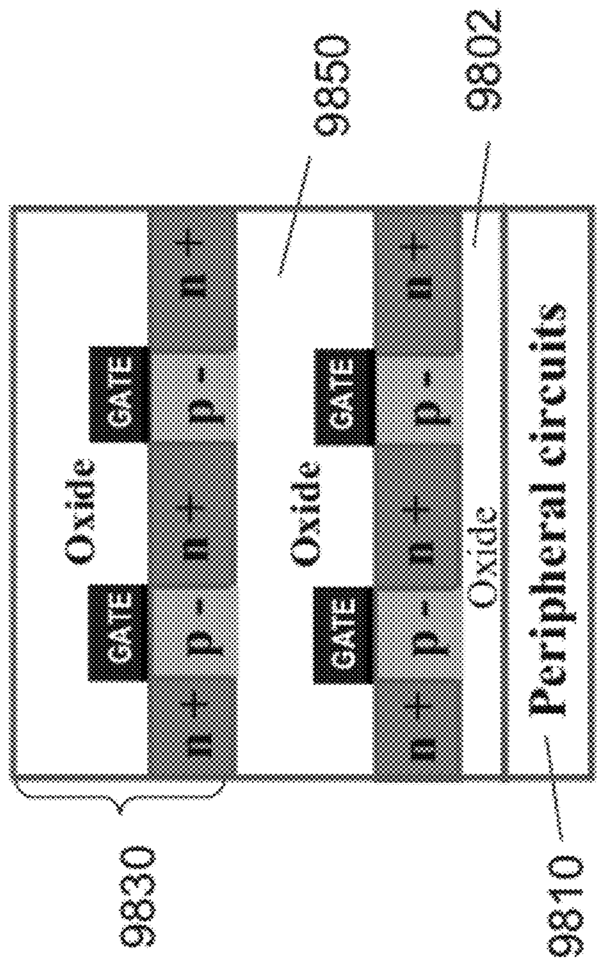

As illustrated in FIG. 98E, the transistor layer formation, bonding to acceptor wafer 9810 oxide 9850, and subsequent transistor formation as described in FIGS. 98A to 98D may be repeated to form the second tier 9830 of memory transistors. After all the memory layers are constructed, a rapid thermal anneal (RTA) or flash anneal may be conducted to activate the dopants in all of the memory layers and in the acceptor wafer 9810 peripheral circuits. Alternatively, optical anneals, such as, for example, a laser based anneal, may be performed.

Figure 98F:
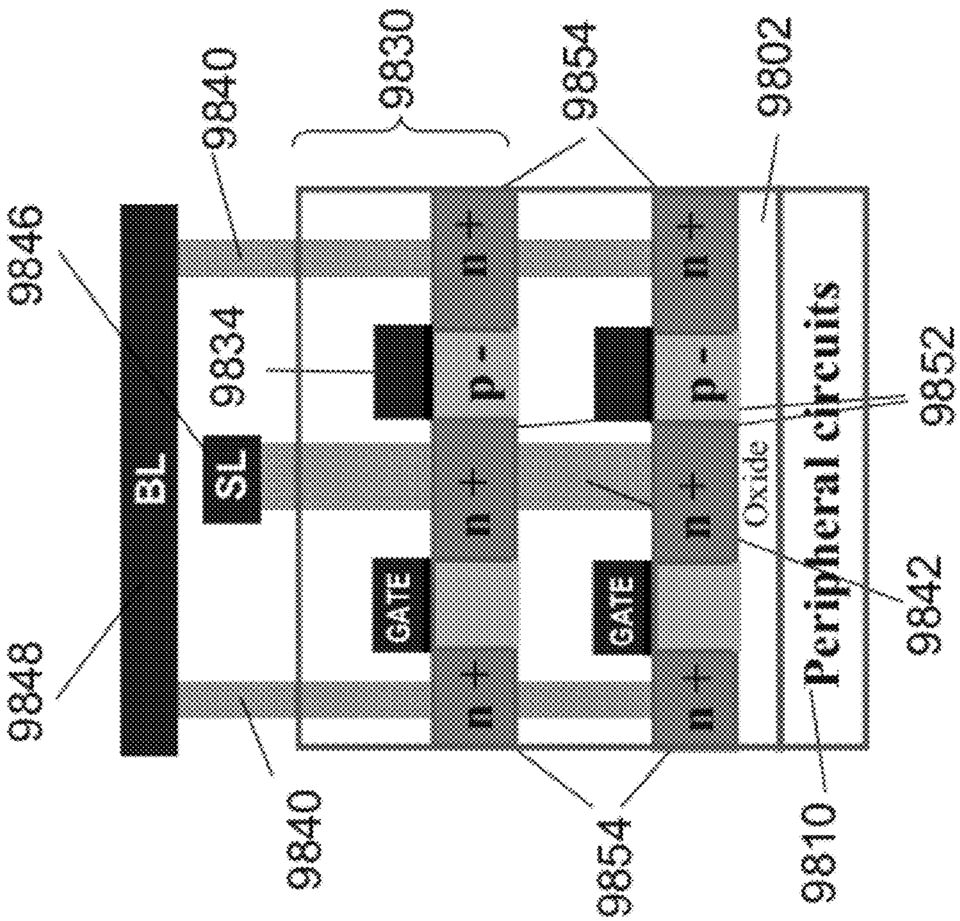

As illustrated in FIG. 98F, contacts and metal interconnects may be formed by lithography and plasma/RIE etch. Bit line (BL) contacts 9840 may electrically couple the memory layers' transistor N+ regions on the transistor drain side 9854, and the source line contact 9842 may electrically couple the memory layers' transistor N+ regions on the transistors source side 9852. The bit-line (BL) wiring 9848 and source-line (SL) wiring 9846 may electrically couple the bit-line contacts 9840 and source-line contacts 9842 respectively. The gate stacks, such as 9834, may be connected with a contact and metallization (not shown) to form the word-lines (WLs). A through layer via (not shown) may be formed to electrically couple the BL, SL, and WL metallization to the acceptor wafer 9810 peripheral circuitry via an acceptor wafer metal connect pad (not shown).

Figure 98H:
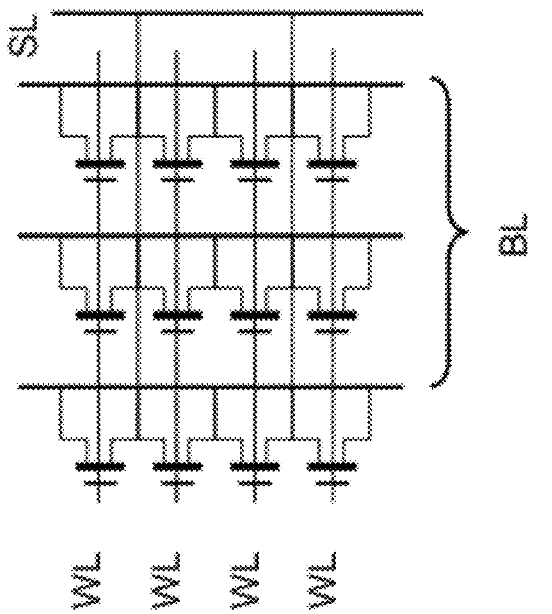
Figure 98G:
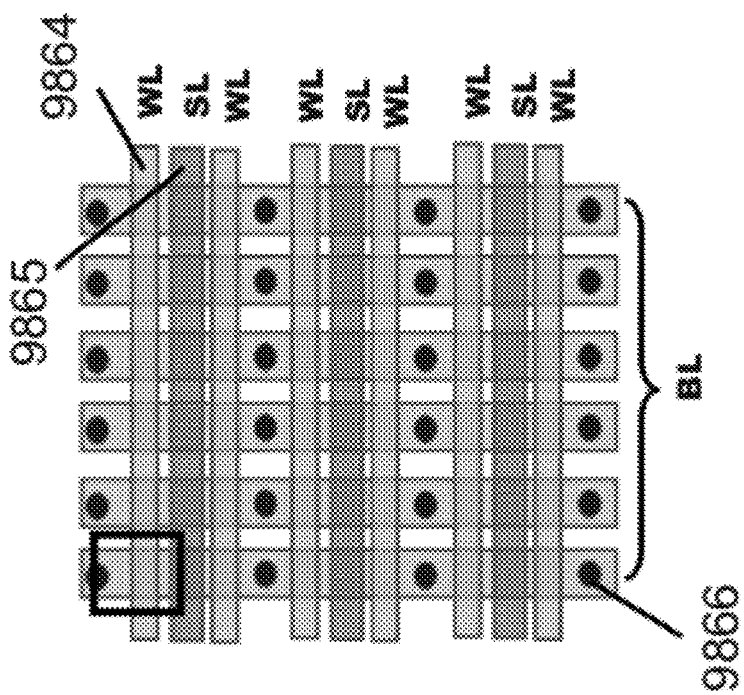

As illustrated in FIG. 98G, a top-view layout of a section of the top of the memory array is shown where WL wiring 9864 and SL wiring 9865 may be perpendicular to the BL wiring 9866.

As illustrated in FIG. 98H, a schematic of each single layer of the DRAM array shows the connections for WLs, BLs and SLs at the array level. The multiple layers of the array may share BL and SL contacts, but each layer may have its own unique set of WL connections to allow each bit to be accessed independently of the others.

This flow may enable the formation of a horizontally-oriented monolithic 3D DRAM array that may utilize two masking steps per memory layer and may be constructed by layer transfers of wafer sized doped mono-crystalline silicon layers and this 3D DRAM array may be connected to an underlying multi-metal layer semiconductor device, which may or may not contain the peripheral circuits, used to control the DRAM's read and write functions.

Persons of ordinary skill in the art will appreciate that the illustrations in FIGS. 98A through 98H are exemplary only and are not drawn to scale. Such skilled persons will further appreciate that many variations may be possible such as, for example, the transistors may be of another type such as RCATs, or junction-less. Or the contacts may utilize doped poly-crystalline silicon, or other conductive materials. Or the stacked memory layer may be connected to a periphery circuit that is above the memory stack. Many other modifications within the scope of the illustrated embodiments of the invention will suggest themselves to such skilled persons after reading this specification. Thus the invention is to be limited only by the appended claims.

As illustrated in FIGS. 99A to 99M, a horizontally-oriented monolithic 3D DRAM that may utilize one masking step per memory layer may be constructed that is suitable for 3D IC.

Figure 99A:
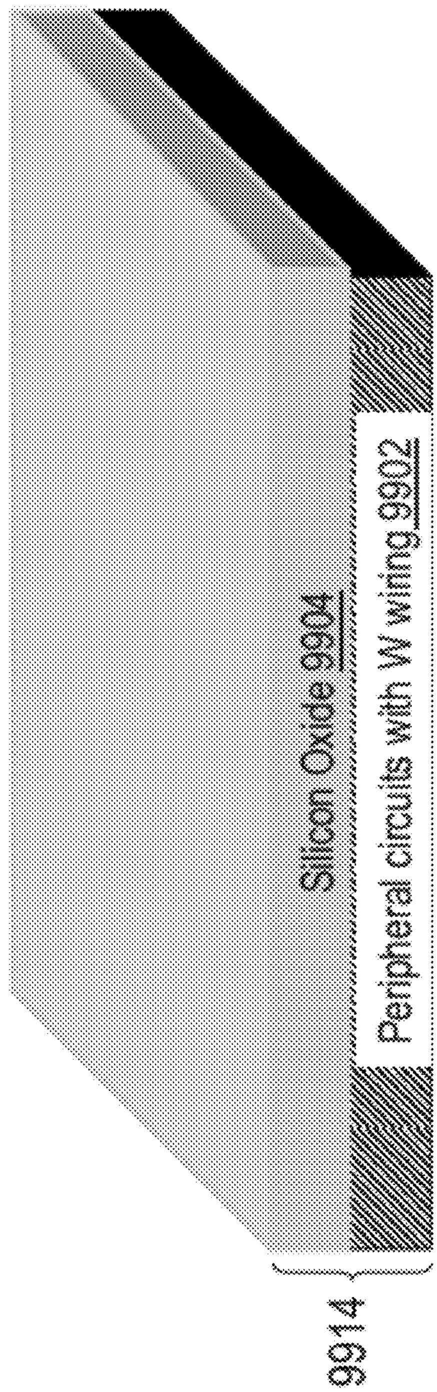

As illustrated in FIG. 99A, a silicon substrate with peripheral circuitry 9902 may be constructed with high temperature (greater than about 400° C.) resistant wiring, such as Tungsten. The peripheral circuitry substrate 9902 may comprise memory control circuits as well as circuitry for other purposes and of various types, such as analog, digital, radio-frequency (RF), or memory. The peripheral circuitry substrate 9902 may comprise peripheral circuits that can withstand an additional rapid-thermal-anneal (RTA) or flash anneal and still remain operational and retain good performance. For this purpose, the peripheral circuits may be formed such that they have been subject to a weak RTA or no RTA for activating dopants. The top surface of the peripheral circuitry substrate 9902 may be prepared for oxide wafer bonding with a deposition of a silicon oxide layer 9904, thus forming acceptor wafer 9914.

Figure 99B:
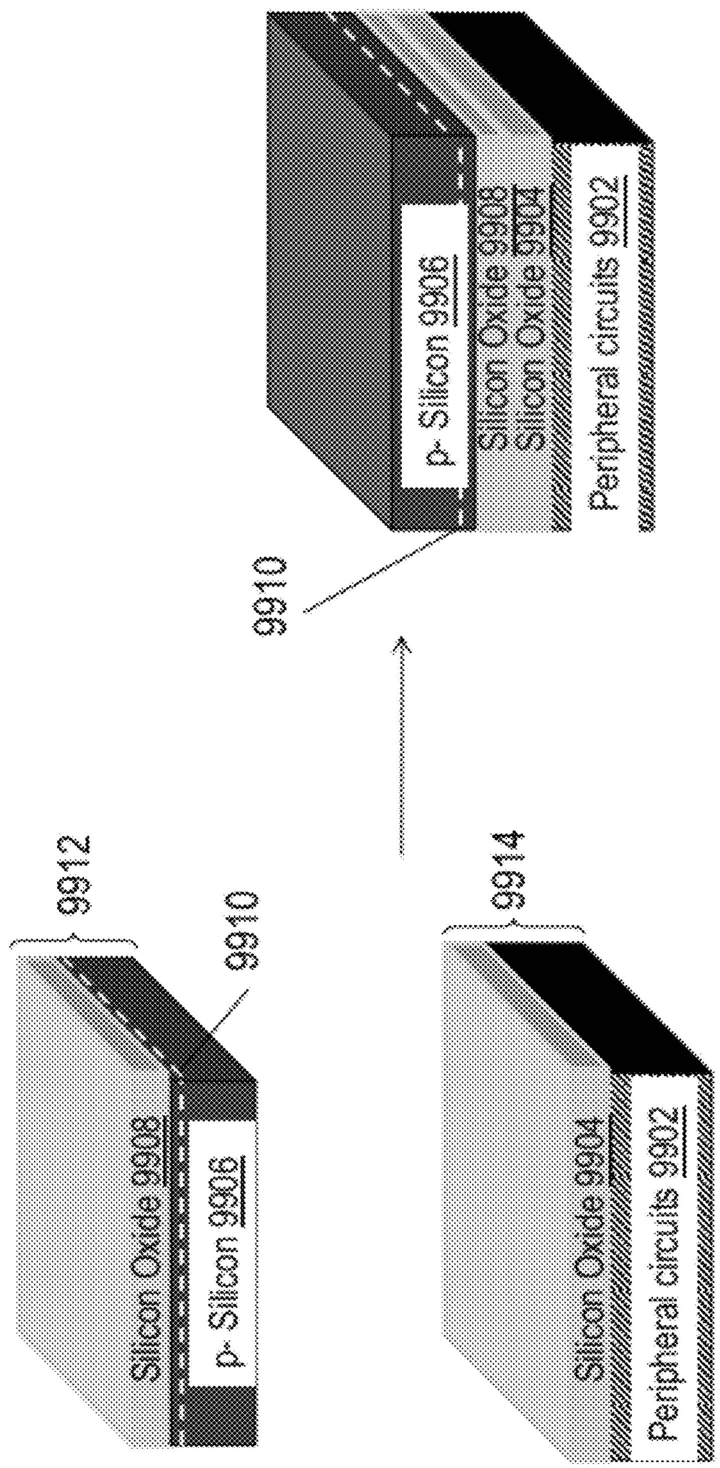

As illustrated in FIG. 99B, a mono-crystalline silicon donor wafer 9912 may be processed to include a wafer sized layer of P− doping (not shown) which may have a different dopant concentration than the P− substrate 9906. The P− doping layer may be formed by ion implantation and thermal anneal. A screen oxide layer 9908 may be grown or deposited prior to the implant to protect the silicon from implant contamination and to provide an oxide surface for later wafer to wafer bonding. A layer transfer demarcation plane 9910 (shown as a dashed line) may be formed in donor wafer 9912 within the P− substrate 9906 or the P− doping layer (not shown) by hydrogen implantation or other methods as previously described. Both the donor wafer 9912 and acceptor wafer 9914 may be prepared for wafer bonding as previously described and then bonded at the surfaces of oxide layer 9904 and oxide layer 9908, at a low temperature (less than about 400° C.) suitable for lowest stresses, or a moderate temperature (less than about 900° C.).

Figure 99C:
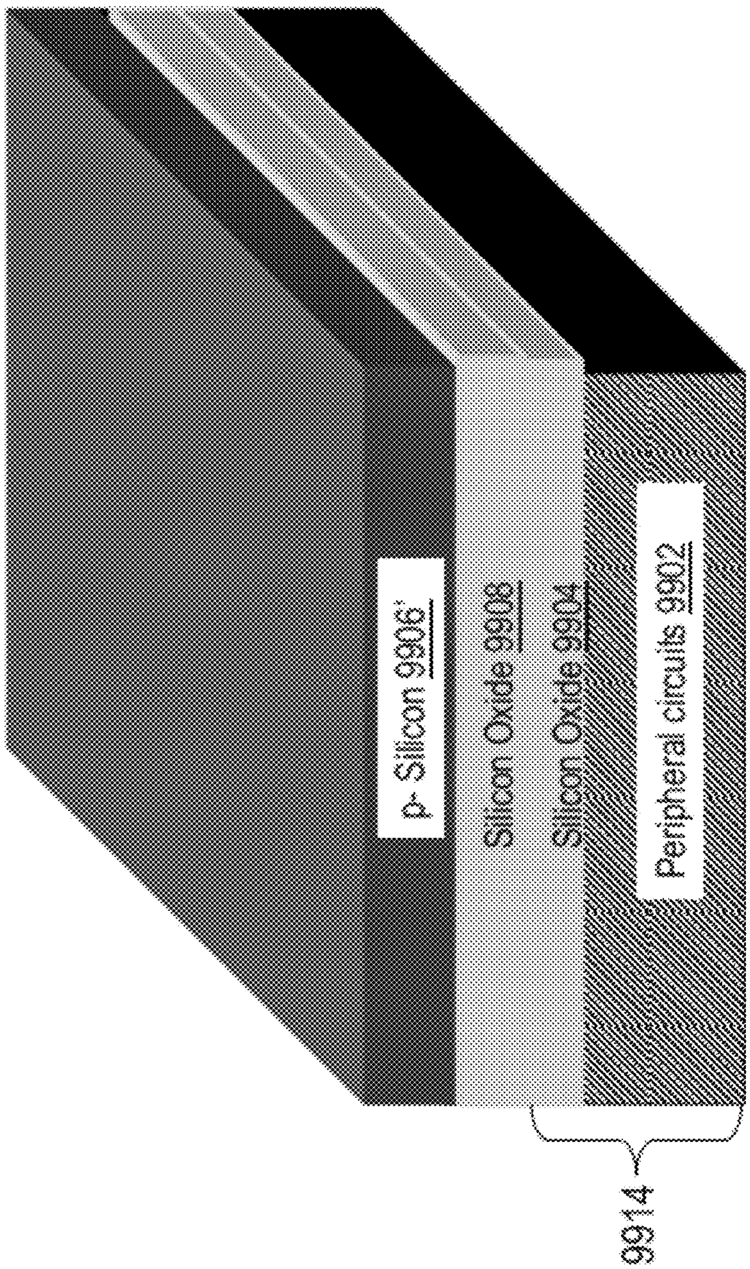

As illustrated in FIG. 99C, the portion of the P− layer (not shown) and the P-substrate 9906 that are above the layer transfer demarcation plane 9910 may be removed by cleaving and polishing, or other processes as previously described, such as, for example, ion-cut or other methods, thus forming the remaining mono-crystalline silicon P− layer 9906'. Remaining P− layer 9906' and oxide layer 9908 may have been layer transferred to acceptor wafer 9914. The top surface of P− layer 9906' may be chemically or mechanically polished smooth and flat. Now transistors or portions of transistors may be formed and aligned to the acceptor wafer 9914 alignment marks (not shown).

Figure 99D:
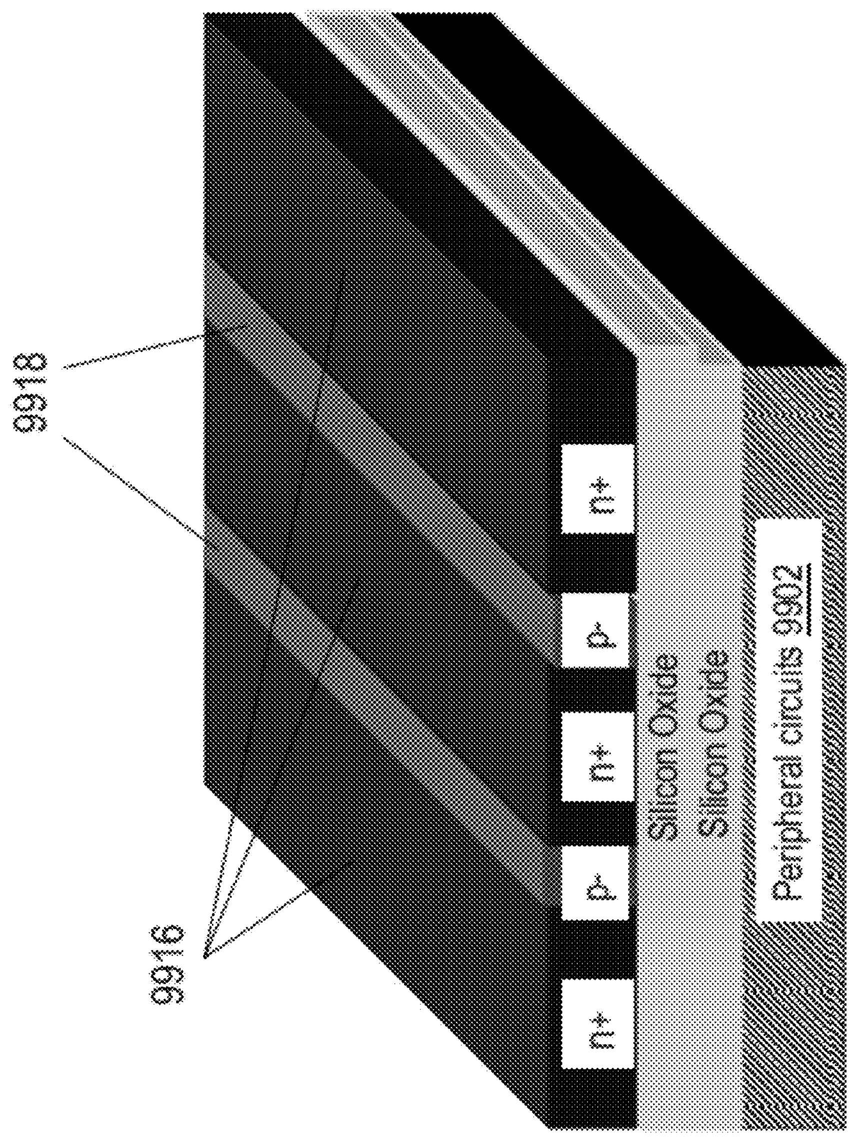

As illustrated in FIG. 99D, N+ silicon regions 9916 may be lithographically defined and N type species, such as Arsenic, may be ion implanted into P− silicon layer 9906'. Thus P-silicon layer 9906' may also form remaining P− silicon regions 9918.

Figure 99E:
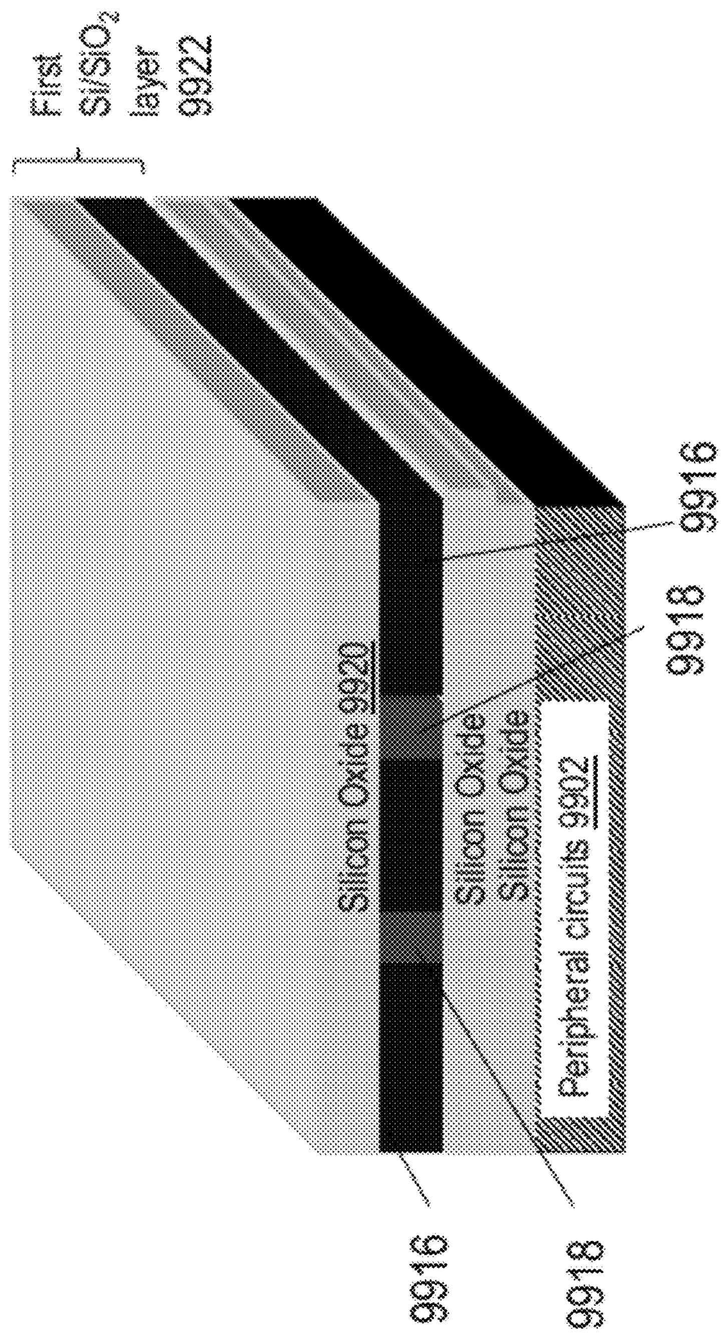

As illustrated in FIG. 99E, oxide layer 9920 may be deposited to prepare the surface for later oxide to oxide bonding, leading to the formation of the first Si/SiO2 layer 9922 which may include silicon oxide layer 9920, N+ silicon regions 9916, and P-silicon regions 9918.

Figure 99F:
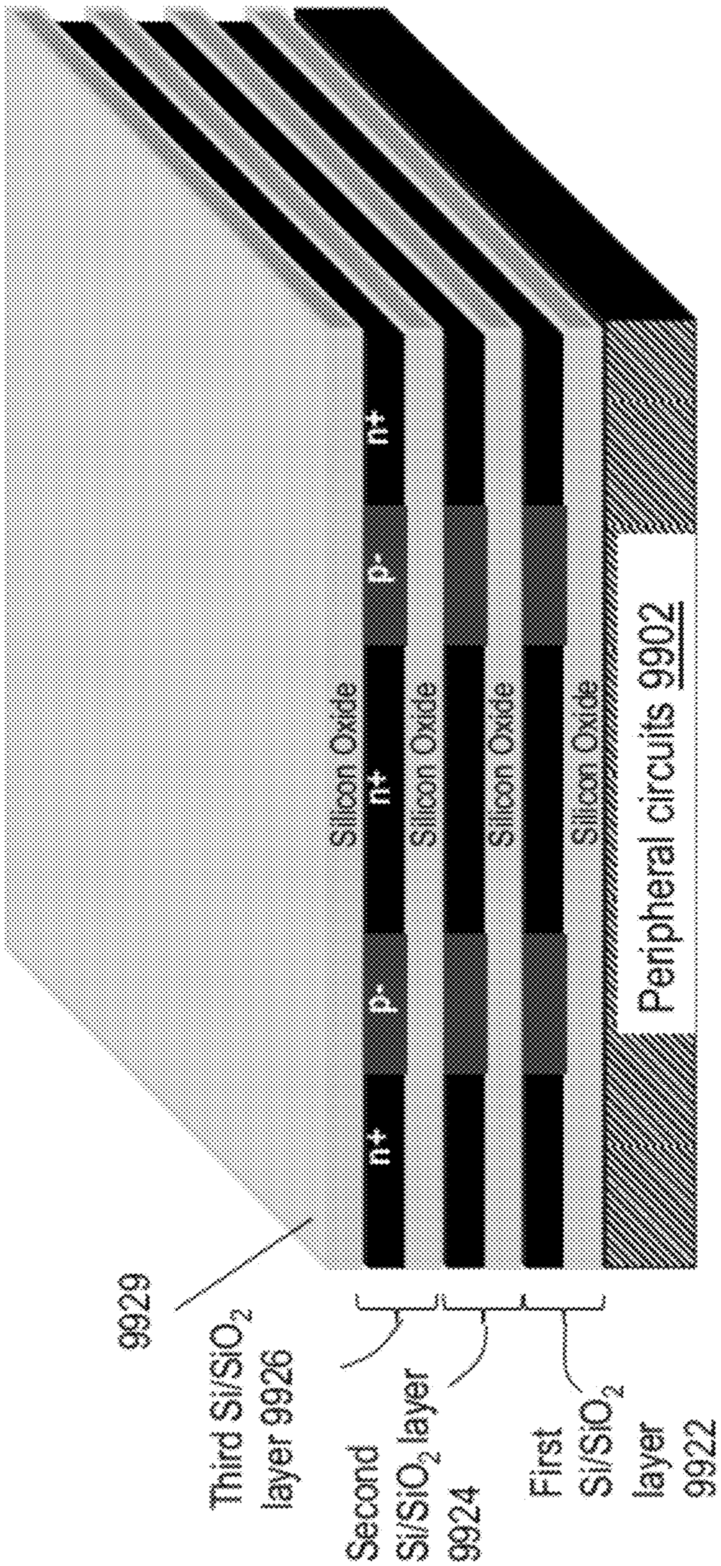

As illustrated in FIG. 99F, additional Si/SiO2 layers, such as second Si/SiO2 layer 9924 and third Si/SiO2 layer 9926, may each be formed as described in FIGS. 99A to 99E. Oxide layer 9929 may be deposited. After all the memory layers are constructed, a rapid thermal anneal (RTA) or flash anneal may be conducted to activate the dopants in substantially all of the memory layers 9922, 9924, 9926 and in the peripheral circuit substrate 9902. Alternatively, optical anneals, such as, for example, a laser based anneal, may be performed.

Figure 99G:
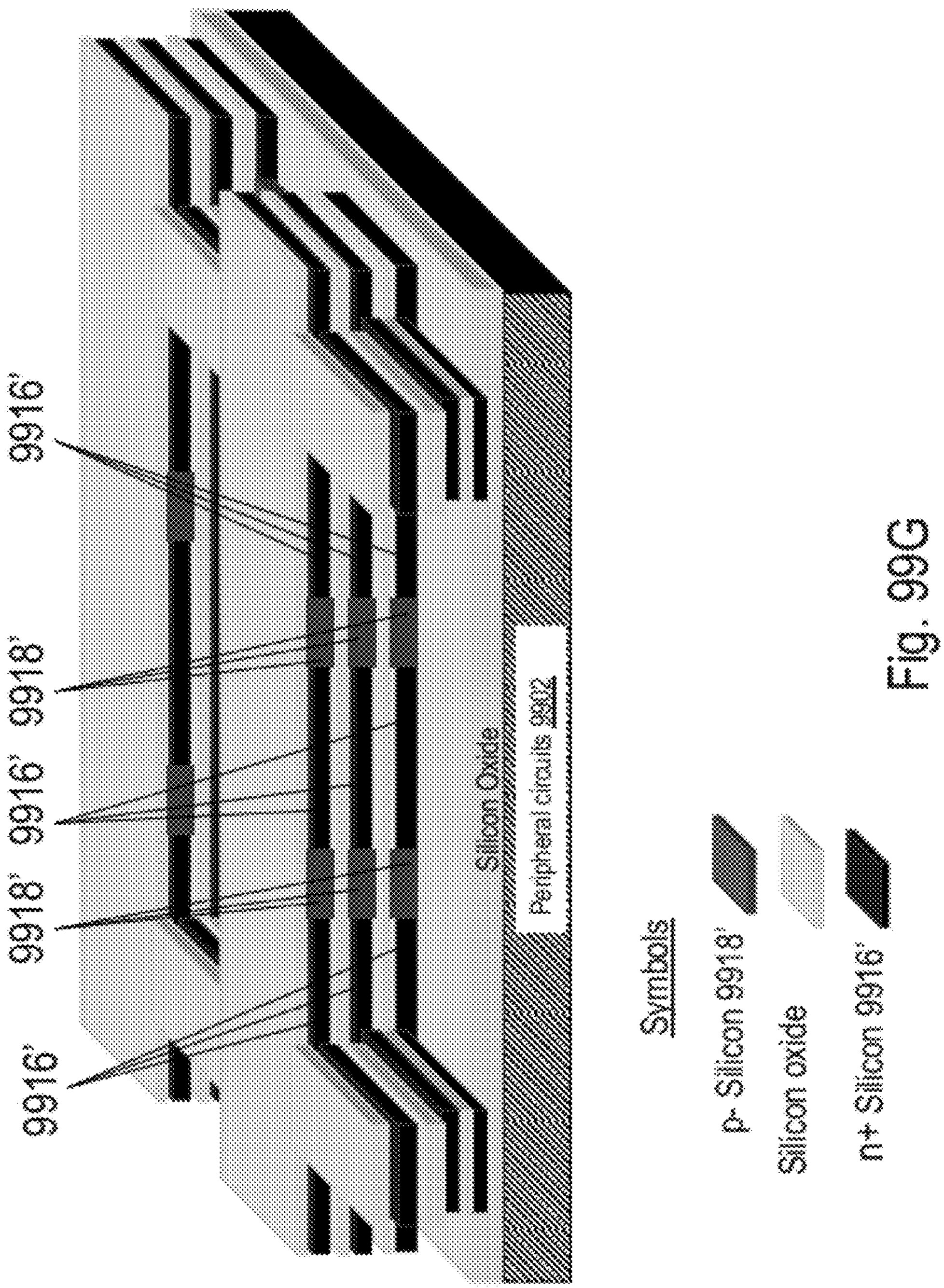

As illustrated in FIG. 99G, oxide layer 9929, third Si/SiO2 layer 9926, second Si/SiO2 layer 9924 and first Si/SiO2 layer 9922 may be lithographically defined and plasma/RIE etched to form a portion of the memory cell structure. The etching may form P− silicon regions 9918', which may form the floating body transistor channels, and N+ silicon regions 9916', which may form the source, drain and local source lines. Thus, these transistor elements or portions may have been defined by a common lithography step, which also may be described as a single lithography step, same lithography step, or one lithography step.

Figure 99H:
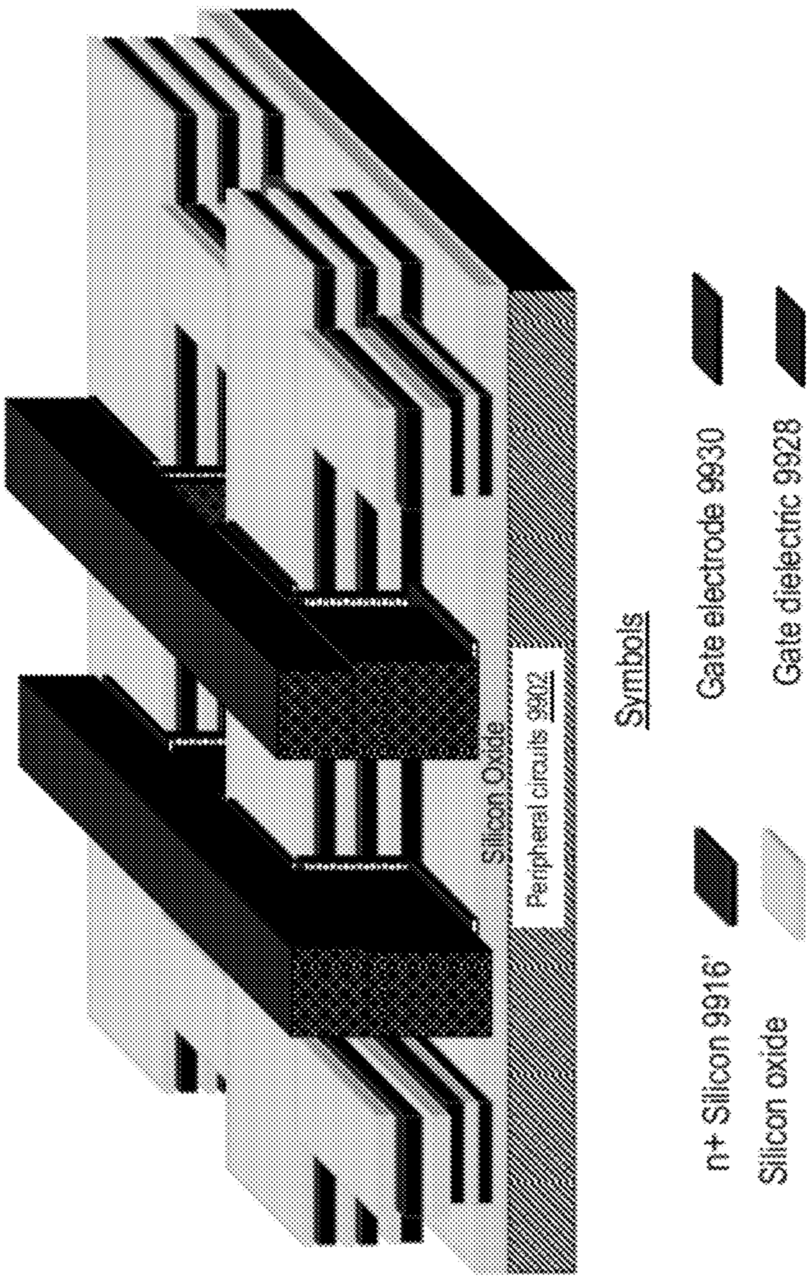

As illustrated in FIG. 99H, a gate dielectric and gate electrode material may be deposited, planarized with a chemical mechanical polish (CMP), and then lithographically defined and plasma/RIE etched to form gate dielectric 9928 regions which may be self-aligned to and covered by gate electrodes 9930 (shown), or may substantially cover the entire silicon/oxide multi-layer structure. The gate electrode 9930 and gate dielectric 9928 stack may be sized and aligned such that P− silicon regions 9918' may be substantially completely covered. The gate stack including gate electrode 9930 and gate dielectric 9928 may be formed with a gate dielectric, such as thermal oxide, and a gate electrode material, such as polycrystalline silicon. Alternatively, the gate dielectric may be an atomic layer deposited (ALD) material that may be paired with a work function specific gate metal according to industry standard high k metal gate process schemes described previously. Further the gate dielectric may be formed with a rapid thermal oxidation (RTO), a low temperature oxide deposition or low temperature microwave plasma oxidation of the silicon surfaces and then a gate electrode such as tungsten or aluminum may be deposited.

Figure 99I:
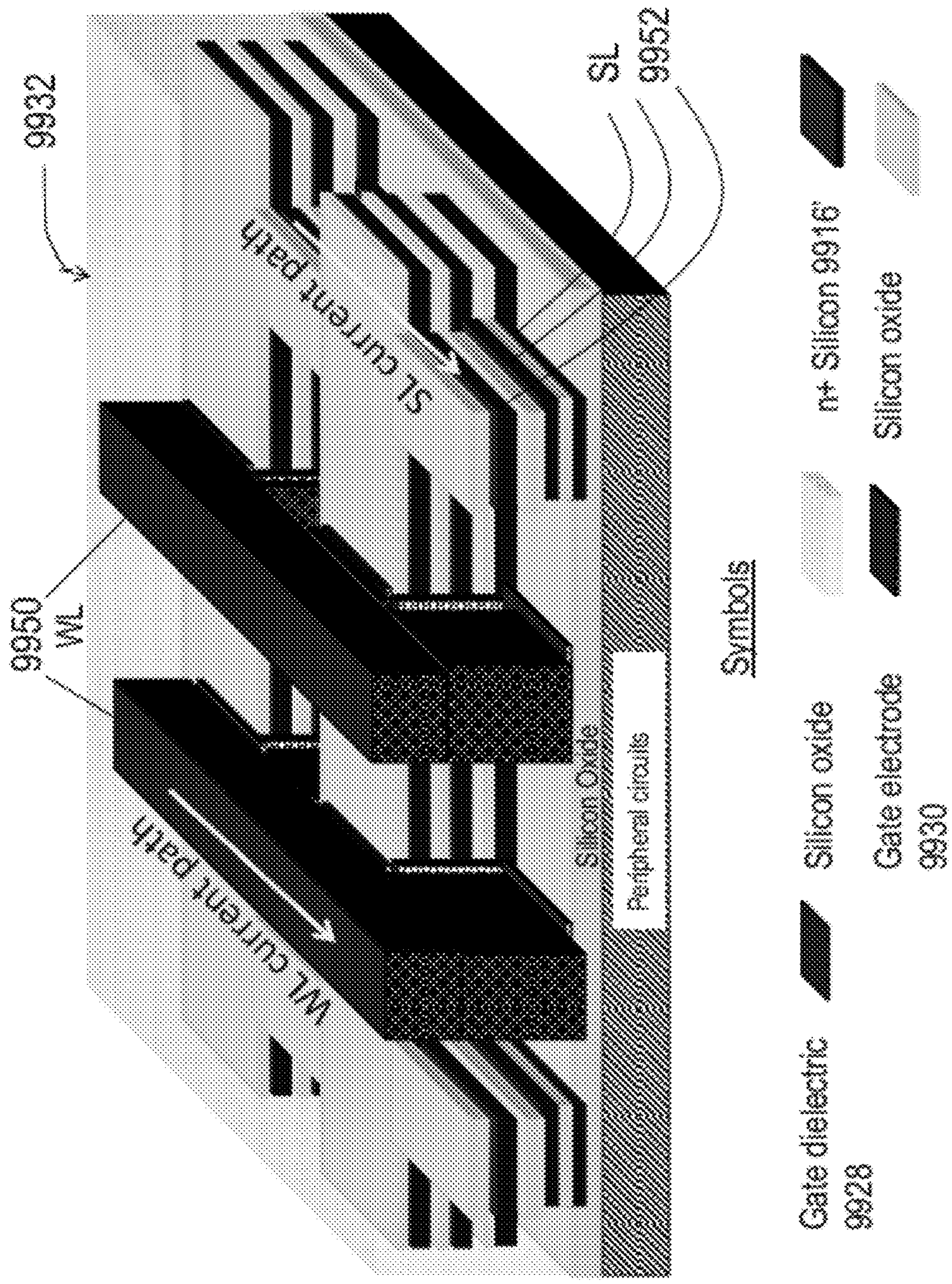

As illustrated in FIG. 99I, substantially the entire structure may be covered with a gap fill oxide 9932, which may be planarized with chemical mechanical polishing. The oxide 9932 is shown transparent in the figure for clarity in illustration. Also shown are word-line regions (WL) 9950, coupled with and composed of gate electrodes 9930, and source-line regions (SL) 9952, composed of indicated N+ silicon regions 9916'.

Figure 99J:
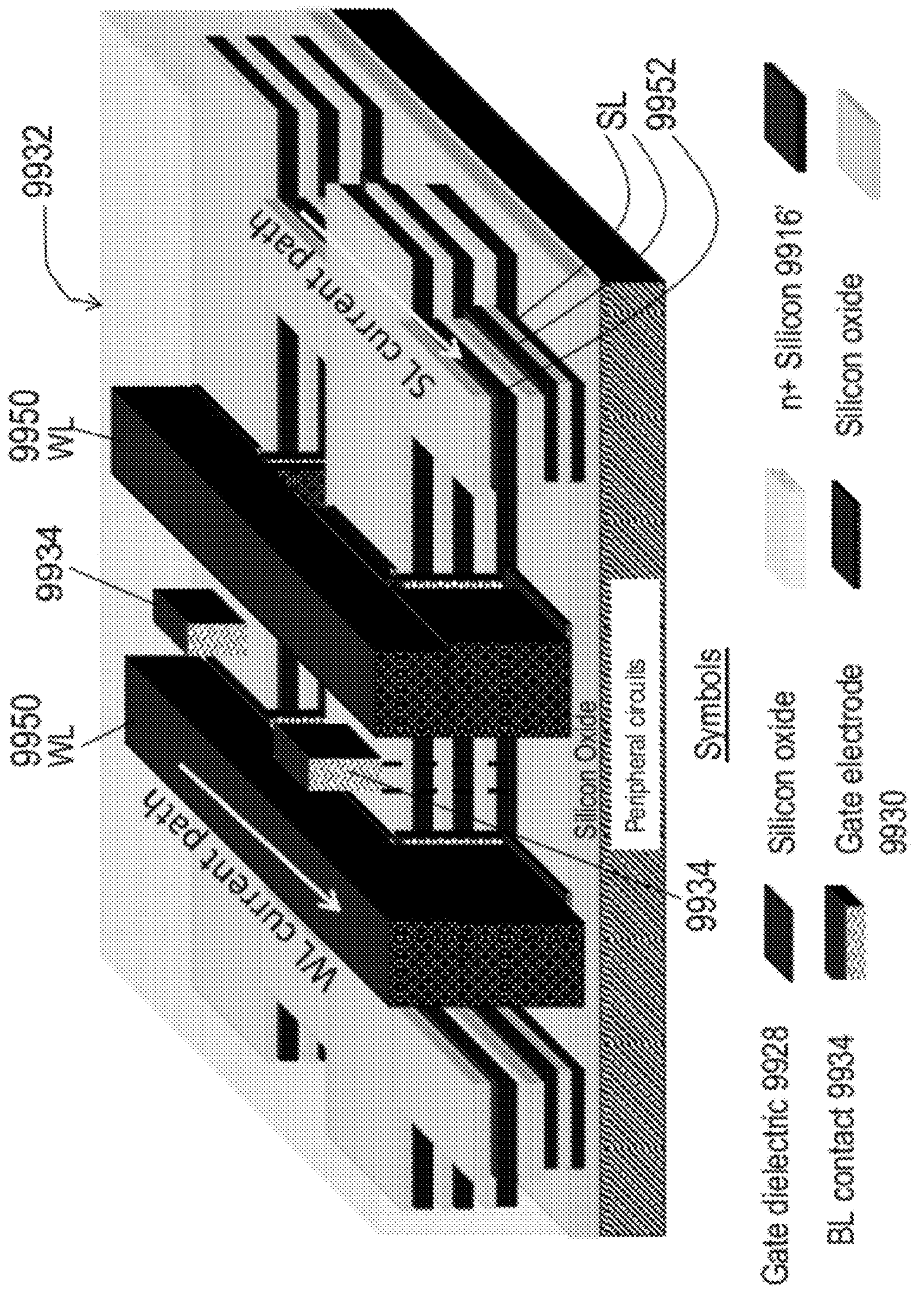

As illustrated in FIG. 99J, bit-line (BL) contacts 9934 may be lithographically defined, etched along with plasma/RIE, and processed by a photoresist removal. Afterwards, metal, such as copper, aluminum, or tungsten, may be deposited to fill the contact and subsequently etched or polished to about the top of oxide 9932. Each BL contact 9934 may be shared among substantially all layers of memory, shown as three layers of memory in FIG. 99J. A through layer via (not shown) may be formed to electrically couple the BL, SL, and WL metallization to the acceptor wafer 9914 peripheral circuitry via an acceptor wafer metal connect pad (not shown).

Figure 99K:
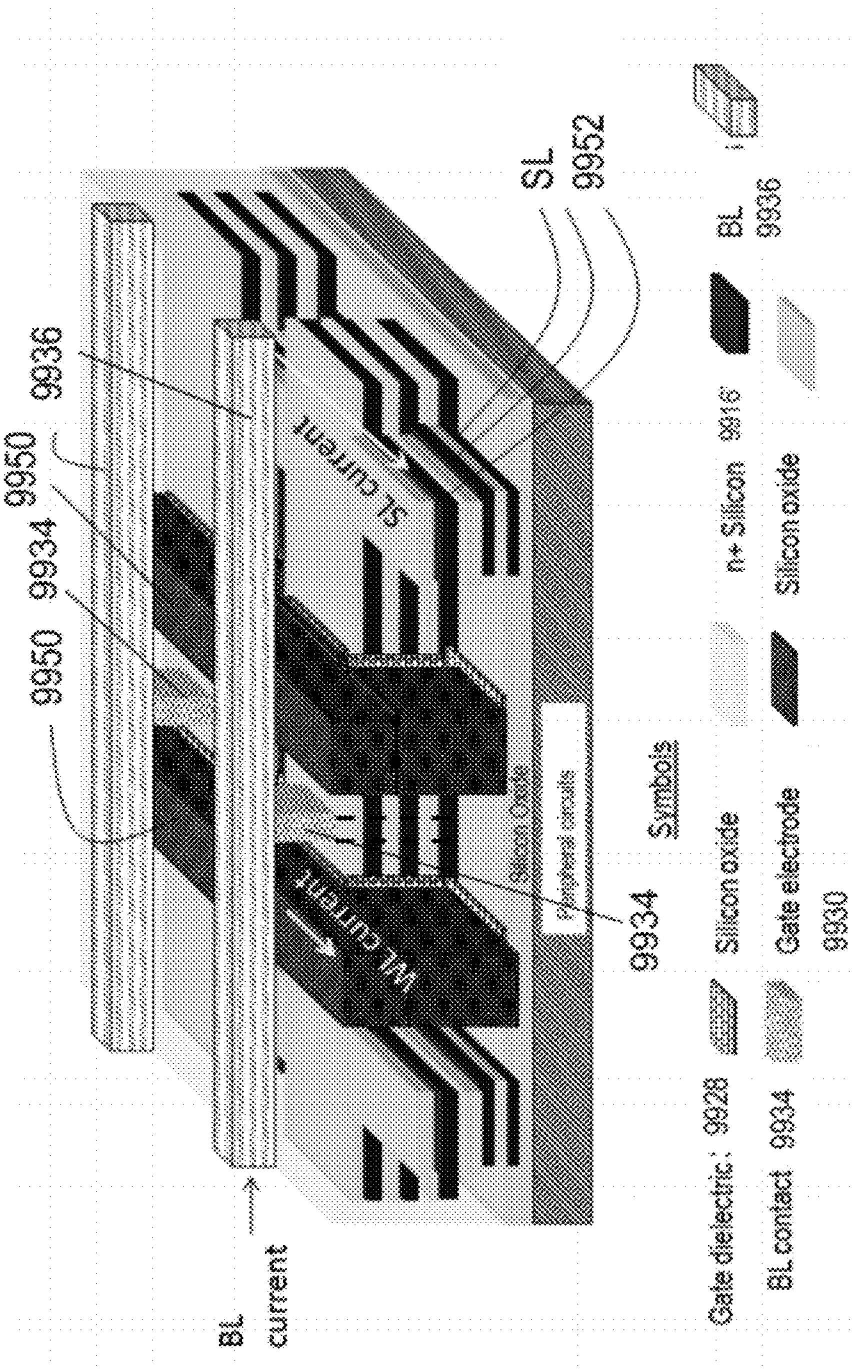

As illustrated in FIG. 99K, BL metal lines 9936 may be formed and connected to the associated BL contacts 9934. Contacts and associated metal interconnect lines (not shown) may be formed for the WL and SL at the memory array edges. SL contacts can be made into stair-like structures using techniques described in "Bit Cost Scalable Technology with Punch and Plug Process for Ultra High Density Flash Memory," 2007 *IEEE Symposium on VLSI Technology*, pp. 14-15, 12-14 Jun. 2007 by Tanaka, H.; Kido, M.; Yahashi, K.; Oomura, M.; et al.

Figure 99L:
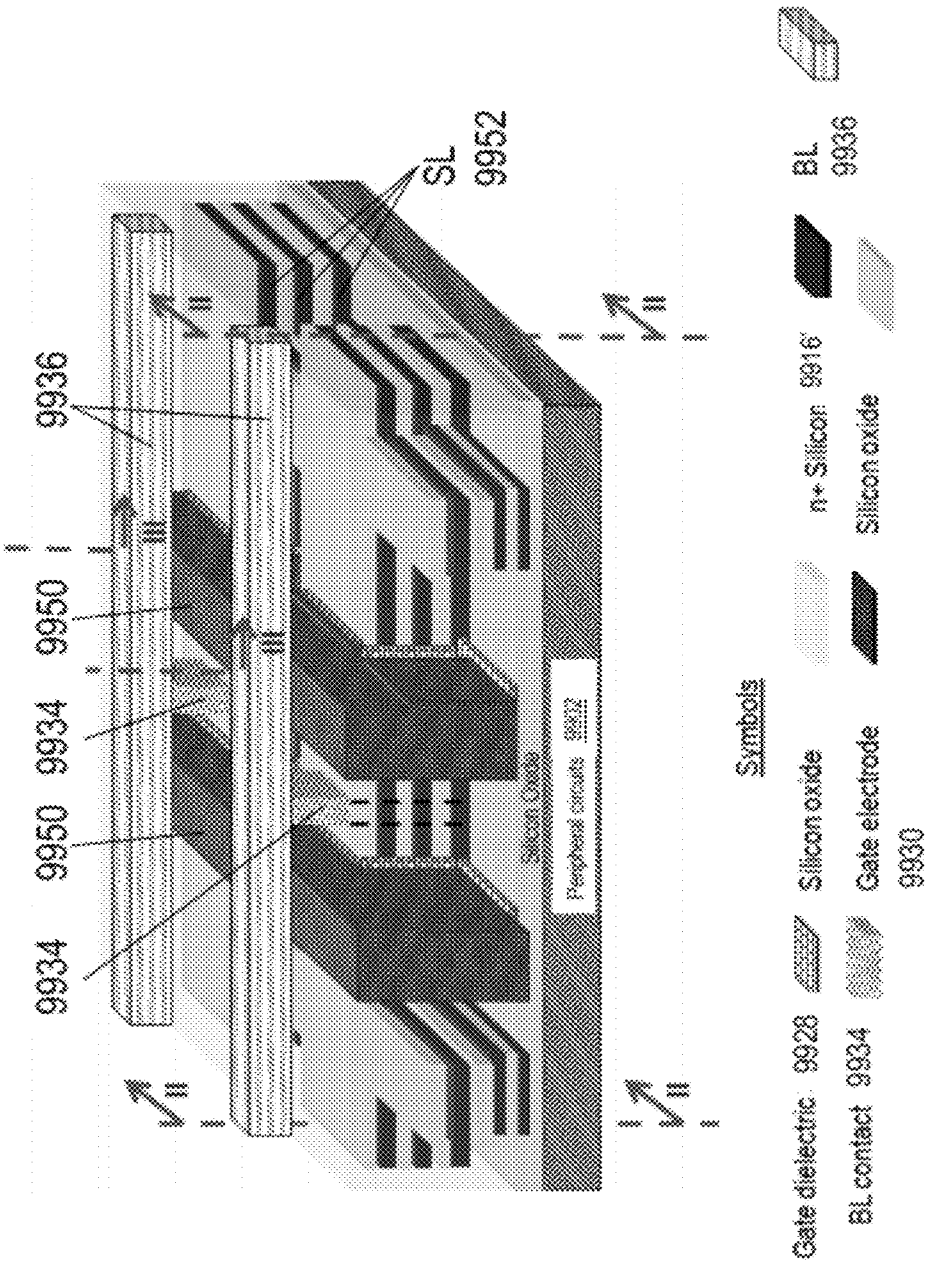

As illustrated in FIGS. 99L, 99L1 and 99L2, cross section cut II of FIG. 99L is shown in FIG. 99L1, and cross section cut III of FIG. 99L is shown in FIG. 99L2. BL metal line 9936, oxide 9932, BL contact 9934, WL regions 9950, gate dielectric 9928, P− silicon regions 9918', and peripheral circuitry substrate 9902 are shown in FIG. 99L1. The BL contact 9934 may connect to one side of the three levels of floating body transistors that may include two N+ silicon regions 9916' in each level with their associated P− silicon region 9918'. BL metal lines 9936, oxide 9932, gate electrode 9930, gate dielectric 9928, P− silicon regions 9918', interlayer oxide region ('ox'), and peripheral circuitry substrate 9902 are shown in FIG. 99L2. The gate electrode 9930 may be common to substantially all six P− silicon regions 9918' and forms six two-sided gated floating body transistors.

Figure 99M:
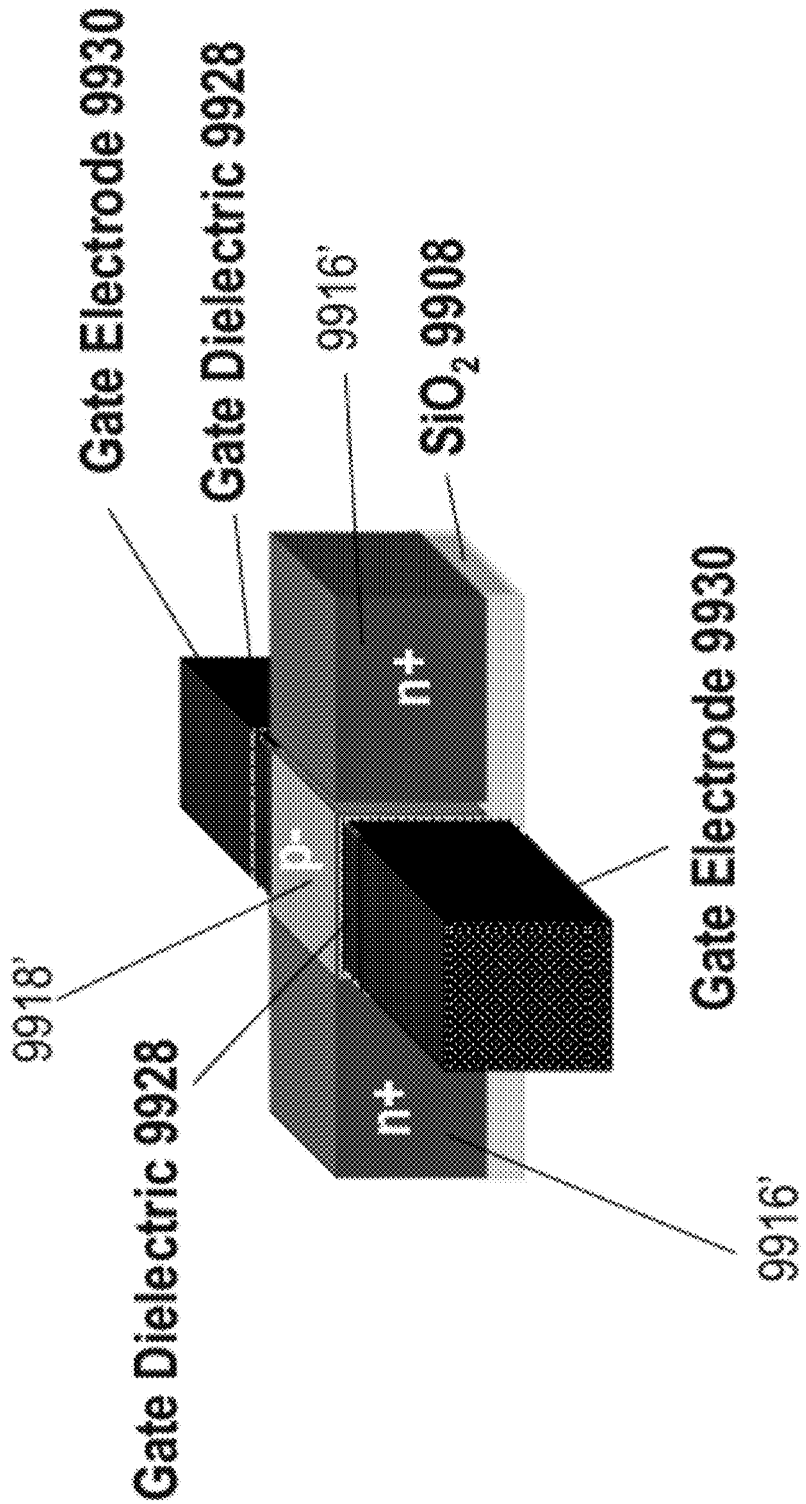

As illustrated in FIG. 99M, a single exemplary floating body transistor with two gates on the first Si/SiO2 layer 9922 may include P− silicon region 9918' (functioning as the floating body transistor channel), N+ silicon regions 9916' (functioning as source and drain), and two gate electrodes 9930 with associated gate dielectrics 9928. The transistor may be electrically isolated from beneath by oxide layer 9908.

This flow may enable the formation of a horizontally-oriented monolithic 3D DRAM that may utilize one masking step per memory layer constructed by layer transfers of wafer sized doped mono-crystalline silicon layers and this 3D DRAM may be connected to an underlying multi-metal layer semiconductor device.

Persons of ordinary skill in the art will appreciate that the illustrations in FIGS. 99A through 99M are exemplary only and are not drawn to scale. Such skilled persons will further appreciate that many variations may be possible such as, for example, the transistors may be of another type such as RCATs, or junction-less. Or the contacts may utilize doped poly-crystalline silicon, or other conductive materials. Or the stacked memory layers may be connected to a periphery circuit that may be above the memory stack. Or Si/SiO2 layers 9922, 9924 and 9926 may be annealed layer-by-layer as soon as their associated implantations may be substantially complete by using a laser anneal system. Many other modifications within the scope of the illustrated embodiments of the invention will suggest themselves to such skilled persons after reading this specification. Thus the invention is to be limited only by the appended claims.

As illustrated in FIGS. 100A to 100L, a horizontally-oriented monolithic 3D DRAM that may utilize zero additional masking steps per memory layer by sharing mask steps after substantially all the layers have been transferred may be constructed. The 3D DRAM may be suitable for 3D IC manufacturing.

Figure 100A:
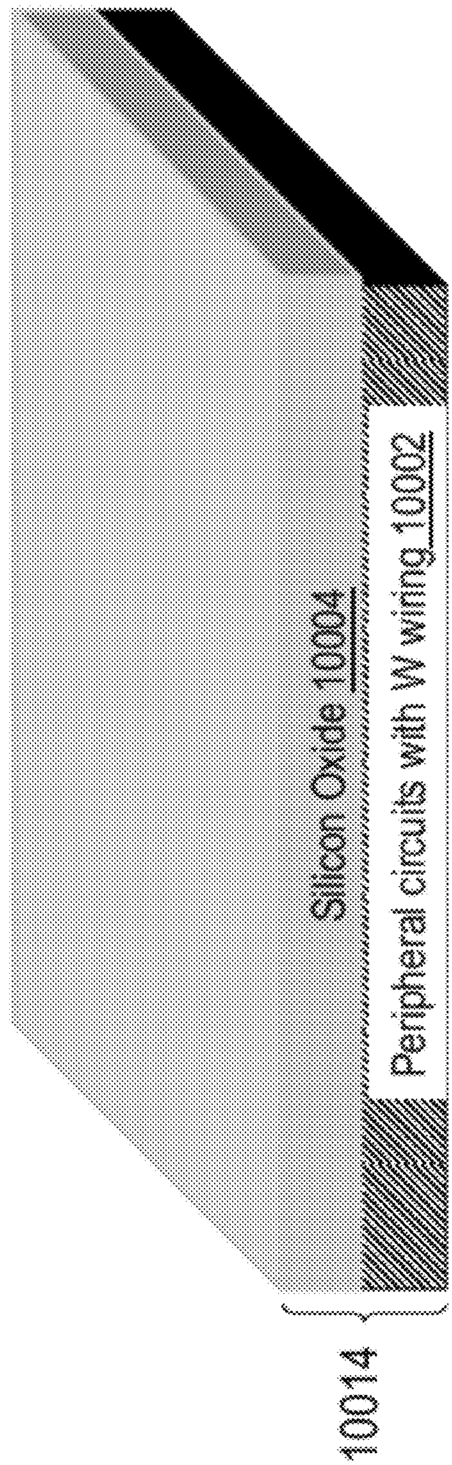

As illustrated in FIG. 100A, a silicon substrate with peripheral circuitry 10002 may be constructed with high temperature (greater than about 400° C.) resistant wiring, such as Tungsten. The peripheral circuitry substrate 10002 may include memory control circuits as well as circuitry for other purposes and of various types, such as analog, digital, RF, or memory. The peripheral circuitry substrate 10002 may include peripheral circuits that can withstand an additional rapid-thermal-anneal (RTA) or flash anneal and still remain operational and retain good performance. For this purpose, the peripheral circuits may be formed such that they have been subject to a weak RTA or no RTA for activating dopants. The top surface of the peripheral circuitry substrate 10002 may be prepared for oxide wafer bonding with a deposition of a silicon oxide layer 10004, thus forming acceptor wafer 10014.

Figure 100B:
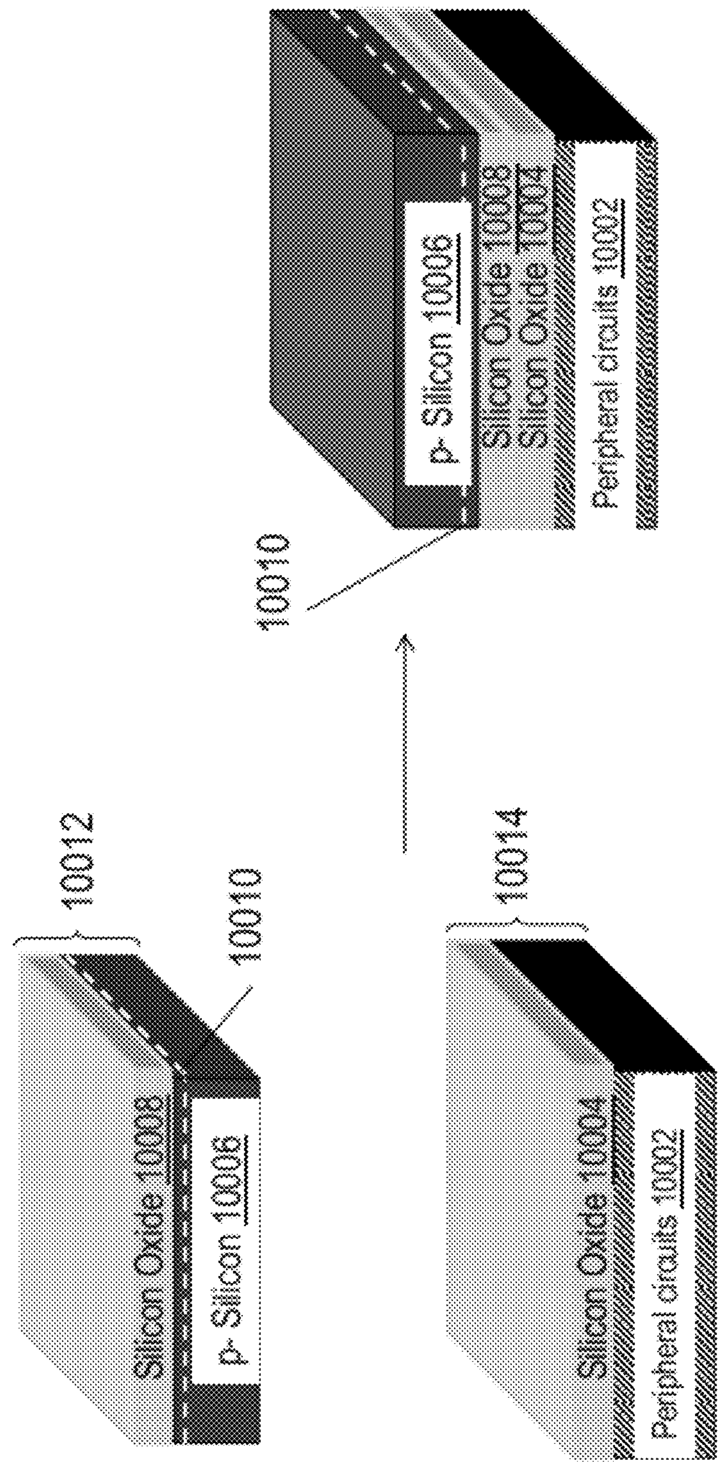

As illustrated in FIG. 100B, a mono-crystalline silicon donor wafer 10012 may be processed to include a wafer sized layer of P− doping (not shown) which may have a different dopant concentration than the P− substrate 10006. The P− doping layer may be formed by ion implantation and thermal anneal. A screen oxide layer 10008 may be grown or deposited prior to the implant to protect the silicon from implant contamination and to provide an oxide surface for later wafer to wafer bonding. A layer transfer demarcation plane 10010 (shown as a dashed line) may be formed in donor wafer 10012 within the P− substrate 10006 or the P− doping layer (not shown) by hydrogen implantation or other methods as previously described. Both the donor wafer 10012 and acceptor wafer 10014 may be prepared for wafer bonding as previously described and then bonded at the surfaces of oxide layer 10004 and oxide layer 10008, at a low temperature (less than about 400° C.) suitable for lowest stresses, or a moderate temperature (less than about 900° C.).

Figure 100C:
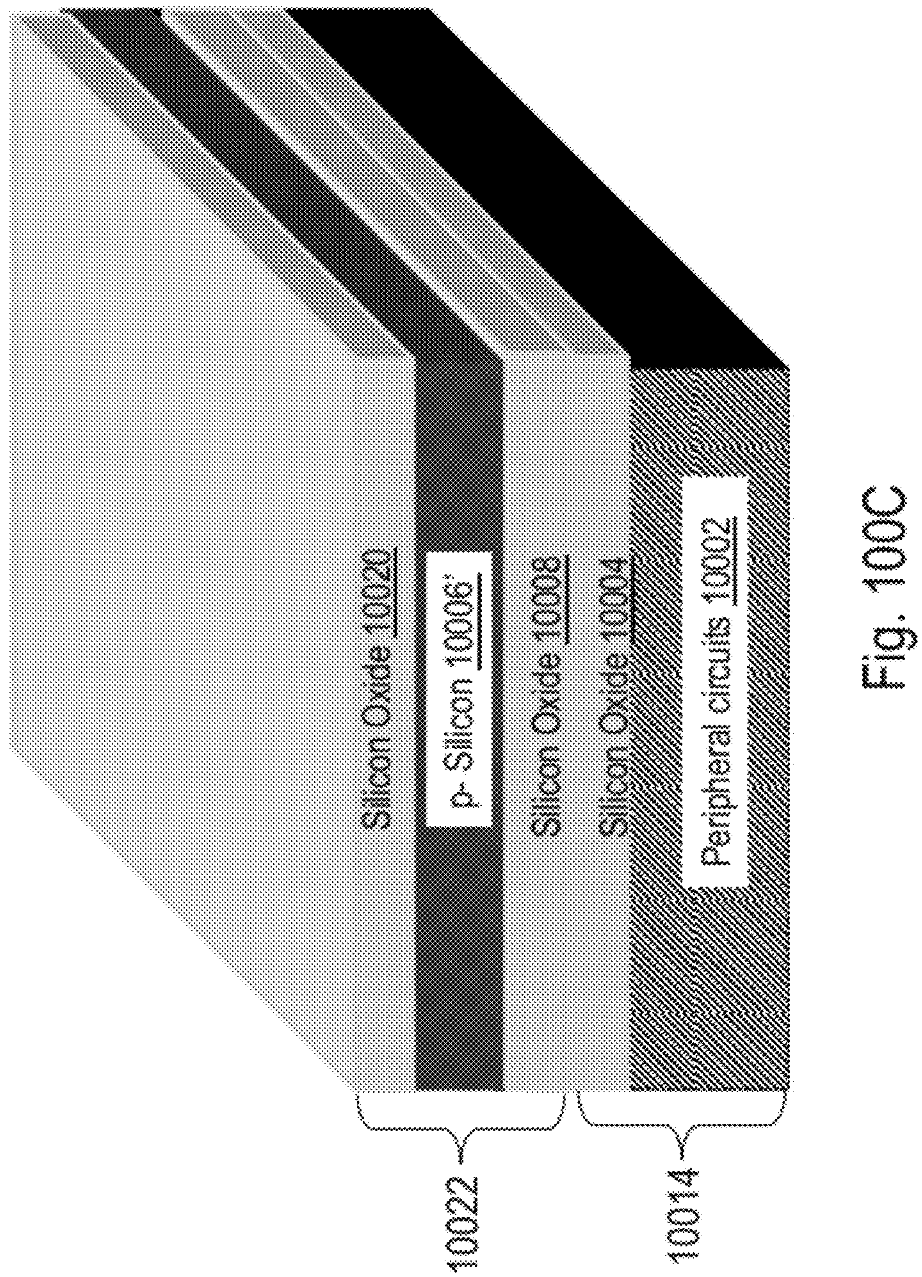

As illustrated in FIG. 100C, the portion of the P− layer (not shown) and the P− substrate 10006 that are above the layer transfer demarcation plane 10010 may be removed by cleaving and polishing, or other processes as previously described, such as ion-cut or other methods, thus forming the remaining mono-crystalline silicon P− layer 10006'. Remaining P− layer 10006' and oxide layer 10008 may have been layer transferred to acceptor wafer 10014. The top surface of P− layer 10006' may be chemically or mechanically polished smooth and flat. Transistors or portions of transistors may be formed and aligned to the acceptor wafer 10014 alignment marks (not shown). Oxide layer 10020 may be deposited to prepare the surface for later oxide to oxide bonding. This bonding may now form the first Si/SiO2 layer 10023 which may include silicon oxide layer 10020, P− layer 10006', and oxide layer 10008.

Figure 100D:
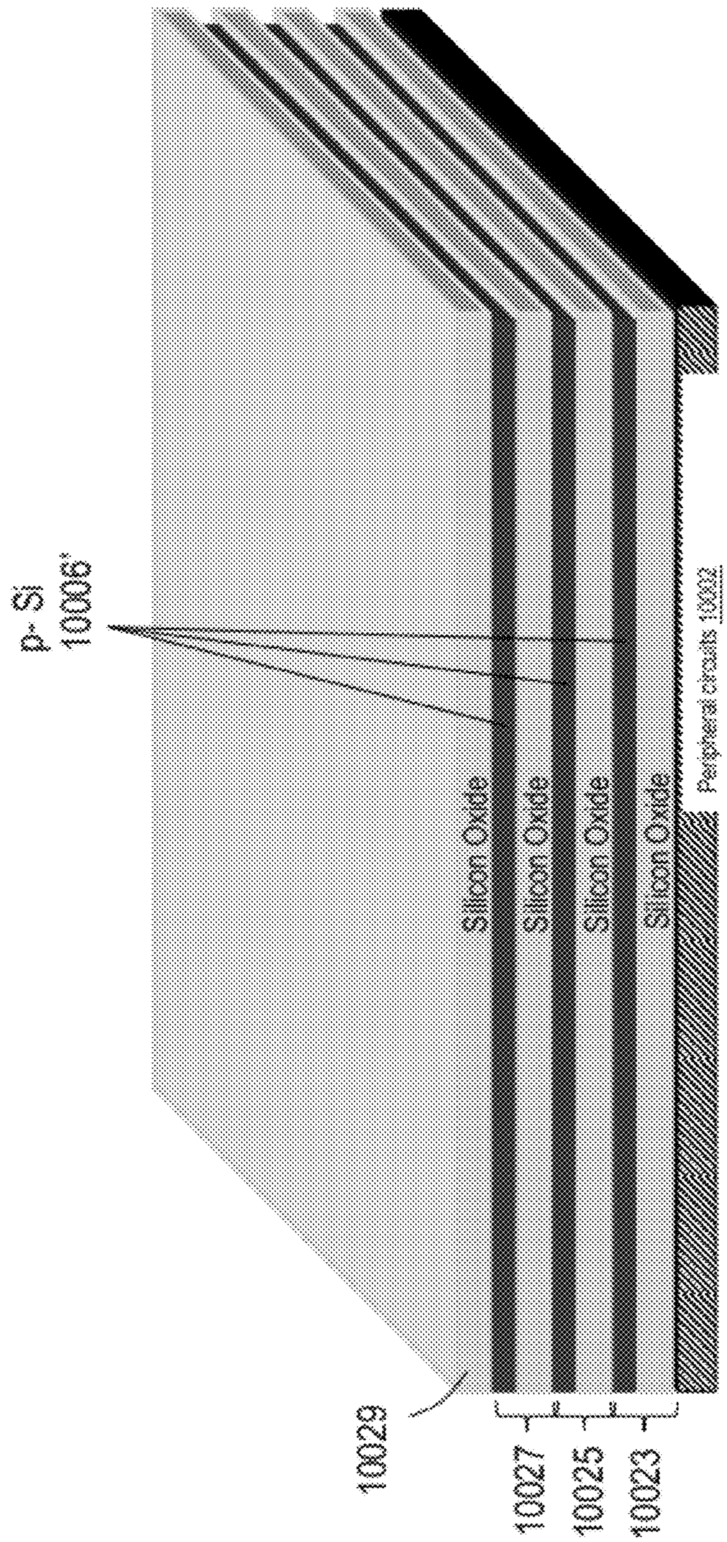

As illustrated in FIG. 100D, additional Si/SiO2 layers, such as second Si/SiO2 layer 10025 and third Si/SiO2 layer 10027, may each be formed as described in FIGS. 100A to 100C. Oxide layer 10029 may be deposited to electrically isolate the top silicon layer.

Figure 100E:
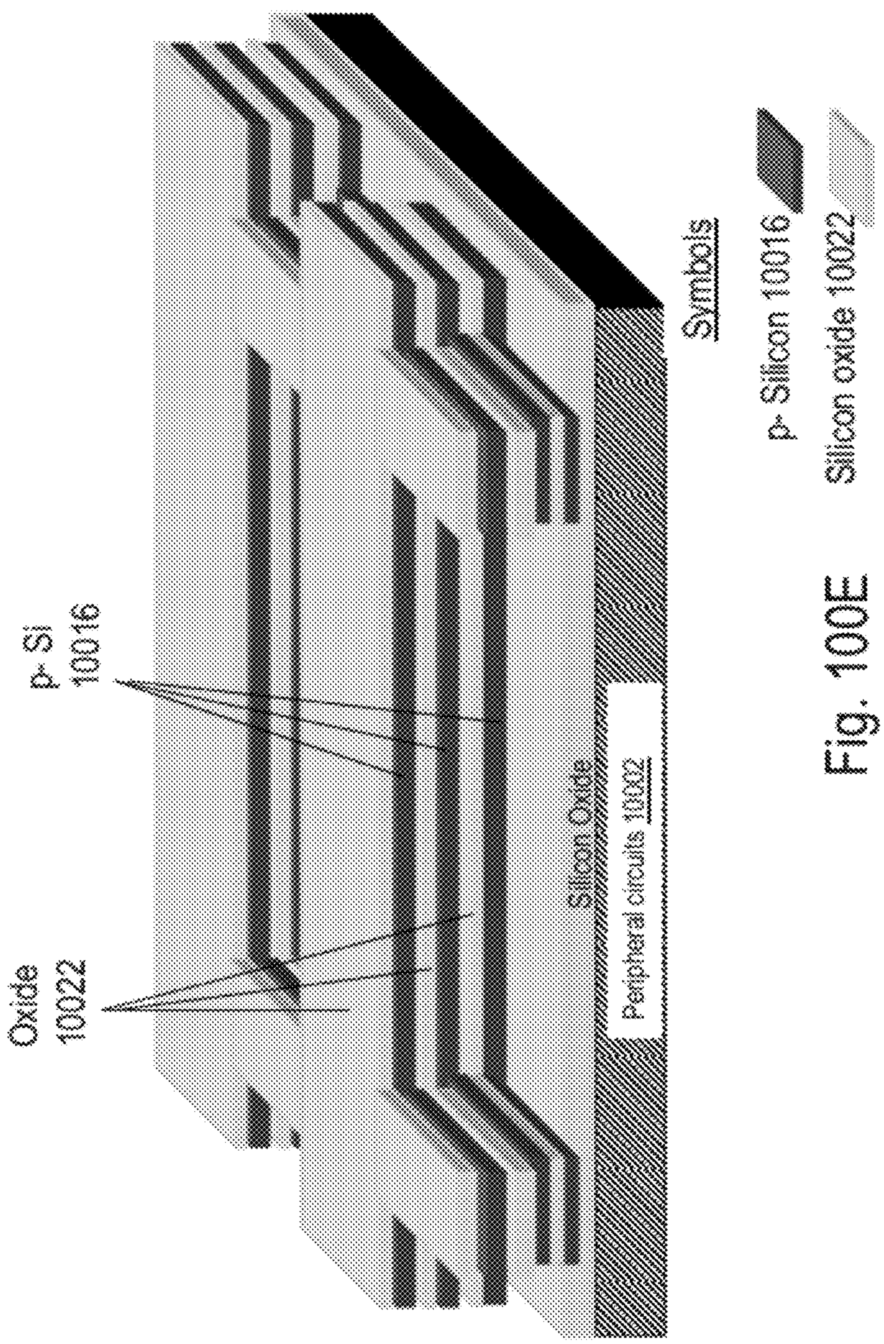

As illustrated in FIG. 100E, oxide layer 10029, third Si/SiO2 layer 10027, second Si/SiO2 layer 10025 and first Si/SiO2 layer 10023 may be lithographically defined and plasma/RIE etched to form a portion of the memory cell structure, which may now include regions of P− silicon 10016 and oxide 10022. Thus, these transistor elements or portions may have been defined by a common lithography step, which also may be described as a single lithography step, same lithography step, or one lithography step.

Figure 100F:
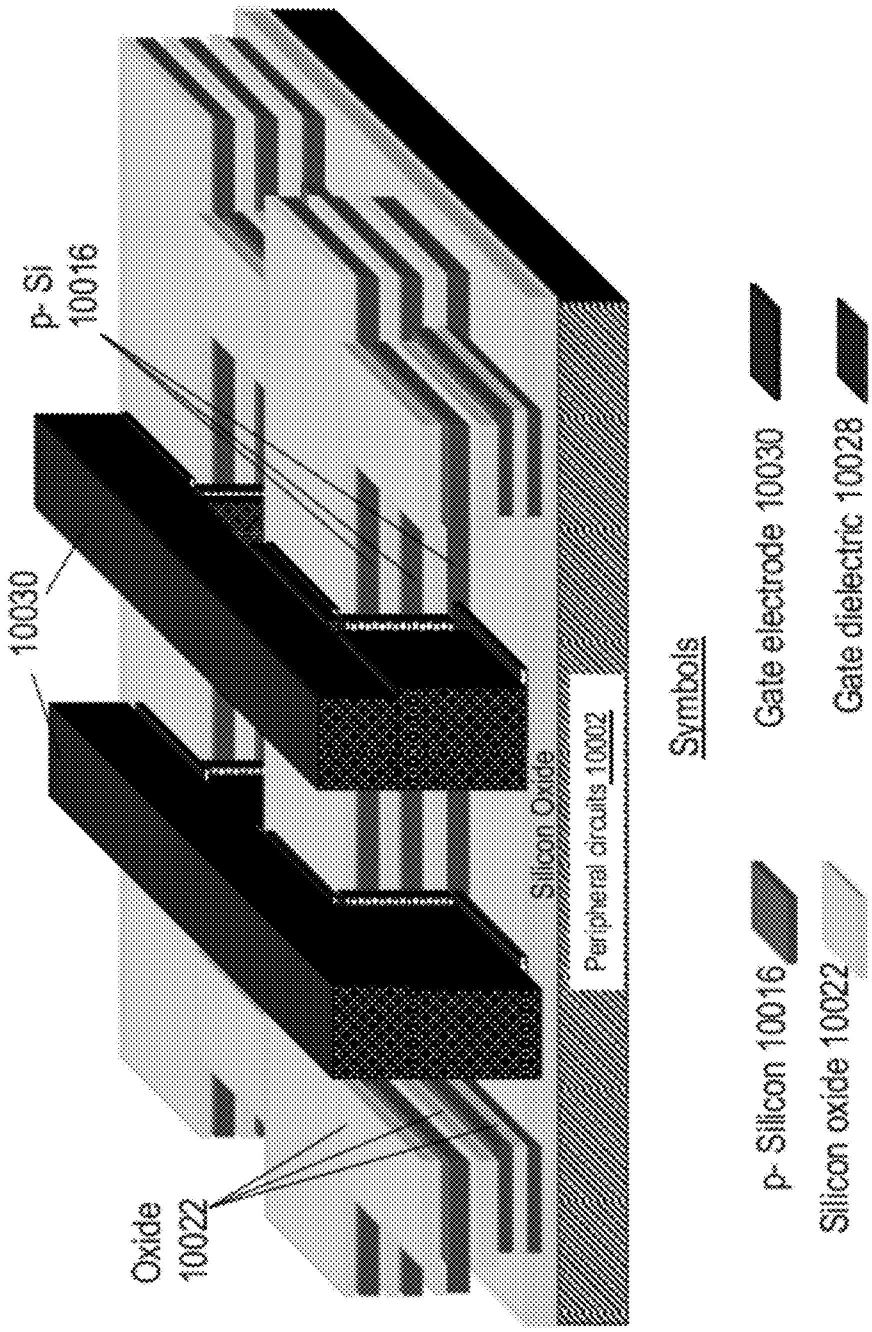

As illustrated in FIG. 100F, a gate dielectric and gate electrode material may be deposited, planarized with a chemical mechanical polish (CMP), and then lithographically defined and plasma/RIE etched to form gate dielectric regions 10028 which may either be self-aligned to and covered by gate electrodes 10030 (shown), or cover the entire silicon/oxide multi-layer structure. The gate stack including gate electrode 10030 and gate dielectric 10028 may be formed with a gate dielectric, such as, for example, thermal oxide, and a gate electrode material, such as poly-crystalline silicon. Alternatively, the gate dielectric may be an atomic layer deposited (ALD) material that may be paired with a work function specific gate metal according to an industry standard of high k metal gate process schemes described previously. Or the gate dielectric may be formed with a rapid thermal oxidation (RTO), a low temperature oxide deposition or low temperature microwave plasma oxidation of the silicon surfaces and then a gate electrode such as, for example, tungsten or aluminum may be deposited.

Figure 100G:
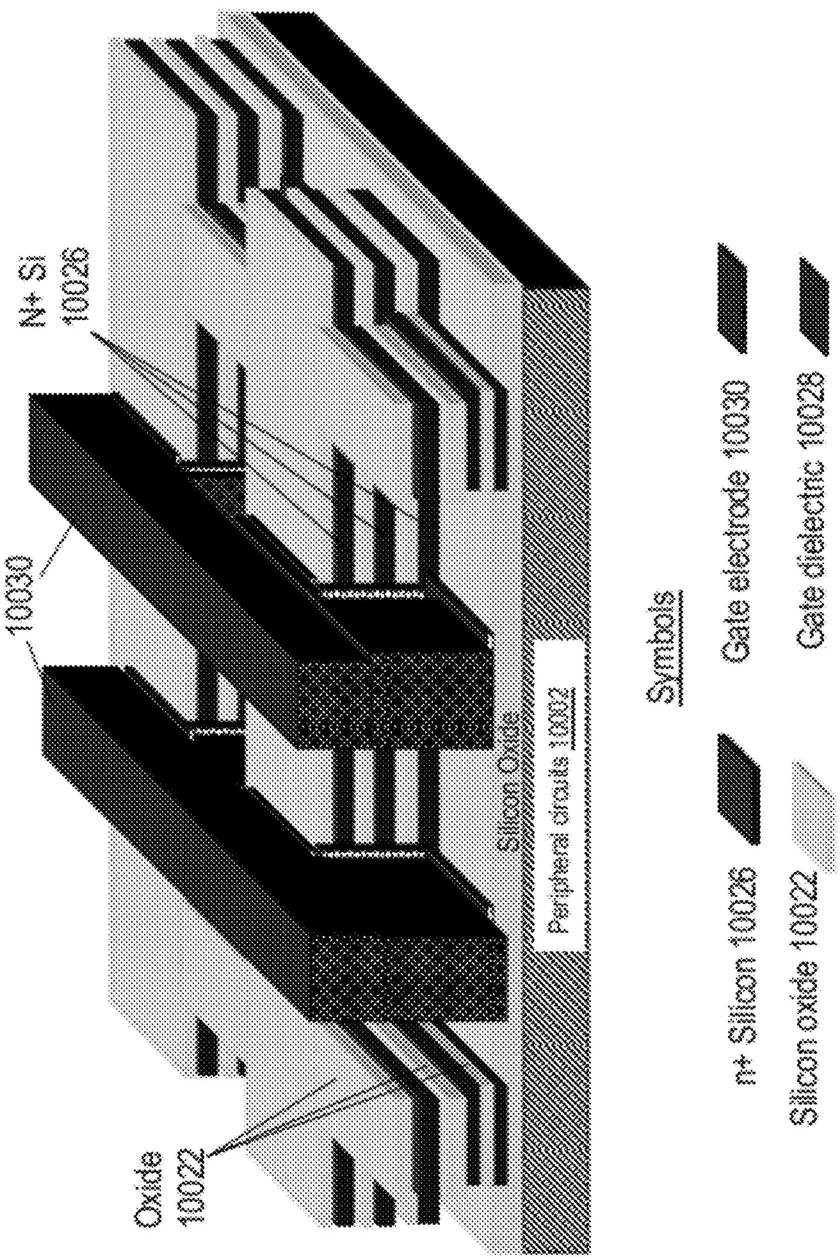

As illustrated in FIG. 100G, N+ silicon regions 10026 may be formed in a self-aligned manner to the gate electrodes 10030 by ion implantation of an N type species, such as Arsenic, into the regions of P− silicon 10016 that are not blocked by the gate electrodes 10030. Thus remaining regions of P− silicon 10017 (not shown) in the gate electrode 10030 blocked areas may be formed. Different implant energies or angles, or multiples of each, may be utilized to place the N type species into each layer of P− silicon regions 10016. Spacers (not shown) may be utilized during this multi-step implantation process and layers of silicon present in different layers of the stack may have different spacer widths to account for the differing lateral straggle of N type species implants. Bottom layers, such as first Si/SiO2 layer 10023, could have larger spacer widths than top layers, such as, for example, third Si/SiO2 layer 10027. Alternatively, angular ion implantation with substrate rotation may be utilized to compensate for the differing implant straggle. The top layer implantation may have a slanted angle, rather than perpendicular, to the wafer surface and hence land ions slightly underneath the gate electrode 10030 edges and closely match a more perpendicular lower layer implantation which may land ions slightly underneath the gate electrode 10030 edge due to the straggle effects of the greater implant energy needed to reach the lower layer. A rapid thermal anneal (RTA) or flash anneal may be conducted to activate the dopants in substantially all of the memory layers 10023, 10025, 10027 and in the peripheral circuitry substrate 10002. Alternatively, optical anneals, such as, for example, a laser based anneal, may be performed.

Figure 100H:
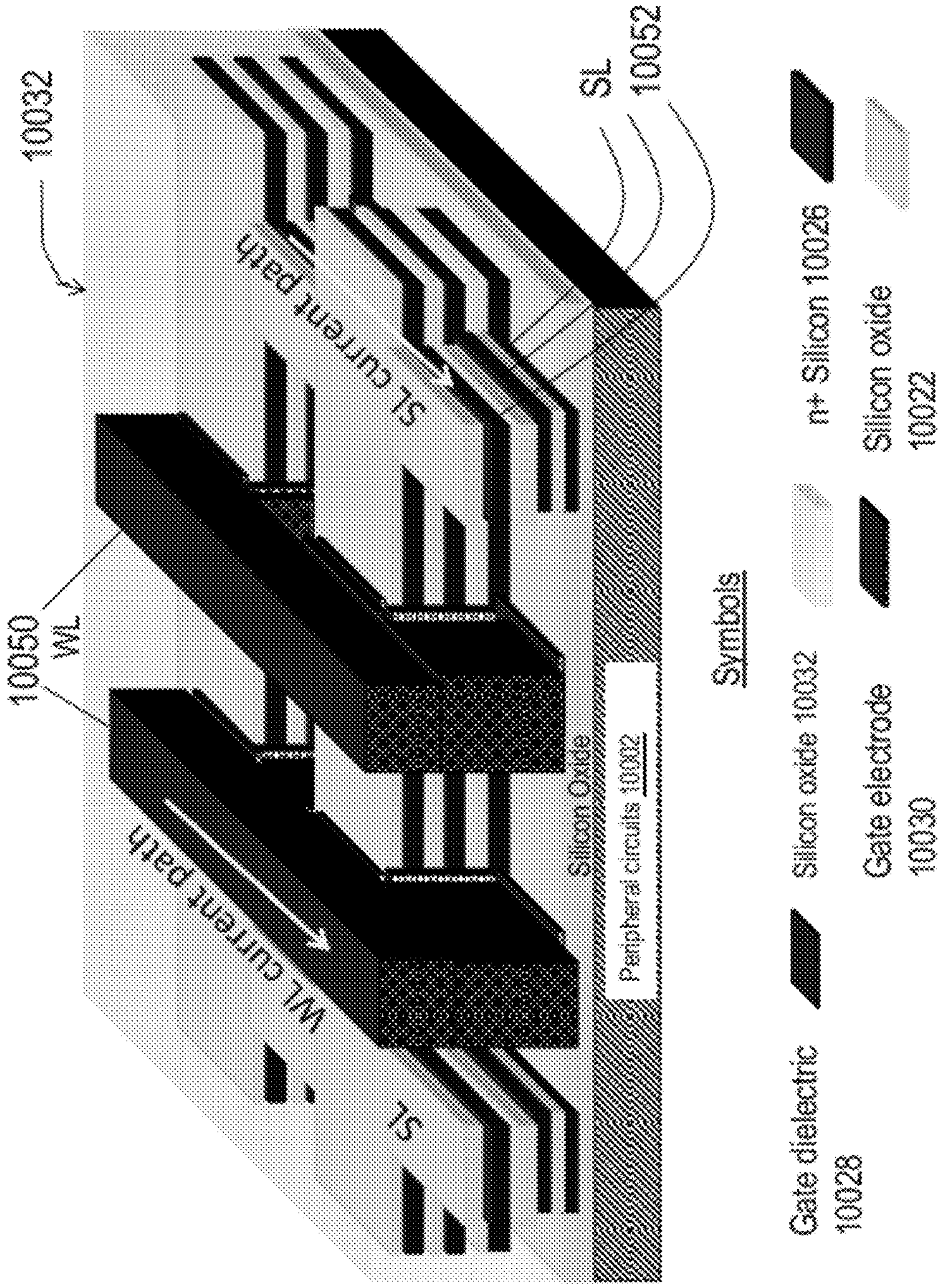

As illustrated in FIG. 100H, the entire structure may be covered with a gap fill oxide 10032, which may be planarized with chemical mechanical polishing. The oxide 10032 is shown transparent in the figure for clarity in illustration. Word-line regions (WL) 10050, coupled with and composed of gate electrodes 10030, and source-line regions (SL) 10052, composed of indicated N+ silicon regions 10026, are shown.

Figure 100I:
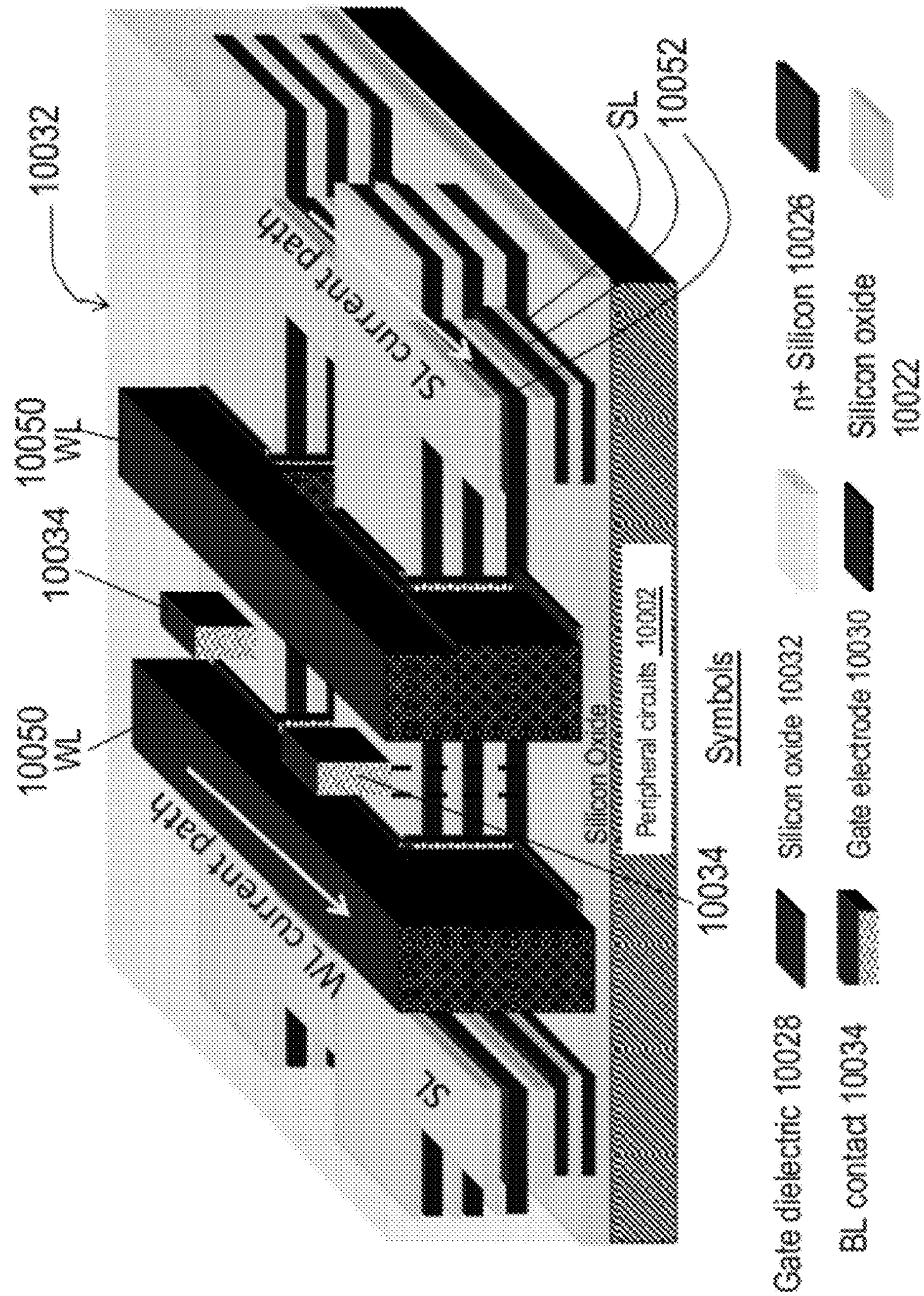

As illustrated in FIG. 100I, bit-line (BL) contacts 10034 may be lithographically defined, etched with plasma/RIE, and processed by a photoresist removal. Metal, such as, for example, copper, aluminum, or tungsten, may be deposited to fill the contact and etched or polished to the top of oxide 10032. Each BL contact 10034 may be shared among substantially all layers of memory, shown as three layers of memory in FIG. 100I. A through layer via (not shown) may be formed to electrically couple the BL, SL, and WL metallization to the acceptor wafer 10014 peripheral circuitry via an acceptor wafer metal connect pad (not shown).

Figure 100J:
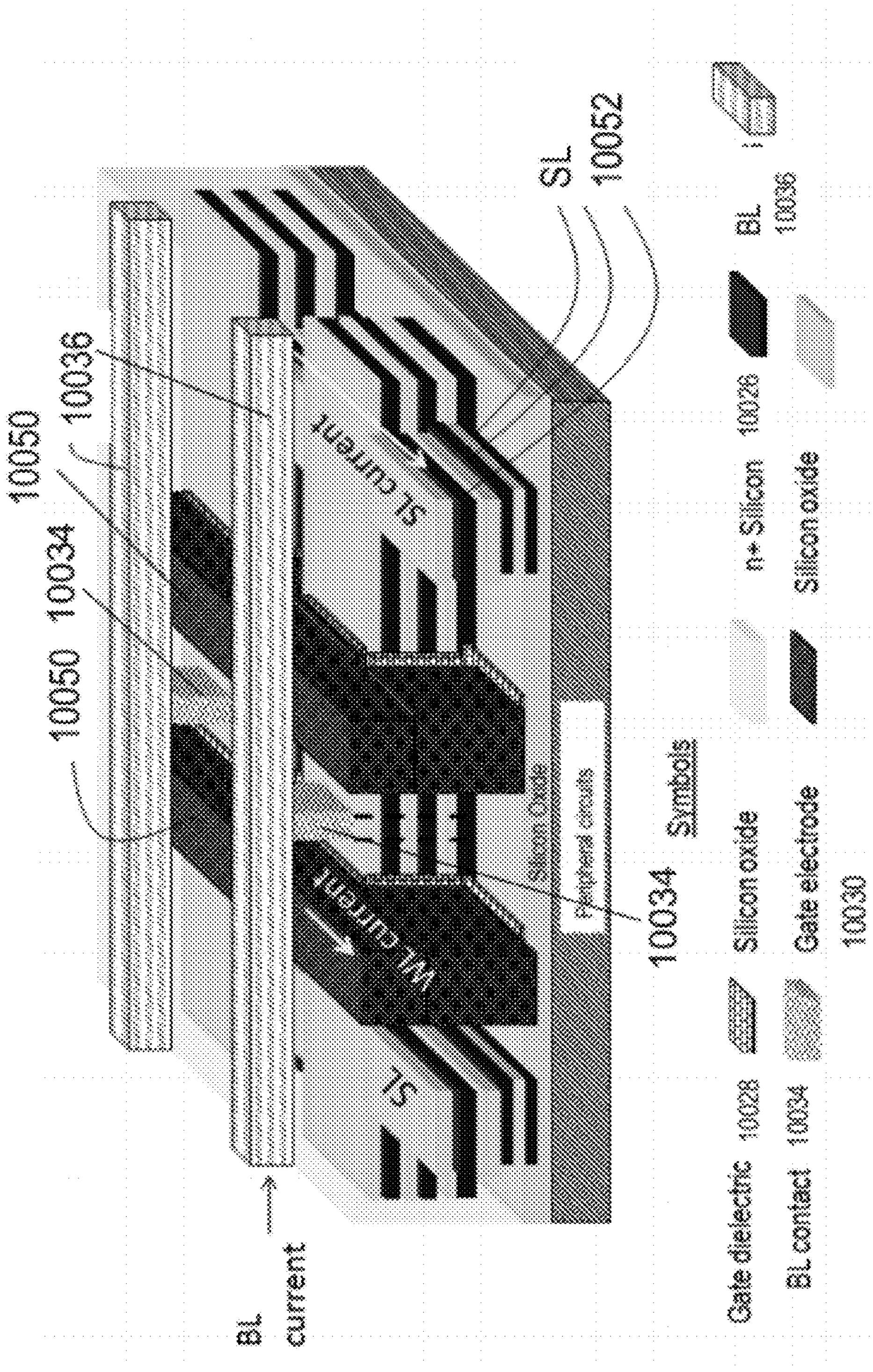

As illustrated in FIG. 100J, BL metal lines 10036 may be formed and connect to the associated BL contacts 10034. Contacts and associated metal interconnect lines (not shown) may be formed for the WL and SL at the memory array edges.

Figure 100K:
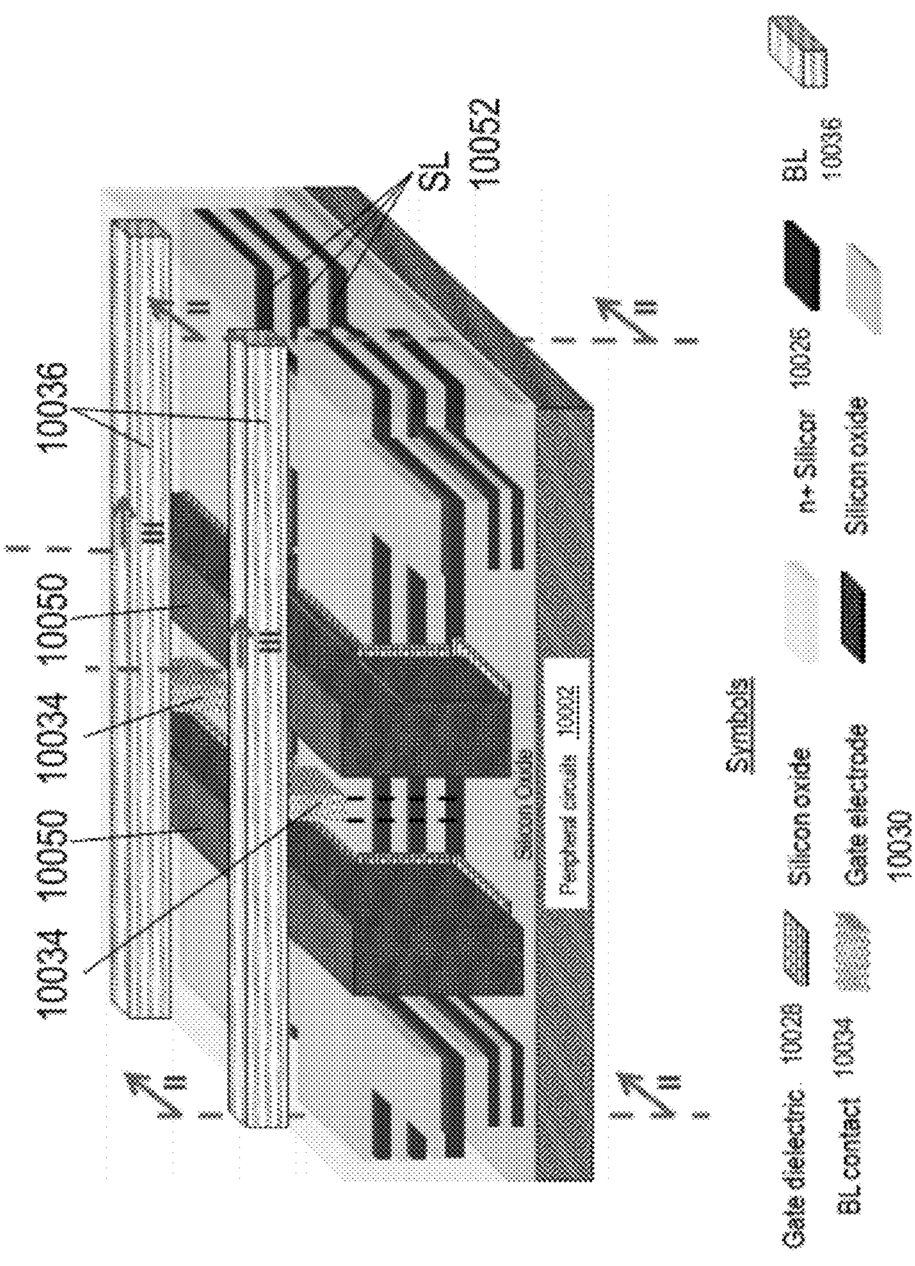

FIG. 100K1 shows a cross-sectional cut II of FIG. 100K, while FIG. 100K2 shows a cross-sectional cut III of FIG. 100K. FIG. 100K1 shows BL metal line 10036, oxide 10032, BL contact 10034, WL regions 10050, gate dielectric 10028, N+ silicon regions 10026, P− silicon regions 10017, and peripheral circuitry substrate 10002. The BL contact 10034 may couple to one side of the three levels of floating body transistors that may include two N+ silicon regions 10026 in each level with their associated P− silicon region 10017. FIG. 100K2 shows BL metal lines 10036, oxide 10032, gate electrode 10030, gate dielectric 10028, P− silicon regions 10017, interlayer oxide region ('ox'), and peripheral circuitry substrate 10002. The gate electrode 10030 may be common to substantially all six P− silicon regions 10017 and may form six two-sided gated floating body transistors.

Figure 100L:
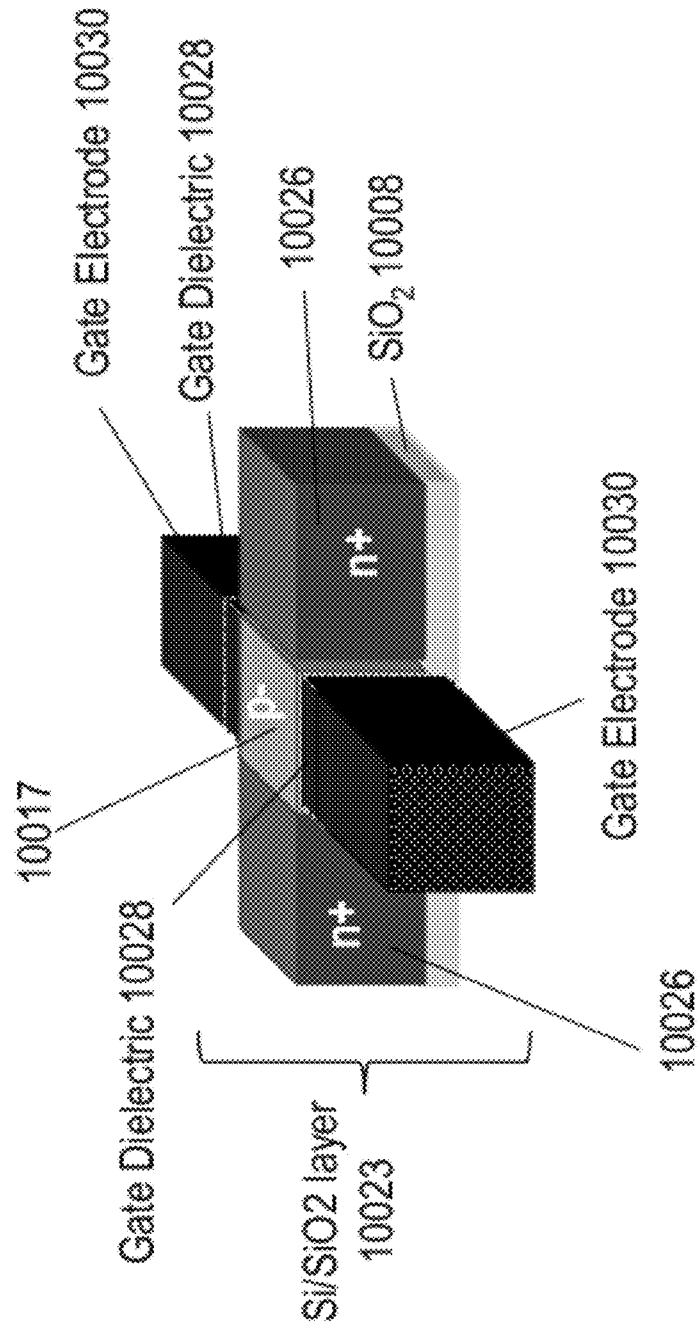

As illustrated in FIG. 100L, a single exemplary floating body two gate transistor on the first Si/SiO2 layer 10023 may include P− silicon region 10017 (functioning as the floating body transistor channel), N+ silicon regions 10026 (functioning as source and drain), and two gate electrodes 10030 with associated gate dielectrics 10028. The transistor may be electrically isolated from beneath by oxide layer 10008.

This flow may enable the formation of a horizontally-oriented monolithic 3D DRAM that may utilize zero additional masking steps per memory layer and may be constructed by layer transfers of wafer sized doped monocrystalline silicon layers and may be connected to an underlying multi-metal layer semiconductor device.

Persons of ordinary skill in the art will appreciate that the illustrations in FIGS. 100A through 100L are exemplary only and are not drawn to scale. Such skilled persons will further appreciate that many variations may be possible such as, for example, the transistors may be of another type such as RCATs, or junction-less. Additionally, the contacts may utilize doped poly-crystalline silicon, or other conductive materials. Moreover, the stacked memory layer may be connected to a periphery circuit that may be above the memory stack. Further, each gate of the double gate 3D DRAM can be independently controlled for better control of the memory cell. Many other modifications within the scope of the illustrated embodiments of the invention will suggest themselves to such skilled persons after reading this specification. Thus the invention is to be limited only by the appended claims.

FIG. 227A-J describes an alternative process flow to construct a horizontally-oriented monolithic 3D DRAM. This monolithic 3D DRAM utilizes the floating body effect and independently addressable double-gate transistors. One mask is utilized on a "per-memory-layer" basis for the monolithic 3D DRAM concept shown in FIG. 227A-J, while other masks may be shared between different layers. Independently addressable double-gated transistors provide an increased flexibility in the programming, erasing and operating modes of floating body DRAMs. The process flow may include several steps that occur in the following sequence.

Figure 227A:
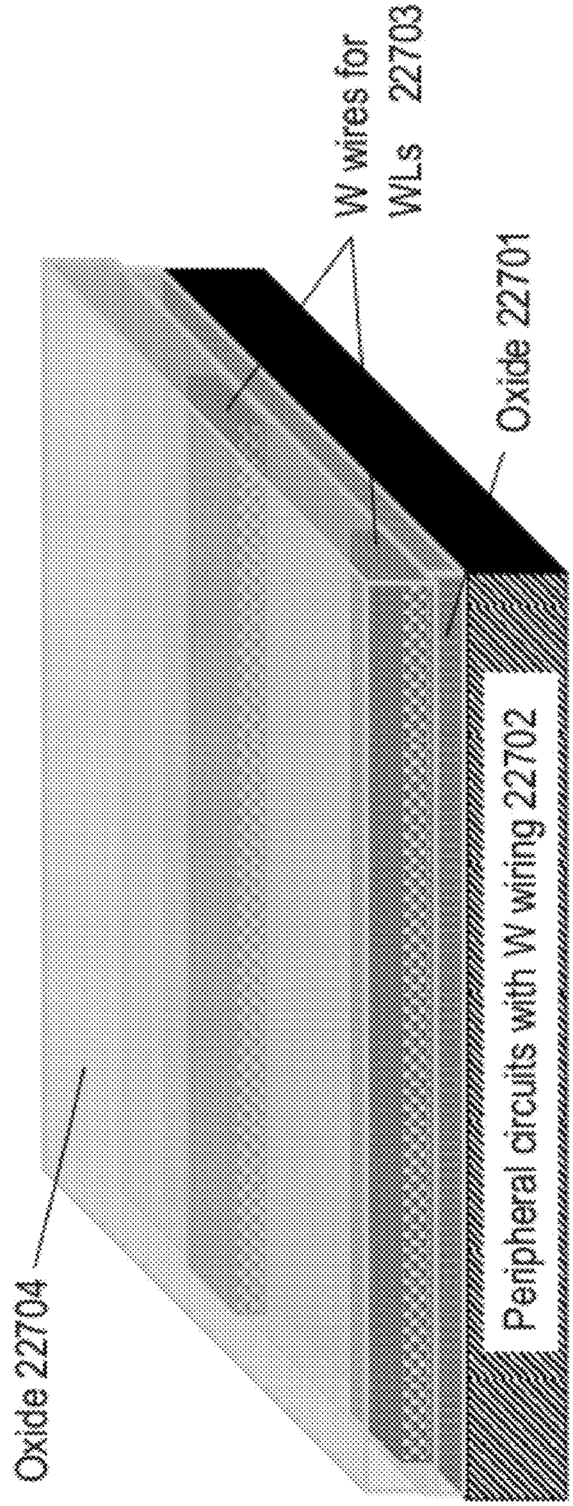

Step (A): Peripheral circuits 22702 with tungsten (W) wiring may be constructed. Isolation, such as oxide 22701, may be deposited on top of peripheral circuits 22702 and tungsten word line (WL) wires 22703 may be constructed on top of oxide 22701. WL wires 22703 may be coupled to the peripheral circuits 22702 through metal vias (not shown). Above WL wires 22703 and filling in the spaces, oxide layer 22704 may be deposited and may be chemically mechanically polished (CMP) in preparation for oxide-oxide bonding. FIG. 227A illustrates the structure after Step (A).

Figure 227B:
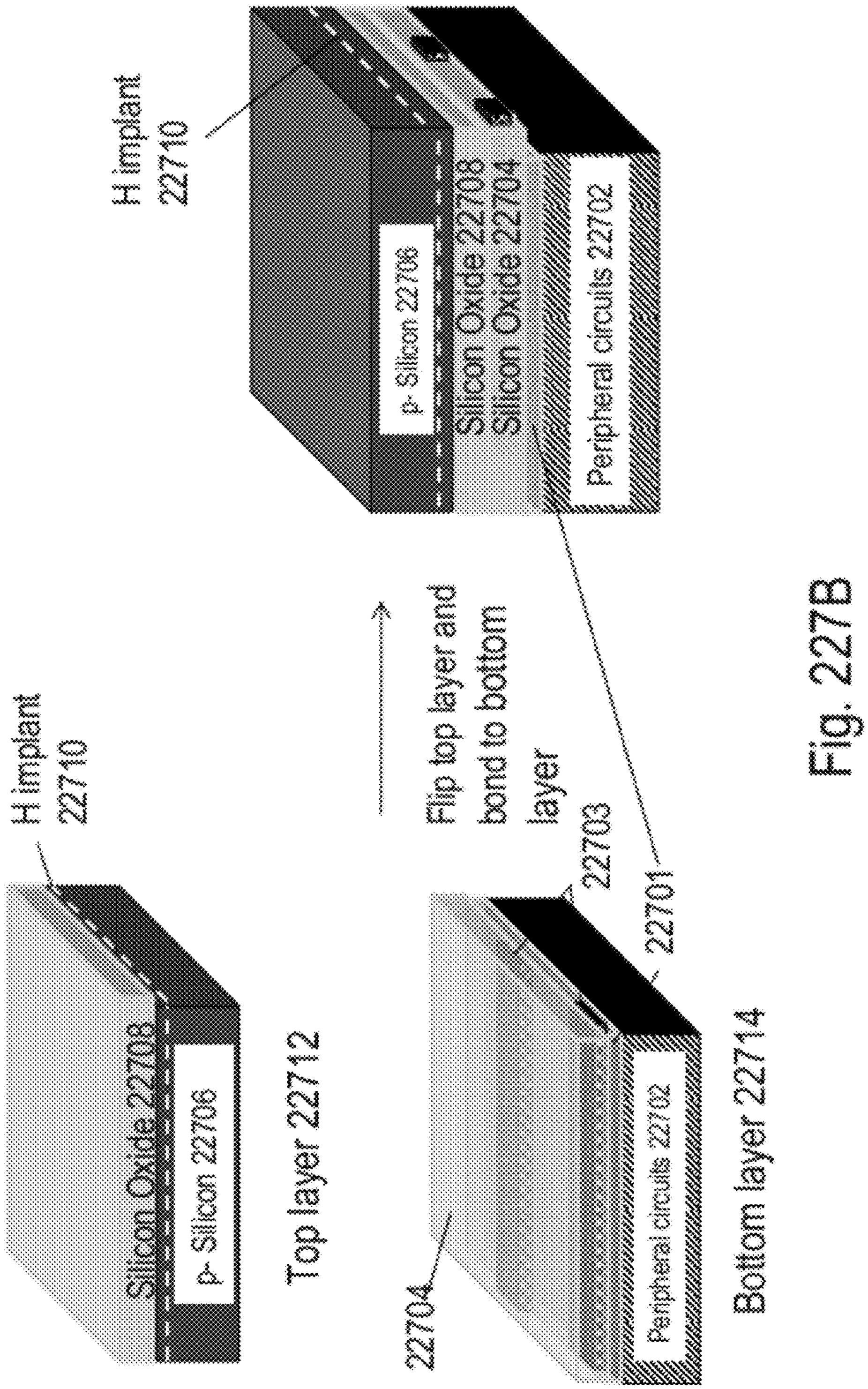

Step (B): FIG. 227B shows a drawing illustration after Step (B). A p− Silicon wafer 22706 may have an oxide layer 22708 grown or deposited above it. Following this, hydrogen may be implanted into the p− Silicon wafer at a certain depth indicated by dashed lines as hydrogen plane 22710. Alternatively, some other atomic species such as Helium could be (co-) implanted. This hydrogen implanted p− Silicon wafer 22706 may form the top layer 22712. The bottom layer 22714 may include the peripheral circuits 22702 with oxide layer 22704, WL wires 22703 and oxide 22701. The top layer 22712 may be flipped and bonded to the bottom layer 22714 using oxide-to-oxide bonding of oxide layer 22704 to oxide layer 22708.

Figure 227C:
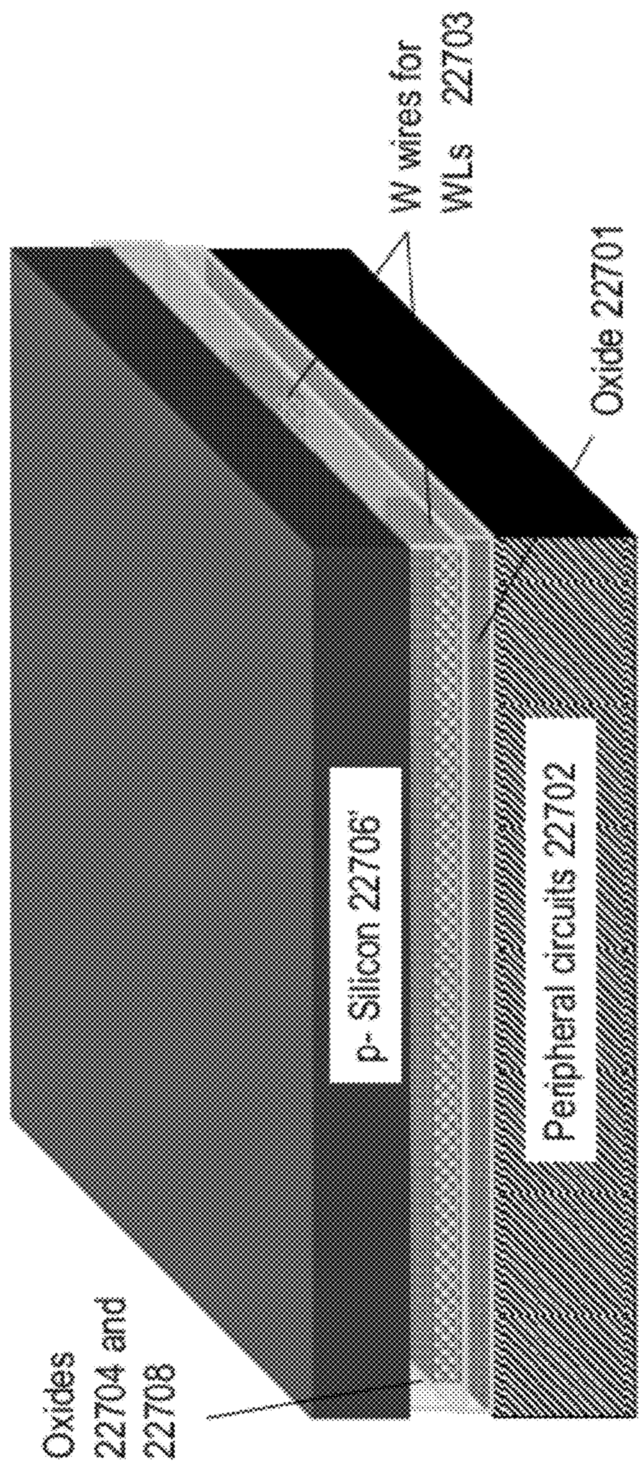

Step (C): FIG. 227C illustrates the structure after Step (C). The stack of top and bottom wafers after Step (B) may be cleaved at the hydrogen plane 22710 using either an anneal, a sideways mechanical force or other means of cleaving or thinning the top layer 22712 described elsewhere in this document. A CMP process may then be conducted. At the end of this step, a single-crystal p− Si layer 22706' may exist atop the peripheral circuits, and this has been achieved using layer-transfer techniques.

Figure 227D:
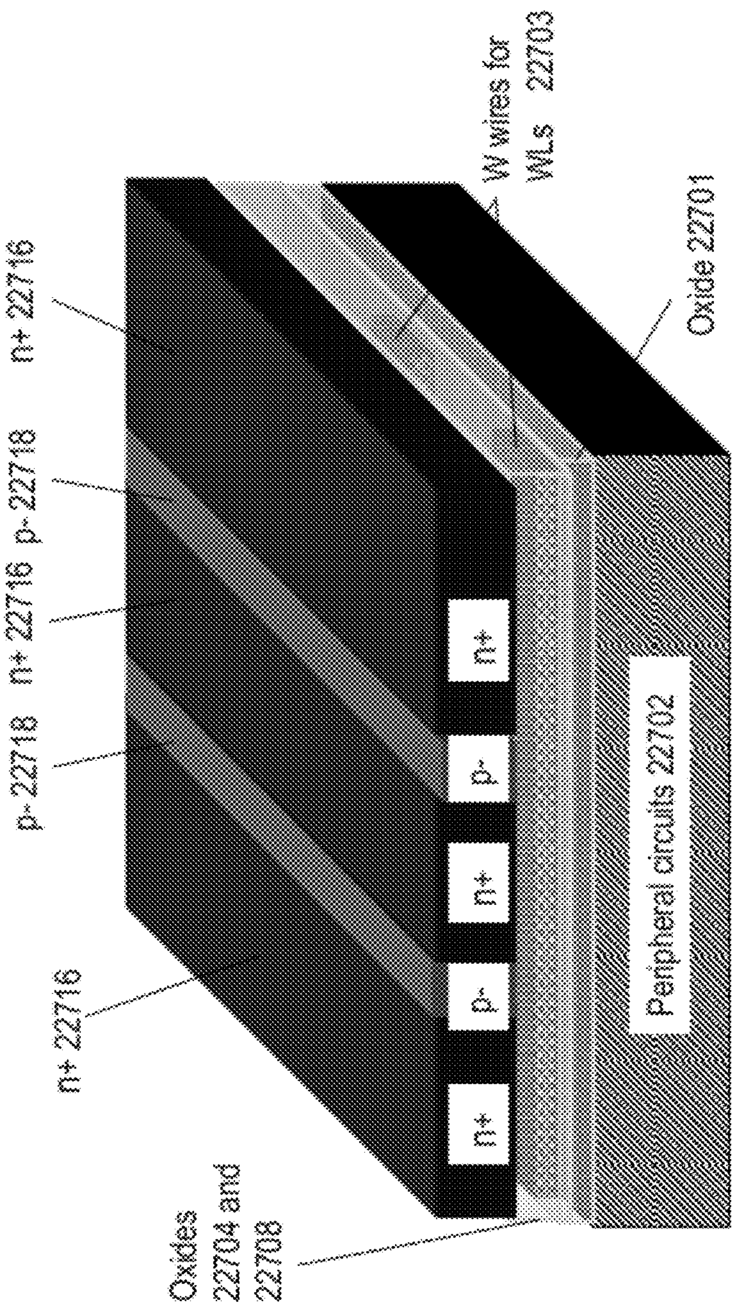

Step (D): FIG. 227D illustrates the structure after Step (D). Using lithography and then ion implantation or other semiconductor doping methods such as plasma assisted doping (PLAD), n+ regions 22716 and p− regions 22718 may be formed on the transferred layer of p− Si after Step (C).

Figure 227E:
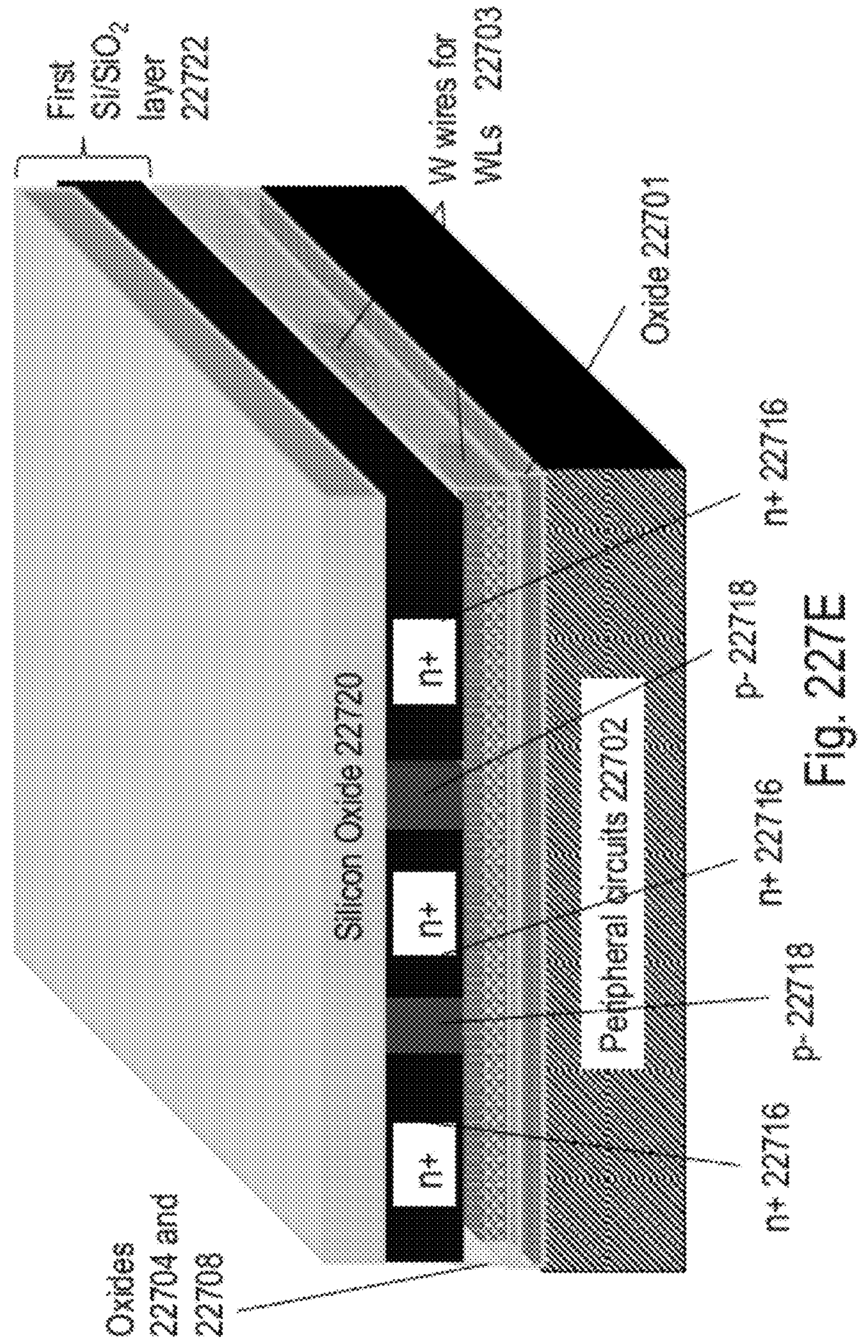

Step (E): FIG. 227E illustrates the structure after Step (E). An oxide layer 22720 may be deposited atop the structure obtained after Step (D). A first layer of Si/$SiO_2$ 22722 may be formed atop the peripheral circuits 22702, oxide 22701, WL wires 22703, oxide layer 22704 and oxide layer 22708.

Figure 227F:
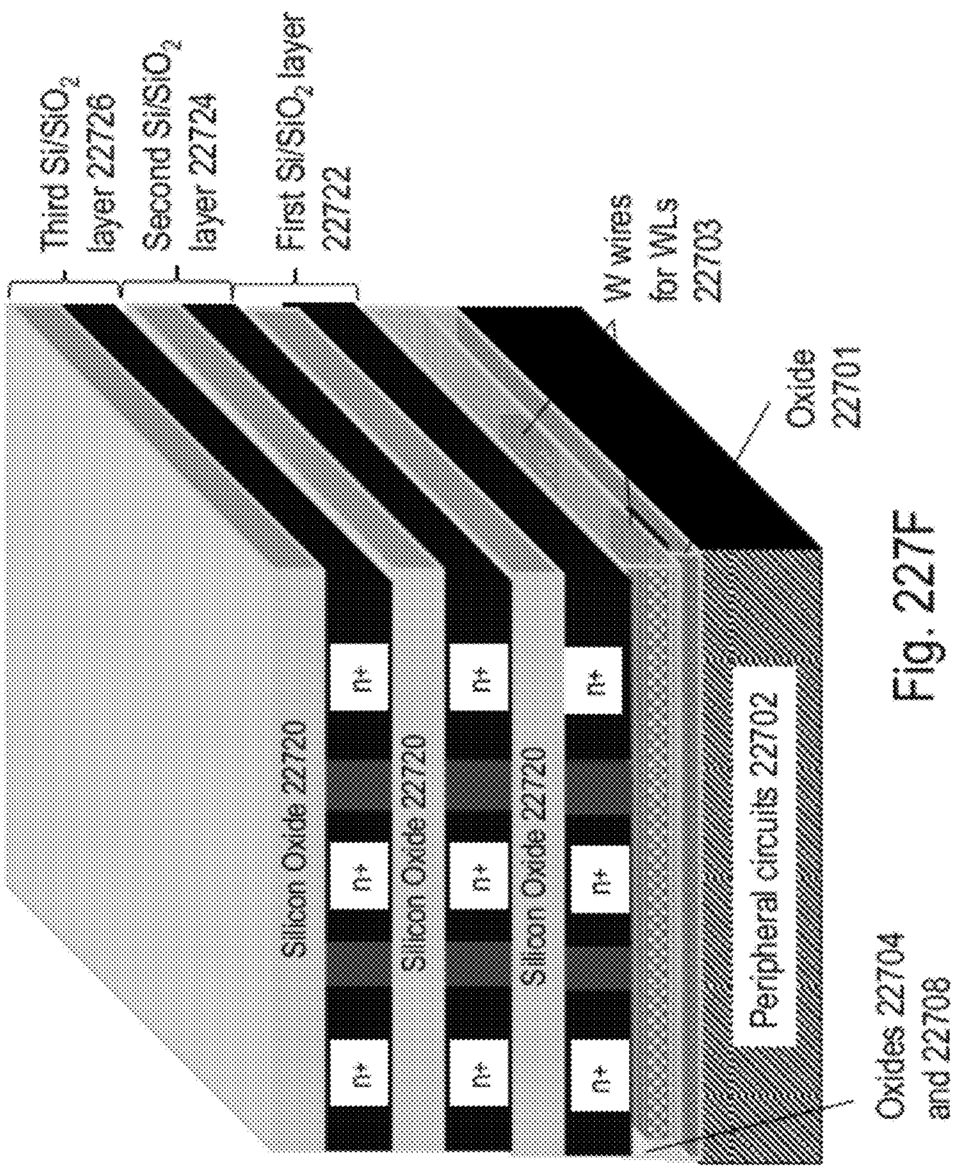

Step (F): FIG. 227F illustrates the structure after Step (F). Using procedures similar to Steps (B)-(E), additional Si/$SiO_2$ layers 22724 and 22726 may be formed atop Si/$SiO_2$ layer 22722. A rapid thermal anneal (RTA) or spike anneal or flash anneal or laser anneal may be done to activate all implanted or doped regions within Si/$SiO_2$ layers 22722, 22724 and 22726 (and possibly also the peripheral circuits 22702). Alternatively, the Si/$SiO_2$ layers 22722, 22724 and 22726 may be annealed layer-by-layer as soon as their implantations or dopings are done using an optical anneal system such as a laser anneal system. A CMP polish/plasma etch stop layer (not shown), such as silicon nitride, may be deposited on top of the topmost Si/$SiO_2$ layer, for example third Si/$SiO_2$ layer 22726.

Figure 227G:
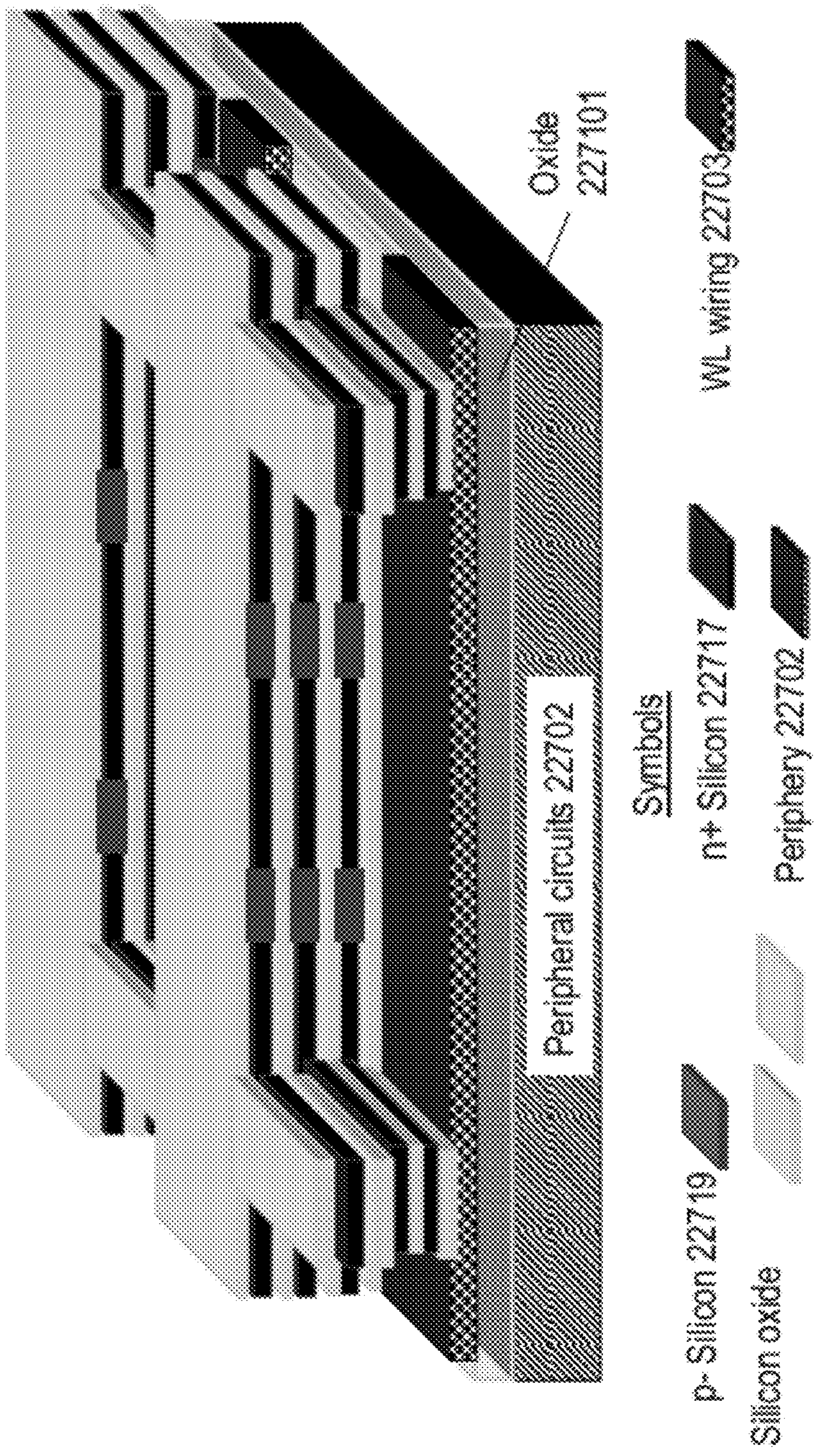

Step (G): FIG. 227G illustrates the structure after Step (G). Lithography and etch processes may be utilized to make an exemplary structure as shown in FIG. 227G, thus forming n+ regions 22717, p− regions 22719, and associated oxide regions.

Figure 227H:
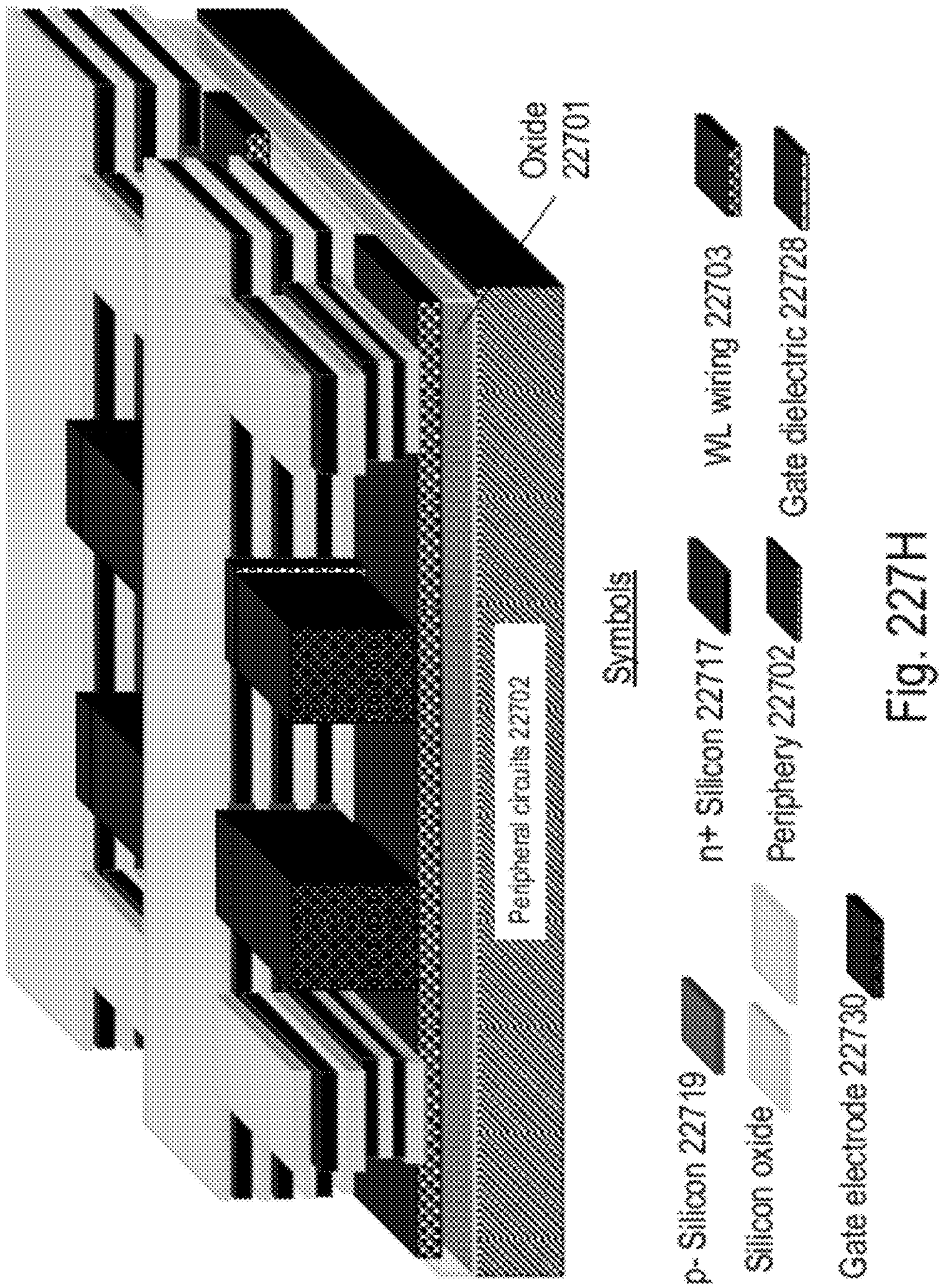

Step (H): FIG. 227H illustrates the structure after Step (H). Gate dielectric 22728 may be deposited and then an etch-back process may be employed to clear the gate dielectric from the top surface of WL wires 22703. Then gate electrode 22730 may be deposited such that an electrical coupling may be made from WL wires 22703 to gate electrode 22730. A CMP may be done to planarize the gate electrode 22730 regions such that the gate electrode 22730 may form many separate and electrically disconnected regions. Lithography and etch may be utilized to define gate regions over the p− silicon regions (e.g. p− Si regions 22719 after Step (G)). Note that gate width could be slightly larger than p− region width to compensate for overlay errors in lithography. A silicon oxide layer may be deposited and planarized. For clarity, the silicon oxide layer is shown transparent in the figure.

Figure 227I:
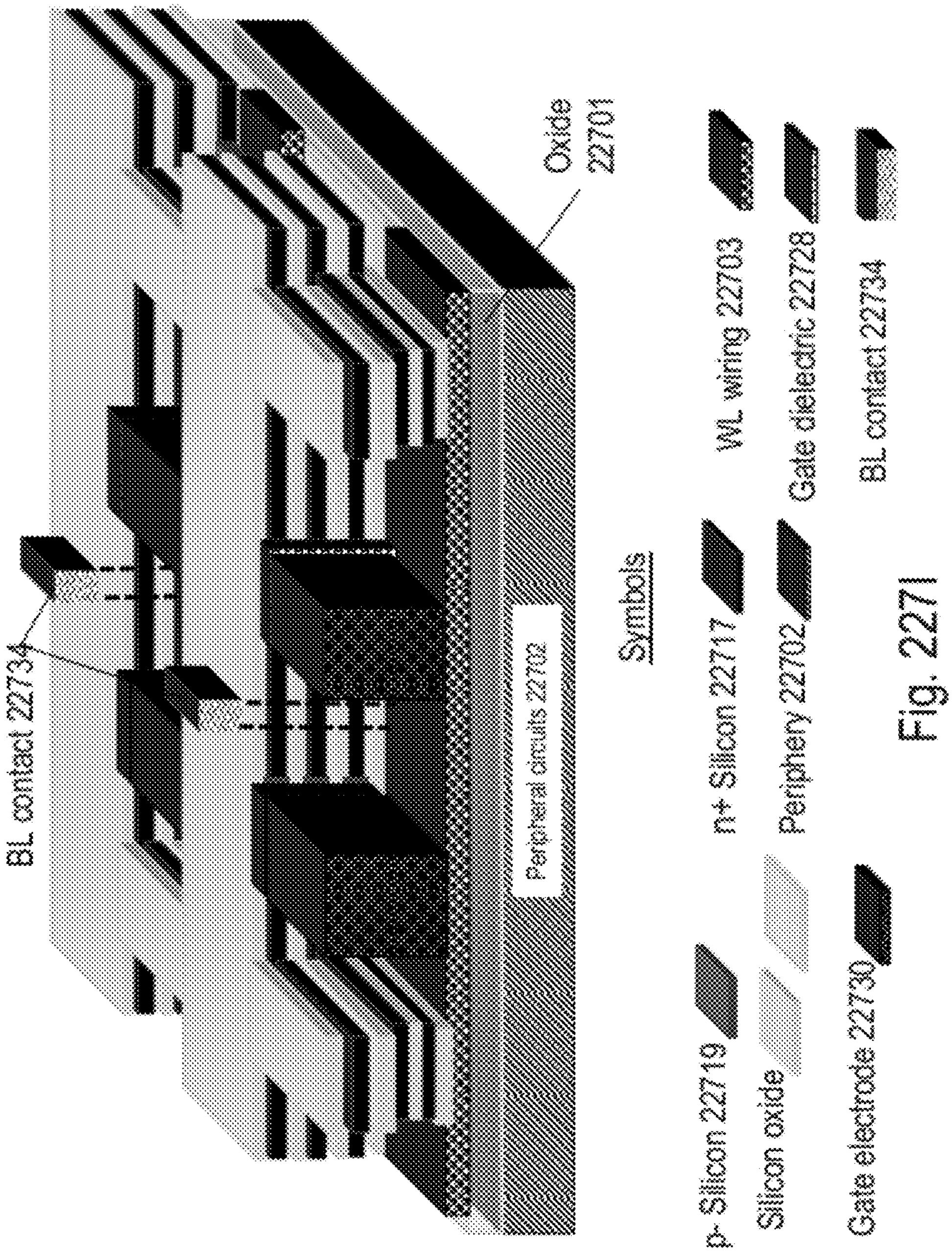

Step (I): FIG. 227I illustrates the structure after Step (I). Bit-line (BL) contacts 22734 may be formed by etching and deposition. These BL contacts may be shared among all layers of memory.

Figure 227J:
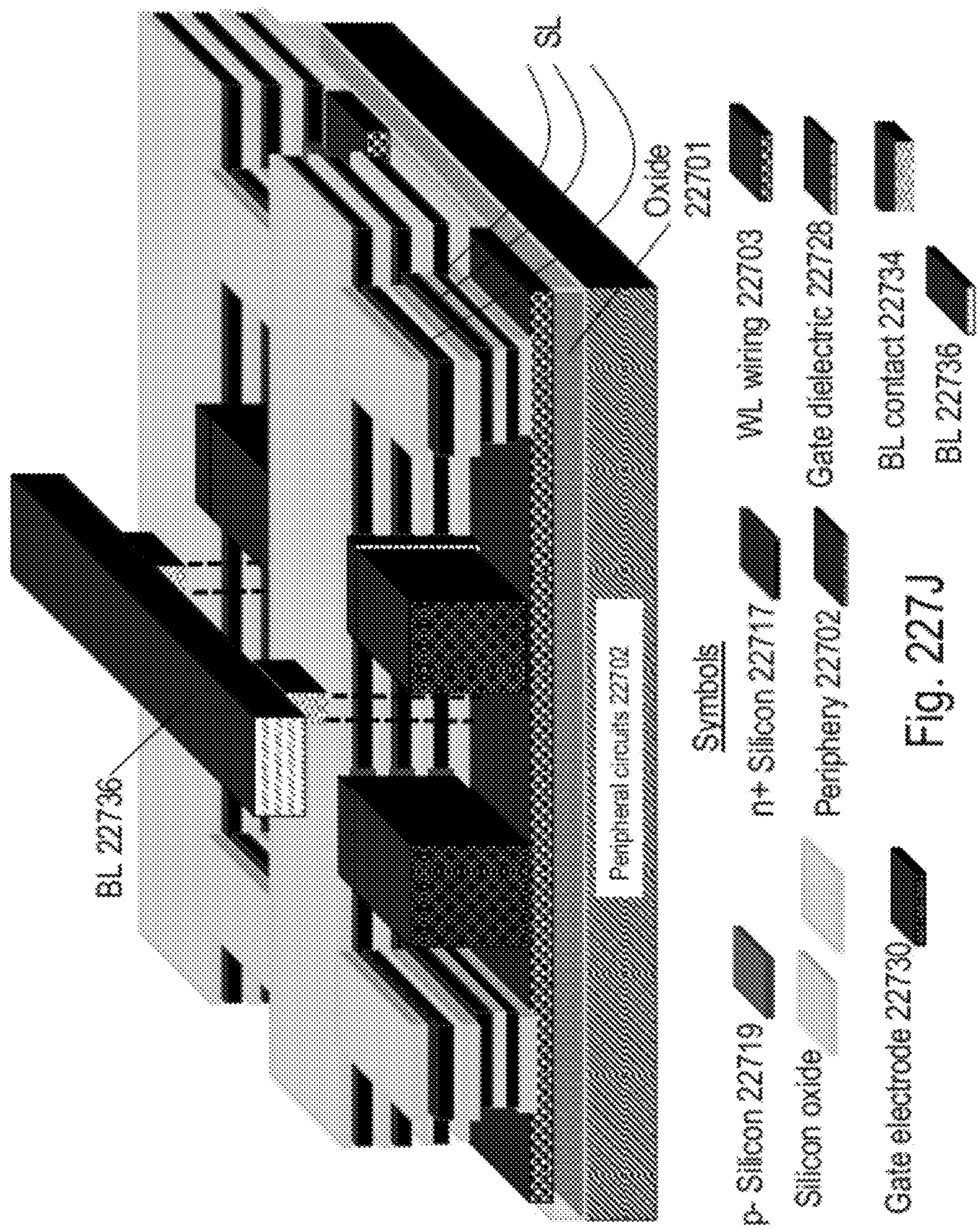

Step (J): FIG. 227J illustrates the structure after Step (J). Bit Lines (BLs) 22736 may be constructed. SL contacts (not shown) can be made into stair-like structures using techniques described in "Bit Cost Scalable Technology with Punch and Plug Process for Ultra High Density Flash Memory," *VLSI Technology,* 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be done in steps prior to Step (J) as well.

A floating-body DRAM has thus been constructed, with (1) horizontally-oriented transistors, (2) some of the memory cell control lines, e.g., source-lines SL, constructed of heavily doped silicon and embedded in the memory cell layer, (3) side gates simultaneously deposited over multiple memory layers and independently addressable, and (4) monocrystalline (or single-crystal) silicon layers obtained by layer transfer techniques such as ion-cut. WL wires 22703 need not be on the top layer of the peripheral circuits 22702, they may be integrated. WL wires 22703 may be constructed of another high temperature resistant material, such as NiCr.

Novel monolithic 3D memory technologies utilizing material resistance changes may be constructed in a similar manner. There may be many types of resistance-based memories including phase change memory, Metal Oxide memory, resistive RAM (RRAM), memristors, solid-electrolyte memory, ferroelectric RAM, MRAM, etc. Background information on these resistive-memory types may be given in "Overview of candidate device technologies for storage-class memory," *IBM Journal of Research and Development*, vol. 52, no. 4.5, pp. 449-464, July 2008 by Burr, G. W., et. al. The contents of this document are incorporated in this specification by reference.

As illustrated in FIGS. 101A to 101K, a resistance-based zero additional masking steps per memory layer 3D memory may be constructed that is suitable for 3D IC manufacturing. This 3D memory may utilize junction-less transistors and may have a resistance-based memory element in series with a select or access transistor.

Figure 101A:
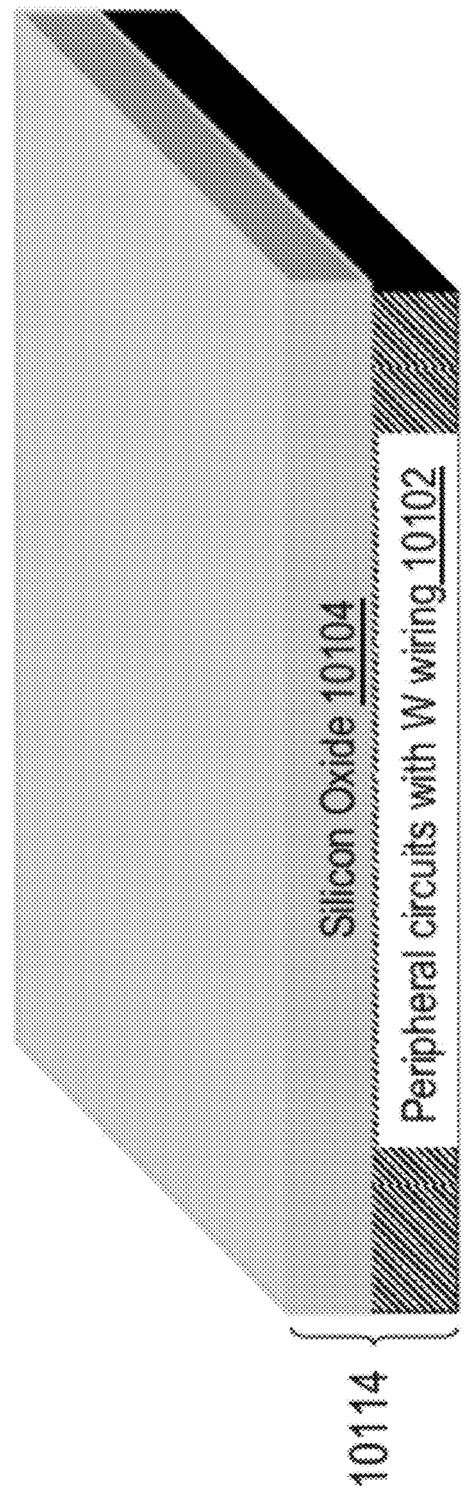

As illustrated in FIG. 101A, a silicon substrate with peripheral circuitry 10102 may be constructed with high temperature (greater than about 400° C.) resistant wiring, such as, for example, Tungsten. The peripheral circuitry substrate 10102 may include memory control circuits as well as circuitry for other purposes and of various types, such as, for example, analog, digital, RF, or memory. The peripheral circuitry substrate 10102 may include peripheral circuits that can withstand an additional rapid-thermal-anneal (RTA) and still remain operational and retain good performance. For this purpose, the peripheral circuits may be formed such that they have had a weak RTA or no RTA for activating dopants. The top surface of the peripheral circuitry substrate 10102 may be prepared for oxide wafer bonding with a deposition of a silicon oxide layer 10104, thus forming acceptor wafer 10114.

Figure 101B:
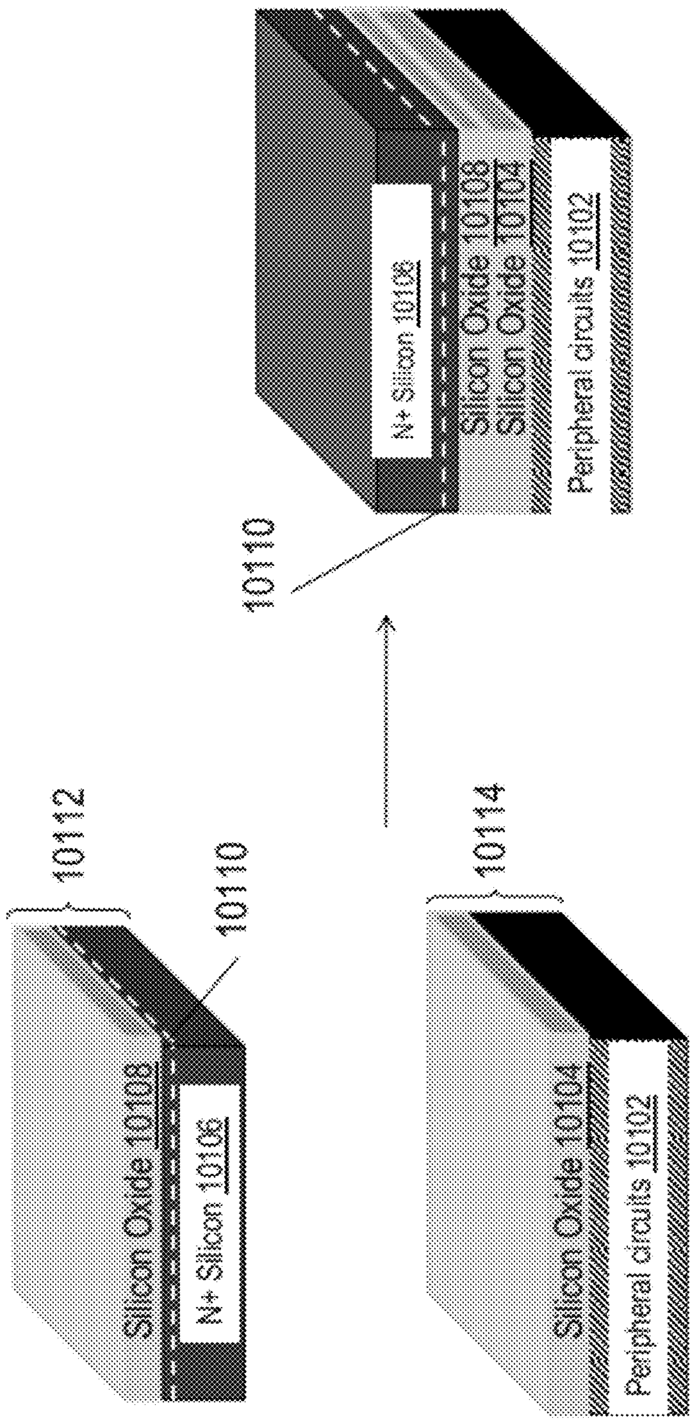

As illustrated in FIG. 101B, a mono-crystalline silicon donor wafer 10112 may be, for example, processed to include a wafer sized layer of N+ doping (not shown) which may have a different dopant concentration than the N+ substrate 10106. The N+ doping layer may be formed by ion implantation and thermal anneal. A screen oxide layer 10108 may be grown or deposited prior to the implant to protect the silicon from implant contamination and to provide an oxide surface for later wafer to wafer bonding. A layer transfer demarcation plane 10110 (shown as a dashed line) may be formed in donor wafer 10112 within the N+ substrate 10106 or the N+ doping layer (not shown) by hydrogen implantation or other methods as previously described. Both the donor wafer 10112 and acceptor wafer 10114 may be prepared for wafer bonding as previously described and then bonded at the surfaces of oxide layer 10104 and oxide layer 10108, at a low temperature (less than about 400° C.) suitable for lowest stresses, or a moderate temperature (less than about 900° C.).

Figure 101C:
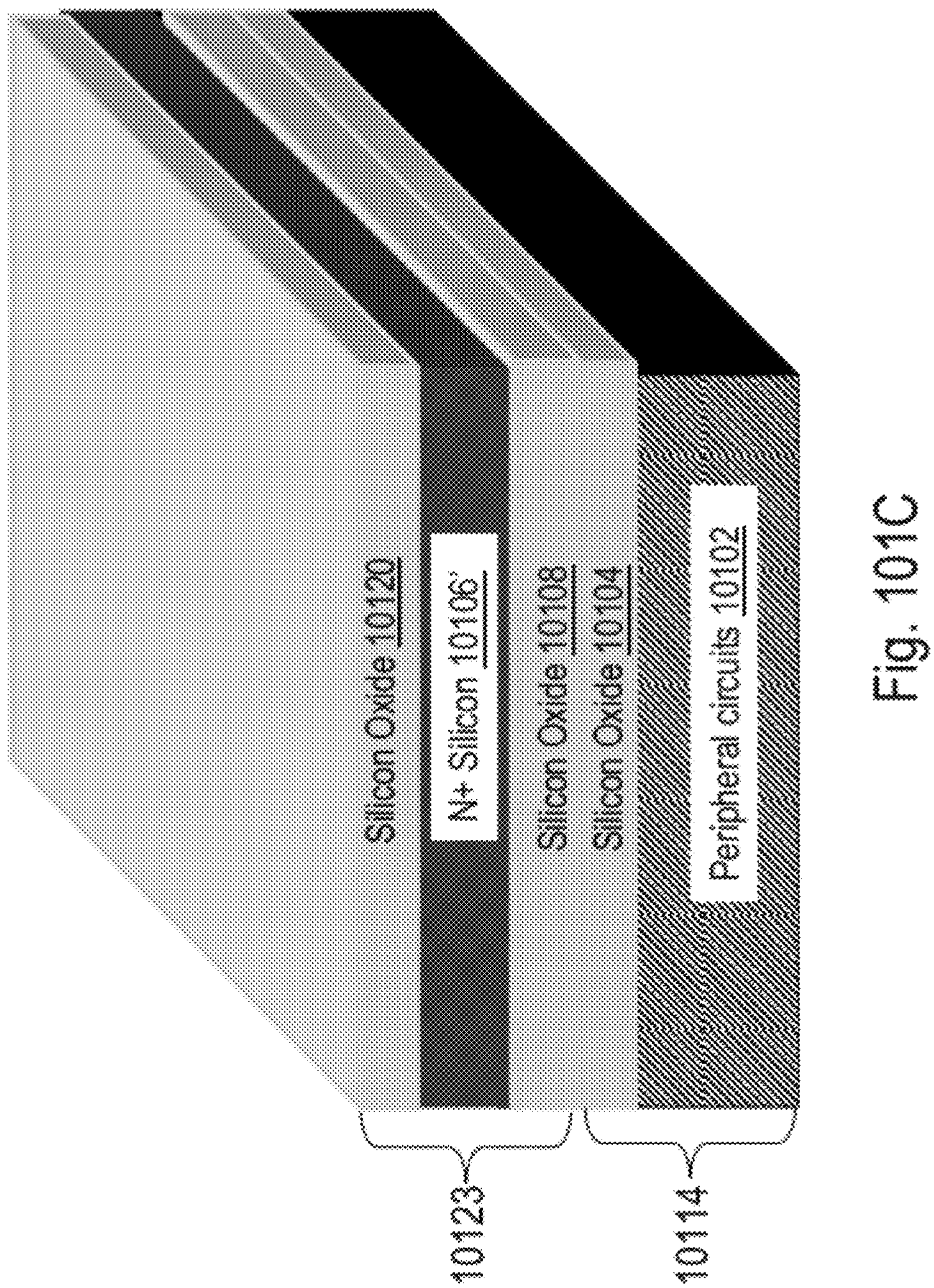

As illustrated in FIG. 101C, the portion of the N+ layer (not shown) and the N+ wafer substrate 10106 that are above the layer transfer demarcation plane 10110 may be removed by cleaving and polishing, or other processes as previously described, such as, for example, ion-cut or other methods, thus forming the remaining mono-crystalline silicon N+ layer 10106'. Remaining N+ layer 10106' and oxide layer 10108 may have been layer transferred to acceptor wafer 10114. The top surface of N+ layer 10106' may be chemically or mechanically polished smooth and flat. Now transistors or portions of transistors may be formed and aligned to the acceptor wafer 10114 alignment marks (not shown). Oxide layer 10120 may be deposited to prepare the surface for later oxide to oxide bonding, leading to the formation of the first Si/SiO2 layer 10123 that includes silicon oxide layer 10120, N+ silicon layer 10106', and oxide layer 10108.

Figure 101D:
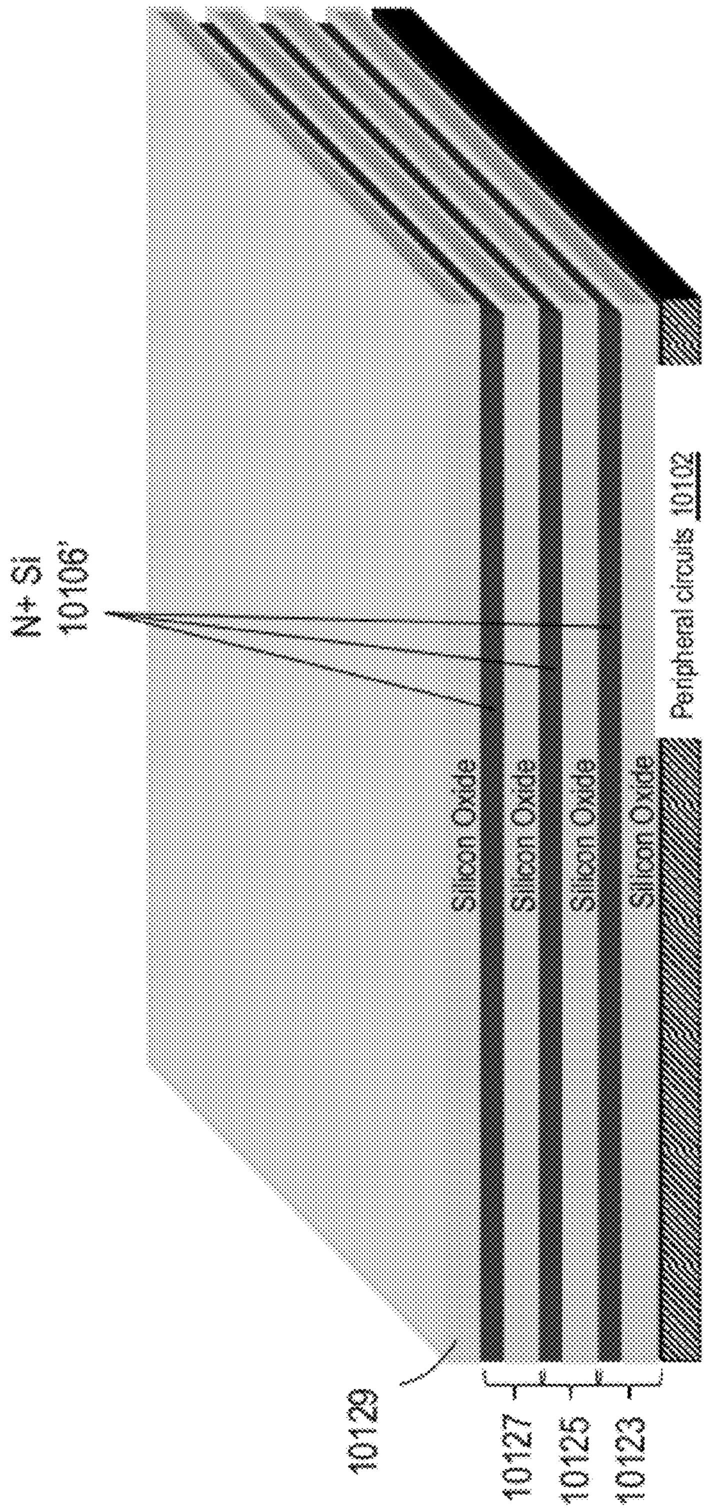

As illustrated in FIG. 101D, additional Si/SiO2 layers, such as, for example, second Si/SiO2 layer 10125 and third Si/SiO2 layer 10127, may each be formed as described in FIGS. 101A to 101C. Oxide layer 10129 may be deposited to electrically isolate the top N+ silicon layer.

Figure 101E:
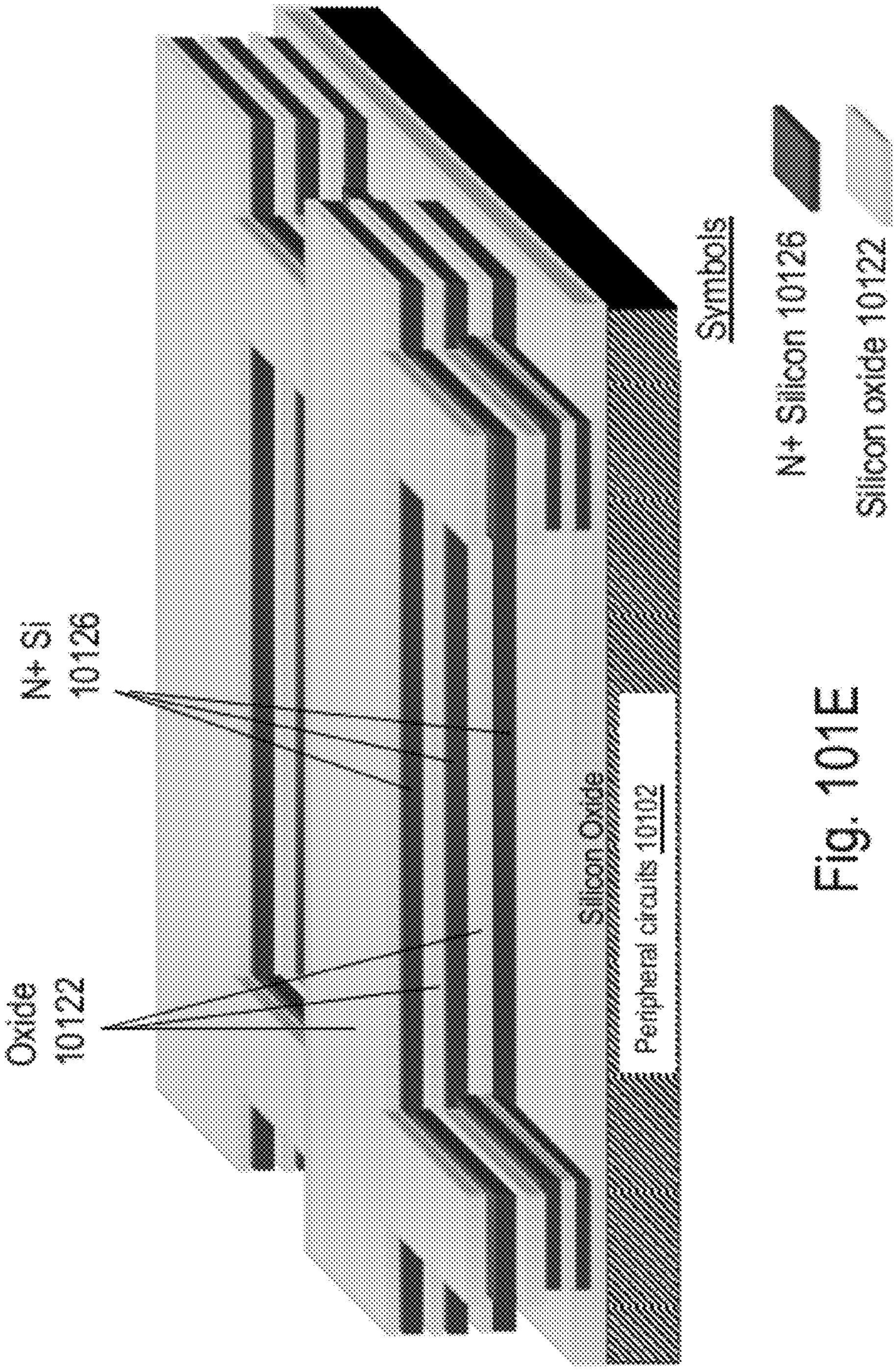

As illustrated in FIG. 101E, oxide layer 10129, third Si/SiO2 layer 10127, second Si/SiO2 layer 10125 and first Si/SiO2 layer 10123 may be lithographically defined and plasma/RIE etched to form a portion of the memory cell structure, which may now include regions of N+ silicon 10126 and oxide 10122. Thus, these transistor elements or portions may have been defined by a common lithography step, which also may be described as a single lithography step, same lithography step, or one lithography step.

Figure 101F:
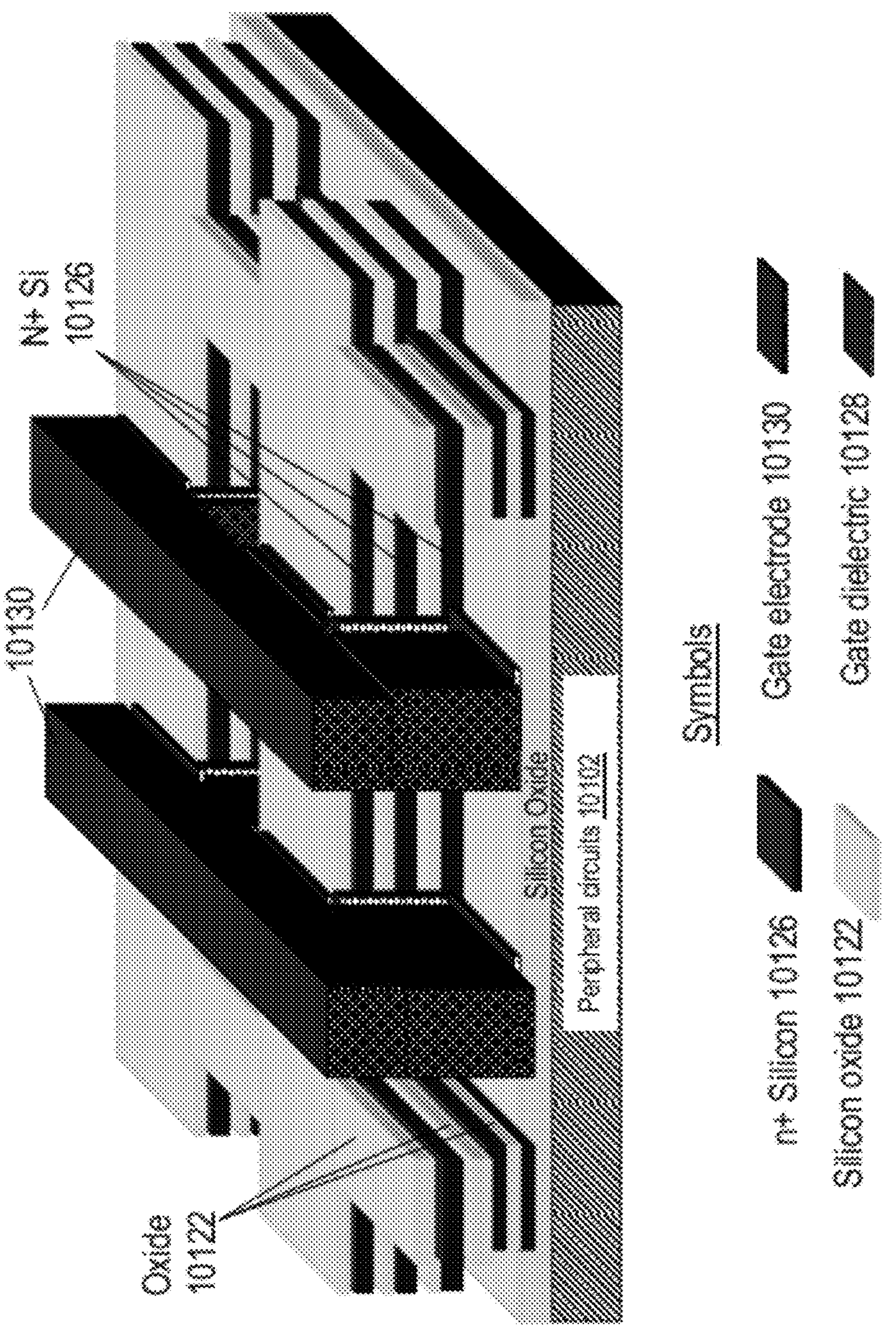

As illustrated in FIG. 101F, a gate dielectric and gate electrode material may be deposited, planarized with a chemical mechanical polish (CMP), and may then be lithographically defined and plasma/RIE etched to form gate dielectric regions 10128 which may either be self-aligned to and covered by gate electrodes 10130 (shown), or cover the entire N+ silicon 10126 and oxide 10122 multi-layer structure. The gate stack including gate electrode 10130 and gate dielectric 10128 may be formed with a gate dielectric, such as, for example, thermal oxide, and a gate electrode material, such as, for example, poly-crystalline silicon. Alternatively, the gate dielectric may be an atomic layer deposited (ALD) material that may be paired with a work function specific gate metal according to industry standard high k metal gate process schemes described previously. Moreover, the gate dielectric may be formed with a rapid thermal oxidation (RTO), a low temperature oxide deposition or low temperature microwave plasma oxidation of the silicon surfaces and then a gate electrode such as, for example, tungsten or aluminum may be deposited.

Figure 101G:
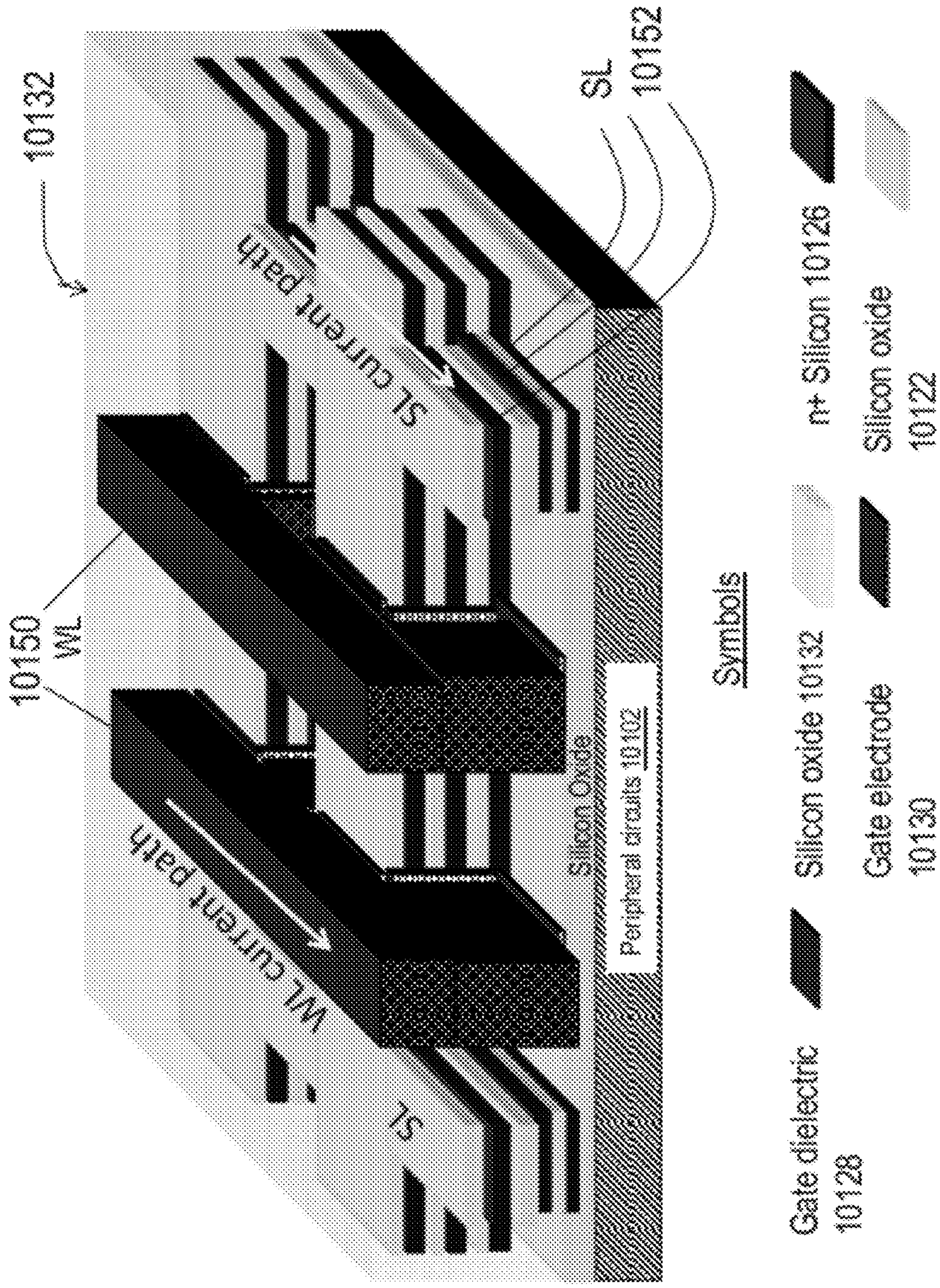

As illustrated in FIG. 101G, the entire structure may be covered with a gap fill oxide 10132, which may be planarized with chemical mechanical polishing. The oxide 10132 is shown transparent in the figure for clarity in illustration. Also shown are word-line regions (WL) 10150, coupled with and composed of gate electrodes 10130, and source-line regions (SL) 10152, composed of N+ silicon regions 10126.

Figure 101H:
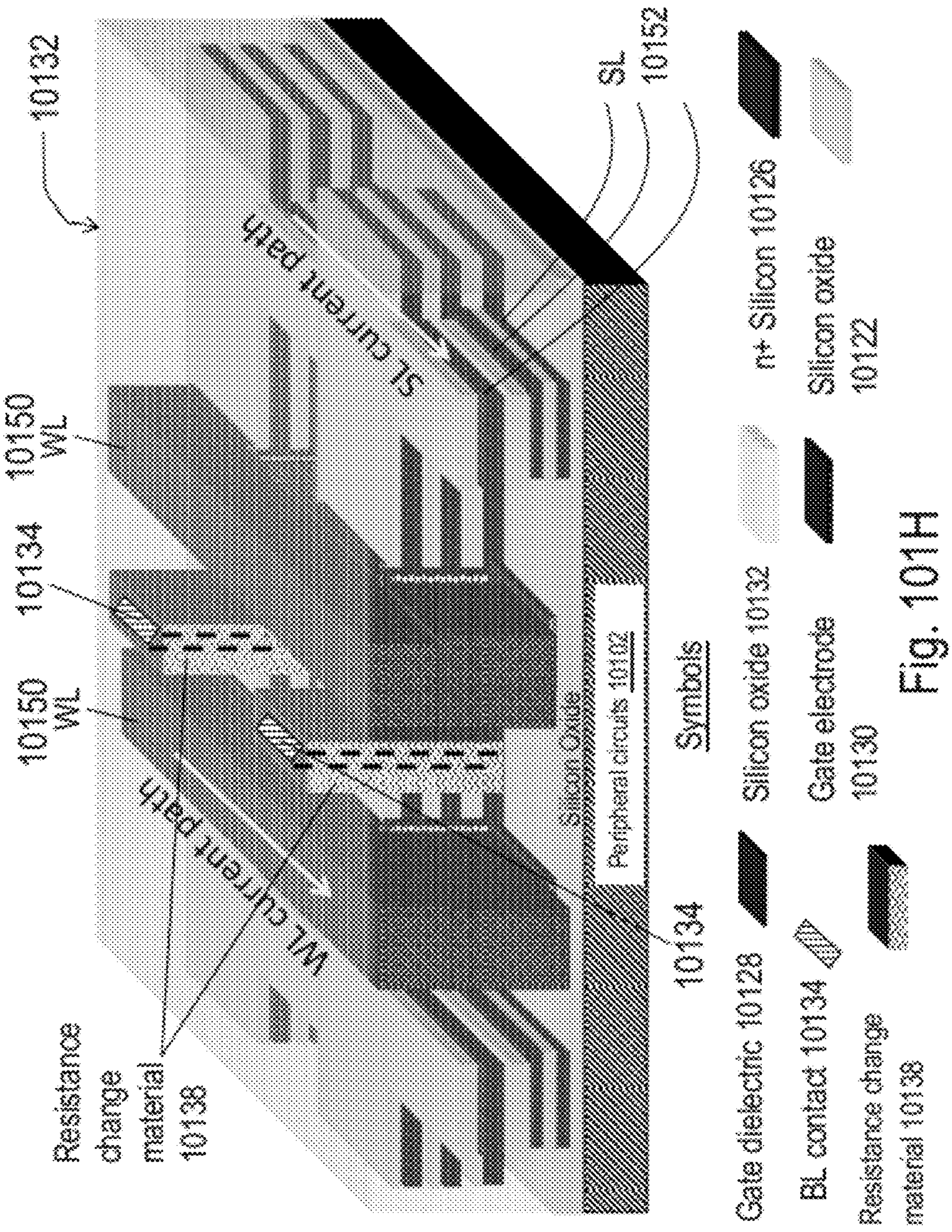

As illustrated in FIG. 101H, bit-line (BL) contacts 10134 may be lithographically defined, etched along with plasma/RIE through oxide 10132, the three N+ silicon regions 10126, and associated oxide vertical isolation regions to connect all memory layers vertically. BL contacts 10134 may then be processed by a photoresist removal. Resistive change material 10138, such as, for example, hafnium oxide, may then be deposited, for example, with atomic layer deposition (ALD). The electrode for the resistance change memory element may then be deposited by ALD to form the electrode/BL contact 10134. The excess deposited material may be polished to planarity at or below the top of oxide 10132. Each BL contact 10134 with resistive change material 10138 may be shared among substantially all layers of memory, shown as three layers of memory in FIG. 101H.

Figure 101I:
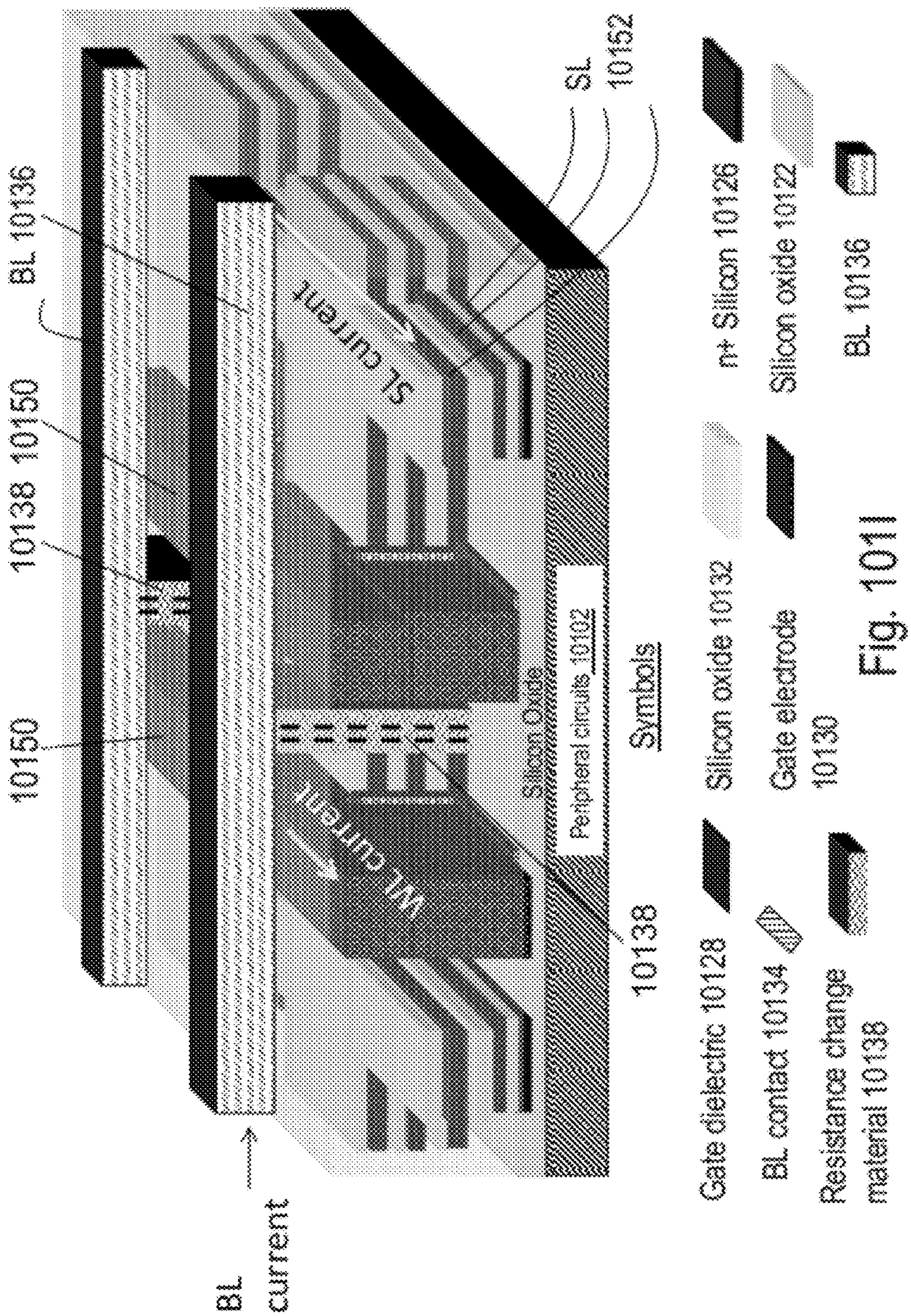

As illustrated in FIG. 101I, BL metal lines 10136 may be formed and may connect to the associated BL contacts 10134 with resistive change material 10138. Contacts and associated metal interconnect lines (not shown) may be formed for the WL and SL at the memory array edges. A through layer via (not shown) may be formed to electrically couple the BL, SL, and WL metallization to the acceptor wafer 10114 peripheral circuitry via an acceptor wafer metal connect pad (not shown).

Figure 101J:
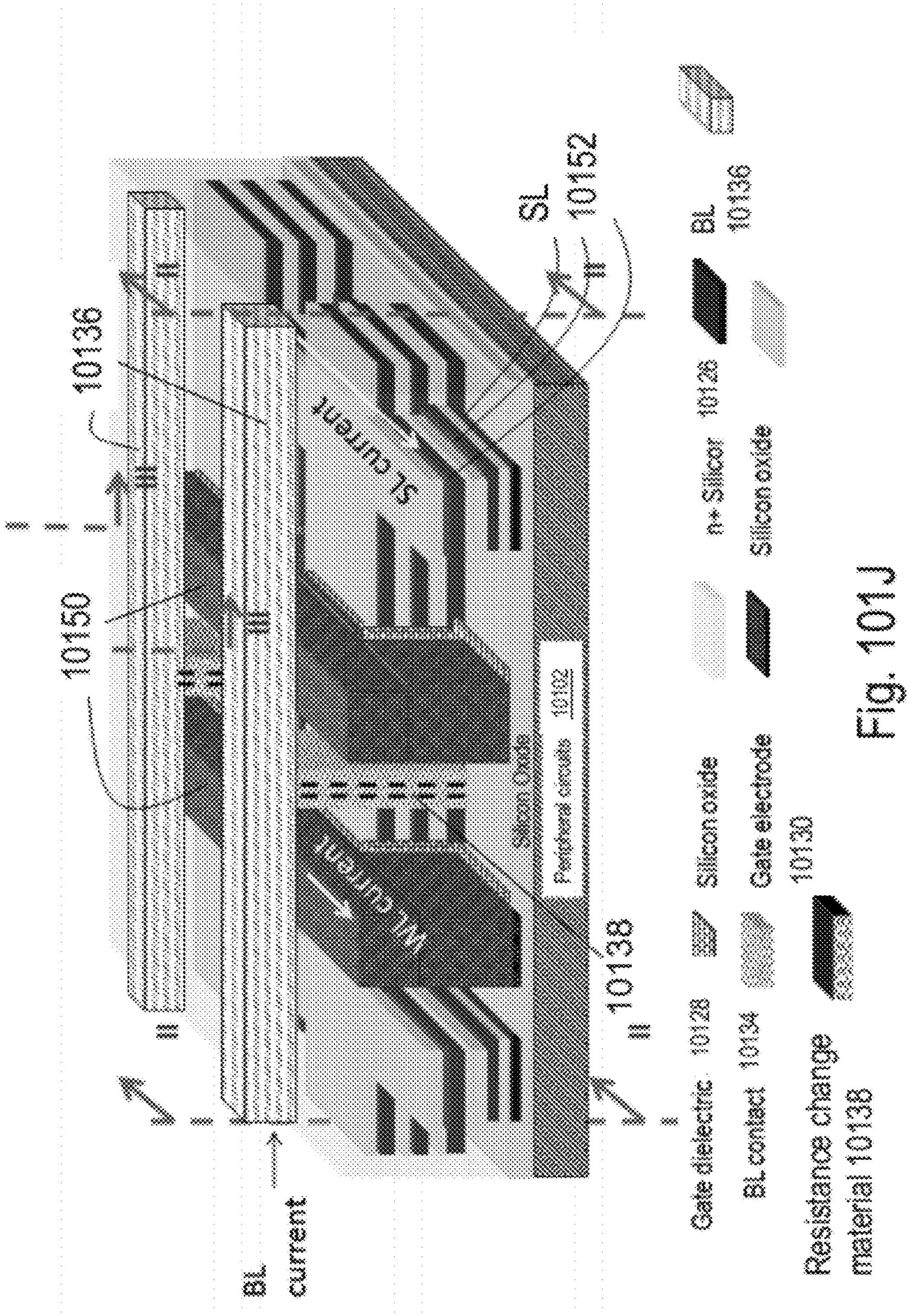

FIG. 101J1 shows a cross sectional cut II of FIG. 101J, while FIG. 101J2 shows a cross-sectional cut III of FIG. 101J. FIG. 101J1 shows BL metal line 10136, oxide 10132, BL contact/electrode 10134, resistive change material 10138, WL regions 10150, gate dielectric 10128, N+ silicon regions 10126, and peripheral circuitry substrate 10102. The BL contact/electrode 10134 may couple to one side of the three levels of resistive change material 10138. The other side of the resistive change material 10138 may be coupled to N+ regions 10126. FIG. 101J2 shows BL metal lines 10136, oxide 10132, gate electrode 10130, gate dielectric 10128, N+ silicon regions 10126, interlayer oxide region ('ox'), and peripheral circuitry substrate 10102. The gate electrode 10130 may be common to substantially all six N+ silicon regions 10126 and may form six two-sided gated junction-less transistors as memory select transistors.

Figure 101K:
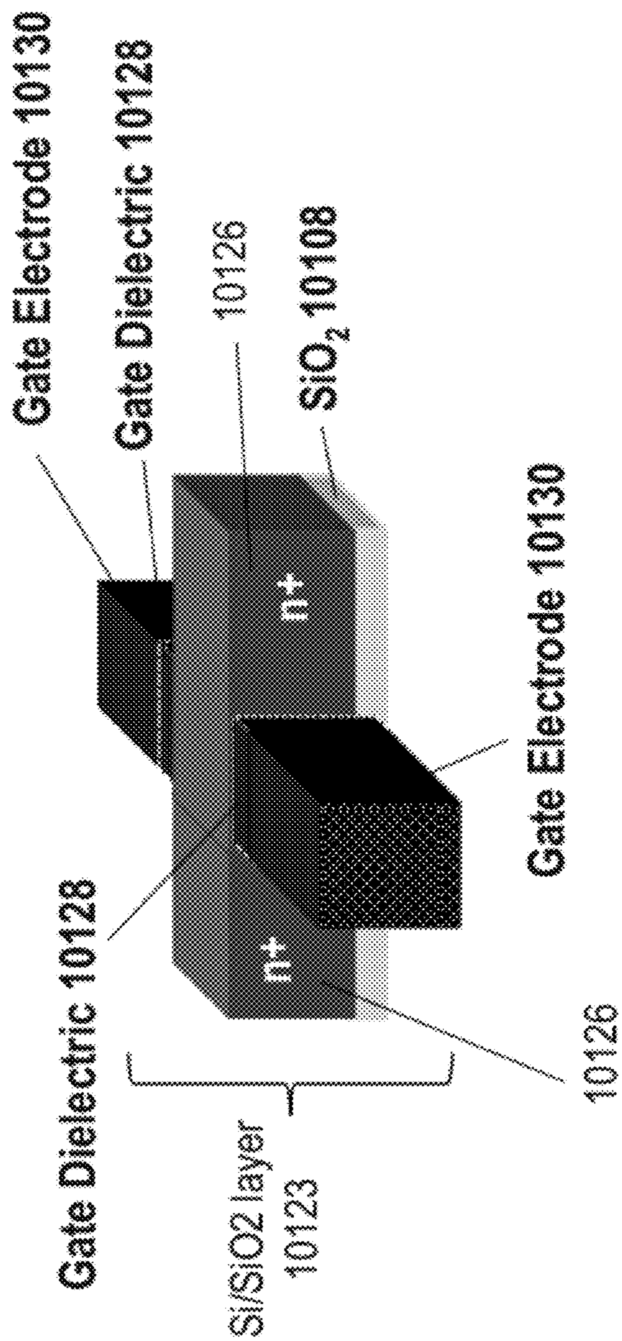

As illustrated in FIG. 101K, a single exemplary two-sided gate junction-less transistor on the first Si/SiO2 layer 10123 may include N+ silicon region 10126 (functioning as the source, drain, and transistor channel), and two gate electrodes 10130 with associated gate dielectrics 10128. The transistor may be electrically isolated from beneath by oxide layer 10108.

This flow may enable the formation of a resistance-based multi-layer or 3D memory array with zero additional masking steps per memory layer, which may utilize junction-less transistors and may have a resistance-based memory element in series with a select transistor, and may be constructed by layer transfers of wafer sized doped mono-crystalline silicon layers, and this 3D memory array may be connected to an underlying multi-metal layer semiconductor device.

Persons of ordinary skill in the art will appreciate that the illustrations in FIGS. 101A through 101K are exemplary only and are not drawn to scale. Such skilled persons will further appreciate that many variations may be possible such as, for example, the transistors may be of another type such as RCATs. Additionally, doping of each N+ layer may be slightly different to compensate for interconnect resistances. Moreover, the stacked memory layer may be connected to a periphery circuit that may be above the memory stack. Further, each gate of the double gate 3D resistance based memory can be independently controlled for better control of the memory cell. Many other modifications within the scope of the illustrated embodiments of the invention will suggest themselves to such skilled persons after reading this specification. Thus the invention is to be limited only by the appended claims.

FIG. 192A-M illustrates an embodiment of the invention, wherein a horizontally-oriented monolithic 3D resistive memory array may be constructed and may have a resistive memory element in series with a transistor selector wherein one electrode may be selectively silicided. No mask may be utilized on a "per-memory-layer" basis for the monolithic 3D resistive memory shown in FIG. 192A-M, and substantially all other masks may be shared among different layers. The process flow may include the following steps which may be in sequence from Step (A) to Step (K). When the same reference numbers are used in different drawing figures (among FIG. 192A-M), the reference numbers may be used to indicate analogous, similar or identical structures to enhance the understanding of the invention by clarifying the relationships between the structures and embodiments presented in the various diagrams—particularly in relating analogous, similar or identical functionality to different physical structures.

Figure 192A:
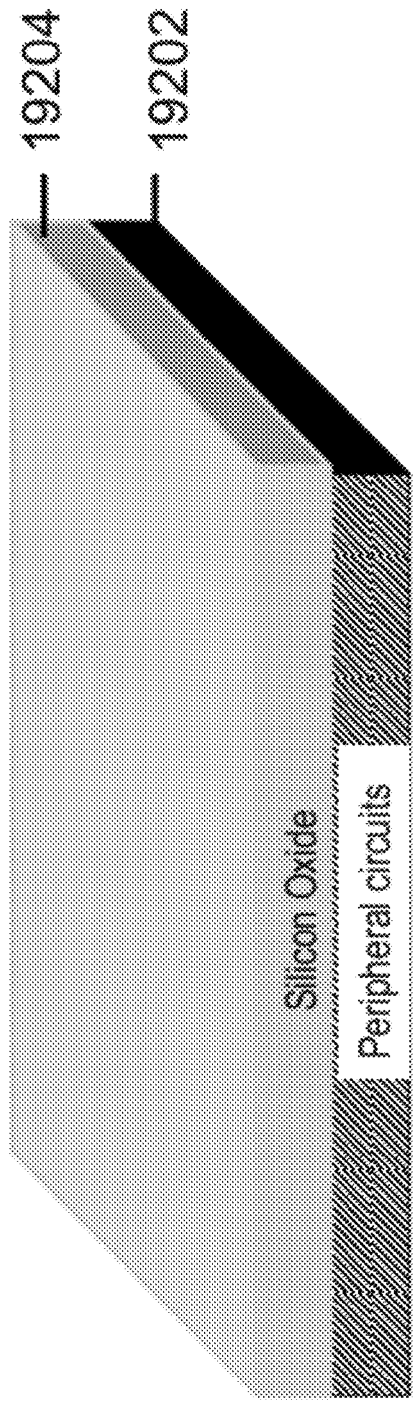

Step (A): Peripheral circuits 19202 may be constructed on a monocrystalline silicon substrate and may include high temperature (greater than about 400° C.) resistant wiring, such as, for example, tungsten. The peripheral circuits 19202 may include memory control circuits as well as circuitry for other purposes and of various types, such as, for example, analog, digital, RF, or memory. The peripheral circuits 19202 may include peripheral circuits that can withstand an additional rapid-thermal-anneal (RTA) and still remain operational and retain good performance. For this purpose, the peripheral circuits may be formed such that they have had a weak RTA or no RTA for activating dopants. The top surface of the peripheral circuits 19202 may be prepared for oxide wafer bonding with a deposition of a silicon oxide layer 19204, thus forming bottom wafer or substrate 19214. FIG. 192A shows a drawing illustration after Step (A).

Figure 192B:
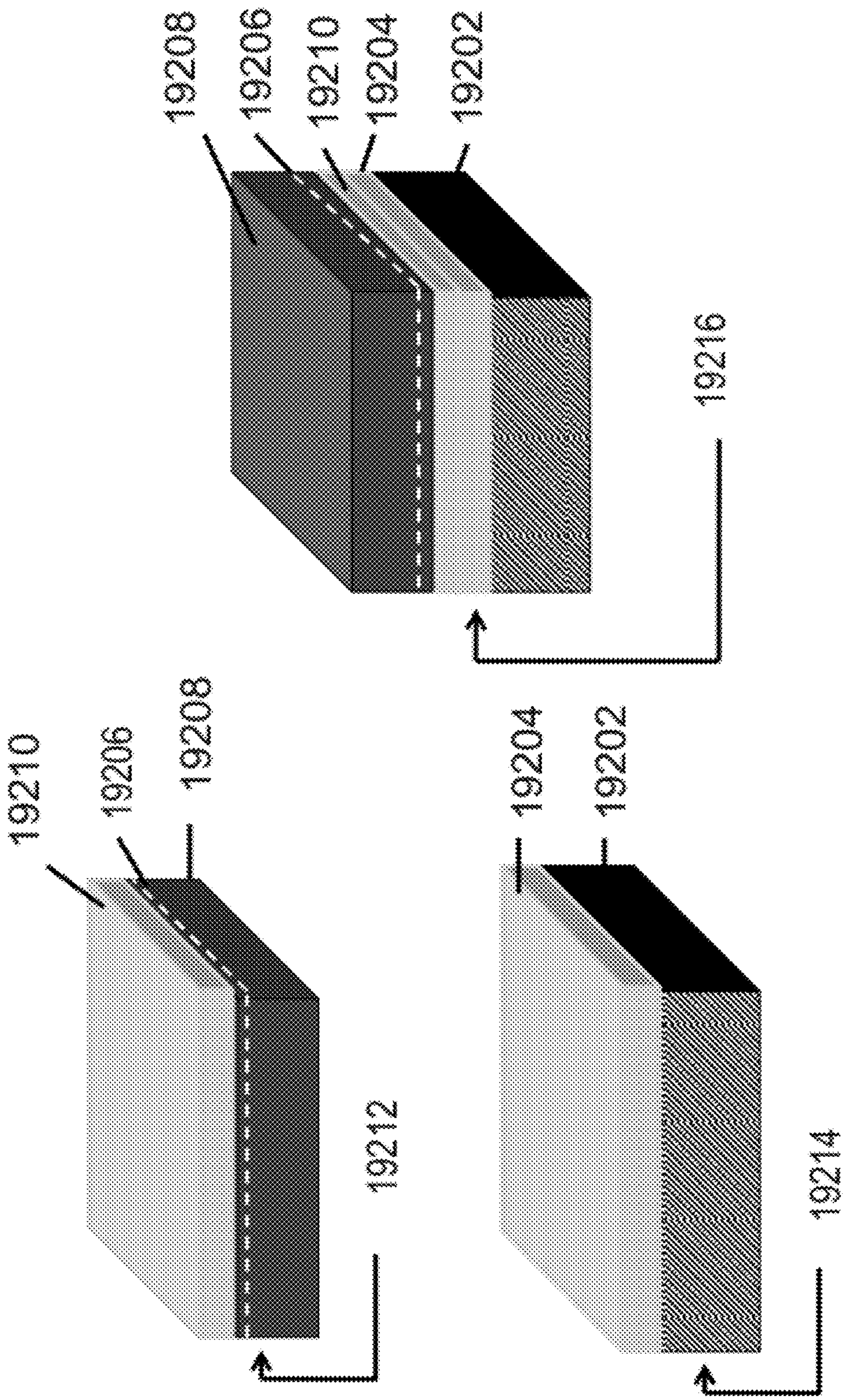

Step (B): FIG. 192B illustrates the structure after Step (B). N+ Silicon wafer 19208 may have an oxide layer 19210 grown or deposited above it. Hydrogen may be implanted into the n+ Silicon wafer 19208 to a certain depth indicated by hydrogen plane 19206. Alternatively, some other atomic species, such as Helium, may be (co-)implanted. Thus, top layer 19212 may be formed. The bottom wafer or substrate 19214 may include the peripheral circuits 19202 with oxide layer 19204. The top layer 19212 may be flipped and bonded to the bottom wafer or substrate 19214 using oxide-to-oxide bonding to form top and bottom stack 19216.

Figure 192C:
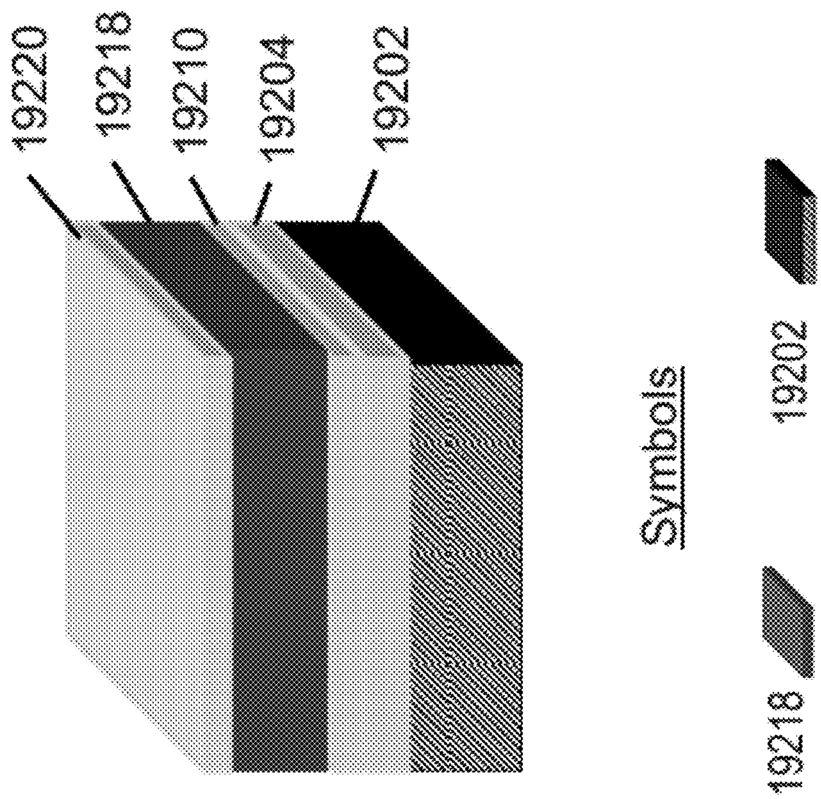

Step (C): FIG. 192C illustrates the structure after Step (C). The top and bottom stack 19216 may be cleaved substantially at the hydrogen plane 19206 using methods including, for example, a thermal anneal or a sideways mechanical force. A CMP process may be conducted. Thus n+ Silicon layer 19218 may be formed. A layer of silicon oxide 19220 may be deposited atop the n+ Silicon layer 19218. At the end of this step, a single-crystal n+ Silicon layer 19218 may exist atop the peripheral circuits 19202, and this has been achieved using layer-transfer techniques.

Figure 192D:
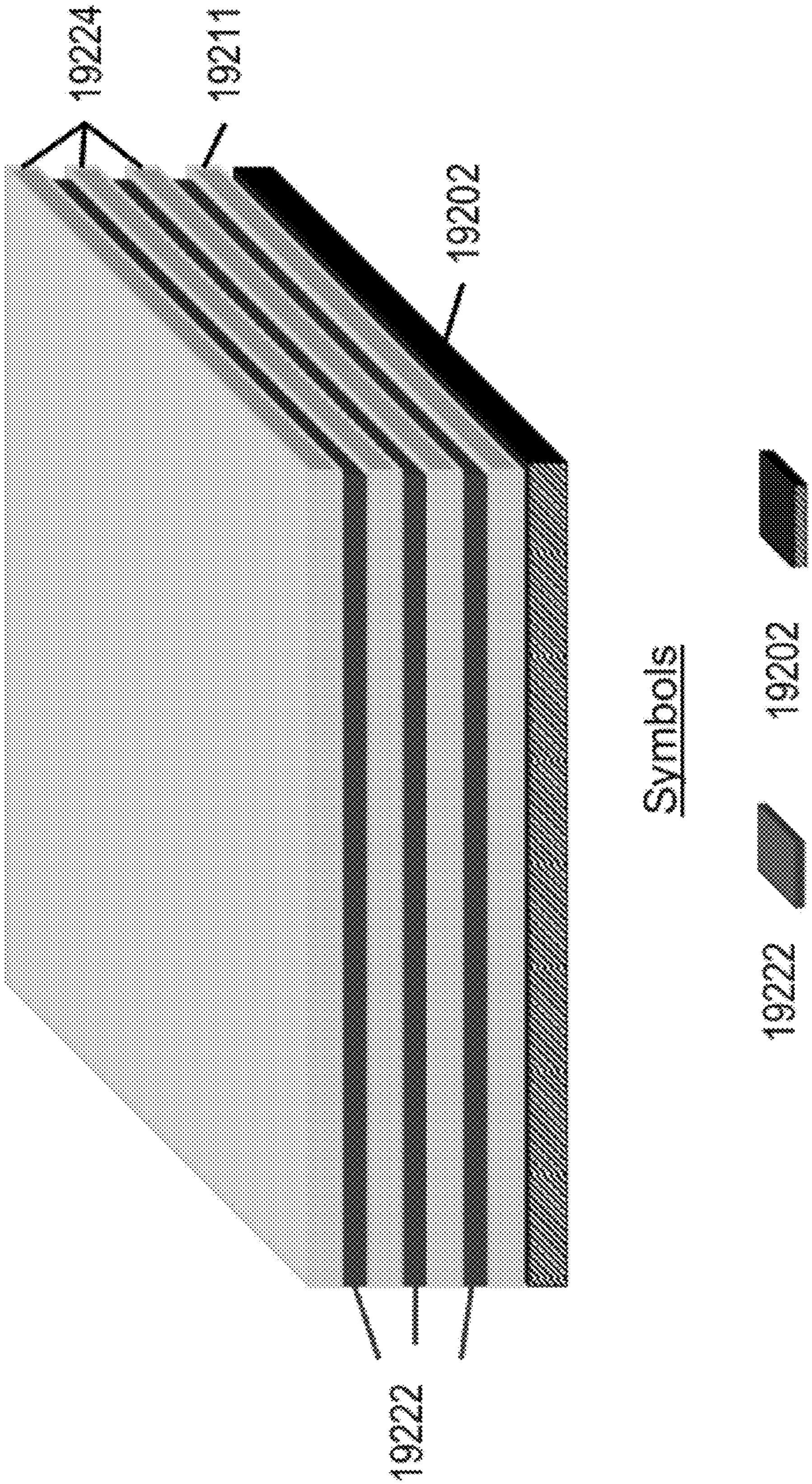

Step (D): FIG. 192D illustrates the structure after Step (D). Using methods similar to Step (B) and (C), multiple n+ silicon layers 19222 (now including n+ Silicon layer 19218) may be formed with associated silicon oxide layers 19224. Oxide layer 19204 and oxide layer 19210, which were previously oxide-oxide bonded, are now illustrated as oxide layer 19211.

Figure 192E:
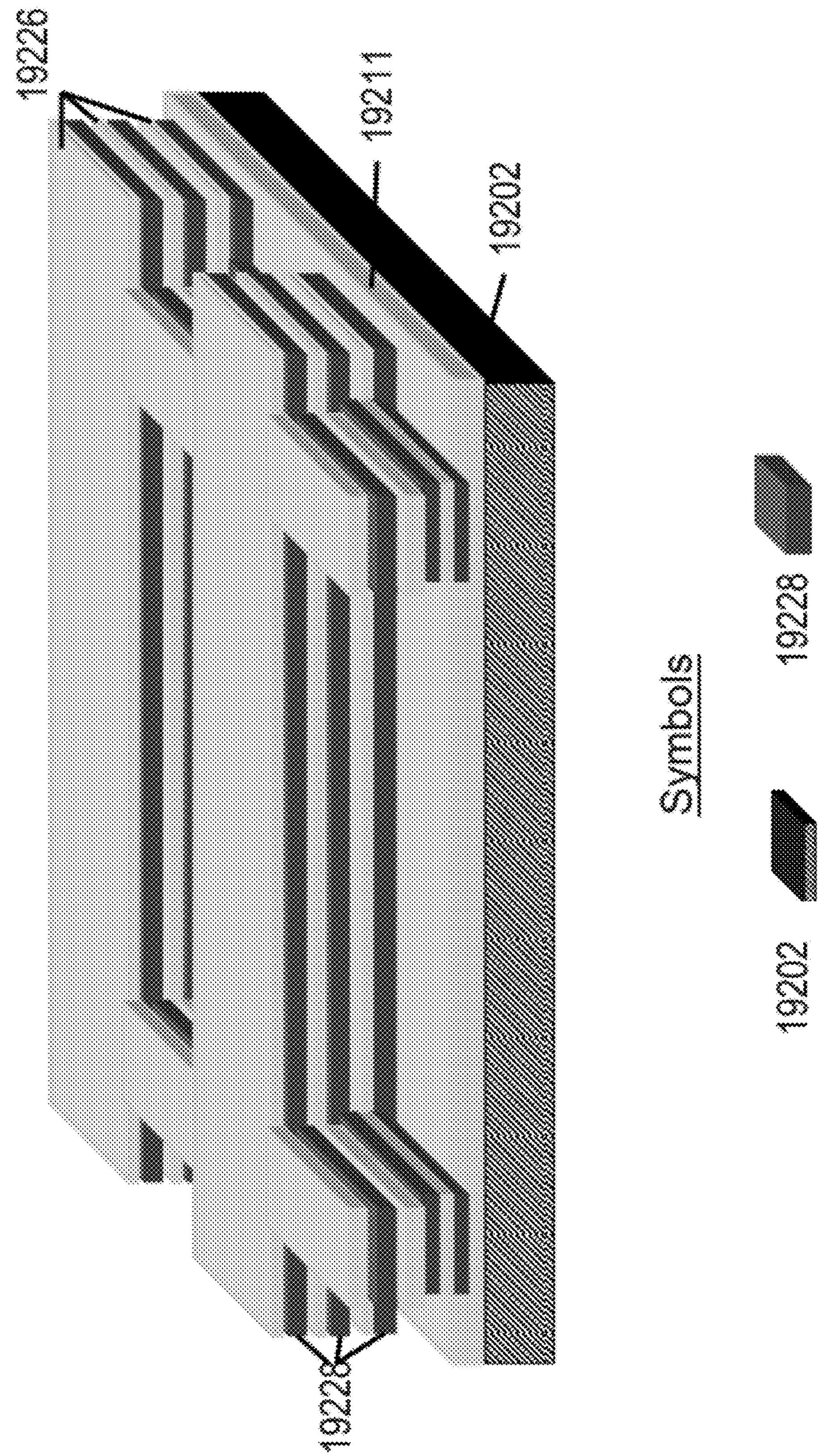

Step (E): FIG. 192E illustrates the structure after Step (E). Lithography and etch processes may then be utilized to make a structure as shown in the figure. The etch of multiple n+ silicon layers 19222 and associated silicon oxide layers 19224 may stop on oxide layer 19211 (shown), or may extend into and etch a portion of oxide layer 19211 (not shown). Thus exemplary patterned oxide regions 19226 and patterned n+ silicon regions 19228 may be formed. Thus, these transistor elements or portions may have been defined by a common lithography step, which also may be described as a single lithography step, same lithography step, or one lithography step.

Figure 192F:
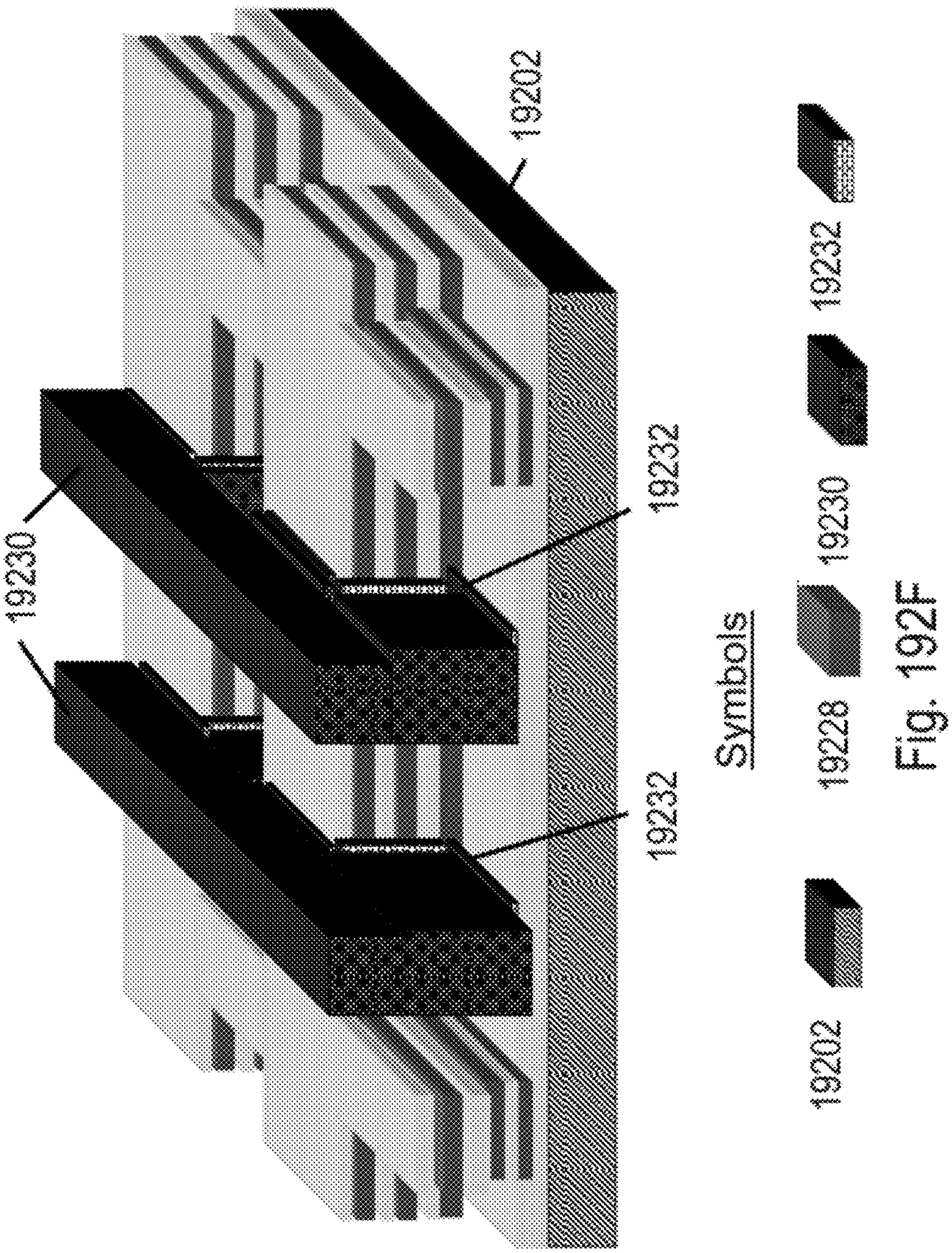

Step (F): FIG. 192F illustrates the structure after Step (F). A gate dielectric, such as, for example, silicon dioxide or hafnium oxides, and gate electrode, such as, for example, doped amorphous silicon or TiAlN, may be deposited and a CMP may be done to planarize the gate stack layers. Lithography and etch may be utilized to define the gate regions, thus gate dielectric regions 19232 and gate electrode regions 19230 may be formed.

Figure 192G:
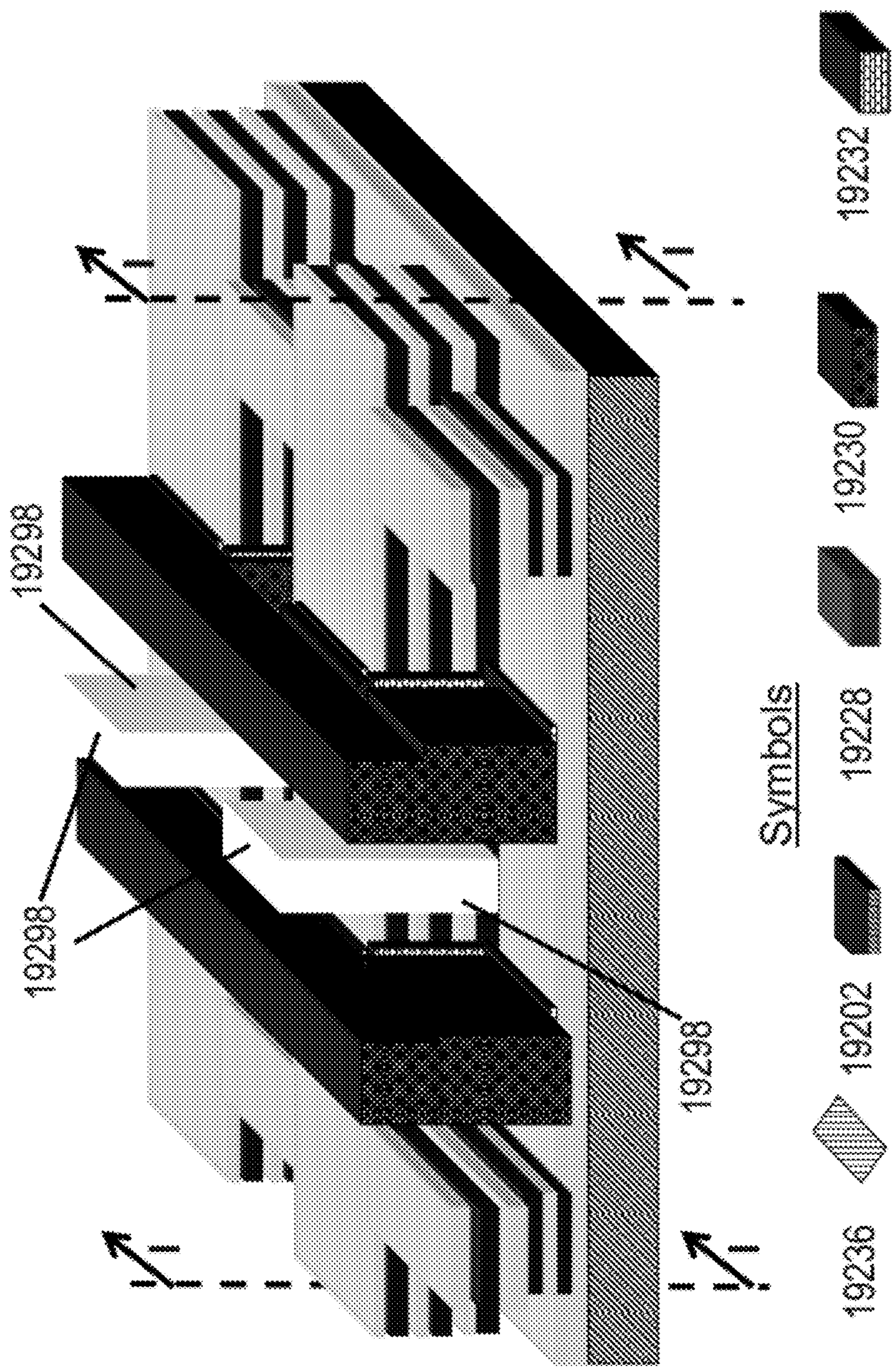
Figure 192H:
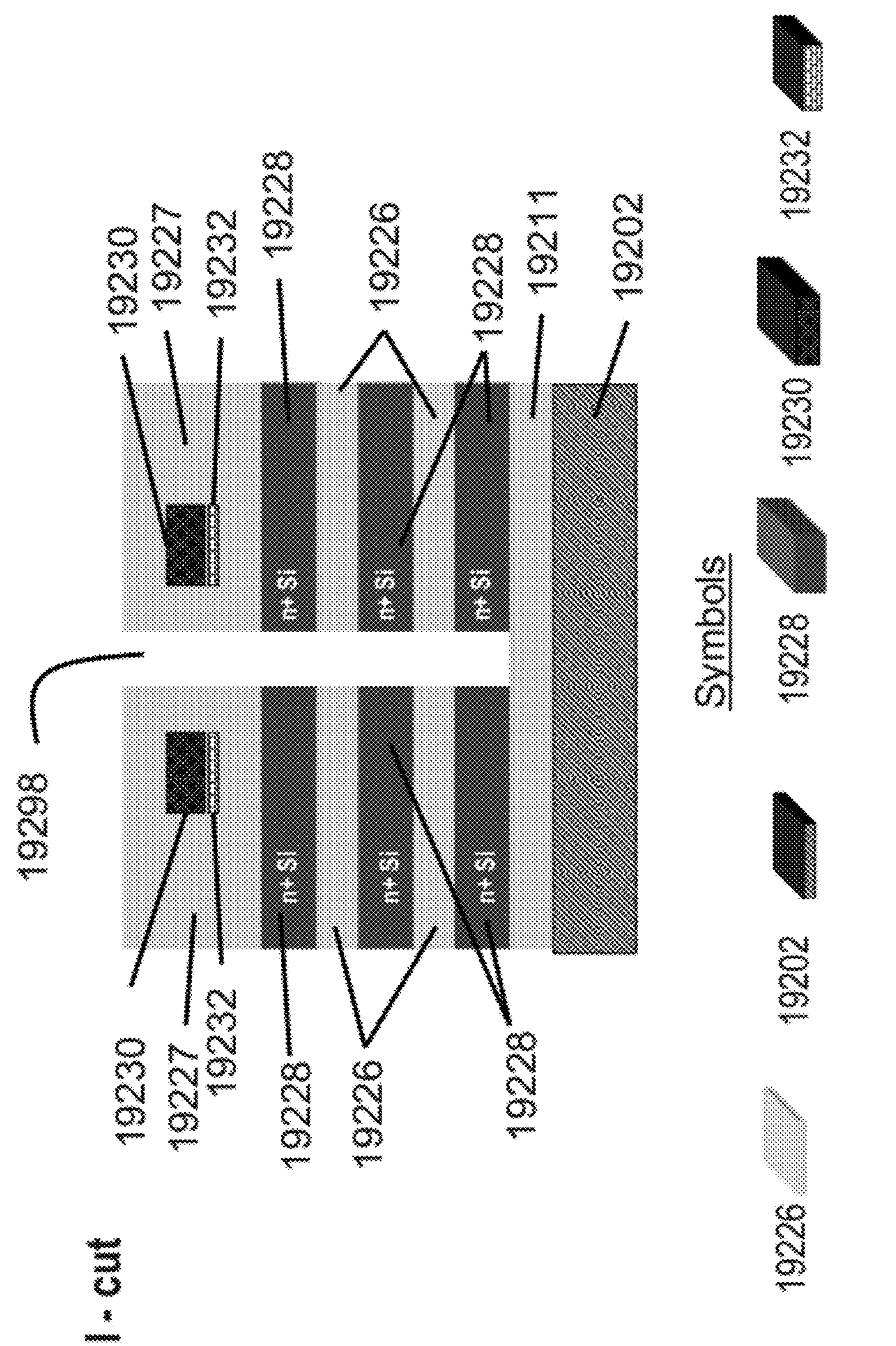

Step (G): FIG. 192G illustrates the structure after Step (G). The entire structure may be covered with a gap fill oxide 19227, which may be planarized with chemical mechanical polishing. The oxide 19227 is shown transparent in the figure for clarity in illustration. A trench 19298, for example two of which may be placed as shown in FIG. 192G, may be formed by lithography, etch and clean processes. FIG. 192H shows a cross-sectional view of FIG. 192G along the I plane, which may include trench 19298, oxide 19227, gate dielectric regions 19232, gate electrode regions 19230, patterned oxide regions 19226, patterned n+ silicon regions 19228, oxide layer 19211, and peripheral circuits 19202.

Figure 192I:
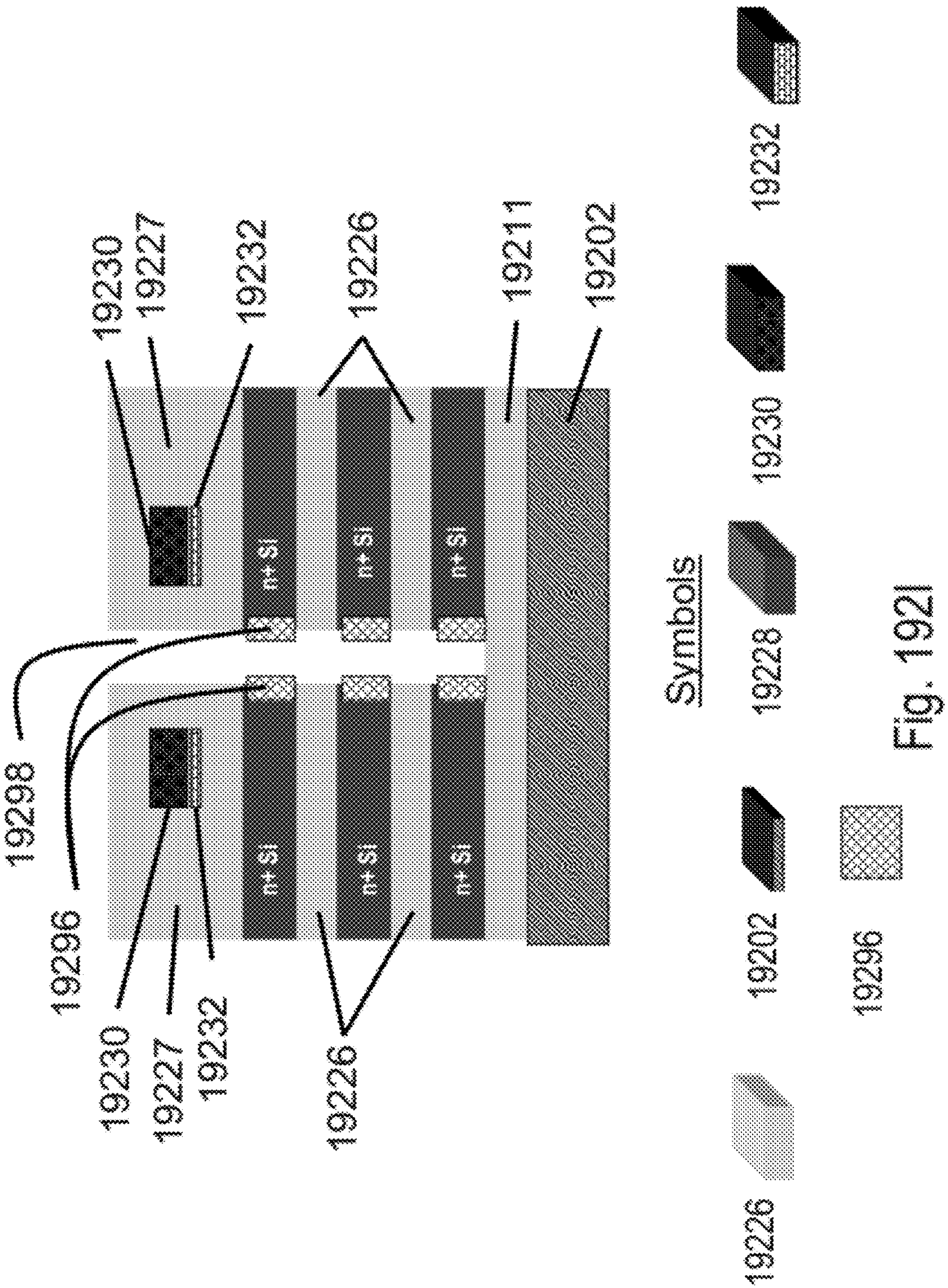

Step (H): FIG. 192I illustrates the structure after Step (H). Using a selective metal process, such as, for example, a selective tungsten process, metal regions 19296 may be formed. Alternatively, a silicidation process may be carried out to form a metal silicide selectively in metal regions 19296. Alternatively, any other selective metal formation or deposition process may be utilized.

Figure 192J:
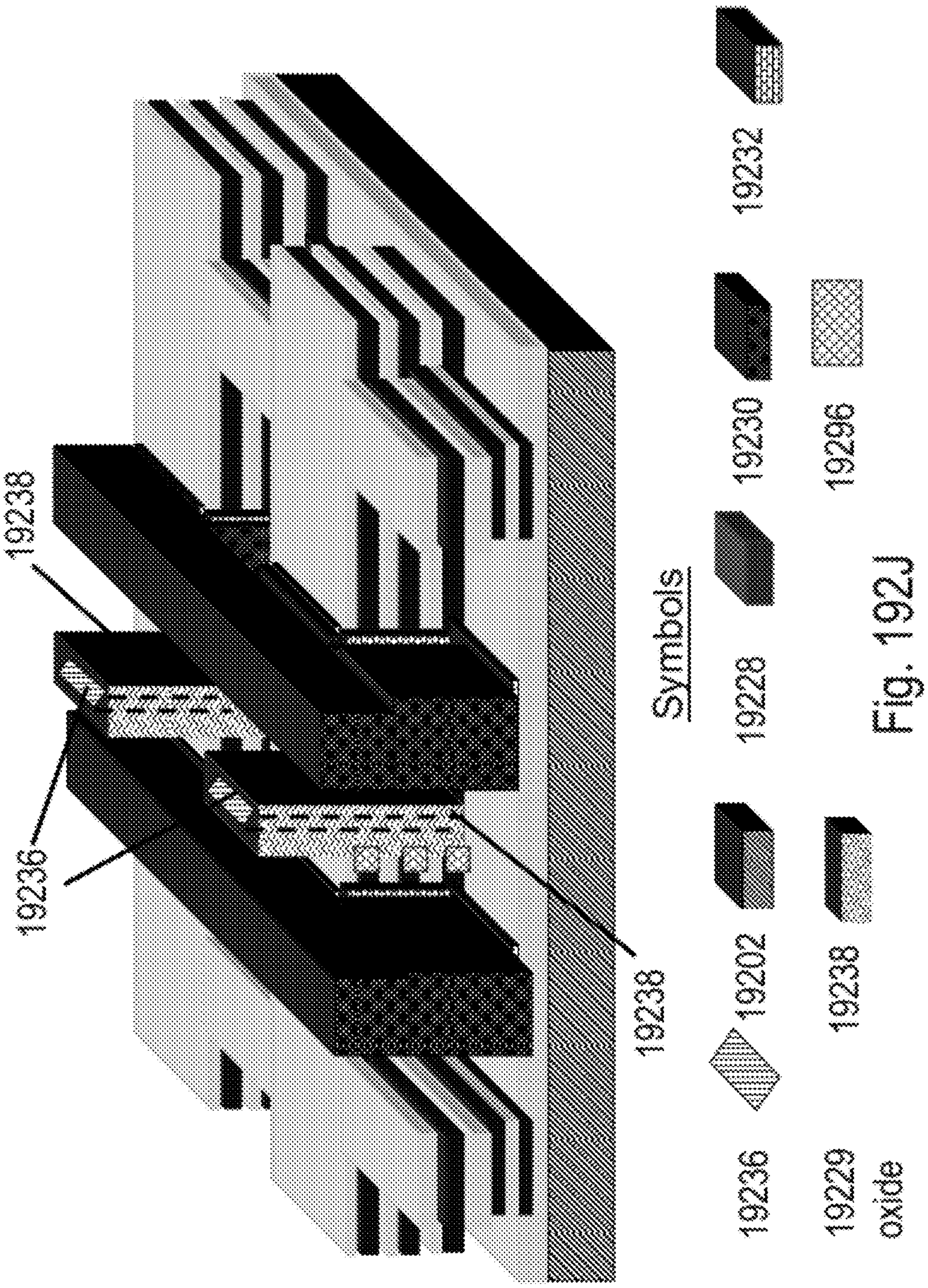

Step (I): FIG. 192J illustrates the structure after Step (I). A resistive memory material and then a metal electrode material may be deposited and polished with CMP. The metal electrode material may substantially fill the trenches. Thus resistive memory regions 19238 and metal electrode regions 19236 may be formed, which may substantially reside inside the exemplary two trenches. The resistive memory regions 19238 may be include materials such as, for example, hafnium oxide, titanium oxide, niobium oxide, zirconium oxide and any number of other possible materials with dielectric constants greater than or equal to 4. Alternatively, the resistive memory regions 19238 may include materials such as, for example, phase change memory ($Ge_2Sb_2Te_5$) or some other material. The resistive memory elements may be include the resistive memory regions 19238 and selective metal regions 19296 in between the surfaces or edges of metal electrode regions 19236 and the associated stacks of n+ silicon regions 19228.

Figure 192K:
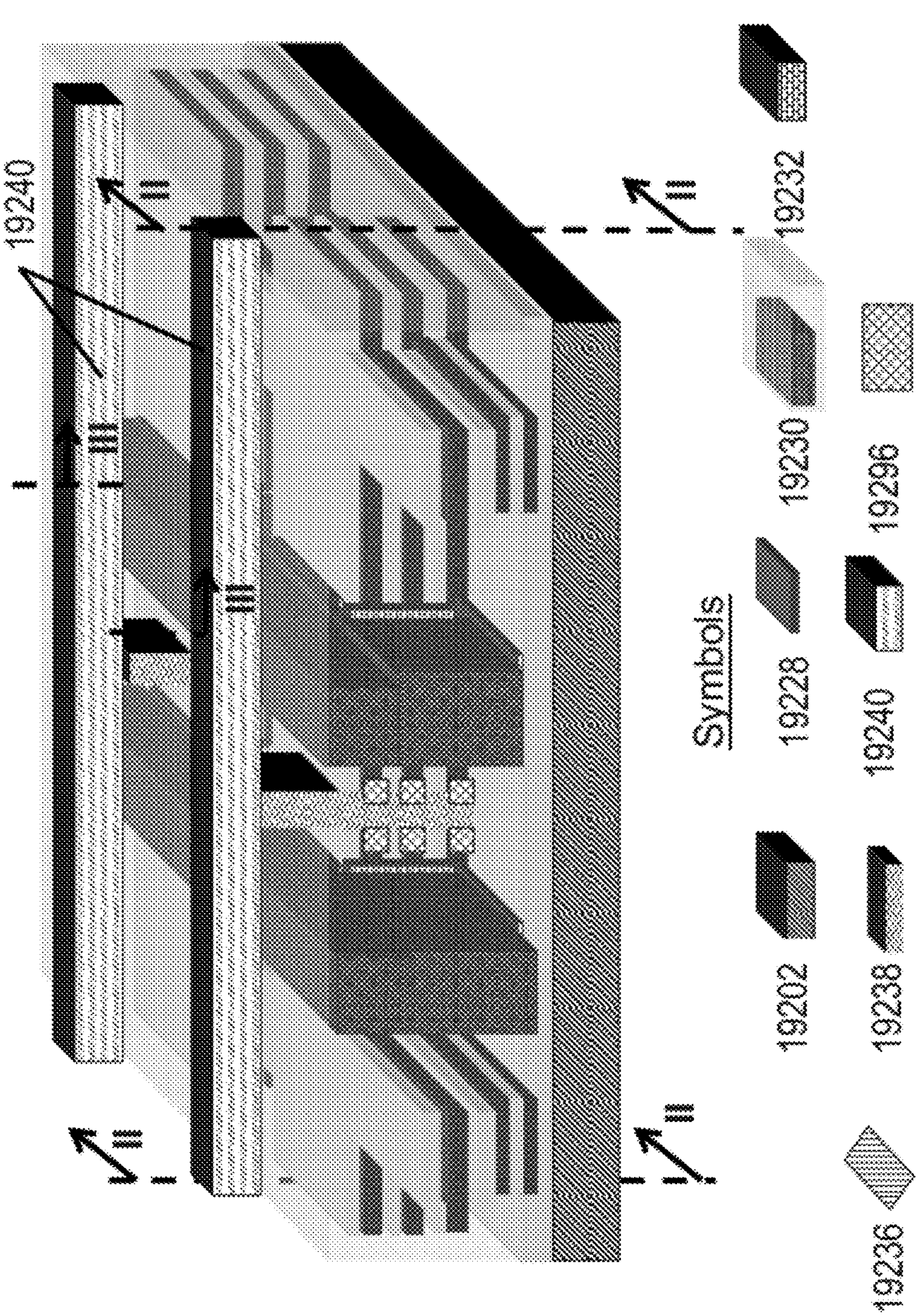

Step (J): FIG. 192K illustrates the structure after Step (J). An oxide layer 19229 may then be deposited and planarized. The oxide layer 19229 is shown transparent in the figure for clarity. Bit Lines 19240 may then be constructed. Contacts (not shown) may then be made to Bit Lines, Word Lines and Source Lines of the memory array at its edges. Source Line contacts can be made into stair-like structures using techniques described in "Bit Cost Scalable Technology with Punch and Plug Process for Ultra High Density Flash Memory," *VLSI Technology,* 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for Source Lines could be done in steps prior to Step (J) as well. Vertical connections, such as a through layer via (not shown) may be formed to electrically couple the BL, SL, and WL metallization to the peripheral circuits 19202 via an acceptor wafer metal connect pad (not shown) or direct aligned via (not shown).

Figure 192L:
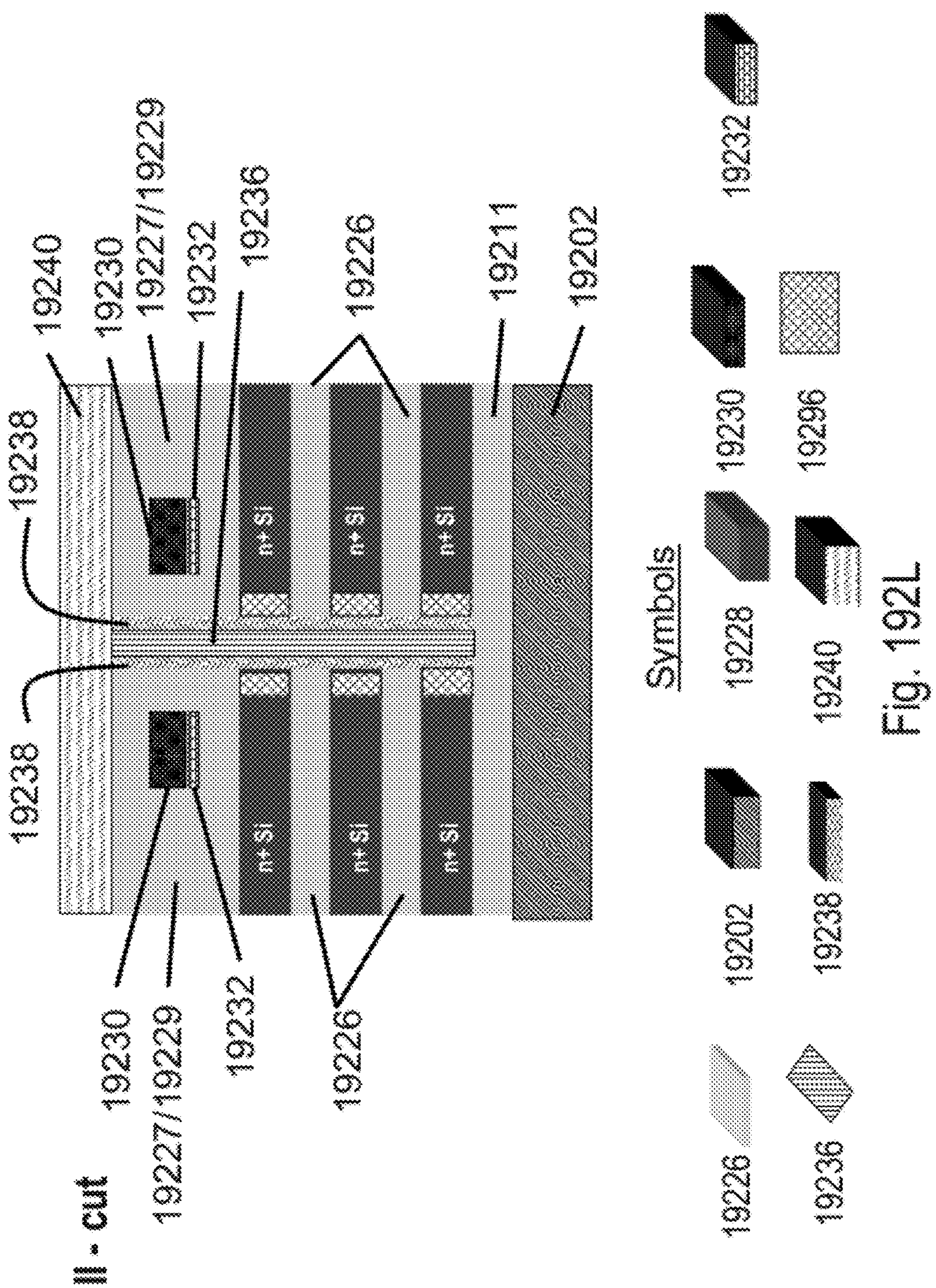
Figure 192M:
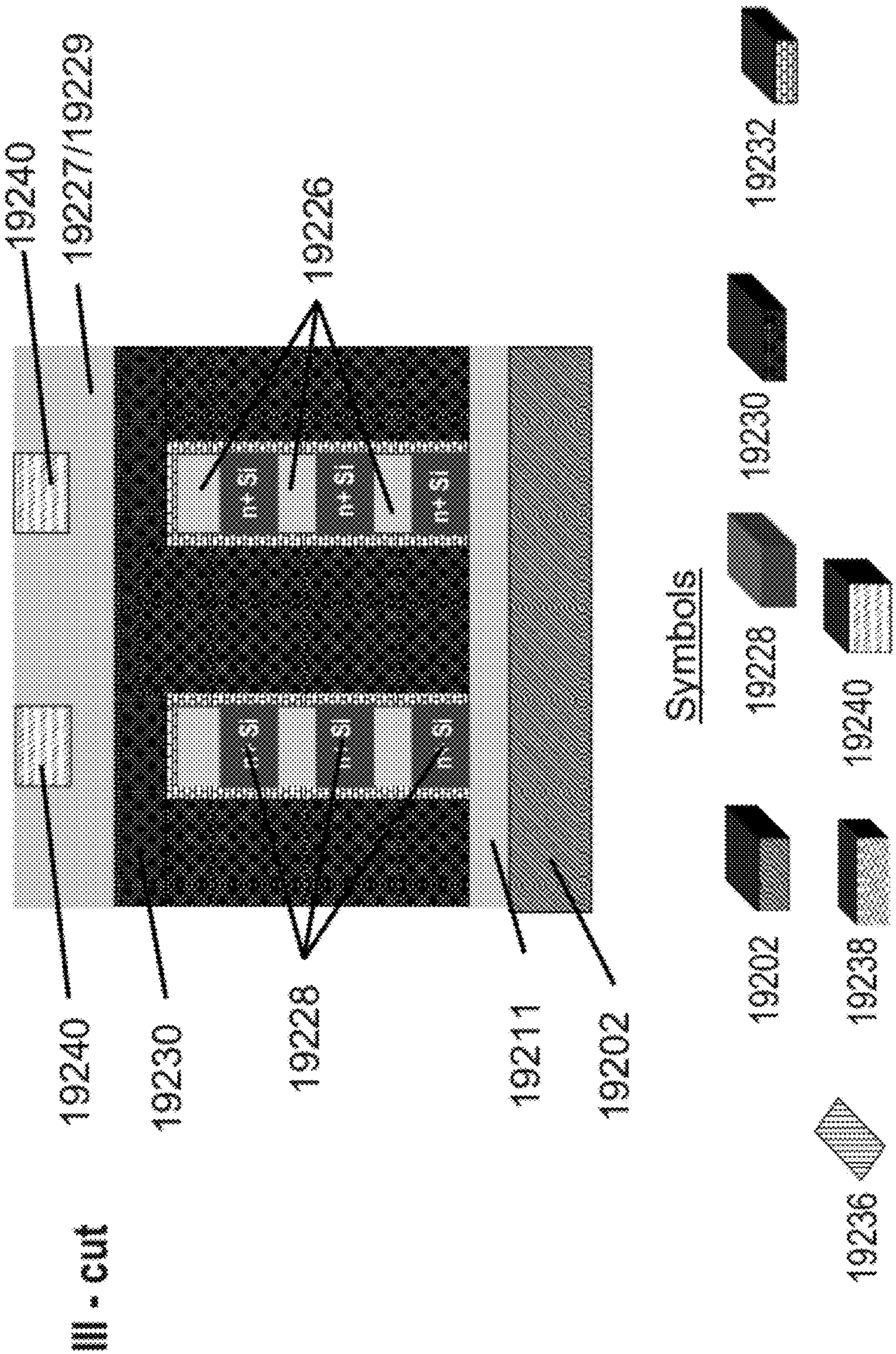

FIG. 192L and FIG. 192M show cross-sectional views of the exemplary memory array along FIG. 192K's planes II and III respectively. Multiple junction-less transistors in series with resistive memory elements can be observed in FIG. 192L.

A procedure for constructing a monolithic 3D resistive memory has thus been described, with (1) horizontally-oriented transistors, (2) some of the memory cell control lines—e.g., source-lines SL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut.

Persons of ordinary skill in the art will appreciate that the illustrations in FIGS. 192A through 192M are exemplary only and are not drawn to scale. Such skilled persons will further appreciate that many variations may be possible such as, for example, layer transfer techniques other than the described hydrogen implant and ion-cut may be utilized. Moreover, while FIG. 192A-M described the procedure for forming a monolithic 3D resistive memory with substantially all lithography steps shared among multiple memory layers, alternative procedures could be used. For example, procedures similar to those described in patent application Ser. No. 13/099,010 may be used to construct a monolithic 3D resistive memory using selective deposition processes similar to those shown in FIG. 192I. Many other modifications within the scope of the illustrated embodiments of the invention will suggest themselves to such skilled persons after reading this specification. Thus the invention is to be limited only by the appended claims.

As illustrated in FIGS. 102A to 102L, a resistance-based 3D memory may be constructed with zero additional masking steps per memory layer, which may be suitable for 3D IC manufacturing. This 3D memory may utilize double gated MOSFET transistors and may have a resistance-based memory element in series with a select transistor.

Figure 102A:
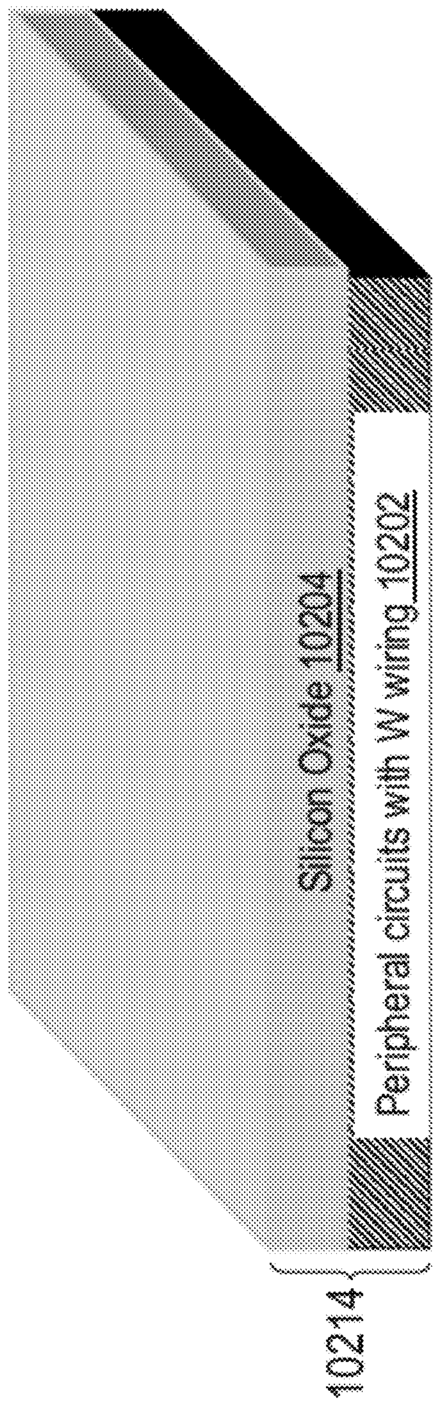

As illustrated in FIG. 102A, a silicon substrate with peripheral circuitry 10202 may be constructed with high temperature (greater than about 400° C.) resistant wiring, such as, for example, Tungsten. The peripheral circuitry substrate 10202 may include memory control circuits as well as circuitry for other purposes and of various types, such as, for example, analog, digital, RF, or memory. The peripheral circuitry substrate 10202 may include peripheral circuits that can withstand an additional rapid-thermal-anneal (RTA) or flash anneal and still remain operational and retain good performance. For this purpose, the peripheral circuits may be formed such that they have been subject to a weak RTA or no RTA for activating dopants. The top surface of the peripheral circuitry substrate 10202 may be prepared for oxide wafer bonding with a deposition of a silicon oxide layer 10204, thus forming acceptor wafer 10214.

Figure 102B:
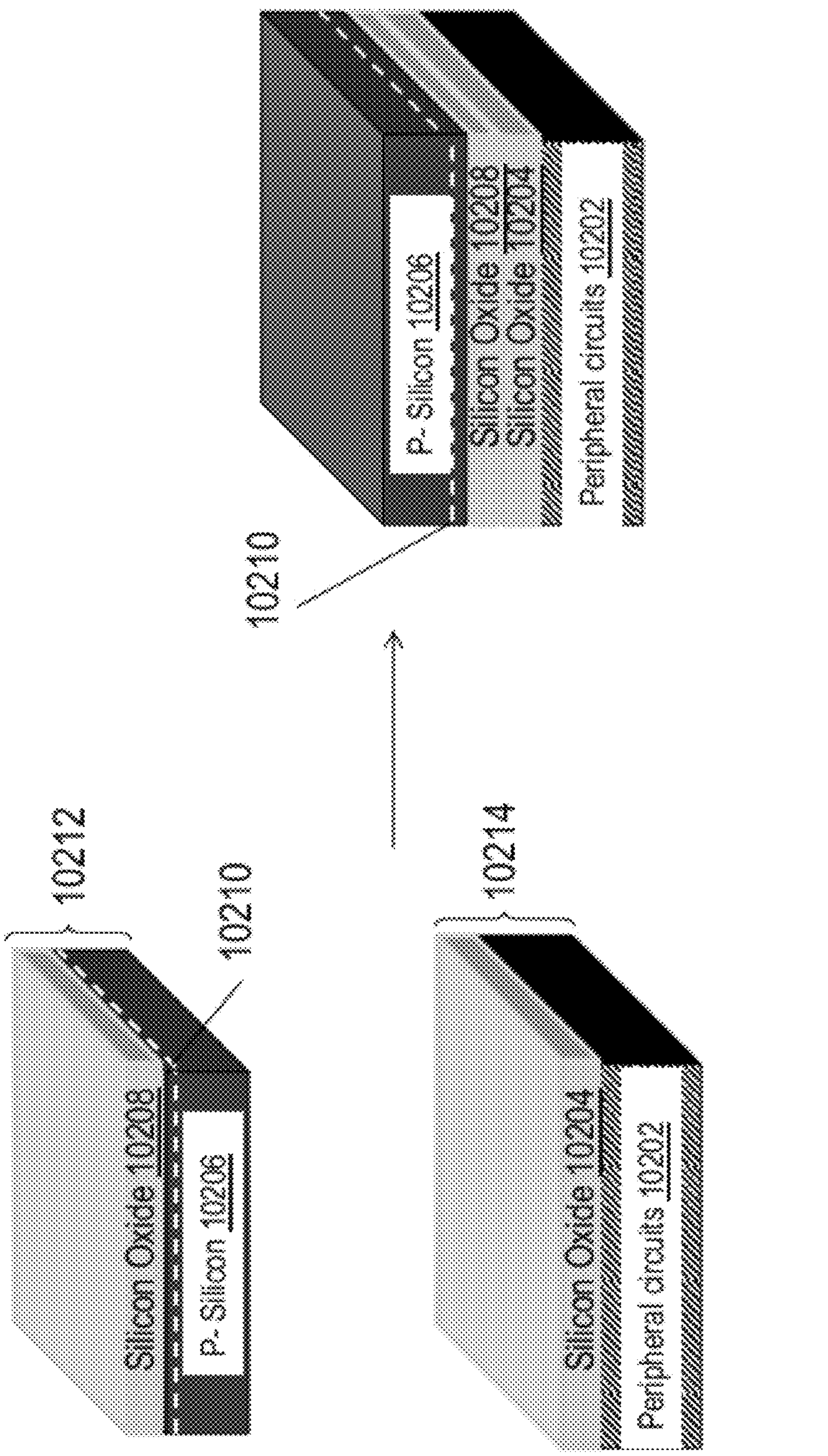

As illustrated in FIG. 102B, a mono-crystalline silicon donor wafer 10212 may be, for example, processed to include a wafer sized layer of P− doping (not shown) which may have a different dopant concentration than the P− substrate 10206. The P− doping layer may be formed by ion implantation and thermal anneal. A screen oxide layer 10208 may be grown or deposited prior to the implant to protect the silicon from implant contamination and to provide an oxide surface for later wafer to wafer bonding. A layer transfer demarcation plane 10210 (shown as a dashed line) may be formed in donor wafer 10212 within the P− substrate 10206 or the P− doping layer (not shown) by hydrogen implantation or other methods as previously described. Both the donor wafer 10212 and acceptor wafer 10214 may be prepared for wafer bonding as previously described and then bonded at the surfaces of oxide layer 10204 and oxide layer 10208, at a low temperature (less than about 400° C. suitable for lowest stresses), or at a moderate temperature (less than about 900° C.).

Figure 102C:
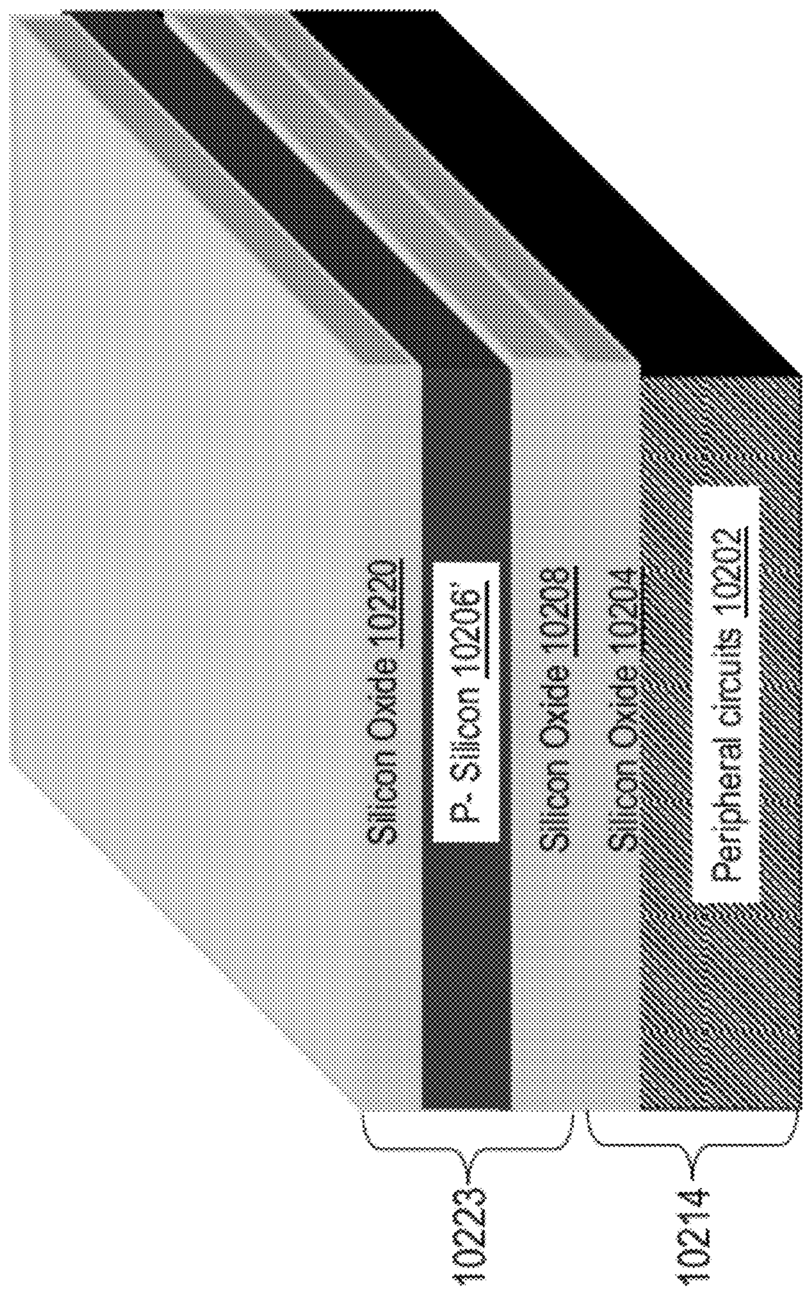

As illustrated in FIG. 102C, the portion of the P− layer (not shown) and the P− substrate 10206 that are above the layer transfer demarcation plane 10210 may be removed by cleaving and polishing, or other processes as previously described, such as, for example, ion-cut or other methods, thus forming the remaining mono-crystalline silicon P− layer 10206'. Remaining P− layer 10206' and oxide layer 10208 may have been layer transferred to acceptor wafer 10214. The top surface of P− layer 10206' may be chemically or mechanically polished smooth and flat. Now transistors or portions of transistors may be formed and aligned to the acceptor wafer 10214 alignment marks (not shown). Oxide layer 10220 may be deposited to prepare the surface for later oxide to oxide bonding. This bonding may now form the first Si/SiO2 layer 10223 including silicon oxide layer 10220, P− layer 10206', and oxide layer 10208.

Figure 102D:
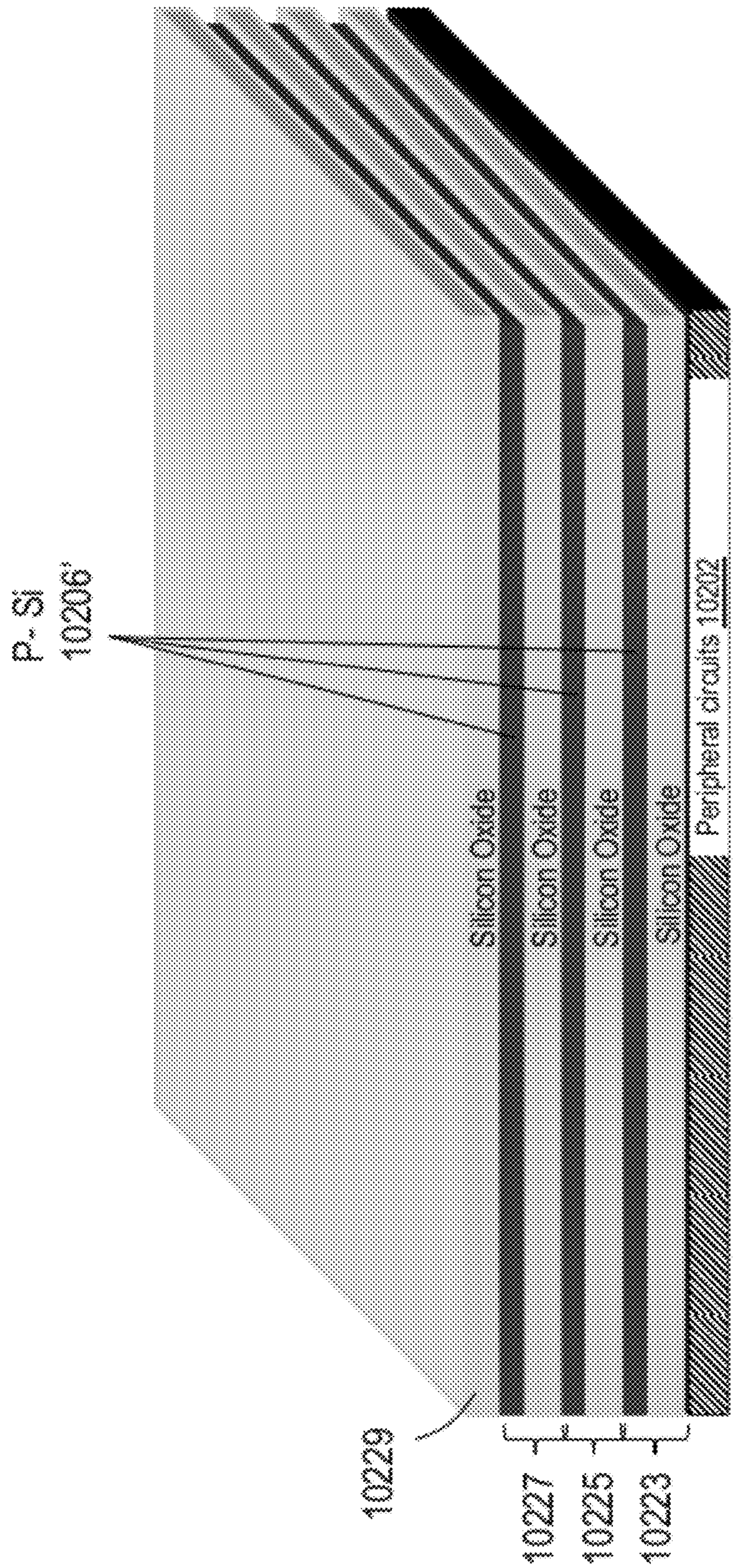

As illustrated in FIG. 102D, additional Si/SiO2 layers, such as second Si/SiO2 layer 10225 and third Si/SiO2 layer 10227, may each be formed as described in FIGS. 102A to 102C. Oxide layer 10229 may be deposited to electrically isolate the top silicon layer.

Figure 102E:
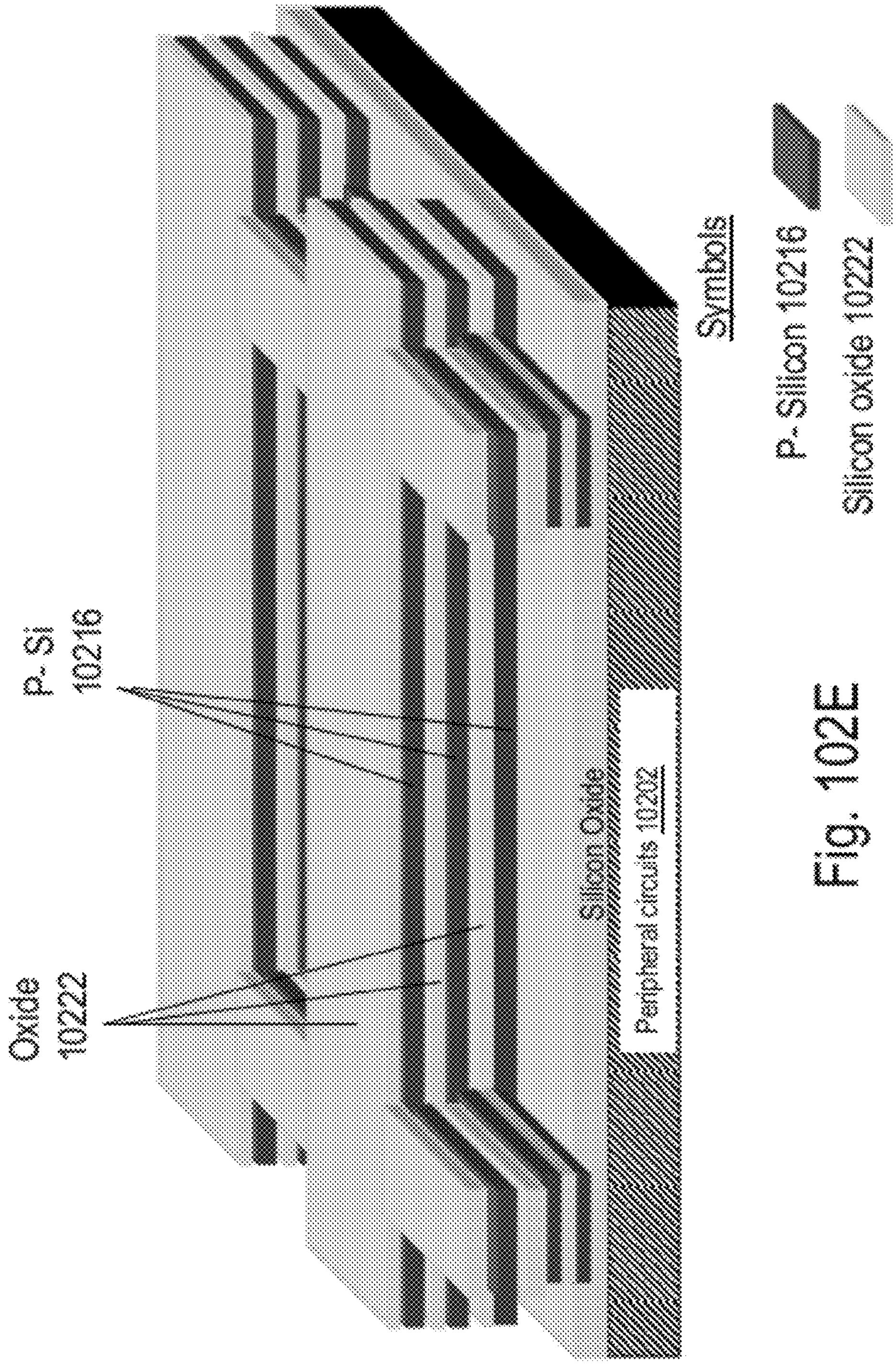

As illustrated in FIG. 102E, oxide layer 10229, third Si/SiO2 layer 10227, second Si/SiO2 layer 10225 and first Si/SiO2 layer 10223 may be lithographically defined and plasma/RIE etched to form a portion of the memory cell structure, which now includes regions of P− silicon 10216 and oxide 10222. Thus, these transistor elements or portions may have been defined by a common lithography step, which also may be described as a single lithography step, same lithography step, or one lithography step.

Figure 102F:
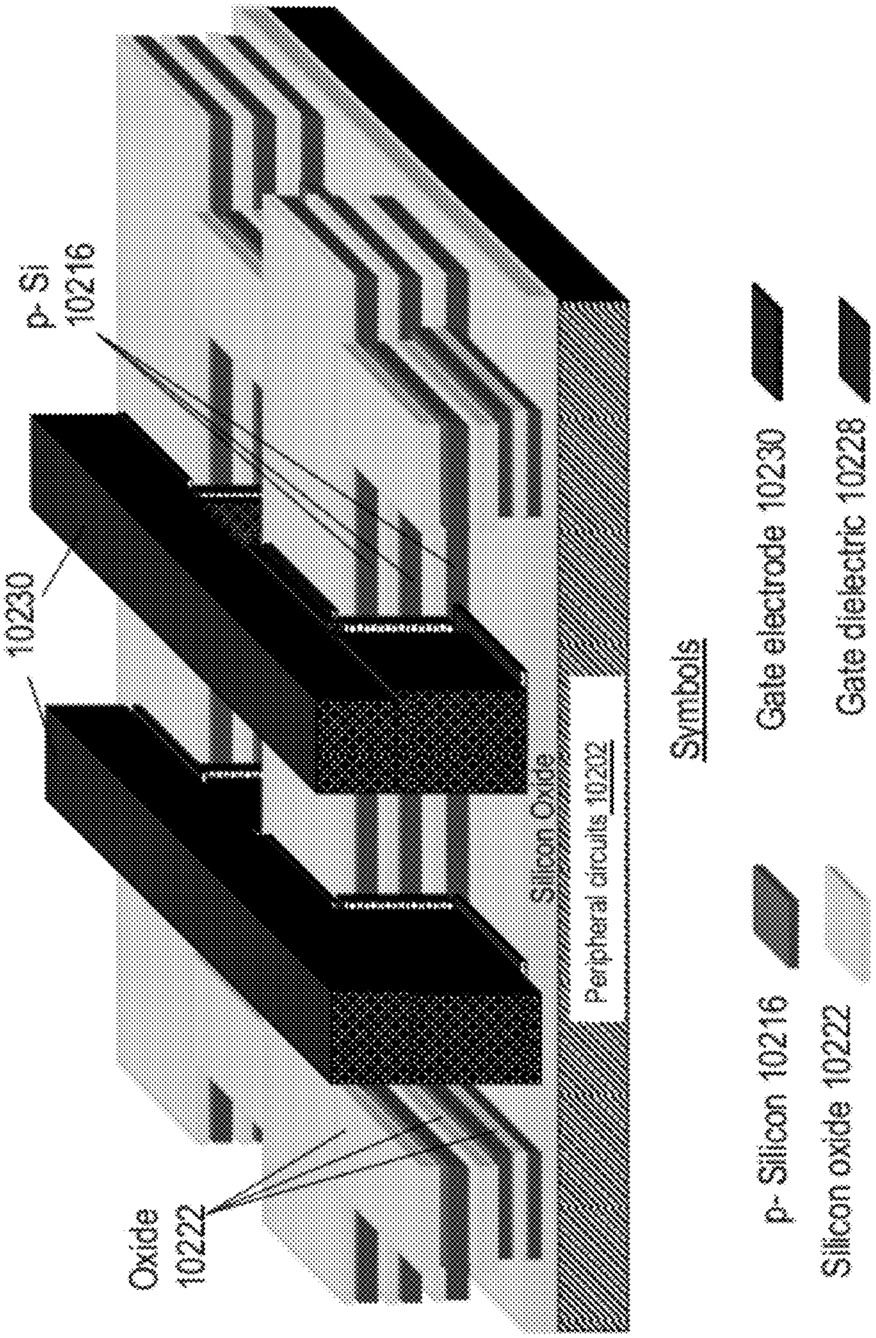

As illustrated in FIG. 102F, a gate dielectric and gate electrode material may be deposited, planarized with a chemical mechanical polish (CMP), and then lithographically defined and plasma/RIE etched to form gate dielectric regions 10228 which may either be self-aligned to and covered by gate electrodes 10230 (shown), or may cover the entire silicon/oxide multi-layer structure. The gate stack including gate electrode 10230 and gate dielectric 10228 may be formed with a gate dielectric, such as, for example, thermal oxide, and a gate electrode material, such as, for example, polycrystalline silicon. Alternatively, the gate dielectric may be an atomic layer deposited (ALD) material that may be paired with a work function specific gate metal according to an industry standard of high k metal gate process schemes described previously. Additionally, the gate dielectric may be formed with a rapid thermal oxidation (RTO), a low temperature oxide deposition or low temperature microwave plasma oxidation of the silicon surfaces and then a gate electrode such as tungsten or aluminum may be deposited.

Figure 102G:
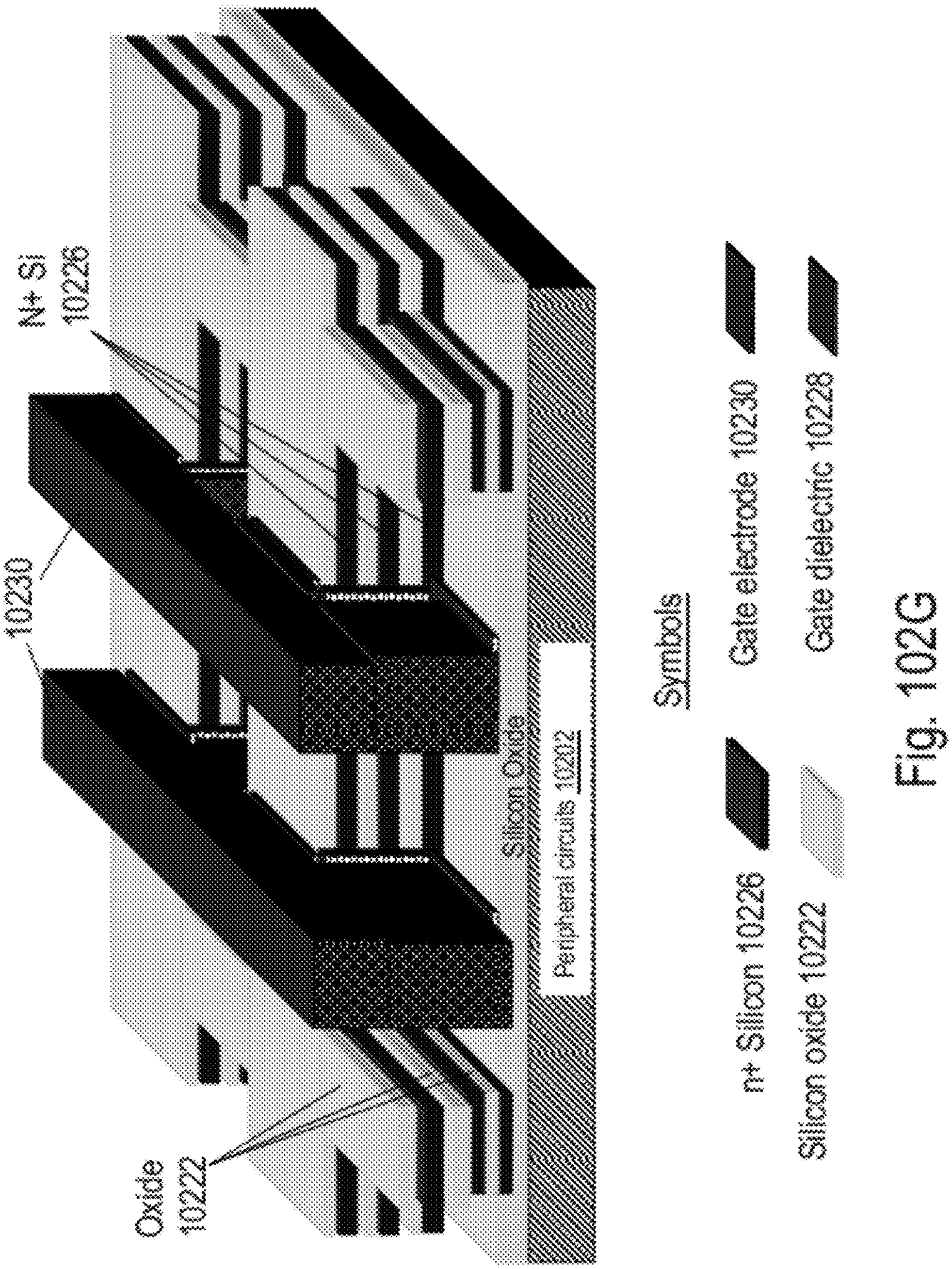

As illustrated in FIG. 102G, N+ silicon regions 10226 may be formed in a self-aligned manner to the gate electrodes 10230 by ion implantation of an N type species, such as, for example, Arsenic, into the regions of P− silicon 10216 that may not be blocked by the gate electrodes 10230. This implantation may also form the remaining regions of P− silicon 10217 (not shown) in the gate electrode 10230 blocked areas. Different implant energies or angles, or multiples of each, may be utilized to place the N type species into each layer of P− silicon regions 10216. Spacers (not shown) may be utilized during this multi-step implantation process and layers of silicon present in different layers of the stack may have different spacer widths to account for the differing lateral straggle of N type species implants. Bottom layers, such as, for example, first Si/SiO2 layer 10223, could have larger spacer widths than top layers, such as, for example, third Si/SiO2 layer 10227. Alternatively, angular ion implantation with substrate rotation may be utilized to compensate for the differing implant straggle. The top layer implantation may have a slanted angle, rather than perpendicular to the wafer surface, and hence land ions slightly underneath the gate electrode 10230 edges and closely match a more perpendicular lower layer implantation which may land ions slightly underneath the gate electrode 10230 edge due to the straggle effects of the greater implant energy needed to reach the lower layer. A rapid thermal anneal (RTA) or flash anneal may be conducted to activate the dopants in substantially all of the memory layers 10223, 10225, 10227 and in the peripheral circuitry substrate 10202. Alternatively, optical anneals, such as, for example, a laser based anneal, may be performed.

Figure 102H:
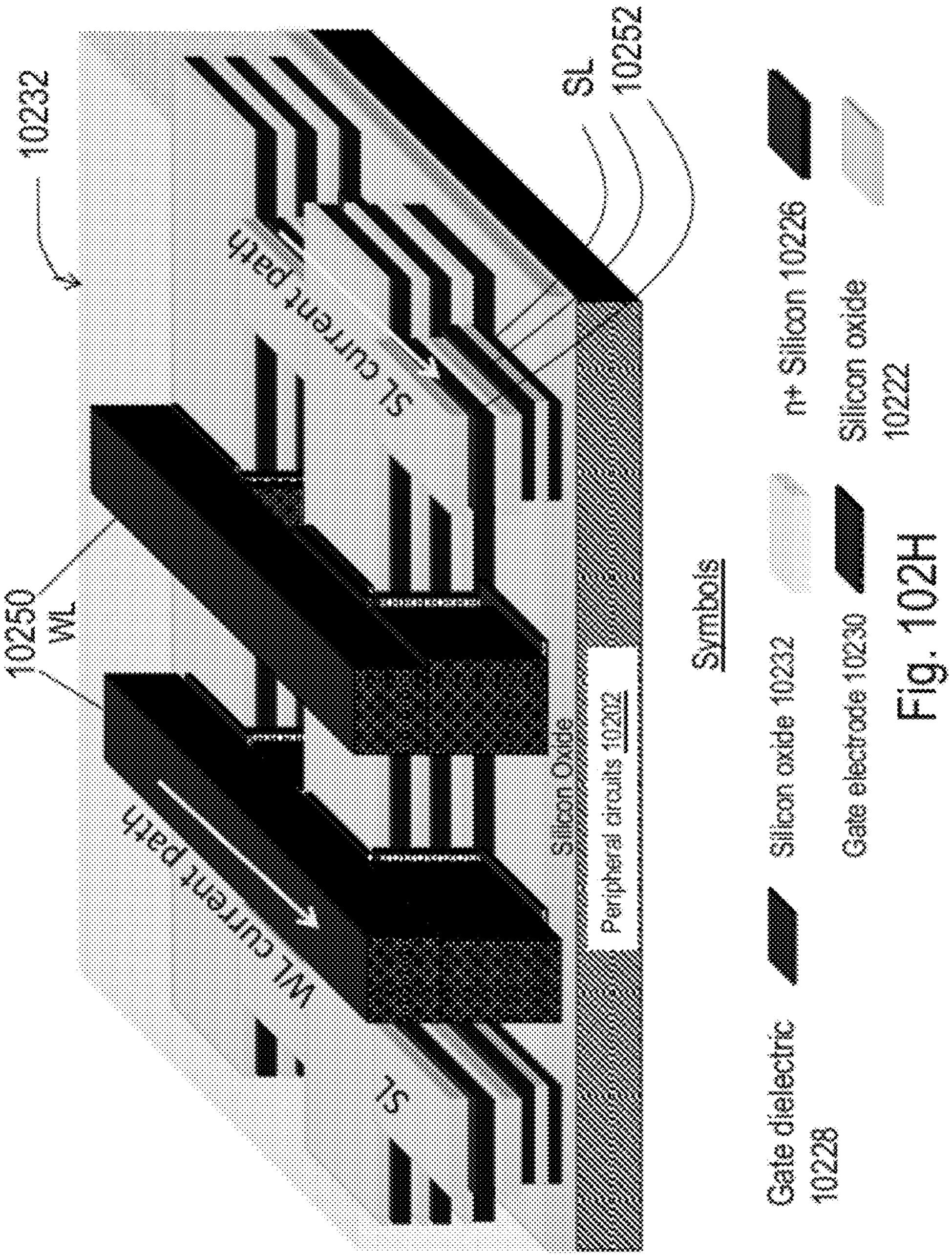

As illustrated in FIG. 102H, the entire structure may be covered with a gap fill oxide 10232, which may be planarized with chemical mechanical polishing. The oxide 10232 is shown transparent in the figure for clarity in illustration. Also shown are word-line regions (WL) 10250, which may be coupled with and composed of gate electrodes 10230, and source-line regions (SL) 10252, composed of indicated N+ silicon regions 10226.

Figure 102I:
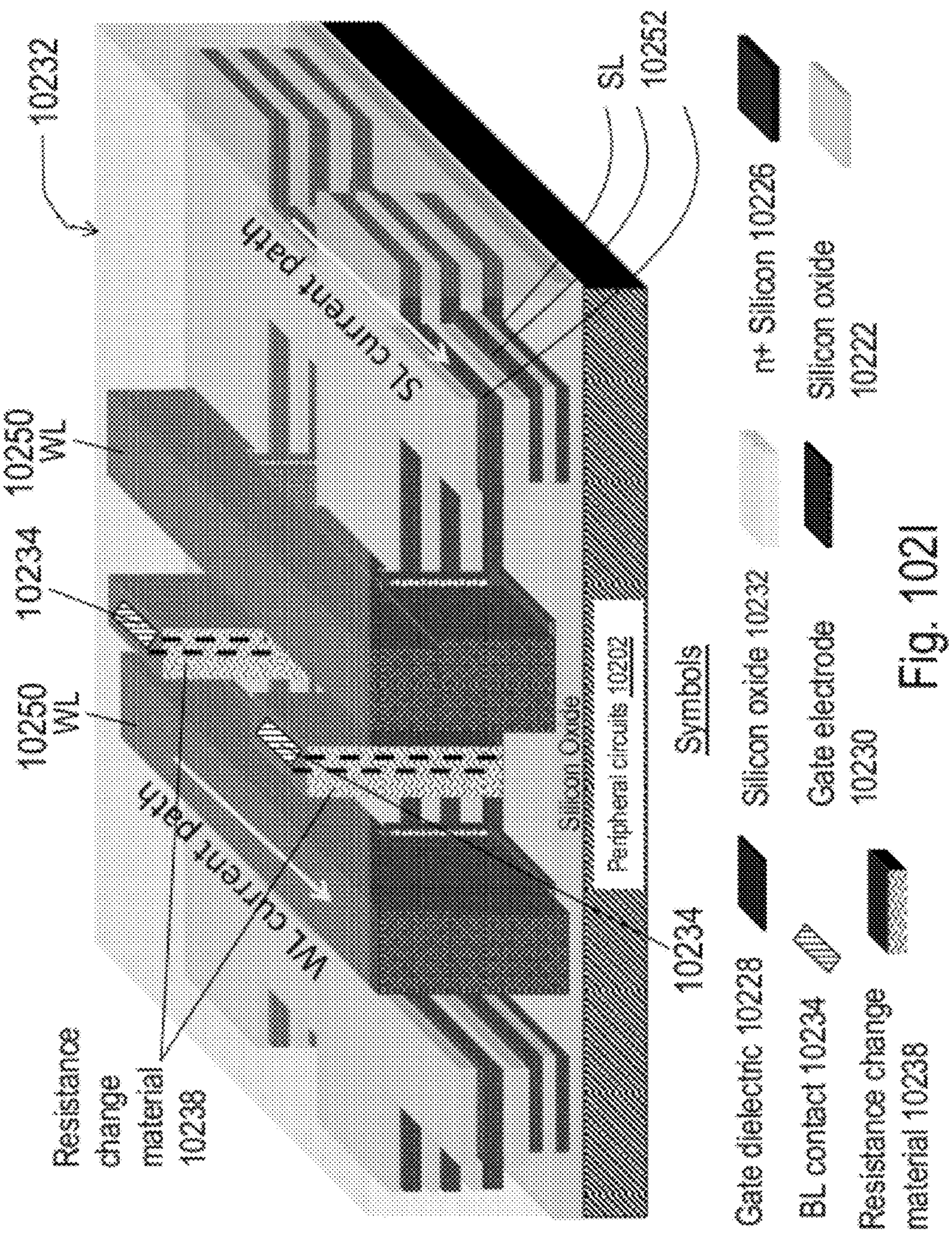

As illustrated in FIG. 102I, bit-line (BL) contacts 10234 may be lithographically defined and then etched utilizing, for example, plasma/RIE, through oxide 10232, the three N+ silicon regions 10226, and associated oxide vertical isolation regions to connect substantially all memory layers vertically, and followed by photoresist removal. Resistance change material 10238, such as hafnium oxide, may then be deposited, for example, with atomic layer deposition (ALD). The electrode for the resistance change memory element may then be deposited by ALD to form the electrode/BL contact 10234. The excess deposited material may be polished to planarity at or below the top of oxide 10232. Each BL contact 10234 with resistive change material 10238 may be shared among substantially all layers of memory, shown as three layers of memory in FIG. 102I.

Figure 102J:
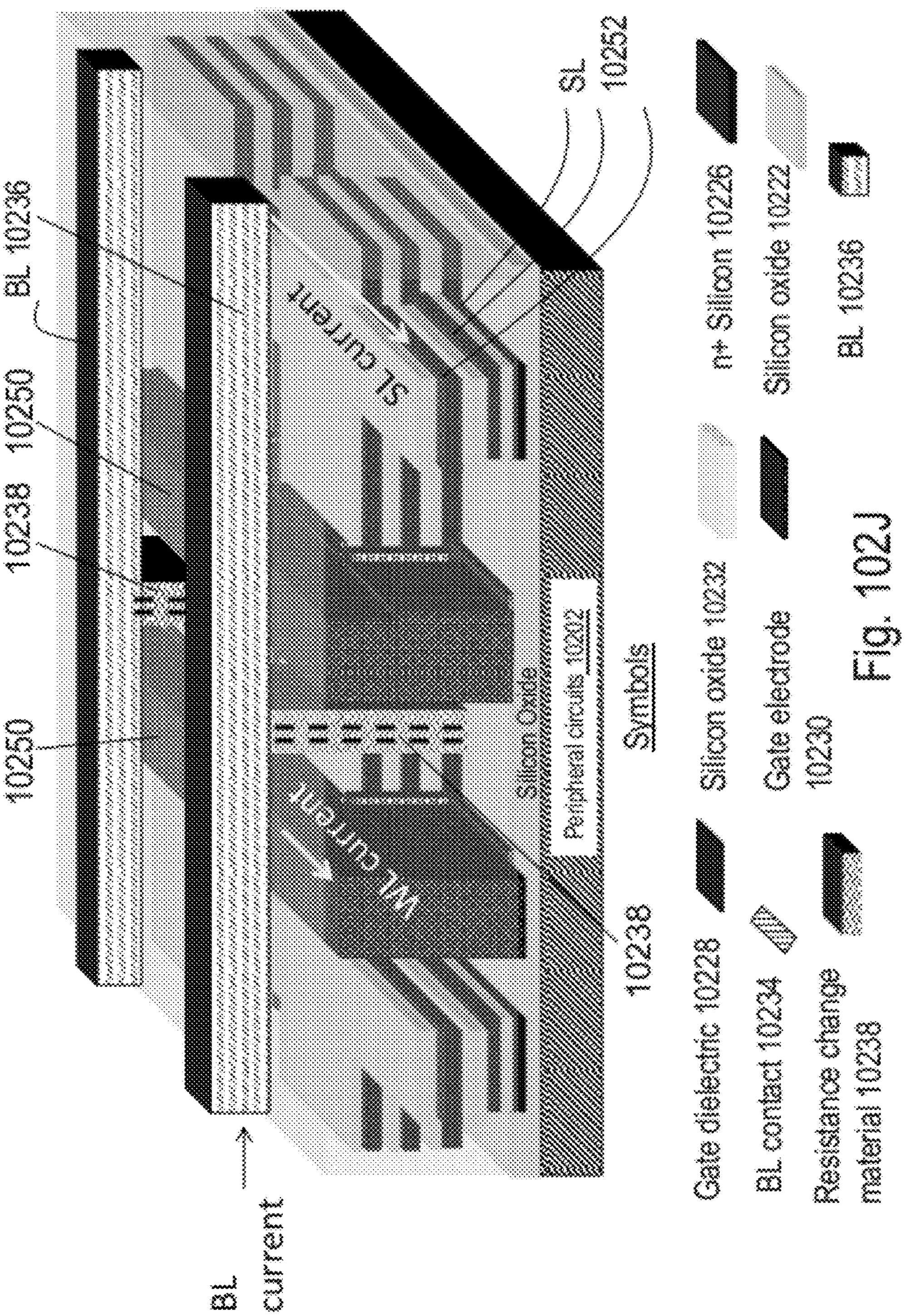

As illustrated in FIG. 102J, BL metal lines 10236 may be formed and connect to the associated BL contacts 10234 with resistive change material 10238. Contacts and associated metal interconnect lines (not shown) may be formed for the WL and SL at the memory array edges. A through layer via (not shown) may be formed to electrically couple the BL, SL, and WL metallization to the acceptor wafer 10214 peripheral circuitry via an acceptor wafer metal connect pad (not shown).

Figure 102K:
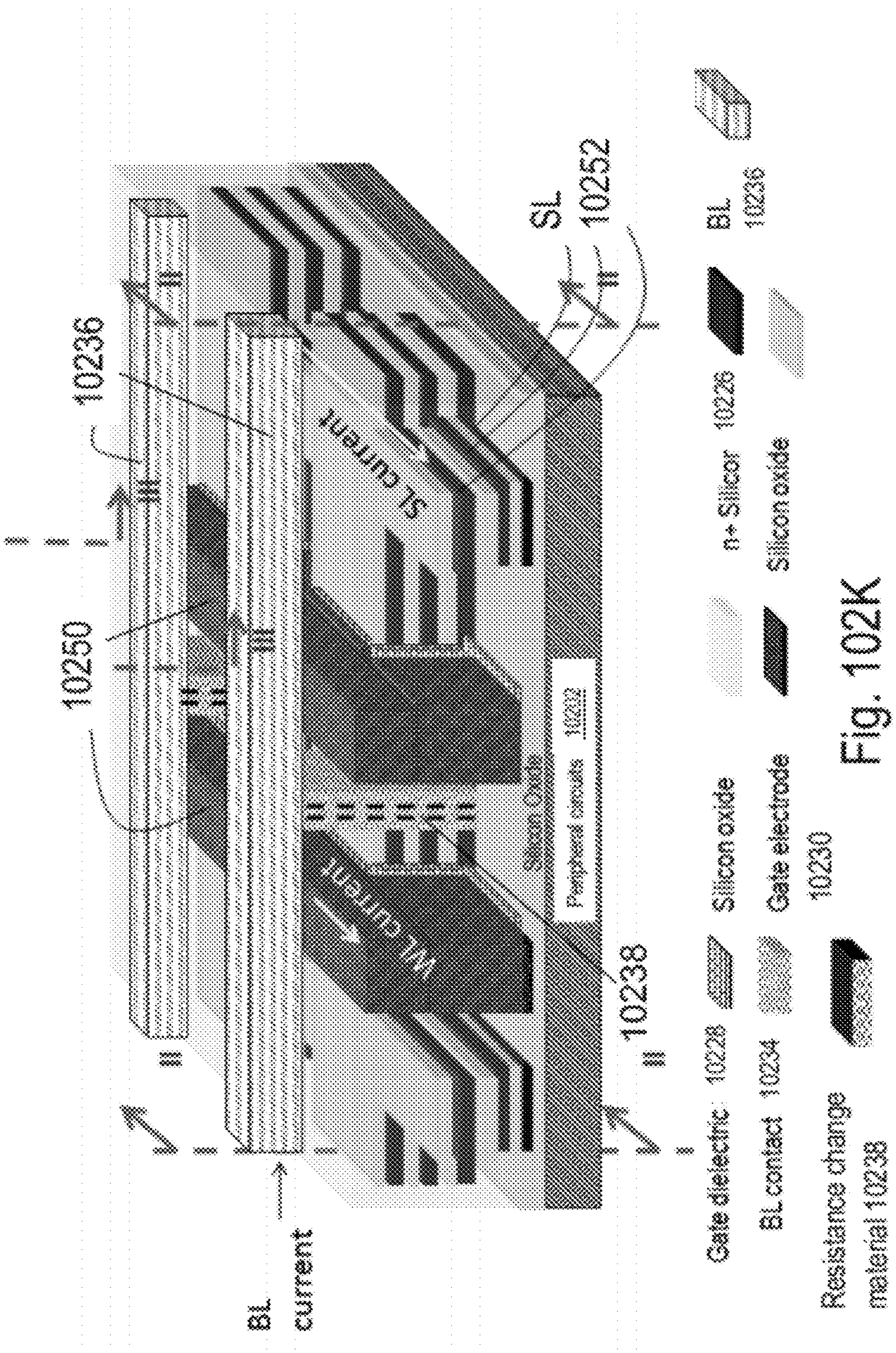

FIG. 102K1 is a cross-sectional cut II of FIG. 102K, while FIG. 102K2 is a cross-sectional cut III of FIG. 102K. FIG. 102K1 shows BL metal line 10236, oxide 10232, BL contact/electrode 10234, resistive change material 10238, WL regions 10250, gate dielectric 10228, P− silicon regions 10217, N+ silicon regions 10226, and peripheral circuitry substrate 10202. The BL contact/electrode 10234 may couple to one side of the three levels of resistive change material 10238. The other side of the resistive change material 10238 may be coupled to N+ silicon regions 10226. FIG. 102K2 shows the P-regions 10217 with associated N+ regions 10226 on each side form the source, channel, and drain of the select transistor. BL metal lines 10236, oxide 10232, gate electrode 10230, gate dielectric 10228, P− silicon regions 10217, interlayer oxide regions ('ox'), and peripheral circuitry substrate 10202. The gate electrode 10230 may be common to substantially all six P− silicon regions 10217 and may control the six double gated MOSFET select transistors.

Figure 102L:
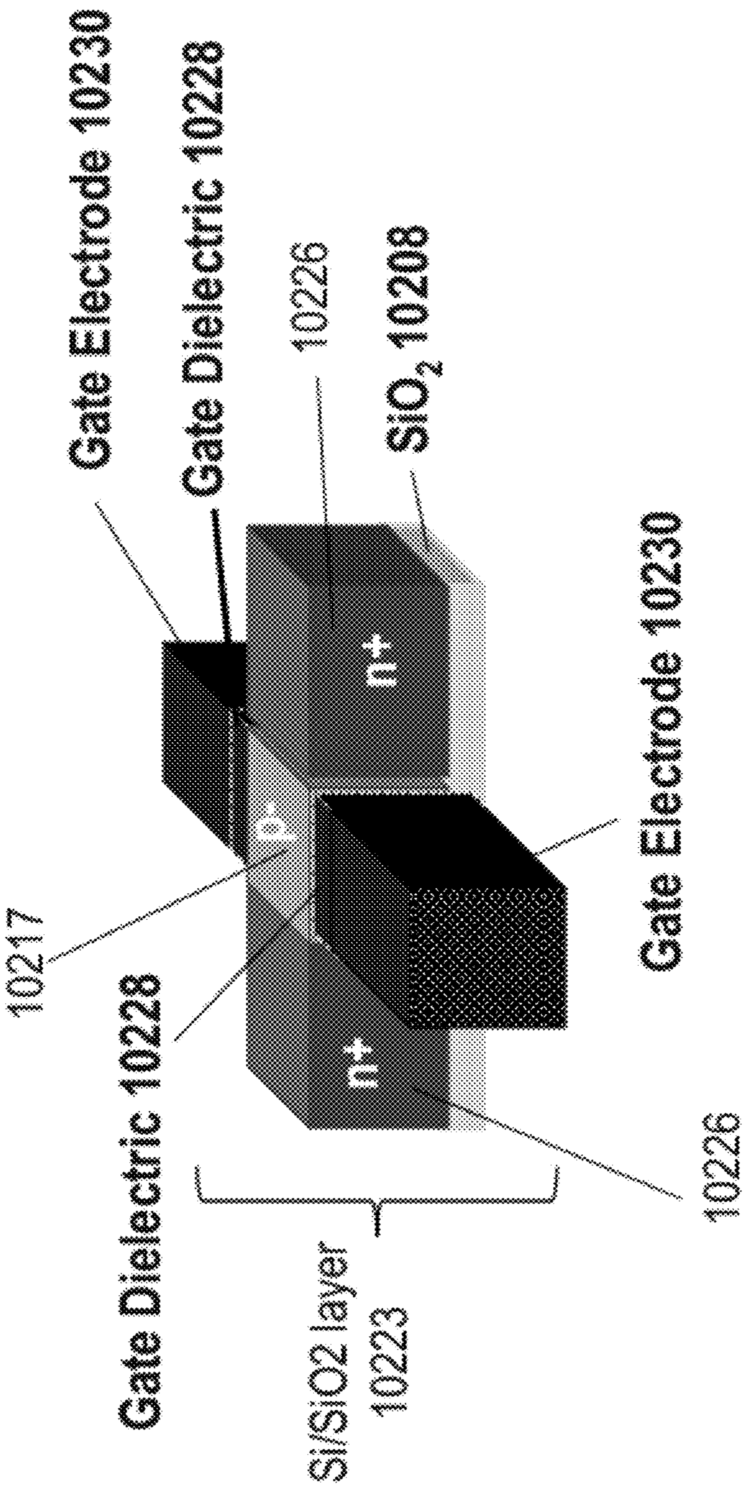

As illustrated in FIG. 102L, a single exemplary double gated MOSFET select transistor on the first Si/SiO2 layer 10223 may include P− silicon region 10217 (functioning as the transistor channel), N+ silicon regions 10226 (functioning as source and drain), and two gate electrodes 10230 with associated gate dielectrics 10228. The transistor may be electrically isolated from beneath by oxide layer 10208.

The above flow may enable the formation of a resistance-based 3D memory with zero additional masking steps per memory layer constructed by layer transfers of wafer sized doped mono-crystalline silicon layers and may be connected to an underlying multi-metal layer semiconductor device.

Persons of ordinary skill in the art will appreciate that the illustrations in FIGS. 102A through 102L are exemplary only and are not drawn to scale. Such skilled persons will further appreciate that many variations may be possible, such as, for example, the transistors may be of another type such as RCATs. Furthermore, the MOSFET selectors may utilize lightly doped drain and halo implants for channel engineering. Additionally, the contacts may utilize doped poly-crystalline silicon, or other conductive materials. Moreover, the stacked memory layer may be connected to a periphery circuit that is above the memory stack. Further, each gate of the double gate 3D DRAM can be independently controlled for better control of the memory cell. Many other modifications within the scope of the illustrated embodiments of the invention will suggest themselves to such skilled persons after reading this specification. Thus the invention is to be limited only by the appended claims.

As illustrated in FIGS. 103A to 103M, a resistance-based 3D memory with one additional masking step per memory layer may be constructed that is suitable for 3D IC manufacturing. This 3D memory may utilize double gated MOSFET select transistors and may have a resistance-based memory element in series with the select transistor.

Figure 103A:
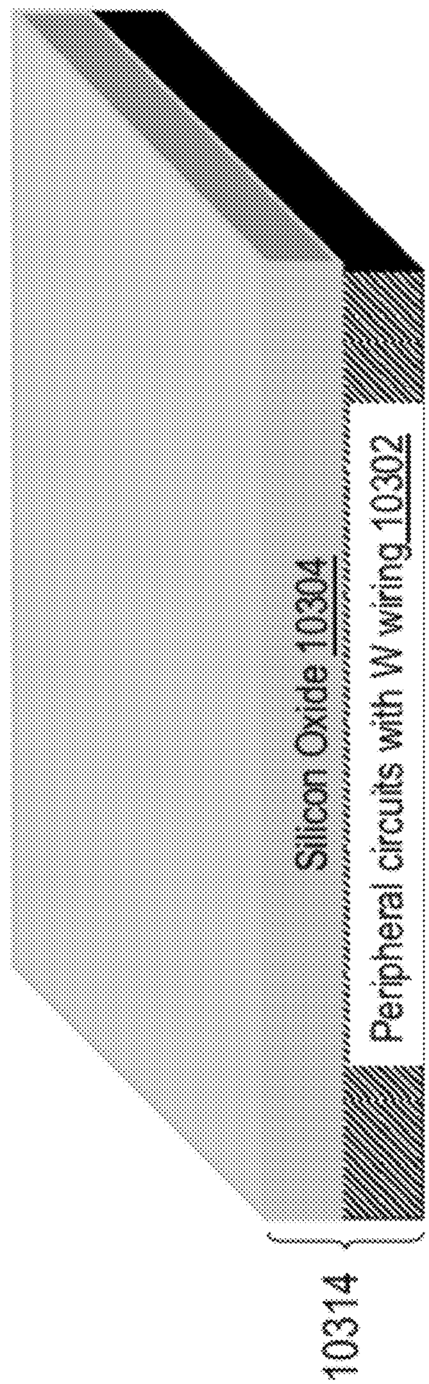

As illustrated in FIG. 103A, a silicon substrate with peripheral circuitry 10302 may be constructed with high temperature (greater than about 400° C.) resistant wiring, such as, for example, Tungsten. The peripheral circuitry substrate 10302 may include memory control circuits as well as circuitry for other purposes and of various types, such as, for example, analog, digital, RF, or memory. The peripheral circuitry substrate 10302 may include circuits that can withstand an additional rapid-thermal-anneal (RTA) or flash anneal and still remain operational and retain good performance. For this purpose, the peripheral circuits may be formed such that they have been subject to a weak RTA or no RTA for activating dopants. The top surface of the peripheral circuitry substrate 10302 may be prepared for oxide wafer bonding with a deposition of a silicon oxide layer 10304, thus forming acceptor wafer 10314.

Figure 103B:
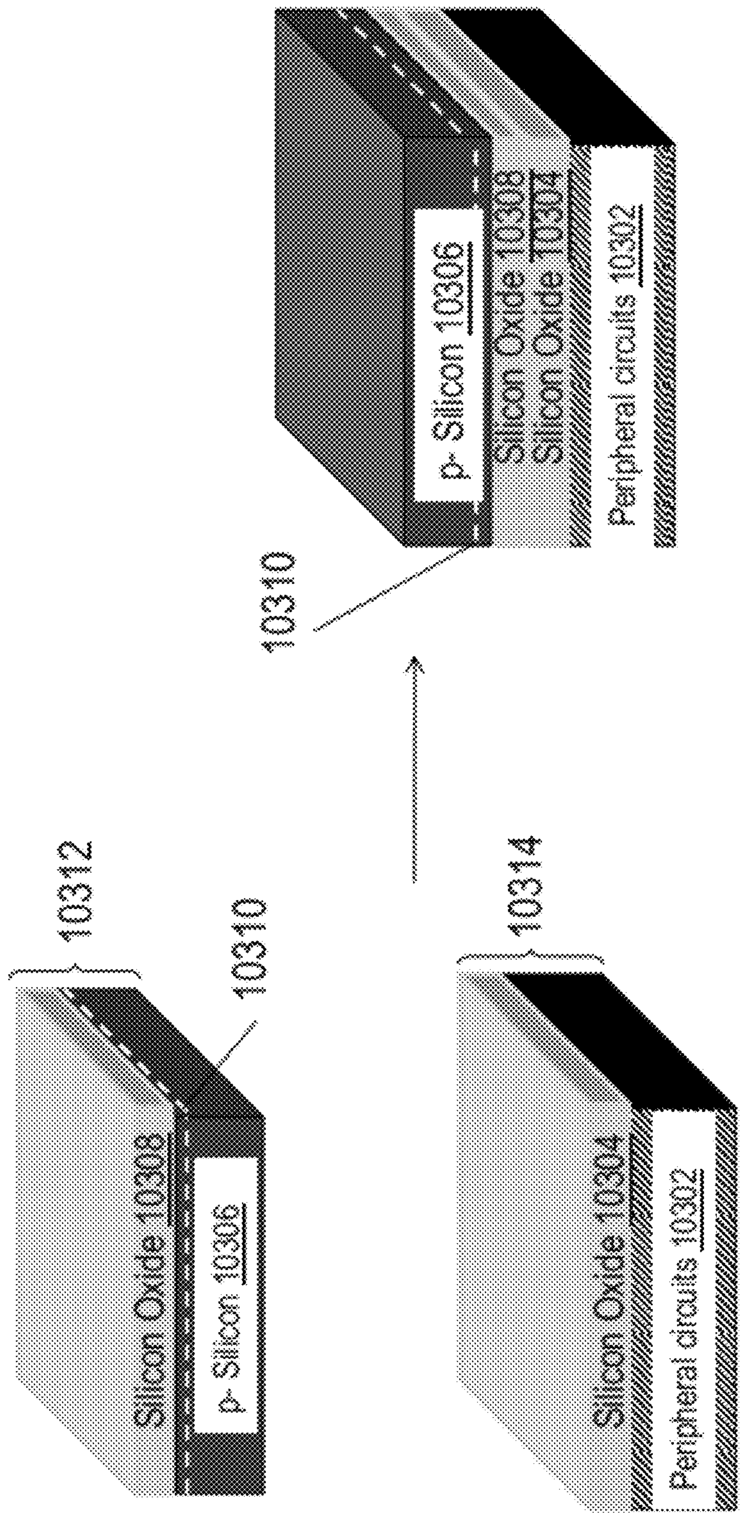

As illustrated in FIG. 103B, a mono-crystalline silicon donor wafer 10312 may be, for example, processed to include a wafer sized layer of P− doping (not shown) which may have a different dopant concentration than the P− substrate 10306. The P− doping layer may be formed by ion implantation and thermal anneal. A screen oxide layer 10308 may be grown or deposited prior to the implant to protect the silicon from implant contamination and to provide an oxide surface for later wafer to wafer bonding. A layer transfer demarcation plane 10310 (shown as a dashed line) may be formed in donor wafer 10312 within the P− substrate 10306 or the P− doping layer (not shown) by hydrogen implantation or other methods as previously described. Both the donor wafer 10312 and acceptor wafer 10314 may be prepared for wafer bonding as previously described and then bonded at the surfaces of oxide layer 10304 and oxide layer 10308, at a low temperature (less than about 400° C. suitable for lowest stresses), or a moderate temperature (less than about 900° C.).

Figure 103C:
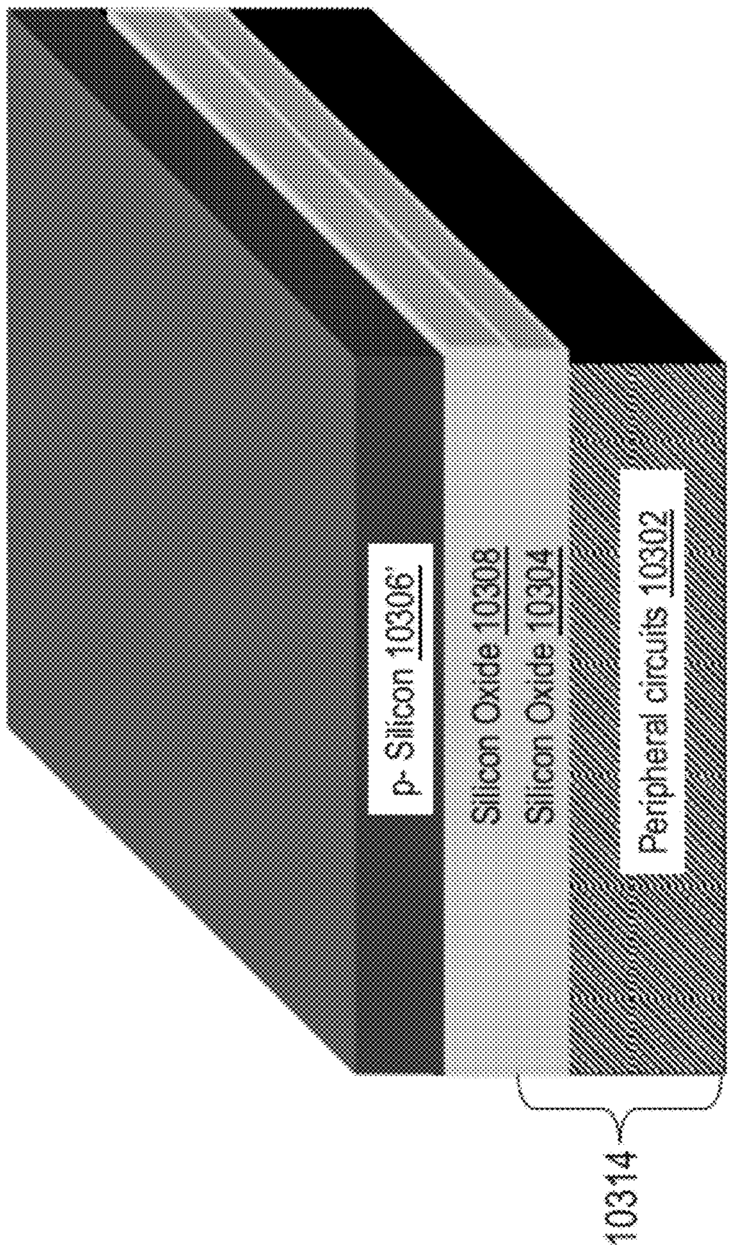

As illustrated in FIG. 103C, the portion of the P− layer (not shown) and the P-substrate 10306 that are above the layer transfer demarcation plane 10310 may be removed by cleaving and polishing, or other processes as previously described, such as ion-cut or other methods, thus forming the remaining mono-crystalline silicon P− layer 10306'. Remaining P− layer 10306' and oxide layer 10308 may have been layer transferred to acceptor wafer 10314. The top surface of P− layer 10306' may be chemically or mechanically polished smooth and flat. Transistors or portions of transistors may be formed and aligned to the acceptor wafer 10314 alignment marks (not shown).

Figure 103D:
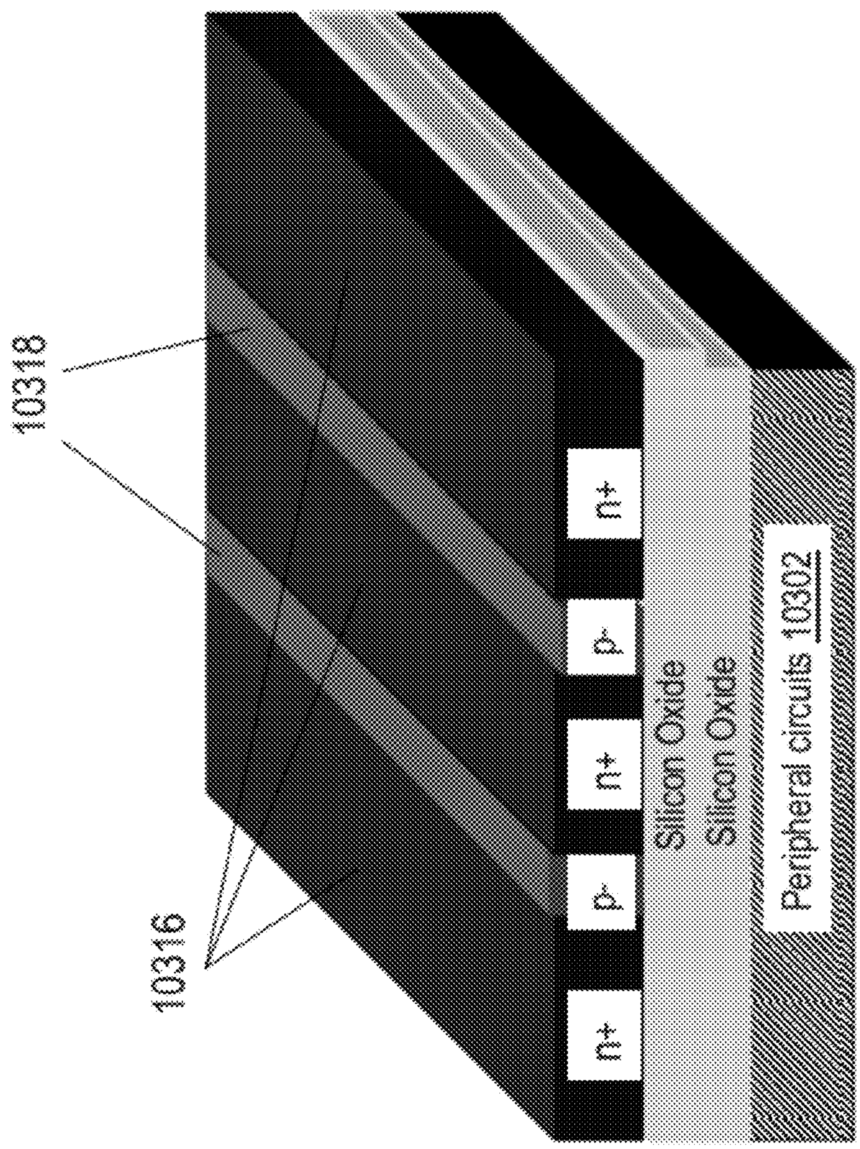

As illustrated in FIG. 103D, N+ silicon regions 10316 may be lithographically defined and N type species, such as, for example, Arsenic, may be ion implanted into P-layer 10306'. This implantation also may form remaining regions of P− silicon 10318.

Figure 103E:
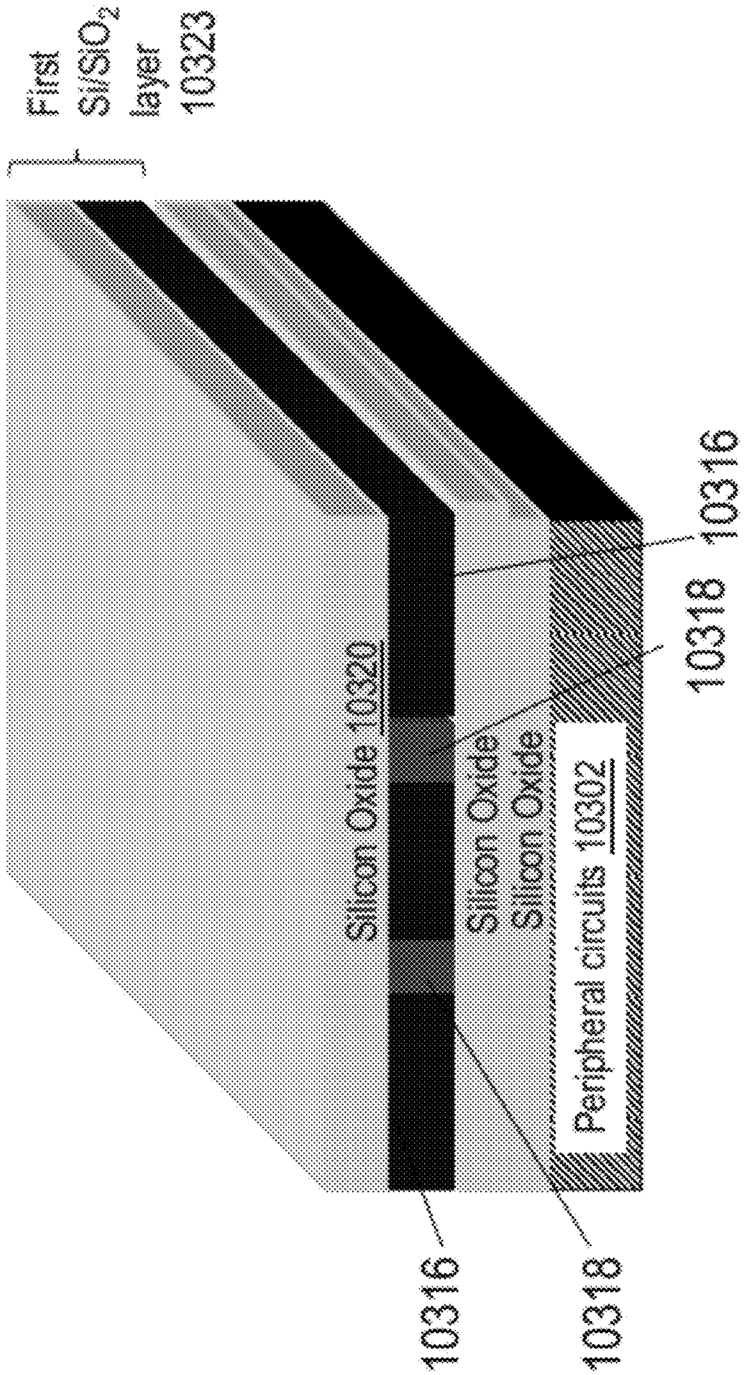

As illustrated in FIG. 103E, oxide layer 10320 may be deposited to prepare the surface for later oxide to oxide bonding, leading to the formation of the first Si/SiO2 layer 10323 that may include silicon oxide layer 10320, N+ silicon regions 10316, and P-silicon regions 10318.

Figure 103F:
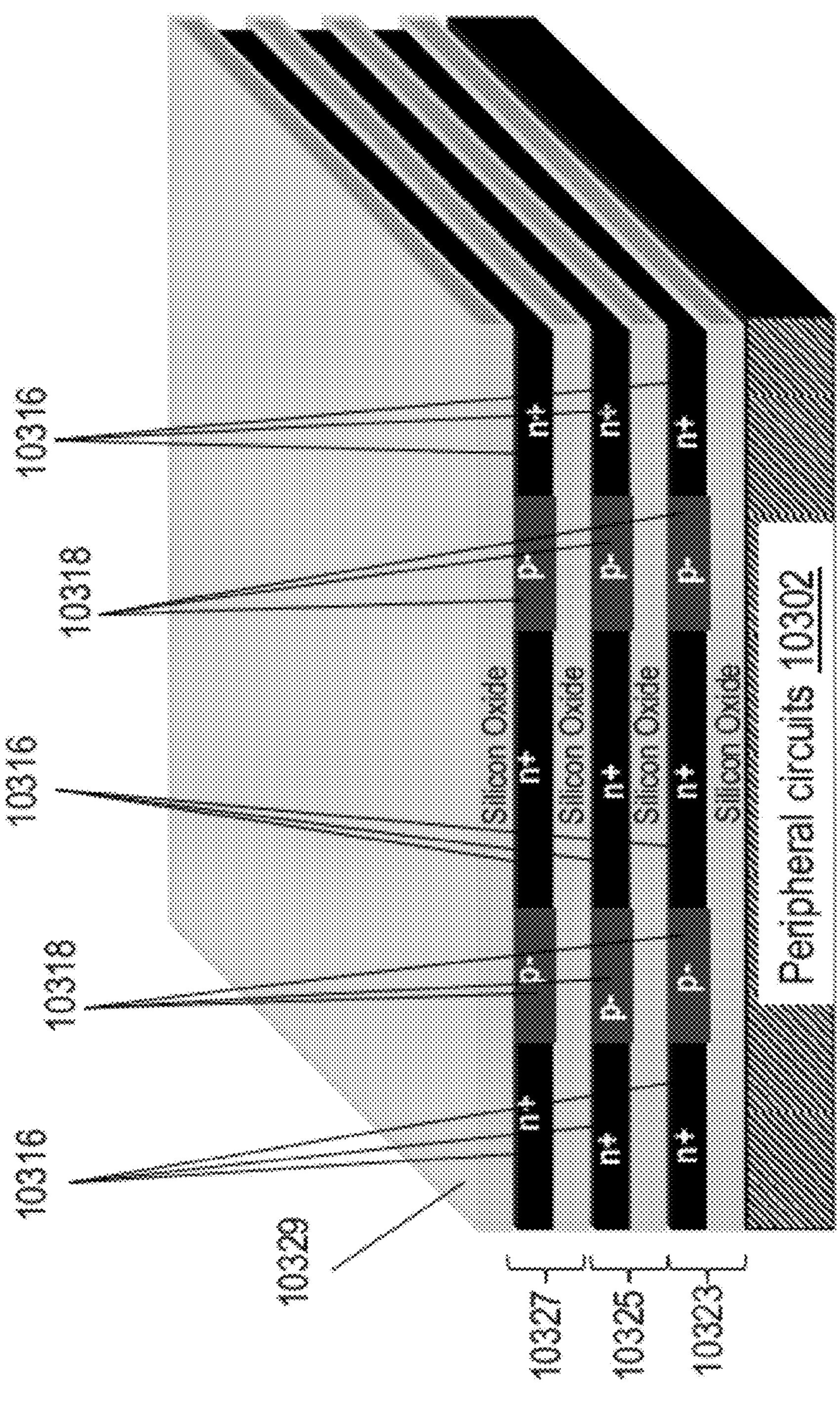

As illustrated in FIG. 103F, additional Si/SiO2 layers, such as, for example. second Si/SiO2 layer 10325 and third Si/SiO2 layer 10327, may each be formed as described in FIGS. 103A to 103E. Oxide layer 10329 may be deposited. After substantially all the numbers of memory layers are constructed, a rapid thermal anneal (RTA) or flash anneal may be conducted to activate the dopants in substantially all of the memory layers 10323, 10325, 10327 and in the peripheral circuitry substrate 10302. Alternatively, optical anneals, such as, for example, a laser based anneal, may be performed.

Figure 103G:
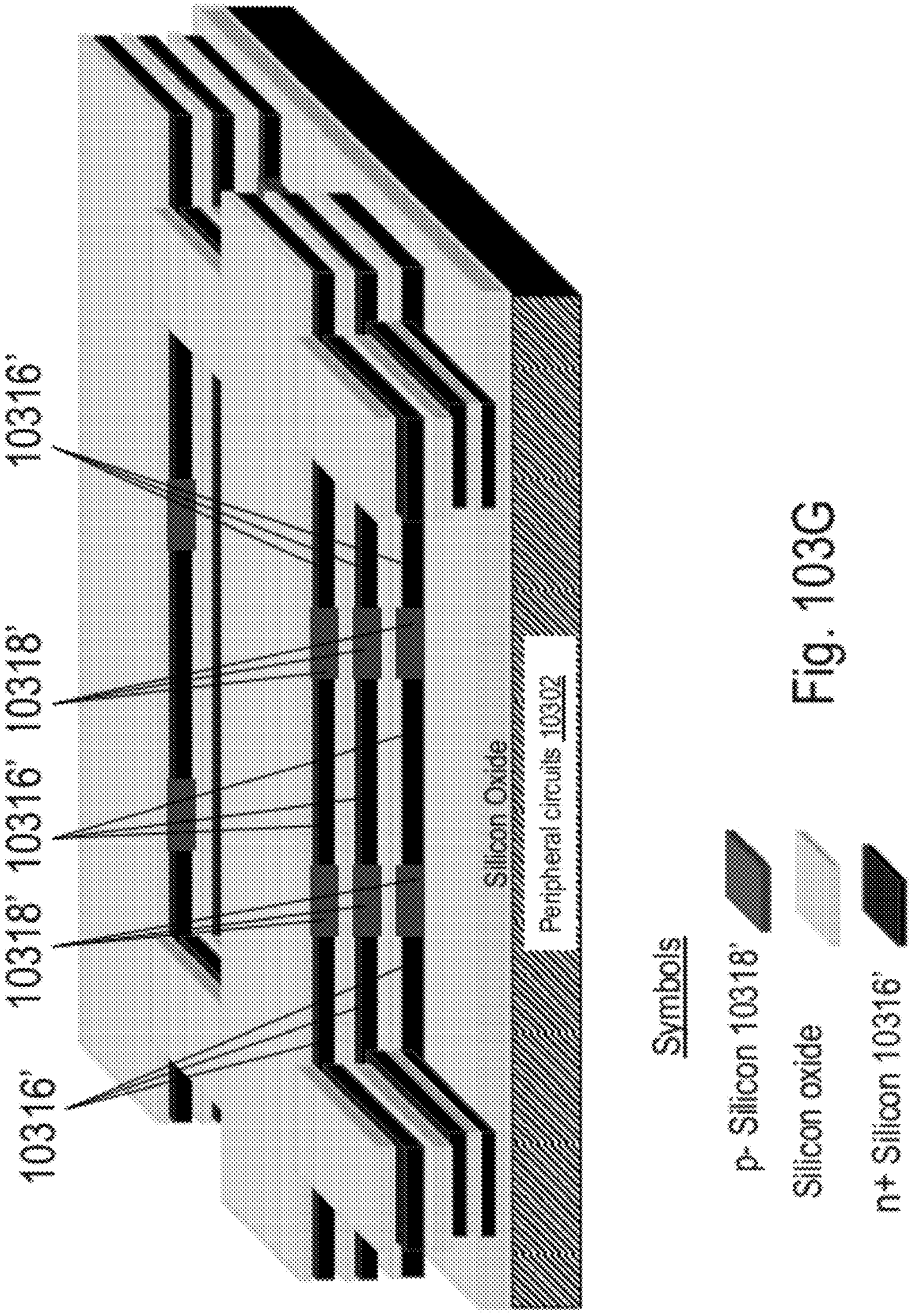

As illustrated in FIG. 103G, oxide layer 10329, third Si/SiO2 layer 10327, second Si/SiO2 layer 10325 and first Si/SiO2 layer 10323 may be lithographically defined and plasma/RIE etched to form a portion of the memory cell structure. The etching may result in regions of P− silicon 10318', which forms the transistor channels, and N+ regions 10316', which may form the source, drain and local source lines. Thus, these transistor elements or portions may have been defined by a common lithography step, which also may be described as a single lithography step, same lithography step, or one lithography step.

Figure 103H:
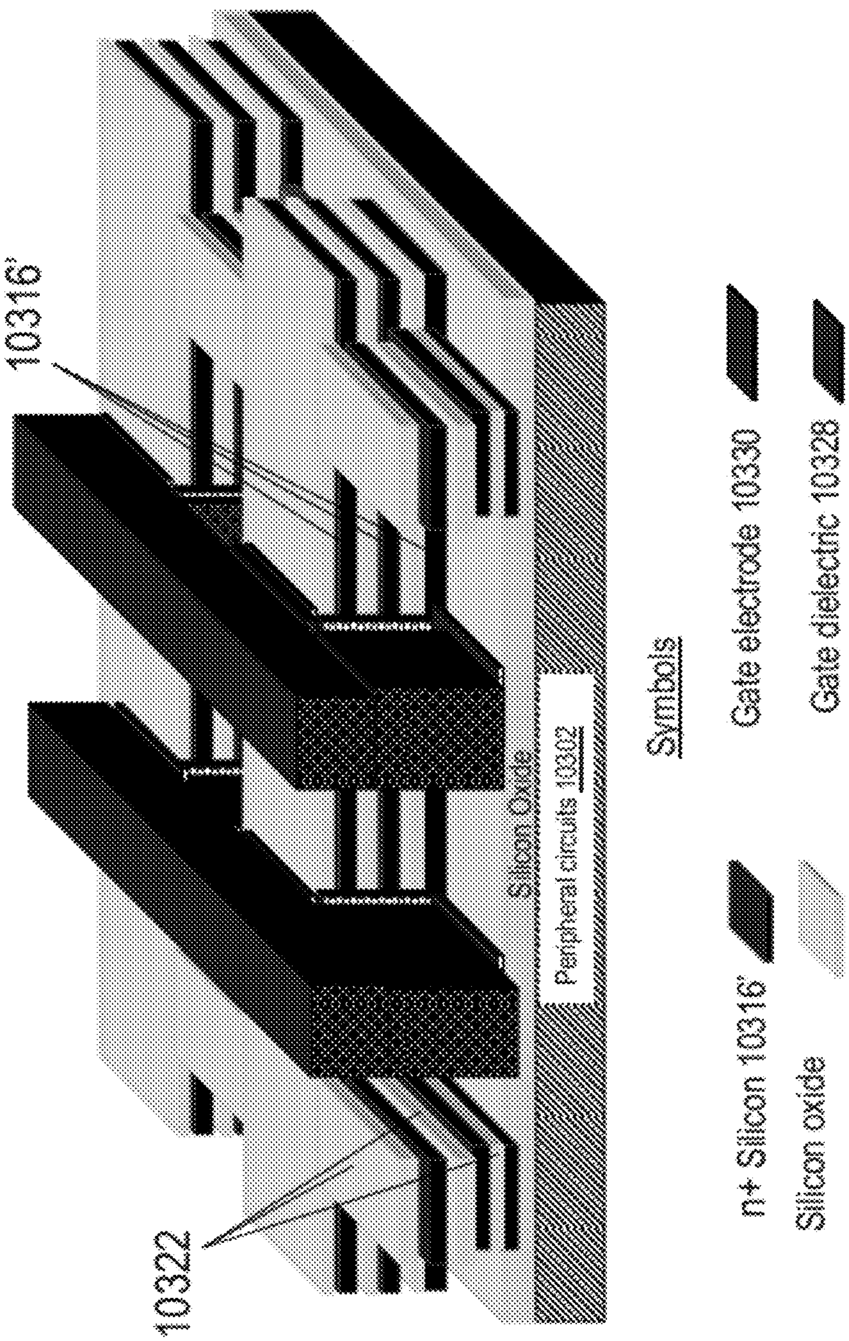

As illustrated in FIG. 103H, a gate dielectric and gate electrode material may be deposited, planarized with a chemical mechanical polish (CMP), and then lithographically defined and plasma/RIE etched to form gate dielectric regions 10328 which may be either self-aligned to and covered by gate electrodes 10330 (shown), or cover substantially the entire silicon/oxide multi-layer structure. The gate electrode 10330 and gate dielectric 10328 stack may be sized and aligned such that P− regions 10318' are substantially completely covered. The gate stack including gate electrode 10330 and gate dielectric 10328 may be formed with a gate dielectric, such as thermal oxide, and a gate electrode material, such as, for example, poly-crystalline silicon. Alternatively, the gate dielectric may be an atomic layer deposited (ALD) material that may be paired with a work function specific gate metal according to industry standard high k metal gate process schemes described previously. Moreover, the gate dielectric may be formed with a rapid thermal oxidation (RTO), a low temperature oxide deposition or low temperature microwave plasma oxidation of the silicon surfaces and then a gate electrode such as tungsten or aluminum may be deposited. SiO2 regions 10322, the result from the etching of the three Si/SiO2 layers in FIG. 103G, are denoted.

Figure 103I:
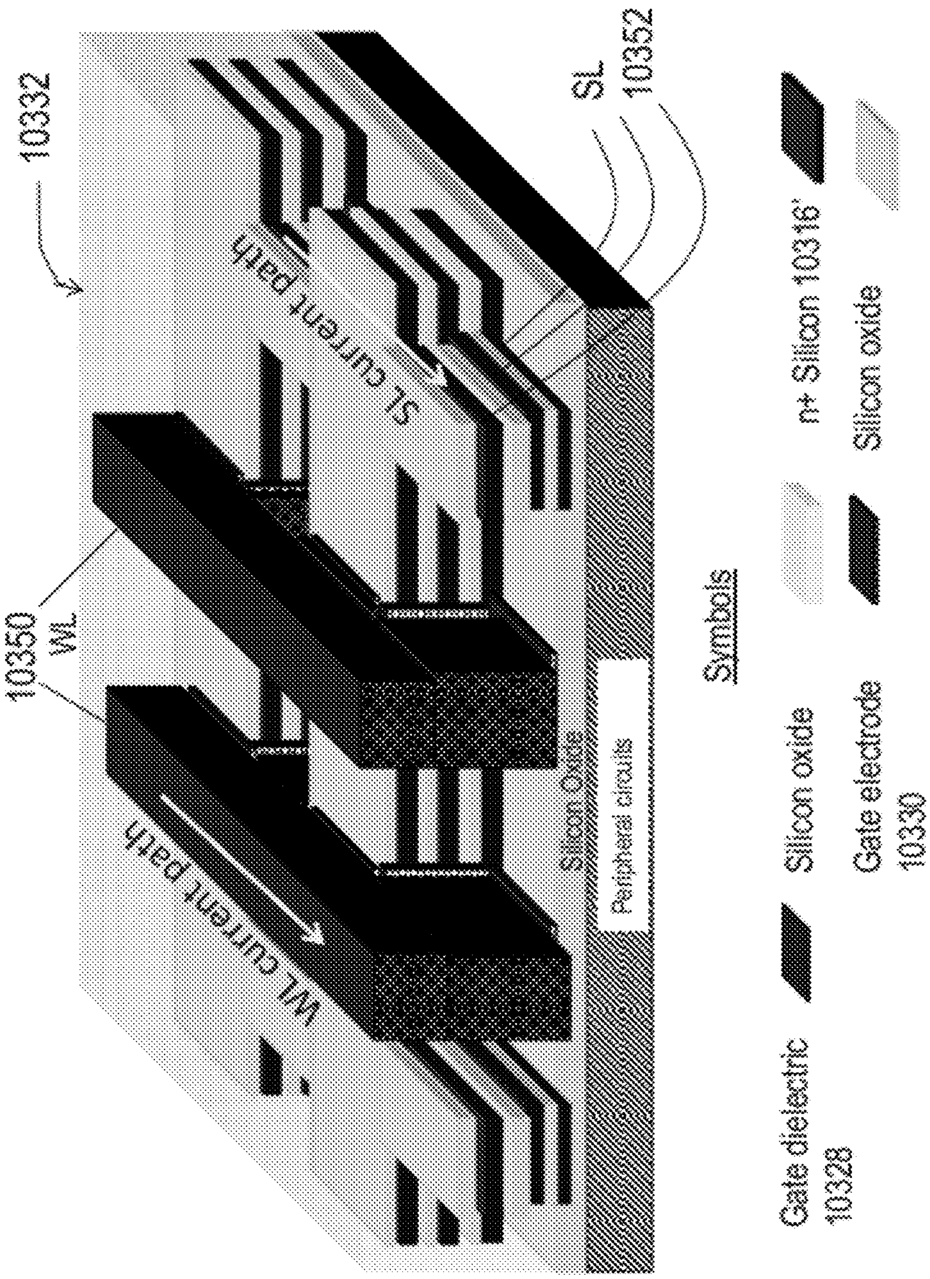

As illustrated in FIG. 103I, the entire structure may be covered with a gap fill oxide 10332, which may be planarized with chemical mechanical polishing. The oxide 10332 is shown transparent in the figure for clarity in illustration. Also shown are word-line regions (WL) 10350, which may be coupled with and composed of gate electrodes 10330, and source-line regions (SL) 10352, composed of indicated N+ regions 10316'.

Figure 103J:
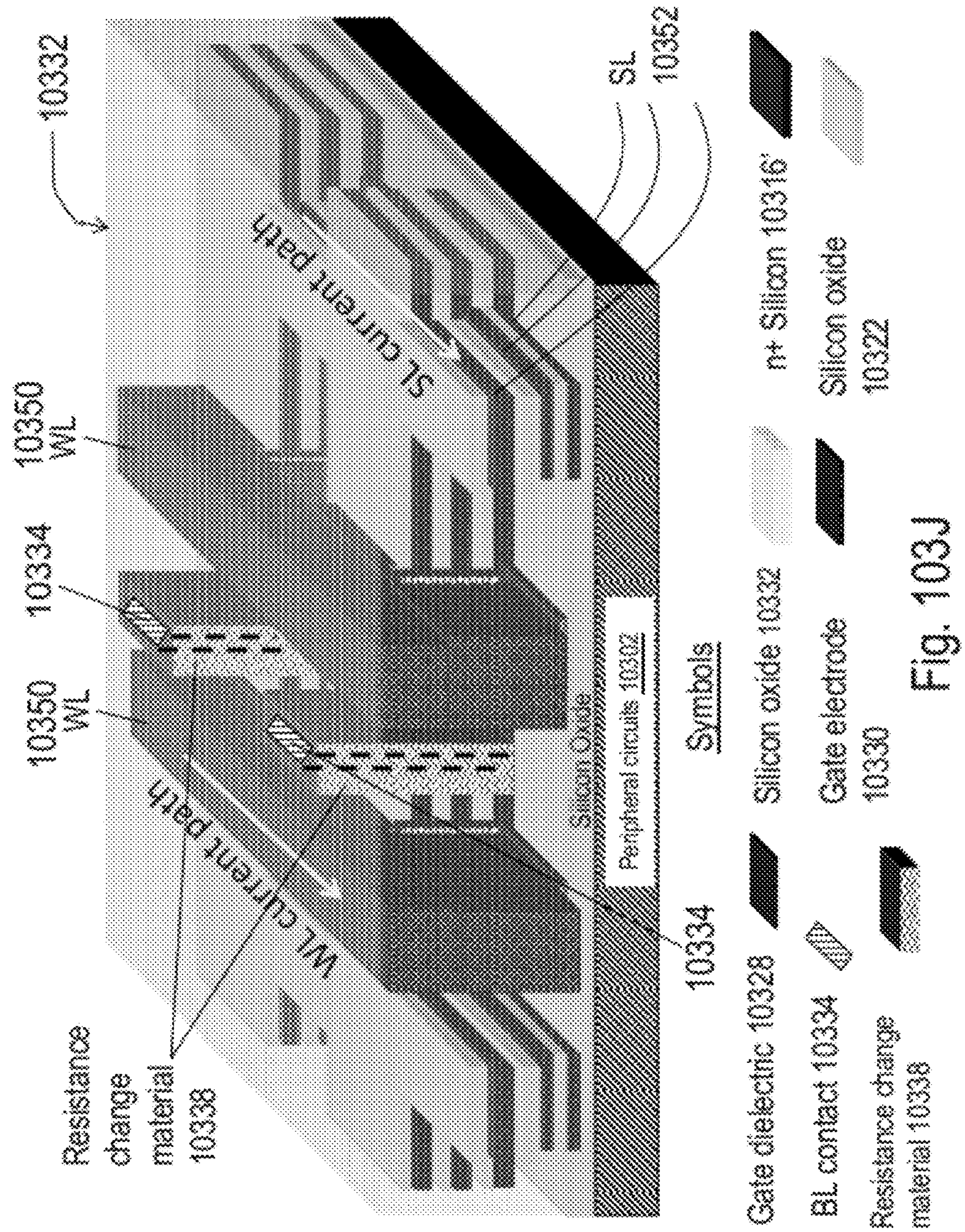

As illustrated in FIG. 103J, bit-line (BL) contacts 10334 may be lithographically defined, then etched with, for example, plasma/RIE, through oxide 10332, the three N+ regions 10316', and the associated oxide vertical isolation regions to connect substantially all memory layers vertically. BL contacts 10334 may then be processed by a photoresist removal. Resistance change material 10338, such as, for example, hafnium oxide, may then be deposited, for example, with atomic layer deposition (ALD). The electrode for the resistance change memory element may then be deposited by ALD to form the BL contact/electrode 10334. The excess deposited material may be polished to planarity at or below the top of oxide 10332. Each BL contact/electrode 10334 with resistive change material 10338 may be shared among substantially all layers of memory, shown as three layers of memory in FIG. 103J.

Figure 103K:
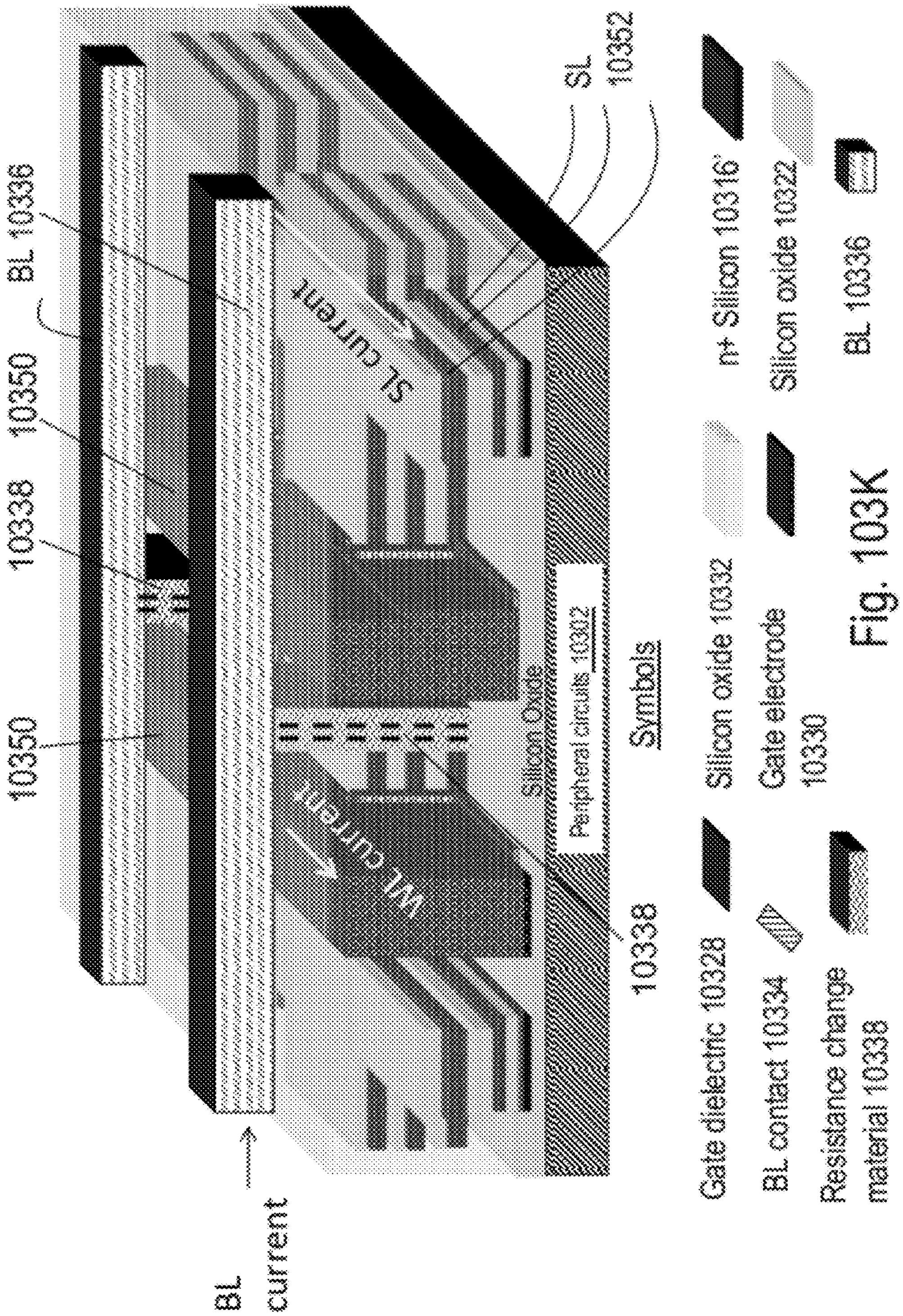

As illustrated in FIG. 103K, BL metal lines 10336 may be formed and connected to the associated BL contacts 10334 with resistive change material 10338. Contacts and associated metal interconnect lines (not shown) may be formed for the WL and SL at the memory array edges. A through layer via (not shown) may be formed to electrically couple the BL, SL, and WL metallization to the acceptor wafer 10314 peripheral circuitry via an acceptor wafer metal connect pad (not shown).

Figure 103L:
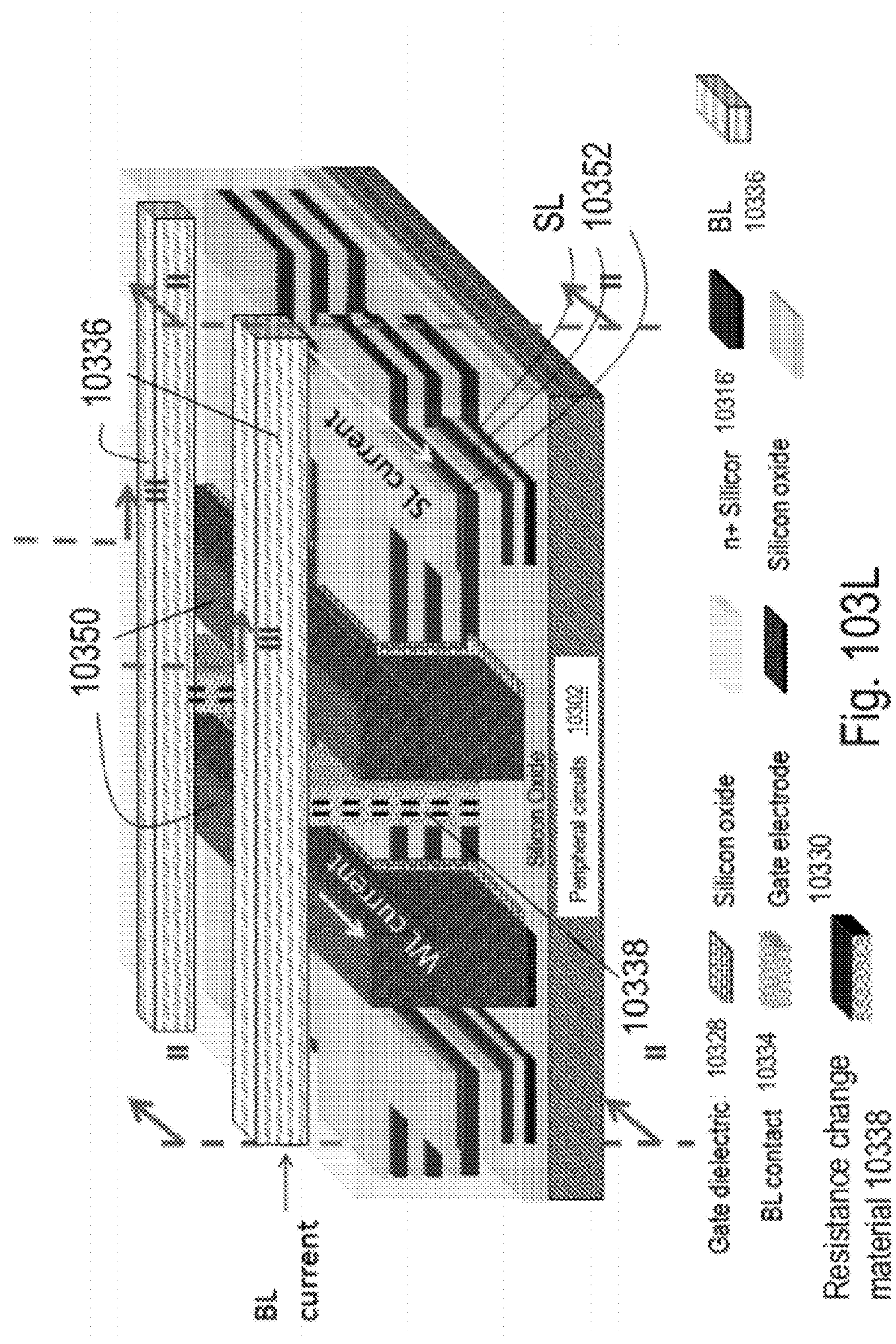

FIG. 103L1 is a cross section cut II view of FIG. 103L, while FIG. 103L2 is a cross-sectional cut III view of FIG. 103L. FIG. 103L2 shows BL metal line 10336, oxide 10332, BL contact/electrode 10334, resistive change material 10338, WL regions 10350, gate dielectric 10328, P− regions 10318', N+ regions 10316', and peripheral circuitry substrate 10302. The BL contact/electrode 10334 may couple to one side, N+ regions 10326, of the three levels of resistive change material 10338. The other side of the resistive change material 10338 may be coupled to N+ regions 10316'. The P− regions 10318' with associated N+ regions 10316' and 10326 on each side may form the source, channel, and drain of the select transistor. FIG. 103L2 shows BL metal lines 10336, oxide 10332, gate electrode 10330, gate dielectric 10328, P− regions 10318', interlayer oxide regions ('ox'), and peripheral circuitry substrate 10302. The gate electrode 10330 may be common to all six P− regions 10318' and may control the six double gated MOSFET select transistors.

Figure 103M:
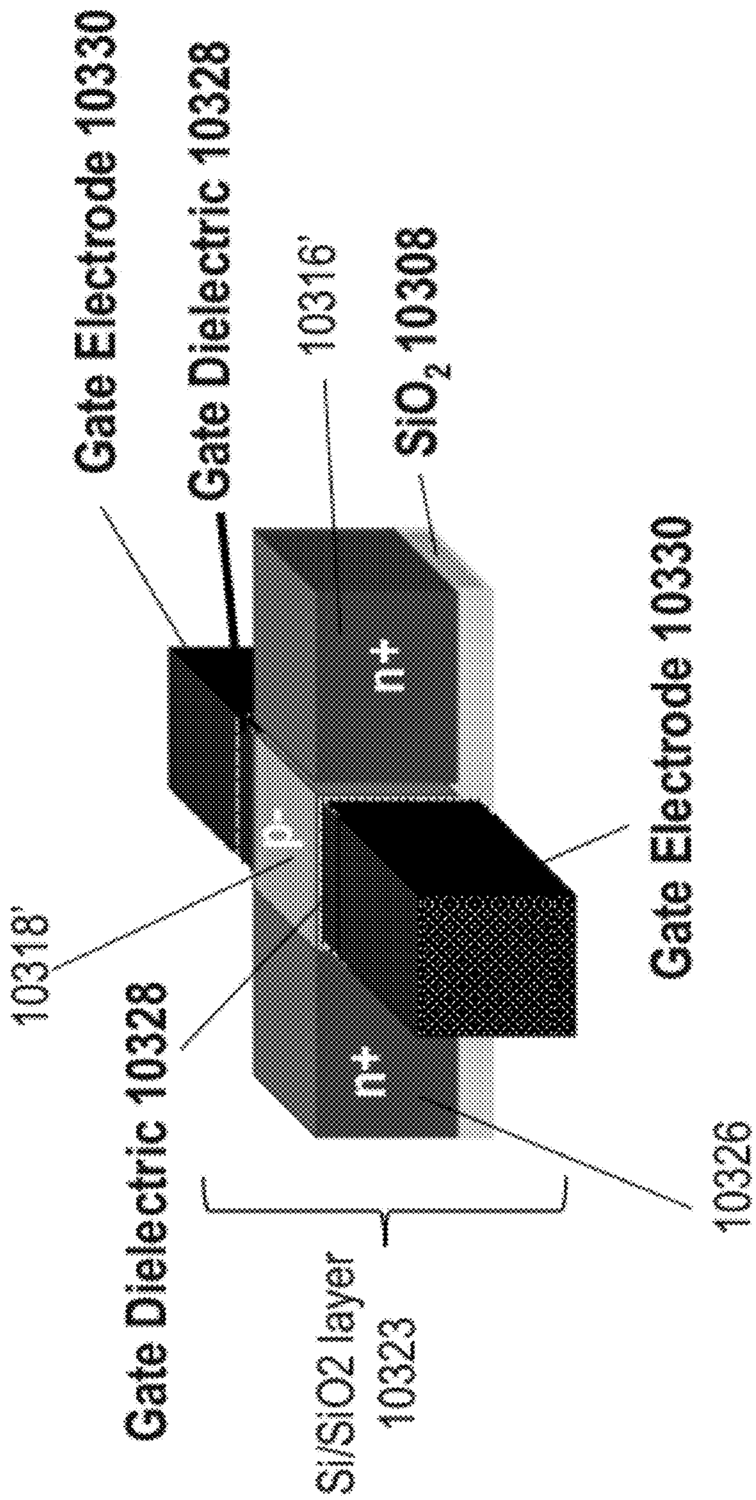

As illustrated in FIG. 103M, a single exemplary double gated MOSFET select transistor on the first Si/SiO2 layer 10323 may include P− region 10318' (functioning as the transistor channel), N+ region 10316' and N+ region 10326 (functioning as source and drain), and two gate electrodes 10330 with associated gate dielectrics 10328. The transistor may be electrically isolated from beneath by oxide layer 10308.

The above flow may enable the formation of a resistance-based 3D memory with one additional masking step per memory layer constructed by layer transfers of wafer sized doped mono-crystalline silicon layers and may be connected to an underlying multi-metal layer semiconductor device.

Persons of ordinary skill in the art will appreciate that the illustrations in FIGS. 103A through 103M are exemplary only and are not drawn to scale. Such skilled persons will further appreciate that many variations may be possible such as, for example, the transistors may be of another type, such as RCATs. Additionally, the contacts may utilize doped poly-crystalline silicon, or other conductive materials. Moreover, the stacked memory layer may be connected to a periphery circuit that may be above the memory stack. Further, Si/SiO2 layers 10323, 10325 and 10327 may be annealed layer-by-layer as soon as their associated implantations are complete by using a laser anneal system. Many other modifications within the scope of the illustrated embodiments of the invention will suggest themselves to such skilled persons after reading this specification. Thus the invention is to be limited only by the appended claims.

As illustrated in FIGS. 104A to 104F, a resistance-based 3D memory with two additional masking steps per memory layer may be constructed that may be suitable for 3D IC manufacturing. This 3D memory may utilize single gate MOSFET select transistors and may have a resistance-based memory element in series with the select transistor.

Figure 104A:
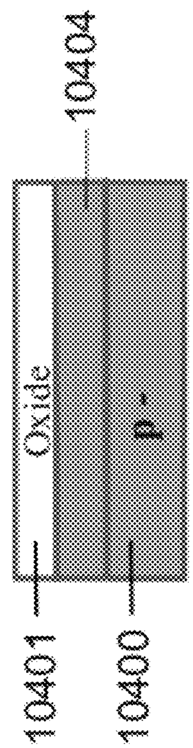

As illustrated in FIG. 104A, a P− substrate donor wafer 10400 may be processed to include a wafer sized layer of P− doping 10404. The P− layer 10404 may have the same or different dopant concentration than the P− substrate donor wafer 10400. The P− layer 10404 may be formed by ion implantation and thermal anneal. A screen oxide 10401 may be grown before the implant to protect the silicon from implant contamination and to provide an oxide surface for later wafer to wafer bonding.

Figure 104B:
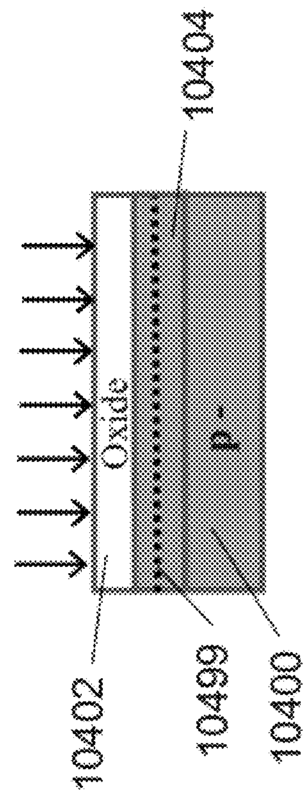

As illustrated in FIG. 104B, the top surface of P− substrate donor wafer 10400 may be prepared for oxide wafer bonding with a deposition of an oxide or by thermal oxidation of the P− layer 10404 to form oxide layer 10402, or a re-oxidation of implant screen oxide 10401. A layer transfer demarcation plane 10499 (shown as a dashed line) may be formed in P− substrate donor wafer 10400 or P− layer 10404 (shown) by hydrogen implantation 10407 or other methods as previously described. Both the P− substrate donor wafer 10400 and acceptor wafer 10410 may be prepared for wafer bonding as previously described and then bonded, illustratively at a low temperature (less than about 400° C.) to minimize stresses. The portion of the P− layer 10404 and the P− substrate donor wafer 10400 above the layer transfer demarcation plane 10499 may be removed by cleaving and polishing, or other processes as previously described, such as, for example, ion-cut or other methods.

Figure 104C:
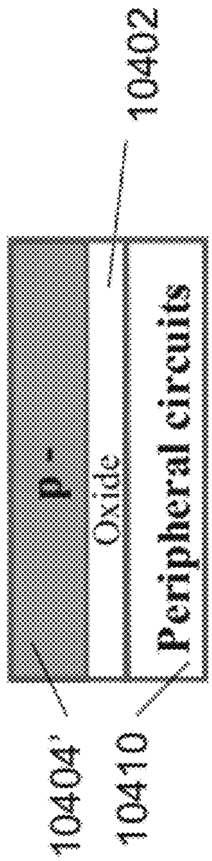

As illustrated in FIG. 104C, the remaining P− doped layer 10404', and oxide layer 10402 may have been layer transferred to acceptor wafer 10410. Acceptor wafer 10410 may include peripheral circuits such that they can withstand an additional rapid-thermal-anneal (RTA) or flash anneal and may still remain operational and retain good performance. For this purpose, the peripheral circuits may be formed such that they have been subject to a weak RTA or no RTA for activating dopants. Also, the peripheral circuits may utilize a refractory metal such as tungsten that can withstand high temperatures greater than about 400° C. The top surface of P− doped layer 10404' may be chemically or mechanically polished smooth and flat. Now transistors may be formed and aligned to the acceptor wafer 10410 alignment marks (not shown).

Figure 104D:
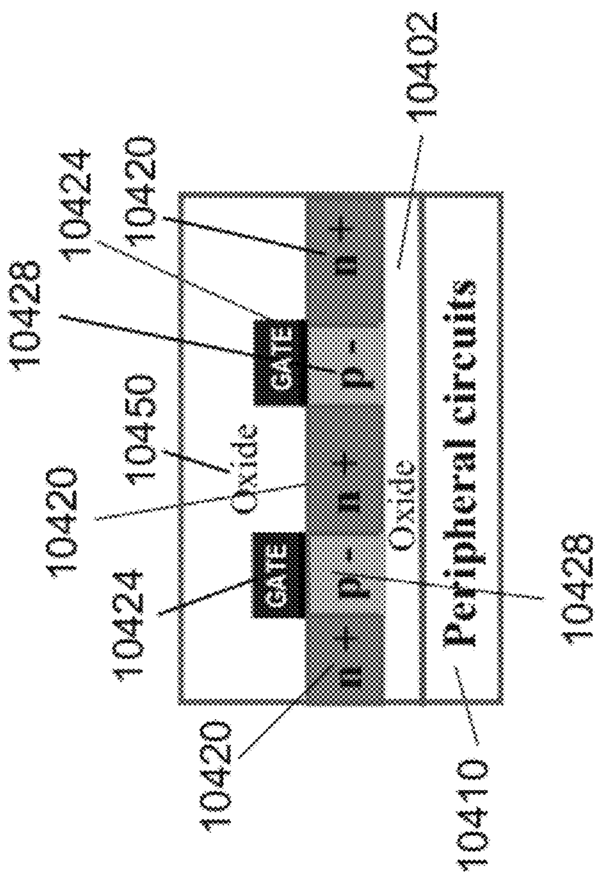

As illustrated in FIG. 104D, shallow trench isolation (STI) oxide regions (not shown) may be lithographically defined and plasma/RIE etched to at least the top level of oxide layer 10402, thus removing regions of P− doped layer 10404' of mono-crystalline silicon. A gap-fill oxide may be deposited and CMP'ed flat to form conventional STI oxide regions and P− doped mono-crystalline silicon regions (not shown) for forming the transistors. Threshold adjust implants may or may not be performed at this time. A gate stack 10424 may be formed with a gate dielectric, such as, for example, thermal oxide, and a gate metal material, such as, for example, polycrystalline silicon. Alternatively, the gate oxide may be an atomic layer deposited (ALD) gate dielectric that may be paired with a work function specific gate metal according to industry standard high k metal gate process schemes described previously. Moreover, the gate oxide may be formed with a rapid thermal oxidation (RTO), a low temperature oxide deposition or low temperature microwave plasma oxidation of the silicon surfaces and then a gate material such as, for example, tungsten or aluminum may be deposited. Gate stack self-aligned LDD (Lightly Doped Drain) and halo punch-thru implants may be performed at this time to adjust junction and transistor breakdown characteristics. A conventional spacer deposition of oxide and nitride and a subsequent etch-back may be done to form implant offset spacers (not shown) on the gate stacks 10424. A self-aligned N+ source and drain implant may be performed to create transistor source and drains 10420 and remaining P− silicon NMOS transistor channels 10428. High temperature anneal steps may or may not be done at this time to activate the implants and set initial junction depths. Finally, the entire structure may be covered with a gap fill oxide 10450, which may be planarized with chemical mechanical polishing. The oxide surface may be prepared for oxide to oxide wafer bonding as previously described.

Figure 104E:
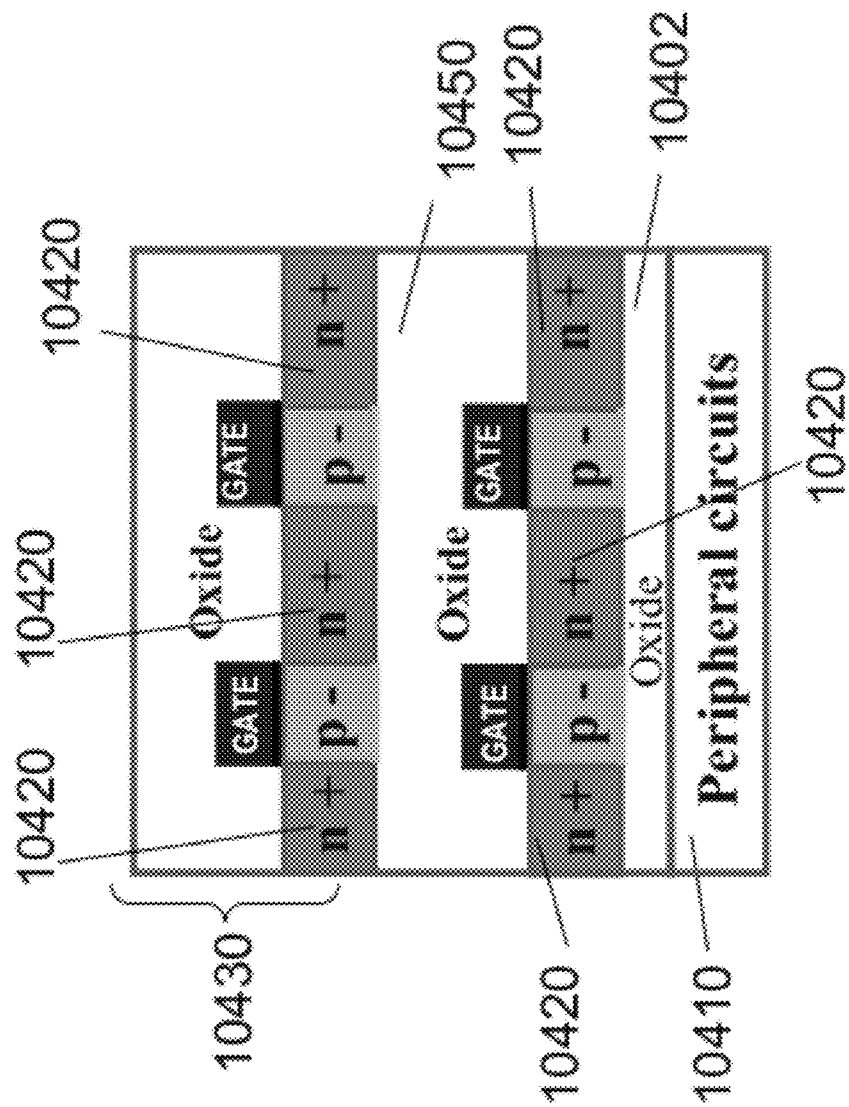

As illustrated in FIG. 104E, the transistor layer formation, bonding to acceptor wafer 10410 oxide 10450, and subsequent transistor formation as described in FIGS. 104A to 104D may be repeated to form the second tier 10430 of memory transistors. After substantially all the memory layers are constructed, a rapid thermal anneal (RTA) or flash anneal may be conducted to activate the dopants in substantially all of the memory layers and in the acceptor wafer 10410 peripheral circuits. Alternatively, optical anneals, such as, for example, a laser based anneal, may be performed.

Figure 104F:
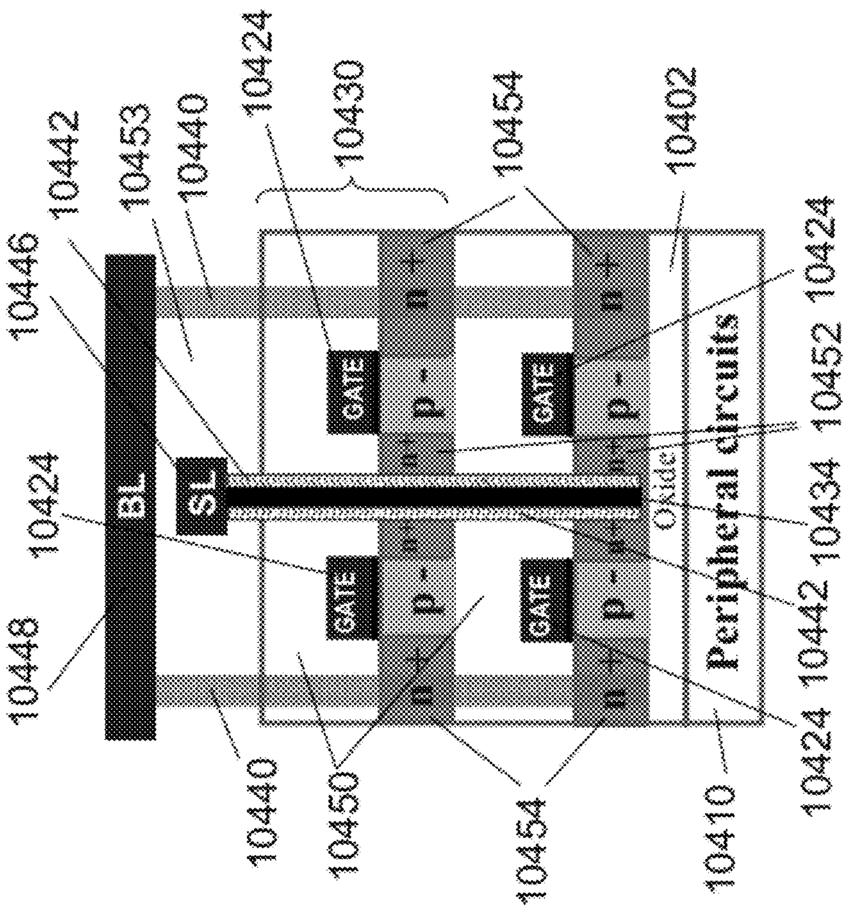

As illustrated in FIG. 104F, source-line (SL) contacts 10434 may be lithographically defined, then etched with, for example, plasma/RIE, through the oxide 10450 and N+ silicon regions 10420 of each memory tier, and the associated oxide vertical isolation regions to connect substantially all memory layers vertically. SL contacts may then be processed by a photoresist removal. Resistance change memory material 10442, such as, for example, hafnium oxide, may then be deposited, for example, with atomic layer deposition (ALD). The electrode for the resistance change memory element may then be deposited by ALD to form the SL contact/electrode 10434. The excess deposited material may be polished to planarity at or below the top of oxide 10450. Each SL contact/electrode 10434 with resistive change material 10442 may be shared among substantially all layers of memory, shown as two layers of memory in FIG. 104F. The SL contact 10434 may electrically couple the memory layers' transistor N+ regions on the transistor source side 10452. SL metal lines 10446 may be formed and connected to the associated SL contacts 10434 with resistive change material 10442. Oxide layer 10453 may be deposited and planarized. Bit-line (BL) contacts 10440 may be lithographically defined, then etched with, for example, plasma/RIE through oxide 10453, the oxide 10450 and N+ silicon regions 10420 of each memory tier, and the associated oxide vertical isolation regions to connect substantially all memory layers vertically. BL contacts 10440 may then be processed by a photoresist removal. BL contacts 10440 may electrically couple the memory layers' transistor N+ regions on the transistor drain side 10454. BL metal lines 10448 may be formed and connect to the associated BL contacts 10440. The gate stacks, such as 10424, may be connected with a contact and metallization (not shown) to form the word-lines (WLs). A through layer via (not shown) may be formed to electrically couple the BL, SL, and WL metallization to the acceptor wafer 10410 peripheral circuitry via an acceptor wafer metal connect pad (not shown).

This flow may enable the formation of a resistance-based 3D memory with two additional masking steps per memory layer constructed by layer transfers of wafer sized doped layers and this 3D memory may be connected to an underlying multi-metal layer semiconductor device.

Persons of ordinary skill in the art will appreciate that the illustrations in FIGS. 104A through 104F are exemplary only and are not drawn to scale. Such skilled persons will further appreciate that many variations may be possible such as, for example, the transistors may be of another type such as PMOS or RCATs. Additionally, the stacked memory layer may be connected to a periphery circuit that is above the memory stack. Moreover, each tier of memory could be configured with a slightly different donor wafer P− layer doping profile. Further, the memory could be organized in a different manner, such as BL and SL interchanged, or where there may be buried wiring whereby wiring for the memory array can be below the memory layers but above the periphery. Many other modifications within the scope of the illustrated embodiments of the invention will suggest themselves to such skilled persons after reading this specification. Thus the invention is to be limited only by the appended claims.

Charge trap NAND (Negated AND) memory devices may be another form of popular commercial non-volatile memories. Charge trap device may store their charge in a charge trap layer, wherein this charge trap layer then may influence the channel of a transistor. Background information on charge-trap memory can be found in "*Integrated Interconnect Technologies for* 3*D Nanoelectronic Systems*", Chapter 13, Artech House, 2009 by Bakir and Meindl (hereinafter Bakir), "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. and "Introduction to Flash memory," Proc. IEEE 91, 489-502 (2003) by R. Bez, et al. Work described in Bakir utilized selective epitaxy, laser recrystallization, or polysilicon to form the transistor channel, which can result in less than satisfactory transistor performance. The architectures shown in FIGS. 105 and 106 may be relevant for any type of charge-trap memory.

As illustrated in FIGS. 105A to 105G, a charge trap based two additional masking steps per memory layer 3D memory may be constructed that is suitable for 3D IC. This 3D memory may utilize NAND strings of charge trap transistors constructed in mono-crystalline silicon.

Figure 105A:
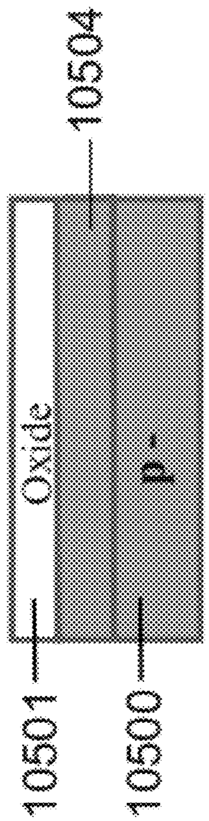

As illustrated in FIG. 105A, a P− substrate donor wafer 10500 may be processed to include a wafer sized layer of P− doping 10504. The P-doped layer 10504 may have the same or different dopant concentration than the P− substrate donor wafer 10500. The P-doped layer 10504 may have a vertical dopant gradient. The P− doped layer 10504 may be formed by ion implantation and thermal anneal. A screen oxide 10501 may be grown before the implant to protect the silicon from implant contamination and to provide an oxide surface for later wafer to wafer bonding.

Figure 105B:
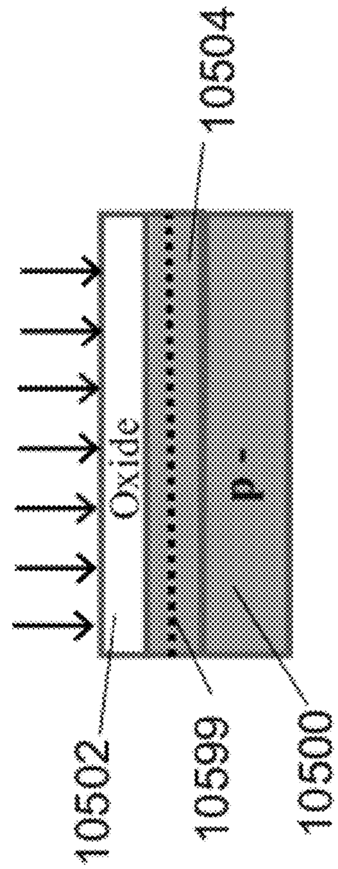

As illustrated in FIG. 105B, the top surface of P− substrate donor wafer 10500 may be prepared for oxide wafer bonding with a deposition of an oxide or by thermal oxidation of the P− doped layer 10504 to form oxide layer 10502, or a re-oxidation of implant screen oxide 10501. A layer transfer demarcation plane 10599 (shown as a dashed line) may be formed in P− substrate donor wafer 10500 or P− doped layer 10504 (shown) by hydrogen implantation 10507 or other methods as previously described. Both the P− substrate donor wafer 10500 and acceptor wafer 10510 may be prepared for wafer bonding as previously described and then bonded, for example, at a low temperature (e.g., less than about 400° C.) to minimize stresses. The portion of the P− doped layer 10504 and the P− substrate donor wafer 10500 that are above the layer transfer demarcation plane 10599 may be removed by cleaving and polishing, or other processes as previously described, such as ion-cut or other methods.

Figure 105C:
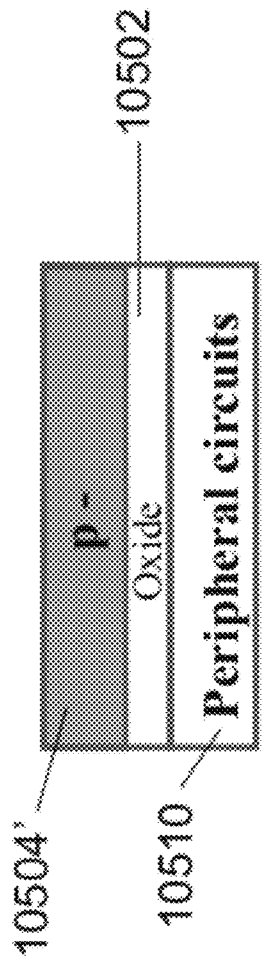

As illustrated in FIG. 105C, the remaining P− layer 10504', and oxide layer 10502 may have been layer transferred to acceptor wafer 10510. Acceptor wafer 10510 may include peripheral circuits such that the accepter wafer can withstand an additional rapid-thermal-anneal (RTA) or flash anneal and still remain operational and retain good performance. For this purpose, the peripheral circuits may be formed such that they have been subject to a weak RTA or no RTA for activating dopants. Also, the peripheral circuits may utilize a refractory metal such as, for example, tungsten that can withstand practical high temperatures greater than about 400° C. The top surface of P− layer 10504' may be chemically or mechanically polished smooth and flat. Transistors may be formed and aligned to the acceptor wafer 10510 alignment marks (not shown).

Figure 105D:
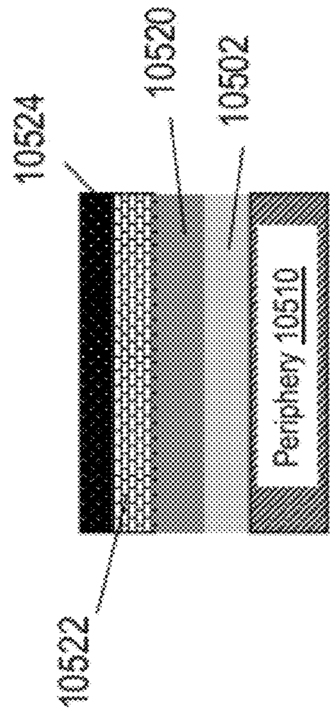

As illustrated in FIG. 105D, shallow trench isolation (STI) oxide regions (not shown) may be lithographically defined and plasma/RIE etched to at least the top level of oxide layer 10502, thus removing regions of P− layer 10504' of mono-crystalline silicon and forming P− silicon regions 10520. A gap-fill oxide may be deposited and CMP'ed flat to form conventional STI oxide regions and P− doped mono-crystalline silicon regions (not shown) for forming the transistors. Threshold adjust implants may or may not be performed at this time. A gate stack may be formed with growth or deposition of a charge trap gate dielectric 10522, such as, for example, thermal oxide and silicon nitride layers (ONO: Oxide-Nitride-Oxide), and a gate metal material 10524, such as, for example, doped or undoped poly-crystalline silicon. Alternatively, the charge trap gate dielectric may comprise silicon or III-V nano-crystals encased in an oxide.

Figure 105E:
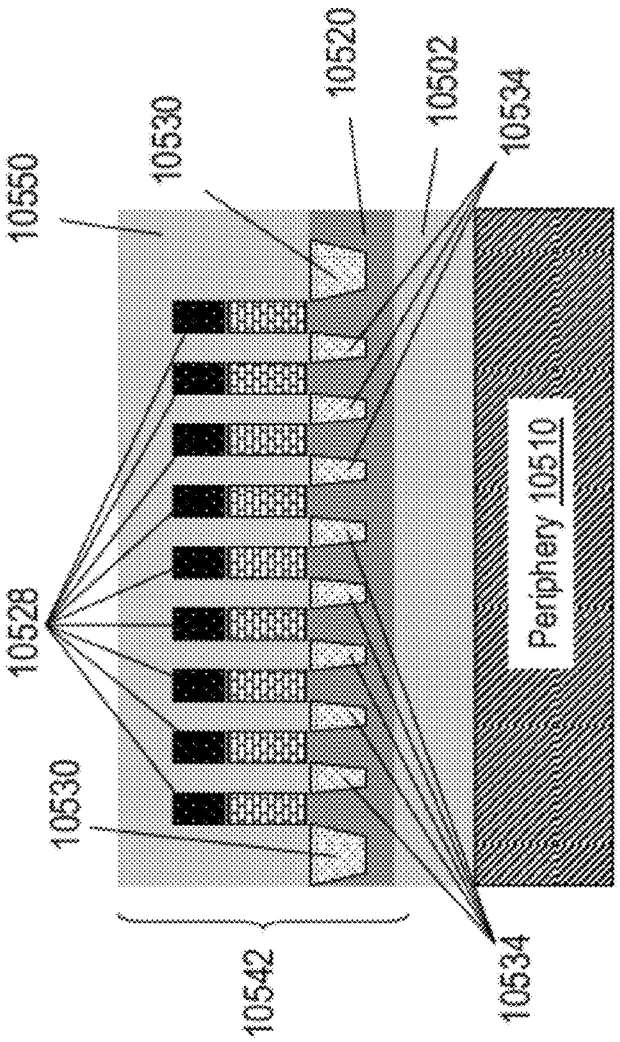

As illustrated in FIG. 105E, gate stacks 10528 may be lithographically defined and plasma/RIE etched, thus removing regions of gate metal material 10524 and charge trap gate dielectric 10522. A self-aligned N+ source and drain implant may be performed to create inter-transistor source and drains 10534 and end of NAND string source and drains 10530. Finally, the entire structure may be covered with a gap fill oxide 10550 and the oxide planarized with chemical mechanical polishing. The oxide surface may be prepared for oxide to oxide wafer bonding as previously described. This bonding may now form the first tier of memory transistors 10542 including oxide 10550, gate stacks 10528, inter-transistor source and drains 10534, end of NAND string source and drains 10530, P− silicon regions 10520, and oxide layer 10502.

Figure 105F:
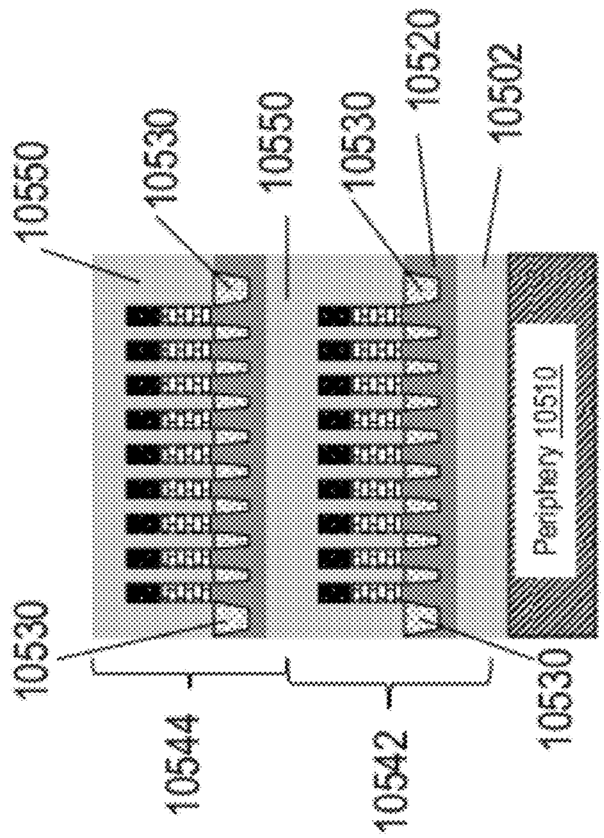

As illustrated in FIG. 105F, the transistor layer formation, bonding to acceptor wafer 10510 oxide 10550, and subsequent transistor formation as described in FIGS. 105A to 105D may be repeated to form the second tier 10544 of memory transistors on top of the first tier of memory transistors 10542. After substantially all the memory layers are constructed, a rapid thermal anneal (RTA) or flash anneal may be conducted to activate the dopants in substantially all of the memory layers and in the acceptor wafer 10510 peripheral circuits. Alternatively, optical anneals, such as, for example, a laser based anneal, may be performed.

Figure 105G:
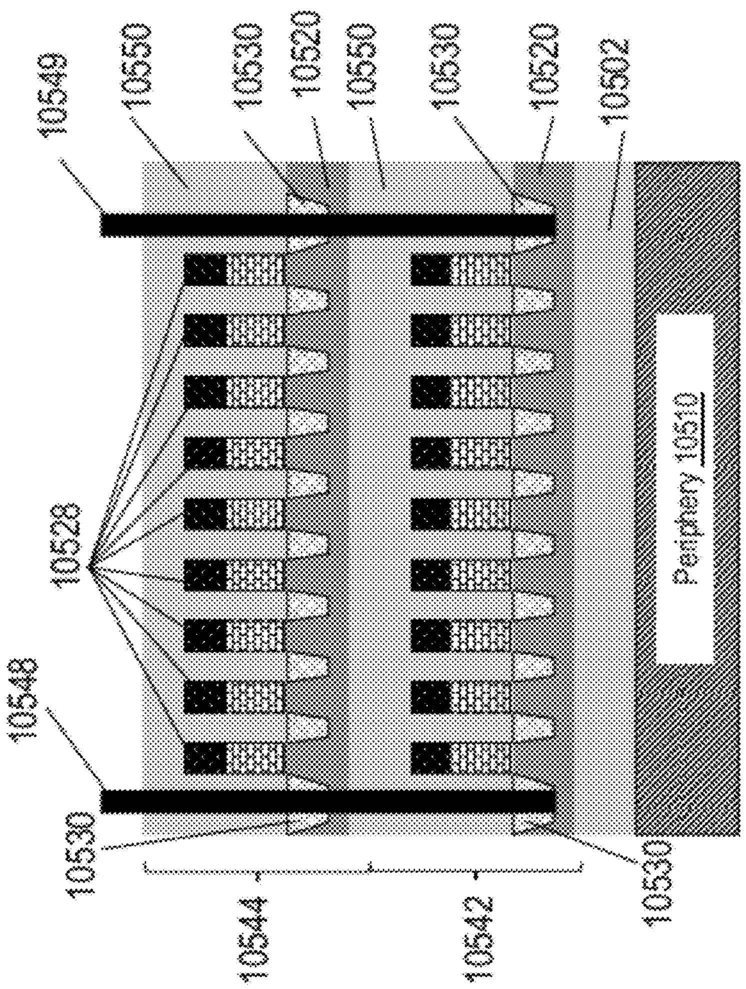

As illustrated in FIG. 105G, source line (SL) ground contact 10548 and bit line contact 10549 may be lithographically defined, then etched with, for example, plasma/RIE, through oxide 10550, end of NAND string source and drains 10530, P-silicon regions 10520 of each memory tier, and the associated oxide vertical isolation regions to connect substantially all memory layers vertically. SL ground contacts and bit line contact may then be processed by a photoresist removal. Metal or heavily doped poly-crystalline silicon may be utilized to fill the contacts and metallization utilized to form BL and SL wiring (not shown). The gate stacks 10528 may be connected with a contact and metallization to form the word-lines (WLs) and WL wiring (not shown). A through layer via (not shown) may be formed to electrically couple the BL, SL, and WL metallization to the acceptor wafer 10510 peripheral circuitry via an acceptor wafer metal connect pad (not shown).

This flow may enable the formation of a charge trap based 3D memory with two additional masking steps per memory layer constructed by layer transfers of wafer sized doped layers of mono-crystalline silicon and this 3D memory may be connected to an underlying multi-metal layer semiconductor device.

Persons of ordinary skill in the art will appreciate that the illustrations in FIGS. 105A through 105G are exemplary only and are not drawn to scale. Such skilled persons will further appreciate that many variations may be possible such as, for example, BL or SL select transistors may be constructed within the process flow. Moreover, the stacked memory layer may be connected to a periphery circuit that is above the memory stack. Additionally, each tier of memory could be configured with a slightly different donor wafer P− layer doping profile. Further, the memory could be organized in a different manner, such as BL and SL interchanged, or these architectures can be modified into a NOR flash memory style, or where buried wiring for the memory array may be below the memory layers but above the periphery. Besides, the charge trap dielectric and gate layer may be deposited before the layer transfer and temporarily bonded to a carrier or holder wafer or substrate and then transferred to the acceptor substrate with periphery. Many other modifications within the scope of the illustrated embodiments of invention will suggest themselves to such skilled persons after reading this specification. Thus the invention is to be limited only by the appended claims.

As illustrated in FIGS. 106A to 106G, a charge trap based 3D memory with zero additional masking steps per memory layer 3D memory may be constructed that may be suitable for 3D IC manufacturing. This 3D memory may utilize NAND strings of charge trap junction-less transistors with junction-less select transistors constructed in mono-crystalline silicon.

Figure 106A:
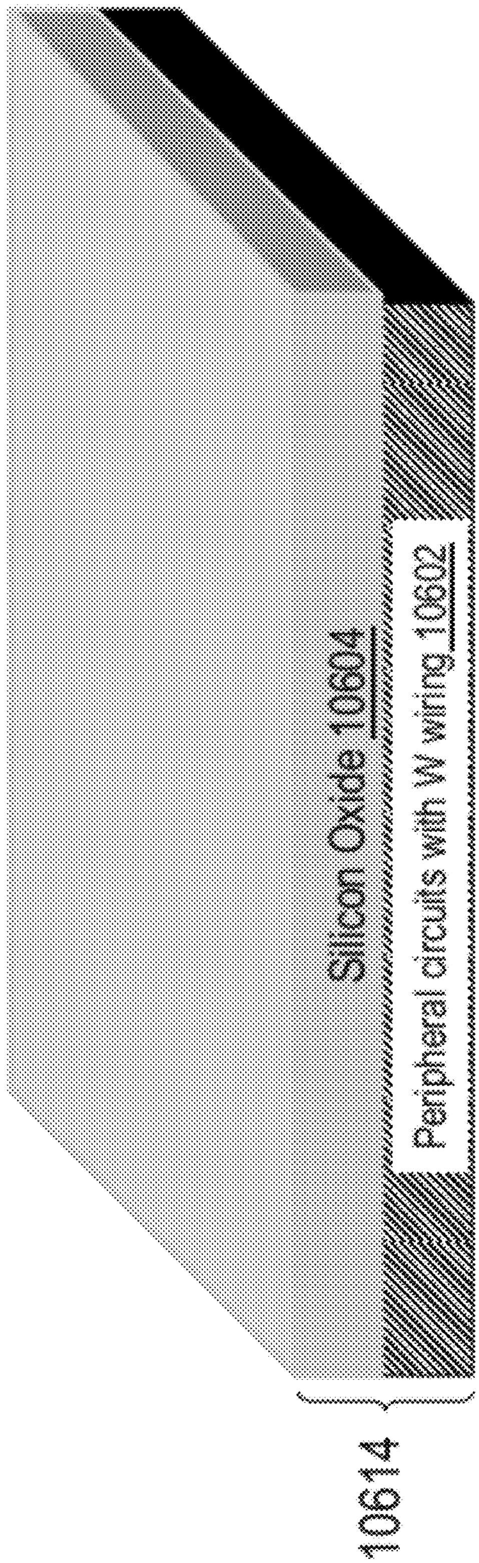

As illustrated in FIG. 106A, a silicon substrate with peripheral circuitry 10602 may be constructed with high temperature (e.g., greater than about 400° C.) resistant wiring, such as, for example, Tungsten. The peripheral circuitry substrate 10602 may include memory control circuits as well as circuitry for other purposes and of various types, such as, for example, analog, digital, RF, or memory. The peripheral circuitry substrate 10602 may include peripheral circuits that can withstand an additional rapid-thermal-anneal (RTA) or flash anneal and still remain operational and retain good performance. For this purpose, the peripheral circuits may be formed such that they have been subject to a weak RTA or no RTA for activating dopants. The top surface of the peripheral circuitry substrate 10602 may be prepared for oxide wafer bonding with a deposition of a silicon oxide layer 10604, thus forming acceptor substrate 10614.

Figure 106B:
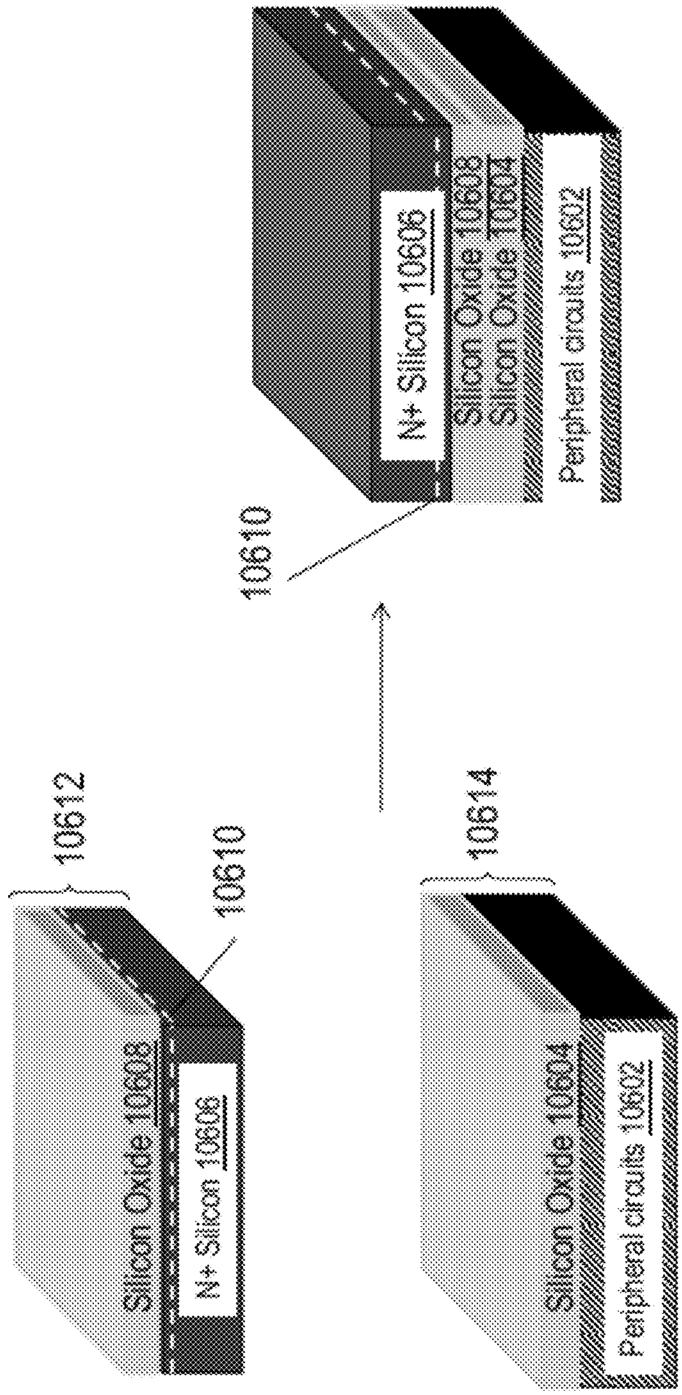

As illustrated in FIG. 106B, a mono-crystalline silicon donor wafer 10612 may be processed to include a wafer sized layer of N+ doping (not shown) which may have a different dopant concentration than the N+ substrate 10606. The N+ doping layer may be formed by ion implantation and thermal anneal. A screen oxide layer 10608 may be grown or deposited prior to the implant to protect the silicon from implant contamination and to provide an oxide surface for later wafer to wafer bonding. A layer transfer demarcation plane 10610 (shown as a dashed line) may be formed in donor wafer 10612 within the N+ substrate 10606 or the N+ doping layer (not shown) by hydrogen implantation or other methods as previously described. Both the donor wafer 10612 and acceptor substrate 10614 may be prepared for wafer bonding as previously described and then bonded at the surfaces of oxide layer 10604 and oxide layer 10608, at a low temperature (e.g., less than about 400° C. suitable for lowest stresses), or a moderate temperature (e.g., less than about 900° C.).

Figure 106C:
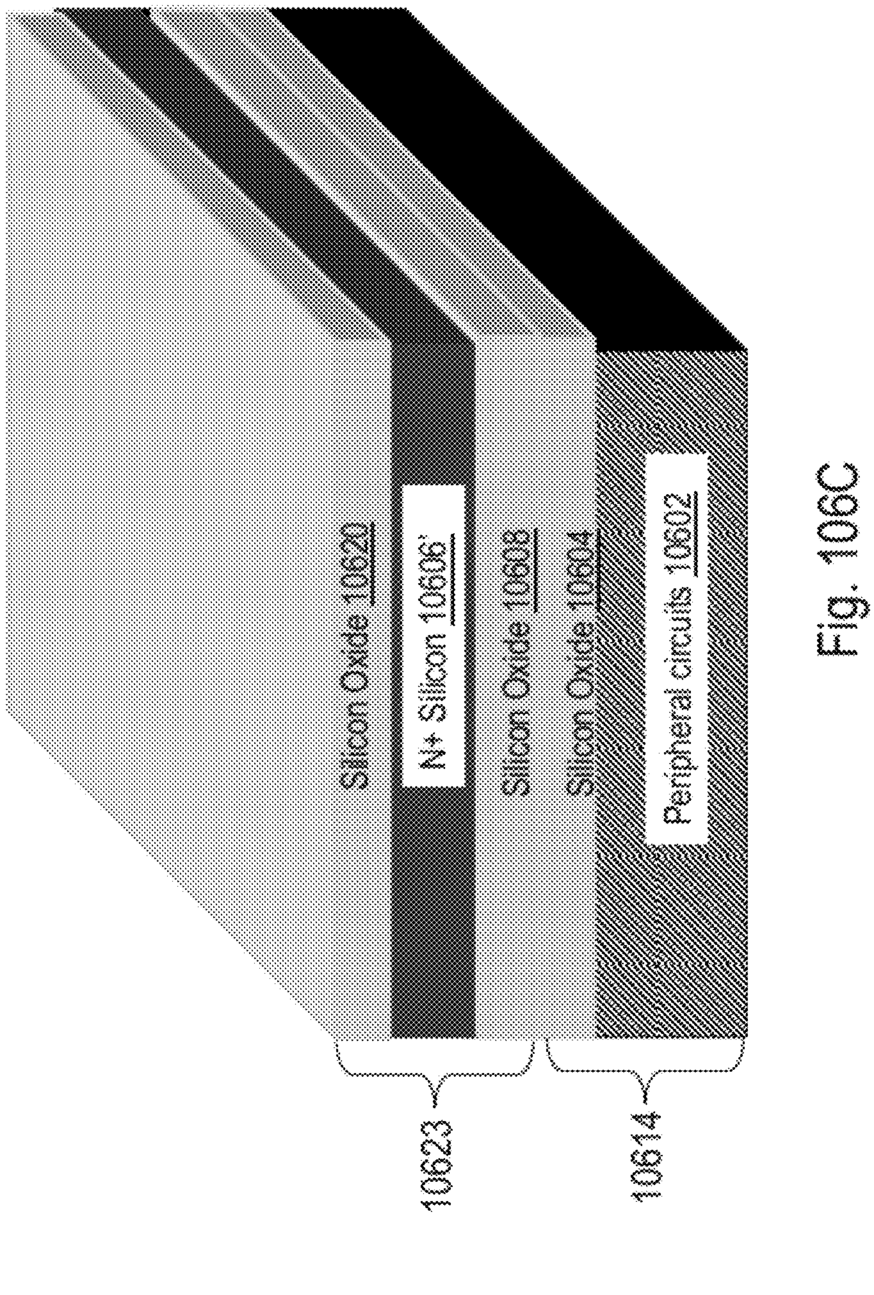

As illustrated in FIG. 106C, the portion of the N+ layer (not shown) and the N+ wafer substrate 10606 that may be above the layer transfer demarcation plane 10610 may be removed by cleaving and polishing, or other processes as previously described, such as ion-cut or other methods, thus forming the remaining mono-crystalline silicon N+ layer 10606'. Remaining N+ layer 10606' and oxide layer 10608 may have been layer transferred to acceptor substrate 10614. The top surface of N+ layer 10606' may be chemically or mechanically polished smooth and flat. Oxide layer 10620 may be deposited to prepare the surface for later oxide to oxide bonding. This bonding may now form the first Si/SiO2 layer 10623 including silicon oxide layer 10620, N+ silicon layer 10606', and oxide layer 10608.

Figure 106D:
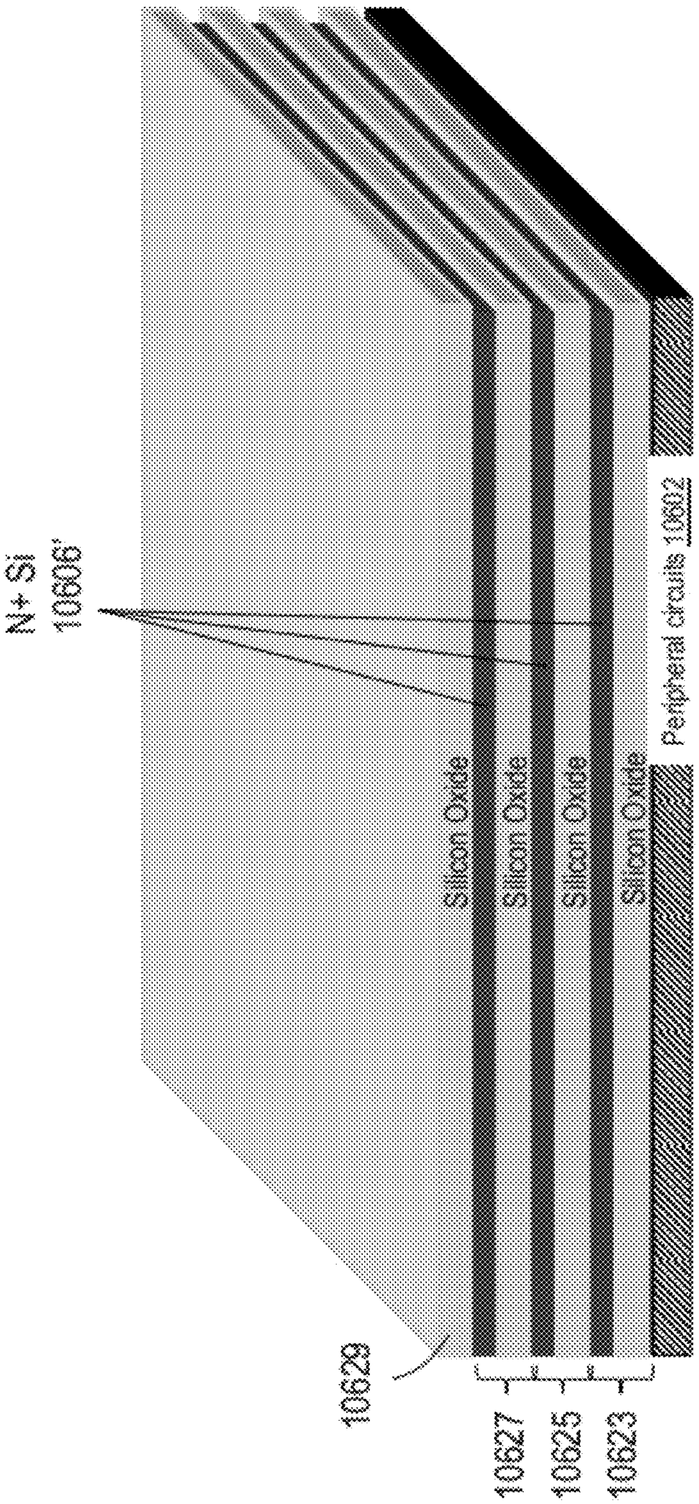

As illustrated in FIG. 106D, additional Si/SiO2 layers, such as, for example, second Si/SiO2 layer 10625 and third Si/SiO2 layer 10627, may each be formed as described in FIGS. 106A to 106C. Oxide layer 10629 may be deposited to electrically isolate the top N+ silicon layer.

Figure 106E:
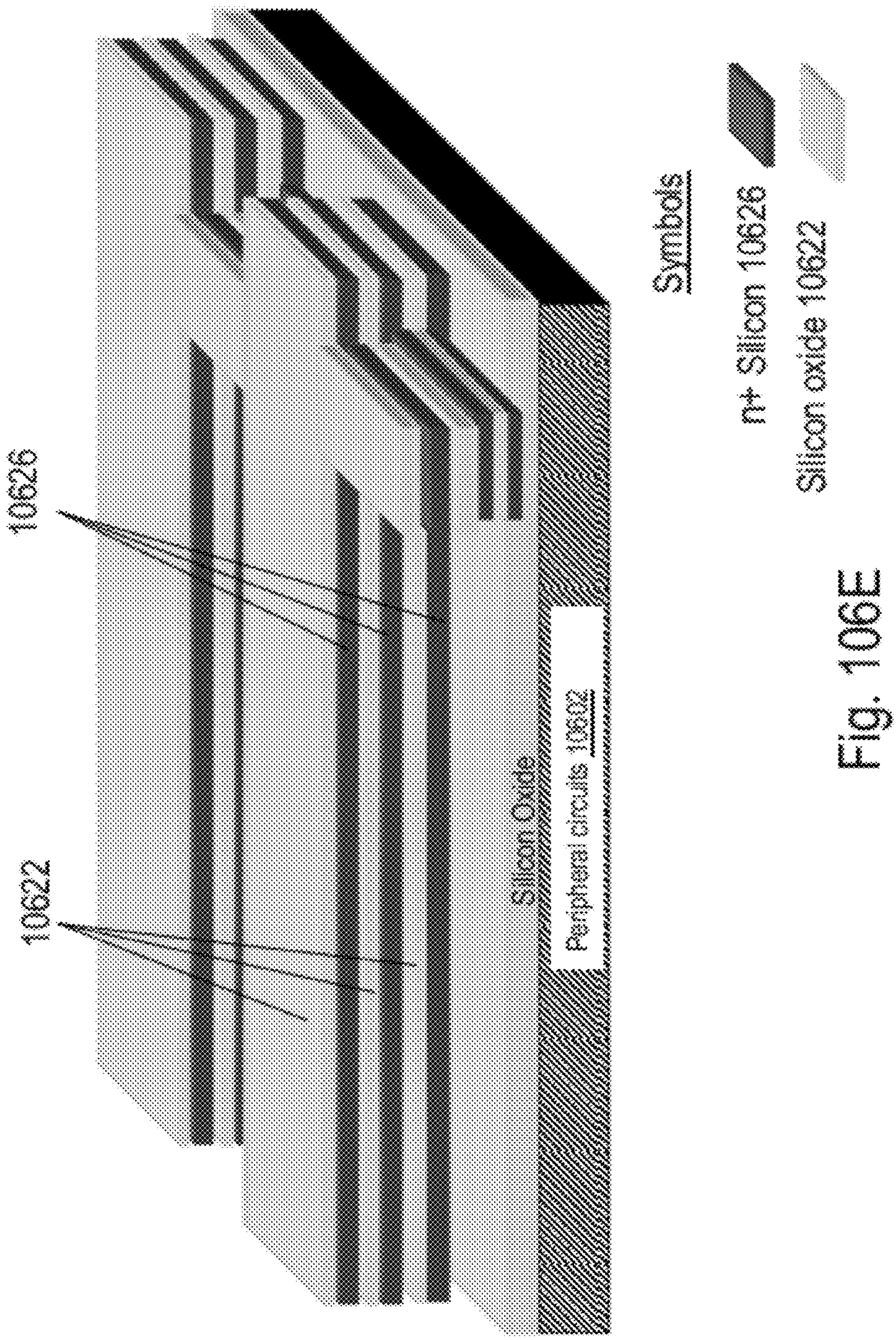

As illustrated in FIG. 106E, oxide layer 10629, third Si/SiO2 layer 10627, second Si/SiO2 layer 10625 and first Si/SiO2 layer 10623 may be lithographically defined and plasma/RIE etched to form a portion of the memory cell structure, which may now include regions of N+ silicon 10626 and oxide 10622. Thus, these transistor elements or portions may have been defined by a common lithography step, which also may be described as a single lithography step, same lithography step, or one lithography step.

Figure 106F:
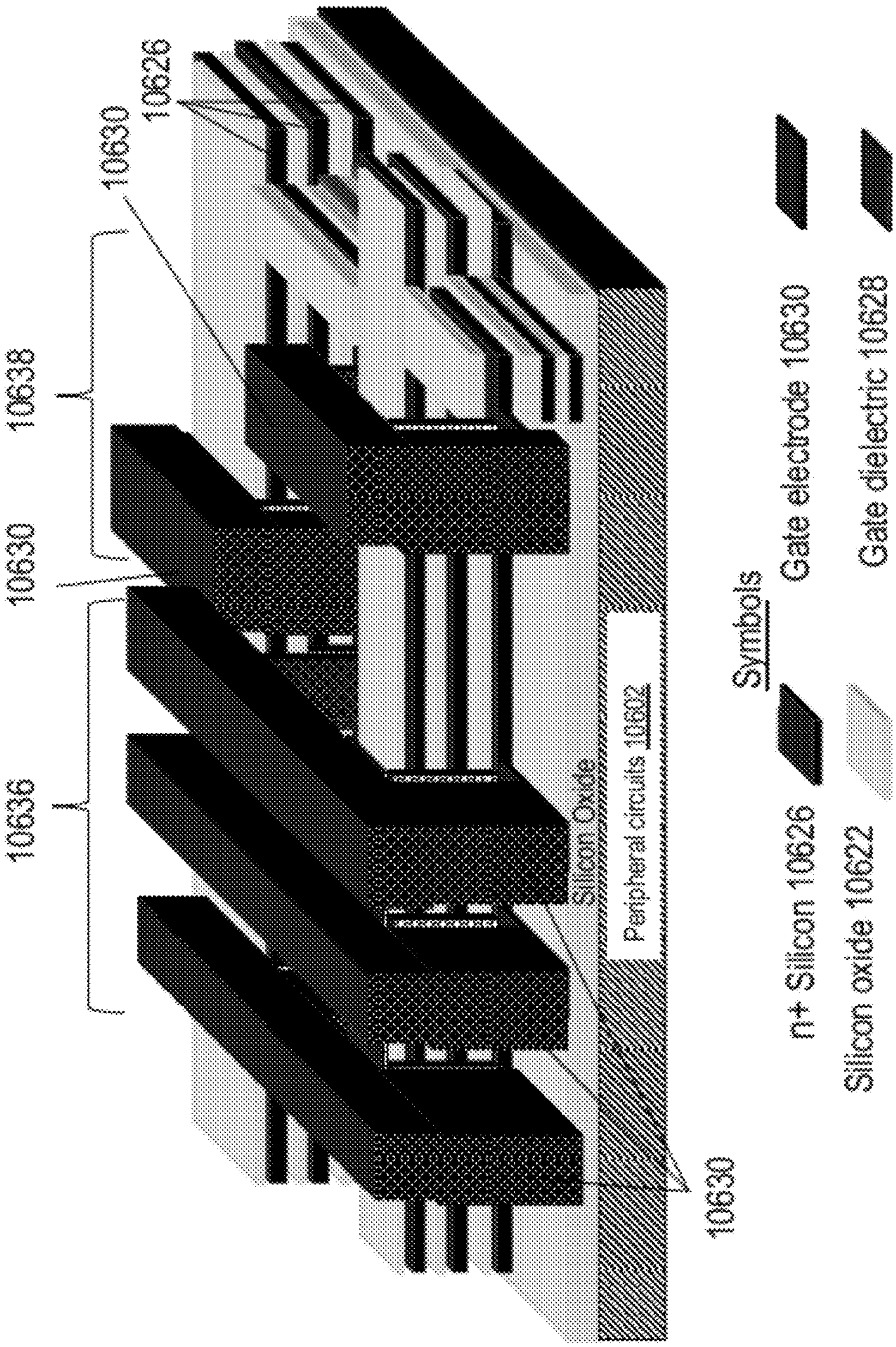

As illustrated in FIG. 106F, a gate stack may be formed with growth or deposition of a charge trap gate dielectric layer, such as thermal oxide and silicon nitride layers (ONO: Oxide-Nitride-Oxide), and a gate metal electrode layer, such as doped or undoped poly-crystalline silicon. The gate metal electrode layer may then be planarized with chemical mechanical polishing. Alternatively, the charge trap gate dielectric layer may include silicon or III-V nano-crystals encased in an oxide. The select transistor area 10638 may include a non-charge trap dielectric. The gate metal electrode regions 10630 and gate dielectric regions 10628 of both the NAND string area 10636 and select transistor area 10638 may be lithographically defined and plasma/RIE etched.

Figure 106G:
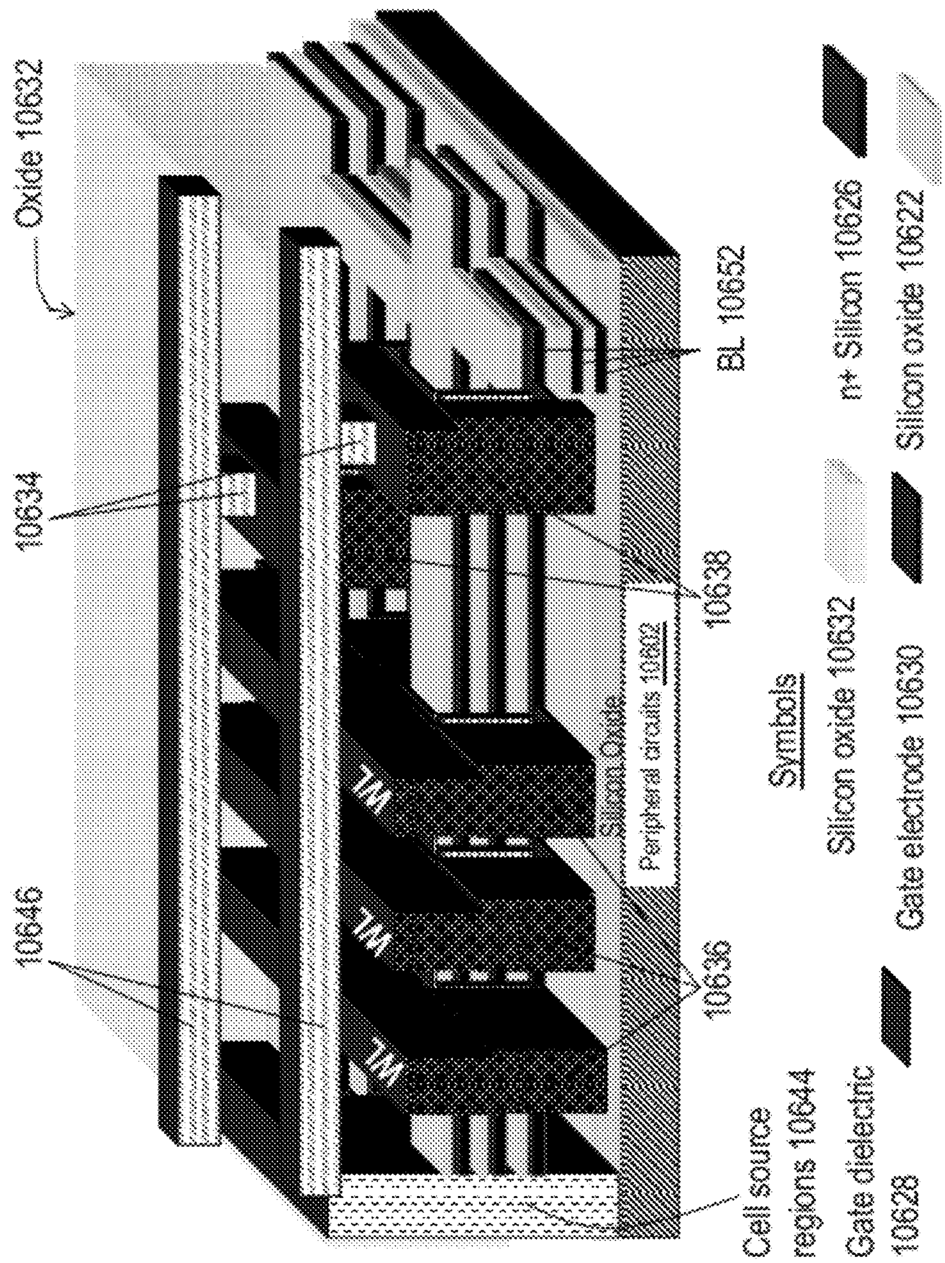

As illustrated in FIG. 106G, the entire structure may be covered with a gap fill oxide 10632, which may be planarized with chemical mechanical polishing. The gap fill oxide 10632 is shown transparent in the figure for clarity in illustration. Select metal lines 10646 may be formed and connected to the associated select gate contacts 10634. Contacts and associated metal interconnect lines (not shown) may be formed for the WL and SL at the memory array edges. Word-line regions (WL) 10636, gate metal electrode regions 10630, and bit-line regions (BL) 10652 including indicated N+ silicon regions 10626, are shown. Source regions 10644 may be formed by a trench contact etch and filled to couple to the N+ silicon regions on the source end of the NAND string 10636. A through layer via (not shown) may be formed to electrically couple the BL, SL, and WL metallization to the acceptor substrate 10614 peripheral circuitry via an acceptor wafer metal connect pad (not shown).

This flow may enable the formation of a charge trap based 3D memory with zero additional masking steps per memory layer constructed by layer transfers of wafer sized doped layers of mono-crystalline silicon and this 3D memory may be connected to an underlying multi-metal layer semiconductor device.

Persons of ordinary skill in the art will appreciate that the illustrations in FIGS. 106A through 106G are exemplary only and are not drawn to scale. Such skilled persons will further appreciate that many variations may be possible such as, for example, BL or SL contacts may be constructed in a staircase manner as described previously. Moreover, the stacked memory layer may be connected to a periphery circuit that may be above the memory stack. Additionally, each tier of memory could be configured with a slightly different donor wafer N+ layer doping profile. Further, the memory could be organized in a different manner, such as BL and SL interchanged, or where buried wiring for the memory array may be below the memory layers but above the periphery. Additional types of 3D charge trap memories may be constructed by layer transfer of mono-crystalline silicon; for example, those found in "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al., and "Multi-layered Vertical Gate NAND Flash overcoming stacking limit for terabit density storage", Symposium on VLSI Technology, 2009 by W. Kim, S. Choi, et al. Many other modifications within the scope of the illustrated embodiments of the invention will suggest themselves to such skilled persons after reading this specification. Thus the invention is to be limited only by the appended claims.

Floating gate (FG) memory devices may be another form of popular commercial non-volatile memories. Floating gate devices may store their charge in a conductive gate (FG) that may be nominally isolated from unintentional electric fields, wherein the charge on the FG then influences the channel of a transistor. Background information on floating gate flash memory can be found in "Introduction to Flash memory", Proc. IEEE 91, 489-502 (2003) by R. Bez, et al. The architectures shown in FIGS. 107 and 108 may be relevant for any type of floating gate memory.

As illustrated in FIGS. 107A to 107G, a floating gate based 3D memory with two additional masking steps per memory layer may be constructed that is suitable for 3D IC manufacturing. This 3D memory may utilize NAND strings of floating gate transistors constructed in mono-crystalline silicon.

Figure 107A:
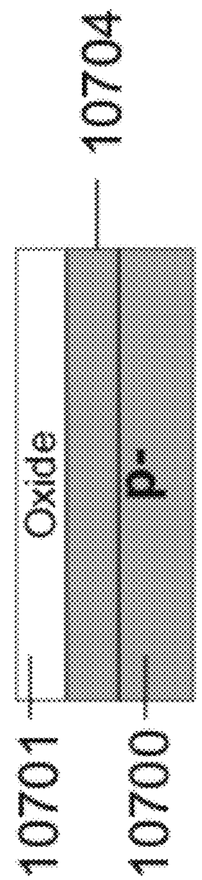

As illustrated in FIG. 107A, a P− substrate donor wafer 10700 may be processed to include a wafer sized layer of P− doping 10704. The P-doped layer 10704 may have the same or a different dopant concentration than the P− substrate donor wafer 10700. The P-doped layer 10704 may have a vertical dopant gradient. The P− doped layer 10704 may be formed by ion implantation and thermal anneal. A screen oxide 10701 may be grown before the implant to protect the silicon from implant contamination and to provide an oxide surface for later wafer to wafer bonding.

Figure 107B:
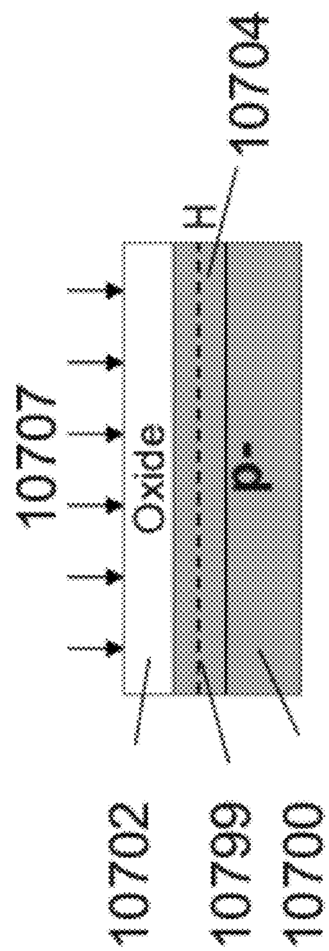

As illustrated in FIG. 107B, the top surface of P− substrate donor wafer 10700 may be prepared for oxide wafer bonding with a deposition of an oxide or by thermal oxidation of the P− doped layer 10704 to form oxide layer 10702, or a re-oxidation of implant screen oxide 10701. A layer transfer demarcation plane 10799 (shown as a dashed line) may be formed in P− substrate donor wafer 10700 or P− doped layer 10704 (shown) by hydrogen implantation 10707 or other methods as previously described. Both the P− substrate donor wafer 10700 and acceptor wafer 10710 may be prepared for wafer bonding as previously described and then bonded, for example, at a low temperature (less than about 400° C.) to minimize stresses. The portion of the P− doped layer 10704 and the P− substrate donor wafer 10700 that are above the layer transfer demarcation plane 10799 may be removed by cleaving and polishing, or other processes as previously described, such as ion-cut or other methods.

Figure 107C:
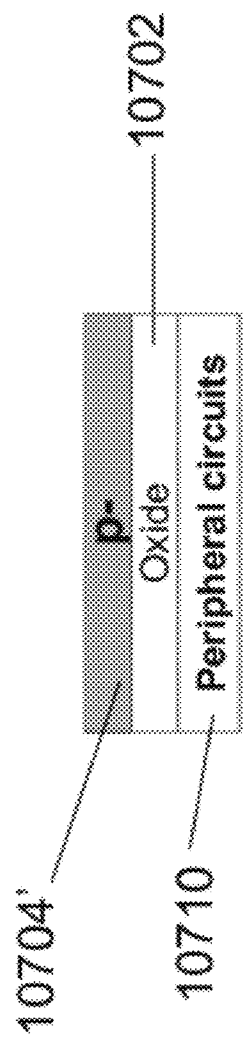

As illustrated in FIG. 107C, the remaining P− doped layer 10704', and oxide layer 10702 may have been layer transferred to acceptor wafer 10710. Acceptor wafer 10710 may include peripheral circuits such that they can withstand an additional rapid-thermal-anneal (RTA) or flash anneal and may still remain operational and retain good performance. For this purpose, the peripheral circuits may be formed such that they have been subjected to a weak RTA or no RTA for activating dopants. Also, the peripheral circuits may utilize a refractory metal such as, for example, tungsten that can withstand high temperatures greater than about 400° C. The top surface of P− doped layer 10704' may be chemically or mechanically polished smooth and flat. Transistors may be formed and aligned to the acceptor wafer 10710 alignment marks (not shown).

Figure 107D:
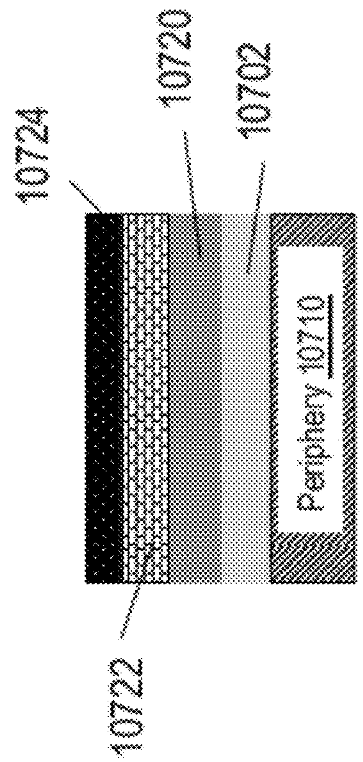

As illustrated in FIG. 107D a partial gate stack may be formed with growth or deposition of a tunnel oxide 10722, such as, for example, thermal oxide, and a FG gate metal material 10724, such as, for example, doped or undoped poly-crystalline silicon. Shallow trench isolation (STI) oxide regions (not shown) may be lithographically defined and plasma/RIE etched to at least the top level of oxide layer 10702, thus removing regions of P− doped layer 10704' of mono-crystalline silicon and forming P− doped regions 10720. A gap-fill oxide may be deposited and CMP'ed flat to form conventional STI oxide regions (not shown).

Figure 107E:
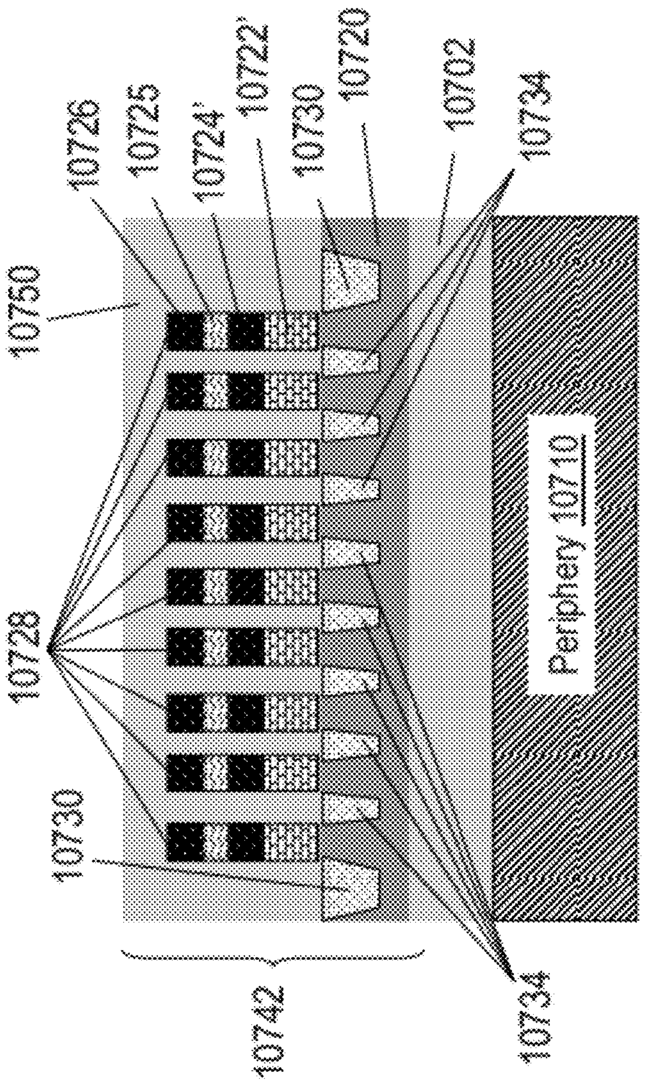

As illustrated in FIG. 107E, an inter-poly oxide layer, such as silicon oxide and silicon nitride layers (ONO: Oxide-Nitride-Oxide), and a Control Gate (CG) gate metal material, such as doped or undoped poly-crystalline silicon, may be deposited. The gate stacks 10728 may be lithographically defined and plasma/RIE etched, thus substantially removing regions of CG gate metal material, inter-poly oxide layer, FG gate metal material 10724, and tunnel oxide 10722. This removal may result in the gate stacks 10728 including CG gate metal regions 10726, inter-poly oxide regions 10725, FG gate metal regions 10724', and tunnel oxide regions 10722'. For example, only one gate stack 10728 is annotated with region tie lines for clarity in illustration. A self-aligned N+ source and drain implant may be performed to create inter-transistor source and drains 10734 and end of NAND string source and drains 10730. The entire structure may be covered with a gap fill oxide 10750, which may be planarized with chemical mechanical polishing. The oxide surface may be prepared for oxide to oxide wafer bonding as previously described. This bonding may now form the first tier of memory transistors 10742 including oxide 10750, gate stacks 10728, inter-transistor source and drains 10734, end of NAND string source and drains 10730, P− silicon regions 10720, and oxide layer 10702.

Figure 107F:
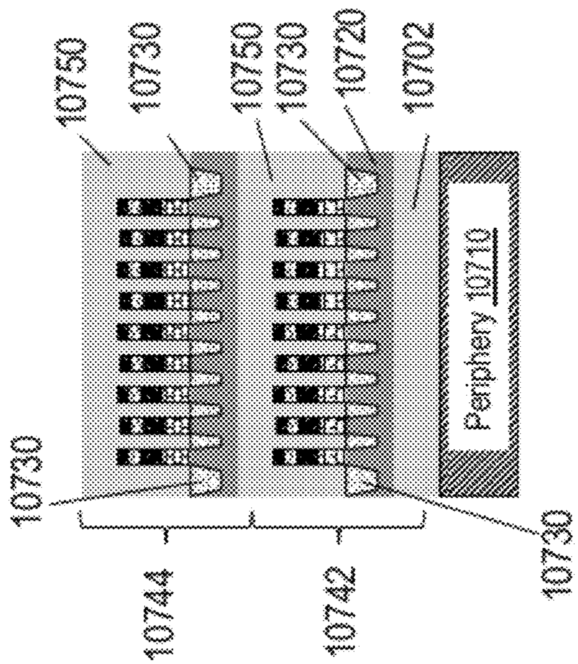

As illustrated in FIG. 107F, the transistor layer formation, bonding to acceptor wafer 10710 oxide 10750, and subsequent transistor formation as described in FIGS. 107A to 107D may be repeated to form the second tier 10744 of memory transistors on top of the first tier of memory transistors 10742. After substantially all the memory layers are constructed, a rapid thermal anneal (RTA) or flash anneal may be conducted to activate the dopants in substantially all of the memory layers and in the acceptor wafer 10710 peripheral circuits. Alternatively, optical anneals, such as, for example, a laser based anneal, may be performed.

Figure 107G:
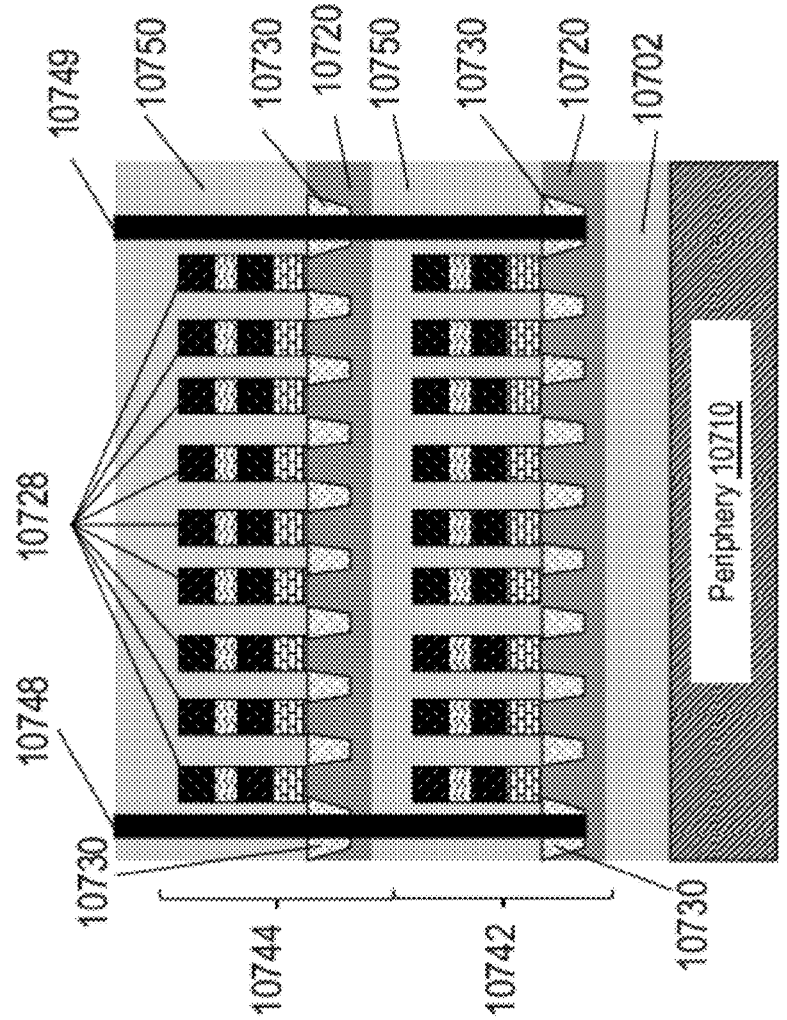

As illustrated in FIG. 107G, source line (SL) ground contact 10748 and bit line contact 10749 may be lithographically defined, etched with plasma/RIE through oxide 10750, end of NAND string source and drains 10730, and P− regions 10720 of each memory tier, and the associated oxide vertical isolation regions to connect substantially all memory layers vertically. SL ground contact 10748 and bit line contact 10749 may then be processed by a photoresist removal. Metal or heavily doped poly-crystalline silicon may be utilized to fill the contacts and metallization utilized to form BL and SL wiring (not shown). The gate stacks 10728 may be connected with a contact and metallization to form the word-lines (WLs) and WL wiring (not shown). A through layer via (not shown) may be formed to electrically couple the BL, SL, and WL metallization to the acceptor substrate 10710 peripheral circuitry via an acceptor wafer metal connect pad (not shown).

This flow may enable the formation of a floating gate based 3D memory with two additional masking steps per memory layer constructed by layer transfers of wafer sized doped layers of mono-crystalline silicon and this 3D memory may be connected to an underlying multi-metal layer semiconductor device.

Persons of ordinary skill in the art will appreciate that the illustrations in FIGS. 107A through 107G are exemplary only and are not drawn to scale. Such skilled persons will further appreciate that many variations may be possible such as, for example, BL or SL select transistors may be constructed within the process flow. Moreover, the stacked memory layer may be connected to a periphery circuit that is above the memory stack. Additionally, each tier of memory could be configured with a slightly different donor wafer P− layer doping profile. Further, the memory could be organized in a different manner, such as BL and SL interchanged, or where buried wiring for the memory array may be below the memory layers but above the periphery. Many other modifications within the scope of the illustrative embodiments of the invention will suggest themselves to such skilled persons after reading this specification. Thus the invention is to be limited only by the appended claims.

As illustrated in FIGS. 108A to 108H, a floating gate based 3D memory with one additional masking step per memory layer 3D memory may be constructed that can be suitable for 3D IC manufacturing. This 3D memory may utilize 3D floating gate junction-less transistors constructed in mono-crystalline silicon.

Figure 108A:
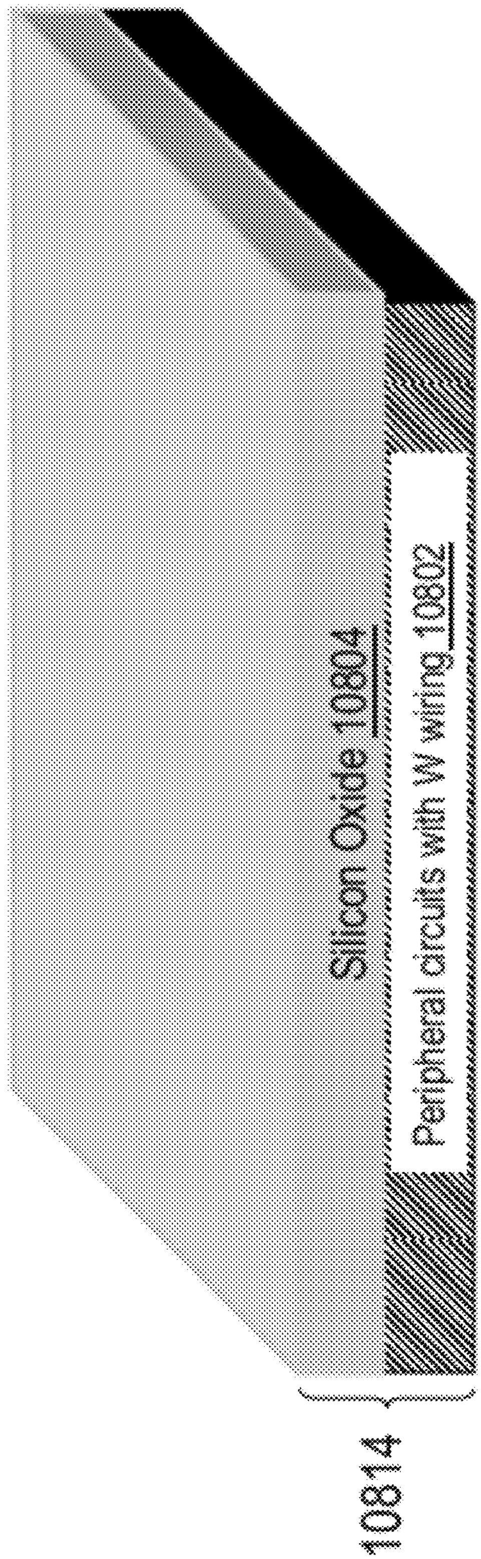

As illustrated in FIG. 108A, a silicon substrate with peripheral circuitry 10802 may be constructed with high temperature (greater than about 400° C.) resistant wiring, such as, for example, Tungsten. The peripheral circuitry substrate 10802 may include memory control circuits as well as circuitry for other purposes and of various types, such as, for example, analog, digital, RF, or memory. The peripheral circuitry substrate 10802 may include peripheral circuits that can withstand an additional rapid-thermal-anneal (RTA) or flash anneal and still remain operational and retain good performance. For this purpose, the peripheral circuits may be formed such that they may have been subject to a weak RTA or no RTA for activating dopants. The top surface of the peripheral circuitry substrate 10802 may be prepared for oxide wafer bonding with a deposition of a silicon oxide layer 10804, thus forming acceptor wafer 10814.

Figure 108B:
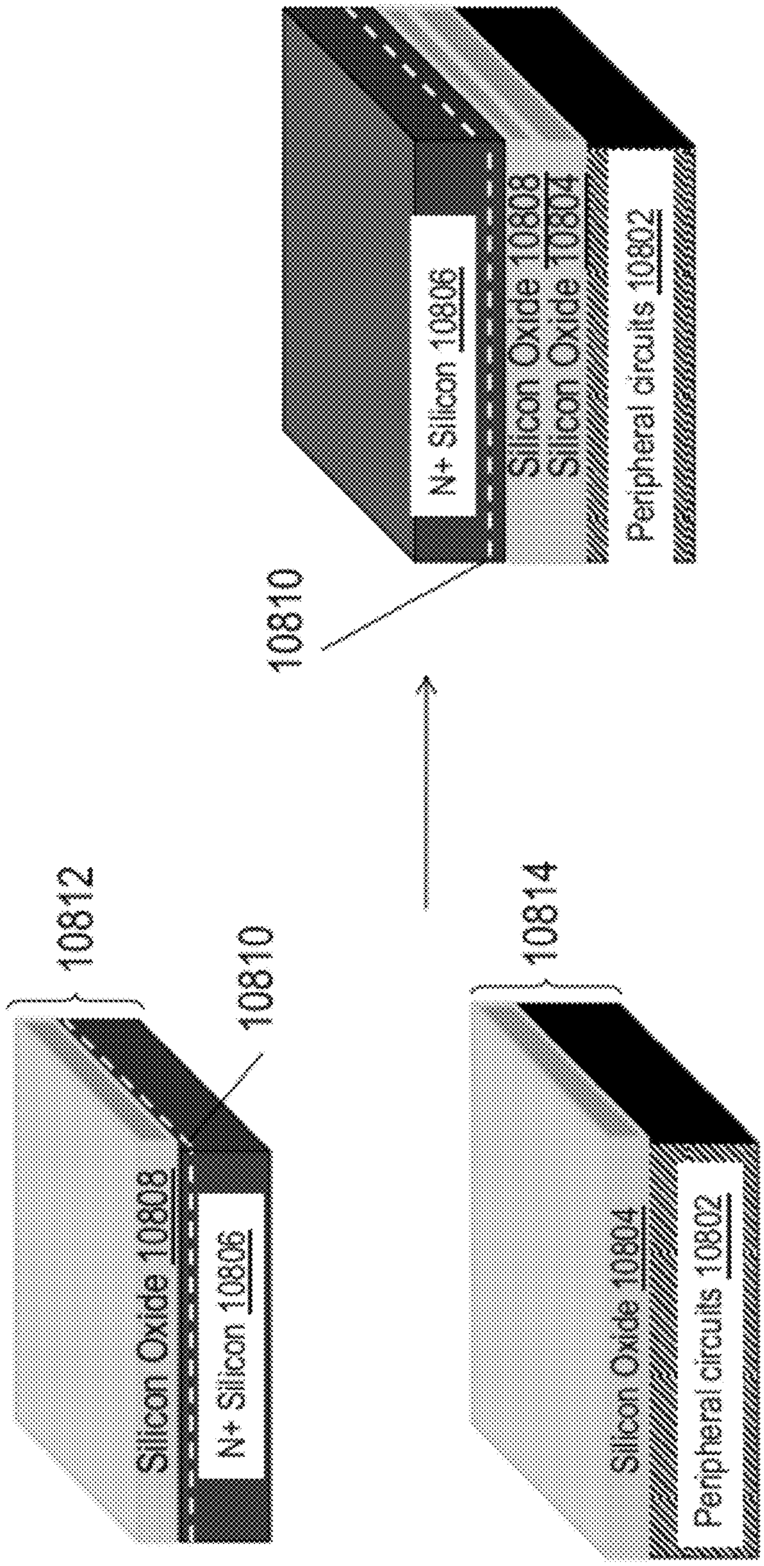

As illustrated in FIG. 108B, a mono-crystalline N+ doped silicon donor wafer 10812 may be processed to include a wafer sized layer of N+ doping (not shown) which may have a different dopant concentration than the N+ substrate 10806. The N+ doping layer may be formed by ion implantation and thermal anneal. A screen oxide layer 10808 may be grown or deposited prior to the implant to protect the silicon from implant contamination and to provide an oxide surface for later wafer to wafer bonding. A layer transfer demarcation plane 10810 (shown as a dashed line) may be formed in donor wafer 10812 within the N+ substrate 10806 or the N+ doping layer (not shown) by hydrogen implantation or other methods as previously described. Both the donor wafer 10812 and acceptor wafer 10814 may be prepared for wafer bonding as previously described and then may be bonded at the surfaces of oxide layer 10804 and oxide layer 10808, at a low temperature (e.g., less than about 400° C. suitable for lowest stresses), or a moderate temperature (e.g., less than about 900° C.).

Figure 108C:
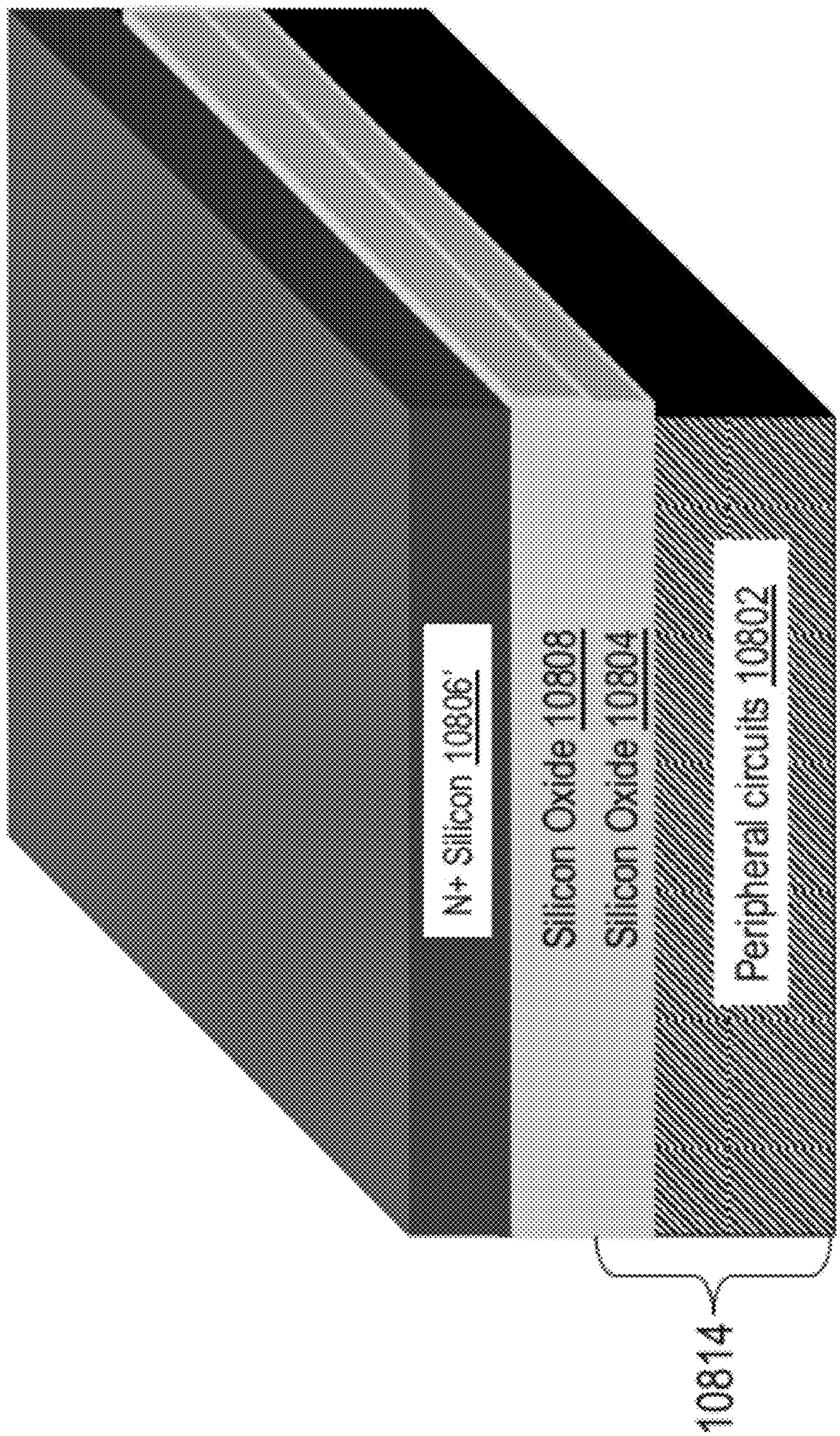

As illustrated in FIG. 108C, the portion of the N+ layer (not shown) and the N+ wafer substrate 10806 that are above the layer transfer demarcation plane 10810 may be removed by cleaving and polishing, or other processes as previously described, such as ion-cut or other methods, thus forming the remaining mono-crystalline silicon N+ layer 10806'. Remaining N+ layer 10806' and oxide layer 10808 may have been layer transferred to acceptor wafer 10814. The top surface of N+ layer 10806' may be chemically or mechanically polished smooth and flat. Transistors or portions of transistors may be formed and aligned to the acceptor wafer 10814 alignment marks (not shown).

Figure 108D:
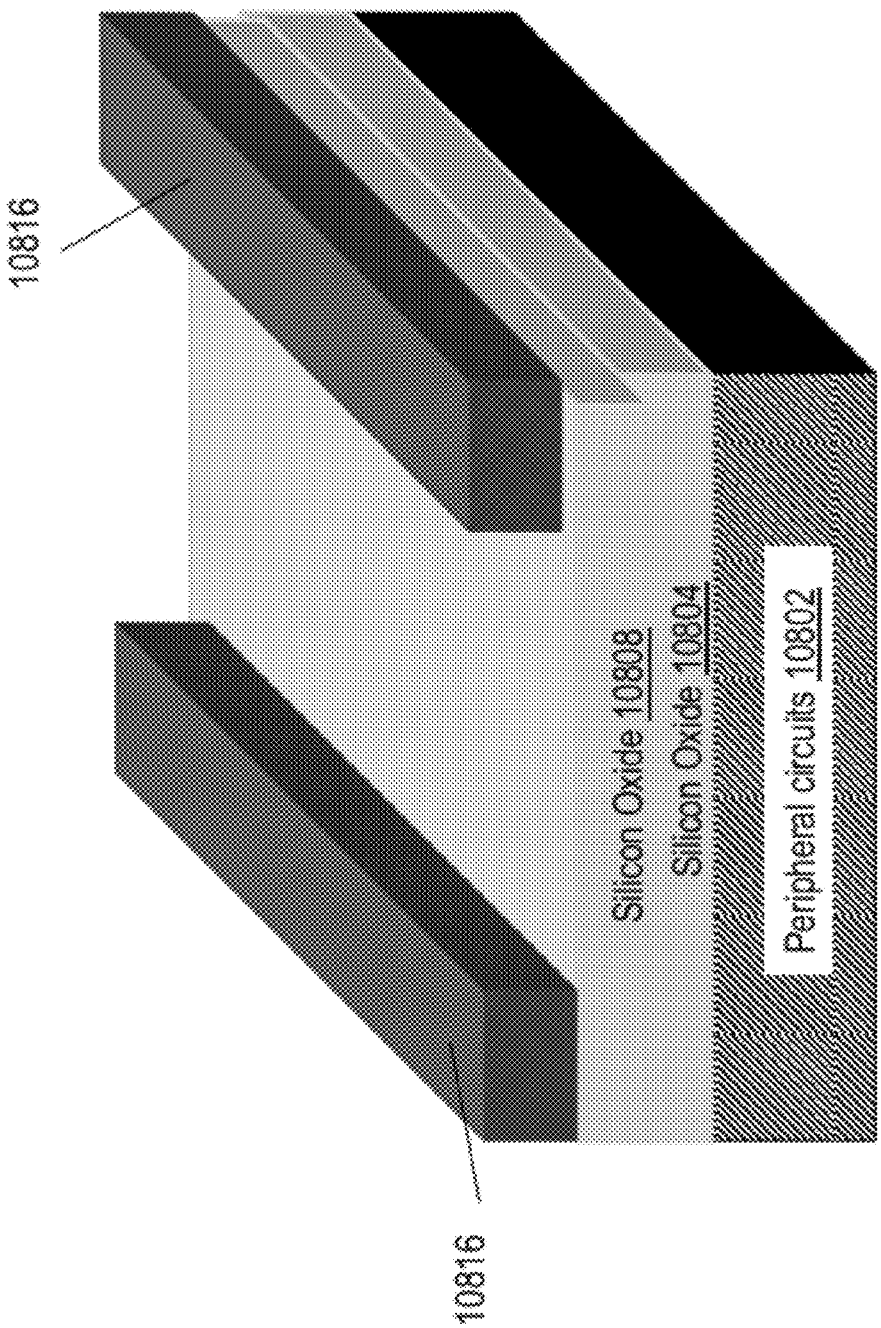

As illustrated in FIG. 108D, N+ regions 10816 may be lithographically defined and then etched with plasma/RIE, thus removing regions of N+ layer 10806' and stopping on or partially within oxide layer 10808.

Figure 108E:
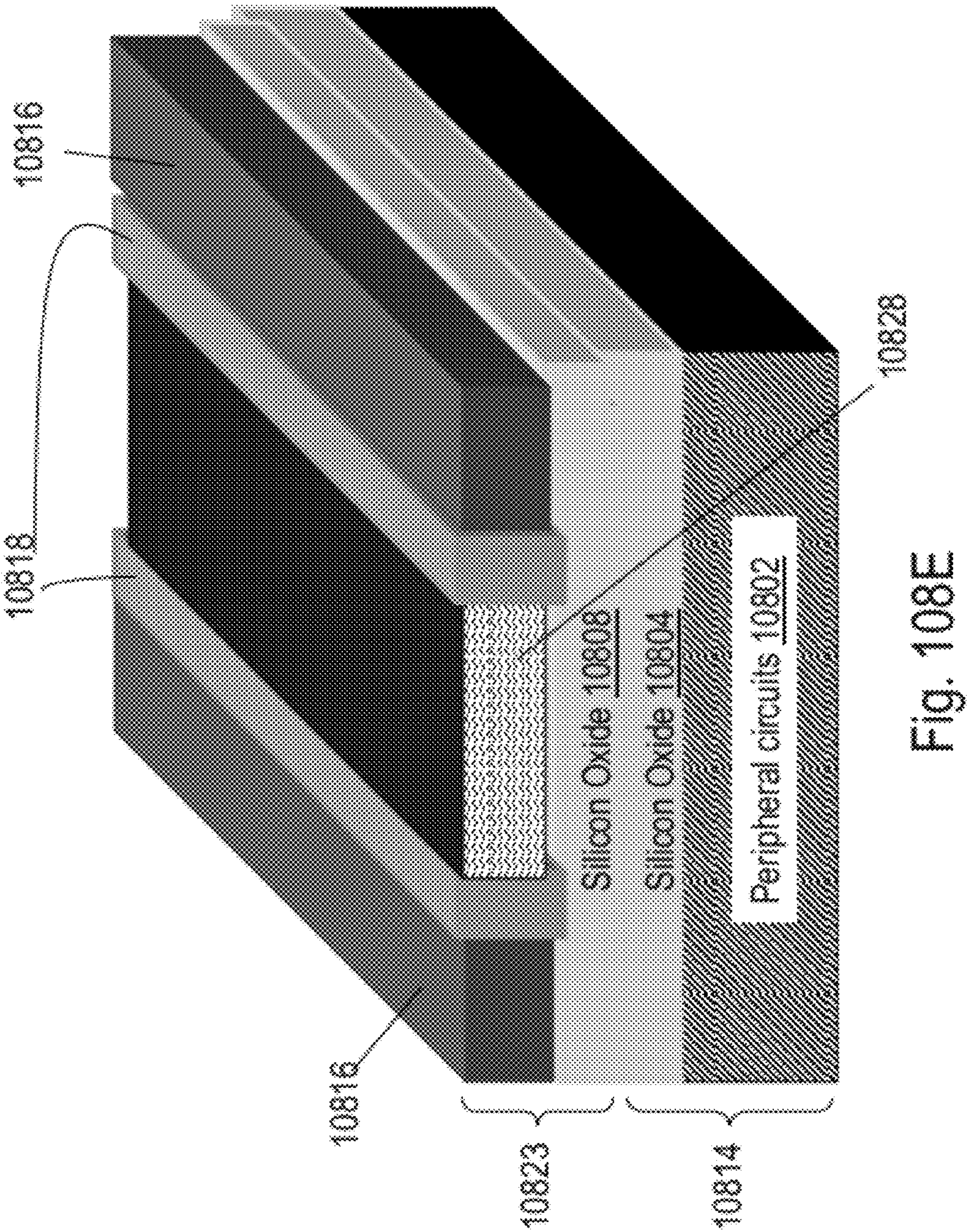

As illustrated in FIG. 108E, a tunneling dielectric 10818 may be grown or deposited, such as thermal silicon oxide, and a floating gate (FG) material 10828, such as doped or undoped poly-crystalline silicon, may be deposited. The structure may be planarized by chemical mechanical polishing to approximately the level of the N+ regions 10816. The surface may be prepared for oxide to oxide wafer bonding as previously described, such as a deposition of a thin oxide. This bonding may now form the first memory layer 10823 including future FG regions 10828, tunneling dielectric 10818, N+ regions 10816 and oxide layer 10808.

Figure 108F:
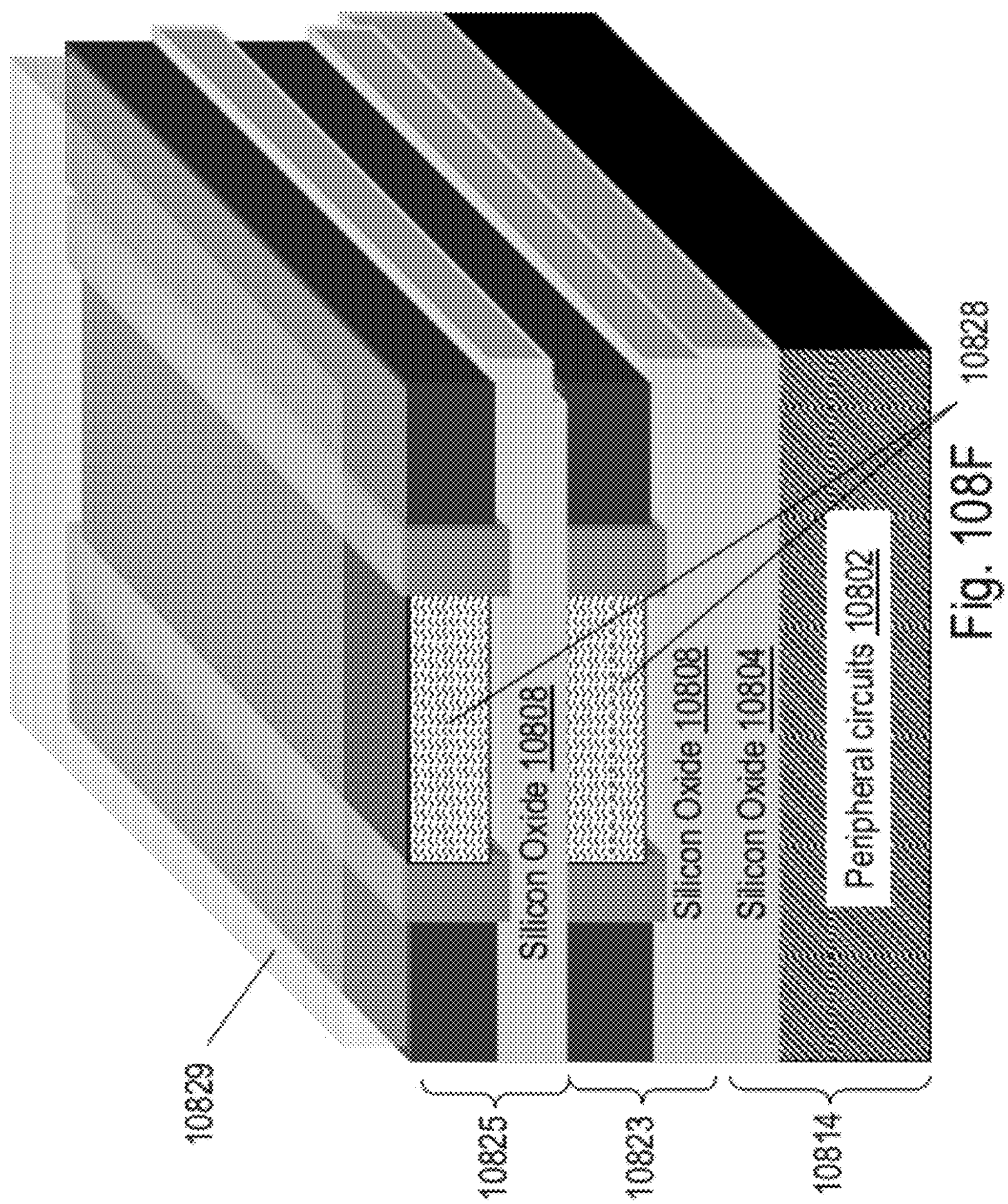

As illustrated in FIG. 108F, the N+ layer formation, bonding to an acceptor wafer, and subsequent memory layer formation as described in FIGS. 108A to 108E may be repeated to form the second layer of memory 10825 on top of the first memory layer 10823. A layer of oxide 10829 may then be deposited.

Figure 108G:
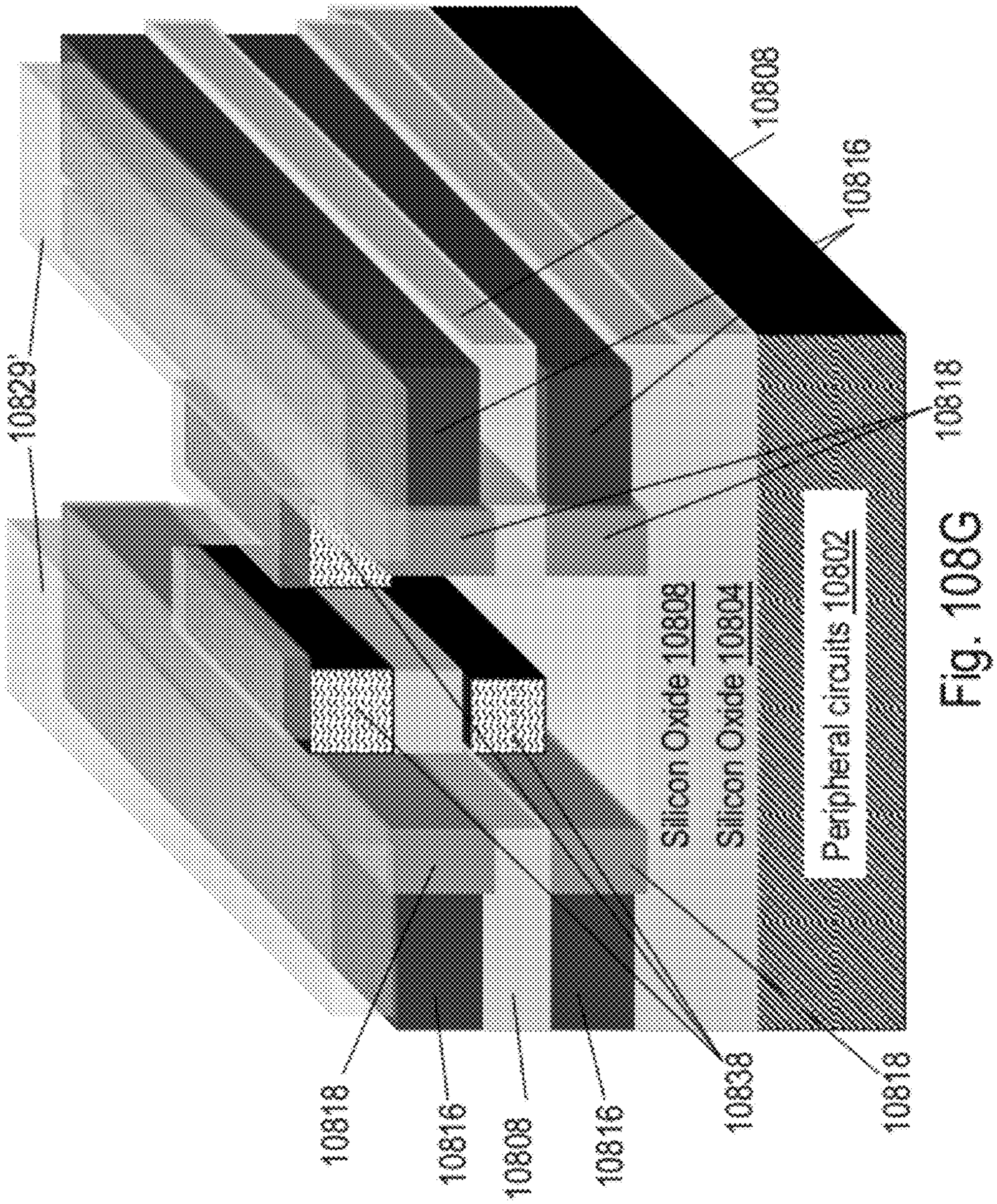

As illustrated in FIG. 108G, FG regions 10838 may be lithographically defined and then etched with, for example, plasma/RIE, removing portions of oxide layer 10829, future FG regions 10828 and oxide layer 10808 on the second layer of memory 10825 and future FG regions 10828 on the first memory layer 10823, thus stopping on or partially within oxide layer 10808 of the first memory layer 10823.

Figure 108H:
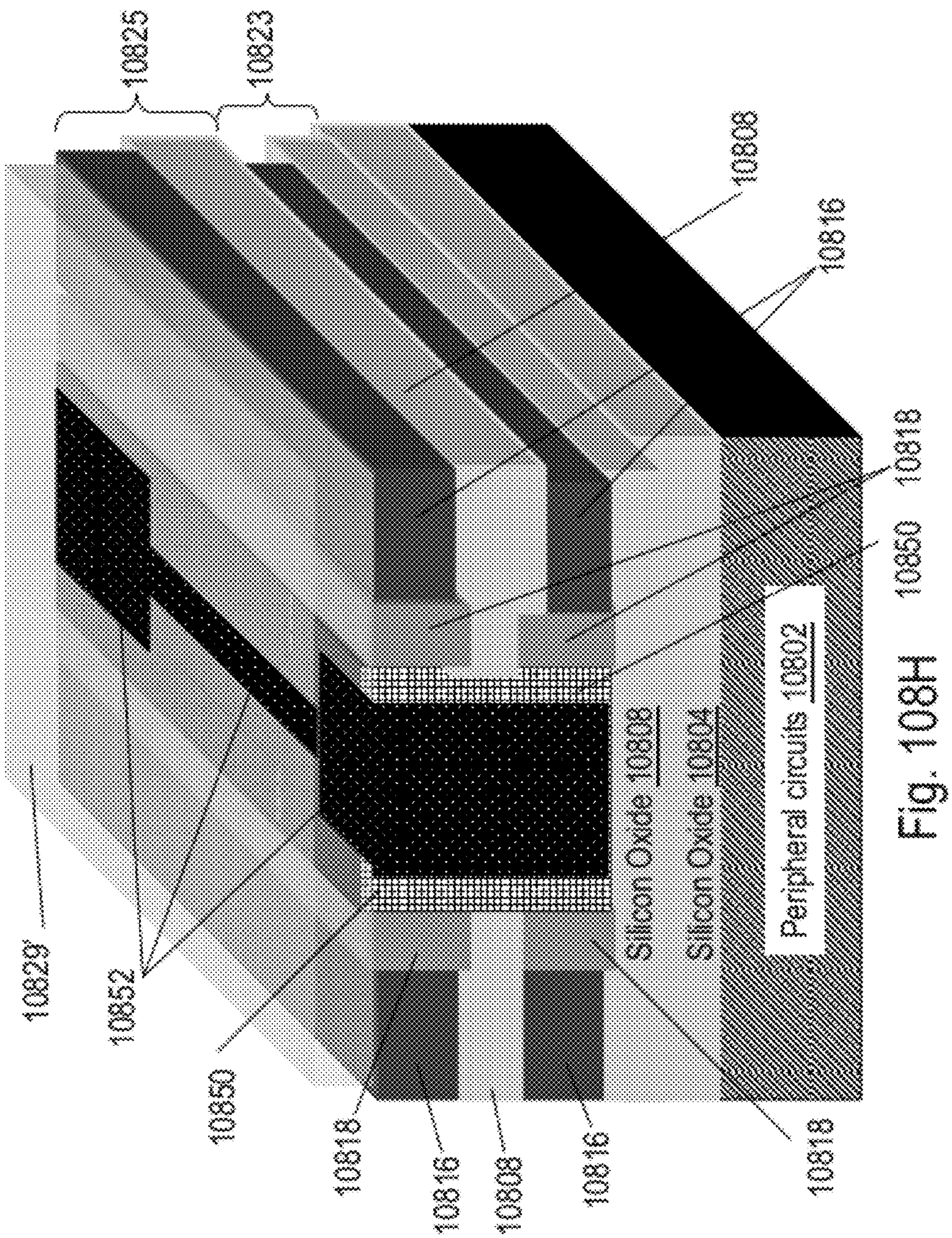

As illustrated in FIG. 108H, an inter-poly oxide layer 10850, such as, for example, silicon oxide and silicon nitride layers (ONO: Oxide-Nitride-Oxide), and a Control Gate (CG) gate material 10852, such as, for example, doped or undoped poly-crystalline silicon, may be deposited. The surface may be planarized by chemical mechanical polishing leaving a thinned oxide layer 10829'. As shown in the illustration, this results in the formation of 4 horizontally oriented floating gate memory bit cells with N+ junction-less transistors. Contacts and metal wiring to form well-know memory access/decoding schemes may be processed and a through layer via (TLV) may be formed to electrically couple the memory access decoding to the acceptor substrate peripheral circuitry via an acceptor wafer metal connect pad.

This flow may enable the formation of a floating gate based 3D memory with one additional masking step per memory layer constructed by layer transfer of wafer sized doped layers of mono-crystalline silicon and this 3D memory may be connected to an underlying multi-metal layer semiconductor device.

Persons of ordinary skill in the art will appreciate that the illustrations in FIGS. 108A through 108H are exemplary only and are not drawn to scale. Such skilled persons will further appreciate that many variations may be possible such as, for example, memory cell control lines could be built in a different layer rather than the same layer. Moreover, the stacked memory layers may be connected to a periphery circuit that may be above the memory stack. Additionally, each tier of memory could be configured with a slightly different donor wafer N+ layer doping profile. Further, the memory could be organized in a different manner, such as BL and SL interchanged, or these architectures could be modified into a NOR flash memory style, or where buried wiring for the memory array may be below the memory layers but above the periphery. Many other modifications within the scope of the illustrative embodiments of the invention will suggest themselves to such skilled persons after reading this specification.

It may be desirable to place the peripheral circuits for functions such as, for example, memory control, on the same mono-crystalline silicon or polysilicon layer as the memory elements or string rather than reside on a mono-crystalline silicon or polysilicon layer above or below the memory elements or string on a 3D IC memory chip. However, that memory layer substrate thickness or doping may preclude proper operation of the peripheral circuits as the memory layer substrate thickness or doping provides a fully depleted transistor channel and junction structure, such as, for example, FD-SOI. Moreover, for a 2D IC memory chip constructed on, for example, an FD-SOI substrate, wherein the peripheral circuits for functions such as, for example, memory control, must reside and properly function in the same semiconductor layer as the memory element, a fully depleted transistor channel and junction structure may preclude proper operation of the periphery circuitry, but may provide many benefits to the memory element operation and reliability. Some embodiments of the present invention which solves these issues are described in FIGS. 226A to 226D.

FIGS. 226A-D describe a process flow to construct a monolithic 2D floating-gate flash memory on a fully depleted Silicon on Insulator (FD-SOI) substrate which utilizes partially depleted silicon-on-insulator transistors for the periphery. A 3D horizontally-oriented floating-gate memory may also be constructed with the use of this process flow in combination with some of the embodiments of this present invention described in this document. The 2D process flow may include several steps as described in the following sequence.

Figure 226A:
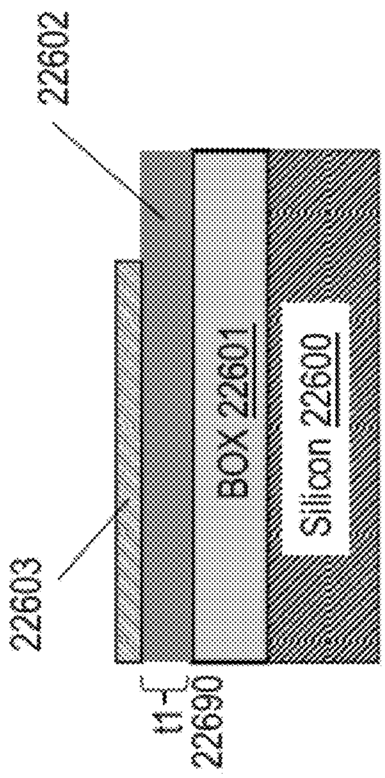

Step (A): An FD-SOI wafer, which may include silicon substrate 22600, buried oxide (BOX) 22601, and thin silicon mono-crystalline layer 22602, may have an oxide layer grown or deposited substantially on top of the thin silicon mono-crystalline layer 22602. Thin silicon mono-crystalline layer 22602 may be of thickness t1 22690 ranging from approximately 2 nm to approximately 100 nm, typically 5 nm to 15 nm. Thin silicon mono-crystalline layer 22602 may be substantially absent of semiconductor dopants to form an undoped silicon layer, or doped, such as, for example, with elemental or compound species that form a p+, or p−, or p, or n+, or n−, or n silicon layer. The oxide layer may be lithographically defined and etched substantially to removal such that oxide region 22603 is formed. A plasma etch or an oxide etchant, such as, for example, a dilute solution of hydrofluoric acid, may be utilized. Thus thin silicon mono-crystalline layer 22602 may not covered by oxide region 22603 in desired areas where transistors and other devices that form the desired peripheral circuits may substantially and eventually reside. Oxide region 22603 may include multiple materials, such as silicon oxide and silicon nitride, and may act as a chemical mechanical polish (CMP) polish stop in subsequent steps. FIG. 226A illustrates the exemplary structure after Step (A).

Figure 226B:
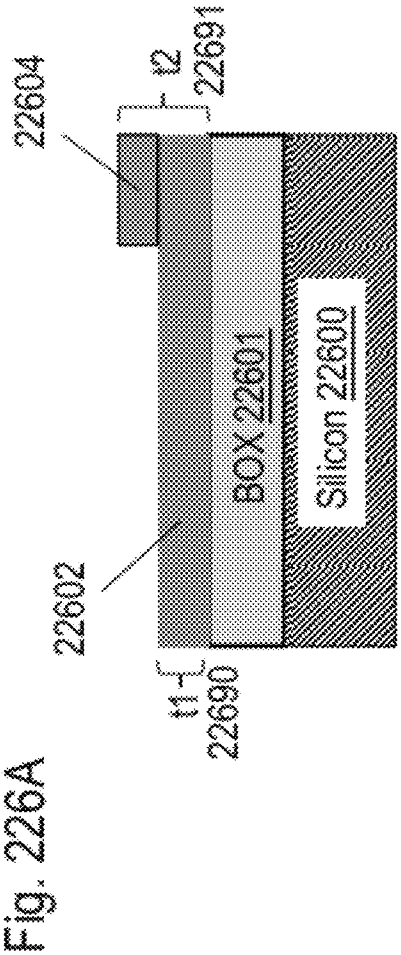

Step (B): FIG. 226B illustrates the exemplary structure after Step (B). A selective expitaxy process may be utilized to grow crystalline silicon on the uncovered by oxide region 22603 surface of thin silicon mono-crystalline layer 22602, thus forming silicon mono-crystalline region 22604. The total thickness of crystalline silicon in this region that is above BOX 22601 is t2 22691, which is a combination of thickness t1 22690 of thin silicon mono-crystalline layer 22602 and silicon mono-crystalline region 22604. T2 22691 is greater than t1 22690, and may be of thickness ranging from approximately 4 nm to approximately 1000 nm, typically 50 nm to 500 nm. Silicon mono-crystalline region 22604 may be may be substantially absent of semiconductor dopants to form an undoped silicon region, or doped, such as, for example, with elemental or compound species that form a p+, or p, or p−, or n+, or n, or n− silicon layer. Silicon mono-crystalline region 22604 may be substantially equivalent in concentration and type to thin silicon mono-crystalline layer 22602, or may have a higher or lower different dopant concentration and may have a differing dopant type. Silicon mono-crystalline region 22604 may be CMP'd for thickness control, utilizing oxide region 22603 as a polish stop, or for asperity control. Oxide region 22603 may be removed. Thus, there are silicon regions of thickness t1 22690 and regions of thickness t2 22691 on top of BOX 22601. The silicon regions of thickness t1 22690 may be utilized to construct fully depleted silicon-on-insulator transistors and memory cells, and regions of thickness t2 22691 may be utilized to construct partially depleted silicon-on-insulator transistors for the periphery circuits and memory control.

Figure 226C:
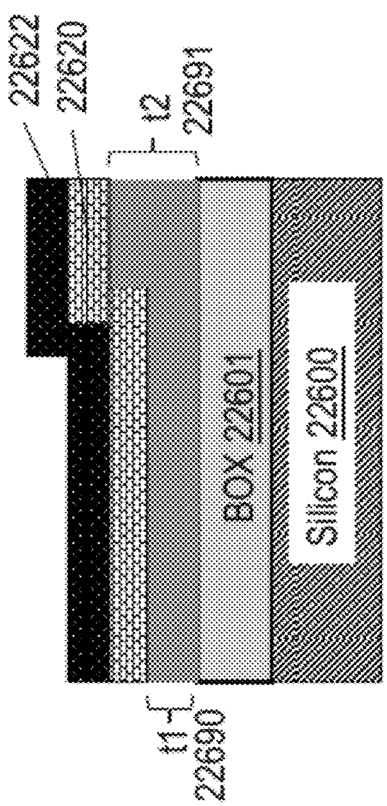

Step (C): FIG. 226C illustrates the exemplary structure after Step (C). Tunnel oxide layer 22620 may a grown or deposited and floating gate layer 22622 may be deposited.

Figure 226D:
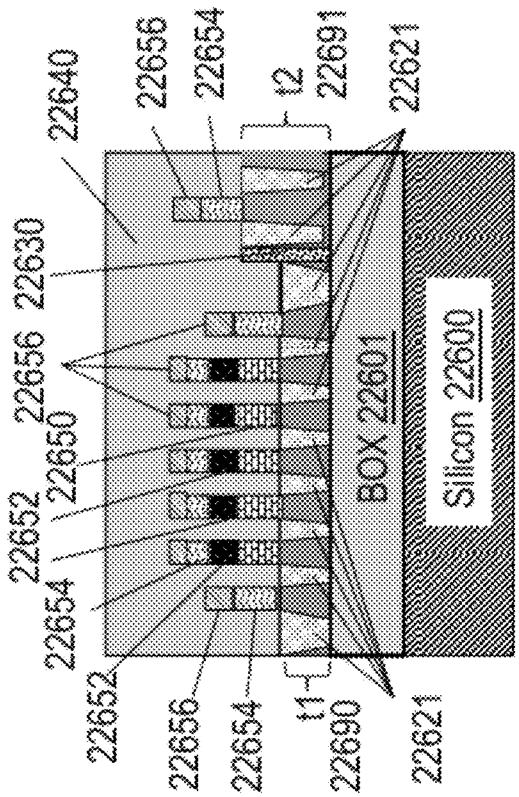

Step (D): FIG. 226D illustrates the exemplary structure after Step (D). Isolation regions 22630 and others (not shown for clarity) may be formed in silicon mono-crystalline regions of thickness t1 22690 and may be formed in silicon mono-crystalline regions of thickness t2 22691. Floating gate layer 22622 and a portion or substantially all of tunnel oxide layer 22620 may be removed in the eventual periphery circuitry regions and the NAND string select gate regions. An inter-poly-dielectric (IPD) layer, such as, for example, an oxide-nitride-oxide ONO layer, may be deposited following which a control gate electrode, such as, for example, doped polysilicon, may then be deposited. The gate regions may be patterned and etched. Thus, tunnel oxide regions 22650, floating gate regions 22652, IPD regions 22654, and control gate regions 22656 may be formed. Not all regions are tag-lined for illustration clarity. Following this, source-drain regions 22621 may be implanted and activated by thermal or optical anneals. An inter-layer dielectric 22640 may then deposited and planarized. Contacts (not shown) may be made to connect bit-lines (BL) and source-lines (SL) to the NAND string. Contacts to the well of the NAND string (not shown) may also be made. All these contacts could be constructed of heavily doped polysilicon or some other material. Following this, wiring layers (not shown) for the memory array may be constructed.

An exemplary 2D floating-gate memory on FD-SOI with functional periphery circuitry has thus been constructed.

Alternatively, as illustrated in FIGS. 226E-H, a monolithic 2D floating-gate flash memory on a fully depleted Silicon on Insulator (FD-SOI) substrate which utilizes partially depleted silicon-on-insulator transistors for the periphery may be constructed by first constructing the memory array and then constructing the periphery after a selective epitaxial deposition.

Figure 226E:
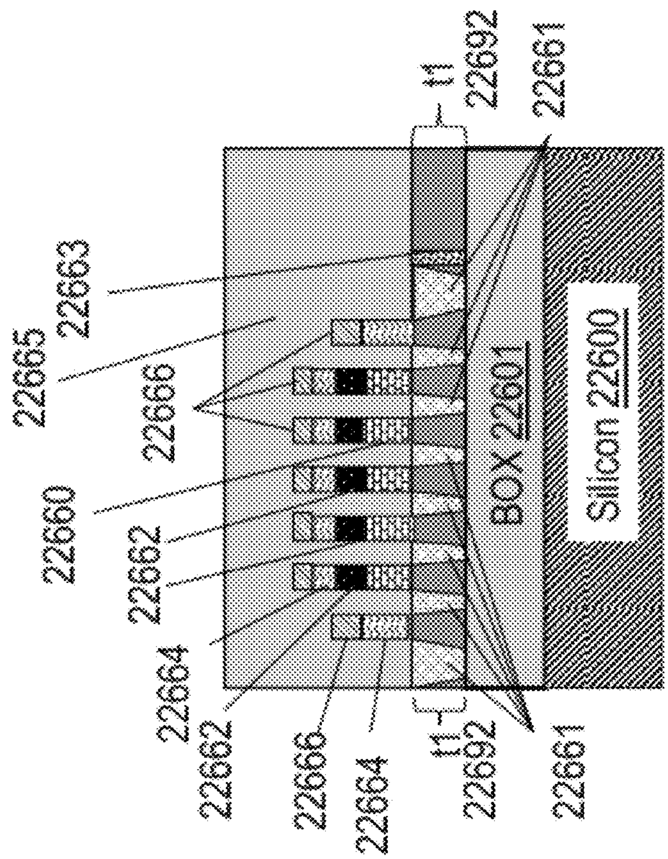

As illustrated in FIG. 226E, an FD-SOI wafer, which may include silicon substrate 22600, buried oxide (BOX) 22601, and thin silicon mono-crystalline layer 22602 of thickness t1 22692 ranging from approximately 2 nm to approximately 100 nm, typically 5 nm to 15 nm, may have a NAND string array constructed on regions of thin silicon mono-crystalline layer 22602 of thickness t1 22692. Thus forming tunnel oxide regions 22660, floating gate regions 22662, IPD regions 22664, control gate regions 22666, isolation regions 22663, memory source-drain regions 22661, and inter-layer dielectric 22665. Not all regions are tag-lined for illustration clarity. Thin silicon mono-crystalline layer of thickness t1 22692 may be substantially absent of semiconductor dopants to form an undoped silicon layer, or doped, such as, for example, with elemental or compound species that form a p+, or p−, or p, or n+, or n−, or n silicon layer.

Figure 226F:
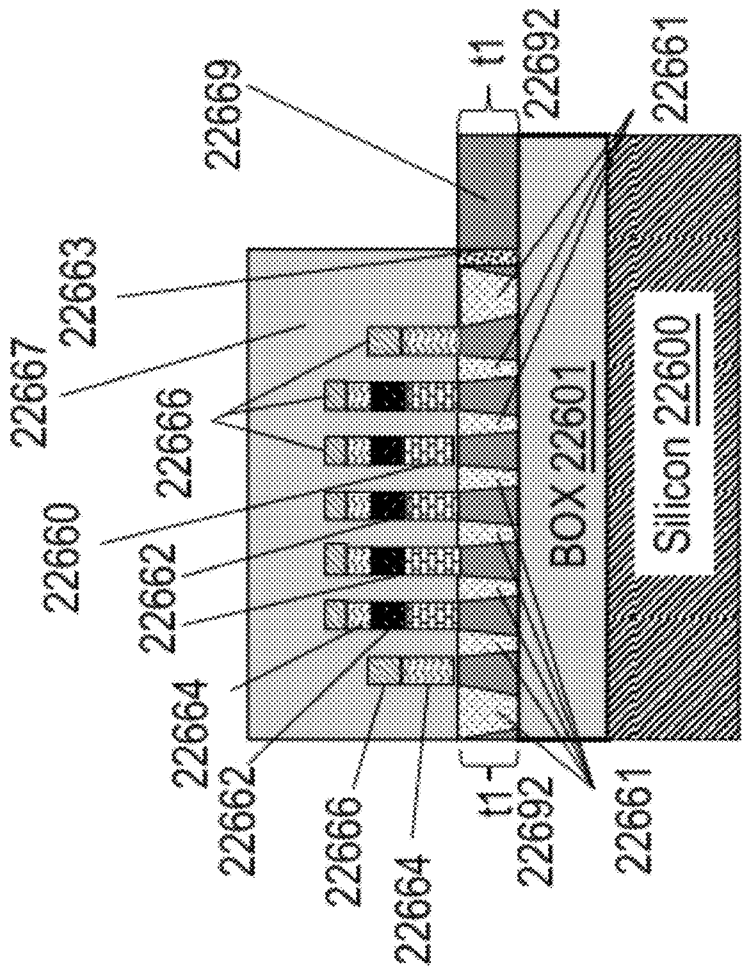

As illustrated in FIG. 226F, the intended peripheral regions may be lithographically defined and the inter-layer dielectric 22665 etched in the exposed regions, thus exposing the surface of monocrystalline silicon region 22669 and forming inter-layer dielectric region 22667.

Figure 226G:
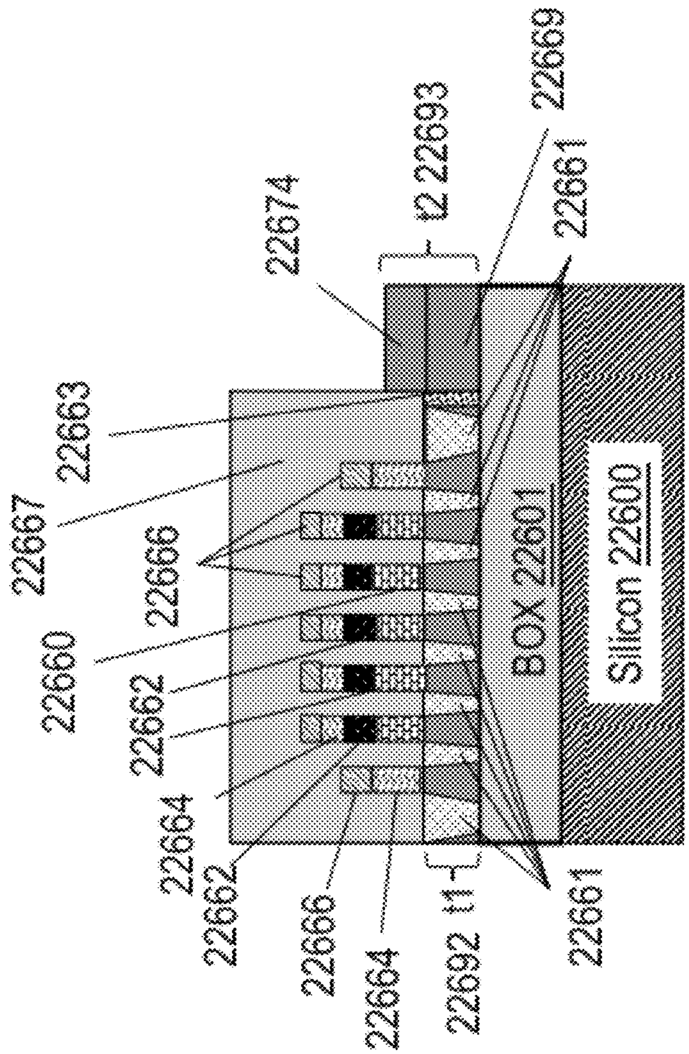

As illustrated in FIG. 226G, a selective epitaxial process may be utilized to grow crystalline silicon on the uncovered by inter-layer dielectric region 22667 surface of monocrystalline silicon region 22669, thus forming silicon mono-crystalline region 22674. The total thickness of crystalline silicon in this region that is above BOX 22601 is t2 22693, which is a combination of thickness t1 22692 and silicon mono-crystalline region 22674. T2 22693 is greater than t1 22692, and may be of thickness ranging from approximately 4 nm to approximately 1000 nm, typically 50 nm to 500 nm. Silicon mono-crystalline region 22674 may be may be substantially absent of semiconductor dopants to form an undoped silicon region, or doped, such as, for example, with elemental or compound species that form a p+, or p, or p−, or n+, or n, or n− silicon layer. Silicon mono-crystalline region 22674 may be substantially equivalent in concentration and type to thin silicon mono-crystalline layer of thickness t1 22692, or may have a higher or lower different dopant concentration and may have a differing dopant type.

Figure 226H:
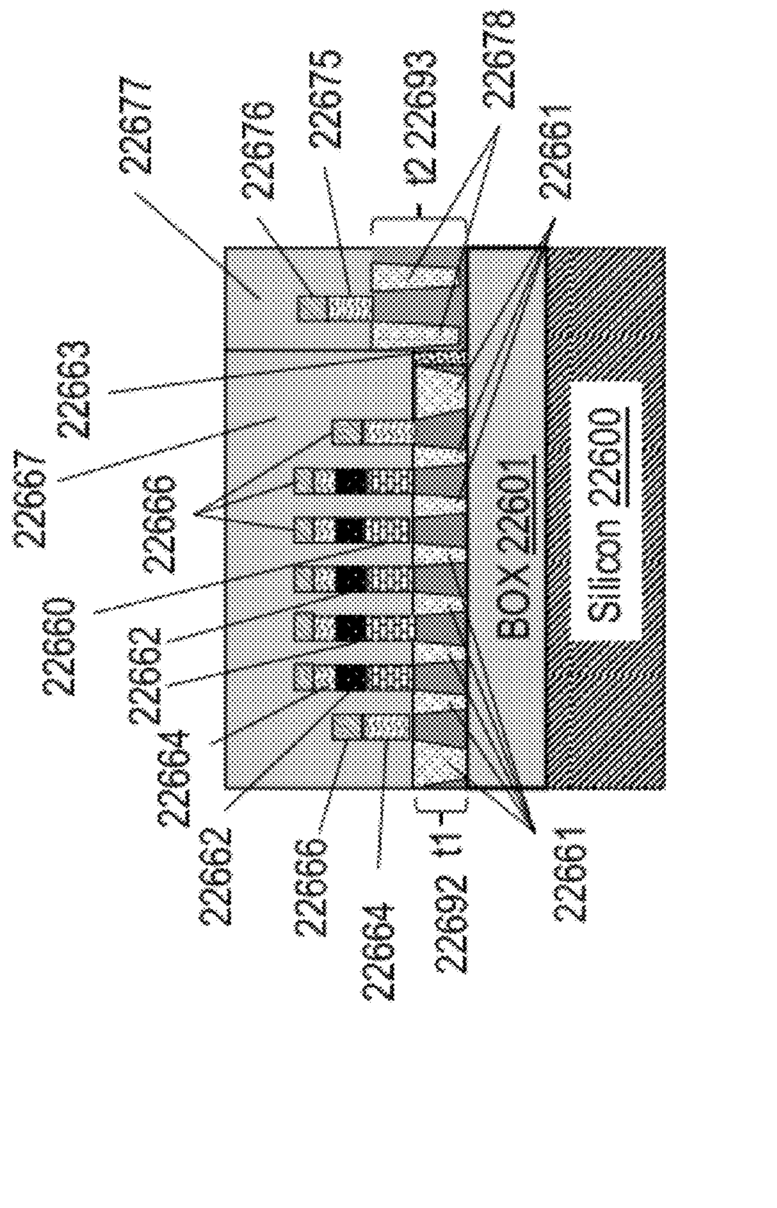

As illustrated in FIG. 226H, periphery transistors and devices may be constructed on regions of monocrystalline silicon with thickness t2 22693, thus forming gate dielectric regions 22675, gate electrode regions 22676, source-drain regions 22678. The periphery devices may be covered with oxide 22677. Source-drain regions 22661 and source-drain regions 22678 activated by thermal or optical anneals, or may have been previously activated. An additional inter-layer dielectric (not shown) may then be deposited and planarized. Contacts (not shown) may be made to connect bit-lines (BL) and source-lines (SL) to the NAND string. Contacts to the well of the NAND string (not shown) and to the periphery devices may also be made. All these contacts could be constructed of heavily doped polysilicon or some other material. Following this, wiring layers (not shown) for the memory array may be constructed.

An exemplary 2D floating-gate memory on FD-SOI with functional periphery circuitry has thus been constructed.

Persons of ordinary skill in the art will appreciate that thin silicon mono-crystalline layer 22602 may be formed by other processes including a polycrystalline or amorphous silicon deposition and optical or thermal crystallization techniques. Moreover, thin silicon mono-crystalline layer 22602 may not be mono-crystalline, but may be polysilicon or partially crystallized silicon. Further, silicon mono-crystalline region 22604 or 22674 may be formed by other processes including a polycrystalline or amorphous silicon deposition and optical or thermal crystallization techniques. Additionally, thin silicon mono-crystalline layer 22602 and silicon mono-crystalline region 22604 or 22674 may include more than one type of semiconductor doping or concentration of doping and may possess doping gradients. Moreover, while the exemplary process flow described with FIG. 226A-D showed the NAND string and the periphery sharing components such as the control gate and the IPD, a process flow may include separate lithography steps, dielectrics, and gate electrodes to form the NAND string than those utilized to form the periphery. Further, source-drain regions 22621 may be formed separately for the periphery transistors in silicon mono-crystalline regions of thickness t2 and those transistors in silicon mono-crystalline regions of thickness t1. Also, the NAND string source-drain regions may be formed separately from the select and periphery transistors. Furthermore, persons of ordinary skill in the art will appreciate that the process steps and concepts of forming regions of thicker silicon for the memory periphery circuits may be applied to many memory types, such as, for example, charge trap, resistive change, DRAM, SRAM, and floating body DRAM.

The monolithic 3D integration concepts described in this patent application can lead to novel embodiments of poly-crystalline silicon based memory architectures. While the following concepts in FIGS. 109 and 110 are explained by using resistive memory architectures as an example, it will be clear to one skilled in the art that similar concepts can be applied to the NAND flash, charge trap, and DRAM memory architectures and process flows described previously in this patent application.

As illustrated in FIGS. 109A to 109K, a resistance-based 3D memory with zero additional masking steps per memory layer may be constructed with methods that may be suitable for 3D IC manufacturing. This 3D memory may utilize poly-crystalline silicon junction-less transistors that may have either a positive or a negative threshold voltage and may have a resistance-based memory element in series with a select or access transistor.

Figure 109A:
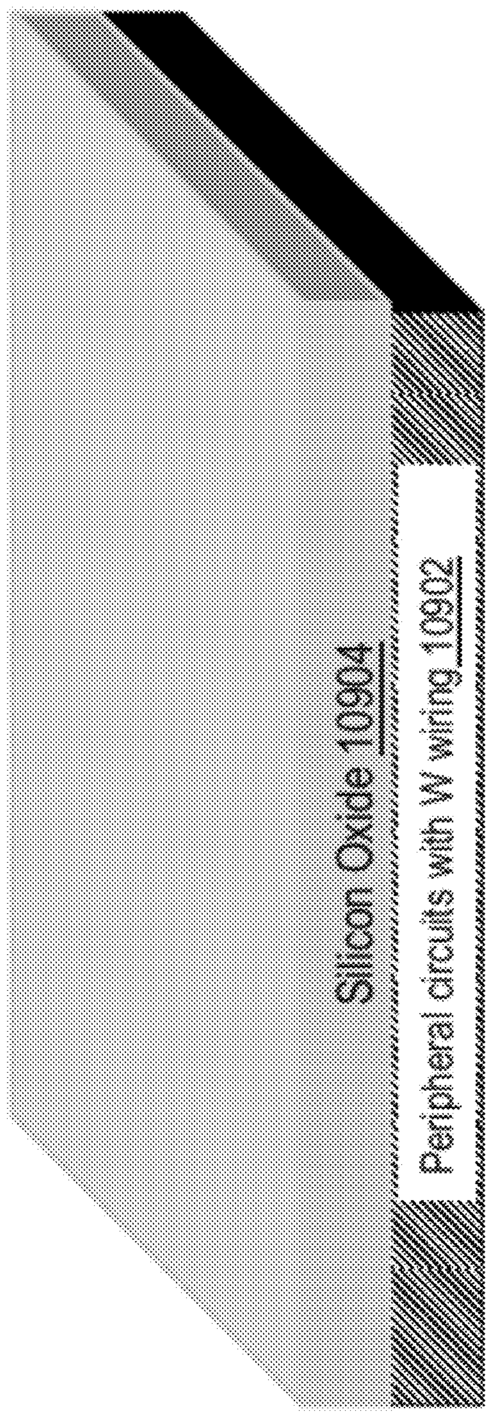

As illustrated in FIG. 109A, a silicon substrate with peripheral circuitry 10902 may be constructed with high temperature (greater than about 400° C.) resistant wiring, such as, for example, Tungsten. The peripheral circuits substrate 10902 may include memory control circuits as well as circuitry for other purposes and of various types, such as, for example, analog, digital, RF, or memory. The peripheral circuits substrate 10902 may include peripheral circuits that can withstand an additional rapid-thermal-anneal (RTA) or flash anneal and may still remain operational and retain good performance. For this purpose, the peripheral circuits may be formed such that they have been subject to a partial or weak RTA or no RTA for activating dopants. Silicon oxide layer 10904 may be deposited on the top surface of the peripheral circuitry substrate.

Figure 109B:
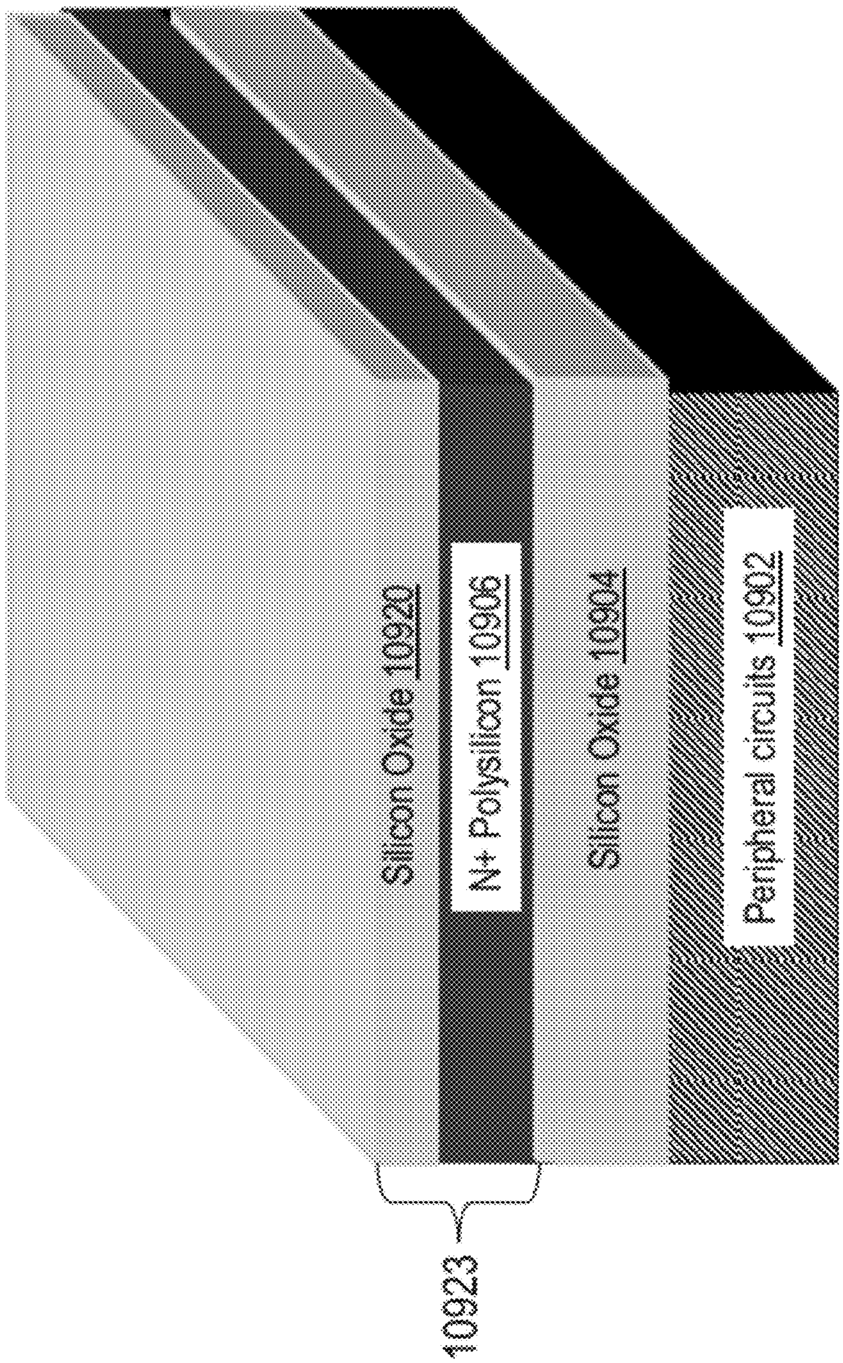

As illustrated in FIG. 109B, a layer of N+ doped poly-crystalline or amorphous silicon 10906 may be deposited. The amorphous silicon or poly-crystalline silicon layer 10906 may be deposited using a chemical vapor deposition process, such as LPCVD or PECVD, or other process methods, and may be deposited doped with N+ dopants, such as Arsenic or Phosphorous, or may be deposited un-doped and subsequently doped with, such as, ion implantation or PLAD (PLasma Assisted Doping) techniques. Silicon Oxide 10920 may then be deposited or grown. This oxide may now form the first Si/SiO2 layer 10923 which may include N+ doped poly-crystalline or amorphous silicon layer 10906 and silicon oxide layer 10920.

Figure 109C:
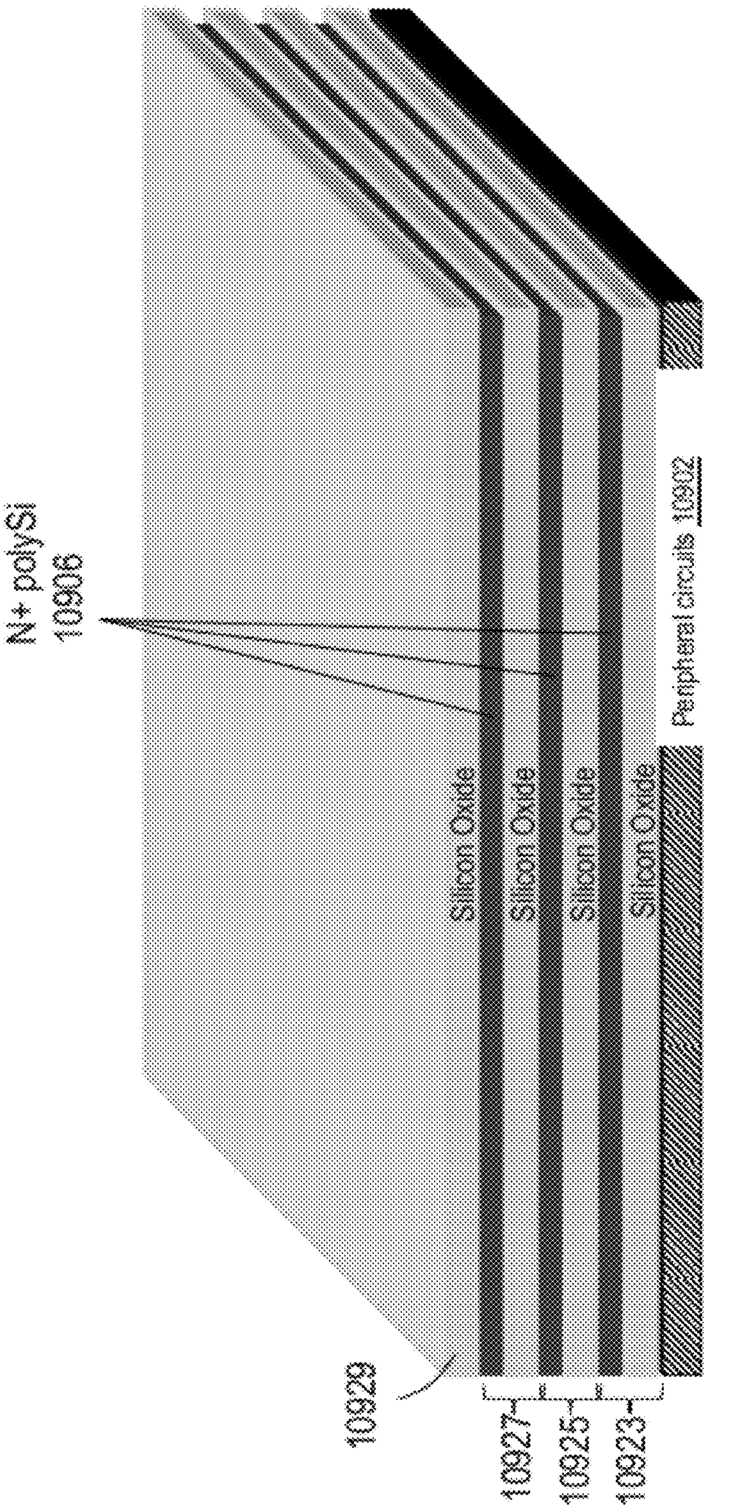

As illustrated in FIG. 109C, additional Si/SiO2 layers, such as, for example, second Si/SiO2 layer 10925 and third Si/SiO2 layer 10927, may each be formed as described in FIG. 109B. Oxide layer 10929 may be deposited to electrically isolate the top N+ doped poly-crystalline or amorphous silicon layer.

Figure 109D:
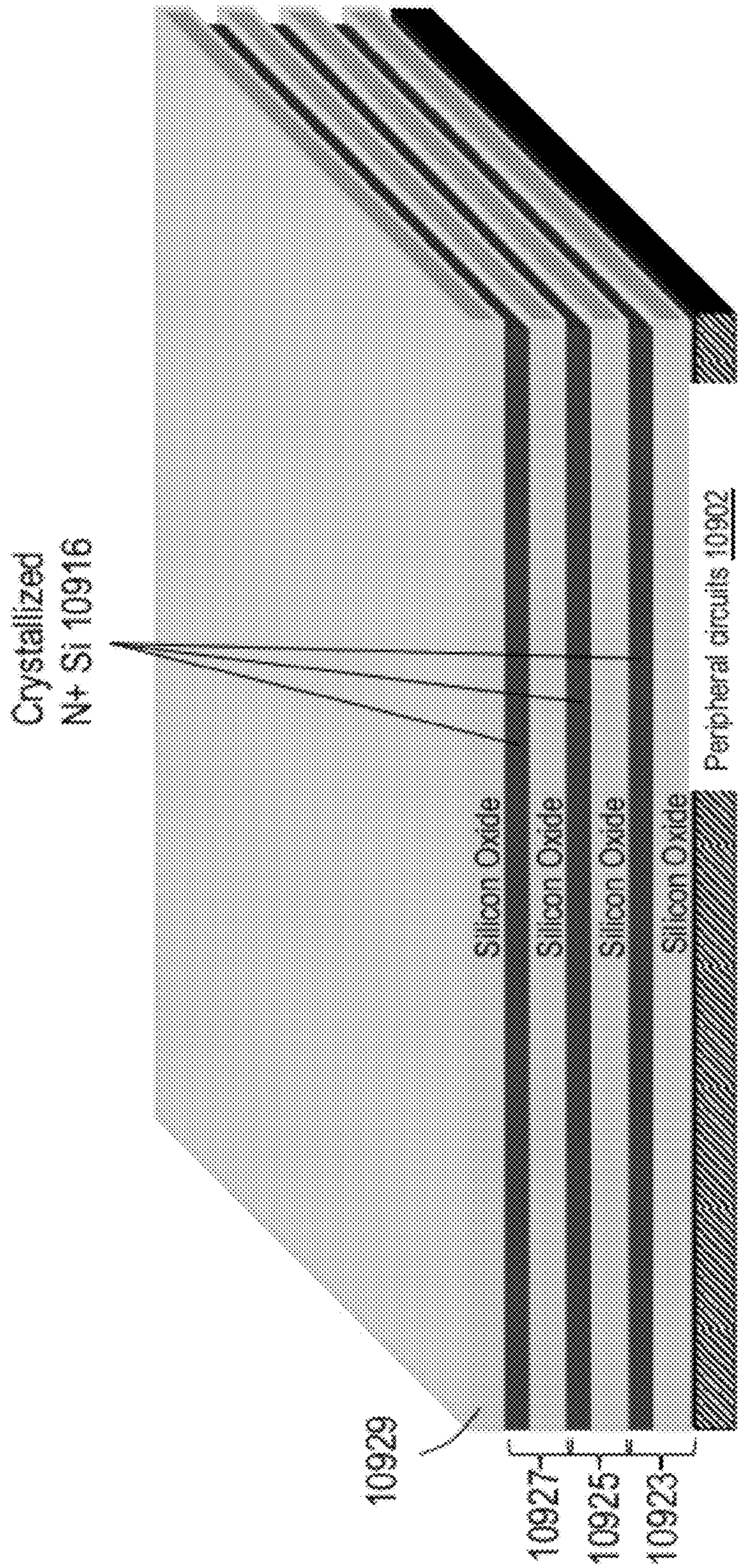

As illustrated in FIG. 109D, a Rapid Thermal Anneal (RTA) or flash anneal may be conducted to crystallize the N+ doped poly-crystalline silicon or amorphous silicon layers 10906 of first Si/SiO2 layer 10923, second Si/SiO2 layer 10925, and third Si/SiO2 layer 10927, forming crystallized N+ silicon layers 10916. Temperatures during this RTA may be as high as about 800° C. Alternatively, an optical anneal, such as, for example, a laser anneal, could be performed alone or in combination with the RTA or other annealing processes.

Figure 109E:
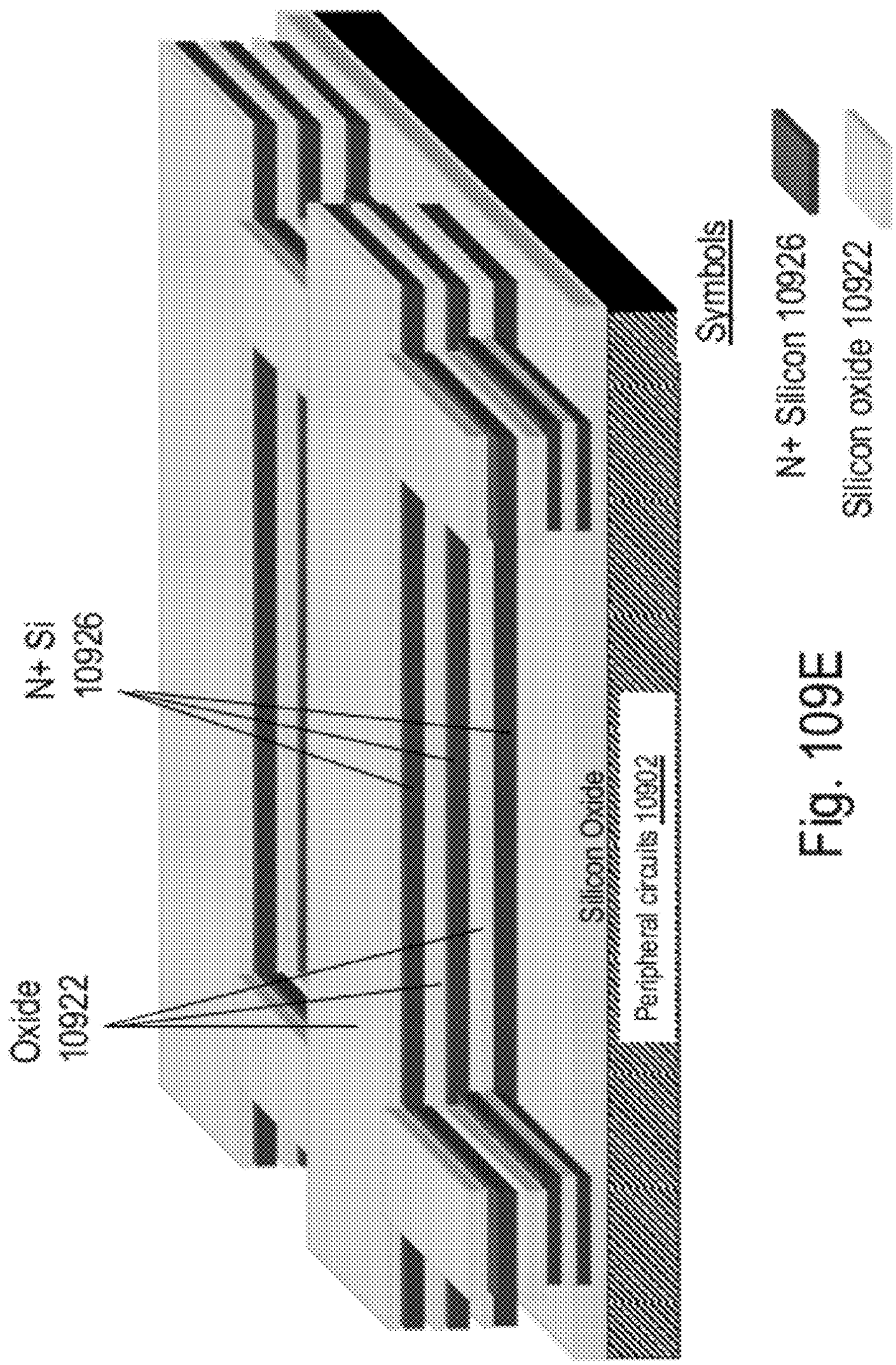

As illustrated in FIG. 109E, oxide layer 10929, third Si/SiO2 layer 10927, second Si/SiO2 layer 10925 and first Si/SiO2 layer 10923 may be lithographically defined and plasma/RIE etched to form a portion of the memory cell structure, which may now include multiple layers of regions of crystallized N+ silicon 10926 (previously crystallized N+ silicon layers 10916) and oxide 10922. Thus, these transistor elements or portions may have been defined by a common lithography step, which also may be described as a single lithography step, same lithography step, or one lithography step.

Figure 109F:
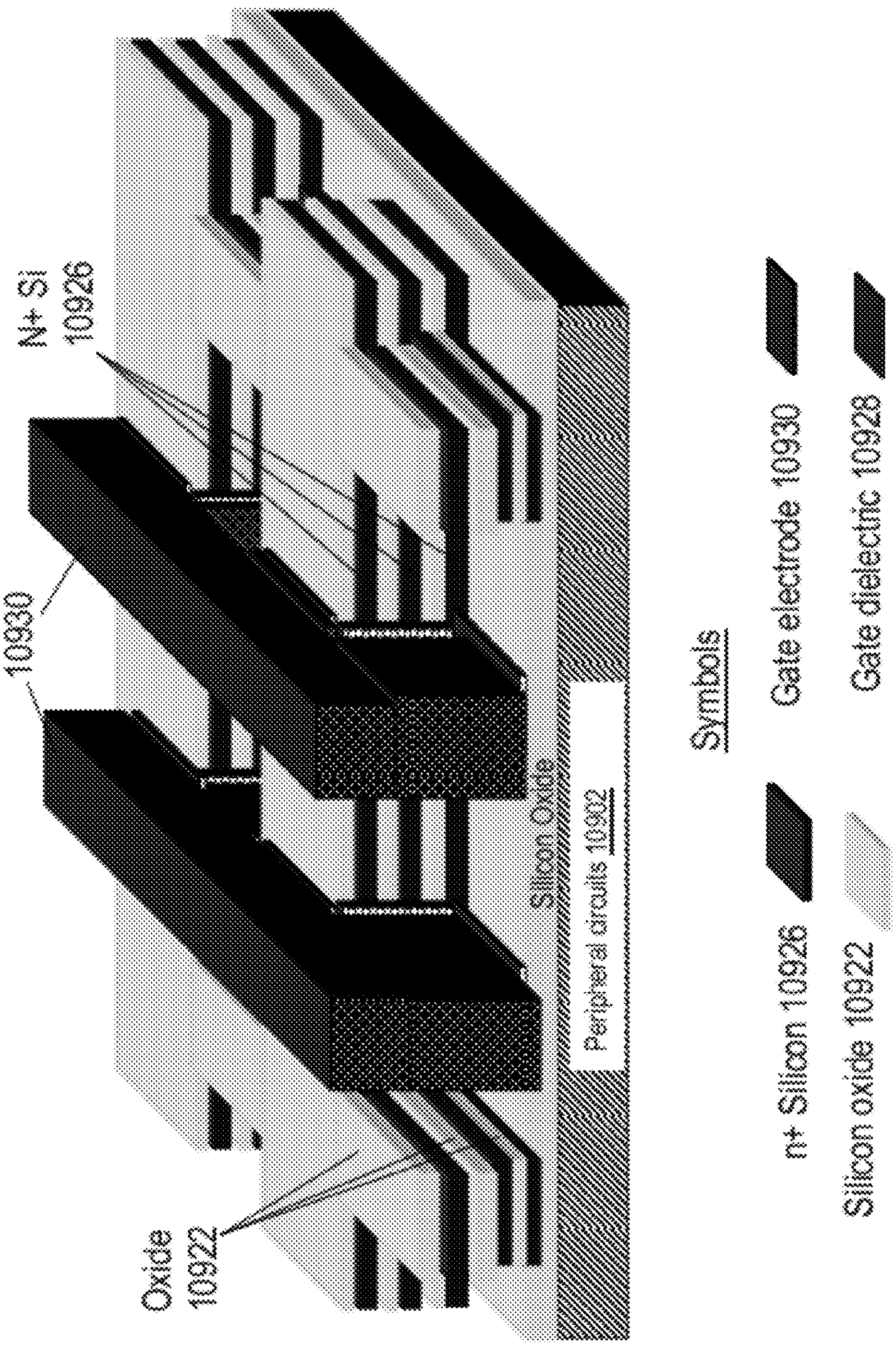

As illustrated in FIG. 109F, a gate dielectric and gate electrode material may be deposited, planarized with a chemical mechanical polish (CMP), and then lithographically defined and plasma/RIE etched to form gate dielectric regions 10928 which may either be self-aligned to and covered by gate electrodes 10930 (shown), or cover the entire crystallized N+ silicon regions 10926 and oxide regions 10922 multi-layer structure. The gate stack including gate electrode 10930 and gate dielectric regions 10928 may be formed with a gate dielectric, such as thermal oxide, and a gate electrode material, such as poly-crystalline silicon. Alternatively, the gate dielectric may be an atomic layer deposited (ALD) material that may be paired with a work function specific gate metal according to industry standard high k metal gate process schemes described previously. Furthermore, the gate dielectric may be formed with a rapid thermal oxidation (RTO), a low temperature oxide deposition or low temperature microwave plasma oxidation of the silicon surfaces and then a gate electrode such as tungsten or aluminum may be deposited.

Figure 109G:
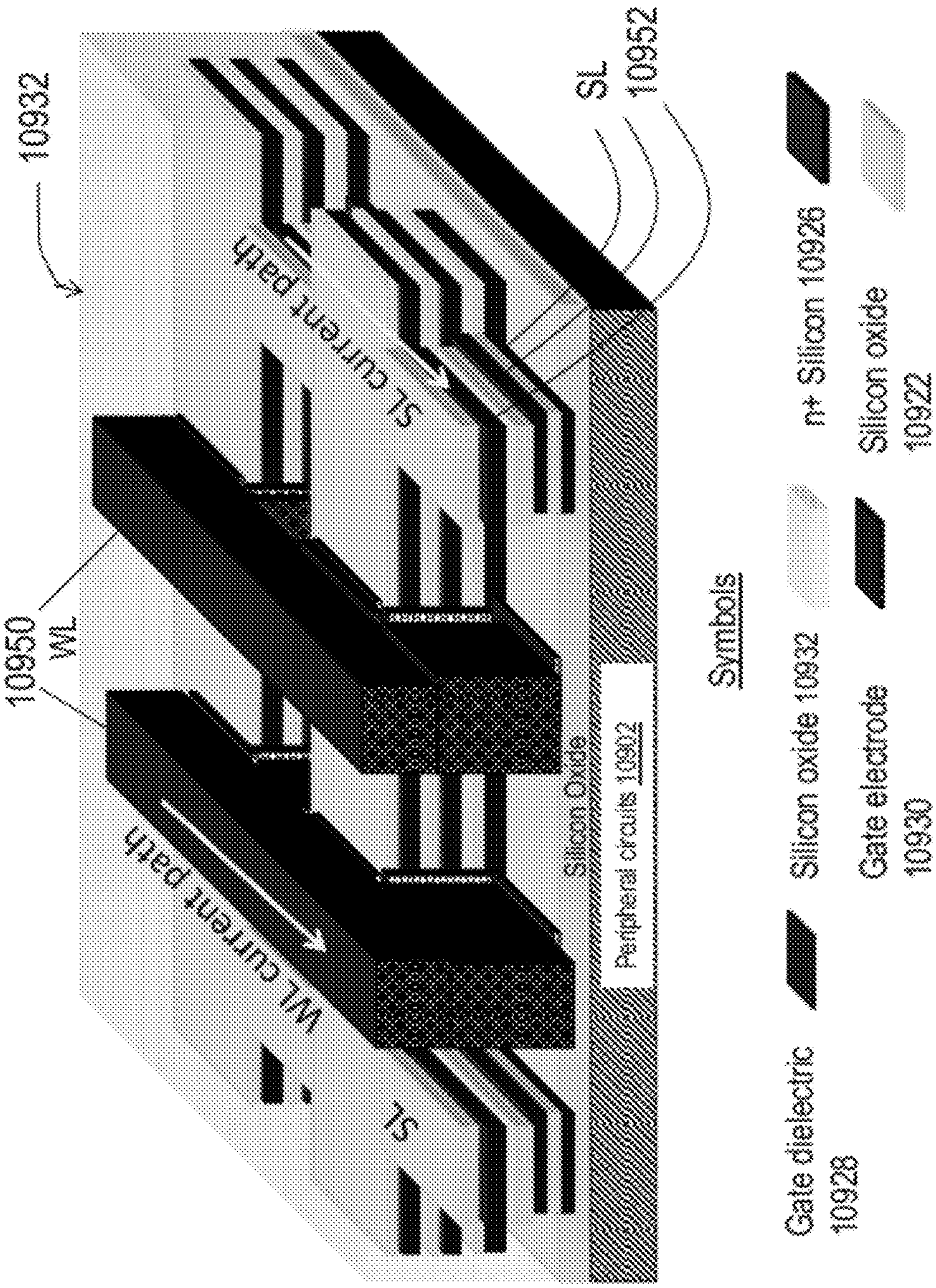

As illustrated in FIG. 109G, the entire structure may be covered with a gap fill oxide 10932, which may be planarized with chemical mechanical polishing. The oxide 10932 is shown transparently in the figure for clarity in illustration. Also shown are word-line regions (WL) 10950, which may be coupled with and include gate electrodes 10930, and source-line regions (SL) 10952, including crystallized N+ silicon regions 10926.

Figure 109H:
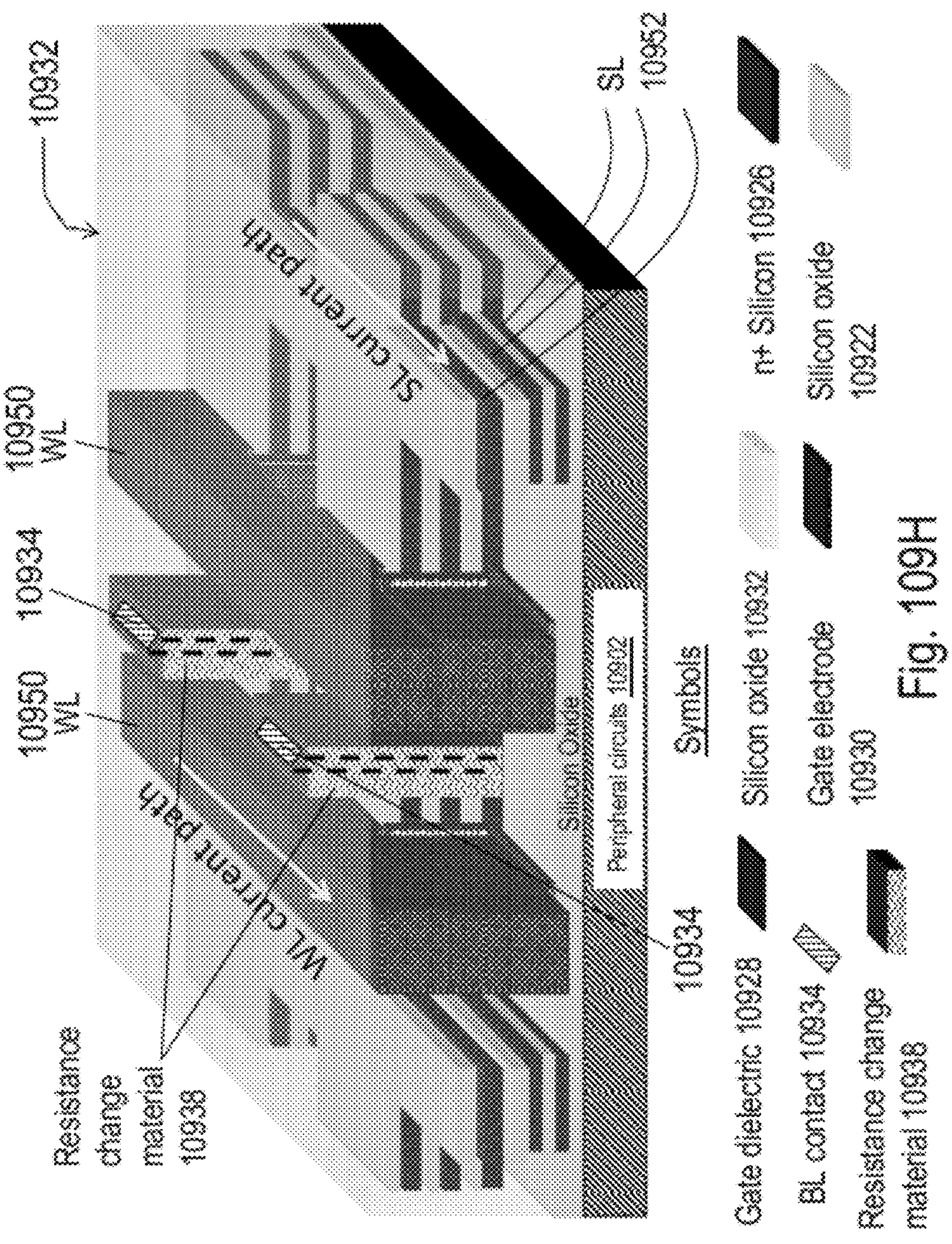

As illustrated in FIG. 109H, bit-line (BL) contacts 10934 may be lithographically defined, etched with plasma/RIE through oxide 10932, the three crystallized N+ silicon regions 10926, and associated oxide vertical isolation regions, to connect substantially all memory layers vertically, and then photoresist may be removed. Resistance change material 10938, such as, for example, hafnium oxides or titanium oxides, may then be deposited, for example, with atomic layer deposition (ALD). The electrode for the resistance change memory element may then be deposited by ALD to form the electrode/BL contact 10934. The excess deposited material may be polished to planarity at or below the top of oxide 10932. Each BL contact 10934 with resistive change material 10938 may be shared among substantially all layers of memory, shown as three layers of memory in FIG. 109H.

Figure 109I:
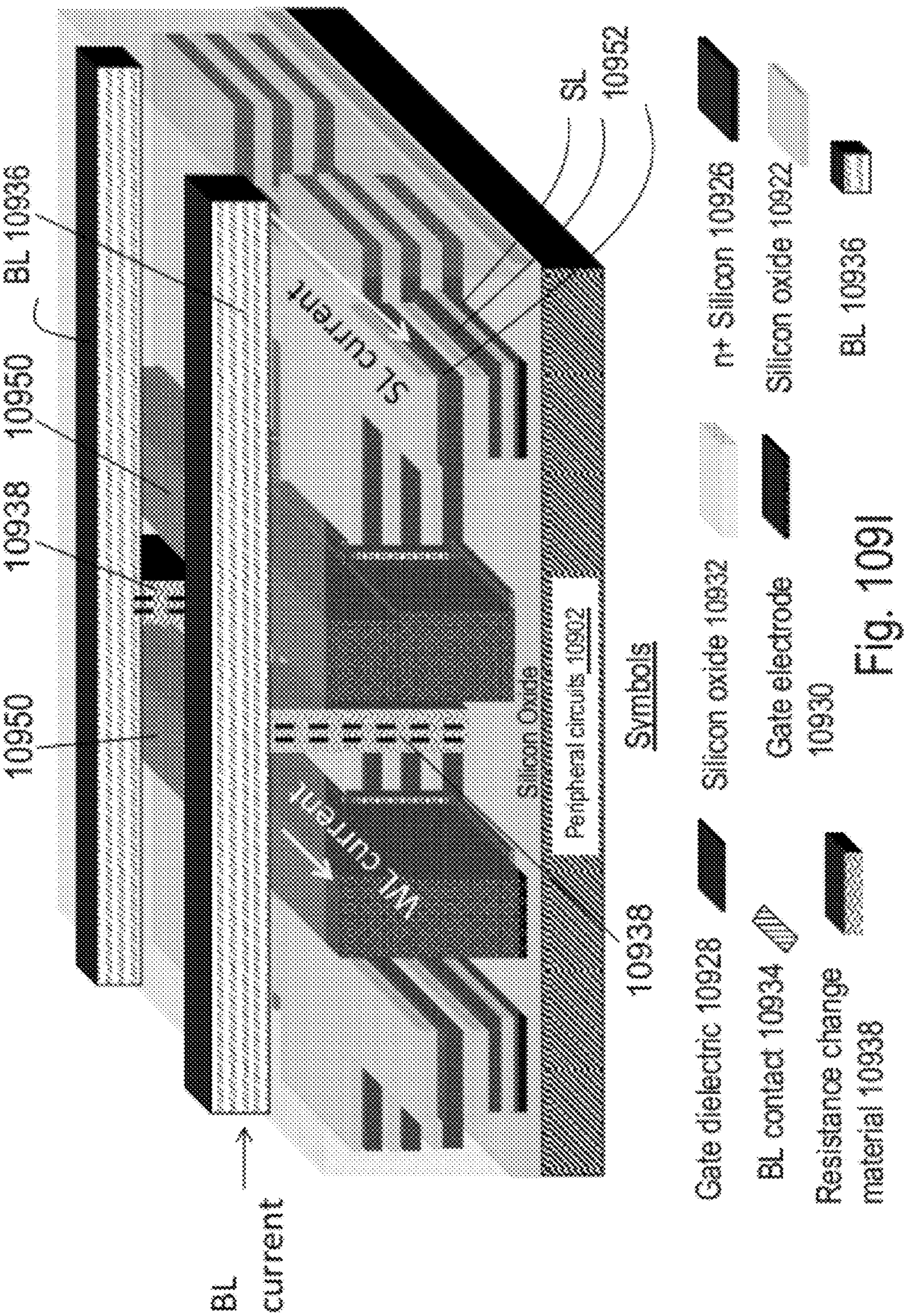

As illustrated in FIG. 109I, BL metal lines 10936 may be formed and connected to the associated BL contacts 10934 with resistive change material 10938. Contacts and associated metal interconnect lines (not shown) may be formed for the WL and SL at the memory array edges. A through layer via (not shown) may be formed to electrically couple the BL, SL, and WL metallization to the acceptor substrate peripheral circuitry via an acceptor wafer metal connect pad (not shown).

Figure 109J:
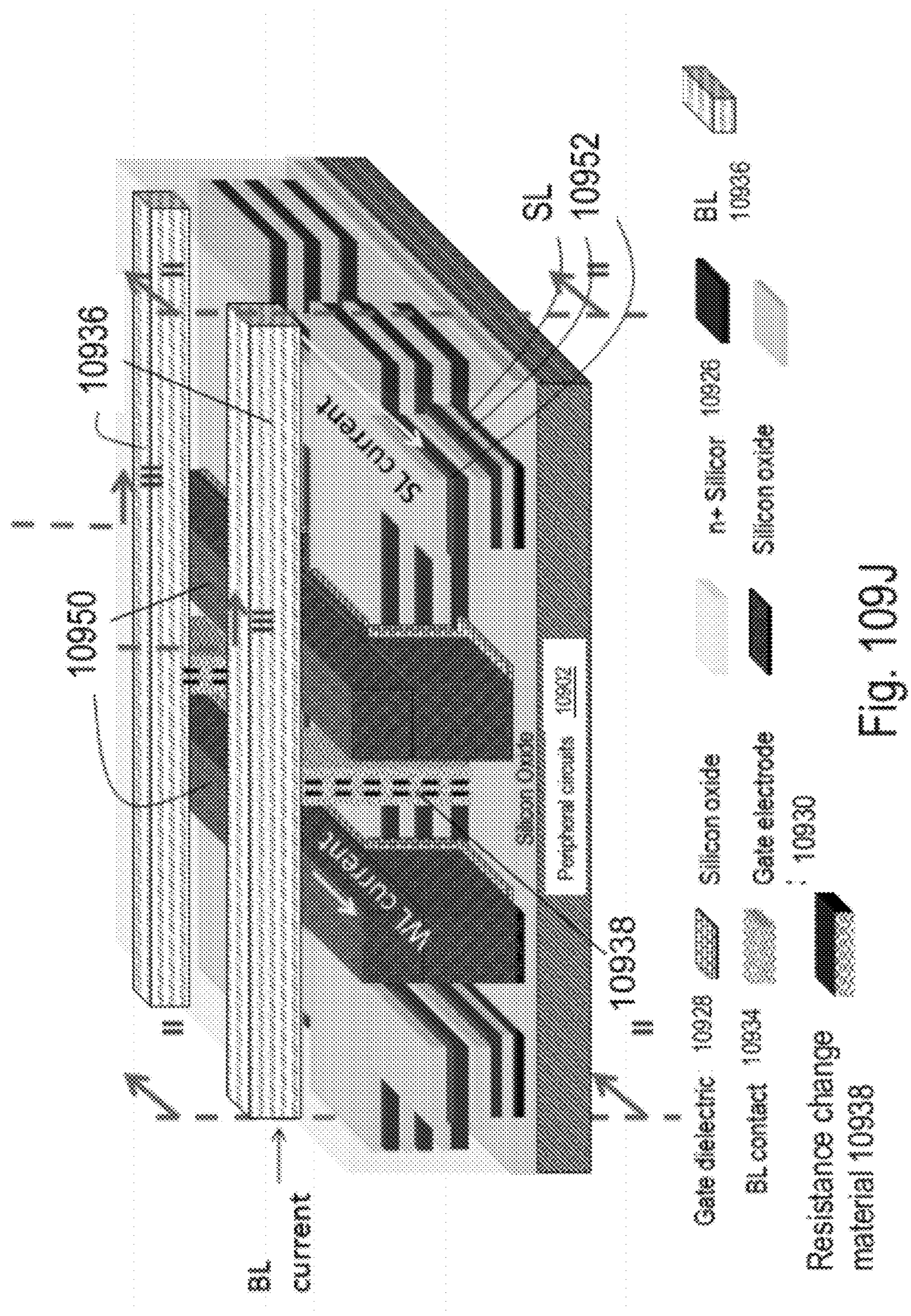

FIG. 109J1 is a cross sectional cut II view of FIG. 109J, while FIG. 109J2 is a cross sectional cut III view of FIG. 109J. FIG. 109J1 shows BL metal line 10936, oxide 10932, BL contact/electrode 10934, resistive change material 10938, WL regions 10950, gate dielectric regions 10928, crystallized N+ silicon regions 10926, and peripheral circuits substrate 10902. The BL contact/electrode 10934 may couple to one side of the three levels of resistive change material 10938. The other side of the resistive change material 10938 may be coupled to crystallized N+ regions 10926. FIG. 109J2 shows BL metal lines 10936, oxide 10932, gate electrode 10930, gate dielectric regions 10928, crystallized N+ silicon regions 10926, interlayer oxide region ('ox'), and peripheral circuits substrate 10902. The gate electrode 10930 may be common to substantially all six crystallized N+ silicon regions 10926 and may form six two-sided gated junction-less transistors as memory select transistors.

Figure 109K:
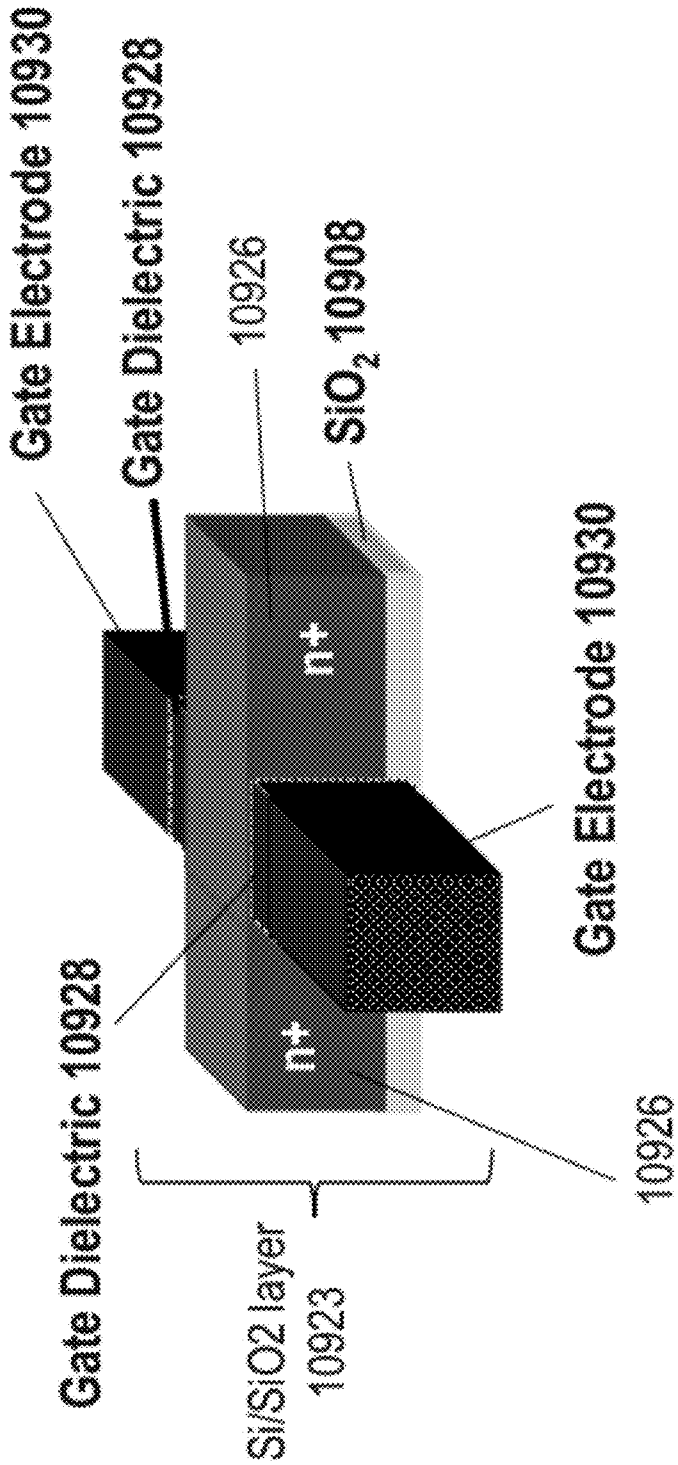

As illustrated in FIG. 109K, a single exemplary two-sided gated junction-less transistor on the first Si/SiO2 layer 10923 may include crystallized N+ silicon region 10926 (functioning as the source, drain, and transistor channel), and two gate electrodes 10930 with associated gate dielectric regions 10928. The transistor may be electrically isolated from beneath by oxide layer 10908.

This flow may enable the formation of a resistance-based multi-layer or 3D memory array with zero additional masking steps per memory layer, which may utilize poly-crystalline silicon junction-less transistors and may have a resistance-based memory element in series with a select transistor, and may be constructed by layer transfer of wafer sized doped poly-crystalline silicon layers, and this 3D memory array may be connected to an underlying multi-metal layer semiconductor device.

Persons of ordinary skill in the art will appreciate that the illustrations in FIGS. 109A through 109K are exemplary only and are not drawn to scale. Such skilled persons will further appreciate that many variations may be possible such as, for example, the RTAs and/or optical anneals of the N+ doped poly-crystalline or amorphous silicon layers 10906 as described for FIG. 109D may be performed after each Si/SiO2 layer is formed in FIG. 109C. Additionally, N+ doped poly-crystalline or amorphous silicon layer 10906 may be doped P+, or with a combination of dopants and other polysilicon network modifiers to enhance the RTA or optical annealing and subsequent crystallization and lower the N+ silicon layer 10916 resistivity. Moreover, doping of each crystallized N+ layer may be slightly different to compensate for interconnect resistances. Furthermore, each gate of the double gated 3D resistance based memory may be independently controlled for better control of the memory cell. Many other modifications within the scope of the illustrated embodiments of the invention will suggest themselves to such skilled persons after reading this specification. Thus the invention is to be limited only by the appended claims.

As illustrated in FIGS. 110A to 110J, an alternative embodiment of a resistance-based 3D memory with zero additional masking steps per memory layer may be constructed with methods that are suitable for 3D IC manufacturing. This 3D memory may utilize poly-crystalline silicon junction-less transistors that may have either a positive or a negative threshold voltage, a resistance-based memory element in series with a select or access transistor, and may have the periphery circuitry layer formed or layer transferred on top of the 3D memory array.

Figure 110A:
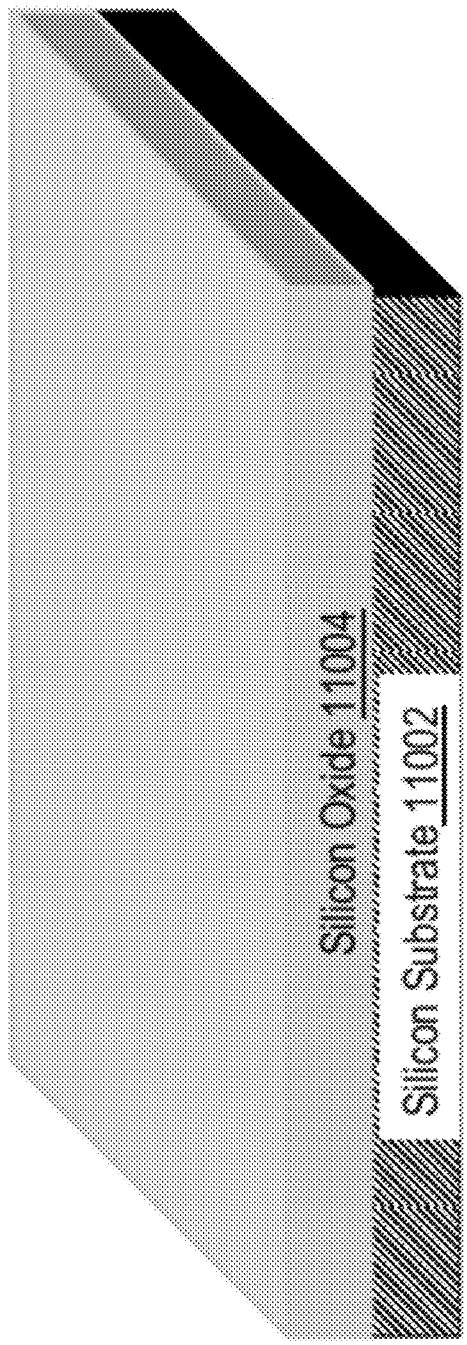

As illustrated in FIG. 110A, a silicon oxide layer 11004 may be deposited or grown on top of silicon substrate 11002.

Figure 110B:
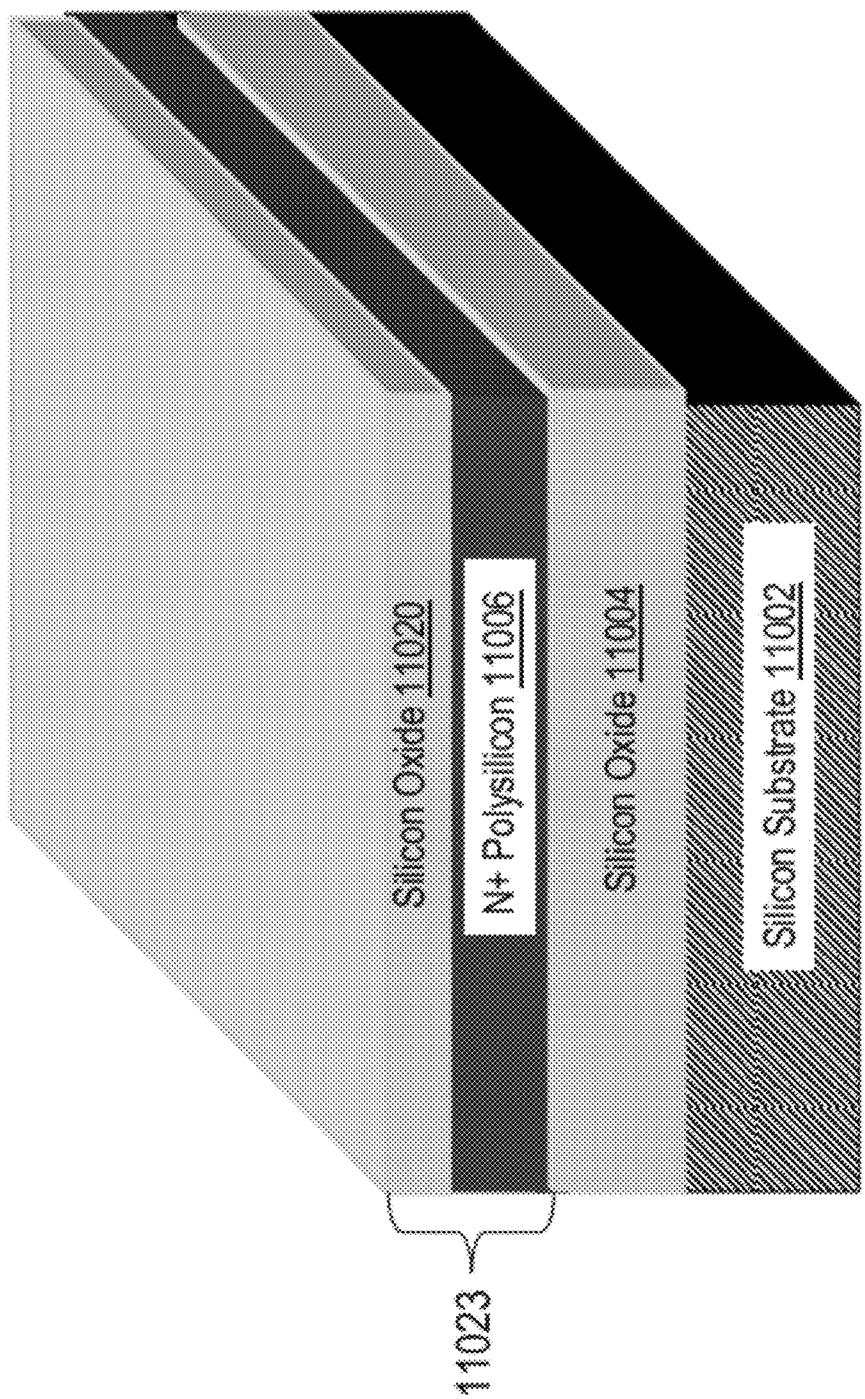

As illustrated in FIG. 110B, a layer of N+ doped poly-crystalline or amorphous silicon 11006 may be deposited. The N+ doped poly-crystalline or amorphous silicon layer 11006 may be deposited using a chemical vapor deposition process, such as LPCVD or PECVD, or other process methods, and may be deposited doped with N+ dopants, such as, for example, Arsenic or Phosphorous, or may be deposited un-doped and subsequently doped with, such as, for example, ion implantation or PLAD (PLasma Assisted Doping) techniques. Silicon Oxide 11020 may then be deposited or grown. This oxide may now form the first Si/SiO2 layer 11023 comprised of N+ doped poly-crystalline or amorphous silicon layer 11006 and silicon oxide layer 11020.

Figure 110C:
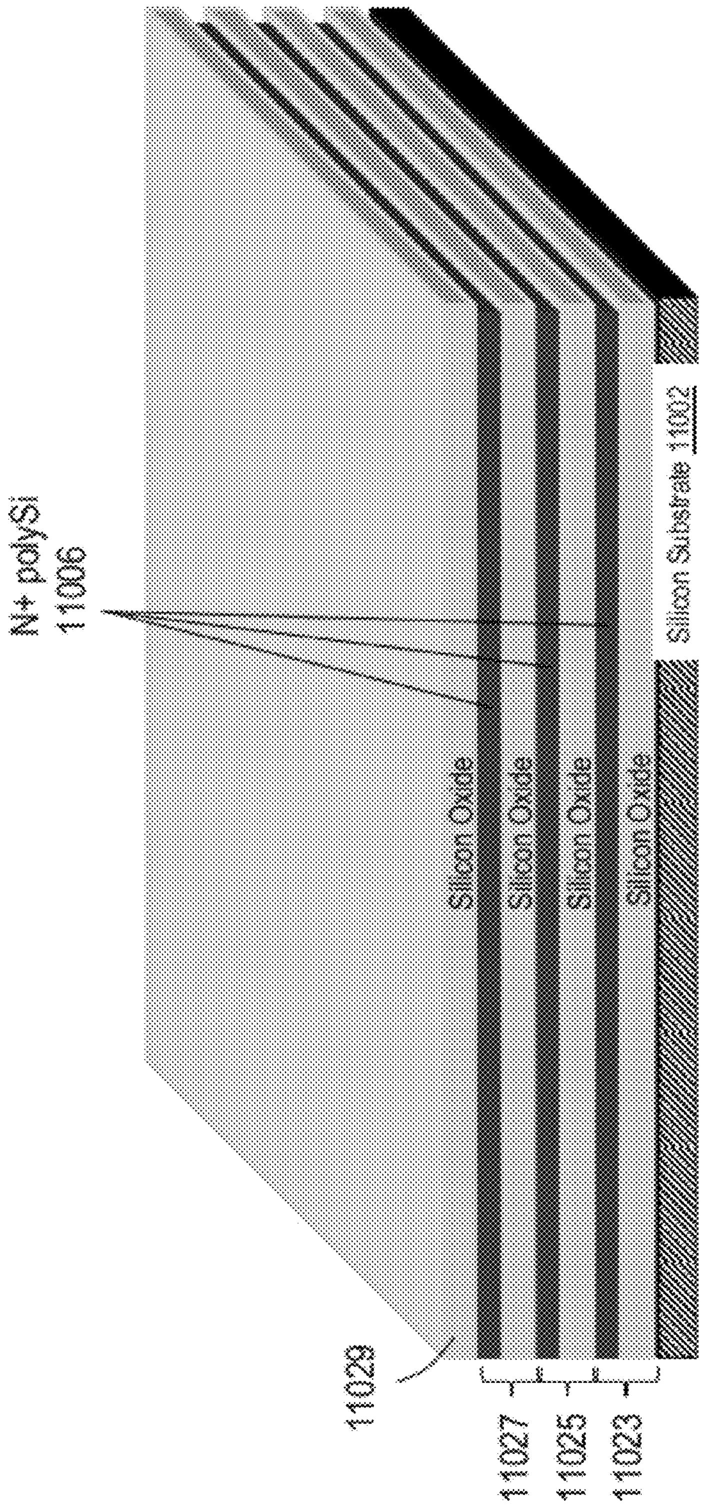

As illustrated in FIG. 110C, additional Si/SiO2 layers, such as, for example, second Si/SiO2 layer 11025 and third Si/SiO2 layer 11027, may each be formed as described in FIG. 110B. Oxide layer 11029 may be deposited to electrically isolate the top N+ doped poly-crystalline or amorphous silicon layer.

Figure 110D:
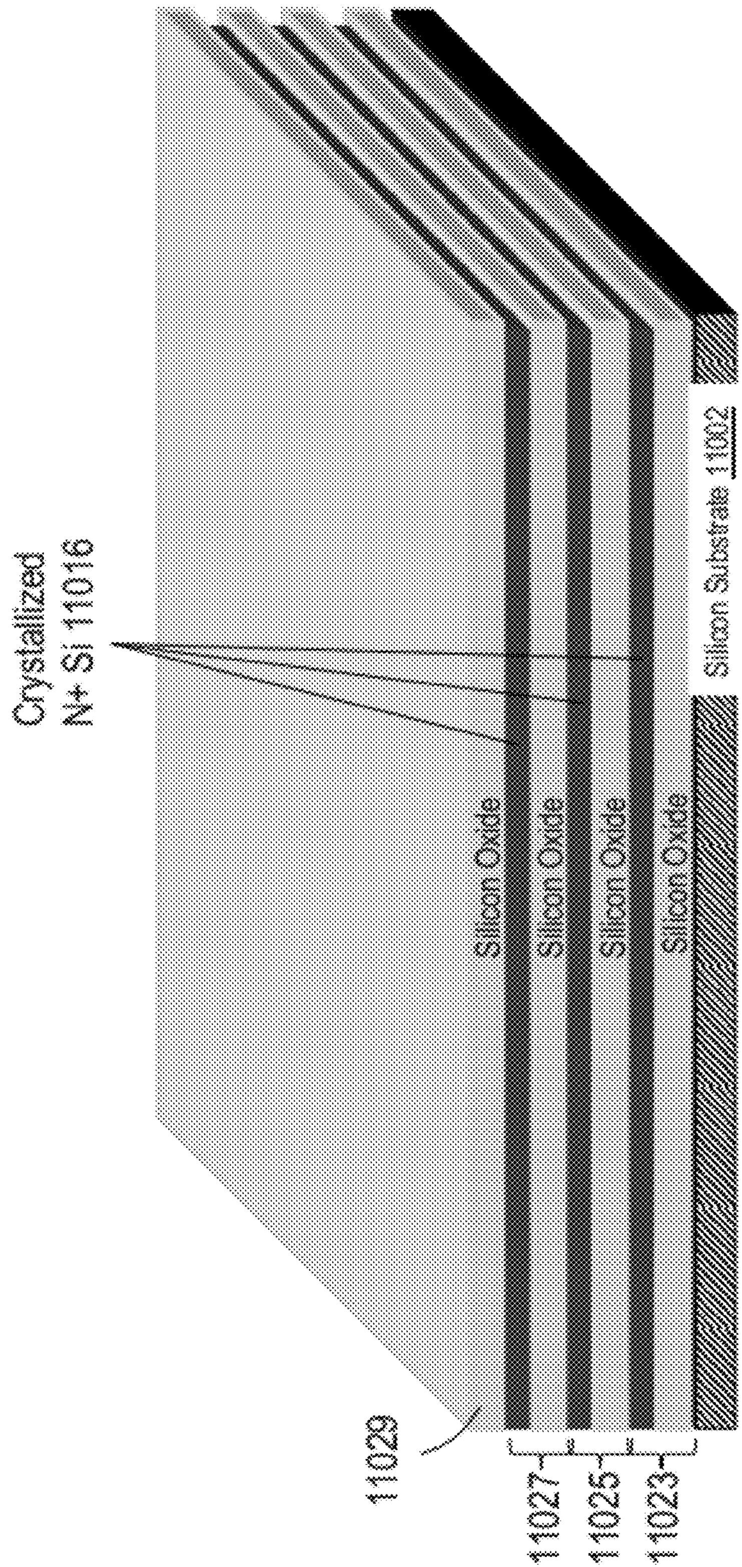

As illustrated in FIG. 110D, a Rapid Thermal Anneal (RTA) or flash anneal may be conducted to crystallize the N+ doped poly-crystalline silicon or amorphous silicon layers 11006 of first Si/SiO2 layer 11023, second Si/SiO2 layer 11025, and third Si/SiO2 layer 11027, forming crystallized N+ silicon layers 11016. Alternatively, an optical anneal, such as, for example, a laser anneal, could be performed alone or in combination with the RTA or other annealing processes. Temperatures during this step could be as high as about 700° C., and could even be as high as, for example, 1400° C. Since there may be no circuits or metallization underlying these layers of crystallized N+ silicon, very high temperatures (such as, for example, 1400° C.) can be used for the anneal process, leading to very good quality poly-crystalline silicon with few grain boundaries and very high carrier mobilities approaching those of mono-crystalline crystal silicon.

Figure 110E:
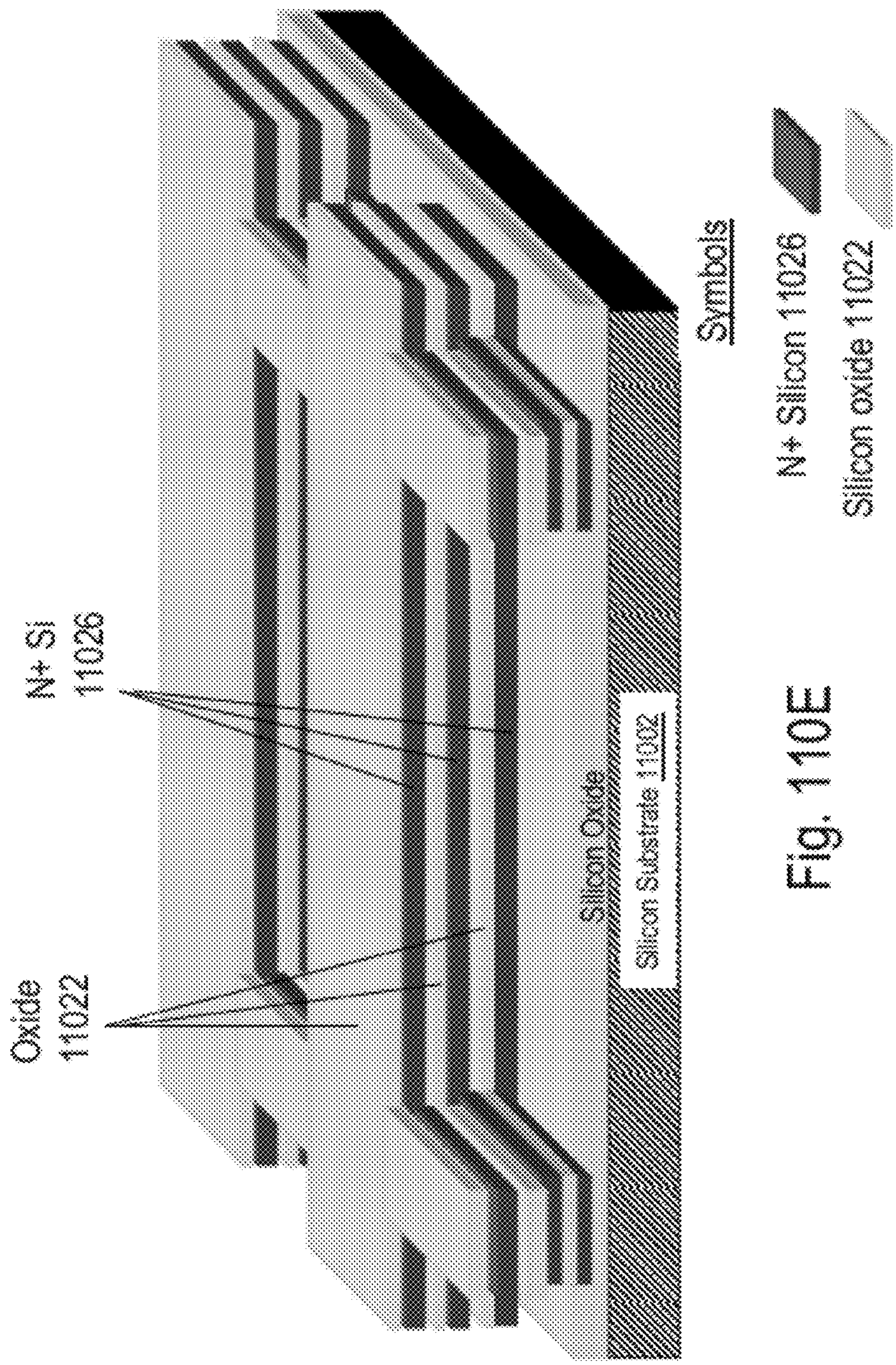

As illustrated in FIG. 110E, oxide layer 11029, third Si/SiO2 layer 11027, second Si/SiO2 layer 11025 and first Si/SiO2 layer 11023 may be lithographically defined and plasma/RIE etched to form a portion of the memory cell structure, which may now include multiple layers of regions of crystallized N+ silicon 11026 (previously crystallized N+ silicon layers 11016) and oxide 11022. Thus, these transistor elements or portions may have been defined by a common lithography step, which also may be described as a single lithography step, same lithography step, or one lithography step.

Figure 110F:
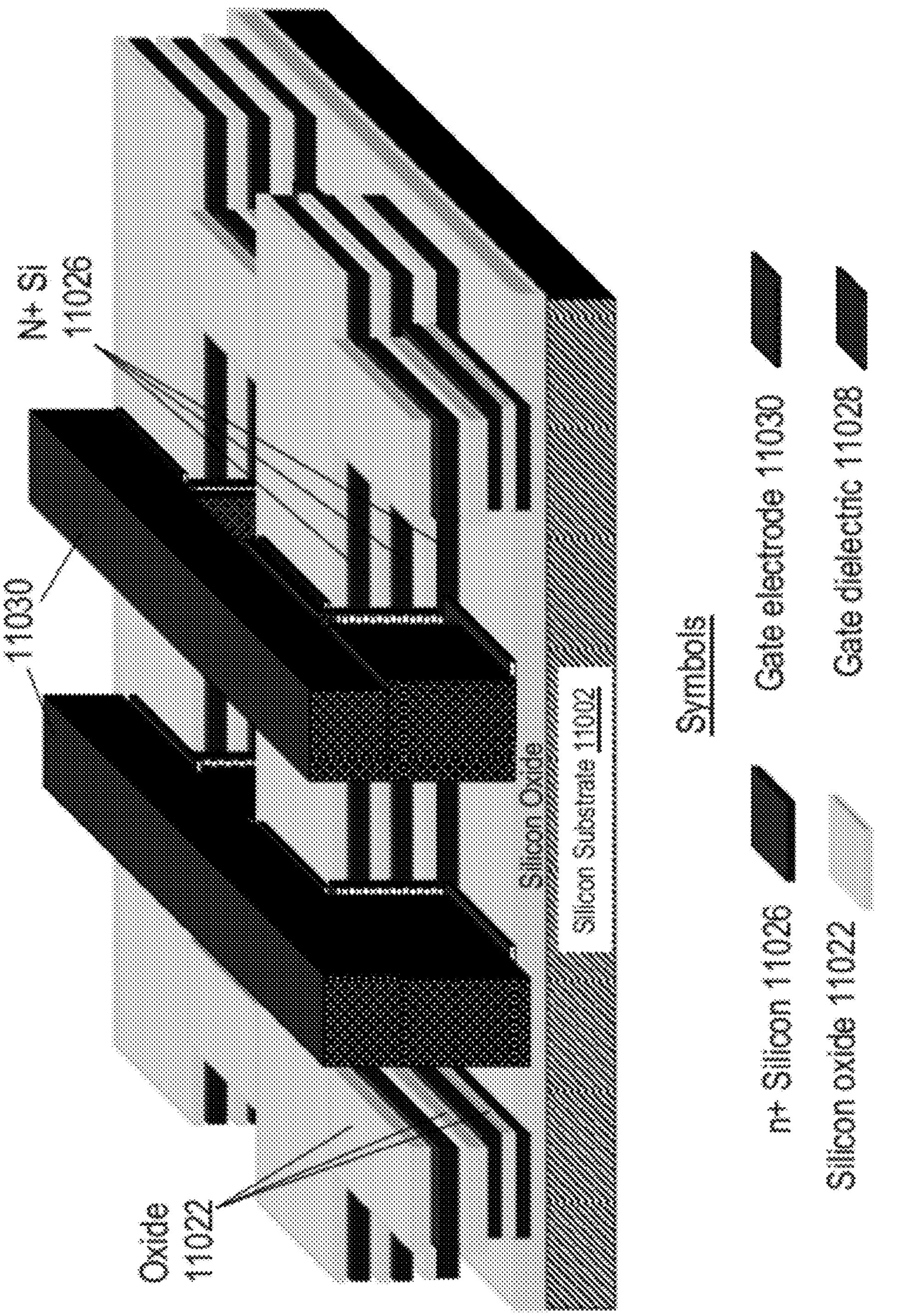

As illustrated in FIG. 110F, a gate dielectric and gate electrode material may be deposited, planarized with a chemical mechanical polish (CMP), and then lithographically defined and plasma/RIE etched to form gate dielectric regions 11028 which may either be self-aligned to and covered by gate electrodes 11030 (shown), or cover the entire crystallized N+ silicon regions 11026 and oxide regions 11022 multi-layer structure. The gate stack including gate electrode 11030 and gate dielectric regions 11028 may be formed with a gate dielectric, such as thermal oxide, and a gate electrode material, such as poly-crystalline silicon. Alternatively, the gate dielectric may be an atomic layer deposited (ALD) material that may be paired with a work function specific gate metal according to industry standard high k metal gate process schemes described previously. Additionally, the gate dielectric may be formed with a rapid thermal oxidation (RTO), a low temperature oxide deposition or low temperature microwave plasma oxidation of the silicon surfaces and then a gate electrode such as tungsten or aluminum may be deposited.

Figure 110G:
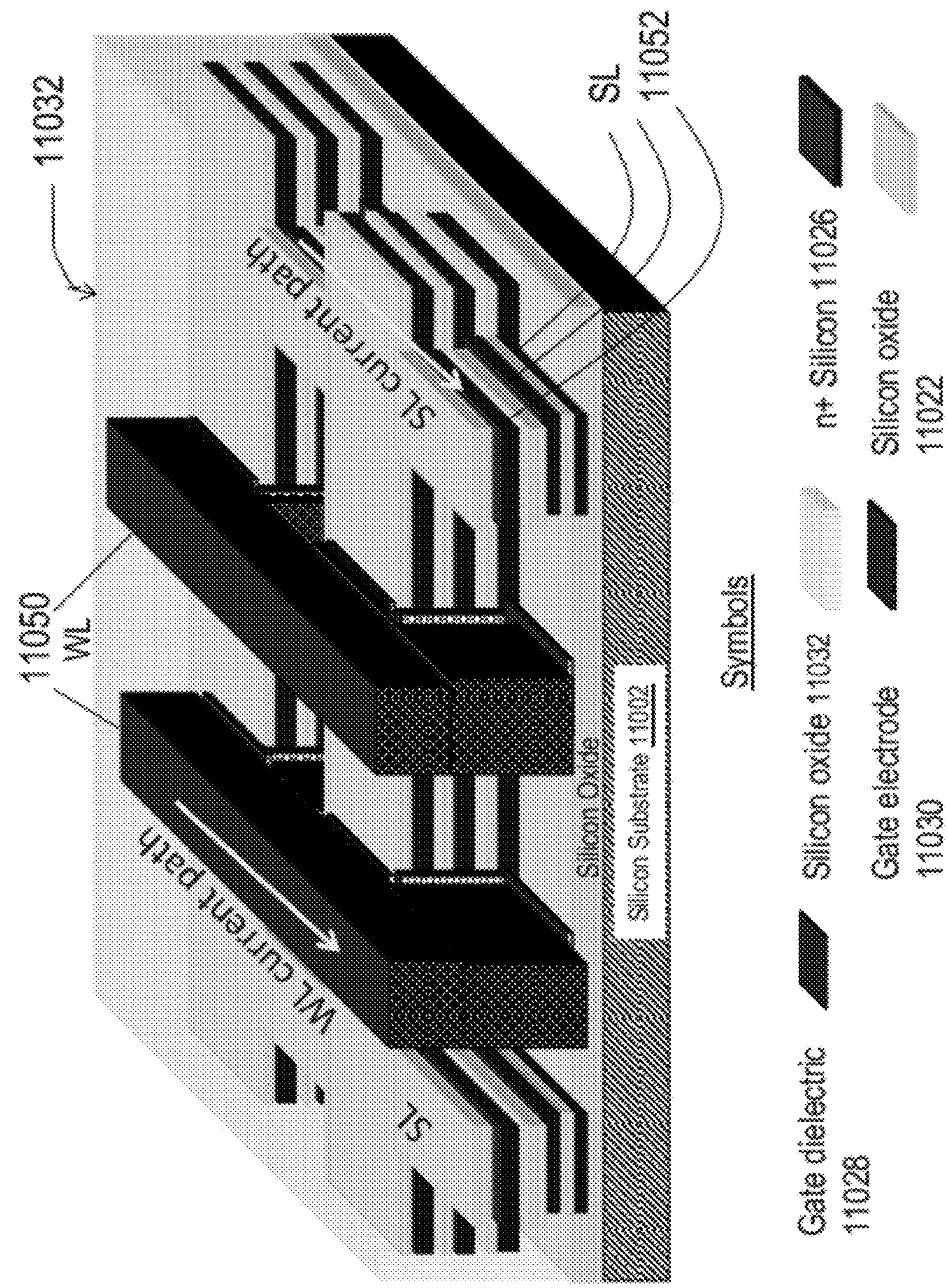

As illustrated in FIG. 110G, the entire structure may be covered with a gap fill oxide 11032, which may be planarized with chemical mechanical polishing. The oxide 11032 is shown transparently in the figure for clarity in illustration. Also shown are word-line regions (WL) 11050, which may be coupled with and include gate electrodes 11030, and source-line regions (SL) 11052, including crystallized N+ silicon regions 11026.

Figure 110H:
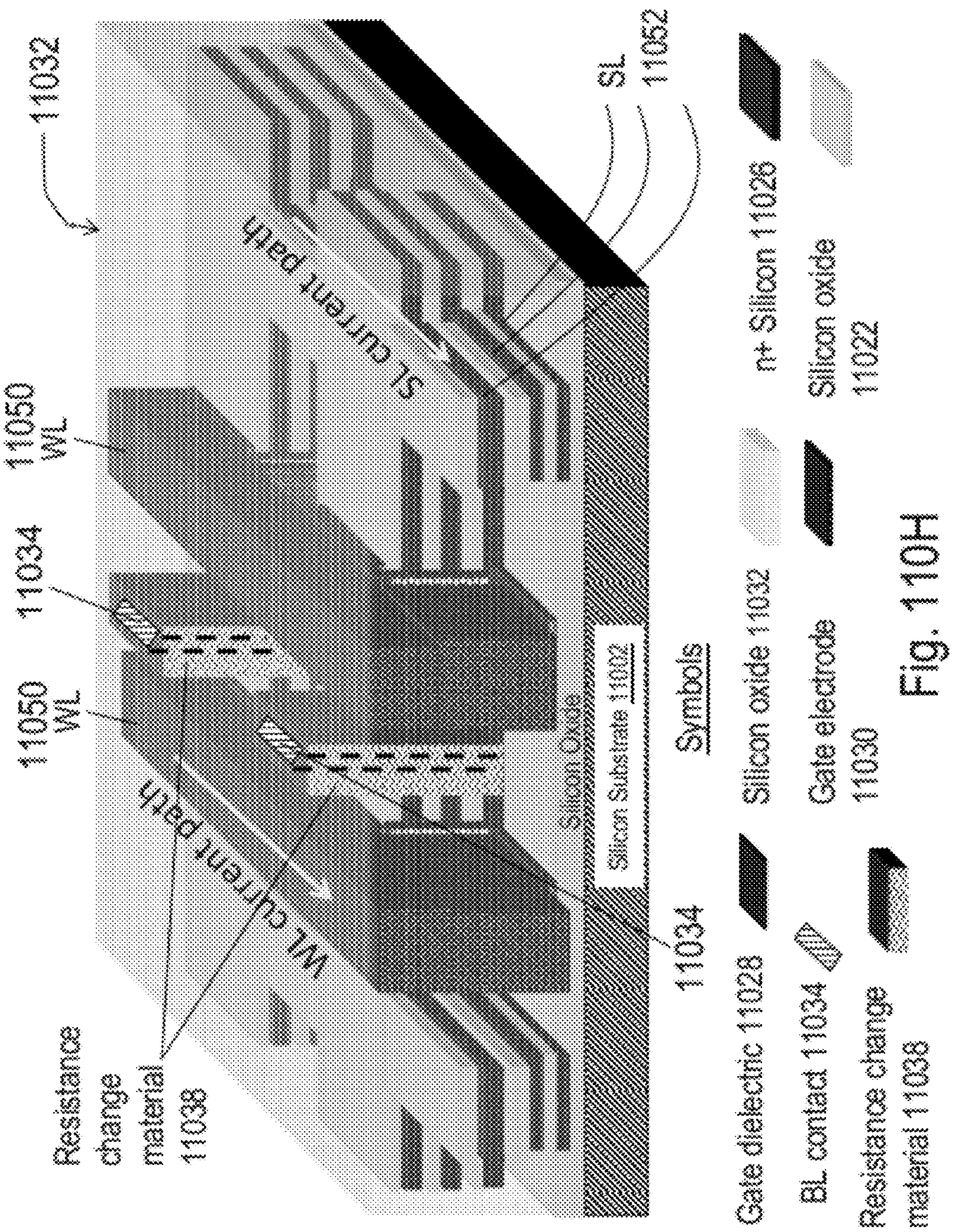

As illustrated in FIG. 110H, bit-line (BL) contacts 11034 may be lithographically defined, etched with, for example, plasma/RIE, through oxide 11032, the three crystallized N+ silicon regions 11026, and the associated oxide vertical isolation regions to connect substantially all memory layers vertically. BL contacts 11034 may then be processed by a photoresist removal. Resistance change material 11038, such as hafnium oxides or titanium oxides, may then be deposited, for example, with atomic layer deposition (ALD). The electrode for the resistance change memory element may then be deposited by ALD to form the electrode/BL contact 11034. The excess deposited material may be polished to planarity at or below the top of oxide 11032. Each BL contact 11034 with resistive change material 11038 may be shared among substantially all layers of memory, shown as three layers of memory in FIG. 110H.

Figure 110I:
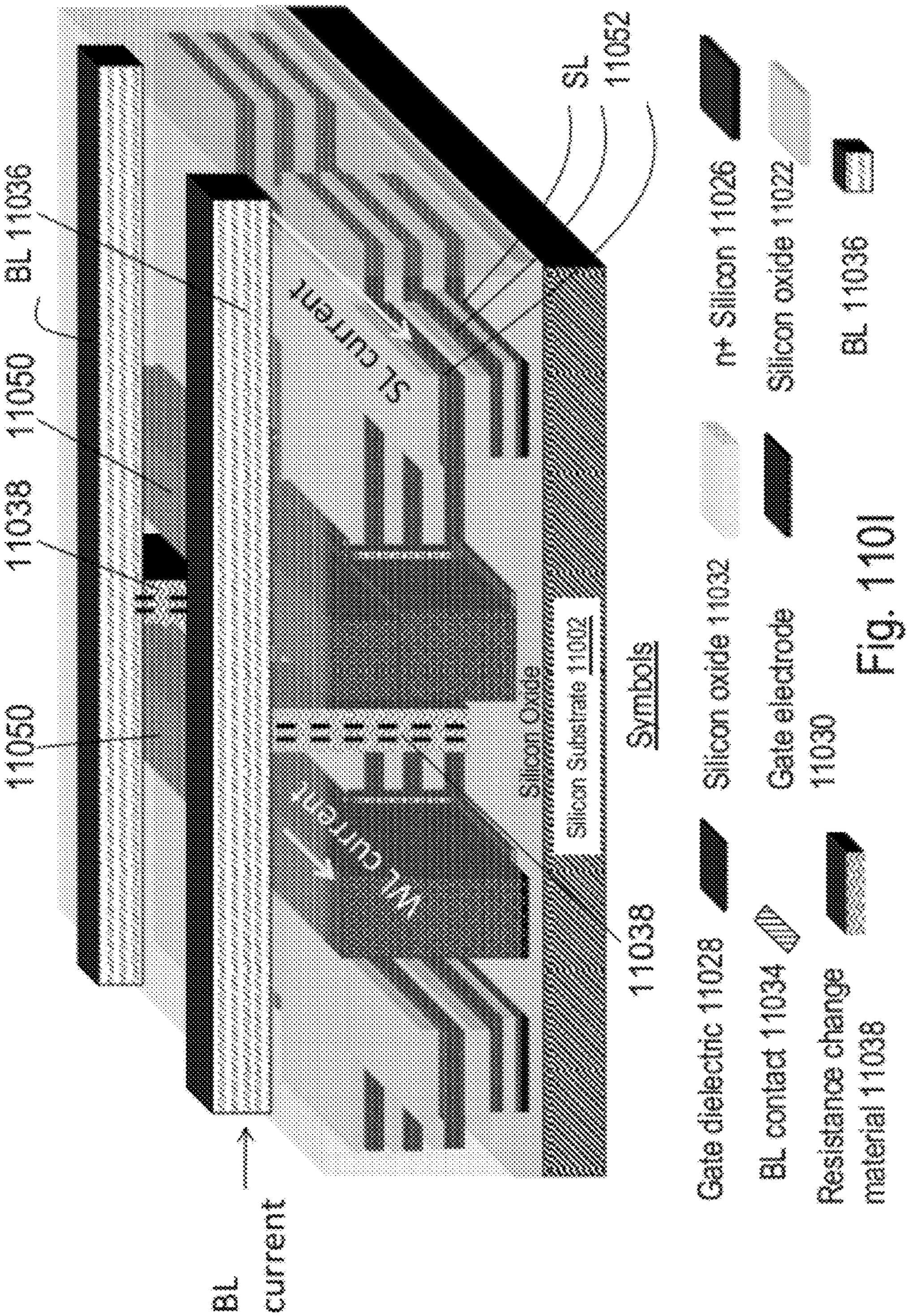

As illustrated in FIG. 110I, BL metal lines 11036 may be formed and connected to the associated BL contacts 11034 with resistive change material 11038. Contacts and associated metal interconnect lines (not shown) may be formed for the WL and SL at the memory array edges.

Figure 110J:
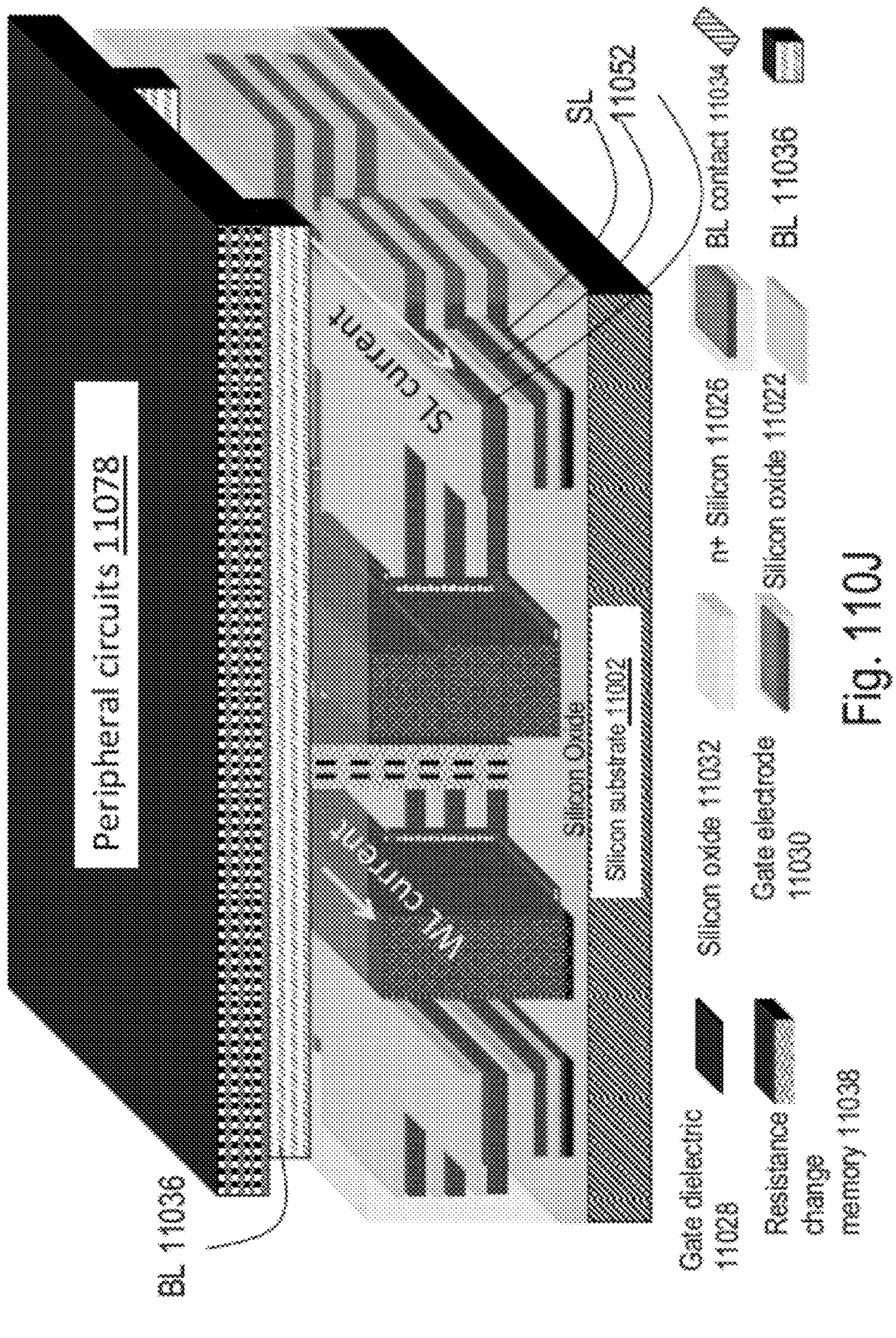

As illustrated in FIG. 110J, peripheral circuits 11078 may be constructed and then layer transferred, using methods described previously such as, for example, ion-cut with replacement gates, to the memory array. Thru layer vias (not shown) may be formed to electrically couple the periphery circuitry to the memory array BL, WL, SL and other connections such as, for example, power and ground. Alternatively, the periphery circuitry may be formed and directly aligned to the memory array and silicon substrate 11002 utilizing the layer transfer of wafer sized doped layers and subsequent processing, such as, for example, the junction-less, Recess Channel Array Transistor (RCAT), V-groove, or bipolar transistor formation flows as previously described.

This flow may enable the formation of a resistance-based multi-layer or 3D memory array with zero additional masking steps per memory layer, which may utilize poly-crystalline silicon junction-less transistors and may have a resistance-based memory element in series with a select transistor, and may be constructed by layer transfers of wafer sized doped poly-crystalline silicon layers, and this 3D memory array may be connected to an overlying multi-metal layer semiconductor device or periphery circuitry.

Persons of ordinary skill in the art will appreciate that the illustrations in FIGS. 110A through 110J are exemplary only and are not drawn to scale. Such skilled persons will further appreciate that many variations may be possible such as, for example, the RTAs and/or optical anneals of the N+ doped poly-crystalline or amorphous silicon layers 11006 as described for FIG. 110D may be performed after each Si/SiO2 layer may be formed in FIG. 110C. Additionally, N+ doped poly-crystalline or amorphous silicon layer 11006 may be doped P+, or with a combination of dopants and other polysilicon network modifiers to enhance the RTA or optical annealing crystallization and subsequent crystallization, and lower the N+ silicon layer 11016 resistivity. Moreover, doping of each crystallized N+ layer may be slightly different to compensate for interconnect resistances. Further, each gate of the double gated 3D resistance based memory may be independently controlled for better control of the memory cell. Furthermore, by proper choice of materials for memory layer transistors and memory layer wires (e.g., by using tungsten and other materials that withstand high temperature processing for wiring), standard CMOS transistors may be processed at high temperatures (e.g., greater than about 400° C.) to form the periphery circuits 11078. Many other modifications within the scope of the illustrated embodiments of the invention will suggest themselves to such skilled persons after reading this specification. Thus the invention is to be limited only by the appended claims.

An alternative embodiment of this present invention may be a monolithic 3D DRAM we call NuDRAM. It may utilize layer transfer and cleaving methods described in this document. It may provide high-quality single crystal silicon at low effective thermal budget, leading to considerable advantage over prior art.

One embodiment of this invention may be constructed with the process flow depicted in FIG. 88(A)-(F). FIG. 88(A) describes the first step in the process. A p− wafer 8801 may be implanted with n type dopant to form an n+ layer 8802, following which an RTA or flash anneal may be performed. Alternatively, the n+ layer 8802 may be formed by epitaxy.

FIG. 88(B) shows the next step in the process. Hydrogen may be implanted into the wafer at a certain depth in the p− wafer 8801. Final position of the hydrogen is depicted by the dotted line of hydrogen plane 8803.

FIG. 88(C) describes the next step in the process. The wafer may be attached to a temporary carrier wafer 8804 using an adhesive. For example, one could use a polyimide adhesive from Dupont for this purpose along with a temporary carrier wafer 8804 made of glass. The wafer may then be cleaved at the hydrogen plane 8803 using any cleave method described in this document. After cleave, the cleaved surface may be polished with CMP and an oxide 8805 may be deposited on this surface. The structure of the wafer after substantially all these processes may be carried out is shown in FIG. 88(C).

FIG. 88(D) illustrates the next step in the process. A wafer with DRAM peripheral circuits 8806 such as sense amplifiers, row decoders, etc. may now be used as a base on top of which the wafer in FIG. 88(C) may be bonded, using oxide-to-oxide bonding at surface 8807. The temporary carrier wafer 8804 may then be removed. Then, a step of masking, etching, and oxidation may be performed, to define rows of diffusion, isolated by oxide similarly to 8905 of FIG. 89 (B). The rows of diffusion and isolation may be aligned with the underlying peripheral circuits 8806. After forming isolation regions, RCATs may be constructed by etching, and then depositing gate dielectric 8809 and gate electrode 8808. This procedure may be further explained in the descriptions associated with FIG. 67. The gate electrode mask may be aligned to the underlying peripheral circuits 8806. An oxide layer 8810 may be deposited and polished with CMP.

FIG. 88(E) shows the next step of the process. A second RCAT layer 8812 may be formed atop the first RCAT layer 8811 using steps similar to FIG. 88(A)-(D). These steps could be repeated multiple times to form the multilayer 3D DRAM.

The next step of the process may be described with respect to FIG. 88(F). Via holes 8813 may be etched to RCAT sources and drains through substantially all of the layers of the stack. As this step may also be performed in alignment with the peripheral circuits 8806, an etch stop could be designed or no vulnerable element should be placed underneath the designated etch locations. This etch stop may be similar to a conventional DRAM array wherein the gates 8816 of multiple RCAT transistors are connected by poly line or metal line perpendicular to the plane of the illustration in FIG. 88. This connection of gate electrodes may form the word-line, similar to that illustrated in FIGS. 89A-D. The layout may spread the word-lines of the multilayer DRAM structure so that for each layer there may be at least one vertical contact hole connection to allow peripheral circuits 8806 to control each layer's word-line independently. Via holes 8813 may then be filled with heavily doped polysilicon. The heavily doped polysilicon may be constructed using a low temperature (below about 400° C.) process such as PECVD. The heavily doped polysilicon may not only improve the contact of multiple sources, drains, and word-lines of the 3D DRAM, but also may serve the purpose of separating adjacent p− layers 8817 and 8818. Alternatively, oxide may be utilized for isolation. Multiple layers of interconnects and vias may then be constructed to form Bit-Lines 8815 and Source-Lines 8814 to complete the DRAM array. While RCAT transistors may be shown in FIG. 88, a process flow similar to FIG. 88A-F can be developed for other types of low-temperature processed stackable transistors as well. For example, V-groove transistors and other transistors described in other embodiments of the invention may be developed.

FIG. 89(A)-(D) show the side-views, layout, and schematic of one part of the NuDRAM array described in FIG. 88(A)-(F). FIG. 89(A) shows one particular cross-sectional view of the NuDRAM array. The Bit-Lines (BL) 8902 may run in a direction perpendicular to the word-lines (WL) 8904 and source-lines (SL) 8903.

A cross-sectional view taken along the plane indicated by the broken line as shown in FIG. 89(B). Oxide isolation regions 8905 may separate p− layers 8906 of adjacent transistors. WL 8907 may include, for example, gate electrodes of each transistor connected together.

A layout of this array is shown in FIG. 89(C). The WL wiring 8908 and SL wiring 8909 may be perpendicular to the BL wiring 8910. A schematic of the NuDRAM array (FIG. 89(D)) reveals connections for WLs, BLs and SLs at the array level.

Another variation embodiment of the invention is described in FIG. 90(A)-(F). FIG. 90(A) describes the first step in the process. A p− wafer 9001 may include an n+ epi layer 9002 and a p− epi layer 9003 grown over the n+ epi layer. Alternatively, these layers could be formed with implant. An oxide layer 9004 may be grown or deposited over the wafer as well.

FIG. 90(B) shows the next step in the process. Hydrogen H+, or other atomic species, may be implanted into the wafer at a certain depth in the n+ region 9002. The final position of the hydrogen is depicted by the dotted line for hydrogen plane 9005.

FIG. 90(C) describes the next step in the process. The wafer may be flipped and attached to a wafer with DRAM peripheral circuits 9006 using oxide-to-oxide bonding. The wafer may then be cleaved at the hydrogen plane 9005 using low temperature (less than about 400° C.) cleave methods described in this document. After cleave, the cleaved surface may be polished with CMP.

As shown in FIG. 90(D), a step of masking, etching, and low temperature oxide deposition may be performed, to define rows of diffusion, isolated by said oxide. The rows of diffusion and isolation may be aligned with the underlying peripheral circuits 9006. After forming isolation regions, RCATs may be constructed with masking, etch, and gate dielectric 9009 and gate electrode 9008 deposition. The procedure for constructing this RCAT is explained in the description for FIG. 67. The gates and other structures may be aligned to the underlying peripheral circuits 9006. An oxide layer 9010 may be deposited and polished with CMP.

FIG. 90(E) shows the next step of the process. A second RCAT layer 9012 may be formed atop the first RCAT layer 9011 using steps similar to FIG. 90(A)-(D). These steps could be repeated multiple times to form the multilayer 3D DRAM.

The next step of the process is described in FIG. 90(F). Via holes may be etched to the source and drain connections through substantially all of the layers in the stack, similar to a conventional DRAM array wherein the gate electrodes 9016 of multiple RCAT transistors are connected by poly line perpendicular to the plane of the illustration in FIG. 90. This connection of gate electrodes may form the word-line. The layout may spread the word-lines of the multilayer DRAM structure so that for each layer there may be at least one vertical hole to allow the peripheral circuits 9006 to control each layer word-line independently. Via holes may then be filled with heavily doped polysilicon 9013. The heavily doped polysilicon 9013 may be constructed using a low temperature process below about 400° C. such as PECVD. Multiple layers of interconnects and vias may then be constructed to form bit-lines 9015 and source-lines 9014 to complete the DRAM array. Array organization of the NuDRAM described in FIG. 90 may be similar to FIG. 89. While RCAT transistors are shown in FIG. 90, a process flow similar to FIG. 90 can be developed for other types of low-temperature processed stackable transistors as well. For example, V-groove transistors and other transistors previously described in other embodiments of this invention can be developed.

Yet another flow for constructing NuDRAMs may be shown in FIG. 91A-L. The process description may begin in FIG. 91A with forming shallow trench isolation 9102 in an SOI p− wafer 9101. The buried oxide layer is indicated as 9119.

Figure 91B:
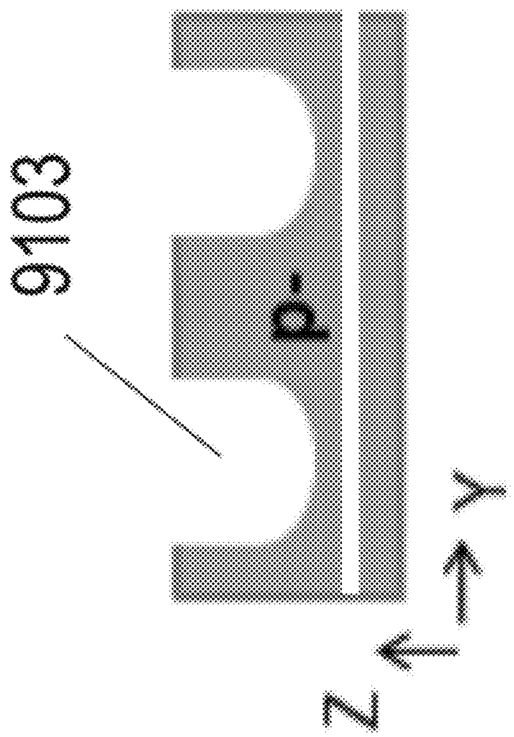
Figure 91A:
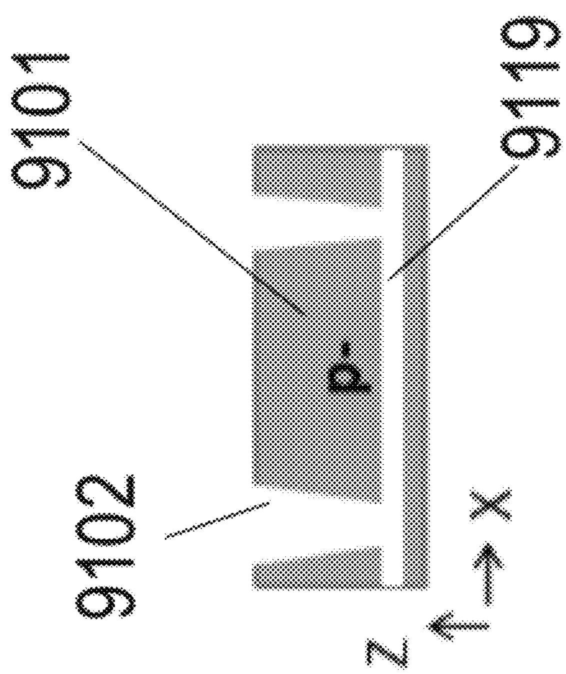

Following this procedure, a gate trench etch 9103 may be performed as illustrated in FIG. 91B. FIG. 91B shows a cross-sectional view of the NuDRAM in the YZ plane, compared to the XZ plane for FIG. 91A (therefore the shallow trench isolation 9102 is not shown in FIG. 91B).

Figure 91C:
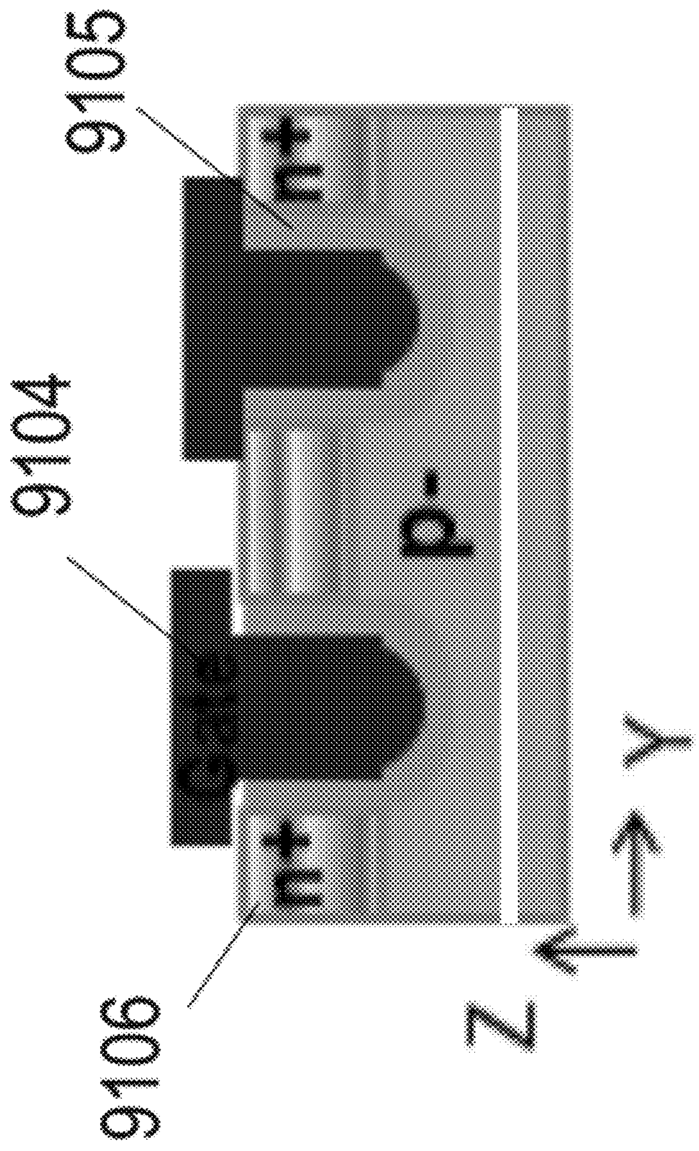

The next step in the process is illustrated in FIG. 91C. A gate dielectric layer 9105 may be formed and the RCAT gate electrode 9104 may be formed using procedures similar to FIG. 67E. Ion implantation may then be carried out to form source and drain n+ regions 9106.

Figure 91D:
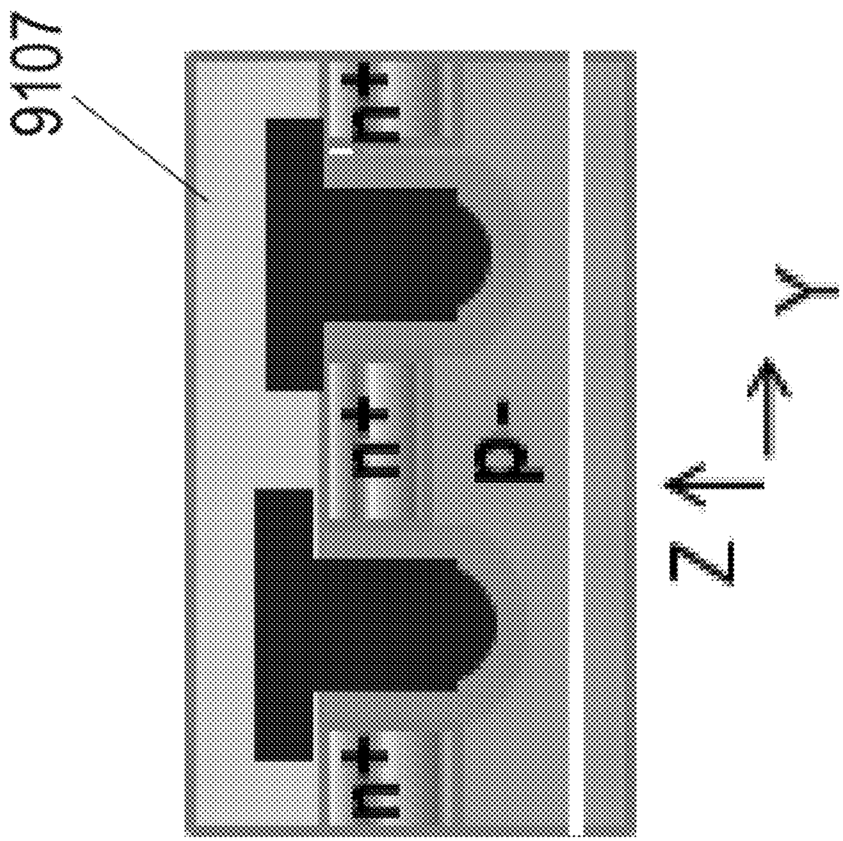

FIG. 91D shows an inter-layer dielectric 9107 may be formed and polished.

Figure 91E:
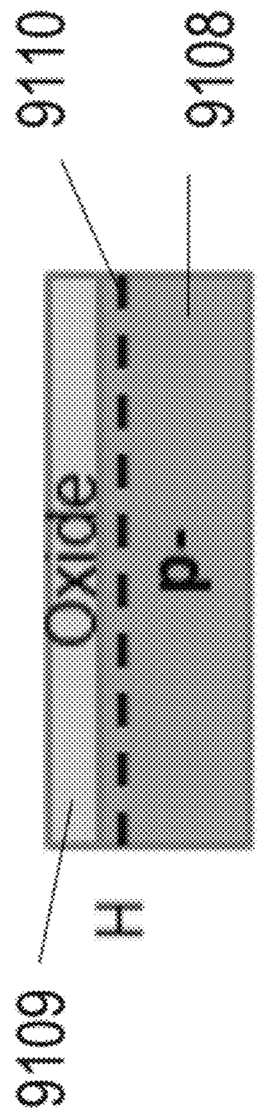

FIG. 91E reveals the next step in the process. Another p− wafer 9108 may be taken, an oxide 9109 may be grown on p− wafer 9108 following which hydrogen H+, or other atomic species, may be implanted at a certain depth represented by dashed line hydrogen plane 9110, for cleave purposes.

This "higher layer" p− wafer 9108 may then be flipped and bonded to the lower SOI p− wafer 9101 using oxide-to-oxide bonding. A cleave may then be performed at the hydrogen plane 9110, following which a CMP may be performed resulting in the structure as illustrated in FIG. 91F.

Figure 91F:
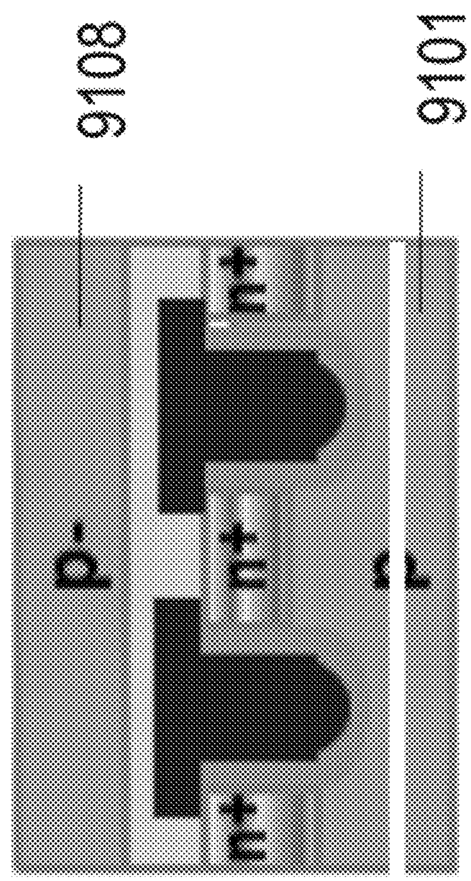
Figure 91H:
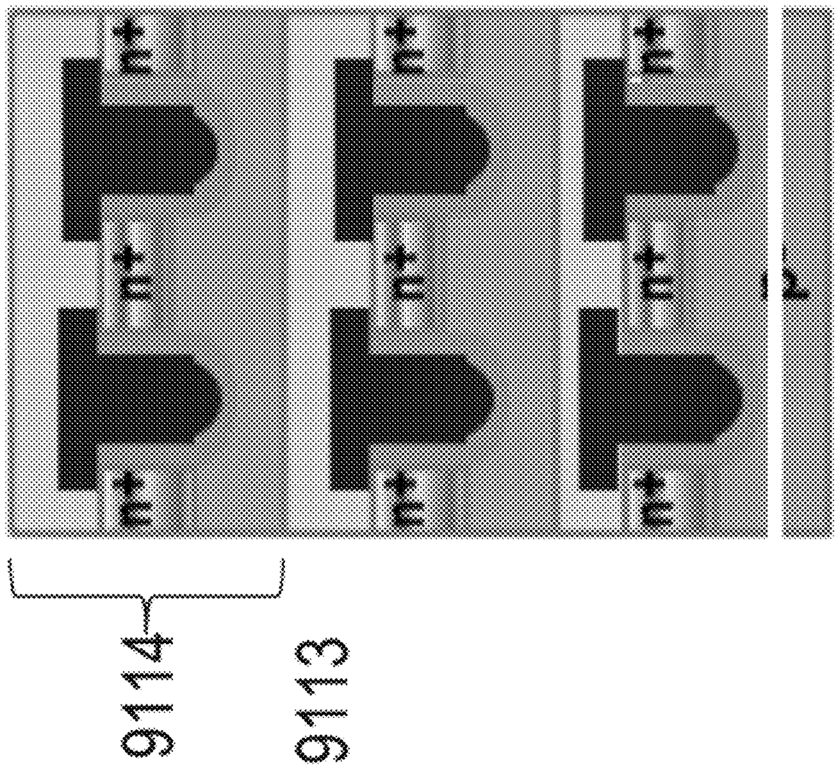
Figure 91G:
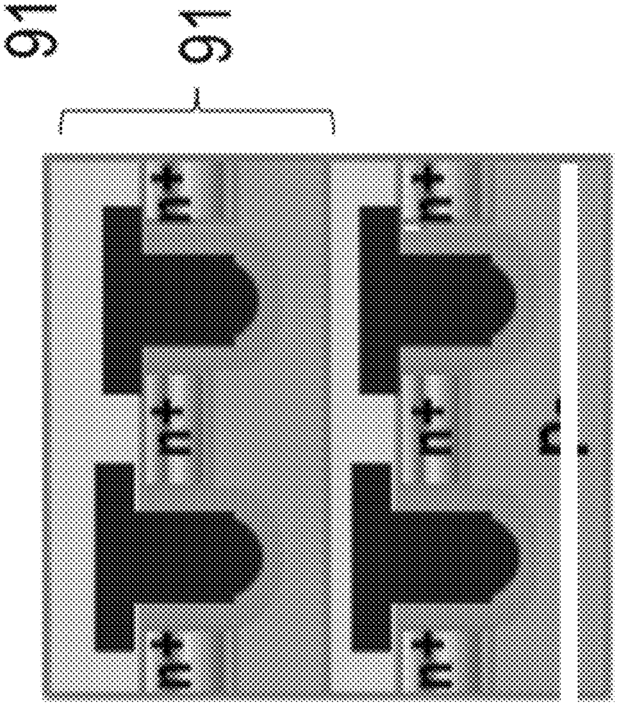

FIG. 91G shows the next step in the process. Another layer of RCATs 9113 may be constructed using procedures similar to those shown in FIG. 91B-D. This layer of RCATs may be aligned to features, such as alignment marks, in the bottom SOI p− wafer 9101.

As shown in FIG. 91H, one or more layers of RCATs 9114 can then be constructed using procedures similar to those shown in FIG. 91E-G.

Figure 91I:
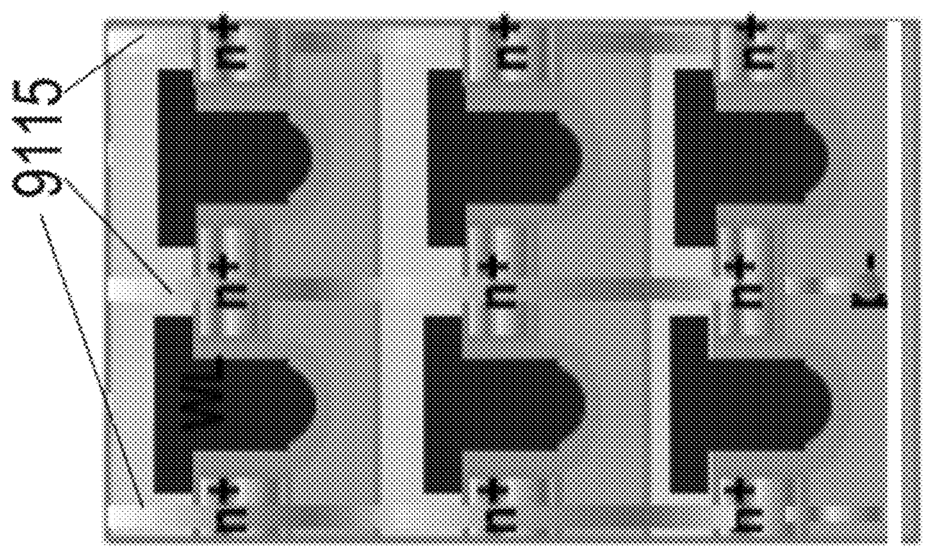

FIG. 91I illustrates vias 9115 that may be formed and may couple to different n+ regions and also to WL layers. These vias 9115 may be constructed with heavily doped polysilicon.

Figure 91J:
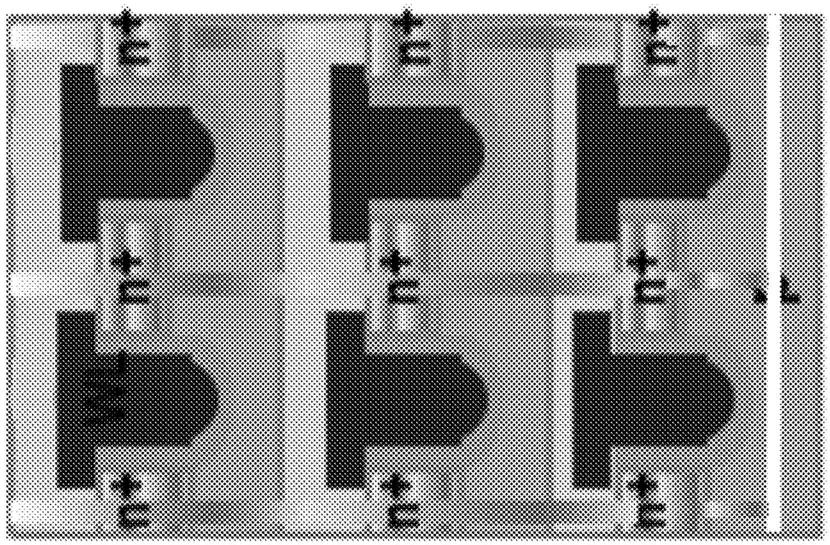

FIG. 91J shows the next step in the process where a Rapid Thermal Anneal (RTA) or flash anneal may be done to activate implanted dopants and to crystallize poly Si regions of substantially all layers.

Figure 91L:
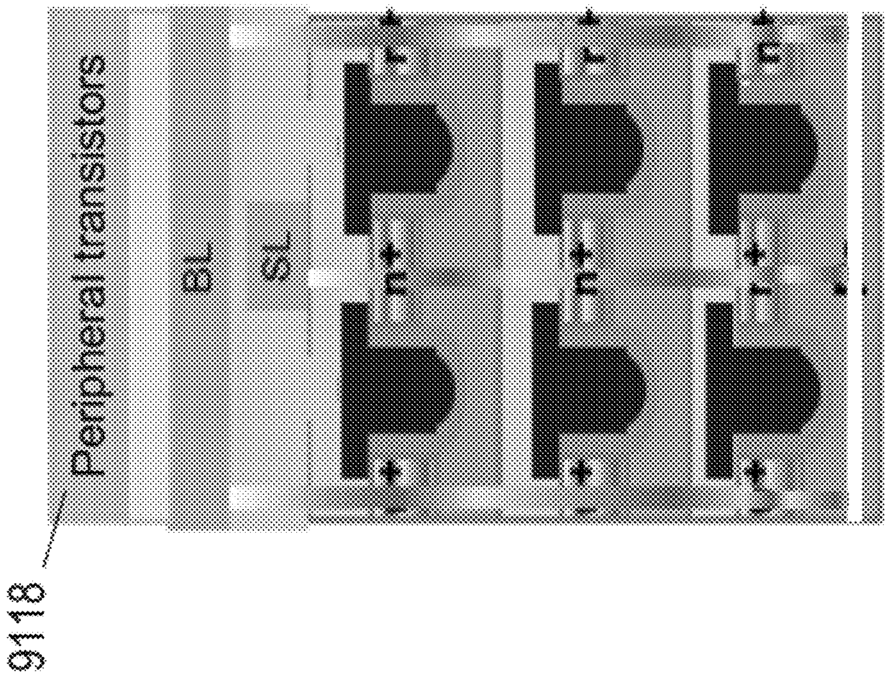
Figure 91K:
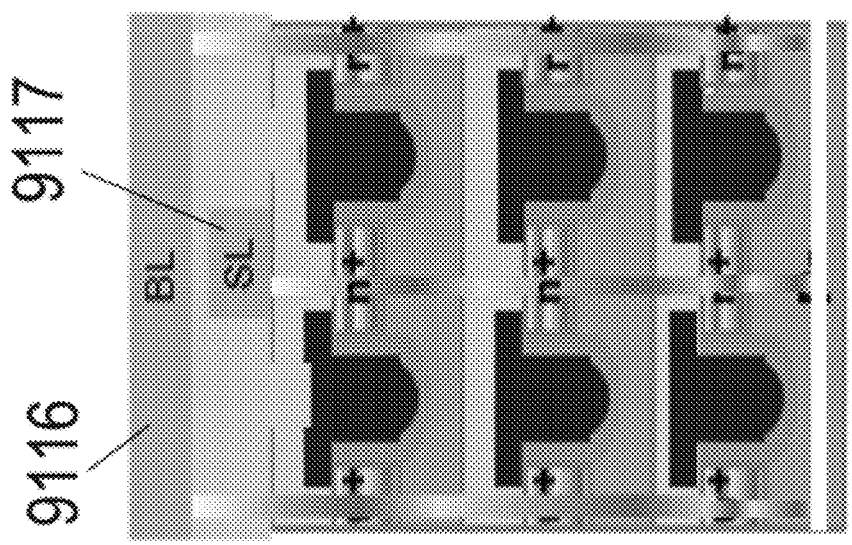

FIG. 91K illustrates bit-lines BLs 9116 and source-lines SLs 9117 that may be formed.

Following the formations of BLs 9116 and SLs 9117, FIG. 91L shows a new layer of transistors and vias for DRAM peripheral circuits 9118 that may be formed using procedures described previously (e.g., V-groove MOSFETs can be formed as described in FIG. 29A-G). These peripheral circuits 9118 may be aligned to the DRAM transistor layers below. DRAM transistors for this embodiment can be of any type (either high temperature (i.e., greater than about 400° C.) processed or low temperature (i.e., lower than about 400° C.) processed transistors), while peripheral circuits may be low temperature processed transistors since they are constructed after Aluminum or Copper wiring layers BLs 9116 and SLs 9117 are present. Array architecture for the embodiment shown in FIG. 91 may be similar to the one indicated in FIG. 89.

A variation of the flow shown in FIG. 91A-L may be used as an alternative process for fabricating NuDRAMs. Peripheral circuit layers may first be constructed with substantially all steps complete for transistors except the RTA. One or more levels of tungsten metal may be used for local wiring of these peripheral circuits. Following this procedure, multiple layers of RCATs may be constructed with layer transfer as described in FIG. 91, after which an RTA or flash anneal may be conducted. Highly conductive copper or aluminum wire layers may then be added for the completion of the DRAM flow. This flow may reduce the fabrication cost by sharing the RTA, the high temperature steps, doing them once for substantially all crystallized layers and may also allow the use of similar design for the 3D NuDRAM peripheral circuit as used in conventional 2D DRAM. For this process flow, DRAM transistors may be of any type, and may not be restricted to low temperature etch-defined transistors such as RCAT or V-groove transistors.

An illustration of a NuDRAM constructed with partially depleted SOI transistors is given in FIG. 92A-F. FIG. 92A describes the first step in the process. A p− wafer 9201 may have an oxide layer 9202 grown over it. FIG. 92B shows the next step in the process. Hydrogen H+ may be implanted into the wafer at a certain depth in the p− wafer 9201. P− wafer 9201 may have a top layer of p doping of a differing concentration than that of the bulk of p− wafer 9201, and that layer may be transferred. The final position of the hydrogen is depicted by the dotted line as hydrogen plane 9203. FIG. 92C describes the next step in the process. A wafer with DRAM peripheral circuits 9204 may be prepared. This wafer may have transistors that have not seen RTA or flash anneal processes. Alternatively, a weak or partial RTA for the peripheral circuits may be used. Multiple levels of tungsten interconnect to connect together transistors in 9204 may be prepared. The wafer from FIG. 92B may be flipped and attached to the wafer with DRAM peripheral circuits 9204 using oxide-to-oxide bonding. The wafer may then be cleaved at the hydrogen plane 9203 using any cleave method described in this document. After cleave, the cleaved surface may be polished with CMP. FIG. 92D shows the next step in the process. A step of masking, etching, and low temperature oxide deposition may be performed, to define rows of diffusion, isolated by said oxide. The rows of diffusion and isolation may be aligned with the underlying peripheral circuits 9204. After forming isolation regions, partially depleted SOI (PD-SOI) transistors may be constructed with formation of a gate dielectric 9207, a gate electrode 9205, and then patterning and etch of 9207 and 9205 followed by formation of ion implanted source/drain regions 9208. Note that no Rapid Thermal Anneal (RTA) may be done at this step to activate the implanted source/drain regions 9208. The masking step in FIG. 92D may be aligned to the underlying peripheral circuits 9204. An oxide layer 9206 may be deposited and polished with CMP. FIG. 92E shows the next step of the process. A second Partial Depleted Silicon On Insulator (PD-SOI) transistor layer 9209 may be formed atop the first PD-SOI transistor layer using steps similar to FIG. 92A-D. These may be repeated multiple times to form the multilayer 3D DRAM. An RTA or flash anneal to activate dopants and crystallize polysilicon regions in substantially all the transistor layers may then be conducted. The next step of the process is described in FIG. 92F.

Via holes 9210 may be masked and may be etched to word-lines and source and drain connections through substantially all of the layers in the stack. Note that the gates of transistors 9213 are connected together to form word-lines in a similar fashion to FIG. 89. Via holes may then be filled with a metal such as tungsten. Alternatively, heavily doped polysilicon may be used. Multiple layers of interconnects and vias may be constructed to form Bit-Lines 9211 and Source-Lines 9212 to complete the DRAM array. Array organization of the NuDRAM described in FIG. 92 may be similar to those depicted in FIG. 89.

For the purpose of programming transistors, a single type of top transistor could be sufficient. Yet for logic type circuitry two complementing transistors might be helpful to allow CMOS type logic. Accordingly the above described various mono-type transistor flows could be performed twice. First perform substantially all the steps to build the 'n' type, and then do an additional layer transfer to build the 'p' type on top of 'n' type layer.

Figure 30:
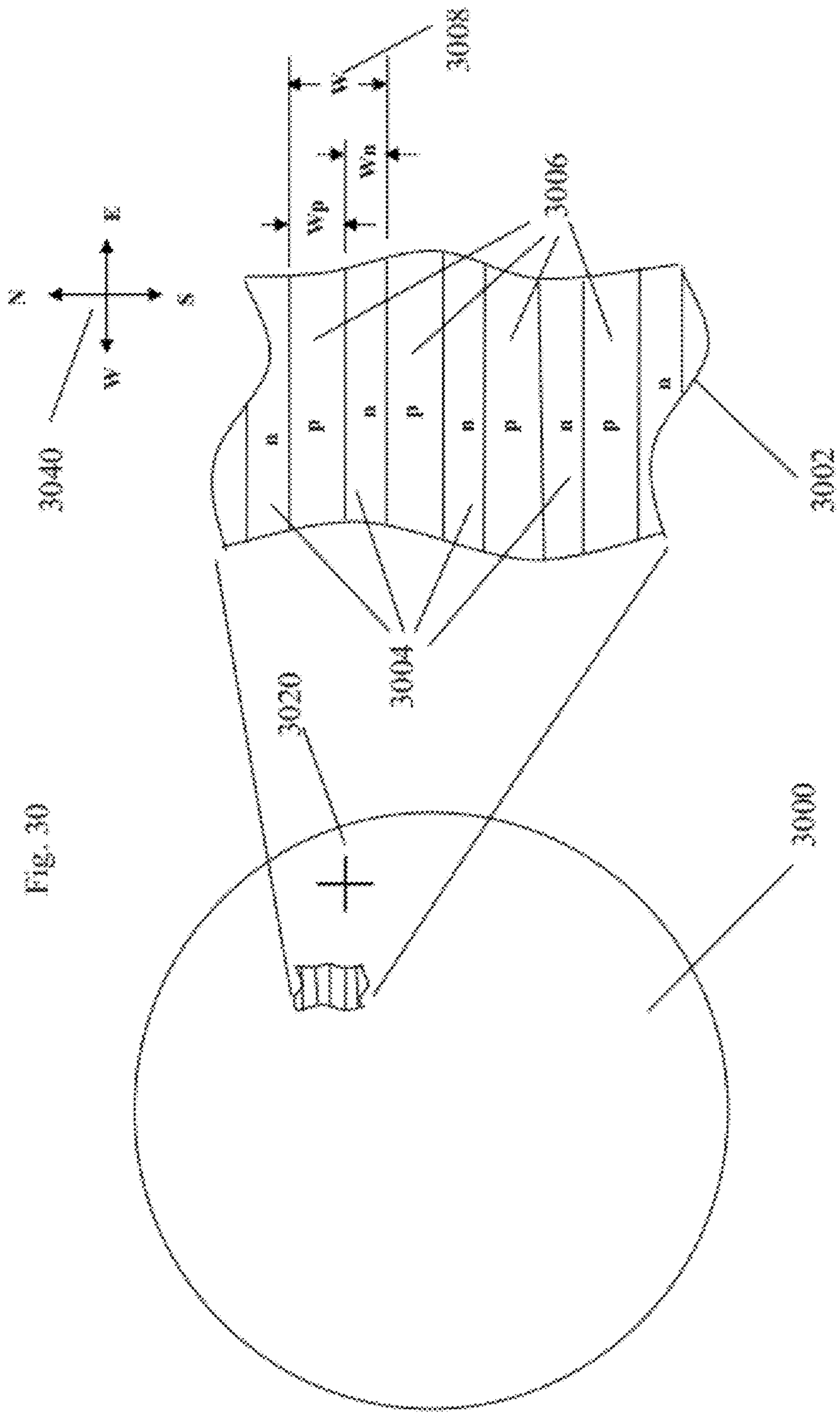
FIG. 30 is an exemplary drawing illustration of a donor wafer.

An additional alternative may be to build both 'n' type and 'p' type transistors on the same layer. An n-type transistor may include the formation of an n-channel metal-oxide-semiconductor (nMOS) transistor and a p-type transistor may include the formation of a p-channel metal-oxide-semiconductor (pMOS) transistor. The challenge may be to form these transistors aligned to the underlying layers 808. An illustrative solution may be described with the help of FIGS. 30 to 33. The flow could be applied to any transistor constructed in a manner suitable for wafer transfer including, but not limited to horizontal or vertical MOSFETs, JFETs, horizontal and vertical junction-less transistors, RCATs, Spherical-RCATs, etc. An illustrative difference is that now the donor wafer 3000 may be pre-processed to build not just one transistor type but both types by comprising alternating rows throughout donor wafer 3000 for the build of rows of n-type transistors 3004 and rows of p-type transistors 3006 as illustrated in FIG. 30. FIG. 30 also includes a four cardinal directions indicator 3040, which will be used through FIG. 33 to assist the explanation. The width of the rows of n-type transistors 3004 is Wn and the width of the rows of p-type transistors 3006 is Wp and their sum W 3008 is the width of the repeating pattern. The rows may traverse from East to West and the alternating may repeat substantially all the way from North to South. The donor wafer rows 3004 and 3006 may extend in length East to West by the acceptor die width plus the maximum donor wafer to acceptor wafer misalignment, or alternatively, may extend substantially the entire length of a donor wafer East to West. In fact the wafer could be considered as divided into reticle projections which in most cases may contain a few dies per image or step field. In most cases, the scribe line designed for future dicing of the wafer to individual dies may be more than 20 microns wide. The wafer to wafer misalignment may be about 1 micron. Accordingly, extending patterns into the scribe line may allow full use of the patterns within the die boundaries with minimal effect on the dicing scribe lines. Wn and Wp could be set for the minimum width of the corresponding transistor, n-type transistor and p-type transistor respectively, plus its isolation in the selected process node. The donor wafer 3000 may also have an alignment mark 3020 which may be on the same layers of the donor wafer as the n 3004 and p 3006 rows and accordingly could be used later to properly align additional patterning and processing steps to said n 3004 and p 3006 rows.

The donor wafer 3000 may be placed on top of the main or acceptor wafer 3100 for a layer transfer as described previously. The state of the art may allow for very good angular alignment of this bonding step but it may be difficult to achieve a better than about 1 micron position alignment.

Persons of ordinary skill in the art will appreciate that the directions North, South, East and West are used for illustrative purposes only, have no relationship to true geographic directions, that the North-South direction could become the East-West direction (and vice versa) by merely rotating the wafer 90 degrees and that the rows of n-type transistors 3004 and rows of p-type transistors 3006 could also run North-South as a matter of design choice with corresponding adjustments to the rest of the fabrication process. Such skilled persons will further appreciate that the rows of n-type transistors 3004 and rows of p-type transistors 3006 can have many different organizations as a matter of design choice. For example, the rows of n-type transistors 3004 and rows of p-type transistors 3006 can each include a single row of transistors in parallel, multiple rows of transistors in parallel, multiple groups of transistors of different dimensions and orientations and types (either individually or in groups), and different ratios of transistor sizes or numbers between the rows of n-type transistors 3004 and rows of p-type transistors 3006, etc. Thus the scope of the illustrated embodiments of the invention is to be limited only by the appended claims.

Figure 31:
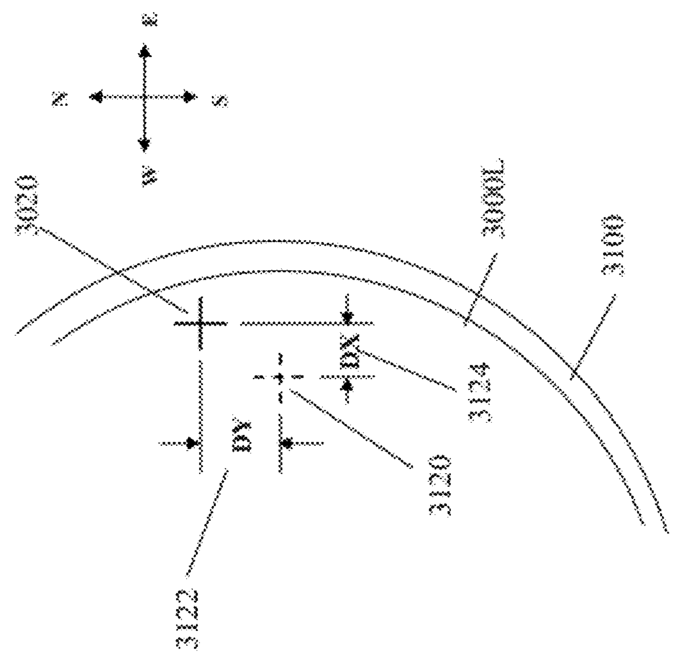
FIG. 31 is an exemplary drawing illustration of a transferred layer on top of a main wafer.

FIG. 31 illustrates the acceptor wafer 3100 with its alignment mark 3120 and the transferred layer 3000L of the donor wafer 3000 with its alignment mark 3020. The misalignment in the East-West direction is DX 3124 and the misalignment in the North-South direction is DY 3122. For simplicity of the following explanations, the alignment marks 3120 and 3020 may be assumed set so that the alignment mark 3020 of the transferred layer (from the donor wafer or substrate) is always north of the alignment mark 3120 of the base wafer (the acceptor wafer or substrate), though the cases where alignment mark 3020 is either perfectly aligned with (within tolerances) or south of alignment mark 3120 are handled in an appropriately similar manner. In addition, these alignment marks may be placed in, for example, only a few locations on each wafer, within each step field, within each die, within each repeating pattern W, or in other locations as a matter of design choice.

In the construction of this described monolithic 3D Integrated Circuits the objective may be to connect structures built on transferred layer 3000L to the underlying acceptor wafer 3100 and to structures on 808 layers at about the same density and accuracy as the connections between layers in 808, which may need alignment accuracies on the order of tens of nanometers (nm) or better.

In the direction East-West the approach may be the same as was described before with respect to FIGS. 21 through 29. The pre-fabricated structures on the donor wafer 3000 may be the same regardless of the misalignment DX 3124. Therefore just like before, the pre-fabricated structures may be aligned using the underlying alignment mark 3120 to form the transistors out of the rows of n-type transistors 3004 and rows of p-type transistors 3006 by etching and additional processes as described regardless of DX. In the North-South direction it is now different as the pattern does change. Yet the advantage of the proposed structure of the repeating pattern in the North-South direction of alternating rows illustrated in FIG. 30 may arise from the fact that for every distance W 3008, the pattern may repeat. Accordingly the effective alignment uncertainty may be reduced to W 3008 as the pattern in the North-South direction may keep repeating every W.

Figure 32:
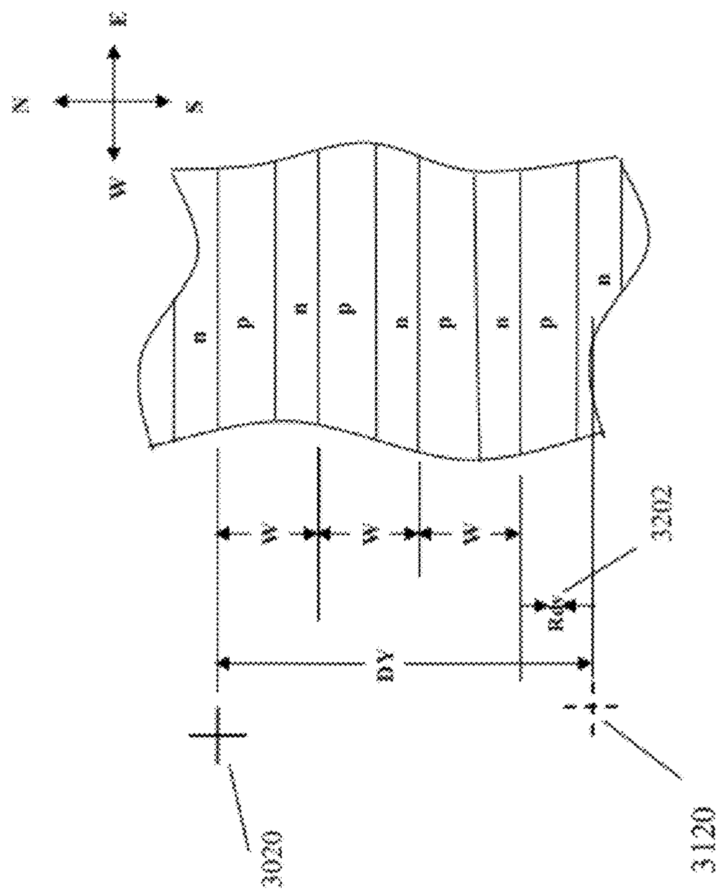
FIG. 32 is an exemplary drawing illustration of a measured alignment offset.

So the effective alignment uncertainty may be calculated as to how many Ws-full patterns of 'n' 3004 and 'p' 3006 row pairs—would fit in DY 3122 and what would be the residue Rdy 3202 (remainder of DY modulo W, $0<=Rdy<W$) as illustrated in FIG. 32. Accordingly, to properly align to the nearest n 3004 and p 3006 in the North-South direction, the alignment may be to the underlying alignment mark 3120 offset by Rdy 3202. Accordingly, the alignment may be done based on the misalignment between the alignment marks of the acceptor wafer alignment mark 3120 and the donor wafer alignment marks 3020 by taking into account the repeating distance W 3008 and calculating the resultant required offset Rdy 3202. Alignment mark 3120, covered by the donor wafer transferred layer 3000L during alignment, may be visible and usable to the stepper or lithographic tool alignment system when infra-red (IR) light and optics may be used.

Figure 69:
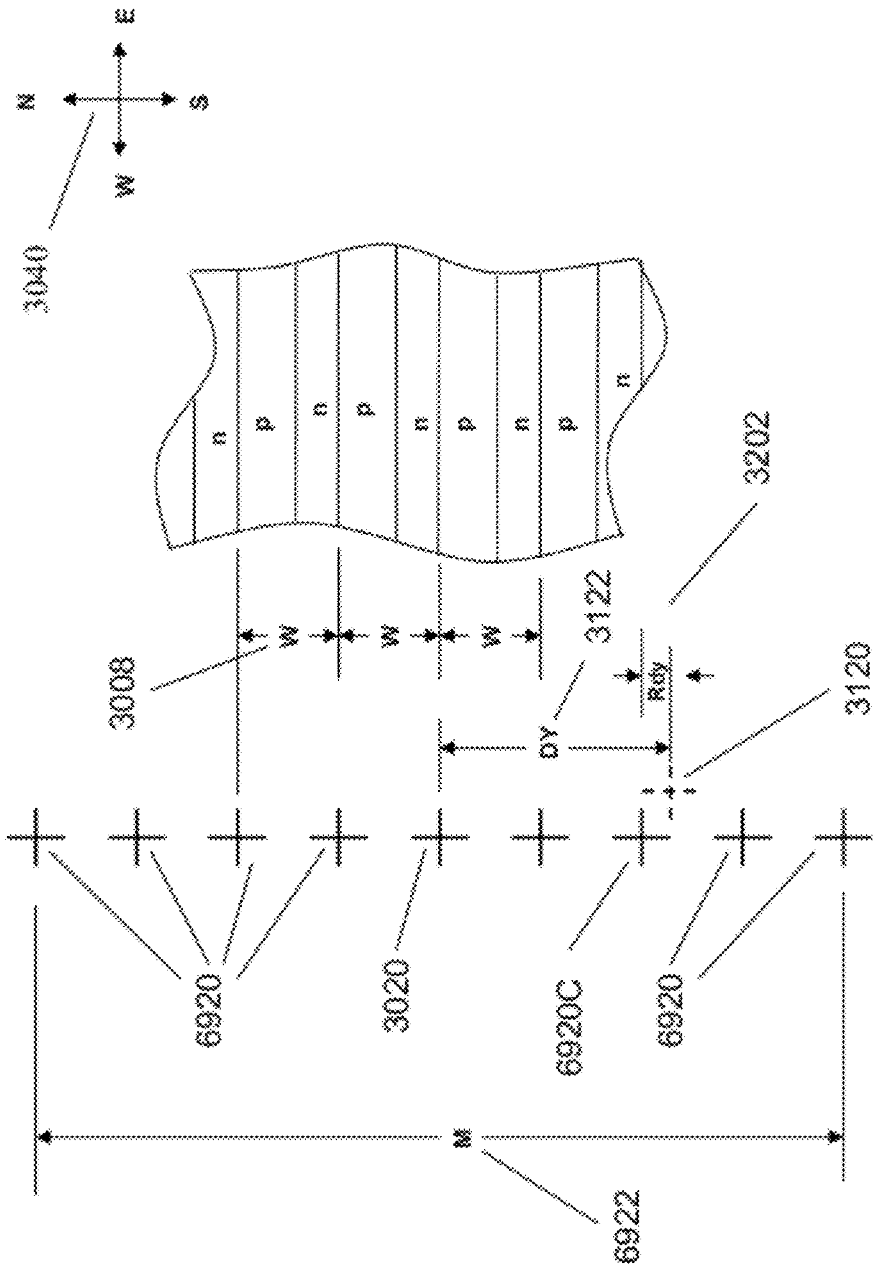
FIG. 69 is an exemplary drawing illustration of a donor wafer.

Alternatively, multiple alignment marks on the donor wafer could be used as illustrated in FIG. 69. The donor wafer alignment mark 3020 may be replicated precisely every W 3008 in the North to South direction for a distance to cover the full extent of potential North to South misalignment M 6922 between the donor wafer and the acceptor wafer, thus forming added donor wafer alignment marks 6920 and closest added donor wafer alignment mark 6920C. The residue Rdy 3202 may therefore be the North to South misalignment between the closest added donor wafer alignment mark 6920C and the acceptor wafer alignment mark 3120. The closest added donor wafer alignment mark 6920C may be defined as the added donor wafer alignment mark 6920 that is closest in distance to the acceptor wafer alignment mark 3120. Accordingly, instead of alignment to the underlying alignment mark 3120 offset by Rdy 3202, alignment can be to the closest added donor wafer alignment mark 6920C. Accordingly, the alignment may be done based on the misalignment between the alignment marks of the acceptor wafer alignment mark 3120 and the added donor wafer alignment marks 6920 by choosing the closest added donor wafer alignment mark 6920C on the donor wafer.

The illustration in FIG. 69 was made to simplify the explanation, and in actual usage the alignment marks might take a larger area than W×W. In such a case, to avoid having the added donor wafer alignment marks 6920 overlapping each other, an offset could be used with proper marking to allow proper alignment.

Figure 33A:
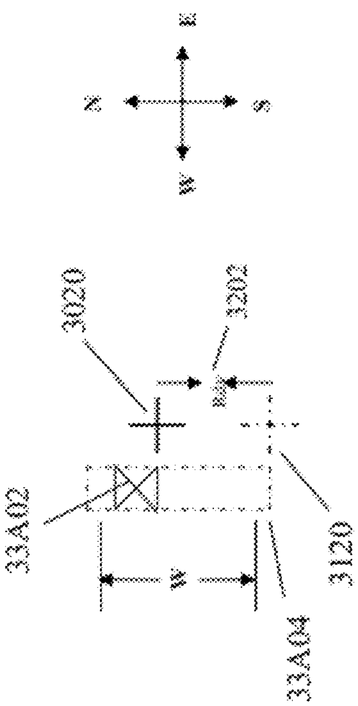
FIG. 33A, 33B are exemplary drawing illustrations of a connection strip.
Figure 33B:
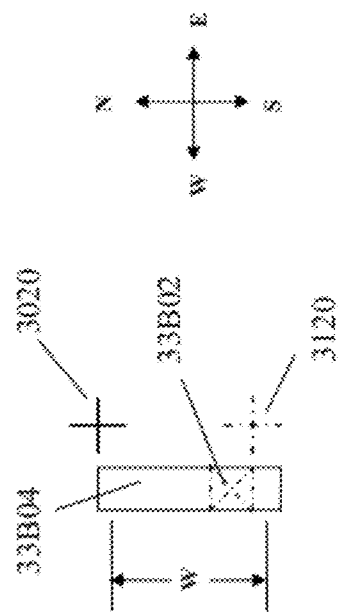

Each wafer that may be processed accordingly through this flow may have a specific Rdy 3202 which may be subject to the actual misalignment DY 3122. But the masks used for patterning the various patterns may need to be pre-designed and fabricated and may remain the same for substantially all wafers (processed for the same end-device) regardless of the actual misalignment. In order to improve the connection between structures on the transferred layer 3000L and the underlying acceptor wafer 3100, the underlying acceptor wafer 3100 may be designed to have a landing zone strip 33A04 going North-South of length W 3008 plus any extension necessary for the via design rules, as illustrated in FIG. 33A. The landing zone extension, in length or width, for via design rules may include compensation for angular misalignment due to the wafer to wafer bonding that is not compensated for by the stepper overlay algorithms, and may include uncompensated donor wafer bow and warp. The landing zone strip 33A04 may be part of the acceptor wafer 3100 and accordingly aligned to its alignment mark 3120. Via 33A02 going down and being part of a top layer transferred layer 3000L pattern (aligned to the underlying alignment mark 3120 with Rdy offset) may be connected to the landing zone strip 33A04. Via 33A02 may be drawn in the database (not shown) so that it is positioned approximately at the center of the landing zone strip 33A04, and, hence, may be away from the ends of the landing zone strip 33A04 at distances greater than approximately the nominal layer to layer misalignment margin.

Figure 33C:
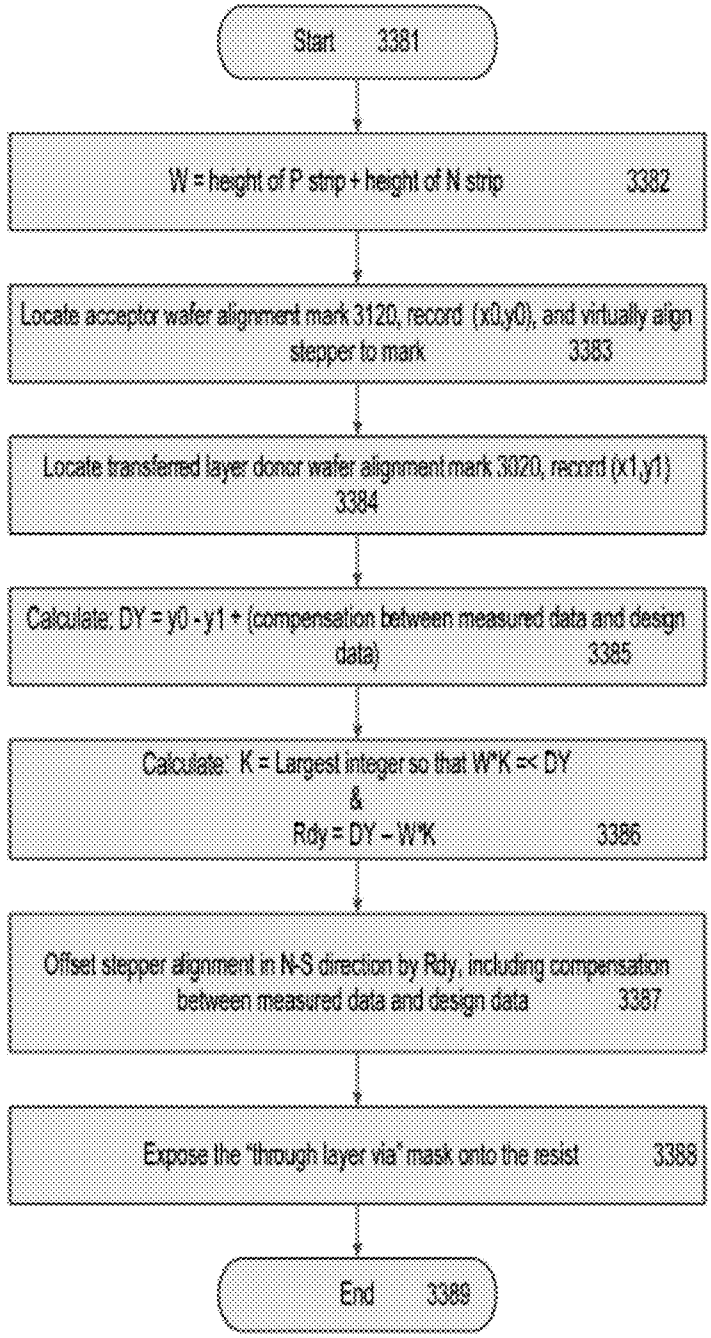
FIG. 33C, 33D are exemplary drawing illustrations of methodologies for alignment of through layer via or connection strip described with respect to FIGS. 30 to 33B.

FIG. 33C illustrates an exemplary methodology for implementing alignment of a through via mask to connect to landing zone strip 33A04 in the top layer of the underlying acceptor wafer 3100 and may be described with respect to FIG. 30 to FIGS. 33A&B. Start (3381) and determine (3382) W 3008, the height/width of 'n' 3004 and 'p' 3006 row pairs as described above. Locate (3383) acceptor wafer alignment mark 3120 coordinates, such as (x0,y0), record co-ordinates for further calculation, and the stepper/litho tool may initially (may be virtual) align the mask to acceptor wafer alignment mark 3120. Locate (3384) transferred layer donor wafer alignment mark 3020 coordinates, such as (x1,y1), record co-ordinates for further calculation. Calculate (3385) DY 3122 from the y-coordinates of the two marks (y0-y1) and compensate for any differences between measured data and design/layout data. This calculation may be done by the stepper. Calculate (3386) the largest integer K such that W 3008 times K is less than or equal to DY 3122. Then calculate the residue offset Rdy 3202, which may be DY 3122 minus the result of W 3008 multiplied by K. These calculations may be done by the stepper. Offset (3387) the initial stepper alignment in the North-South direction by the calculated residue offset Rdy 3202. This offset may also include compensation for any differences between measured data and design/layout data and may include offsets for typical processing effects such as, for example, runout and thin film stresses. Expose (3388) the through layer via mask onto the desired resist layer and continue processing the now properly aligned thru layer via. The alignment & litho process may End (3389).

Alternatively a North-South landing strip 33B04 with at least W length, plus extensions per the via design rules and other compensations described above, may be made on the upper layer transferred layer 3000L and accordingly aligned to the underlying alignment mark 3120 with Rdy offset, thus connected to the via 33B02 coming 'up' and being part of the underlying pattern aligned to the underlying alignment mark 3120 (with no offset).

Figure 33D:
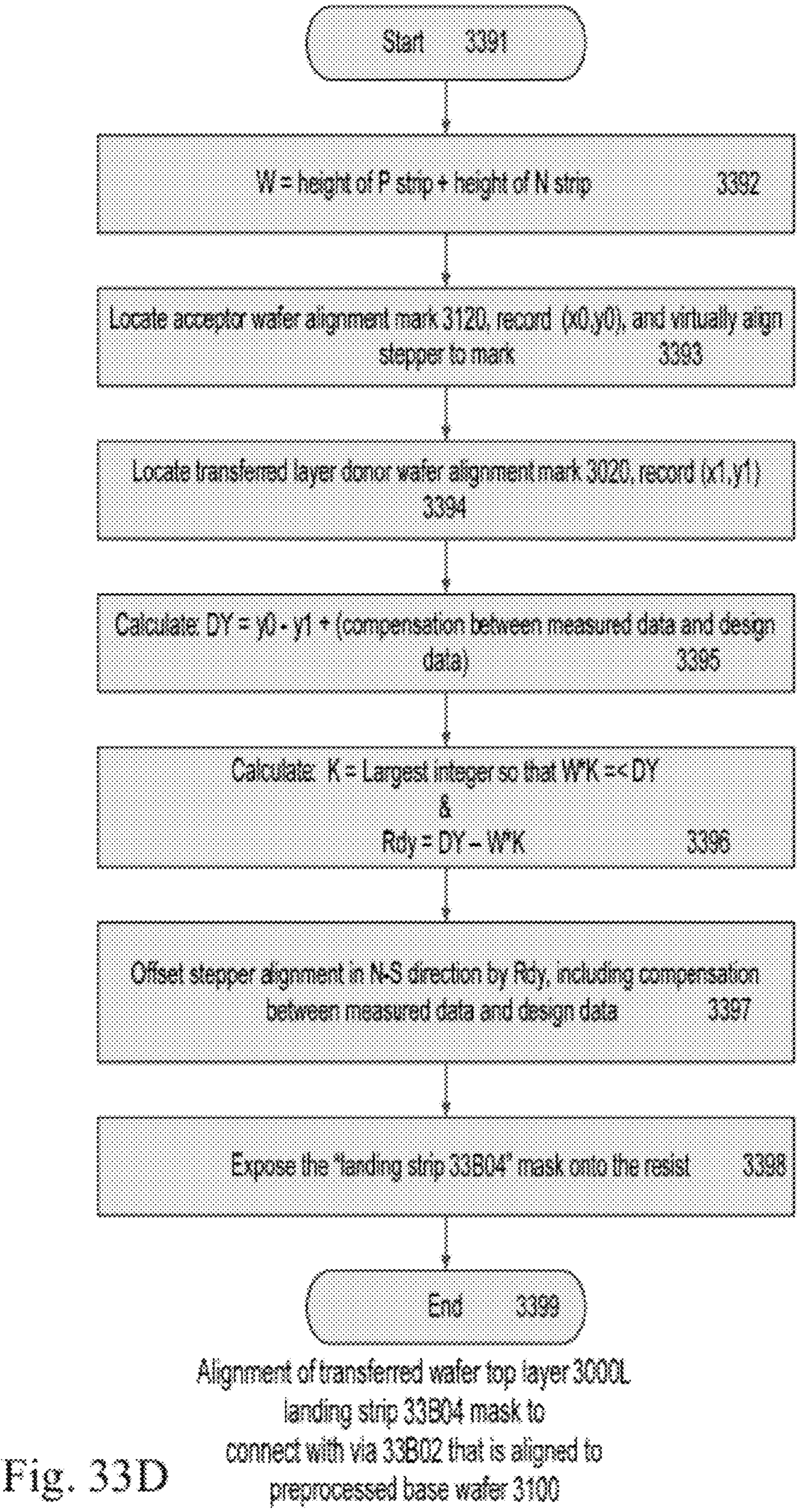

FIG. 33D illustrates an exemplary methodology for implementing alignment of a transferred layer 3000L landing strip 33B04 to connect with the via 33B02 that may already be formed and may be aligned to the underlying acceptor wafer 3100, and may be described with respect to FIG. 30 to FIGS. 33A&B. Start (3391) and determine (3392) W 3008, the height/width of 'n' 3004 and 'p' 3006 row pairs as described above. Locate (3393) acceptor wafer alignment mark 3120 coordinates, such as (x0,y0), record co-ordinates for further calculation, and the stepper/litho tool may initially (may be virtual) align the mask to acceptor wafer alignment mark 3120. Locate (3394) transferred layer donor wafer alignment mark 3020 coordinates, such as (x1,y1), record co-ordinates for further calculation. Calculate (3395) DY 3122 from the y-coordinates of the two marks (y0-y1) and compensate for any differences between measured data and design/layout data. This calculation may be done by the stepper. Calculate (3396) the largest integer K such that W 3008 times K is less than or equal to DY 3122. Then calculate the residue offset Rdy 3202, which may be DY 3122 minus the result of W 3008 multiplied by K. These calculations may be done by the stepper. Offset (3397) the initial stepper alignment in the North-South direction by the calculated residue offset Rdy 3202. This offset may also include compensation for any differences between measured data and design/layout data and may include offsets for typical processing effects such as, for example, runout and thin film stresses. Expose (3398) the landing strip 33B04 mask onto the desired resist layer and continue processing the now properly aligned landing strip mask. The alignment & litho process may End (3399).

Figure 34A:
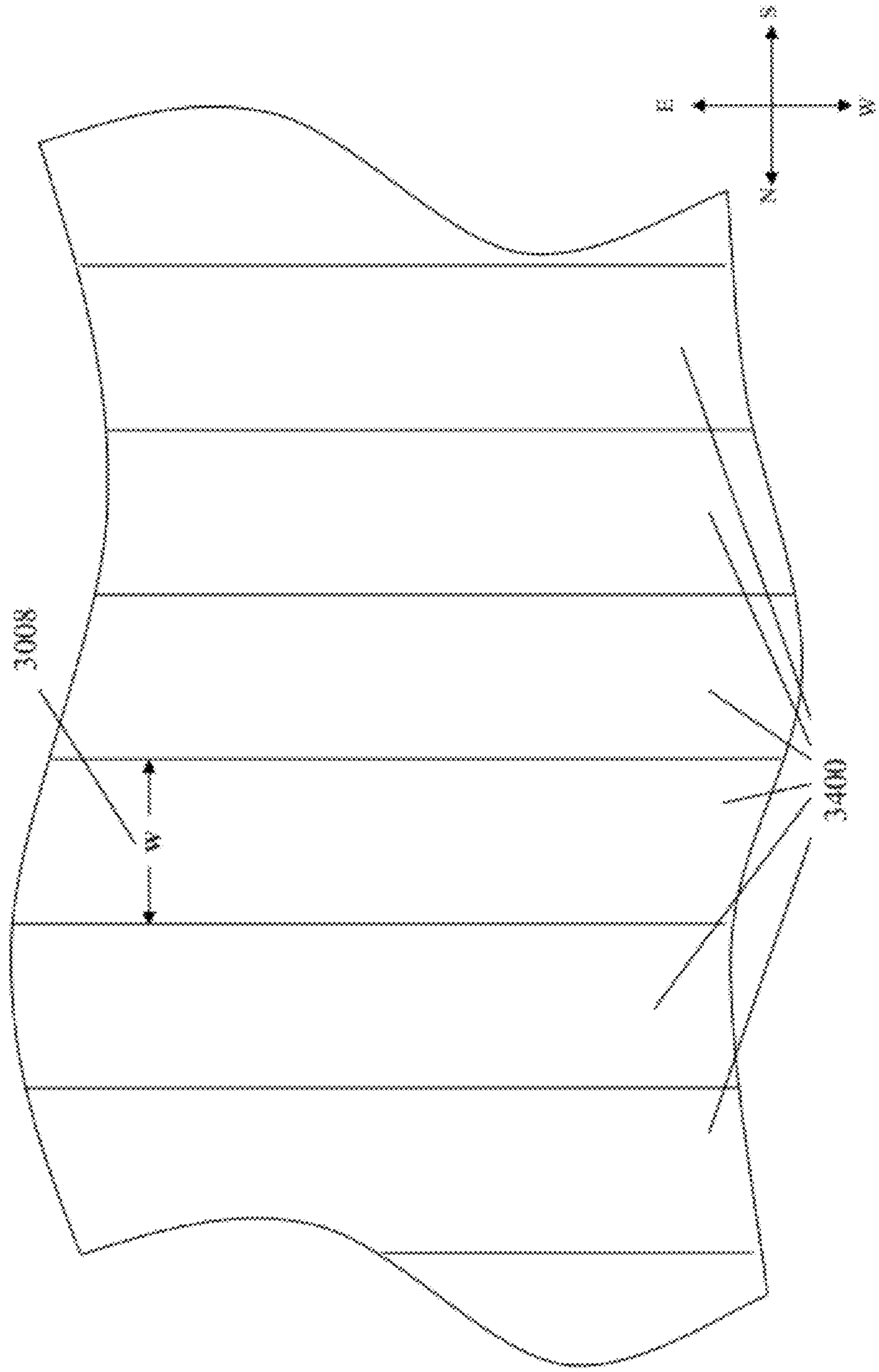
FIG. 34 A-E are exemplary drawing illustrations of pre-processed wafers used for a layer transfer.

An example of a process flow to create complementary transistors on a single transferred layer for architectures such as, for example, CMOS logic, may be as follows. First, a donor wafer may be preprocessed to be prepared for the layer transfer. This complementary donor wafer may be specifically processed to create repeating rows 3400 of p and n wells whereby their combined widths is W 3008 as illustrated in FIG. 34A. Repeating rows 3400 may be as long as an acceptor die width plus the maximum donor wafer to acceptor wafer misalignment, or alternatively, may extend the entire length of a donor wafer. FIG. 34A may be rotated 90 degrees with respect to FIG. 30 as indicated by the four cardinal directions indicator, to be in the same orientation as subsequent FIGS. 34B through 35G.

Figures 34B, 34C, 34D:
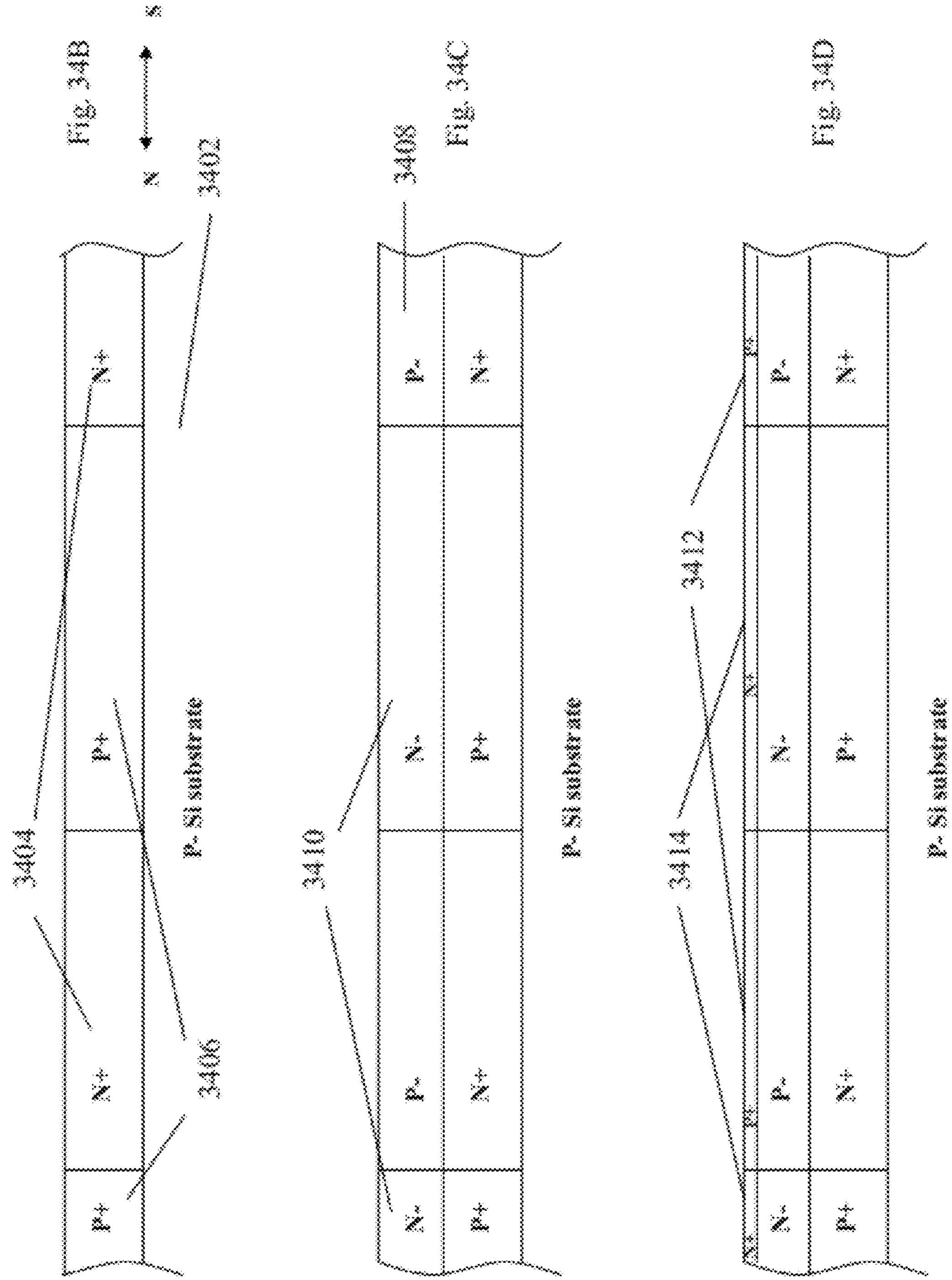

FIG. 34B is a cross-sectional drawing illustration of a pre-processed wafer used for a layer transfer. A P− wafer 3402 may be processed to have a "buried" layer of N+ 3404 and of P+ 3406 by masking, ion implantation, and activation in repeated widths of W 3008.

This process may be followed by a P− epi growth (epitaxial growth) 3408 and a mask, ion implantation, and anneal of N− regions 3410 in FIG. 34C.

Next, a shallow P+ 3412 and N+ 3414 may be formed by mask, shallow ion implantation, and RTA or flash anneal activation as shown in FIG. 34D.

Figure 34E:
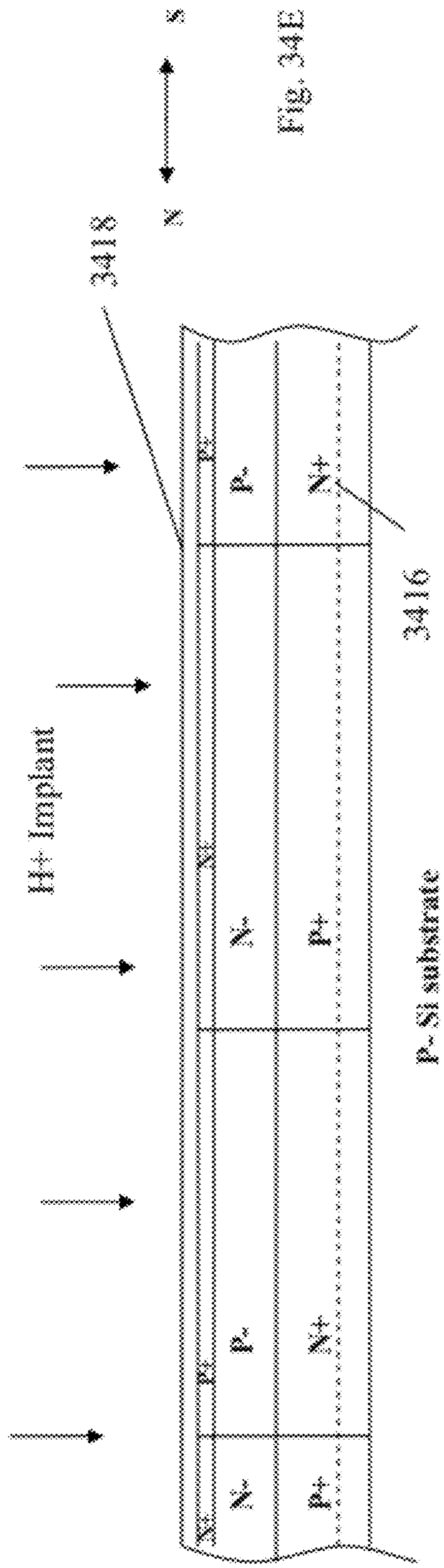

FIG. 34E is a drawing illustration of the pre-processed wafer for a layer transfer, such as, for example, ion-cut method, by an implant of an atomic species, such as H+, preparing the SmartCut "cleaving plane" 3416 in the lower part of the deep N+ & P+ regions. A thin layer of oxide 3418 may be deposited or grown to facilitate the oxide-oxide bonding to the layer 808. This oxide 3418 may be deposited or grown before the H+ implant, and may comprise differing thicknesses over the P+ 3412 and N+ 3414 regions so as to allow an even H+ implant range stopping to facilitate a level and continuous Smart Cut cleaving plane 3416. Adjusting the depth of the H+ implant if needed could be achieved in other ways including different implant depth setting for the P+ 3412 and N+ 3414 regions.

Figure 35A:
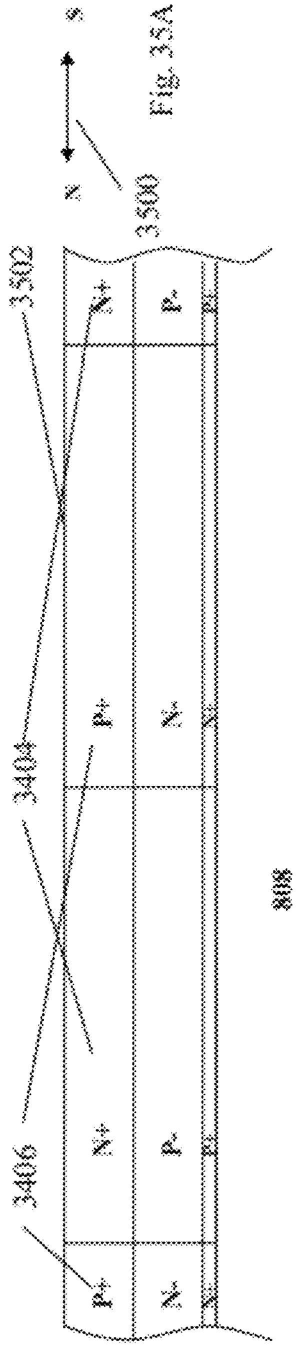
FIG. 35 A-G are exemplary drawing illustrations of formations of top planar transistors.

A layer-transfer-flow may be performed, as illustrated in FIG. 20, to transfer the pre-processed striped multi-well single crystal silicon wafer on top of 808 as shown in FIG. 35A. The cleaved surface 3502 may or may not be smoothed by a combination of CMP and chemical polish techniques.

A variation of the p & n well stripe donor wafer preprocessing above may be to also preprocess the well isolations with shallow trench etching, dielectric fill, and CMP prior to the layer transfer.

The step by step low temperature formation side views of the planar CMOS transistors on the complementary donor wafer (FIG. 34) may be illustrated in FIGS. 35A to 35G. FIG. 35A illustrates the layer transferred on top of wafer or layer 808 after the smart cut wherein the N+ 3404 & P+ 3406 are on top running in the East to West direction (i.e., perpendicular to the plane of the drawing) and repeating widths in the North to South direction as indicated by cardinal 3500.

Figure 35B:
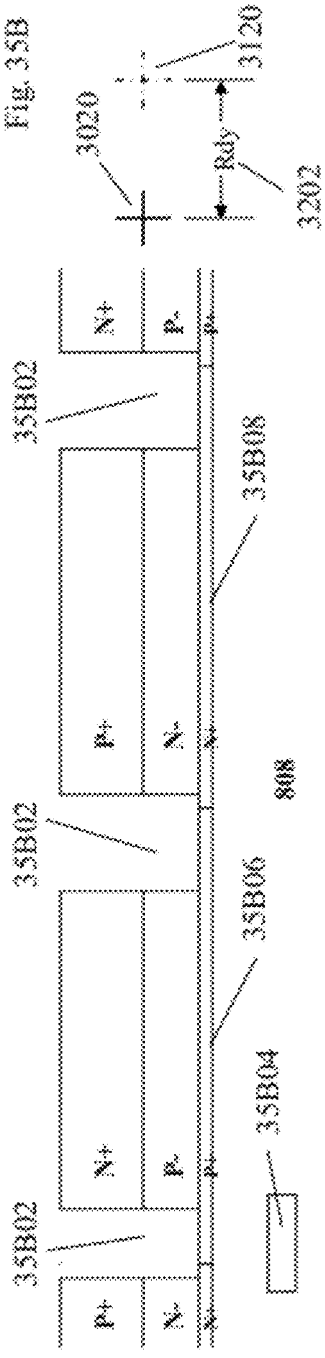

Then the substrate P+ 35B06 and N+ 35B08 source and 808 metal layer 35B04 access openings, as well as the transistor isolation 35B02 may be masked and etched in FIG. 35B. This layer and substantially all subsequent masking layers may be aligned as described and shown above in FIG. 30-32 and may be illustrated in FIG. 35B where the layer alignment mark 3020 may be aligned with offset Rdy to the base wafer layer 808 alignment mark 3120.

Figure 35C:
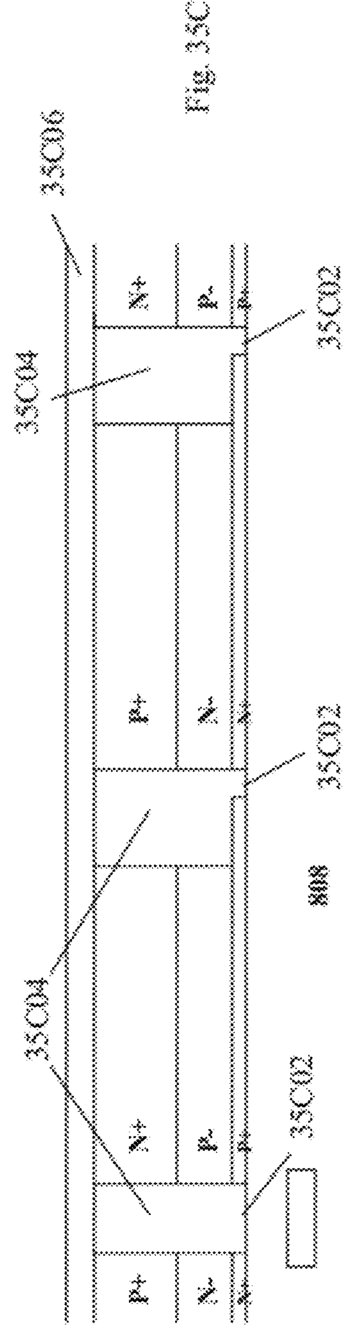

Utilizing an additional masking layer, the isolation region 35C02 may be defined by etching substantially all the way to about the top of preprocessed wafer or layer 808 to provide full isolation between transistors or groups of transistors in FIG. 35C. Then a Low-Temperature Oxide 35C04 may be deposited and chemically mechanically polished. Then a thin polish stop layer 35C06 such as low temperature silicon nitride may be deposited resulting in the structure illustrated in FIG. 35C.

Figure 35D:
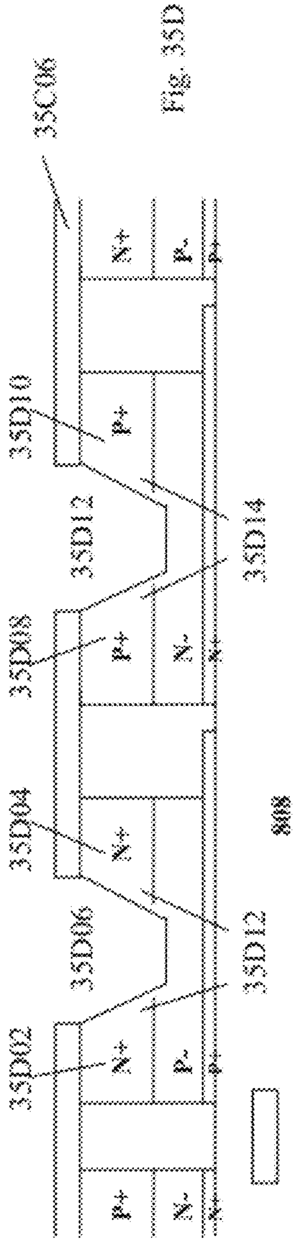

The n-channel source 35D02, drain 35D04 and self-aligned gate 35D06 may be defined by masking and etching the thin polish stop layer 35C06 and then a sloped N+ etch as illustrated in FIG. 35D. The above may be repeated on the P+ to form the p-channel source 35D08, drain 35D10 and self-aligned gate 35D12 to create the complementary devices and form Complementary Metal Oxide Semiconductor (CMOS). Both sloped (35-90 degrees, 45 is shown) etches may be accomplished with wet chemistry or plasma etching techniques. This etch may form N+ angular source and drain extensions 35D12 and P+ angular source and drain extension 35D14.

Figure 35E:
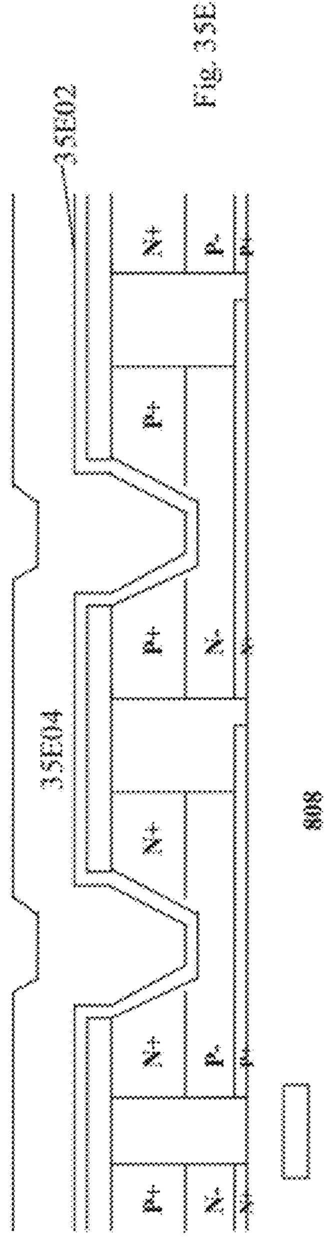

FIG. 35E illustrates the structure following deposition and densification of a low temperature based Gate Dielectric 35E02, or alternatively a low temperature microwave plasma oxidation of the silicon surfaces, to serve as the n & p MOSFET gate oxide, and then deposition of a gate material 35E04, such as aluminum or tungsten. Alternatively, a high-k metal gate structure may be formed as follows. Following an industry standard HF/SC1/SC2 clean to create an atomically smooth surface, a high-k gate dielectric 35E02 may be deposited. The semiconductor industry has chosen Hafnium-based dielectrics as the leading material of choice to replace SiO2 and Silicon oxynitride. The Hafnium-based family of dielectrics includes hafnium oxide and hafnium silicate/hafnium silicon oxynitride. Hafnium oxide, HfO2, has a dielectric constant twice as much as that of hafnium silicate/hafnium silicon oxynitride (HfSiO/HfSiON k~15). The choice of the metal may affect whether the device performs properly. A metal replacing N+ poly as the gate electrode may need to have a work function of about 4.2 eV for the device to operate properly and at the right threshold voltage. Alternatively, a metal replacing P+ poly as the gate electrode may need to have a work function of about 5.2 eV to operate properly. The TiAl and TiAlN based family of metals, for example, could be used to tune the work function of the metal from 4.2 eV to 5.2 eV. The gate oxides and gate metals may be different between the n and p channel devices, and may be accomplished with selective removal of one type and replacement of the other type.

Figure 35F:
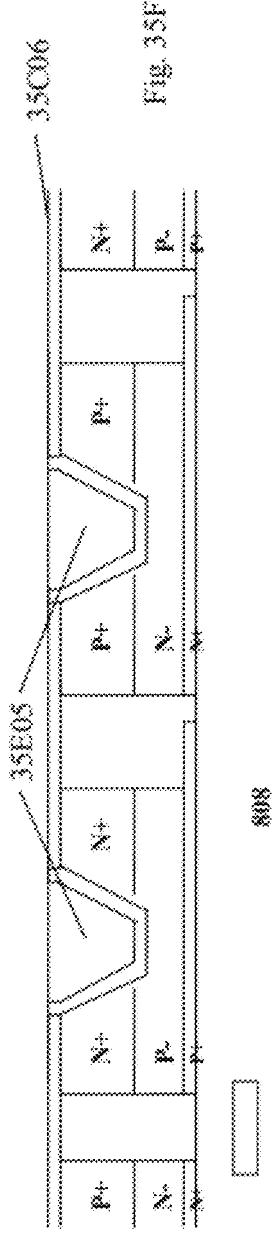
Figure 35G:
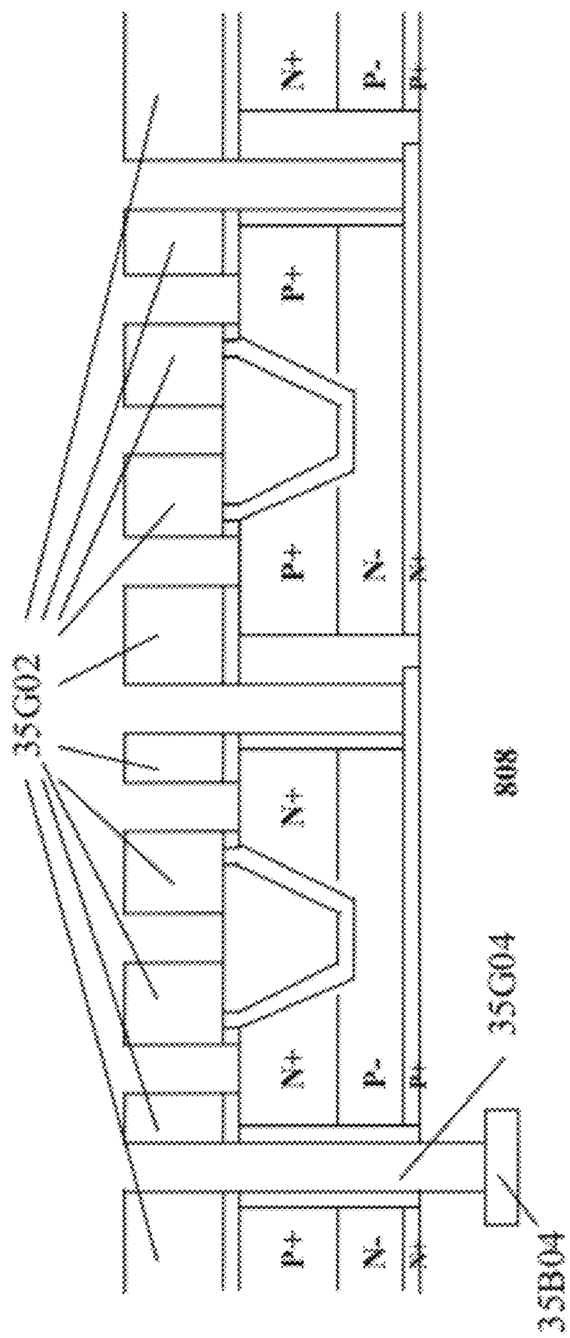

FIG. 35F illustrates the structure following a chemical mechanical polishing of gate material 35E04, thus forming the metal gate 35E05, utilizing the nitride polish stop layer 35C06. A thick oxide 35G02 may be deposited and contact openings may be masked and etched preparing the transistors to be connected as illustrated in FIG. 35G. This figure also illustrates the layer transfer silicon via 35G04 masked and etched to provide interconnection of the top transistor wiring to the lower layer 808 interconnect wiring 35B04. This flow may enable the formation of mono-crystalline top CMOS transistors that could be connected to the underlying multi-metal layer semiconductor devices without exposing the underlying devices and interconnects metals to high temperature. These transistors could be used as programming transistors of the antifuse on second antifuse layer 807 or for other functions such as logic or memory in a 3D integrated circuit that may be electrically coupled to metal layers in preprocessed wafer or layer 808. An additional illustrative advantage of this flow may be that the SmartCut H+, or other atomic species, implant step may be done prior to the formation of the MOS transistor gates avoiding potential damage to the gate function.

Persons of ordinary skill in the art will appreciate that while the transistors fabricated in FIGS. 34A through 35G are shown with their conductive channels oriented in a north-south direction and their gate electrodes oriented in an east-west direction for clarity in explaining the simultaneous fabrication of P-channel and N-channel transistors, that other orientations and organizations may be possible. Such skilled persons will further appreciate that the transistors may be rotated 90° with their gate electrodes oriented in a north-south direction. For example, it may be evident to such skilled persons that transistors aligned with each other along an east-west row can either be electrically isolated from each other with Low-Temperature Oxide 35C04 or share source and drain regions and contacts as a matter of design choice. Such skilled persons will also realize that rows of n-type transistors 3004 may contain multiple N-channel transistors aligned in a north-south direction and rows of p-type transistors 3006 may contain multiple P-channel transistors aligned in a north-south direction, specifically to form back-to-back sub-rows of P-channel and N-channel transistors for efficient logic layouts in which adjacent sub-rows of the same type share power supply lines and connections. Many other design choices may be possible within the scope of the illustrated embodiments of the invention and will suggest themselves to such skilled persons, thus the invention is to be limited only by the appended claims.

Alternatively, full CMOS devices may be constructed with a single layer transfer of wafer sized doped layers. The process flow is described below for the case of n-RCATs and p-RCATs, but may apply to any of the above devices constructed out of wafer sized transferred doped layers.

As illustrated in FIGS. 95A to 95I, an n-RCAT and p-RCAT may be constructed in a single layer transfer of wafer sized doped layer with a process flow that may be suitable for 3D IC manufacturing.

Figure 95A:
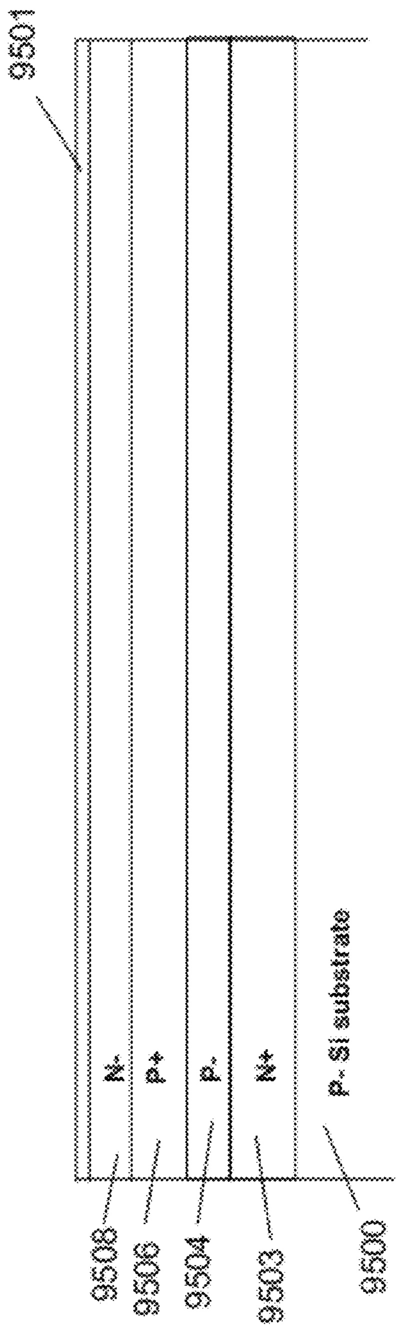

As illustrated in FIG. 95A, a P− substrate donor wafer 9500 may be processed to include four wafer sized layers of N+ doping 9503, P− doping 9504, P+ doping 9506, and N− doping 9508. The P− layer 9504 may have the same or a different dopant concentration than the P− donor wafer 9500. The four doped layers 9503, 9504, 9506, and 9508 may be formed by ion implantation and thermal anneal. The layer stack may alternatively be formed by successive epitaxially deposited doped silicon layers or by a combination of epitaxy and implantation and anneals. P− layer 9504 and N− layer 9508 may also have graded doping to mitigate transistor performance issues, such as short channel effects. A screen oxide 9501 may be grown or deposited before an implant to protect the silicon from implant contamination and to provide an oxide surface for later wafer to wafer bonding. These processes may be done at temperatures above about 400° C. as the layer transfer to the processed substrate with metal interconnects has yet to be done.

Figure 95B:
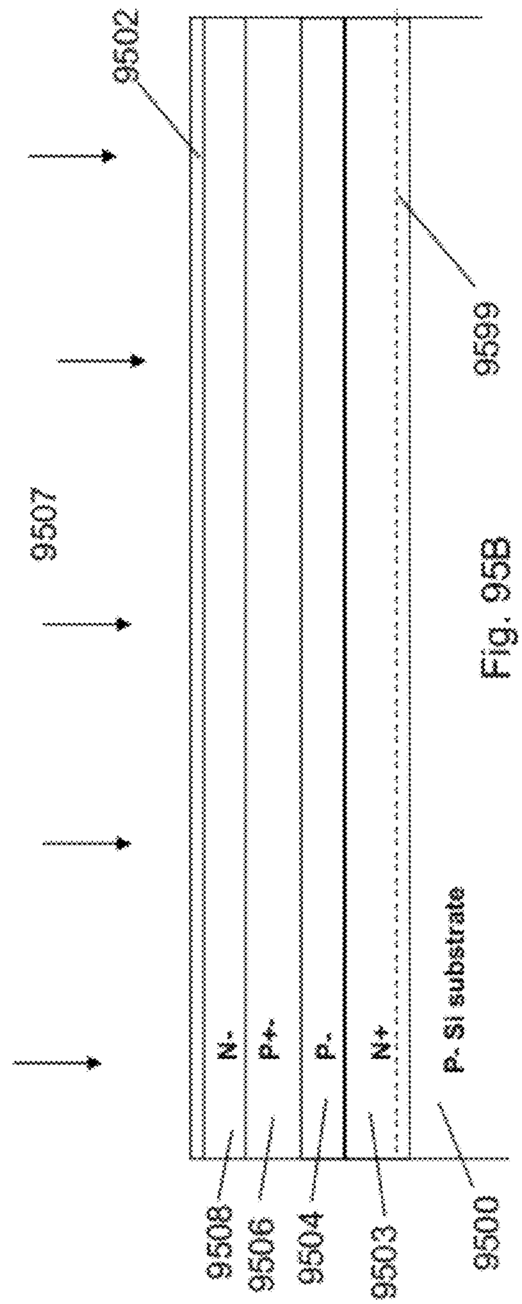

As illustrated in FIG. 95B, the top surface of donor wafer 9500 may be prepared for oxide wafer bonding with a deposition of an oxide or by thermal oxidation of the N-layer 9508 to form oxide layer 9502, or a re-oxidation of implant screen oxide 9501. A layer transfer demarcation plane 9599 (shown as a dashed line) may be formed in donor wafer 9500 or N+ layer 9503 (shown) by hydrogen implantation 9507 or other methods as previously described. Both the donor wafer 9500 and acceptor wafer 9510 or substrate may be prepared for wafer bonding as previously described and then low temperature (less than about 400° C.) bonded. The portion of the N+ layer 9503 and the P− donor wafer 9500 that are above the layer transfer demarcation plane 9599 may be removed by cleaving and polishing, or other low temperature processes as previously described. This process of an ion implanted atomic species, such as, for example, Hydrogen, forming a layer transfer demarcation plane, and subsequent cleaving or thinning, may be called 'ion-cut'. Acceptor wafer 9510 may have similar meanings as wafer 808 previously described with reference to FIG. 8.

Figure 95C:
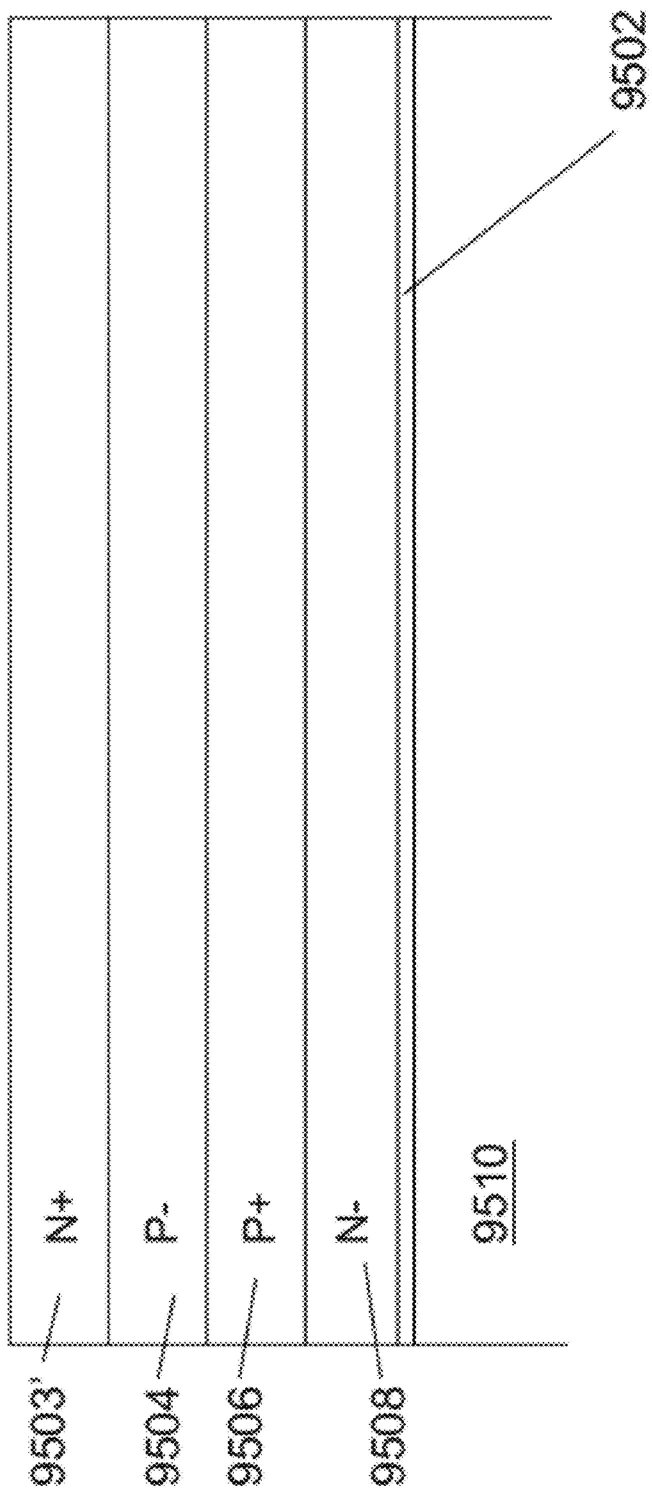

As illustrated in FIG. 95C, the remaining N+ layer 9503', P− layer 9504, P+ layer 9506, N− layer 9508, and oxide layer 9502 may have been layer transferred to acceptor wafer 9510. The top surface of N+ layer 9503' may be chemically or mechanically polished smooth and flat. Multiple transistors may be formed with low temperature (less than about 400° C.) processing and aligned to the acceptor wafer 9510 alignment marks (not shown). For illustration clarity, the oxide layers, such as oxide layer 9502, used to facilitate the wafer to wafer bond are not shown in subsequent drawings.

Figure 95D:
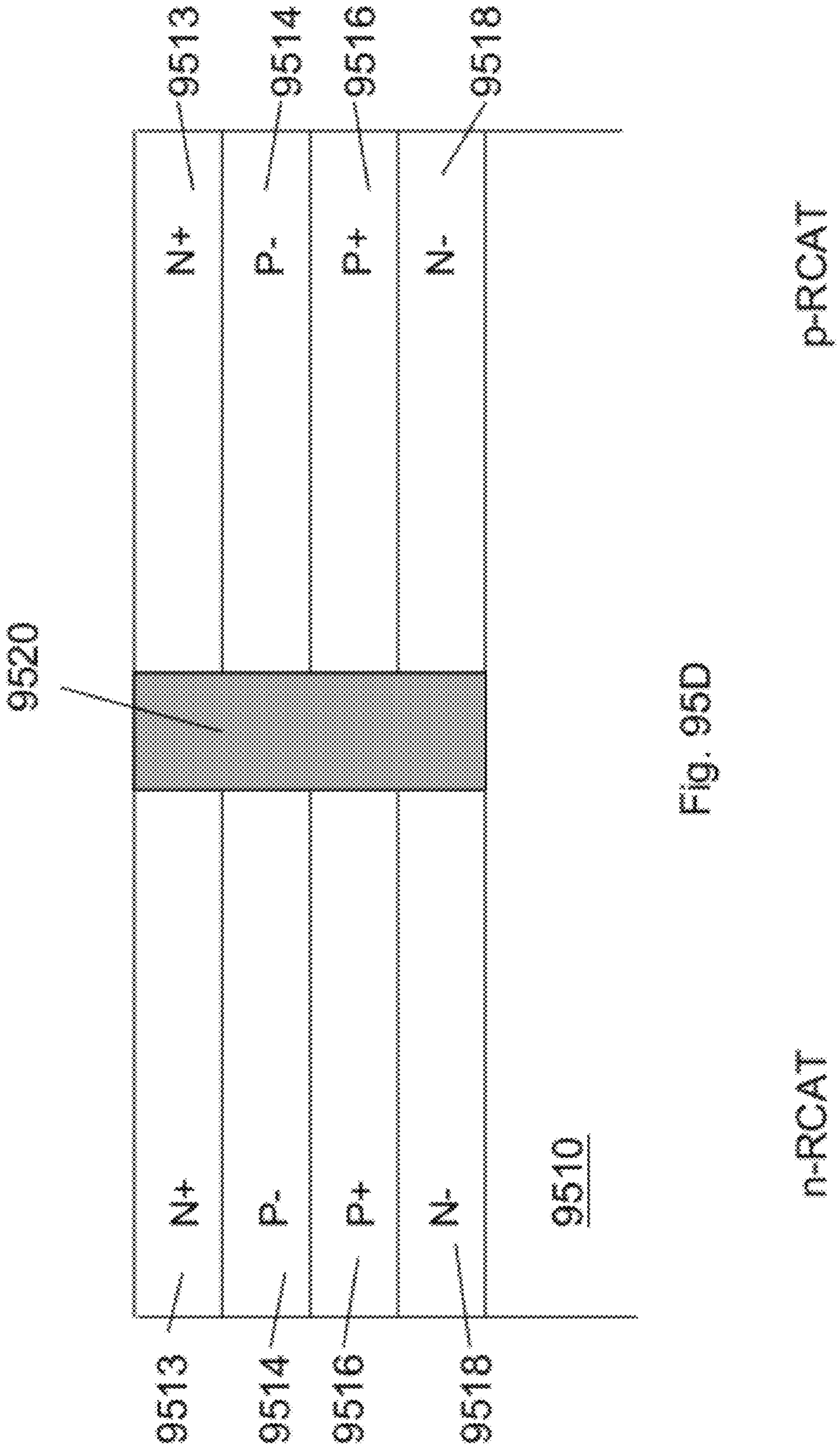

As illustrated in FIG. 95D the transistor isolation region may be lithographically defined and then formed by plasma/RIE etch removal of portions of N+ layer 9503', P− layer 9504, P+ layer 9506, and N− layer 9508 to at least the top oxide of acceptor wafer 9510. A low-temperature gap fill oxide may be deposited and chemically mechanically polished, remaining in transistor isolation region 9520. Thus formed may be future RCAT transistor regions N+ doped 9513, P− doped 9514, P+ doped 9516, and N− doped 9518.

Figure 95E:
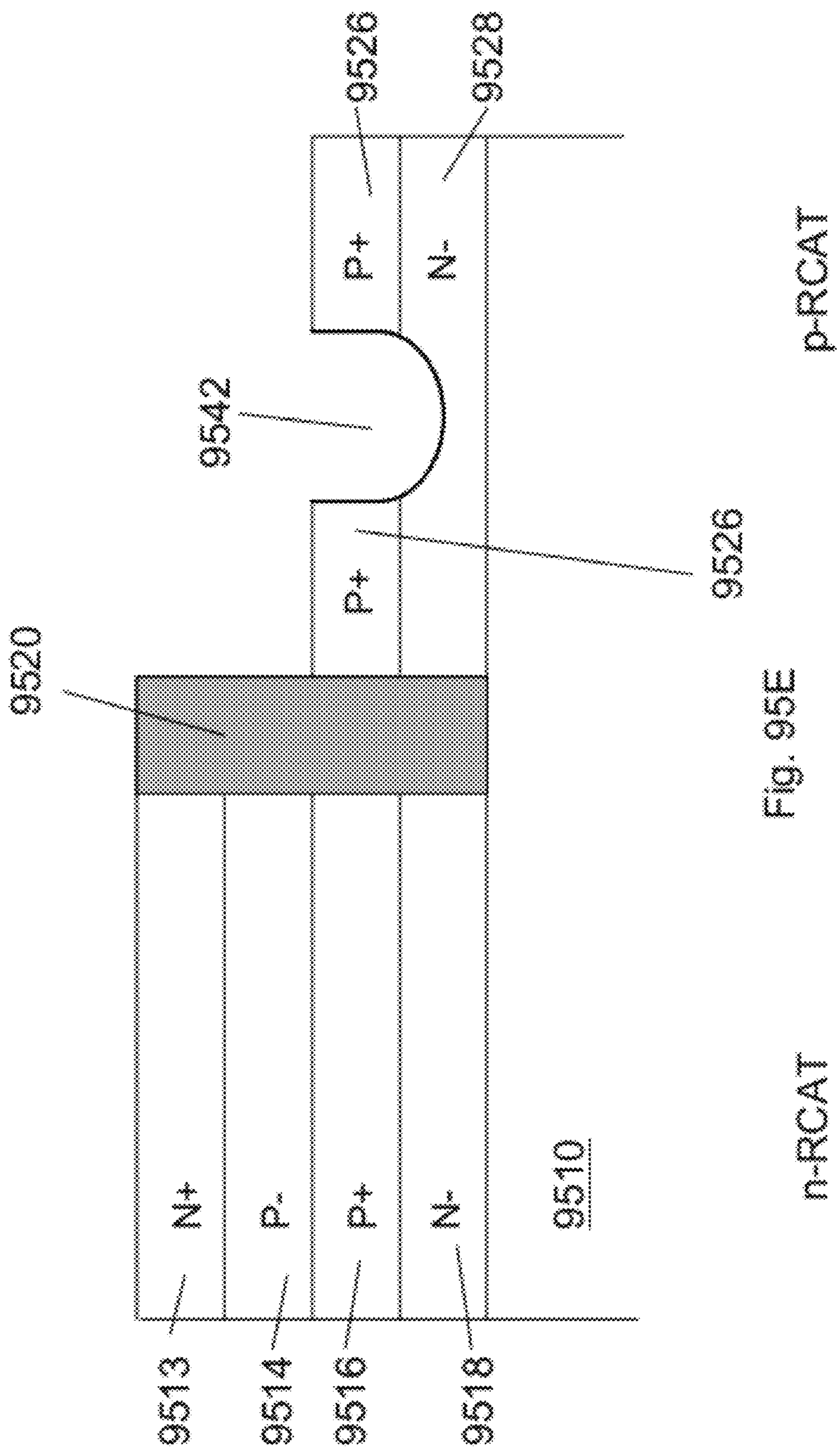

As illustrated in FIG. 95E the N+ doped region 9513 and P− doped region 9514 of the p-RCAT portion of the wafer may be lithographically defined and removed by either plasma/RIE etch or a selective wet etch. Then the p-RCAT recessed channel 9542 may be mask defined and etched. The recessed channel surfaces and edges may be smoothed by wet chemical or plasma/RIE etching techniques to mitigate high field effects. These process steps may form P+ source and drain regions 9526 and N− transistor channel region 9528.

Figure 95F:
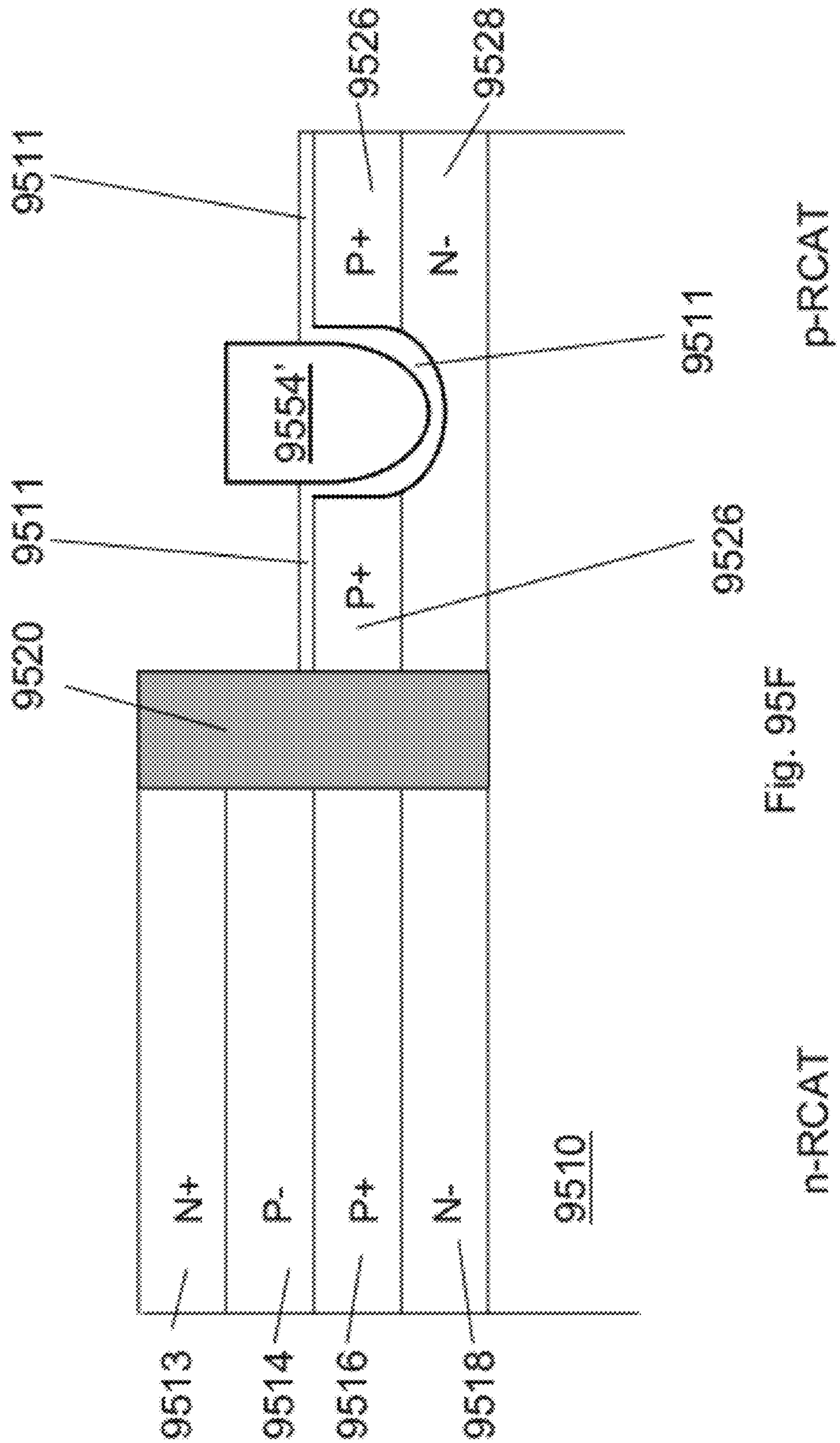

As illustrated in FIG. 95F, a gate dielectric 9511 may be formed and a gate metal material may be deposited. The gate dielectric 9511 may be an atomic layer deposited (ALD) gate dielectric that may be paired with a work function specific gate metal according to industry standard high k metal gate process schemes described previously and targeted for an p-channel RCAT utility. Alternatively, the gate dielectric 9511 may be formed with a low temperature oxide deposition or low temperature microwave plasma oxidation of the silicon surfaces and then a gate material such as platinum or aluminum may be deposited. Gate material may be chemically mechanically polished, and the p-RCAT gate electrode 9554' may be defined by masking and etching.

Figure 95G:
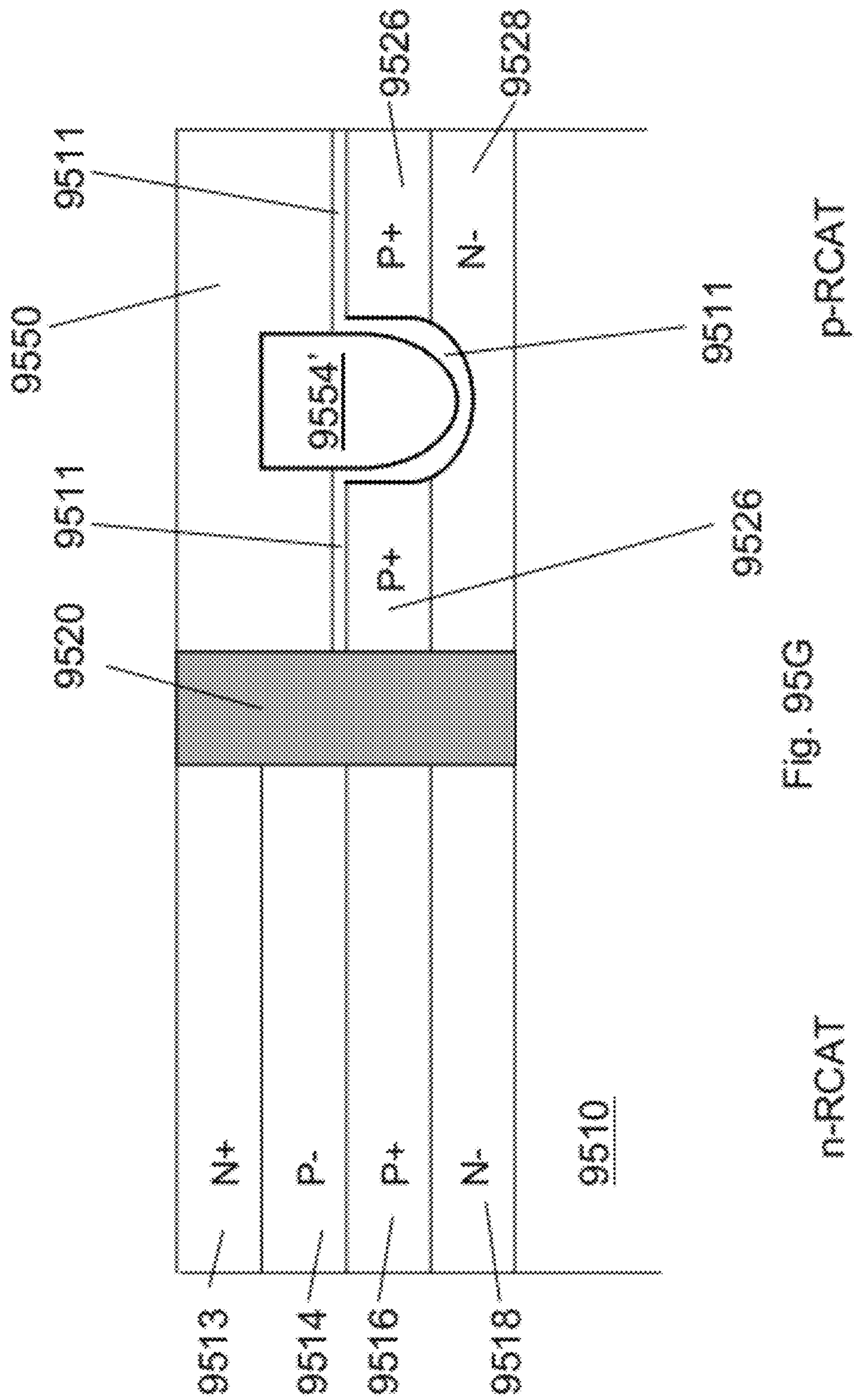

As illustrated in FIG. 95G, a low temperature oxide 9550 may be deposited and planarized, covering the formed p-RCAT so that the processing to form the n-RCAT may proceed.

Figure 95H:
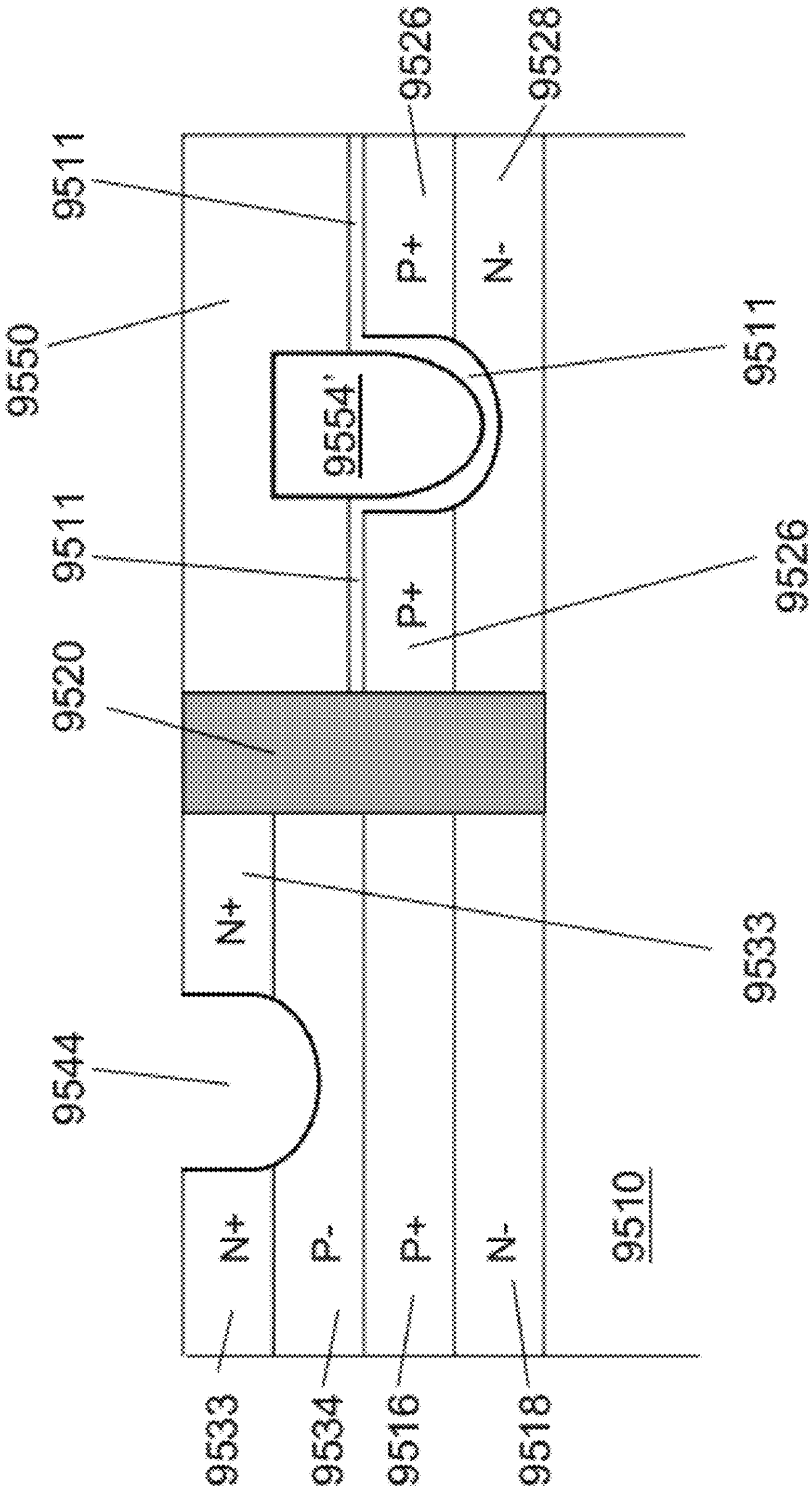

As illustrated in FIG. 95H the n-RCAT recessed channel 9544 may be mask defined and etched. The recessed channel surfaces and edges may be smoothed by wet chemical or plasma/RIE etching techniques to mitigate high field effects. These process steps may form N+ source and drain regions 9533 and P− transistor channel region 9534.

Figure 95I:
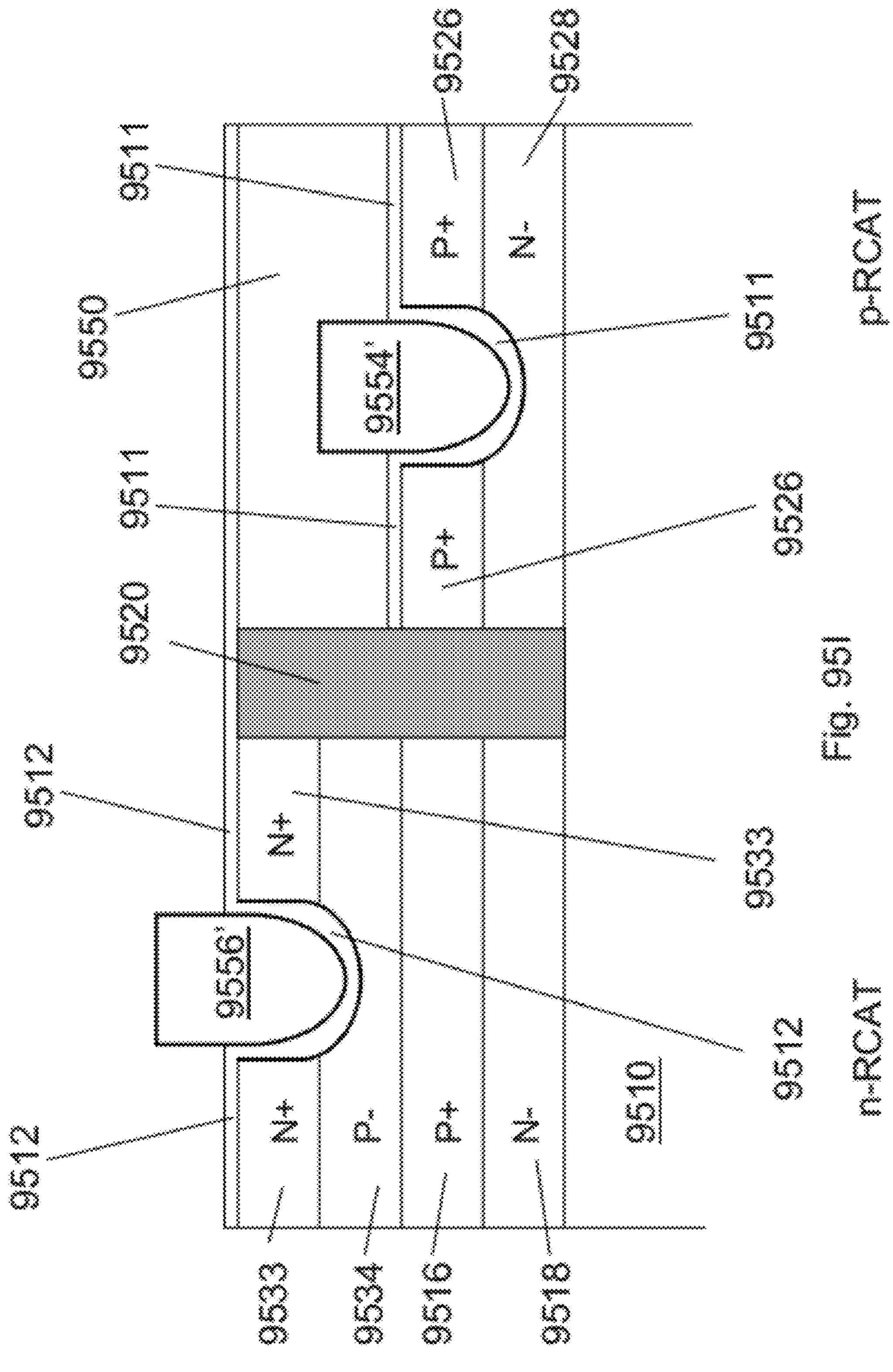

As illustrated in FIG. 95I, a gate dielectric 9512 may be formed and a gate metal material may be deposited. The gate dielectric 9512 may be an atomic layer deposited (ALD) gate dielectric that may be paired with a work function specific gate metal according to industry standard high k metal gate process schemes described previously and targeted for use in an n-channel RCAT. Additionally, the gate dielectric 9512 may be formed with a low temperature oxide deposition or low temperature microwave plasma oxidation of the silicon surfaces and then a gate material such as tungsten or aluminum may be deposited. The gate material may be chemically mechanically polished, and the gate electrode 9556' may be defined by masking and etching.

Figure 95J:
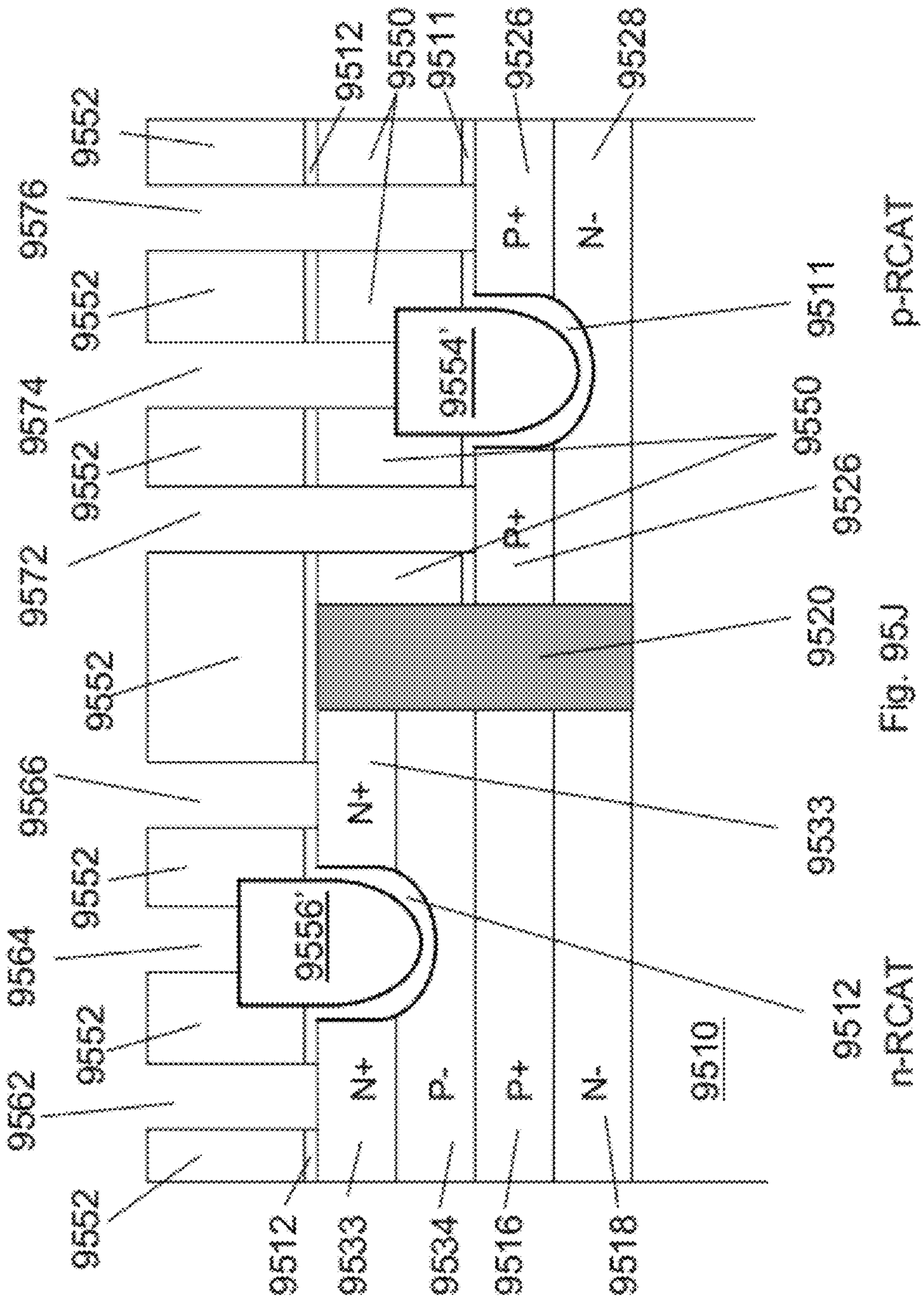

As illustrated in FIG. 95J, the entire structure may be covered with a low temperature oxide 9552, which may be planarized with chemical mechanical polishing. Contacts and metal interconnects may be formed by lithography and plasma/RIE etch. The n-RCAT N+ source and drain regions 9533, P− transistor channel region 9534, gate dielectric 9512 and gate electrode 9556' are shown. The p-RCAT P+ source and drain regions 9526, N− transistor channel region 9528, gate dielectric 9511 and gate electrode 9554' are shown. Transistor isolation region 9520, oxide 9552, n-RCAT source contact 9562, gate contact 9564, and drain contact 9566 are shown. p-RCAT source contact 9572, gate contact 9574, and drain contact 9576 are shown. The n-RCAT source contact 9562 and drain contact 9566 may provide electrical coupling to their respective N+ regions 9533. The n-RCAT gate contact 9564 may provide electrical coupling to gate electrode 9556'. The p-RCAT source contact 9572 and drain contact 9576 may provide electrical coupling to their respective N+ regions 9526. The p-RCAT gate contact 9574 may provide electrical coupling to gate electrode 9554'. Contacts (not shown) to P+ doped region 9516, and N− doped region 9518 may be made to allow biasing for noise suppression and back-gate/substrate biasing.

Interconnect metallization may then be conventionally formed. The through layer via (not shown) may be formed to electrically couple the complementary RCAT layer metallization to the acceptor wafer 9510 at acceptor wafer metal connect pad (not shown). This flow may enable the formation of a mono-crystalline silicon n-RCAT and p-RCAT constructed in a single layer transfer of prefabricated wafer sized doped layers, which may be formed and connected to the underlying multi-metal layer semiconductor device without exposing the underlying devices to a high temperature.

Persons of ordinary skill in the art will appreciate that the illustrations in FIGS. 95A through 95J are exemplary only and are not drawn to scale. Such skilled persons will further appreciate that many variations may be possible such as, for example, the n-RCAT may be processed prior to the p-RCAT, or that various etch hard masks may be employed. Such skilled persons will further appreciate that devices other than a complementary RCAT may be created with minor variations of the process flow, such as, for example, complementary bipolar junction transistors, or complementary raised source drain extension transistors, or complementary junction-less transistors, or complementary V-groove transistors. Many other modifications within the scope of the illustrated embodiments of the invention will suggest themselves to such skilled persons after reading this specification. Thus the invention is to be limited only by the appended claims.

An alternative method whereby to build both ‘n’ type and ‘p’ type transistors on the same layer may be to partially process the first phase of transistor formation on the donor wafer with normal CMOS processing including a ‘dummy gate’, a process known as gate-last transistors or process, or gate replacement transistors or process, or replacement gate transistors or process. In some embodiments of the invention, a layer transfer of the mono-crystalline silicon may be performed after the dummy gate is completed and before the formation of a replacement gate. Processing prior to layer transfer may have no temperature restrictions and the processing during and after layer transfer may be limited to low temperatures, generally, for example, below about 400° C. The dummy gate and the replacement gate may include various materials such as silicon and silicon dioxide, or metal and low k materials such as TiAlN and HfO2. An example may be the high-k metal gate (HKMG) CMOS transistors that have been developed for the 45 nm, 32 nm, 22 nm, and future CMOS generations. Intel and TSMC may have shown the advantages of a ‘gate-last’ approach to construct high performance HKMG CMOS transistors (C, Auth et al., VLSI 2008, pp 128-129 and C. H. Jan et al, 2009 IEDM p. 647).

Figures 70A, 70B:
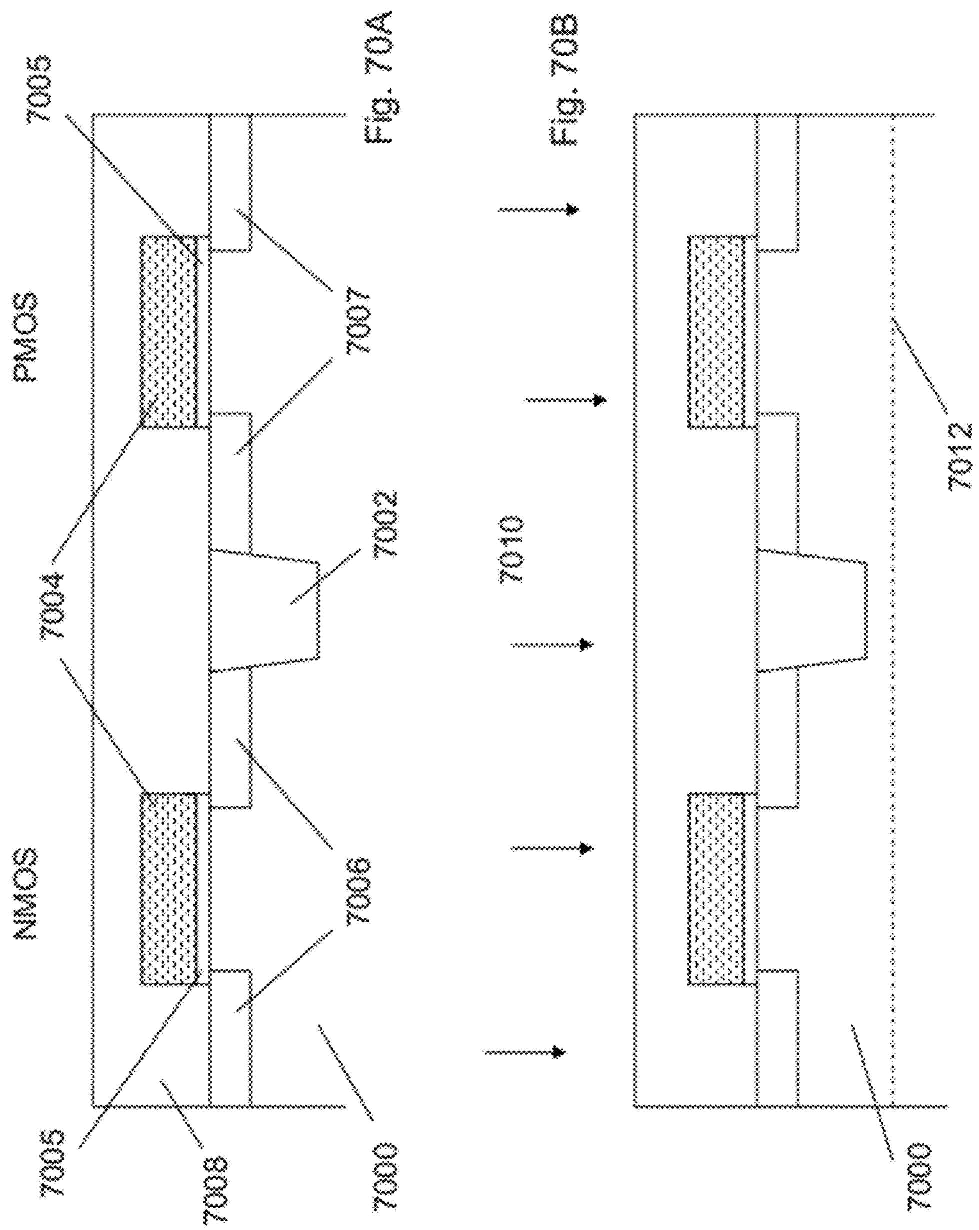
FIGS. 70 A, B, B-1, and C-H are exemplary drawing illustrations of formation of top planar transistors.
Figures 1, 70B:
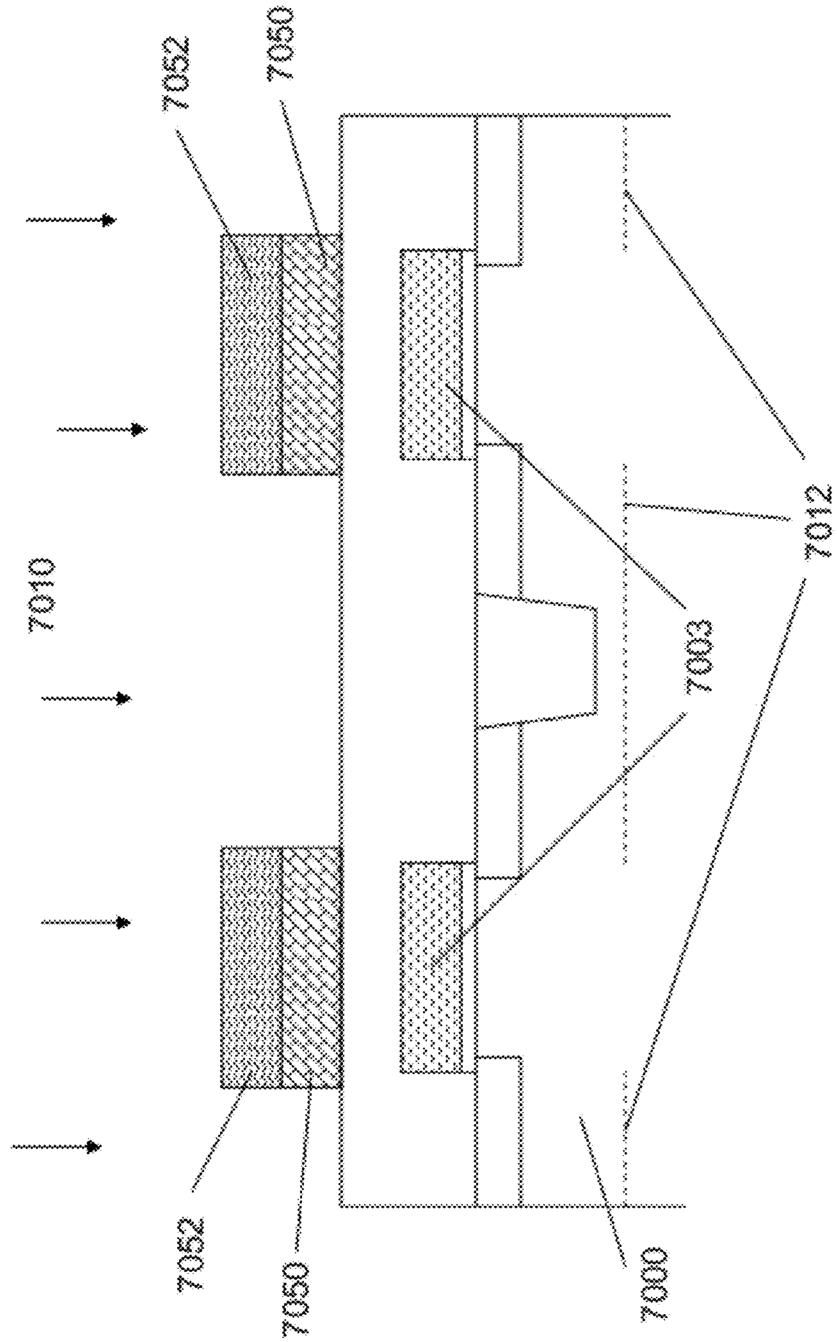

As illustrated in FIG. 70A, a bulk silicon donor wafer 7000 may be processed in the normal state of the art HKMG gate-last manner up to the step prior to where CMP exposure of the polysilicon dummy gates takes place. FIG. 70A illustrates a cross section of the bulk silicon donor wafer 7000, the isolation 7002 between transistors, the polysilicon 7004 and gate oxide 7005 of both n-type and p-type CMOS dummy gates, their associated source and drains 7006 for NMOS and 7007 for PMOS, and the interlayer dielectric (ILD) 7008. These structures of FIG. 70A illustrate completion of the first phase of transistor formation. At this step, or alternatively just after a CMP of ILD 7008 to expose the polysilicon dummy gates or to planarize the ILD 7008 and not expose the dummy gates, an implant of an atomic species 7010, such as, for example, H+, may prepare the cleave plane 7012 in the bulk of the donor substrate for layer transfer suitability, as illustrated in FIG. 70B.

Figure 70C:
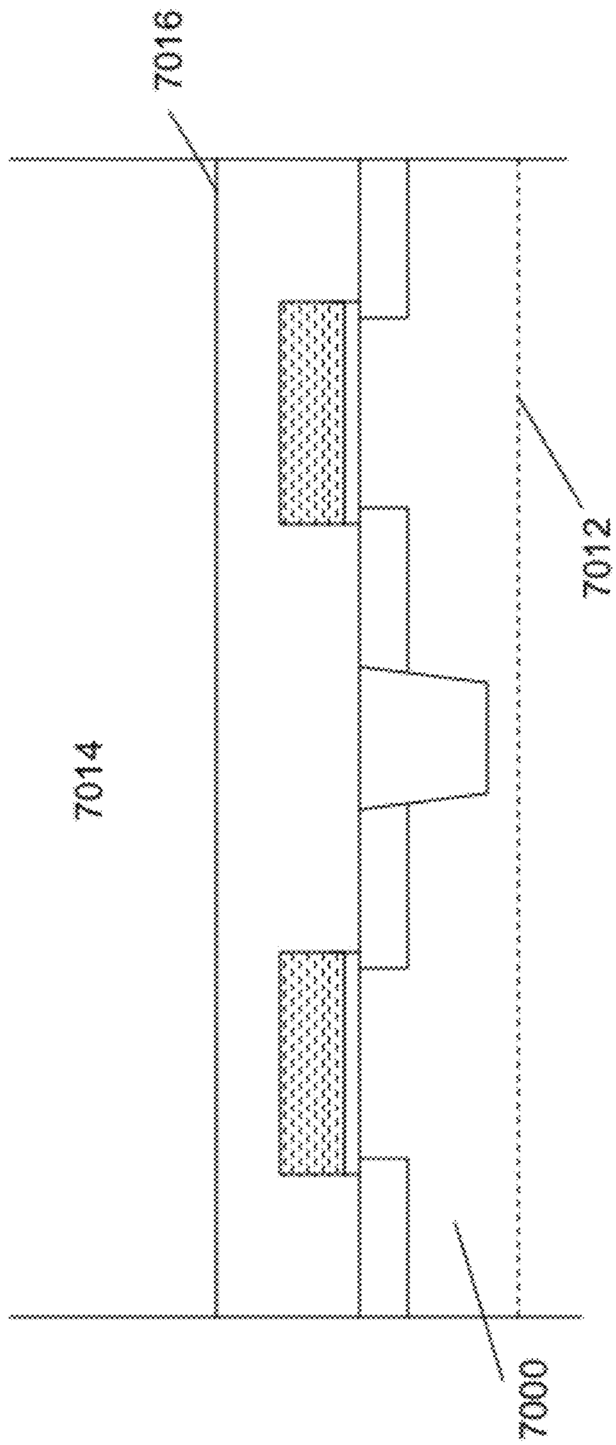

The donor wafer 7000 may be now temporarily bonded to carrier substrate 7014 at interface 7016 as illustrated in FIG. 70C with a low temperature process that may facilitate a low temperature release. The carrier substrate 7014 may be a glass substrate to enable state of the art optical alignment with the acceptor wafer. A temporary bond between the carrier substrate 7014 and the donor wafer 7000 at interface 7016 may be made with a polymeric material, such as polyimide DuPont HD3007, which can be released at a later step by laser ablation, Ultra-Violet radiation exposure, or thermal decomposition. Alternatively, a temporary bond may be made with uni-polar or bi-polar electrostatic technology such as, for example, the Apache tool from Beam Services Inc.

Figure 70D:
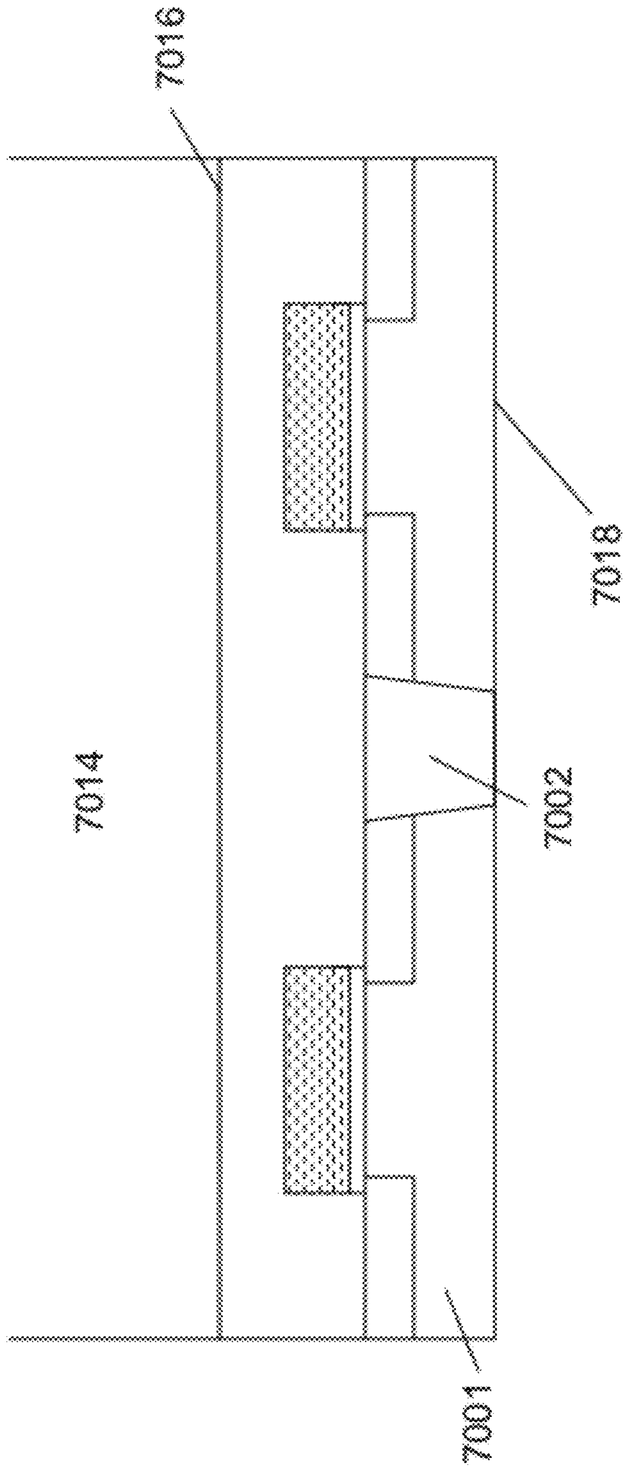

The donor wafer 7000 may then be cleaved at the cleave plane 7012 and may be thinned by chemical mechanical polishing (CMP) so that the transistor isolation 7002 may be exposed at the donor layer face 7018 as illustrated in FIG. 70D. Alternatively, the CMP could continue to the bottom of the junctions to create a fully depleted SOI layer.

Figure 70E:
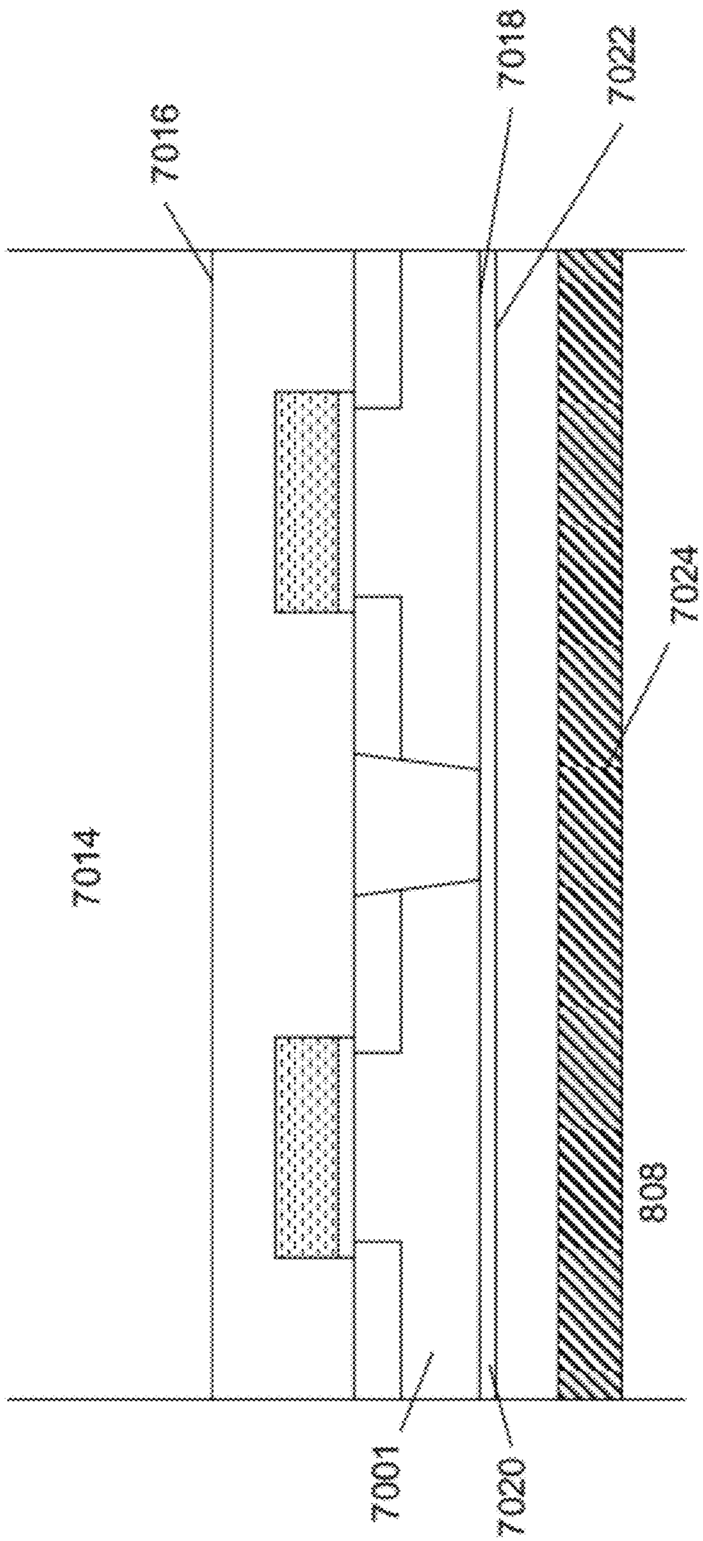

As shown in FIG. 70E, the thin mono-crystalline donor layer face 7018 may be prepared for layer transfer by a low temperature oxidation or deposition of an oxide 7020, and plasma or other surface treatments to prepare the oxide surface 7022 for wafer oxide-to-oxide bonding. Similar surface preparation may be performed on the 808 acceptor wafer in preparation for oxide-to-oxide bonding.

A low temperature (for example, less than about 400° C.) layer transfer flow may be performed, as illustrated in FIG. 70E, to transfer the thinned and first phase of transistor formation pre-processed HKMG transistor silicon layer 7001 with attached carrier substrate 7014 to the acceptor wafer 808. Acceptor wafer 808 may include metallization comprising metal strips 7024 to act as landing pads for connection between the circuits formed on the transferred layer with the underlying circuits of layer or layer within acceptor wafer 808.

Figure 70F:
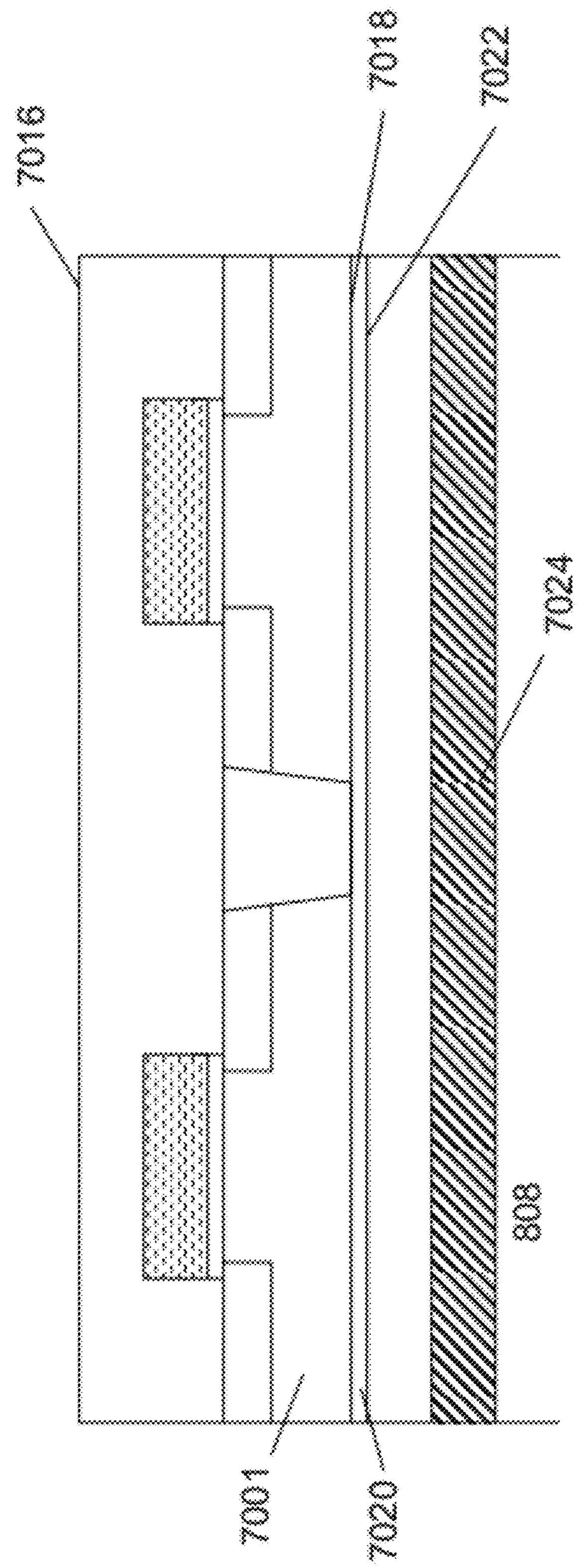

As illustrated in FIG. 70F, the carrier substrate 7014 may then be released using a low temperature process such as laser ablation.

Figure 70G:
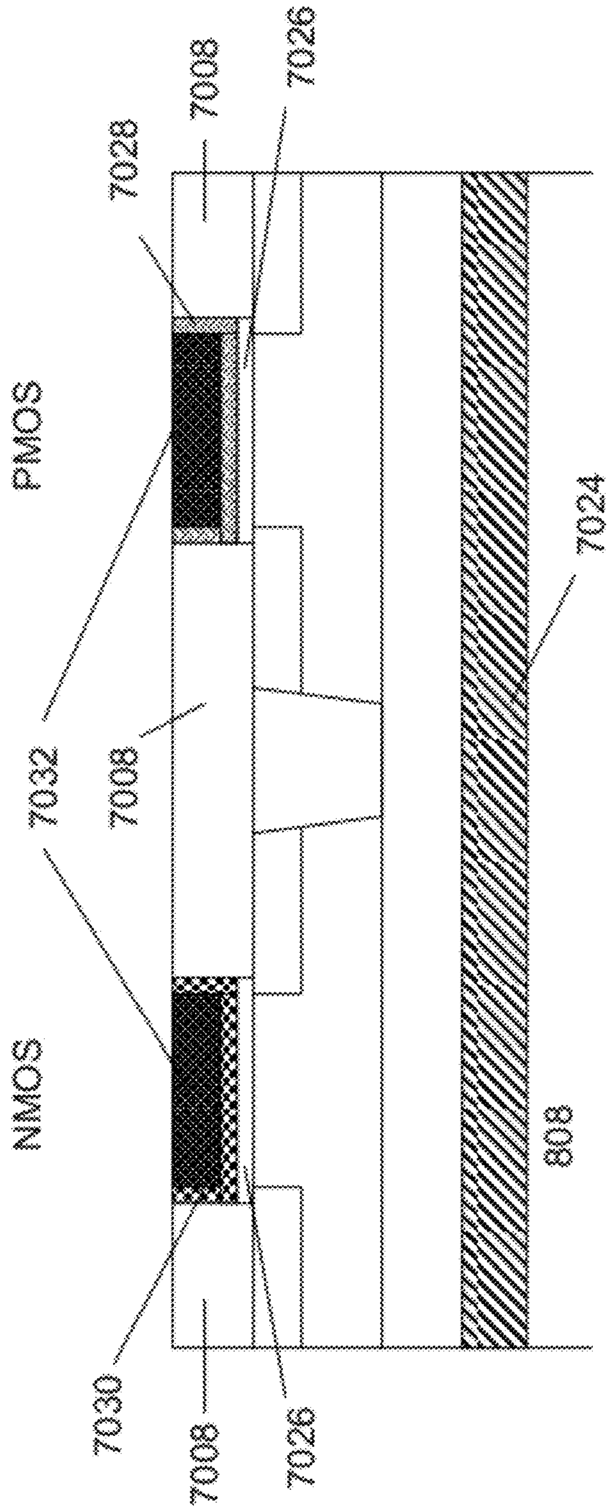

The bonded combination of acceptor wafer 808 and HKMG transistor silicon layer 7001 may now be ready for normal state of the art gate-last transistor formation completion. As illustrated in FIG. 70G, the ILD 7008 may be chemical mechanically polished to expose the top of the polysilicon dummy gates. The dummy polysilicon gates may then be removed by etching and the hi-k gate dielectric 7026 and the PMOS specific work function metal gate 7028 may be deposited. The PMOS work function metal gate may be removed from the NMOS transistors and the NMOS specific work function metal gate 7030 may be deposited. An aluminum overfill 7032 may be performed on both NMOS and PMOS gates and the metal CMP'ed.

Figure 70H:
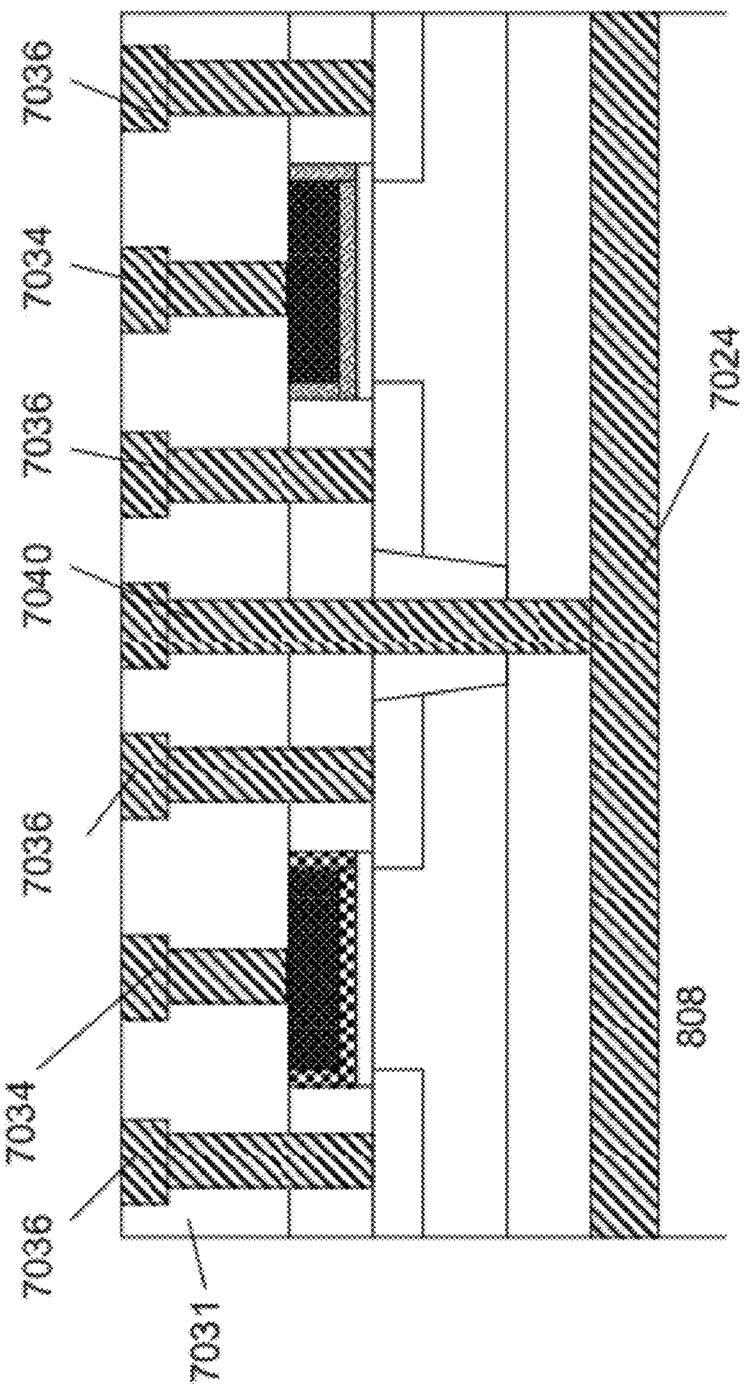

As illustrated in FIG. 70H, a dielectric layer 7031 may be deposited and the normal gate contact 7034 and source/drain 7036 contact formation and metallization may now be performed to connect the transistors on that mono-crystalline layer and to connect to the acceptor wafer 808 top metal strip 7024 with through via 7040 providing connection through the transferred layer from the donor wafer to the acceptor wafer. The top metal layer may be formed to act as the acceptor wafer landing strips for a repeat of the above process flow to stack another preprocessed thin mono-crystalline layer of two-phase formed transistors. The above process flow may also be utilized to construct gates of other types, such as, for example, doped polysilicon on thermal oxide, doped polysilicon on oxynitride, or other metal gate configurations, as 'dummy gates,' may perform a layer transfer of the thin mono-crystalline layer, replace the gate electrode and gate oxide, and then proceed with low temperature interconnect processing. An alternative layer transfer method may be utilized, such as, for example, SOI wafers with etchback of the bulk silicon to the buried oxide layer, in place of an ion-cut layer transfer scheme.

Figure 82A:
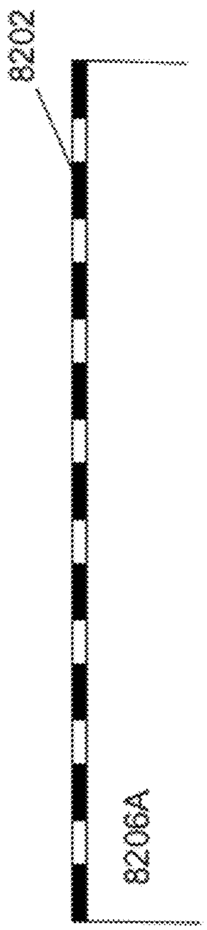
FIG. 82 A-G are exemplary drawing illustrations of a formation of top planar transistors.

Alternatively, the carrier substrate 7014 may be a silicon wafer, and infra-red light and optics could be utilized for alignments. FIGS. 82A-G illustrate the use of a carrier wafer. FIG. 82A illustrates the first step of preparing transistors with dummy gate transistors 8202 on first donor wafer 8206A. The first step may complete the first phase of transistor formation.

Figure 82B:
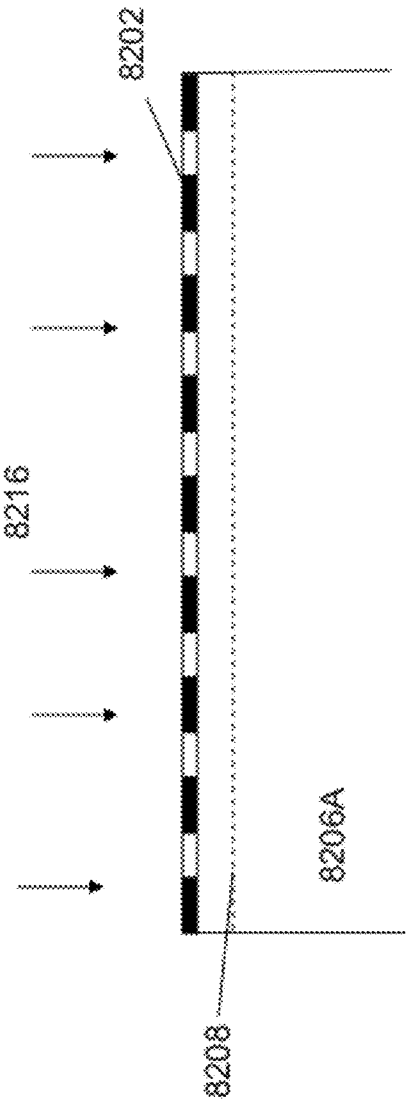

FIG. 82B illustrates forming a cleave line 8208 by implant 8216 of atomic particles such as H+.

Figure 82C:
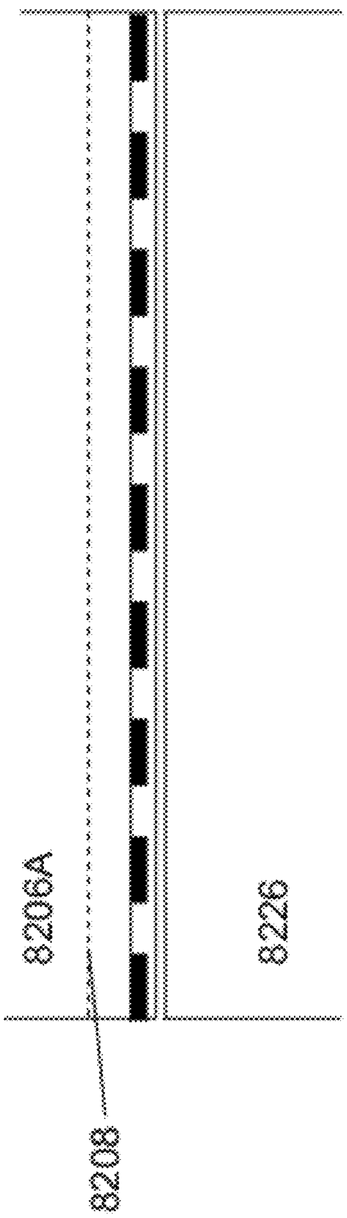

FIG. 82C illustrates permanently bonding the first donor wafer 8206A to a second donor wafer 8226. The permanent bonding may be oxide-to-oxide wafer bonding as described previously.

Figure 82D:
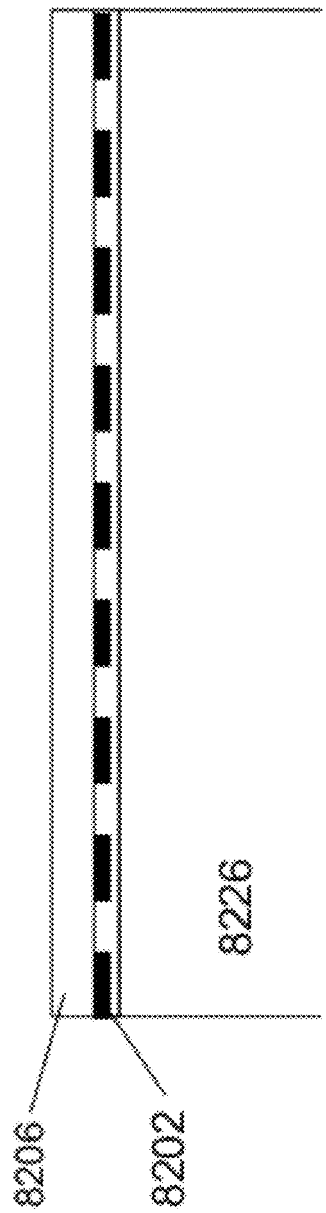

FIG. 82D illustrates the second donor wafer 8226 acting as a carrier wafer after cleaving the first donor wafer off; leaving a thin layer 8206 of first donor wafer 8206A with the now buried dummy gate transistors 8202.

Figures 82E, 82F:
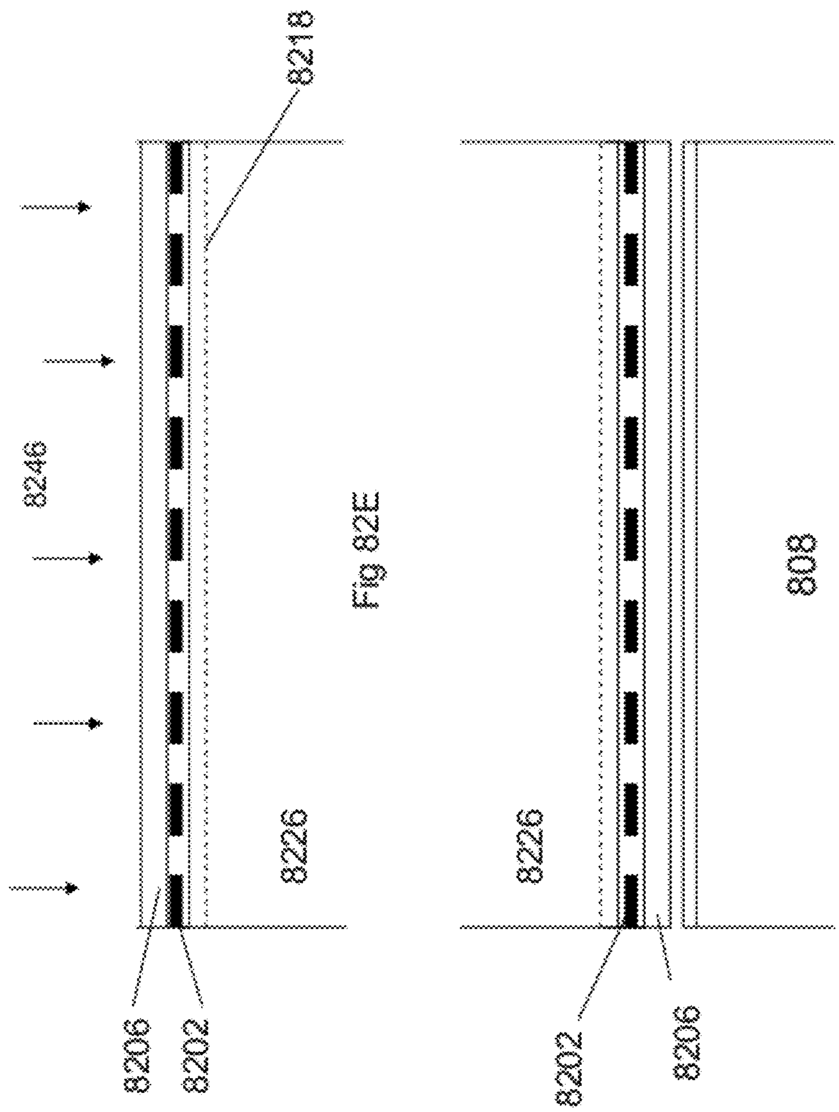

FIG. 82E illustrates forming a second cleave line 8218 in the second donor wafer 8226 by implant 8246 of atomic species such as, for example, H+.

FIG. 82F illustrates the second layer transfer step to bring the dummy gate transistors 8202 ready to be permanently bonded to the house 808. For simplicity of the explanation, the steps of surface layer preparation done for each of these bonding steps have been left out.

Figure 82G:
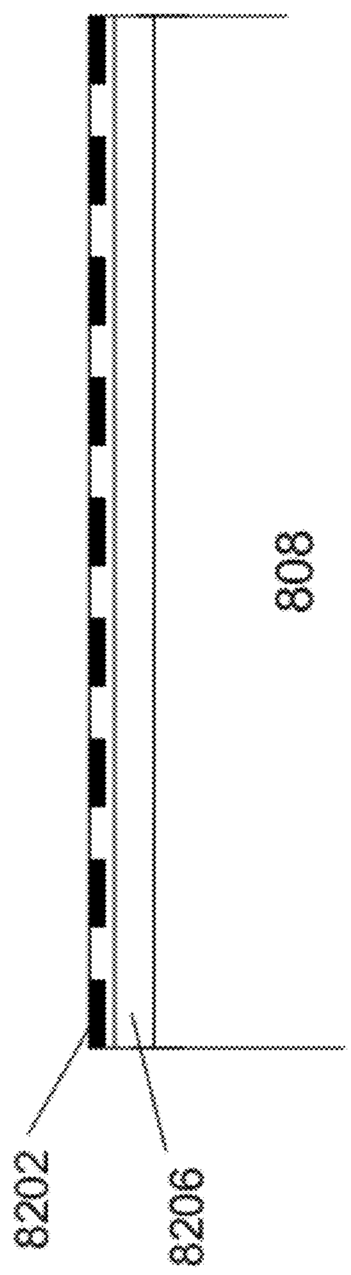

FIG. 82G illustrates the house 808 with the dummy gate transistors 8202 on top after cleaving off the second donor wafer and removing the layers on top of the dummy gate transistors. Now the flow may proceed to replace the dummy gates with the final gates, form the metal interconnection layers, and continue the 3D fabrication process. An alternative layer transfer method may be utilized, such as, for example, SOI wafers with etchback of the bulk silicon to the buried oxide layer, in place of an ion-cut layer transfer scheme.

An illustrative alternative may be available when using the carrier wafer flow. In this flow we can use the two sides of the transferred layer to build NMOS on one side and PMOS on the other side. Proper timing of the replacement gate step in such a flow could enable full performance transistors properly aligned to each other. Compact 3D library cells may be constructed from this process flow.

Figure 83A:
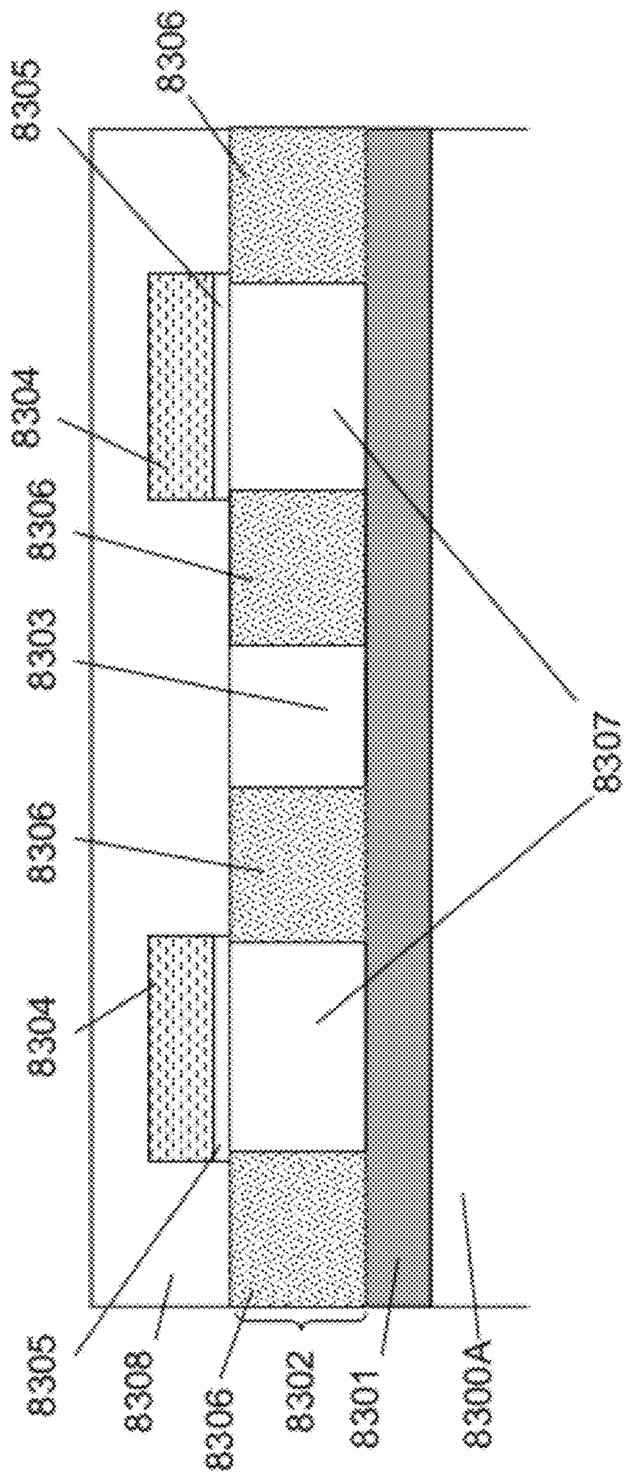
FIG. 83 A-L are exemplary drawing illustrations of a formation of top planar transistors.

As illustrated in FIG. 83A, an SOI (Silicon On Insulator) donor wafer 8300A or substrate may be processed according to normal state of the art using, e.g., a High-k-Metal Gate (HKMG) gate-last process, with adjusted thermal cycles to compensate for later thermal processing, up to the step prior to where CMP exposure of the polysilicon dummy gates takes place. Alternatively, the donor wafer 8300A may start as a bulk silicon wafer and utilize an oxygen implantation and thermal anneal to form a buried oxide layer, such as the SIMOX process (i.e., separation by implantation of oxygen). FIG. 83A illustrates a cross section of the SOI donor wafer 8300A, the buried oxide (i.e., BOX) 8301, the thin silicon layer 8302 of the SOI wafer, the isolation 8303 between transistors, the polysilicon 8304 and gate oxide 8305 of n-type CMOS dummy gates, their associated source and drains 8306 for NMOS, the NMOS transistor channel 8307, and the NMOS interlayer dielectric (ILD) 8308. Alternatively, PMOS devices or full CMOS devices may be constructed at this stage. This stage may complete the first phase of transistor formation.

Figure 83B:
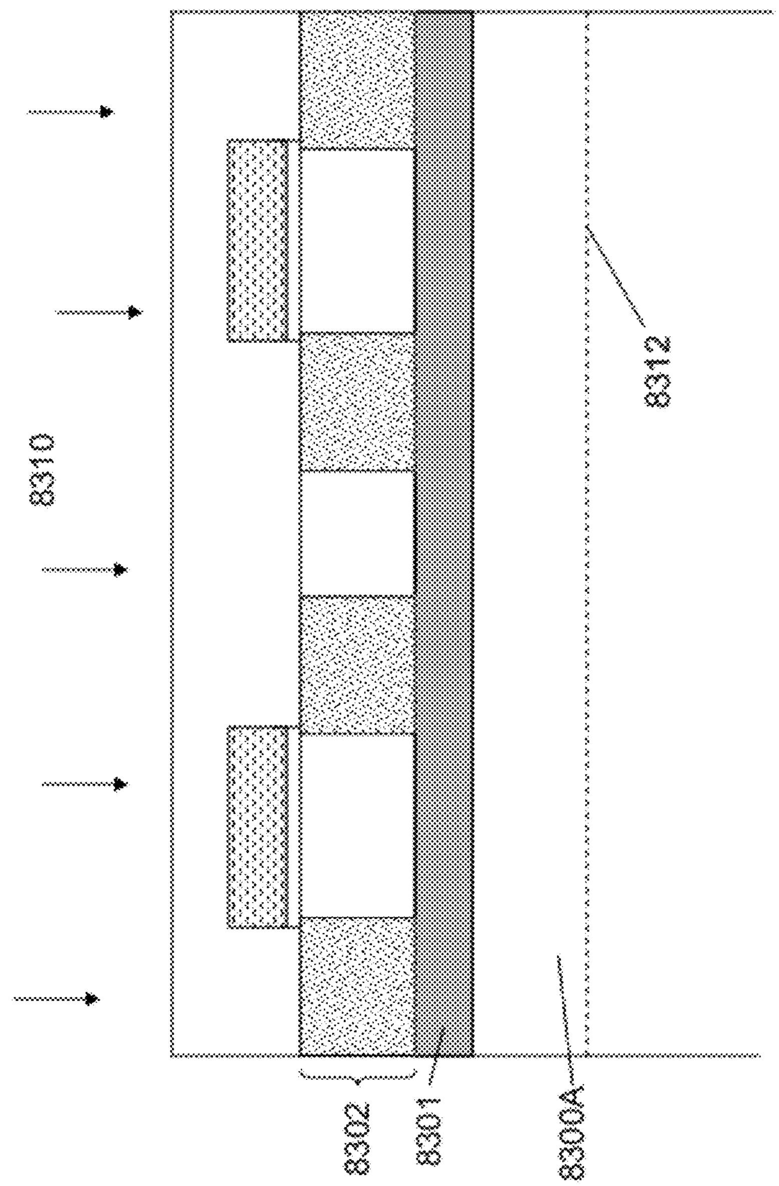

At this step, or alternatively just after a CMP of NMOS ILD 8308 to expose the polysilicon dummy gates or to planarize the NMOS ILD 8308 and not expose the dummy gates, an implant of an atomic species 8310, such as, for example, H+, may prepare the cleaving plane 8312 in the bulk of the donor substrate for layer transfer suitability, as illustrated in FIG. 83B.

Figure 83C:
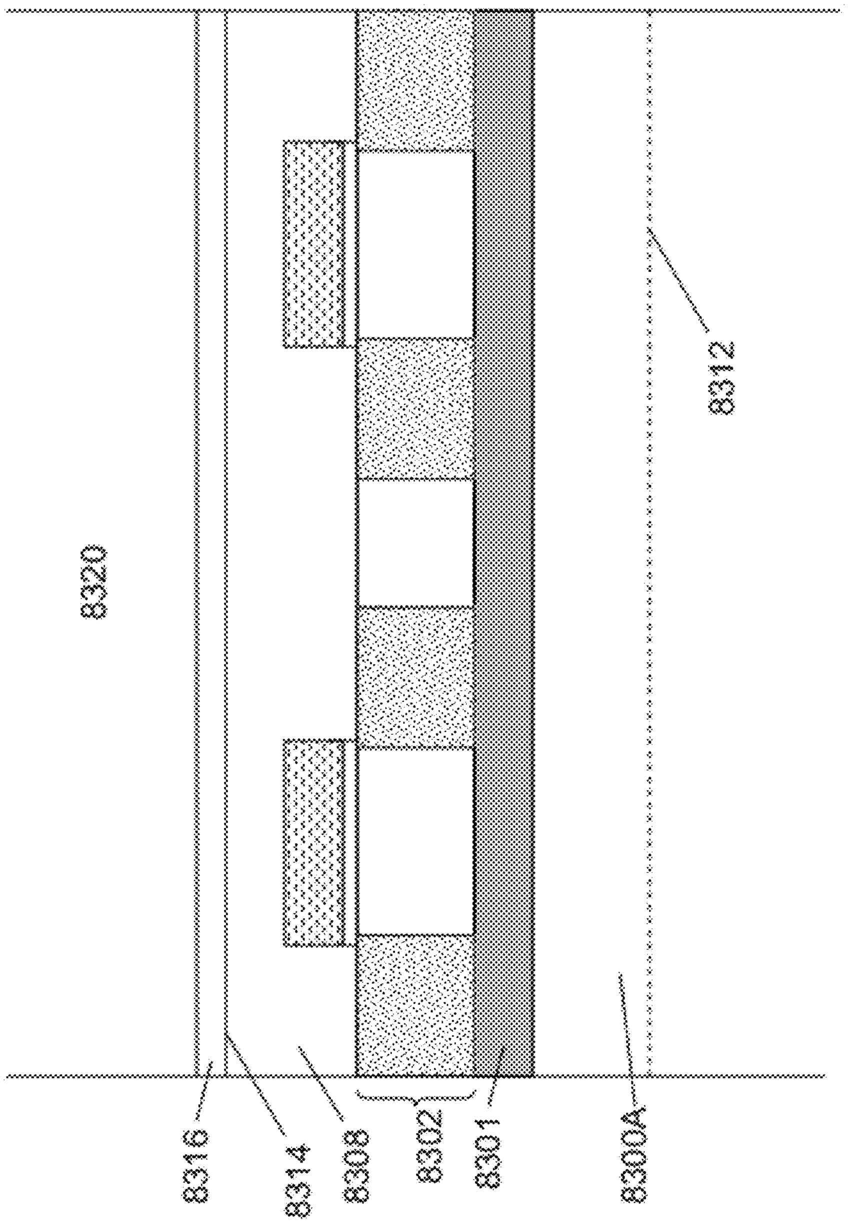

The SOI donor wafer 8300A may now be permanently bonded to a carrier wafer 8320 or substrate that may have been prepared with an oxide layer 8316 for oxide-to-oxide bonding to the donor wafer surface 8314 as illustrated in FIG. 83C.

Figure 83D:
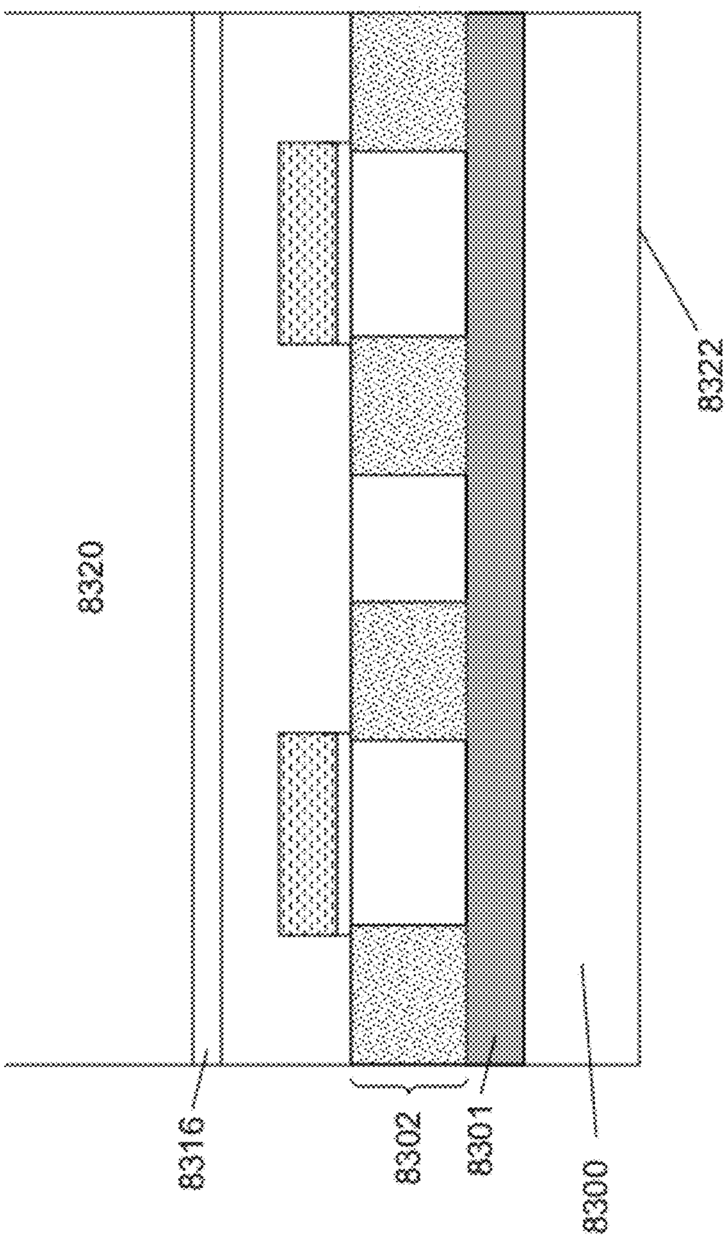

As illustrated in FIG. 83D, the donor wafer 8300A may then be cleaved at the cleaving plane 8312 and may be thinned by chemical mechanical polishing (CMP) and surface 8322 may be prepared for transistor formation. Thus donor wafer layer 8300 may be formed.

Figure 83E:
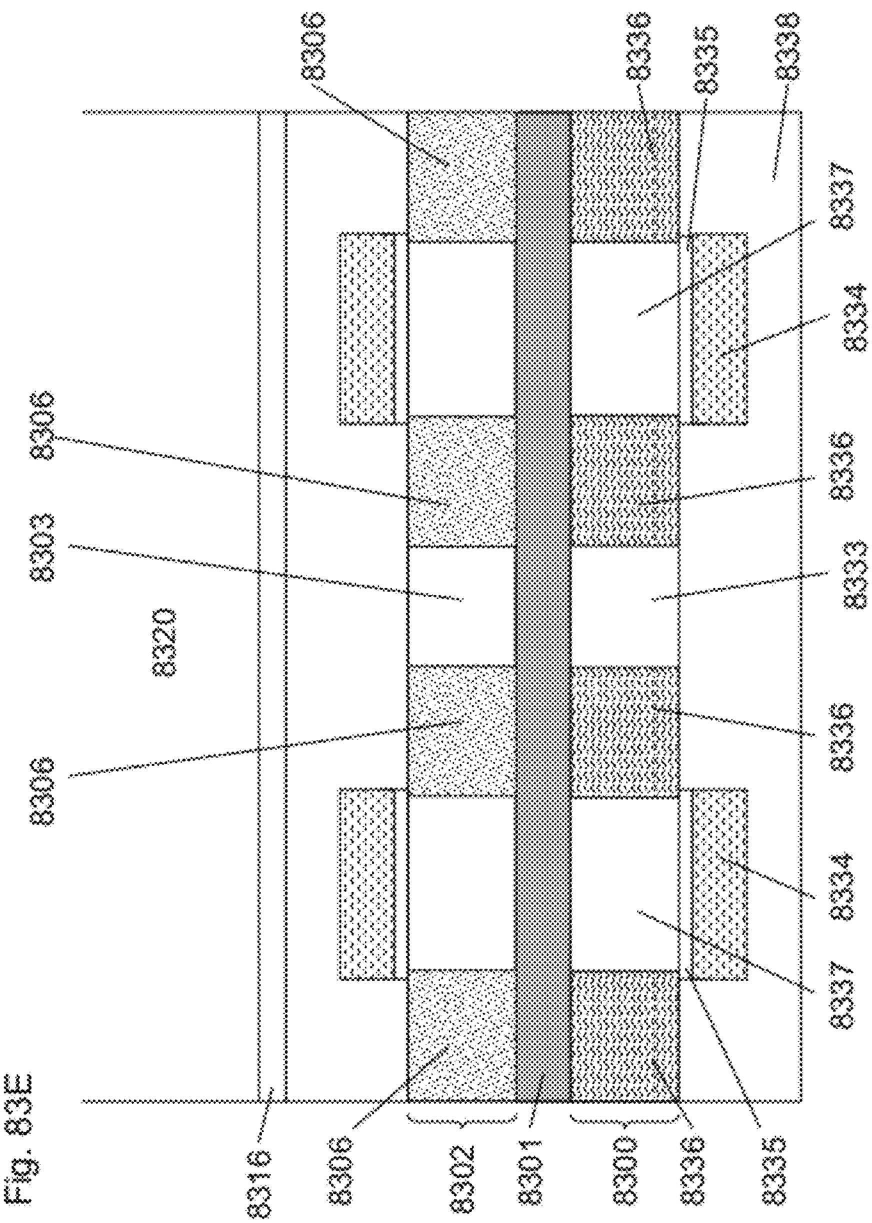

The donor wafer layer 8300 at surface 8322 may be processed in the normal state of the art gate last processing to form the PMOS transistors with dummy gates. FIG. 83E illustrates the cross section after the PMOS devices are formed showing the buried oxide (BOX) 8301, the now thin silicon donor wafer layer 8300 of the SOI substrate, the isolation 8333 between transistors, the polysilicon 8334 and gate oxide 8335 of p-type CMOS dummy gates, their associated source and drains 8336 for PMOS, the PMOS transistor channel 8337, and the PMOS interlayer dielectric (ILD) 8338. The PMOS transistors may be precisely aligned at state of the art tolerances to the NMOS transistors due to the shared substrate donor wafer layer 8300 possessing the same alignment marks. At this step, or alternatively just after a CMP of PMOS ILD 8338, the processing flow may proceed to expose the PMOS polysilicon dummy gates or to planarize the oxide layer PMOS ILD 8338 and may not expose the dummy gates. Now the wafer could be put into a high temperature anneal to activate both the NMOS and the PMOS transistors.

Figure 83F:
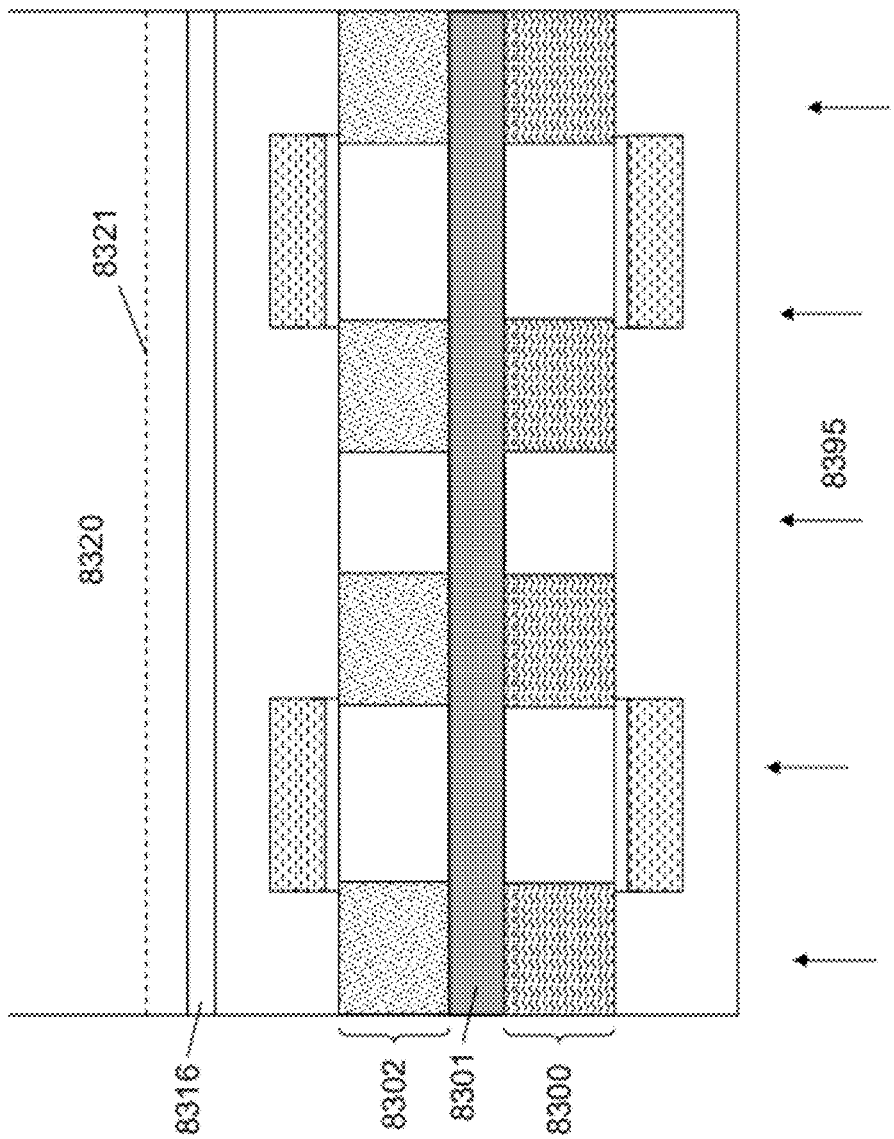

Then an implant of an atomic species 8395, such as, for example, H+, may prepare the cleaving plane 8321 in the bulk of the carrier wafer 8320 for layer transfer suitability, as illustrated in FIG. 83F.

Figure 83G:
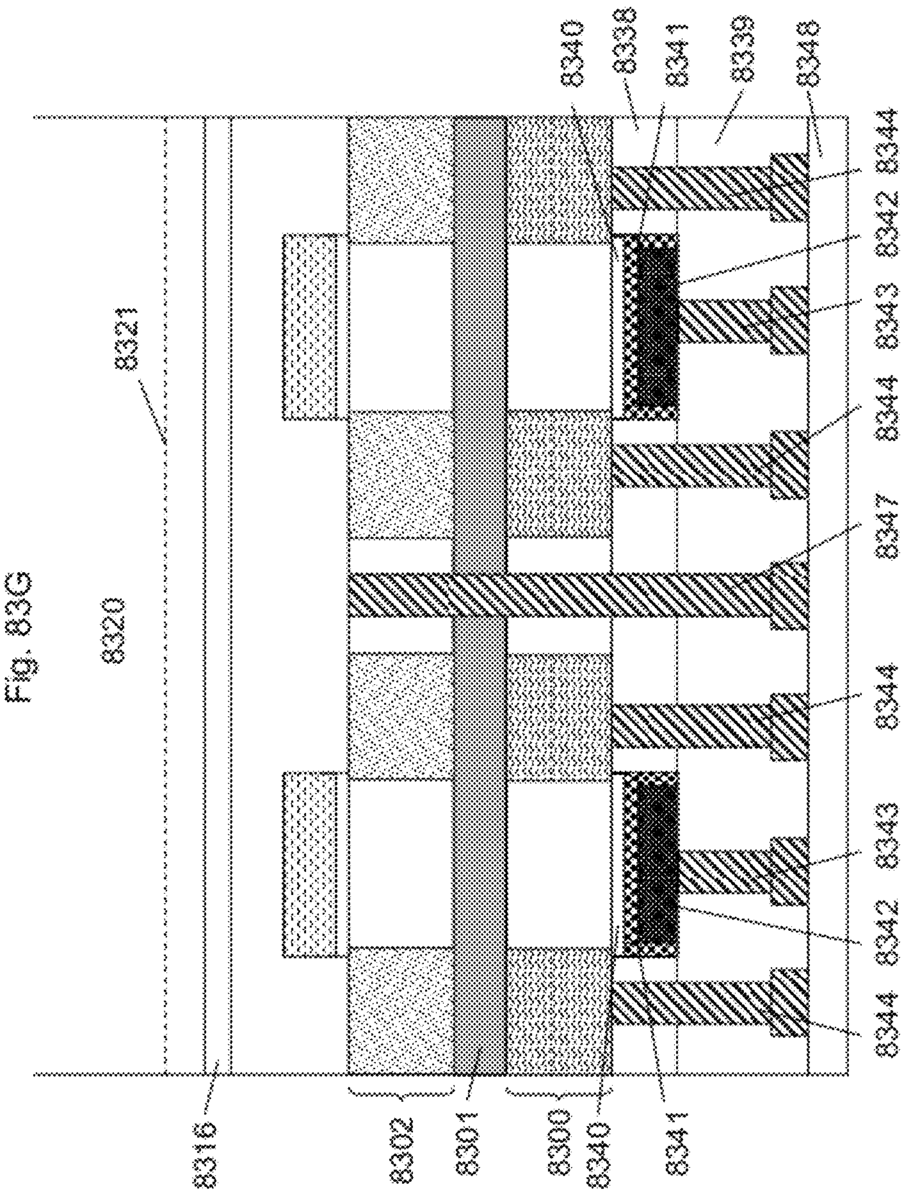

The PMOS transistors may now be ready for normal state of the art gate-last transistor formation completion. As illustrated in FIG. 83G, the PMOS ILD 8338 may be chemical mechanically polished to expose the top of the polysilicon dummy gates. The dummy polysilicon gates may then be removed by etch and the PMOS hi-k gate dielectric 8340 and the PMOS specific work function metal gate 8341 may be deposited. An aluminum fill 8342 may be performed on the PMOS gates and the metal CMP'ed. A dielectric layer 8339 may be deposited and the normal gate 8343 and source/drain 8344 contact formation and metallization. The PMOS layer to NMOS layer via 8347 and metallization may be partially formed as illustrated in FIG. 83G and an oxide layer 8348 may be deposited to prepare for bonding.

Figure 83H:
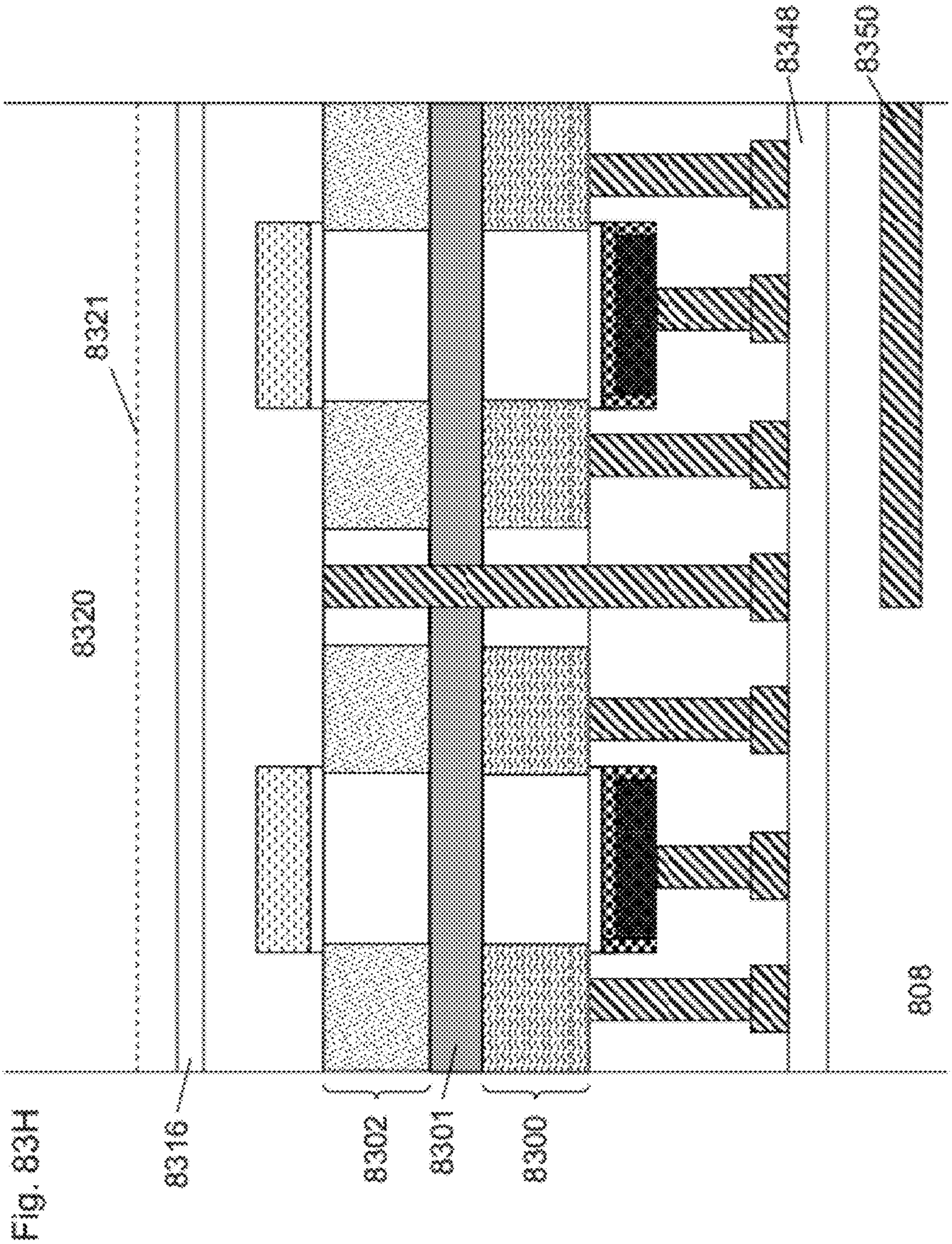

The carrier wafer and two sided n/p layer may then be aligned and permanently bonded to House acceptor wafer 808 with associated metal landing strip 8350 as illustrated in FIG. 83H.

Figure 83I:
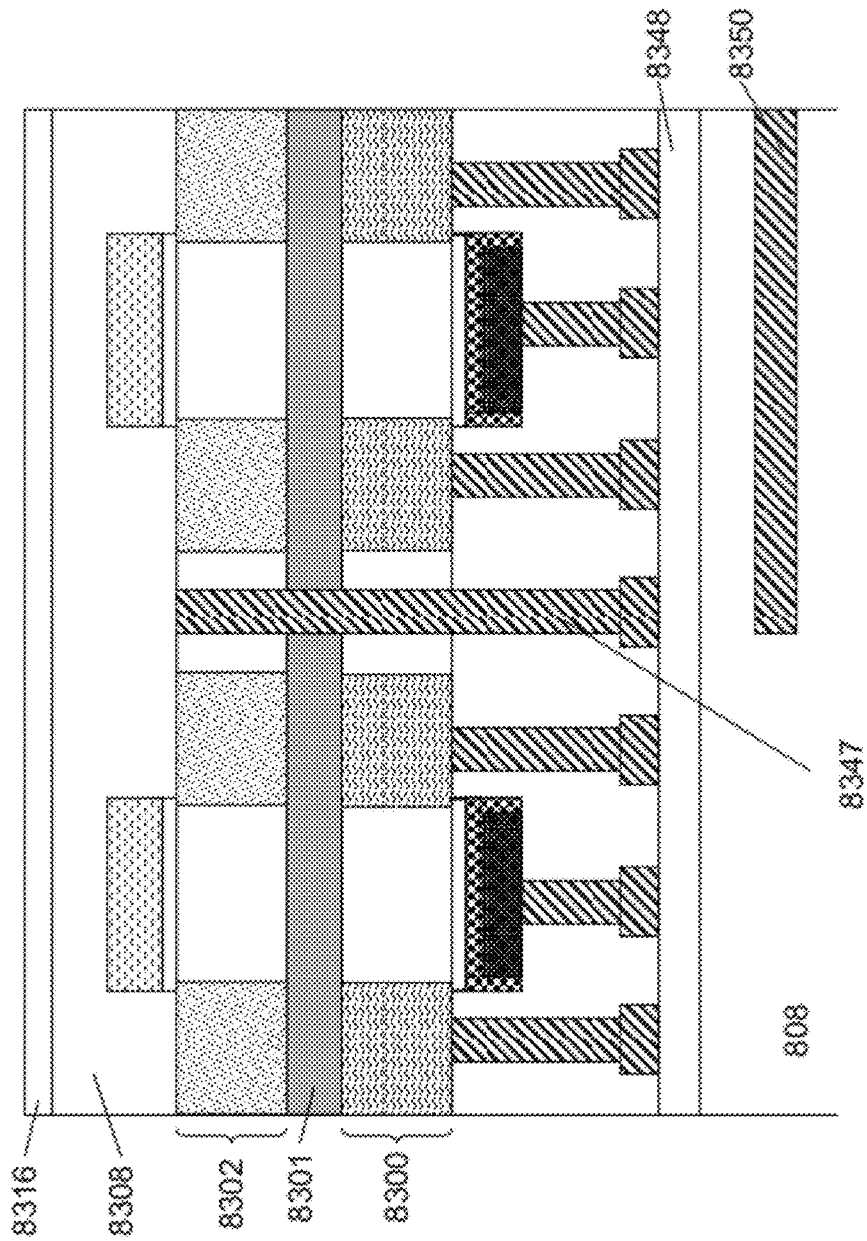

The carrier wafer 8320 may then be cleaved at the cleaving plane 8321 and may be thinned by chemical mechanical polishing (CMP) to oxide layer 8316 as illustrated in FIG. 83I.

Figure 83J:
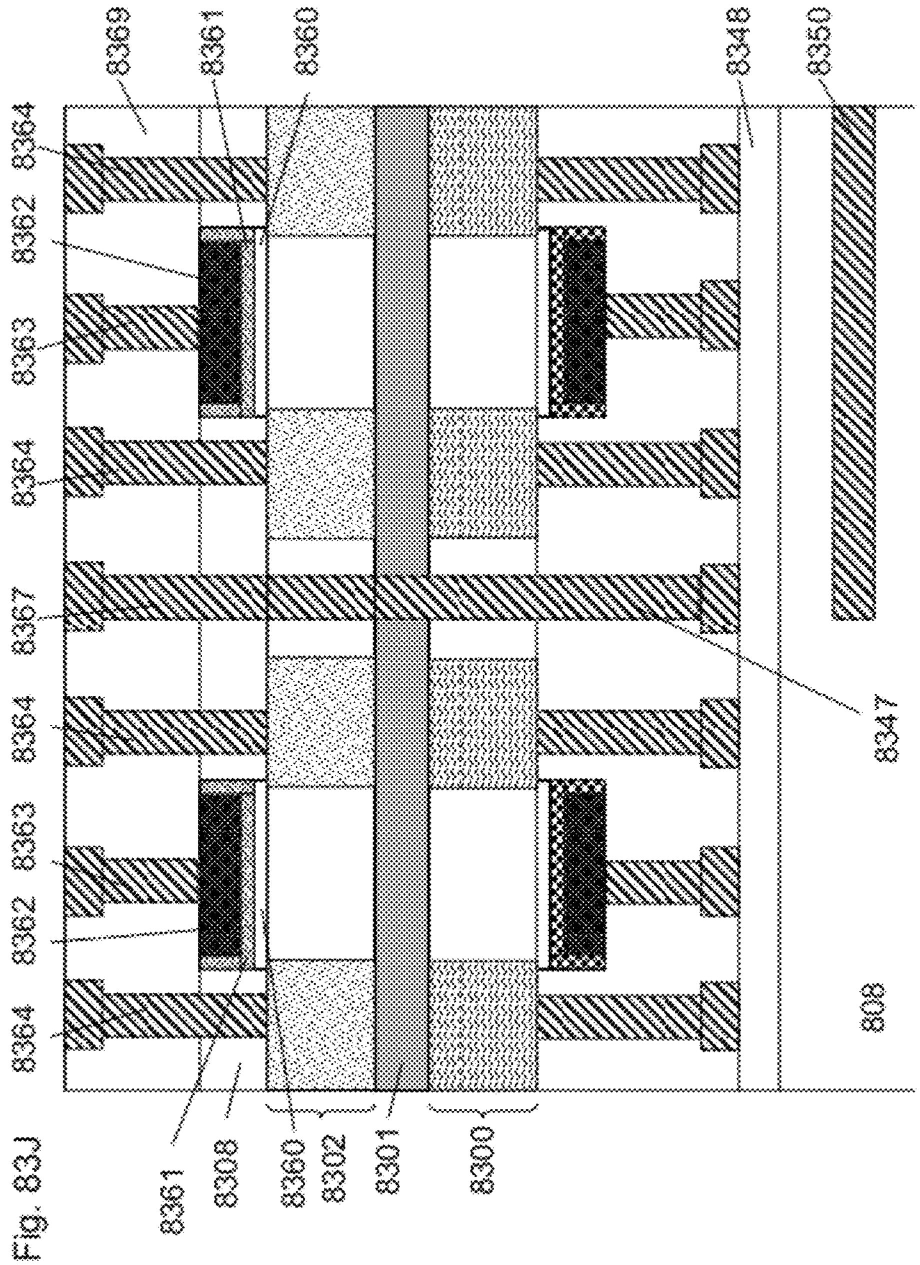

The NMOS transistors may now be ready for normal state of the art gate-last transistor formation completion. As illustrated in FIG. 83J, the NMOS ILD 8308 may be chemical mechanically polished to expose the top of the NMOS polysilicon dummy gates. The dummy polysilicon gates may then be removed by etching and the NMOS hi-k gate dielectric 8360 and the NMOS specific work function metal gate 8361 may be deposited. An aluminum fill 8362 may be performed on the NMOS gates and the metal CMP'ed. A dielectric layer 8369 may be deposited and the normal gate 8363 and source/drain 8364 contacts may be formed and metalized. The NMOS layer to PMOS layer via 8367 to connect to 8347 and the metallization of via 8367 may be formed.

Figure 83K:
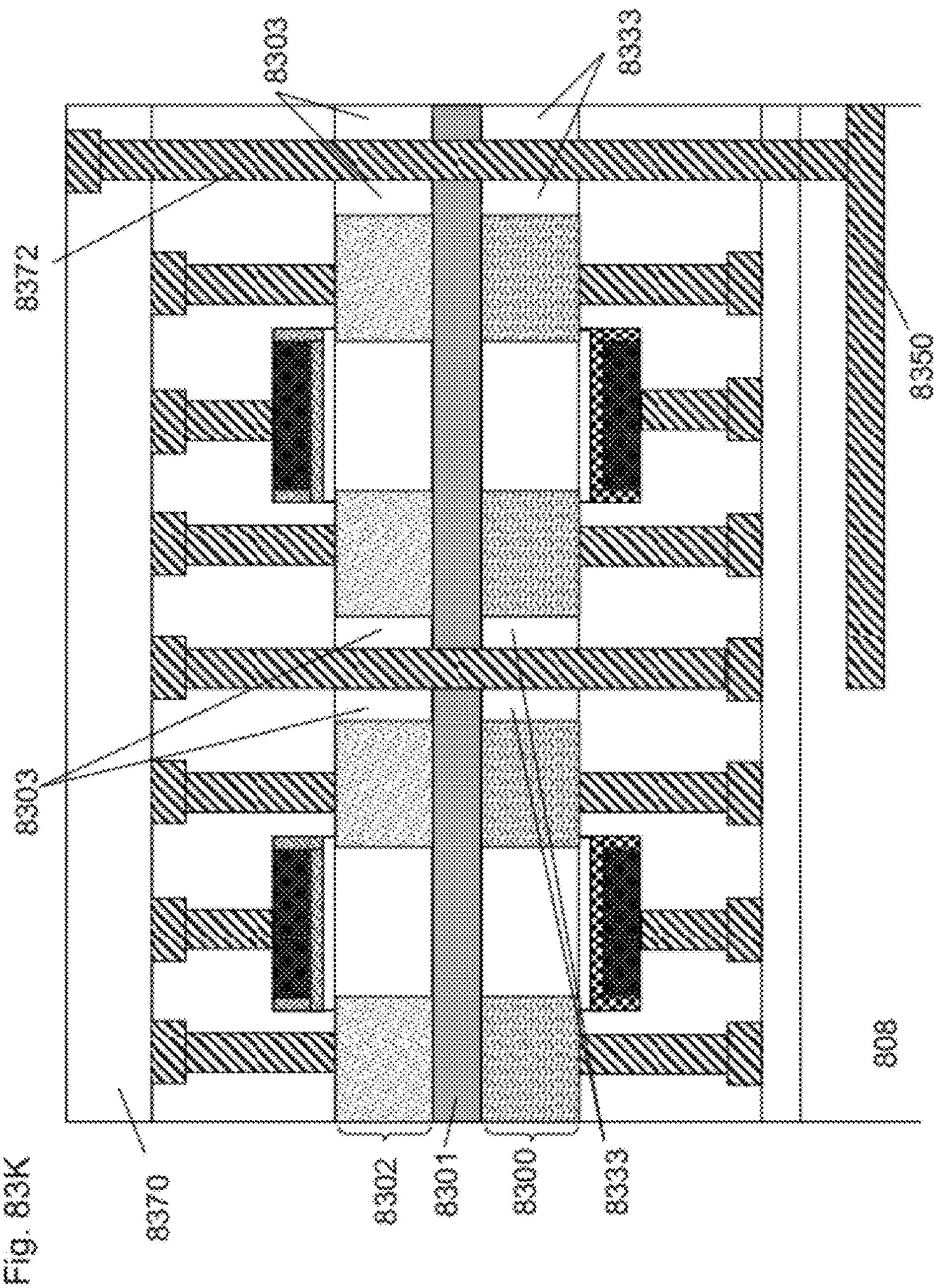

As illustrated in FIG. 83K, a dielectric layer 8370 may be deposited. Layer-to-layer through via 8372 may then be aligned, masked, etched, and metalized to electrically connect to the acceptor wafer 808 and metal-landing strip 8350. A topmost metal layer of the layer stack illustrated in FIG. 83K may be formed to act as the acceptor wafer landing strips for a repeat of the above process flow to stack another preprocessed thin mono-crystalline layer of transistors.

Persons of ordinary skill in the art will appreciate that the illustrations in FIGS. 83A through 83K are exemplary only and are not drawn to scale. Such skilled persons will further appreciate that many variations may be possible such as, for example, the transistor layers on each side of box 8301 may comprise full CMOS, or one side may be CMOS and the other n-type MOSFET transistors, logic cells, or other combinations and types of semiconductor devices. Moreover, SOI wafers with etchback of the bulk silicon to the buried oxide layer may be utilized in place of an ion-cut layer transfer scheme. Many other modifications within the scope of the illustrated embodiments of the invention will suggest themselves to such skilled persons after reading this specification. Thus the invention is to be limited only by the appended claims.

Figure 83L:
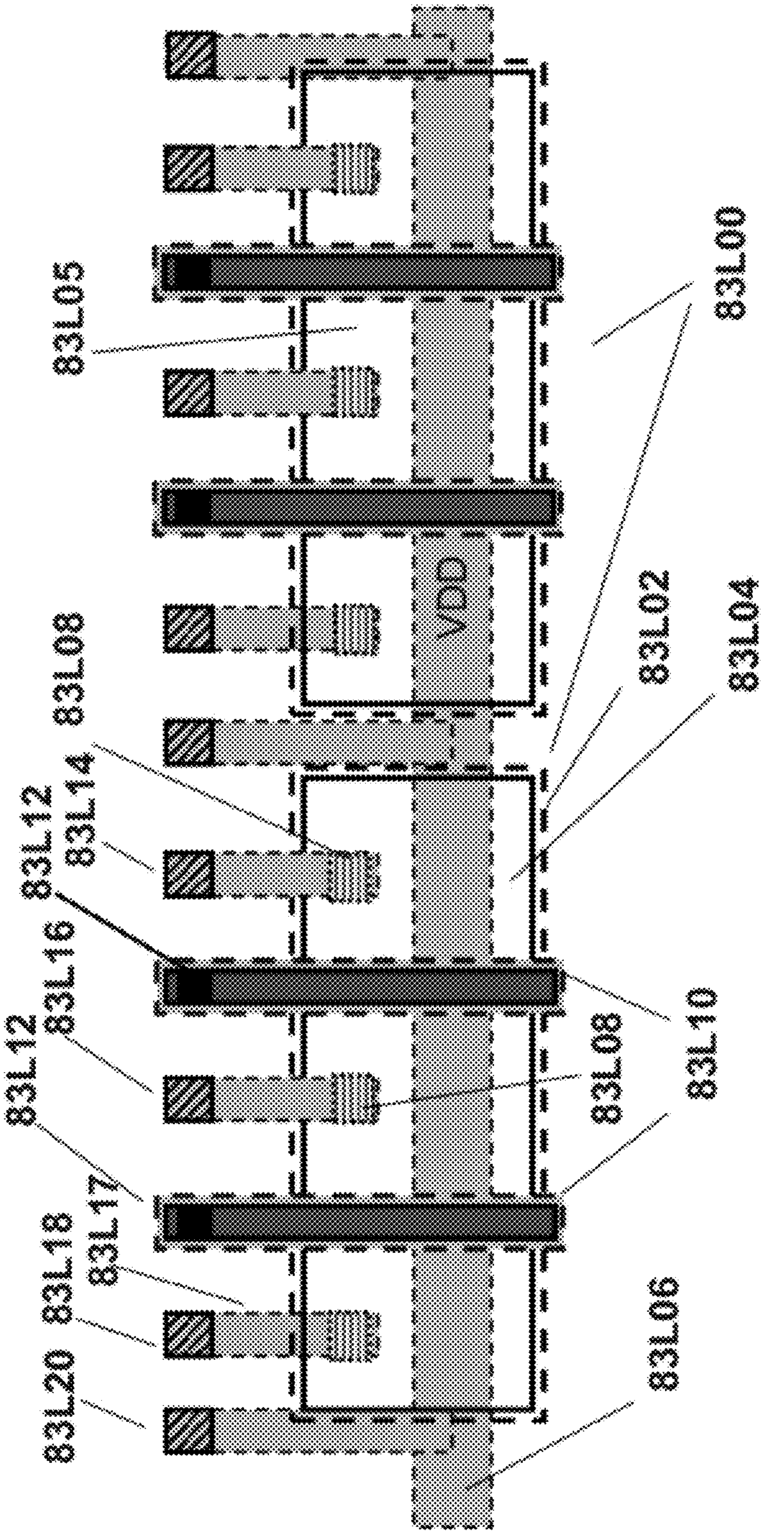

FIG. 83L is a top view drawing illustration of a repeating generic cell 83L00 as a building block for forming gate array, of two NMOS transistors 83L04 with shared diffusion 83L05 overlaying 'face down' two PMOS transistors 83L02 with shared diffusion. The NMOS transistors gates may overlay the PMOS transistors gates 83L10 and the overlayed gates may be connected to each other by via 83L12. The Vdd power line 83L06 could run as part of the face down generic structure with connection to the upper layer using vias 83L20. The diffusion connection 83L08 may be using the face down metal generic structure 83L17 and brought up by vias 83L14, 83L16, 83L18.

FIG. 83L1 is a drawing illustration of the generic cell 83L00 which may be customized by custom NMOS transistor contacts 83L22, 83L24 and custom metal 83L26 to form a double inverter. The Vss power line 83L25 may run on top of the NMOS transistors.

FIG. 83L2 is a drawing illustration of the generic cell 83L00 which may be customized to a NOR function, FIG. 83L3 is a drawing illustration of the generic cell 83L00 which may be customized to a NAND function and FIG. 83L4 is a drawing illustration of the generic cell 83L00 which may be customized to a multiplexer function. Accordingly generic cell 83L00 could be customized to substantially provide the logic functions, such as, for example, NAND and NOR functions, so a generic gate array using array of generic cells 83L00 could be customized with custom contacts vias and metal layers to any logic function. Thus, the NMOS, or n-type, transistors may be formed on one layer and the PMOS, or p-type, transistors may be formed on another layer, and connection paths may be formed between the n-type and p-type transistors to create Complementary Metal-Oxide-Semiconductor (CMOS) logic cells. Additionally, the n-type and p-type transistors layers may reside on the first, second, third, or any other of a number of layers in the 3D structure, substantially overlaying the other layer, and any other previously constructed layer.

Another alternative, with reference to FIG. 70 and description, is illustrated in FIG. 70B-1 whereby the implant of an atomic species 7010, such as, for example, H+, may be screened from the sensitive gate areas 7003 by first masking and etching a shield implant stopping layer of a dense material 7050, for example 5000 angstroms of Tantalum, and may be combined with 5,000 angstroms of photoresist 7052. This implant may create a segmented cleave plane 7012 in the bulk of the donor wafer silicon wafer and additional polishing may be applied to provide a smooth bonding surface for layer transfer suitability.

Additional alternatives to the use of an SOI donor wafer may be employed to isolate transistors in the vertical direction. For example, a pn junction may be formed between the vertically stacked transistors and may be biased. Also, oxygen ions may be implanted between the vertically stacked transistors and annealed to form a buried oxide layer. Also, a silicon-on-replacement-insulator technique may be utilized for the first formed dummy transistors wherein a buried SiGe layer may be selectively etched out and refilled with oxide, thereby creating islands of electrically isolated silicon.

Figures 150A, 150B, 150C:
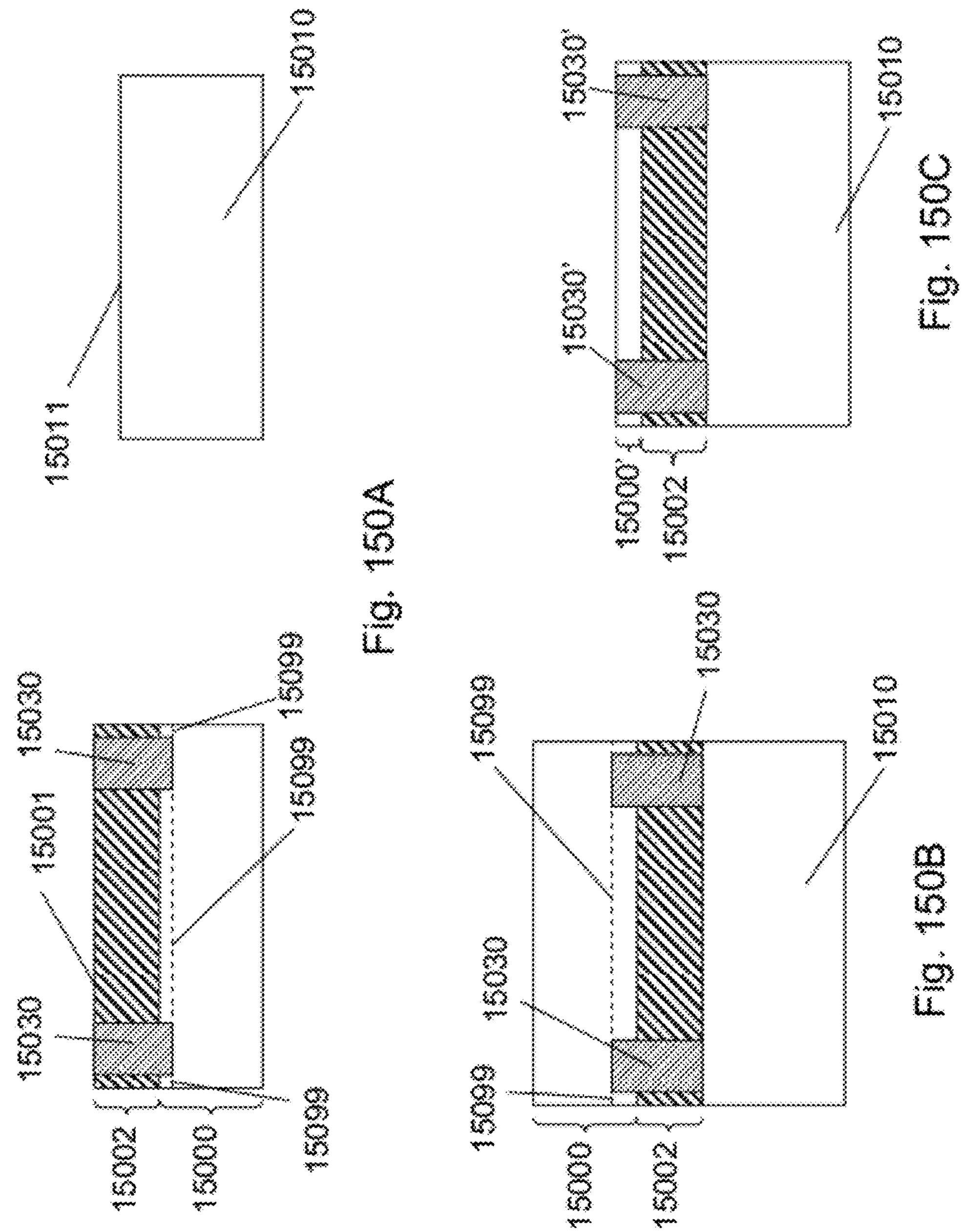

An additional alternative to the use of an SOI donor wafer or the use of ion-cut methods to enable a layer transfer of a well-controlled thin layer of pre-processed layer or layers of semiconductor material, devices, or transistors to the acceptor wafer or substrate is illustrated in FIGS. 150A to 150C. An additional embodiment of the invention may be to form and utilize layer transfer demarcation plugs to provide an etchback stop or marker for the controlled thinning of the donor wafer. An additional embodiment of the invention may be to form and utilize layer transfer demarcation plugs to provide shear strength stability during and after layer transfer of thinned layers.

As illustrated in FIG. 150A, a generalized process flow may begin with a donor wafer 15000 that may be preprocessed with layers 15002 which may include, for example, conducting, semi-conducting or insulating materials that may be formed by deposition, ion implantation and anneal, oxidation, epitaxial growth, combinations of above, or other semiconductor processing steps and methods. Additionally, donor wafer 15000 may be a fully formed CMOS or other device type wafer, wherein layers 15002 may include, for example, transistors and metal interconnect layers. Donor wafer 15000 may be a partially processed CMOS or other device type wafer, wherein layers 15002 may include, for example, transistors and an interlayer dielectric deposited that may be processed just prior to the first contact lithographic step. Layer transfer demarcation plugs (LTDPs) 15030 may be lithographically defined and then plasma/RIE etched to a depth (shown) of approximately the layer transfer demarcation plane 15099. The LTDPs 15030 may also be etched to a depth past the layer transfer demarcation plane 15099 and further into the donor wafer 15000 or to a depth that is shallower than the layer transfer demarcation plane 15099. The LTDPs 15030 may be filled with an etch-stop material, such as, for example, silicon dioxide, tungsten, heavily doped P+ silicon or polycrystalline silicon, copper, or a combination of etch-stop materials, and planarized with a process such as, for example, chemical mechanical polishing (CMP) or RIE/plasma etching. Donor wafer 15000 may be further thinned by CMP. The placement on donor wafer 15000 of the LTDPs 15030 may include, for example, in the scribelines, white spaces in the preformed circuits, or any pattern and density for use as electrical or thermal coupling between donor and acceptor layers. The term white spaces may be understood as areas on an integrated circuit wherein the density of structures above the silicon layer may be small enough, allowing other structures, such as LTDPs, to be placed with minimal impact to the existing structure's layout position and organization. The size of the LTDPs 15030 formed on donor wafer 15000 may include, for example, diameters of the state of the art process via or contact, or may be larger or smaller than the state of the art. LTDPs 15030 may be processed before or after layers 15002 are formed. Further processing to complete the devices and interconnection of layers 15002 on donor wafer 15000 may take place after the LTDPs 15030 are formed. Acceptor wafer 15010 may be a preprocessed wafer that has fully functional circuitry or may be a wafer with previously transferred layers, or may be a blank carrier or holder wafer, or other kinds of substrates and may be called a target wafer. The acceptor wafer 15010 and the donor wafer 15000 may be, for example, a bulk mono-crystalline silicon wafer or a Silicon On Insulator (SOI) wafer or a Germanium on Insulator (GeOI) wafer. Acceptor wafer 15010 may have metal connect pads and acceptor wafer alignment marks as described previously for acceptor wafers with reference to FIG. 8.

Both the donor wafer 15000 and the acceptor wafer 15010 bonding surfaces 15001 and 15011 may be prepared for wafer bonding by depositions, polishes, plasma, or wet chemistry treatments to facilitate successful wafer to wafer bonding.

As illustrated in FIG. 150B, the donor wafer 15000 with layers 15002, LTDPs 15030, and layer transfer demarcation plane 15099 may then be flipped over, aligned and bonded to the acceptor wafer 15010 as previously described.

As illustrated in FIG. 150C, the donor wafer 15000 may be thinned to approximately the layer transfer demarcation plane 15099, leaving a portion of the donor wafer 15000', LTDPs 15030' and the pre-processed layers 15002 aligned and bonded to the acceptor wafer 15010. The donor wafer 15000 may be controllably thinned to the layer transfer demarcation plane 15099 by utilizing the LTDPs 15030 as etch stops or etch stopping indicators. For example, the LTDPs 15030 may be substantially composed of heavily doped P+ silicon. The thinning process, such as CMP with pressure force or optical detection, wet etch with optical detection, plasma etching with optical detection, or mist/spray etching with optical detection, may incorporate a selective etch chemistry, such as, for example, etching agents that etch n− Si or p− Si but do not attack p+ Si doped above 1E20/cm$^3$ include KOH, EDP (ethylenediamine/pyrocatechol/water) and hydrazine, that etches lightly doped silicon quickly but has a very slow etch rate of heavily doped P+ silicon, and may sense the exposed and un-etched LTDPs 15030 as a pad pressure force change or optical detection of the exposed and un-etched LTDPs, and may stop the etch-back processing.

Additionally, for example, the LTDPs 15030 may be substantially composed of a physically dense and hard material, such as, for example, tungsten or diamond-like carbon (DLC). The thinning process, such as CMP with pressure force detection, may sense the hard material of the LTDPs 15030 by force pressure changes as the LTDPs 15030 are exposed during the etch-back or thinning processing and may stop the etch-back processing. Additionally, for example, the LTDPs 15030 may be substantially composed of an optically reflective or absorptive material, such as, for example, aluminum, copper, polymers, tungsten, or diamond like carbon (DLC). The thinning process, such as CMP with optical detection, wet etch with optical detection, plasma etch with optical detection, or mist/spray etching with optical detection, may sense the material in the LTDPs 15030 by optical detection of color, reflectivity, or wavelength absorption changes as the LTDPs 15030 may be exposed during the etch-back or thinning processing and may stop the etch-back processing. Additionally, for example, the LTDPs 15030 may be substantially composed of chemically detectable material, such as silicon oxide, polymers, soft metals such as copper or aluminum. The thinning process, such as CMP with chemical detection, wet etch with chemical detection, RIE/Plasma etching with chemical detection, or mist/spray etching with chemical detection, may sense the dissolution of the LTDPs 15030 material by chemical detection means as the LTDPs 15030 are exposed during the etch-back or thinning processing and may stop the etch-back processing. The chemical detection methods may include, for example, time of flight mass spectrometry, liquid ion chromatography, or spectroscopic methods such as infra-red, ultraviolet/visible, or Raman. The thinned surface may be smoothed or further thinned by processes described in this various embodiments of the invention document. The LTDPs 15030 may be replaced, partially or completely, with a conductive material, such as, for example, copper, aluminum, or tungsten, and may be utilized as donor layer to acceptor wafer interconnect.

Persons of ordinary skill in the art will appreciate that the illustrations in FIGS. 150A to 150C are exemplary only and are not drawn to scale. Such skilled persons will further appreciate that many variations may be possible such as, for example, the LTDP methods outlined may be applied to a variety of layer transfer and 3DIC process flows, including, for example, FIGS. 70, 81, 82, 83, 85 in this application. Moreover, the LTDPs 15030 may not only be utilized as donor wafer layers to acceptor wafer layers electrical interconnect, but may also be utilized as heat conducting paths as a portion of a heat removal system for the 3DIC. Further, this LTDP methodology may also be utilized in concert with the precision alignment technique described in relation to FIG. 111 wherein oxide filled plugs are utilized of large (for alignment) and small (for interconnect) during layer transfer alignment and bonding processes, and then the oxide may be removed from the LTDPs and the LTDPs may then be filled with conductive material for layer to layer interconnect electrical or thermal interconnect. Such skilled persons will further appreciate that the layer transfer demarcation plane 15099 and associated etch depth of the LTDPs 15030 may lie within the layers 15002, at the transition between layers 15002 and donor wafer 15000, or in the donor wafer 15000. (shown). Many other modifications within the scope of the illustrated embodiments of the invention will suggest themselves to such skilled persons after reading this specification. Thus the invention is to be limited only by the appended claims.

An alternative embodiment of the above process flow with reference to FIG. 70 is illustrated in FIGS. 81A to 81F and may provide a face down CMOS planar transistor layer on top of a preprocessed House substrate. The CMOS planar transistors may be fabricated with dummy gates and the cleave plane 7012 may be created in the donor wafer as described previously and illustrated in FIGS. 70A and 70B. Then the dummy gates may be replaced as described previously and illustrated in FIG. 81A.

The contact and metallization steps may be performed as illustrated in FIG. 81B to allow future connections to the transistors once they are face down.

The face 8102 of donor wafer 8100 may be prepared for bonding by deposition of an oxide 8104, and plasma or other surface treatments to prepare the oxide surface 8106 for wafer-to-wafer oxide-to-oxide bonding as illustrated in FIG. 81C.

Similar surface preparation may be performed on the 808 acceptor wafer in preparation for the oxide-to-oxide bonding. Now a low temperature (e.g., less than about 400° C.) layer transfer flow may be performed, as illustrated in FIG. 81D, to transfer the prepared donor wafer 8100 with oxide surface 8106 to the acceptor wafer 808. Acceptor wafer 808 may be preprocessed with transistor circuitry and metal interconnect layers and may have a top metallization layer or layers that may include metal landing strips 8124 to act as landing pads for connection between the circuits formed on the transferred layer with the underlying circuit layers in house 808. For FIGS. 81D to 81F, an additional STI (shallow trench isolation) isolation 8130 without via 7040 may be added to the illustration.

The donor wafer 8100 may then be cleaved at the cleave plane 7012 and may be thinned by chemical mechanical polishing (CMP) so that the transistor isolations 7002 and 8130 may be exposed as illustrated in FIG. 81E. Alternatively, the CMP could continue to the bottom of the junctions to create a fully depleted SOI layer.

As illustrated in FIG. 81F, a low-temperature oxide or low-k dielectric 8136 may be deposited and planarized. The through via 8128 to house 808 acceptor wafer landing strip 8124 and contact 8140 to through via 7040 may be etched, metalized, and connected by metal line 8150 to provide electrical connection from the donor wafer transistors to the acceptor wafer. The length of landing strips 8124 may be at least the repeat width W plus margin per the proper via design rules as shown in FIGS. 32 and 33A. The landing zone strip extension for proper via design rules may include angular misalignment of the wafer-to-wafer bonding that is not compensated for by the stepper overlay algorithms, and may include uncompensated donor wafer bow and warp.

The face down flow has some advantages such as, for example, enabling double gate transistors, back biased transistors, or access to the floating body in memory applications. For example, a back gate for a double gate transistor may be constructed as illustrated in FIG. 81E-1. A low temperature gate oxide 8160 with gate material 8162 may be grown or deposited and defined by lithographic and etch processes as described previously.

The metal hookup may be constructed as illustrated in FIG. 81F-1.

As illustrated in FIG. 81F-2, fully depleted SOI transistors with junctions 8170 and 8171 may be alternatively constructed in this flow as described in respect to CMP thinning illustrated in FIG. 81E.

An alternative embodiment of the above double gate process flow that may provide a back gate in a face-up flow is illustrated in FIGS. 85A to 85E with reference to FIG. 70. The CMOS planar transistors may be fabricated with the dummy gates and the cleave plane 7012 may be created in the donor wafer, bulk or SOI, as described and illustrated in FIGS. 70A and 70B. The donor wafer may be attached either permanently or temporarily to the carrier substrate as described and illustrated in FIG. 70C and then cleaved and thinned to the STI transistor isolations 7002 as shown in FIG. 70D. Alternatively, the CMP could continue to the bottom of the junctions to create a fully depleted SOI layer.

Figure 85A:
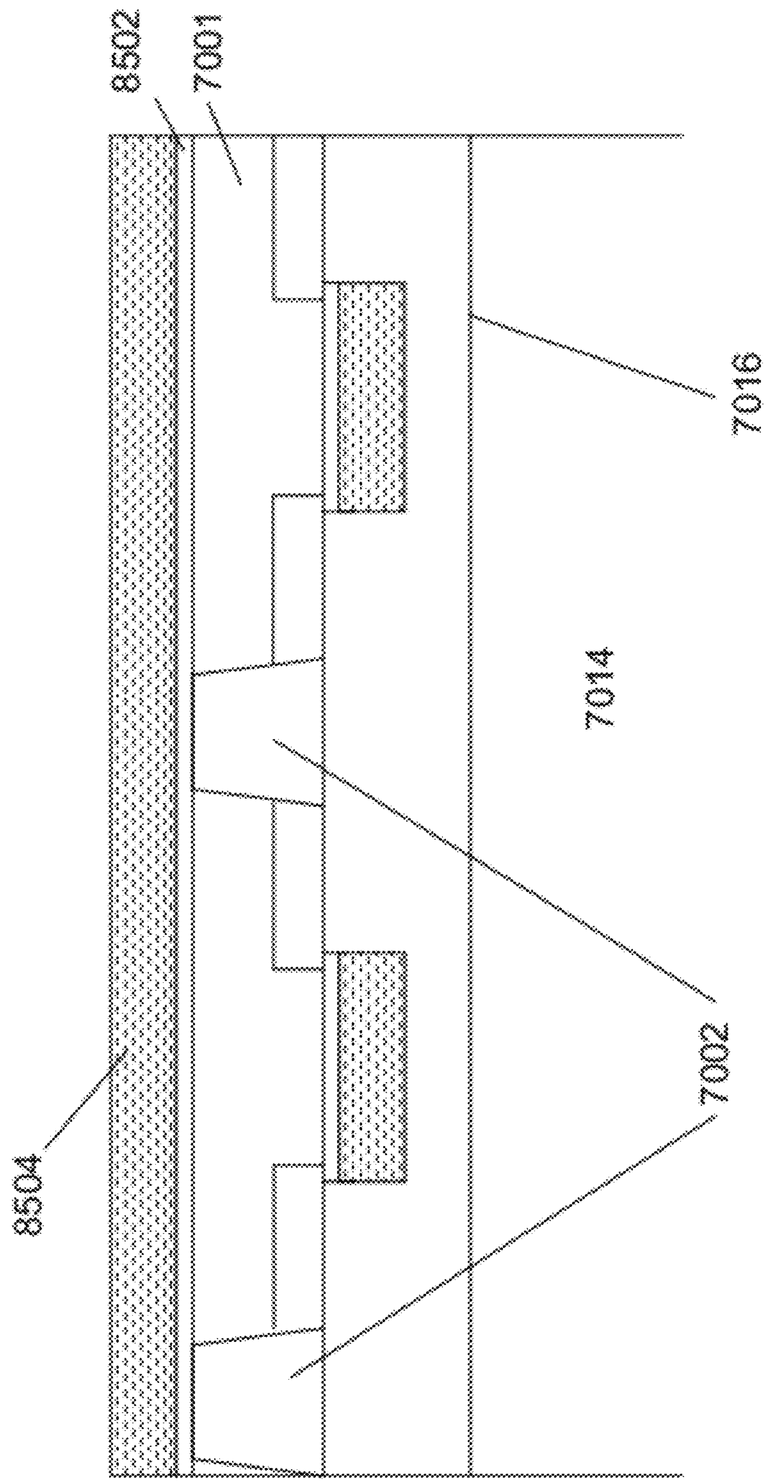
FIG. 85 A-E are exemplary drawing illustrations of formation of top planar transistors.

A second gate oxide 8502 may be grown or deposited as illustrated in FIG. 85A and a gate material 8504 may be deposited. The gate oxide 8502 and gate material 8504 may be formed with low temperature (e.g., less than about 400° C.) materials and processing, such as previously described TEL SPA gate oxide and amorphous silicon, ALD techniques, or hi-k metal gate stack (HKMG), or may be formed with a higher temperature gate oxide or oxynitride and doped polysilicon if the carrier substrate bond is permanent and the existing planar transistor dopant movement is accounted for.

Figure 85B:
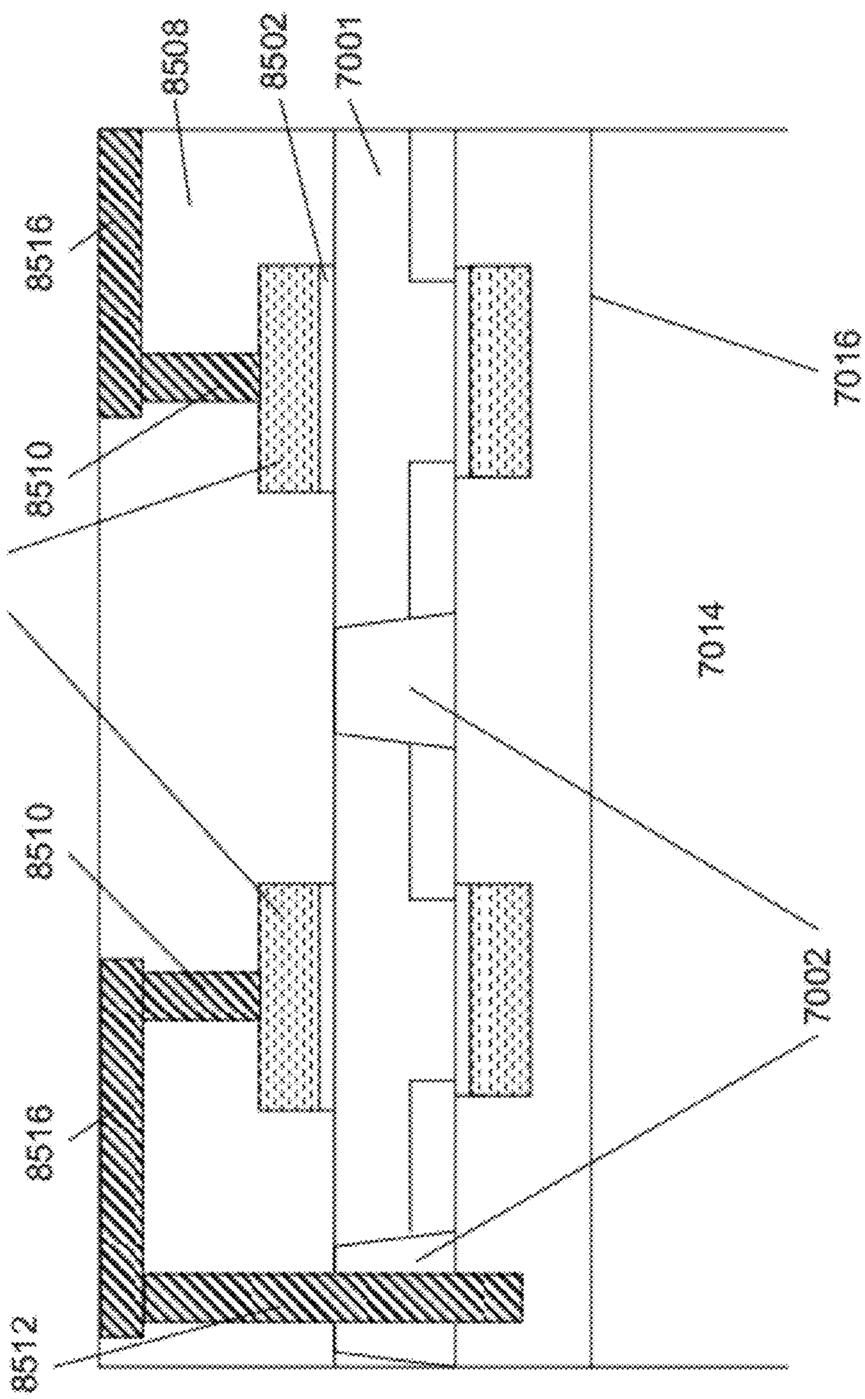

The gate stack 8506 may be defined, a dielectric 8508 may be deposited and planarized, and then local contacts 8510 and layer to layer contacts 8512 and metallization, such as metal line 8516, may be formed as illustrated in FIG. 85B.

Figure 85C:
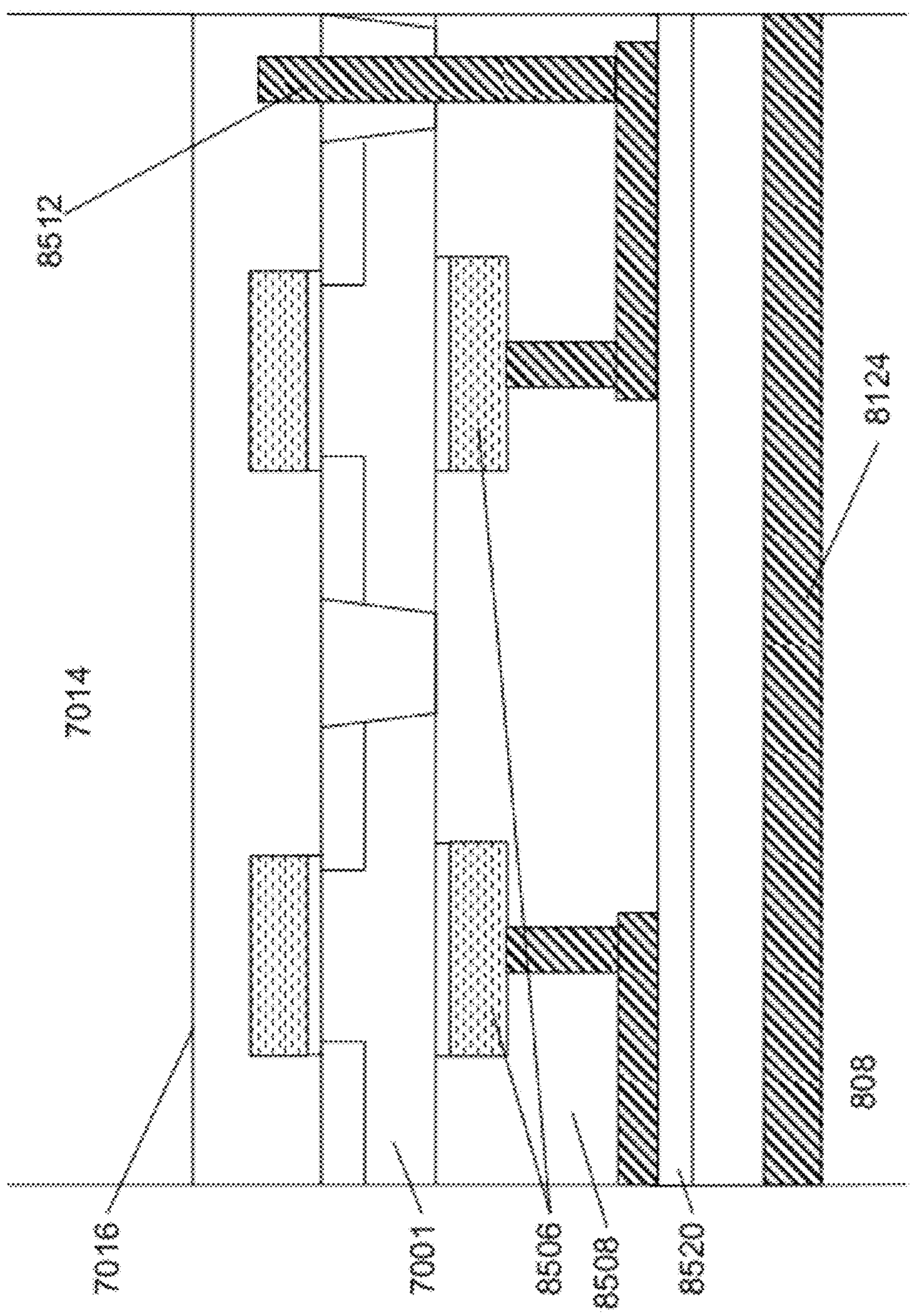

As shown in FIG. 85C, the thin mono-crystalline donor and carrier substrate stack may be prepared for layer transfer by methods previously described including oxide layer 8520. Similar surface preparation may be performed on house 808 acceptor wafer in preparation for oxide-to-oxide bonding. Now a low temperature (e.g., less than about 400° C.) layer transfer flow may be performed, as illustrated in FIG. 85C, to transfer the thinned and first-phase-transistor-formation-preprocessed HKMG transistor silicon layer 7001 and back-gate gate stacks 8506 with attached carrier substrate 7014 to the acceptor wafer 808. The acceptor wafer 808 may have a top metallization including metal landing strips 8124 to act as landing pads for connection between the circuits formed on the transferred layer with the underlying circuit layers 808.

Figure 85D:
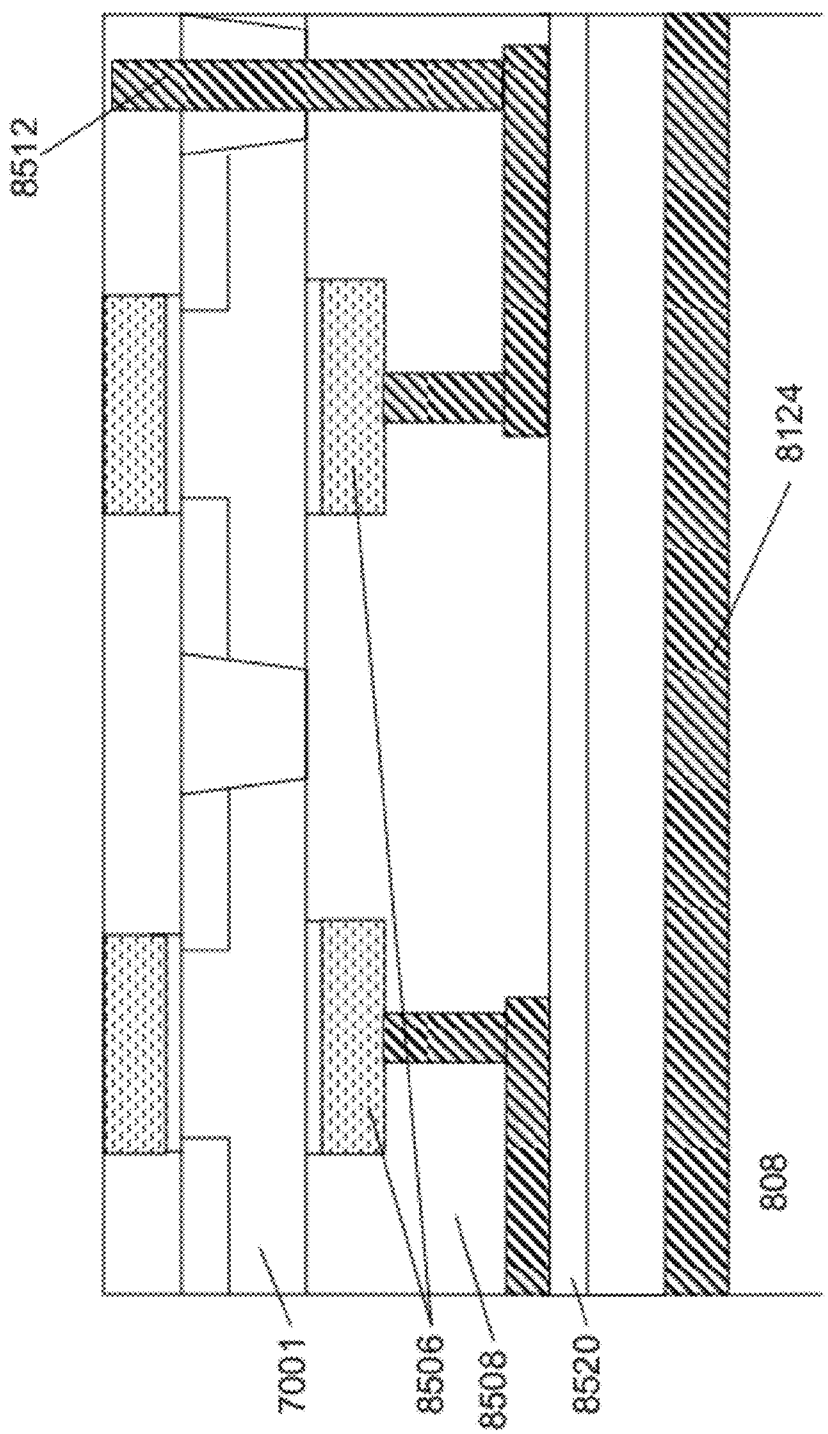

As illustrated in FIG. 85D, the carrier substrate 7014 may then be released at interface 7016 as previously described.

Figure 85E:
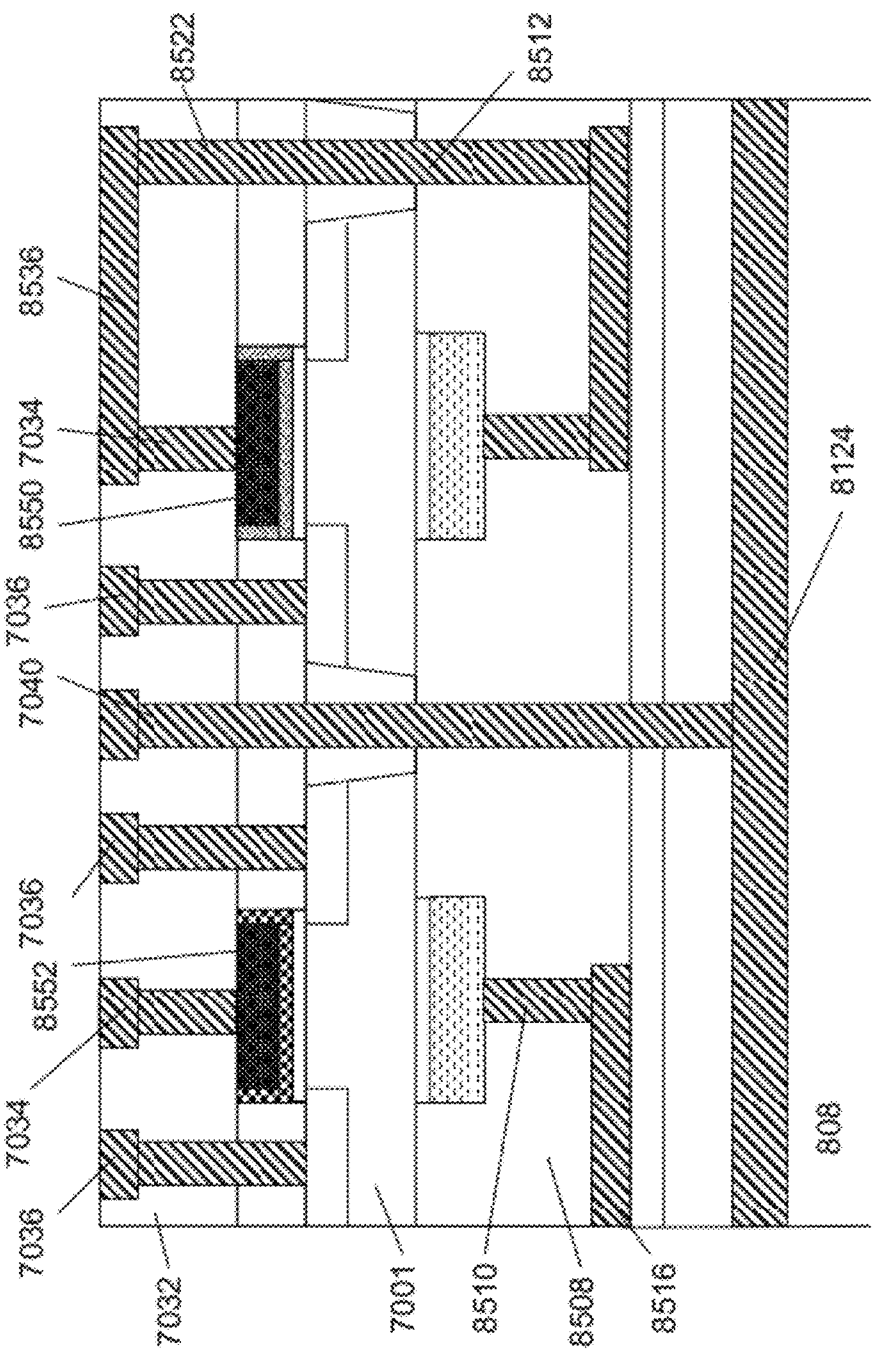

The bonded combination of acceptor wafer 808 and HKMG transistor silicon layer 7001 may now be ready for normal state of the art gate-last transistor formation completion as illustrated in FIG. 85E and connection to the acceptor wafer House 808 through layer to layer via 7040. The top transistor 8550 may be back gated by connecting the top gate to the bottom gate through gate contact 7034 to metal line 8536 and to contact 8522 to connect to the donor wafer layer through layer contact 8512. The top transistor 8552 may be back biased by connecting metal line 8516 to a back bias circuit that may be in the top transistor level or in the House 808. Moreover, an alternative layer transfer method may be utilized, such as, for example, SOI wafers with etchback of the bulk silicon to the buried oxide layer, in place of an ion-cut layer transfer scheme.

The present invention may overcome the challenge of forming these planar transistors aligned to the underlying layers 808 as described in association with FIGS. 71 to 79 and FIGS. 30 to 33. The general flow may be applied to the transistor constructions described before as relating to FIGS. 70 A-H. In one embodiment, the donor wafer 3000 may be pre-processed to build not just one transistor type but both types by comprising alternating parallel rows that are the die width plus maximum donor wafer to acceptor wafer misalignment in length. Alternatively, the rows may be made wafer long for the first phase of transistor formation of 'n' type 3004 and 'p' type 3006 transistors as illustrated in FIG. 30. FIG. 30 may also include a four cardinal directions 3040 indicator, which will be used through FIGS. 71 to 78. As shown in the blown up projection 3002, the width of the n-type rows 3004 is Wn and the width of the p-type rows 3006 is Wp and their sum W 3008 is the width of the repeating pattern. The rows traverse from East to West and the alternating pattern repeats substantially all the way across the wafer from North to South. Wn and Wp may be set for the minimum width of the corresponding transistor, n-type transistor and p-type transistor respectively, plus its isolation in the selected process node. The donor wafer 3000 may also have an alignment mark 3020 on the same layers of the donor wafer as the n 3004 and p 3006 rows and accordingly may be used later to properly align additional patterning and processing steps to the n 3004 and p 3006 rows.

Figure 71:
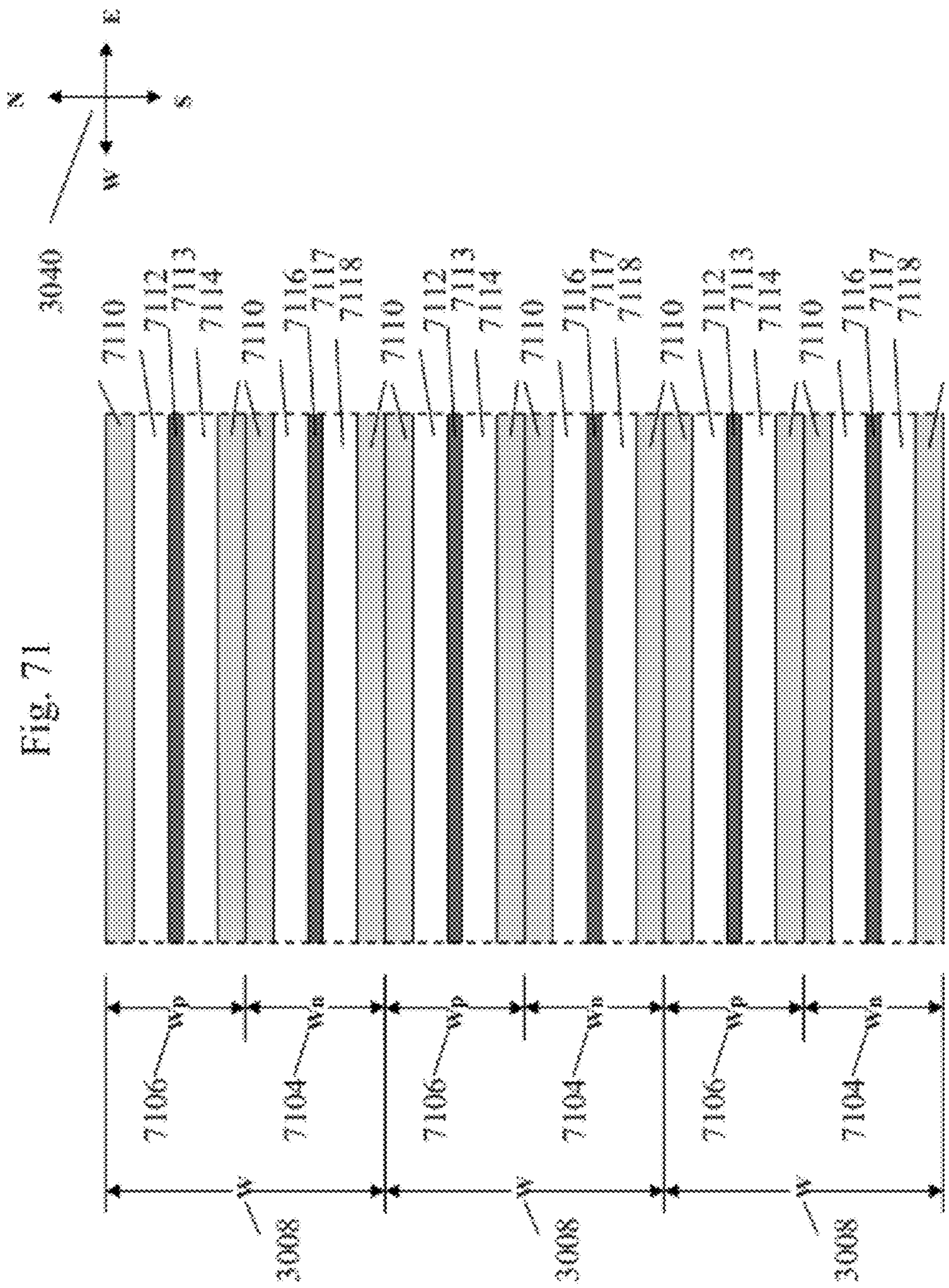
FIG. 71 is an exemplary drawing illustration of a layout for a donor wafer.

As illustrated in FIG. 71, the width of the p type transistor row width repeat Wp 7106 may include two transistor isolations 7110 of width 2 F each, plus a transistor source 7112 of width 2.5 F, a PMOS gate 7113 of width F, and a transistor drain 7114 of width 2.5 F. The total Wp may be 10 F, where F may be 2 times lambda, the minimum design rule. The width of the n type transistor row width repeat Wn 7104 may include two transistor isolations 7110 of width 2 F each, plus a transistor source 7116 of width 2.5 F, a NMOS gate 7117 of width F, and a transistor drain 7118 of width 2.5 F. The total Wn may be 10 F and the total repeat W 3008 may be 20 F.

The donor wafer transferred layer 3000L, now thinned and the first-phase-transistor-formation pre-processed HKMG transistor silicon layer 7001 with the attached carrier substrate 7014 completed as described previously in relation to FIG. 70E, may be placed on top of the acceptor wafer 3100 as illustrated in FIG. 31. The state of the art alignment methods allow for very good angular alignment of this bonding step but it is difficult to achieve a better than approximately 1 micron position alignment. FIG. 31 illustrates the acceptor wafer 3100 with its corresponding alignment mark 3120 and the transferred layer 3000L of the donor wafer with its corresponding alignment mark 3020. The misalignment in the East-West direction is DX 3124 and the misalignment in the North-South direction is DY 3122. These alignment marks 3120 and 3020 may be placed in, for example, only a few locations on each wafer, or within each step field, or within each die, or within each repeat W. The alignment approach involving residue Rdy 3202 and the landing zone strips 33A04 and 33B04 as described previously in respect to FIGS. 32, 33A and 33B may be utilized to improve the density and reliability of the electrical connection from the transferred donor wafer layer to the acceptor wafer.

The low temperature post layer transfer process flow for the donor wafer layout with gates parallel to the source and drains as shown in FIG. 71 is illustrated in FIGS. 72A to 72F.

Figure 72A:
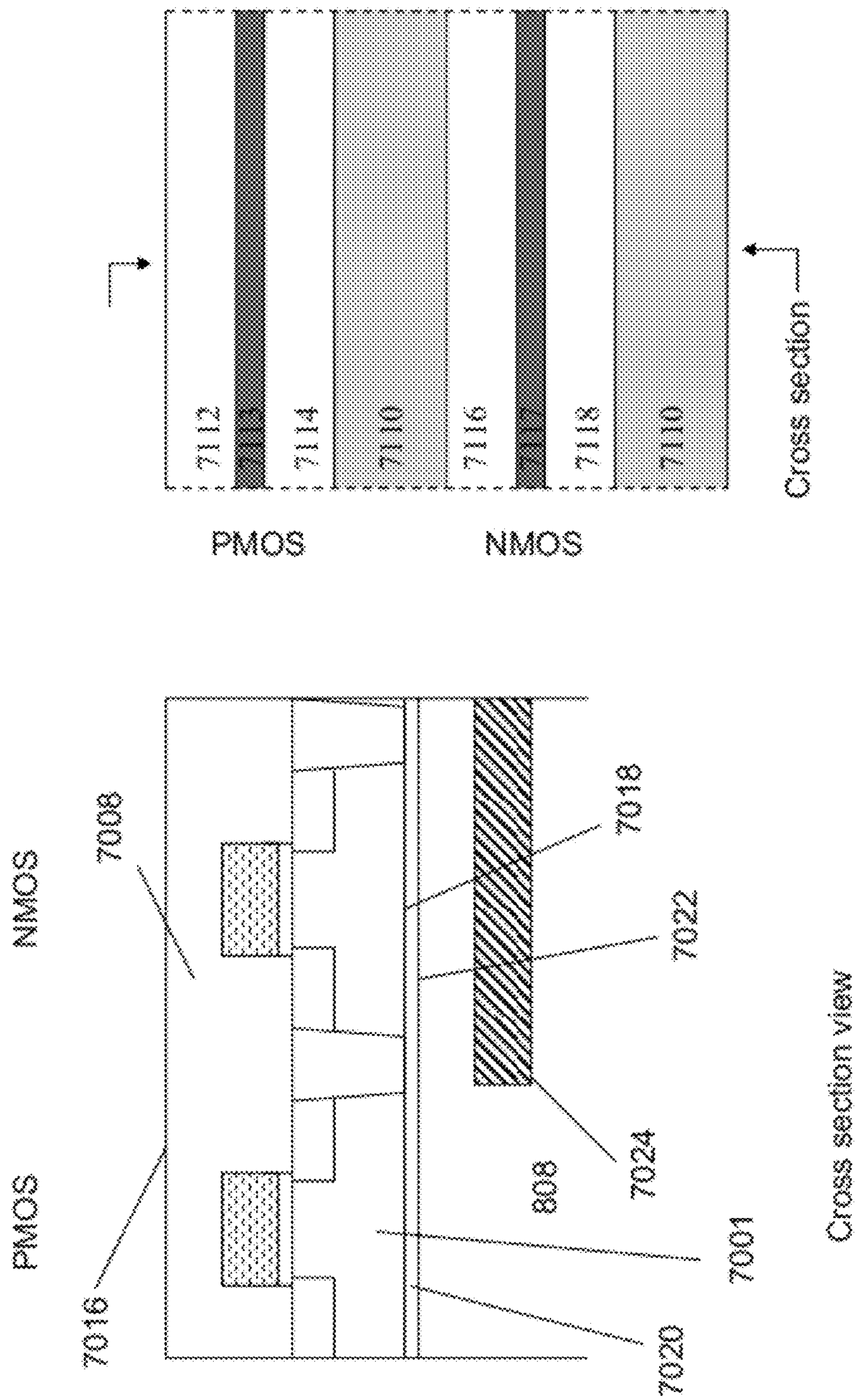
FIG. 72 A-F are exemplary drawing illustrations of formation of top planar transistors.

FIG. 72A illustrates the top view and cross-sectional view of the wafer after layer transfer of the first phase of transistor formation, layer transfer & bonding of the thin mono-crystalline preprocessed donor layer to the acceptor wafer, and release of the bonded structure from the carrier substrate, as previously described in FIG. 70, up to and including FIG. 70F.

Figure 72B:
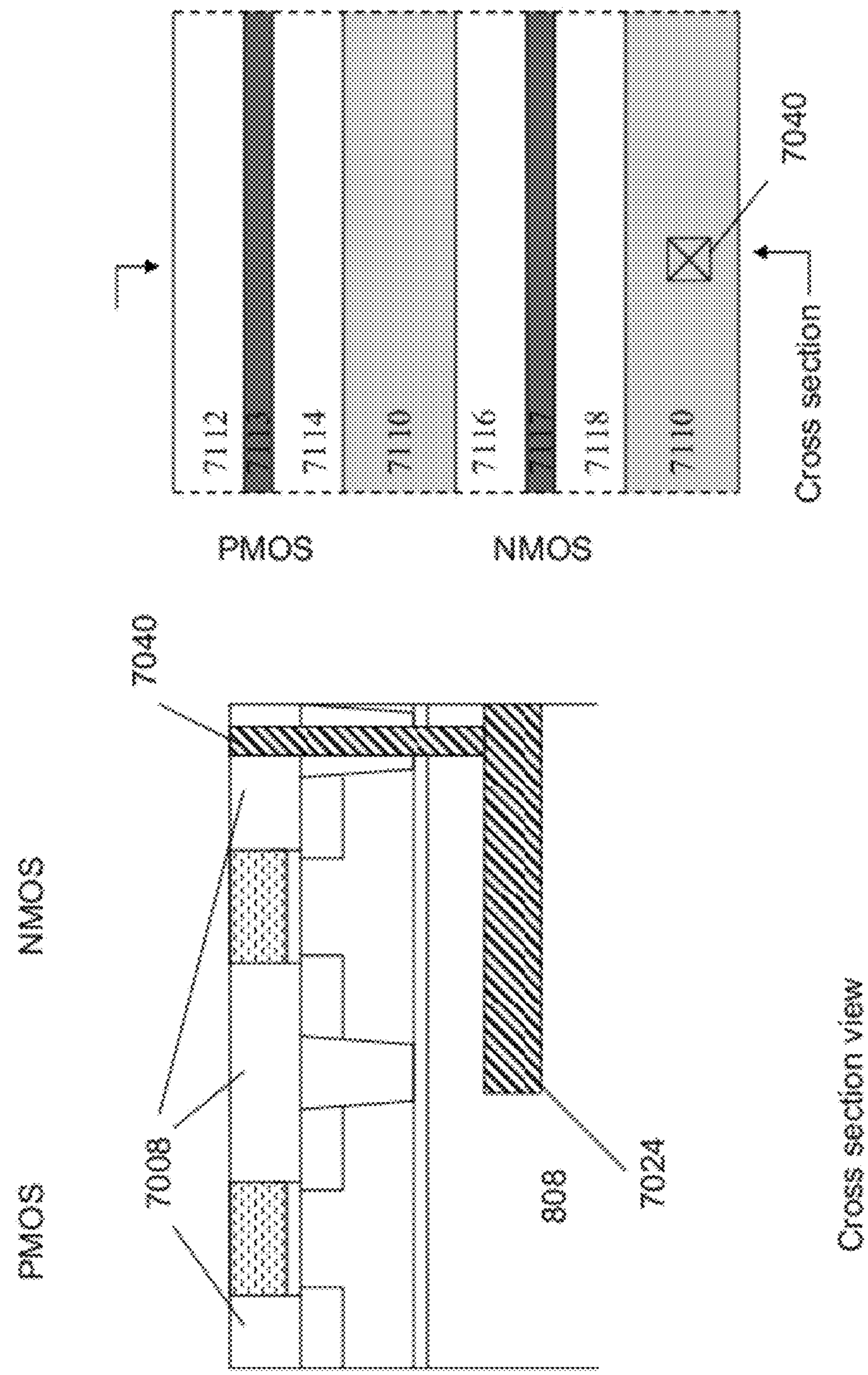

The interlayer dielectric (ILD) 7008 may be chemical mechanical polished (CMP'd) to expose the top of the dummy polysilicon and the layer-to-layer via 7040 may be etched, metal filled, and CMP'd flat as illustrated in FIG. 72B.

Figure 72C:
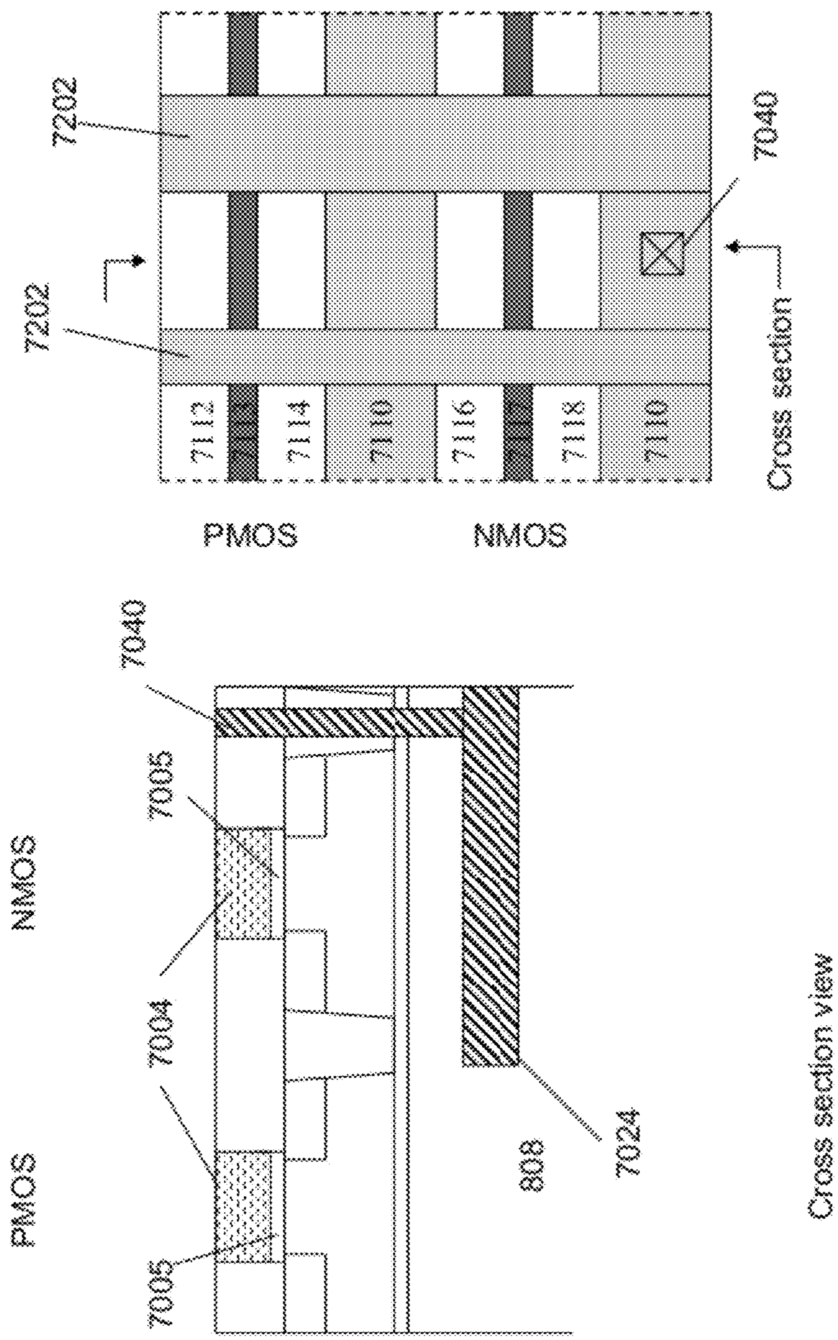

The long rows of pre-formed transistors may be etched into lengths or segments by forming isolation regions 7202 as illustrated in FIG. 72C. A low temperature oxidation may be performed to repair damage to the transistor edge and the isolation regions 7202 may be filled with a dielectric and CMP'd flat so to provide isolation between transistor segments.

Alternatively, isolation regions 7202 may be selectively opened and filled for the PMOS and NMOS transistors separately to provide compressive or tensile stress enhancement to the transistor channels for carrier mobility enhancement.

Figure 72D:
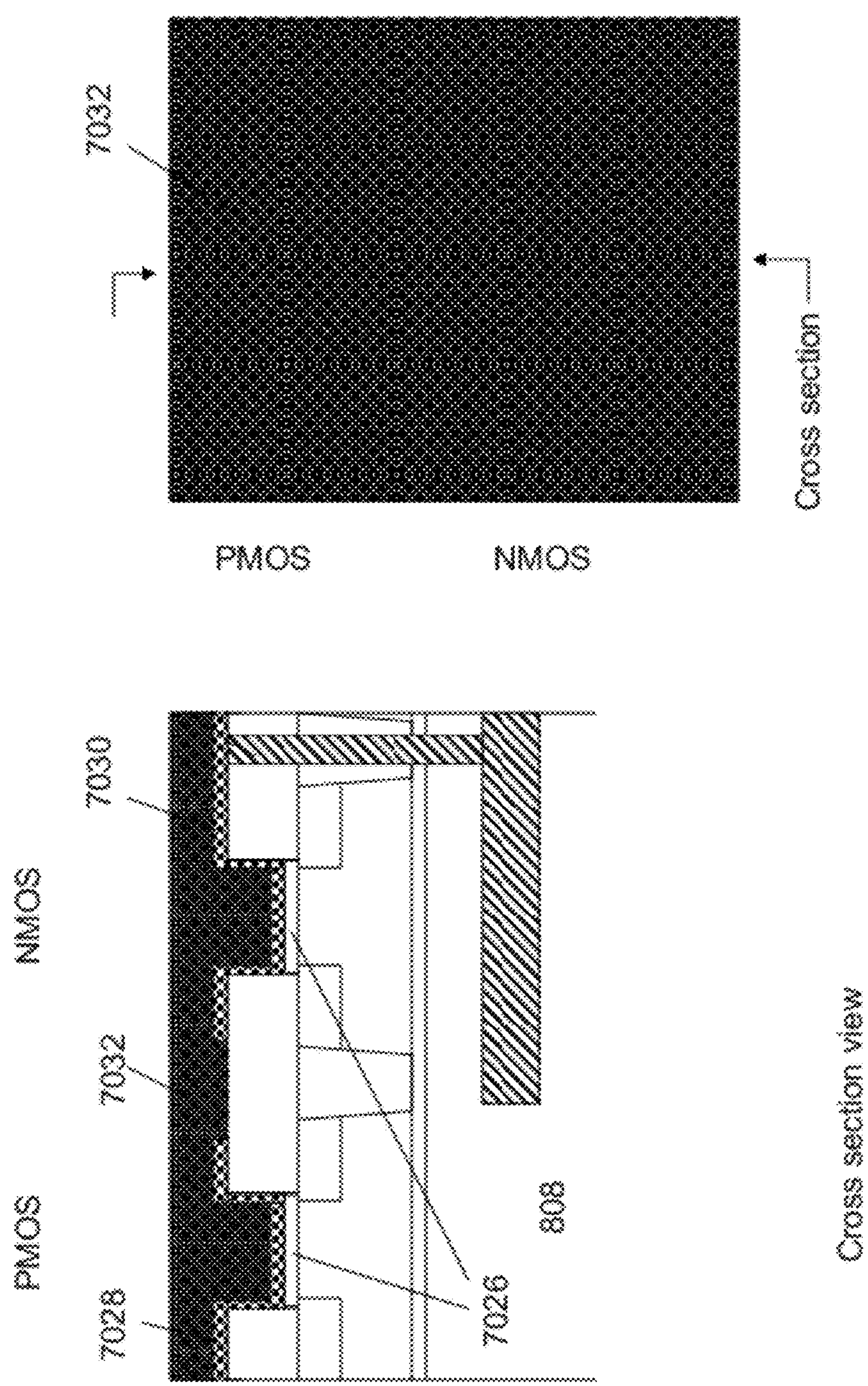

The polysilicon 7004 and gate oxide 7005 dummy gates may now be etched out to provide some gate overlap between the isolation regions 7202 edge and the normal replacement gate deposition of high-k gate dielectric 7026, PMOS metal gate 7028 and NMOS metal gate 7030. In addition, aluminum overfill 7032 may be performed. The CMP of aluminum overfill 7032 may be performed to planarize the surface for the gate definition as illustrated in FIG. 72D.

Figure 72E:
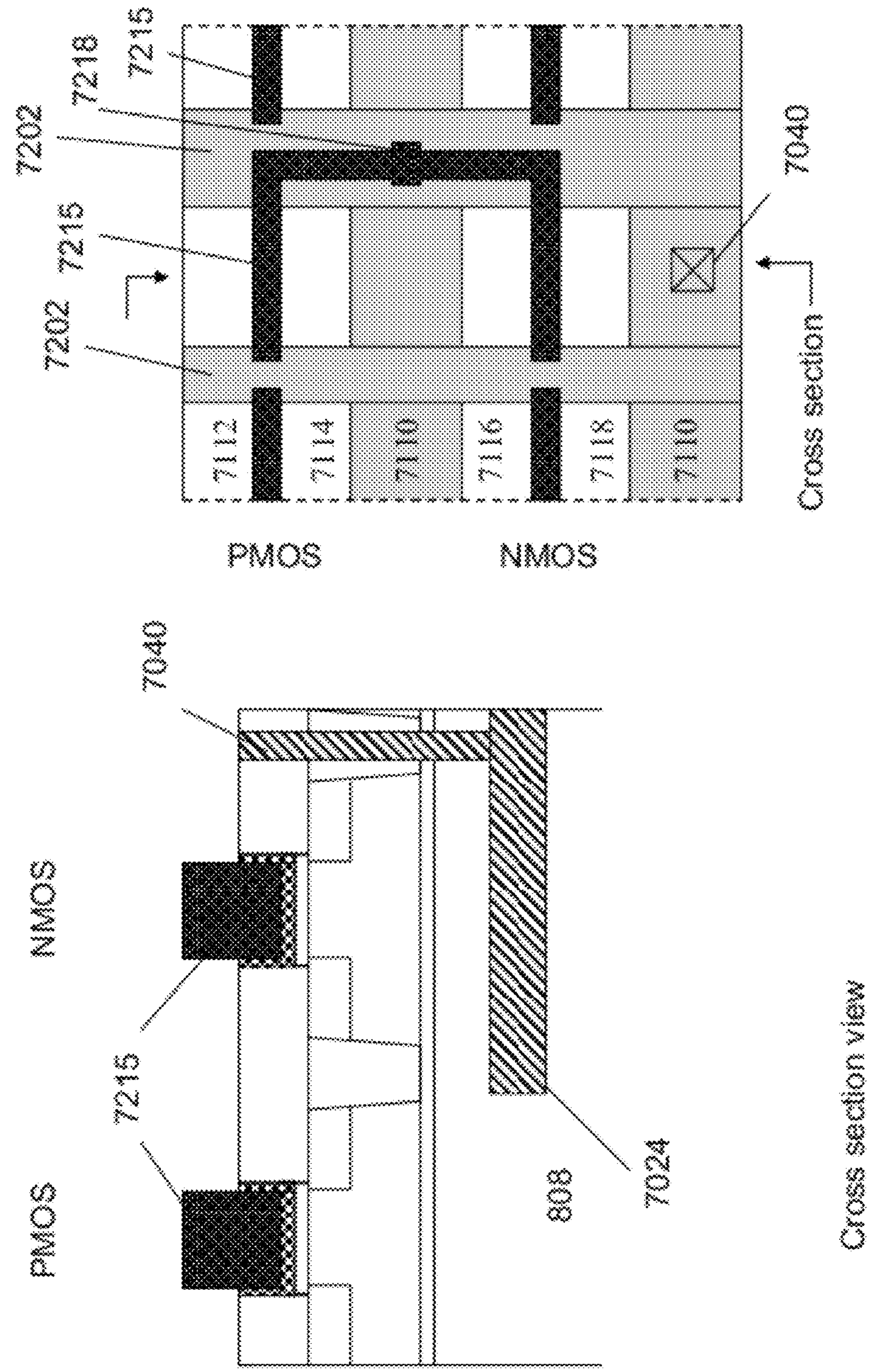

The replacement gates 7215 may be patterned and etched as illustrated in FIG. 72E and may provide a gate contact landing area 7218.

Figure 72F:
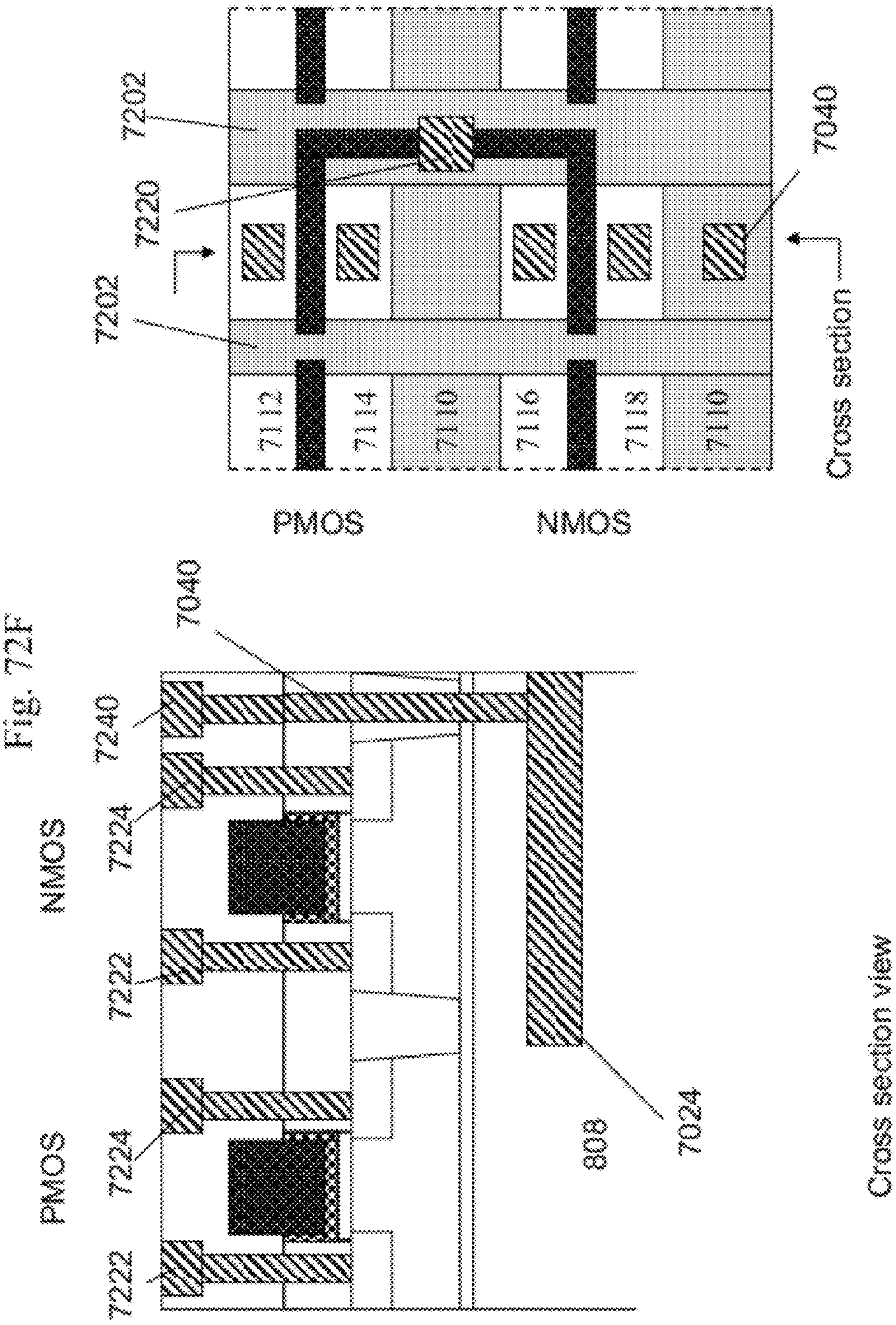

An interlayer dielectric may be deposited and planarized with CMP, and normal contact formation and metallization may be performed to make gate 7220, source 7222, drain 7224, and interlayer via 7240 connections as illustrated in FIG. 72F.

Figure 73:
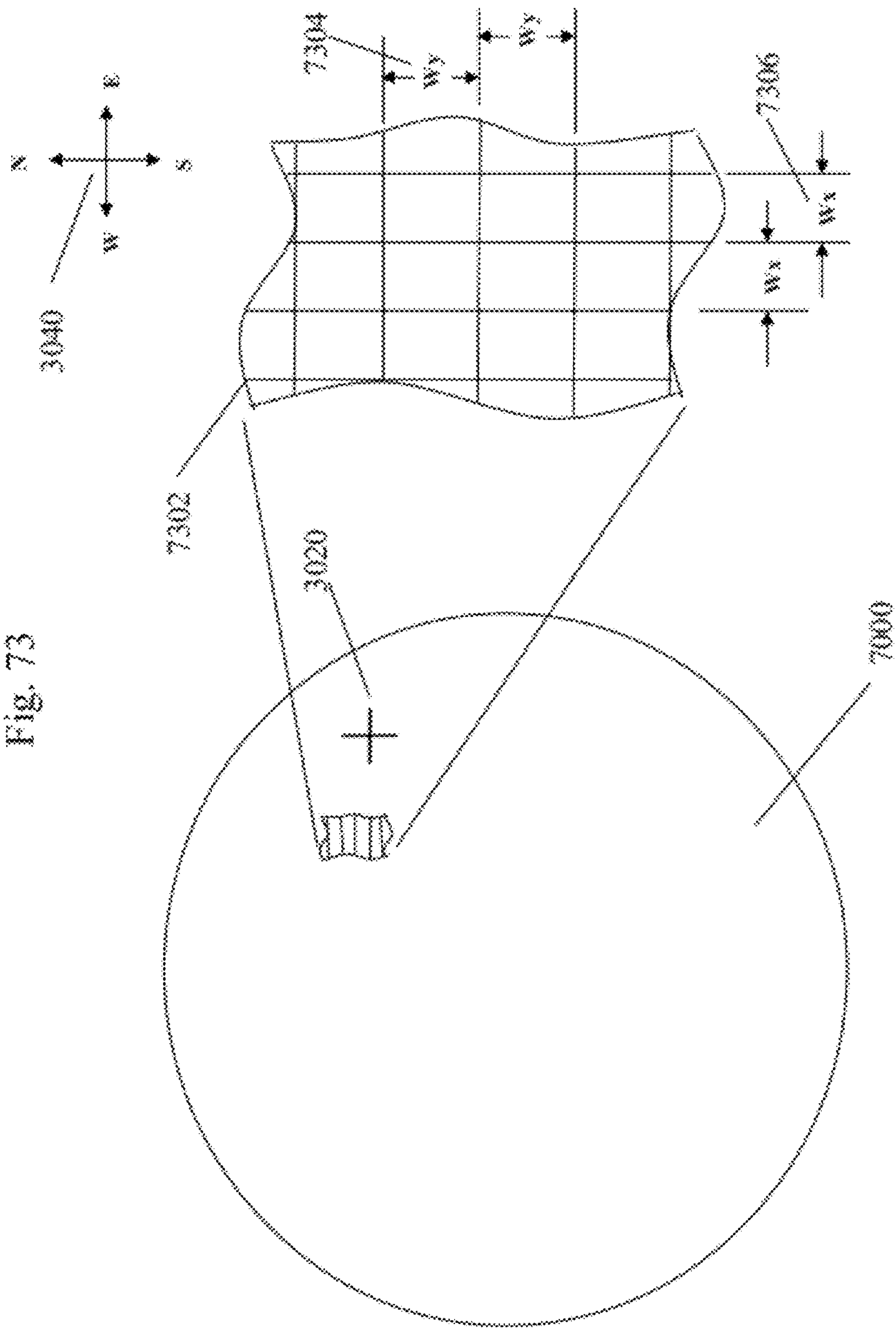
FIG. 73 is an exemplary drawing illustration of a donor wafer.
Figure 74:
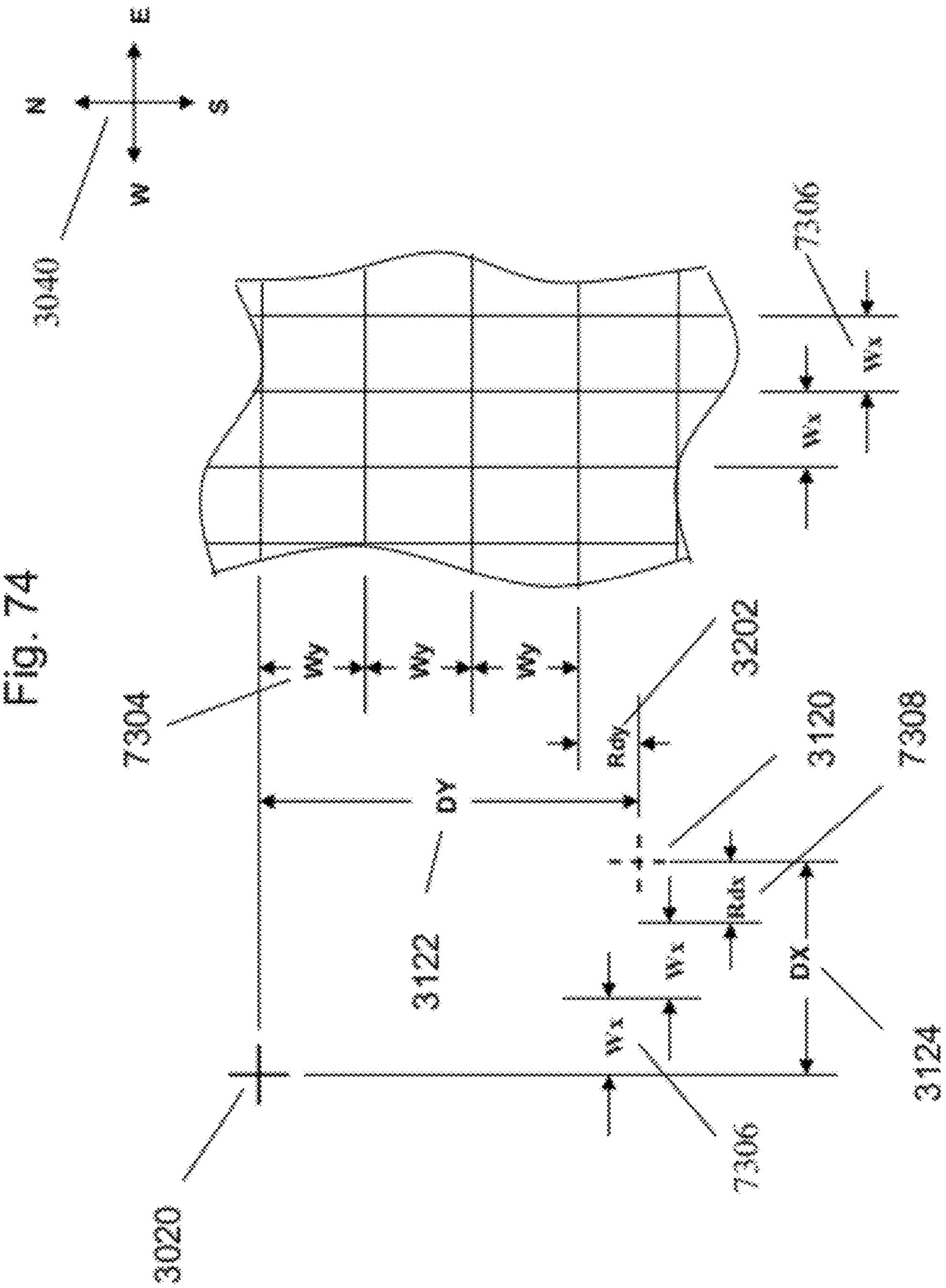
FIG. 74 is an exemplary drawing illustration of a measured alignment offset.
Figure 75:
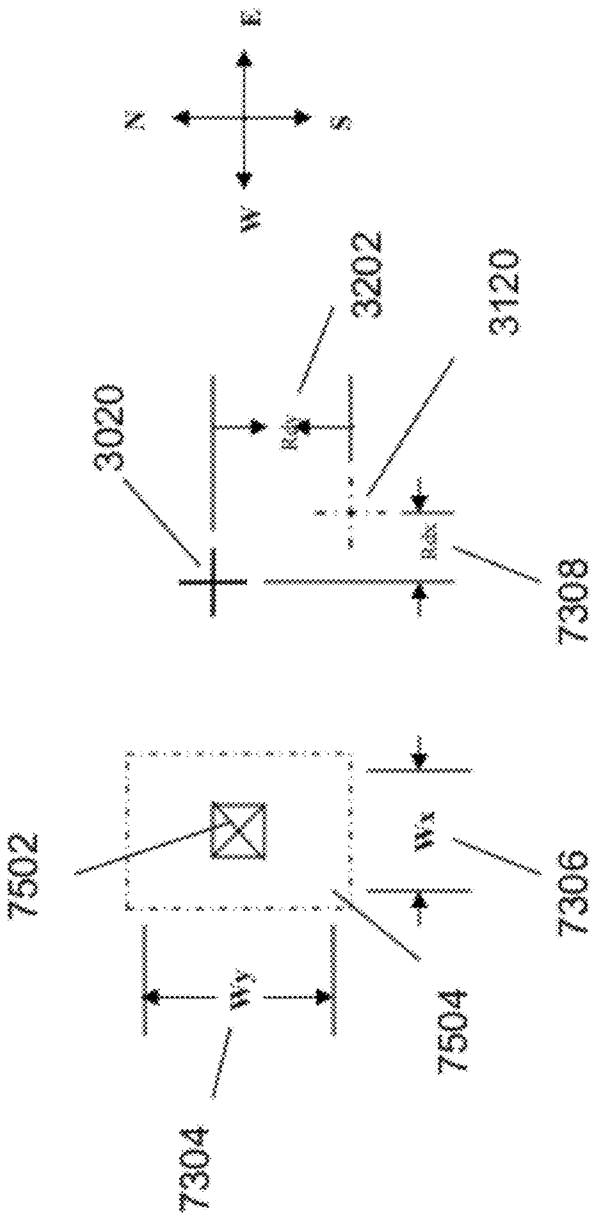
FIG. 75 is an exemplary drawing illustration of a connection strip.

In an alternative embodiment, the donor wafer 7000 may be pre-processed for the first phase of transistor formation to build n and p type dummy transistors comprising repeated patterns in both directions. FIGS. 73, 74, 75 may include a four cardinal directions 3040 indicator, which may be used to assist the explanation. As illustrated in the blown-up projection 7302 in FIG. 73, the width Wy 7304 may correspond to the repeating pattern rows that may traverse the acceptor die East to West width plus the maximum donor wafer to acceptor wafer misalignment length, or alternatively traverse the length of the donor wafer from East to West, and the repeats may extend substantially all the way across the wafer from North to South. Similarly, the width Wx 7306 corresponds to the repeating pattern rows that may traverse the acceptor die North to South width plus the maximum donor wafer to acceptor wafer misalignment length, or alternatively traverse the length of the donor wafer from North to South, and the repeats may extend substantially all the way across the wafer from East to West. The donor wafer 7000 may also have an alignment mark 3020 on the same layers of the donor wafer as the Wx 7306 and Wy 7304 repeating patterns rows. Accordingly, alignment mark 3020 may be used later to properly align additional patterning and processing steps to said rows.

The donor wafer transferred layer 3000L, now thinned and comprising the first phase of transistor formation pre-processed HKMG transistor silicon layer 7001 with attached carrier substrate 7014 completed as described previously in relation to FIG. 70E, may be placed on top of the acceptor wafer 3100 as illustrated in FIG. 31. The state of the art alignment may allow for very good angular alignment of this bonding step but it is difficult to achieve a better than about 1 micron position alignment. FIG. 31 illustrates the acceptor wafer 3100 with its corresponding alignment mark 3120 and the transferred layer 3000L of the donor wafer with its corresponding alignment mark 3020. The misalignment in the East-West direction is DX 3124 and the misalignment in the North-South direction is DY 3122. These alignment marks may be placed in, for example, only a few locations on each wafer, or within each step field, or within each die, or within each repeat W.

The proposed structure, illustrated in FIG. 74, may include repeating patterns in both the North-South and East-West direction of alternating rows of parallel transistor bands. An illustrative advantage of the proposed structure may be that the transistor and the processing could be similar to the acceptor wafer processing, thereby significantly reducing the development cost of 3D integrated devices. Accordingly the effective alignment uncertainty may be reduced to Wy 7304 in the North to South direction and Wx 7306 in the West to East direction. Accordingly, the alignment residue Rdy 3202 (remainder of DY modulo Wy, 0<=Rdy<Wy) in the North to South direction could be calculated. Accordingly, the North-South direction alignment may be to the underlying alignment mark 3120 offset by Rdy 3202 to properly align to the nearest Wy. Similarly, the effective alignment uncertainty may be reduced to Wx 7306 in the East to West direction. The alignment residue Rdx 7308 (remainder of DX modulo Wx, 0<=Rdx<Wx) in the West to East direction could be calculated in a manner similar to that of Rdy 3202. Likewise, the East-West direction alignment may be performed to the underlying alignment mark 3120 offset by Rdx 7308 to properly align to the nearest Wx.

Each wafer to be processed according to this flow may have at least one specific Rdx 7308 and Rdy 3202 which may be subject to the actual misalignment DX 3124 and DY 3122 and Wx and Wy. The masks used for patterning the various circuit patterns may be pre-designed and fabricated and remain the same for substantially all wafers (processed for the same end-device) regardless of the actual wafer to wafer misalignment. In order to allow the connection between structures on the donor layer, for example, HKMG transistor silicon layer 7001, and the underlying acceptor wafer 808, the underlying wafer 808 may be designed to have a rectangle landing zone 7504 extending North-South of length Wy 7304 plus any extension necessary for the via design rules, and extending East-West of length Wx 7306 plus any extension required for the via design rules, as illustrated in FIG. 75. The landing zone rectangle extension for via design rules may also include angular misalignment of the wafer-to-wafer bonding not compensated by the stepper overlay algorithms, and may include uncompensated donor wafer bow and warp. The rectangle landing zone 7504 may be part of the acceptor wafer 808 and may be accordingly aligned to its alignment mark 3120. Through via 7502 going down and being part of the donor layer, for example, HKMG transistor silicon layer 7001, pattern may be aligned to the underlying alignment mark 3120 by offsets Rdx 7308 and Rdy 3202 respectively, providing connections to the rectangle landing zone 7504. Through via 7502 may be drawn in the database (not shown) so that it may be positioned approximately at the center of the rectangle landing zone 7504, and, hence, may be away from the ends of the rectangle landing zone 7504 at distances greater than approximately the nominal layer to layer misalignment margin.

Figure 77:
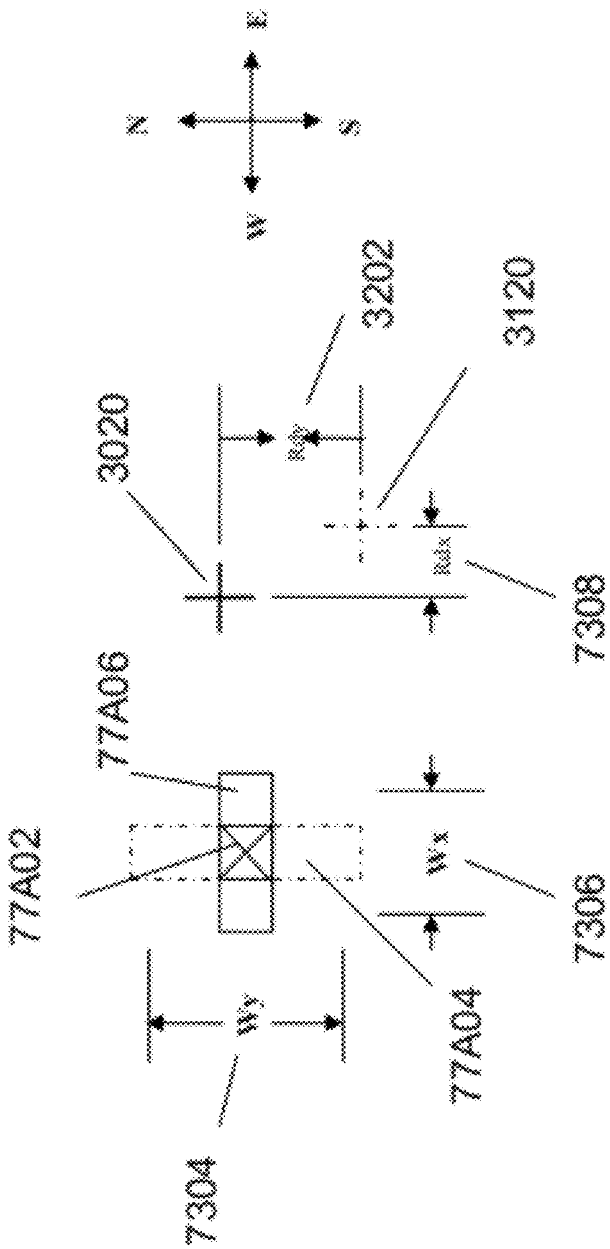
FIG. 77 is an exemplary drawing illustration of a connection strip.

In an alternative embodiment, the rectangle landing zone 7504 in acceptor substrate 808 may be replaced by a landing strip 77A04 in the acceptor wafer and an orthogonal landing strip 77A06 in the donor layer as illustrated in FIG. 77. Through via 77A02 going down and being part of the donor layer, for example HKMG transistor silicon layer 7001, pattern may be aligned to the underlying alignment mark 3120 by offsets Rdx 7308 and Rdy 3202 respectively, providing connections to the landing strip 77A06. Through via 77A02 may be drawn in the database (not shown) so that it may be positioned approximately at the center of landing strip 77A04 and landing strip 77A06, and, hence, may be away from the ends of strip 77A04 and strip 77A06 at distances greater than approximately the nominal layer to layer misalignment margin.

Figure 77A:
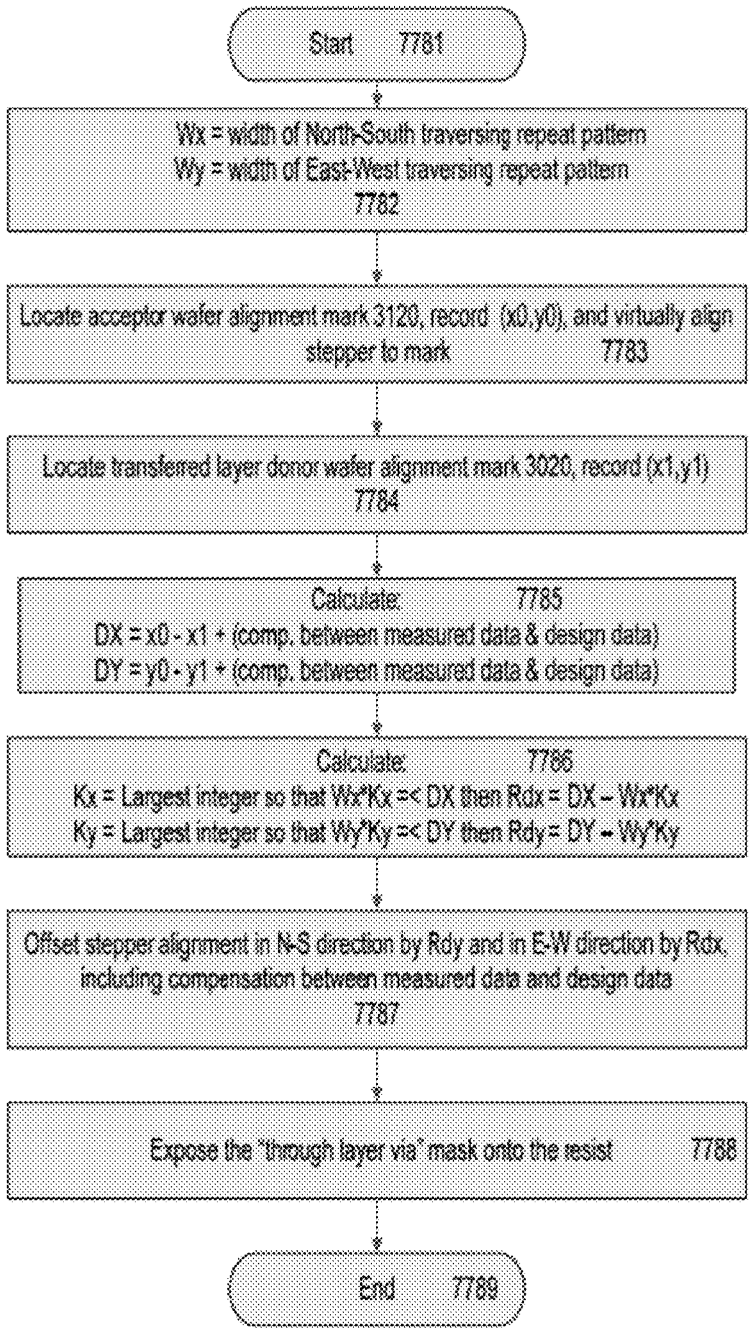
FIG. 77A, 77B are exemplary drawing illustrations of methodologies for alignment of through layer via or connection strip described with respect to FIGS. 73 to 77.

FIG. 77A illustrates an exemplary methodology for implementing alignment of a through via mask which may connect to landing strip 77A04 in the top layer of the underlying acceptor wafer 3100 and to landing strip 77A06 in the transferred wafer top layer of donor wafer 7000, for example HKMG transistor silicon layer 7001, and may be described with respect to FIGS. 73, 74, and 77. Start (7781) and determine (7782) widths Wx 7306 and Wy 7304 as described previously. Locate (7783) acceptor wafer alignment mark 3120 coordinates, such as (x0,y0), and record co-ordinates for further calculation, and the stepper/litho tool may initially (may be virtual) align the mask to acceptor wafer alignment mark 3120. Locate (7784) transferred layer donor wafer alignment mark 3020 coordinates, such as (x1,y1), and record co-ordinates for further calculation. Calculate (7785) DX 3124 from the y-coordinates of the two marks (x0-x1) and compensate for any differences between measured data and design/layout data, and calculate DY 3122 from the y-coordinates of the two marks (y0-y1) and compensate for any differences between measured data and design/layout data. These calculations may be done by the stepper. Calculate (7786) the largest integer Kx such that Wx 7306 times Kx is less than or equal to DX 3124. Then calculate the residue offset Rdx 7308, which may be DX 3124 minus the result of Wx 7306 multiplied by Kx. Also, calculate (7786) the largest integer Ky such that Wy 7304 times Ky is less than or equal to DY 3122. Then calculate the residue offset Rdy 3202, which may be DY 3122 minus the result of Wy 7304 multiplied by Ky. These calculations may be done by the stepper. Offset (7787) the initial stepper alignment in the North-South direction by the calculated residue offset Rdy 3202 and in the East-West direction by the calculated residue offset Rdx 7308. These offsets may also include compensation for any differences between measured data and design/layout data and may include offsets for typical processing effects such as, for example, runout and thin film stresses. Expose (7788) the through layer via mask onto the desired resist layer and continue processing the now properly aligned thru layer via. The alignment & litho process may End (7789).

Figure 77B:
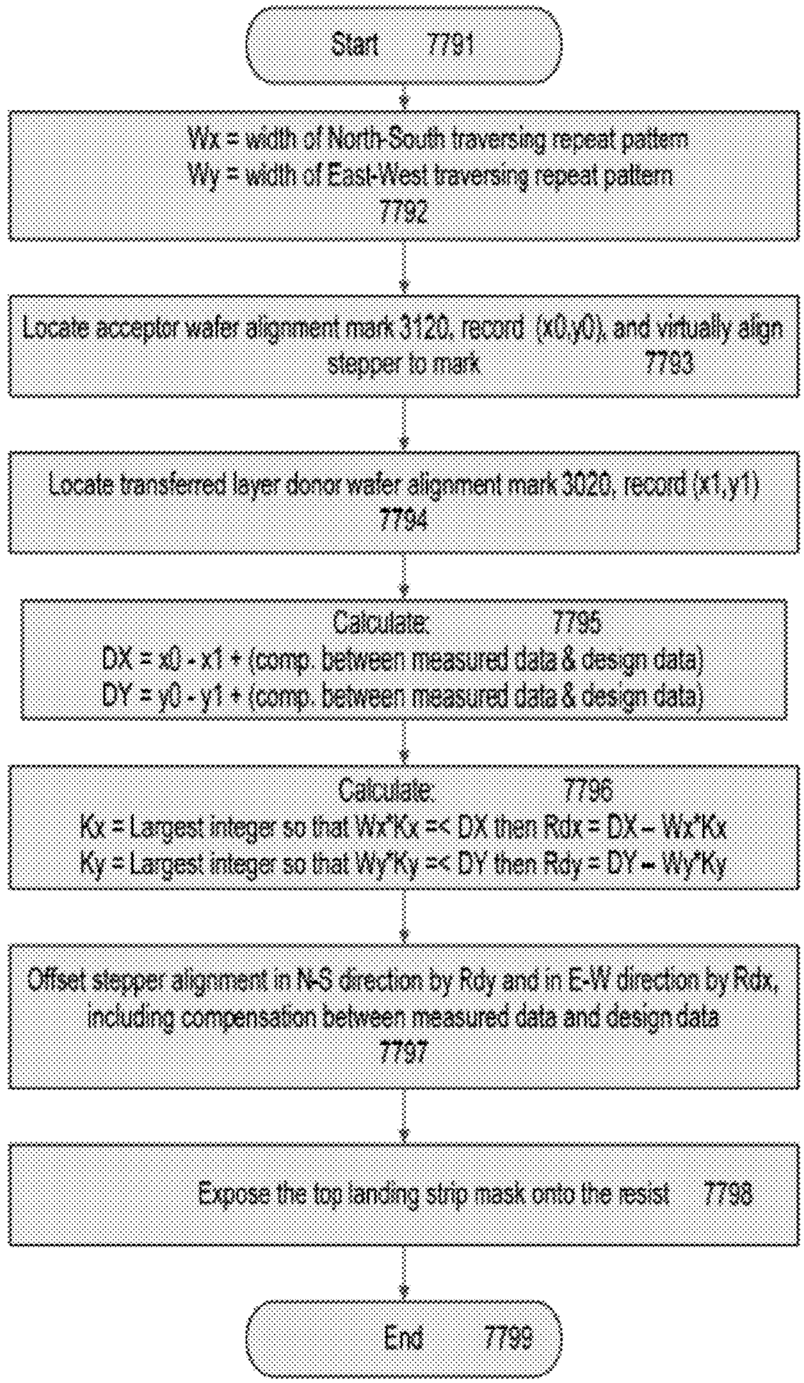

FIG. 77B illustrates an exemplary methodology for implementing alignment of transferred wafer top layer donor wafer 7000, for example HKMG transistor silicon layer 7001, landing strip 77A06 to through layer via 77A02 which may connect to landing strip 77A04 in the top layer of the underlying acceptor wafer 3100 and may be described with respect to FIGS. 73, 74, and 77. Start (7791) and determine (7792) widths Wx 7306 and Wy 7304 as described previously. Locate (7793) acceptor wafer alignment mark 3120 coordinates, such as (x0,y0), and record co-ordinates for further calculation, and the stepper/litho tool may initially (may be virtual) align the mask to acceptor wafer alignment mark 3120. Locate (7794) transferred layer donor wafer alignment mark 3020 coordinates, such as (x1,y1), and record co-ordinates for further calculation. Calculate (7795) DX 3124 from the y-coordinates of the two marks (x0-x1) and compensate for any differences between measured data and design/layout data, and calculate DY 3122 from the y-coordinates of the two marks (y0-y1) and compensate for any differences between measured data and design/layout data. These calculations may be done by the stepper. Calculate (7796) the largest integer Kx such that Wx 7306 times Kx is less than or equal to DX 3124. Then calculate the residue offset Rdx 7308, which may be DX 3124 minus the result of Wx 7306 multiplied by Kx. Also, calculate (7796) the largest integer Ky such that Wy 7304 times Ky is less than or equal to DY 3122. Then calculate the residue offset Rdy 3202, which may be DY 3122 minus the result of Wy 7304 multiplied by Ky. These calculations may be done by the stepper. Offset (7797) the initial stepper alignment in the North-South direction by the calculated residue offset Rdy 3202 and in the East-West direction by the calculated residue offset Rdx 7308. These offsets may also include compensation for any differences between measured data and design/layout data and may include offsets for typical processing effects such as, for example, runout and thin film stresses. Expose (7798) the transferred wafer top layer landing strip mask onto the desired resist layer and continue processing the now properly aligned landing strip. The alignment & litho process may End (7799).

Figure 76:
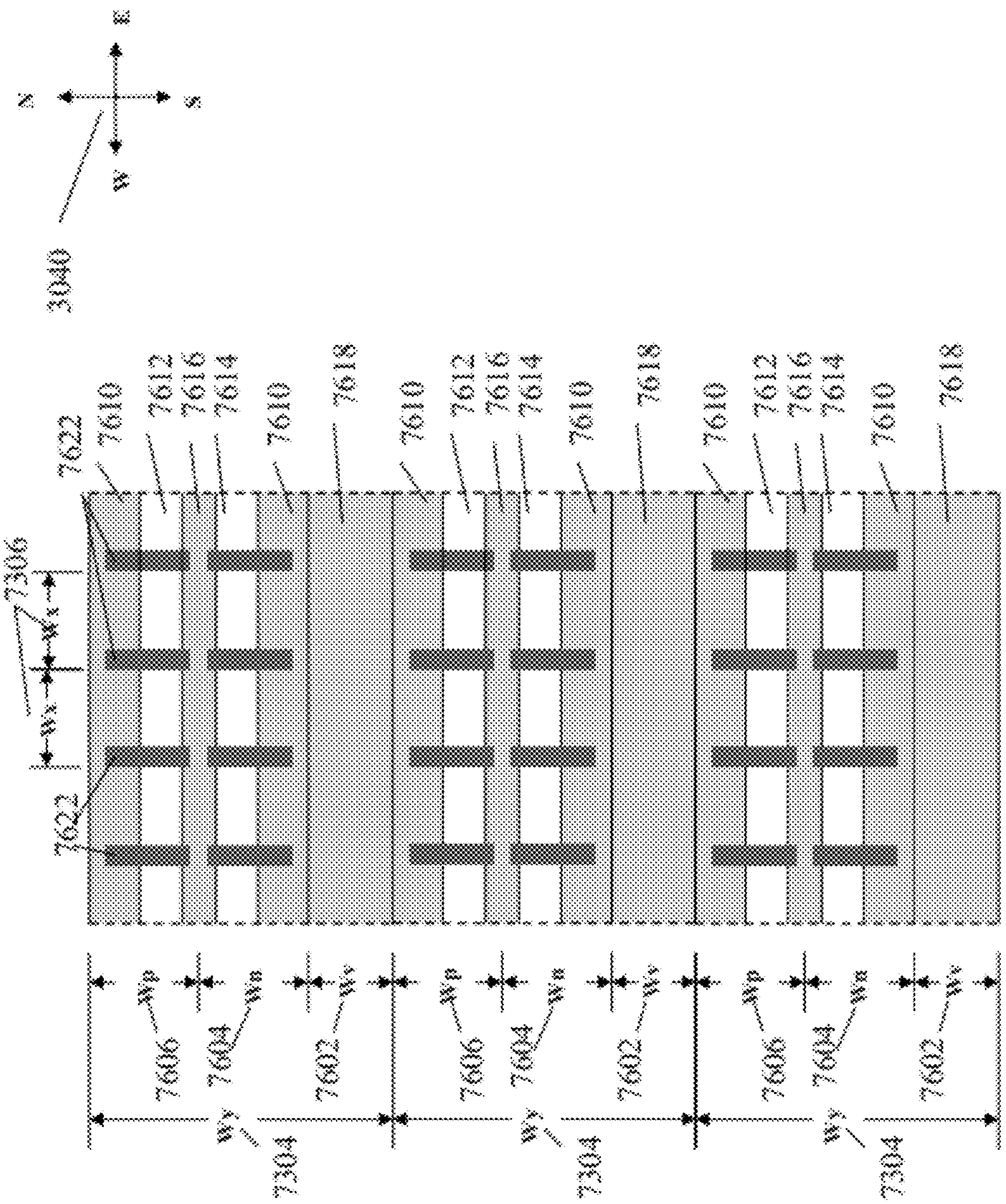
FIG. 76 is an exemplary drawing illustration of a layout for a donor wafer.

FIG. 76 illustrates a repeating pattern in both the North-South and East-West direction. This repeating pattern may be a repeating pattern of transistors, of which each transistor has gate 7622, forming a band of transistors along the East-West axis. The repeating pattern in the North-South direction may comprise parallel bands of transistors, of which each transistor has active area 7612 or 7614. The transistors may have their gates 7622 fully defined. The structure may therefore be repeating in East-West with repetitions of Wx 7306. In the North-South direction the structure may repeat every Wy 7304. The width Wv 7602 of the layer to layer via channel 7618 may be 5 F, and the width of the n type transistor row width repeat Wn 7604 may include two transistor isolations 7610 of 3 F width and shared isolation region 7616 of 1 F width, plus a transistor active area 7614 of width 2.5 F. The width of the p type transistor row width repeat Wp 7606 may include two transistor isolations 7610 of 3 F width and shared 7616 of 1 F, plus a transistor active area 7612 of width 2.5 F. The total Wy 7304 may be 18 F, the addition of Wv+Wn+Wp, where F may be two times lambda, the minimum design rule. The gates 7622 may be of width F and spaced 4 F apart from each other in the East-West direction. The East-West repeat width Wx 7306 may be 5 F. Adjacent transistors in the East-West direction may be electrically isolated from each other by biasing the gate in-between to the appropriate off state; i.e., grounded gate for NMOS and Vdd gate for PMOS.

The donor wafer transferred layer 3000L, now thinned and including the first-phase-transistor-formation pre-processed HKMG transistor silicon layer 7001 with attached carrier substrate 7014 completed as described previously in relation to FIG. 70E, may be placed on top of the acceptor wafer 3100 as illustrated in FIG. 31. The DX 3124 and DY 3122 misalignment and, as described previously, the associated Rdx 7308 and Rdy 3202 may be calculated. The connection between structures on the donor layer, for example, HKMG transistor silicon layer 7001, and the underlying wafer 808, may be designed to have a landing strip 77A04 going North-South of length Wy 7304 plus any extension necessary for the via design rules, as illustrated in FIG. 77. The landing strip extension for via design rules may include angular misalignment of the wafer to wafer bonding not compensated for by the stepper overlay algorithms, and may include uncompensated donor wafer bow and warp. The strip 77A04 may be part of the wafer 808 and may be accordingly aligned to its alignment mark 3120. The landing strip 77A06 may be part of the donor wafer layers and may be oriented in parallel to the transistor bands and accordingly going East-West. Landing strip 77A06 may be aligned to the main wafer alignment mark 3120 with offsets of Rdx and Rdy (i.e., equivalent to alignment to donor wafer alignment mark 3020). Through via 77A02 connecting these two landing strips 77A04 and 77A06 may be part of a top layer HKMG transistor silicon layer 7001 pattern. The via 77A02 may be aligned to the main wafer 808 alignment mark in the West-East direction and to the main wafer alignment mark 3120 with Rdy offset in the North-South direction.

Figure 78A:
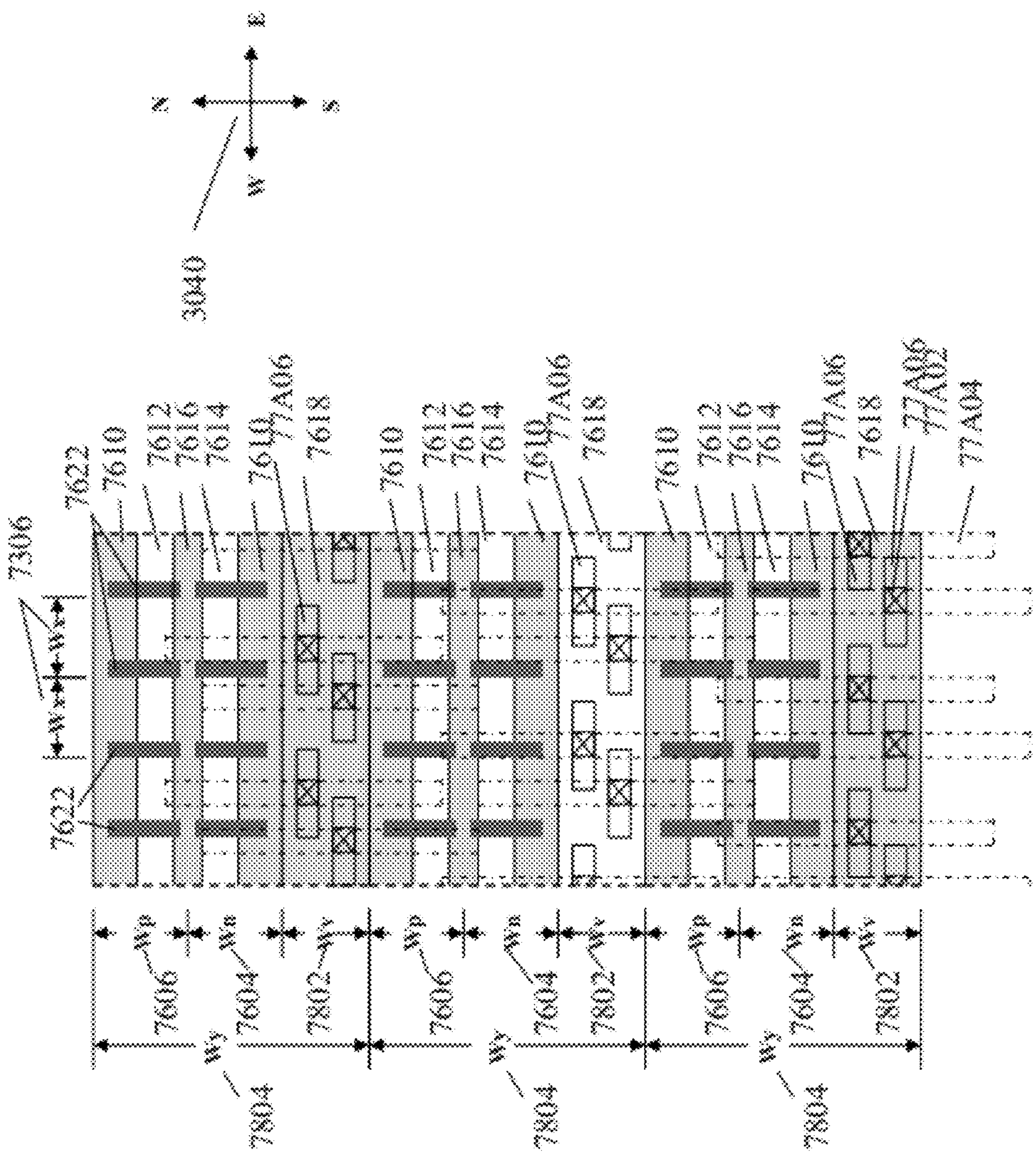
FIG. 78A, 78B, 78C are exemplary drawing illustrations of a layout for a donor wafer.

Alternatively, the repeating pattern of continuous diffusion sea of gates described in FIG. 76 may have an enlarged width Wv 7802 for multiple rows of landing strips 77A06 as illustrated in FIG. 78A. The width Wv 7802 of the layer-to-layer via channel 7618 may be 10 F, and the total Wy 7804 North-South pattern repeat may be 23 F.

Figure 78B:
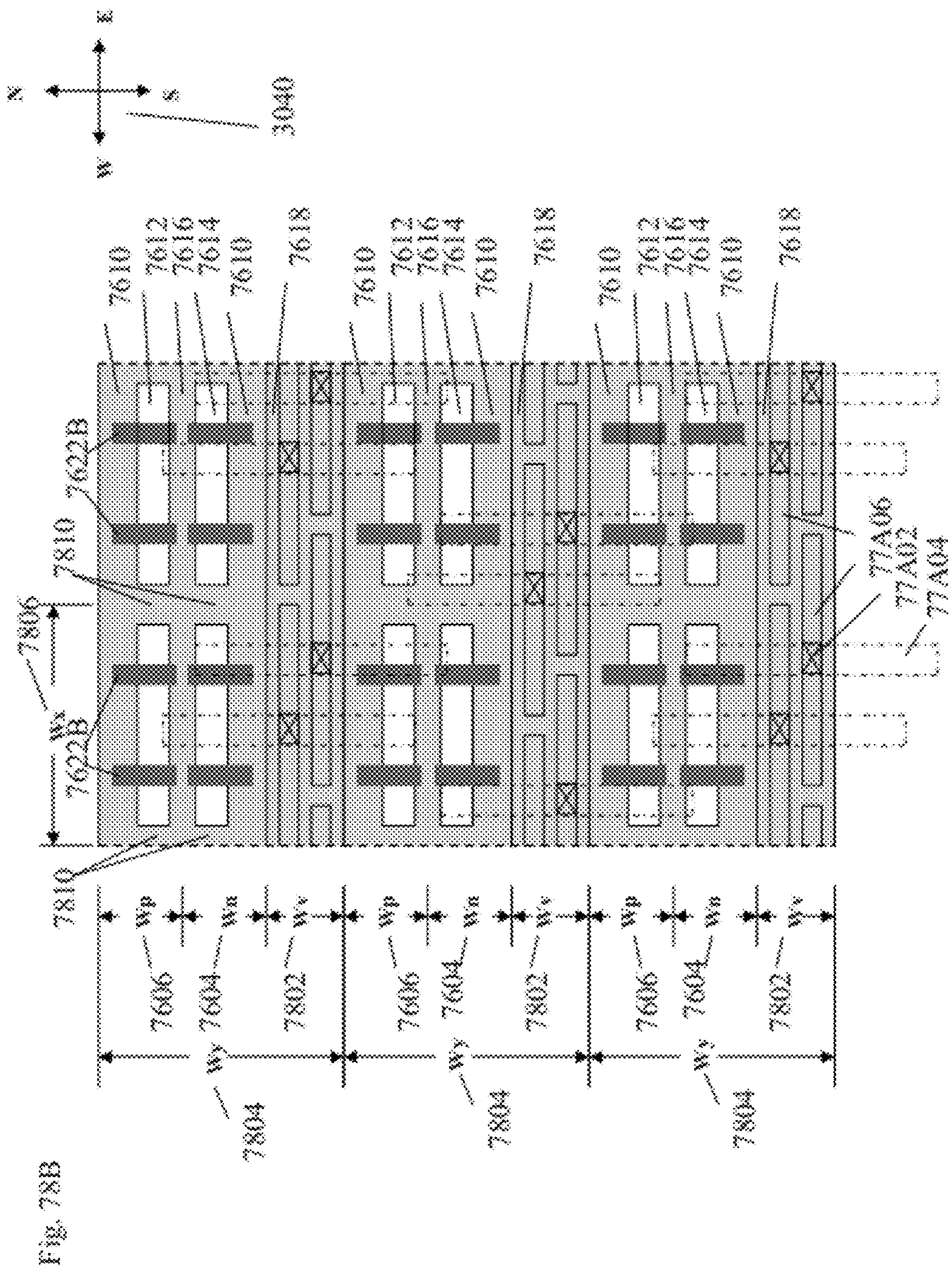

In an alternative embodiment, the gates 7622B may be repeated in the East to West direction as pairs with an additional repeat of isolations 7810 as illustrated in FIG. 78B. This repeating pattern of transistors, of which each transistor has gate 7622B, may form a band of transistors along the East-West axis. The repeating pattern in the North-South direction may include parallel bands of these transistors, of which each transistor may have active area 7612 or 7614. The East-West pattern repeat width Wx 7806 may be 14 F and the length of the donor wafer landing strips 77A06 may be designed of length Wx 7806 plus any extension necessary by design rules as described previously. The donor wafer landing strip 77A06 may be oriented parallel to the transistor bands and accordingly going East-West.

Figure 78C:
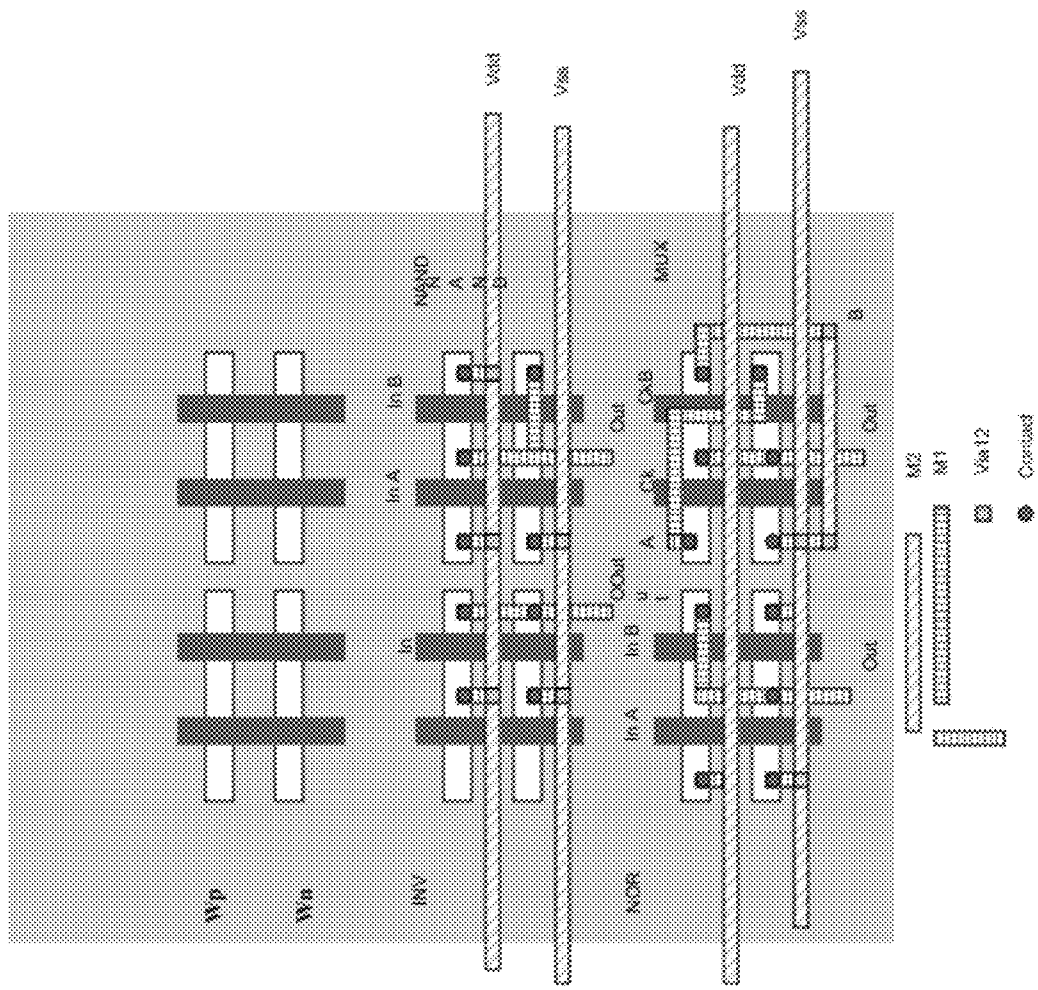

FIG. 78C illustrates a section of a Gate Array terrain with a repeating transistor cell structure. The cell may be similar to the one of FIG. 78B wherein the respective gates of the N transistors may be connected to the gates of the P transistors. FIG. 78C illustrates an implementation of basic logic cells: Inv, NAND, NOR, MUX.

Figure 79:
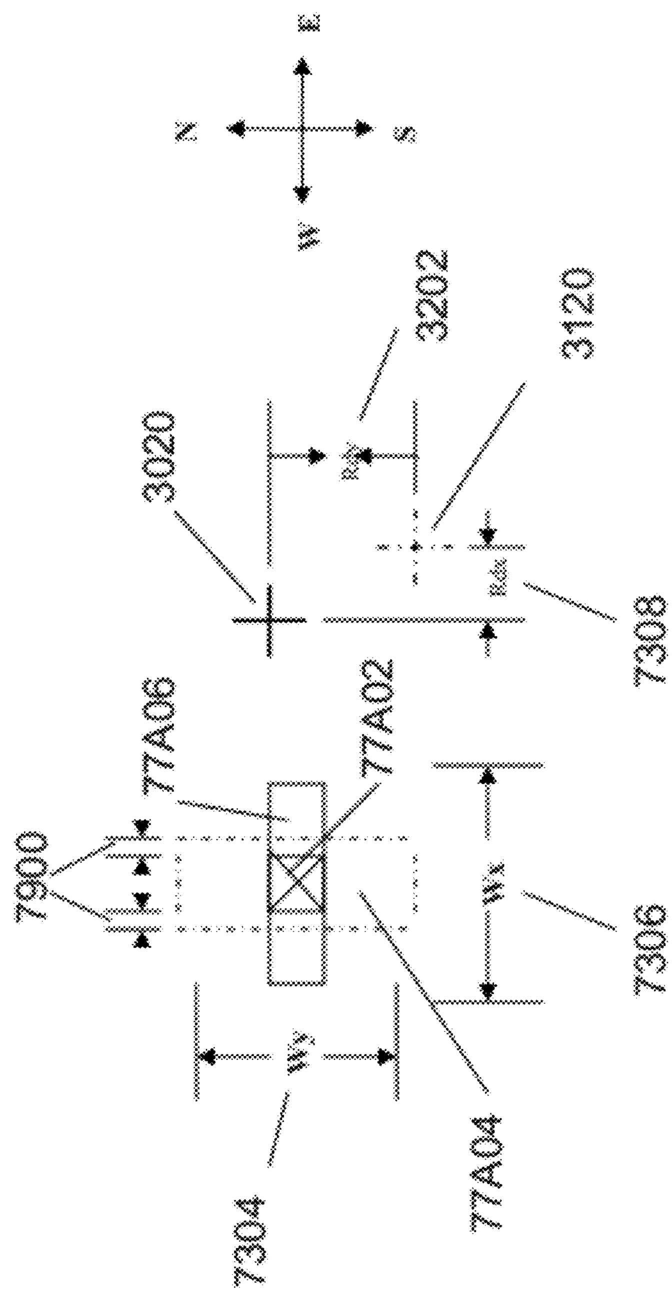
FIG. 79 is an exemplary drawing illustration of a connection strip.

Alternatively, to increase the density of through layer via connections in the donor wafer layer to layer via channel, the donor landing strip 77A06 may be designed to be less than Wx 7306 in length by utilizing increases 7900 in the width of the House landing strip 77A04 and offsetting the through layer via 77A02 properly as illustrated in FIG. 79. The landing strips 77A04 and 77A06 may be aligned as described previously. Via 77A02 may be aligned to the main wafer alignment mark 3120 with Rdy offset in the North-South direction, and in the East-West direction to the acceptor wafer 808 alignment mark 3120 as described previously plus an additional shift towards East. The offset size may be about equal to the reduction of the donor wafer landing strip 77A06.

In an additional embodiment, a block of a non-repeating pattern device structures may be prepared on a donor wafer and layer transferred using the above described techniques. This donor wafer of non-repeating pattern device structure may be a memory block of DRAM, or a block of Input-Output circuits, or any other circuit block. A general connectivity structure 8002 may be used to connect the donor wafer non-repeating pattern device structure 8004 to the acceptor wafer die 8000 (or house 808 wafer die).

Figure 80:
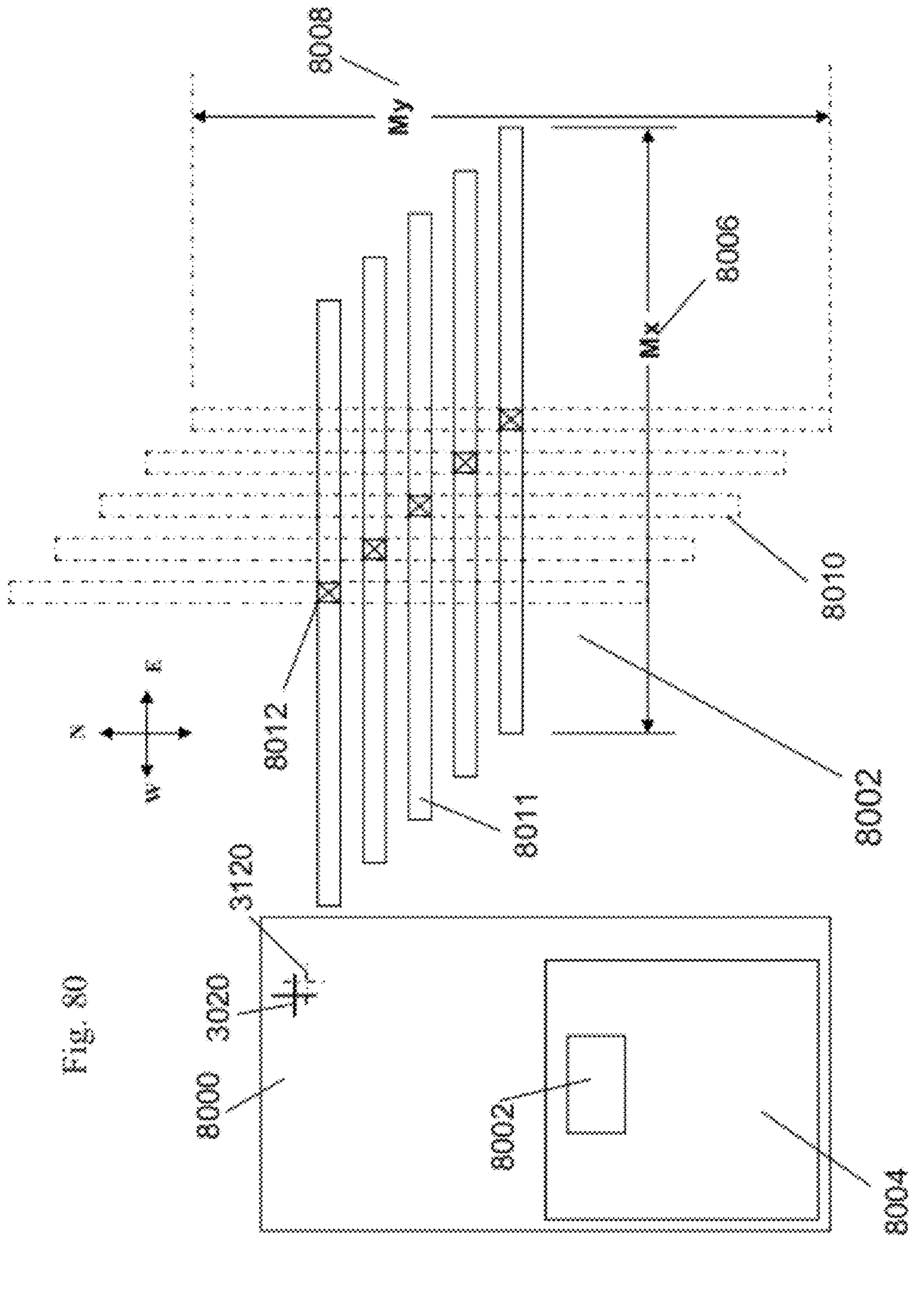
FIG. 80 is an exemplary drawing illustration of a connection strip array structure.

Acceptor wafer die 8000 is illustrated in FIG. 80. The connectivity structure 8002 may be drawn inside or outside of the donor wafer non-repeating pattern device structure 8004. Mx 8006 may be the maximum donor wafer to acceptor wafer die 8000 misalignment plus any extension necessary by design rules as described previously in the East-West direction and My 8008 may be the maximum donor wafer to acceptor wafer misalignment plus any extension necessary by design rules as described previously in the North-South direction from the layer transfer process. Mx 8006 and My 8008 may also include incremental misalignment resulting from the angular misalignment of the wafer to wafer bonding not compensated for by the stepper overlay algorithms, and may include uncompensated donor wafer bow and warp. The acceptor wafer North-South landing strip 8010 may have a length of My 8008 aligned to the acceptor wafer alignment mark 3120. The donor wafer East-West landing strip 8011 may have a length of Mx 8006 aligned to the donor wafer alignment mark 3020. The through layer via 8012 connecting them may be aligned to the acceptor wafer alignment mark 3120 in the East West direction and to the donor wafer alignment mark 3020 in the North-South direction. For the purpose of illustration, the lower metal landing strip of the donor wafer was oriented East-West and the upper metal landing strip of the acceptor was oriented North-South. The orientation of the landing strips could be exchanged. Through layer via 8012 may be drawn in the database (not shown) so that it may be positioned approximately at the center of acceptor wafer North-South landing strip 8010 and donor wafer East-West landing strip 8011, and, hence, may be away from the ends of acceptor wafer North-South landing strip 8010 and donor wafer East-West landing strip 8011 at distances greater than approximately the nominal layer to layer misalignment margin.

The donor wafer may include sections of repeating device structure elements such as those illustrated in FIG. 76 and FIG. 78B in combination with device structure elements that do not repeat. These two elements, one repeating and the other non-repeating, would be patterned separately since the non-repeating elements pattern should be aligned to the donor wafer alignment mark 3020, while the pattern for the repeating elements would be aligned to the acceptor wafer alignment mark 3120 with an offset (Rdx & Rdy) as described previously. Accordingly, a variation of the general connectivity structure illustrated in FIG. 80 could be used to connect between to these two elements. The donor wafer East-West landing strips 8011 could be aligned to the donor wafer alignment marks 3020 together with the non-repeating elements and the acceptor wafer North-South landing strips 8010 would be aligned to the acceptor wafer alignment mark 3120 with the offset together with the repeating elements pattern. The vias 8012 connecting these strips would need to be aligned in the North-South direction to the donor wafer alignment marks 3020 and in the East-West direction to the acceptor wafer alignment mark 3120 with the offset.

Persons of ordinary skill in the art will appreciate that the illustrations in FIG. 80 are exemplary only and are not drawn to scale. Such skilled persons will further appreciate that many variations may be possible such as, for example, the donor wafer may include only non-repeating pattern structures and thus may be connected to the acceptor wafer by acceptor and donor metal landing strips acceptor wafer North-South landing strip 8010 and donor wafer East-West landing strip 8011 of length Mx 8006 and My 8008 and vias 8012 by aligning, which may include adjustments such as, for example, wafer bow, mask runout, and alignment variation, the donor wafer alignment marks to the acceptor wafer alignment marks. Moreover, these alignment schemes for 3DIC may be utilized by many of the device process flows described in this present invention. Furthermore, the landing strip directions East-West and North-South may be swapped between acceptor and donor wafers. Further, the landing strips may be designed off-orthogonal with respect to each other, or may be designed to run in other compass directions than North-South and East-West, or both off-orthogonal and off-North-South East-West compass directions. Many other modifications within the scope of the illustrated embodiments of the invention will suggest themselves to such skilled persons after reading this specification. Thus the invention is to be limited only by the appended claims.

The above flows, whether single type transistor donor wafer or complementary type transistor donor wafer, could be repeated multiple times to build a multi-level 3D monolithic integrated system. These flows could also provide a mix of device technologies in a monolithic 3D manner. For example, device I/O or analog circuitry such as, for example, phase-locked loops (PLL), clock distribution, or RF circuits could be integrated with CMOS logic circuits via layer transfer, or bipolar circuits could be integrated with CMOS logic circuits, or analog devices could be integrated with logic, and so on. Prior art shows alternative technologies of constructing 3D devices. The most common technologies are, either using thin film transistors (TFT) to construct a monolithic 3D device, or stacking prefabricated wafers and then using a through silicon via (TSV) to connect the prefabricated wafers. The TFT approach may be limited by the performance of thin film transistors while the stacking approach may be limited by the relatively large lateral size of the TSV via (on the order of a few microns) due to the relatively large thickness of the 3D layer (about 60 microns) and accordingly the relatively low density of the through silicon vias connecting them. According to many embodiments of the present invention that construct 3D IC based on layer transfer techniques, the transferred layer may be a thin layer of less than about 0.4 micron. This 3D IC with transferred layer according to some embodiments of the present invention may be in sharp contrast to TSV based 3D ICs in the prior art where the layers connected by TSV may be more than 5 microns thick and in most cases more than 50 microns thick.

The alternative process flows presented in, for example, FIGS. 20 to 35, 40, 54 to 61, 65 to 96, and 133-137 may provide true monolithic 3D integrated circuits. It may allow the use of layers of single crystal silicon transistors with the ability to have the upper transistors aligned to the underlying circuits as well as those layers aligned each to other and only limited by the Stepper capabilities. Similarly the contact pitch between the upper transistors and the underlying circuits may be compatible with the contact pitch of the underlying layers. While in the best current stacking approach the stack wafers are a few microns thick, the alternative process flows presented in, for example, FIGS. 20 to 35, 40, 54 to 61, 65 to 96, and 133-137 may suggest very thin layers of typically 100 nm, but recent work has demonstrated layers about 20 nm thin.

Accordingly the presented alternatives allow for true monolithic 3D devices. This monolithic 3D technology may provide the ability to integrate with full density, and to be scaled to tighter features, at the same pace as the semiconductor industry.

Additionally, true monolithic 3D devices may allow the formation of various sub-circuit structures in a spatially efficient configuration with higher performance than 2D equivalent structures. Illustrated below are some examples of how a 3D 'library' of cells may be constructed in the true monolithic 3D fashion.

Figure 42:
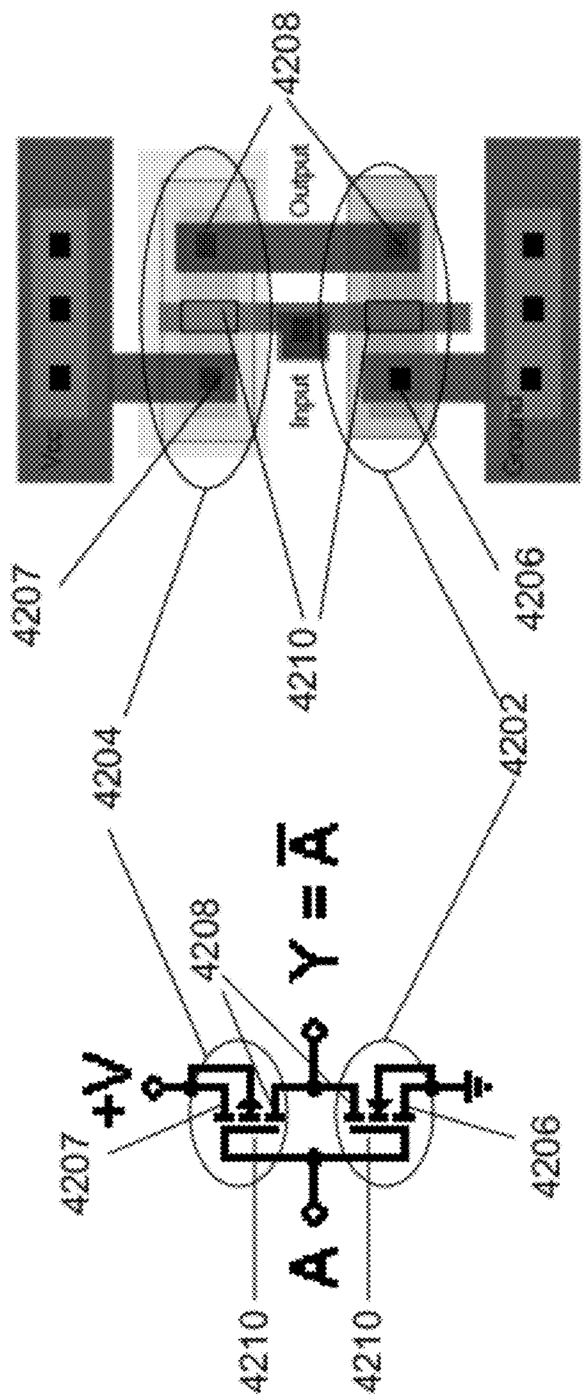
FIG. 42 is an exemplary drawing illustration of an inverter cell.

FIG. 42 illustrates a typical 2D CMOS inverter layout and schematic diagram where the NMOS transistor 4202 and the PMOS transistor 4204 are laid out side by side and are in differently doped wells. The NMOS source 4206 may be typically grounded, the NMOS and PMOS drains 4208 may be electrically tied together, the NMOS & PMOS gates 4210 may be electrically tied together, and the PMOS 4207 source may be tied to +Vdd. The structure built in 3D described below may take advantage of these connections in the 3rd dimension.

Figure 43A:
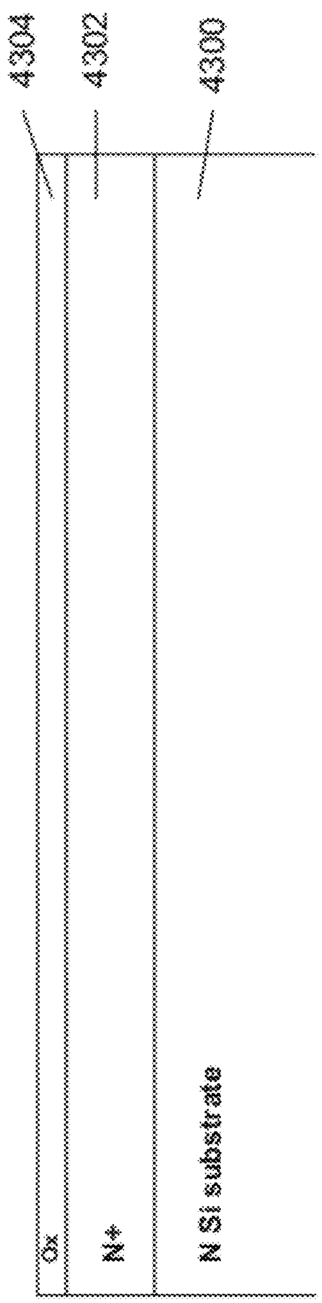
FIG. 43 A-C is an exemplary drawing illustration of preparation steps for formation of a 3D cell.
Figure 43B:
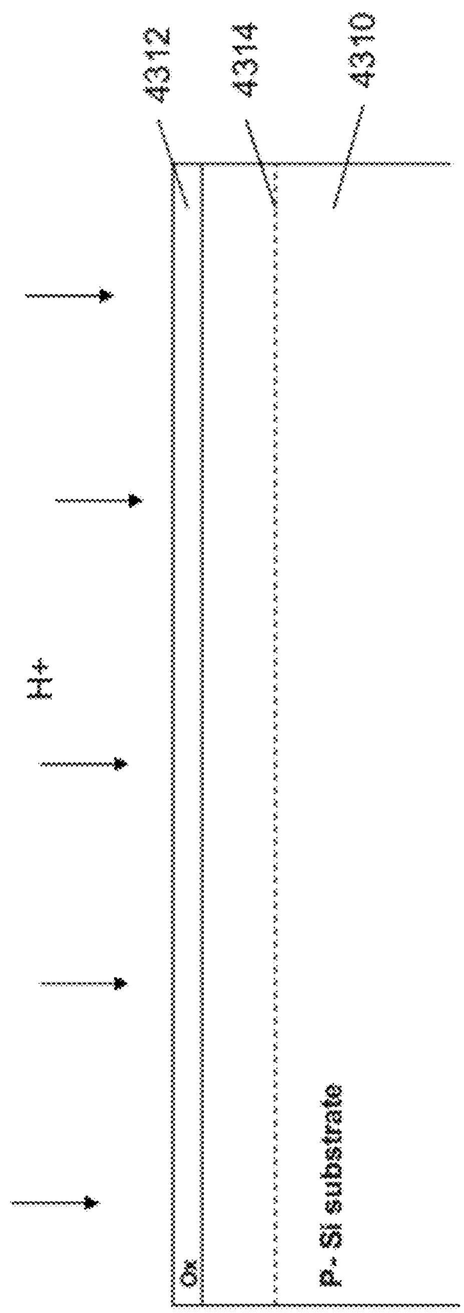
Figure 43C:
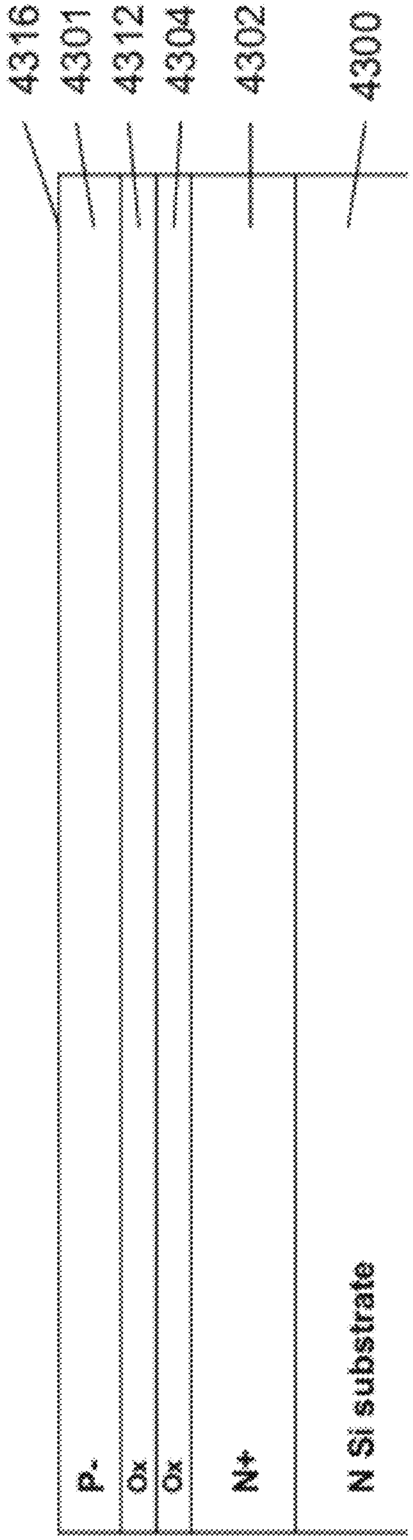

An acceptor wafer may be preprocessed as illustrated in FIG. 43A. A heavily doped N single crystal silicon wafer 4300 may be implanted with a heavy dose of N+ species, and annealed to create an even lower resistivity layer 4302. Alternatively, a high temperature resistant metal such as Tungsten may be added as a low resistance interconnect layer, as a sheet layer or as a defined geometry metallization. An oxide 4304 may be grown or deposited to prepare the wafer for bonding. A donor wafer is preprocessed to prepare for layer transfer as illustrated in FIG. 43B. FIG. 43B is a drawing illustration of the pre-processed donor wafer used for a layer transfer. A P− wafer 4310 may be processed to make it ready for a layer transfer by a deposition or growth of an oxide 4312, surface plasma treatments, and by an implant of an atomic species such as H+ preparing the SmartCut cleaving plane 4314. Now a layer-transfer-flow may be performed to transfer the pre-processed single crystal silicon donor wafer on top of the acceptor wafer as illustrated in FIG. 43C. The cleaved surface 4316 may or may not be smoothed by a combination of CMP, chemical polish, and epitaxial (EPI) smoothing techniques.

Figure 44A:
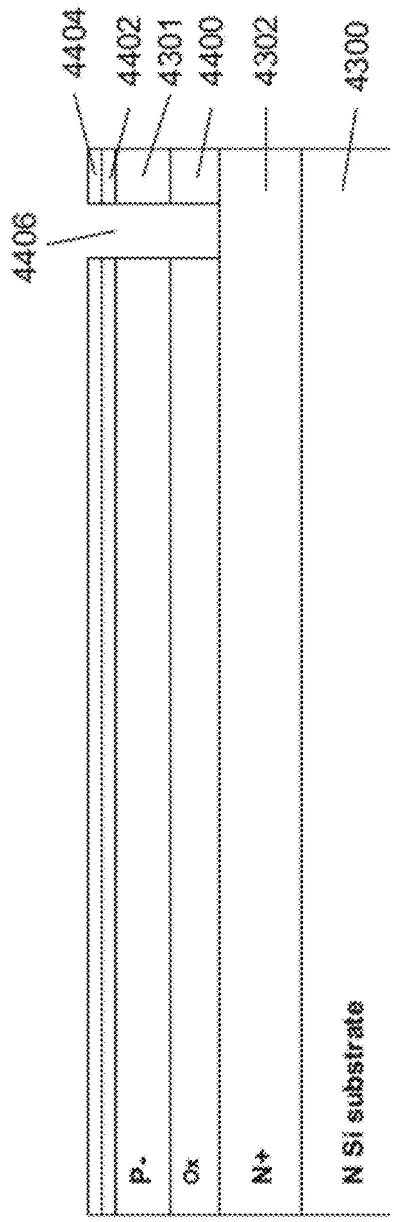
FIG. 44 A-F is an exemplary drawing illustration of steps for formation of a 3D cell.
Figure 44B:
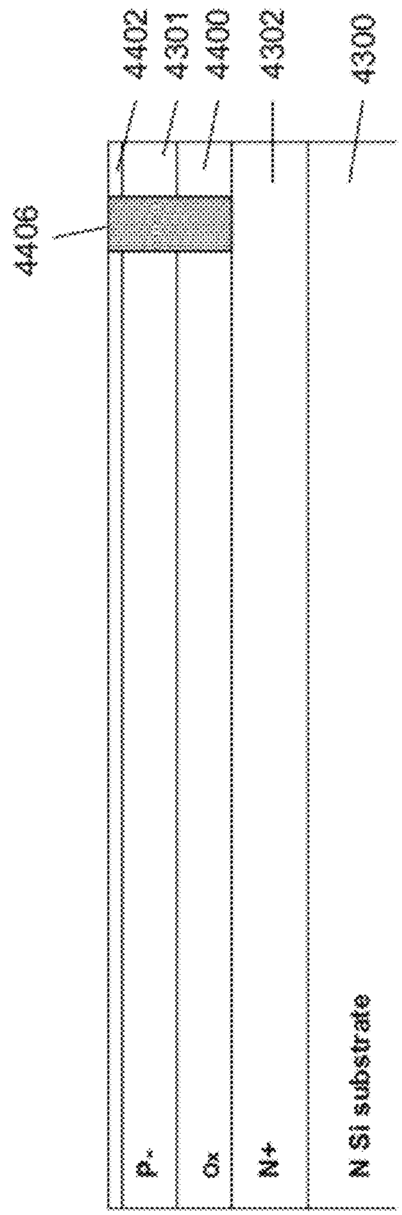

A process flow to create devices and interconnect to build the 3D library may be illustrated in FIGS. 44A to G. As illustrated in FIG. 44A, a polish stop layer 4404, such as silicon nitride or amorphous carbon, may be deposited after a protecting oxide layer 4402. The NMOS source to ground connection 4406 may be masked and etched to contact the heavily doped N+ layer 4302 that serves as a ground plane. This may be done at typical contact layer size and precision. For the sake of clarity, the two oxide layers, oxide 4304 from the acceptor and oxide 4312 from the donor wafer, may be combined and designated as 4400. The NMOS source to ground connection 4406 may be filled with a deposition of heavily doped polysilicon or amorphous silicon, or a high melting point metal such as tungsten, and then chemically mechanically polished as illustrated in FIG. 44B to the level of the protecting oxide layer 4402.

Figure 44C:
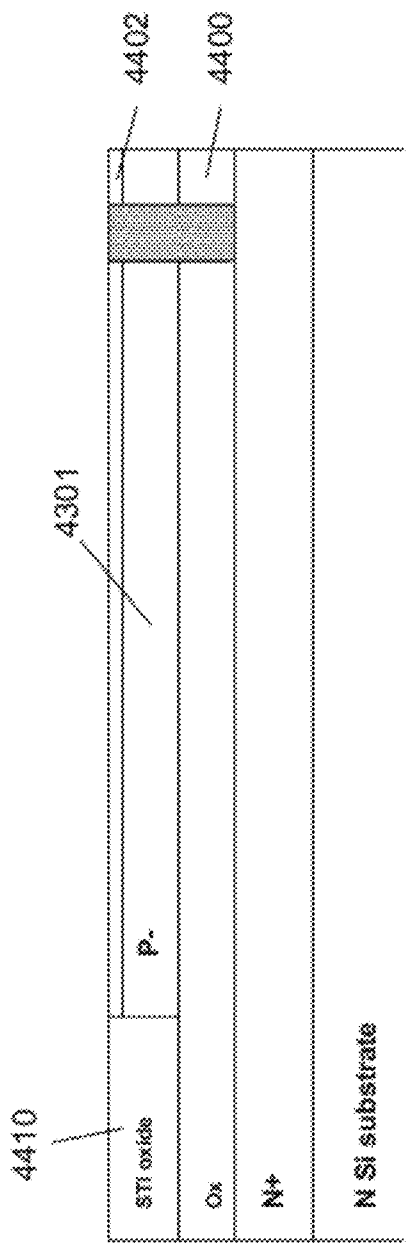

Now a standard NMOS transistor formation process flow may be performed, with two exceptions. First, no photolithographic masking steps may be used for an implant step that differentiates NMOS and PMOS devices, as only the NMOS devices may be formed now. Second, high temperature anneal steps may or may not be done during the NMOS formation, as some or substantially all of the necessary anneals can be done after the PMOS formation described later. A typical shallow trench (STI) isolation region 4410 may be formed between the eventual NMOS transistors by masking, plasma etching of the unmasked regions of P− layer 4301 to the oxide layer 4400, stripping the masking layer, depositing a gap-fill oxide, and chemical mechanically polishing the gap-fill oxide flat as illustrated in FIG. 44C. Threshold adjust implants may or may not be performed at this time. The silicon surface may be cleaned of remaining oxide with an HF (Hydrofluoric Acid) etch.

Figure 44D:
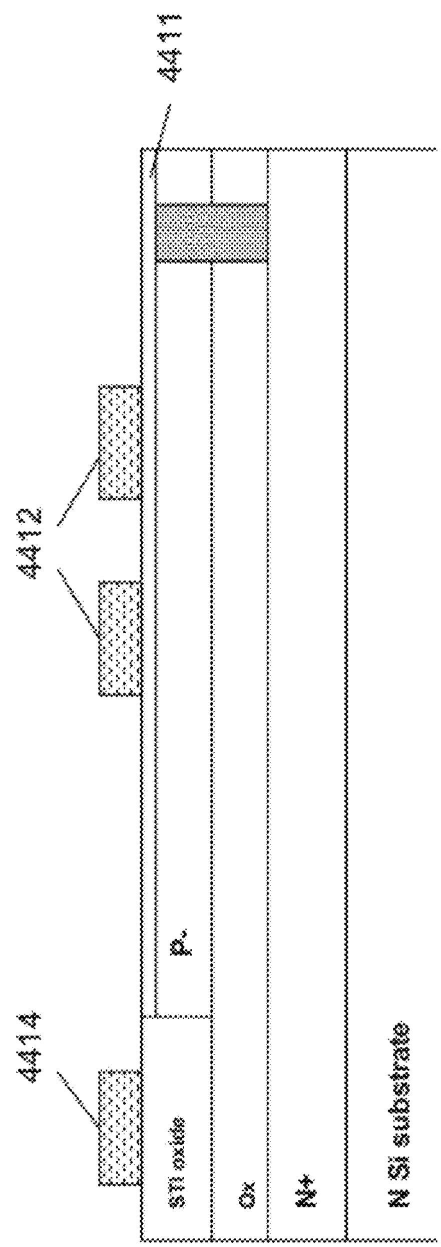

A gate oxide 4411 may be thermally grown and doped polysilicon may be deposited to form the gate stack. The gate stack may be lithographically defined and etched, creating NMOS gates 4412 and the poly on STI interconnect 4414 as illustrated in FIG. 44D. Alternatively, a high-k metal gate process sequence may be utilized at this stage to form the NMOS gate 4412 stacks and poly on STI interconnect 4414. Gate stack self-aligned LDD (Lightly Doped Drain) and halo punch-thru implants may be performed at this time to adjust junction and transistor breakdown characteristics.

Figure 44E:
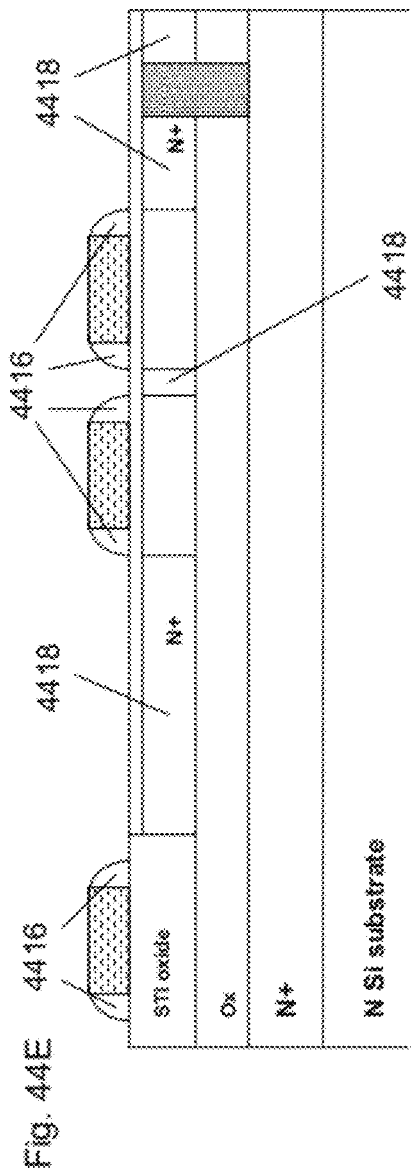
Figure 44F:
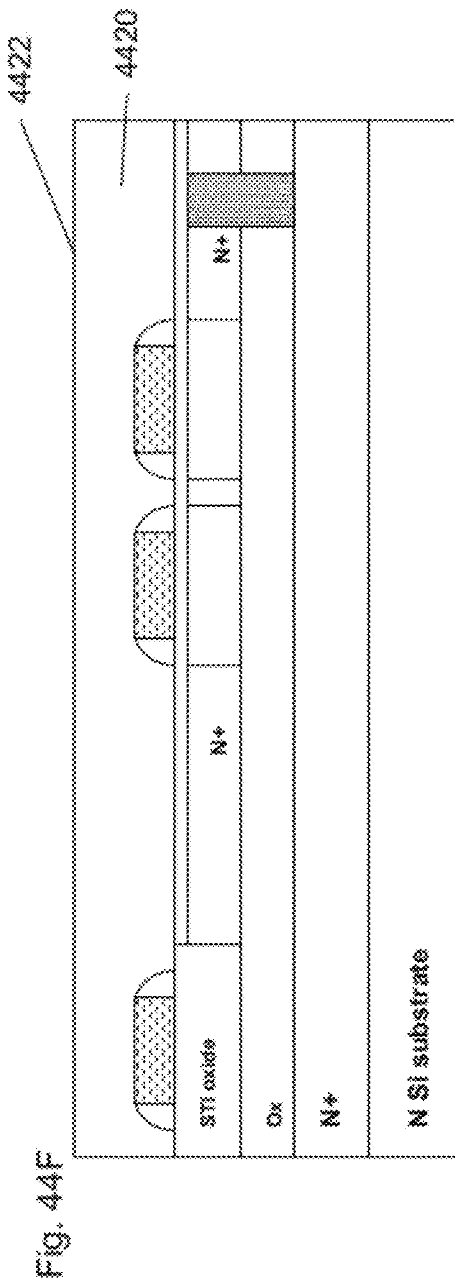

FIG. 44E illustrates a typical spacer deposition of oxide and nitride and a subsequent etchback, to form implant offset spacers 4416 on the gate stacks and then a self-aligned N+ source and drain implant may be performed to create the NMOS transistor source and drain 4418. High temperature anneal steps may or may not be done at this time to activate the implants and set initial junction depths. A self-aligned silicide may then be formed. Additionally, one or more metal interconnect layers with associated contacts and vias (not shown) may be constructed utilizing standard semiconductor manufacturing processes. The metal layer may be constructed at lower temperature using such metals as Copper or Aluminum, or may be constructed with refractory metals such as Tungsten to provide high temperature utility at greater than about 400 degrees Centigrade. A thick oxide 4420 may be deposited as illustrated in FIG. 44F and CMP'd (chemical mechanically polished) flat. The wafer surface 4422 may be treated with a plasma activation in preparation to be an acceptor wafer for the next layer transfer.

Figure 45A:
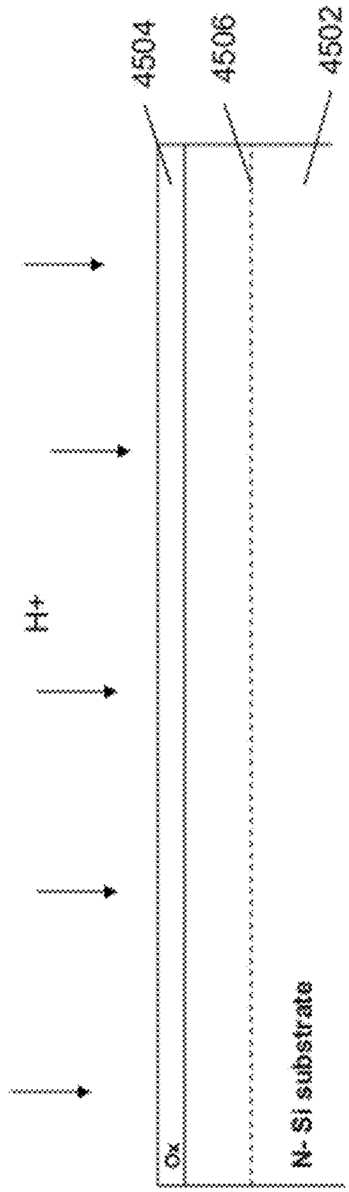
FIG. 45 A-G is an exemplary drawing illustration of steps for formation of a 3D cell.

A donor wafer to create PMOS devices may be preprocessed to prepare for layer transfer as illustrated in FIG. 45A. An N− wafer 4502 may be processed to make it ready for a layer transfer by a deposition or growth of an oxide 4504, surface plasma treatments, and by an implant of an atomic species, such as H+, preparing the SmartCut cleaving plane 4506.

Figure 45B:
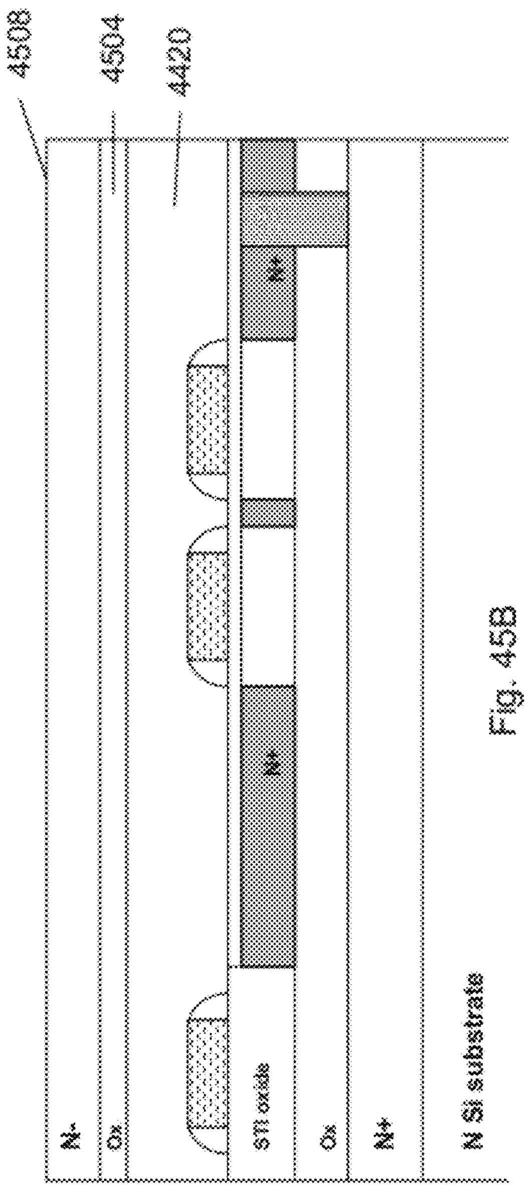

Now a layer-transfer-flow may be performed to transfer the pre-processed single crystal silicon donor wafer on top of the acceptor wafer as illustrated in FIG. 45B, bonding the acceptor wafer oxide 4420 to the donor wafer oxide 4504. To optimize the PMOS mobility, the donor wafer may be rotated 90 degrees with respect to the acceptor wafer as part of the bonding process to facilitate creation of the PMOS channel in the <110> silicon plane direction. The cleaved surface 4508 may or may not be smoothed by a combination of CMP, chemical polish, and epitaxial (EPI) smoothing techniques.

For the sake of clarity, the two oxide layers, oxide 4420 from the acceptor and oxide 4504 from the donor wafer, are combined and designated as 4500. Now a standard PMOS transistor formation process flow may be performed, with one exception. No photolithographic masking steps may be used for the implant steps that differentiate NMOS and PMOS devices, as only the PMOS devices may be formed now. An advantage of this 3D cell structure may be the independent formation of the PMOS transistors and the NMOS transistors. Therefore, each transistor formation may be optimized independently. This may be accomplished by the independent selection of the crystal orientation, various stress materials and techniques, such as, for example, doping profiles, material thicknesses and compositions, temperature cycles, and so forth.

Figure 45C:
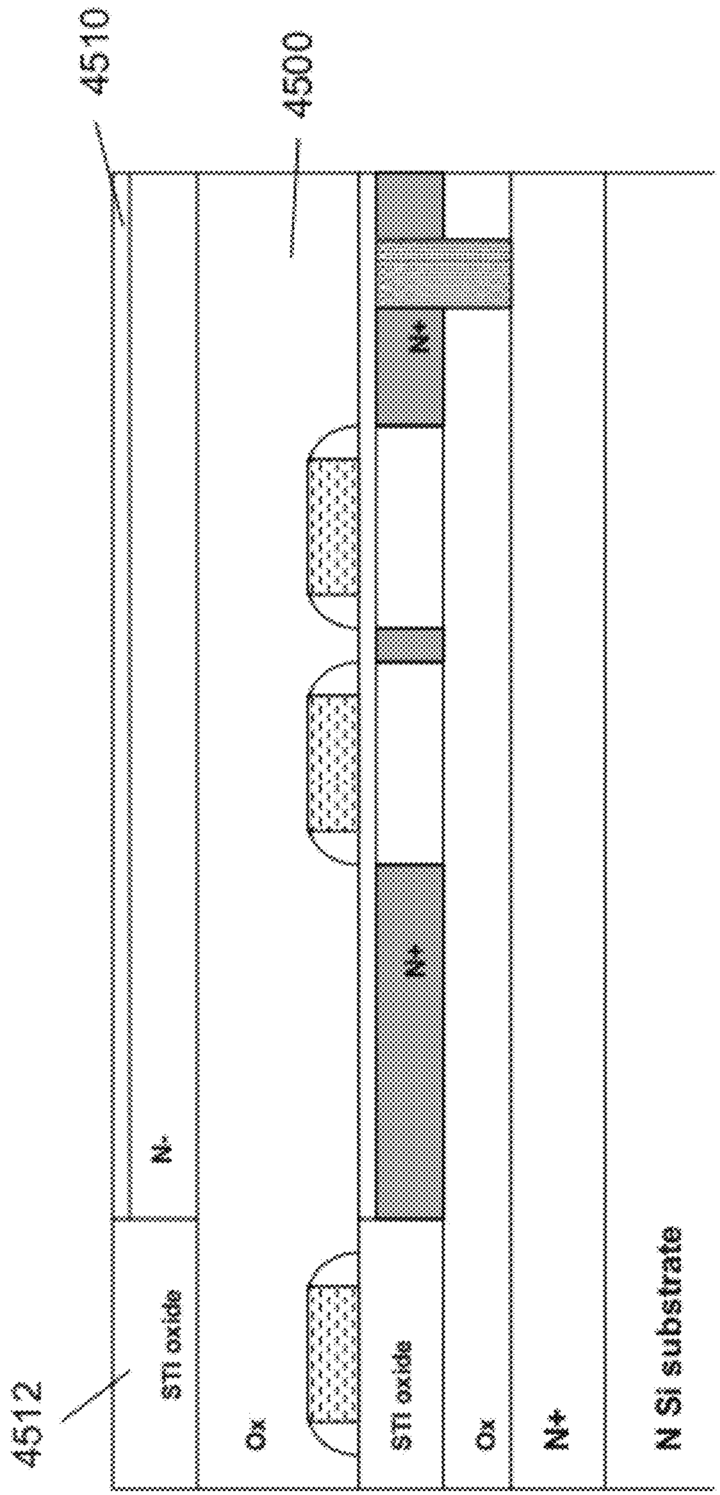

A polishing stop layer, such as silicon nitride or amorphous carbon, may be deposited after a protecting oxide layer 4510. A typical shallow trench (STI) isolation region 4512 may be formed between the eventual PMOS transistors by lithographic definition, plasma etching to the oxide layer 4500, depositing a gap-fill oxide, and chemical mechanically polishing flat as illustrated in FIG. 45C. Threshold adjust implants may or may not be performed at this time.

Figure 45D:
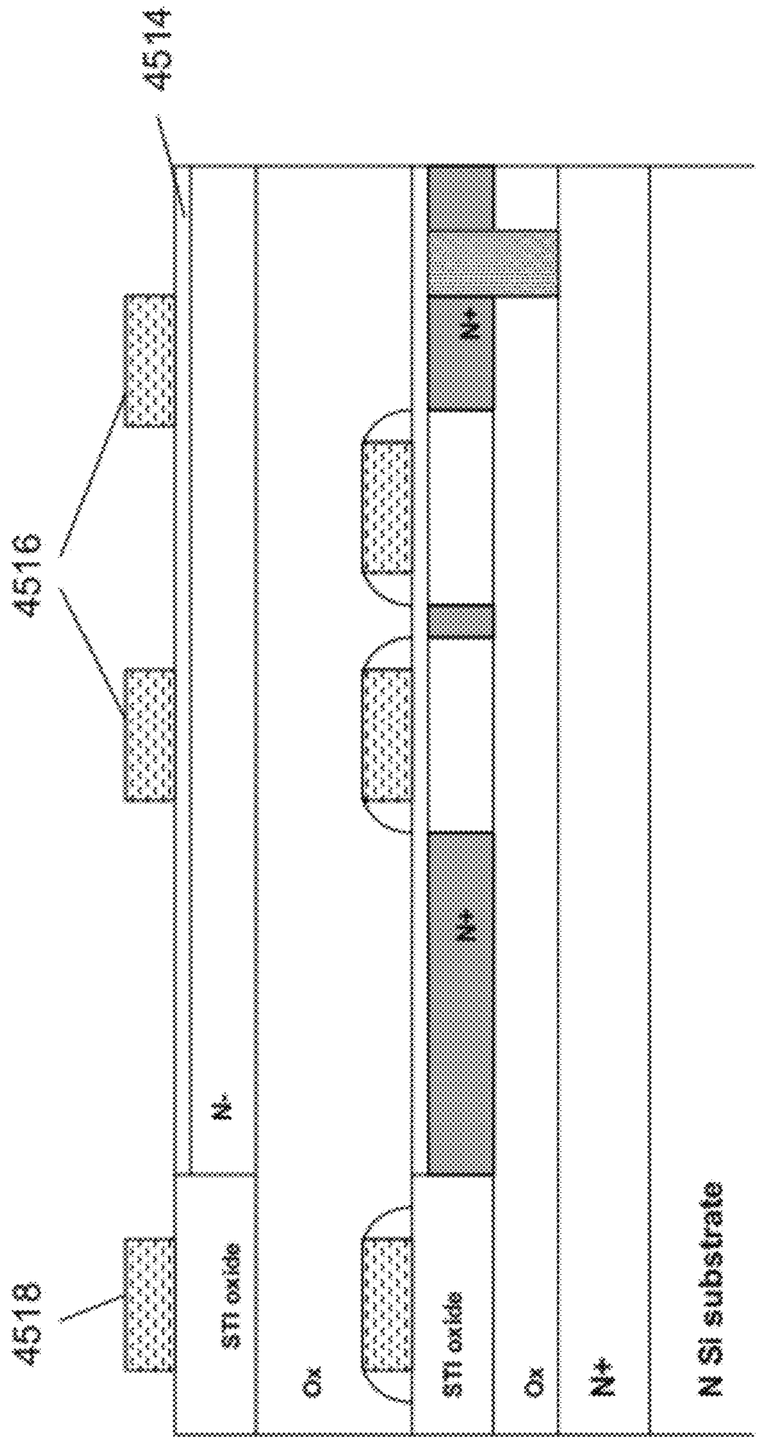

The silicon surface may be cleaned of remaining oxide with an HF (Hydrofluoric Acid) etch. A gate oxide 4514 may be thermally grown and doped polysilicon may be deposited to form the gate stack. The gate stack may be lithographically defined and etched, creating PMOS gates 4516 and the poly on STI interconnect 4518 as illustrated in FIG. 45D. Alternatively, a high-k metal gate process sequence may be utilized at this stage to form the PMOS gate 4516 stacks and the poly on STI interconnect 4518. Gate stack self-aligned LDD (Lightly Doped Drain) and halo punch-thru implants may be performed at this time to adjust junction and transistor breakdown characteristics.

Figure 45E:
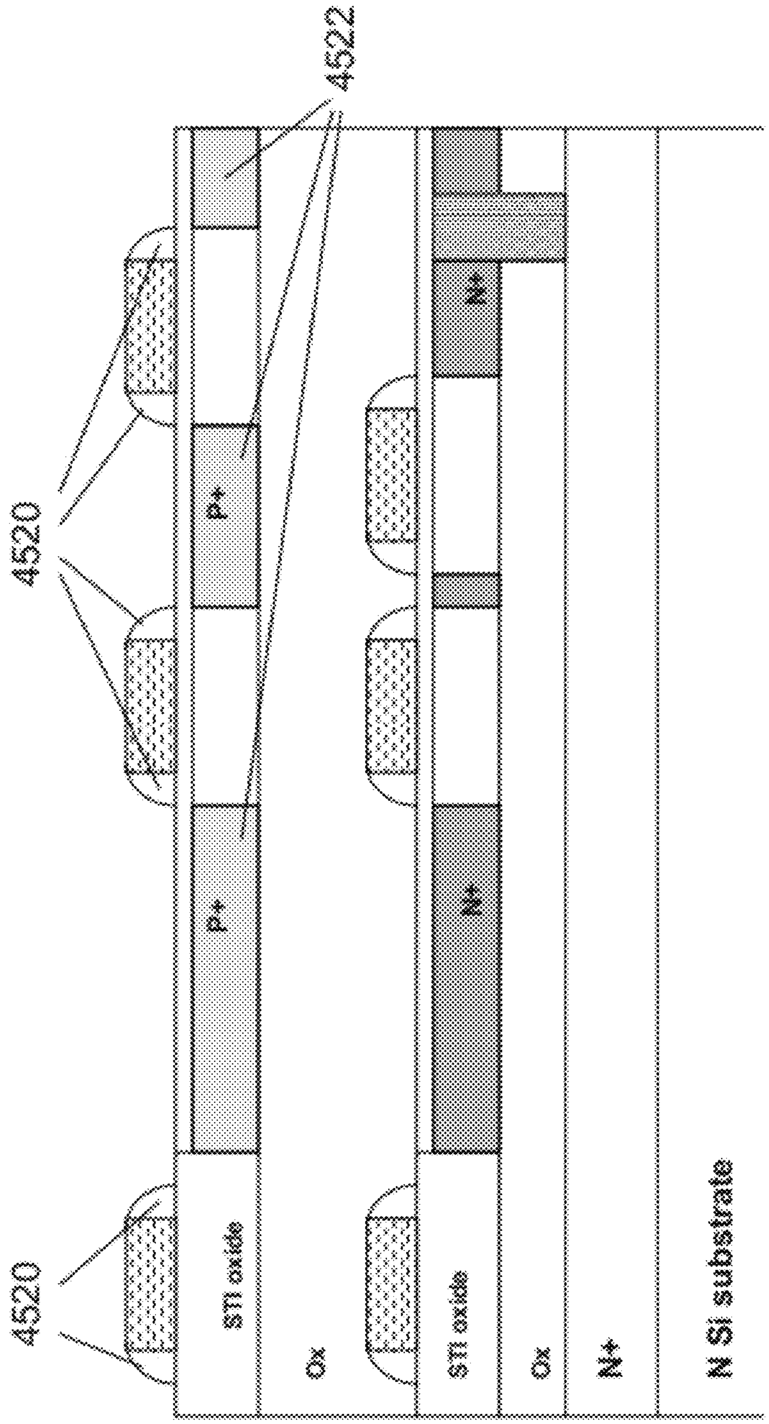

FIG. 45E illustrates a typical spacer deposition of oxide and nitride and a subsequent etchback, to form implant offset spacers 4520 on the gate stacks and then a self-aligned P+ source and drain implant may be performed to create the PMOS transistor source and drain regions 4522. Thermal anneals to activate implants and set junctions in both the PMOS and NMOS devices may be performed with RTA (Rapid Thermal Anneal), or flash anneal, or furnace thermal exposures. Alternatively, laser annealing may be utilized after the NMOS and PMOS sources and drain implants to activate implants and set the junctions. Optically absorptive and reflective layers as described previously may be employed to anneal implants and activate junctions.

Figure 45F:
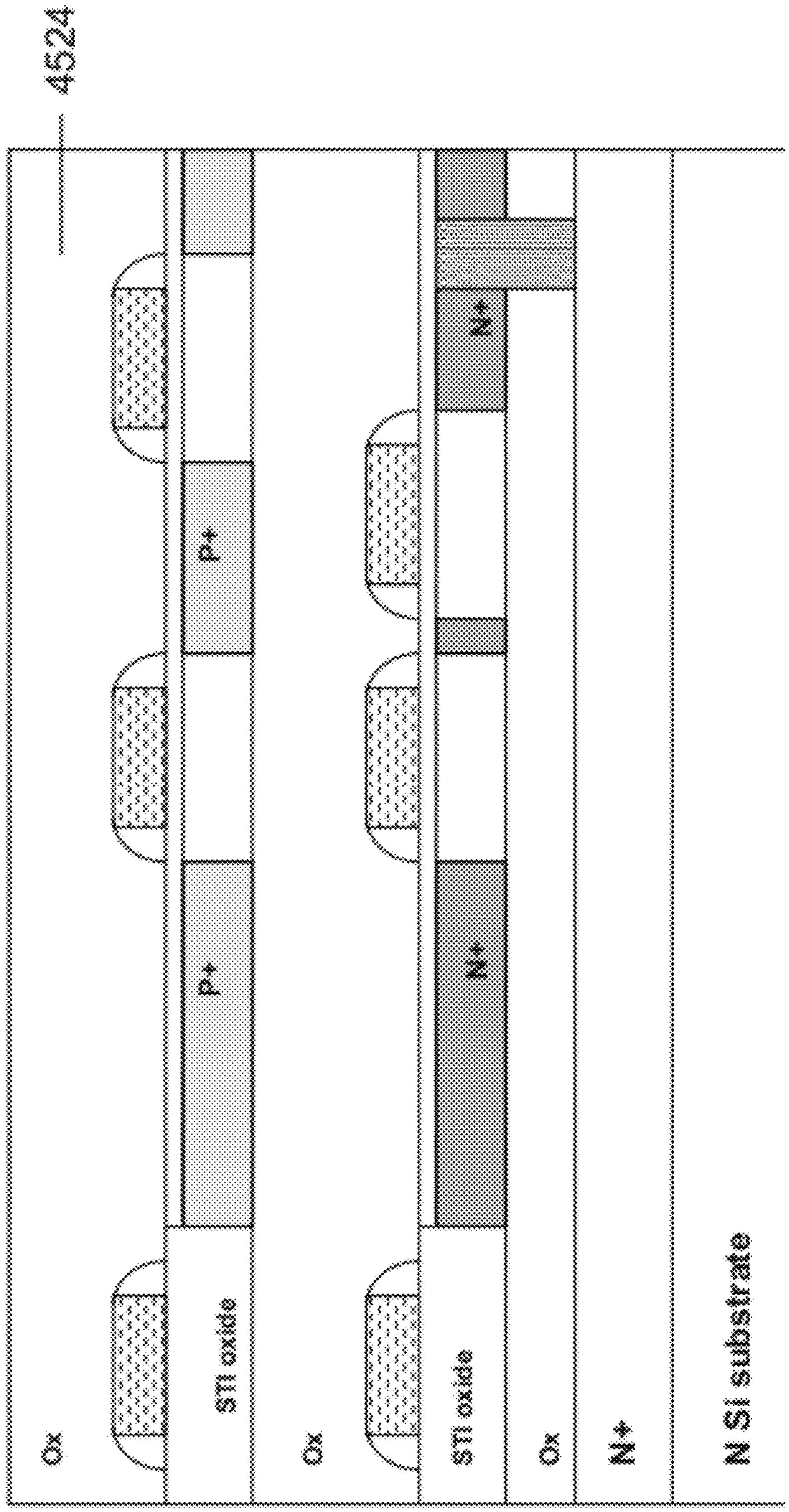

A thick oxide 4524 may be deposited as illustrated in FIG. 45F and CMP'ed (chemical mechanically polished) flat.

Figure 45G:
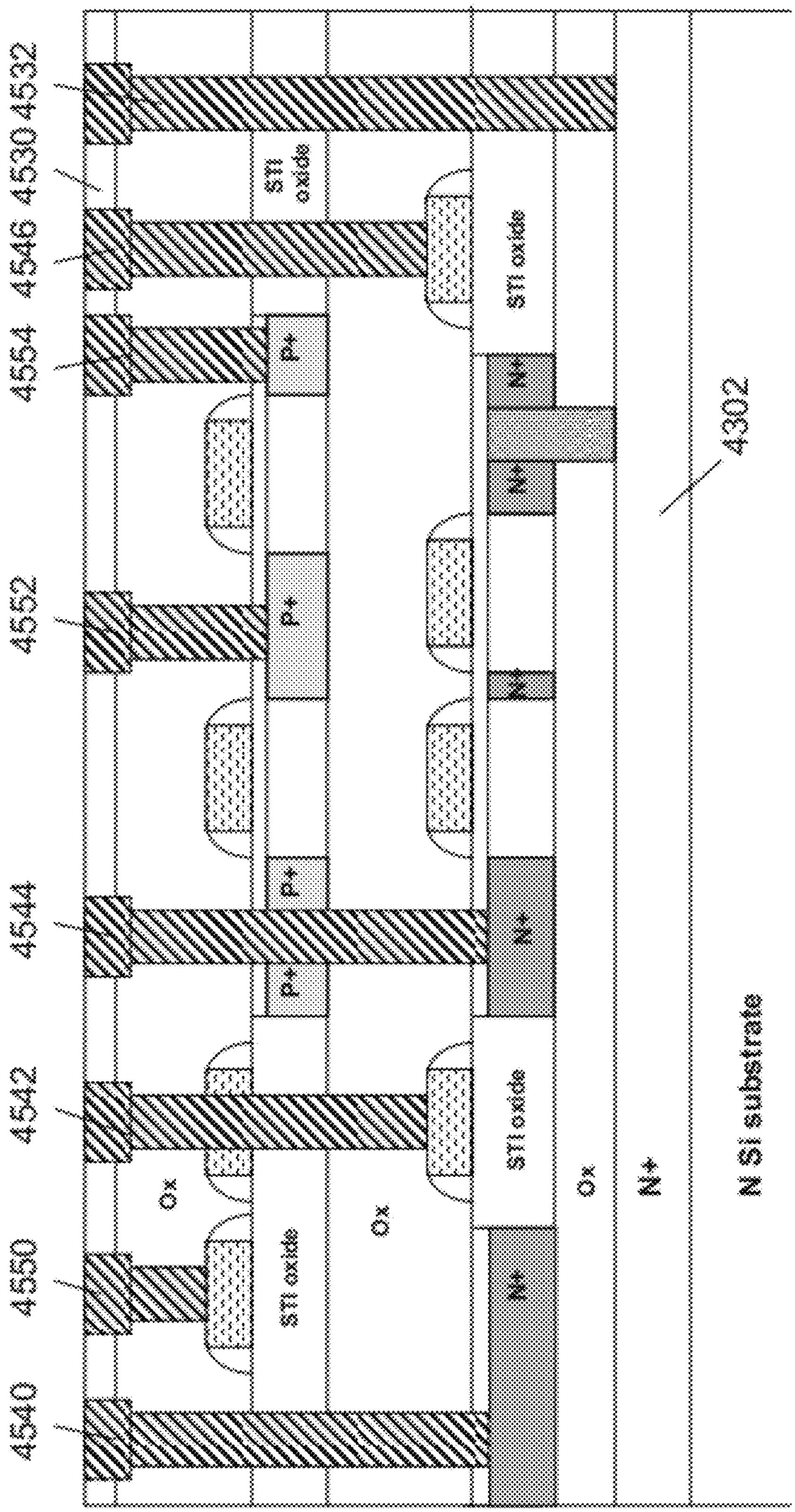

FIG. 45G illustrates the formation of the three groups of eight interlayer contacts. An etch stop and polishing stop layer or layers 4530 may be deposited, such as silicon nitride or amorphous carbon. First, the deepest contact 4532 to the N+ ground plane layer 4302, as well as the NMOS drain only contact 4540 and the NMOS only gate on STI contact 4546 may be masked and etched in a first contact step. Then the NMOS & PMOS gate on STI interconnect contact 4542 and the NMOS and PMOS drain contact 4544 may be masked and etched in a second contact step. Then the PMOS level contacts may be masked and etched: the PMOS gate interconnect on STI contact 4550, the PMOS only source contact 4552, and the PMOS only drain contact 4554 in a third contact step. Alternatively, the shallowest contacts may be masked and etched first, followed by the mid-level, and then the deepest contacts. The metal lines may be mask defined and etched, filled with barrier metals and copper interconnect, and CMP'ed in a normal Dual Damascene interconnect scheme, thereby completing the eight types of contact connections.

Figure 46A:
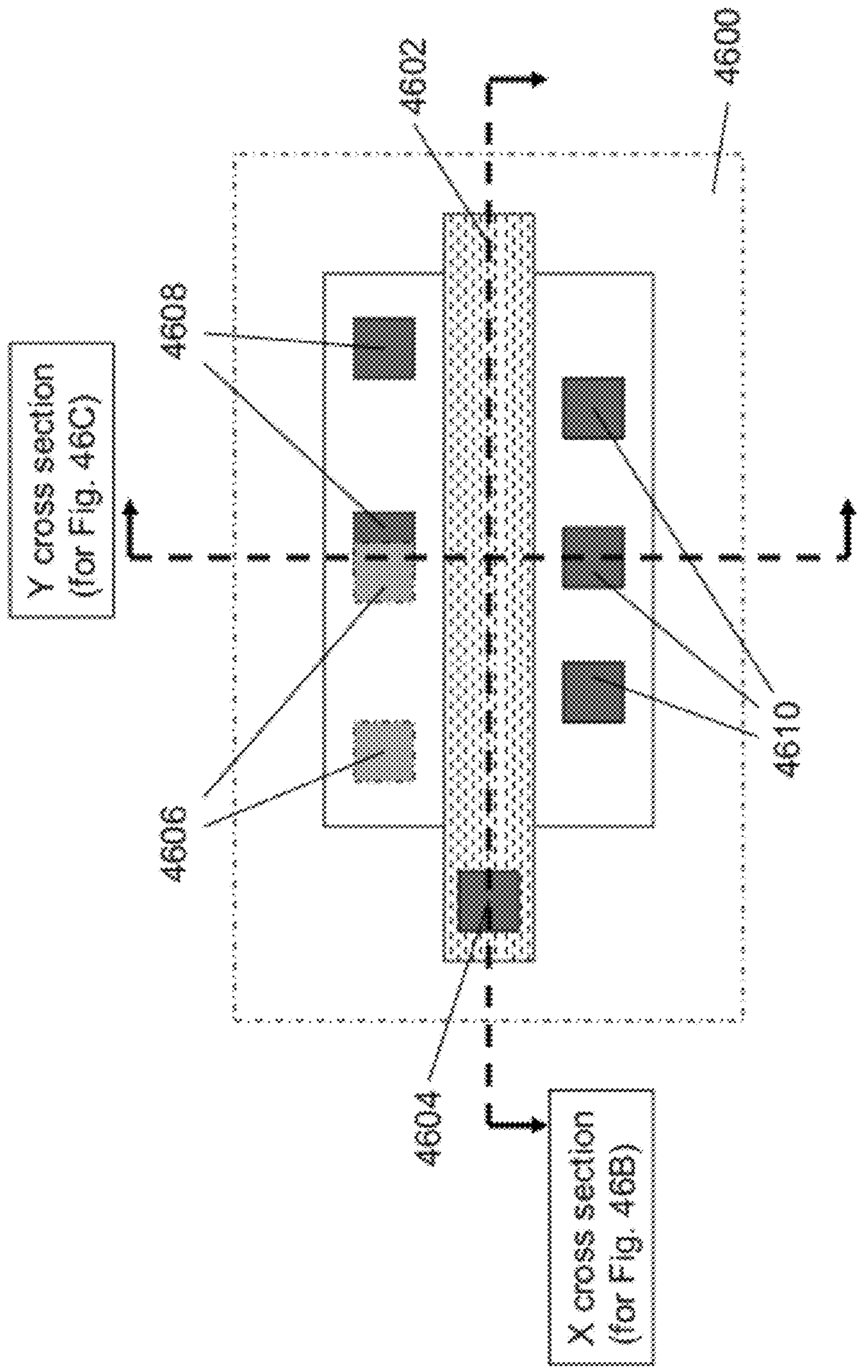
FIG. 46 A-C is an exemplary drawing illustration of a layout and cross sections of a 3D inverter cell.
Figure 46B:
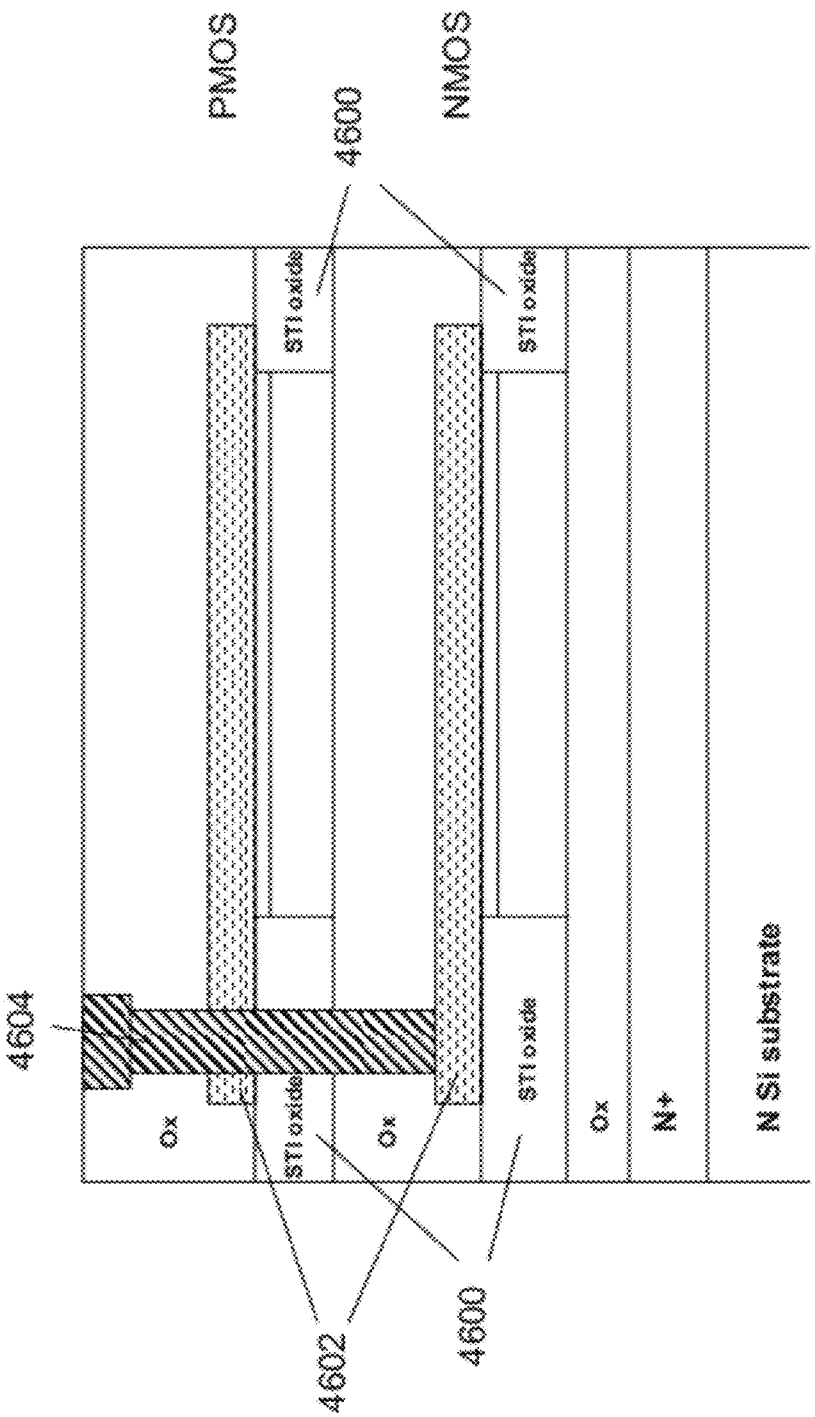
Figure 46C:
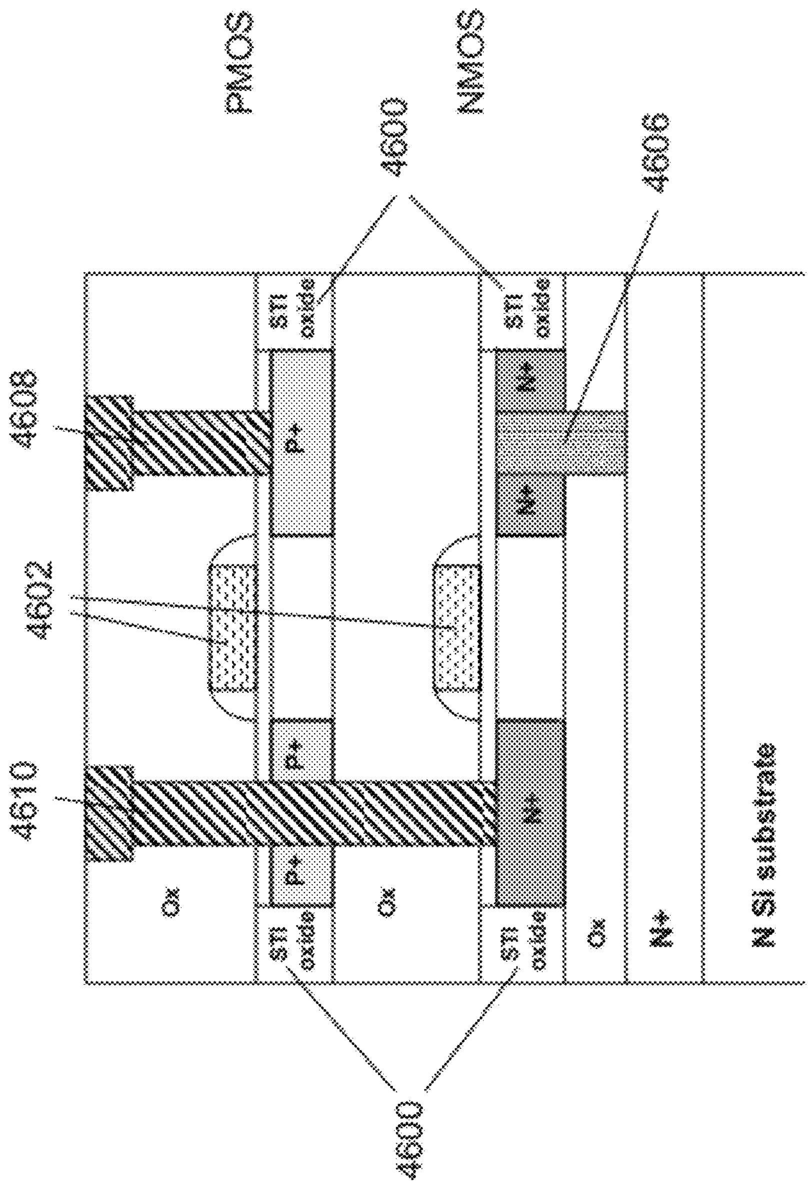

With reference to the 2D CMOS inverter cell schematic and layout illustrated in FIG. 42, the above process flow may be used to construct a compact 3D CMOS inverter cell example as illustrated in FIGS. 46A through 46C. The topside view of the 3D cell is illustrated in FIG. 46A where the STI (shallow trench isolation) 4600 for both NMOS and PMOS is drawn coincident and the PMOS is on top of the NMOS.

The X direction cross sectional view is illustrated in FIG. 46B and the Y direction cross sectional view is illustrated in FIG. 46C. The NMOS and PMOS gates 4602 are drawn coincident and stacked, and are connected by an NMOS gate on STI to PMOS gate on STI contact 4604, which may be similar to contact 4542 in FIG. 45G. This gate may be the connection for inverter input signal A as illustrated in FIG. 42. The N+ source contact to the ground plane 4606, which may be similar to NMOS source to ground connection 4406 contact in FIG. 44B, in FIGS. 46A & C may make the NMOS source to ground connection 4206 illustrated in FIG. 42. The PMOS source contacts 4608, which may be similar to contact 4552 in FIG. 45G, may make the PMOS source connection to +V 4207 as shown in FIG. 42. The NMOS and PMOS drain shared contacts 4610, which may be similar to contact 4544 in FIG. 45G, may make the shared connection NMOS and PMOS drains 4208 as the output Y in FIG. 42. The ground to ground plane contact, similar to contact 4532 in FIG. 45G, is not shown. This contact may not be needed in every cell and may be shared.

Figure 47:
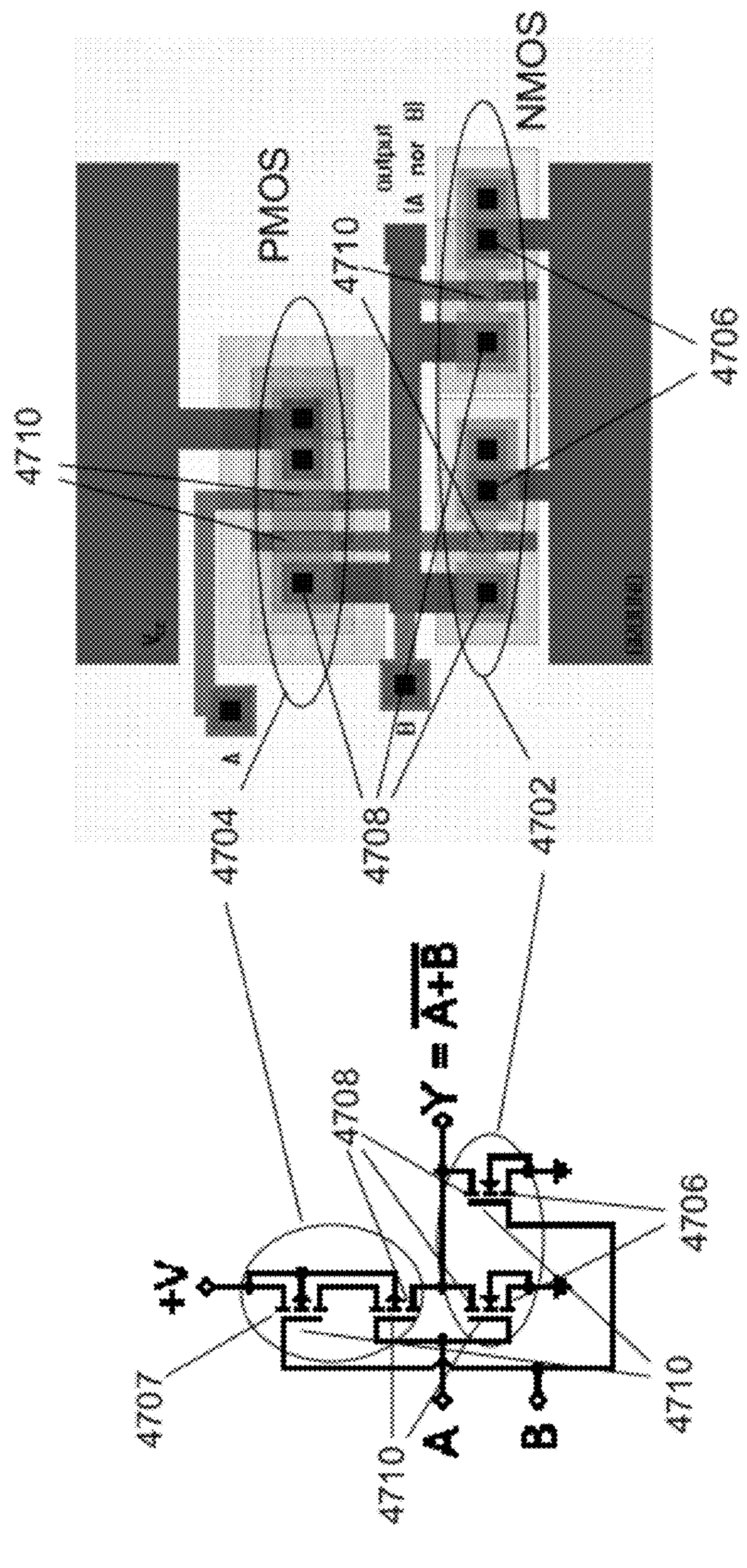
FIG. 47 is an exemplary drawing illustration of a 2-input NOR cell.

Other 3D logic or memory bit cells may be constructed in a similar fashion. An example of a typical 2D 2-input NOR cell schematic and layout is illustrated in FIG. 47. The NMOS transistors 4702 and the PMOS transistors 4704 may be laid out side by side and are in differently doped wells. The NMOS sources 4706 may be typically grounded, both of the NMOS drains and one of the PMOS drains may be electrically tied together in shared connection 4708 to generate the output Y, and the NMOS & PMOS gates 4710 may be electrically paired together for input A or input B. The structure built in 3D described below may take advantage of these connections in the 3rd dimension.

Figure 48A:
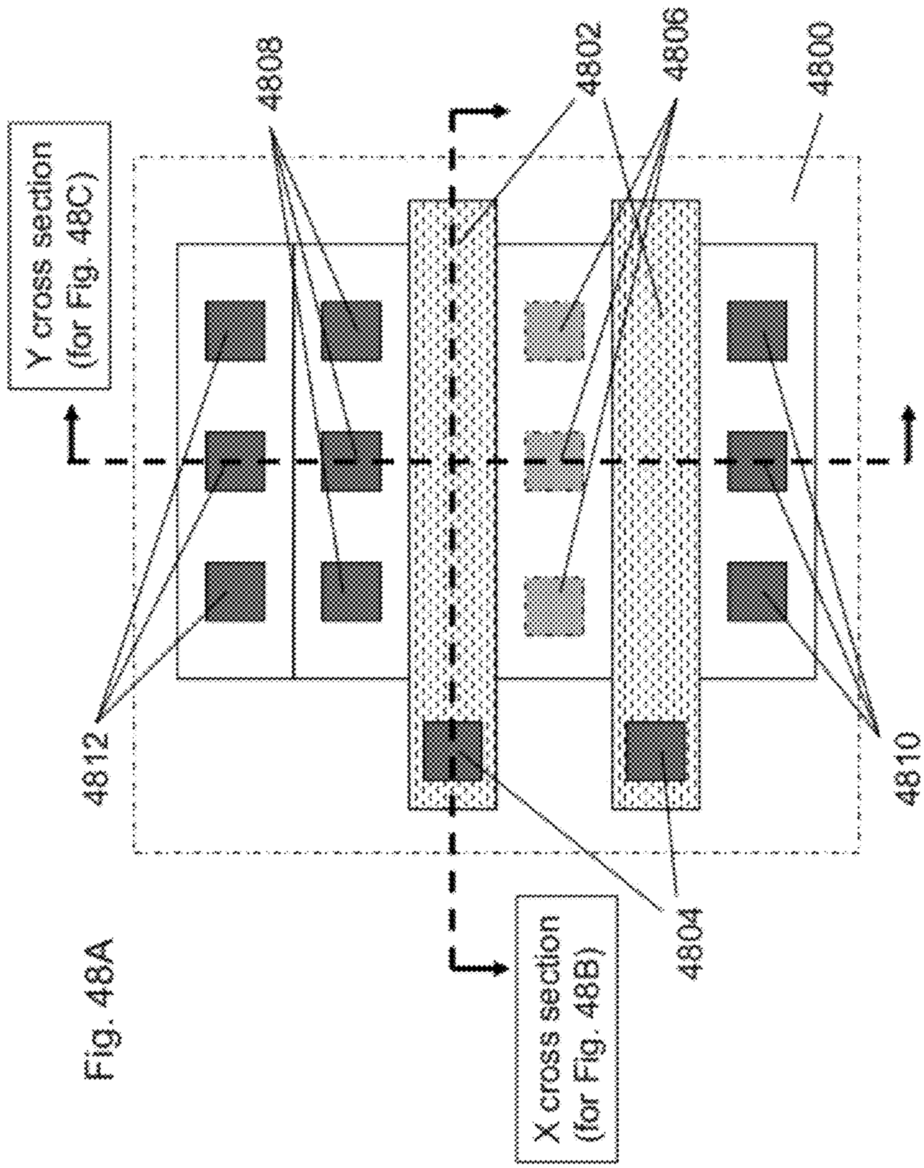
FIG. 48 A-C are exemplary drawing illustrations of a layout and cross sections of a 3D 2-input NOR cell.
Figure 48B:
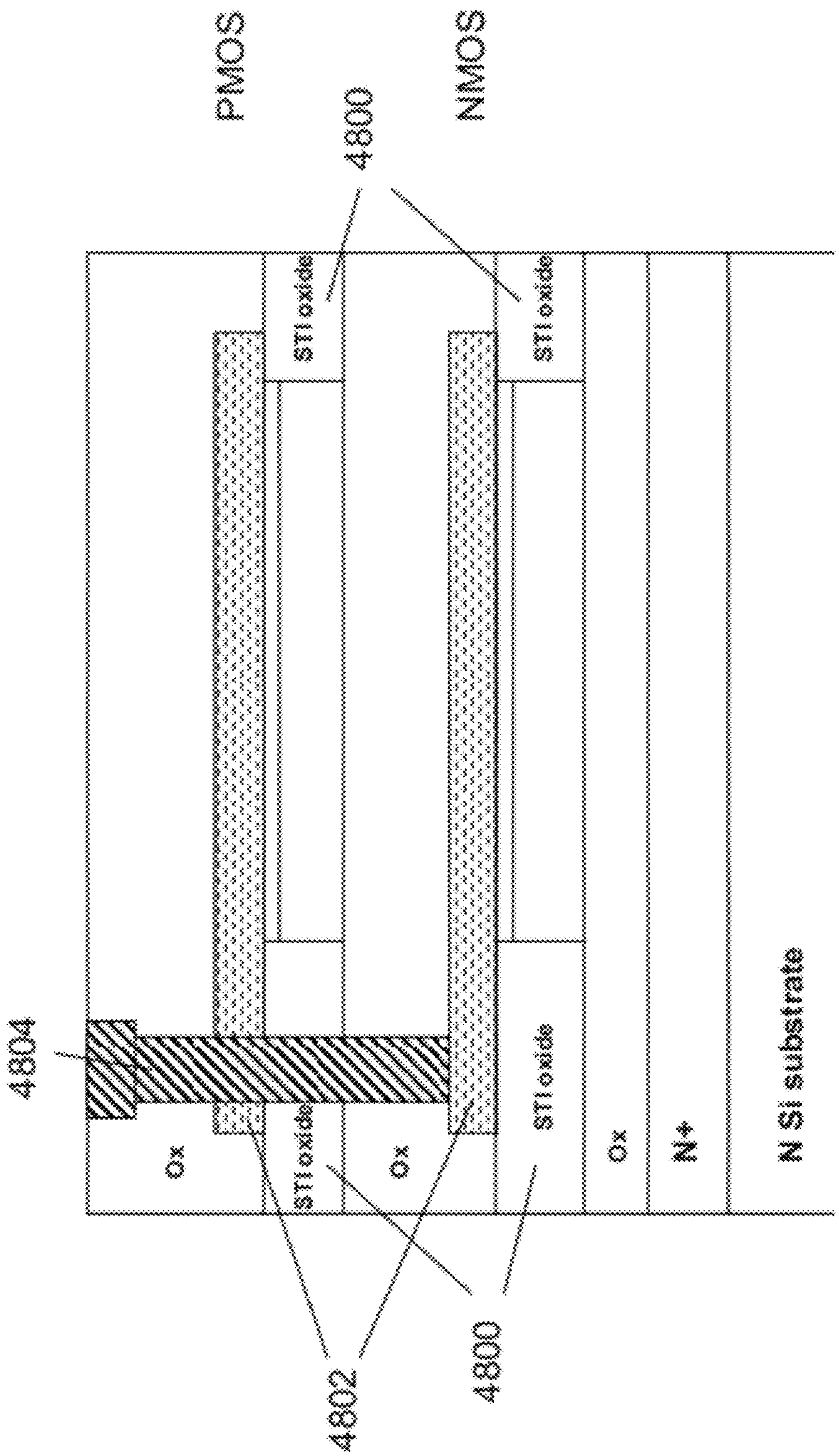
Figure 48C:
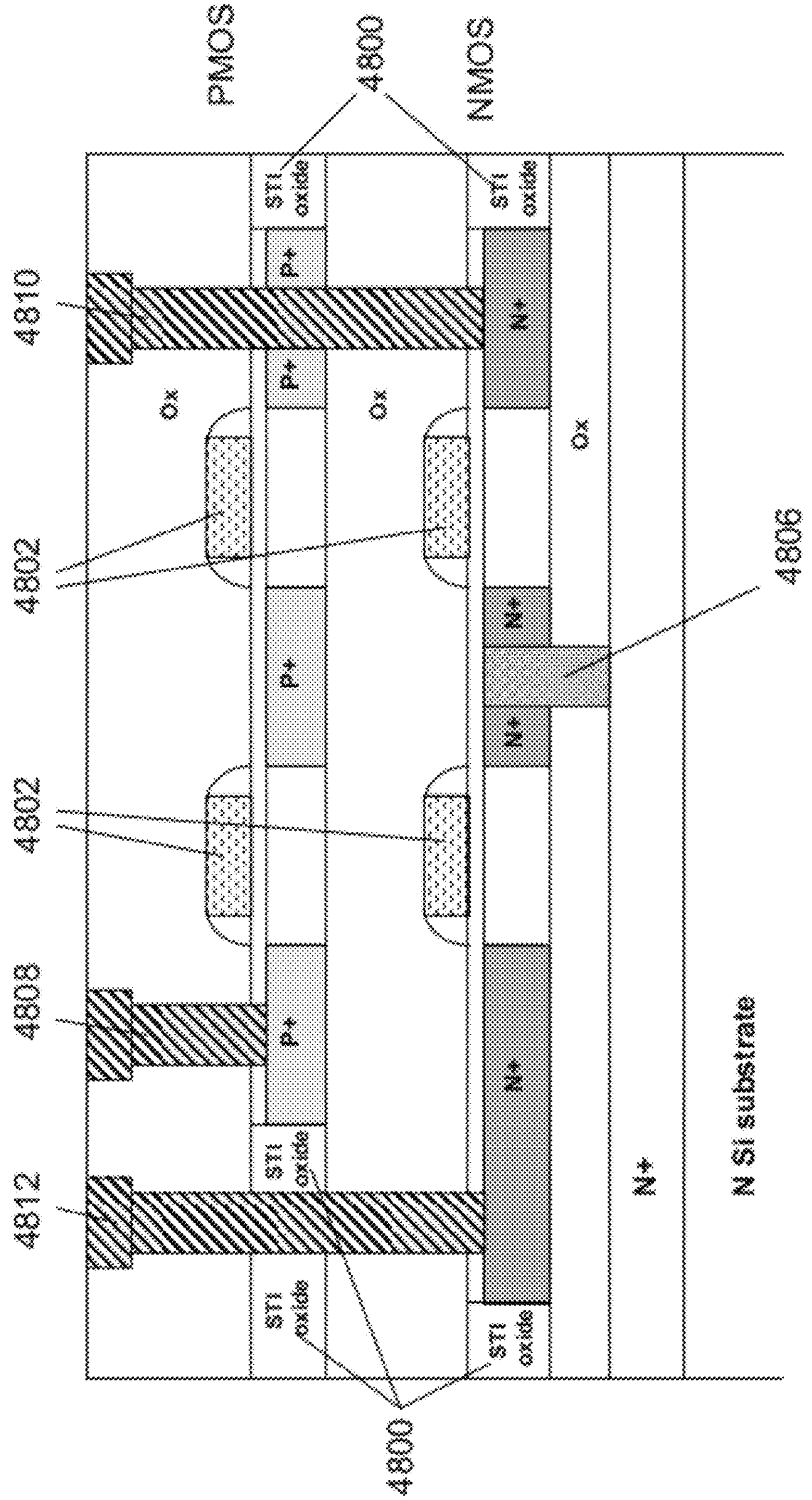

The above process flow may be used to construct a compact 3D 2-input NOR cell example as illustrated in FIGS. 48A through 48C. The topside view of the 3D cell is illustrated in FIG. 48A where the STI (shallow trench isolation) 4800 for both NMOS and PMOS is drawn coincident on the bottom and sides, and not on the top silicon layer to allow NMOS drain only connections to be made. The cell X cross sectional view is illustrated in FIG. 48B and the Y cross sectional view is illustrated in FIG. 48C.

The NMOS and PMOS gates 4802 are drawn coincident and stacked, and each are connected by a NMOS gate on STI to PMOS gate on STI contact 4804, which may be similar to contact 4542 in FIG. 45G. These gates may be the connections for input signals A & B as illustrated in FIG. 47.

The N+ source contact to the ground plane 4806 in FIGS. 48A & C may make the NMOS source to ground connection 4706 illustrated in FIG. 47. The PMOS source contacts 4808, which may be similar to contact 4552 in FIG. 45G, may make the PMOS source connection to +V 4707 as shown in FIG. 47. The NMOS and PMOS drain shared contacts 4810, which may be similar to contact 4544 in FIG. 45G, may make the shared connection 4708 as the output Y in FIG. 47. The NMOS source contacts 4812, which may be similar to contact 4540 in FIG. 45, may make the NMOS connection to Output Y, which may be connected to the NMOS and PMOS drain shared contacts 4810 with metal to form output Y in FIG. 47. The ground to ground plane contact, similar to contact 4532 in FIG. 45G, is not shown. This contact may not be needed in every cell and may be shared.

Figure 49A:
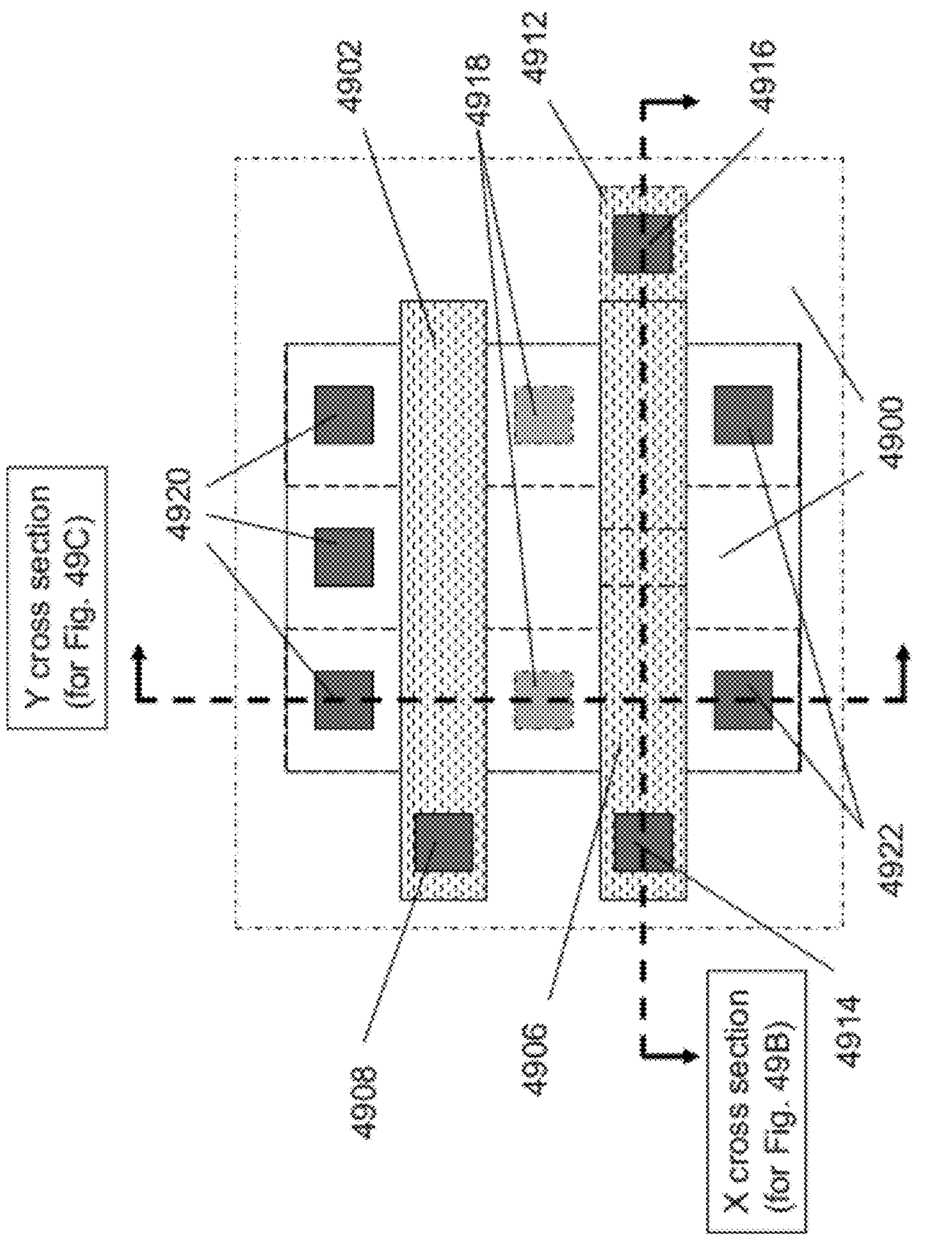
FIG. 49 A-C are exemplary drawing illustrations of a 3D 2-input NOR cell.
Figure 49B:
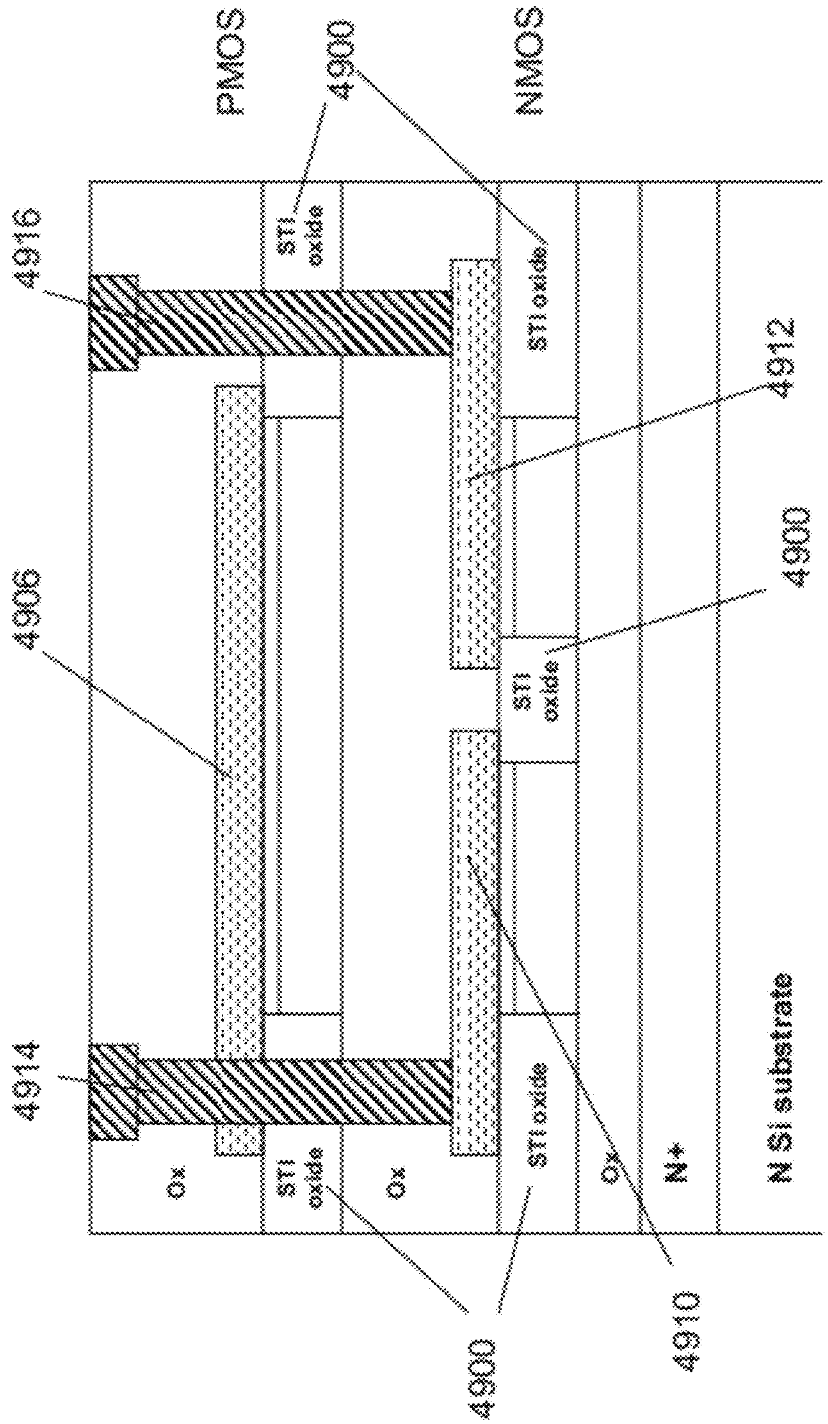
Figure 49C:
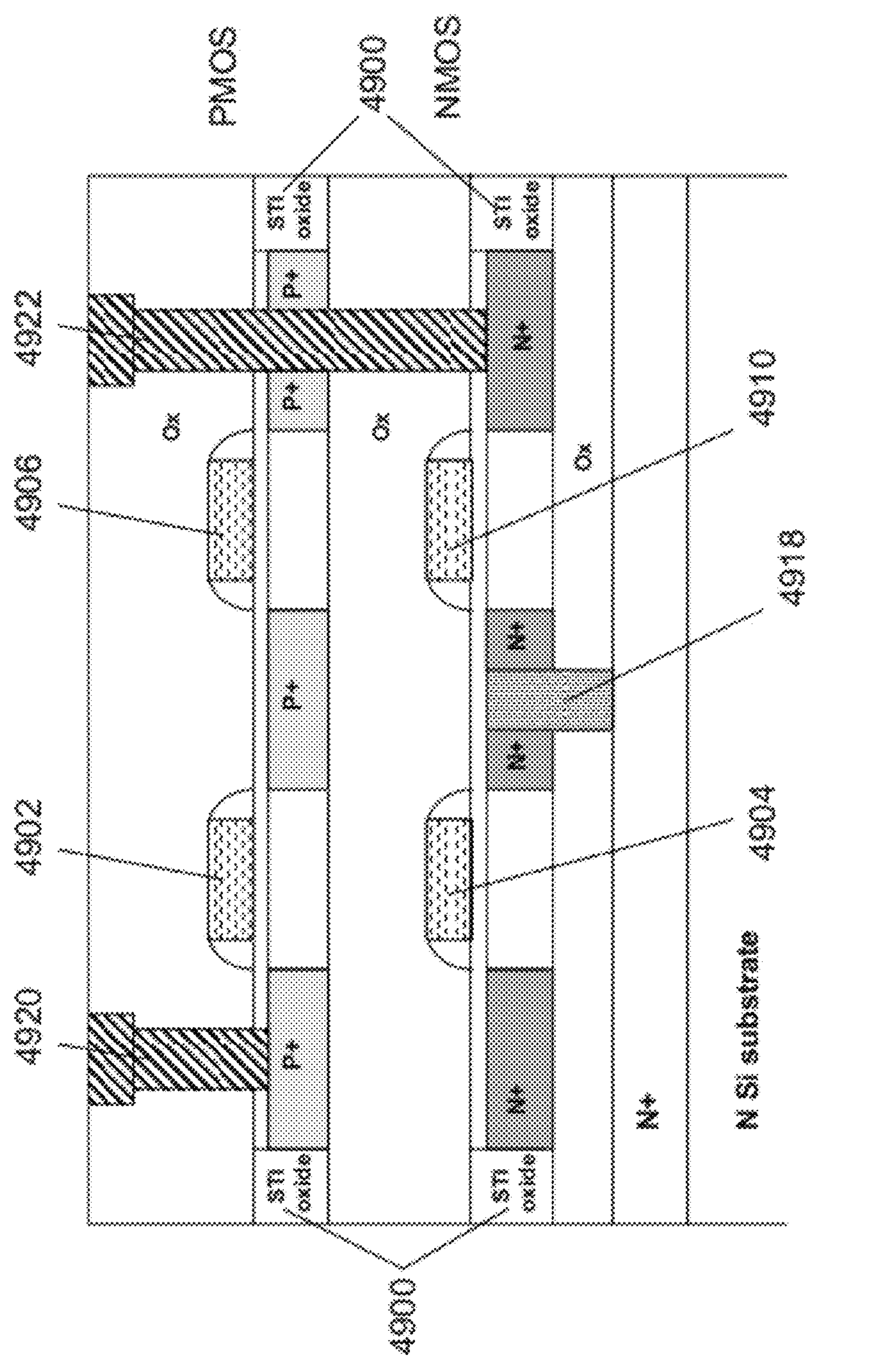

The above process flow may be used to construct an alternative compact 3D 2-input NOR cell example as illustrated in FIGS. 49A through 49C. The topside view of the 3D cell is illustrated in FIG. 49A where the STI (shallow trench isolation) 4900 for both NMOS and PMOS may be drawn coincident on the top and sides, but not on the bottom silicon layer to allow isolation between the NMOS-A and NMOS-B transistors and allow independent gate connections. The NMOS or PMOS transistors referred to with the letter -A or -B identify which NMOS or PMOS transistor gate may be connected to, either the A input or the B input, as illustrated in FIG. 47. The cell X cross sectional view is illustrated in FIG. 49B and the Y cross sectional view is illustrated in FIG. 49C.

The PMOS-B gate 4902 may be drawn coincident and stacked with dummy gate 4904, and the PMOS-B gate 4902 may be connected to input B by PMOS gate only on STI contact 4908. Both the NMOS-A gate 4910 and NMOS-B gate 4912 are drawn underneath the PMOS-A gate 4906. The NMOS-A gate 4910 and the PMOS-A gate 4906 may be connected together and to input A by NMOS gate on STI to PMOS gate on STI contact 4914, which may be similar to contact 4542 in FIG. 45G. The NMOS-B gate 4912 may be connected to input B by a NMOS only gate on STI contact 4916, which may be similar to contact 4546 illustrated in FIG. 45G. These gates may be the connections for input signals A & B 4710 as illustrated in FIG. 47.

The N+ source contact to the ground plane 4918 in FIGS. 49A & C may form the NMOS source to ground connection

4706 illustrated in FIG. 47 and may be similar to ground connection 4406 in FIG. 44B. The PMOS-B source contacts 4920 to Vdd, which are similar to contact 4552 in FIG. 45G, may form the PMOS source connection to +V 4707 as shown in FIG. 47. The NMOS-A, NMOS-B, and PMOS-B drain shared contacts 4922, which may be similar to contact 4544 in FIG. 45G, form the shared connection 4708 as the output Y in FIG. 47. The ground to ground plane contact, similar to contact 4532 in FIG. 45G, is not shown. This contact may not be needed in every cell and may be shared.

Figure 50A:
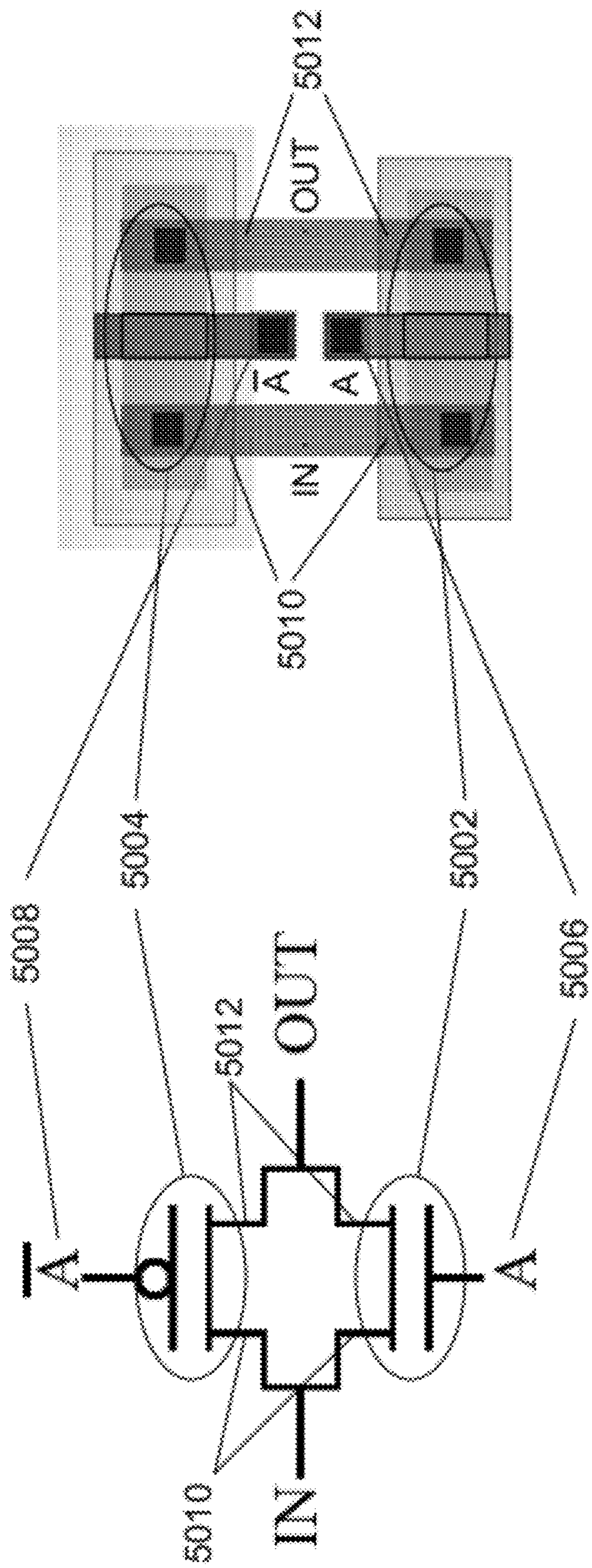
FIG. 50 A-D are exemplary drawing illustrations of a 3D CMOS Transmission cell.

The above process flow may also be used to construct a CMOS transmission gate. An example of a typical 2D CMOS transmission gate schematic and layout is illustrated in FIG. 50A. The NMOS transistor 5002 and the PMOS transistor 5004 may be laid out side by side and may be in differently doped wells. The control signal A as the NMOS gate input 5006 and its complement $\overline{A}$ as the PMOS gate input 5008 may allow a signal from the input to fully pass to the output when both NMOS and PMOS transistors may be turned on (A=1, $\overline{A}$=0), and not to pass any input signal when both are turned off (A=0, $\overline{A}$=1). The NMOS and PMOS sources 5010 may be electrically tied together and to the input, and the NMOS and PMOS drains 5012 may be electrically tied together to generate the output. The structure built in 3D described below may take advantage of these connections in the 3rd dimension.

Figure 50B:
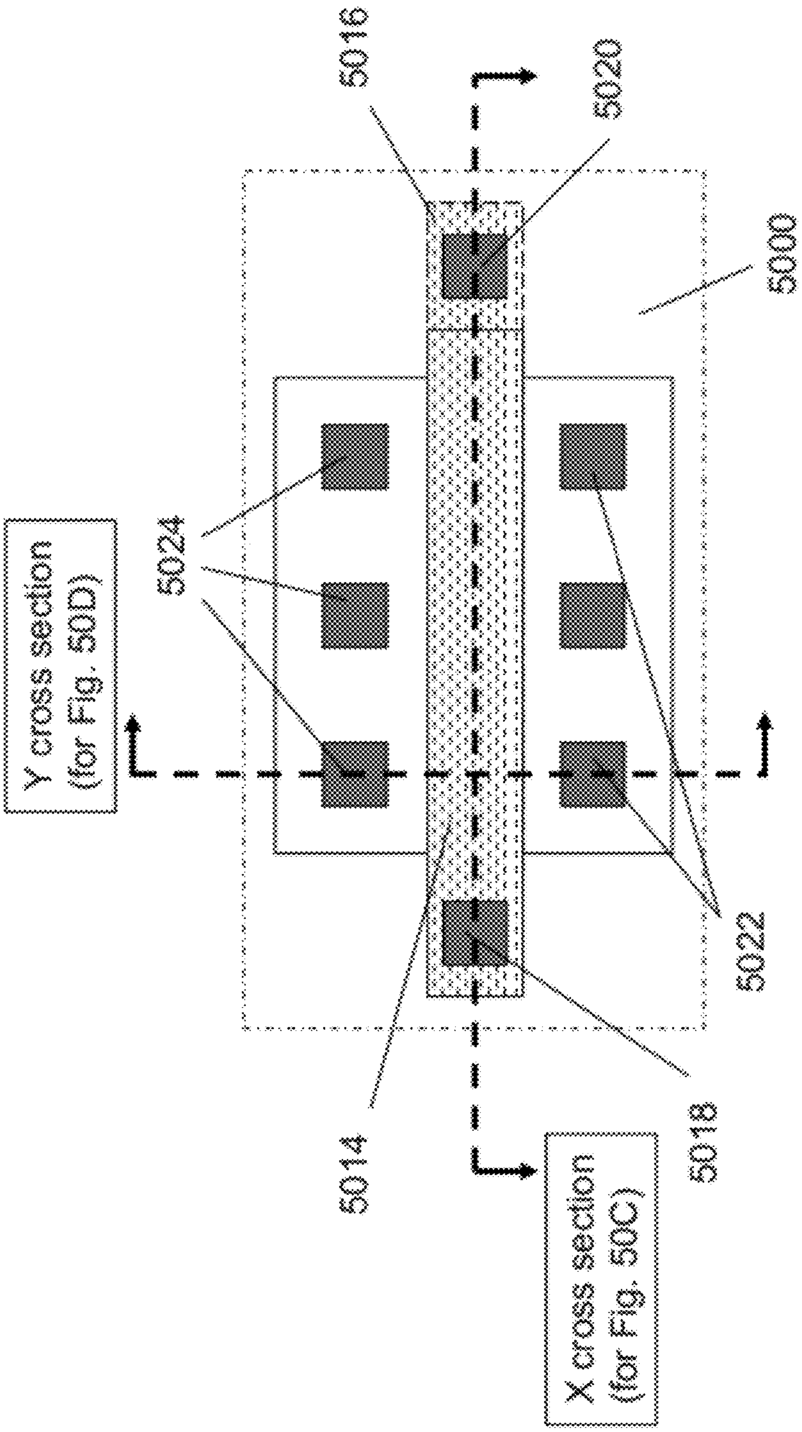
Figure 50C:
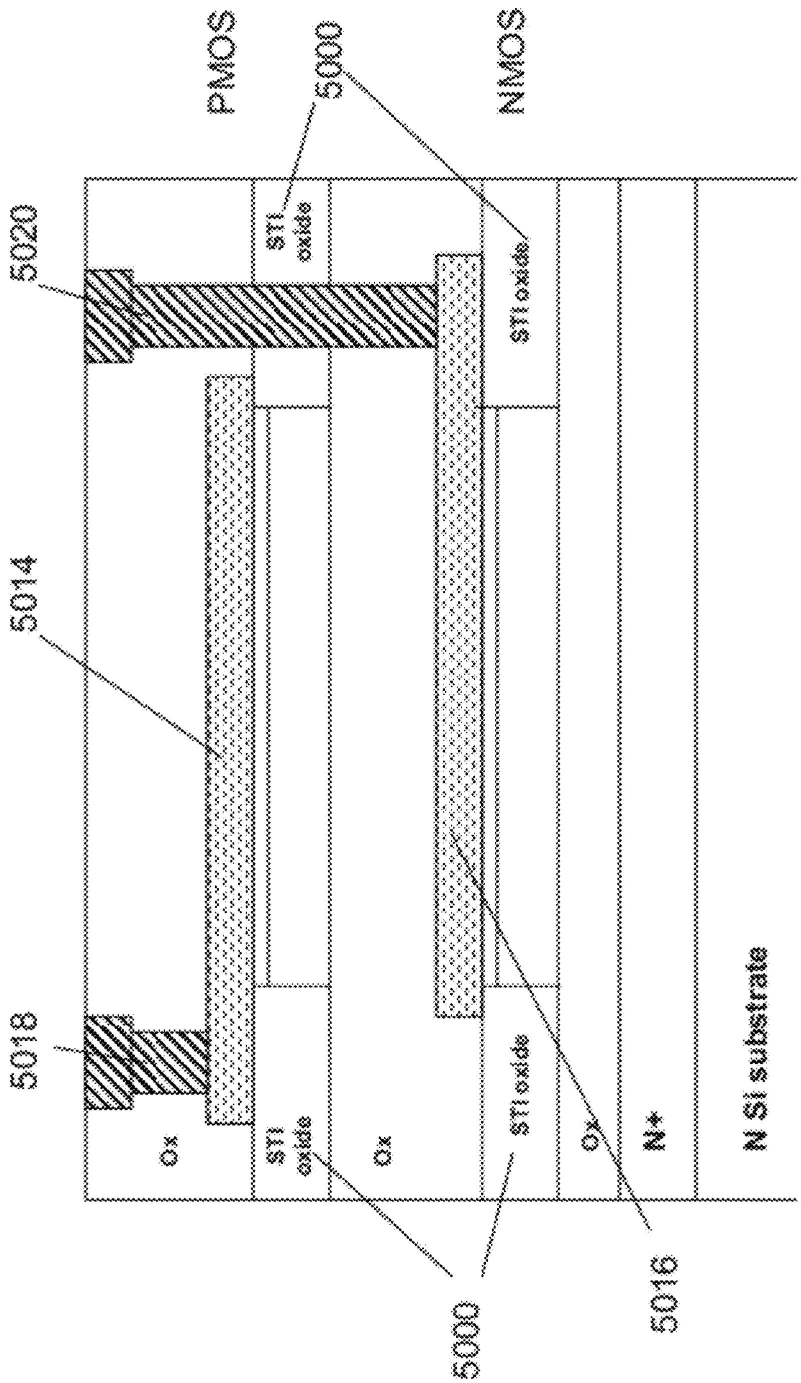
Figure 50D:
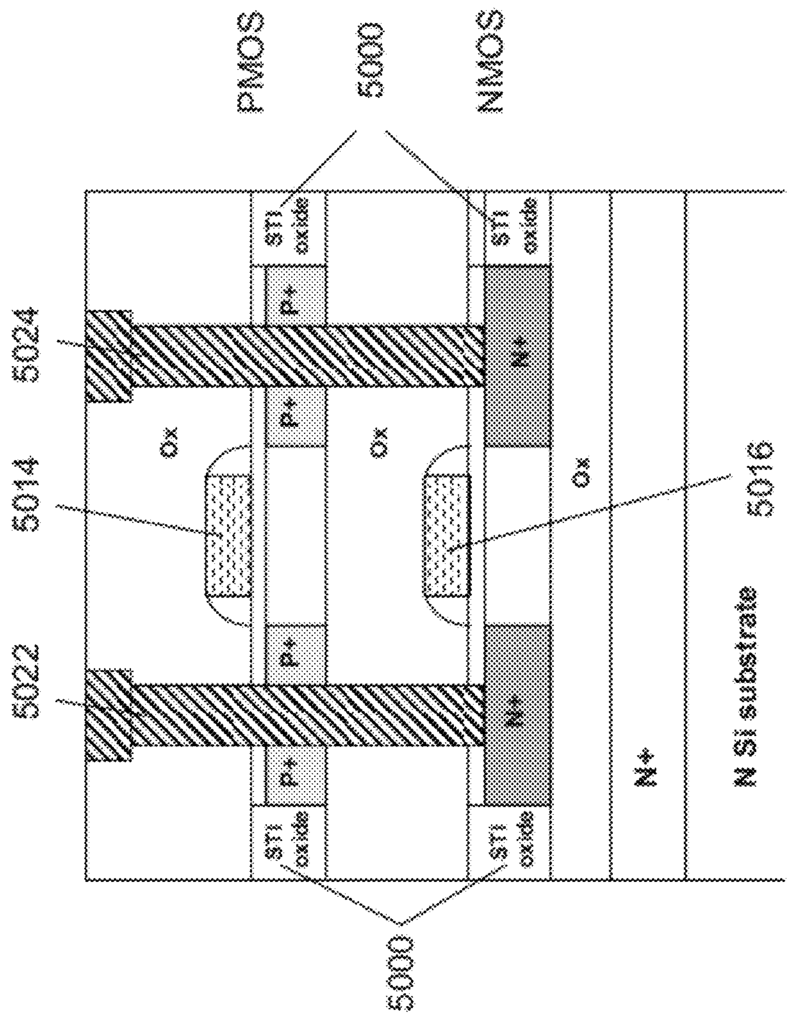

The above process flow may be used to construct a compact 3D CMOS transmission cell example as illustrated in FIGS. 50B through 50D. The topside view of the 3D cell is illustrated in FIG. 50B where the STI (shallow trench isolation) 5000 for both NMOS and PMOS may be drawn coincident on the top and sides. The cell X cross sectional view is illustrated in FIG. 50C and the Y cross sectional view is illustrated in FIG. 50D. The PMOS gate 5014 may be drawn coincident and may be stacked with the NMOS gate 5016. The PMOS gate 5014 may be connected to control signal $\overline{A}$ 5008 by PMOS gate only on STI contact 5018. The NMOS gate 5016 may be connected to control signal A 5006 by NMOS gate only on STI contact 5020. The NMOS and PMOS source shared contacts 5022 may make the shared connection NMOS and PMOS sources 5010 for the input in FIG. 50A. The NMOS and PMOS drain shared contacts 5024 may make the shared connection NMOS and PMOS drains 5012 for the output in FIG. 50A.

Additional logic and memory bit cells, such as a 2-input NAND gate, a transmission gate, an MOS driver, a flip-flop, a 6T SRAM, a floating body DRAM, a CAM (Content Addressable Memory) array, etc., may be similarly constructed with this 3D process flow and methodology.

Another more compact 3D library may be constructed whereby one or more layers of metal interconnect may be allowed between the NMOS and PMOS devices. This methodology may allow more compact cell construction especially when the cells are complex; however, the top PMOS devices should now be made with a low-temperature layer transfer and transistor formation process as shown previously, unless the metals between the NMOS and PMOS layers may be constructed with refractory metals, such as, for example, Tungsten.

Accordingly, the library process flow proceeds as described above for FIGS. 43 and 44. Then the layer or layers of conventional metal interconnect may be constructed on top of the NMOS devices, and then that wafer may be treated as the acceptor wafer or 'House' wafer 808 and the PMOS devices may be layer transferred and constructed in one of the low temperature flows, such as, for example, as shown in FIGS. 21, 22, 29, 39, and 40.

Figure 51A:
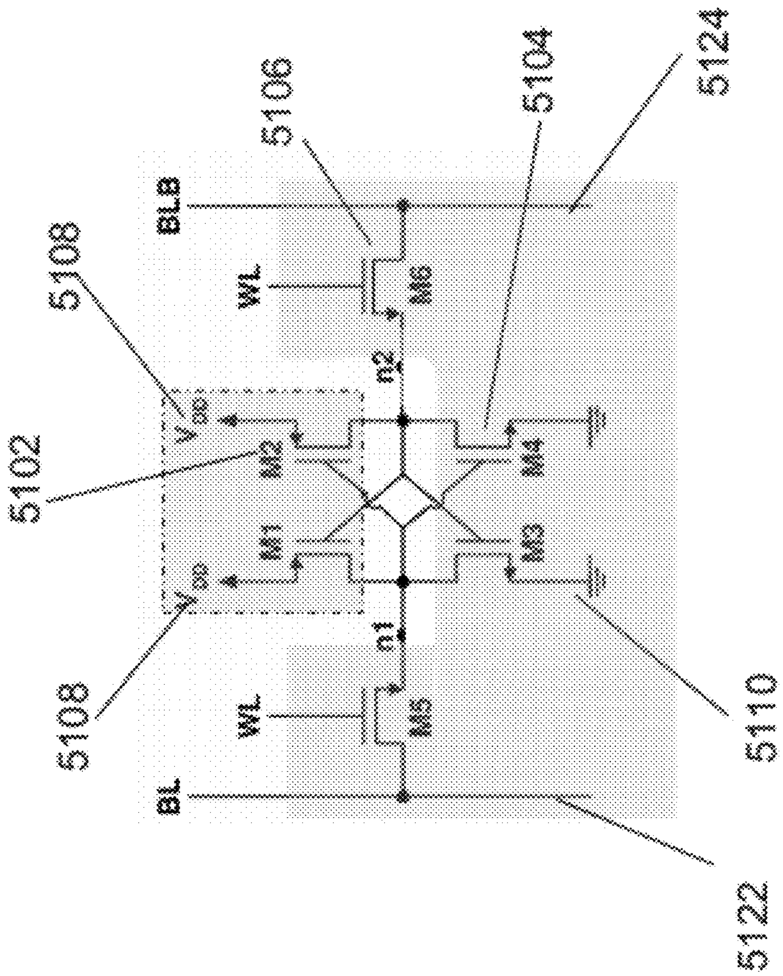
FIG. 51 A-D are exemplary drawing illustrations of a 3D CMOS SRAM cell.

The above process flow may be used to construct, for example, a compact 3D CMOS 6-Transistor SRAM (Static Random Access Memory) cell as illustrated, for example, in FIGS. 51A through 51D. The SRAM cell schematic is illustrated in FIG. 51A. Access to the cell may be controlled by the word line transistors M5 and M6 where M6 is labeled as 5106. These access transistors may control the connection to the bit line 5122 and the bit line bar line 5124. The two cross coupled inverters M1-M4 may be pulled high to Vdd 5108 with M1 or M2 5102, and may be pulled to the ground line 5110 through transistors M3 or M4 5104.

Figure 51B:
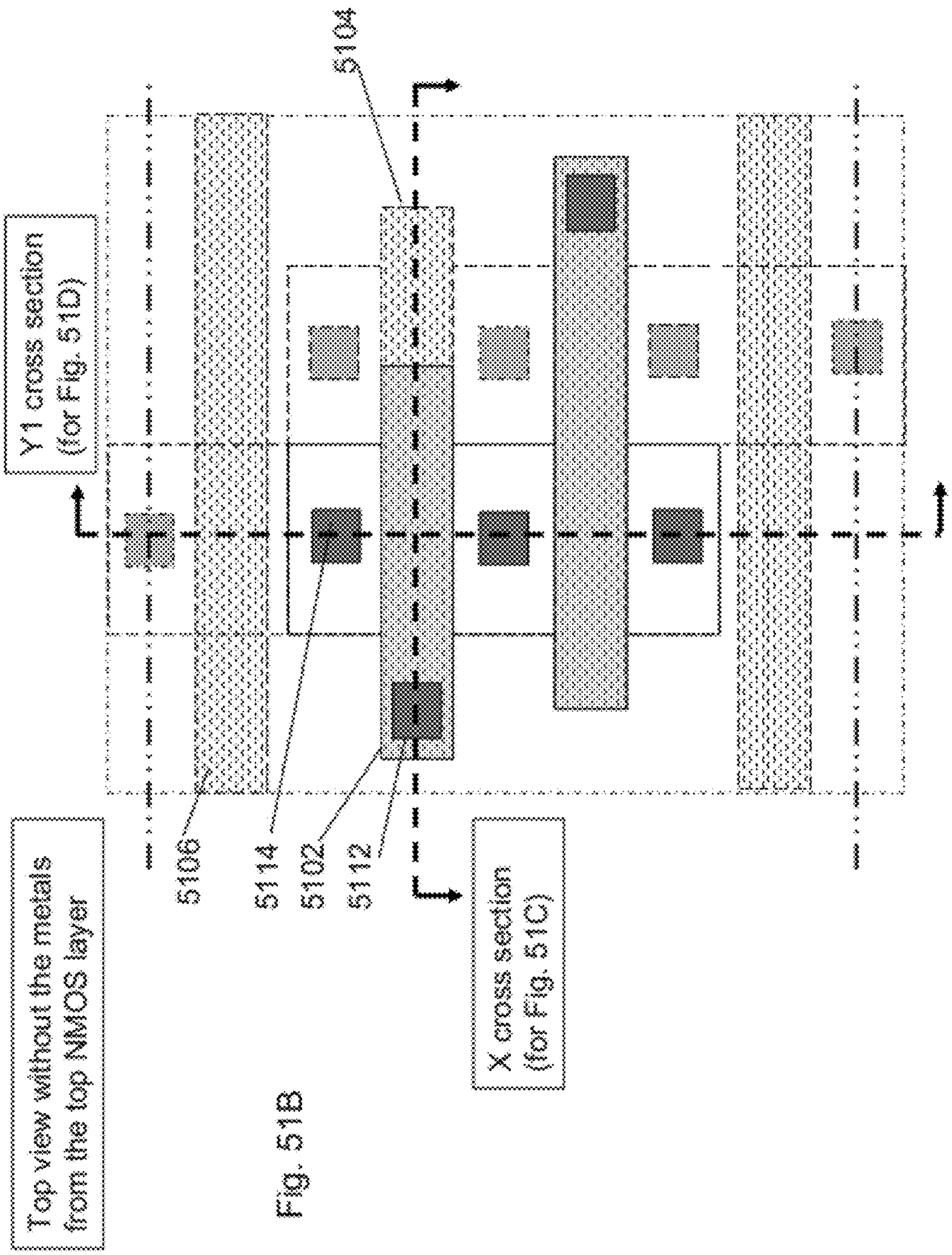
Figure 51C:
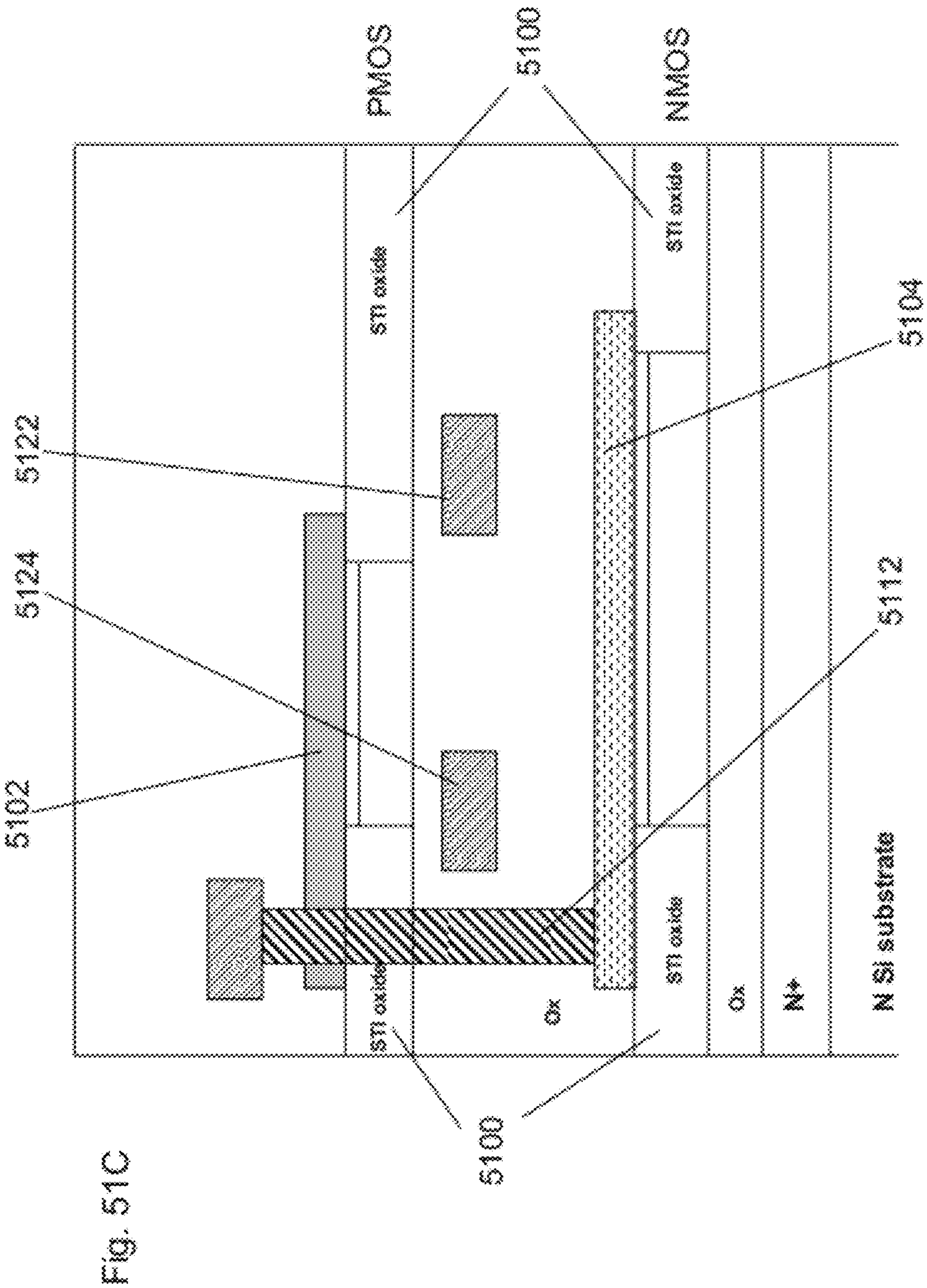
Figure 51D:
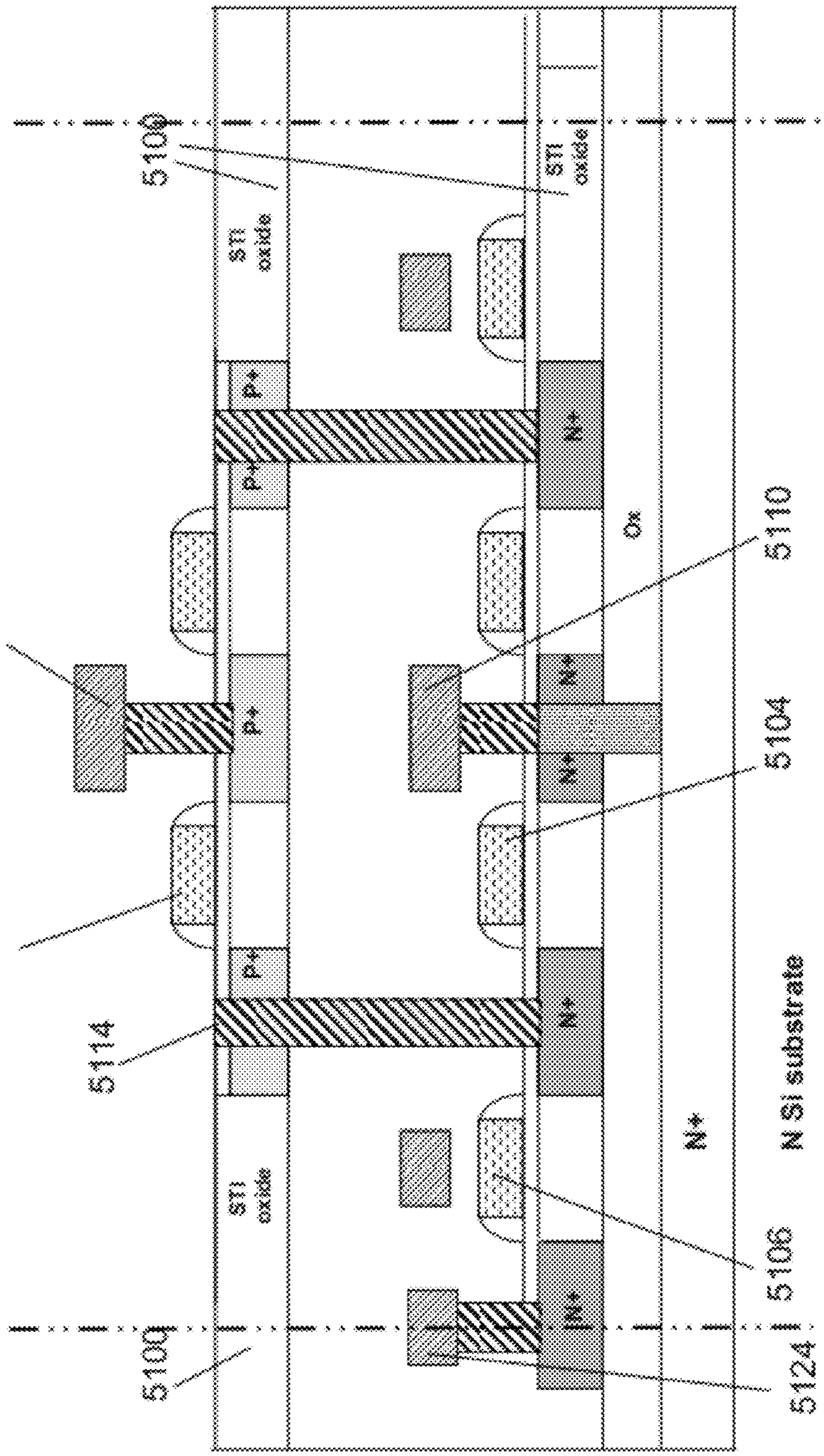

The topside NMOS, with no metal shown, view of the 3D SRAM cell may be illustrated in FIG. 51B, the SRAM cell X cross sectional view may be illustrated in FIG. 51C, and the Y cross sectional view may be illustrated in FIG. 51D. NMOS word line access transistor M6 5106 may be connected to the bit line bar line 5124 with a contact to NMOS metal 1. The NMOS pull down transistor 5104 may be connected to the ground line 5110 by a contact to NMOS metal 1 and to the back plane N+ ground layer. The bit line 5122 in NMOS metal 1 and transistor isolation oxide 5100 may be illustrated. The Vdd supply 5108 may be brought into the cell on PMOS metal 1 and connected to M2 5102 through a contact to P+. The PMOS poly on STI to NMOS poly on STI contact 5112 may connect the gates of both M2 5102 and M4 5104 to illustrate the 3D cross coupling. The common drain connection of M2 and M4 to the bit bar access transistor M6 may be made through the PMOS P+ to NMOS N+ contact 5114.

The above process flow may also be used to construct a compact 3D CMOS 2 Input NAND cell example as illustrated in FIGS. 62A through 62D. The NAND-2 cell schematic and 2D layout may be illustrated in FIG. 62A. The two PMOS transistor 6201 sources 6211 may be tied together and to V+ supply and the PMOS drains may be tied together and to one NMOS drain 6213 and to the output Y. Input A 6203 may be tied to one PMOS gate and one NMOS gate. Input B 6204 may be tied to the other PMOS and NMOS gates. For the two NMOS transistors 6202, the NMOS A drain may be tied 6220 to the NMOS B source, and the NMOS B drain 6212 may be tied to ground. The structure built in 3D described below may take advantage of these connections in the 3rd dimension.

Figure 62A:
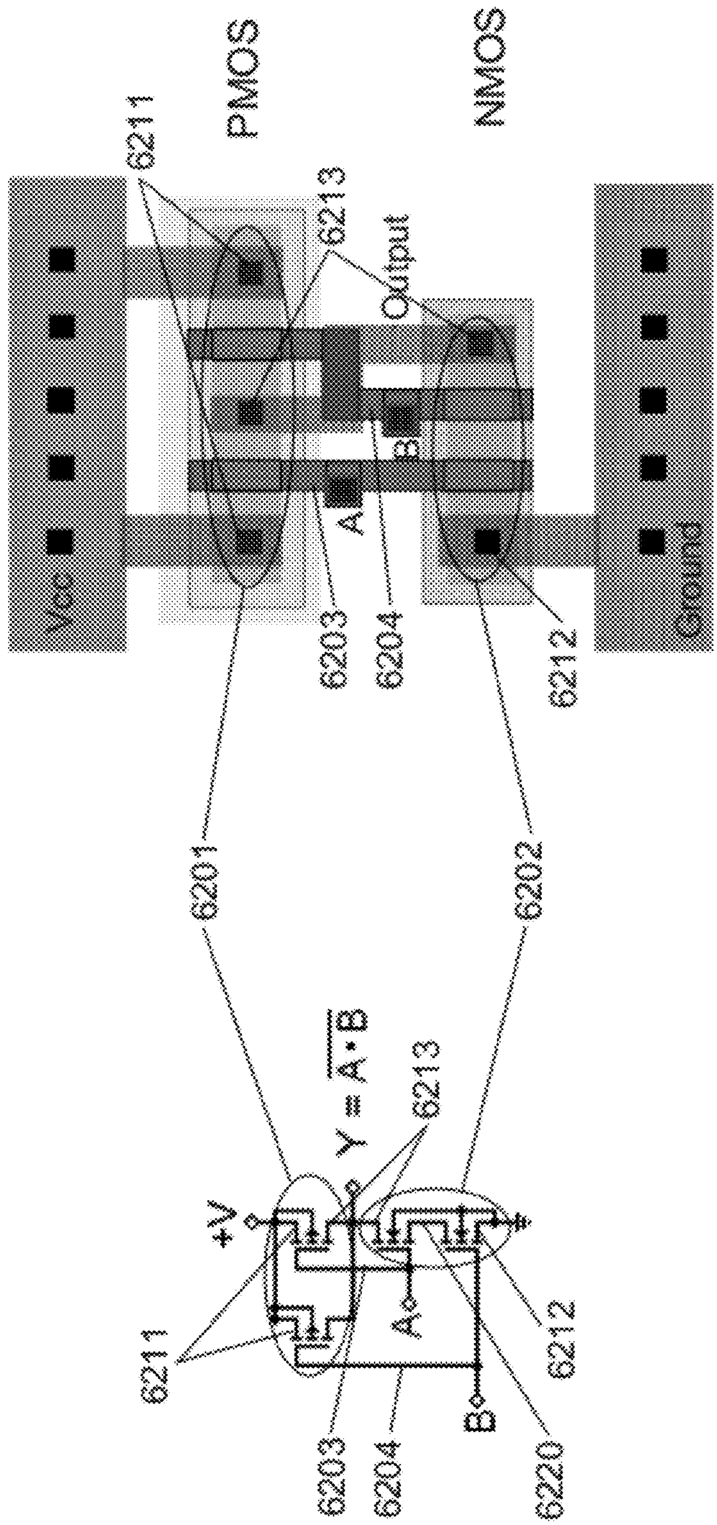
FIG. 62 A-D are exemplary drawing illustrations of a 3D NAND2 cell.
Figure 62B:
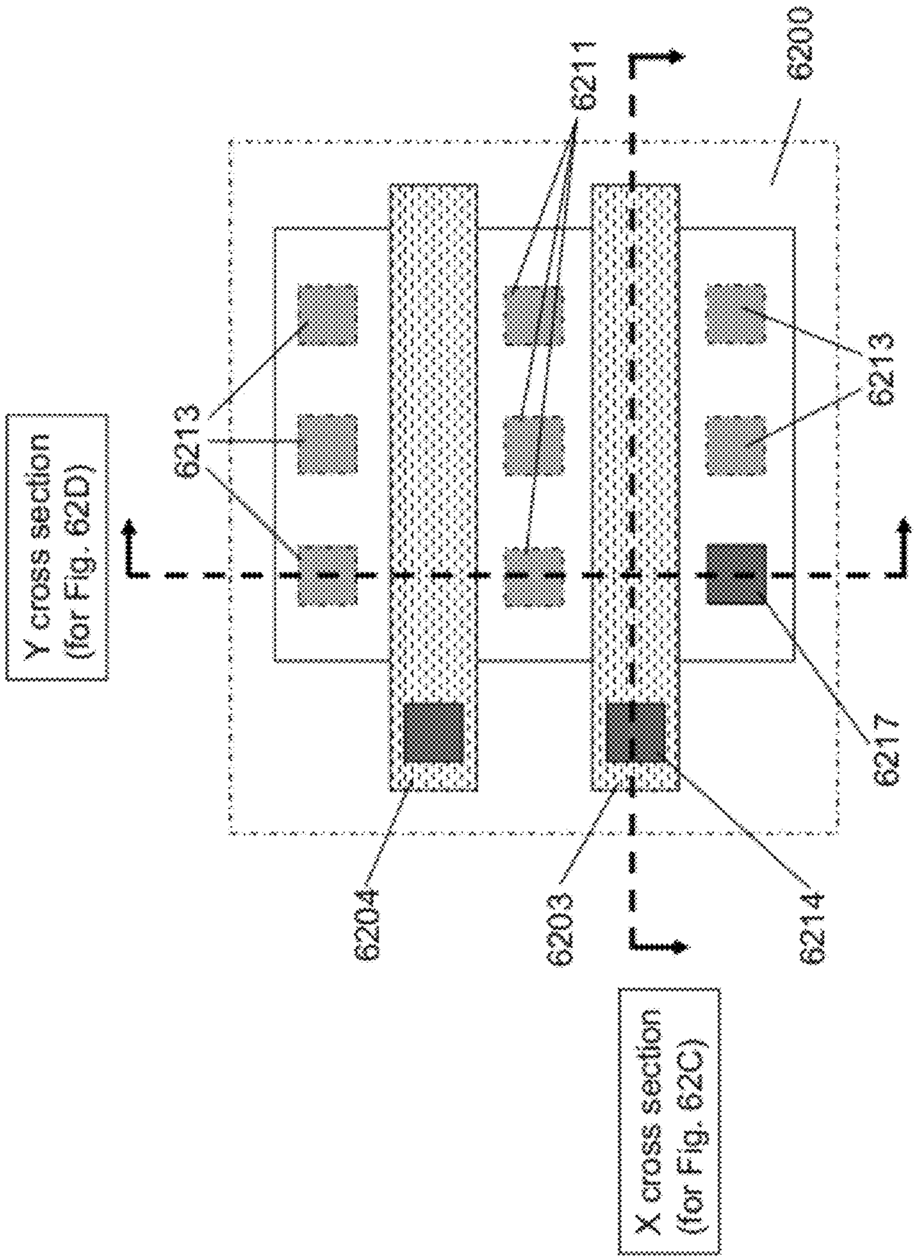
Figure 62C:
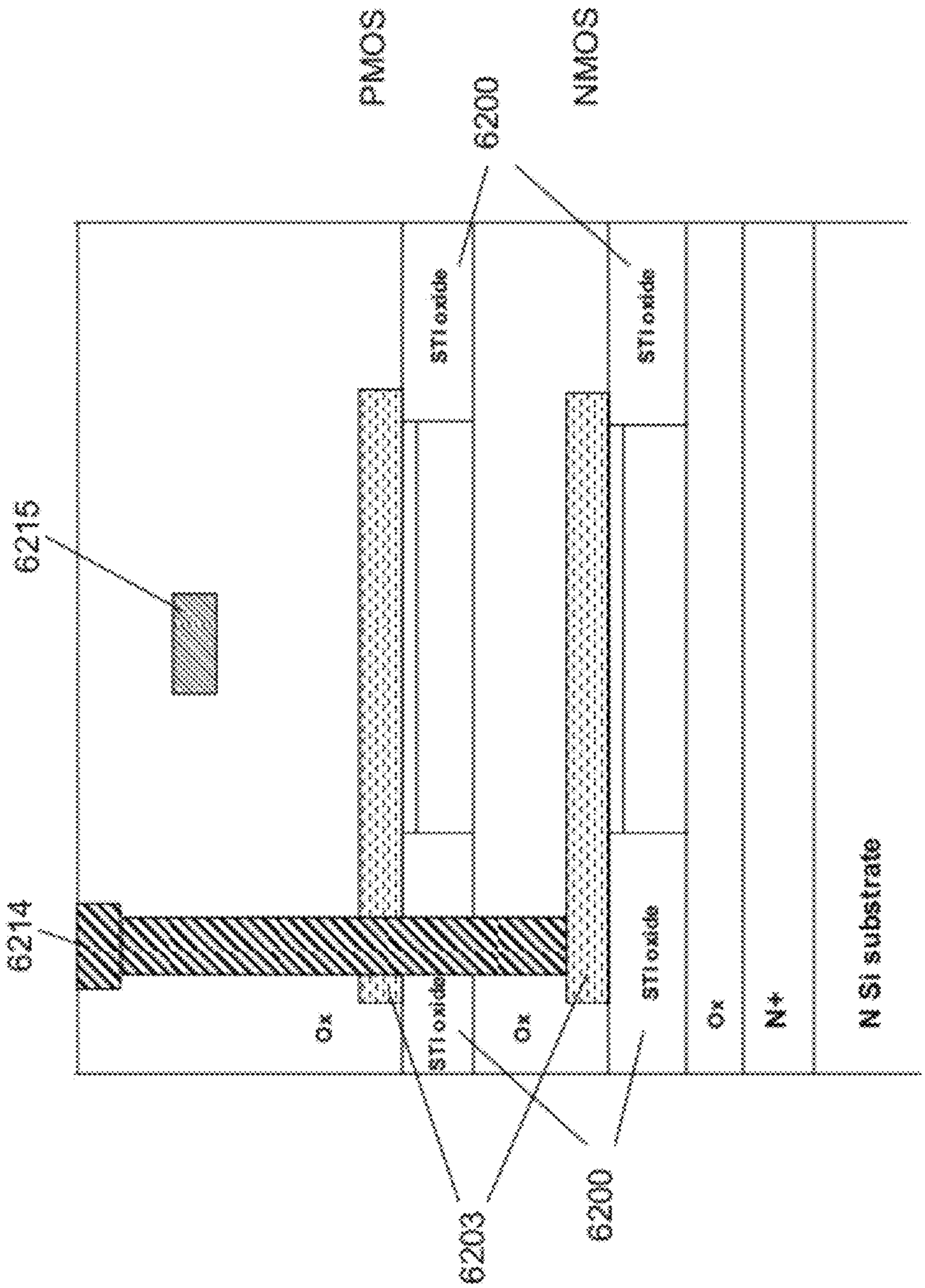
Figure 62D:
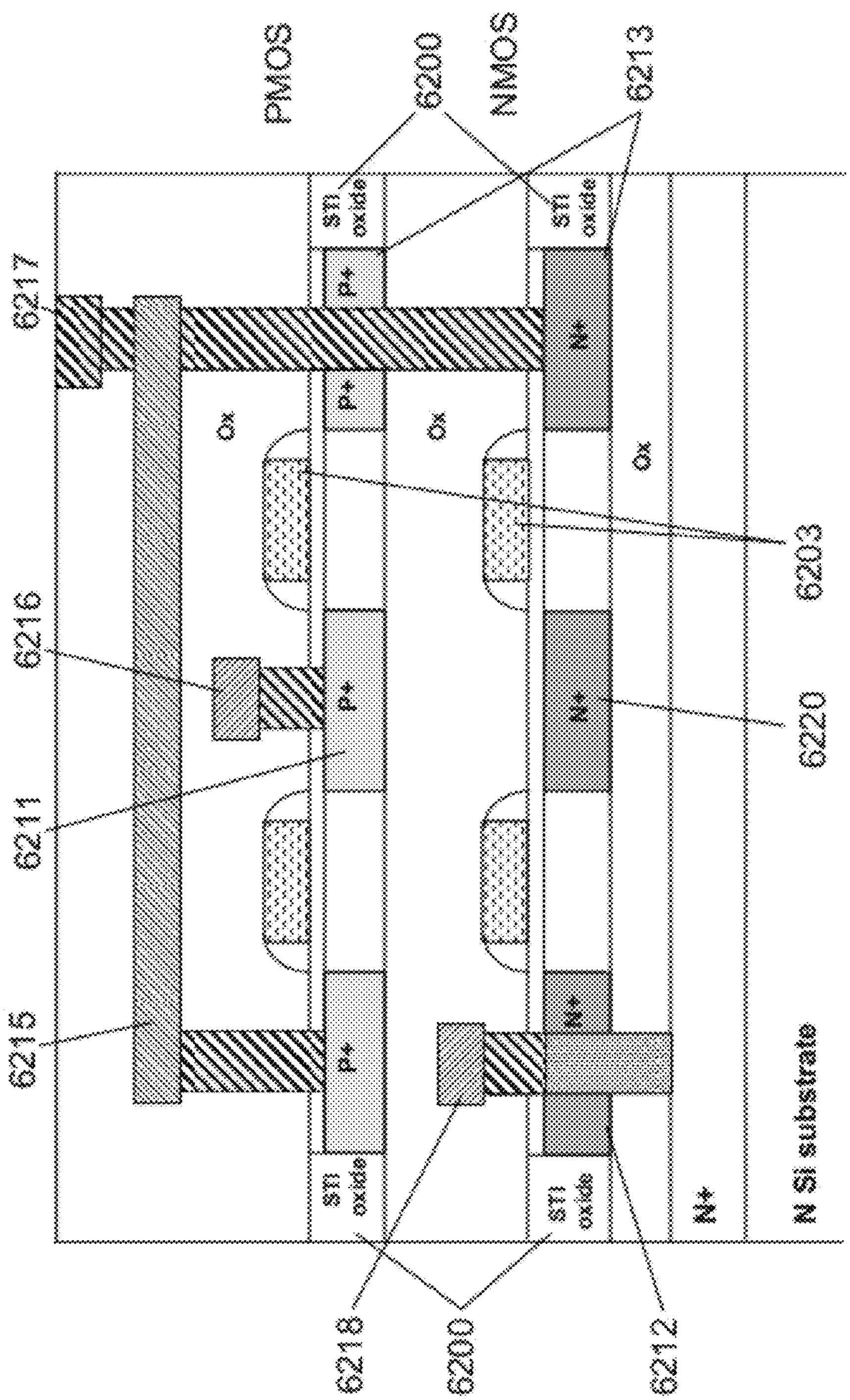

The topside view of the 3D NAND-2 cell, with no metal shown, is illustrated in FIG. 62B, the NAND-2 cell X cross sectional views is illustrated in FIG. 62C, and the Y cross sectional view may be illustrated in FIG. 62D. The two PMOS transistor 6201 sources 6211 may be tied together in the PMOS silicon layer and to the V+ supply metal 6216 in the PMOS metal 1 layer through a contact. The NMOS A drain and the PMOS A drain may be tied 6213 together with a through P+ to N+ contact and to the Output Y metal 6217 in PMOS metal 2, and also connected to the PMOS B drain contact through PMOS metal 1 6215. Input A on PMOS metal 2 6214 may be tied 6203 to both the PMOS A gate and the NMOS A gate with a PMOS gate on STI to NMOS gate on STI contact. Input B may be tied 6204 to the PMOS B gate and the NMOS B using a P+ gate on STI to NMOS gate on STI contact. The NMOS B source and the NMOS A drain may be tied together 6220 in the NMOS silicon layer. The NMOS B drain 6212 may be tied connected to the ground line 6218 by a contact to NMOS metal 1 and to the back plane N+ ground layer. The transistor isolation oxides 6200 may be illustrated.

Another compact 3D library may be constructed whereby one or more layers of metal interconnect may be allowed between more than two NMOS and PMOS device layers. This methodology may allow a more compact cell construction especially when the cells may be complex; however, devices above the first NMOS layer may now be made with a low temperature layer transfer and transistor formation process as shown previously.

Accordingly, the library process flow proceeds as described above for FIGS. 43 and 44. Then the layer or layers of conventional metal interconnect may be constructed on top of the NMOS devices, and then that wafer may be treated as the acceptor wafer or house 808 and the PMOS devices may be layer transferred and constructed in one of the low temperature flows, such as, for example, as shown in FIGS. 21, 22, 29, 39, and 40. This low temperature process may be repeated to form another layer of PMOS or NMOS device, and so on.

Figure 53A:
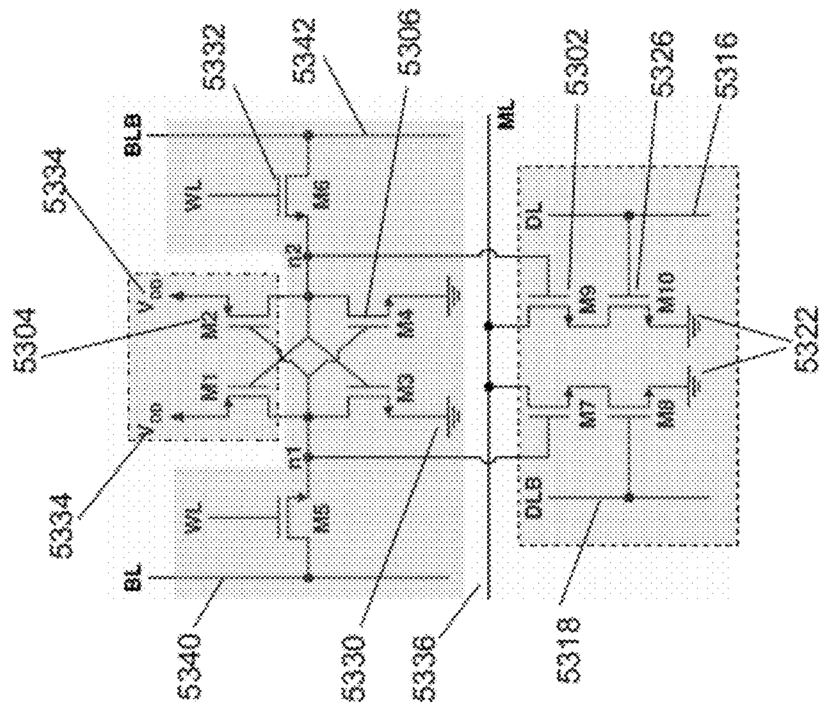
FIG. 53 A-E are exemplary drawing illustrations of a 3D CAM cell.

The above process flow may also be used to construct a compact 3D CMOS Content Addressable Memory (CAM) array as illustrated in FIGS. 53A to 53E. The CAM cell schematic is illustrated in FIG. 53A. Access to the SRAM cell may be controlled by the word line transistors M5 and M6 where M6 is labeled as 5332. These access transistors may control the connection to the bit line 5340 and the bit line bar line 5342. The two cross coupled inverters M1-M4 may be pulled high to Vdd 5334 with M1 or M2 5304, and may be pulled to ground 5330 through transistors M3 or M4 5306. The match line 5336 may deliver comparison circuit match or mismatch state to the match address encoder. The detect line 5316 and detect line bar 5318 may select the comparison circuit cell for the address search and may connect to the gates of the pull down transistors M8 and M10 5326 to ground 5322. The SRAM state read transistors M7 and M9 5302 gates may be connected to the SRAM cell nodes n1 and n2 to read the SRAM cell state into the comparison cell. The structure built in 3D described below may take advantage of these connections in the 3rd dimension.

Figure 53B:
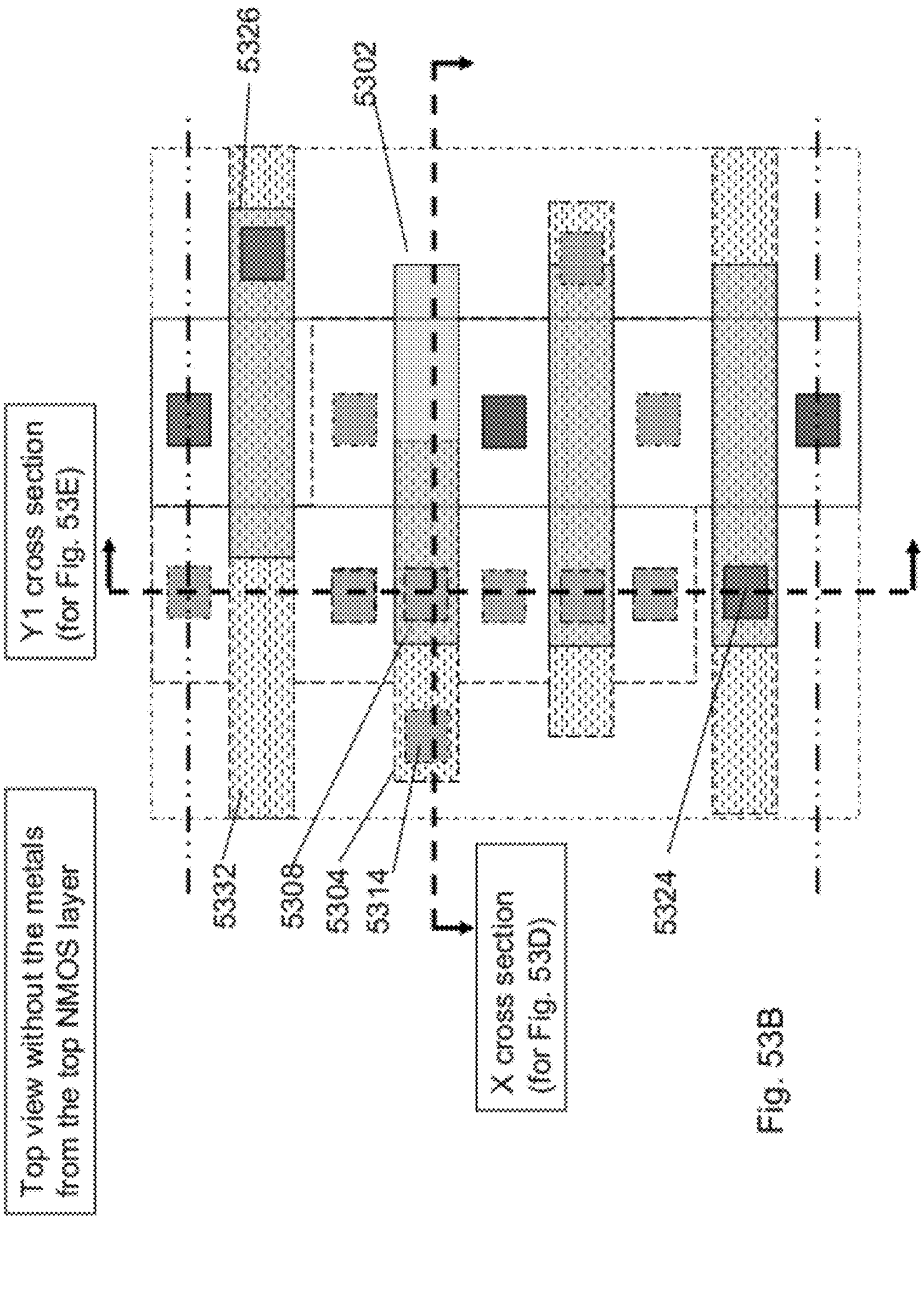
Figure 53C:
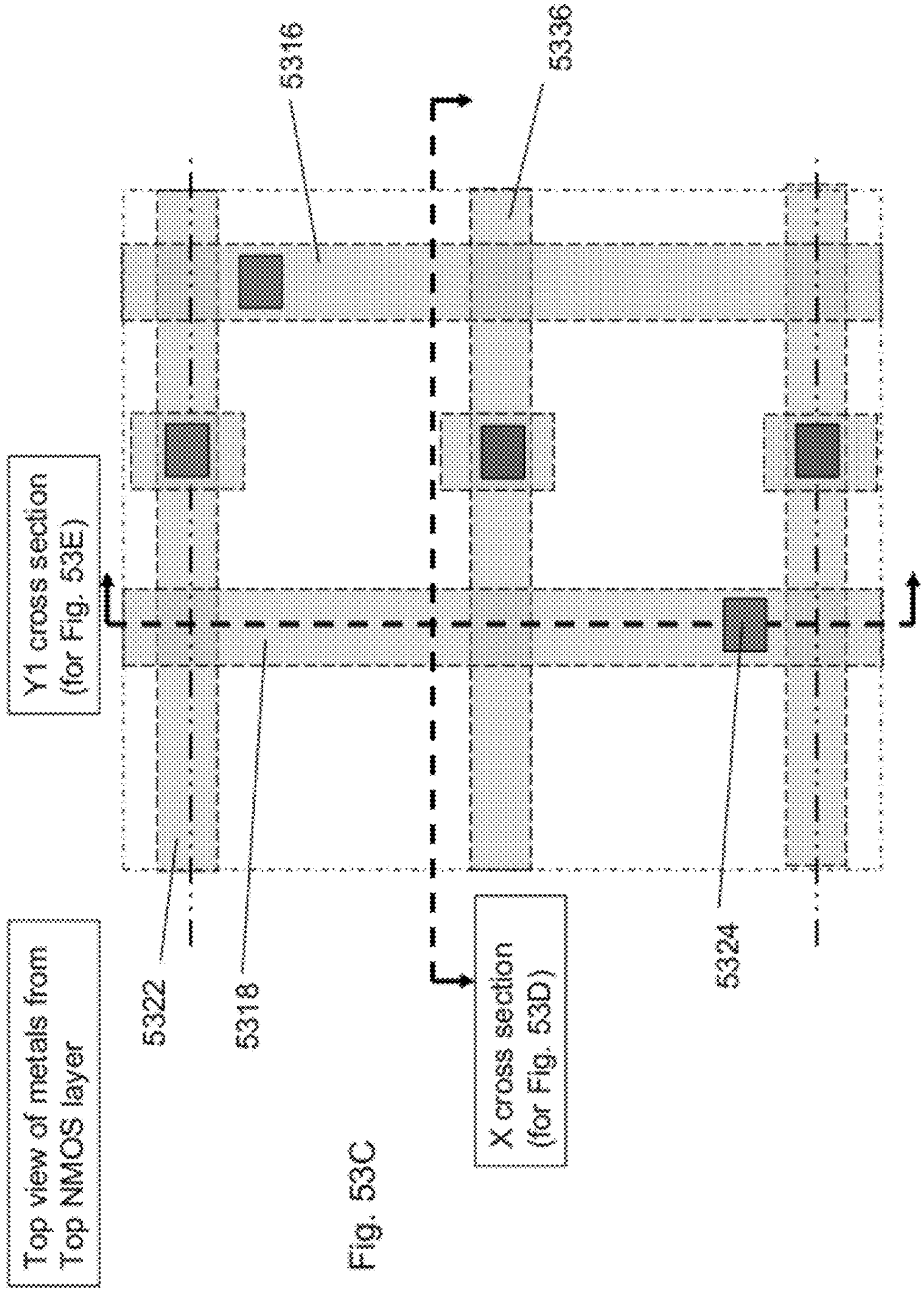
Figure 53D:
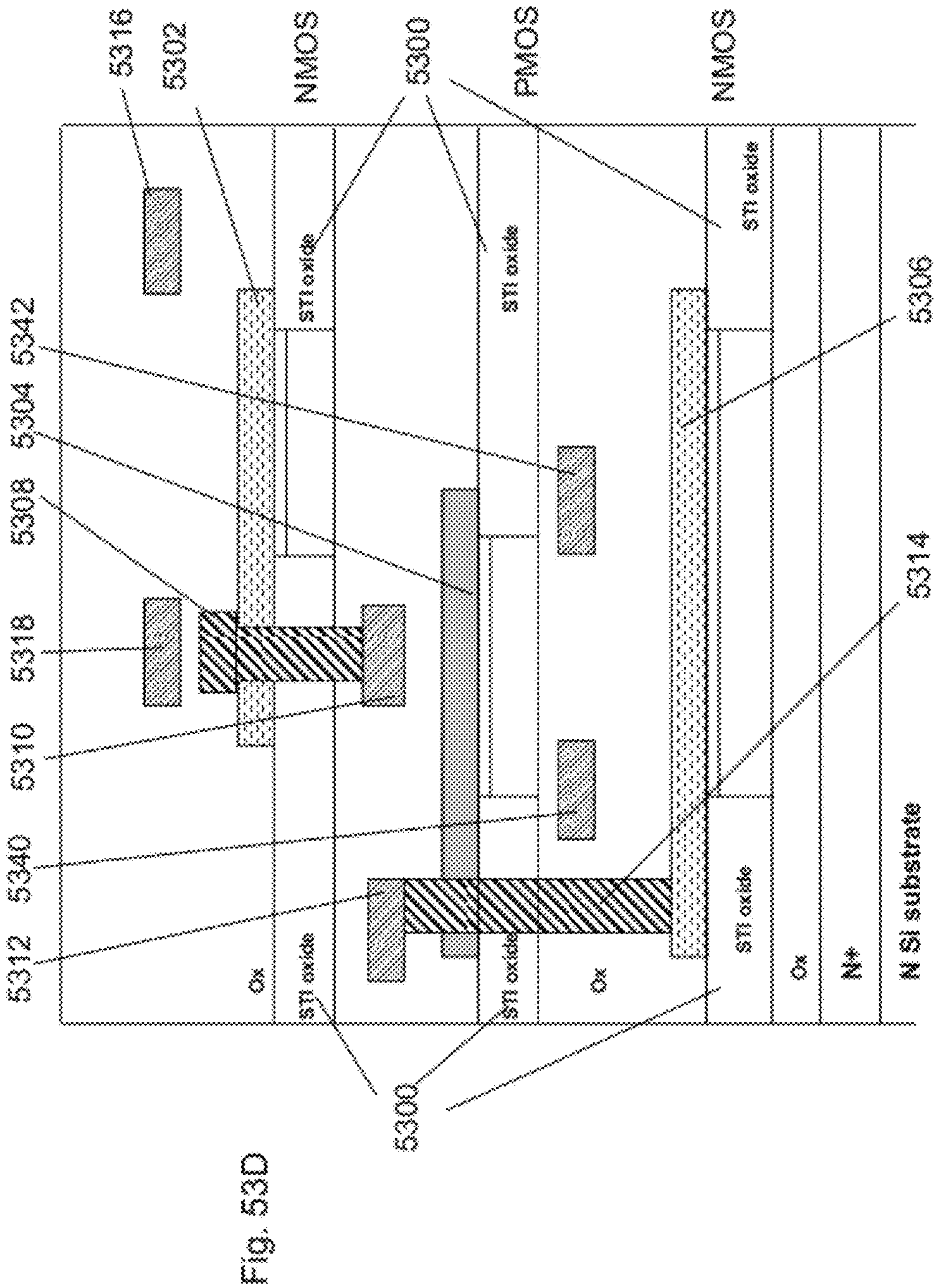
Figure 53E:
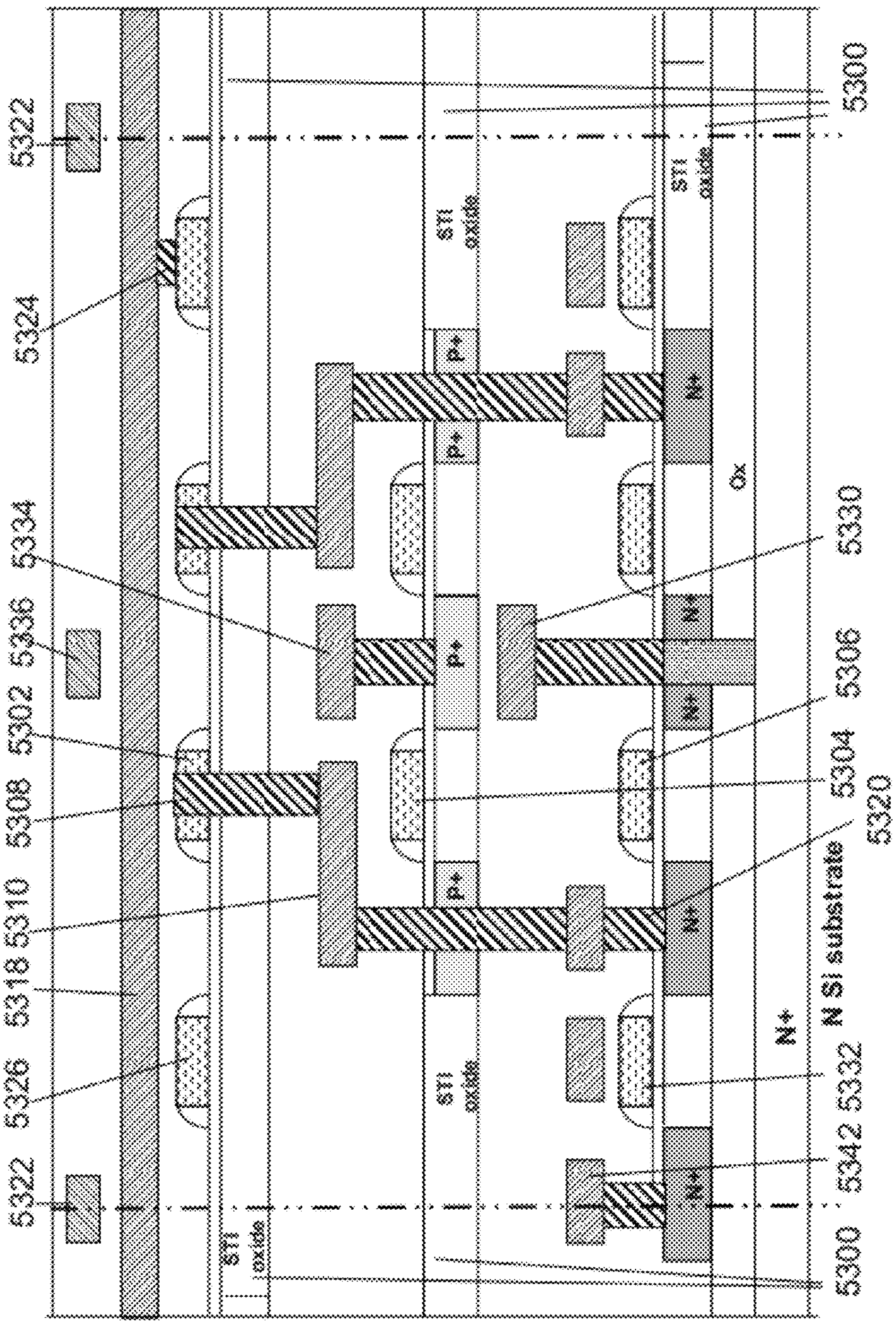

The topside top NMOS view of the 3D CAM cell, without metals shown, is illustrated in FIG. 53B, the topside top NMOS view of the 3D CAM cell, with metal shown, may be illustrated in FIG. 53C, the 3DCAM cell X cross sectional view may be illustrated in FIG. 53D, and the Y cross sectional view may be illustrated in FIG. 53E. The bottom NMOS word line access transistor M6 5332 may be connected to the bit line bar line 5342 with an N+ contact to NMOS metal 1. The bottom NMOS pull down transistor 5306 may be connected to the ground 5330 line by an N+ contact to NMOS metal 1 and to the back plane N+ ground layer. The bit line 5340 may be in NMOS metal 1 and transistor isolation oxides 5300 are illustrated. The ground 5322 may be brought into the cell on top NMOS metal-2. The Vdd supply 5334 may be brought into the cell on PMOS metal-1 5334 and connects to M2 5304 thru a contact to P+. The PMOS poly on STI to bottom NMOS poly on STI contact 5314 may connect the gates of both M2 5304 and M4 5306 to illustrate the SRAM 3D cross coupling and connects to the comparison cell node n1 through PMOS metal-1 5312. The common drain connection of M2 and M4 to the bit bar access transistor M6 may be made through the PMOS P+ to NMOS N+ contact 5320 and connects node n2 to the M9 gate 5302 via PMOS metal-1 5310 and metal to gate on STI contact 5308. Top NMOS comparison cell ground pulldown transistor M10 gate 5326 may be connected to detect line 5316 with a NMOS metal-2 to gate poly on STI contact. The detect line bar 5318 in top NMOS metal-2 may connect through contact 5324 to the gate of M8 in the top NMOS layer. The match line 5336 in top NMOS metal-2 may connect to the drain side of M9 and M7.

Another compact 3D library may be constructed whereby one or more layers of metal interconnect may be allowed between the NMOS and PMOS devices and one or more of the devices may be constructed vertically.

Figure 63A:
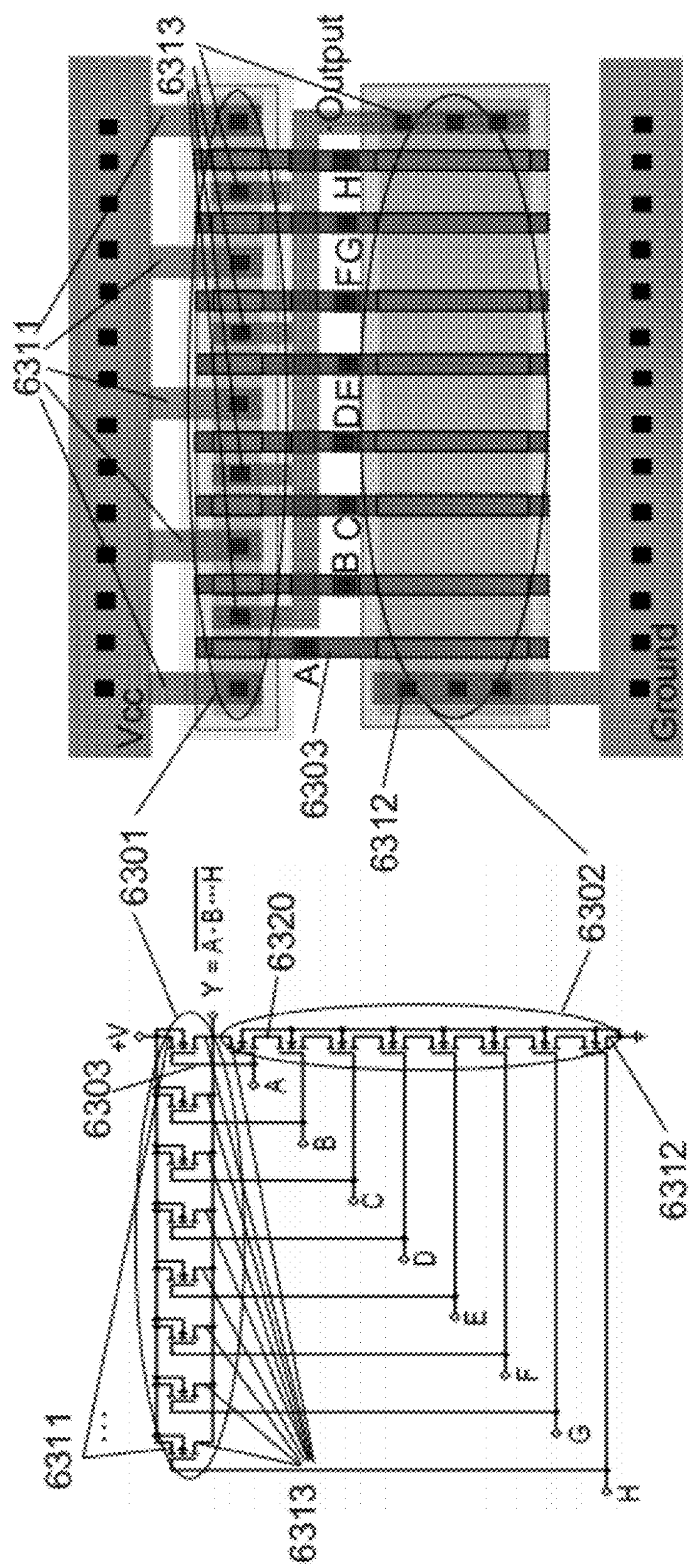
FIG. 63 A-G are exemplary drawing illustrations of a 3D NAND8 cell.

A compact 3D CMOS 8 Input NAND cell may be constructed as illustrated in FIGS. 63A through 63G. The NAND-8 cell schematic and 2D layout is illustrated in FIG. 63A. The eight PMOS transistor 6301 sources 6311 may be tied together and to V+ supply and the PMOS drains 6313 may be tied together and to the NMOS A drain and to the output Y. Inputs A to H may be tied to one PMOS gate and one NMOS gate. Input A may be tied to the PMOS A gate and NMOS A gate, input B may be tied to the PMOS B gate and NMOS B gate, and so forth through input H may be tied to the PMOS H gate and NMOS H gate. The eight NMOS transistors 6302 may be coupled in series between the output Y and the PMOS drains 6313 and ground. The structure built in 3D described below will take advantage of these connections in the 3rd dimension.

Figure 63B:
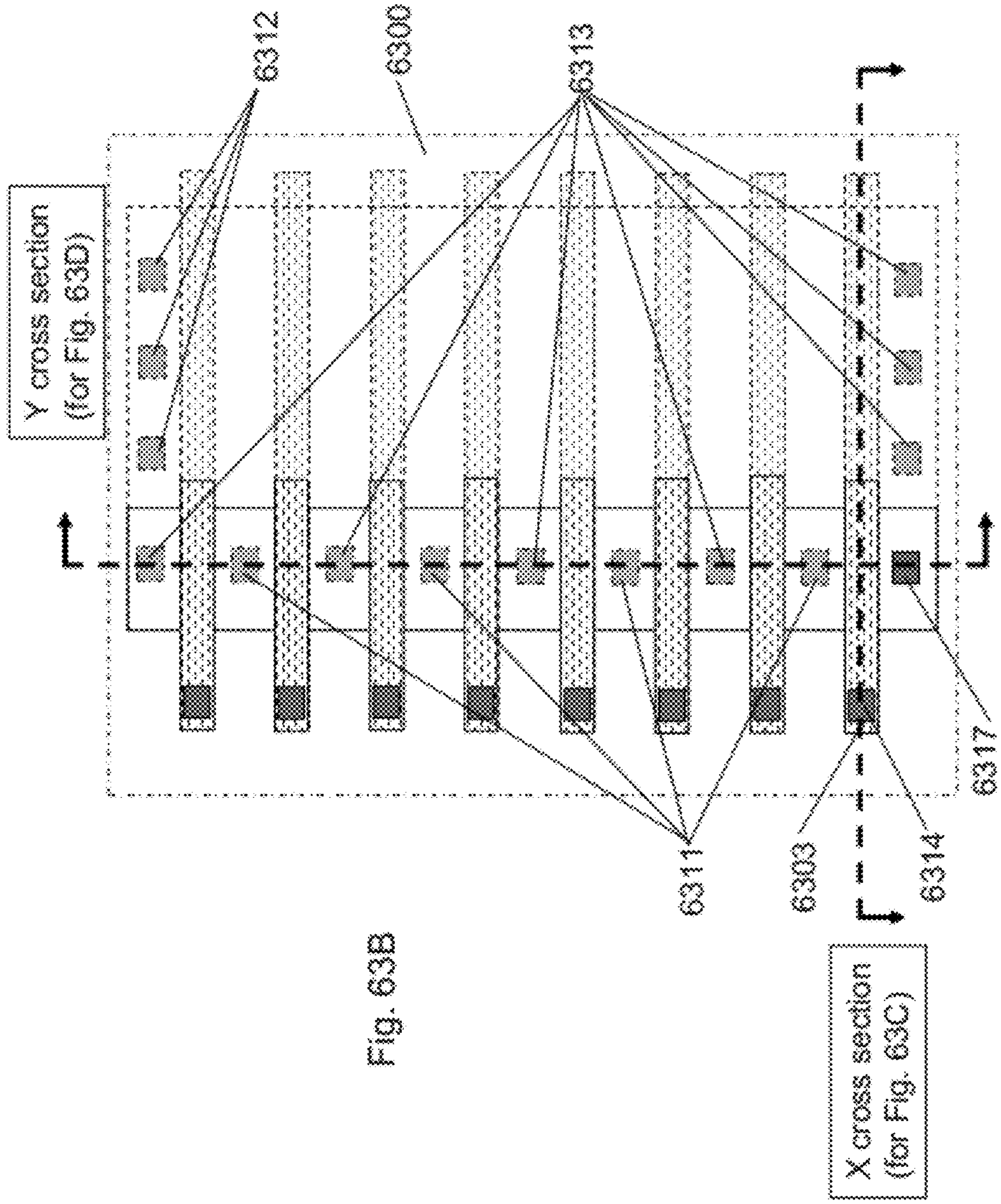
Figure 63C:
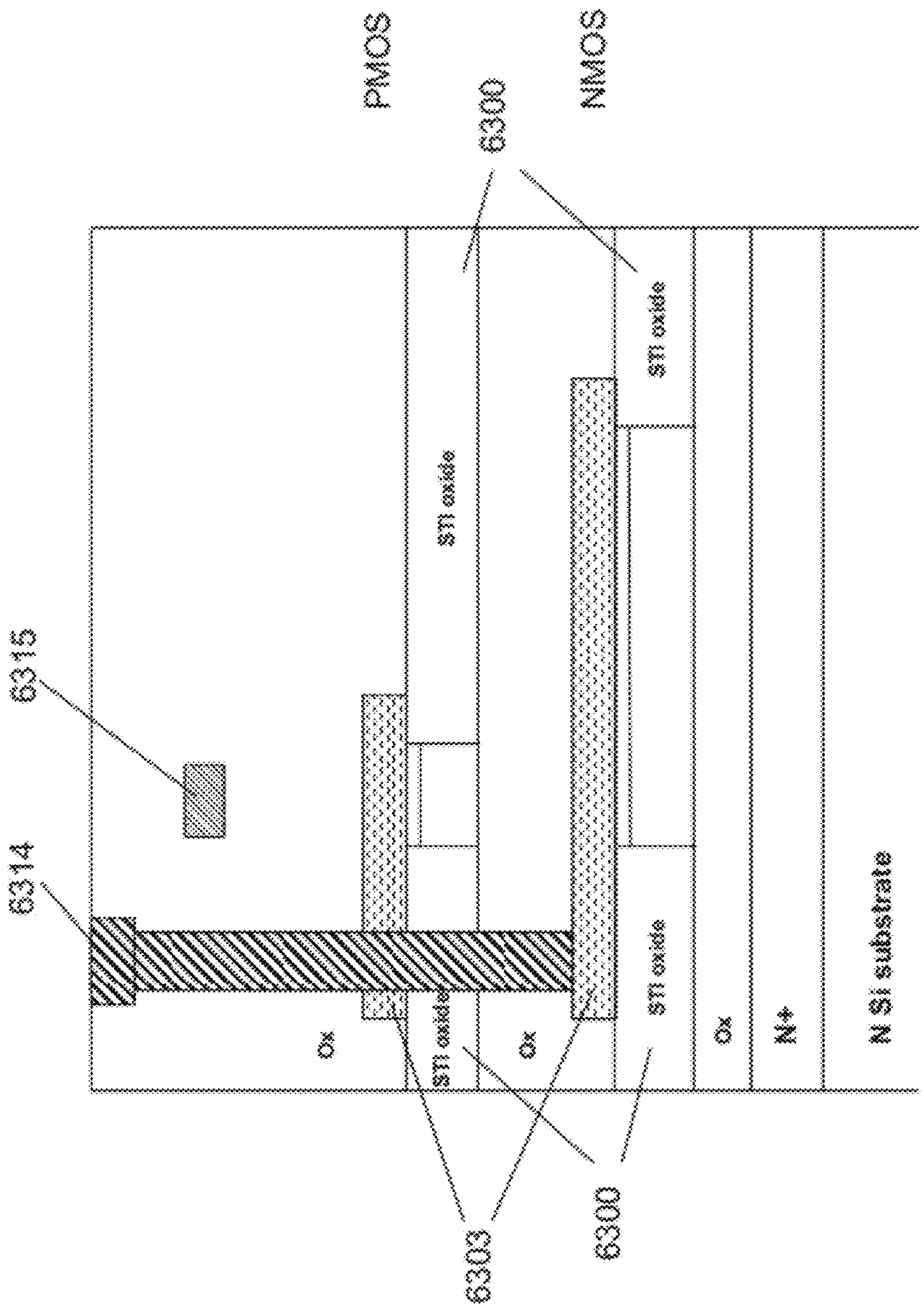
Figure 63D:
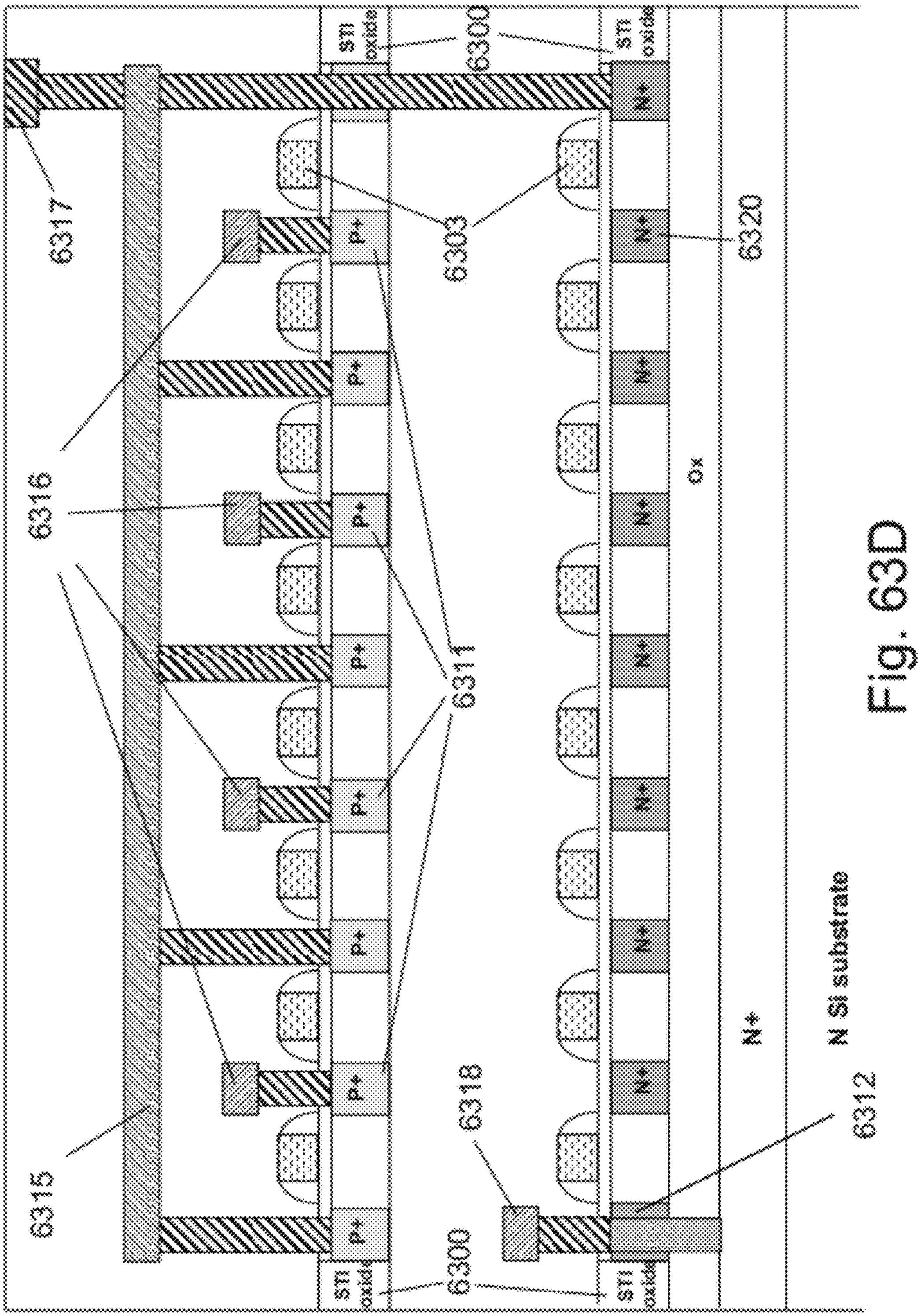
Figure 63E:
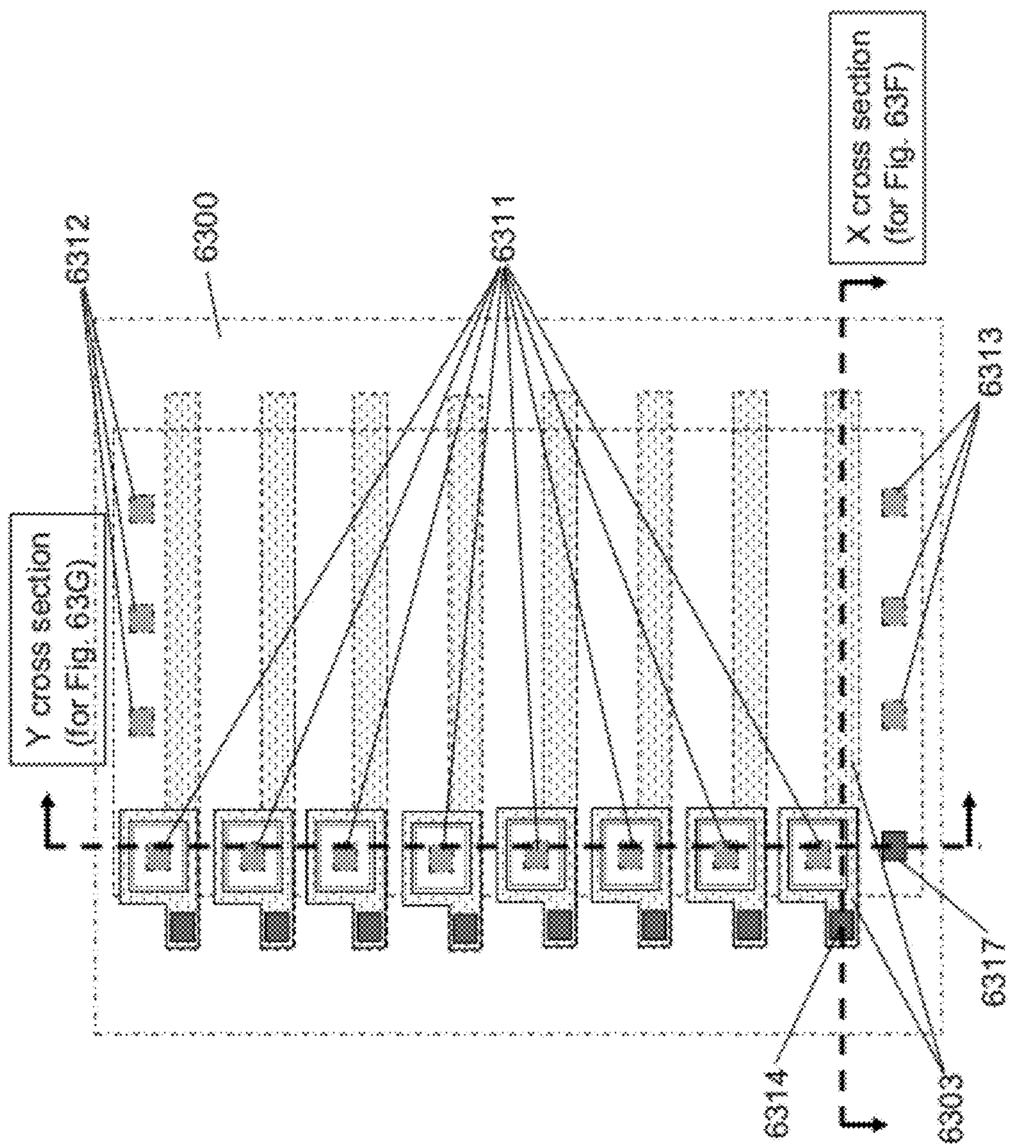
Figure 63F:
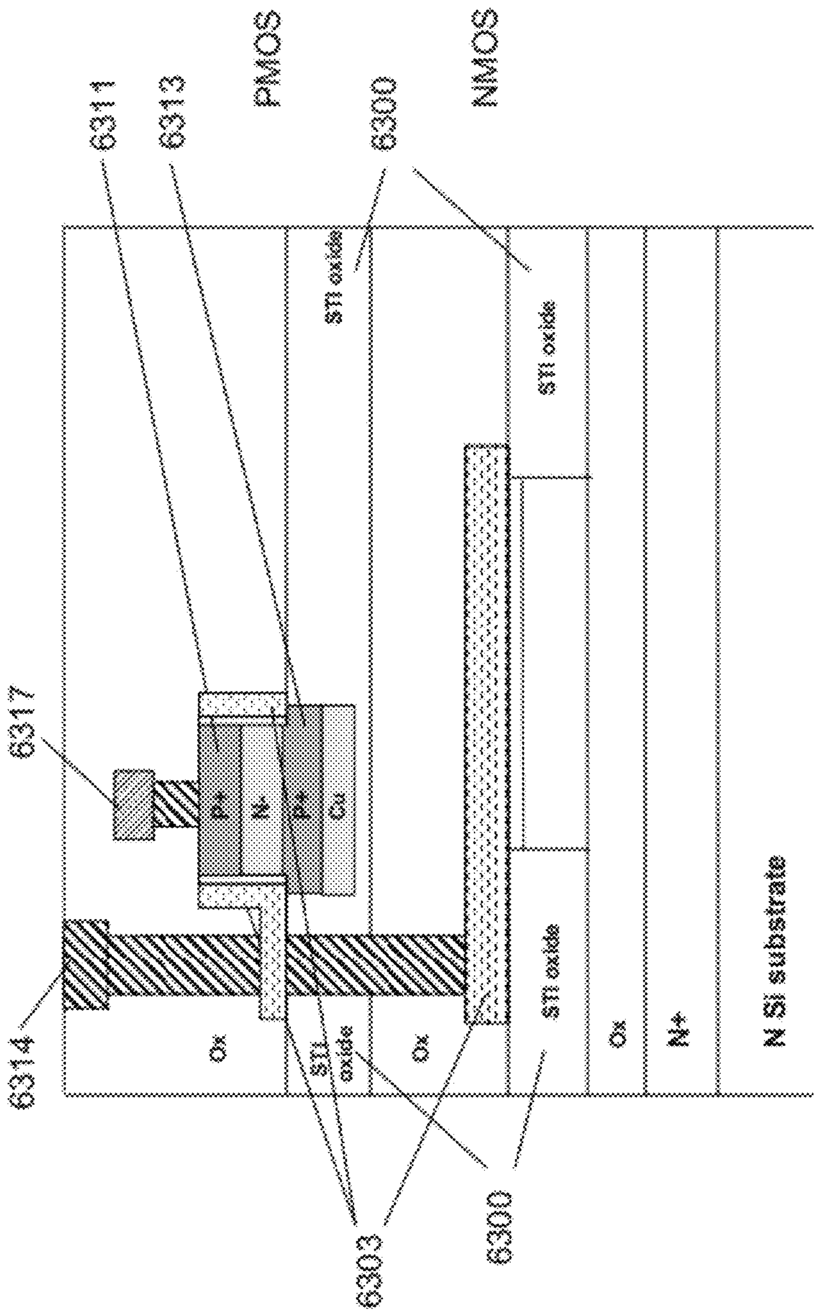
Figure 63G:
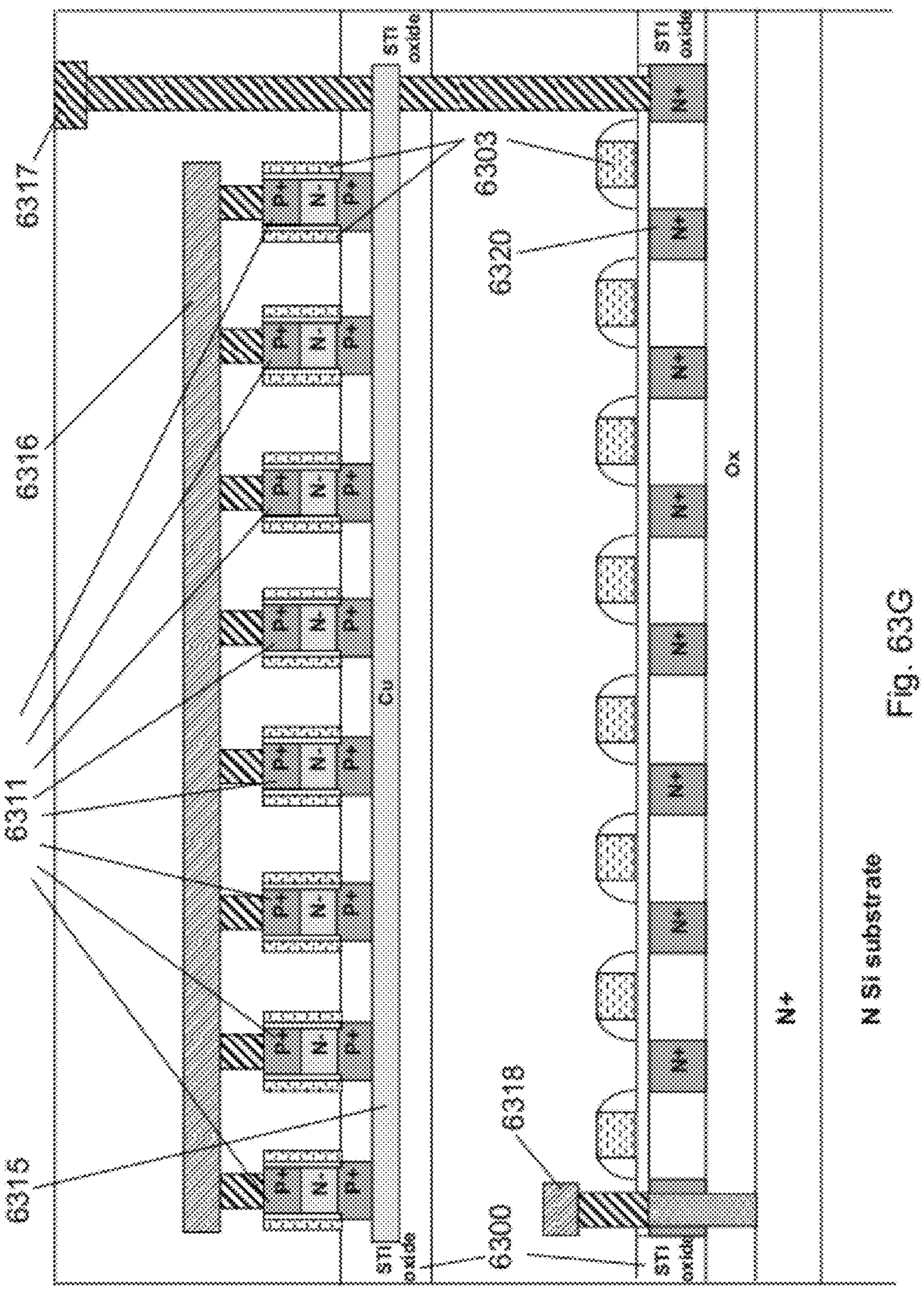

The topside view of the 3D NAND-8 cell, with no metal shown and with horizontal NMOS and PMOS devices, is illustrated in FIG. 63B, the cell X cross sectional views is illustrated in FIG. 63C, and the Y cross sectional view is illustrated in FIG. 63D. The NAND-8 cell with vertical PMOS and horizontal NMOS devices are shown in FIG. 63E for topside view, 63F for the X cross section view, and 63H for the Y cross sectional view. The same reference numbers are used for analogous structures in the embodiment shown in FIGS. 63B through 63D and the embodiment shown in FIGS. 63E through 63G. The eight PMOS transistor 6301 sources 6311 may be tied together in the PMOS silicon layer and to the V+ supply metal 6316 in the PMOS metal 1 layer through P+ to Metal contacts. The NMOS A drain and the PMOS A drain may be tied 6313 together with a through P+ to N+ contact 6317 and to the output Y supply metal 6315 in PMOS metal 2, and also may be connected to substantially all of the PMOS drain contacts through PMOS metal 1 6315. Input A on PMOS metal 2 6314 may be tied 6303 to both the PMOS A gate and the NMOS A gate with a PMOS gate on STI to NMOS gate on STI contact 6314. Substantially all the other inputs may be tied to P and N gates in similar fashion. The NMOS A source and the NMOS B drain may be tied together 6320 in the NMOS silicon layer. The NMOS H source 6312 may be tied connected to the ground line 6318 by a contact to NMOS metal 1 and to the back plane N+ ground layer. The transistor isolation oxides 6300 are illustrated.

A compact 3D CMOS 8 Input NOR may be constructed as illustrated in FIGS. 64A through 64G. The NOR-8 cell schematic and 2D layout may be illustrated in FIG. 64A. The PMOS H transistor source 6411 may be tied to V+ supply on metal 6416. The NMOS transistors 6402 drains may be tied together and to PMOS A drain 6413 and to Output Y. Inputs A to H may be tied to one PMOS gate and one NMOS gate. Input A may be tied to the PMOS A and NMOS A gates 6403. The NMOS sources 6412 may be substantially all tied to ground. The PMOS H drain 6420 may be tied to the next PMOS source in the stack, PMOS G, and repeated so forth for PMOS transistors 6401. The structure built in 3D described below may take advantage of these connections in the 3rd dimension.

Figure 64A:
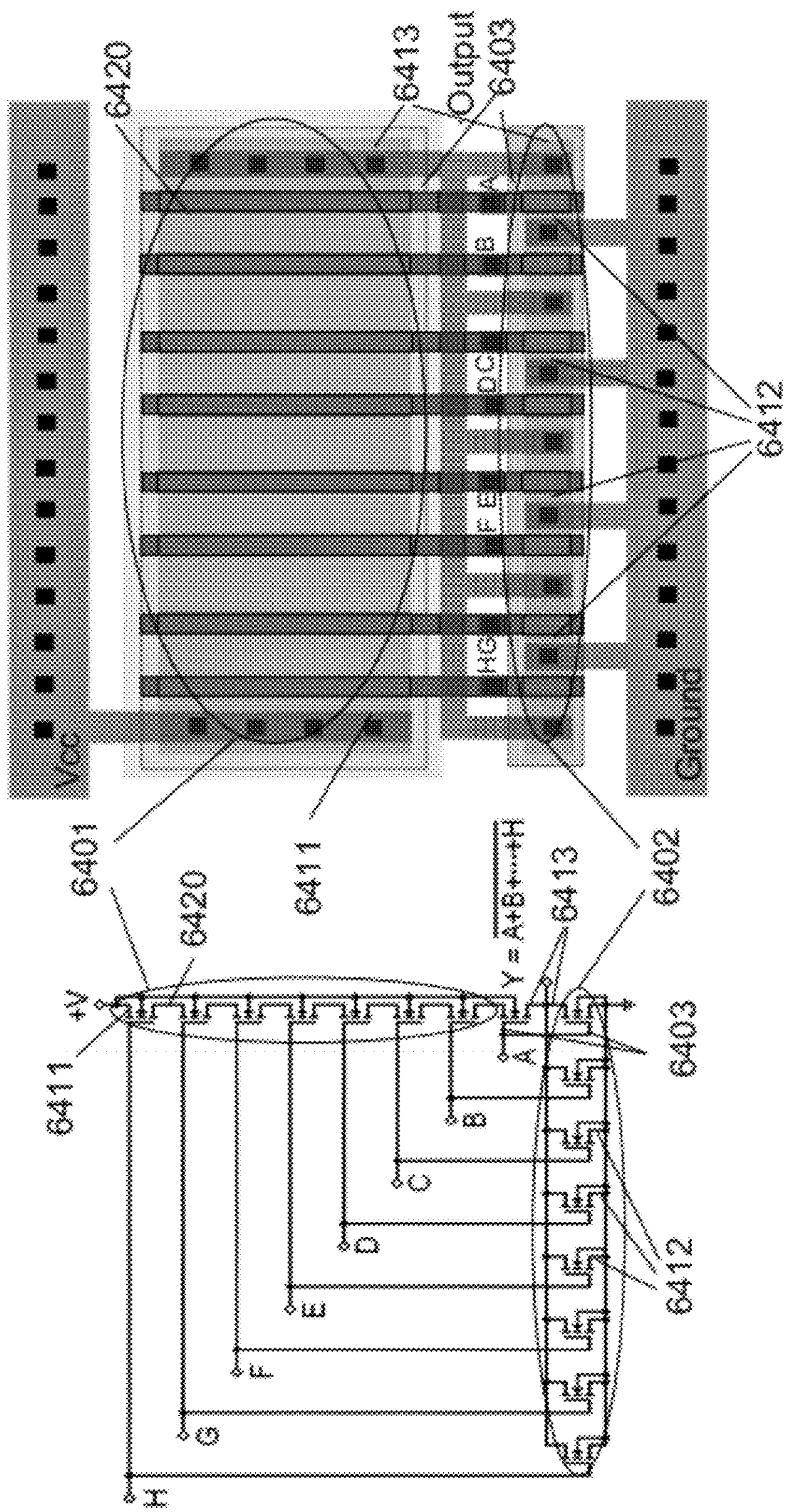
FIG. 64 A-G are exemplary drawing illustrations of a 3D NOR8 cell.
Figure 64B:
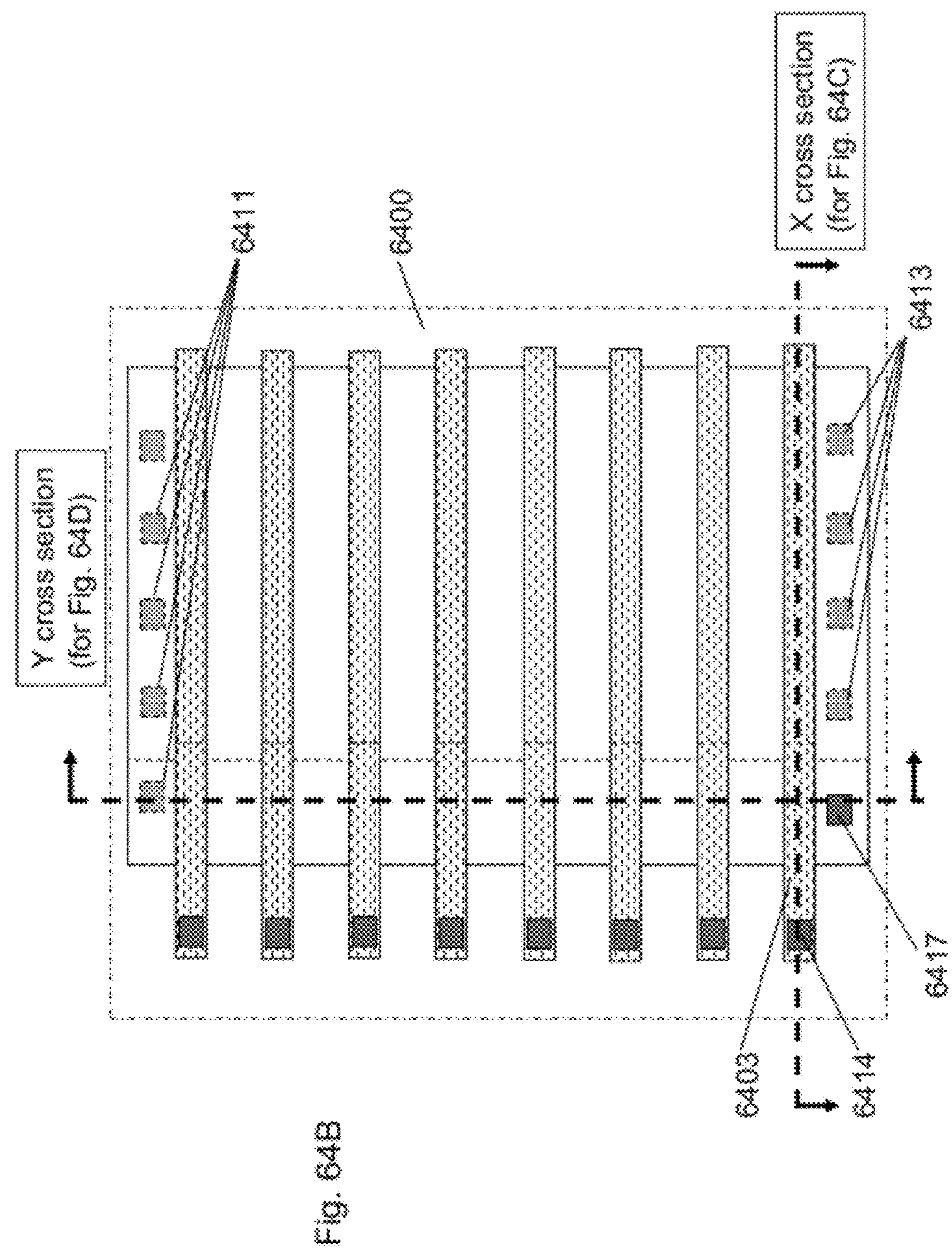
Figure 64C:
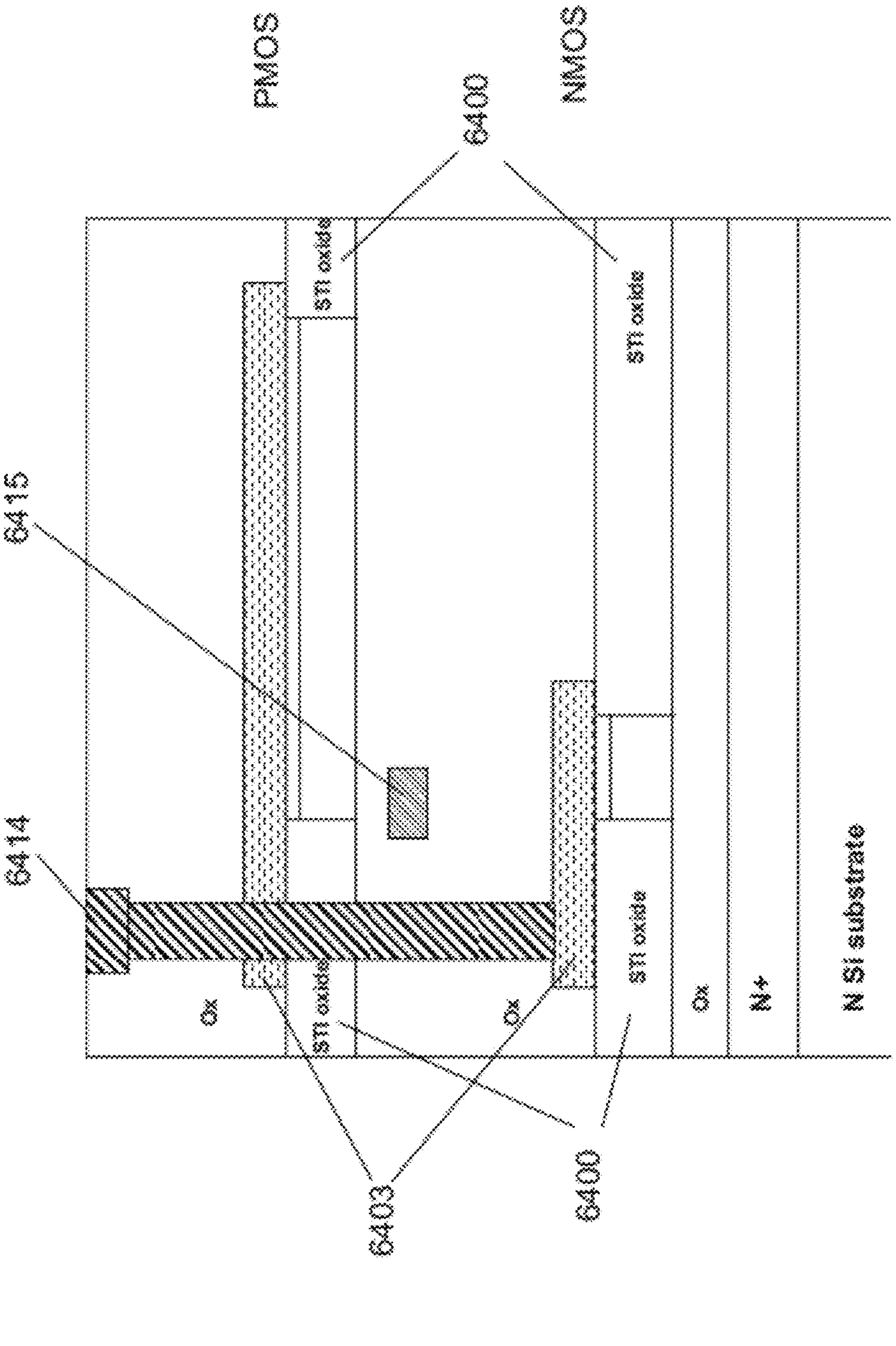
Figure 64D:
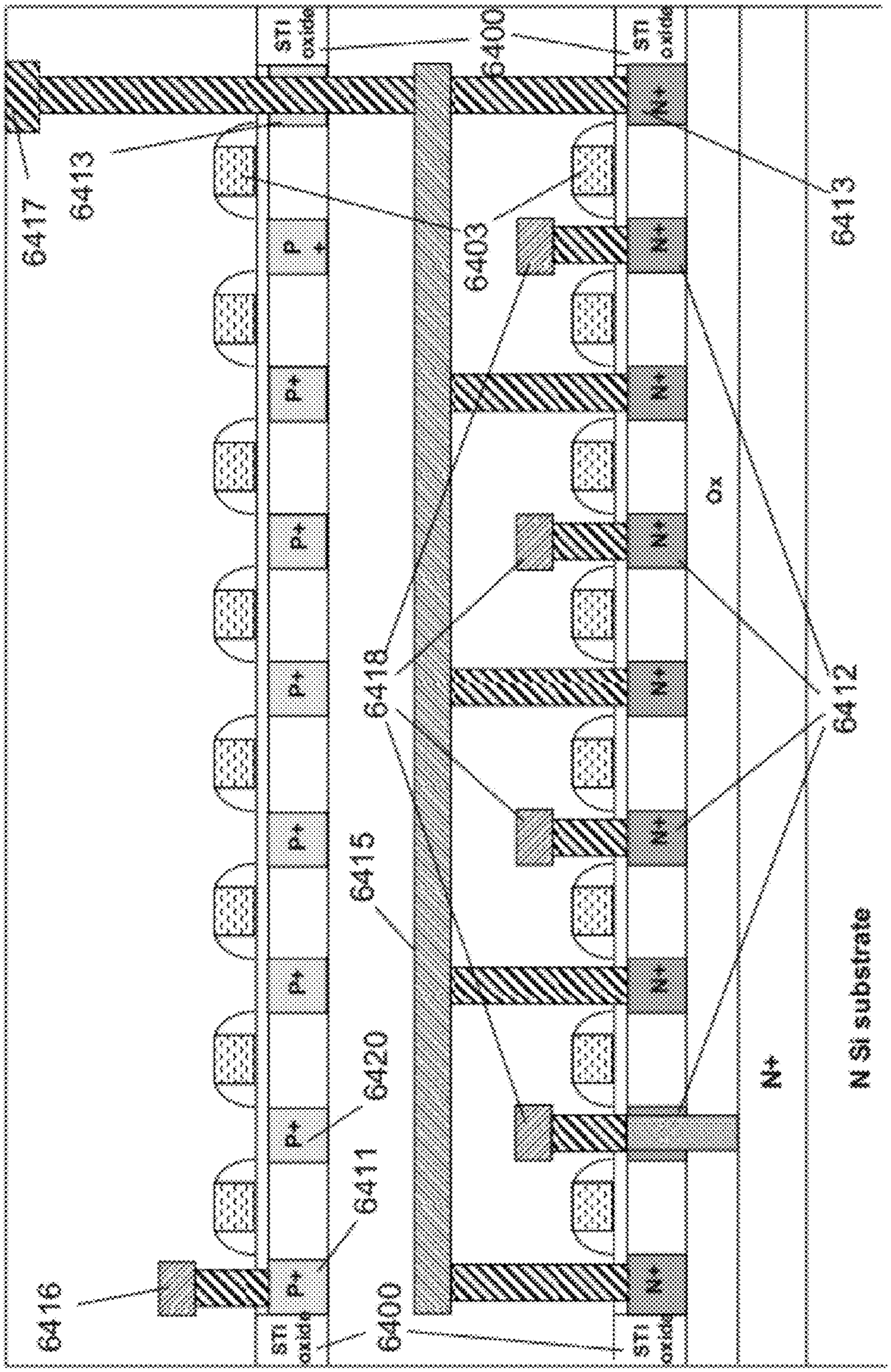
Figure 64E:
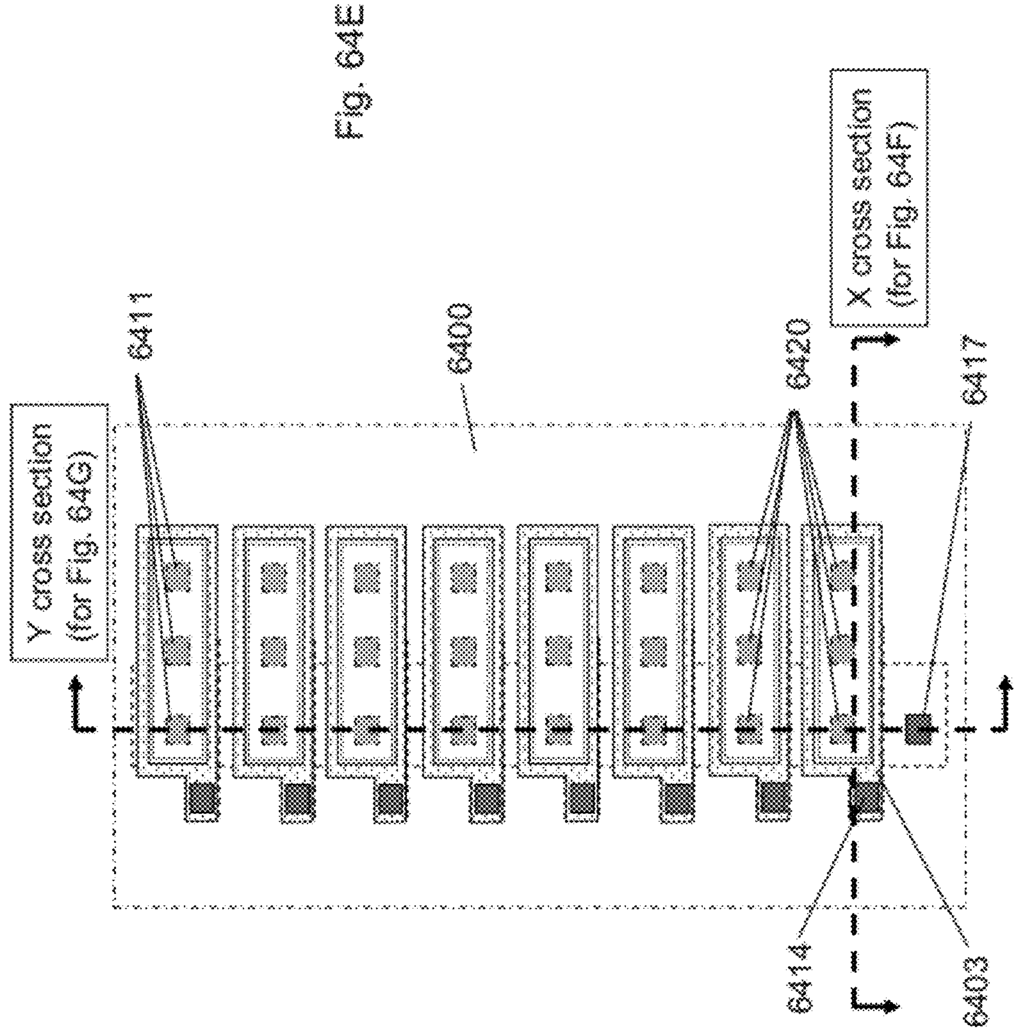
Figure 64F:
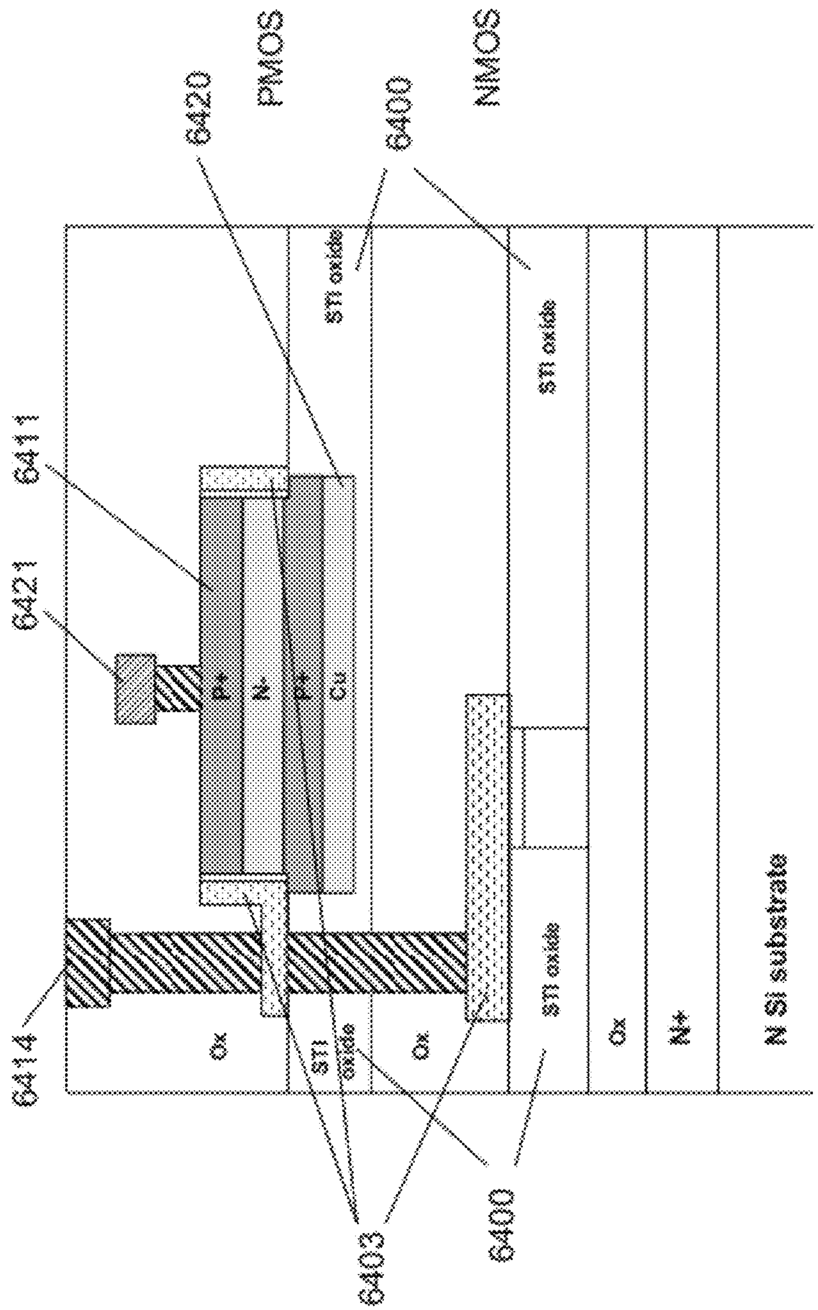
Figure 64G:
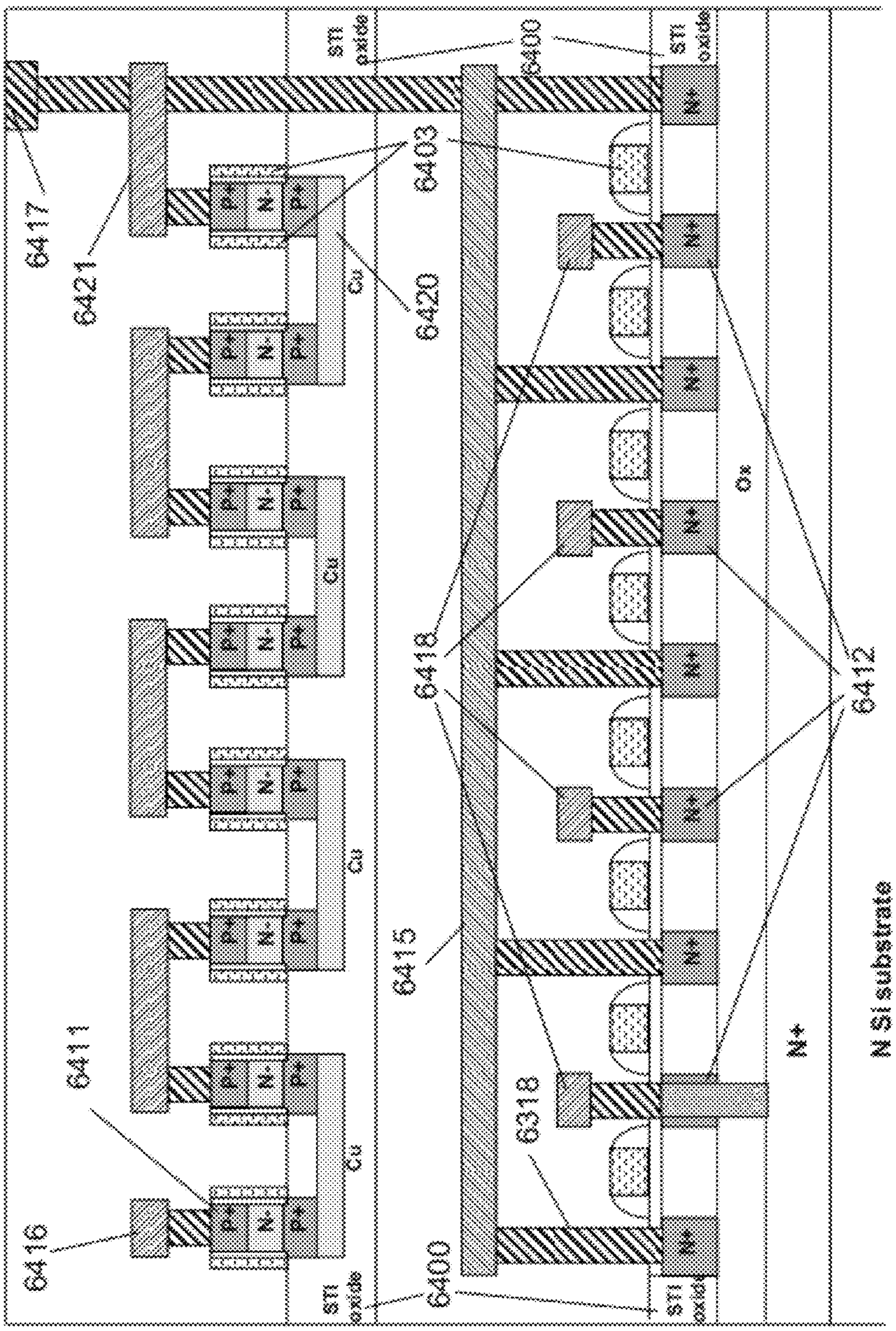

The topside view of the 3D NOR-8 cell, with no metal shown and with horizontal NMOS and PMOS devices, is illustrated in FIG. 64B, the cell X cross sectional views may be s illustrated in FIG. 64C, and the Y cross sectional view may be illustrated in FIG. 64D. The NAND-8 cell with vertical PMOS and horizontal NMOS devices are shown in FIG. 64E for topside view, 64F for the X cross section view, and 64G for the Y cross sectional view. The PMOS H transistor source 6411 may be tied to the V+ supply metal 6421 in the PMOS metal 1 layer through a P+ to Metal contact. The PMOS H drain may be tied 6420 to PMOS G source in the PMOS silicon layer. The NMOS sources 6412 may be substantially all tied to ground by N+ to NMOS metal-1 contacts to metal lines 6418 and to the backplane N+ ground layer in the N− substrate. Input A on PMOS metal-2 may be tied to both PMOS A and NMOS A gates 6403 with a gate on STI to gate on STI contact 6414. The NMOS drains may be substantially all tied together with NMOS metal-2 6415 to the NMOS A drain and PMOS A drain 6413 by the P+ to N+ to PMOS metal-2 contact 6417, which may be tied to output Y. FIG. 64G illustrates the use of vertical PMOS transistors to compactly tie the stack sources and drain, and may make a very compact area cell shown in FIG. 64E. The transistor isolation oxides 6400 are illustrated.

Accordingly a CMOS circuit may be constructed where the various circuit cells may be built on two silicon layers achieving a smaller circuit area and shorter intra and inter transistor interconnects. As interconnects may become dominating for power and speed, packing circuits in a smaller area would result in a lower power and faster speed end device.

Persons of ordinary skill in the art will appreciate that a number of different process flows have been described with exemplary logic gates and memory bit cells used as representative circuits. Such skilled persons will further appreciate that whichever flow is chosen for an individual design, a library of all the logic functions for use in the design may be created so that the cells may easily be reused either within that individual design or in subsequent ones employing the same flow. Such skilled persons will also appreciate that many different design styles may be used for a given design. For example, a library of logic cells could be built in a manner that has uniform height called standard cells as is well known in the art. Alternatively, a library could be created for use in long continuous strips of transistors called a gated array which is also known in the art. In another alternative embodiment, a library of cells could be created for use in a hand crafted or custom design as is well known in the art. For example, in yet another alternative embodiment, any combination of libraries of logic cells tailored to these design approaches can be used in a particular design as a matter of design choice, the libraries chosen may employ the same process flow if they are to be used on the same layers of a 3D IC. Different flows may be used on different levels of a 3D IC, and one or more libraries of cells appropriate for each respective level may be used in a single design.

Also known in the art are computer program products that may be stored in computer readable media for use in data processing systems employed to automate the design process, more commonly known as computer aided design (CAD) software. Persons of ordinary skill in the art will appreciate the advantages of designing the cell libraries in a manner compatible with the use of CAD software.

Persons of ordinary skill in the art will realize that libraries of I/O cells, analog function cells, complete memory blocks of various types, and other circuits may also be created for one or more processing flows to be used in a design and that such libraries may also be made compatible with CAD software. Many other uses and embodiments will suggest themselves to such skilled persons after reading this specification, thus the scope of the illustrated embodiments of the invention is to be limited only by the appended claims.

Figure 59:
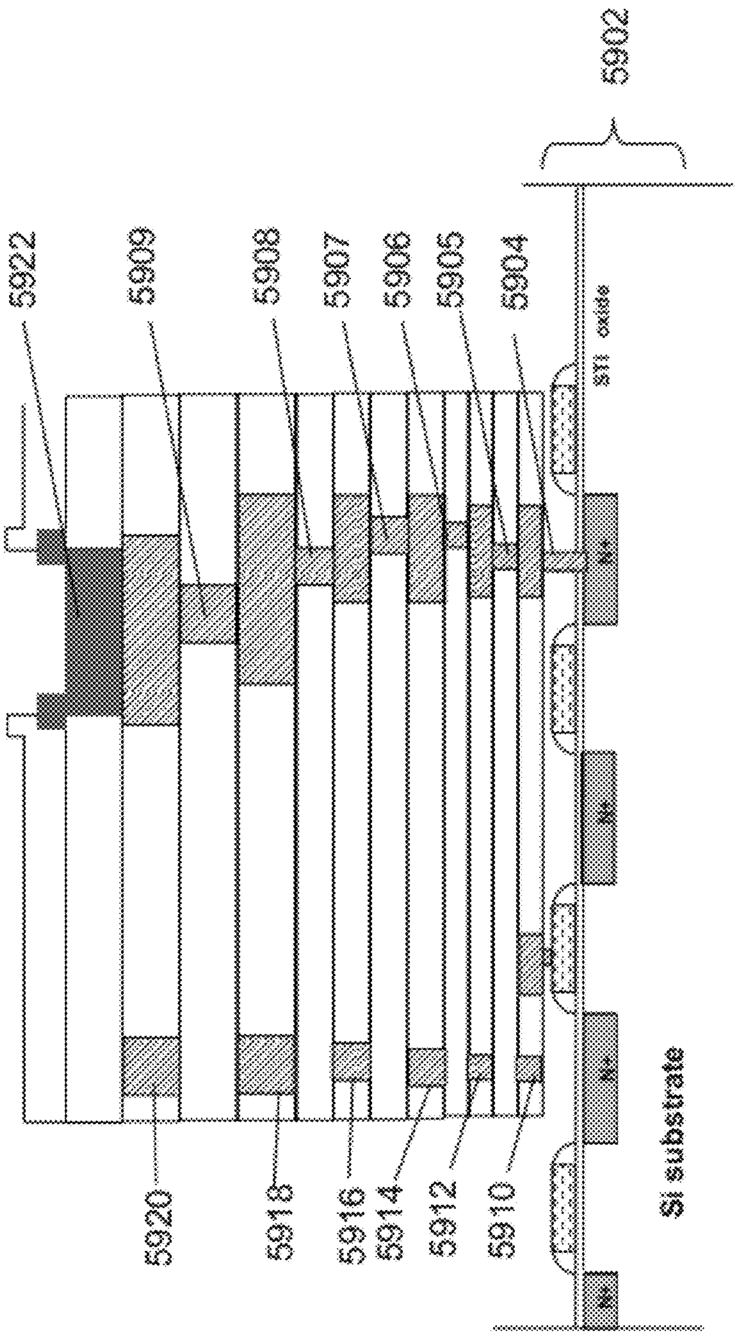
FIG. 59 is an exemplary drawing illustration of a metal interconnect stack prior art.

Additionally, when circuit cells are built on two or more layers of thin silicon as shown above, and enjoy the dense vertical through silicon via interconnections, the metallization layer scheme to take advantage of this dense 3D technology may be improved as follows. FIG. 59 illustrates the prior art of silicon integrated circuit metallization schemes. The conventional transistor silicon layer 5902 may be connected to the first metal layer 5910 through the contact 5904. The dimensions of this interconnect pair of contact and metal lines generally may be at the minimum line resolution of the lithography and etch capability for that technology process node. Traditionally, this is called a '1X' design rule metal layer. Usually, the next metal layer may be also at the "1X' design rule, the metal line 5912 and via below 5905 and via above 5906 that connects metal line 5912 with 5910 or with 5914 where desired. Then the next few layers often may be constructed at twice the minimum lithographic and etch capability and called '2X' metal layers, and have thicker metal for higher current carrying capability. These designs are illustrated with metal line 5914 paired with via 5907 and metal line 5916 paired with via 5908 in FIG. 59. Accordingly, the metal via pairs of 5918 with 5909, and 5920 with bond pad opening 5922, represent the '4X' metallization layers where the planar and thickness dimensions may be again larger and thicker than the 2X and 1X layers. The precise number of 1X or 2X or 4X layers may vary depending on interconnection needs and other requirements; however, the general flow may be that of increasingly larger metal line, metal space, and via dimensions as the metal layers may be farther from the silicon transistors and closer to the bond pads.

Figure 60:
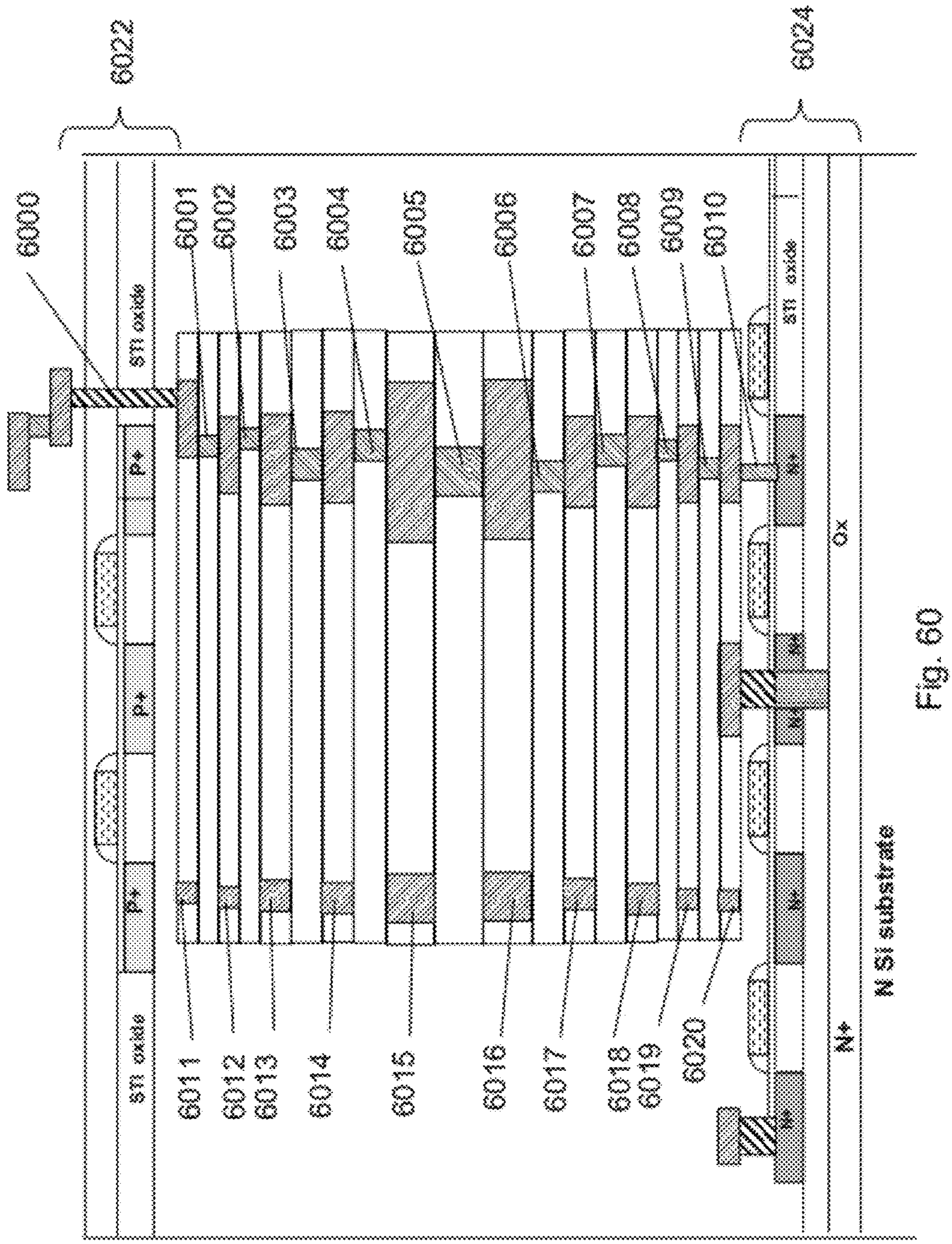
FIG. 60 is an exemplary drawing illustration of a metal interconnect stack.

The metallization layer scheme may be improved for 3D circuits as illustrated in FIG. 60. The first mono- or polycrystalline silicon device layer 6024 is illustrated as the NMOS silicon transistor layer from the above 3D library cells, but may also be a conventional logic transistor silicon substrate or layer. The '1X' metal layers 6020 and 6019 may be connected with contact 6010 to the silicon transistors and vias 6008 and 6009 to each other or metal 6018. The 2X layer pairs metal 6018 with via 6007 and metal 6017 with via 6006. The 4X metal layer 6016 may be paired with via 6005 and metal 6015, also at 4X. However, now via 6004 may be constructed in 2X design rules to enable metal line 6014 to be at 2X. Metal line 6013 and via 6003 may be also at 2X design rules and thicknesses. Vias 6002 and 6001 may be paired with metal lines 6012 and 6011 at the 1X minimum design rule dimensions and thickness. The through layer via 6000 of the illustrated PMOS layer transferred silicon 6022 may then be constructed at the 1X minimum design rules and provide for maximum density of the top layer. The precise numbers of 1X or 2X or 4X layers may vary depending on circuit area and current carrying metallization design rules and tradeoffs. The illustrated PMOS layer transferred silicon 6022 may be, for example, any of the low temperature devices illustrated herein.

When a transferred layer is not optically transparent to shorter wavelength light, and hence not able to detect alignment marks and images to a nanometer or tens of nanometer resolution, due to the transferred layer or its carrier or holder substrate's thickness, infra-red (IR) optics and imaging may be utilized for alignment purposes. However, the resolution and alignment capability may not be satisfactory. In some embodiments of the present invention, alignment windows may be created that allow use of the shorter wavelength light, for example, for alignment purposes during layer transfer flows.

Figure 111A:
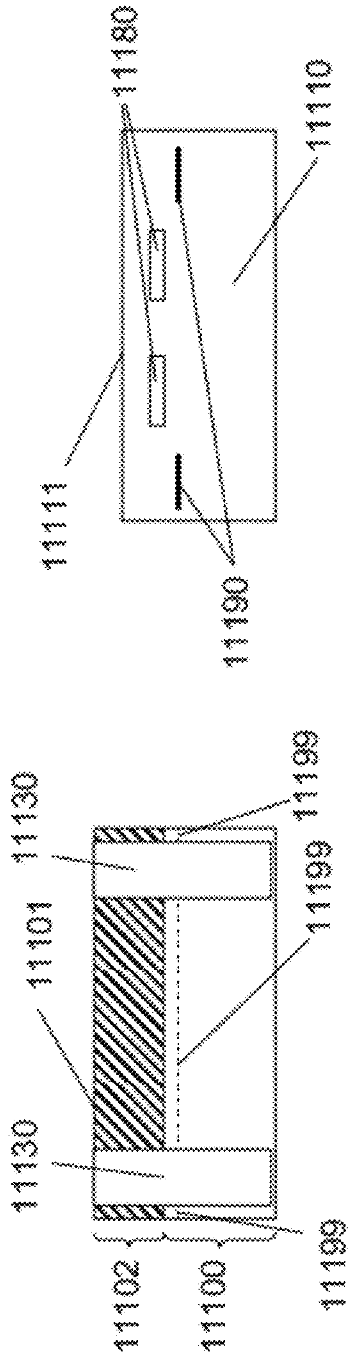

As illustrated in FIG. 111A, a generalized process flow may begin with a donor wafer 11100 that may be preprocessed with layers 11102 of conducting, semi-conducting or insulating materials that may be formed by deposition, ion implantation and anneal, oxidation, epitaxial growth, combinations of above, or other semiconductor processing steps and methods. The donor wafer 11100 may also be preprocessed with a layer transfer demarcation plane 11199, such as, for example, a hydrogen implant cleave plane, before or after layers 11102 are formed, or may be thinned by other methods previously described. Alignment windows 11130 may be lithographically defined, plasma/RIE etched substantially through layers 11102, layer transfer demarcation plane 11199, and donor wafer 11100, and then filled with shorter wavelength transparent material, such as, for example, silicon dioxide, and planarized with chemical mechanical polishing (CMP). For example, donor wafer 11100 may be further thinned by CMP. The size and placement on donor wafer 11100 of the alignment windows 11130 may be determined based on the maximum misalignment tolerance of the alignment scheme used while bonding the donor wafer 11100 to the acceptor wafer 11110, and the placement locations of the acceptor wafer alignment marks 11190. Alignment windows 11130 may be processed before or after layers 11102 are formed. Acceptor wafer 11110 may be a preprocessed wafer that has fully functional circuitry or may be a wafer with previously transferred layers, or may be a blank carrier or holder wafer, or other kinds of substrates and may be called a target wafer. The acceptor wafer 11110 and the donor wafer 11100 may be, for example, a bulk mono-crystalline silicon wafer or a Silicon On Insulator (SOI) wafer or a Germanium on Insulator (GeOI) wafer. Acceptor wafer 11110 metal connect pads or strips 11180 and acceptor wafer alignment marks 11190 are shown.

Both the donor wafer 11100 and the acceptor wafer 11110 bonding surfaces 11101 and 11111 may be prepared for wafer bonding by depositions, polishes, plasma, or wet chemistry treatments to facilitate successful wafer to wafer bonding.

Figure 111C:
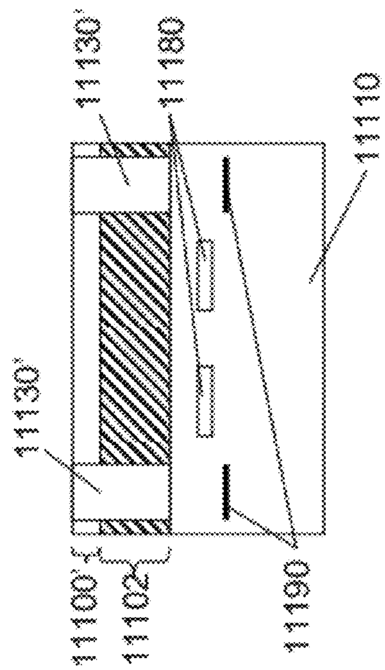
Figure 111B:
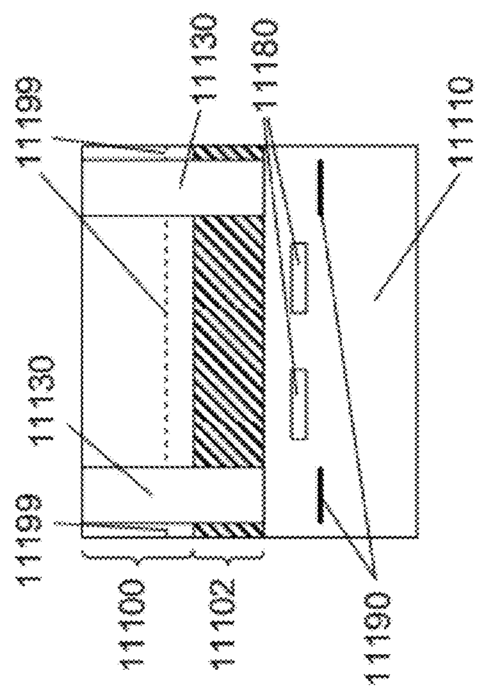

As illustrated in FIG. 111B, the donor wafer 11100 with layers 11102, alignment windows 11130, and layer transfer demarcation plane 11199 may then be flipped over, high resolution aligned to acceptor wafer alignment marks 11190, and bonded to the acceptor wafer 11110.

As illustrated in FIG. 111C, the donor wafer 11100 may be cleaved at or thinned as described elsewhere in this document to approximately the layer transfer demarcation plane 11199, leaving a portion of the donor, donor wafer portion 11100', alignment windows 11130' and the pre-processed layers 11102 aligned and bonded to the acceptor wafer 11110.

Figure 111D:
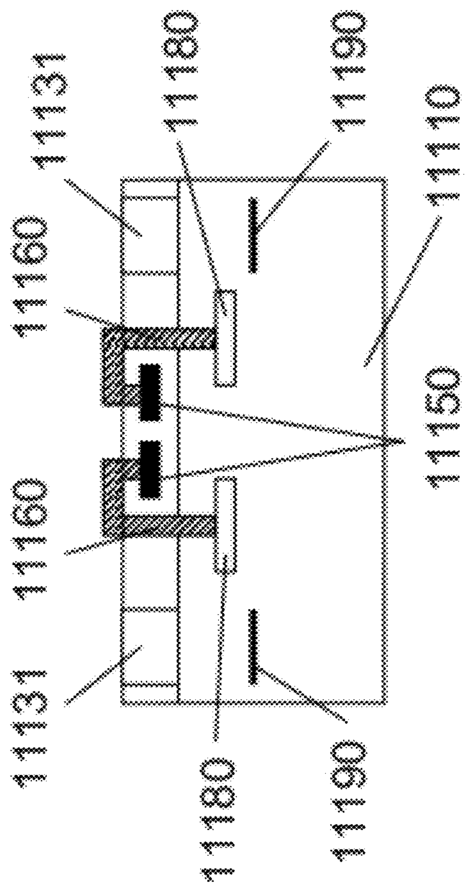

As illustrated in FIG. 111D, the remaining donor wafer portion 11100' may be removed by polishing or etching and the transferred layers 11102 may be further processed to create donor wafer device structures 11150 that may be precisely aligned to the acceptor wafer alignment marks 11190, and the alignment windows 11130' may be further processed into alignment window regions 11131. These donor wafer device structures 11150 may utilize through layer vias (TLVs) 11160 to electrically couple the donor wafer device structures 11150 to the acceptor wafer metal connect pads or strips 11180. As the transferred layers 11102 may be thin, on the order of 200 nm or less in thickness, the TLVs may be easily manufactured as a normal metal to metal via may be, and said TLV may have state of the art diameters such as nanometers or tens of nanometers. TLV 11160 may be drawn in the database (not shown) so that it may be positioned approximately at the center of the acceptor wafer metal connect pads or strips 11180 and donor wafer devices structure metal connect pads or strips, and, hence, may be away from the ends of acceptor wafer metal connect pads or strips 11180 and donor wafer devices structure metal connect pads or strips at distances greater than approximately the nominal layer to layer misalignment margin.

Additionally, when monolithically stacking multiple layers of transistors and circuitry, there may be a practical limit on how many layers can be effectively stacked. For example, the processing time in the wafer fabrication facility may be too long or yield too risky for a stack of 8 layers, and yet it may be acceptable for creating 4 layer stacks. It therefore may be desirable to create two 4 layer sub-stacks, that may be tested and error or yield corrected with, for example, redundancy schemes described elsewhere in the document, and then stack the two 4-layer sub-stacks to create the desired 8-layer 3D IC stack. The sub-stack transferred layer and substrate or carrier substrate may not be optically transparent to shorter wavelength light, and hence not able to detect alignment marks and images to a nanometer or tens of nanometer resolution, due to the transferred layer or its carrier or holder substrate's thickness or material composition. Infra-red (IR) optics and imaging may be utilized for alignment purposes. However, the resolution and alignment capability may not be satisfactory. In some embodiments of the present invention, alignment windows may be created that allow use of the shorter wavelengths of light for alignment purposes during layer transfer flows or traditional through silicon via (TSV) flows as a method to stack and electrically couple the sub-stacks.

Figure 153A:
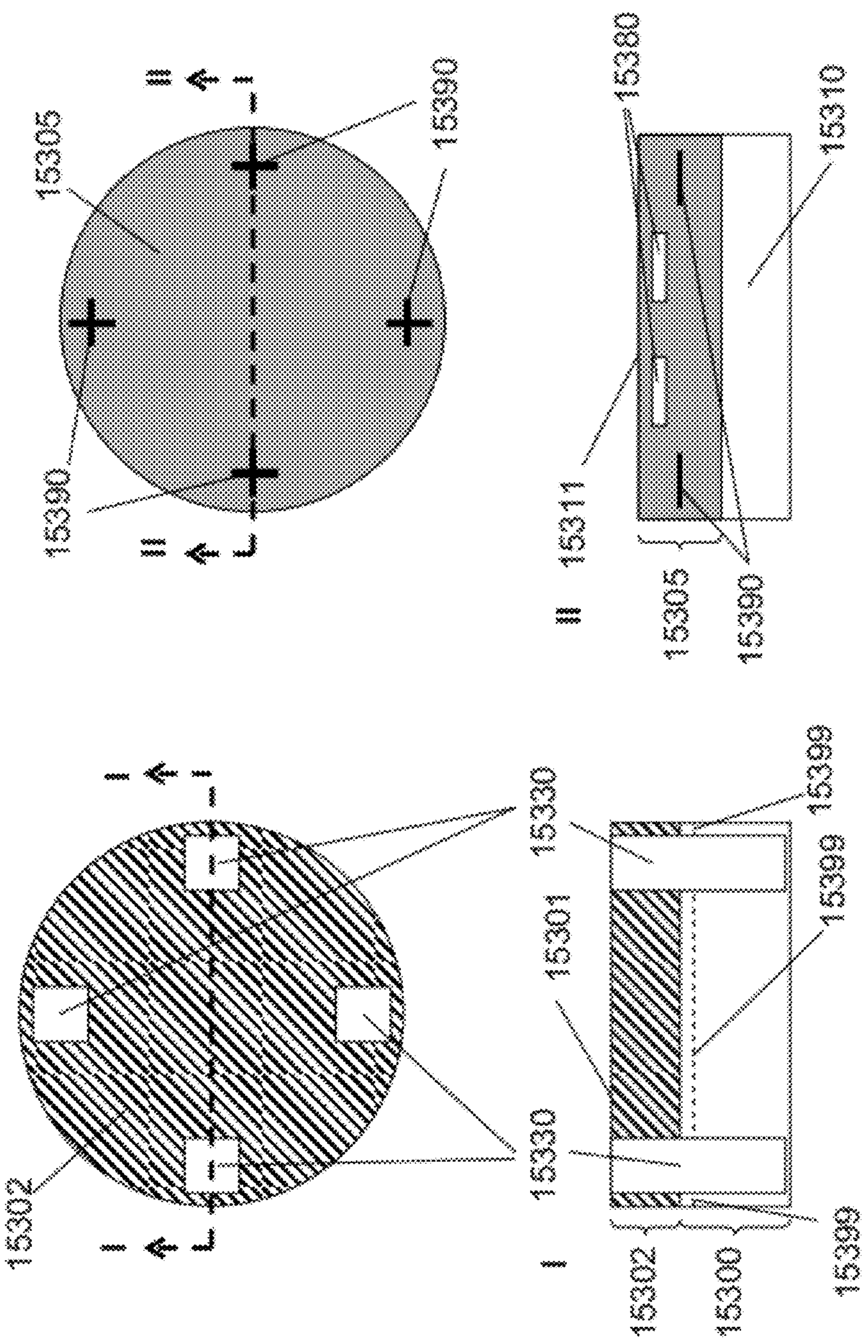

As illustrated in FIG. 153A with cross-sectional cuts I and II, a generalized process flow may begin with a donor wafer 15300 that may be preprocessed with multiple layers of monolithically stacked transistors and circuitry sub-stack 15302 by 3D IC methods, including, for example, methods such as described in general in FIG. 8 and in many embodiments in this document. The donor wafer 15300 may also be preprocessed with a layer transfer demarcation plane 15399, such as, for example, a hydrogen implant cleave plane, before or after multiple layers of monolithically stacked transistors and circuitry sub-stack 15302 is formed, or layer transfer demarcation plane 15399 may represent an SOI donor wafer buried oxide, or may be preprocessed by other methods previously described, such as, for example, use of a heavily boron doped layer. Alignment windows 15330 may be lithographically defined and then may be plasma/RIE etched substantially through the multiple layers of monolithically stacked transistors and circuitry sub-stack 15302, layer transfer demarcation plane 15399, and donor wafer 15300, and may then filled with shorter wavelength transparent material, such as, for example, silicon dioxide, and may then be planarized with chemical mechanical polishing (CMP). For example, donor wafer 15300 may be further thinned by CMP. The size and placement on donor wafer 15300 of the alignment widows 15330 may be determined based on the maximum misalignment tolerance of the alignment scheme used while bonding the donor wafer 15300 to the acceptor wafer 15310, and the number and placement locations of the acceptor wafer alignment marks 15390. Alignment windows 15330 may be processed before or after each or some of the layers of the multiple layers of monolithically stacked transistors and circuitry sub-stack 15302 are formed.

Acceptor wafer 15310 may be a preprocessed wafer with multiple layers of monolithically stacked transistors and circuitry sub-stack 15305. Acceptor wafer 15310 metal connect pads or strips 15380 and acceptor wafer alignment marks 15390 are shown and may be formed in the top device layer of the multiple layers of monolithically stacked transistors and circuitry sub-stack 15305 (shown), or may be formed in any of the other layers of multiple layers of monolithically stacked transistors and circuitry sub-stack 15305 (not shown), or may be formed in the substrate potion of the acceptor wafer 15310 (not shown).

Both the donor wafer 15300 and the acceptor wafer 15310 bonding surfaces 15301 and 15311 respectively may be prepared for wafer bonding by depositions, polishes, plasma, or wet chemistry treatments to facilitate successful wafer to wafer bonding.

Figure 153C:
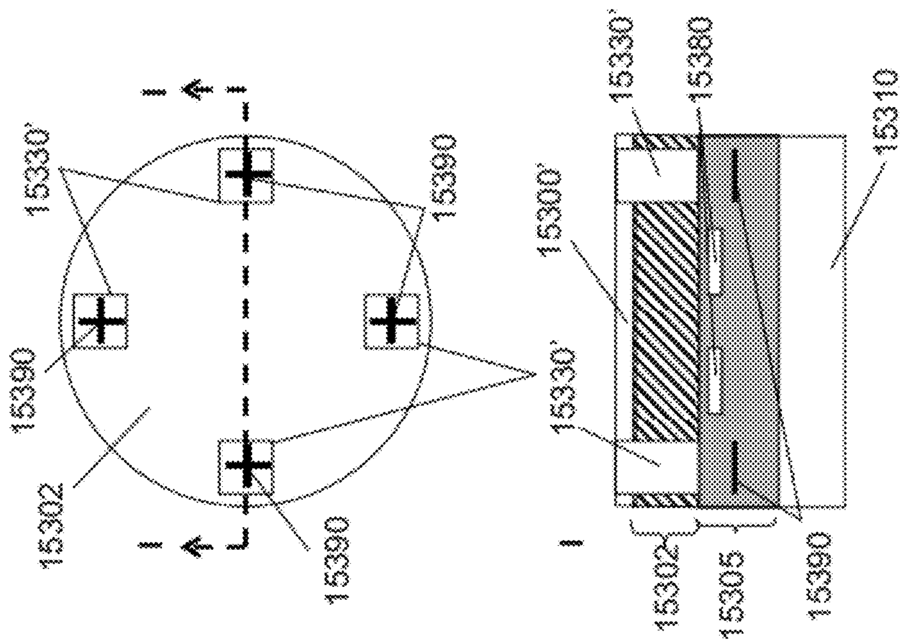
Figure 153B:
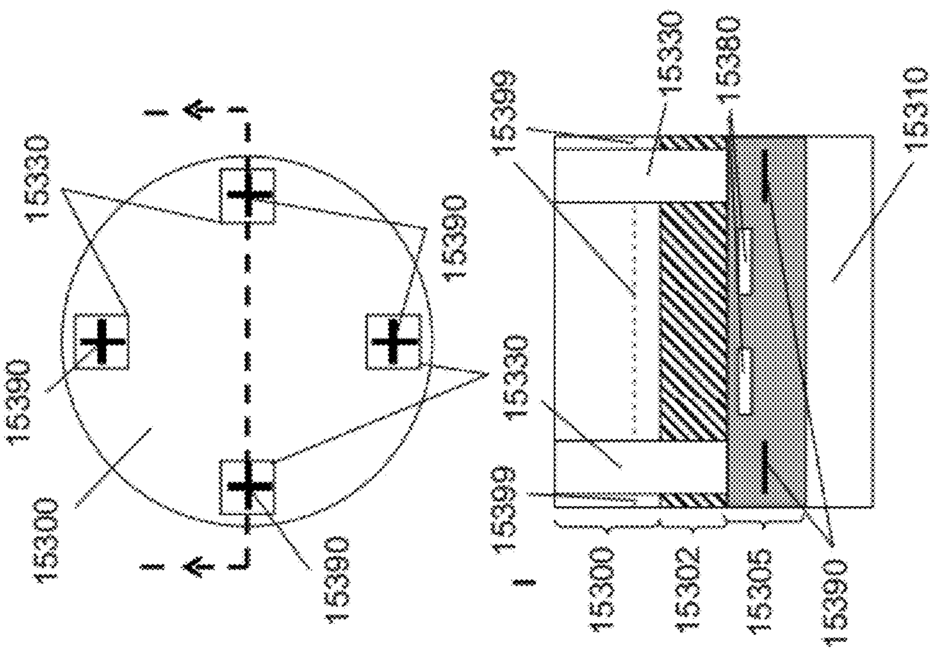

As illustrated in FIG. 153B with cross-sectional cut I, the donor wafer 15300 with the multiple layers of monolithically stacked transistors and circuitry sub-stack 15302, alignment windows 15330, and layer transfer demarcation plane 15399 may then be flipped over, high resolution aligned to acceptor wafer alignment marks 15390, and bonded to the acceptor wafer 15310 with multiple layers of monolithically stacked transistors and circuitry sub-stack 15305. Temperature controlled and profiled wafer bonding chucks may be utilized to compensate for run-out or other across the wafer and wafer section misalignment or expansion offsets.

As illustrated in FIG. 153C with cross-sectional cut I, the donor wafer 15300 may be cleaved at or thinned as described elsewhere in this document to approximately the layer transfer demarcation plane 15399, leaving a portion of the donor wafer 15300', alignment windows 15330' and the pre-processed layers multiple layers of monolithically stacked transistors and circuitry sub-stack 15302 aligned and bonded to the acceptor wafer 15310 with multiple layers of monolithically stacked transistors and circuitry sub-stack 15305.

Figure 153D:
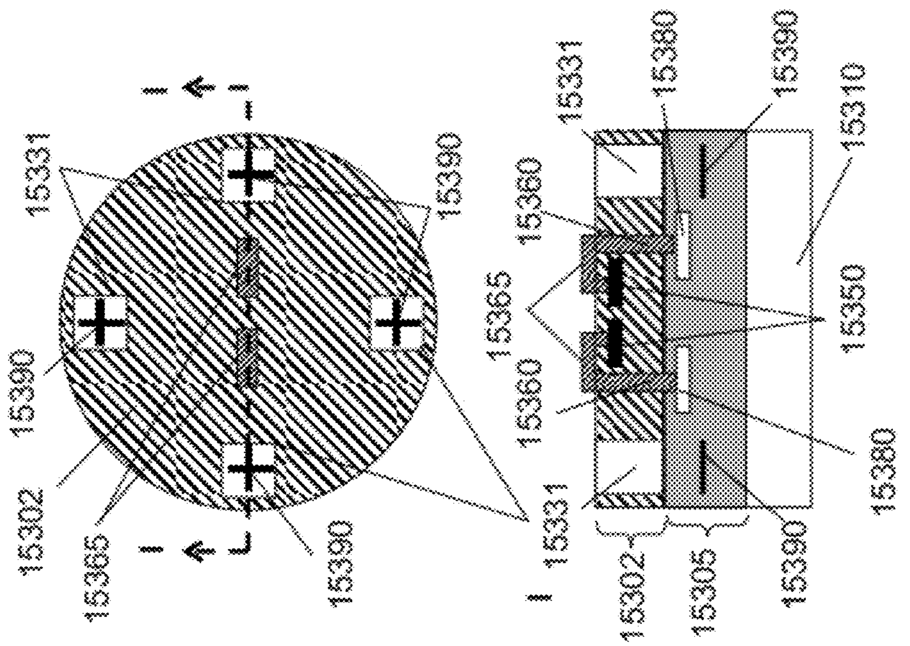

As illustrated in FIG. 153D with cross-sectional cut I, the remaining donor wafer portion 15300' may be removed by polishing or etching, thus also forming thinned alignment windows 15331, and the transferred multiple layers of monolithically stacked transistors and circuitry sub-stack 15302 may be further processed to create layer to layer or sub-stack to sub-stack connections utilizing methods including, for example, through layer vias (TLVs) 15360 and metallization 15365 to electrically couple the transferred multiple layers of monolithically stacked transistors and circuitry sub-stack 15302 donor wafer device structures 15350 to the acceptor wafer metal connect pads or strips 15380. As the thickness of the transferred multiple layers of monolithically stacked transistors and circuitry sub-stack 15302 increases, traditional via last TSV (Thru Silicon Via) processing may be utilized to electrically couple the transferred multiple layers of monolithically stacked transistors and circuitry sub-stack 15302 donor wafer device structures 15350 to the acceptor wafer metal connect pads or strips 15380. TLV 15360 may be drawn in the database (not shown) so that it may be positioned approximately at the center of the acceptor wafer metal connect pads or strips 15380 and donor wafer devices structure metal connect pads or strips, and, hence, may be away from the ends of acceptor wafer metal connect pads or strips 15380 and donor wafer devices structure metal connect pads or strips at distances greater than approximately the nominal layer to layer misalignment margin.

Persons of ordinary skill in the art will appreciate that the illustrations in FIGS. 153A through 153D are exemplary only and are not drawn to scale. Such skilled persons will further appreciate that many variations may be possible such as, for example, the acceptor wafer 15310 may have alignment windows over the alignment marks formed prior to the alignment and bonding step to the donor wafer. Additionally, a via first TSV process may be utilized on the donor wafer 15300 prior to the wafer to wafer bonding. Moreover, the acceptor wafer 15310 and the donor wafer 15300 may be, for example, a bulk mono-crystalline silicon wafer or a Silicon On Insulator (SOI) wafer or a Germanium on Insulator (GeOI) wafer. Further, the opening size of the alignment windows 15330 formed may be substantially minimized by use of pre-alignment with IR or other long wavelength light, and final high resolution alignment performed through the alignment windows 15330 with lower wavelength light. Many other modifications within the scope of the illustrated embodiments of the invention will suggest themselves to such skilled persons after reading this specification. Thus the invention is to be limited only by the appended claims.

Figure 154A:
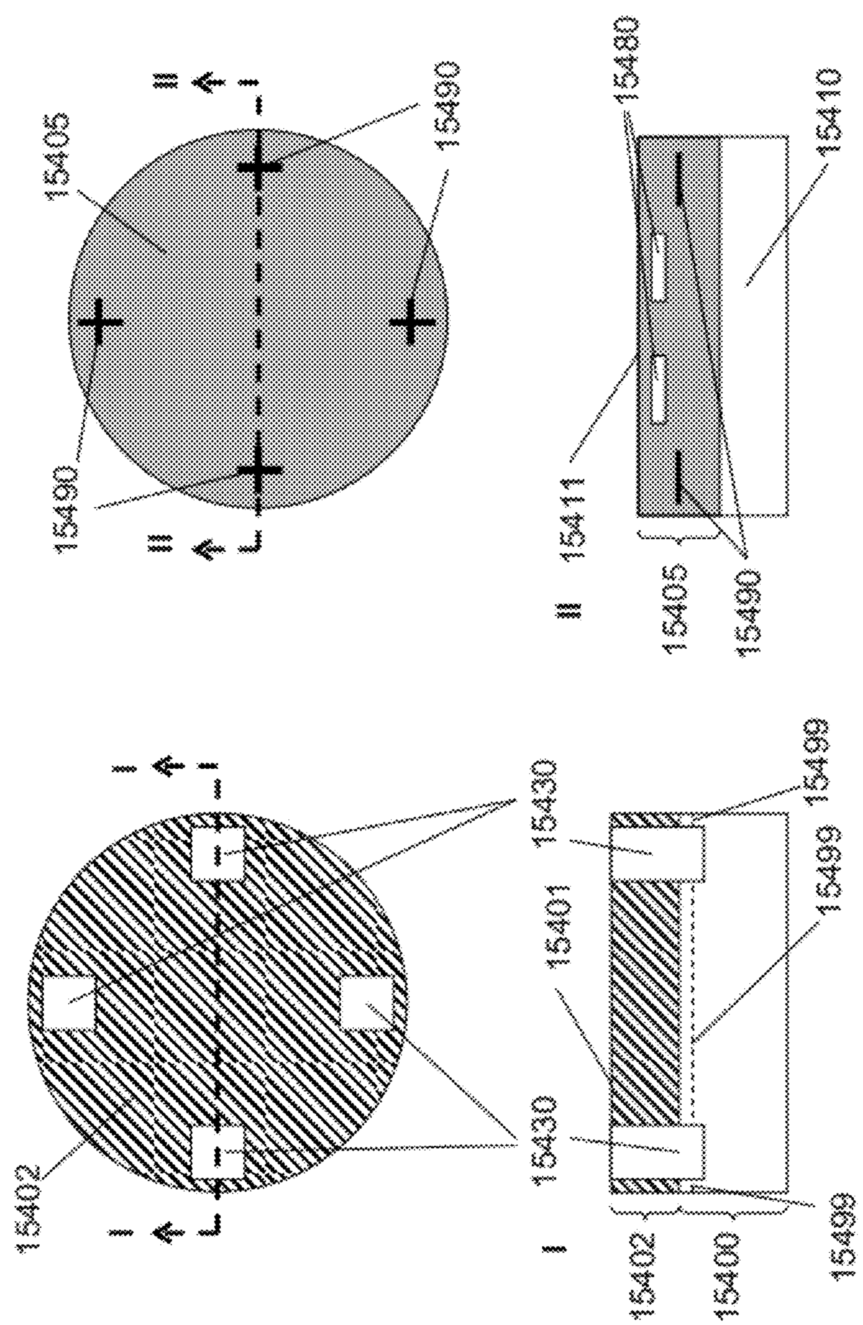

As illustrated in FIG. 154A with cross-sectional cuts I and II, a generalized process flow utilizing a carrier wafer or substrate may begin with a donor wafer 15400 that may be preprocessed with multiple layers of monolithically stacked transistors and circuitry sub-stack 15402 by 3D IC methods, including, for example, methods such as described in general in FIG. 8 and in many embodiments in this document. The donor wafer 15400 may also be preprocessed with a layer transfer demarcation plane 15499, such as, for example, a hydrogen implant cleave plane, before or after multiple layers of monolithically stacked transistors and circuitry sub-stack 15402 is formed, or layer transfer demarcation plane 15499 may represent an SOI donor wafer buried oxide, or may be preprocessed by other methods previously described, such as, for example, use of a heavily boron doped layer. Alignment windows 15430 may be lithographically defined and may then be plasma/RIE etched substantially through the multiple layers of monolithically stacked transistors and circuitry sub-stack 15402 and then may be etched to approximately the layer transfer demarcation plane 15499. In FIG. 154A, the alignment windows 15430 are shown etched past the layer transfer demarcation plane 15499, but may be etched shallower than the layer transfer demarcation plane 15499. The alignment windows 15430 may then be filled with shorter wavelength transparent material, such as, for example, silicon dioxide, and then may be planarized with chemical mechanical polishing (CMP). The size and placement on donor wafer 15400 of the alignment windows 15430 may be determined based on the maximum misalignment tolerance of the alignment scheme used while bonding the donor wafer 15400 to the acceptor wafer 15410, and the number and placement locations of the acceptor wafer alignment marks 15490. Alignment windows 15430 may be processed before or after each or some of the layers of the multiple layers of monolithically stacked transistors and circuitry sub-stack 15402 are formed.

Acceptor wafer 15410 may be a preprocessed wafer with multiple layers of monolithically stacked transistors and circuitry sub-stack 15405. Acceptor wafer 15410 metal connect pads or strips 15480 and acceptor wafer alignment marks 15490 are shown and may be formed in the top device layer of the multiple layers of monolithically stacked transistors and circuitry sub-stack 15405 (shown), or may be formed in any of the other layers of multiple layers of monolithically stacked transistors and circuitry sub-stack 15405 (not shown), or may be formed in the substrate potion of the acceptor wafer 15410 (not shown).

Figure 154B:
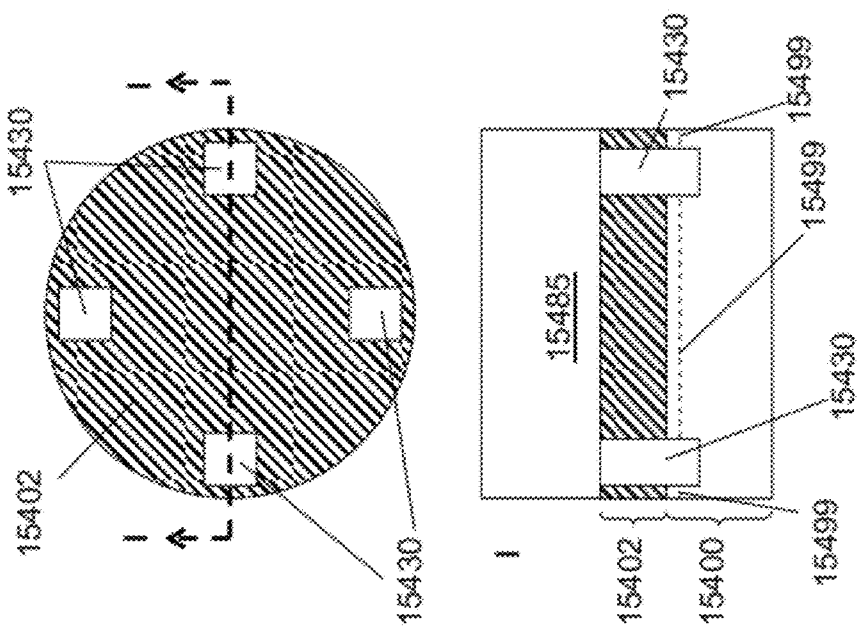

As illustrated in FIG. 154B with cross-sectional cut I, carrier substrate 15485, such as, for example, a glass or quartz substrate, may be temporarily bonded to the donor wafer at surface 15401. Some carrier substrate temporary bonding methods and materials are described elsewhere in this document.

Figure 154C:
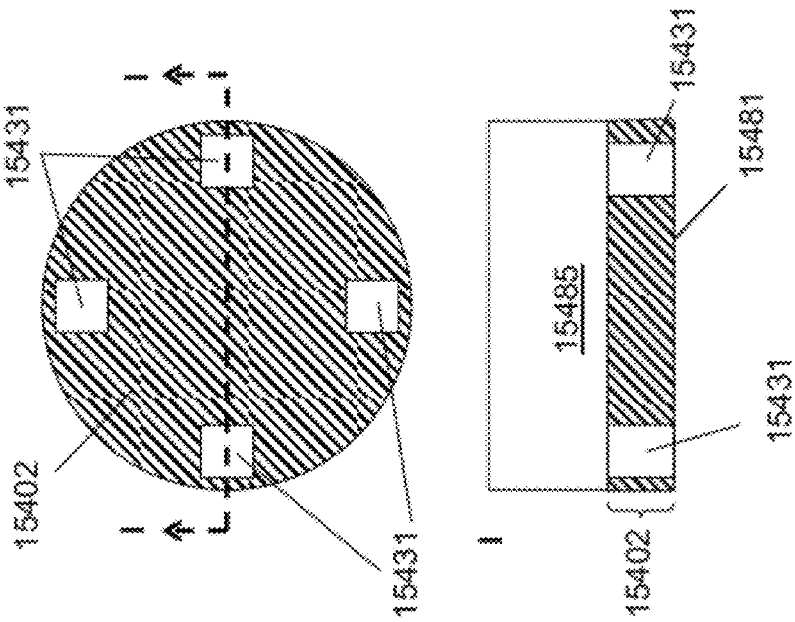

As illustrated in FIG. 154C with cross-sectional cut I, the donor wafer 15400 may be substantially thinned by previously described processes, such as, for example, cleaving at the layer transfer demarcation plane 15499 and polishing with CMP to approximately the bottom of the STI structures. The STI structures may be in the bottom layer of the donor wafer sub-stack multiple layers of monolithically stacked transistors and circuitry sub-stack 15402. Alignment windows 15431 may be thus formed.

Both the carrier substrate 15485 with donor wafer sub-stack multiple layers of monolithically stacked transistors and circuitry sub-stack 15402 and the acceptor wafer 15410 bonding surfaces, donor wafer bonding surface 15481 and acceptor bonding surface 15411, may be prepared for wafer bonding by depositions, polishes, plasma, or wet chemistry treatments to facilitate successful wafer to wafer bonding.

Figure 154D:
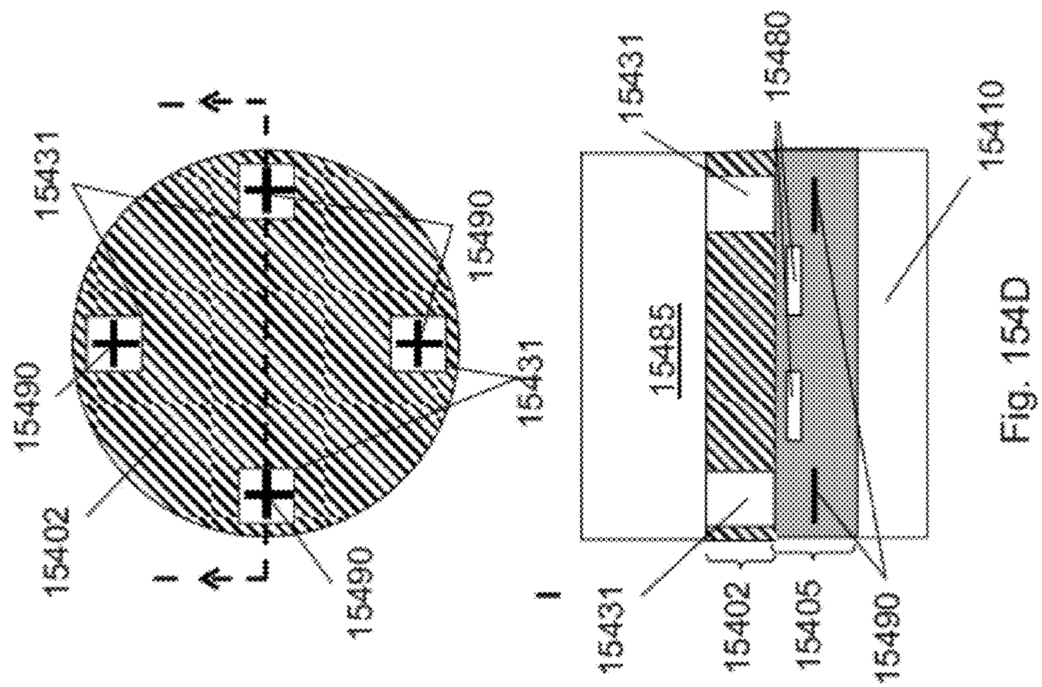

As illustrated in FIG. 154D with cross-sectional cut I, the carrier substrate 15485 with donor wafer multiple layers of monolithically stacked transistors and circuitry sub-stack 15402 and alignment windows 15431, may then be high resolution aligned to acceptor wafer alignment marks 15490, and may be bonded to the acceptor wafer 15410 with multiple layers of monolithically stacked transistors and circuitry sub-stack 15405 at acceptor bonding surface 15411 and donor wafer bonding surface 15481. Temperature controlled and profiled wafer bonding chucks may be utilized to compensate for run-out or other across the wafer and wafer section misalignment or expansion offsets.

Figure 154E:
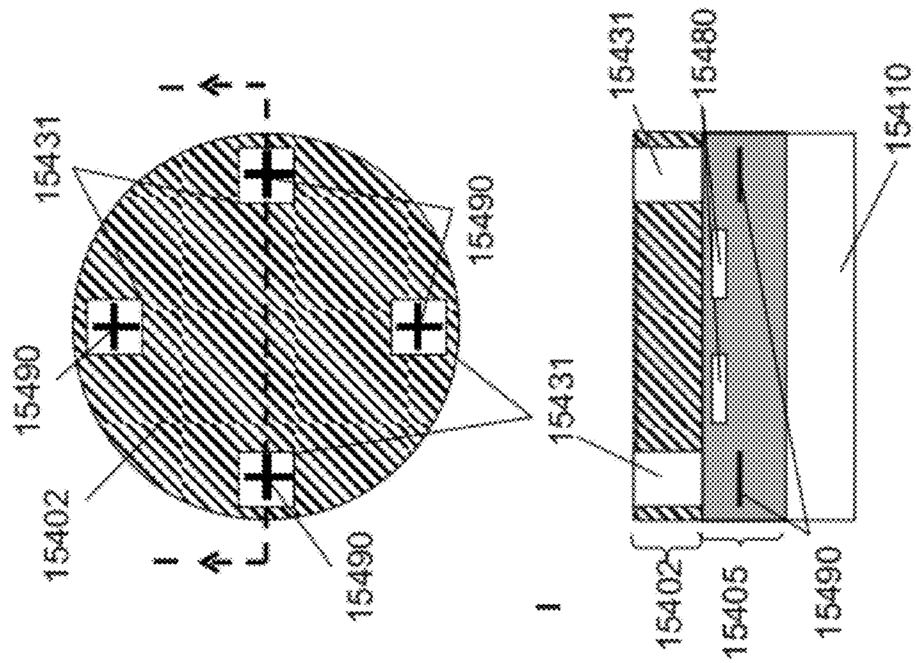

As illustrated in FIG. 154E with cross-sectional cut I, the carrier substrate 15485 may be detached with processes described elsewhere in this document, for example, with laser ablation of a polymeric adhesion layer, thus leaving alignment windows 15431 and the pre-processed multiple layers of monolithically stacked transistors and circuitry sub-stack 15402 aligned and bonded to the acceptor wafer 15410 with multiple layers of monolithically stacked transistors and circuitry sub-stack 15405, acceptor wafer 15410 metal connect pads or strips 15480, and acceptor wafer alignment marks 15490.

Figure 154F:
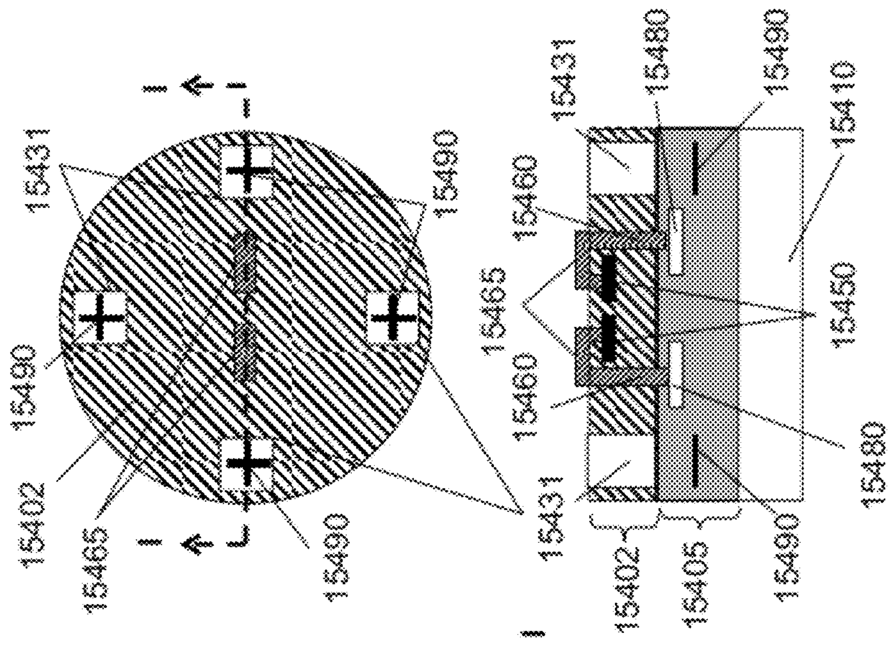

As illustrated in FIG. 154F with cross-sectional cut I, the transferred multiple layers of monolithically stacked transistors and circuitry sub-stack 15402 may be further processed to create layer to layer or sub-stack to sub-stack connections utilizing methods including, for example, through layer vias (TLVs) 15460 and metallization 15465 to electrically couple the transferred multiple layers of monolithically stacked transistors and circuitry sub-stack 15402 donor wafer device structures 15450 to the acceptor wafer metal connect pads or strips 15480. As the thickness of the transferred multiple layers of monolithically stacked transistors and circuitry sub-stack 15402 increases, traditional via last TSV (Thru Silicon Via) processing may be utilized to electrically couple the transferred multiple layers of monolithically stacked transistors and circuitry sub-stack 15402 donor wafer device structures 15450 to the acceptor wafer metal connect pads or strips 15480. TLV 15460 may be drawn in the database (not shown) so that it may be positioned approximately at the center of the acceptor wafer metal connect pads or strips 15480 and donor wafer devices structure metal connect pads or strips, and, hence, may be away from the ends of acceptor wafer metal connect pads or strips 15480 and donor wafer devices structure metal connect pads or strips at distances greater than approximately the nominal layer to layer misalignment margin.

Persons of ordinary skill in the art will appreciate that the illustrations in FIGS. 154A through 154F are exemplary only and are not drawn to scale. Such skilled persons will further appreciate that many variations may be possible such as, for example, the acceptor wafer 15410 may have alignment windows over the alignment marks formed prior to the alignment and bonding step to the donor wafer. Additionally, a via first TSV process may be utilized on the donor wafer 15400 prior to the wafer to wafer bonding. Moreover, the acceptor wafer 15410 and the donor wafer 15400 may be, for example, a bulk mono-crystalline silicon wafer or a Silicon On Insulator (SOI) wafer or a Germanium on Insulator (GeOI) wafer. Further, the carrier substrate may be a silicon wafer with a layer transfer demarcation plane and utilize methods, such as permanently oxide to oxide bonding the carrier wafer to the donor wafer and then cleaving and thinning after bonding to the acceptor wafer, described elsewhere in this document, to layer transfer the donor wafer device layers or sub-stack to the acceptor wafer. Moreover, the opening size of the alignment windows 15430 formed may be substantially minimized by use of pre-alignment with IR or other long wavelength light, and final high resolution alignment performed through the alignment windows 15430 with lower wavelength light. Many other modifications within the scope of the illustrated embodiments of the invention will suggest themselves to such skilled persons after reading this specification. Thus the invention is to be limited only by the appended claims.

The monolithic 3D process has many illustrative advantages but it also may have potential draw backs. Length of processing may be one. A typical state of the art processing time from blank wafer to finished wafer may take more than 4 weeks of processing. If monolithic 3D fabrication were to result in doubling or tripling this overall length of processing time it might be a limiting factor for some applications. It may be desirable to improve the processing flow to reduce the time it takes from beginning to end. Some embodiments of the invention may be to process layers in parallel and then stack and connect them. Some aspects of stacking and connecting wafers have been described in relation to FIGS. 80, 93, 94, 153 and 154. Some embodiments of the invention are now described.

With reference to FIG. 154, it may be desirable to have the circuitry interconnection between the underlying base wafer acceptor wafer 15410 with multiple layers of monolithically stacked transistors and circuitry sub-stack 15405 and the transferred layer of the donor wafer multiple layers of monolithically stacked transistors and circuitry sub-stack 15402 accomplished during the stacking step and processing. A potential advantage may be that there would be no need to leave room for the TLV 15460. This may be desirable if the transferred layer donor wafer multiple layers of monolithically stacked transistors and circuitry sub-stack 15402 includes transistor layers plus multiple layers of interconnections and when many connections may be required between the underlying acceptor wafer 15410 with multiple layers of monolithically stacked transistors and circuitry sub-stack 15405 and the overlying transferred layer donor wafer multiple layers of monolithically stacked transistors and circuitry sub-stack 15402. There are multiple techniques known in the art to form electrical connection as part of the bonding process of wafers but the challenge is the misalignment between the two structures bonded. This misalignment may be associated with the process of wafer bonding. As discussed before, the misalignment between wafers of current wafer to wafer bonding equipment is about one micrometer, which may be large with respect to the desired connectivity scale density of nanometer processing.

To accomplish electrical connections between the acceptor wafer and the donor wafer the acceptor wafer may have on its top surface connection pads, which may include, for example, copper or aluminum, which will be called bottom-pads. The bottom surface of the donor wafer transferred layer may also have connection pads, which may include, for example, copper or aluminum, which will be called upper-pads. The bottom-pads and upper-pads may be placed one on top of the other to form electrical connections. If the bottom-pads and upper-pads are constructed large enough, then the wafer to wafer bonding misalignment may not limit the ability to connect. And accordingly, for example, for a 1 micrometer misalignment, the connectivity limit would be on the order of one connection per 1 micron square with bottom-pads and upper-pads sizes on the order of 1 micrometer on a side. The following alternative of the invention would allow much higher vertical connectivity than the wafer to wafer bonding misalignment limits. The planning of these connection pads need to be such that regardless of the misalignment (within a given maximum limit, for example, 1 micrometer) all the desired connections would be made, while avoiding forming shorts between two active independent connection paths.

FIG. 155A illustrates an exemplary portion of a wafer sized or die sized plurality of bottom-pads 15502 and FIG. 155B illustrates an exemplary portion of a wafer sized or die sized plurality of upper-pads 15504 and upper-pads 15505 (not all pads are reference number tie-lined for clarity of the illustrations). The design may be such that for each bottom-pad 15502 there may be at least one upper-pad 15504 or upper-pad 15505 that bottom-pad 15502 may be in full contact with after the layer transfer bonding and associated misalignment of designed pads, and in no case the upper-pad 15504 or upper-pad 15505 might form a short between two bottom-pads 15502. Bottom-pad space 15524, the space between two adjacent bottom-pads 15502, may be made larger than the size of the upper-pads 15504 or upper-pads 15505. An illustrative directional orientation cross 15508 is provided for FIG. 155A to FIG. 155D. It should be noted that in a similar manner as typical semiconductor device design rules, spaces and structure sizing may need to account for process variations, such as lithographic and etch variations and biases. For example, the bottom-pad space 15524 may need to be large enough to avoid shorts even if the sizes of some pads, for example some of upper-pads 15504 or upper-pads 15505, turn out large within the process window range at end of process. For simplicity of the explanation, the details of such rules extension for covering all the production-acceptable variations may be ignored, as these are well known in the practice of the art.

As illustrated in FIG. 155A, the bottom-pads 15502 may be arranged in repeating patterns of rows and columns. Each bottom-pad 15502 may be a square with sides 15520 and may be spaced bottom-pad space 15524 to the next column pad and spaced bottom-pad space 15524 to the next row. The upper-pads and layout may be constructed with sets of upper-pads 15504 and upper-pads 15505 as illustrated in FIG. 155B. Each set of upper-pads may be arranged in row and column with the same repetition cycle and distance as the bottom-pads 15502, and may be symmetrically offset with respect to each other so that each upper-pad 15505 may be placed in equal distance to the four upper-pads 15504 that may be around said upper-pad 15505. The sizing of the pads and the distance between them may be set so that when upper-pad 15504 lands perfectly aligned to the North-West corner of a bottom-pad 15502, the corresponding (of set) upper-pad 15505, which is South-East of bottom-pad 15502, may land aligned to the South-East corner of the same bottom-pad 15502. It should be noted, that, as has been described before, misalignment of up to 1 micrometer could happen in current wafer bonding equipment in the direction of North-South or West-East but the angular misalignment may be quite small and would be less than 1 micrometer over the substantially the entire wafer size of 300 mm. Accordingly the design rule pad sizes and spaces could be adjusted to accommodate the angular misalignment.

It may be appreciated that for any misalignment in North-Sought and in West-East direction that is within the misalignment range, there will at least one of the upper-pads in the set (upper-pads 15504 or upper-pads 15505) that may come in substantially full contact with their corresponding bottom-pad 15502. If upper-pads 15504 fall in the space between bottom-pads 15502, then upper-pads 15505 would be in substantially full contact with a bottom pad 155002, and vice-versa.

The layout structure of connections illustrated in FIG. 155A and FIG. 155B may be made as follows in exemplary steps A to E.

Step A: Upper-pad side length 15506 may be designed and drawn as the smallest allowed by the design rules, with upper-pads 15504 and upper-pads 15505 being the smallest square allowed by the design rules.

Step B: Bottom-pad space 15524 may be made large enough so that upper-pads 15504 or upper-pads 15505 may not electrically short two adjacent bottom-pads 15502.

Step C: Bottom-pads 15502 may be squares with sides 15520, sides 15520 which may be equal in distance to double the distance of bottom-pad space 15524.

Step D: The bottom-pads 15502 layout structure, as illustrated in FIG. 155A, may be rows of bottom-pads 15502 as squares sized of sides 15520 and spaced bottom-pad space 15524, and forming columns of squares bottom-pads 15502 spaced by bottom-pad space 15524. The horizontal and vertical repetition may then be three times the bottom-pad space 15524.

Step E: The upper-pads structure, as illustrated in FIG. 155B, may be two sets of upper-pads 15504 and upper-pads 15505. Each set may be rows of squares sized upper-pad side length 15506 and may repeat every E-W length 15510, where E-W length 15510 may be 3 times bottom-pad space 15524, and forming columns of these squares repeating every N-S length 15512, where N-S length 15512 may be 3 times bottom-pad space 15524. The two sets may be offset in both in the West-East direction and the North-South direction so that each upper-pad 15505 may be placed in the middle of the space between four adjacent upper-pads 15504.

Such a pad structure as illustrated in FIGS. 155A and 155B may provide a successful electrical connection of wires between two bonded wafers so there may always be at least one successful connection between the bottom wafer pad and one of its corresponding upper wafer pads, and no undesired shorts can occur. The structure may be designed such that for every bottom-pad 15502 there may be a potential pair of upper-pads 15504 and upper-pads 15505 of which at least one is forming good contact. The selection of which upper-pad (upper-pad 15504 or upper-pad 15505) to utilize for electrical connections between the two bonded wafers could be based on a chip test structure which would test which pad set has a lower resistance, or by optical methods to measure the misalignment and then select upper-pads 15504 or upper-pads 15505 according to the misalignment the appropriate pad set.

An electronic circuit could be constructed to route a signal from the bottom-pads 15502 through the electrically connected upper-pads 15504 or upper-pads 15505 to the appropriate circuit at the upper layer, such as the transferred layer of the donor wafer multiple layers of monolithically stacked transistors and circuitry sub-stack 15402. Such switch matrix would need to be designed according to the maximum misalignment error and the number of signals within that range. The programming of the switch matrix to properly connect stack layer signals could be done based on, for example, an electrically read on-chip test structure or on an optical misalignment measurement. Such electronic switch matrices are known in the art and are not detailed herein. Additionally, the misalignment compensation and reroute to properly connect stack layer signals could be done in the transferred layer (such as the transferred layer of the donor wafer multiple layers of monolithically stacked transistors and circuitry sub-stack 15402) metal connection layers and misalignment compensation structures as has been described before with respect to FIG. 80 and FIG. 94.

Another variation of such structures could be made to meet the same requirements as the bottom-pads/upper-pads structures described in FIGS. 155A and 155B. FIG. 155C illustrates a repeating structure of bottom-pad strips 15532 and FIG. 155D illustrates the matching structures of upper-pad strips 15534 and the offset upper-pad strips 15535. The layout and design of the structures in FIGS. 155C and 155D may be similar to that described for FIGS. 155A and 155B.

Persons of ordinary skill in the art will appreciate that the illustrations in FIGS. 155A through 155D are exemplary only and are not drawn to scale. Such skilled persons will further appreciate that many variations may be possible such as, for example, the acceptor wafer and donor wafer in the discussion may be sub-stacks of multiple layers of circuitry and interconnect or may be singular layers of processed or preprocessed circuitry or doped layers. Moreover, misalignment between the two layers of circuitry which are desired to be connected may be a result from more than the wafer to wafer bonding process; for example, from lithographic capability, or thermal or stress induced continental drift. Further, bottom-pad space 15524 may not be symmetric in North-South and East-West directions. Furthermore, the orientation of the bottom and upper pads and spaces may not be in an orthogonal or Cartesian manner as illustrated, they could be angular or of polar co-ordinate type. Moreover, sides 15520 of bottom-pad 15502 may instead be not equal to each other and bottom-pad 15502 may be shaped, for example, as a rectangle. Moreover, upper pad side length 15506 of upper-pad 15504 or upper-pad 15505 may not be equal to each other and upper-pad 15504 or upper-pad 15505 may be shaped, for example, as a rectangle. Furthermore, bottom-pad 15502 and upper-pad 15504 or upper-pad 15505 may be shaped in circular or oval shapes. Moreover, upper-pad 15504 may be sized or shaped differently than upper-pad 15505. Further, shorts may be designed in to allow for example, higher current carrying pad connections. Moreover, the misalignment compensation and reroute to properly connect stack layer signals may utilize programmable switches or programmable logic, and may be tied to the electrically read on-chip test structure. Furthermore, each set of upper-pads may be non-symmetrically offset with respect to each other so that each upper-pad 15505 may be placed in a non-equal distance to the four upper-pads 15504 that may be around said upper-pad 15505. Many other modifications within the scope of the illustrated embodiments of the invention will suggest themselves to such skilled persons after reading this specification. Thus the invention is to be limited only by the appended claims.

There may be many ways to build the multilayer 3D IC, as some embodiments of the invention may follow. Wafers could be processed sequentially one layer at a time to include one or more transistor layers and then connect the structure of one wafer on top of the other wafer. In such case the donor wafer, for example transferred layer of the donor wafer multiple layers of monolithically stacked transistors and circuitry sub-stack 15402, may be a fully processed multi-layer wafer and the placing on top of the acceptor wafer, for example acceptor wafer 15410, could include flipping it over or using a carrier method to avoid flipping. In each case the non-essential substrate could be cut or etched away using layer transfer techniques such as those described before.

Wafers could be processed in parallel, each one potentially utilizing a different wafer fab or process flow and then proceeding as in the paragraph directly above.

One wafer could contain non repeating structures while the other one would contain repeating structures such as memory or programmable logic. In such case there are strong benefits for high connectivity between the wafers, while misalignment can be less of an issue as the repeating structure might be tolerant of such misalignment.

The transferred wafer or layer, for example transferred layer of the donor wafer multiple layers of monolithically stacked transistors and circuitry sub-stack 15402, could include a repeating transistors structure but subsequent to the bonding the follow-on process would align to the structure correctly as described above to keep to a minimum the overhead resulting from the wafer bonding misalignment.

FIG. 149 describes an embodiment of the invention, wherein a memory array 14902 may be constructed on a piece of silicon and peripheral transistors 14904 may be stacked atop the memory array 14902. The peripheral transistors 14904 may be constructed well-aligned with the underlying memory array 14902 using any of the schemes described in this document. For example, the peripheral transistors may be junction-less transistors, recessed channel transistors or they could be formed with one of the repeating layout schemes described in this document. Through-silicon connections 14906 may connect the memory array 14902 to the peripheral transistors 14904. The memory array may be DRAM memory, SRAM memory, flash memory, some type of resistive memory or in general, could be any memory type that may be commercially available.

An additional use for the high density of TLVs 11160 in FIG. 111D, or any such TLVs in this document, may be to thermally conduct heat generated by the active circuitry from one layer to another connected by the TLVs, such as, for example, donor layers and device structures to acceptor wafer or substrate. TLVs 11160 may also be utilized to conduct heat to an on chip thermoelectric cooler, heat sink, or other heat removing device. A portion of TLVs on a 3D IC may be utilized primarily for electrical coupling, and a portion may be primarily utilized for thermal conduction. In many cases, the TLVs may provide utility for both electrical coupling and thermal conduction.

FIG. 160 illustrates a 3D integrated circuit. Two monocrystalline silicon layers, 16004 and 16016 are shown. Silicon layer 16016 could be thinned down from its original thickness, and its thickness could be in the range of approximately 1 um to approximately 50 um. Silicon layer 16004 may include transistors which could have gate electrode region 16014, gate dielectric region 16012, and shallow trench isolation (STI) regions 16010. Silicon layer 16016 may include transistors which could have gate electrode region 16034, gate dielectric region 16032, and shallow trench isolation (STI) regions 16030. A through-silicon via (TSV) 16018 could be present and may have a surrounding dielectric region 16020. Wiring layers for silicon layer 16004 are indicated as 16008 and wiring dielectric is indicated as 16006. Wiring layers for silicon layer 16016 are indicated as 16038 and wiring dielectric is indicated as 16036. The heat removal apparatus, which could include a heat spreader and a heat sink, is indicated as 16002. The heat removal problem for the 3D integrated circuit shown in FIG. 160 may be immediately apparent. The silicon layer 16016 is far away from the heat removal apparatus 16002, and it may be difficult to transfer heat between silicon layer 16016 and heat removal apparatus 16002. Furthermore, wiring dielectric regions 16006 do not conduct heat well, and this increases the thermal resistance between silicon layer 16016 and heat removal apparatus 16002.

FIG. 161 illustrates a 3D integrated circuit that could be constructed, for example, using techniques described herein and in US Patent Application 2011/0121366 and U.S. patent application Ser. No. 13/099,010. Two mono-crystalline silicon layers, 16104 and 16116 are shown. Silicon layer 16116 could be thinned down from its original thickness, and its thickness could be in the range of approximately 3 nm to approximately 1 um. Silicon layer 16104 may include transistors which could have gate electrode region 16114, gate dielectric region 16112, and shallow trench isolation (STI) regions 16110. Silicon layer 16116 may include transistors which could have gate electrode region 16134, gate dielectric region 16132, and shallow trench isolation (STI) regions 16122. It can be observed that the STI regions 16122 can go right through to the bottom of silicon layer 16116 and provide good electrical isolation. This, however, can cause challenges for heat removal from the STI surrounded transistors since STI regions 16122 may typically be insulators that do not conduct heat well. Therefore, the heat spreading capabilities of silicon layer 16116 with STI regions 16122 may be low. A through-layer via (TLV) 16118 could be present and may include its dielectric region 16120. Wiring layers for silicon layer 16104 are indicated as 16108 and wiring dielectric is indicated as 16106. Wiring layers for silicon layer 16116 are indicated as 16138 and wiring dielectric is indicated as 16136. The heat removal apparatus, which could include a heat spreader and a heat sink, is indicated as 16102. The heat removal problem for the 3D integrated circuit shown in FIG. 161 may be immediately apparent. The silicon layer 16116 is far away from the heat removal apparatus 16102, and it may be difficult to transfer heat between silicon layer 16116 and heat removal apparatus 16102. Furthermore, wiring dielectric regions 16106 do not conduct heat well, and this increases the thermal resistance between silicon layer 16116 and heat removal apparatus 16102. The heat removal challenge may be further exacerbated by the poor heat spreading properties of silicon layer 16116 with STI regions 16122.

FIG. 162 and FIG. 163 illustrate how the power or ground distribution network of a 3D integrated circuit could assist heat removal. FIG. 162 illustrates an exemplary power distribution network or structure of the 3D integrated circuit. The 3D integrated circuit, could, for example, be constructed with two silicon layers 16204 and 16216. The heat removal apparatus 16202 could include a heat spreader and a heat sink. The power distribution network or structure could consist of a global power grid 16210 that takes the supply voltage (denoted as VDD) from power pads and transfers it to local power grids 16208 and 16206, which then transfer the supply voltage to logic cells or gates such as 16214 and 16215. Vias 16218 and 16212, such as the previously described TSV or TLV, could be used to transfer the supply voltage from the global power grid 16210 to local power grids 16208 and 16206. The 3D integrated circuit could have similar distribution networks, such as for ground and other supply voltages, as well. Typically, many contacts may be made between the supply and ground distribution networks and silicon layer 16204. As a result there may exist a low thermal resistance between the power/ground distribution network and the heat removal apparatus 16202. Since power/ground distribution networks are typically constructed of conductive metals and could have low effective electrical resistance, they could have a low thermal resistance as well. Each logic cell or gate on the 3D integrated circuit (such as, for example 16214) is typically connected to VDD and ground, and therefore could have contacts to the power and ground distribution network. These contacts could help transfer heat efficiently (i.e. with low thermal resistance) from each logic cell or gate on the 3D integrated circuit (such as, for example 16214) to the heat removal apparatus 16202 through the power/ground distribution network and the silicon layer 16204.

FIG. 163 illustrates an exemplary NAND gate 16320 or logic cell and shows how all portions of this logic cell or gate could be located with low thermal resistance to the VDD or ground (GND) contacts. The NAND gate 16320 could consist of two pMOS transistors 16302 and two nMOS transistors 16304. The layout of the NAND gate 16320 is indicated in 16322. Various regions of the layout include metal regions 16306, poly regions 16308, n type silicon regions 16310, p type silicon regions 16312, contact regions 16314, and oxide regions 16324. pMOS transistors in the layout are indicated as 16316 and nMOS transistors in the layout are indicated as 16318. It can be observed that substantially all parts of the exemplary NAND gate 16320 could have low thermal resistance to VDD or GND contacts since they are physically very close to them. Thus, substantially all transistors in the NAND gate 16320 can be maintained at desirable temperatures if the VDD or ground contacts are maintained at desirable temperatures.

While the previous paragraph describes how an existing power distribution network or structure can transfer heat efficiently from logic cells or gates in 3D-ICs to their heat sink, many techniques to enhance this heat transfer capability will be described herein. These embodiments of the invention can provide several benefits, including lower thermal resistance and the ability to cool higher power 3D-ICs. As well, thermal contacts may provide mechanical stability and structural strength to low-k Back End Of Line (BEOL) structures, which may need to accommodate shear forces, such as from CMP and/or cleaving processes. These techniques may be useful for different implementations of 3D-ICs, including, for example, monolithic 3D-ICs and TSV-based 3D-ICs.

FIG. 164 describes an embodiment of the invention, where the concept of thermal contacts is described. Two mono-crystalline silicon layers, 16404 and 16416 may have transistors. Silicon layer 16416 could be thinned down from its original thickness, and its thickness could be in the range of approximately 3 nm to approximately 1 um. Mono-crystalline silicon layer 16404 could have STI regions 16410, gate dielectric regions 16412, gate electrode regions 16414 and several other regions required for transistors (not shown). Mono-crystalline silicon layer 16416 could have STI regions 16430, gate dielectric regions 16432, gate electrode regions 16434 and several other regions required for transistors (not shown). Heat removal apparatus 16402 may include, for example, heat spreaders and heat sinks. In the example shown in FIG. 164, mono-crystalline silicon layer 16404 is closer to the heat removal apparatus 16402 than other mono-crystalline silicon layers such as mono-crystalline silicon layer 16416. Dielectric regions 16406 and 16446 could be used to electrically insulate wiring regions such as 16422 and 16442 respectively. Through-layer vias for power delivery 16418 and their associated dielectric regions 16420 are shown. A thermal contact 16424 can be used that connects the local power distribution network or structure, which may include wiring layers 16442 used for transistors in the silicon layer 16404, to the silicon layer 16404. Thermal junction region 16426 can be either a doped or undoped region of silicon, and further details of thermal junction region 16426 will be given in FIG. 165. The thermal contact such as 16424 can be placed close to the corresponding through-layer via for power delivery 16418; this helps transfer heat efficiently from the through-layer via for power delivery 16418 to thermal junction region 16426 and silicon layer 16404 and ultimately to the heat removal apparatus 16402. For example, the thermal contact 16424 could be located within approximately 2 um distance of the through-layer via for power delivery 16418 in the X-Y plane (the through-layer via direction is considered the Z plane in FIG. 164). While the thermal contact such as 16424 is described above as being between the power distribution network or structure and the silicon layer closest to the heat removal apparatus, the thermal contact could also be placed between the ground distribution network and the silicon layer closest to the heat sink. Furthermore, more than one thermal contact 16424 can be placed close to the through-layer via for power delivery 16418. These thermal contacts can improve heat transfer from transistors located in higher layers of silicon such as 16416 to the heat removal apparatus 16402. While mono-crystalline silicon has been mentioned as the transistor material in this paragraph, other options are possible including, for example, poly-crystalline silicon, mono-crystalline germanium, mono-crystalline III-V semiconductors, graphene, and various other semiconductor materials with which devices, such as transistors, may be constructed within. Moreover, thermal contacts and vias need not be stacked in a vertical line through multiple stacks, layers, strata of circuits. Thermal contacts and vias may include materials such as sp2 carbon as conducting and sp3 carbon as non-conducting of electrical current.

FIG. 165 describes an embodiment of the invention, where various implementations of thermal junctions and associated thermal contacts are illustrated. P-wells in CMOS integrated circuits are typically biased to ground and N-wells are typically biased to the supply voltage VDD. This makes the design of thermal contacts and thermal junctions non-obvious. A thermal contact 16504 between the power (VDD) distribution network and a P-well 16502 can be implemented as shown in N+ in P-well thermal junction and contact example 16508, where an n+ doped region thermal junction 16506 may be formed in the P-well region at the base of the thermal contact 16504. The n+ doped region thermal junction 16506 may ensure that a reverse biased p-n junction can be formed in N+ in P-well thermal junction and contact example 16508 and makes the thermal contact viable (i.e. not highly conductive) from an electrical perspective. The thermal contact 16504 could be formed of a conductive material such as copper, aluminum or some other material. A thermal contact 16514 between the ground (GND) distribution network and a P-well 16512 may be implemented as shown in P+ in P-well thermal junction and contact example 16518, where a p+ doped region thermal junction 16516 may be formed in the P-well region at the base of the thermal contact 16514. The p+ doped region thermal junction 16516 makes the thermal contact viable (i.e. not highly conductive) from an electrical perspective. The p+ doped region thermal junction 16516 and the P-well 16512 would typically be biased at ground potential. A thermal contact 16524 between the power (VDD) distribution network and an N-well 16522 can be implemented as shown in N+ in N-well thermal junction and contact example 16528, where an n+ doped region thermal junction 16526 may be formed in the N-well region at the base of the thermal contact 16524. The n+ doped region thermal junction 16526 makes the thermal contact viable (i.e. not highly conductive) from an electrical perspective. Both the n+ doped region thermal junction 16526 and the N-well 16522 would typically be biased at VDD potential. A thermal contact 16534 between the ground (GND) distribution network and an N-well 16532 can be implemented as shown in P+ in N-well thermal junction and contact example 16538, where a p+ doped region thermal junction 16536 may be formed in the N-well region at the base of the thermal contact 16534. The p+ doped region thermal junction 16536 makes the thermal contact viable (i.e. not highly conductive) from an electrical perspective due to the reverse biased p-n junction formed in P+ in N-well thermal junction and contact example 16538. Note that the thermal contacts, a heat removal connection, may be designed to conduct negligible electricity, and the current flowing through them may be several orders of magnitude lower than the current flowing through a transistor when it is switching. Therefore, the thermal contacts, a heat removal connection, can be considered to be designed to conduct heat and conduct negligible (or no) electricity. Thermal contacts may include materials such as carbon nanotubes. Thermal contacts and vias may include materials such as sp2 carbon as conducting and sp3 carbon as non-conducting of electrical current. Moreover, thermal contacts and vias need not be stacked in a vertical line through multiple stacks, layers, strata of circuits.

FIG. 166 describes an embodiment of the invention, where an additional type of thermal contact structure is illustrated. The embodiment shown in FIG. 166 could also function as a decoupling capacitor to mitigate power supply noise. It could consist of a thermal contact 16604, an electrode 16610, a dielectric 16606 and P-well 16602. The dielectric 16606 may be electrically insulating, and could be optimized to have high thermal conductivity. Dielectric 16606 could be formed of materials, such as, for example, hafnium oxide, silicon dioxide, other high k dielectrics, carbon, carbon based material, or various other dielectric materials with electrical conductivity below 1 nano-amp per square micron.

A thermal connection may be defined as the combination of a thermal contact and a thermal junction. The thermal connections illustrated in FIG. 165, FIG. 166 and other figures in this patent application may be designed into a chip to remove heat (conduct heat), and may be designed to not conduct electricity. Essentially, a semiconductor device comprising power distribution wires is described wherein some of said wires have a thermal connection designed to conduct heat to the semiconductor layer but the wires do not substantially conduct electricity through the thermal connection to the semiconductor layer.

Thermal contacts similar to those illustrated in FIG. 165 and FIG. 166 can be used in the white spaces of a design, i.e. locations of a design where logic gates or other useful functionality are not present. These thermal contacts connect white-space silicon regions to power and/or ground distribution networks. Thermal resistance to the heat removal apparatus can be reduced with this approach. Connections between silicon regions and power/ground distribution networks can be used for various device layers in the 3D stack, and need not be restricted to the device layer closest to the heat removal apparatus. A Schottky contact or diode may also be utilized for a thermal contact and thermal junction. Thermal contacts and vias may include materials such as sp2 carbon as conducting and sp3 carbon as non-conducting of electrical current. Moreover, thermal contacts and vias need not be stacked in a vertical line through multiple stacks, layers, strata of circuits.

FIG. 167 illustrates an embodiment of the invention, which can provide enhanced heat removal from 3D-ICs by integrating heat spreader layers or regions in stacked device layers. Two mono-crystalline silicon layers, 16704 and 16716 are shown. Silicon layer 16716 could be thinned from its original thickness, and its thickness could be in the range of approximately 3 nm to approximately 1 um. Silicon layer 16704 may include gate electrode region 16714, gate dielectric region 16712, and shallow trench isolation (STI) regions 16710. Silicon layer 16716 may include gate electrode region 16734, gate dielectric region 16732, and shallow trench isolation (STI) regions 16722. A through-layer via (TLV) 16718 could be present and may have a dielectric region 16720. Wiring layers for silicon layer 16704 are indicated as 16708 and wiring dielectric is indicated as 16706. Wiring layers for silicon layer 16716 are indicated as 16738 and wiring dielectric is indicated as 16736. The heat removal apparatus, which could include a heat spreader and a heat sink, is indicated as 16702. It can be observed that the STI regions 16722 can go right through to the bottom of silicon layer 16716 and provide good electrical isolation. This, however, can cause challenges for heat removal from the STI surrounded transistors since STI regions 16722 are typically electrical insulators that do not conduct heat well. The buried oxide layer 16724 typically does not conduct heat well either. To tackle heat removal issues with the structure shown in FIG. 167, a heat spreader 16726 can be integrated into the 3D stack by methods, such as, deposition of a heat spreader layer and subsequent etching into regions. The heat spreader 16726 material may include, for example, copper, aluminum, graphene, diamond, carbon nano-tubes, carbon (sp3 or other) or any other material with a high thermal conductivity (defined as greater than 100 W/m-K). While the heat spreader concept for 3D-ICs is described with an architecture similar to FIG. 161, similar heat spreader concepts could be used for architectures similar to FIG. 160, and also for other 3D IC architectures.

FIG. 168 illustrates an embodiment of the invention, which can provide enhanced heat removal from 3D-ICs by using thermally conductive shallow trench isolation (STI) regions in stacked device layers. Two mono-crystalline silicon layers, 16804 and 16816 are shown. Silicon layer 16816 could be thin, and its thickness could be in the range of approximately 3 nm to approximately 1 um. Silicon layer 16804 may include transistors which could have gate electrode region 16814, gate dielectric region 16812, and shallow trench isolation (STI) regions 16810. Silicon layer 16816 may include transistors which could have gate electrode region 16834, gate dielectric region 16832, and shallow trench isolation (STI) regions 16822. A through-layer via (TLV) 16818 could be present and may have a dielectric region 16820. Dielectric region 16820 may include a shallow trench isolation region. Wiring layers for silicon layer 16804 are indicated as 16808 and wiring dielectric is indicated as 16806. Wiring layers for silicon layer 16816 are indicated as 16838 and wiring dielectric is indicated as 16836. The heat removal apparatus, which could include a heat spreader and a heat sink, is indicated as 16802. It can be observed that the STI regions 16822 can go right through to the bottom of silicon layer 16816 and provide good electrical isolation. This, however, can cause challenges for heat removal from the STI surrounded transistors since STI regions 16822 are typically filled with insulators such as silicon dioxide that do not conduct heat well. To tackle possible heat removal issues with the structure shown in FIG. 168, the STI regions 16822 in stacked silicon layers such as 16816 could be formed substantially of thermally conductive dielectrics including, for example, diamond, carbon (sp3 or other forms), or other dielectrics that have a thermal conductivity higher than silicon dioxide. Essentially, these materials could have thermal conductivity higher than 0.6 W/m-K. This can provide enhanced heat spreading in stacked device layers. Thermally conductive STI dielectric regions could be used in the vicinity of the transistors in stacked 3D device layers and may also be utilized as the dielectric that surrounds TLV 16818, such as dielectric region 16820.

FIG. 169 illustrates an embodiment of the invention, which can provide enhanced heat removal from 3D-ICs using thermally conductive pre-metal dielectric regions in stacked device layers. Two mono-crystalline silicon layers, 16904 and 16916 are shown. Silicon layer 16916 could be thin, and its thickness could be in the range of approximately 3 nm to approximately 1 um. Silicon layer 16904 may include transistors which could have gate electrode region 16914, gate dielectric region 16912, and shallow trench isolation (STI) regions 16910. Silicon layer 16916 may include transistors which could have gate electrode region 16934, gate dielectric region 16932, and shallow trench isolation (STI) regions 16922. A through-layer via (TLV) 16918 could be present and may have a dielectric region 16920, which may include an STI region. Wiring layers for silicon layer 16904 are indicated as 16908 and wiring dielectric is indicated as 16906. Wiring layers for silicon layer 16916 are indicated as 16938 and wiring dielectric is indicated as 16936. The heat removal apparatus, which could include a heat spreader and a heat sink, is indicated as 16902. It can be observed that the STI regions 16922 can go right through to the bottom of silicon layer 16916 and provide good electrical isolation. This, however, can cause challenges for heat removal from the STI surrounded transistors since STI regions 16922 are typically filled with insulators such as silicon dioxide that do not conduct heat well. To tackle this issue, the inter-layer dielectrics (ILD) 16924 for contact region 16926 could be constructed substantially with a thermally conductive material, such as, for example, insulating carbon, diamond, diamond like carbon (DLC), carbon nano-tubes, and various other materials that provide better thermal conductivity than silicon dioxide. Essentially, these materials could have thermal conductivity higher than 0.6 W/m-K. Essentially, thermally conductive pre-metal dielectric regions could be used among some of the transistors in stacked 3D device layers.

FIG. 170 describes an embodiment of the invention, which can provide enhanced heat removal from 3D-ICs using thermally conductive etch stop layers or regions for the first metal level of stacked device layers. Two mono-crystalline silicon layers, 17004 and 17016 are shown. Silicon layer 17016 could be thin, and its thickness could be in the range of approximately 3 nm to approximately 1 um. Silicon layer 17004 may include transistors which could have gate electrode region 17014, gate dielectric region 17012, and shallow trench isolation (STI) regions 17010. Silicon layer 17016 may include transistors which could have gate electrode region 17034, gate dielectric region 17032, and shallow trench isolation (STI) regions 17022. A through-layer via (TLV) 17018 could be present and may include dielectric region 17020. Wiring layers for silicon layer 17004 are indicated as 17008 and wiring dielectric is indicated as 17006. Wiring layers for silicon layer 17016 are indicated as first metal layer 17028 and other metal layers 17038 and wiring dielectric is indicated as 17036. The heat removal apparatus, which could include a heat spreader and a heat sink, is indicated as 17002. It can be observed that the STI regions 17022 can go right through to the bottom of silicon layer 17016 and provide good electrical isolation. This, however, can cause challenges for heat removal from the STI surrounded transistors since STI regions 17022 are typically filled with insulators such as silicon dioxide that do not conduct heat well. To tackle this issue, etch stop layer 17024 for the first metal layer 17028 of stacked device layers can be substantially constructed out of a thermally conductive but electrically isolative material. Examples of such thermally conductive materials could include insulating carbon, diamond, diamond like carbon (DLC), carbon nano-tubes, and various other materials that provide better thermal conductivity than silicon dioxide and silicon nitride. Essentially, these materials could have thermal conductivity higher than 0.6 W/m-K. Essentially, thermally conductive etch-stop layer dielectric regions could be used for the first metal layer above transistors in stacked 3D device layers.

Figure 171A:
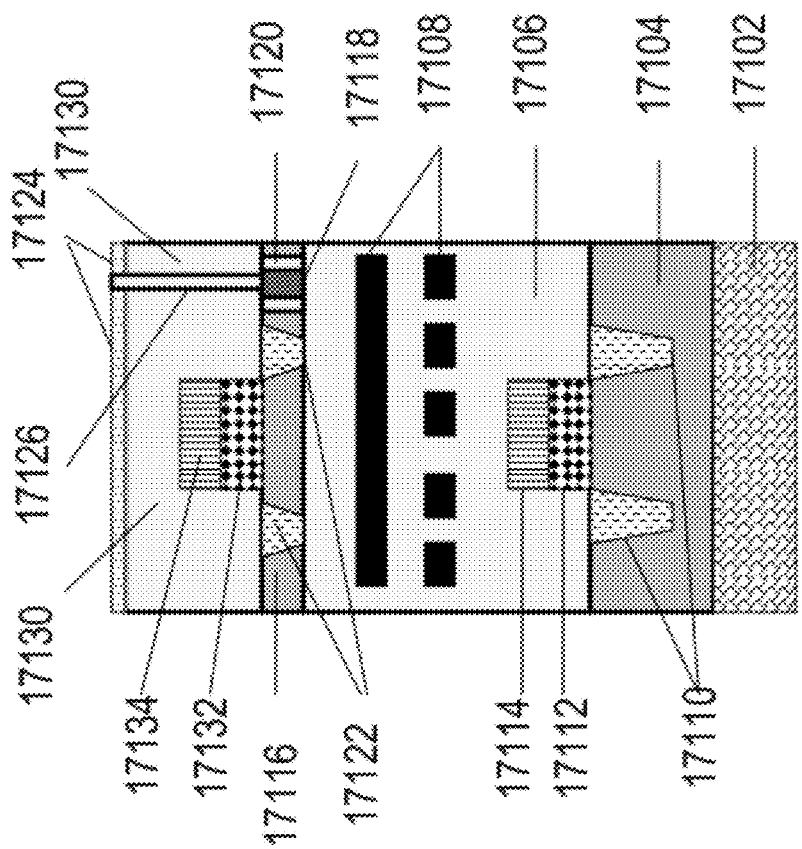
Figure 171B:
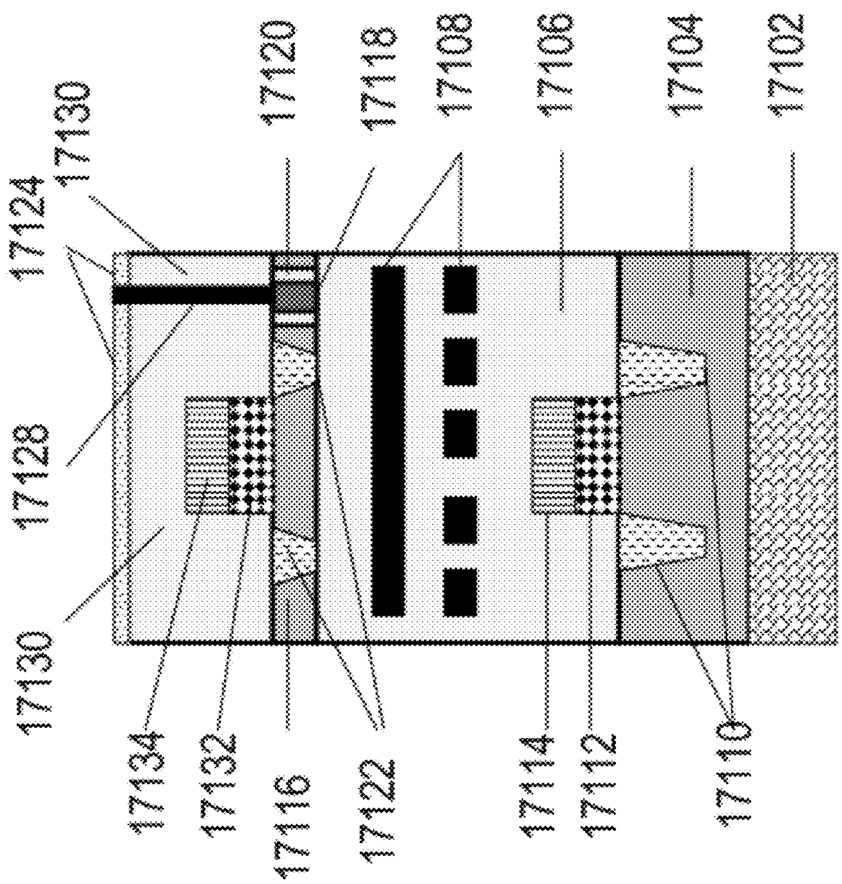

FIG. 171A-B describes an embodiment of the invention, which can provide enhanced heat removal from 3D-ICs using thermally conductive layers or regions as part of pre-metal dielectrics for stacked device layers. Two mono-crystalline silicon layers, 17104 and 17116, are shown and may have transistors. Silicon layer 17116 could be thin, and its thickness could be in the range of approximately 3 nm to approximately 1 um. Silicon layer 17104 could have gate electrode region 17114, gate dielectric region 17112 and shallow trench isolation (STI) regions 17110. Silicon layer 17116 could have gate electrode region 17134, gate dielectric region 17132 and shallow trench isolation (STI) regions 17122. A through-layer via (TLV) 17118 could be present and may include its dielectric region 17120. Wiring layers for silicon layer 17104 are indicated as 17108 and wiring dielectric is indicated as 17106. The heat removal apparatus, which could include a heat spreader and a heat sink, is indicated as 17102. It can be observed that the STI regions 17122 can go right through to the bottom of silicon layer 17116 and provide good electrical isolation. This, however, can cause challenges for heat removal from the STI surrounded transistors since STI regions 17122 are typically filled with insulators such as silicon dioxide that do not conduct heat well. To tackle this issue, a technique is described in FIG. 171A-B. FIG. 171A illustrates the formation of openings for making contacts to transistors. A hard mask 17124 layer or region is typically used during the lithography step for contact formation and this hard mask 17124 may be utilized to define regions 17126 of the pre-metal dielectric 17130 that are etched away. FIG. 171B shows the contact 17128 formed after metal is filled into the contact opening 17126 shown in FIG. 171A, and after a chemical mechanical polish (CMP) process. The hard mask 17124 used for the process shown in FIG. 171A-B can be chosen to be a thermally conductive material such as, for example, carbon or other material with higher thermal conductivity than silicon nitride, and can be left behind after the process step shown in FIG. 171B. Essentially, these materials for hard mask 17124 could have a thermal conductivity higher than 0.6 W/m-K. Further steps for forming the 3D-IC (such as forming additional metal layers) can then be performed.

FIG. 172 shows the layout of a 4 input NAND gate, where the output OUT is a function of inputs A, B, C and D. Various sections of the 4 input NAND gate could include metal 1 regions 17206, gate regions 17208, N-type silicon regions 17210, P-type silicon regions 17212, contact regions 17214, and oxide isolation regions 17216. If the NAND gate is used in 3D IC stacked device layers, some regions of the NAND gate (such as 17218) are far away from VDD and GND contacts, these regions could have high thermal resistance to VDD and GND contacts, and could heat up to undesired temperatures. This is because the regions of the NAND gate that are far away from VDD and GND contacts cannot effectively use the low-thermal resistance power delivery network to transfer heat to the heat removal apparatus.

FIG. 173 illustrates an embodiment of the invention wherein the layout of the 3D stackable 4 input NAND gate can be modified so that all parts of the gate are at desirable, such as sub-100° C., temperatures during chip operation. Inputs to the gate are denoted as A, B, C and D, and the output is denoted as OUT. Various sections of the 4 input NAND gate could include the metal 1 regions 17306, gate regions 17308, N-type silicon regions 17310, P-type silicon regions 17312, contact regions 17314, and oxide isolation regions 17316. An additional thermal contact 17320 (whose implementation can be similar to those described in FIG. 165 and FIG. 166) can be added to the layout shown in FIG. 172 to keep the temperature of region 17318 under desirable limits (by reducing the thermal resistance from region 17318 to the GND distribution network). Several other techniques can also be used to make the layout shown in FIG. 173 more desirable from a thermal perspective.

FIG. 174 shows the layout of a transmission gate with inputs A and A'. Various sections of the transmission gate could include metal 1 regions 17406, gate regions 17408, N-type silicon regions 17410, P-type silicon regions 17412, contact regions 17414, and oxide isolation regions 17416. If the transmission gate is used in 3D IC stacked device layers, many regions of the transmission gate could heat up to undesired temperatures since there are no VDD and GND contacts. So, there could be high thermal resistance to VDD and GND distribution networks. Thus, the transmission gate cannot effectively use the low-thermal resistance power delivery network to transfer heat to the heat removal apparatus.

FIG. 175 illustrates an embodiment of the invention wherein the layout of the 3D stackable transmission gate can be modified so that substantially all parts of the gate are at desirable, such as sub-100° C., temperatures during chip operation. Inputs to the gate are denoted as A and A'. Various sections of the transmission gate could include metal 1 regions 17506, gate regions 17508, N-type silicon regions 17510, P-type silicon regions 17512, contact regions 17514, and oxide isolation regions 17516. Additional thermal contacts, such as, for example 17520 and 17522 (whose implementation can be similar to those described in FIG. 165 and FIG. 166) can be added to the layout shown in FIG. 174 to keep the temperature of the transmission gate under desirable limits (by reducing the thermal resistance to the VDD and GND distribution networks). Several other techniques can also be used to make the layout shown in FIG. 175 more desirable from a thermal perspective.

The thermal path techniques illustrated with FIG. 173 and FIG. 175 are not restricted to logic cells such as transmission gates and NAND gates, and can be applied to a number of cells such as, for example, SRAMs, CAMs, multiplexers and many others. Furthermore, the techniques illustrated with FIG. 173 and FIG. 175 can be applied and adapted to various techniques of constructing 3D integrated circuits and chips, including those described in pending US Patent Application 2011/0121366 and U.S. patent application Ser. No. 13/099,010. Furthermore, techniques illustrated with FIG. 173 and FIG. 175 (and other similar techniques) need not be applied to all such gates on the chip, but could be applied to a portion of gates of that type, such as, for example, gates with higher activity factor, lower threshold voltage, or higher drive current. Moreover, thermal contacts and vias need not be stacked in a vertical line through multiple stacks, layers, strata of circuits.

When a chip is typically designed, a cell library consisting of various logic cells such as NAND gates, NOR gates and other gates may be created, and the chip design flow proceeds using this cell library. It will be clear to one skilled in the art that a cell library may be created wherein each cell's layout can be optimized from a thermal perspective and based on heat removal criteria such as maximum allowable transistor channel temperature (i.e. where each cell's layout can be optimized such that substantially all portions of the cell may have low thermal resistance to the VDD and GND contacts, and such, to the power bus and the ground bus.).

FIG. 193 illustrates a possible procedure for a chip designer to ensure a good thermal profile for his or her design.

After a first pass or a portion of the first pass of the desired chip layout process is complete, a thermal analysis may be conducted to determine temperature profiles for active or passive elements, such as gates, on the 3D chip. The thermal analysis may be started (19300). The temperature of any stacked gate may be calculated and compared to a desired specification value (19310). If the gate temperature is higher than the specification, modifications 19320 may be made to the layout or design, such as, for example, power grids for stacked layers may be made denser or wider, additional contacts to the gate may be added, more through-silicon (TLV and/or TSV) connections may be made for connecting the power grid in stacked layers to the layer closest to the heat sink, or any other method to reduce stacked layer temperature that may be described herein may be used alone or in combination. The output 19330 may give the designer the temperature of either the modified stacked gate ('Yes' tree) or an unmodified one ('No' tree), and may include the original un-modified gate temperature that was above the desired specification. The thermal analysis may end (19340) or may be iterated. Alternatively, the power grid may be designed (based on heat removal criteria) simultaneously with the logic gates and layout of the design.

Recessed channel transistors form a transistor family that can be stacked in 3D. FIG. 181 illustrates a Recessed Channel Transistor when constructed in a 3D stacked layer using procedures outlined in US Patent Application 20110121366 and U.S. patent application Ser. No. 13/099,010. In FIG. 181, 18102 could indicate a bottom layer of transistors and wires, 18104 could indicate an oxide layer, 18106 could indicate oxide regions, 18108 could indicate a gate dielectric, 18110 could indicate n+ silicon regions, 18112 could indicate a gate electrode and 18114 could indicate a region of p− silicon. Essentially, since the recessed channel transistor may be surrounded on all sides by thermally insulating oxide layers 18104 and 18106, heat removal may be a serious issue. Furthermore, to contact the p− silicon region 18114, a p+ region may be needed to obtain low contact resistance, which may be difficult to construct at temperatures lower than approximately 400° C.

Figure 176A:
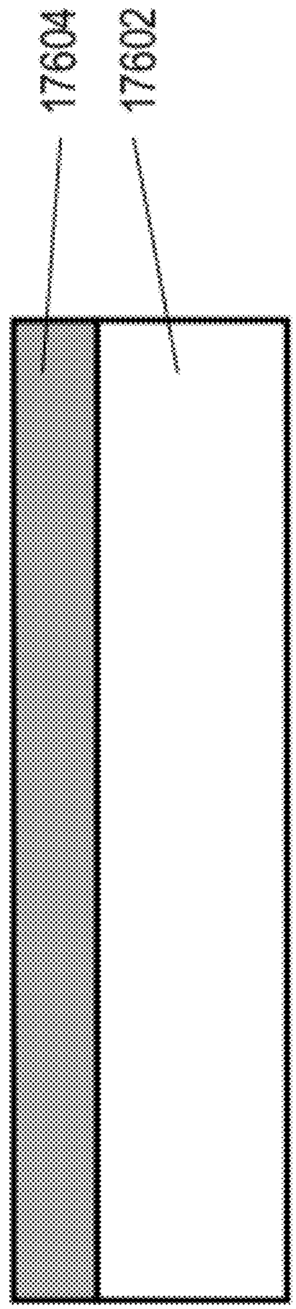
Figure 176B:
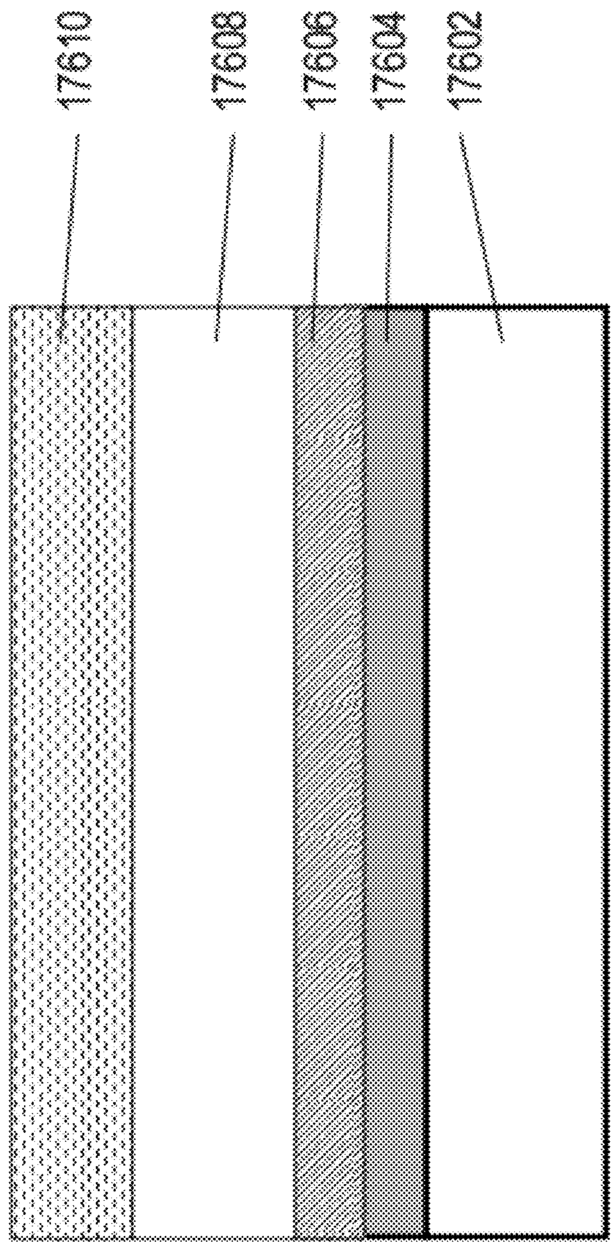
Figure 176C:
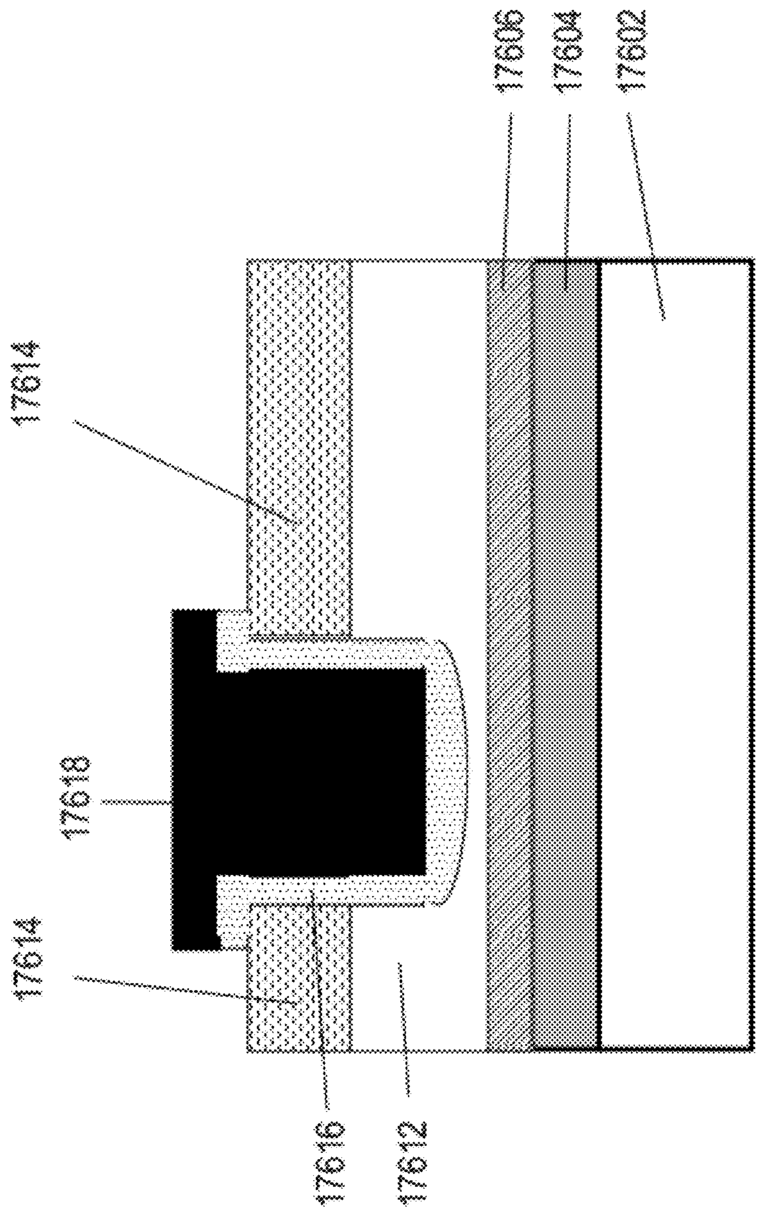
Figure 176D:
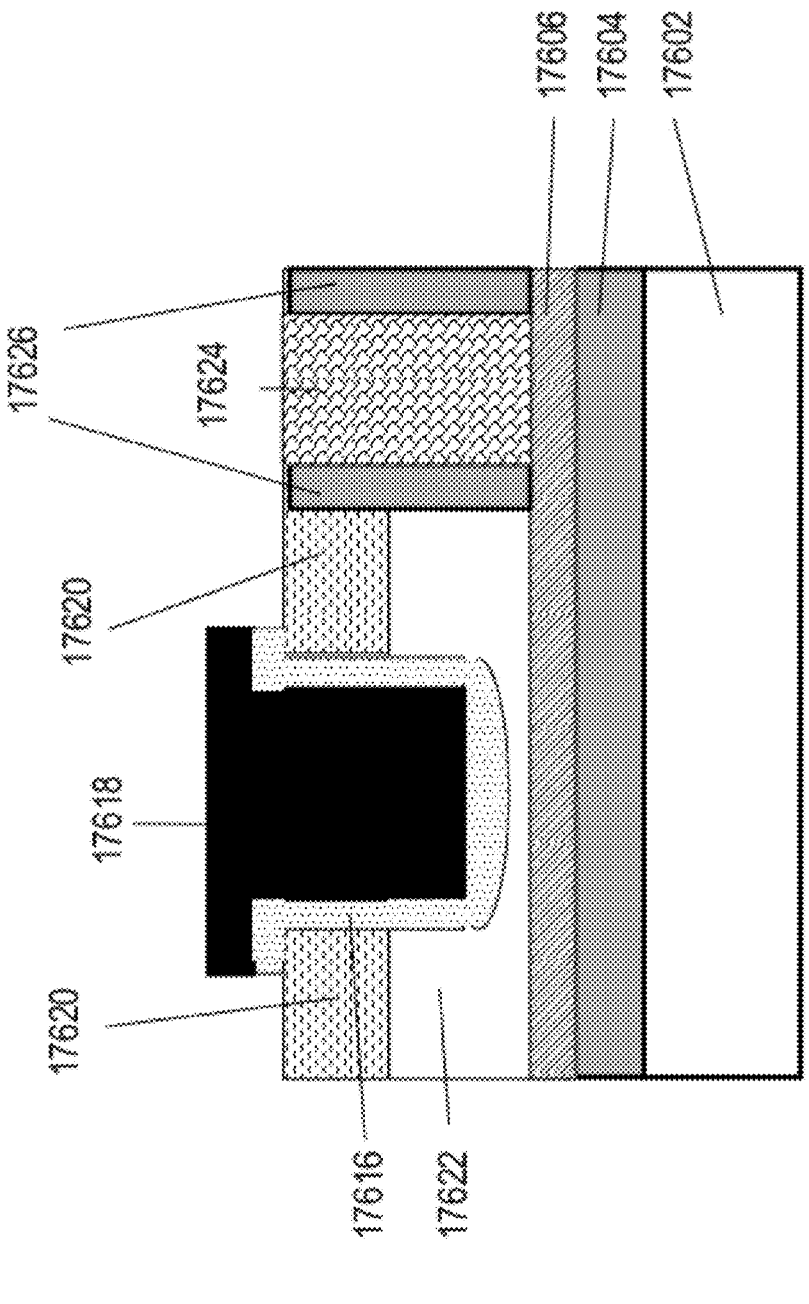

FIG. 176A-D illustrates an embodiment of the invention wherein thermal contacts can be constructed to a recessed channel transistor. Note that numbers used in FIG. 176A-D are inter-related. For example, if a certain number is used in FIG. 176A, it has the same meaning if present in FIG. 176B. The process flow may begin in FIG. 176A with a bottom layer of transistors and copper interconnects 17602 being constructed with a silicon dioxide layer 17604 atop it. Using layer transfer approaches similar to those described in US patent applications 20110121366 and Ser. No. 13/099,010, an activated layer of p+ silicon 17606, an activated layer of p− silicon 17608 and an activated layer of n+ silicon 17610 can be transferred atop the structure shown in FIG. 176A to form the structure shown in FIG. 176B. FIG. 176C shows the next step in the process flow. After forming isolation regions (not shown in FIG. 176C for simplicity), gate dielectric regions 17616 and gate electrode regions 17618 could be formed using procedures similar to those described in US patent applications 20110121366 and Ser. No. 13/099,010. 17612 could indicate a region of p− silicon and 17614 could indicate a region of n+ silicon. FIG. 176C thus shows a RCAT (recessed channel transistor) formed with a p+ silicon region atop copper interconnect regions where the copper interconnect regions may not be exposed to temperatures higher than approximately 400° C. FIG. 176D shows the next step of the process where thermal contacts could be made to the p+ silicon region 17606. In FIG. 176D, 17622 could indicate a region of p− silicon, 17620 could indicate a region of n+ silicon, 17624 could indicate a via constructed of a metal or metal silicide or a combination of the two and 17626 could indicate oxide regions. Via 17624 can connect p+ region 17606 to the ground (GND) distribution network. This is because the nMOSFET could have its body region connected to GND potential and operate correctly or as desired, and the heat produced in the device layer can be removed through the low-thermal resistance GND distribution network to the heat removal apparatus.

FIG. 177 illustrates an embodiment of the invention wherein thermal contacts may be utilized to remove heat from a pMOSFET device layer that may be stacked above a bottom layer of transistors and wires 17702. In FIG. 177, 17704 represents a buried oxide region, 17706 represents an n+ region of mono-crystalline silicon, 17714 represents an n-region of mono-crystalline silicon, 17710 represents a p+ region of mono-crystalline silicon, 17708 represents the gate dielectric and 17712 represents the gate electrode. The structure shown in FIG. 177 can be constructed using methods similar to those described in pending US Patent Application 20110121366, U.S. patent application Ser. No. 13/099,010 and FIG. 176A-D. The thermal contact 17718 could be constructed of any metal, metal silicide or a combination of these two types of materials. It can connect n+ region 17706 to the power (VDD) distribution network. This is because the pMOSFET could have its body region connected to the supply voltage (VDD) potential and operate correctly or as desired, and the heat produced in the device layer can be removed through the low-thermal resistance VDD distribution network to the heat removal apparatus. Regions 17716 represent isolation regions.

FIG. 178 illustrates an embodiment of the invention wherein thermal contacts may be utilized to remove heat from a CMOS device layer that could be stacked atop a bottom layer of transistors and wires 17802. In FIG. 178, 17804, 17824 and 17830 could represent regions of an insulator, such as silicon dioxide, 17806 and 17836 could represent regions of p+ silicon, 17808 and 17812 could represent regions of p− silicon, 17810 could represent regions of n+ silicon, 17814 could represent regions of n+ silicon, 17816 could represent regions of n− silicon, 17820 could represent regions of p+ silicon, 17818 could represent a gate dielectric region for a pMOS transistor, 17822 could represent a gate electrode region for a pMOS transistor, 17834 could represent a gate dielectric region for a nMOS transistor and 17828 could represent a gate electrode region for a nMOS transistor. An nMOS transistor could therefore be formed of regions 17834, 17828, 17810, 17808 and 17806. A pMOS transistor could therefore be formed of regions 17814, 17816, 17818, 17820 and 17822. This stacked CMOS device layer could be formed with procedures similar to those described in pending US Patent Application 20110121366, U.S. patent application Ser. No. 13/099,010, and FIG. 176 A-D. The thermal contact 17826 connected between n+ silicon region 17814 and the power (VDD) distribution network helps remove heat from the pMOS transistor. This is because the pMOSFET could have its body region connected to the supply voltage (VDD) potential and operate correctly or as desired, and the heat produced in the device layer can be removed through the low-thermal resistance VDD distribution network to the heat removal apparatus as previously described. The thermal contact 17832 connected between p+ silicon region 17806 and the ground (GND) distribution network may remove heat from the nMOS transistor. This is because the nMOSFET could have its body region connected to GND potential and operate correctly or as desired, and the heat produced in the device layer can be removed through the low-thermal resistance GND distribution network to the heat removal apparatus as previously described.

FIG. 179 illustrates an embodiment of the invention that describes a technique that could reduce heat-up of transistors fabricated on silicon-on-insulator (SOI) substrates. SOI substrates have a buried oxide (BOX) between the silicon transistor regions and the heat sink. This BOX region may typically have a high thermal resistance, and makes heat transfer from transistor regions to the heat sink difficult. In FIGS. 179, 17936, 17948 and 17956 could represent regions of an insulator, such as silicon dioxide, 17946 could represent regions of n+ silicon, 17940 could represent regions of p− silicon, 17952 could represent a gate dielectric region for a nMOS transistor, 17954 could represent a gate electrode region for a nMOS transistor, 17944 could represent copper wiring regions and 17904 could represent a highly doped silicon region. One of the key limitations of silicon-on-insulator (SOI) substrates may be the low heat transfer from transistor regions to the heat removal apparatus 17902 through the buried oxide layer 17936 that has low thermal conductivity. The ground contact 17962 of the nMOS transistor shown in FIG. 179 can be connected to the ground distribution network 17964 which in turn can be connected with a low thermal resistance connection 17950 to highly doped silicon region 17904 and thus to heat removal apparatus 17902. This may enable high thermal conductivity between the transistor shown in FIG. 179 and the heat removal apparatus 17902. While FIG. 179 described how heat could be transferred between an MOS transistor and the heat removal apparatus, similar approaches can also be used for pMOS transistors.

FIG. 180 illustrates an embodiment of the invention that describes a technique that could reduce heat-up of transistors fabricated on silicon-on-insulator (SOI) substrates. In FIGS. 180, 18036, 18048 and 18056 could represent regions of an insulator, such as silicon dioxide, 18046 could represent regions of n+ silicon, 18040 could represent regions of p-silicon, 18052 could represent a gate dielectric region for a nMOS transistor, 18054 could represent a gate electrode region for a nMOS transistor, 18044 could represent copper wiring regions and 18004 could represent a doped silicon region. One of the key limitations of silicon-on-insulator (SOI) substrates may be the low heat transfer from transistor regions to the heat removal apparatus 18002 through the buried oxide layer 18036 that has low thermal conductivity. The ground contact 18062 of the nMOS transistor shown in FIG. 180 can be connected to the ground distribution network 18064 which in turn can be connected with a low thermal resistance connection 18050 to doped silicon region 18004 through an implanted and activated region 18010. The implanted and activated region 18010 could be such that thermal contacts similar to those in FIG. 165 can be formed. This could enable low thermal conductivity between the transistor shown in FIG. 180 and the heat removal apparatus 18002. While FIG. 180 described how heat could be transferred between a nMOS transistor and the heat removal apparatus, similar approaches can also be used for pMOS transistors.

FIG. 182 illustrates an embodiment of the invention wherein heat spreading regions may be located on the sides of 3D-ICs. The 3D integrated circuit shown in FIG. 182 could be potentially constructed using techniques described in US Patent Application 20110121366 and U.S. patent application Ser. No. 13/099,010. Two mono-crystalline silicon layers, 18204 and 18216 are shown. Silicon layer 18216 could be thinned down from its original thickness, and its thickness could be in the range of approximately 3 nm to approximately 1 um. Silicon layer 18204 may include transistors which could have gate electrode region 18214, gate dielectric region 18212, and shallow trench isolation (STI) regions 18210. Silicon layer 18216 may include transistors which could have gate electrode region 18234, gate dielectric region 18232, and shallow trench isolation (STI) regions 18222. It can be observed that the STI regions 18222 can go right through to the bottom of silicon layer 18216 and provide good electrical isolation. A through-layer via (TLV) 18218 could be present and may include its dielectric region 18220. Wiring layers for silicon layer 18204 are indicated as 18208 and wiring dielectric is indicated as 18206. Wiring layers for silicon layer 18216 are indicated as 18238 and wiring dielectric is indicated as 18236. The heat removal apparatus, which could include a heat spreader and a heat sink, is indicated as 18202. Thermally conductive material 18240 could be present at the sides of the 3D-IC shown in FIG. 182. Thus, a thermally conductive heat spreading region could be located on the sidewalls of a 3D-IC. The thermally conductive material 18240 could be a dielectric such as, for example, insulating carbon, diamond, diamond like carbon (DLC), carbon nanotubes, and various other materials that provide better thermal conductivity than silicon dioxide. Essentially, these materials could have thermal conductivity higher than 0.6 W/m-K. One possible scheme that could be used for forming these regions could involve depositing and planarizing the thermally conductive material 18240 at locations on or close to the dicing regions, such as potential dicing scribe lines, of a 3D-IC after an etch process. The wafer could then be diced. Although this embodiment of the invention is described with FIG. 182, one could combine the concept of having thermally conductive material regions on the sidewalls of 3D-ICs with ideas shown in other figures of this patent application, such as, for example, the concept of having lateral heat spreaders shown in FIG. 167.

While concepts in this patent application have been described with respect to 3D-ICs with two stacked device layers, those of ordinary skill in the art will appreciate that it can be valid for 3D-ICs with more than two stacked device layers.

As layers may be stacked in a 3D IC, the power density per unit area typically increases. The thermal conductivity of mono-crystalline silicon is poor at 150 W/m-K and silicon dioxide, the most common electrical insulator in modern silicon integrated circuits, may have a very poor thermal conductivity at 1.4 W/m-K. If a heat sink is placed at the top of a 3D IC stack, then the bottom chip or layer (farthest from the heat sink) has the poorest thermal conductivity to that heat sink, since the heat from that bottom layer may travel through the silicon dioxide and silicon of the chip(s) or layer(s) above it.

As illustrated in FIG. 112, a heat spreader layer 11205 may be deposited on top of a thin silicon dioxide layer 11203 which may be deposited on the top surface of the interconnect metallization layers 11201 of substrate 11202. Heat spreader layer 11205 may include Plasma Enhanced Chemical Vapor Deposited Diamond Like Carbon (PECVD DLC), which may have a thermal conductivity of about 1000 W/m-K, or another thermally conductive material, such as Chemical Vapor Deposited (CVD) graphene (about 5000 W/m-K) or copper (about 400 W/m-K). Heat spreader layer 11205 may be of thickness about 20 nm up to about 1 micron. The illustrated thickness range may be about 50 nm to 100 nm and the illustrated electrical conductivity of the heat spreader layer 11205 may be an insulator to enable minimum design rule diameters of the future through layer vias. If the heat spreader is electrically conducting, the TLV openings may need to be somewhat enlarged to allow for the deposition of a non-conducting coating layer on the TLV walls before the conducting core of the TLV is deposited. Alternatively, if the heat spreader layer 11205 is electrically conducting, it may be masked and etched to provide the landing pads for the through layer vias and a large grid around them for heat transfer, which could also be used as the ground plane or as power and ground straps for the circuits above and below it. Oxide layer 11204 may be deposited (and may be planarized to fill any gaps in the heat transfer layer) to prepare for wafer to wafer oxide bonding. Acceptor substrate 11214 may include substrate 11202, interconnect metallization layers 11201, thin silicon dioxide layer 11203, heat spreader layer 11205, and oxide layer 11204. The donor substrate 11206 or wafer may be processed with wafer sized layers of doping as previously described, in preparation for forming transistors and circuitry (such as, for example, junction-less, RCAT, V-groove, and bipolar) after the layer transfer. A screen oxide layer 11207 may be grown or deposited prior to the implant or implants to protect the silicon from implant contamination, if implantation is utilized, and to provide an oxide surface for later wafer to wafer bonding. A layer transfer demarcation plane 11299 (shown as a dashed line) may be formed in donor substrate 11206 by hydrogen implantation, 'ion-cut' method, or other methods as previously described. Donor wafer 11212 may include donor substrate 11206, layer transfer demarcation plane 11299, screen oxide layer 11207, and any other layers (not shown) in preparation for forming transistors as discussed previously. Both the donor wafer 11212 and acceptor substrate 11214 may be prepared for wafer bonding as previously described and then bonded at the surfaces of oxide layer 11204 and oxide layer 11207, at a low temperature (less than about 400° C.). The portion of donor substrate 11206 that is above the layer transfer demarcation plane 11299 may be removed by cleaving and polishing, or other processes as previously described, such as ion-cut or other methods, thus forming the remaining transferred layers 11206'. Alternatively, donor wafer 11212 may be constructed and then layer transferred, using methods described previously such as, for example, ion-cut with replacement gates (not shown), to the acceptor substrate 11214. Now transistors or portions of transistors may be formed and aligned to the acceptor wafer alignment marks (not shown) and through layer vias formed as previously described. Thus, a 3D IC with an integrated heat spreader may be constructed.

Figure 113A:
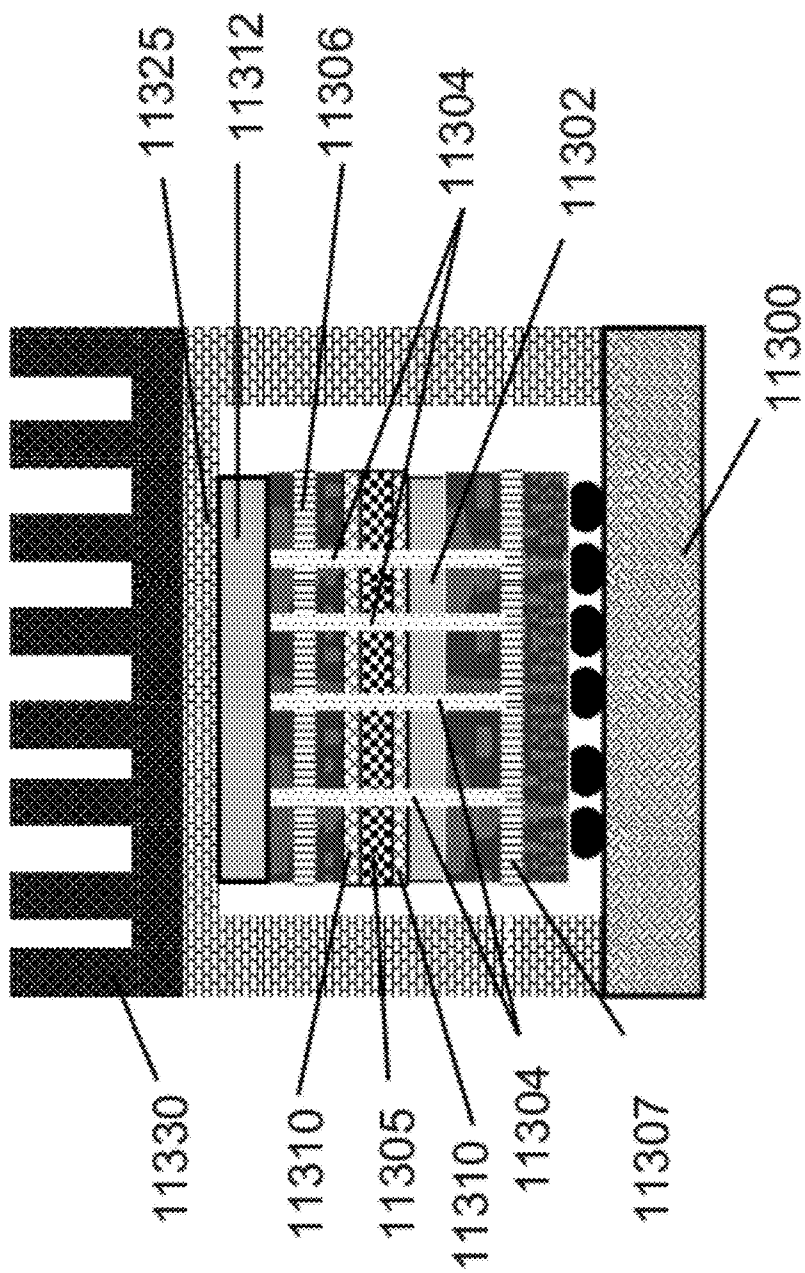

As illustrated in FIG. 113A, a set of power and ground grids, such as bottom transistor layer power and ground grid 11307 and top transistor layer power and ground grid 11306, may be connected by through layer power and ground vias 11304 and thermally coupled to the electrically non-conducting heat spreader layer 11305. If the heat spreader is an electrical conductor, then it could either, for example, only be used as a ground plane, or a pattern should be created with power and ground strips in between the landing pads for the TLVs. The density of the power and ground grids and the through layer vias to the power and ground grids may be designed to substantially improve a certain overall thermal resistance for substantially all the circuits in the 3D IC stack. Bonding oxides 11310, printed wiring board 11300, package heat spreader 11325, bottom transistor layer 11302, top transistor layer 11312, and heat sink 11330 are shown. Thus, a 3D IC with an integrated heat sink, heat spreaders, and through layer vias to the power and ground grid may be constructed.

Figure 113B:
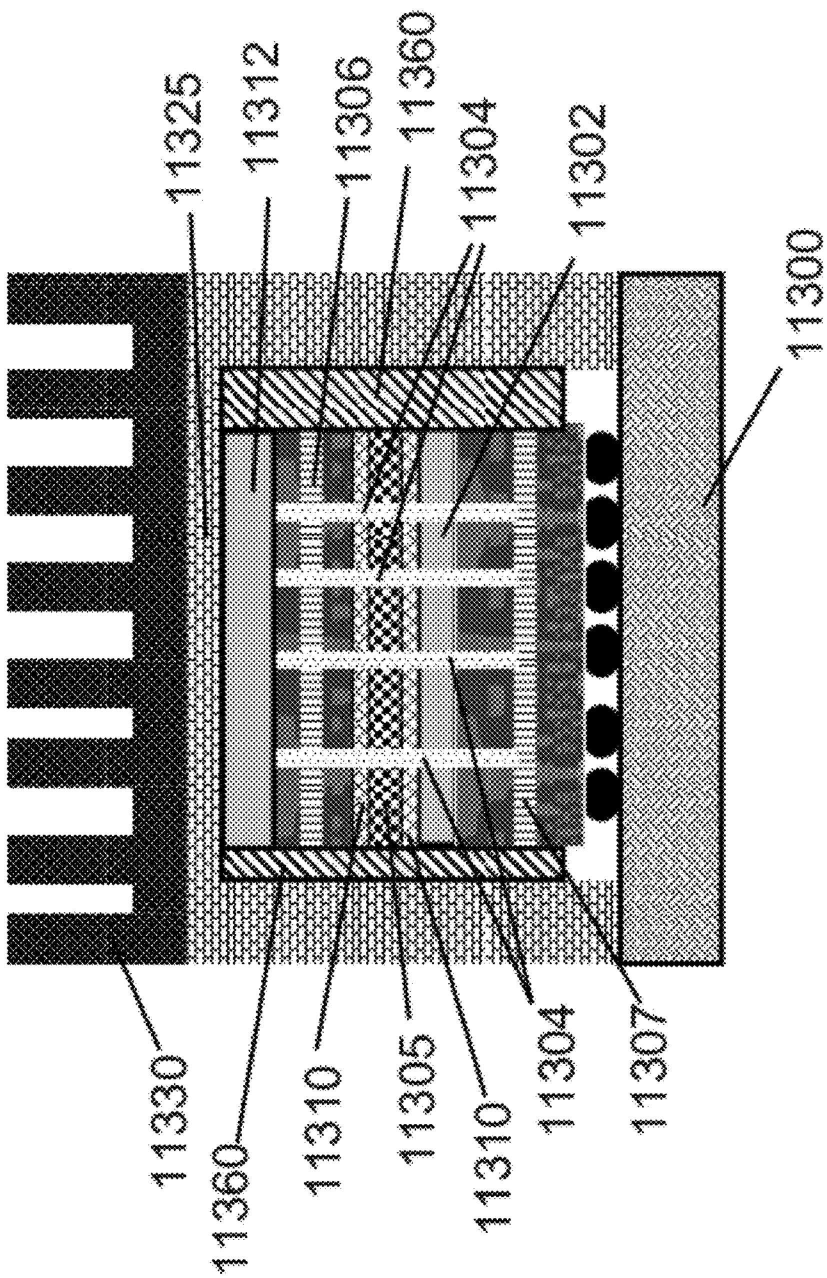

As illustrated in FIG. 113B, thermally conducting material, such as PECVD DLC, may be formed on the sidewalls of the 3D IC structure of FIG. 113A to form sidewall thermal conductors 11360 for sideways heat removal. Bottom transistor layer power and ground grid 11307, top transistor layer power and ground grid 11306, through layer power and ground vias 11304, heat spreader layer 11305, bonding oxides 11310, printed wiring board 11300, package heat spreader 11325, bottom transistor layer 11302, top transistor layer 11312, and heat sink 11330 may be shown.

FIG. 138A illustrates a packaging scheme used for several high-performance microchips. A silicon chip 13802 may be attached to an organic substrate 13804 using solder bumps 13808. The organic substrate 13804, in turn, may be connected to an FR4 printed wiring board (also called board) 13806 using solder bumps 13812. The co-efficient of thermal expansion (CTE) of silicon may be about 3.2 ppm/K, the CTE of organic substrates is typically ~17 ppm/K and the CTE of the FR4 printed wiring board material is typically ~17 ppm/K. Due to this large mismatch between CTE of the silicon chip 13802 and the organic substrate 13804, the solder bumps 13808 may be subjected to stresses, which can cause defects and cracking in solder bumps 13808. To avoid this potential cause of defects and cracking, underfill material 13810 may be dispensed between solder bumps. While underfill material 13810 can prevent defects and cracking, it can cause other challenges. Firstly, when solder bump sizes are reduced or when high density of solder bumps is required, dispensing underfill material may become difficult or even impossible, since underfill cannot flow in small spaces. Secondly, underfill may be hard to remove once dispensed. As a result, if a chip on a substrate is found to have defects, removing the chip and replacing with another chip may be difficult. Hence, production of multi-chip substrates may be difficult. Thirdly, underfill can cause the stress, due to the mismatch of CTE between the silicon chip 13802 and the organic substrate 13804, to be more efficiently communicated to the low k dielectric layers may present between on-chip interconnects.

Figure 139B:
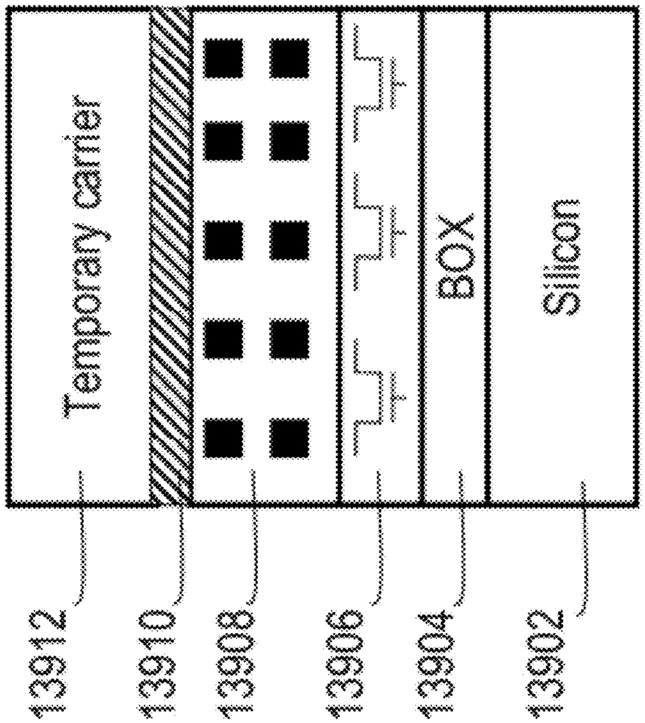

FIG. 139B illustrates a packaging scheme used for many low-power microchips. A silicon chip 13814 may be directly connected to an FR4 substrate 13816 using solder bumps 13818. Due to the large difference in CTE between the silicon chip 13814 and the FR4 substrate 13816, underfill 13820 may be dispensed many times between solder bumps. As mentioned previously, underfill may bring with it challenges related to difficulty of removal and to the stress communicated to the chip low k dielectric layers.

Figure 139A:
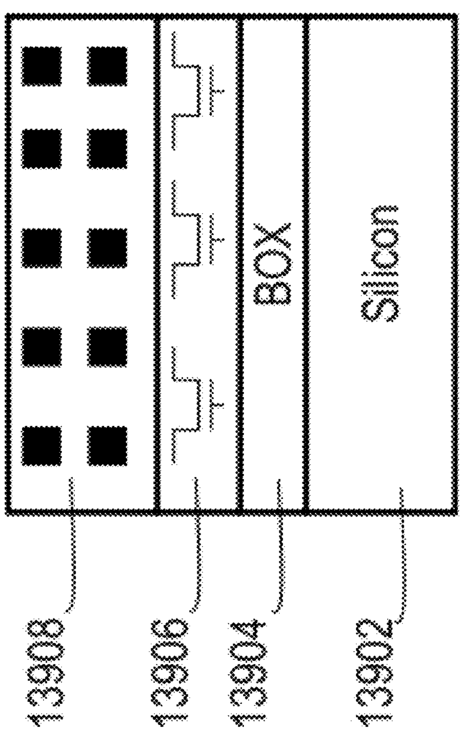

In both of the packaging types described in FIG. 139A and FIG. 139B and also many other packaging methods available in the literature, the mismatch of co-efficient of thermal expansion (CTE) between a silicon chip and a substrate, or between a silicon chip and a printed wiring board, may be a serious issue in the packaging industry. A technique to solve this problem without the use of underfill may be advantageous as an illustration.

FIG. 139A-F describes an embodiment of this present invention, where use of underfill may be avoided in the packaging process of a chip constructed on a silicon-on-insulator (SOI) wafer. Although this embodiment of the present invention is described with respect to one type of packaging scheme, it will be clear to one skilled in the art that the invention may be applied to other types of packaging. The process flow for the SOI chip could include the following steps that occur in sequence from Step (A) to Step (F). When the same reference numbers are used in different drawing figures (among FIG. 139A-F), they are used to indicate analogous, similar or identical structures to enhance the understanding of the present invention by clarifying the relationships between the structures and embodiments presented in the various diagrams—particularly in relating analogous, similar or identical functionality to different physical structures.

Step (A) is illustrated in FIG. 139A. An SOI wafer with transistors constructed on silicon layer 13906 may have a buried oxide layer 13904 atop silicon layer/substrate 13902. Interconnect layers 13908, which may include metals such as aluminum or copper and insulators such as silicon oxide or low k dielectrics, may be constructed as well.

Step (B) is illustrated in FIG. 139B. A temporary carrier wafer 13912 can be attached to the structure shown in FIG. 139A using a temporary bonding adhesive 13910. The temporary carrier wafer 13912 may be constructed with a material, such as, for example, glass or silicon. The temporary bonding adhesive 13910 may include, for example, a polyimide.

Figure 139C:
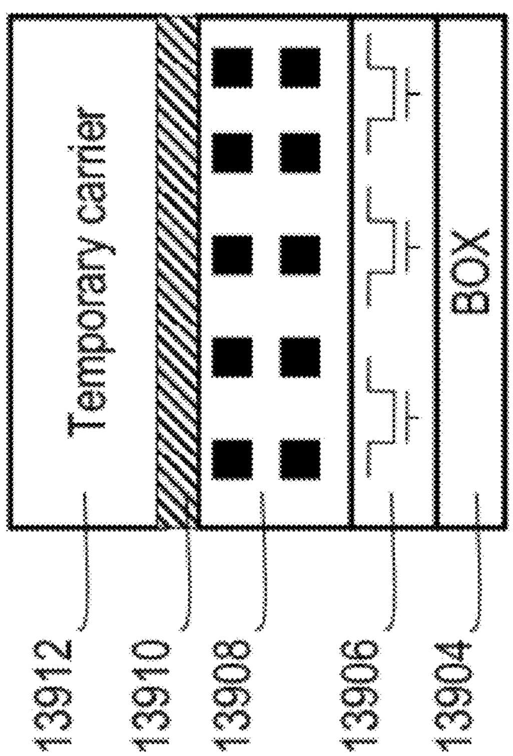

Step (C) is illustrated in FIG. 139C. The structure shown in FIG. 139B may be subjected to a selective etch process, such as, for example, a Potassium Hydroxide etch, (potentially combined with a back-grinding process) where silicon layer/substrate 13902 may be removed using the buried oxide layer 13904 as an etch stop. Once the buried oxide layer 13904 may be reached during the etch step, the etch process may be stopped. The etch chemistry may be selected such that it etches silicon but does not etch the buried oxide layer 13904 appreciably. The buried oxide layer 13904 may be polished with CMP to ensure a planar and smooth surface.

Figure 139D:
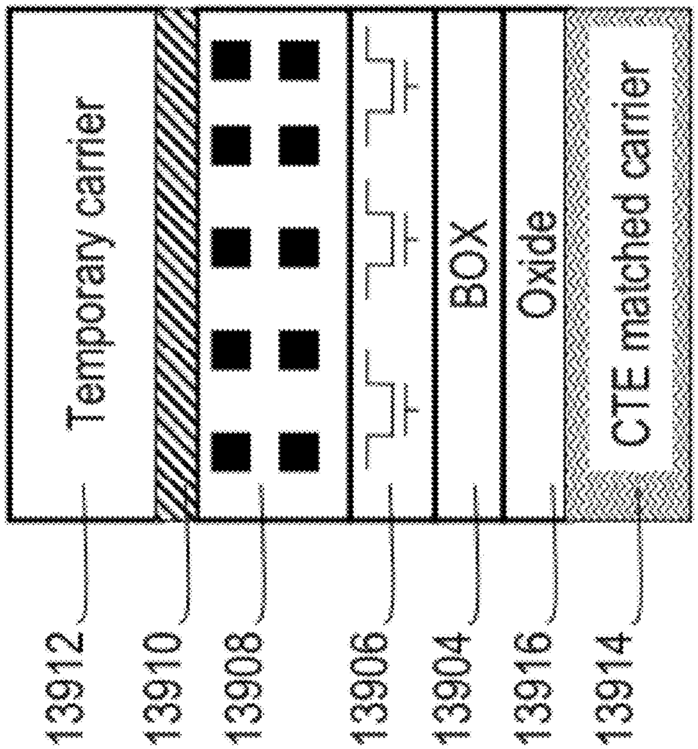

Step (D) is illustrated in FIG. 139D. The structure shown in FIG. 139C may be bonded to an oxide-coated carrier wafer having a co-efficient of thermal expansion (CTE) similar to that of the organic substrate used for packaging. This oxide-coated carrier wafer as described may be called a CTE matched carrier wafer henceforth in this document. The bonding step may be conducted using oxide-to-oxide bonding of buried oxide layer 13904 to the oxide coating 13916 of the CTE matched carrier wafer 13914. The CTE matched carrier wafer 13914 may include materials, such as, for example, copper, aluminum, organic materials, copper alloys and other materials.

Figure 139E:
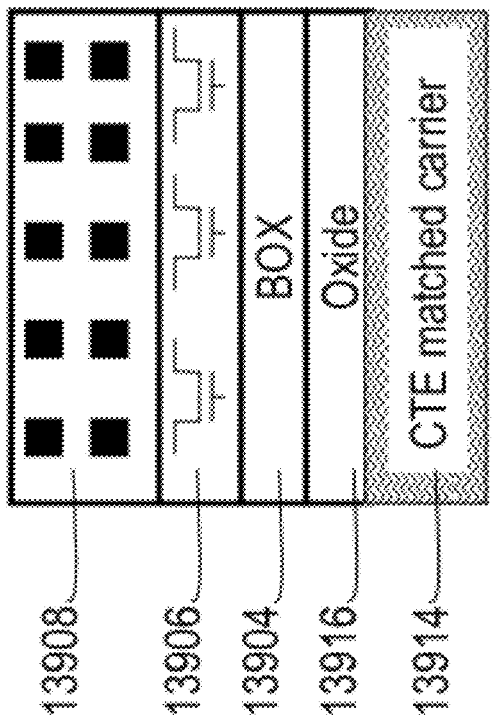

Step (E) is illustrated in FIG. 139E. The temporary carrier wafer 13912 may be detached from the structure at the surface of the interconnect layers 13908 by removing the temporary bonding adhesive 13910. This detachment may be done, for example, by shining laser light through the glass temporary carrier wafer 13912 to ablate or heat the temporary bonding adhesive 13910.

Figure 139F:
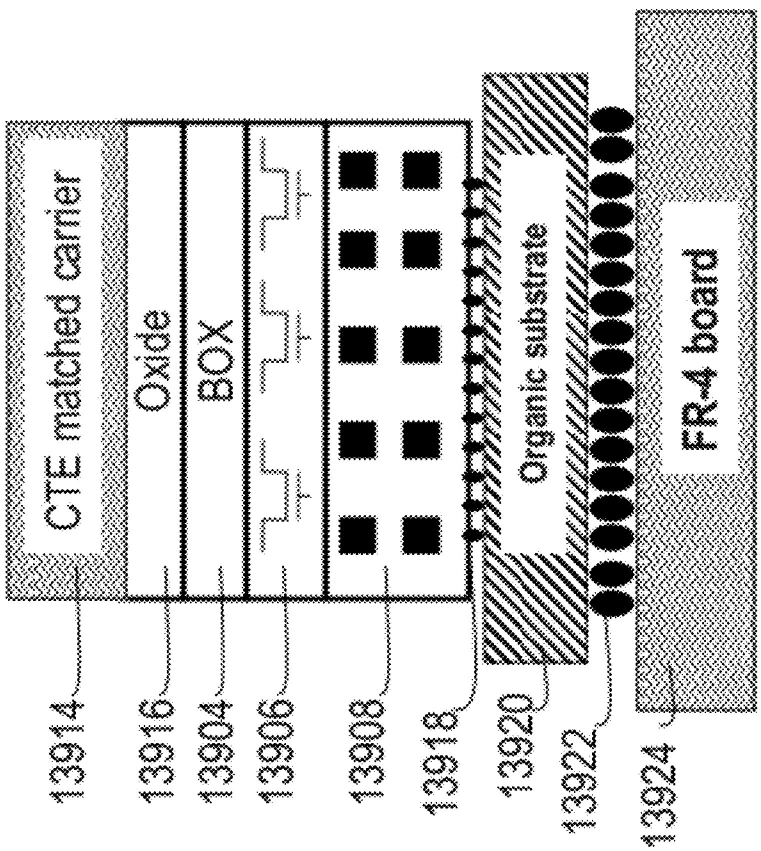

Step (F) is illustrated in FIG. 139F. Solder bumps 13918 may be constructed for the structure shown in FIG. 139E. After dicing, this structure may be attached to organic substrate 13920. This organic substrate 13920 may then be attached to a printed wiring board 13924, such as, for example, an FR4 substrate, using solder bumps 13922.

The conditions for choosing the CTE matched carrier wafer 13914 for this embodiment of the present invention include the following. Firstly, the CTE matched carrier wafer 13914 can have a CTE close to that of the organic substrate 13920. For example, the CTE of the CTE matched carrier wafer 13914 should be within about 10 ppm/K of the CTE of the organic substrate 13920. Secondly, the volume of the CTE matched carrier wafer 13914 can be much higher than the silicon layer 13906. For example, the volume of the CTE matched carrier wafer 13914 may be greater than about 5 times the volume of the silicon layer 13906. When this volume mismatch happens, the CTE of the combination of the silicon layer 13906 and the CTE matched carrier wafer 13914 may be close to that of the CTE matched carrier wafer 13914. If these two conditions may be met, the issues of co-efficient of thermal expansion mismatch described previously may be ameliorated, and a reliable packaging process may be obtained without underfill being used.

The organic substrate 13920 typically may have a CTE of about 17 ppm/K and the printed wiring board 13924 typically may be constructed of FR4 which has a CTE of about 18 ppm/K. If the CTE matched carrier wafer is constructed of an organic material having a CTE of about 17 ppm/K, it can be observed that issues of co-efficient of thermal expansion mismatch described previously are ameliorated, and a reliable packaging process may be obtained without underfill being used. If the CTE matched carrier wafer is constructed of a copper alloy having a CTE of about 17 ppm/K, it can be observed that issues of co-efficient of thermal expansion mismatch described previously may be ameliorated, and a reliable packaging process may be obtained without underfill being used. If the CTE matched carrier wafer may be constructed of an aluminum alloy material having a CTE of about 24 ppm/K, it can be observed that issues of co-efficient of thermal expansion mismatch described previously are ameliorated, and a reliable packaging process may be obtained without underfill being used. Silicon layer 13906, buried oxide layer 13904, interconnect layers 13908 may be regions atop silicon layer/substrate 13902.

FIG. 140A-F describes an embodiment of this present invention, where use of underfill may be avoided in the packaging process of a chip constructed on a bulk-silicon wafer. Although this embodiment of the present invention is described with respect to one type of packaging scheme, it will be clear to one skilled in the art that the invention may be applied to other types of packaging. The process flow for the silicon chip could include the following steps that occur in sequence from Step (A) to Step (F). When the same reference numbers may be used in different drawing figures (among FIG. 140A-F), they may be used to indicate analogous, similar or identical structures to enhance the understanding of the present invention by clarifying the relationships between the structures and embodiments presented in the various diagrams—particularly in relating analogous, similar or identical functionality to different physical structures.

Figure 140B:
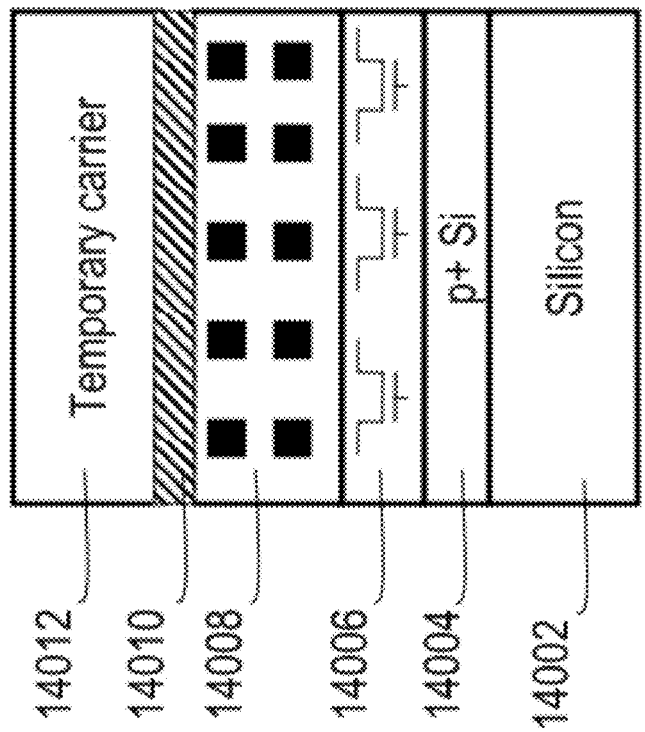
Figure 140A:
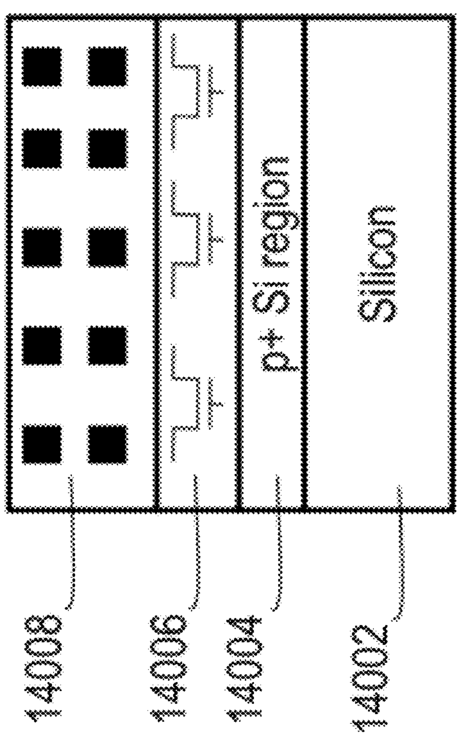

Step (A) is illustrated in FIG. 140A. A bulk-silicon wafer with transistors constructed on silicon layer 14006 may have a buried p+ silicon layer 14004 atop silicon layer/substrate 14002. Interconnect layers 14008, which may include metals such as aluminum or copper and insulators such as silicon oxide or low k dielectrics, may be constructed. The buried p+ silicon layer 14004 may be constructed with a process, such as, for example, an ion-implantation and thermal anneal, or an epitaxial doped silicon deposition.

Step (B) is illustrated in FIG. 140B. A temporary carrier wafer 14012 may be attached to the structure shown in FIG. 140A using a temporary bonding adhesive 14010. The temporary carrier wafer 14012 may be constructed with a material, such as, for example, glass or silicon. The temporary bonding adhesive 14010 may include, for example, a polyimide.

Figure 140D:
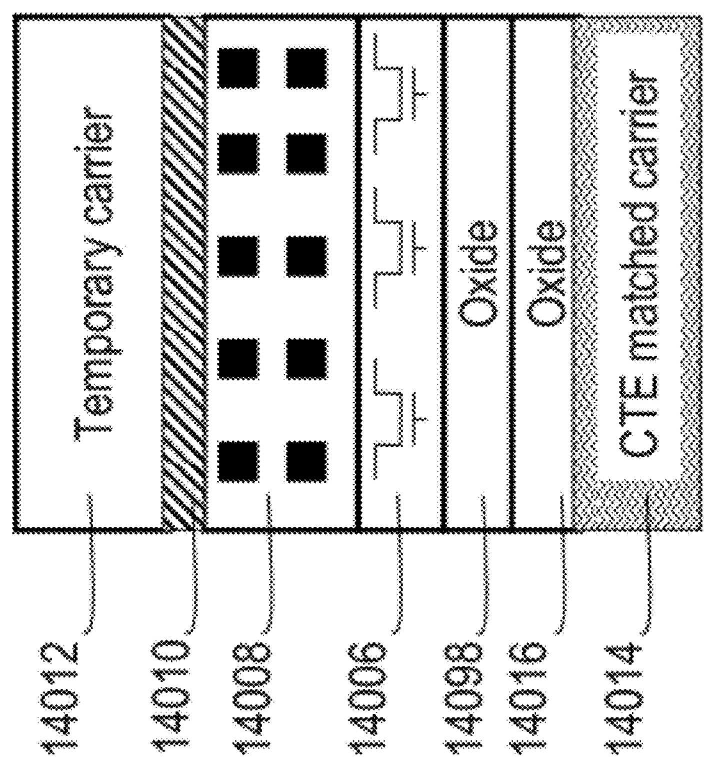
Figure 140C:
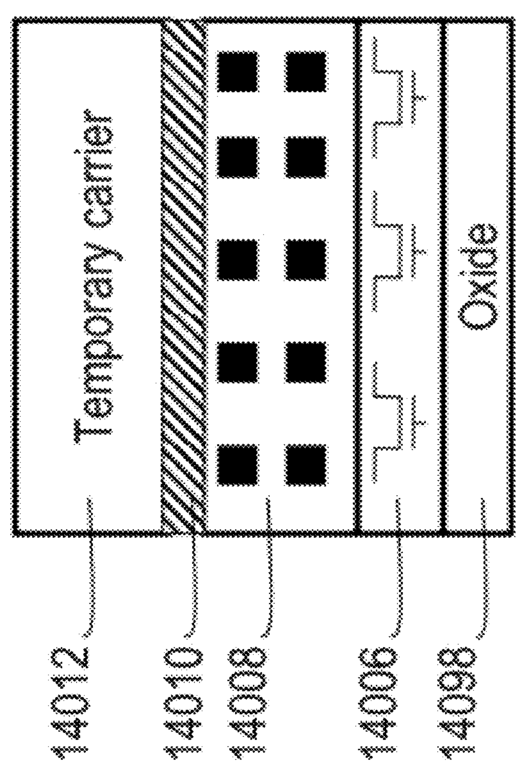

Step (C) is illustrated in FIG. 140C. The structure shown in FIG. 140B may be subjected to a selective etch process, such as, for example, ethylenediamine pyrocatechol (EDP) (potentially combined with a back-grinding process) where silicon layer/substrate 14002 may be removed using the buried p+ silicon layer 14004 as an etch stop. Once the buried p+ silicon layer 14004 may be reached during the etch step, the etch process may be stopped. The etch chemistry may be selected such that the etch process stops at the p+ silicon buried layer. The buried p+ silicon layer 14004 may then be polished away with CMP and planarized. Following this, an oxide layer 14098 may be deposited.

Step (D) is illustrated in FIG. 140D. The structure shown in FIG. 140C may be bonded to an oxide-coated carrier wafer having a co-efficient of thermal expansion (CTE) similar to that of the organic substrate used for packaging. The oxide-coated carrier wafer as described may be called a CTE matched carrier wafer henceforth in this document. The bonding step may be conducted using oxide-to-oxide bonding of oxide layer 14098 to the oxide coating 14016 of the CTE matched carrier wafer 14014. The CTE matched carrier wafer 14014 may include materials, such as, for example, copper, aluminum, organic materials, copper alloys and other materials.

Figure 140E:
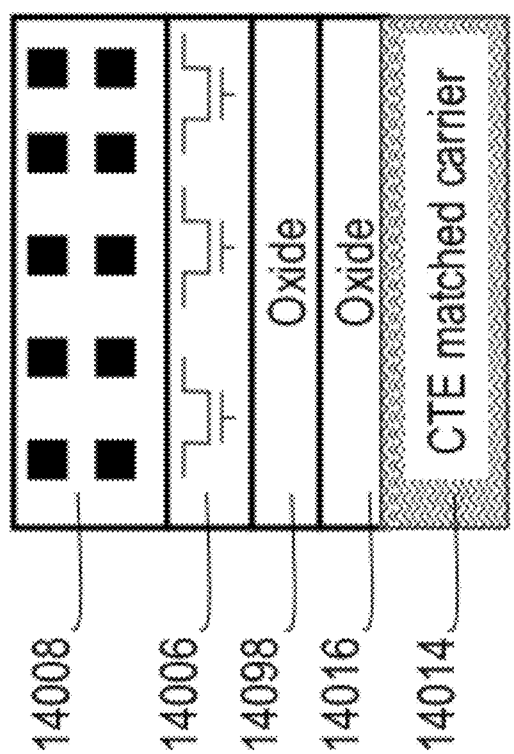

Step (E) is illustrated in FIG. 140E. The temporary carrier wafer 14012 may be detached from the structure at the surface of the interconnect layers 14008 by removing the temporary bonding adhesive 14010. This detachment may be done, for example, by shining laser light through the glass temporary carrier wafer 14012 to ablate or heat the temporary bonding adhesive 14010.

Figure 140F:
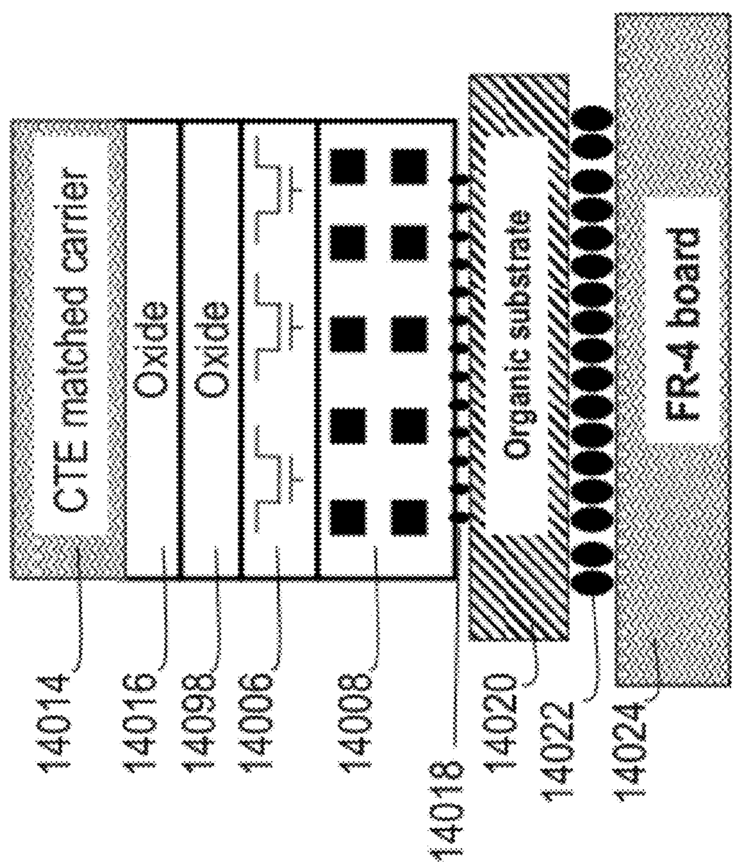

Step (F) is illustrated using FIG. 140F. Solder bumps 14018 may be constructed for the structure shown in FIG. 140E. After dicing, this structure may be attached to organic substrate 14020. This organic substrate may then be attached to a printed wiring board 14024, such as, for example, an FR4 substrate, using solder bumps 14022.

There may be two illustrative conditions while choosing the CTE matched carrier wafer 14014 for this embodiment of the invention. Firstly, the CTE matched carrier wafer 14014 may have a CTE close to that of the organic substrate 14020. Illustratively, the CTE of the CTE matched carrier wafer 14014 may be within about 10 ppm/K of the CTE of the organic substrate 14020. Secondly, the volume of the CTE matched carrier wafer 14014 may be much higher than the silicon layer 14006. Illustratively, the volume of the CTE matched carrier wafer 14014 may be, for example, greater than about 5 times the volume of the silicon layer 14006. When this happens, the CTE of the combination of the silicon layer 14006 and the CTE matched carrier wafer 14014 may be close to that of the CTE matched carrier wafer 14014. If these two conditions are met, the issues of co-efficient of thermal expansion mismatch described previously may be ameliorated, and a reliable packaging process may be obtained without underfill being used. Silicon layer 14006, buried p+ silicon layer 14004, and interconnect layers 14008 may also be regions that are atop silicon layer/substrate 14002.

The organic substrate 14020 typically has a CTE of about 17 ppm/K and the printed wiring board 14024 typically may be constructed of FR4 which has a CTE of about 18 ppm/K. If the CTE matched carrier wafer may be constructed of an organic material having a CTE of 17 ppm/K, it can be observed that issues of co-efficient of thermal expansion mismatch described previously are ameliorated, and a reliable packaging process may be obtained without underfill being used. If the CTE matched carrier wafer may be constructed of a copper alloy having a CTE of about 17 ppm/K, it can be observed that issues of co-efficient of thermal expansion mismatch described previously are ameliorated, and a reliable packaging process may be obtained without underfill being used. If the CTE matched carrier wafer may be constructed of an aluminum alloy material having a CTE of about 24 ppm/K, it can be observed that issues of co-efficient of thermal expansion mismatch described previously may be ameliorated, and a reliable packaging process may be obtained without underfill being used.

While FIG. 139A-F and FIG. 140A-F describe methods of obtaining thinned wafers using buried oxide and buried p+ silicon etch stop layers respectively, it will be clear to one skilled in the art that other methods of obtaining thinned wafers exist. Hydrogen may be implanted through the backside of a bulk-silicon wafer (attached to a temporary carrier wafer) at a certain depth and the wafer may be cleaved using a mechanical force. Alternatively, a thermal or optical anneal may be used for the cleave process. An ion-cut process through the back side of a bulk-silicon wafer could therefore be used to thin a wafer accurately, following which a CTE matched carrier wafer may be bonded to the original wafer.

It will be clear to one skilled in the art that other methods to thin a wafer and attach a CTE matched carrier wafer exist. Other methods to thin a wafer include, but not limited to, CMP, plasma etch, wet chemical etch, or a combination of these processes. These processes may be supplemented with various metrology schemes to monitor wafer thickness during thinning Carefully timed thinning processes may also be used.

FIG. 141 describes an embodiment of this present invention, where multiple dice, such as, for example, dice 14124 and 14126 may be placed and attached atop packaging substrate 14116. Packaging substrate 14116 may include packaging substrate high density wiring layers 14114, packaging substrate vias 14120, packaging substrate-to-printed-wiring-board connections 14118, and printed wiring board 14122. Die-to-substrate connections 14112 may be utilized to electrically couple dice 14124 and 14126 to the packaging substrate high density wiring levels 14114 of packaging substrate 14116. The dice 14124 and 14126 may be constructed using techniques described with FIG. 139A-F and FIG. 140A-F but may be attached to packaging substrate 14116 rather than organic substrate 13920 or 14020. Due to the techniques of construction described in FIG. 139A-F and FIG. 140A-F being used, a high density of connections may be obtained from each die, such as 14124 and 14126, to the packaging substrate 14116. By using a packaging substrate 14116 with packaging substrate high density wiring levels 14114, a large density of connections between multiple dice 14124 and 14126 may be realized. This may open up several opportunities for system design. In one embodiment of this invention, unique circuit blocks may be placed on different dice assembled on the packaging substrate 14116. In another embodiment, contents of a large die may be split among many smaller dice to reduce yield issues. In yet another embodiment, analog and digital blocks could be placed on separate dice. It will be obvious to one skilled in the art that several variations of these concepts are possible. The illustrative enabler for all these ideas may be the fact that the CTEs of the dice are similar to the CTE of the packaging substrate, so that a high density of connections from the die to the packaging substrate may be obtained, and provide for a high density of connection between dice. 14102 denotes a CTE matched carrier wafer, 14104 and 14106 are oxide layers, 14108 represents transistor regions, 14110 represents a multilevel wiring stack, 14112 represents die-to-substrate connections, 14116 represents the packaging substrate, 14114 represents the packaging substrate high density wiring levels, 14120 represents vias on the packaging substrate, 14118 denotes packaging substrate-to-printed-wiring-board connections and 14122 denotes a printed wiring board.

As well, the independent formation of each transistor layer may enable the use of materials other than silicon to construct transistors. For example, a thin III-V compound quantum well channel such as InGaAs and InSb may be utilized on one or more of the 3D layers described above by direct layer transfer or deposition and the use of buffer compounds such as GaAs and InAlAs to buffer the silicon and III-V lattice mismatches. This feature may enable high mobility transistors that can be optimized independently for p and n-channel use, solving the integration difficulties of incorporating n and p III-V transistors on the same substrate, and also the difficulty of integrating the III-V transistors with conventional silicon transistors on the same substrate. For example, the first layer silicon transistors and metallization generally cannot be exposed to temperatures higher than about 400° C. The III-V compounds, buffer layers, and dopings generally may need processing temperatures above that 400° C. threshold. By use of the pre deposited, doped, and annealed layer donor wafer formation and subsequent donor to acceptor wafer transfer techniques described above and illustrated, for example, in FIGS. 14, 20 to 29, and 43 to 45, III-V transistors and circuits may be constructed on top of silicon transistors and circuits without damaging said underlying silicon transistors and circuits. As well, any stress mismatches between the dissimilar materials to be integrated, such as silicon and III-V compounds, may be mitigated by the oxide layers, or specialized buffer layers, that may be vertically in-between the dissimilar material layers. Additionally, this may now enable the integration of optoelectronic elements, communication, and data path processing with conventional silicon logic and memory transistors and silicon circuits. Another example of a material other than silicon that the independent formation of each transistor layer may enable is Germanium.

It should be noted that this 3D IC technology could be used for many applications. As an example the various structures presented in FIGS. 15 to 19 having been constructed in the 'foundation,' which may be below the main or primary or house layer, could be just as well be 'fabricated' in the "Attic," which may be above the main or primary or house layer, by using the techniques described in relation to FIGS. 21 to 35.

Figure 36:
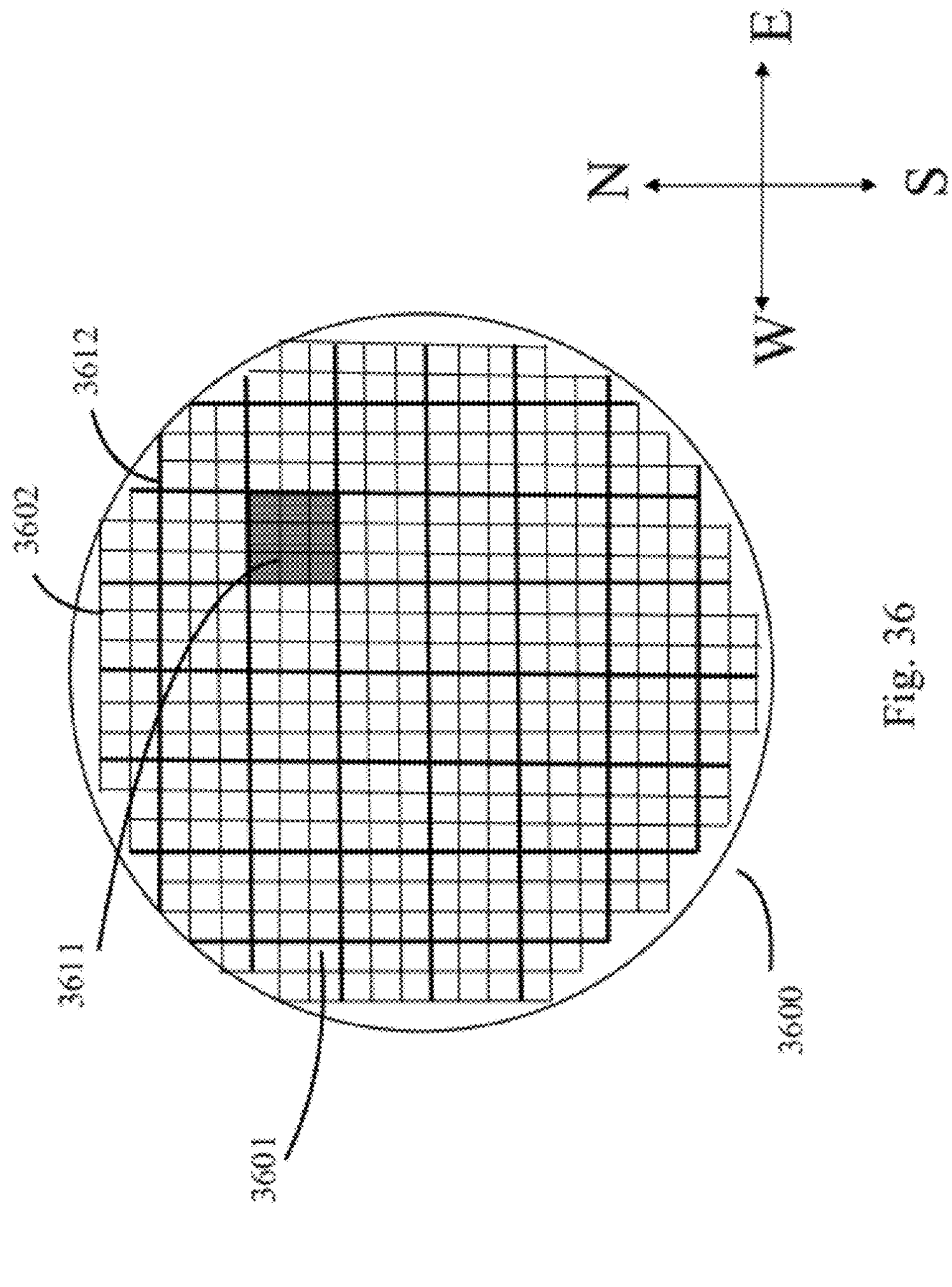
FIG. 36 is an exemplary drawing illustration of a tile array wafer.

It also should be noted that the 3D programmable system, where the logic fabric may be sized by dicing a wafer of tiled array as illustrated in FIG. 36, could utilize the 'monolithic' 3D techniques related to FIG. 14 in respect to the 'Foundation,' or to FIGS. 21 through 35 in respect to the Attic, to add 10 or memories as presented in FIG. 11. So while in many cases constructing a 3D programmable system using TSV could be possible there might be cases where it will be better to use the 'Foundation' or 'Attic".

When a substrate wafer, carrier wafer, or donor wafer may be thinned by a ion-cut & cleaving method in this document, there may be other methods that may be employed to thin the wafer. For example, a boron implant and anneal may be utilized to create a layer in the silicon substrate to be thinned that will provide a wet chemical etch stop plane such as described in FIG. 231 herein. A dry etch, such as a halogen gas cluster beam, may be employed to thin a silicon substrate and then smooth the silicon surface with an oxygen gas cluster beam. Additionally, these thinning techniques may be utilized independently or in combination to achieve the proper thickness and defect free surface as may be needed by the process flow.

Some alternatives to ion-cut & cleave layer transfers of very thin layers of silicon (less than about 200 nm) atop a bottom layer of transistors and wires are described in FIG. 230 to FIG. 233.

Figure 230A:
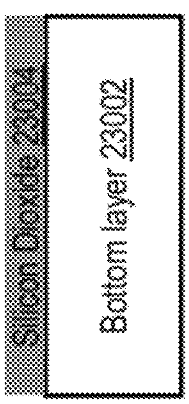

The process flow in FIG. 230A-F may include several steps as described in the following sequence:

Step (A): A silicon dioxide layer 23004 may be deposited above the generic bottom layer 23002. FIG. 230A illustrates the structure after Step (A).

Figure 230B:
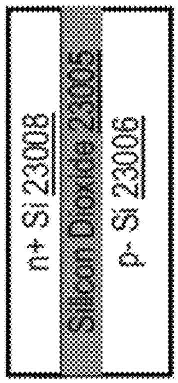

Step (B): An SOI wafer 23006 may be implanted with n+ near its surface to form a n+ Si layer 23008. The buried oxide (BOX) of the SOI wafer may be silicon dioxide layer 23005. FIG. 230B illustrates the structure after Step (B).

Step (C): A p− Si layer 23010 may be epitaxially grown atop the n+ Si layer 23008. A silicon dioxide layer 23012 may be deposited atop the p− Si layer 23010. An anneal (such as a rapid thermal anneal RTA or spike anneal or laser anneal) may be conducted to activate dopants. Alternatively, the n+ Si layer 23008 and p− Si layer 23010 can be formed by a buried layer implant of n+ Si in a p− SOI wafer.

Figure 230C:
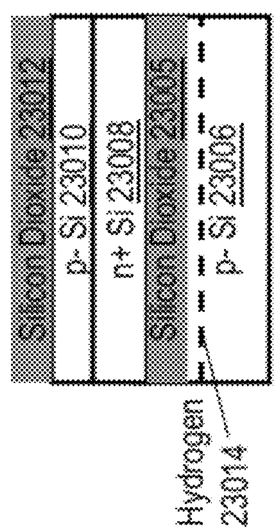

Hydrogen may be then implanted into the SOI wafer 23006 at a certain depth to form hydrogen plane 23014. Alternatively, another atomic species such as helium can be implanted or co-implanted. FIG. 230C illustrates the structure after Step (C).

Figure 230D:
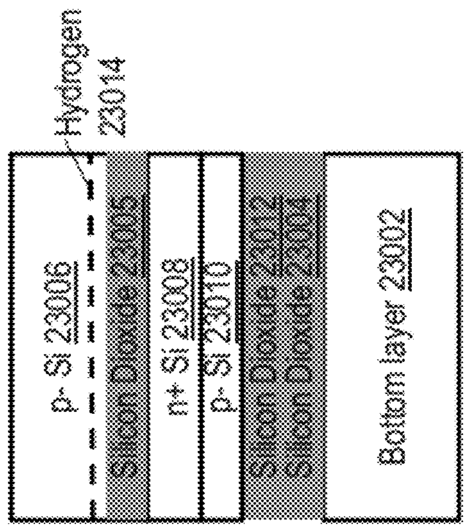

Step (D): The top layer wafer shown after Step (C) may be flipped and bonded atop the bottom layer wafer using oxide-to-oxide bonding. FIG. 230D illustrates the structure after Step (D).

Figure 230F:
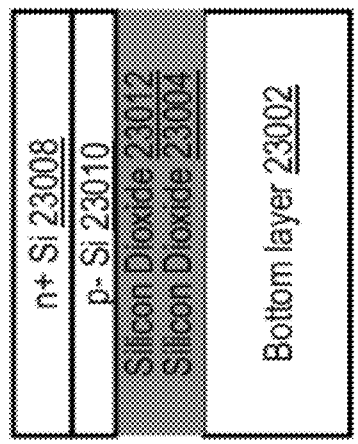
Figure 230E:
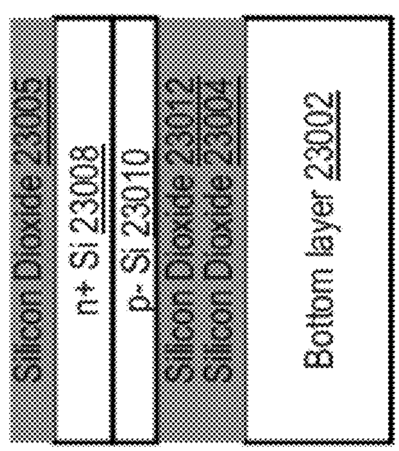

Step (E): A cleave operation may be performed at the hydrogen plane 23014 using an anneal. Alternatively, a sideways mechanical force may be used. Following this, an etching process that etches Si but does not etch silicon dioxide, such as KOH solutions or CF4 plasma etches, may be utilized to remove the p− Si layer of SOI wafer 23006 remaining after cleave. CMO may also be utilized. The buried oxide (BOX) silicon dioxide layer 23005 acts as an etch stop. FIG. 230E illustrates the structure after Step (E).

Step (F): Once the etch stop silicon dioxide layer 23005 may be reached, an etch or CMP process may be utilized to etch the silicon dioxide layer 23005 till the n+ silicon layer 23008 may be reached. The etch process for Step (F) may be preferentially chosen so that it etches silicon dioxide but does not attack Silicon. For example, a dilute hydrofluoric acid solution may be utilized. FIG. 230F illustrates the structure after Step (F). It is clear from the process shown in FIG. 230A-F that one can get excellent control of the n+ layer 23008's thickness after layer transfer.

Figures 231A, 231B, 231C, 231D:
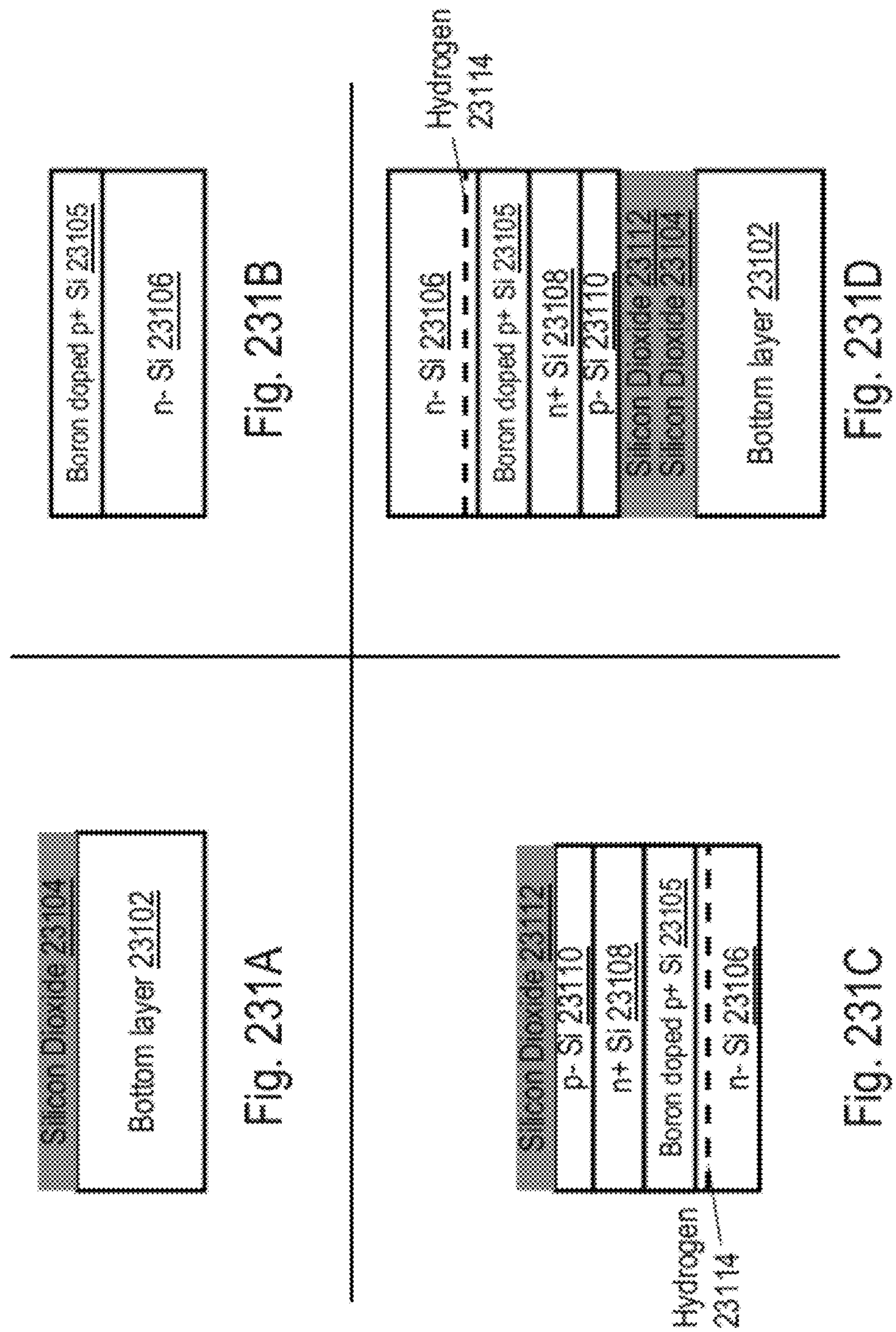

While the process shown in FIG. 230A-F results in accurate layer transfer of thin regions, it may have some limitations. SOI wafers may typically be quite costly, and utilizing an SOI wafer just for having an etch stop layer may not typically be economically viable. In that case, an alternative process shown in FIG. 231A-F could be utilized. The process flow in FIG. 231A-F may include several steps as described in the following sequence:

Step (A): A silicon dioxide layer 23104 may be deposited above the generic bottom layer 23102. FIG. 231A illustrates the structure after Step (A).

Step (B): An n− Si wafer 23106 may be implanted with boron doped p+ Si near its surface to form a p+ Si layer 23105. The p+ layer may be doped above 1E20/cm3, and typically above 1E21/cm3. Alternatively, a p− Si layer instead of the p+ Si layer 23105 may be used. A p− Si wafer can be utilized instead of the n− Si wafer 23106 as well. FIG. 231B illustrates the structure after Step (B).

Step (C): An n+ Si layer 23108 and a p− Si layer 23110 may be epitaxially grown atop the p+ Si layer 23105. A silicon dioxide layer 23112 may be deposited atop the p− Si layer 23110. An anneal (such as a rapid thermal anneal RTA, spike anneal, flash anneal, or laser anneal) may be conducted to activate dopants. Alternatively, the p+ Si layer 23105, the n+ Si layer 23108 and the p− Si layer 23110 can be formed by a series of implants on an n− Si wafer 23106.

Hydrogen may be then implanted into the n− Si wafer 23106 at a certain depth to form hydrogen plane 23114. Alternatively, another atomic species such as helium can be implanted. FIG. 231C illustrates the structure after Step (C).

Step (D): The top layer wafer shown after Step (C) may be flipped and bonded atop the bottom layer wafer using oxide-to-oxide bonding. FIG. 231D illustrates the structure after Step (D).

Figure 231F:
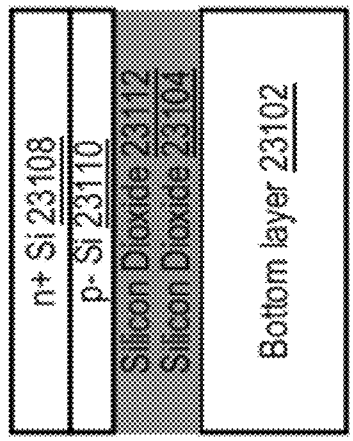
Figure 231E:
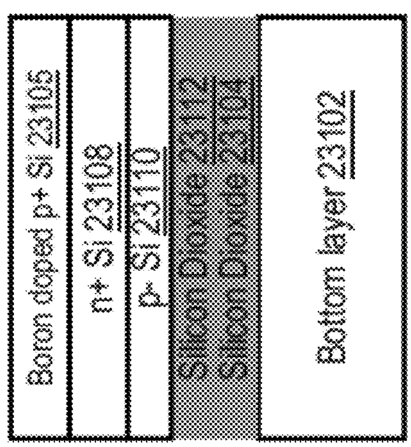

Step (E): A cleave operation may be performed at the hydrogen plane 23114 using an anneal. Alternatively, a sideways mechanical force may be used. Following this, an etching process that etches the remaining n− Si layer of n− Si wafer 23106 but does not etch the p+ Si etch stop layer 23105 may be utilized to etch through the n-Si layer of n− Si wafer 23106 remaining after cleave. Examples of etching agents that etch n− Si or p− Si but do not attack p+ Si doped above 1E20/cm3 include KOH, EDP (ethylenediamine/pyrocatechol/water) and hydrazine. FIG. 231E illustrates the structure after Step (E).

Step (F): Once the etch stop 23105 may be reached, an etch or CMP process may be utilized to etch the p+ Si layer 23105 till the n+ silicon layer 23108 may be reached. FIG. 231F illustrates the structure after Step (F). It is clear from the process shown in FIG. 231A-F that excellent control of the n+ layer 23108's thickness after layer transfer may be obtained.

While silicon dioxide and p+ Si were utilized as etch stop layers in FIG. 230 A-F and FIG. 231 A-F respectively, other etch stop layers such as SiGe could be utilized. An etch stop layer of SiGe can be incorporated in the middle of the structure shown in FIG. 231 A-F using an epitaxy process. As well, n+ Si layer 23108 and p− Si layer 23110 may be doped differently or may include other layers in combination with other embodiments herein.

Figure 232A:
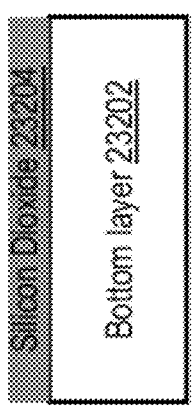

FIG. 232A-F shows a procedure using etch-stop layer controlled etch-back for layer transfer. The process flow in FIG. 232A-F may include several steps in the following sequence:

Step (A): A silicon dioxide layer 23204 may be deposited above the generic bottom layer 23202. FIG. 232A illustrates the structure after Step (A).

Figure 232B:
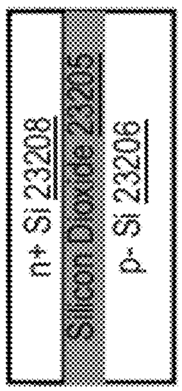

Step (B): SOI wafer 23206 may be implanted with n+ near its surface to form an n+ Si layer 23208. The buried oxide (BOX) of the SOI wafer may be silicon dioxide layer 23205. FIG. 232B illustrates the structure after Step (B).

Figure 232C:
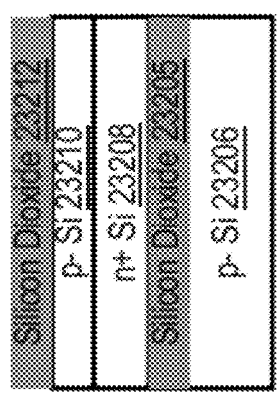

Step (C): A p− Si layer 23210 may be epitaxially grown atop the n+ Si layer 23208. A silicon dioxide layer 23212 may be grown/deposited atop the p− Si layer 23210. An anneal (such as a rapid thermal anneal RTA or spike anneal or laser anneal) may be conducted to activate dopants. FIG. 232C illustrates the structure after Step (C).

Alternatively, the n+ Si layer 23208 and p− Si layer 23210 can be formed by a buried layer implant of n+ Si in a p− SOI wafer.

Figure 232D:
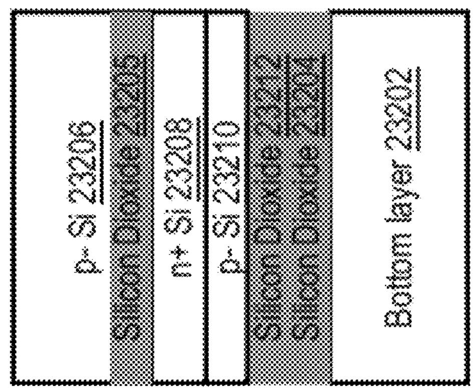

Step (D): The top layer wafer shown after Step (C) may be flipped and bonded atop the bottom layer wafer using oxide-to-oxide bonding. FIG. 232D illustrates the structure after Step (D).

Figure 232F:
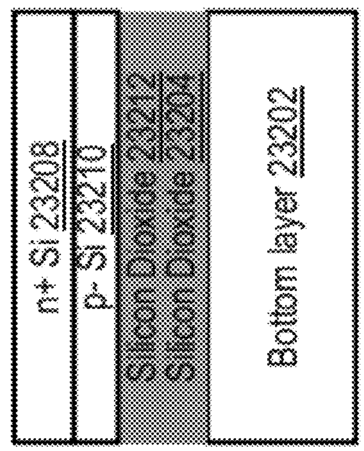
Figure 232E:
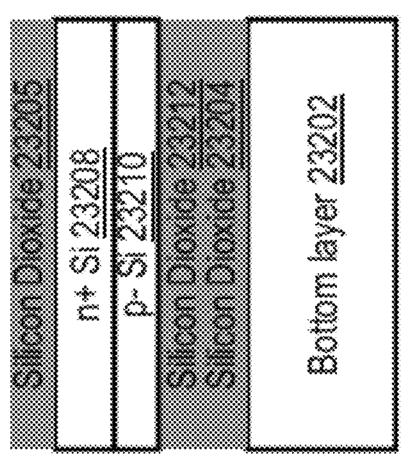

Step (E): An etch process that etches Si but does not etch silicon dioxide may be utilized to etch through the p− Si layer of SOI wafer 23206. The buried oxide (BOX) of silicon dioxide layer 23205 therefore acts as an etch stop. FIG. 232E illustrates the structure after Step (E).

Step (F): Once the etch stop of silicon dioxide layer 23205 is substantially reached, an etch or CMP process may be utilized to etch the silicon dioxide layer 23205 till the n+ silicon layer 23208 may be reached. The etch process for Step (F) may be preferentially chosen so that it etches silicon dioxide but does not attack Silicon. FIG. 232F illustrates the structure after Step (F).

At the end of the process shown in FIG. 232A-F, the desired regions may be layer transferred atop the bottom layer 23202. While FIG. 232A-F shows an etch-stop layer controlled etch-back using a silicon dioxide etch stop layer, other etch stop layers such as SiGe or p+ Si can be utilized in alternative process flows. As well, n+ Si layer 23208 and p− Si layer 23210 may be doped differently or may include other layers in combination with other embodiments herein.

Figure 142A:
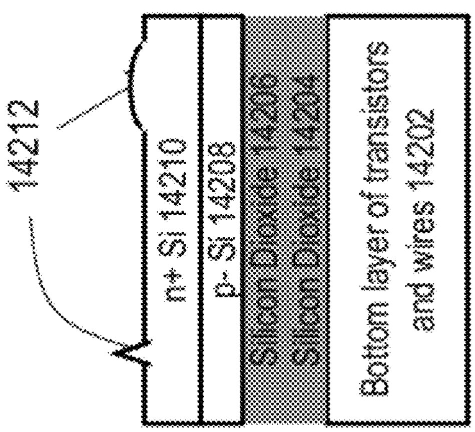

FIG. 142A shows the surface of a wafer or substrate structure after a layer transfer and after a hydrogen, or other atomic species, implant plane may have been cleaved. The wafer may include a bottom layer of transistors and wires 14202 with an oxide layer 14204 atop. These layers in turn may have been bonded using oxide-to-oxide bonding and cleaved to a structure such that a silicon dioxide layer 14206, p− Silicon layer 14208 and n+ Silicon layer 14210 may be formed atop the bottom layer of transistors and wires 14202 and the oxide layer 14204. The surface of the wafer or substrate structure shown in FIG. 142A can often be non-planar after cleaving along a hydrogen plane, with irregular features 14212 formed atop it.

The irregular features 14212 may be removed using a chemical mechanical polish (CMP) that can planarize the surface of the wafer or substrate structure.

Figure 142B:
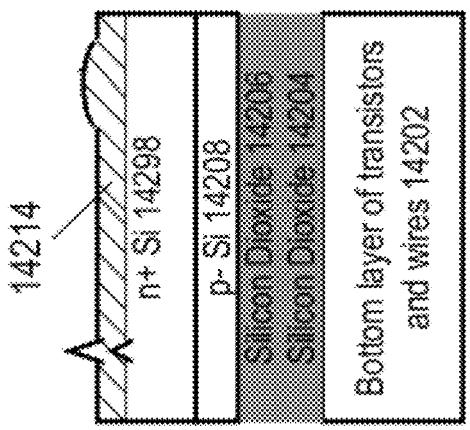
Figure 142C:
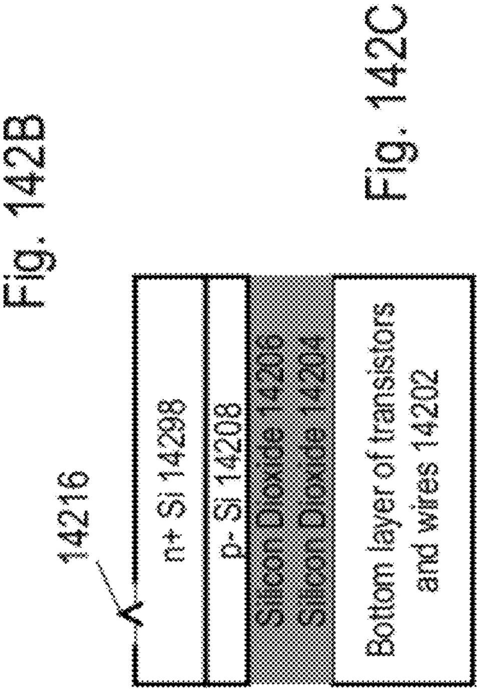

Alternatively, a process shown in FIG. 142B-C may be utilized to remove or reduce the extent of irregular features 14212 of FIG. 142A. Various elements in FIG. 142B such as 14202, 14204, 14206 and 14208 may be as described in the description for FIG. 142A. The surface of n+ Silicon layer 14210 and the irregular features 14212 may be subjected to a radical oxidation process, for example, utilizing the TEL SPA tool, that produces thermal oxide layer 14214 at less than about 400° C. by using a plasma. The thermal oxide layer 14214 consumes a portion of the n+ Silicon region 14210 shown in FIG. 142A to produce the n+ Si region 14298 of FIG. 142B. The thermal oxide layer 14214 may then be etched away, utilizing an etchant such as, for example, a dilute Hydrofluoric acid solution, to form the structure shown in FIG. 142C. Various elements in FIG. 142C such as 14202, 14204, 14206, 14208 and 14298 may be as described with respect to FIG. 142B. It can be observed that the extent of non-planarities 14216 in FIG. 142C may be less than in FIG. 142A. The radical oxidation and etch-back process may smoothen the surface and reduces non-planarities.

Alternatively, according to an embodiment of this present invention, surface non-planarities may be removed or reduced by treating the cleaved surface of the wafer or substrate in a hydrogen plasma at less than about 400° C. The hydrogen plasma source gases may include, for example, hydrogen, argon, nitrogen, hydrogen chloride, water vapor, methane, and so on. Hydrogen anneals at about 1100° C. are known to reduce surface roughness in silicon. By having a plasma, the temperature requirement can be reduced to less than about 400° C. A tool that might be employed is the TEL SPA tool.

Alternatively, according to another embodiment of this present invention, a thin film, such as, for example, a Silicon oxide or photosensitive resist, may be deposited atop the cleaved surface of the wafer or substrate and etched back. The etchant that may be required for this etch-back process may have approximately equal etch rates for both silicon and the deposited thin film. This etchant could reduce non-planarities on the wafer surface.

Alternatively, Gas Cluster Ion Beam technology may be utilized for smoothing surfaces after cleaving along an implanted plane of hydrogen or other atomic species.

FIG. 143A-D shows a description of a prior art shallow trench isolation process. The process flow for the silicon chip could include the following steps that occur in sequence from Step (A) to Step (D). When the same reference numbers are used in different drawing figures (among FIG. 143A-D), they may indicate analogous, similar or identical structures to enhance the understanding of the embodiments of the present invention being discussed by clarifying the relationships between the structures and embodiments presented in the various diagrams—particularly in relating analogous, similar or identical functionality to different physical structures.

Figure 143A:
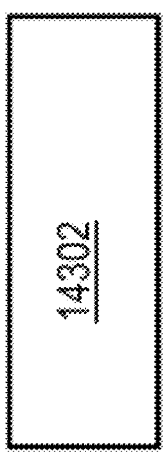

Step (A) is illustrated in FIG. 143A. A silicon wafer 14302 may be constructed.

Figure 143B:
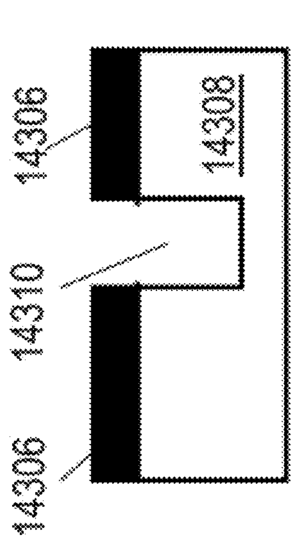

Step (B) is illustrated in FIG. 143B. Silicon nitride layer 14306 may be formed using a process such as chemical vapor deposition (CVD) and may then be lithographically patterned. Following this, an etch process may be conducted to form trench 14310. The silicon region remaining after these process steps is indicated as 14308. A silicon oxide (not shown) may be utilized as a stress relief layer between the silicon nitride layer 14306 and silicon wafer 14302.

Figure 143C:
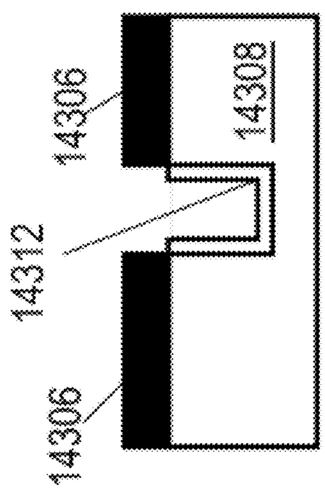

Step (C) is illustrated using FIG. 143C. A thermal oxidation process at greater than about 700° C. may be conducted to form oxide region 14312. The silicon nitride layer 14306 may prevent the silicon nitride covered surfaces of silicon region 14308 from becoming oxidized during this process.

Figure 143D:
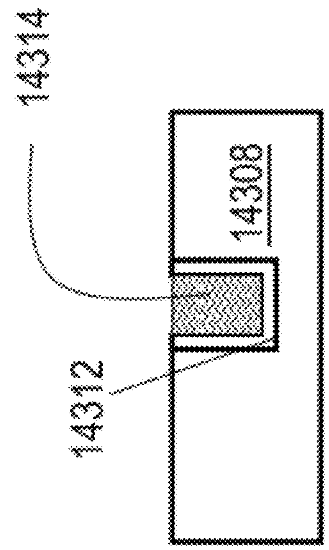

Step (D) is illustrated in FIG. 143D. An oxide fill may be deposited, following which an anneal may be done to densify the deposited oxide. A chemical mechanical polish (CMP) may be conducted to planarize the surface. Silicon nitride layer 14306 may be removed either with a CMP process or with a selective etch, such as hot phosphoric acid. The oxide fill layer after the CMP process is indicated as 14314.

The prior art process described in FIG. 143A-D may be prone to the drawback of high temperature (>400° C.) processing which may be not suitable for some embodiments of the present invention that involve 3D stacking of components such as, for example, junction-less transistors (JLT) and recessed channel array transistors (RCAT). Steps that involve temperatures greater than about 400° C. may include the thermal oxidation conducted to form oxide region 14312 and the densification anneal conducted in Step (D) above.

FIG. 144A-D describes an embodiment of this present invention, where sub-400° C. process steps may be utilized to form the shallow trench isolation regions. The process flow for the silicon chip may include the following steps that may occur in sequence from Step (A) to Step (D). When the same reference numbers are used in different drawing figures (among FIG. 144A-D), they are used to indicate analogous, similar or identical structures to enhance the understanding of the present invention by clarifying the relationships between the structures and embodiments presented in the various diagrams—particularly in relating analogous, similar or identical functionality to different physical structures.

Figure 144A:
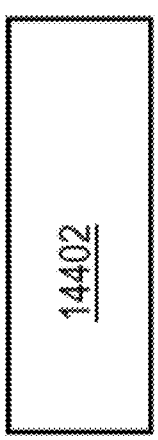

Step (A) is illustrated in FIG. 144A. A silicon wafer 14402 may be constructed.

Figure 144B:
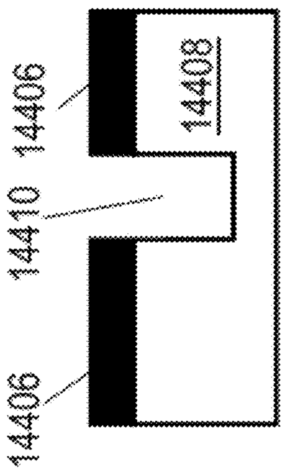

Step (B) is illustrated in FIG. 144B. Silicon nitride layer 14406 may be formed using a process, such as, for example, plasma-enhanced chemical vapor deposition (PECVD) or physical vapor deposition (PVD), and may then be lithographically patterned. Following this formation, an etch process may be conducted to form trench 14410. The silicon region remaining after these process steps may be indicated as 14408. A silicon oxide (not shown) may be utilized as a stress relief layer between the silicon nitride layer 14406 and silicon wafer 14402.

Figure 144C:
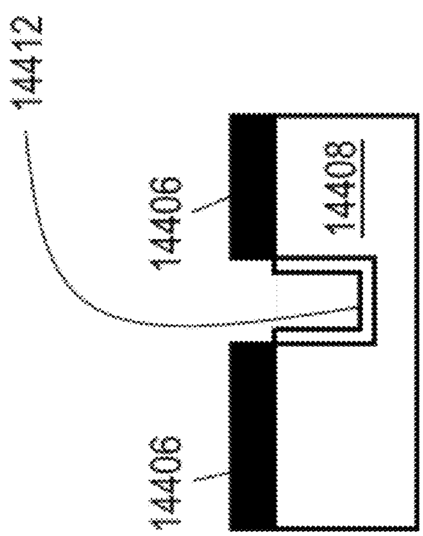

Step (C) is illustrated in FIG. 144C. A plasma-assisted radical thermal oxidation process, which has a process temperature typically less than about 400° C., may be conducted to form the oxide region 14412. The silicon nitride layer 14406 may prevent the silicon nitride covered surfaces of silicon region 14308 from becoming oxidized during this process.

Figure 144D:
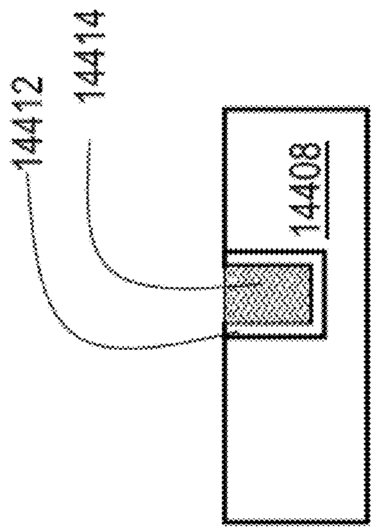

Step (D) is illustrated using FIG. 144D. An oxide fill may be deposited, illustratively using a process such as, for example, a high-density plasma (HDP) process that produces dense oxide layers at low temperatures, less than about 400° C. Depositing a dense oxide avoids the requirement for a densification anneal that would need to be conducted at a temperature greater than about 400° C. A chemical mechanical polish (CMP) may be conducted to planarize the surface. Silicon nitride layer 14406 may be removed either with a CMP process or with a selective etch, such as hot phosphoric acid. The oxide fill layer after the CMP process may be indicated as 14414.

The process described using FIG. 144A-D can be conducted at less than 400° C., and this is advantageous for many 3D stacked architectures.

Lithography costs for semiconductor manufacturing today may form a dominant percentage of the total cost of a processed wafer. In fact, some estimates may describe lithography cost as being more than 50% of the total cost of a processed wafer. Thus, there is a need for the reduction of lithography cost for semiconductor manufacturing.

FIG. 145A-J describes an embodiment of the invention, where a process flow is described in which a single lithography step may be shared among many wafers. Although the process flow is described with respect to a junction-less transistor, it may be obvious to one with ordinary skill in the art that it can be modified and applied to other types of transistors, such as, for example, FINFETs and planar CMOS MOSFETs. The process flow for the silicon chip may include the following steps that occur in sequence from Step (A) to Step (I). When the same reference numbers are used in different drawing figures (among FIG. 145A-J), they are used to indicate analogous, similar or identical structures to enhance the understanding of the embodiments of the present invention by clarifying the relationships between the structures and embodiments presented in the various diagrams—particularly in relating analogous, similar or identical functionality to different physical structures.

Figure 145A:
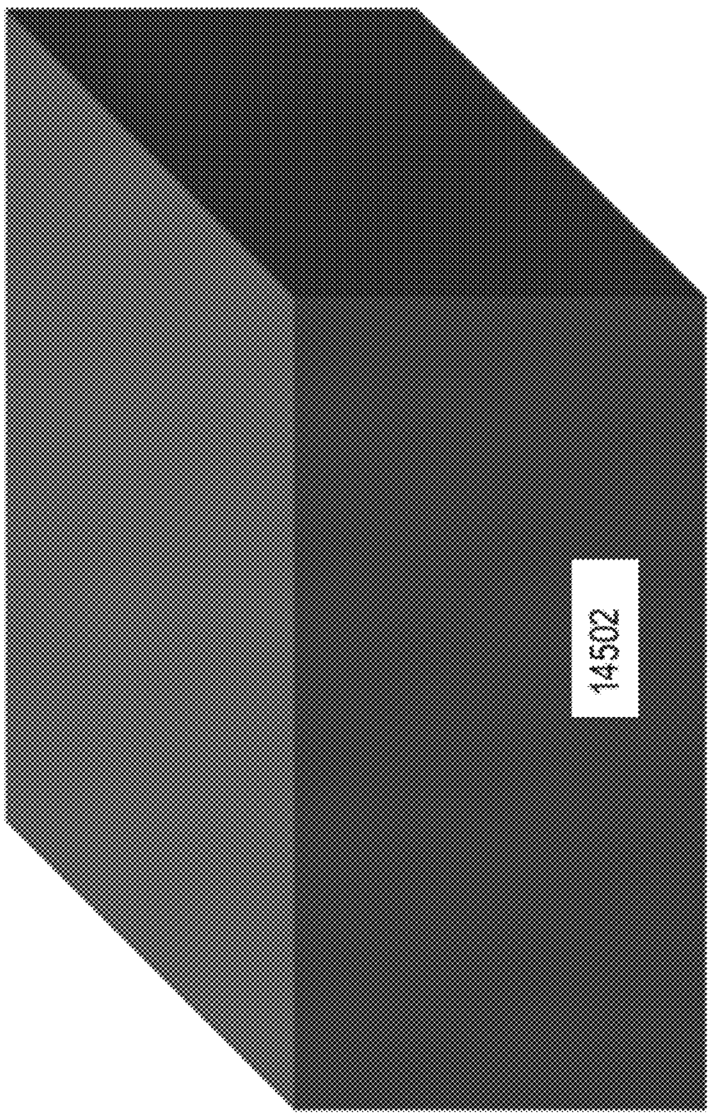

Step (A) is illustrated in FIG. 145A. A p− Silicon wafer/substrate 14502 may be taken.

Figure 145B:
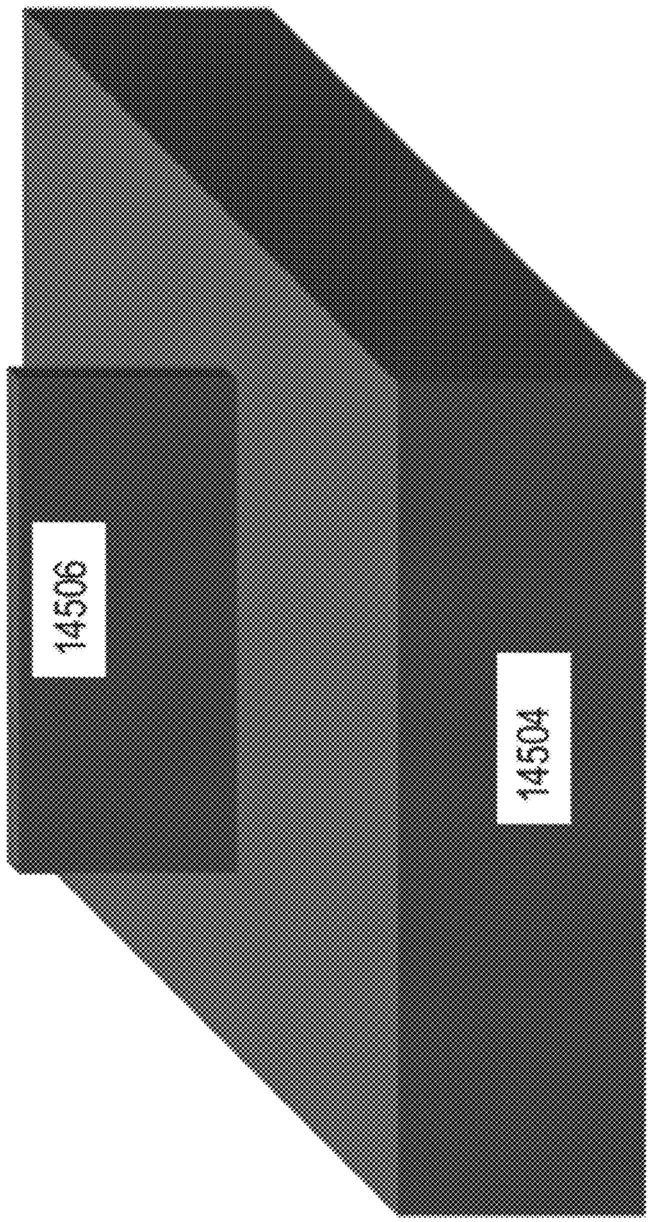

Step (B) is illustrated in FIG. 145B. N+ and p+ dopant regions may be implanted into the p− Silicon wafer/substrate 14502 of FIG. 145A. A thermal anneal, such as, for example, rapid, furnace, spike, or laser may then be done to activate dopants. Following this, a lithography and etch process may be conducted to define p− silicon region 14504 and n+ silicon region 14506. Regions with p+ silicon where p-JLTs may be fabricated are not shown.

Figure 145C:
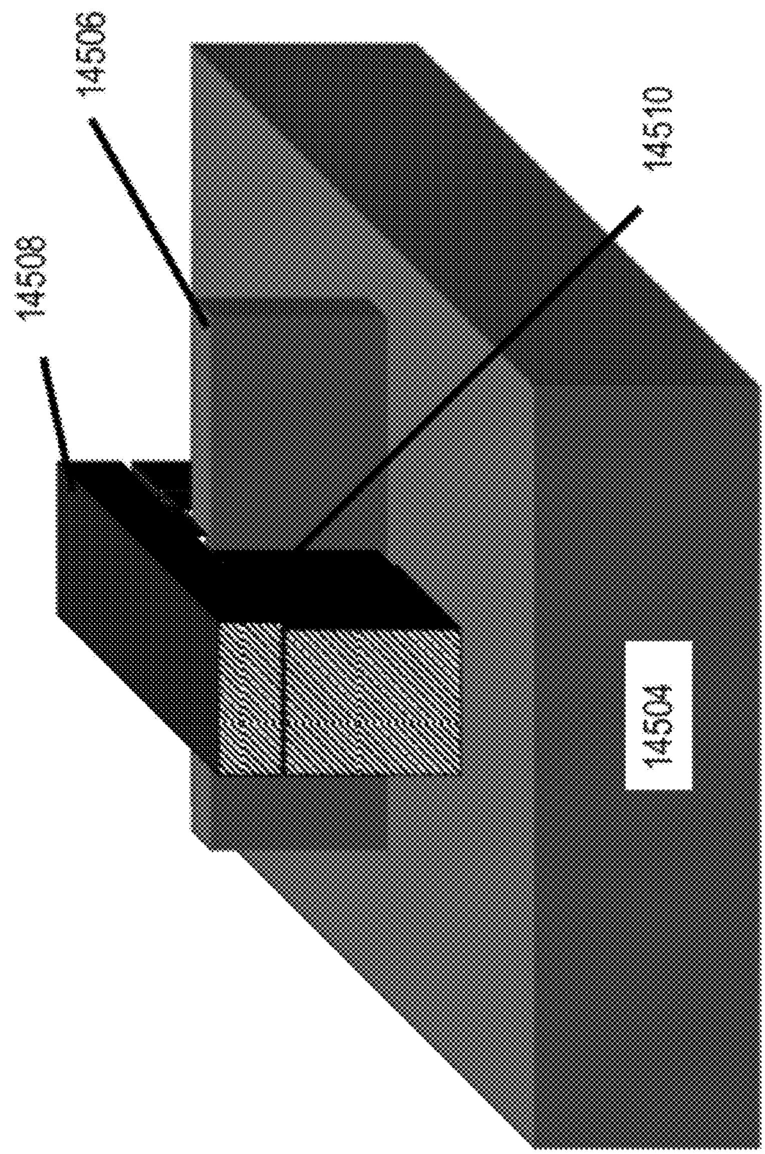

Step (C) is illustrated in FIG. 145C. Gate dielectric regions 14510 and gate electrode regions 14508 may be formed by oxidation or deposition of a gate dielectric, then deposition of a gate electrode, polishing with CMP and then lithography and etch. The gate electrode regions 14508 may be doped polysilicon. Alternatively, various hi-k metal gate (HKMG) materials could be utilized for gate dielectric and gate electrode as described previously.

Figure 145D:
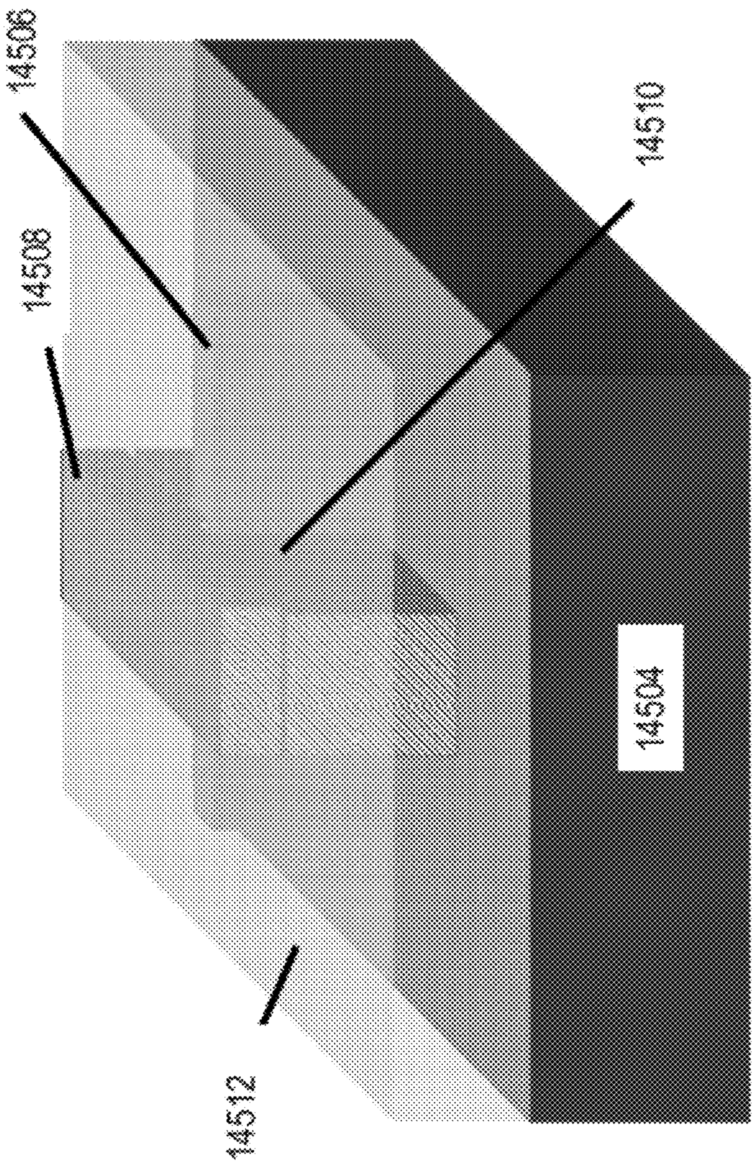

Step (D) is illustrated in FIG. 145D. Oxide regions 14512, for example, silicon dioxide, may be formed by deposition and may then be planarized and polished with CMP such that the oxide regions 14512 cover p− silicon regions 14504, n+ silicon regions 14506, gate electrode regions 14508 and gate dielectric regions 14510.

Figure 145E:
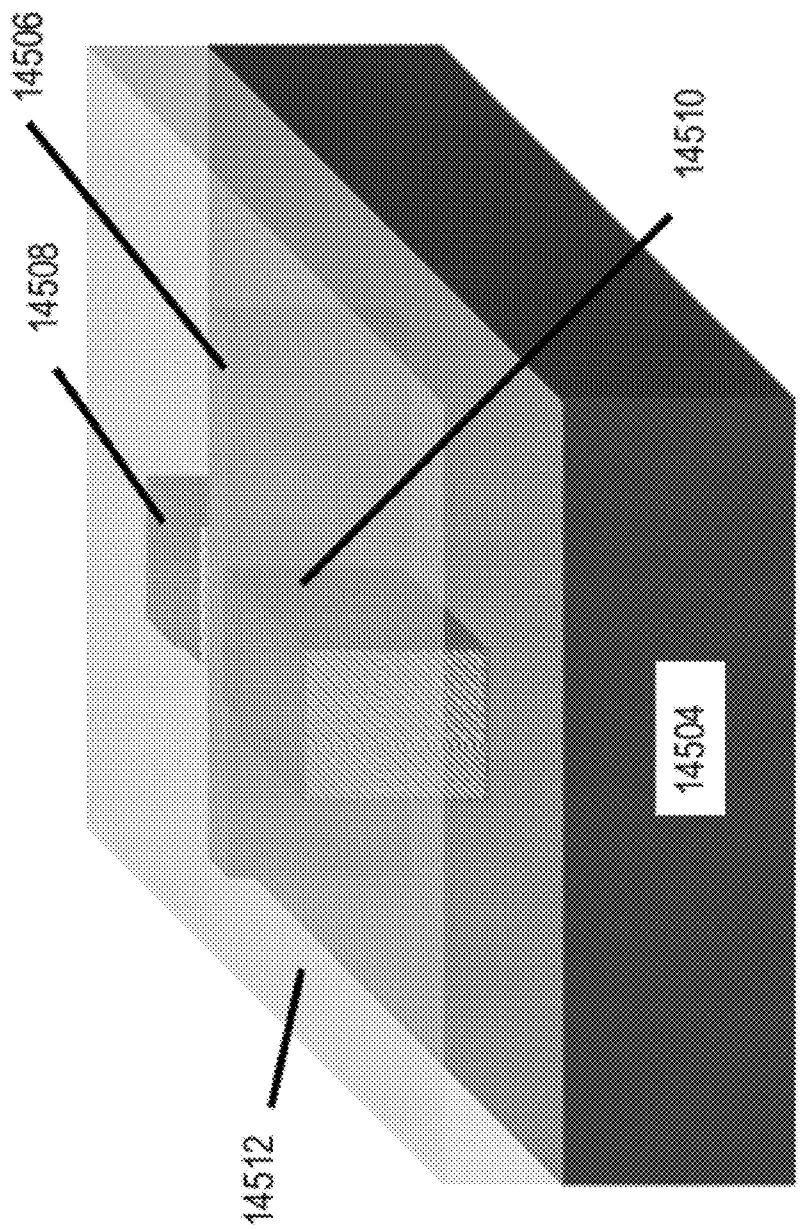

Step (E) is illustrated in FIG. 145E. The structure shown in FIG. 145D may be further polished with CMP such that portions of oxide regions 14512, gate electrode regions 14508, gate dielectric regions 14510 and n+ silicon regions 14506 may be polished. Following this polish, a silicon dioxide layer may be deposited over the structure.

Figure 145F:
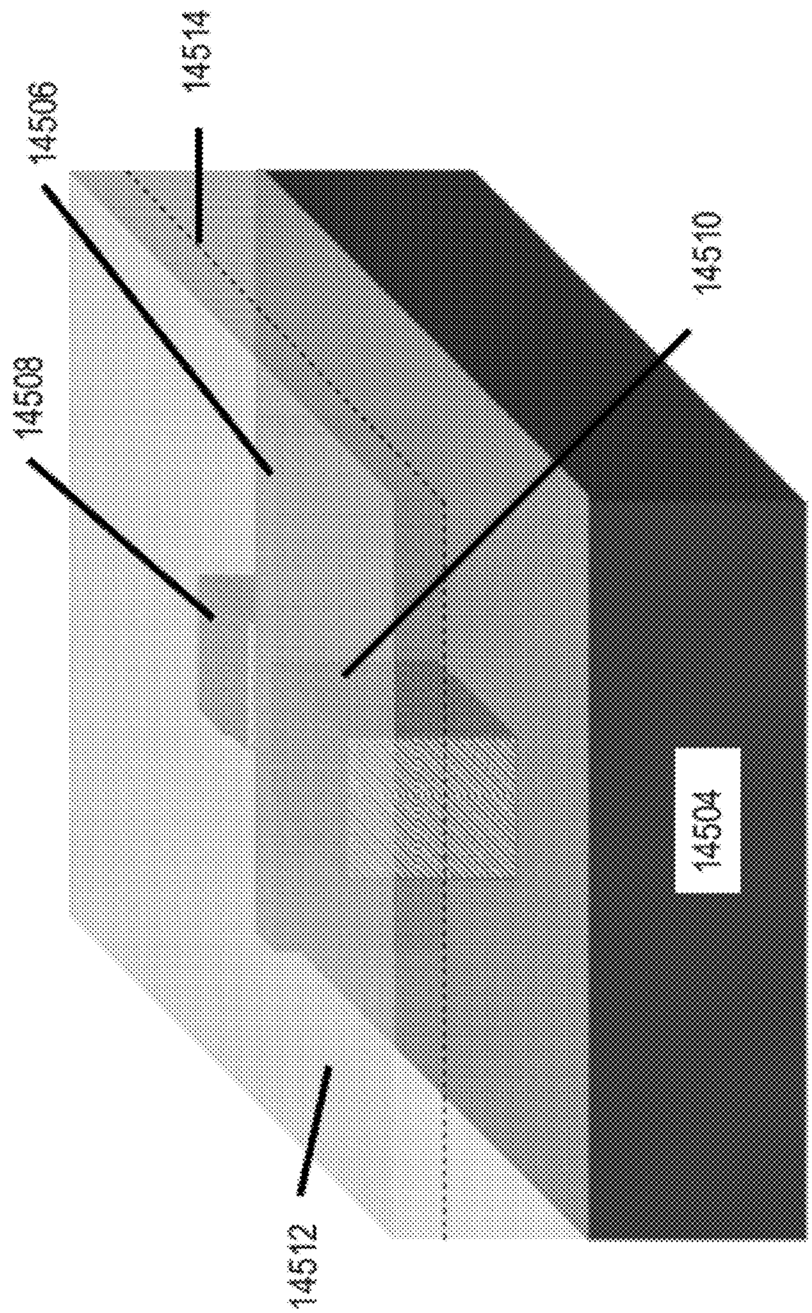

Step (F) is illustrated in FIG. 145F. Hydrogen H+ may be implanted into the structure at a certain depth creating hydrogen plane 14514 indicated by dotted lines.

Figure 145G:
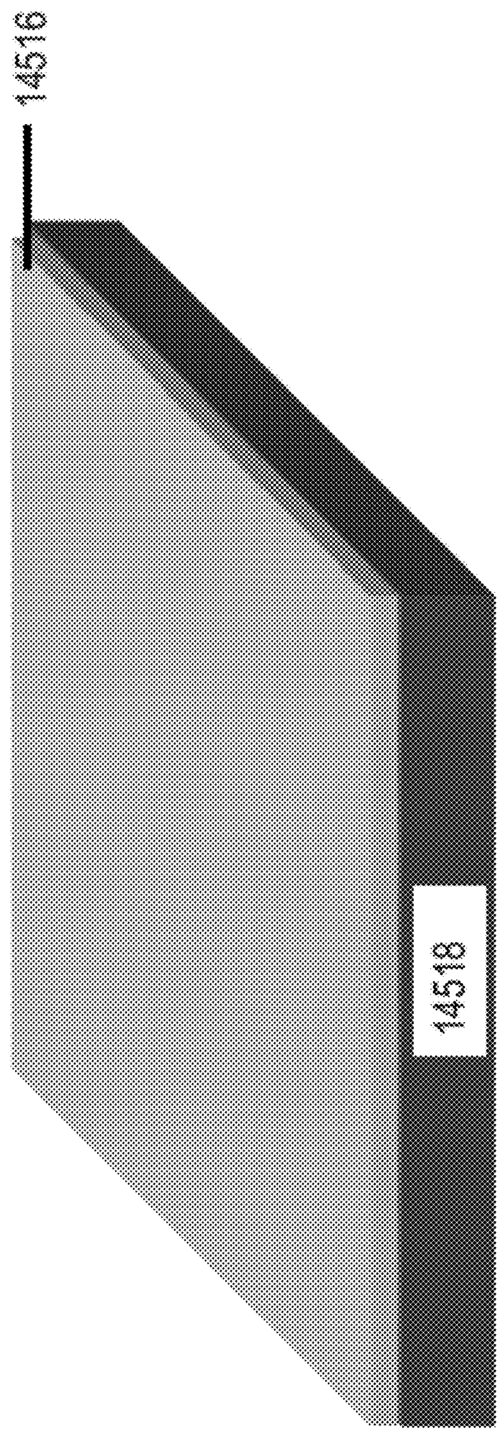

Step (G) is illustrated in FIG. 145G. A silicon wafer/substrate 14518 may have a oxide layer 14516, for example, silicon dioxide, deposited atop it.

Figure 145H:
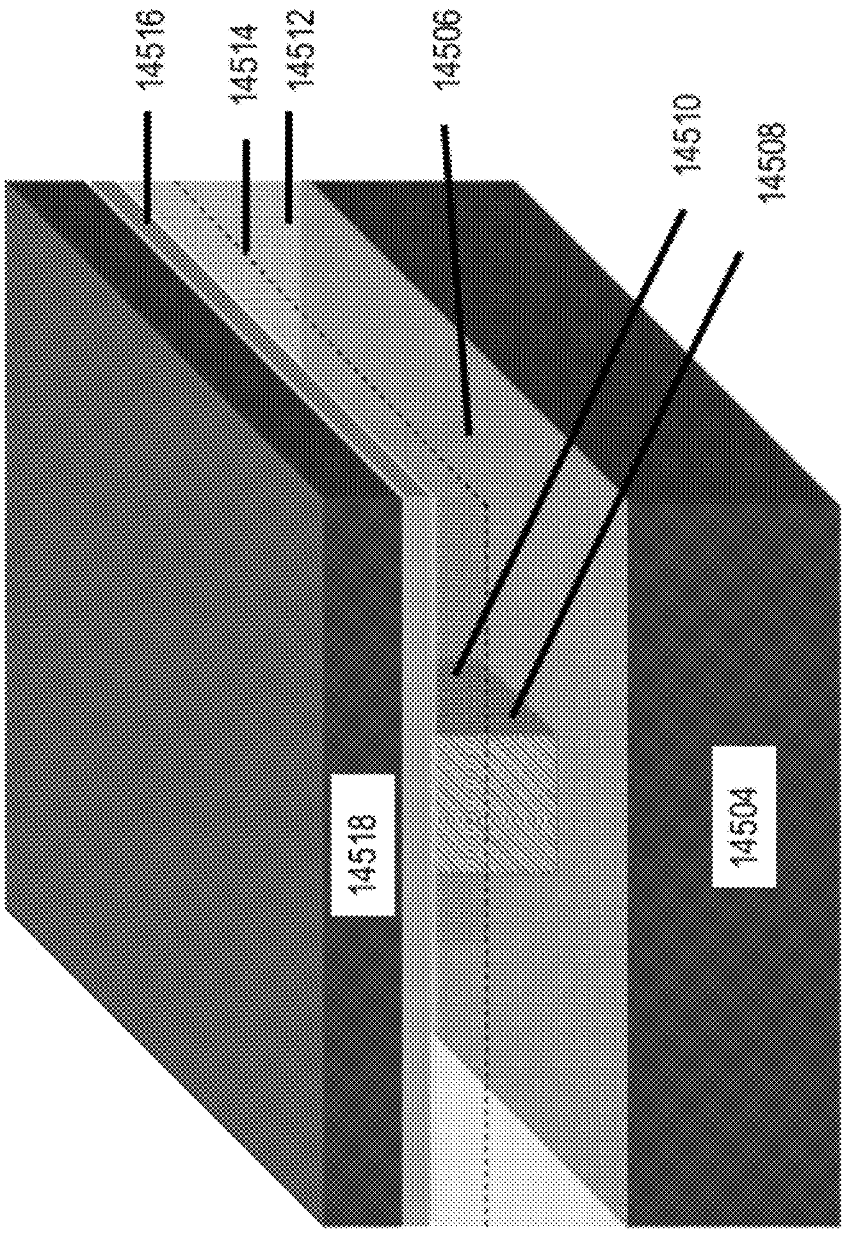

Step (H) is illustrated in FIG. 145H. The structure shown in FIG. 145G may be flipped and bonded atop the structure shown in FIG. 145F using oxide-to-oxide bonding.

Figure 145I:
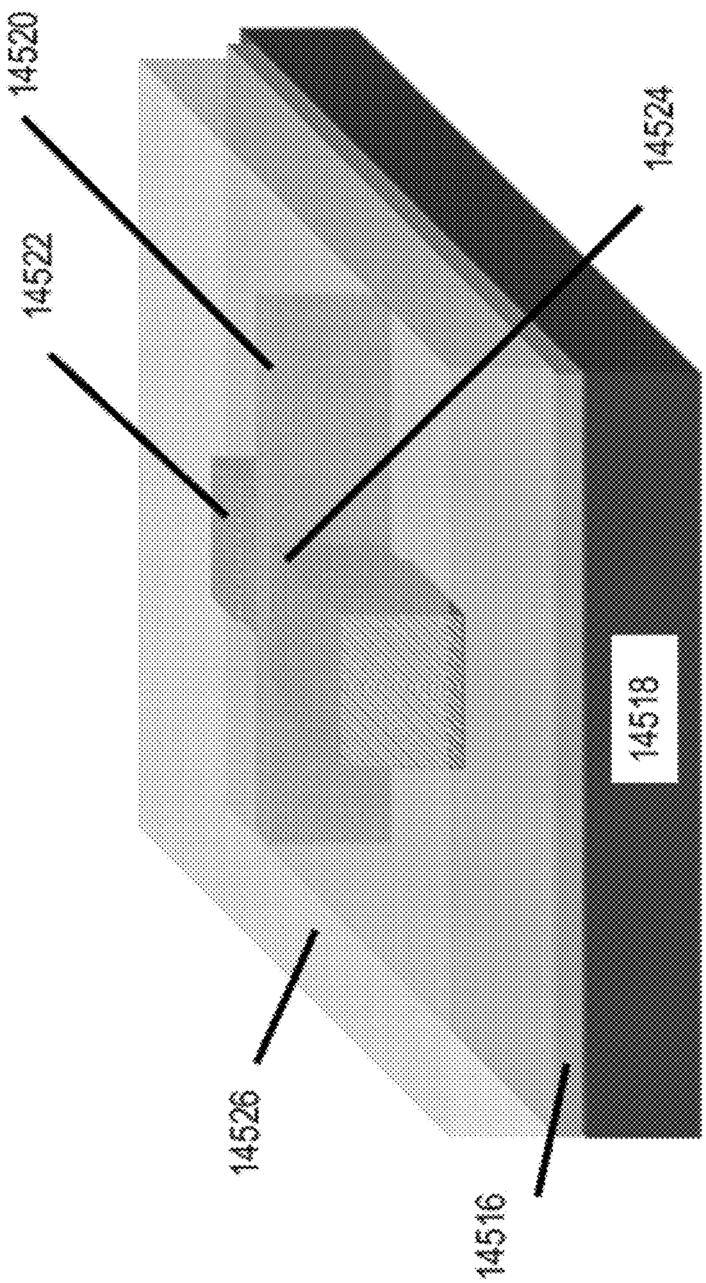
Figure 145J:
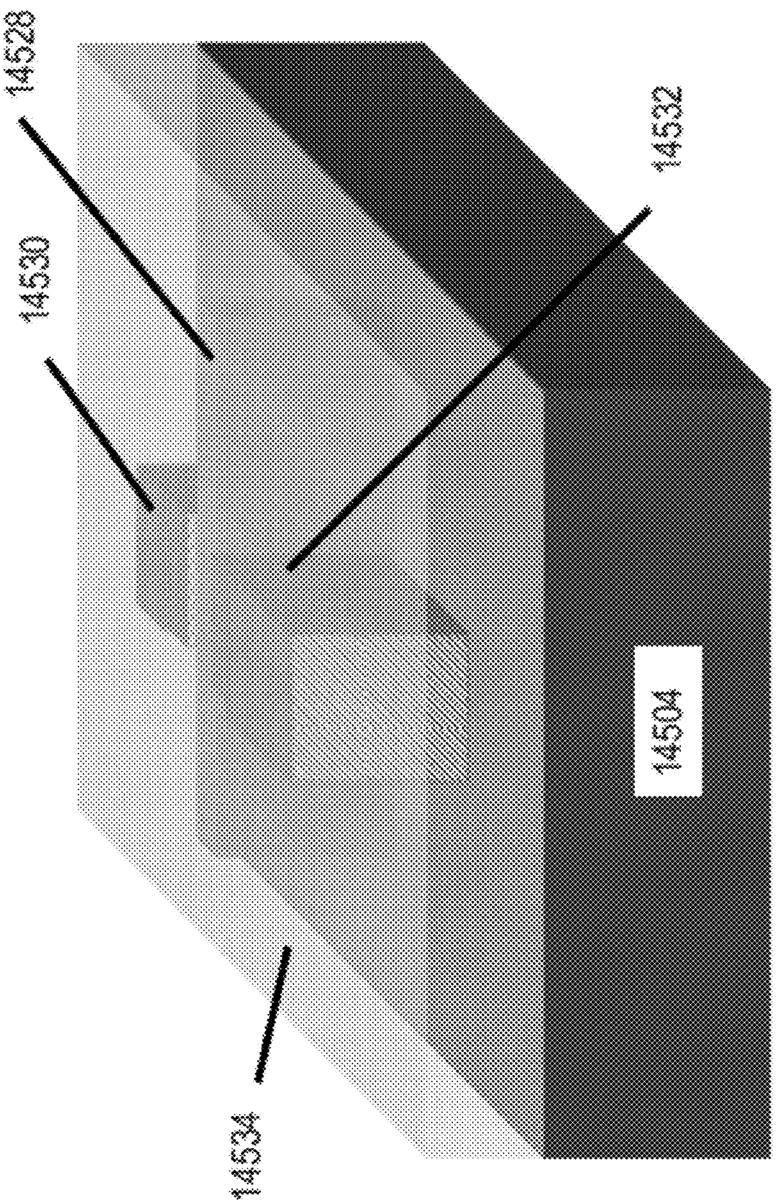

Step (I) is illustrated in FIG. 145I and FIG. 145J. The structure shown in FIG. 145H may be cleaved at hydrogen plane 14514 using a sideways mechanical force. Alternatively, a thermal anneal, such as, for example, furnace or spike, could be used for the cleave process. Following the cleave process, CMP steps may be done to planarize surfaces. FIG. 145I shows silicon wafer/substrate 14518 having an oxide layer 14516 and patterned features transferred atop it. These patterned features may include gate dielectric regions 14524, gate electrode regions 14522, n+ silicon channel 14520 and silicon dioxide regions 14526. These patterned features may be used for further fabrication, with contacts, interconnect levels and other steps of the fabrication flow being completed. FIG. 145J shows the p− silicon region 14504 on p− Silicon wafer/substrate 14502 (not shown) having patterned transistor layers. These patterned transistor layers may include gate dielectric regions 14532, gate electrode regions 14530, n+ silicon regions 14528 and silicon dioxide regions 14534. The structure in FIG. 145J may be used for transferring patterned layers to other substrates similar to the one shown in FIG. 145G using processes similar to those described in FIG. 145F-J. For example, a set of patterned features created with lithography steps once (such as the one shown in FIG. 145E) may be layer transferred to many wafers, thereby removing the requirement for separate lithography steps for each wafer. Lithography cost can be reduced significantly using this approach.

Implanting hydrogen through the gate dielectric regions 14510 in FIG. 145F may not degrade the dielectric quality, since the area exposed to implant species may be small (a gate dielectric is typically 2 nm thick, and the channel length may be typically <about 20 nm, so the exposed area to the implant species may be just about 40 sq. nm). Additionally, a thermal anneal or oxidation after the cleave may repair the potential implant damage. Also, a post-cleave CMP polish to remove the hydrogen rich plane within the gate dielectric may be performed.

An alternative embodiment of this present invention may involve forming a dummy gate transistor structure, as previously described for the replacement gate process, for the structure shown in FIG. 145I. Post cleave, the gate electrode regions 14522 and the gate dielectric regions 14524 materials may be etched away and then the trench may be filled with a replacement gate dielectric and a replacement gate electrode.

In an alternative embodiment of the invention described in FIG. 145A-J, the silicon wafer/substrate 14518 in FIG. 145A-J may be a wafer with one or more pre-fabricated transistor and interconnect layers. Low temperature (less than about 400° C.) bonding and cleave techniques as previously described may be employed. In that scenario, 3D stacked logic chips may be formed with fewer lithography steps. Alignment schemes similar to those described previously may be used.

FIG. 146A-K describes an alternative embodiment of this invention, wherein a process flow is described in which a side gated monocrystalline Finfet may be formed with lithography steps shared among many wafers. The distinguishing characteristic of the Finfet is that the conducting channel is wrapped by a thin metal or semiconductor, such as silicon, “fin”, which may form the gate of the device. The thickness of the fin (measured in the direction from source to drain) determines the effective channel length of the device. Finfet may be used somewhat generically to describe any fin-based, multigate transistor architecture regardless of number of gates. The process flow for the silicon chip may include the following steps that may occur in sequence from Step (A) to Step (J). When the same reference numbers are used in different drawing figures (among FIG. 146A-K), they are used to indicate analogous, similar or identical structures to enhance the understanding of the embodiments of the invention by clarifying the relationships between the structures and embodiments presented in the various diagrams—particularly in relating analogous, similar or identical functionality to different physical structures.

Figure 146A:
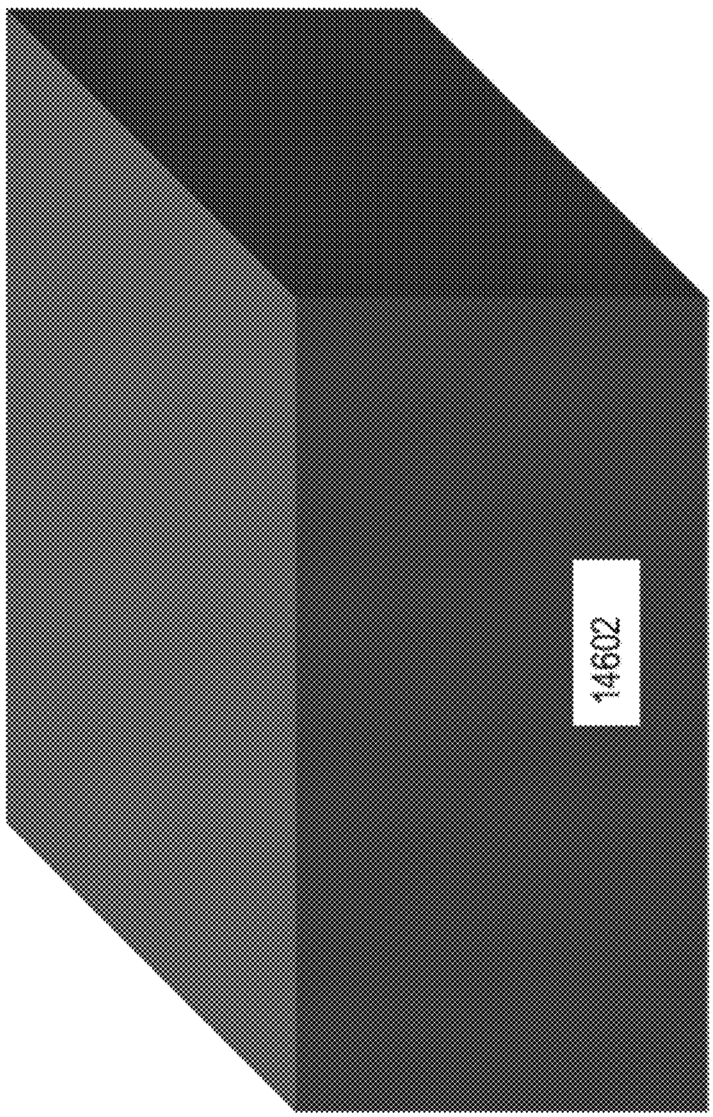

Step (A) is illustrated in FIG. 146A. An n− Silicon wafer/substrate 14602 may be taken.

Figure 146B:
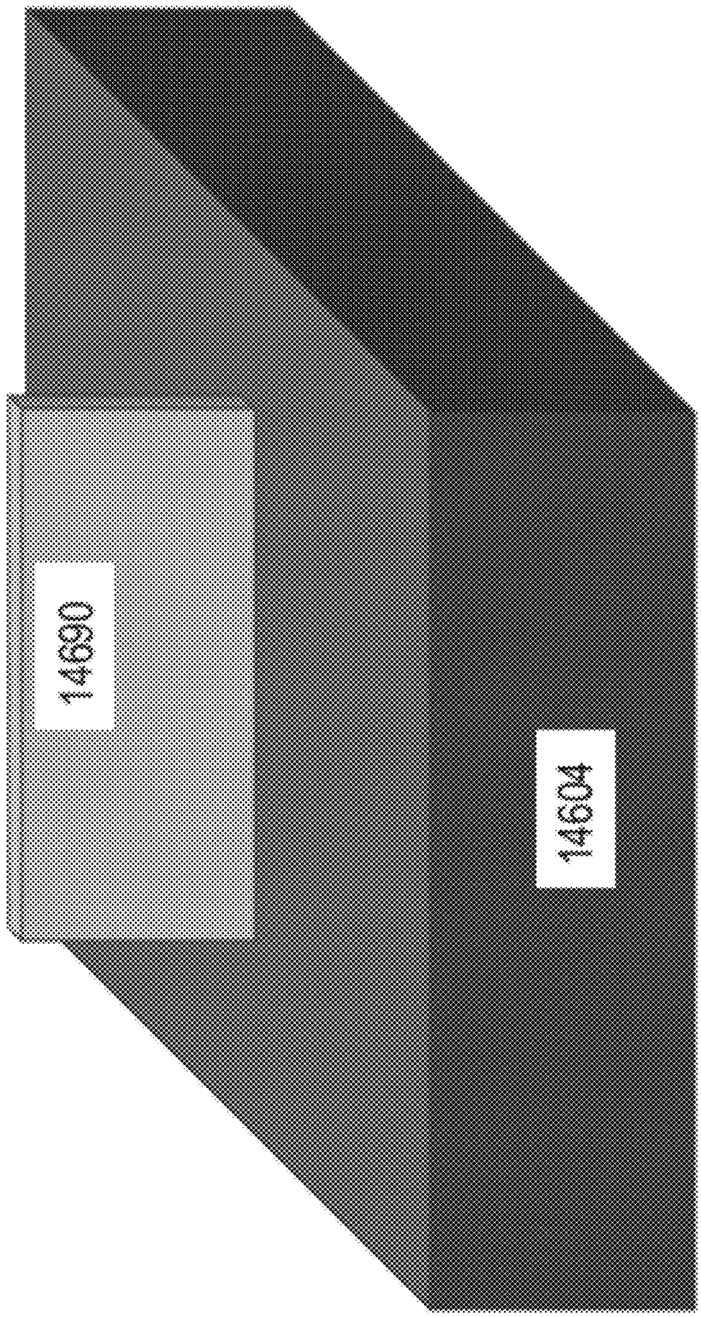

Step (B) is illustrated in FIG. 146B. P type dopant, such as, for example, Boron ions, may be implanted into the n− Silicon wafer/substrate 14602 of FIG. 146A. A thermal anneal, such as, for example, rapid, furnace, spike, flash, or laser may then be done to activate dopants. Following this, a lithography and etch process may be conducted to define n− silicon region 14604 and p− silicon region 14690. Regions with n− silicon, similar in structure and formation to p− silicon region 14690, where p-Finfets may be fabricated, are not shown.

Figure 146C:
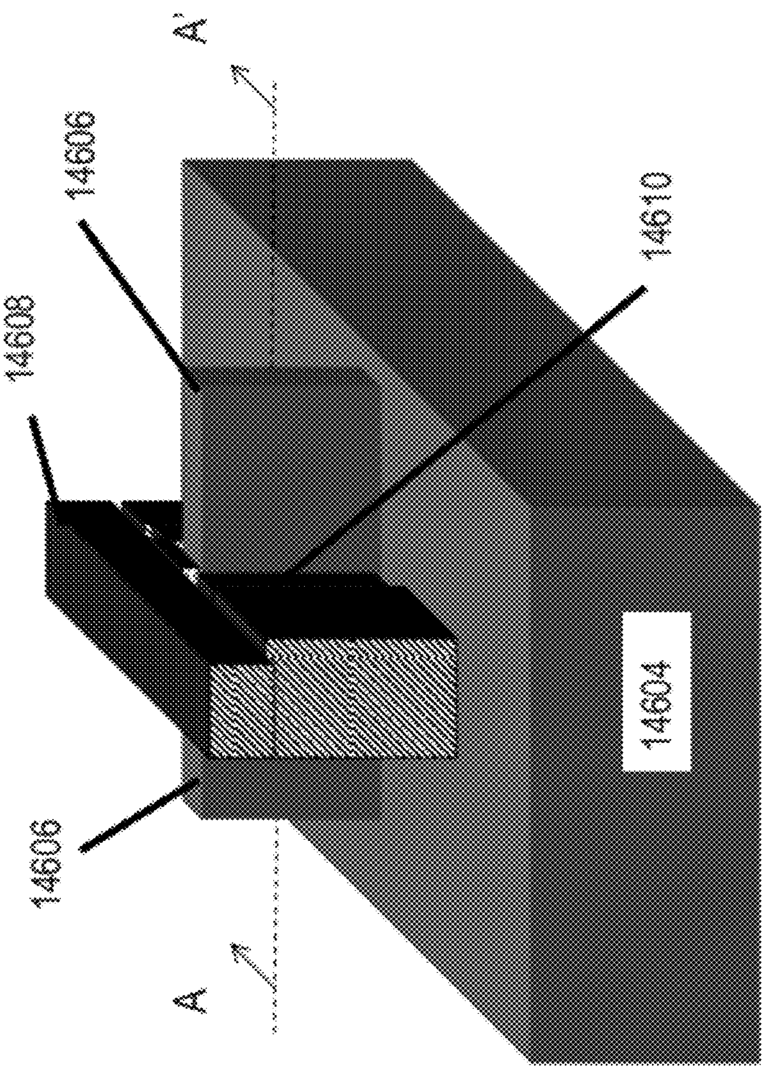
Figure 146D:
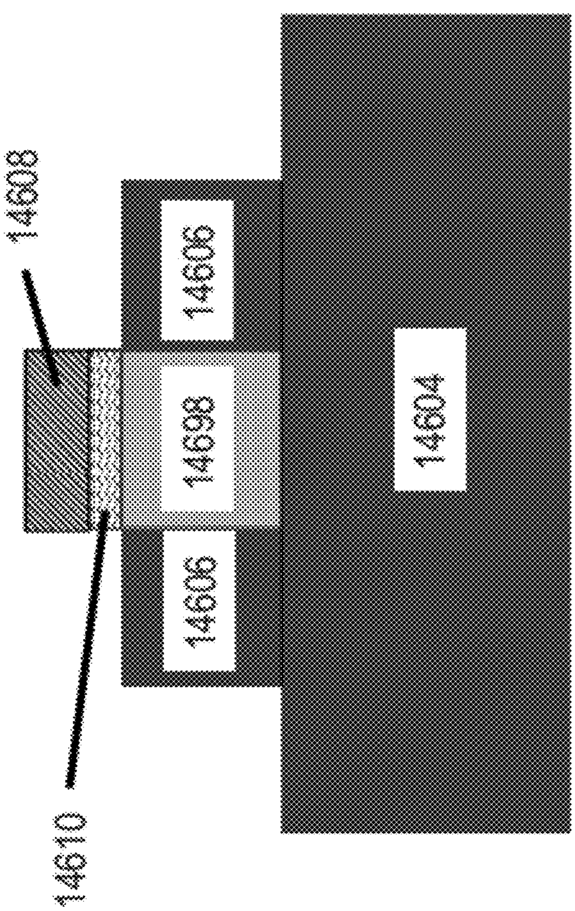

Step (C) is illustrated in FIG. 146C. Gate dielectric regions 14610 and gate electrode regions 14608 may be formed by oxidation or deposition of a gate dielectric, then deposition of a gate electrode, polishing with CMP, and then lithography and etch. The gate electrode regions 14608 may be, for example, doped polysilicon. Alternatively, various hi-k metal gate (HKMG) materials could be utilized for gate dielectric and gate electrode as described previously. N+ dopants, such as, for example, Arsenic, Antimony or Phosphorus, may then be implanted to form source and drain regions of the Finfet. The n+ doped source and drain regions may be indicated as 14606. FIG. 146D shows a cross-section of FIG. 146C along the AA' direction. P− doped region 14698 can be observed, as well as n+ doped source and drain regions 14606, gate dielectric regions 14610, gate electrode regions 14608, and n− silicon region 14604.

Figure 146E:
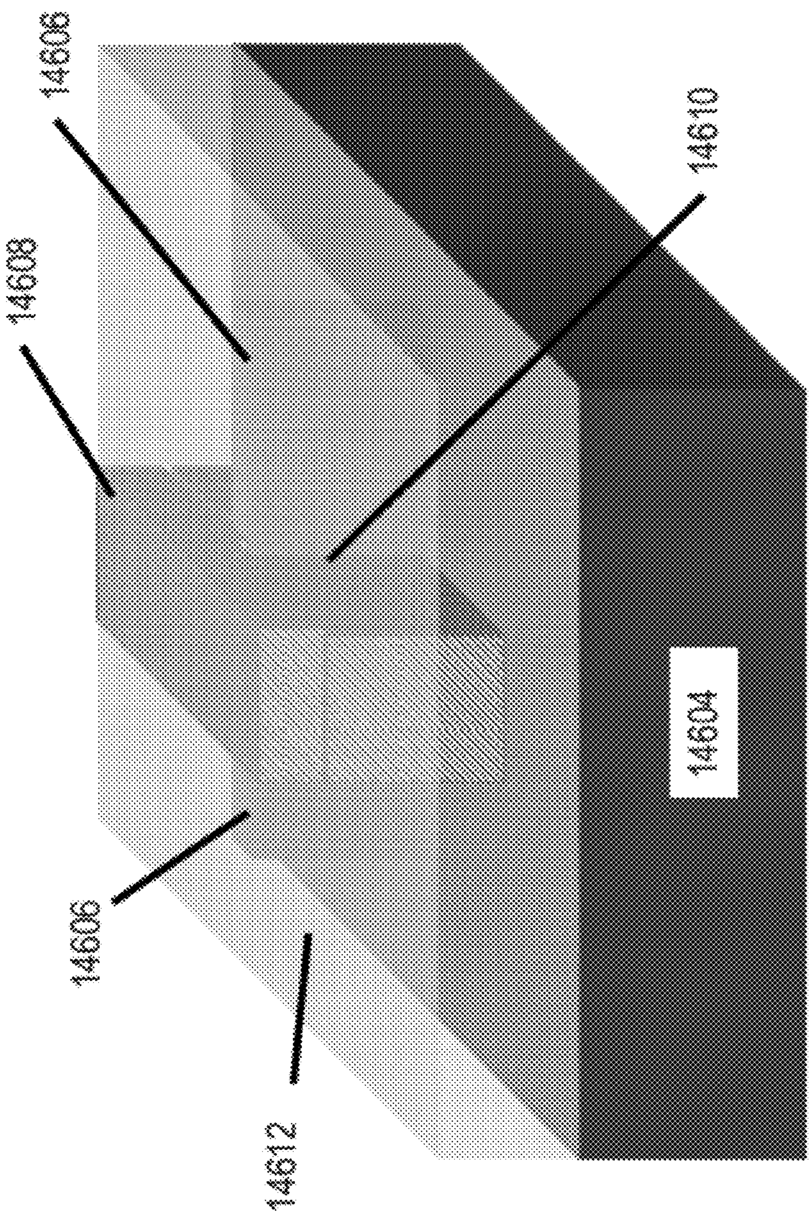

Step (D) is illustrated in FIG. 146E. Oxide regions 14612, for example, silicon dioxide, may be formed by deposition and may then be planarized and polished with CMP such that the oxide regions 14612 cover n+ silicon region 14604, n+ doped source and drain regions 14606, gate electrode regions 14608, p− doped region 14698, and gate dielectric regions 14610.

Figure 146F:
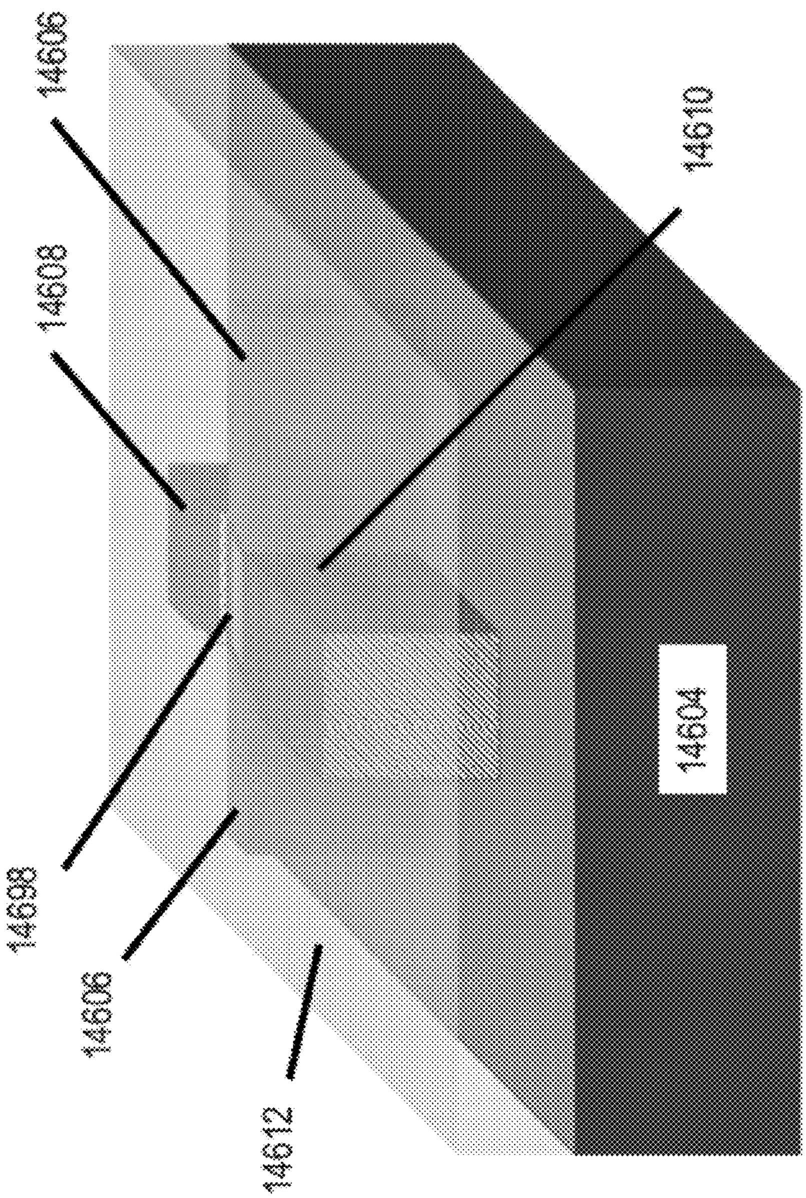

Step (E) is illustrated in FIG. 146F. The structure shown in FIG. 146E may be further polished with CMP such that portions of oxide regions 14612, gate electrode regions 14608, gate dielectric regions 14610, p− doped regions 14698, and n+ doped source and drain regions 14606 are polished. Following this, a silicon dioxide layer may be deposited over the structure.

Figure 146G:
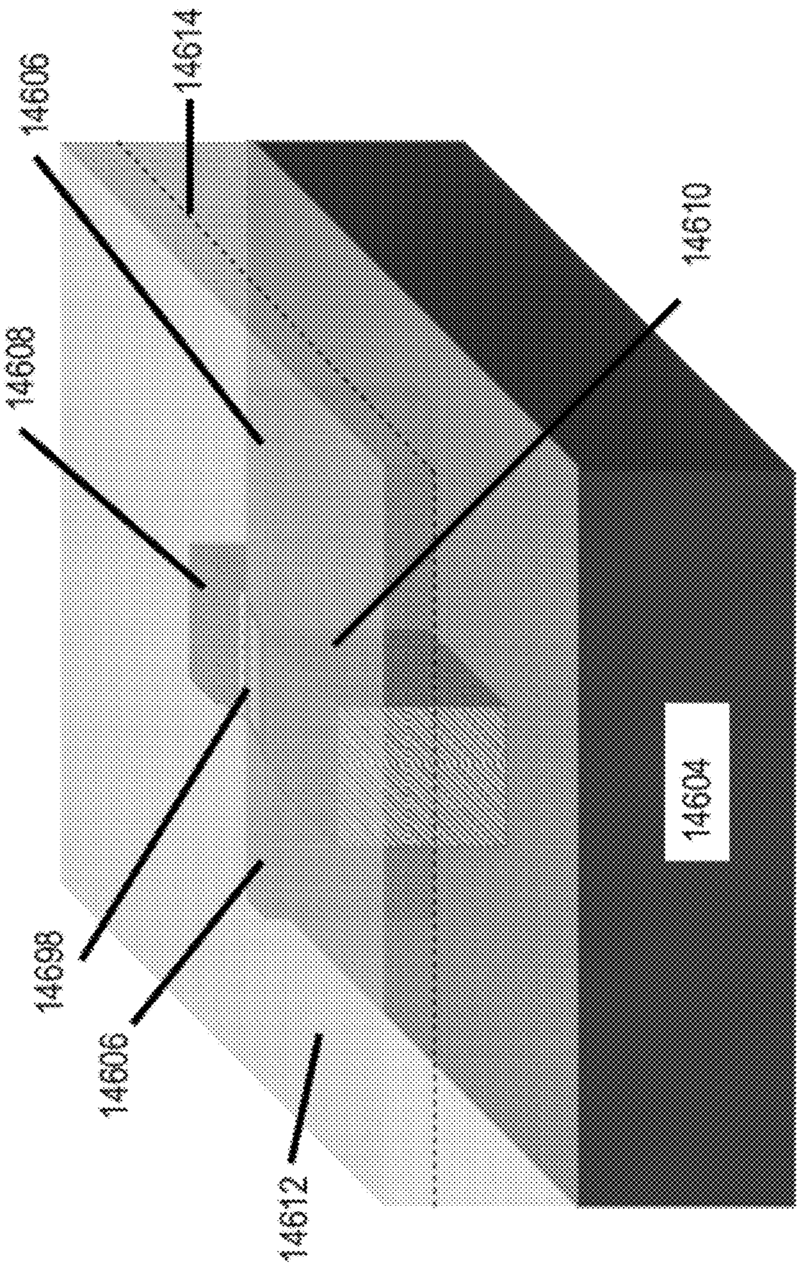

Step (F) is illustrated in FIG. 146G. Hydrogen H+ may be implanted into the structure at a certain depth creating hydrogen plane 14614 indicated by dotted lines.

Figure 146H:
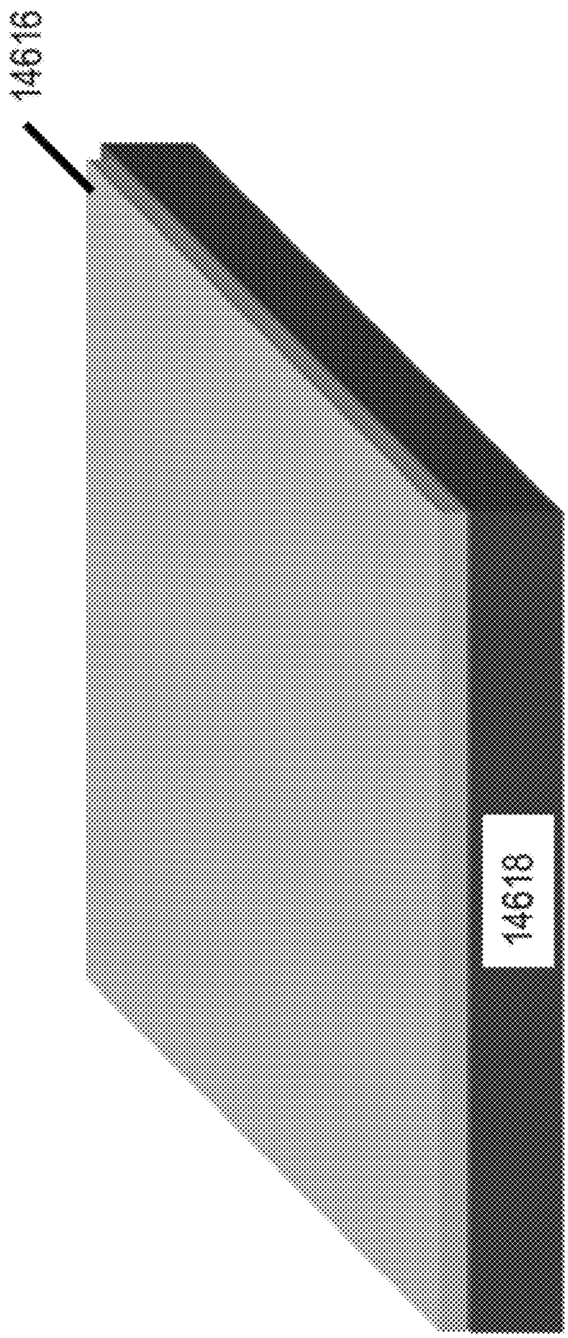

Step (G) is illustrated in FIG. 146H. A silicon wafer 14618 may have an oxide layer 14616, for example, silicon dioxide, deposited atop it.

Figure 146I:
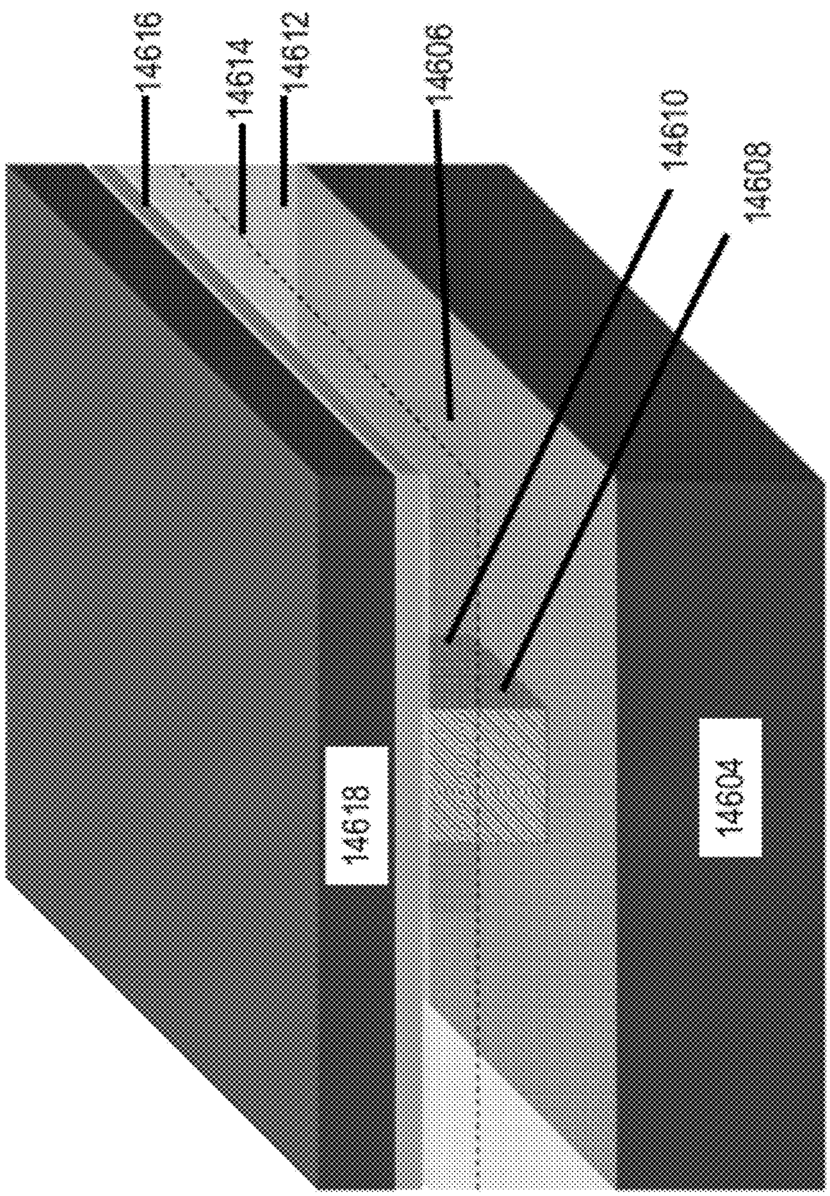

Step (H) is illustrated in FIG. 146I. The structure shown in FIG. 146H may be flipped and bonded atop the structure shown in FIG. 145G using oxide-to-oxide bonding.

Figure 146J:
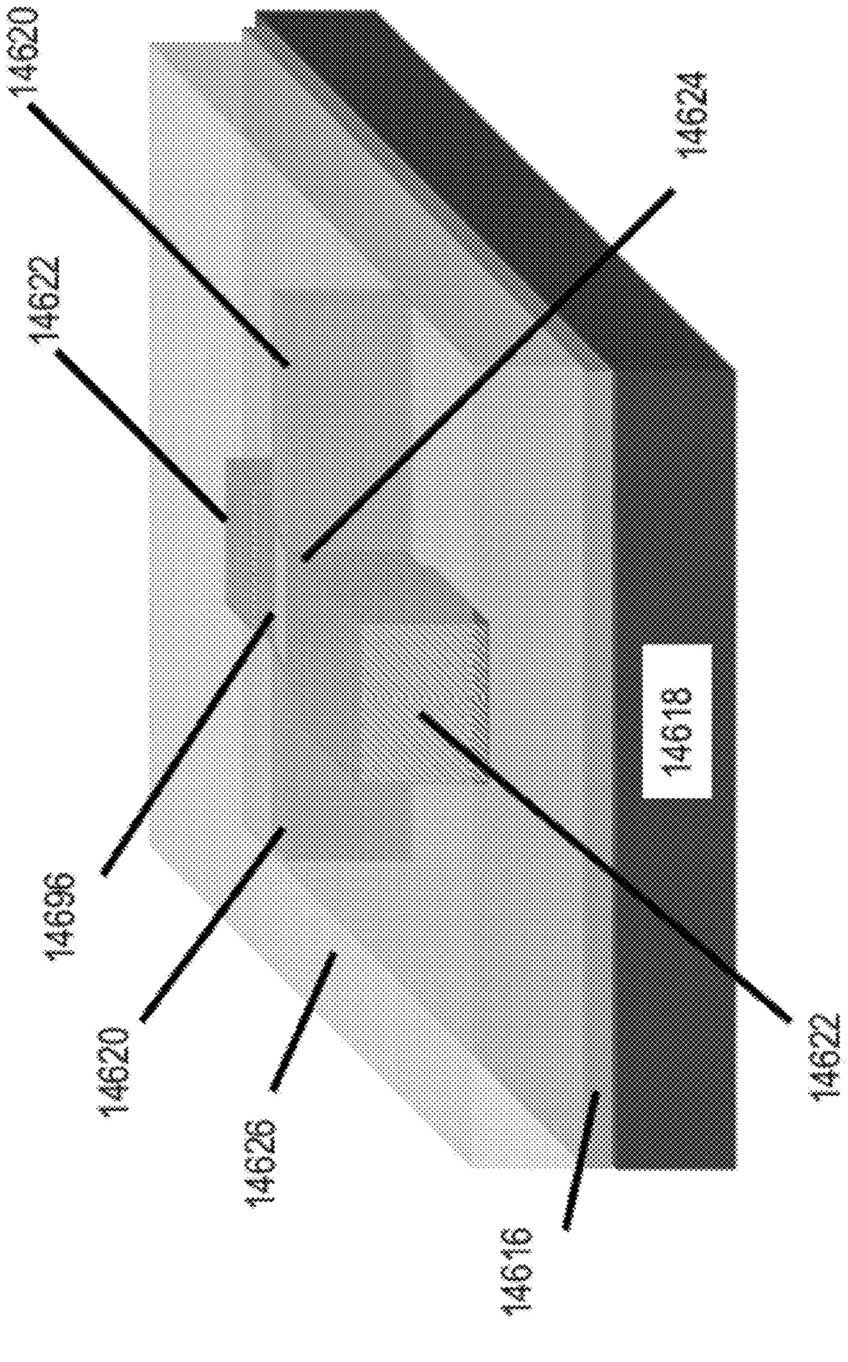
Figure 146K:
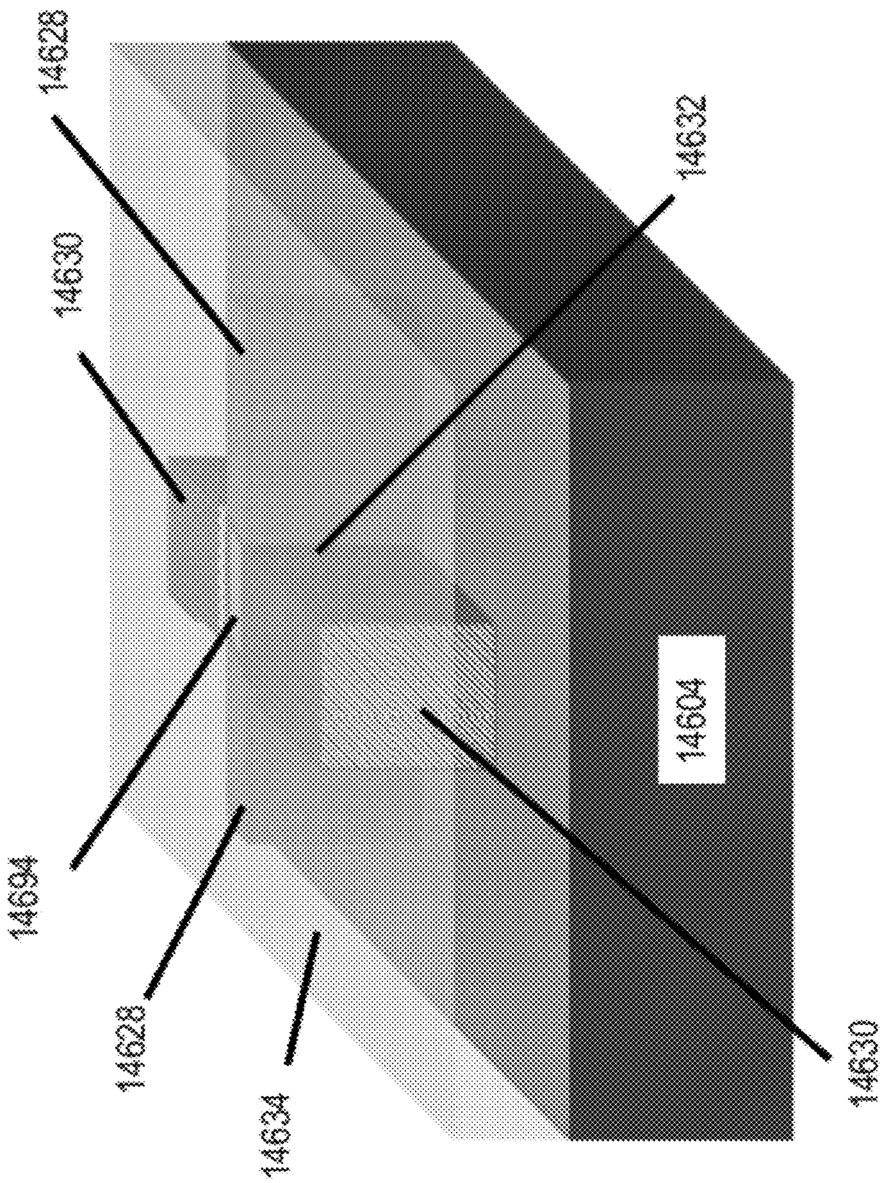

Step (I) is illustrated in FIG. 146J and FIG. 146K. The structure shown in FIG. 146J may be cleaved at hydrogen plane 14614 using a sideways mechanical force. Alternatively, a thermal anneal, such as, for example, furnace or spike, could be used for the cleave process. Following the cleave process, CMP processes may be done to planarize surfaces. FIG. 146J shows silicon wafer 14618 having an oxide layer 14616 and patterned features transferred atop it. These patterned features may include gate dielectric regions 14624, gate electrode regions 14622, n+ silicon region 14620, p− silicon region 14696 and silicon dioxide regions 14626. These patterned features may be used for further fabrication, with contacts, interconnect levels and other steps of the fabrication flow being completed. FIG. 146K shows the n+ silicon region 14604 on n− Silicon wafer/substrate 14602 (not shown) having patterned transistor layers. These patterned transistor layers may include gate dielectric regions 14632, gate electrode regions 14630, n+ silicon regions 14628, p− silicon region 14694, and silicon dioxide regions 14634. The structure in FIG. 146K may be used for transferring patterned layers to other substrates similar to the one shown in FIG. 146H using processes similar to those described in FIG. 146G-K. For example, a set of patterned features created with lithography steps once (such as the one shown in FIG. 146F) may be layer transferred to many wafers, thereby removing the requirement for separate lithography steps for each wafer. Lithography cost can be reduced significantly using this approach.

Implanting hydrogen through the gate dielectric regions 14610 in FIG. 146G may not degrade the dielectric quality, since the area exposed to implant species may be small (a gate dielectric is typically about 2 nm thick, and the channel length is typically less than about 20 nm, so the exposed area to the implant species is about 40 sq. nm). Additionally, a thermal anneal or oxidation after the cleave may repair the potential implant damage. Also, a post-cleave CMP polish to remove the hydrogen rich plane within the gate dielectric may be performed.

An alternative embodiment of the invention may involve forming a dummy gate transistor structure, as previously described for the replacement gate process, for the structure shown in FIG. 146J. Post cleave, the gate electrode regions 14622 and the gate dielectric regions 14624 materials may be etched away and then the trench may be filled with a replacement gate dielectric and a replacement gate electrode.

In an alternative embodiment of the invention described in FIG. 146A-K, the substrate silicon wafer 14618 in FIG. 146A-K may be a wafer with one or more pre-fabricated transistor and interconnect layers. Low temperature (less than about 400° C.) bonding and cleave techniques as previously described may be employed. In that scenario, 3D stacked logic chips may be formed with fewer lithography steps. Alignment schemes similar to those described previously may be used.

FIG. 147A-G describe another embodiment of the invention as a process flow in which a planar transistor may be formed with lithography steps shared among many wafers. The process flow for the silicon chip may include the following steps that occur in sequence from Step (A) to Step (F). When the same reference numbers are used in different drawing figures (among FIG. 147A-G), they are used to indicate analogous, similar or identical structures to enhance the understanding of the embodiments of the present invention by clarifying the relationships between the structures and embodiments presented in the various diagrams—particularly in relating analogous, similar or identical functionality to different physical structures.

Figure 147A:
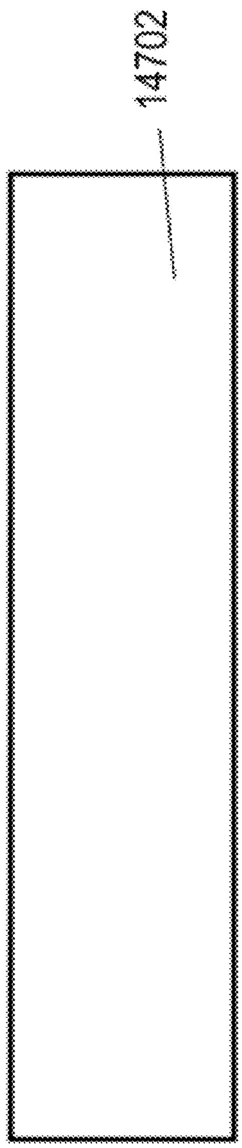

Step (A) is illustrated in FIG. 147A. A p− silicon wafer 14702 may be taken.

Figure 147B:
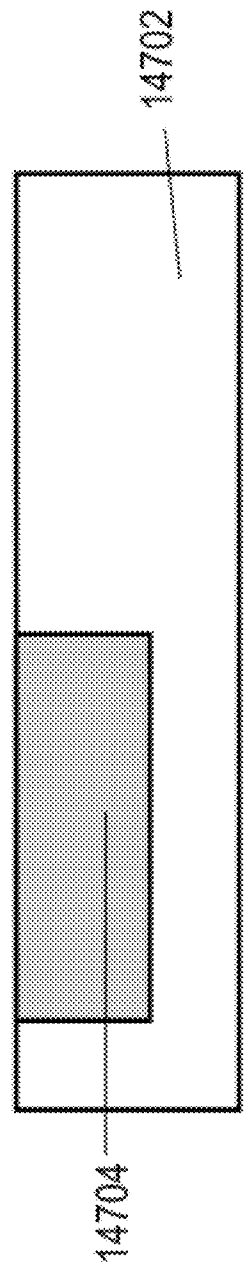

Step (B) is illustrated in FIG. 147B. An n well implant opening may be lithographically defined and n type dopants, such as, for example, Arsenic or Phosphorous, may be ion implanted into the p− silicon wafer 14702. A thermal anneal, such as, for example, rapid, furnace, spike, or laser may be done to activate the implanted dopants. Thus, n-well region 14704 may be formed.

Figure 147C:
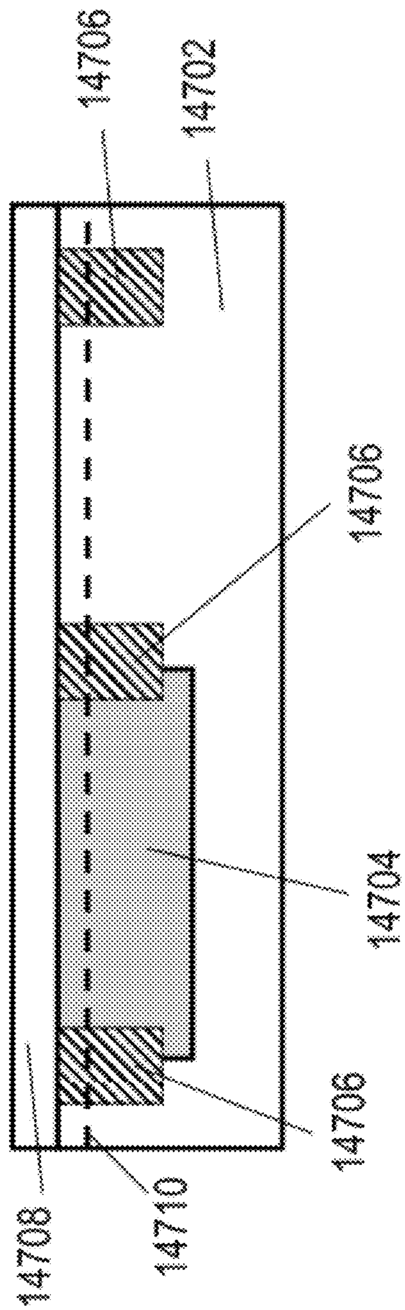

Step (C) is illustrated in FIG. 147C. Shallow trench isolation regions 14706 may be formed, after which an oxide layer 14708 may be grown or deposited. Following this, hydrogen H+ ions may be implanted into the wafer at a certain depth creating hydrogen plane 14710 indicated by dotted lines.

Figure 147D:
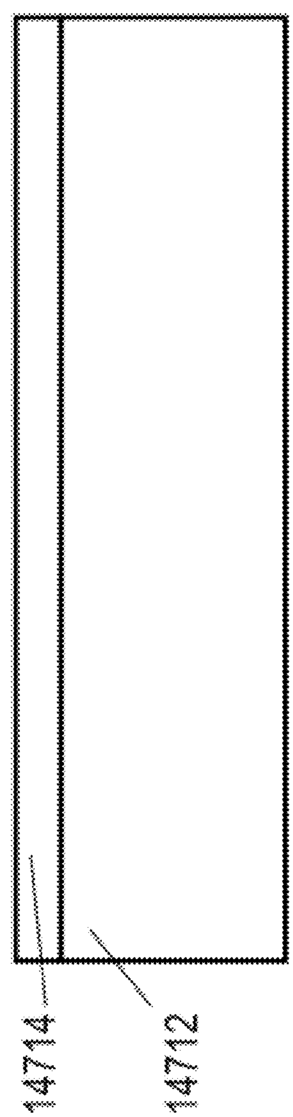

Step (D) is illustrated in FIG. 147D. A silicon wafer 14712 may be taken and an oxide layer 14714 may be deposited or grown atop it.

Figure 147E:
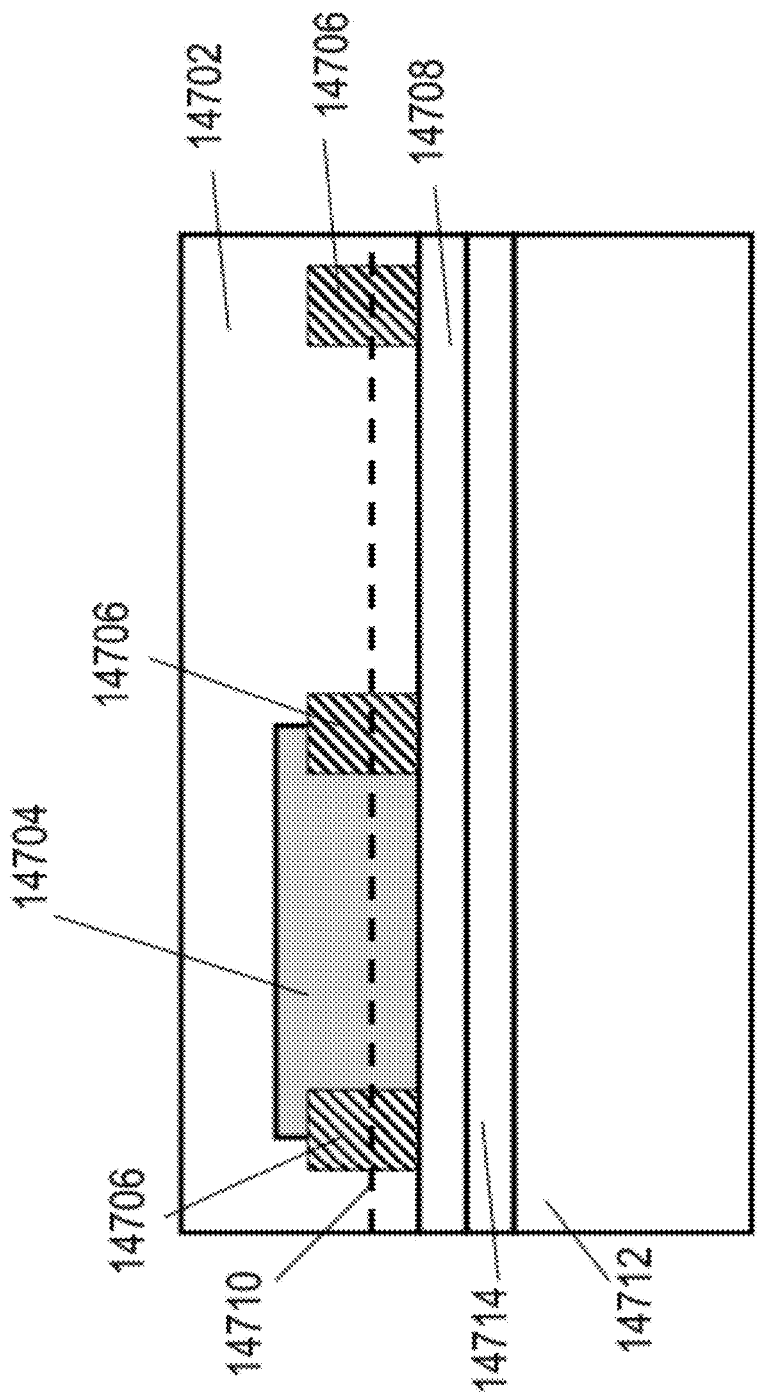

Step (E) is illustrated in FIG. 147E. The structure shown in FIG. 147C may be flipped and bonded atop the structure shown in FIG. 147D using oxide-to-oxide bonding of layers 14714 and 14708.

Figure 147F:
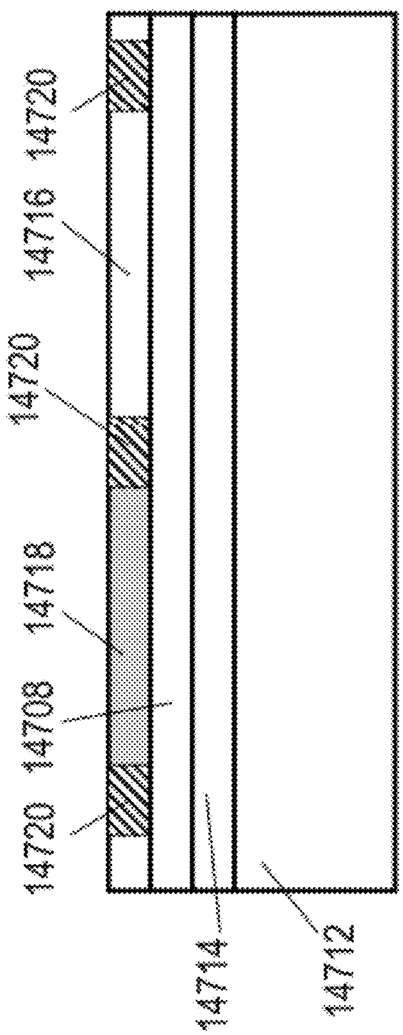
Figure 147G:
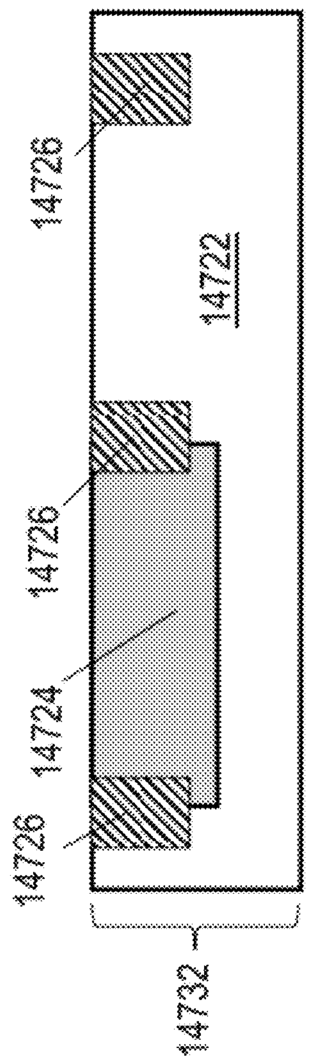

Step (F) is illustrated in FIG. 147F and FIG. 147G. The structure shown in FIG. 147E may be cleaved at hydrogen plane 14710 using a sideways mechanical force. Alternatively, a thermal anneal, such as, for example, furnace or spike, could be used for the cleave process. Following the cleave process, CMP processes may be used to planarize and polish surfaces of both silicon wafers 14712 and 14732. FIG. 147F shows a silicon-on-insulator wafer formed after the cleave and CMP process where p type regions 14716, n type regions 14718 and shallow trench isolation regions 14720 may be formed atop oxide regions 14708 and 14714 and silicon wafer 14712. Transistor fabrication may then be completed on the structure shown in FIG. 147F, following which metal interconnects may be formed. FIG. 147G shows wafer 14732 formed after the cleave and CMP process which may include p− silicon regions 14722, n well region 14724 and shallow trench isolation regions 14726. These features may be layer transferred to other wafers similar to the one shown in FIG. 147D using processes similar to those shown in FIG. 147E-G. For example, a single set of patterned features created with lithography steps once may be layer transferred onto many wafers thereby saving lithography cost.

In an alternative embodiment of the invention described in FIG. 147A-G, the substrate silicon wafer 14712 in FIG. 147A-G may be a wafer with one or more pre-fabricated transistor and metal interconnect layers. Low temperature (less than about 400° C.) bonding and cleave techniques as previously described may be employed. In that scenario, 3D stacked logic chips may be formed with fewer lithography steps. Alignment schemes similar to those described previously may be used.

FIG. 148A-H describes another embodiment of this present invention, wherein 3D integrated circuits may be formed with fewer lithography steps. The process flow for the silicon chip may include the following steps that occur in sequence from Step (A) to Step (G). When the same reference numbers are used in different drawing figures (among FIG. 148A-H), they are used to indicate analogous, similar or identical structures to enhance the understanding of the present invention by clarifying the relationships between the structures and embodiments presented in the various diagrams—particularly in relating analogous, similar or identical functionality to different physical structures.

Figure 148A:
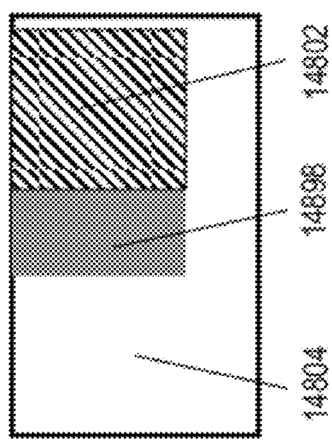

Step (A) is illustrated in FIG. 148A. A p silicon wafer may have n type silicon wells formed in it using standard procedures following which a shallow trench isolation may be formed. 14804 denotes p silicon regions, 14802 may denote n silicon regions and 14898 denotes shallow trench isolation regions.

Figure 148B:
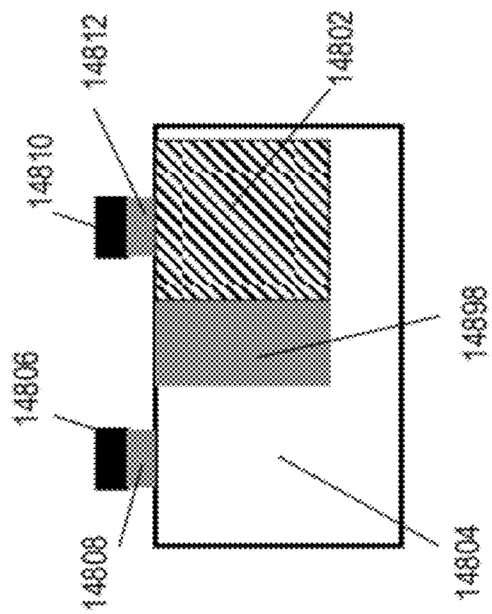

Step (B) is illustrated in FIG. 148B. Dummy gates may be constructed with silicon dioxide and polycrystalline silicon (polysilicon). The term "dummy gates" may be used since these gates will be replaced by high k gate dielectrics and metal gates later in the process flow, according to the standard replacement gate (or gate-last) process. This replacement gate process may also be called a gate replacement process. Further details of replacement gate processes may be described in "A 45 nm Logic Technology with High-k+Metal Gate Transistors, Strained Silicon, 9 Cu Interconnect Layers, 193 nm Dry Patterning, and 100% Pb-free Packaging," IEDM Tech. Dig., pp. 247-250, 2007 by K. Mistry, et al. and "Ultralow-EOT (5 Å) Gate-First and Gate-Last High Performance CMOS Achieved by Gate-Electrode Optimization," IEDM Tech. Dig., pp. 663-666, 2009 by L. Ragnarsson, et al. 14806 and 14810 may be polysilicon gate electrodes while 14808 and 14812 may be silicon dioxide dielectric layers.

Figure 148D:
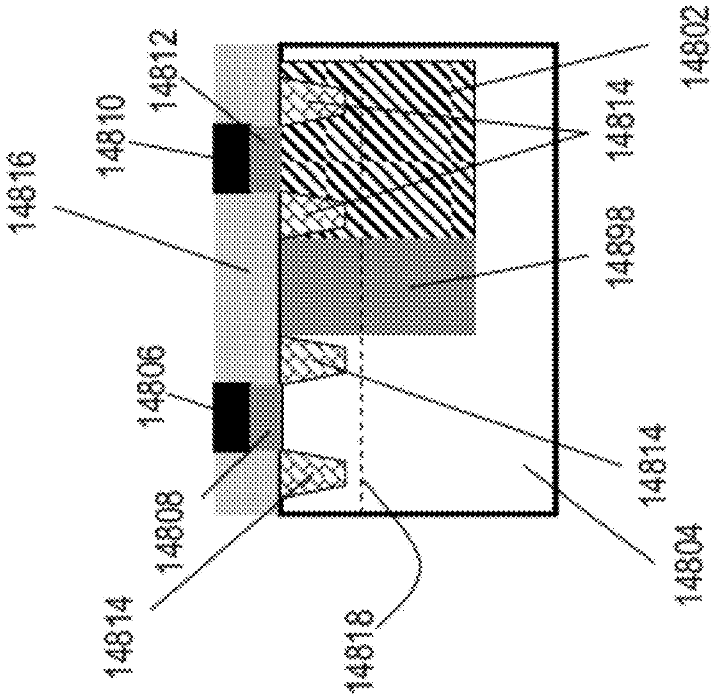
Figure 148C:
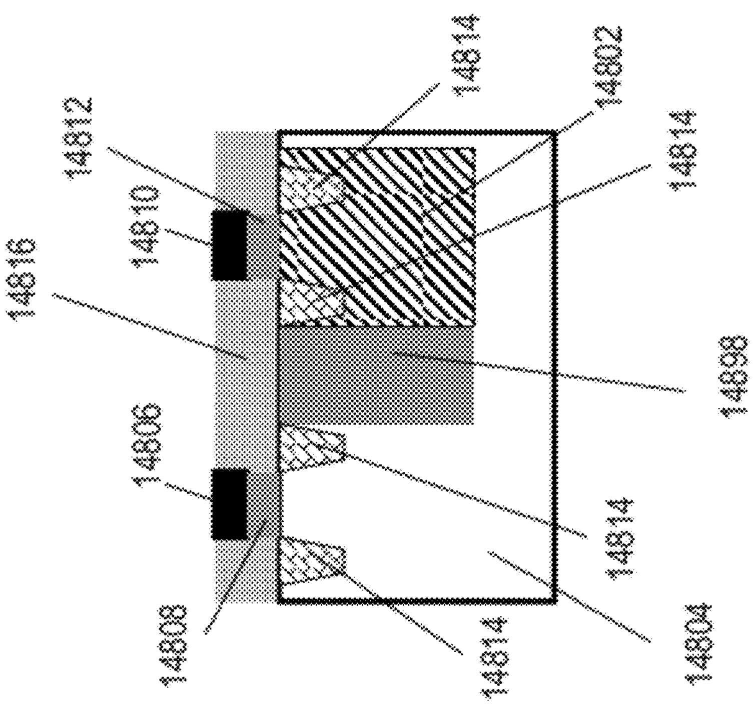

Step (C) is illustrated in FIG. 148C. The remainder of the gate-last transistor fabrication flow up to just prior to gate replacement may proceed with the formation of source-drain regions 14814, strain enhancement layers to improve mobility (not shown), high temperature anneal to activate source-drain regions 14814, formation of inter-layer dielectric (ILD) 14816, and so forth.

Step (D) is illustrated in FIG. 148D. Hydrogen may be implanted into the wafer creating hydrogen plane 14818 indicated by dotted lines.

Figure 148F:
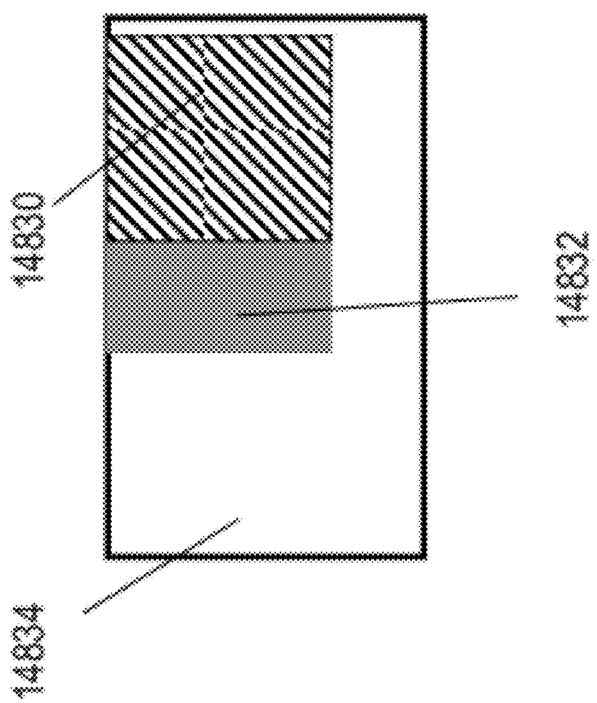
Figure 148E:
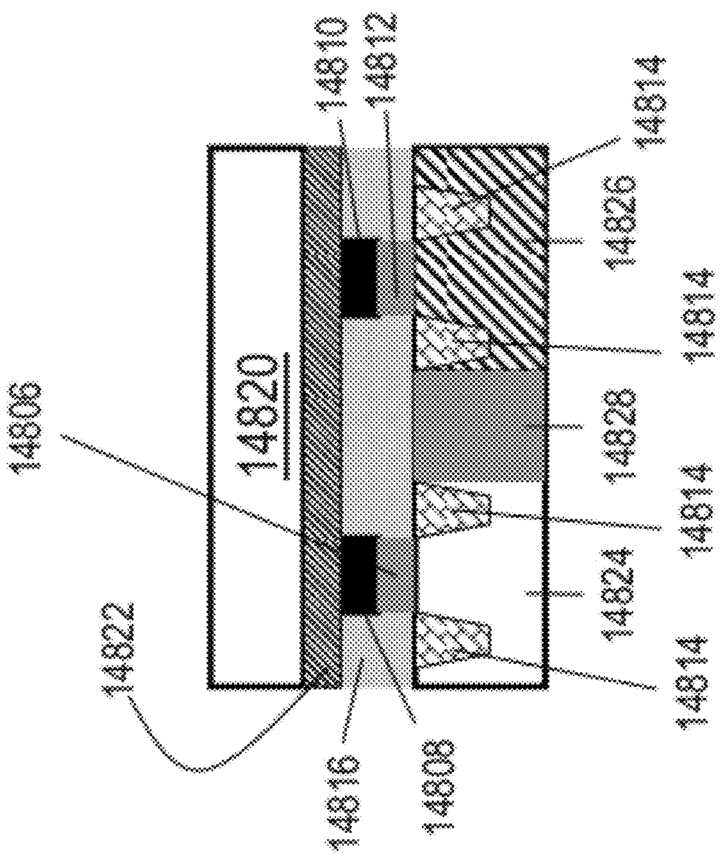

Step (E) is illustrated in FIG. 148E. The wafer after step (D) may be bonded to a temporary carrier wafer 14820 using a temporary bonding adhesive 14822. This temporary carrier wafer 14820 may be constructed of glass. Alternatively, it could be constructed of silicon. The temporary bonding adhesive 14822 may be a polymeric material, such as a polyimide. A thermal anneal or a sideways mechanical force may be utilized to cleave the wafer at the hydrogen plane 14818. A CMP process commences on the exposed surface of p silicon region 14804. 14824 may indicate a p silicon region, 14828 may indicate an oxide isolation region and 14826 may indicate an n silicon region after this process.

FIG. 148F shows the other portion of the cleaved structure after a CMP process. 14834 may indicate a p silicon region, 14830 may indicate an n silicon region and 14832 may indicate an oxide isolation region. The structure shown in FIG. 148F may be reused to transfer layers using process steps similar to those described with FIG. 148A-E to form structures similar to FIG. 148E. This may enable a significant reduction in lithography cost.

Figure 148H:
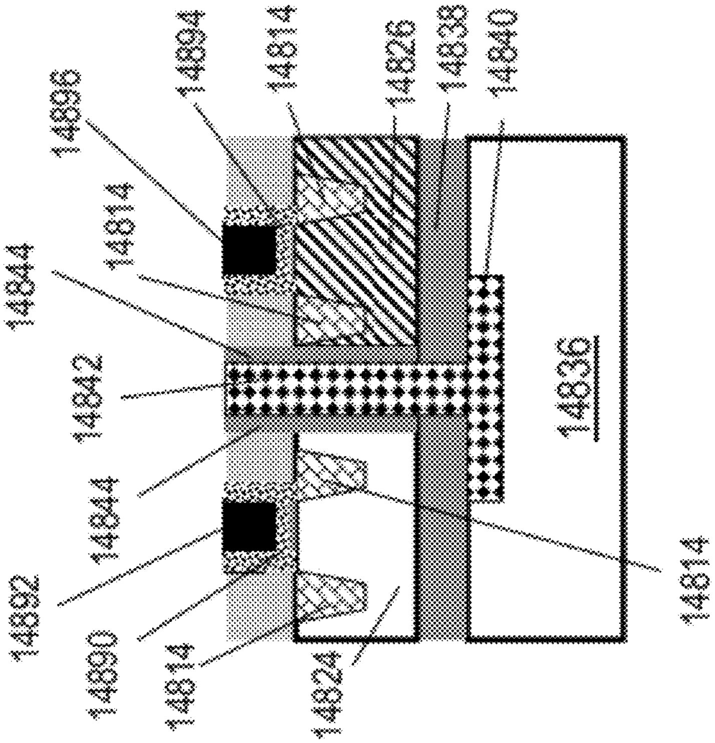
Figure 148G:
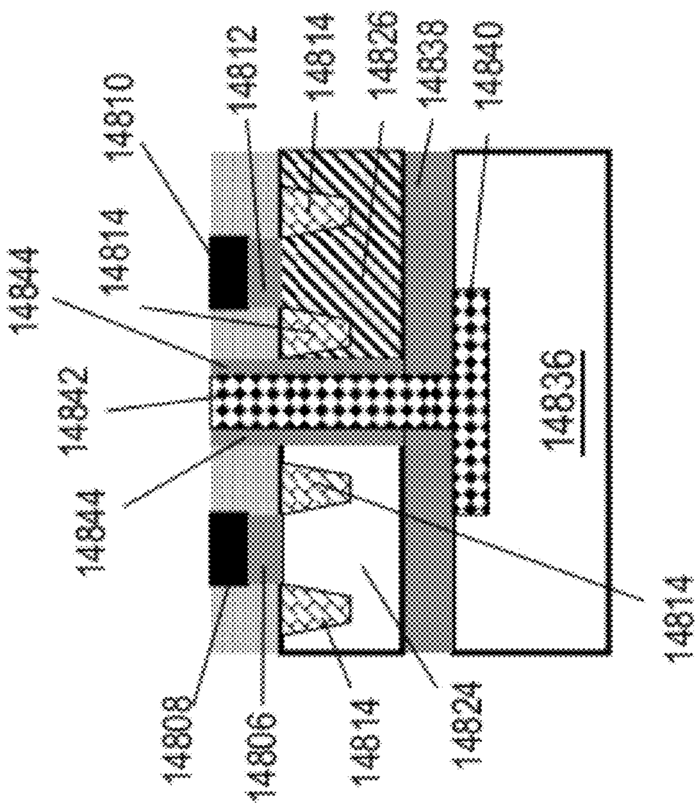

Step (F) may be illustrated in FIG. 148G: An oxide layer 14838 may be deposited onto the bottom of the wafer shown in Step (E). The wafer may then be bonded to the top surface of bottom layer of wires and transistors 14836 using oxide-to-oxide bonding. The bottom layer of wires and transistors 14836 could also be called a base wafer. The temporary carrier wafer 14820 may then be removed by shining a laser onto the temporary bonding adhesive 14822 through the temporary carrier wafer 14820 (which could be constructed of glass). Alternatively, a thermal anneal could be used to remove the temporary bonding adhesive 14822. Through-silicon connections 14842 with a non-conducting (e.g. oxide) liner 14844 to the landing pads 14840 in the base wafer may be constructed at a very high density using special alignment methods described herein, with reference to FIG. 73 through FIG. 80.

Step (G) may be illustrated in FIG. 148H. Dummy gates consisting of gate electrodes 14808 and 14810 and gate dielectrics 14806 and 14812 may be etched away, followed by the construction of a replacement with high k gate dielectrics 14890 and 14894 and metal gates 14892 and 14896. For example, partially-formed high performance transistors may be layer transferred atop the base wafer (may also be called target wafer) followed by the completion of the transistor processing with a low (sub 400° C.) process. The remainder of the transistor, contact, and wiring layers may then be constructed.

It will be appreciated by persons of ordinary skill in the art that alternative versions of this flow may be possible with various methods to attach temporary carriers and with various versions of the gate-last, or replacement gate, process flow.

Figure 9A:
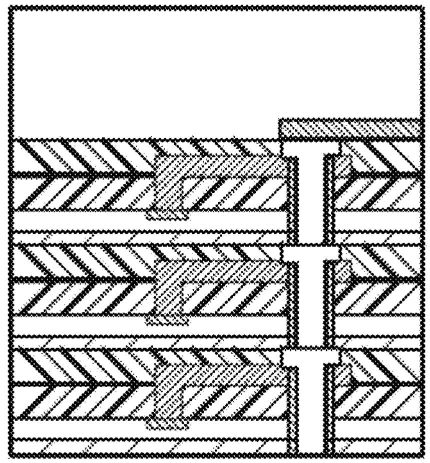
FIG. 9A-9C are a drawing illustration of an IC system utilizing Through Silicon Via of a prior art.
Figure 9B:
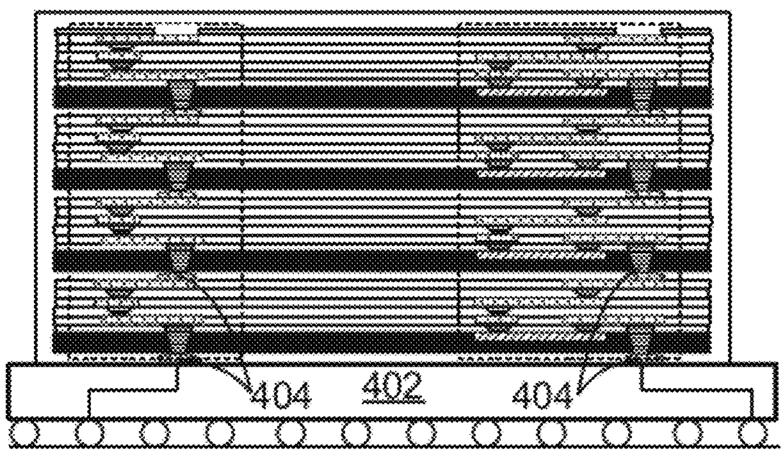
Figure 9C:
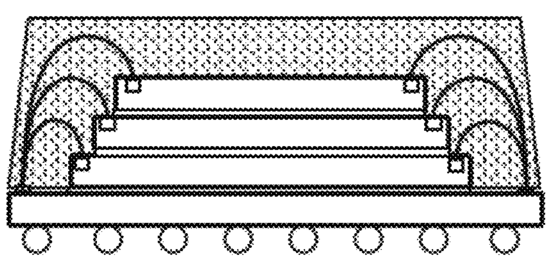

FIGS. 9A through 9C illustrates alternative configurations for three-dimensional—3D integration of multiple dies constructing IC system and utilizing Through Silicon Via. FIG. 9A illustrates an example in which the Through Silicon Via may be continuing vertically through substantially all the dies constructing a global cross-die connection.

FIG. 9B provides an illustration of similar sized dies constructing a 3D system. FIG. 9B shows that the Through Silicon Via 404 may be at the same relative location in substantially all the dies constructing a standard interface.

FIG. 9C illustrates a 3D system with dies having different sizes. FIG. 9C also illustrates the use of wire bonding from substantially all three dies in connecting the IC system to the outside.

Figure 10A:
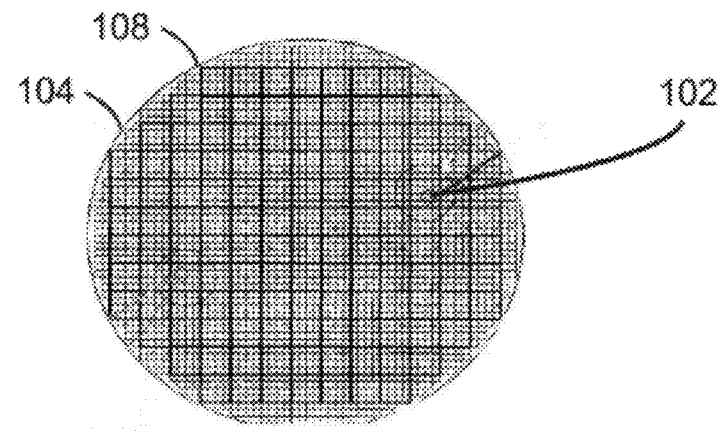
FIG. 10A is a drawing illustration of continuous array wafer of a prior art.
Figure 10B:
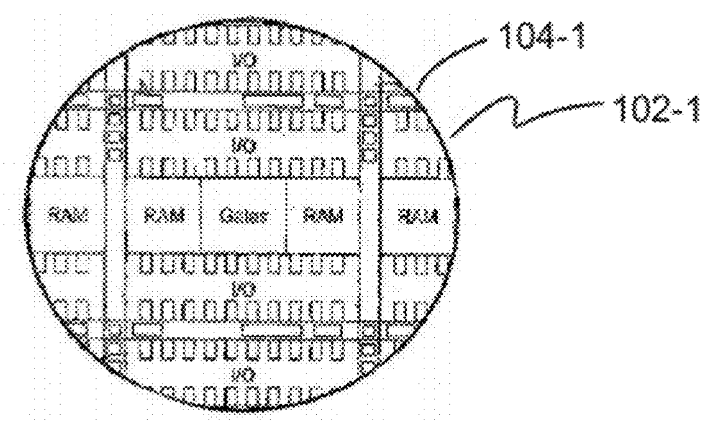
FIG. 10B is a drawing illustration of continuous array portion of wafer of a prior art.
Figure 10C:
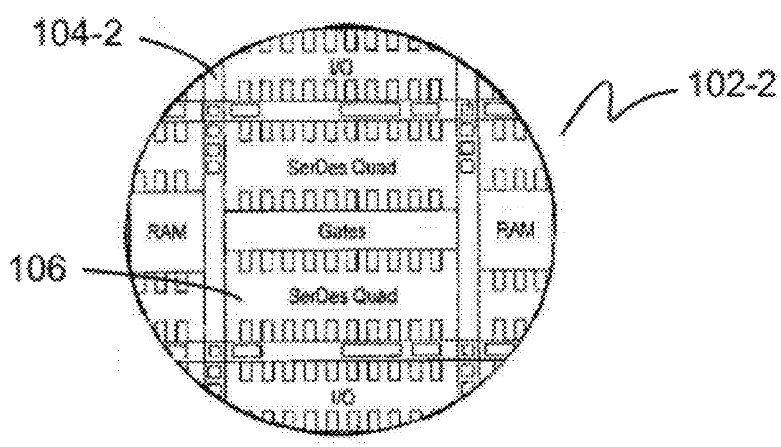
FIG. 10C is a drawing illustration of continuous array portion of wafer of a prior art.

FIG. 10A is a drawing illustration of a continuous array wafer of a prior art U.S. Pat. No. 7,337,425. The bubble 102 may show the repeating tile of the continuous array, and the lines 104 are the horizontal and vertical potential dicing lines. The tile 102 could be constructed as in FIG. 10B 102-1 with potential dicing line 104-1 or as in FIG. 10C with SerDes Quad 106 as part of the tile 102-2 and potential dicing lines 104-2.

In general logic devices may include varying quantities of logic elements, varying amounts of memories, and varying amounts of I/O. The continuous array of the prior art may allow defining various die sizes out of the same wafers and accordingly varying amounts of logic, but it may be far more difficult to vary the three-way ratio between logic, I/O, and memory. In addition, there may exist different types of memories such as SRAM, DRAM, Flash, and others, and there may exist different types of I/O such as SerDes. Some applications might need still other functions such as processor, DSP, analog functions, and others.

Some embodiments of the invention may enable a different approach. Instead of trying to put substantially all of these different functions onto one programmable die, which may need a large number of very expensive mask sets, it may use Through-Silicon Via to construct configurable systems. The technology of "Package of integrated circuits and vertical integration" has been described in U.S. Pat. No. 6,322,903 issued to Oleg Siniaguine and Sergey Savastiouk on Nov. 27, 2001.

Accordingly some embodiments of the invention may suggest the use of a continuous array of tiles focusing each one on a single, or very few types of, function. The target system may then be constructed using desired number of tiles of desired type stacked on top of each other and electrically connected with TSVs or monolithic 3D approaches, thus, a 3D Configurable System may result.

Figure 11A:
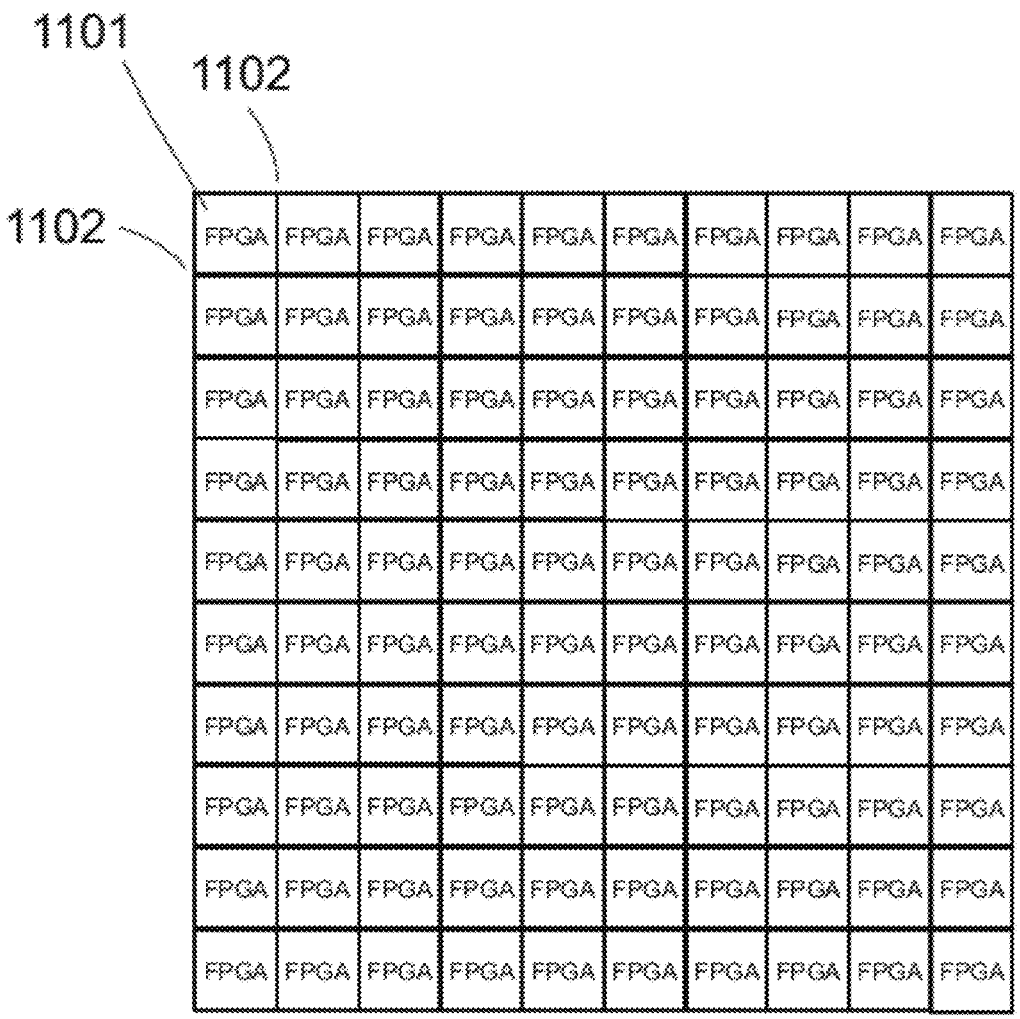
FIG. 11A through 11F are exemplary drawing illustrations of one reticle site on a wafer.

FIG. 11A is a drawing illustration of one reticle site on a wafer comprising tiles of programmable logic 1101 denoted FPGA. Such wafer may be a continuous array of programmable logic. 1102 are potential dicing lines to support various die sizes and the amount of logic to be constructed from one mask set. This die could be used as a base 1202A, 1202B, 1202C or 1202D of the 3D system as in FIG. 12. In one embodiment of this invention these dies may carry mostly logic, and the desired memory and I/O may be provided on other dies, which may be connected by means of Through-Silicon Via. It should be noted that in some cases it may be desired not to have metal lines, even if unused, in the dicing streets 108. In such case, at least for the logic dies, one may use dedicated masks to allow connection over the unused potential dicing lines to connect the individual tiles according to the desired die size. The actual dicing lines may also be called streets.

It should be noted that in general the lithography projected over surface of the wafer may be done by repeatedly projecting a reticle image over the wafer in a "step-and-repeat" manner. In some cases it might be possible to consider differently the separation between repeating tile 102 within a reticle image vs. tiles that relate to two projections. For simplicity this description will use the term wafer but in some cases it will apply, for example, only to tiles with one reticle.

The repeating tile 102 could be of various sizes. For FPGA applications it may be reasonable to assume tile 1101 to have an edge size between about 0.5 mm to about 1 mm which may allow good balance between the end-device size and acceptable relative area loss due to the unused potential dice lines 1102. Potential dice lines may be area regions of the processed wafer where the layers and structures on the wafer may be arranged such that the wafer dicing process may optimally proceed. For example, the potential dice lines may be line segments that surround a desired potential product die wherein the majority of the potential dice line may have no structures and may have a die seal edge structure to protect the desired product die from damages as a result of the dicing process. The dicing process can be accomplished by scribing and breaking, by mechanical sawing (normally with a machine called a dicing saw) or by laser cutting.

There may be many illustrative advantages for a uniform repeating tile structure of FIG. 11A where a programmable device could be constructed by dicing the wafer to the desired size of programmable device. Yet it may be still helpful that the end-device may act as a complete integrated device rather than just as a collection of individual tiles 1101. FIG. 36 illustrates a wafer 3600 carrying an array of tile 3601 with potential dice lines 3602 to be diced along actual dice lines 3612 to construct an end-device 3611 of 3×3 tiles. The end-device 3611 may be bounded by the actual dice lines 3612.

Figure 37:
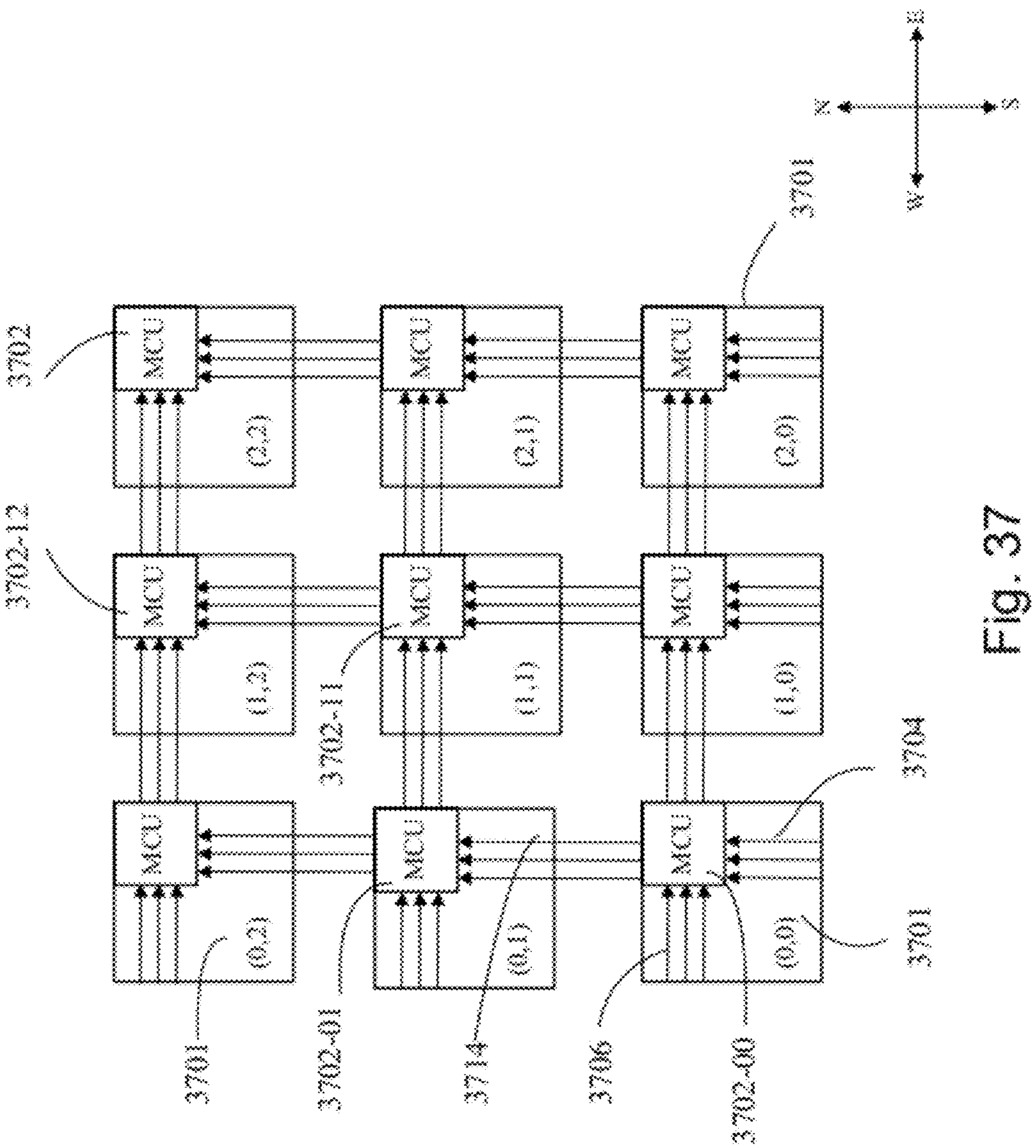
FIG. 37 is an exemplary drawing illustration of a programmable end device.

FIG. 37 is a drawing illustration of an end-device 3611 comprising 9 tiles 3701 [(0,0) to (2,2)] such as tile 3601. Each tile 3701 may contain a tiny micro control unit—MCU 3702. The micro control unit could have a common architecture such as an 8051 with its own program memory and data memory. The MCUs in each tile may be used to load the FPGA tile 3701 with its programmed function and substantially all its initialization for proper operation of the device. The MCU of each tile may be connected (for example, MCU-MCU connections 3714, 3706, & 3704) with a fixed electrical connection so to be controlled by the tile west of it or the tile south of it, in that order of priority. So, for example, the MCU 3702-11 may be controlled by MCU 3702-01. The MCU 3702-01 may have no MCU west of it so it may be controlled by the MCU south of it, MCU 3702-00, through connection 3714. Accordingly the MCU 3702-00 which may be in south-west corner may have no tile MCU to control it through connection 3706 or connection 3704 and it may therefore be the master control unit of the end-device.

Figure 38:
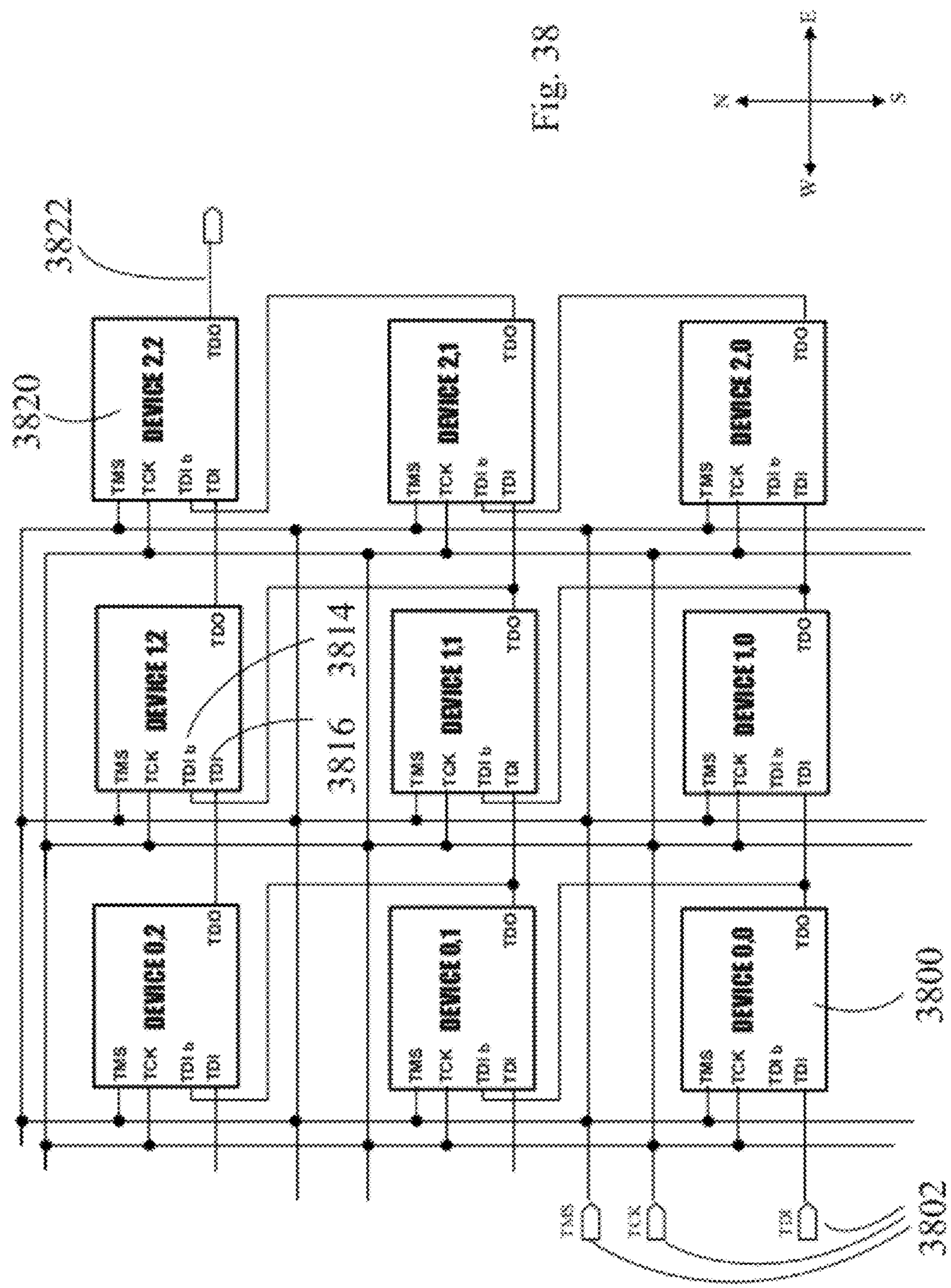
FIG. 38 is an exemplary drawing illustration of modified JTAG connections.

FIG. 38 illustrates a simple control connectivity utilizing a slightly modified Joint Test Action Group (JTAG)—based MCU architecture to support such a tiling approach. These MCU connections may be made with a fixed electrical connection, such as, for example, a metallized via, during the manufacturing process. Each MCU may have two Time-Delay-Integration (TDI) inputs, TDI 3816 from the device on its west side and TDIb 3814 from the MCU on its south side. As long as the input from its west side TDI 3816 is active it may be the controlling input, otherwise the TDIb 3814 from the south side may be the controlling input. Again in this illustration the MCU at the south-west corner tile 3800 may take control as the master. Its control inputs 3802 may be used to control the end-device and through this MCU at the south-west corner tile 3800 it may spread to substantially all other tiles. In the structure illustrated in FIG. 38 the outputs of the end-device 3611 may be collected from the MCU of the tile at the north-east corner 3820 at the TDO output 3822. These MCUs and their connectivity would be used to load the end-device functions, initialize the end-device, test the end-device, debug the end-device, program the end-device clocks, and provide substantially all other desired control functions. Once the end-device has completed its set up or other control and initialization functions such as testing or debugging, these MCUs could be then utilized for user functions as part of the end-device operation and may be connected electrically or configured with programmable connections.

Figure 38A:
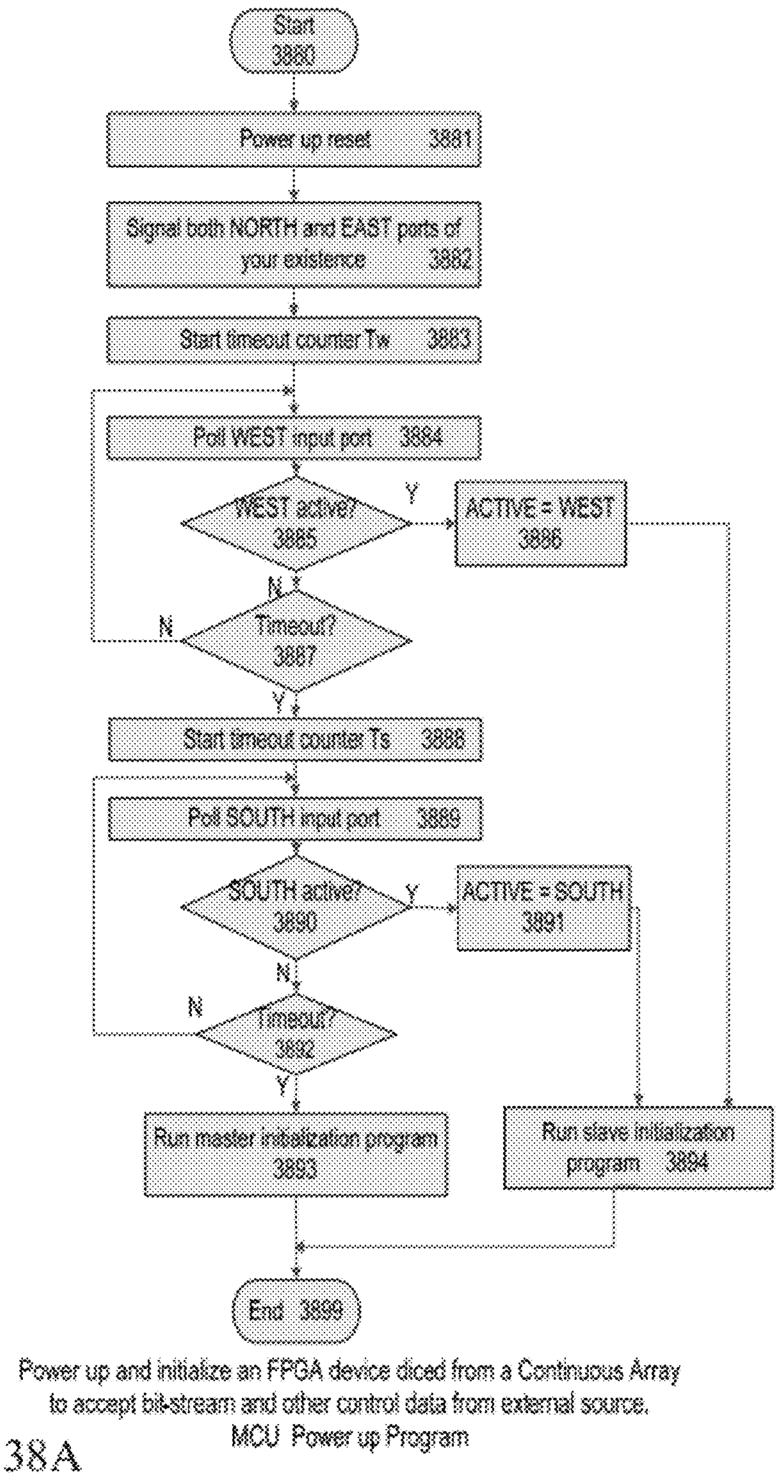
FIG. 38A is an exemplary drawing illustration of a methodology for implementing the MCU power up and initialization as described with respect to FIG. 38.

FIG. 38A illustrates an exemplary methodology for implementing the MCU power up and initialization as described with respect to FIG. 38. Start (3880) and each MCU detects power up reset (3881). Each MCU signals (3882) both North and east ports of its own existence. Each MCU starts (3883) its own a timeout counter Tw. Each MCU polls its West input port (3884). Is its West input port active (3885)? If yes, then set active equal to West (3886) and proceed to run slave initialization program (3894). The MCU has determined it is a slave MCU. If West port is not active, then proceed to ask if timed out (3887) on Tw. If No, MCU returns to polling its West input port (3884). If timed out, then the MCU proceeds to start another timeout counter Ts (3888). The MCU polls its South input port (3889). Is its South port active (3890)? If yes, then set active equal to South (3891) and proceed to run slave initialization program (3894). The MCU has determined it is a slave MCU. If South port is not active, then proceed to ask if timed out (3892) on Ts. If No, MCU returns to polling its South input port (3889). If timed out, then the MCU proceeds to run the master initialization program (3893). The MCU has determined it is the master MCU. The initialization procedure may end (3899). Each MCU may have its own program memory and data memory, and which may include the slave initialization program and the master initialization program.

An additional advantage for this construction of a tiled FPGA array with MCUs may be in the construction of an SoC with embedded FPGA function. A single tile 3601 could be connected to an SoC using Through Silicon Vias (TSVs) and accordingly may provide a self-contained embedded FPGA function.

Clearly, the same scheme can be modified to use the East/North (or any other combination of orthogonal directions) to encode effectively an identical priority scheme.

Figure 11B:
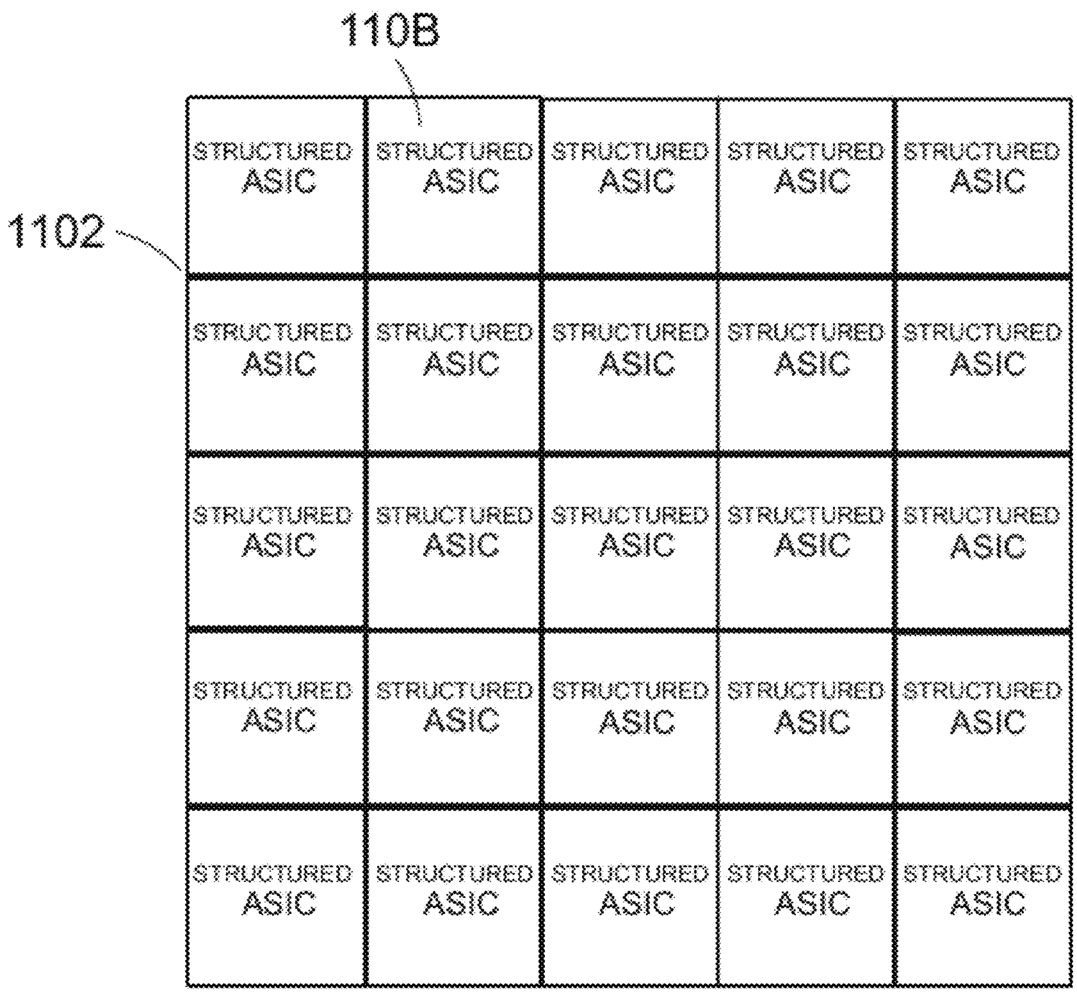

FIG. 11B is a drawing illustration of an alternative reticle site on a wafer comprising tiles of Structured ASIC 1100B. Such wafer may be, for example, a continuous array of configurable logic. 1102 are potential dicing lines to support various die sizes and the amount of logic to be constructed. This die could be used as a base 1202A, 1202B, 1202C or 1202D of the 3D system as in FIG. 12.

Figure 11C:
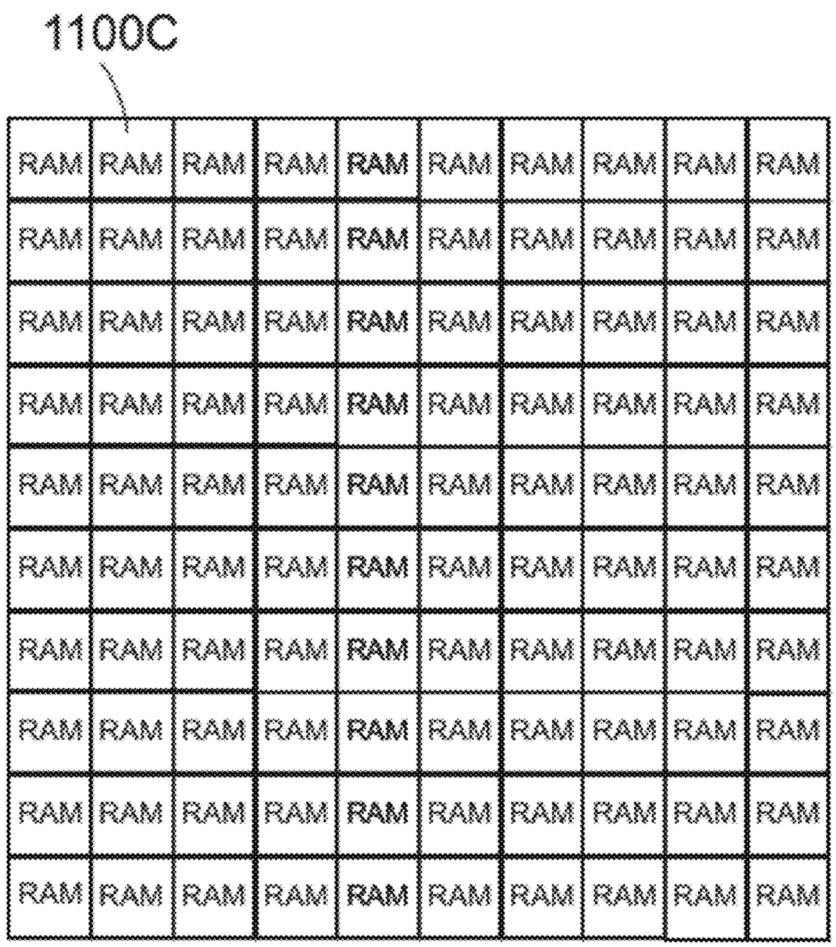

FIG. 11C is a drawing illustration of another reticle site on a wafer comprising tiles of RAM 1100C. Such wafer may be a continuous array of memories. The die diced out of such wafer may be a memory die component of the 3D integrated system. It might include, for example, an antifuse layer or other form of configuration technique to function as a configurable memory die. Yet it might be constructed as a multiplicity of memories connected by a multiplicity of Through Silicon Vias to the configurable die, which may also be used to configure the raw memories of the memory die to the desired function in the configurable system.

Figure 11D:
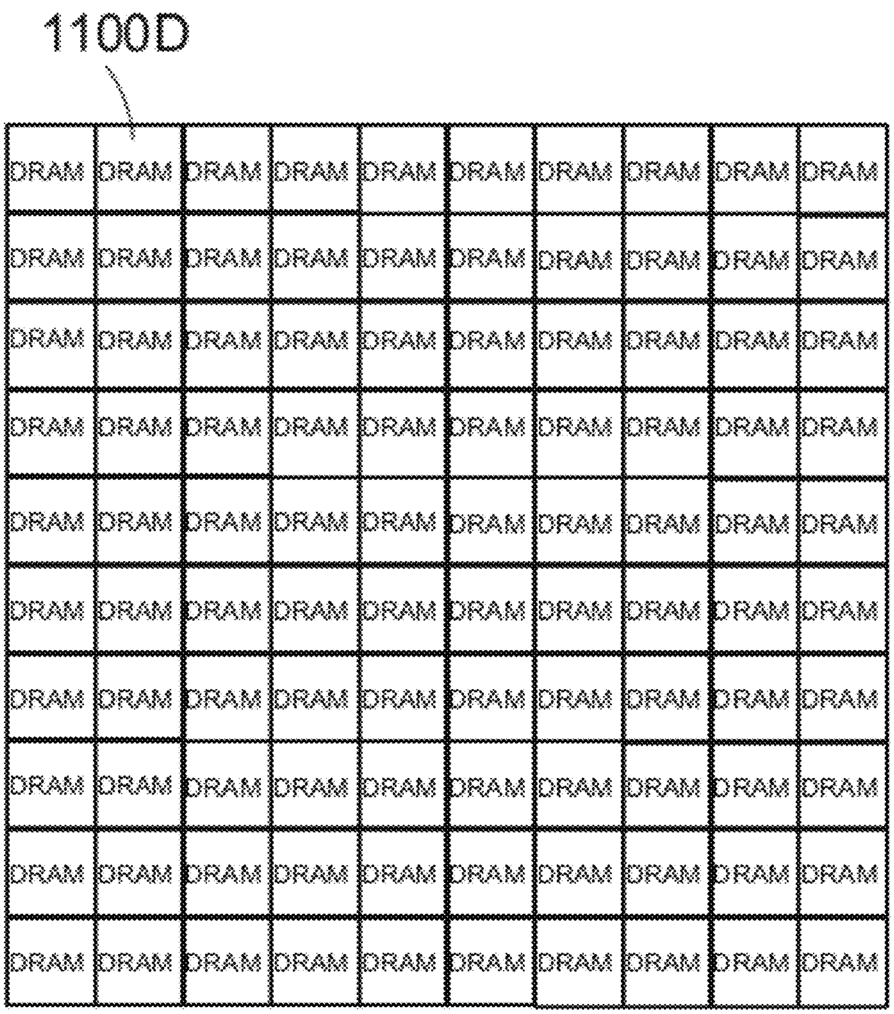

FIG. 11D is a drawing illustration of another reticle site on a wafer including tiles of DRAM 1100D. Such wafer may be a continuous array of DRAM memories.

Figure 11E:
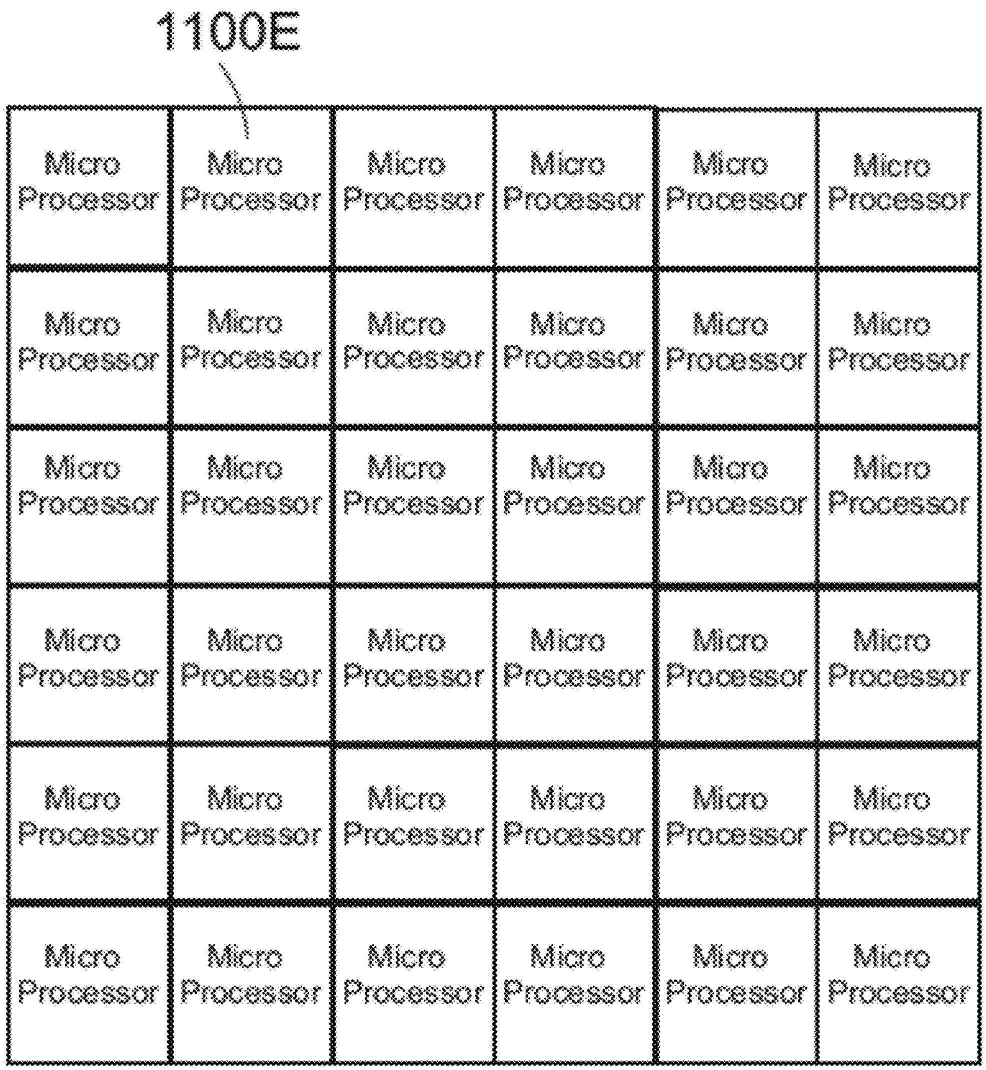

FIG. 11E is a drawing illustration of another reticle site on a wafer comprising tiles of microprocessor or microcontroller cores 1100E. Such wafer may be a continuous array of Processors.

Figure 11F:
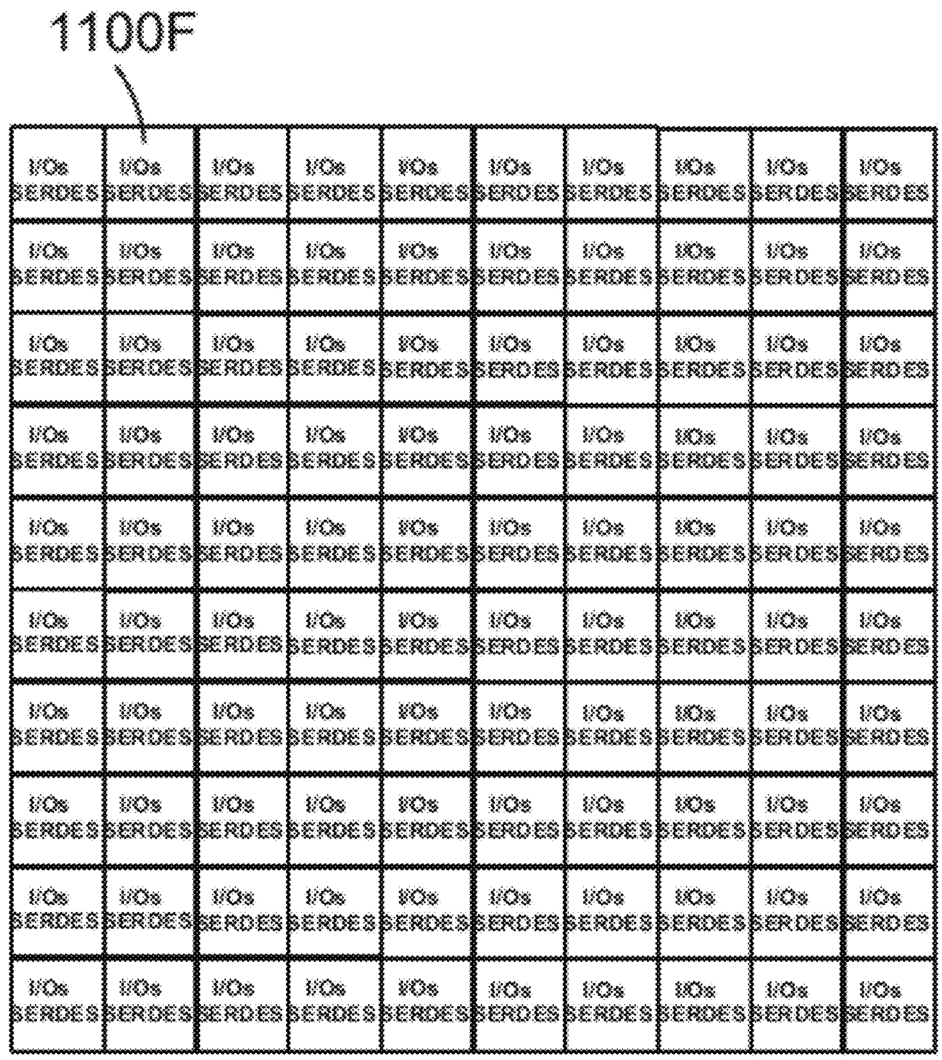

FIG. 11F is a drawing illustration of another reticle site on a wafer including tiles of I/Os 1100F. This could include groups of SerDes. Such a wafer may be a continuous tile of I/Os. The die diced out of such wafer may be an I/O die component of a 3D integrated system. It could include an antifuse layer or other form of configuration technique such as SRAM to configure these I/Os of the configurable I/O die to their function in the configurable system. Yet it might be constructed as a multiplicity of I/O connected by a multiplicity of Through Silicon Vias to the configurable die, which may also be used to configure the raw I/Os of the I/O die to the desired function in the configurable system.

I/O circuits may be a good example of where it could be illustratively advantageous to utilize an older generation process. Usually, the process drivers may be SRAM and logic circuits. It often may take longer to develop the analog function associated with I/O circuits, SerDes circuits, PLLs, and other linear functions. Additionally, while there may be an advantage to using smaller transistors for the logic functionality, I/Os may need stronger drive and relatively larger transistors and may enable higher operating voltages. Accordingly, using an older process may be more cost effective, as the older process wafer might cost less while still performing effectively.

An additional function that it might be advantageous to pull out of the programmable logic die and onto one of the other dies in the 3D system, connected by Through-Silicon-Vias, may be the Clock circuits and their associated PLL, DLL, and control clock circuits and distribution. These circuits may often be area consuming and may also be challenging in view of noise generation. They also could in many cases be more effectively implemented using an older process. The Clock tree and distribution circuits could be included in the I/O die. Additionally the clock signal could be transferred to the programmable die using the Through-Silicon-Vias (TSVs) or by optical means. A technique to transfer data between dies by optical means was presented for example in U.S. Pat. No. 6,052,498 assigned to Intel Corp.

Alternatively an optical clock distribution could be used. There may be new techniques to build optical guides on silicon or other substrates. An optical clock distribution may be utilized to minimize the power used for clock signal distribution and may enable low skew and low noise for the rest of the digital system. Having the optical clock constructed on a different die and then connected to the digital die by means of Through-Silicon-Vias or by optical means, make it very practical, when compared to the prior art of integrating optical clock distribution with logic on the same die.

Alternatively the optical clock distribution guides and potentially some of the support electronics such as the conversion of the optical signal to electronic signal could be integrated by using layer transfer and smart cut approaches as been described before in FIGS. 14 and 20. The optical clock distribution guides and potentially some of the support electronics could be first built on the 'Foundation' wafer 1402 and then a thin layer transferred silicon layer 1404 may be transferred on top of it using the ion-cut flow, so substantially all the following construction of the primary circuit would take place afterward. The optical guide and its support electronics would be able to withstand the high temperatures necessary for the processing of transistors on transferred silicon layer 1404.

And as related to FIG. 20, the optical guide, and the proper semiconductor structures on which at a later stage the support electronics would be processed, could be pre-built on semiconductor layer 2019. Using, for example, the ion-cut flow semiconductor layer 2019 may be then transferred on top of a fully processed wafer 808. The optical guide may be able to withstand the ion implant for the ion-cut to form the ion-cut layer/plane 2008 while the support electronics may be finalized in flows similar to the ones presented in, for example, FIGS. 21 to 35, and 39 to 94. Thus, the landing target for the clock signal may need to accommodate the about 1 micron misalignment of the transferred layer 2004 to the prefabricated primary circuit and its upper layer 808. Such misalignment could be acceptable for many designs. Alternatively, for example, only the base structure for the support electronics may be pre-fabricated on semiconductor layer 2019 and the optical guide may be constructed after the layer transfer along with finalized flows of the support electronics using flows similar to the ones presented in, for example, FIGS. 21-35, and 39 to 94. Alternatively, the support electronics could be fabricated on top of a fully processed wafer 808 by using flows similar to the ones presented in, for example, FIGS. 21-35, and 39 to 94. Then an additional layer transfer on top of the support electronics may be utilized to construct the optical wave guides at low temperature.

Having wafers dedicated to each of these functions may support high volume generic product manufacturing. Then, similar to Lego® blocks, many different configurable systems could be constructed with various amounts of logic memory and I/O. In addition to the alternatives presented in FIGS. 11A through 11F there many other useful functions that could be built and that could be incorporated into the 3D Configurable System. Examples of such may be image sensors, analog, data acquisition functions, photovoltaic devices, non-volatile memory, and so forth.

An additional function that would fit well for 3D systems using TSVs, as described, may be a power control function. In many cases it may be desired to shut down power at times to a portion of the IC that is not currently operational. Using controlled power distribution by an external die connected by TSVs may be illustratively advantageous as the power supply voltage to this external die could be higher because it may be using an older process. Having a higher supply voltage allows easier and better control of power distribution to the controlled die.

Those components of configurable systems could be built by one vendor, or by multiple vendors, who may agree on a standard physical interface to allow mix-and-match of various dies from various vendors.

The construction of the 3D Programmable System could be done for the general market use or custom-tailored for a specific customer.

Another illustrative advantage of some embodiments of this invention may be an ability to mix and match various processes. It might be illustratively advantageous to use memory from a leading edge process, while the I/O, and maybe an analog function die, could be used from an older process of mature technology (e.g., as discussed above).

Figure 12A:
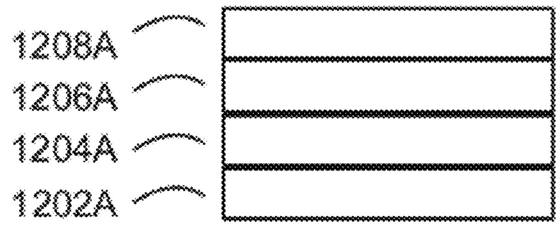
FIG. 12A through 12E are exemplary drawing illustrations of a Configurable system.
Figure 12B:
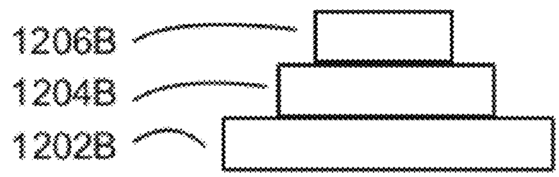
Figure 12C:
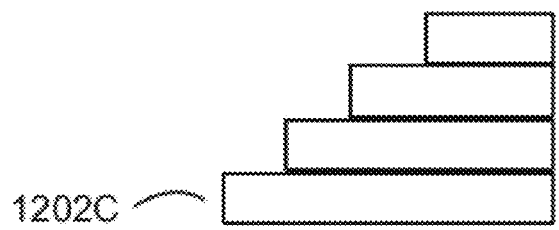
Figure 12D:
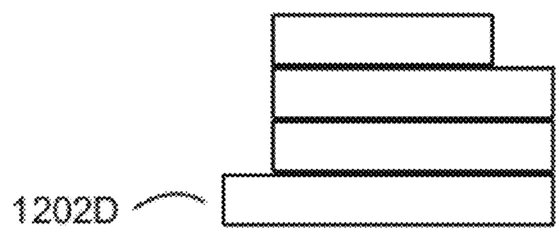
Figure 12E:
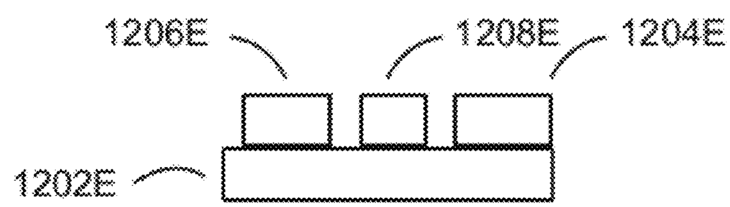

FIGS. 12A through 12E illustrate integrated circuit systems. An integrated circuit system that may include configurable die could be called a Configurable System. FIG. 12A through 12E are drawings illustrating integrated circuit systems or Configurable Systems with various options of die sizes within the 3D system and alignments of the various dies. FIG. 12E presents a 3D structure with some lateral options. In such case a few dies 1204E, 1206E, 1208E may be placed on the same underlying die 1202E allowing relatively smaller die to be placed on the same mother die. For example die 1204E could be a SerDes die while die 1206E could be an analog data acquisition die. It could be advantageous to fabricate these die on different wafers using different process and then integrate them into one system. When the dies are relatively small then it might be useful to place them side by side (such as FIG. 12E) instead of one on top of the other (FIGS. 12A-D).

The Through Silicon Via technology is constantly evolving. In the early generations such via would be 10 microns in diameter. Advanced work now demonstrating Through Silicon Via with less than a about 1-micron diameter. Yet, the density of connections horizontally within the die may typically still be far denser than the vertical connection using Through Silicon Via.

In another alternative of the present invention the logic portion could be broken up into multiple dies, which may be of the same size, to be integrated to a 3D configurable system. Similarly it could be advantageous to divide the memory into multiple dies, and so forth, with other functions.

Recent work on 3D integration may show effective ways to bond wafers together and then dice those bonded wafers. This kind of assembly may lead to die structures such as shown in FIG. 12A or FIG. 12D. Alternatively for some 3D assembly techniques it may be better to have dies of different sizes. Furthermore, breaking the logic function into multiple vertically integrated dies may be used to reduce the average length of some of the heavily loaded wires such as clock signals and data buses, which may, in turn, improve performance.

Figure 84A:
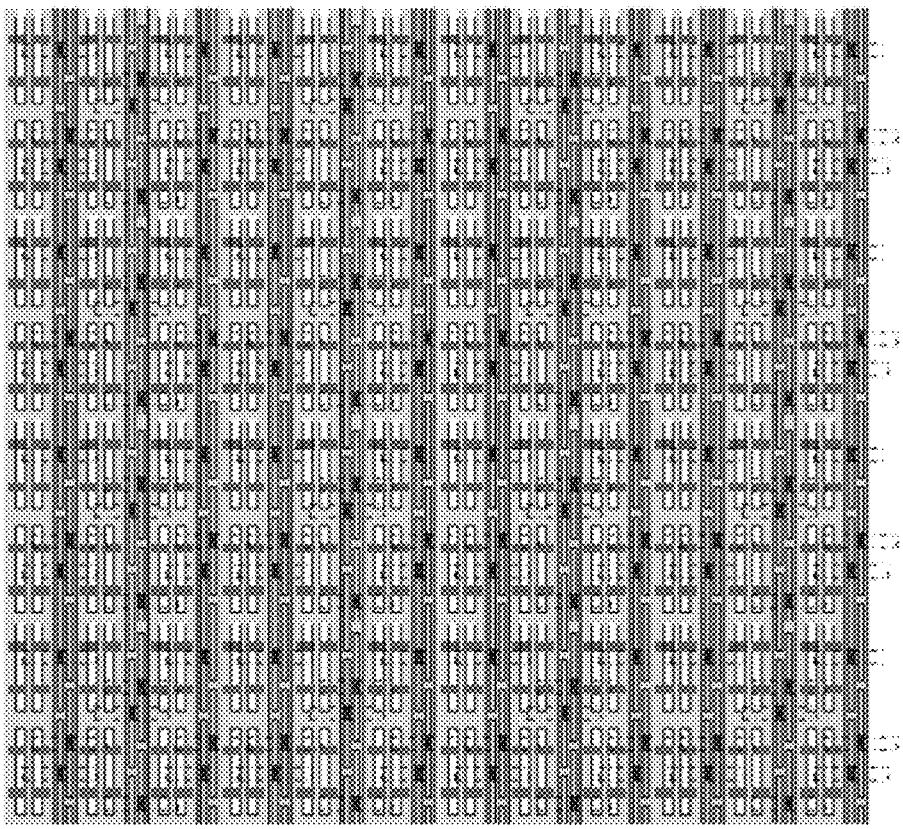
FIG. 84 A-G are exemplary drawing illustrations of continuous transistor arrays.
Figure 84B:
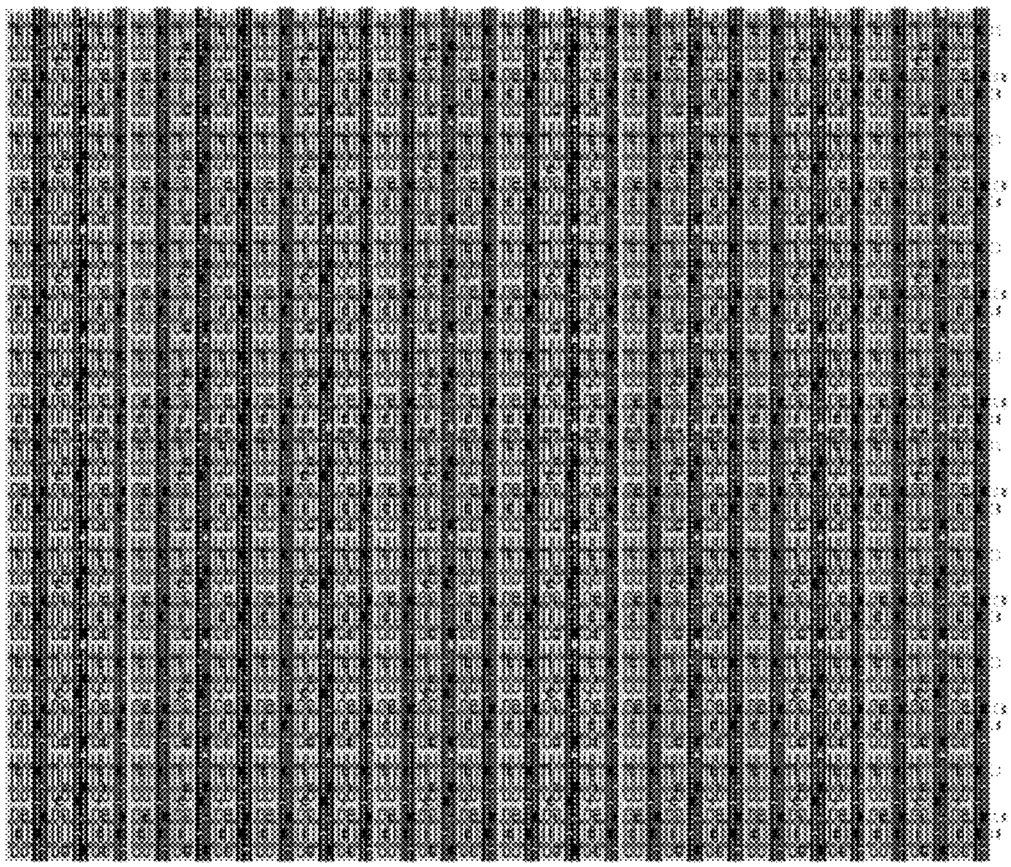
Figure 84C:
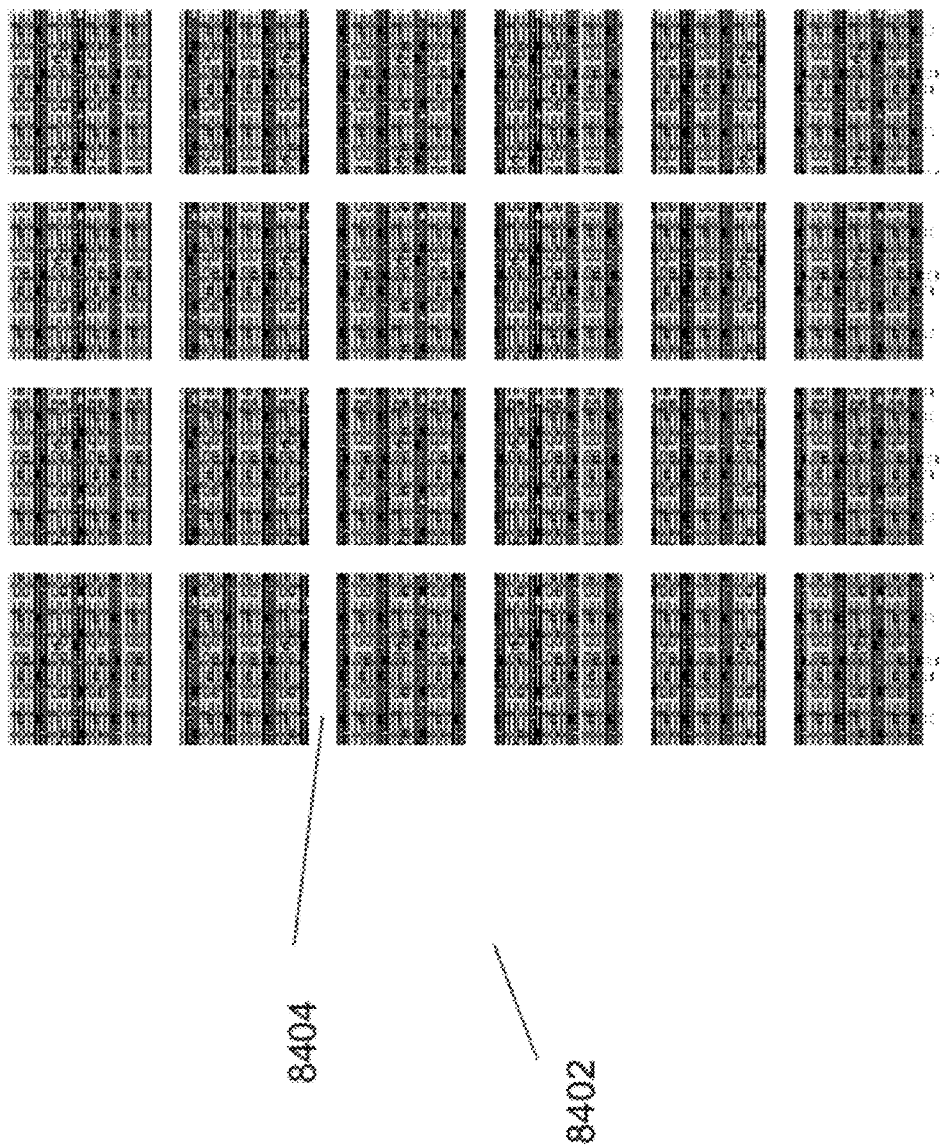

An additional variation of the present invention may be the adaptation of the continuous array (presented in relation to FIGS. 10 and 11) to the general logic device and even more so for the 3D IC system. Lithography limitations may pose considerable concern to advanced device design. Accordingly regular structures may be highly desirable and layers may be constructed in a mostly regular fashion and in most cases with one orientation at a time. Additionally, highly vertically-connected 3D IC system could be most efficiently constructed by separating logic memories and I/O into dedicated layers. For a logic-only layer, the structures presented in FIG. 76 or FIG. 78A-C could be used extensively, as illustrated in FIG. 84. In such a case, the repeating logic pattern 8402 could be made full reticle size. FIG. 84A illustrates a repeating pattern of the logic cells of FIG. 78B wherein the logic cell is repeating 8×12 times. FIG. 84B illustrates the same logic repeating many more times to fully fill a reticle. The multiple masks used to construct the logic terrain could be used for multiple logic layers within one 3D IC and for multiple ICs. Such a repeating structure may include the logic P and N transistors, their corresponding contact layers, and even the landing strips for connecting to the underlying layers. The interconnect layers on top of these logic terrain could be made custom per design or partially custom depending on the design methodology used. The custom metal interconnect may leave the logic terrain unused in the dicing streets area. Alternatively a dicing-streets mask could be used to etch away the unused transistors in the streets area 8404 as illustrated in FIG. 84C.

The continuous logic terrain could use any transistor style including the various transistors previously presented. An additional advantage to some of the 3D layer transfer techniques previously presented may be the option to pre-build, in high volume, transistor terrains for further reduction of 3D custom IC manufacturing costs.

Similarly a memory terrain could be constructed as a continuous repeating memory structure with a fully populated reticle. The non-repeating elements of most memories may be the address decoder and sometimes the sense circuits. Those non repeating elements may be constructed using the logic transistors of the underlying or overlying layer.

Figure 84D:
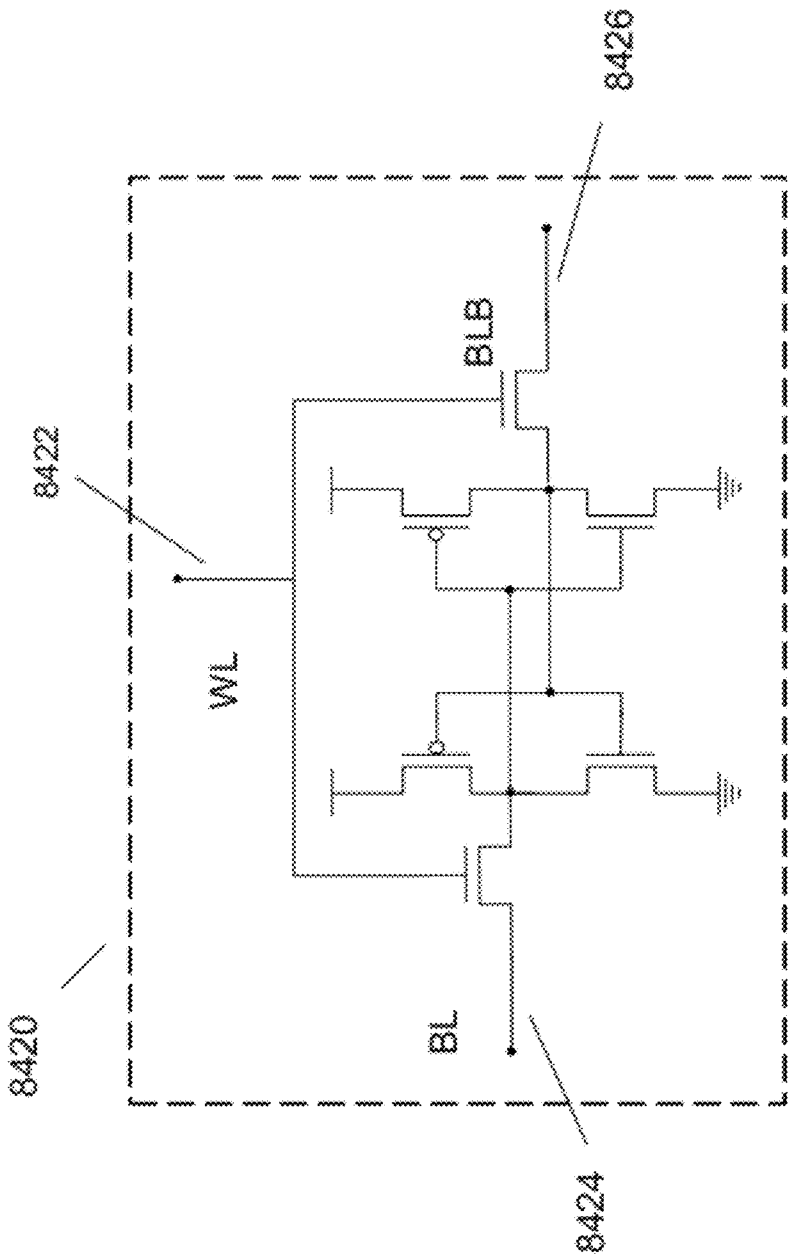

FIGS. 84D-G are drawing illustrations of an SRAM memory terrain. FIG. 84D illustrates a conventional 6 transistor SRAM bit cell 8420 controlled by Word Line (WL) 8422 and Bit Lines (BL, BLB) 8424, 8426. The SRAM bit cell may be specially designed to be very compact.

Figure 84E:
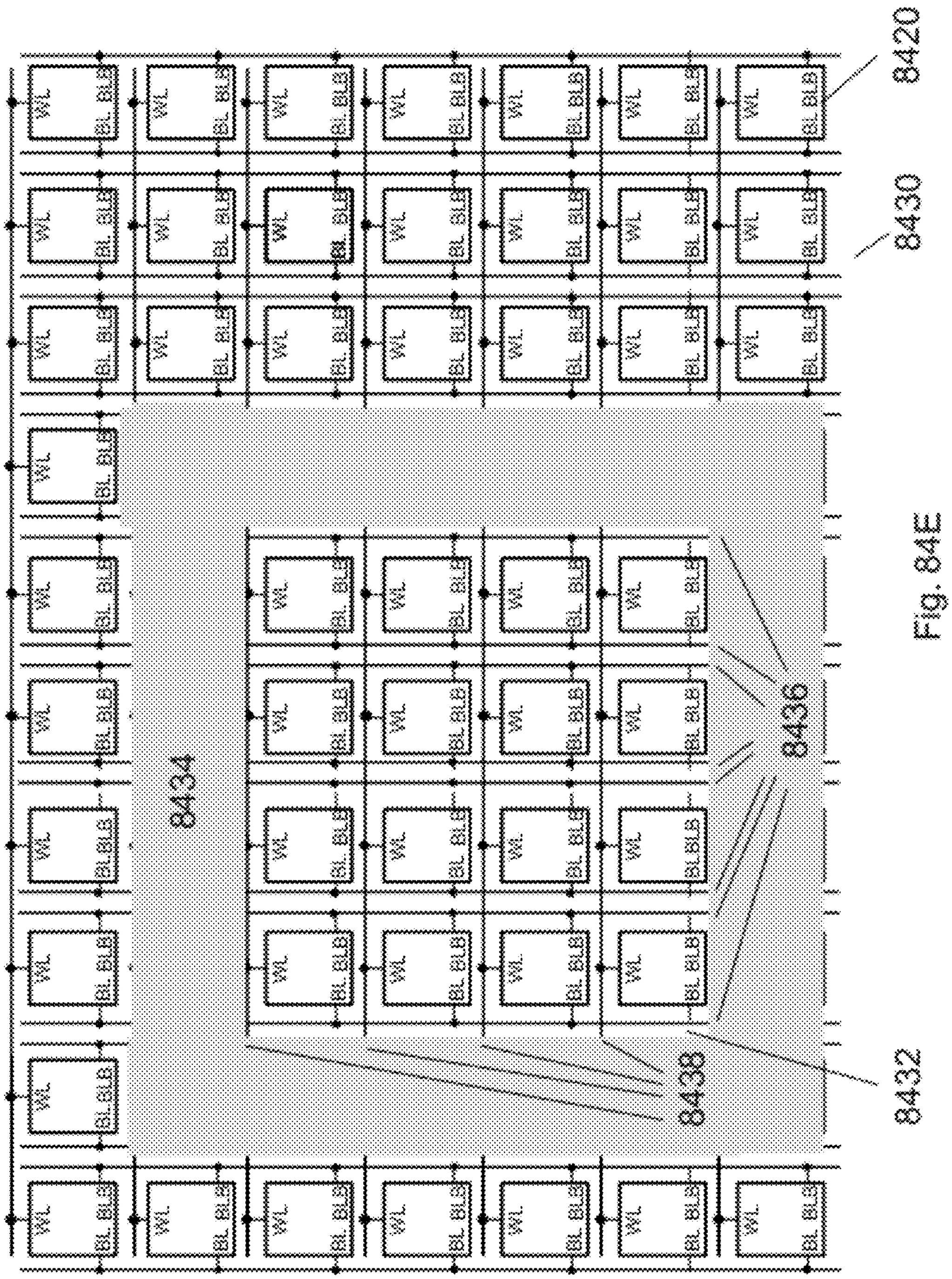

The generic continuous array 8430 may be a reticle step field sized terrain of SRAM bit cells 8420 wherein the transistor layers and even the Metal 1 layer may be used by substantially all designs. FIG. 84E illustrates such continuous array 8430 wherein a 4×4 memory block 8432 may be defined by custom etching the cells around it 8434. The memory may be customized by custom metal masks such metal 2 and metal 3. To control the memory block the Word Lines 8438 and the Bit Lines 8436 may be connected by through layer vias to the logic terrain underneath or above it.

Figure 84F:
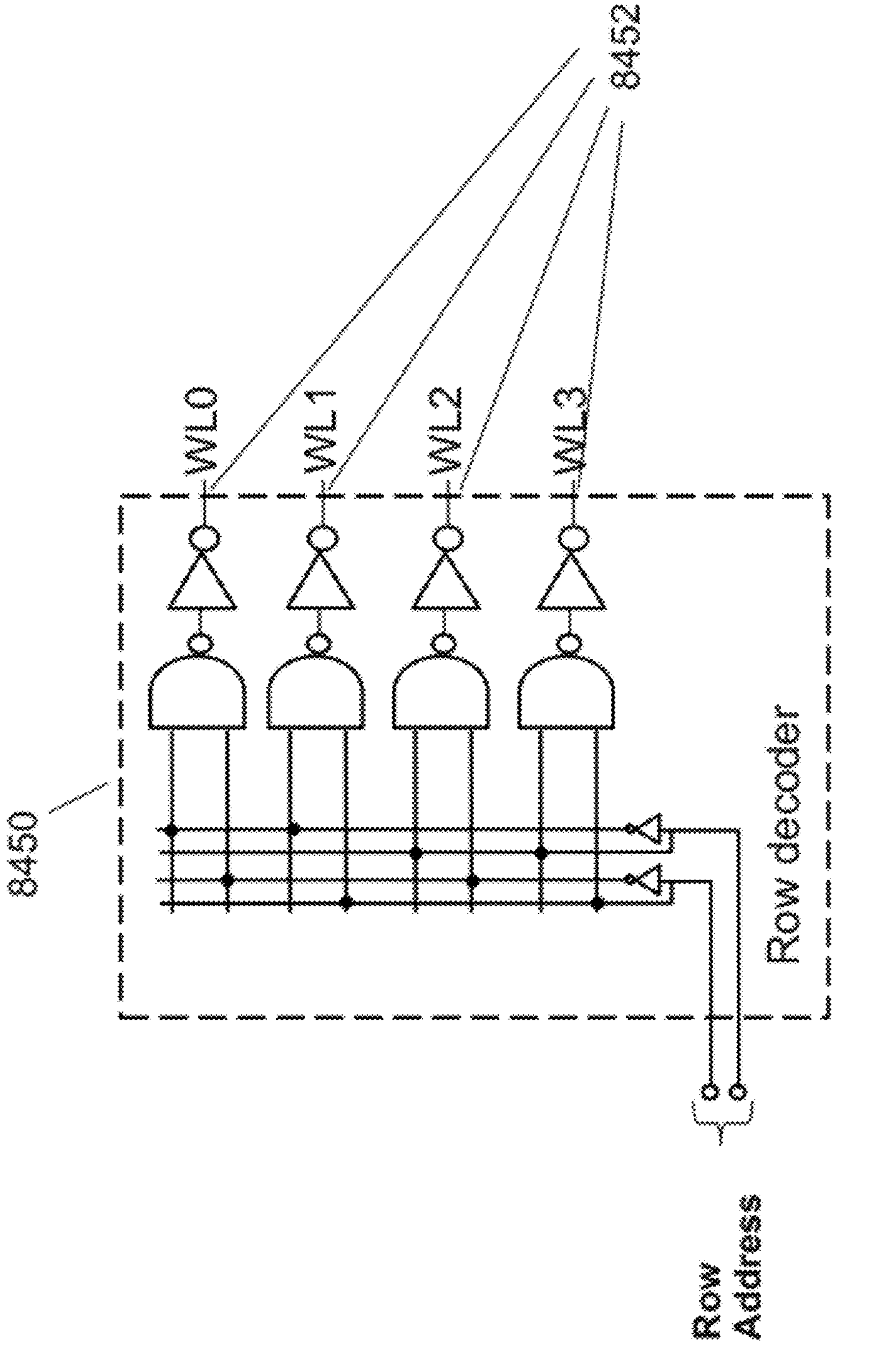
Figure 84G:
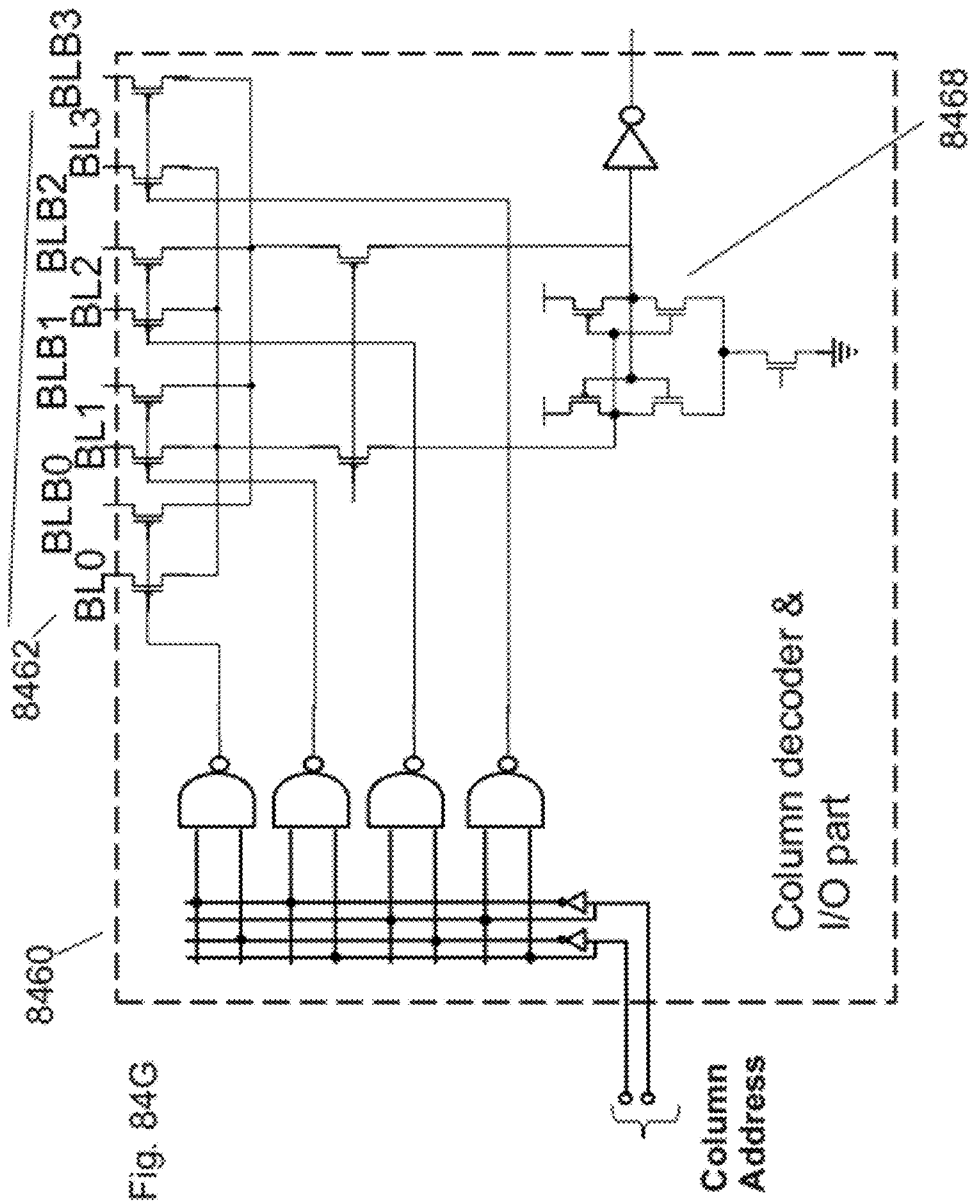

FIG. 84F illustrates a logic structure 8450 that may be constructed on the logic terrain to drive the Word Lines 8452. FIG. 84G illustrates the logic structure 8460 that may be constructed on the logic terrain to drive the Bit Lines 8462. FIG. 84G also illustrates the read sense circuit 8468 that may read the memory content from the bit lines 8462. In a similar fashion, other memory structures may be constructed from the uncommitted memory terrain using the uncommitted logic terrain close to the intended memory structure. In a similar fashion, other types of memory, such as flash or DRAM, may include the memory terrain. Furthermore, the memory terrain may be etched away at the edge of the projected die borders to define dicing streets similar to that indicated in FIG. 84C for a logic terrain.

As illustrated in FIG. 183A, the custom dicing line masking and etch referred to in the FIG. 84C discussion to create multiple thin strips of streets area 8404 for etching may be shaped to created chamfered block corners 18302 of custom blocks 18304 to relieve stress. Custom blocks 18304 may include functions, blocks, arrays, or devices of architectures such as logic, FPGA, I/O, or memory.

As illustrated in FIG. 183B, this custom function etching and chamfering may extend through the BEOL metallization of one device layer of the 3DIC stack as shown in first structure 18350, or extend through the entire 3DIC stack to the bottom substrate and shown in second structure 18370, or may truncate at the isolation of any device layer in the 3D stack as shown in third structure 18360. The cross sectional view of an exemplary 3DIC stack may include second layer BEOL dielectric 18326, second layer interconnect metallization 18324, second layer transistor layer 18322, substrate layer BEOL dielectric 18316, substrate layer interconnect metallization 18314, substrate transistor layer 18312, and substrate 18310.

Passivation of the edge created by the custom function etching may be accomplished as follows. If the custom function etched edge is formed on a layer or strata that is not the topmost one, then it may be passivated or sealed by filling the etched out area with dielectric, such as a Spin-On-Glass (SOG) method, and CMPing flat to continue to the next 3DIC layer transfer. As illustrated in FIG. 183C, the topmost layer custom function etched edge may be passivated with an overlapping layer or layers of material including, for example, oxide, nitride, or polyimide. Oxide may be deposited over custom function etched block edge 18380 and may be lithographically defined and etched to overlap the custom function etched block edge 18380 shown as oxide structure 18384. Silicon nitride may be deposited over wafer and oxide structure 18384, and may be lithographically defined and etched to overlap the custom function etched block edge 18380 and oxide structure 18384, shown as nitride structure 18386.

In such way a single expensive mask set can be used to build many wafers for different memory sizes and finished through another mask set that is used to build many logic wafers that can be customized by few metal layers.

Person skilled in the art will recognize that it is now possible to assemble a true monolithic 3D stack of mono-crystalline silicon layers or strata with high performance devices using advanced lithography that repeatedly reuse same masks, with only few custom metal masks for each device layer. Such person will also appreciate that one can stack in the same way a mix of disparate layers, some carrying transistor array for general logic and other carrying larger scale blocks such as memories, analog elements, Field Programmable Gate Array (FPGA), and I/O. Moreover, such a person would also appreciate that the custom function formation by etching may be accomplished with masking and etching processes such as, for example, a hard-mask and Reactive Ion Etching (RIE), or wet chemical etching, or plasma etching. Furthermore, the passivation or sealing of the custom function etching edge may be stair stepped so to enable improved sidewall coverage of the overlapping layers of passivation material to seal the edge Constructing 3D ICs utilizing multiple layers of different function may combine 3D layers using the layer transfer techniques according to some embodiments of the invention, with substantially fully prefabricated devices connected by industry standard TSV techniques.

Yield repair for random logic may be an embodiment of the invention. The 3D IC techniques presented may allow the construction of a very complex logic 3D IC by using multiple layers of logic. In such a complex 3D IC, enabling the repair of random defects common in IC manufacturing may be highly desirable. Repair of repeating structures is known and commonly used in memories and will be presented in respect to FIG. 41. Another alternative may be a repair for random logic leveraging the attributes of the presented 3D IC techniques and Direct Write eBeam technology such as, for example, technologies offered by Advantest, Fujitsu Microelectronics and Vistec.

Figure 86A:
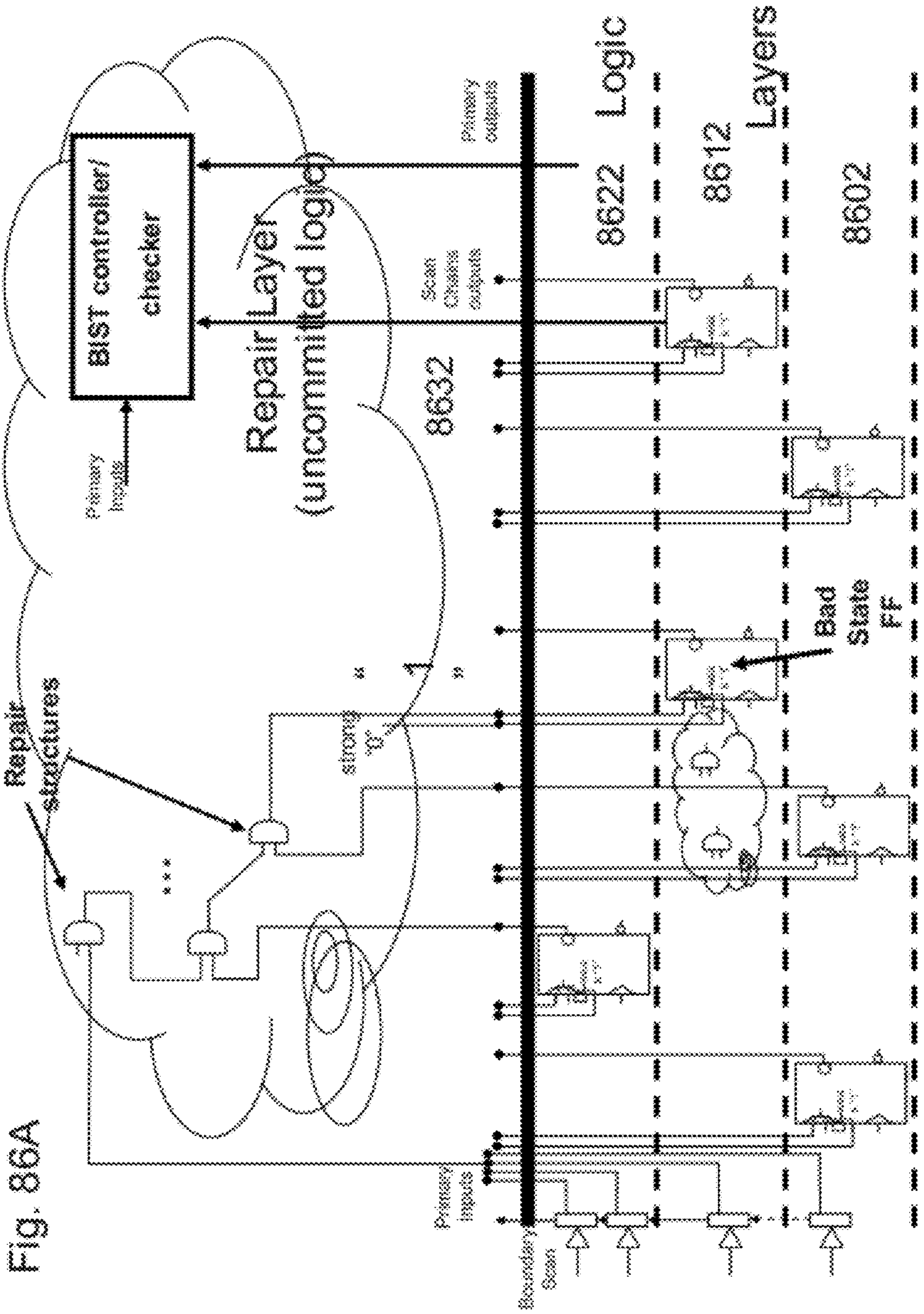
FIG. 86A is an exemplary drawing illustration of a 3D logic IC structured for repair.

FIG. 86A illustrates an exemplary 3D logic IC structured for repair. The illustrated 3D logic IC may include three logic layers 8602, 8612, 8622 and an upper layer of repair logic 8632. In each logic layer substantially all primary outputs, the Flip Flop (FF) outputs, may be fed to the upper layer of repair logic 8632, the repair layer. The upper layer of repair logic 8632 initially may include a repeating structure of uncommitted logic transistors similar to those of FIGS. 76 and 78. The circuitry of logic layer 8602 may be constructed on SOI wafers so that the performance of logic layer 8602 may more closely match logic layers 8612, 8622 and layer of repair logic 8632.

Figure 87:
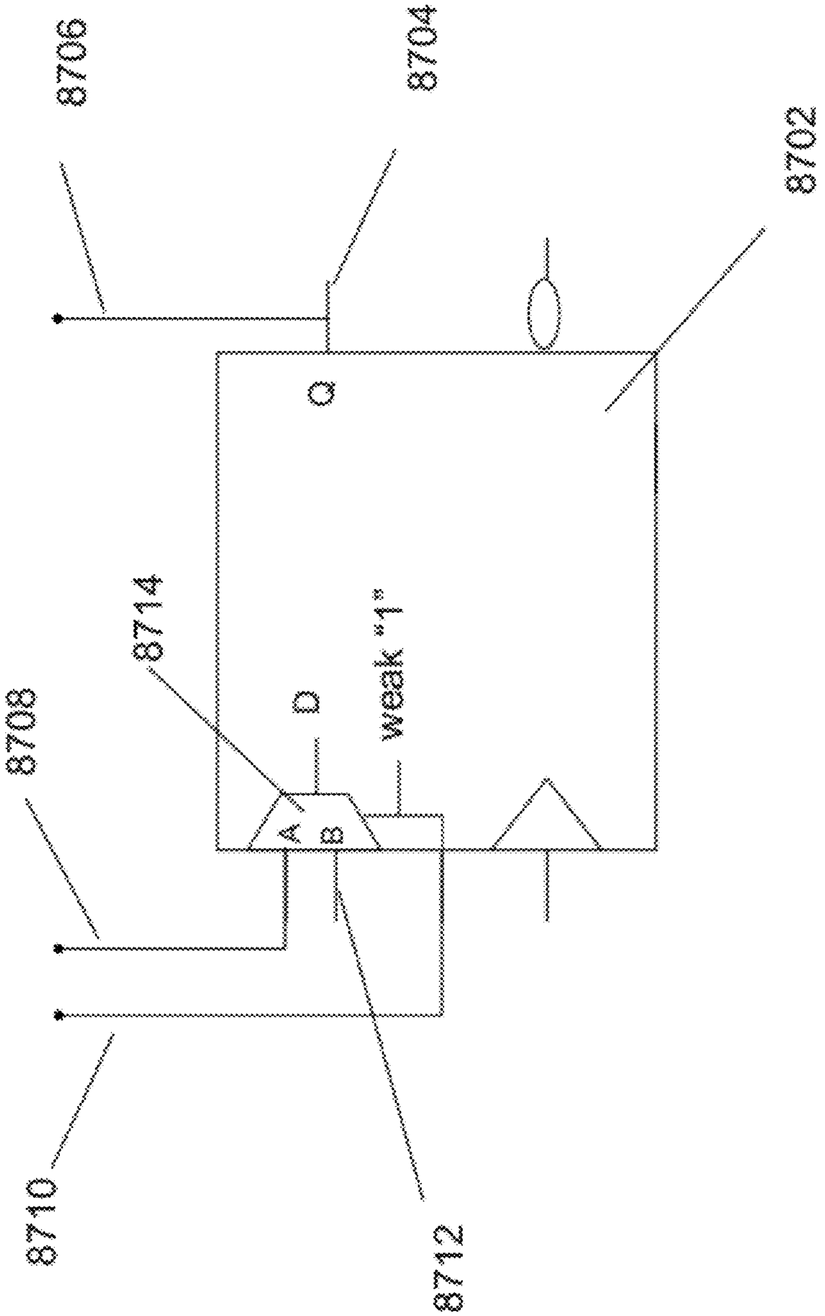
FIG. 87 is an exemplary drawing illustration of a Flip Flop designed for repairable 3D IC logic.

FIG. 87 illustrates a Flip Flop designed for repairable 3D IC logic. Such Flip Flop 8702 may include, in addition to its normal output 8704, a branch 8706 going up to the top layer, and the layer of repair logic 8632. For each Flip Flop, two lines may originate from the layer of repair logic 8632, namely, the repair input 8708 and the control 8710. The normal input 8712 to the Flip Flop may go in through a multiplexer 8714 designed to select the normal input 8712 as long as the top control 8710 is floating. But once the top control 8710 is active low the multiplexer 8714 may select the repair input 8708. A faulty input may impact more than one primary input. The repair may then recreate substantially all the necessary logic to replace substantially all the faulty inputs in a similar fashion.

Multiple alternatives may exist for inserting the new input, including the use of programmability such as, for example, a one-time-programmable element to switch the multiplexer 8714 from the original normal input 8712 to the repair input 8708 without the need of a top control 8710 wire.

At the fabrication, the 3D IC wafer may go through a full scan test. If a fault is detected, a yield repair process may be applied. Using the design data base, repair logic may be built on the upper layer of repair logic 8632. The repair logic may have access to substantially all the primary outputs as they are all available on the top layer. Accordingly, those outputs needed for the repair may be used in the reconstruction of the exact logic found to be faulty. The reconstructed logic may include some enhancement such as drive size or metal wires strength to compensate for the longer lines going up and then down. The repair logic, as a de-facto replacement of the faulty logic 'cone,' may be built using the uncommitted transistors on the top layer. The top layer may be customized with a custom metal layer defined for each die on the wafer by utilizing the direct write eBeam. The replacement signal through repair input 8708 may be connected to the proper Flip Flop and become active by having the top control 8710 signal an active low.

The repair flow may also be used for performance enhancement. If the wafer test includes timing measurements, a slow performing logic 'cone' could be replaced in a similar manner to a faulty logic 'cone' described previously, e.g., in the preceding paragraph.

Figure 86B:
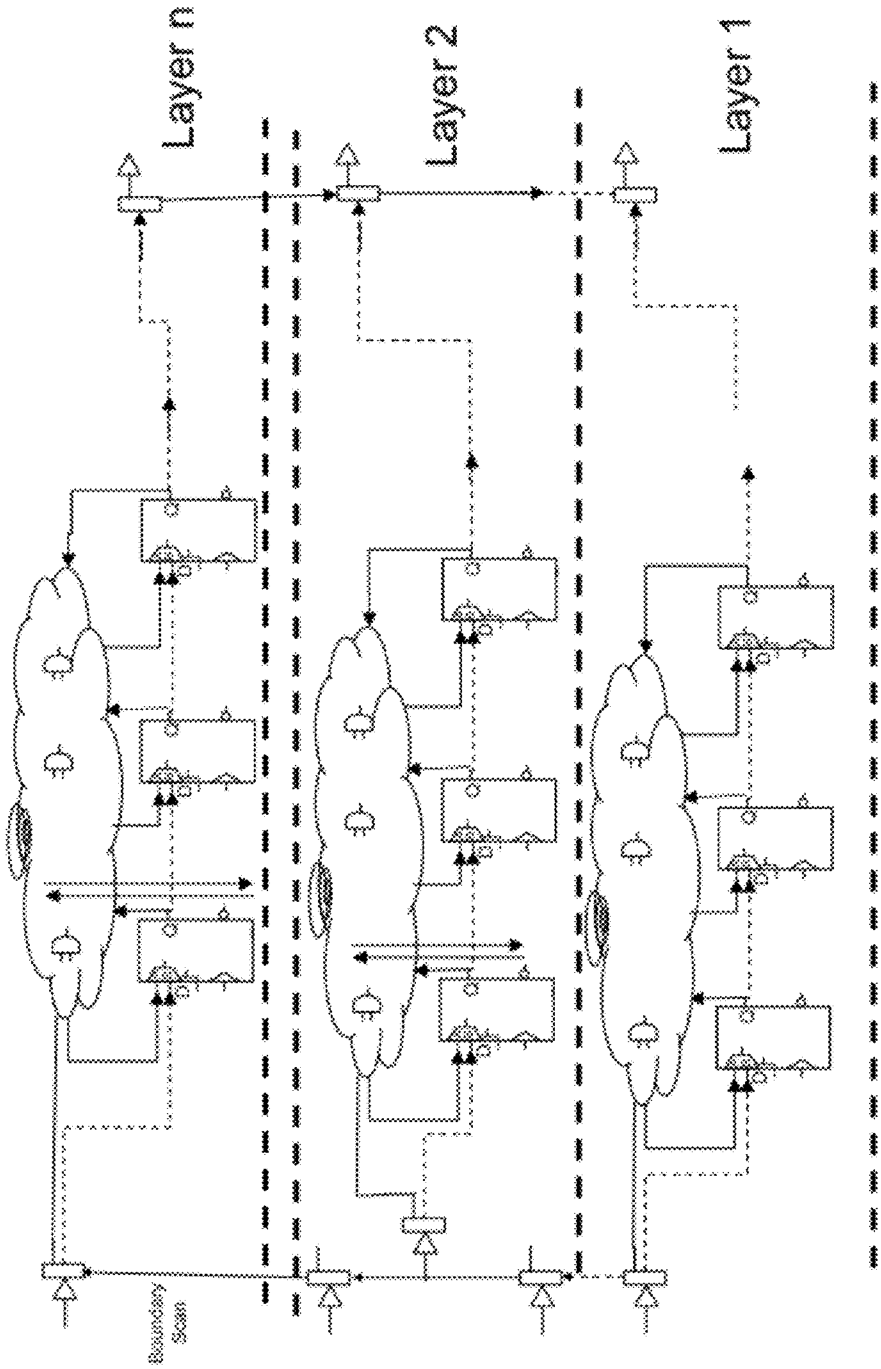
FIG. 86B is an exemplary drawing illustration of a 3D IC with scan chain confined to each layer.

FIG. 86B is a drawing illustration of a 3D IC wherein the scan chains are designed so each is confined to one layer. This confinement may allow testing of each layer as it is fabricated and could be useful in many ways. For example, after a circuit layer is completed and then tested showing very bad yield, then the wafer could be removed and not continued for building additional 3D circuit layers on top of bad base. Alternatively, a design may be constructed to be very modular and therefore the next transferred circuit layer could include replacement modules for the underlying faulty base layer similar to what was suggested in respect to FIG. 41.

Figure 86C:
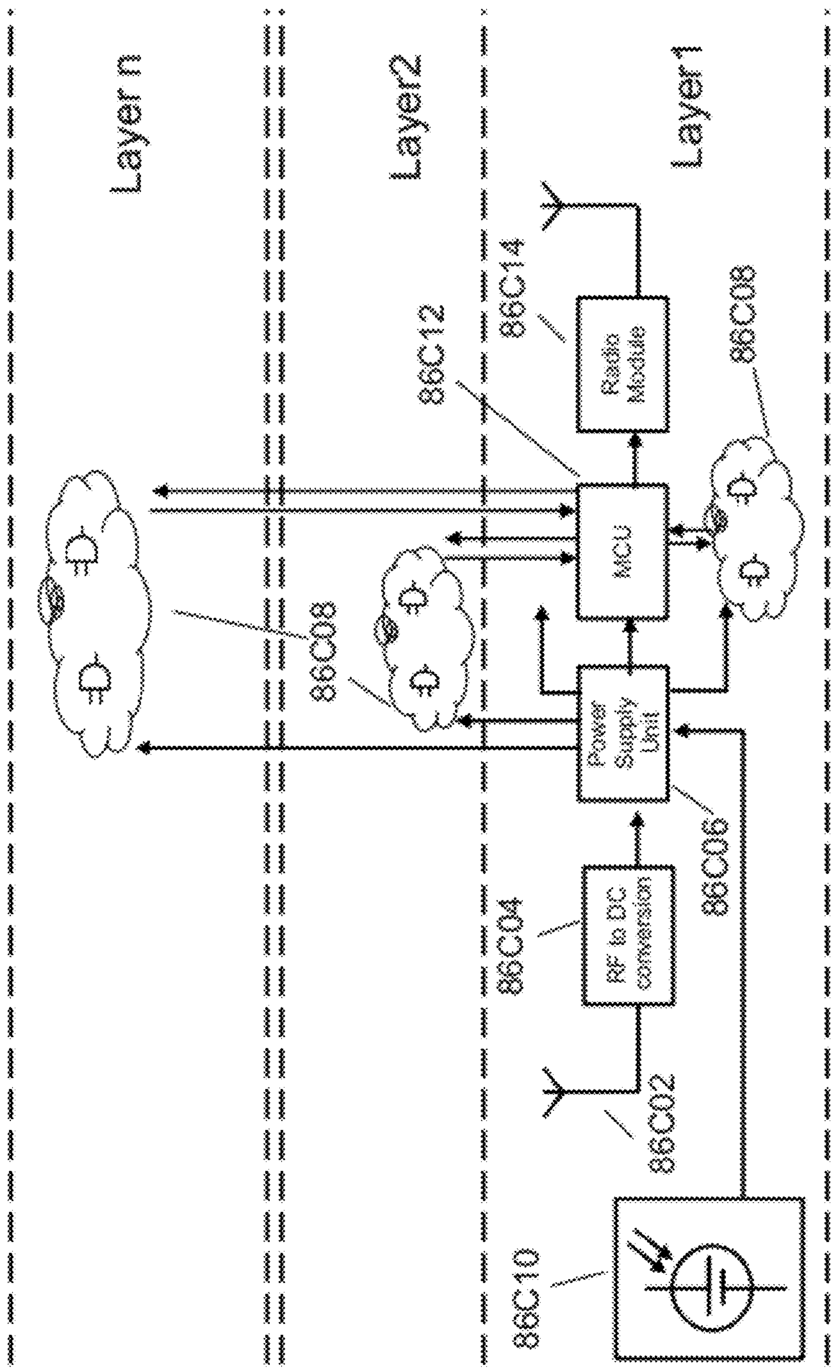
FIG. 86C is an exemplary drawing illustration of contactless testing.
Figure 86D:
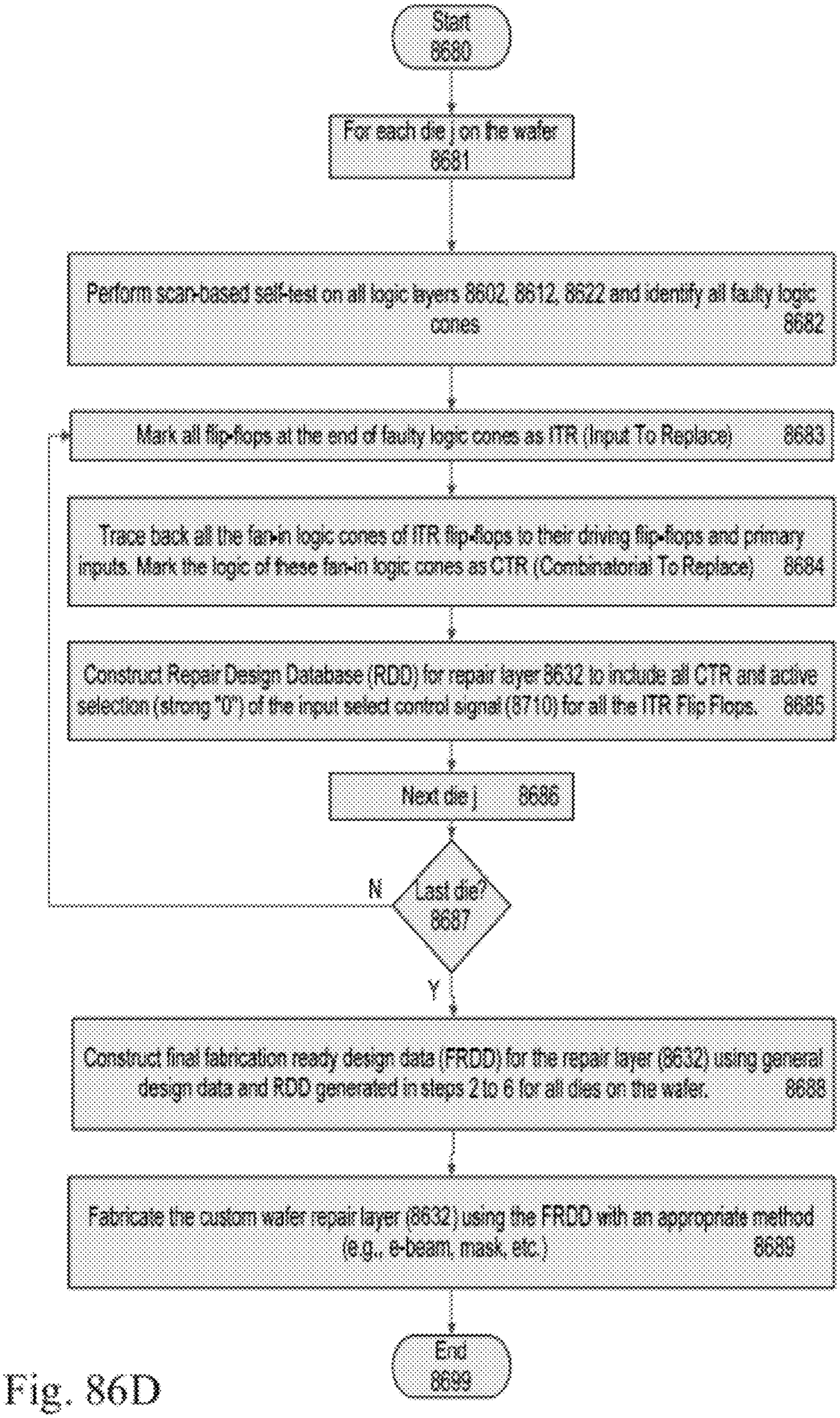
FIG. 86D is an exemplary drawing illustration of a methodology for yield repair of random logic in a 3D logic IC structured for repair as described with respect to FIGS. 86A to C, and FIG. 87.

FIG. 86D illustrates an exemplary methodology for yield repair of random logic in a 3D logic IC structured for repair as described with respect to FIGS. 86A to C, and FIG. 87. Start (8680) and for each die j on the wafer (8681) perform scan based self-test on all logic layers, for example, logic layer 8602, logic layer 8612, logic layer 8622, and identify all faulty logic cones (8682). Mark all flip-flops at the end of any found faulty logic cones as Input to Replace (ITR) (8683).

Trace back all the fan-in logic cones of ITR flip-flops to their driving flip-flops and primary inputs, and then mark the logic of these fan-in logic cones as Combinatorial To Replace (CTR) (8684). Construct a Repair Design Database (RDD) for layer of repair logic 8632 to include all CTRs and active selection (strong "0") of the input select control signal, for example, top control 8710 for all the ITR Flip Flops (8685). Proceed to next die j (8686). Is this die the last die (8687)? If no, then proceed to marking all flip-flops at the end of any found faulty logic cones as Input to Replace (ITR) (8683). If this is the last die (8687), then construct (8688) a final fabrication ready design data (FRDD) database that will be utilized for the layer of repair logic 8632 by using general design data and the RDD generated for all dies on the wafer. Fabricate (8689) the custom wafer repair layer that will be applied to layer of repair logic 8632 using the FRDD, such as, for example, a photolithographic mask or e-bean direct write control data base. This may end (8699) the logic repair methodology and process.

The elements of the present invention related to FIGS. 86A and 86B may need testing of the wafer during the fabrication phase, which might be of concern in respect to debris associated with making physical contact with a wafer for testing if the wafer may be probed when tested. FIG. 86C is a drawing illustration of an embodiment which may provide for contact-less automated self-testing. A contact-less power harvesting element might be used to harvest the electromagnetic energy directed at the circuit of interest by a coil base antenna 86C02, an RF to DC conversion circuit 86C04, and a power supply unit 86C06 to generate the necessary supply voltages to run the self-test circuits and the various 3D IC circuits 86C08 to be tested. Alternatively, a tiny photo voltaic cell 86C10 could be used to convert light beam energy to electric current which may be converted by the power supply unit 86C06 to the needed voltages. Once the circuits are powered, a Micro Control Unit 86C12 could perform a full scan test of all existing 3D IC circuits 86C08. The self-test could be full scan or other BIST (Built In Self-Test) alternatives. The test result could be transmitted using wireless radio module 86C14 to a base unit outside of the 3D IC wafer. Such contact less wafer testing could be used for the test as was referenced in respect to FIG. 86A and FIG. 86B or for other application such as wafer to wafer or die to wafer integration using TSVs. Alternative uses of contact-less testing could be applied to various combinations of the present invention. One example is where a carrier wafer method may be used to create a wafer transfer layer whereby transistors and the metal layers connecting them to form functional electronic circuits are constructed. Those functional circuits could be contactlessly tested to validate proper yield, and, if appropriate, actions to repair or activate built-in redundancy may be done. Then using layer transfer, the tested functional circuit layer may be transferred on top of another processed wafer 808, and may then be connected by utilizing one of the approaches presented before.

According to the yield repair design methodology, substantially all the primary outputs though branch 8706 may go up and substantially all primary normal inputs 8712 could be replaced by signals coming from the top repair input 8708.

An additional advantage of this yield repair design methodology may be the ability to reuse logic layers from one design to another design. For example, a 3D IC system may be designed wherein one of the layers may comprise a WiFi transceiver receiver. And such circuit may now be needed for a completely different 3D IC. It might be advantageous to reuse the same WiFi transceiver receiver in the new design by just having the receiver as one of the new 3D IC design layers to save the redesign effort and the associated NRE (non-recurring expense) for masks and etc. The reuse could be applied to many other functions, allowing the 3D IC to resemble an old way of integrating functions—the PC (printed circuit) Board. For such a concept to work well, a connectivity standard for the connection of wires up and down may be desirable.

Another application of these concepts could be the use of the upper layer to modify the clock timing by adjusting the clock of the actual device and its various fabricated elements. Scan circuits could be used to measure the clock skew and report it to an external design tool. The external design tool could construct the timing modification that would be applied by the clock modification circuits. A direct write ebeam could then be used to form the transistors and circuitry on the top layer to apply those clock modifications for a better yield and performance of the 3D IC end product.

An alternative approach to increase yield of complex systems through use of 3D structure is to duplicate the same design on two layers vertically stacked on top of each other and use BIST techniques similar to those described in the previous sections to identify and replace malfunctioning logic cones. This approach may prove particularly effective repairing very large ICs with very low yields at the manufacturing stage using one-time, or hard to reverse, repair structures such as, for example, antifuses or Direct-Write e-Beam customization. Similar repair approaches can also assist systems that may need a self-healing ability at every power-up sequence through use of memory-based repair structures as described with regard to FIG. 114 below.

FIG. 114 is a drawing illustration of one possible implementation of this concept. Two vertically stacked logic layers 11401 and 11402 may implement, for example, a substantially identical design. The circuitry of logic layer 11401 may be constructed on SOI wafers so that the performance of logic layer 11401 may more closely match logic layer 11402. The design (same on each layer) may be scan-based and may include at least one BIST Controller/Checker on each layer 11451 and 11452 that can communicate with each other either directly or through an external tester. 11421 is a representative Flip-Flop (FF) on the first layer that may have its corresponding FF 11422 on layer 2, each fed by its respective identical logic cones 11411 and 11412. The output of flip-flop 11421 may be coupled to the A input of multiplexer 11431 and the B input of multiplexer 11432 through vertical connection 11406, while the output of flip-flop 11422 may be coupled to the A input of multiplexer 11432 and the B input of multiplexer 11431 through vertical connection 11405. Each such output multiplexer may be respectively controlled from control points 11441 and 11442, and multiplexer outputs may drive the respective following logic stages at each layer. Thus, either logic cone 11411 and flip-flop 11421 or logic cone 11412 and flip-flop 11422 may be either programmably coupleable or selectively coupleable to the following logic stages at each layer.

The multiplexer control points 11441 and 11442 can be implemented using a memory cell, a fuse, an antifuse, or any other customizable element such as, for example, a metal link that can be customized by a Direct-Write e-Beam machine. If a memory cell is used, its contents can be stored in a ROM, a flash memory, or in some other non-volatile storage medium elsewhere in the 3D IC or in the system in which contents may be deployed and loaded upon a system power up, a system reset, or on-demand during system maintenance.

Upon power on, the BCC may initialize all multiplexer controls to select inputs A and runs diagnostic tests on the design on each layer. Failing Flip Flops (FFs) may be identified at each logic layer using, for example, scan and BIST techniques, and as long as there may be no pair of corresponding FF that fails, the BCCs can communicate with each other (directly or through an external tester) to determine which working FF to use and program the multiplexer controls 11441 and 11442 accordingly.

If multiplexer controls 11441 and 11442 are reprogrammable with respect to using memory bit cells, such test and repair process can potentially occur for every power on instance, or on demand, and the 3D IC can self-repair in-circuit. If the multiplexer controls are one-time programmable, the diagnostic and repair process may need to be performed using external equipment. It should be noted that the techniques for contact-less testing and repair as previously described with regard to FIG. 86C can be applicable in this situation.

An alternative embodiment of this concept can use multiplexing 8714 at the inputs of the FF such as described in FIG. 87. In that case both the Q and the inverted Q of FFs may be used, if present.

FIG. 114A illustrates an exemplary methodology for yield repair of failing logic cones in a 3D logic IC structured for repair as described with respect to FIG. 114. Start (11480) the procedure and identify all failing logic cones by performing a self-test on each logic layer (11481). For each faulty logic cone, the flip-flop at the faulty logic cone's end may be marked as Output To Replace (OTR) (11482). Each OTR flip-flop, for example, flip-flop 11421, on the first circuit logic layer 11401 may be checked to determine if its corresponding flip-flop, for example, flip-flop 11422, on the second circuit logic layer 11402 is also marked as OTR (11483). If both are marked OTR (11484), then proceed to repair failure (11488) and a failed attempt to repair may be reported. If both are not marked OTR, then for each OTR marked flip-flop on first circuit logic layer 11401, for this example, flip-flop 11421, mark its output selector multiplexer 11431 to select input B 11405 through selector control 11441, and mark the corresponding output selector multiplexer 11432 on second circuit logic layer 11402 to select input A 11405 through selector control 11442 (11485). As well, for each non-OTR marked flip-flop on first circuit logic layer 11401, for this example, flip-flop 11421, mark its output selector multiplexer 11431 to select input A 11406 through selector control 11441, and mark the corresponding output selector multiplexer 11432 on second circuit logic layer 11402 to select input A 11405 through selector control 11442 (11486). Then proceed to repair success (11487) and a successful repair may be reported.

Person skilled in the art will appreciate that this repair technique of selecting one of two possible outputs from two similar blocks vertically stacked on top of each other can be applied to other types of blocks in addition to FF described above. Examples of such include, but are not limited to, analog blocks, I/O, memory, and other blocks. In such cases the selection of the working output may need specialized multiplexing but the nature of the technique remains unchanged.

Such person will also appreciate that once the BIST diagnosis of both layers is complete, a mechanism similar to the one used to define the multiplexer controls can also be used to selectively power off unused sections of a logic layers to save on power dissipation.

Yet another variation on the illustrative embodiment of the invention may be to use vertical stacking for on the fly repair using redundancy concepts such as Triple (or higher) Modular Redundancy ("TMR"). TMR is a well-known concept in the high-reliability industry where three copies of each circuit are manufactured and their outputs are channeled through a majority voting circuitry. Such TMR system will continue to operate correctly as long as no more than a single fault occurs in any TMR block. A known problem in designing TMR ICs may be that when the circuitry is triplicated, the interconnections may become significantly longer which may slow down the system speed, and the routing may become more complex which may slow down system design. Another problem for TMR is that its design process may be expensive because of correspondingly large design size, while its market may be limited.

Vertical stacking offers a solution of replicating the system image on top of each other. FIG. 115 illustrates such a system with, for example, three logic layers 11501 11502 11503, where combinatorial logic may be replicated such as in logic cones 11511-1, 11511-2, and 11511-3, and FFs may be replicated such as 11521-1, 11521-2, and 11521-3. The circuitry of logic layer 11501 may be constructed on SOI wafers so that the performance of logic layer 11501 may more closely match logic layers 11502 and 11503. One of the layers, logic layer 11501 in this depiction, includes a majority voting circuitry 11531 that may arbitrate among the local FF output 11551 and the vertically stacked FF outputs 11552 and 11553 to produce a final fault tolerant FF output that needs to be distributed to all logic layers as 11541-1, 11541-2, 11541-3.

Person skilled in the art will appreciate that variations on this configuration are possible such as dedicating a separate layer just to the voting circuitry that will make logic layers 11501, 11502 and 11503 logically identical; relocating the voting circuitry to the input of the FFs rather than to its output; or extending the redundancy replication to more than 3 instances (and stacked layers).

The above mentioned method for designing Triple Modular Redundancy (TMR) addresses both of the mentioned weaknesses. First, there may be little or no additional routing congestion in any layer because of TMR, and the design at each layer can be optimally implemented in a single image rather than in triplicate. Second, any design implemented for a non high-reliability market can be converted to TMR design with minimal effort by vertical stacking of three original images and adding a majority voting circuitry either to one of the layers as in FIG. 115, to all three layers, or as a separate layer. A TMR circuit can be shipped from the factory with known errors present (masked by the TMR redundancy), or a Repair Layer can be added to repair any known errors for an even higher degree of reliability.

The exemplary embodiments discussed so far are primarily concerned with yield enhancement and repair in the factory prior to shipping a 3D IC to a customer. Another aspect of the present invention is providing redundancy and self-repair once the 3D IC is deployed in the field. This feature may be a desirable product characteristic because defects may occur in products tested as operating correctly in the factory. For example, defects can occur due to a delayed failure mechanism such as a defective gate dielectric in a transistor that develops into a short circuit between the gate and the underlying transistor source, drain or body. Immediately after fabrication, such a transistor may function correctly during factory testing, but with time and applied voltages and temperatures, the defect can develop into a failure which may be detected during subsequent tests in the field. Many other delayed failure mechanisms may be known. Regardless of the nature of the delayed defect, if it may create a logic error in the 3DIC then subsequent testing according to the present invention may be used to detect and repair it.

FIG. 119 illustrates an exemplary 3D IC generally indicated by 11900 according to an embodiment of the invention.

3D IC 11900 may include two layers labeled Layer 1 and Layer 2 and separated by a dashed line in the figure. Layer 1 and Layer 2 may be bonded together into a single 3D IC using methods known in the art. The electrical coupling of signals between Layer 1 and Layer 2 may be realized with Through-Silicon Via (TSV) or some other interlayer technology. Layer 1 and Layer 2 may each include a single layer of semiconductor devices called a Transistor Layer and its associated interconnections (typically realized in one or more physical Metal Layers) which are called Interconnection Layers. The combination of a Transistor Layer and one or more Interconnection Layers may be called a Circuit Layer. Layer 1 and Layer 2 may each include one or more Circuit Layers of devices and interconnections as a matter of design choice.

Despite differences in construction details, Layer 1 and Layer 2 in 3D IC 11900 may perform substantially identical logic functions. In some embodiments, Layer 1 and Layer 2 may each be fabricated using the same masks for all layers to reduce manufacturing costs. In other embodiments, there may be small variations on one or more mask layers. For example, there may be an on one of the mask layers which creates a different logic signal on each layer which can signal the control logic blocks on Layer 1 and Layer 2 that they may be the controllers Layer 1 and Layer 2 respectively. Other differences between the layers may be present as a matter of design choice.

Layer 1 may include Control Logic 11910, representative scan flip-flops 11911, 11912 and 11913, and representative combinational logic clouds 11914 and 11915, while Layer 2 may include Control Logic 11920, representative scan flip-flops 11921, 11922 and 11923, and representative logic clouds 11924 and 11925. Control Logic 11910 and scan flip-flops 11911, 11912 and 11913 may be coupled together to form a scan chain for set scan testing of combinational logic clouds 11914 and 11915 in a manner previously described. Control Logic 11920 and scan flip-flops 11921, 11922 and 11923 may be also coupled together to form a scan chain for set scan testing of combinational logic clouds 11924 and 11925. Control Logic blocks 11910 and 11920 may be coupled together to allow coordination of the testing on both Layers. In some embodiments, Control Logic blocks 11910 and 11920 may test either themselves or each other. If one of them is bad, the other may be used to control testing on both Layer 1 and Layer 2.

Persons of ordinary skill in the art will appreciate that the scan chains in FIG. 119 are representative only, that in a practical design there may be millions of flip-flops which may be broken into multiple scan chains, and the inventive principles disclosed herein apply regardless of the size and scale of the design.

As with previously described embodiments, the Layer 1 and Layer 2 scan chains may be used in the factory for a variety of testing purposes. For example, Layer 1 and Layer 2 may each have an associated Repair Layer (not shown in FIG. 119) which may be used to correct any defective logic cones or logic blocks which originally may have occurred on either Layer 1 or Layer 2 during their fabrication processes. Alternatively, a single Repair Layer may be shared by Layer 1 and Layer 2.

FIG. 120 illustrates exemplary scan flip-flop 12000 (surrounded by the dashed line in the figure) suitable for use with some embodiments of the invention. Scan flip-flop 12000 may be used for the scan flip-flop instances 11911, 11912, 11913, 11921, 11922 and 11923 in FIG. 119. Present in FIG. 120 is D-type flip-flop 12002 which may have a Q output coupled to the Q output of scan flip-flop 12000, a D input coupled to the output of multiplexer 12004, and a clock input coupled to the CLK signal. Multiplexer 12004 may also have a first data input coupled to the output of multiplexer 12006, a second data input coupled to the SI (Scan Input) input of scan flip-flop 12000, and a select input coupled to the SE (Scan Enable) signal. Multiplexer 12006 may have a first and second data inputs coupled to the D0 and D1 inputs of scan flip-flop 12000 and a select input coupled to the LAYER_SEL signal.

The SE, LAYER_SEL and CLK signals are not shown as coupled to input ports on scan flip-flop 12000 to avoid over complicating the disclosure—particularly in drawings like FIG. 119 where multiple instances of scan flip-flop 12000 appear and explicitly routing them would detract attention from the concepts being presented. In a practical design, all three of those signals may be typically coupled to an appropriate circuit for every instance of scan flip-flop 12000.

When asserted, the SE signal places scan flip-flop 12000 into scan mode causing multiplexer 12004 to gate the SI input to the D input of D-type flip-flop 12002. Since this signal may go to all scan flip-flops 12000 in a scan chain, thus connecting them together as a shift register allowing vectors to be shifted in and test results to be shifted out. When SE is not asserted, multiplexer 12004 may select the output of multiplexer 12006 to present to the D input of D-type flip-flop 12002.

The CLK signal is shown as an "internal" signal here since its origin will differ from embodiment to embodiment as a matter of design choice. In practical designs, a clock signal (or some variation of it) may be typically routed to every flip-flop in its functional domain. In some scan test architectures, CLK will be selected by a third multiplexer (not shown in FIG. 120) from a domain clock used in functional operation and a scan clock for use in scan testing. In such cases, the SCAN_EN signal may typically be coupled to the select input of the third multiplexer so that D-type flip-flop 12002 may be correctly clocked in both scan and functional modes of operation. In other scan architectures, the functional domain clock may be used as the scan clock during test modes and no additional multiplexer is needed. Persons of ordinary skill in the art will appreciate that many different scan architectures are known and will realize that the particular scan architecture in any given embodiment will be a matter of design choice and in no way limits the scope of the illustrated embodiments of the invention.

The LAYER_SEL signal may determine the data source of scan flip-flop 12000 in normal operating mode. As illustrated in FIG. 119, input D1 may be coupled to the output of the logic cone of the Layer (either Layer 1 or Layer 2) where scan flip-flop 12000 may be located, while input D0 may be coupled to the output of the corresponding logic cone on the other Layer. The default value for LAYER_SEL may be thus logic-1 which may select the output from the same Layer. Each scan flip-flop 12000 may have its own unique LAYER_SEL signal. This arrangement may allow a defective logic cone on one Layer to be programmably or selectively replaced by its counterpart on the other Layer. In such cases, the signal coupled to D1 being replaced may be called a Faulty Signal while the signal coupled to D0 replacing it may be called a Repair Signal.

FIG. 121A illustrates an exemplary 3D IC generally indicated by 12100. Like the embodiment of FIG. 119, 3D IC 12100 may include two Layers labeled Layer 1 and Layer 2 and separated by a dashed line in the drawing figure. Layer 1 may include Layer 1 Logic Cone 12110, scan flip-flop 12112, and XOR gate 12114, while Layer 2 may include Layer 2 Logic Cone 12120, scan flip-flop 12122, and XOR gate 12124. The scan flip-flop 12000 of FIG. 120 may be used for scan flip-flops 12112 and 12122, though the SI and other internal connections are not shown in FIG. 121A. The output of Layer 1 Logic Cone 12110 (labeled DATA1 in the drawing figure) may be coupled to the D1 input of scan flip-flop 12112 on Layer 1 and the D0 input of scan flip-flop 12122 on Layer 2. Similarly, the output of Layer 2 Logic Cone 12120 (labeled DATA2 in the drawing figure) may be coupled to the D1 input of scan flip-flop 12122 on Layer 2 and the D0 input of scan flip-flop 12112 on Layer 1. Each of the scan flip-flops 12112 and 12122 may have its own LAYER_SEL signal (not shown in FIG. 121A) that may select between its D0 and D1 inputs in a manner similar to that illustrated in FIG. 120.

XOR gate 12114 may have a first input coupled to DATA1, a second input coupled to DATA2, and an output coupled to signal ERROR1. Similarly, XOR gate 12124 may have a first input coupled to DATA2, a second input coupled to DATA1, and an output coupled to signal ERROR2. If the logic values present on the signals on DATA1 and DATA2 are not equal, ERROR1 and ERROR2 may equal logic-1 signifying there may be a logic error present. If the signals on DATA1 and DATA2 are equal, ERROR1 and ERROR2 may equal logic-0 signifying there may be no logic error present. Persons of ordinary skill in art will appreciate that the underlying assumption here may be that, for example, only one of the Logic Cones 12110 and 12120 may be bad simultaneously. Since both Layer 1 and Layer 2 may have already been factory tested, verified and, in some embodiments, repaired, the statistical likelihood of both logic cones developing a failure in the field may be extremely unlikely even without any factor repair, thus validating the assumption.

In 3DIC 12100, the testing may be done in a number of different ways as a matter of design choice. For example, the clock could be stopped occasionally and the status of the ERROR1 and ERROR2 signals monitored in a spot check manner during a system maintenance period. Alternatively, operation can be halted and scan vectors run with a comparison done on every vector. In some embodiments, a BIST testing scheme using Linear Feedback Shift Registers to generate pseudo-random vectors for Cyclic Redundancy Checking may be employed. These methods all involve stopping system operation and entering a test mode. Other methods of monitoring possible error conditions in real time will be discussed below.

In order to effect a repair in 3D IC 12100, two determinations may be typically made: (1) the location of the logic cone with the error, and (2) which of the two corresponding logic cones may be operating correctly at that location. Thus a method of monitoring the ERROR1 and ERROR2 signals and a method of controlling the LAYER_SEL signals of scan flip-flops 12112 and 12122 may be may be needed, though there may be other approaches. In a practical embodiment, a method of reading and writing the state of the LAYER_SEL signal may be needed for factory testing to verify that Layer 1 and Layer 2 are both operating correctly.

Typically, the LAYER_SEL signal for each scan flip-flop may be held in a programmable element, for example, a volatile memory circuit such as a latch storing one bit of binary data (not shown in FIG. 121A). In some embodiments, the correct value of each programmable element or latch may be determined at system power up, at a system reset, or on demand as a routine part of system maintenance. Alternatively, the correct value for each programmable element or latch may be determined at an earlier point in time and stored in a non-volatile medium like a flash memory or by programming antifuses internal to 3D IC 12100, or the values may be stored elsewhere in the system in which 3D IC 12100 is deployed. In those embodiments, the data stored in the non-volatile medium may be read from its storage location in some manner and written to the LAYER_SEL latches.

Various methods of monitoring ERROR1 and ERROR2 are possible. For example, a separate shift register chain on each Layer (not shown in FIG. 121A) could be employed to capture the ERROR1 and ERROR2 values, though this would carry a significant area penalty. Alternatively, the ERROR1 and ERROR2 signals could be coupled to scan flip-flops 12112 and 12122 respectively (not shown in FIG. 121A), captured in a test mode, and shifted out. This may carry less overhead per scan flip-flop, but may still be expensive.

The cost of monitoring the ERROR1 and ERROR2 signals can be reduced further if it is combined with the circuitry necessary to write and read the latches storing the LAYER_SEL information. In some embodiments, for example, the LAYER_SEL latch may be coupled to the corresponding scan flip-flop 12000 and may have its value read and written through the scan chain. Alternatively, the logic cone, the scan flip-flop, the XOR gate, and the LAYER_SEL latch may all be addressed using the same addressing circuitry.

Illustrated in FIG. 121B is circuitry for monitoring ERROR2 and controlling its associated LAYER_SEL latch by addressing in 3D IC 12100. Present in FIG. 121B is 3D IC 12100, a portion of the Layer 2 circuitry as discussed in FIG. 121A including scan flip-flop 12122 and XOR gate 12124. A substantially identical circuit (not shown in FIG. 121B) may be present on Layer 1 involving scan flip-flop 12112 and XOR gate 12114.

Also present in FIG. 121B is LAYER_SEL latch 12170 which may be coupled to scan flip-flop 12122 through the LAYER_SEL signal. The value of the data stored in latch 12170 may determine which logic cone may be used by scan flip-flop 12122 in normal operation. Latch 12170 may be coupled to COL_ADDR line 12174 (the column address line), ROW_ADDR line 12176 (the row address line) and COL BIT line 12178. These lines may be used to read and write the contents of latch 12170 in a manner similar to any SRAM circuit known in the art. In some embodiments, a complementary COL_BIT line (not shown in FIG. 121B) with inverted binary data may be present. In a logic design, whether implemented in full custom, semi-custom, gate array or ASIC design or some other design methodology, the scan flip-flops may not line up neatly in rows and columns the way memory bit cells do in a memory block. In some embodiments, a tool may be used to assign the scan flip-flops into virtual rows and columns for addressing purposes. Then the various virtual row and column lines would be routed like any other signals in the design.

The ERROR2 line 12172 may be read at the same address as latch 12170 using the circuit including N-channel transistors 12182, 12184 and 12186 and P-channel transistors 12190 and 12192. N-channel transistor 12182 may have a gate terminal coupled to ERROR2 line 12172, a source terminal coupled to ground, and a drain terminal coupled to the source of N-channel transistor 12184. N-channel transistor 12184 may have a gate terminal coupled to COL_ADDR line 12174, a source terminal coupled to N-channel transistor 12182, and a drain terminal coupled to the source of N-channel transistor 12186. N-channel transistor 12186 may have a gate terminal coupled to ROW_ADDR line 12176, a source terminal coupled to the drain N-channel transistor 12184, and a drain terminal coupled to the drain of P-channel transistor 12190 and the gate of P-channel transistor 12192 through line 12188. P-channel transistor 12190 may have a gate terminal coupled to ground, a source terminal coupled to the positive power supply, and a drain terminal coupled to line 12188. P-channel transistor 12192 may have a gate terminal coupled to line 12188, a source terminal coupled to the positive power supply, and a drain terminal coupled to COL_BIT line 12178.

If the particular ERROR2 line 12172 in FIG. 121B is not addressed (i.e., either COL_ADDR line 12174 equals the ground voltage level (logic-0) or ROW_ADDR line 12176 equals the ground voltage supply voltage level (logic-0)), then the transistor stack including the three N-channel transistors 12182, 12184 and 12186 will be non-conductive. The P-channel transistor 12190 may function as a weak pull-up device pulling the voltage level on line 12188 to the positive power supply voltage (logic-1) when the N-channel transistor stack is non-conductive. This may cause P-channel transistor 12192 to be non-conductive presenting high impedance to COL_BIT line 12178.

A weak pull-down (not shown in FIG. 121B) may be coupled to COL BIT line 12178. If all the memory bit cells coupled to COL_BIT line 12178 present a high impedance, then the weak pull-down may pull the voltage level to ground (logic-0).

If the particular ERROR2 line 12172 in FIG. 121B is addressed (i.e., both COL_ADDR line 12174 and ROW_ADDR line 12176 are at the positive power supply voltage level (logic-1)), then the transistor stack including the three N-channel transistors 12182, 12184 and 12186 may be non-conductive if ERROR2=logic-0 and conductive if ERROR2=logic-1. Thus the logic value of ERROR2 may be propagated through P-channel transistors 12190 and 12192 and onto the COL_BIT line 12178.

An illustrative advantage of the addressing scheme of FIG. 121B may be that a broadcast ready mode may be available by addressing all of the rows and columns simultaneously and monitoring all of the column bit lines 12178. If all the column bit lines 12178 are logic-0, all of the ERROR2 signals are logic-0 meaning there are no bad logic cones present on Layer 2. Since field correctable errors may be relatively rare, this can save a lot of time locating errors relative to a scan flip-flop chain approach. If one or more bit lines is logic-1, faulty logic cones may only be present on those columns and the row addresses can be cycled quickly to find their exact addresses. Another illustrative advantage of the scheme may be that large groups or all of the LAYER_SEL latches can be initialized simultaneously to the default value of logic-1 quickly during a power up or reset condition.

At each location where a faulty logic cone may be present, if any, the defect may be isolated to a particular layer so that the correctly functioning logic cone may be selected by the corresponding scan flip-flop on both Layer 1 and Layer 2. If a large non-volatile memory may be present in the 3D IC 12100 or in the external system, then automatic test pattern generated (ATPG) vectors may be used in a manner similar to the factory repair embodiments. In this case, the scan itself may be capable of identifying both the location and the correctly functioning layer. Unfortunately, this scan may require a large number of vectors and a correspondingly large amount of available non-volatile memory which may not be available in all embodiments.

Using some form of Built In Self-Test (BIST) may lead to the advantage of being self-contained inside 3D IC 12100 without needing the storage of large numbers of test vectors. Unfortunately, BIST tests may tend to be of the "go" or "no go" variety. The tests may identify the presence of an error, but may be not particularly good at diagnosing either the location or the nature of the fault. Fortunately, there may be ways to combine the monitoring of the error signals previously described with BIST techniques and appropriate design methodology to quickly determine the correct values of the LAYER_SEL latches.

FIG. 122 illustrates an exemplary portion of the logic design implemented in a 3D IC such as, for example, 11900 of FIG. 119 or 12100 of FIG. 121A. The logic design may be present on both Layer 1 and Layer 2 with substantially identical gate-level implementations. For example, all of the flip-flops (not illustrated in FIG. 122) in the design may be implemented using scan flip-flops similar or identical in function to scan flip-flop 12000 of FIG. 120. For example, all of the scan flip-flops on each Layer may have the sort of interconnections with the corresponding scan flip-flop on the other Layer as described in conjunction with FIG. 121A. For example, each scan flip-flop may have an associated error signal generator (e.g., an XOR gate) for detecting the presence of a faulty logic cone, and a LAYER_SEL latch to control which logic cone may be fed to the flip-flop in normal operating mode as described in conjunction with FIGS. 121A and 121B.

Present in FIG. 122 is an exemplary logic function block (LFB) 12200. Typically LFB 12200 may have a plurality of inputs, an exemplary instance being indicated by reference number 12202, and a plurality of outputs, an exemplary instance being indicated by reference number 12204. For example, LFB 12200 may be designed in a hierarchical manner, meaning that it typically may have smaller logic function blocks such as 12210 and 12220 instantiated within it. Circuits internal to LFBs 12210 and 12220 may be considered to be at a "lower" level of the hierarchy than circuits present in the "top" level of LFB 12200 which may be considered to be at a "higher" level in the hierarchy. LFB 12200 is exemplary only. Many other configurations may be possible. There may be more (or less) than two LFBs instantiated internal to LFB 12200. There may also be individual logic gates and other circuits instantiated internal to LFB 12200 not shown in FIG. 122 to avoid overcomplicating the disclosure. LFBs 12210 and 12220 may have internally instantiated even smaller blocks forming even lower levels in the hierarchy. Similarly, the LFB 12200 may itself be instantiated in another LFB at an even higher level of the hierarchy of the overall design.

Present in LFB 12200 may be Linear Feedback Shift Register (LFSR) circuit 12230 for generating pseudo-random input vectors for LFB 12200 in a manner well known in the art. In FIG. 122 one bit of LFSR 12230 may be associated with each of the inputs 12202 of LFB 12200. If an input 12202 couples directly to a flip-flop (for example, a scan flip-flop similar to scan flip-flop 12000) then that scan flip-flop may be modified to have the additional LFSR functionality to generate pseudo-random input vectors. If an input 12202 couples directly to combinatorial logic, it may be intercepted in test mode and its value determined and replaced by a corresponding bit in LFSR 12230 during testing. Alternatively, the LFSR 12230 may intercept all input signals during testing regardless of the type of circuitry it connects to internal to LFB 12200.

Thus during a BIST test, all the inputs of LFB 12200 may be exercised with pseudo-random input vectors generated by LFSR 12230. As is known in the art, LFSR 12230 may be a single LFSR or a number of smaller LFSRs as a matter of design choice. LFSR 12230 may be illustratively implemented using a primitive polynomial to generate a maximum length sequence of pseudo-random vectors. LFSR 12230 may need to be seeded to a known value, so that the sequence of pseudo-random vectors may be deterministic. The seeding logic can be inexpensively implemented internal to the LFSR 12230 flip-flops and initialized, for example, in response to a reset signal.

Also present in LFB 12200 is Cyclic Redundancy Check (CRC) circuit 12232 for generating a signature of the LFB 12200 outputs generated in response to the pseudo-random input vectors generated by LFSR 12230 in a manner well known in the art. In FIG. 122 one bit of CRC 12232 is associated with each of the outputs 12204 of LFB 12200. If an output 12204 couples directly to a flip-flop (for example, a scan flip-flop similar to scan flip-flop 12000), then that scan flip-flop may be modified to have the additional CRC functionality to generate the signature. If an output 12204 couples directly to combinatorial logic, it may be monitored in test mode and its value coupled to a corresponding bit in CRC 12232. Alternatively, all the bits in CRC may passively monitor an output regardless of the source of the signal internal to LFB 12200.

Thus during a BIST test, all the outputs of LFB 12200 may be analyzed to determine the correctness of their responses to the stimuli provided by the pseudo-random input vectors generated by LFSR 12230. As is known in the art, CRC 12232 may be a single CRC or a number of smaller CRCs as a matter of design choice. As known in the art, a CRC circuit may be a special case of an LFSR, with additional circuits present to merge the observed data into the pseudo-random pattern sequence generated by the base LFSR. The CRC 12232 may be illustratively implemented using a primitive polynomial to generate a maximum sequence of pseudo-random patterns. CRC 12232 may need to be seeded to a known value, so that the signature generated by the pseudo-random input vectors may be deterministic. The seeding logic can be inexpensively implemented internal to the LFSR 12230 flip-flops and initialized, for example, in response to a reset signal. After completion of the test, the value present in the CRC 12232 is compared to the known value of the signature. If all the bits in CRC 12232 match, the signature is valid and the LFB 12200 is deemed to be functioning correctly. If one or more of the bits in CRC 12232 does not match, the signature is invalid and the LFB 12200 is deemed to not be functioning correctly. The value of the expected signature can be inexpensively implemented internal to the CRC 12232 flip-flops and compared internally to CRC 12232 in response to an evaluate signal.

As shown in FIG. 122, LFB 12210 may include LFSR circuit 12212, CRC circuit 12214, and logic function 12216. Since its input/output structure may be analogous to that of LFB 12200, it can be tested in a similar manner albeit on a smaller scale. If LFB 12200 is instantiated into a larger block with a similar input/output structure, LFB 12200 may be tested as part of that larger block or tested separately as a matter of design choice. It may not be necessary that all blocks in the hierarchy have this input/output structure if it is deemed unnecessary to test them individually. An example of this may be LFB 12220 instantiated inside LFB 12200 which may not have an LFSR circuit on the inputs and a CRC circuit on the outputs and which is tested along with the rest of LFB 12200.

Persons of ordinary skill in the art will appreciate that other BIST test approaches are known in the art and that any of them may be used to determine if LFB 12200 is functional or faulty.

In order to repair a 3D IC like 3D IC 12100 of FIG. 121A using the block BIST approach, the part may be put in a test mode and the DATA1 and DATA2 signals may be compared at each scan flip-flop 12000 on Layer 1 and Layer 2 and the resulting ERROR1 and ERROR2 signals may be monitored as described in the above embodiments or possibly using some other method. The location of the faulty logic cone may be determined with regards to its location in the logic design hierarchy. For example, if the faulty logic cone may be located inside LFB 12210 then the BIST routine for, as one example, only that block may be run on both Layer 1 and Layer 2. The results of the two tests determine which of the blocks (and by implication which of the logic cones) is functional and which is faulty. Then the LAYER_SEL latches for the corresponding scan flip-flops 12000 can be set so that each receives the repair signal from the functional logic cone and ignores the faulty signal. Thus the layer determination can be made for a modest cost in hardware in a shorter period of time without the need for expensive ATPG testing.

FIG. 123 illustrates an alternative embodiment with the ability to perform field repair of individual logic cones. An exemplary 3D IC indicated generally by 12300 may include two layers labeled Layer 1 and Layer 2 and separated by a dashed line in the drawing figure. Layer 1 and Layer 2 may be bonded together to form 3D IC 12300 using methods known in the art and interconnected using TSVs or some other interlayer interconnect technology. Layer 1 may include Control Logic block 12310, scan flip-flops 12311 and 12312, multiplexers 12313 and 12314, and Logic cone 12315. Similarly, Layer 2 may include Control Logic block 12320, scan flip-flops 12321 and 12322, multiplexers 12323 and 12324, and Logic cone 12325.

In Layer 1, scan flip-flops 12311 and 12312 may be coupled in series with Control Logic block 12310 to form a scan chain. Scan flip-flops 12311 and 12312 can be ordinary scan flip-flops of a type known in the art. The Q outputs of scan flip-flops 12311 and 12312 may be coupled to the D1 data inputs of multiplexers 12313 and 12314 respectively. Representative logic cone 12315 may have a representative input coupled to the output of multiplexer 12313 and an output coupled to the D input of scan flip-flop 12312.

In Layer 2, scan flip-flops 12321 and 12322 may be coupled in series with Control Logic block 12320 to form a scan chain. Scan flip-flops 12321 and 12322 can be ordinary scan flip-flops of a type known in the art. The Q outputs of scan flip-flops 12321 and 12322 may be coupled to the D1 data inputs of multiplexers 12323 and 12324 respectively. Representative logic cone 12325 may have a representative input coupled to the output of multiplexer 12323 and an output coupled to the D input of scan flip-flop 12322.

The Q output of scan flip-flop 12311 may be coupled to the D0 input of multiplexer 12323, the Q output of scan flip-flop 12321 may be coupled to the D0 input of multiplexer 12313, the Q output of scan flip-flop 12312 may be coupled to the D0 input of multiplexer 12324, and the Q output of scan flip-flop 12322 may be coupled to the D0 input of multiplexer 12314. Control Logic block 12310 may be coupled to Control Logic block 12320 in a manner that allows coordination between testing functions between layers. In some embodiments, the Control Logic blocks 12310 and 12320 can test themselves or each other and, if one is faulty, the other can control testing on both layers. These interlayer couplings may be realized by TSVs or by some other interlayer interconnect technology.

The logic functions performed on Layer 1 may be substantially identical to the logic functions performed on Layer 2. The illustrative embodiment of 3D IC 12300 in FIG. 123 is similar to the embodiment of 3D IC 11900 shown in FIG. 119, with the primary difference being that the multiplexers used to implement the interlayer programmable or selectable cross couplings for logic cone replacement may be located immediately after the scan flip-flops instead of being immediately before them as in exemplary scan flip-flop 12000 of FIG. 120 and in exemplary 3D IC 11900 of FIG. 119.

FIG. 124 illustrates an exemplary 3D IC indicated generally by 12400 which may be also constructed using this approach. Exemplary 3D IC 12400 includes two Layers labeled Layer 1 and Layer 2 and separated by a dashed line in the drawing figure. Layer 1 and Layer 2 may be bonded together to form 3D IC 12400 and interconnected using TSVs or some other interlayer interconnect technology. Layer 1 comprises Layer 1 Logic Cone 12410, scan flip-flop 12412, multiplexer 12414, and XOR gate 12416. Similarly, Layer 2 includes Layer 2 Logic Cone 12420, scan flip-flop 12422, multiplexer 12424, and XOR gate 12426.

Layer 1 Logic Cone 12410 and Layer 2 Logic Cone 12420 may implement substantially identical logic functions. In order to detect a faulty logic cone, the output of the logic cones 12410 and 12420 may be captured in scan flip-flops 12412 and 12422 respectively in a test mode. The Q outputs of the scan flip-flops 12412 and 12422 are labeled Q1 and Q2 respectively in FIG. 124. Q1 and Q2 are compared using the XOR gates 12416 and 12426 to generate error signals ERROR1 and ERROR2 respectively. Each of the multiplexers 12414 and 12424 may have a select input coupled to a layer select latch (not shown in FIG. 124) illustratively located in the same layer as the corresponding multiplexer within relatively close proximity to allow selectable or programmable coupling of Q1 and Q2 to either DATA1 or DATA2.

All the methods of evaluating ERROR1 and ERROR2 described in conjunction with the embodiments of FIGS. 121A, 121B and 122 may be employed to evaluate ERROR1 and ERROR2 in FIG. 124. Similarly, once ERROR1 and ERROR2 are evaluated, the correct values may be applied to the layer select latches for the multiplexers 12414 and 12424 to effect a logic cone replacement if necessary. In this embodiment, logic cone replacement may also include replacing the associated scan flip-flop.

FIG. 125A illustrates an exemplary embodiment with a potentially more economical approach to realizing field repair. An exemplary 3D IC generally indicated by 12500 which includes two Layers labeled Layer 1 and Layer 2 and separated by a dashed line in the drawing figure. Each of Layer 1 and Layer 2 may include at least one Circuit Layer. Layer 1 and Layer 2 may be bonded together using techniques known in the art to form 3D IC 12500 and interconnected with TSVs, TLVs, or other interlayer interconnect technology. Each Layer further may include an instance of Logic Function Block 12510, each of which in turn may include an instance of Logic Function Block (LFB) 12520. LFB 12520 may include LSFR circuits on its inputs (not shown in FIG. 125A) and CRC circuits on its outputs (not shown in FIG. 125A) in a manner analogous to that described with respect to LFB 12200 in FIG. 122.

Each instance of LFB 12520 may have a plurality of multiplexers 12522 associated with its inputs and a plurality of multiplexers 12524 associated with its outputs. These multiplexers may be used to programmably or selectively replace the entire instance of LFB 12520 on either Layer 1 or Layer 2 with its counterpart on the other layer.

On power up, system reset, or on demand from control logic located internal to 3D IC 12500 or elsewhere in the system where 3D IC 12500 may be deployed, the various blocks in the hierarchy can be tested. Any faulty block at any level of the hierarchy with BIST capability may be programmably and selectively replaced by its corresponding instance on the other Layer. Since this may be determined at the block level, this decision can be made locally by the BIST control logic in each block (not shown in FIG. 125A), though some coordination may be illustratively required with higher level blocks in the hierarchy with regards to which Layer the plurality of multiplexers 12522 sources the inputs to the functional LFB 12520 in the case of multiple repairs in the same vicinity in the design hierarchy. Since both Layer 1 and Layer 2 may leave the factory fully functional, or alternatively nearly fully functional, a simple approach may be to designate one of the Layers, for example, Layer 1, as the primary functional layer. Then the BIST controllers of each block can coordinate locally and decide which block should have its inputs and outputs coupled to Layer 1 through the Layer 1 multiplexers 12522 and 12524.

Persons of ordinary skill in the art will appreciate that significant area can be saved by employing this embodiment. For example, since LFBs may be evaluated instead of individual logic cones, the interlayer selection multiplexers for each individual flip-flop like multiplexer 12006 in FIG. 120 and multiplexer 12414 in FIG. 124 can be removed along with the LAYER_SEL latches 12170 of FIG. 121B since this function may be now handled by the pluralities of multiplexers 12522 and 12524 in FIG. 125A, all of which may be controlled by one or more control signals in parallel. Similarly, the error signal generators (e.g., XOR gates 12114 and 12124 in FIGS. 121A and 12416 and 12426 in FIG. 124) and any circuitry needed to read them (e.g., coupling them to the scan flip-flops) or the addressing circuitry described in conjunction with FIG. 121B may also be removed, since in this embodiment entire Logic Function Blocks, rather than individual Logic Cones, may be replaced.

Even the scan chains may be removed in some embodiments. In embodiments where the scan chains may be removed, factory testing and repair may also have to rely on the block BIST circuits. When a bad block is detected, an entire new block may need to be crafted on the Repair Layer with e-Beam. Typically this may take more time than crafting a replacement logic cone due to the greater number of patterns to shape, and the area savings may need to be compared to the test time losses to determine the economically superior decision.

Removing the scan chains may entail a risk in the early debug and prototyping stage of the design, since BIST circuitry is not very good for diagnosing the nature of problems. If there may be a problem in the design itself, the absence of scan testing may make it harder to find and fix the problem, and the cost in terms of lost time to market can be very high and hard to quantify.

Another illustrative advantage to embodiments using the block BIST approach may be described in conjunction with FIG. 125B. One illustrated potential disadvantages to some of the earlier embodiments may be that the majority of circuitry on both Layer 1 and Layer 2 may be active during normal operation. Thus power can be substantially reduced relative to earlier embodiments by operating, for example, only one instance of a block on one of the layers whenever possible.

Present in FIG. 125B are 3D IC 12500, Layer 1 and Layer 2, and two instances each of LFBs 12510 and 12520, and pluralities of multiplexers 12522 and 12524 previously discussed. Also present in each Layer in FIG. 125B is a power select multiplexer 12530 associated with that layer's version of LFB 12520. Each power select multiplexer 12530 has an output coupled to the power terminal of its associated LFB 12520, a first select input coupled to the positive power supply (labeled VCC in the figure), and a second input coupled to the ground potential power supply (labeled GND in the figure). Each power select multiplexer 12530 may have a select input (not shown in FIG. 125B) coupled to control logic (also not shown in FIG. 125B), typically present in duplicate on Layer 1 and Layer 2 though it may be located elsewhere internal to 3D IC 12500 or possibly elsewhere in the system where 3D IC 12500 is deployed.

FIG. 125C illustrates an exemplary methodology for power saving yield repair of a 3D logic IC structured for repair as described with respect to FIGS. 114, 125A and 125B. Start (12580) the procedure and identify all failing logic cones in all logic layers by performing a self-test on each logic layer (12581). For each faulty logic cone, the flip-flop at the faulty logic cone's end may be marked as Output To Replace (OTR) (12582). Each OTR flip-flop, for example, flip-flop 11421, on the first circuit logic layer 11401 may be checked to determine if its corresponding flip-flop, for example, flip-flop 11422, on the second circuit logic layer 11402 is also marked as OTR (12583). If both are marked OTR (12584), then proceed to repair failure (12590) and a failed attempt to repair may be reported. If both are not marked OTR, then for each OTR marked flip-flop on first circuit logic layer 11401, for this example, flip-flop 11421, mark its output selector multiplexer 11431 to select input B 11405 through selector control 11441, and mark the corresponding output selector multiplexer 11432 on second circuit logic layer 11402 to select input A 11405 through selector control 11442 (12585). As well, for each non-OTR marked flip-flop on first circuit logic layer 11401, for this example, flip-flop 11421, mark its output selector multiplexer 11431 to select input A 11406 through selector control 11441, and mark the corresponding output selector multiplexer 11432 on second circuit logic layer 11402 to select input A 11405 through selector control 11442 (12586). For each first circuit logic layer 11401 flip-flop 11421 whose output selector multiplexer 11431 is marked to select input B 11405, trace back its fan-in cone and mark all feeding flip-flops on second circuit logic layer 11402 as Need Power (NP) (12587). Power may be turned off to each second circuit layer flip-flop 12522 (11422 equivalent) that is not marked NP using power select multiplexer 12530 (12588). Then proceed to power-saving repair success (12589) and a successful power-saving repair may be reported.

Persons of ordinary skill in the art will appreciate that there may be many ways to programmably or selectively power down a block inside an integrated circuit known in the art and that the use of power select multiplexer 12530 in the embodiment of FIG. 125B is exemplary only. Any method of powering down LFB 12520 may be within the scope of the present invention. For example, a power switch could be used for both VCC and GND. Alternatively, the power switch for GND could be omitted and the power supply node allowed to "float" down to ground when VCC is decoupled from LFB 12520. In some embodiments, VCC may be controlled by a transistor, like either a source follower or an emitter follower which may be itself controlled by a voltage regulator, and VCC may be removed by disabling or switching off the transistor in some way. Many other alternatives are possible.

In some embodiments, control logic (not shown in FIG. 125B) may use the BIST circuits present in each block to stitch together a single copy of the design (using each block's plurality of input and output multiplexers which function similarly to pluralities of multiplexers 12522 and 12524 associated with LFB 12520) including functional copies of all the LFBs. When this mapping is complete, all of the faulty LFBs and the unused functional LFBs may be powered off using their associated power select multiplexers (similar to power select multiplexer 12530). Thus the power consumption can be reduced to the level that a single copy of the design would require using standard two dimensional integrated circuit technology.

Alternatively, if a layer, for example, Layer 1 may be designated as the primary layer, then the BIST controllers in each block can independently determine which version of the block is to be used. Then the settings of the pluralities of multiplexers 12522 and 12524 may be set to couple the used block to Layer 1 and the settings of power select multiplexers 12530 can be set to power down the unused block. Typically, this should reduce the power consumption by half relative to embodiments where power select multiplexers 12530 or equivalent are not implemented.

There are test techniques known in the art that are a compromise between the detailed diagnostic capabilities of scan testing with the simplicity of BIST testing. In embodiments employing such schemes, each BIST block (smaller than a typical LFB, but typically including a few tens to a few hundreds of logic cones) may store a small number of initial states in particular scan flip-flops while most of the scan flip-flops can use a default value. CAD tools may be used to analyze the design's net-list to identify the necessary scan flip-flops to allow efficient testing.

During test mode, the BIST controller may shift in the initial values and then may start the clocking the design. The BIST controller may have a signature register which might be a CRC or some other circuit which monitors bits internal to the block being tested. After a predetermined number of clock cycles, the BIST controller may stop clocking the design, may shift out the data stored in the scan flip-flops while adding their contents to the block signature, and may compare the signature to a small number of stored signatures (one for each of the stored initial states).

This approach may have the illustrative advantage of not needing a large number of stored scan vectors and the "go" or "no go" simplicity of BIST testing. The test block may be less fine than identifying a single faulty logic cone, but much coarser than a large Logic Function Block. In general, the finer the test granularity (i.e., the smaller the size of the circuitry being substituted for faulty circuitry) the less chance of a delayed fault showing up in the same test block on both Layer 1 and Layer 2. Once the functional status of the BIST block has been determined, the appropriate values may be written to the latches controlling the interlayer multiplexers to replace a faulty BIST block on one if the layers, if necessary. In some embodiments, faulty and unused BIST blocks may be powered down to conserve power.

While discussions of the various exemplary embodiments described so far concern themselves with finding and repairing defective logic cones or logic function blocks in a static test mode, other embodiments of the invention can address failures due to noise or timing. For example, in 3D IC 11900 of FIG. 119 and in 3D IC 12300 of FIG. 123 the scan chains can be used to perform at-speed testing in a manner known in the art. One approach may involve shifting a vector in through the scan chains, applying two or more at-speed clock pulses, and then shifting out the results through the scan chain. This may catch any logic cones that are functionally correct at low speed testing but may be operating too slowly to function in the circuit at full clock speed. While this approach may allow field repair of slow logic cones, it may need the time, intelligence and memory capacity necessary to store, run, and evaluate scan vectors.

Another approach may be to use block BIST testing at power up, reset, or on-demand to over-clock each block at ever increasing frequencies until one fails, determine which layer version of the block is operating faster, and then substitute the faster block for the slower one at each instance in the design. This approach may have the more modest time, intelligence and memory requirements generally associated with block BIST testing, but it may still need placing of the 3D IC in a test mode.

FIG. 126 illustrates an embodiment where errors due to slow logic cones can be monitored in real time while the circuit may be in normal operating mode. An exemplary 3D IC generally indicated at 12600 may include two Layers labeled Layer 1 and Layer 2 that may be separated by a dashed line in the drawing figure. The Layers each may include one or more Circuit Layers and may be bonded together to form 3D IC 12600. The layers may be electrically coupled together using TSVs or some other interlayer interconnect technology.

FIG. 126 focuses on the operation of circuitry coupled to the output of a single Layer 2 Logic Cone 12620, though substantially identical circuitry may also be present on Layer 1 (not shown in FIG. 126). Also present in FIG. 126 may be scan flip-flop 12622 with its D input coupled to the output of Layer 2 Logic Cone 12620 and its Q output coupled to the D1 input of multiplexer 12624 through interlayer line 12612 labeled Q2 in the figure. Multiplexer 12624 may have an output DATA2 coupled to a logic cone (not shown in FIG. 126) and a D0 input may be coupled to the Q1 output of the Layer 1 flip-flop corresponding to scan flip-flop 12622 (not shown in the figure) through interlayer line 12610.

XOR gate 12626 may have a first input coupled to Ql, a second input coupled to Q2, and an output coupled to a first input of AND gate 12646. AND gate 12646 may also have a second input coupled to TEST_EN line 12648 and an output coupled to the Set input of RS flip-flop 3828. RS flip-flop may also have a Reset input coupled to Layer 2 Reset line 12630 and an output coupled to a first input of OR gate 12632 and the gate of N-channel transistor 12638. OR gate 12632 may also have a second input coupled to Layer 2 OR-chain Input line 12634 and an output coupled to Layer 2 OR-chain Output line 12636.

Layer 2 control logic (not shown in FIG. 126) may control the operation of XOR gate 12626, AND gate 12646, RS flip-flop 12628, and OR gate 12632. The TEST_EN line 12648 may be used to disable the testing process with regards to Q1 and Q2. This may be desirable in cases where, for example, a functional error may have already been repaired and differences between Q1 and Q2 may be routinely expected and would interfere with the background testing process looking for marginal timing errors.

Layer 2 Reset line 12630 may be used to reset the internal state of RS flip-flop 12628 to logic-0 along with all the other RS flip-flops associated with other logic cones on Layer 2. OR gate 12632 may be coupled together with all of the other OR-gates associated with other logic cones on Layer 2 to form a large Layer 2 distributed OR function coupled to all of the Layer 2 RS flip-flops like 12628 in FIG. 126. If all of the RS flip-flops may be reset to logic-0, then the output of the distributed OR function may be logic-0. If a difference in logic state may occur between the flip-flops generating the Q1 and Q2 signals, XOR gate 12626 may present a logic-1 through AND gate 12646 (if TEST_EN=logic-1) to the Set input of RS flip-flop 12628 causing it to change state and present a logic-1 to the first input of OR gate 12632, which in turn may produce a logic-1 at the output of the Layer 2 distributed OR function (not shown in FIG. 126) notifying the control logic (not shown in the figure) that an error may have occurred.

The control logic can then use the stack of N-channel transistors 12638, 12640 and 12642 to determine the location of the logic cone producing the error and sense it at point 12644. N-channel transistor 12638 may have a gate terminal coupled to the Q output of RS flip-flop 12628, a source terminal coupled to ground, and a drain terminal coupled to the source of transistor 12640. Transistor 12640 may have a gate terminal coupled to the row address line ROW_ADDR line, a source terminal coupled to the drain of n-channel transistor 12638, and a drain terminal coupled to the source of transistor 12642. Transistor 12642 may have a gate terminal coupled to the column address line COL_ADDR line, a source terminal coupled to the drain of transistor 12640, and a drain terminal coupled to the sense line SENSE.

The row and column addresses may be virtual addresses, since in a logic design the locations of the flip-flops may not be neatly arranged in rows and columns. In some embodiments of the invention, a Computer Aided Design (CAD) tool may be used to modify the net-list to correctly address each logic cone and then the ROW_ADDR and COL_ADDR signals may be routed like any other signal in the design.

This approach may be efficient for the control logic to cycle through the virtual address space. If COL_ADDR=ROW_ADDR=logic-1 and the state of RS flip-flop is logic-1, then the transistor stack will pull SENSE=logic-0. Thus a logic-1 will only occur at a virtual address location where the RS flip-flop has captured an error. Once an error has been detected, RS flip-flop 12628 can be reset to logic-0 with the Layer 2 Reset line 12630 where it will be able to detect another error in the future.

The control logic can be designed to handle an error in any of a number of ways. For example, errors can be logged and if a logic error occurs repeatedly for the same logic cone location, then a test mode can be entered to determine if a repair is necessary at that location. This is a good approach to handle intermittent errors resulting from marginal logic cones that only occasionally fail, for example, due to noise, and may be tested as functional in normal testing. Alternatively, action can be taken upon receipt of the first error notification as a matter of design choice.

As discussed earlier in conjunction with FIG. 27, using Triple Modular Redundancy (TMR) at the logic cone level can also function as an effective field repair method, though it may really create a high level of redundancy that can mask rather than repair errors due to delayed failure mechanisms or marginally slow logic cones. If factory repair is used to make sure all the equivalent logic cones on each layer test functional before the 3D IC is shipped from the factory, the level of redundancy may be even higher. The cost of having three layers versus having two layers, with or without a repair layer may be factored into determining an embodiment for any application.

An alternative TMR approach may be shown in exemplary 3D IC 12700 in FIG. 127. FIG. 127 illustrates substantially identical Layers labeled Layer 1, Layer 2 and Layer 3 separated by dashed lines in the figure. Layer 1, Layer 2 and Layer 3 may each include one or more circuit layers and are bonded together to form 3D IC 12700 using techniques known in the art. Layer 1 may include Layer 1 Logic Cone 12710, flip-flop 12714, and majority-of-three (MAJ3) gate 12716. Layer 2 may include Layer 2 Logic Cone 12720, flip-flop 12724, and MAJ3 gate 12726. Layer 3 may include Layer 3 Logic Cone 12730, flip-flop 12734, and MAJ3 gate 12736.

The logic cones 12710, 12720 and 12730 all may perform a substantially identical logic function. The flip-flops 12714, 12724 and 12734 may be illustratively scan flip-flops. If a Repair Layer is present (not shown in FIG. 127), then the flip-flop 8702 of FIG. 87 may be used to implement repair of a defective logic cone before 3D IC 12700 may be shipped from the factory. The MAJ3 gates 12716, 12726 and 12736 may compare the outputs from the three flip-flops 12714, 12724 and 12734 and output a logic value consistent with the majority of the inputs: specifically if two or three of the three inputs equal logic-0, then the MAJ3 gate may output logic-0; and if two or three of the three inputs equal logic-1, then the MAJ3 gate may output logic-1. Thus if one of the three logic cones or one of the three flip-flops is defective, the correct logic value may be present at the output of all three MAJ3 gates.

One illustrative advantage of the embodiment of FIG. 127 may be that Layer 1, Layer 2 or Layer 3 can all be fabricated using all or nearly all of the same masks. Another illustrative advantage may be that MAJ3 gates 12716, 12726 and 12736 can also effectively function as a Single Event Upset (SEU) filter for high reliability or radiation tolerant applications as described in Rezgui cited above.

Another TMR approach is shown in exemplary 3D IC 12800 in FIG. 128. In this embodiment, the MAJ3 gates may be placed between the logic cones and their respective flip-flops. Present in FIG. 128 are substantially identical Layers labeled Layer 1, Layer 2 and Layer 3 separated by dashed lines in the figure. Layer 1, Layer 2 and Layer 3 may each include one or more circuit layers and may be bonded together to form 3D IC 12800 using techniques known in the art. Layer 1 may include Layer 1 Logic Cone 12810, flip-flop 12814, and majority-of-three (MAJ3) gate 12812. Layer 2 may include Layer 2 Logic Cone 12820, flip-flop 12824, and MAJ3 gate 12822. Layer 3 may include Layer 3 Logic Cone 12830, flip-flop 12834, and MAJ3 gate 12832.

The logic cones 12810, 12820 and 12830 all may perform a substantially identical logic function. The flip-flops 12814, 12824 and 12834 may be illustratively scan flip-flops. If a Repair Layer is present (not shown in FIG. 128), then the flip-flop 8702 of FIG. 87 may be used to implement repair of a defective logic cone before 3D IC 12800 is shipped from the factory. The MAJ3 gates 12812, 12822 and 12832 may compare the outputs from the three logic cones 12810, 12820 and 12830 and may output a logic value which may be consistent with the majority of the inputs. Thus if one of the three logic cones is defective, the correct logic value may be present at the output of all three MAJ3 gates.

One illustrative advantage of the embodiment of FIG. 128 is that Layer 1, Layer 2 or Layer 3 can all be fabricated using all or nearly all of the same masks. Another illustrative advantage may be that MAJ3 gates 12716, 12726 and 12736 can also effectively function as a Single Event Transient (SET) filter for high reliability or radiation tolerant applications as described in Rezgui cited above.

Another TMR embodiment is shown in exemplary 3D IC 12900 in FIG. 129. In this embodiment, the MAJ3 gates may be placed between the logic cones and their respective flip-flops. FIG. 129 illustrates substantially identical Layers labeled Layer 1, Layer 2 and Layer 3 separated by dashed lines in the figure. Layer 1, Layer 2 and Layer 3 may each include one or more circuit layers and may be bonded together to form 3D IC 12900 using techniques known in the art. Layer 1 may include Layer 1 Logic Cone 12910, flip-flop 12914, and majority-of-three (MAJ3) gates 12912 and 12916. Layer 2 may include Layer 2 Logic Cone 12920, flip-flop 12924, and MAJ3 gates 12922 and 12926. Layer 3 may include Layer 3 Logic Cone 12930, flip-flop 12934, and MAJ3 gates 12932 and 12936.

The logic cones 12910, 12920 and 12930 all may perform a substantially identical logic function. The flip-flops 12914, 12924 and 12934 may be illustratively scan flip-flops. If a Repair Layer is present (not shown in FIG. 129), then the flip-flop 8702 of FIG. 87 may be used to implement repair of a defective logic cone before 3D IC 12900 is shipped from the factory. The MAJ3 gates 12912, 12922 and 12932 may compare the outputs from the three logic cones 12910, 12920 and 12930 and output a logic value consistent with the majority of the inputs. Similarly, the MAJ3 gates 12916, 12926 and 12936 may compare the outputs from the three flip-flops 12914, 12924 and 12934 and output a logic value consistent with the majority of the inputs. Thus if one of the three logic cones or one of the three flip-flops is defective, the correct logic value will be present at the output of all six of the MAJ3 gates.

One illustrative advantage of the embodiment of FIG. 129 is that Layer 1, Layer 2 or Layer 3 can all be fabricated using all or nearly all of the same masks. Another illustrative advantage may be that MAJ3 gates 12716, 12726 and 12736 also effectively function as a Single Event Transient (SET) filter while MAJ3 gates 12716, 12726 and 12736 may also effectively function as a Single Event Upset (SEU) filter for high reliability or radiation tolerant applications as described in Rezgui cited above.

Some embodiments of the invention can be applied to a large variety of commercial as well as high-reliability aerospace and military applications. The ability to fix defects in the factory with Repair Layers combined with the ability to automatically fix delayed defects (by masking them with three layer Triple Modular Redundancy (TMR) embodiments or replacing faulty circuits with two layer replacement embodiments) may allow the creation of much larger and more complex three dimensional systems than may be possible with conventional two dimensional integrated circuit (IC) technology. These various aspects of the present invention can be traded off against the cost requirements of the target application.

In order to reduce the cost of a 3D IC according to some embodiments of the present invention, it may be desirable to use the same set of masks to manufacture each Layer. This can be done by creating an identical structure of vias in an appropriate pattern on each layer and then offsetting it by a desired amount when aligning Layer 1 and Layer 2.

FIG. 130A illustrates a via pattern 13000 constructed on Layer 1 of 3D ICs like 11900, 12100, 12200, 12300, 12400, 12500 and 12600 previously discussed. At a minimum the metal overlap pad at each via location 13002, 13004, 13006 and 13008 may be present on the top and bottom metal layers of Layer 1. Via pattern 13000 may occur in proximity to each repair or replacement multiplexer on Layer 1 where via metal overlap pads 13002 and 13004 (labeled L1/D0 for Layer 1 input D0 in the figure) may be coupled to the D0 multiplexer input at that location, and via metal overlap pads 13006 and 13008 (labeled L1/D1 for Layer 1 input D1 in the figure) may be coupled to the D1 multiplexer input.

Similarly, FIG. 130B illustrates a substantially identical via pattern 13010 which may be constructed on Layer 2 of 3D ICs like 11900, 12100, 12200, 12300, 12400, 12500 and 12600 previously discussed. At a minimum the metal overlap pad at each via location 13012, 13014, 13016 and 13018 may be present on the top and bottom metal layers of Layer 2. Via pattern 13010 may occur in proximity to each repair or replacement multiplexer on Layer 2 where via metal overlap pads 13012 and 13014 (labeled L2/D0 for Layer 2 input D0 in the figure) may be coupled to the D0 multiplexer input at that location, and via metal overlap pads 13016 and 13018 (labeled L2/D1 for Layer 2 input D1 in the figure) may be coupled to the D1 multiplexer input.

FIG. 130C illustrates a top view where via patterns 13000 and 13010 may be aligned offset by one interlayer interconnection pitch. The interlayer interconnects may be TSVs or some other interlayer interconnect technology. FIG. 130C may illustrate via metal overlap pads 13002, 13004, 13006, 13008, 13012, 13014, 13016 and 13018 as previously discussed. In FIG. 130C, Layer 2 may be offset by one interlayer connection pitch to the right relative to Layer 1. This offset may cause via metal overlap pads 13004 and 13018 to physically overlap with each other. Similarly, this offset may cause via metal overlap pads 13006 and 13012 to physically overlap with each other. If Through Silicon Vias or other interlayer vertical coupling points are placed at these two overlap locations (using a single mask), then multiplexer input D1 of Layer 2 may be coupled to multiplexer input D0 of Layer 1 and multiplexer input D0 of Layer 2 may be coupled to multiplexer input D1 of Layer 1. This may be precisely the interlayer connection topology necessary to realize the repair or replacement of logic cones and functional blocks in, for example, the embodiments described with respect to FIGS. 121A and 123.

FIG. 130D illustrates a side view of a structure employing the technique described in conjunction with FIGS. 130A, 130B and 130C. FIG. 130D illustrates an exemplary 3D IC generally indicated by 13020 including two instances of Layer 13030 stacked together with the top instance labeled Layer 2 and the bottom instance labeled Layer 1 in the figure. Each instance of Layer 13020 may include an exemplary transistor 13031, an exemplary contact 13032, exemplary metal 1 13033, exemplary via 1 13034, exemplary metal 2 13035, exemplary via 2 13036, and exemplary metal 3 13037. The dashed oval labeled 13000 may indicate the part of the Layer 1 corresponding to via pattern 13000 in FIGS. 130A and 130C. Similarly, the dashed oval labeled 13010 may indicate the part of the Layer 2 corresponding to via pattern 13010 in FIGS. 130B and 130C. An interlayer via such as TSV 13040 in this example may be shown coupling the signal D1 of Layer 2 to the signal D0 of Layer 1. A second interlayer via, not shown since it is out of the plane of FIG. 130D, may couple the signal D01 of Layer 2 to the signal D1 of Layer 1. As can be seen in FIG. 130D, while Layer 1 may be identical to Layer 2, Layer 2 can be offset by one interlayer via pitch allowing the TSVs to correctly align to each layer while for example, only a single interlayer via mask may make the correct interlayer connections.

As previously discussed, in some embodiments of the present invention it may be desirable for the control logic on each Layer of a 3D IC to know which layer it is in. It may also be desirable to use all of the same masks for each of the Layers. In an embodiment using the one interlayer via pitch offset between layers to correctly couple the functional and repair connections, a different via pattern can be placed in proximity to the control logic to exploit the interlayer offset and uniquely identify each of the layers to its control logic.

FIG. 131A illustrates a via pattern 13100 which may be constructed on Layer 1 of 3D ICs like 11900, 12100, 12200, 12300, 12400, 12500 and 12600 previously discussed. At a minimum the metal overlap pad at each via location 13102, 13104, and 13106 may be present on the top and bottom metal layers of Layer 1. Via pattern 13100 may occur in proximity to control logic on Layer 1. Via metal overlap pad 13102 may be coupled to ground (labeled L1/G in the figure for Layer 1 Ground). Via metal overlap pad 13104 may be coupled to a signal named ID (labeled L1/ID in the figure for Layer 1 ID). Via metal overlap pad 13106 may be coupled to the power supply voltage (labeled L1/V in the figure for Layer 1 VCC).

FIG. 131B illustrates a via pattern 13110 which may be constructed on Layer 1 of 3D ICs like 11900, 12100, 12200, 12300, 12400, 12500 and 12600 as previously discussed. At a minimum the metal overlap pad at each via location 13112, 13114, and 13116 may be present on the top and bottom metal layers of Layer 2. Via pattern 13110 may occur in proximity to control logic on Layer 2. Via metal overlap pad 13112 may be coupled to ground (labeled L2/G in the figure for Layer 2 Ground). Via metal overlap pad 13114 may be coupled to a signal named ID (labeled L2/ID in the figure for Layer 2 ID). Via metal overlap pad 13116 may be coupled to the power supply voltage (labeled L2/V in the figure for Layer 2 VCC).

FIG. 131C illustrates a top view where via patterns 13100 and 13110 may be aligned offset by one interlayer interconnection pitch. The interlayer interconnects may be TSVs or some other interlayer interconnect technology. FIG. 130C illustrates via metal overlap pads 13102, 13104, 13106, 13112, 13114, and 13016 as previously discussed. In FIG. 130C, Layer 2 may be offset by one interlayer connection pitch to the right relative to Layer 1. This offset may cause via metal overlap pads 13104 and 13112 to physically overlap with each other. Similarly, this offset may cause via metal overlap pads 13106 and 13114 to physically overlap with each other. If Through Silicon Vias or other interlayer vertical coupling points may be placed at these two overlap locations (using a single mask) then the Layer 1 ID signal may be coupled to ground and the Layer 2 ID signal may be coupled to VCC. This configuration may allow the control logic in Layer 1 and Layer 2 to uniquely know their vertical position in the stack.

Persons of ordinary skill in the art will appreciate that the metal connections between Layer 1 and Layer 2 may typically be much larger including larger pads and numerous TSVs or other interlayer interconnections. This increased size may make alignment of the power supply nodes easy and ensures that L1/V and L2/V may both be at the positive power supply potential and that L1/G and L2/G may both be at ground potential.

Several embodiments of the invention may utilize Triple Modular Redundancy (TMR) distributed over three Layers. In such embodiments it may be desirable to use the same masks for all three Layers.

FIG. 132A illustrates a via metal overlap pattern 13200 including a 3×3 array of TSVs (or other interlayer coupling technology). The TMR interlayer connections may occur in the proximity of a majority-of-three (MAJ3) gate typically fanning in or out from either a flip-flop or functional block. Thus at each location on each of the three layers, the function f(X0, X1, X2)=MAJ3(X0, X1, X2) may be implemented where X0, X1 and X2 are the three inputs to the MAJ3 gate. For purposes of this discussion, the X0 input may always be coupled to the version of the signal generated on the same layer as the MAJ3 gate and the X1 and X2 inputs come from the other two layers.

In via metal overlap pattern 13200, via metal overlap pads 13202, 13212 and 13216 may be coupled to the X0 input of the MAJ3 gate on that layer, via metal overlap pads 13204, 13208 and 13218 may be coupled to the X1 input of the MAJ3 gate on that layer, and via metal overlap pads 13206, 13210 and 13214 may be coupled to the X2 input of the MAJ3 gate on that layer.

FIG. 132B illustrates an exemplary 3D IC generally indicated by 13220 having three Layers labeled Layer 1, Layer 2 and Layer 3 from bottom to top. Each layer may include an instance of via metal overlap pattern 13200 in the proximity of each MAJ3 gate used to implement a TMR related interlayer coupling. Layer 2 may be offset one interlayer via pitch to the right relative to Layer 1 while Layer 3 may be offset one interlayer via pitch to the right relative to Layer 2. The illustration in FIG. 132B may be an abstraction. While it may correctly show the two interlayer via pitch offsets in the horizontal direction, a person of ordinary skill in the art will realize that each row of via metal overlap pads in each instance of via metal overlap pattern 13200 may be horizontally aligned with the same row in the other instances.

Thus there may be three locations where a via metal overlap pad can be aligned on all three layers. FIG. 132B shows three interlayer vias 13230, 13240 and 13250 placed in those locations coupling Layer 1 to Layer 2 and three more interlayer vias 13232, 13242 and 13252 placed in those locations coupling Layer 2 to Layer 3. The same interlayer via mask may be used for both interlayer via fabrication steps.

Thus the interlayer vias 13230 and 13232 may be vertically aligned and couple together the Layer 1 X2 MAJ3 gate input, the Layer 2 X0 MAJ3 gate input, and the Layer 3 X1 MAJ3 gate input. Similarly, the interlayer vias 13240 and 13242 may be vertically aligned and couple together the Layer 1 X1 MAJ3 gate input, the Layer 2 X2 MAJ3 gate input, and the Layer 3 X0 MAJ3 gate input. Finally, the interlayer vias 13250 and 13252 may be vertically aligned and couple together the Layer 1 X0 MAJ3 gate input, the Layer 2 X1 MAJ3 gate input, and the Layer 3 X2 MAJ3 gate input. Since the X0 input of the MAJ3 gate in each layer may be driven from that layer, each driver may be coupled to a different MAJ3 gate input on each layer preventing drivers from being shorted together and the each MAJ3 gate on each layer may receive inputs from each of the three drivers on the three Layers.

Some embodiments of the invention can be applied to a large variety of commercial as well as high-reliability aerospace and military applications. The ability to fix defects in the factory with Repair Layers combined with the ability to automatically fix delayed defects (by masking them with three layer TMR embodiments or replacing faulty circuits with two layer replacement embodiments) may allow the creation of much larger and more complex three dimensional systems than may be possible with conventional two dimensional integrated circuit (IC) technology. These various aspects of the present invention can be traded off against the cost requirements of the target application.

For example, a 3D IC targeted at inexpensive consumer products where cost may be a dominant consideration might do factory repair to maximize yield in the factory but not include any field repair circuitry to minimize costs in products with short useful lifetimes. A 3D IC aimed at higher end consumer or lower end business products might use factory repair combined with two layer field replacement. A 3D IC targeted at enterprise class computing devices which balance cost and reliability might skip doing factory repair and use TMR for both acceptable yields as well as field repair. A 3D IC targeted at high reliability, military, aerospace, space, or radiation-tolerant applications might do factory repair to ensure that all three instances of every circuit may be fully functional and use TMR for field repair as well as SET and SEU filtering. Battery operated devices for the military market might add circuitry to allow the device to operate, for example, only one of the three TMR layers to save battery life and include a radiation detection circuit which automatically switches into TMR mode when needed if the operating environment may change. Many other combinations and tradeoffs may be possible within the scope of the illustrated embodiments of the invention.

It is worth noting that many of the principles of the invention may also applicable to conventional two dimensional integrated circuits (2D ICs). For example, an analogous of the two layer field repair embodiments could be built on a single layer with both versions of the duplicate circuitry on a single 2D IC employing the same cross connections between the duplicate versions. A programmable technology like, for example, fuses, antifuses, flash memory storage, etc., could be used to effect both factory repair and field repair. Similarly, analogous versions of some of the TMR embodiments may have unique topologies in 2D ICs as well as in 3D ICs which may also improve the yield or reliability of 2D IC systems if implemented on a single layer.

Some embodiments of the invention may be to use the concepts of repair and redundancy layers to implement extremely large designs that extend beyond the size of a single reticle, up to and inclusive of a full wafer. This concept of Wafer Scale Integration ("WSI") was attempted in the past by companies such as Trilogy Systems and was abandoned because of extremely low yield. The ability of some of the embodiments of the invention is to effect multiple repairs by using a repair layer, or use of masking multiple faults by using redundancy layers, the result may be to make WSI with very high yield a viable option.

One embodiment of the invention may improve WSI by using the Continuous Array (CA) concept described herein this document. In the case of WSI, however, the CA may extend beyond a single reticle and may potentially span the whole wafer. A custom mask may be used to define unused parts of the wafer which may be etched away.

Particular care must be taken when a design such as WSI crosses reticle boundaries. Alignment of features across a reticle boundary may be worse than the alignment of features within the reticle, and WSI designs must accommodate this potential misalignment. One way of addressing this is to use wider than minimum metal lines, with larger than minimum pitches, to cross the reticle boundary, while using a full lithography resolution within the reticle.

Another embodiment of the invention uses custom reticles for location on the wafer, creating a partial of a full custom design across the wafer. As in the previous case, wider lines and coarser line pitches may be used for reticle boundary crossing.

In substantially all WSI embodiments yield-enhancement may be achieved through fault masking techniques such as TMR, or through repair layers, as illustrated in FIG. 24 through FIG. 44 of U.S. patent application Ser. No. 13/098,997. At one extreme of granularity, a WSI repair layer on an individual flip flop level is illustrated in FIG. 114, which would provide a close to 100% yield even at a relatively high fault density. At the other end of granularity would be a block level repair scheme, with large granularity blocks at one layer effecting repair by replacing faulty blocks on the other layer. Connection techniques, such as illustrated in FIG. 21 of U.S. patent application Ser. No. 13/098,997, may be used to connect the peripheral input/output signals of a large-granularity block across vertical device layers.

In another variation on the WSI invention one can selectively replace blocks on one layer with blocks on the other layer to provide speed improvement rather than to effect logical repair.

In another variation on the WSI invention one can use vertical stacking techniques as illustrated in FIGS. 12A-12E of U.S. patent application Ser. No. 13/098,997 to flexibly provide variable amounts of specialized functions, and I/O in particular, to WSI designs.

FIG. 233A is a drawing illustration of prior art of reticle design. A reticle image 23300, which is the largest area that can be conventionally exposed on the wafer for patterning, may be made up of a multiplicity of identical integrated circuits (IC) such as IC 23301. In other cases (not shown) it can be made up of a multiplicity of non-identical ICs. Between the ICs may be dicing lanes 23303, substantially all fitting within the reticle boundary 23305.

FIG. 233B is a drawing illustration how such reticle image may be used to pattern the surface of wafer 23310 (partially shown), where the reticle image 23300 may repeatedly tile the wafer surface, which may use, for example, a step-and-repeat process.

FIG. 234A is a drawing illustration of this process as applied to WSI design. In the general case there may be multiple types of reticles such as CA style reticle 23420 and ASIC style reticle 23410. In this situation the reticle may include a multiplicity of connecting lines 23414 that may be perpendicular to the reticle edges and may touch the reticle boundary 23412. FIG. 234B is a drawing illustration where a large section of the wafer 23452 may have a combination of such reticle images, both ASIC style 23456 and CA style 23454, projected on adjacent sites of the wafer 23452. The inter-reticle boundary 23458 may be in this case spanned by the connecting lines 23414. Because the alignment across reticles is typically lower than the resolution within the reticle, the width and pitch of these inter-reticle wires may need to be increased to accommodate the inter-reticle alignment errors.

The array of reticles comprising a WSI design may extend as necessary across the wafer, up to and inclusive of the whole wafer. In the case where the WSI is smaller than the full wafer, multiple WSI designs may be placed on a single wafer.

Another use of embodiments of the invention may be in bringing to market, in a cost-effective manner, semiconductor devices in the early stage of introducing a new lithography process to the market, when the process yield is low. Currently, low yield poses major cost and availability challenges during the new lithography process introduction stage. Using any or all three-dimensional repair or fault tolerance techniques described in this invention and illustrated herein this document and in FIGS. 24 through 44 of U.S. patent application Ser. No. 13/098,997 would allow an inexpensive way to provide functional parts during that stage. Once the lithography process matures, its fault density may drop, and its yield increases, the repair layers may be inexpensively stripped off as part of device cost reduction, permanently steering signal propagation only within the base layer through programming or through tying-off the repair control logic. Another possibility would be to continue offering the original device as a higher-priced fault-tolerant option, while offering the stripped version without fault-tolerance at a lower price point.

Despite best simulation and verification efforts, many designs end up containing design bugs even after implementation and manufacturing as semiconductor devices. As design complexity, size, and speed grow, debugging modern devices after manufacturing, the so-called “post-silicon debugging,” becomes more difficult and more expensive. A major cause for this difficulty lies in the need to access a large number of signals over many clock cycles, on top of the fact that some design errors may manifest themselves only when the design is run at-speed. U.S. Pat. No. 7,296,201 describes how to overcome this difficulty by incorporating debugging elements into design itself, providing the ability to control and trace logic circuits, to assist in their debugging. DAFCA of Framingham, Mass. offers technology based on this principle.

FIG. 235 illustrates prior art of Design for Debug Infrastructure (“DFDI”) as described in M. Abramovici, “In-system Silicon Validation and Debug”, IEEE Design and Test of Computers 25(3), 2008. 23502 is a signal wrapper that allows controlling what gets propagated to a target object. 23504 is a multiplexer implementing this function. 23510 is an illustration of such DFDI using said signal wrappers 23512, in conjunction with CapStim 23514—capture/stimulus module—and PTE, a Programmable Trigger Engine 23516, make together a debug module that fully observes and controls signals of target validation module 23518. Yet this ability to debug comes at cost—the addition of DFDI to the design increases the size of the design while still being limited to the number of signals it can store and monitor.

The current invention of 3D devices, including monolithic 3D devices, offers new ways for cost-effective post-silicon debugging. One embodiment of the invention may be to use an uncommitted layer of repair logic 8632 such as illustrated in FIG. 86A and construct a dedicated DFDI to assist in debugging the functional logic layers 8602, 8612 and 8622 at-speed. FIG. 236 is a drawing illustration of such implementation, noting that signal wrapper 23502 is functionally equivalent to multiplexer 8714 of FIG. 87, which may already be present in front of every flip flop of layers or strata 23602, 23612, and 23622. The construction of such debug module 23636 on the uncommitted logic layer 23632 can be accomplished using Direct-Write e-Beam technology such as available from Advantest or Fujitsu to write custom masking patterns in photo-resist. The only difference may be that the new repair layer, the uncommitted logic layer 23632, now also includes register files needed to implement PTE and CaptStim and should be designed to work with the existing BIST controller/checker 23634. Using e-Beam is a cost effective option for this purpose as there is a need for only a small number of so-instrumented devices. Existing faults in the functional levels may also need to be repaired using the same e-beam technique. Alternatively, only fully functional devices can be selected for instrumentation with DFDI. After the design is debugged, the repair layer may be used for regular device repair for yield enhancement as originally intended.

Designing customized DFDI may in itself be an expensive endeavor. FIG. 237 is a drawing illustration of a variation on the invention. Functional logic layers or strata such as 23702, 23712 and 23722 with flip flops manufactured on a regular grid 23734 may be utilized. In such case a standardized DFDI layer 23732 that includes sophisticated debug module 23736 can be designed and used to replace the ad-hoc DFDI layer, made from the uncommitted logic layer 23632, which has the ability to efficiently observe and control all, or a very large number, of the flip flops on the functional logic layers. This standard DFDI can be placed on one or more early wafers just for the purpose of post-silicon debugging on multiple designs. This will make the design of a mask set for this DFDI layer cost-effective, spreading it across multiple projects. After the debugging is accomplished, this standard DFDI layer may be replaced by a regular repair layer, such as layer of repair logic 8632.

Another variation on the invention may use logic layers or strata that do not include flip flops manufactured on a regular grid but still uses standardized DFDI 23832 as described above. In this case a relatively inexpensive custom metal interconnect mask or masks may be designed to create an interposer 23834 to translate the irregular flip flop pattern on logic layers 23802, 23812 and 23822 to the regular interconnect of standardized DFDI layer. Similarly to the previous cases, once the post-silicon debugging is completed, the interposer and the standardized DFDI may be replaced by a regular repair layer, such as layer of repair logic 8632.

Another variation on the DFDI invention illustrated in FIGS. 237 and 238 may be to replace the DFDI layer or strata with a flexible and powerful standard BIST layer or strata. In contrast to a DFDI layer, the BIST layer may be potentially placed on every wafer throughout the design lifetime. While such BIST layer incurs additional manufacturing cost, it saves on using very expensive testers and probe cards. The mask cost and design cost of such BIST layer can be amortized over multiple designs as in the case of DFDI, and designs with irregularly placed flip flops can take advantage of it by using inexpensive interposer layers as illustrated in FIG. 238.

A person of ordinary skills in the art will recognize that the DFDI invention such as illustrated in FIGS. 237 and 238 can be replicated on a more than one stratum of a 3D semiconductor device to accommodate a broad range of design complexity.

Another serious problem with designing semiconductor devices as the lithography minimum feature size scales down may be signal re-buffering using repeaters. With the increased resistivity of metal traces in the deep sub-micron regime, signals need to be re-buffered at rapidly decreasing intervals to maintain circuit performance and immunity to circuit noise. This phenomenon has been described at length in "Prashant Saxena et al., Repeater Scaling and Its Impact on CAD, IEEE Transactions On Computer-Aided Design of Integrated Circuits and Systems, Vol. 23, No. 4, April 2004." The current invention offers a new way to minimize the routing impact of such re-buffering. Long distance signals are frequently routed on high metal layers to give them special treatment such as, for example, wire size or isolation from crosstalk. When signals present on high metal layers need re-buffering, an embodiment of the invention may be to use the active layer or strata above to insert repeaters, rather than drop the signal all the way to the diffusion layer of its current layer or strata. This approach may reduce the routing blockages created by the large number of vias formed when signals repeatedly need to move between high metal layers and the diffusion below, and suggests to selectively replace them with fewer vias to the active layer above.

Manufacturing wafers with advanced lithography and multiple metal layers may be expensive. Manufacturing three-dimensional devices, including monolithic 3D devices, where multiple advanced lithography layers or strata each with multiple metal layers are stacked on top of each other is even more expensive. The vertical stacking process offers new degree of freedom that can be leveraged with appropriate Computer Aided Design ("CAD") tools to lower the manufacturing cost.

Most designs are made of blocks, but the characteristics of these blocks may frequently not be uniform. Consequently, certain blocks may require fewer routing resources, while other blocks may require very dense routing resources. In two dimensional devices the block with the highest routing density demands dictates the number of metal layers for the whole device, even if some device regions may not need them. Three dimensional devices offer a new possibility of partitioning designs into multiple layers or strata based on the routing demands of the blocks assigned to each layer or strata.

Another variation on the invention may be to partition designs into blocks that may require a particular advanced process technology for reasons of density or speed, and into blocks that may have less demanding requirements for reasons of speed, area, voltage, power, or other technology parameters. Such partitioning may be carried into two or more partitions and consequently different process technologies or nodes may be used on different vertical layers or strata to provide an optimized fit to the design's logic and cost demands. This may be particularly important in mobile, mass-produced devices, where both cost and optimized power consumption are of paramount importance.

Synthesis CAD tools currently used in the industry for two-dimensional devices include a single target library. For three-dimensional designs these synthesis tools or design automation tools may need to be enhanced to support two or more target libraries and to be able to support synthesis for disparate technology characteristics of vertical layers or strata. Such disparate layers or strata will allow better cost or power optimization of three-dimensional designs.

FIG. 239 is an exemplary flowchart illustration for an algorithm partitioning a design into two target technologies, each to be placed on a separate layer or strata, when the synthesis tool or design automation tool does not support multiple target technologies. One technology, APL (Advanced Process Library), may be faster than the other, RPL (Relaxed Process Library), with concomitant higher power, higher manufacturing cost, or other differentiating design attributes. The two target technologies may be two different process nodes, wherein one process node, such as the APL, may be more advanced in technology than the other process node, such as the RPL. The RPL process node may employ much lower cost lithography tools and have lower manufacturing costs than the APL.

The partitioning may start with synthesis into APL with a target performance. Once complete, timing analysis may be done on the design, and paths may be sorted by timing slack. The total estimated chip area A(t) may be computed and reasonable margins may be added in anticipation of routing congestion and buffer insertion. The number of vertical layers S may be selected and the overall footprint A(t)/S may be computed.

In the first phase components belonging to paths estimated to require APL, based on timing slack below selected threshold Th, may be set aside (tagged APL). The area of these components may be computed to be A(ap1). If A(ap1) represents a fraction of total area A(t) greater than (S−1)/S then the process terminates and no partitioning into APL and RPL is possible—the whole design needs to be in the APL.

If the fraction of the design that requires APL is smaller than (S−1)/S then it is possible to have at least one layer of RPL. The partitioning process now starts from the largest slack path and towards lower slack paths. It tentatively tags all components of those paths that are not tagged APL with RPL, while accumulating the area of the marked components as A(rp1). When A(rp1) exceeds the area of a complete layer, A(t)/S, the components tentatively marked RPL may be permanently tagged RPL and the process continues after resetting A(rp1) to zero. If all paths are revisited and the components tentatively tagged RPL do not make for an area of a complete layer or strata, their tagging may be reversed back to APL and the process is terminated. The reason is that we want to err on the side of caution and a layer or strata should be an APL layer if it contains a mix of APL and RPL components.

The process as described assumes the availability of equivalent components in both APL and RPL technology. Ordinary persons skilled in the art will recognize that variations on this process can be done to accommodate non-equivalent technology libraries through remapping of the RPL-tagged components in a subsequent synthesis pass to an RPL target library, while marking all the APL-tagged components as untouchable. Similarly, different area requirements between APL and RPL can be accommodated through scaling and de-rating factors at the decision making points of the flow. Moreover, the term layer, when used in the context of layers of mono-crystalline silicon and associated transistors, interconnect, and other associated device structures in a 3D device, such as, for example, uncommitted layer of repair logic 8632, may also be referred to as stratum or strata.

The partitioning process described above can be re-applied to the resulting partitions to produce multi-way partitioning and further optimize the design to minimize cost and power while meeting performance objectives.

While embodiments and applications of the present invention have been shown and described, it would be apparent to those of ordinary skill in the art that many more modifications than mentioned above are possible without departing from the inventive concepts herein. The invention, therefore, is not to be limited except by the spirit of the appended claims.

Figure 13:
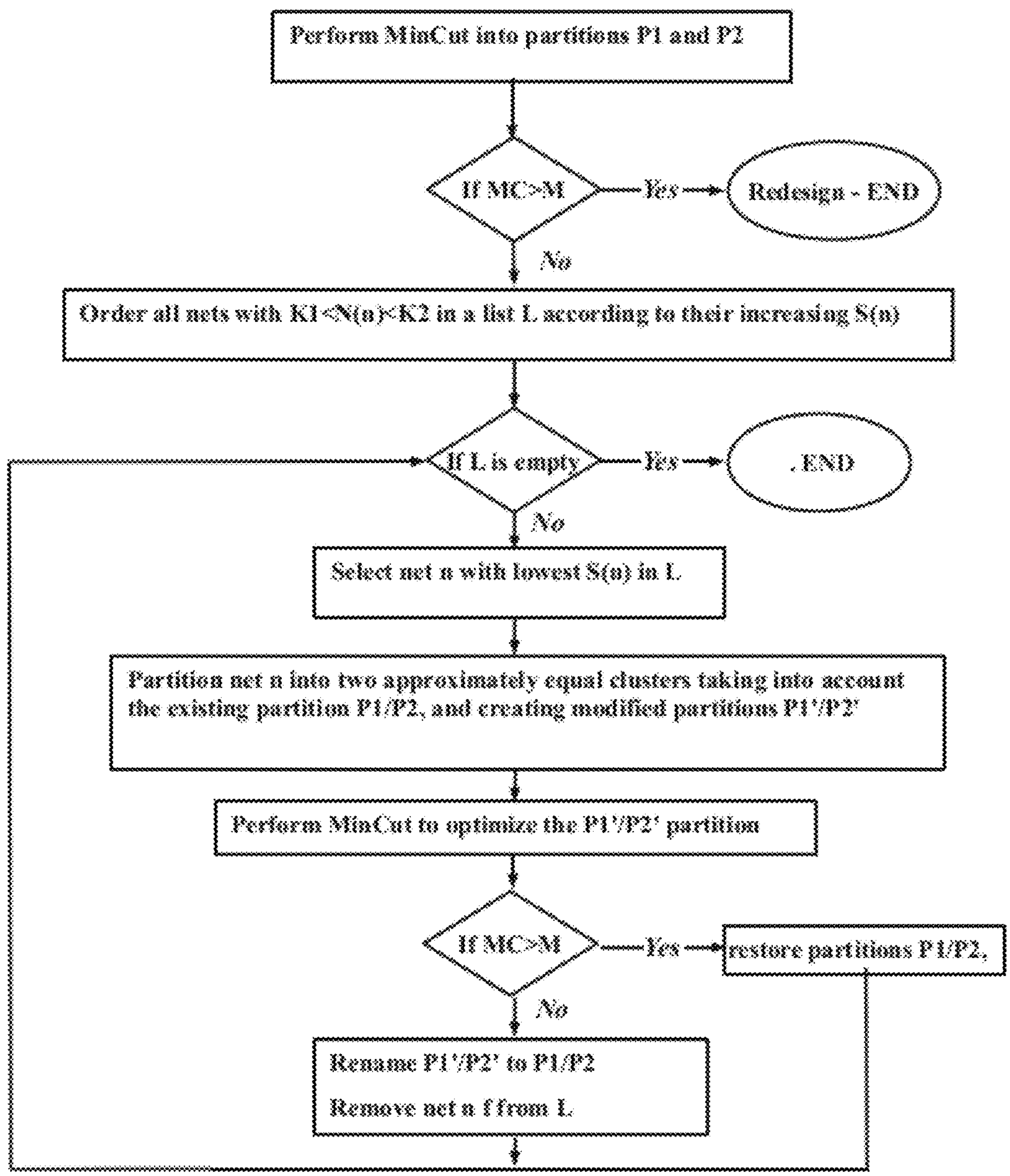
FIG. 13 is an exemplary drawing illustration of a flow chart for 3D logic partitioning.

FIG. 13 is a flow-chart illustration for 3D logic partitioning. The partitioning of a logic design to two or more vertically connected dies may present a different challenge for a Place and Route—P&R—tool. A place and route tool may be a type of CAD software capable of operating on libraries of logic cells (as well as libraries of other types of cells) as previously discussed. The common layout flow of prior art P & R tools may typically start with planning the placement followed by the routing. But the design of the logic of vertically connected dies may give priority to the much-reduced frequency of connections between dies and may create a need for a special design flow and CAD software specifically to support the design flow. In fact, a 3D system might merit planning some of the routing first as presented in the flows of FIG. 13.

The flow chart of FIG. 13 uses the following terms:

M—The number of TSVs available for logic;

N(n)—The number of nodes connected to net n;

S(n)—The median slack of net n;

MinCut—a known algorithm to partition logic design (netlist) to two pieces about equal in size with a minimum number of nets (MC) connecting the pieces;

MC—number of nets connecting the two partitions;

K1, K2—Two parameters selected by the designer.

One idea of the proposed flow of FIG. 13 may be to construct a list of nets in the logic design that connect more than K1 nodes and less than K2 nodes. K1 and K2 are parameters that could be selected by the designer and could be modified in an iterative process. In an embodiment, K1 should be high enough so to limit the number of nets put into the list. The flow's objective may be to assign the TSVs to the nets that have tight timing constraints—critical nets. And also may have many nodes whereby having the ability to spread the placement on multiple die help to reduce the overall physical length to meet the timing constraints. The number of nets in the list may be close but smaller than the number of TSVs. Accordingly, K1 should be set high enough to achieve this objective. K2 may be the upper boundary for nets with the number of nodes N(n) that would justify special treatment.

Critical nets may be identified usually by using static timing analysis of the design to identify the critical paths and the available "slack" time on these paths, and pass the constraints for these paths to the floor planning, layout, and routing tools so that the final design is not degraded beyond the requirement.

Once the list is constructed it may be priority-ordered according to increasing slack, or the median slack, S(n), of the nets. Then, using a partitioning algorithm, such as, but not limited to, MinCut, the design may be split into two parts, with the highest priority nets split about equally between the two parts. The objective may be to give the nets that have tight slack a better chance to be placed close enough to meet the timing challenge. Those nets that have higher than K1 nodes may tend to get spread over a larger area, and by spreading into three dimensions, a better chance to meet the timing challenge may be obtained.

The Flow of FIG. 13 suggests an iterative process of allocating the TSVs to those nets that have many nodes and are with the tightest timing challenge, or smallest slack.

The same Flow could be adjusted to three-way partition or any other number according to the number of dies the logic will be spread on.

Constructing a 3D Configurable System including antifuse based logic also provides features that may implement yield enhancement through utilizing redundancies. This may be even more convenient in a 3D structure of the embodiments of the invention because the memories may not be sprinkled between the logic but may rather be concentrated in the memory die, which may be vertically connected to the logic die. Constructing redundancy in the memory, and the proper self-repair flow, may have a smaller effect on the logic and system performance.

The potential dicing streets of the continuous array according to some embodiments of this invention may represent some loss of silicon area. The narrower the street the lower the loss may be, and therefore, it may be illustratively advantageous to use advanced dicing techniques that can create and work with narrow streets.

One such advanced dicing technique may be the use of lasers for dicing the 3D IC wafers. Laser dicing techniques, including the use of water jets to cool the substrate and remove debris, may be employed to minimize damage to the 3D IC structures and may also be utilized to cut sensitive layers in the 3D IC, and then a conventional saw finish may be used.

An additional illustrative advantage of the 3D Configurable System of various embodiments of this invention may be a reduction in testing cost. This reduction may be the result of building a unique system by using standard 'Lego®' blocks. Testing standard blocks could reduce the cost of testing by using standard probe cards and standard test programs.

The disclosure may present two forms of 3D IC system, first by using TSV and second by using the method referred to herein as the 'Attic' described in, for example, FIGS. 21 to 35 and 39 to 40. Those two methods could even work together as a devices could have multiple layers of mono- or poly-crystalline silicon produced using layer transfer or deposits and the techniques referred to herein as the 'Foundation' and the 'Attic' and then connected together using TSV. The most significant difference may be that prior TSVs can be associated with a relatively large misalignment (about 1 micron) and limited connections (TSV) per mm sq. of about 10,000 for a connected fully fabricated device while the disclosed layer transfer techniques allow 3D structures with a very small misalignment (less than about 10 nm) and high number of connections (vias) per mm sq. of about 100,000,000, since they may be produced in an integrated fabrication flow. An advantage of 3D using TSV may be the ability to test each device before integrating it and utilize the Known Good Die (KGD) in the 3D stack or system. This ability may be very helpful to provide good yield and reasonable costs of the 3D Integrated System.

An additional alternative of the present invention may be a method to allow redundancy so that the highly integrated 3D systems using the layer transfer technique could be produced with good yield. For the purpose of illustrating this redundancy according to some illustrative embodiments of the invention, the programmable tile array presented in FIGS. 11A, 36-38 may be used.

Figure 41:
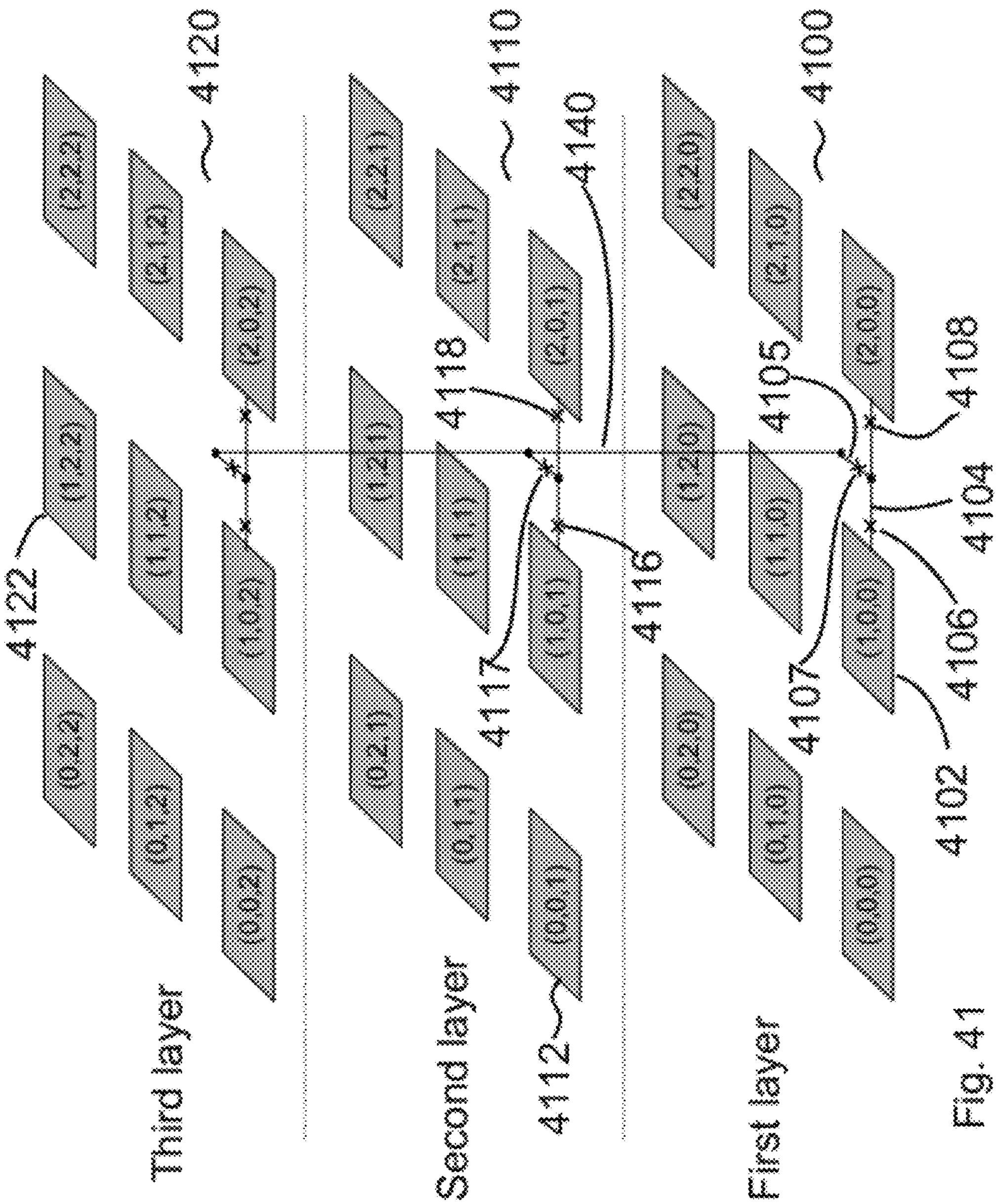
FIG. 41 is an exemplary drawing illustration of a 3D IC system with redundancy.

FIG. 41 is a drawing illustration of a 3D IC system with redundancy. It illustrates a 3D IC programmable system including: first programmable layer 4100 of 3×3 tiles 4102, overlaid by second programmable layer 4110 of 3×3 tiles 4112, overlaid by third programmable layer 4120 of 3×3 tiles 4122. Between a tile and its neighbor tile in the layer there may be many programmable connections 4104. The programmable element 4106 could include, for example, anti-fuse, pass transistor controlled driver, floating gate flash transistor, or similar electrically programmable element. An example of a commercial anti-fuse may be the oxide fuse of Kilopass Technology. Each inter-tile connection 4104 may have a branch out programmable connection 4105 connected to inter-layer vertical connection 4140. The end product may be designed so that at least one layer such as second programmable layer 4110 can be left for redundancy.

When the end product programmable system may be programmed for the end application, each tile can run its own Built-in Test, for example, by using its own MCU. A tile detected to have a defect may be replaced by the tile in the redundancy layer, such as second programmable layer 4110. The replacement may be done by the tile that may be at the same location but in the redundancy layer and therefore it may have an acceptable impact on the overall product functionality and performance. For example, if tile (1,0,0) has a defect then tile (1,0,1) may be programmed to have exactly the same function and may replace tile (1,0,0) by properly setting the inter tile programmable connections. Therefore, if defective tile (1,0,0) was supposed to be connected to tile (2,0,0) by connection 4104 with programmable element 4106, then programmable element 4106 may be turned off and programmable elements 4116, 4117, 4107 will be turned on instead. A similar multilayer connection structure may be used for any connection in or out of a repeating tile. So if the tile has a defect, the redundant tile of the redundant layer may be programmed to the defected tile functionality and the multilayer inter tile structure may be activated to disconnect the faulty tile and connect the redundant tile. The inter layer vertical connection 4140 could be also used when tile (2,0,0) is defective to insert tile (2,0,1), of the redundant layer, instead. In such case (2,0,1) may be programmed to have exactly the same function as tile (2,0,0), programmable element 4108 may be turned off and programmable elements 4118, 4117, 4107 may be turned on instead. This testing could be done from off chip rather than a BIST MCU.

Figure 41A:
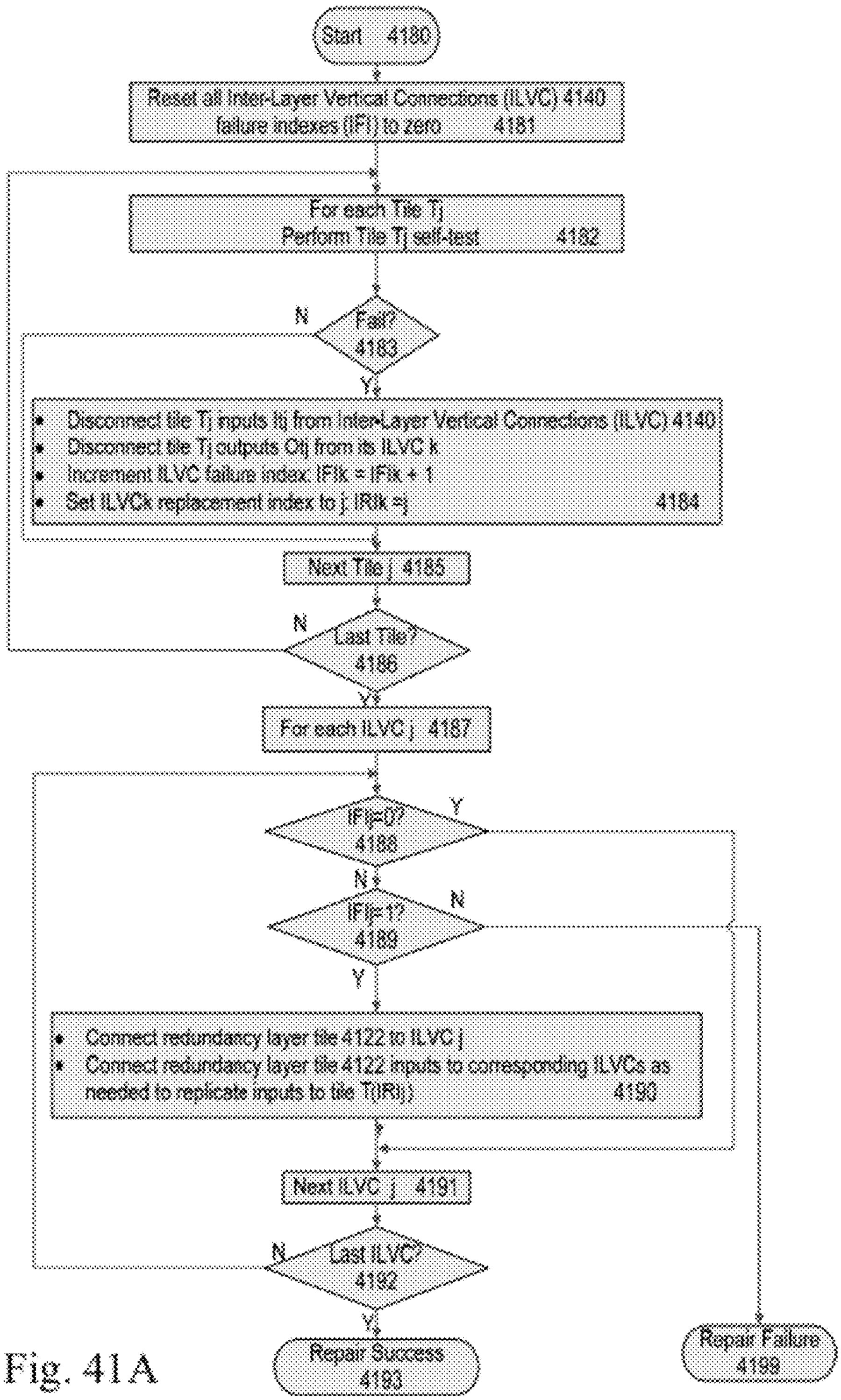
FIG. 41A is an exemplary drawing illustration of a methodology for a tile detecting a defect and attempting to be replaced by a tile in the redundancy layer as described with respect to FIG. 41.

FIG. 41A illustrates an exemplary methodology for a tile detecting a defect and attempting to be replaced by a tile in the redundancy layer as described with respect to FIG. 41. Start (4180) and each MCU resets all inter-layer vertical connections (ILVC) 4140 failure indexes (IFI to zero (4181). For each Tile Tj MCU performs tile self-test (4182). Did tile Tj self-test fail (4183)? If No, then proceed to next Tile j (4185). If tile Tj self-test fail did fail, then MCU may control (4184) disconnection of tile Tj's inputs from the ILVC 4140, the disconnection of tile Tj's output Otj from its ILVC k, the incrementing of ILVC failure index IKlk by adding 1 to the previous IFlk value, and the setting of the ILVCk replacement index to j, i.e., the IRlk value equals j. Then proceed to next Tile j (4185). Is the tile of next Tile j (4185) the last tile (4186)? If no, then proceed to perform a tile self-test (4182) on that next tile. For each ILVC, then perform steps 4188, 4189, 4190, 4191 as needed. For each specific ILVC up to and including ILVCj, is the corresponding IFlj equal to zero (4188)? If yes, then proceed to next ILVC j (4187). If no, then is IFlj equal to one (4189)? If no, then proceed to report a repair failure (4199). If the IFlj is equal to one, then the MCU may control (4190) connection of redundancy layer tile 4122 to ILVCj and connection of redundancy layer tile 4122 inputs to the corresponding ILVCs as needed to replicate inputs to Tile IRlj. Then proceed to next ILVCj (4191). Is this the last ILVC (4192)? If no, then proceed to determining if the corresponding IFlj equal to zero (4188). If this is the last ILVC (4192), then proceed to reporting repair success (4193). This may end the procedure.

An additional embodiment of the invention may be a modified TSV (Through Silicon Via) flow. This flow may be for wafer-to-wafer TSV and may provide a technique whereby the thickness of the added wafer may be reduced to about 1 micrometer (micron). FIGS. 93 A to D illustrate such a technique. The first wafer 9302 may be the base on top of which the 'hybrid' 3D structure may be built. A second wafer top substrate wafer 9304 may be bonded on top of the first wafer 9302. The new top wafer may be face-down so that the electrical circuits 9305 may be face-to-face with the first wafer 9302 circuits 9303.

The bond may be oxide-to-oxide in some applications or copper-to-copper in other applications. In addition, the bond may be by a hybrid bond wherein some of the bonding surface may be oxide and some may be copper.

Figure 93A:
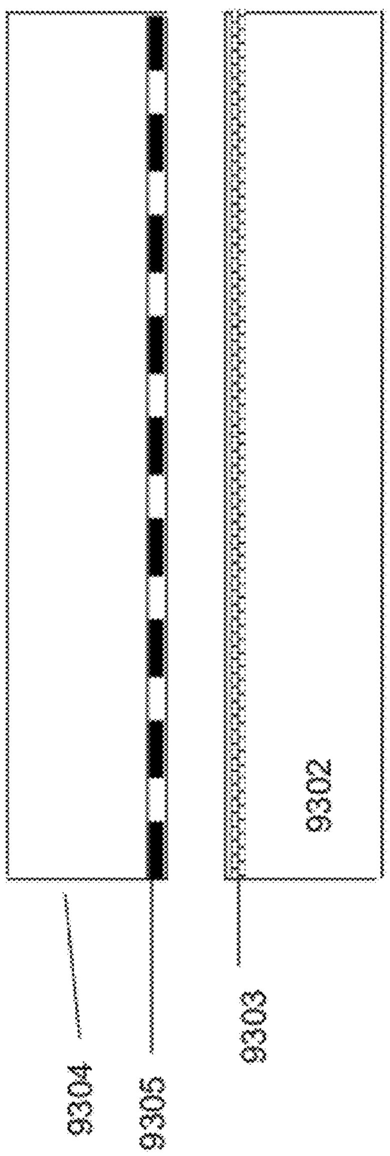
Figure 93B:
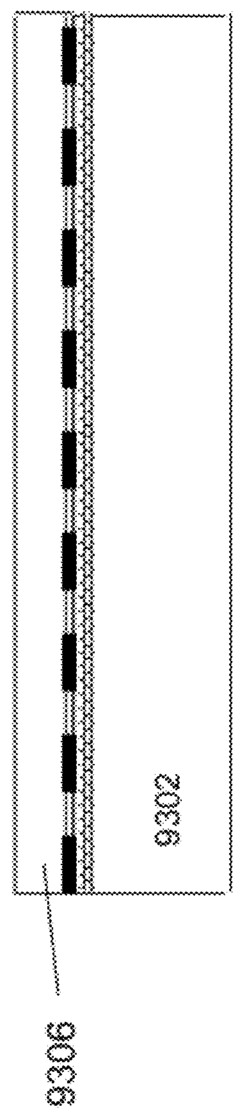

After bonding, the top substrate wafer 9304 may be thinned down to about 60 micron in a conventional back-lap and CMP process. FIG. 93B illustrates the now thinned top wafer 9306 bonded to the first wafer 9302.

Figure 93C:
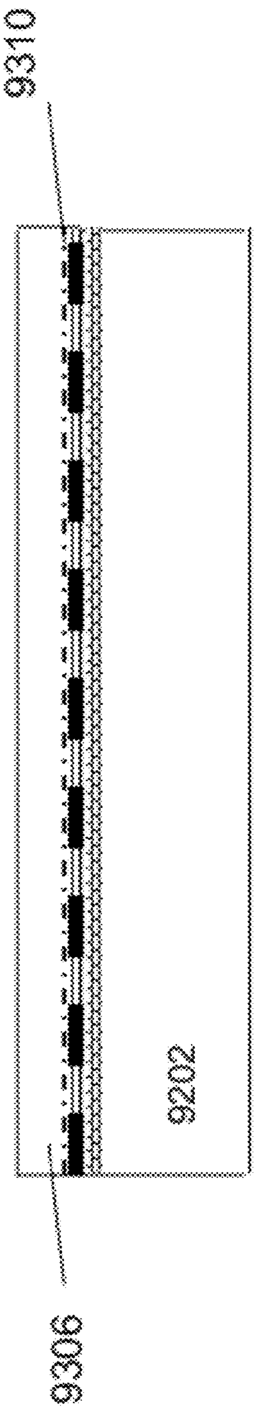

The next step may include a high accuracy measurement of the top wafer 9306 thickness. Then, using a high power 1-4 MeV H+ implant, a cleave plane 9310 may be defined in the top wafer 9306. The cleave plane 9310 may be positioned about 1 micron above the bond surface as illustrated in FIG. 93C. This process may be performed with a special high power implanter such as, for example, the implanter used by SiGen Corporation for their PV (PhotoVoltaic) application.

Figure 93D:
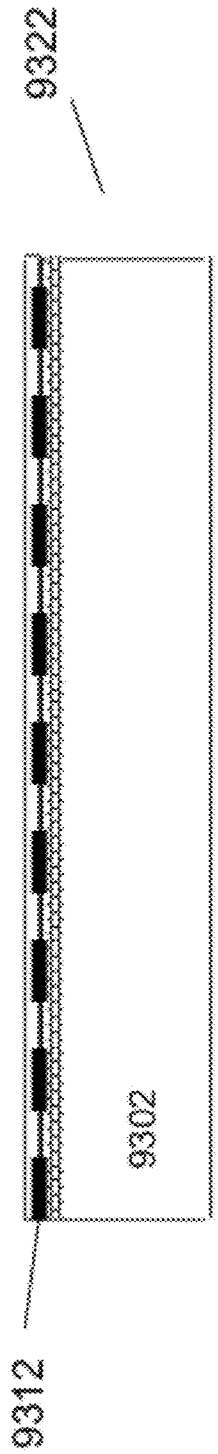

Having the accurate measure of the top wafer 9306 thickness and the highly controlled implant process may enable cleaving most of the top wafer 9306 out thereby leaving a very thin layer 9312 of about 1 micron, bonded on top of the first wafer 9302 as illustrated in FIG. 93D.

An advantage of this process flow may be that an additional wafer with circuits could now be placed and bonded on top of the bonded structure 9322 in a similar manner. But first a connection layer may be built on the back of thin layer 9312 to allow electrical connection to the bonded structure 9322 circuits. Having the top layer thinned to a single micron level may allow such electrical connection metal layers to be fully aligned to the top wafer thin layer 9312 electrical circuits 9305 and may allow the vias through the back side of top thin layer 9312 to be relatively small, of about 100 nm in diameter.

The thinness of the top thin layer 9312 may enable the modified TSV to be at the level of 100 nm vs. the 5 microns necessary for TSVs that need to go through 50 microns of silicon. Unfortunately the misalignment of the wafer-to-wafer bonding process may still be quite significant at about +/−0.5 micron. Accordingly, as described elsewhere in this document in relation to FIG. 75, a landing pad of about 1×1 microns may be used on the top of the first wafer 9302 to connect with a small metal contact on the face of the top substrate wafer 9304 while using copper-to-copper bonding. This process may represent a connection density of about 1 connection per 1 square micron.

It may be desirable to increase the connection density using a concept as illustrated in FIG. 80 and the associated explanations. In the modified TSV case, it may be much more challenging to do so because the two wafers being bonded may be fully processed and once bonded, only very limited access to the landing strips may be available. However, to construct a via, etching through all layers may be needed. FIG. 94 illustrates a method and structures to address these issues.

Figure 94B:
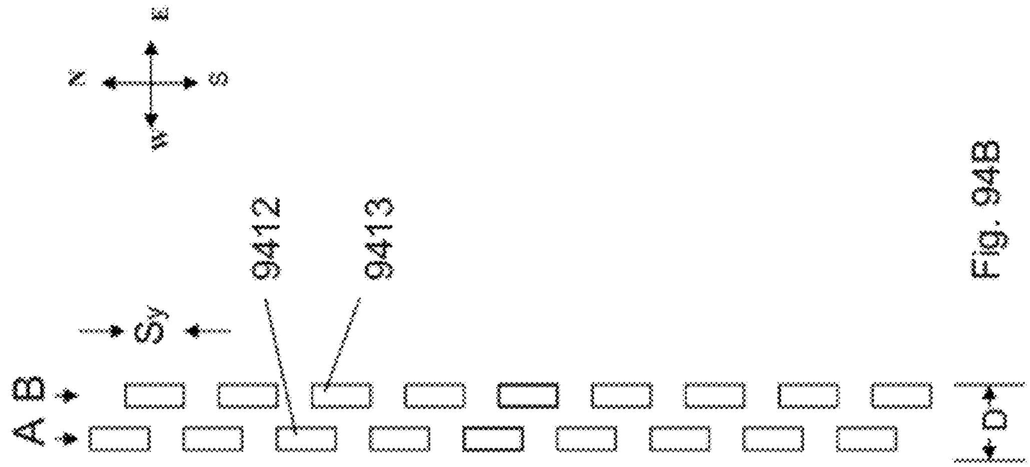
Figure 94A:
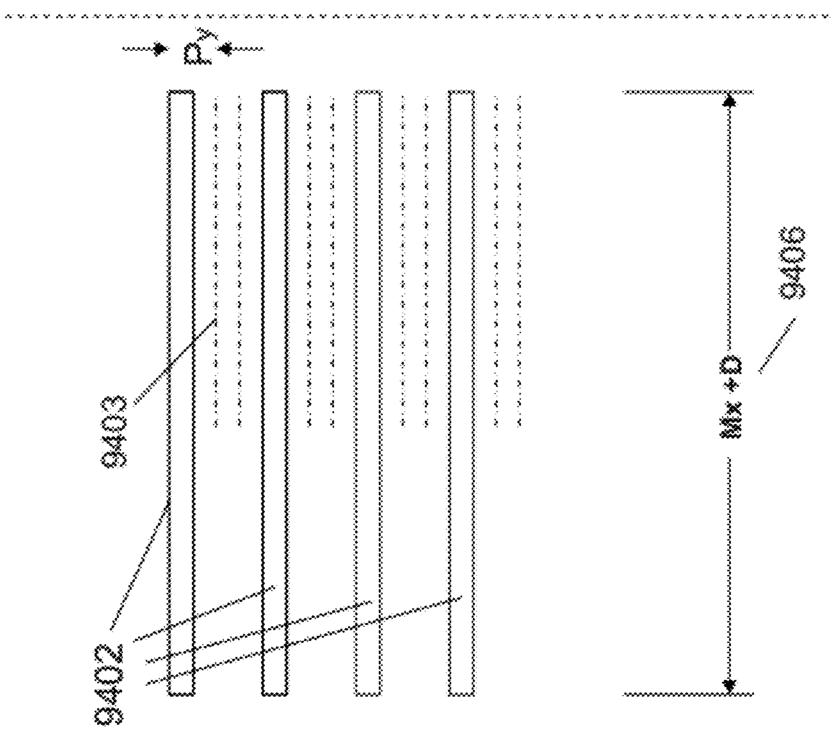

FIG. 94A illustrates four metal landing strips 9402 exposed at the upper layer of the first wafer 9302. The landing strips 9402 may be oriented East-West at a length 9406 of the maximum East-West bonding misalignment Mx plus a delta D, which will be explained later. The pitch of the landing strip may be twice the minimum pitch Py of this upper layer of the first wafer 9302. 9403 may indicate an unused potential room for an additional metal strip.

FIG. 94B illustrates landing strips 9412, 9413 exposed at the top of the second wafer thin layer 9312. FIG. 94B also shows two columns of landing strips, namely, A and B going North to South. The length of these landing strips may be 1.25Py. The two wafers 9302 and top wafer thin layer 9312 may be bonded copper-to-copper and the landing strips of FIG. 94A and FIG. 94B may be designed so that the bonding misalignment does not exceed the maximum misalignment Mx in the East-West direction and My in the North-South direction. The landing strips 9412 and 9413 of FIG. 94B may be designed so that they may never unintentionally short to landing strips 9402 of 94A and that either row A landing strips 9412 or row B landing strips 9413 may achieve full contact with landing strips 9402. The delta D may be the size from the East edge of landing strips 9413 of row B to the West edge of A landing strips 9412. The number of landing strips 9412 and 9413 of FIG. 94B may be designed to cover the FIG. 94A landing strips 9402 plus My to cover maximum misalignment error in the North-South direction.

Figure 94C:
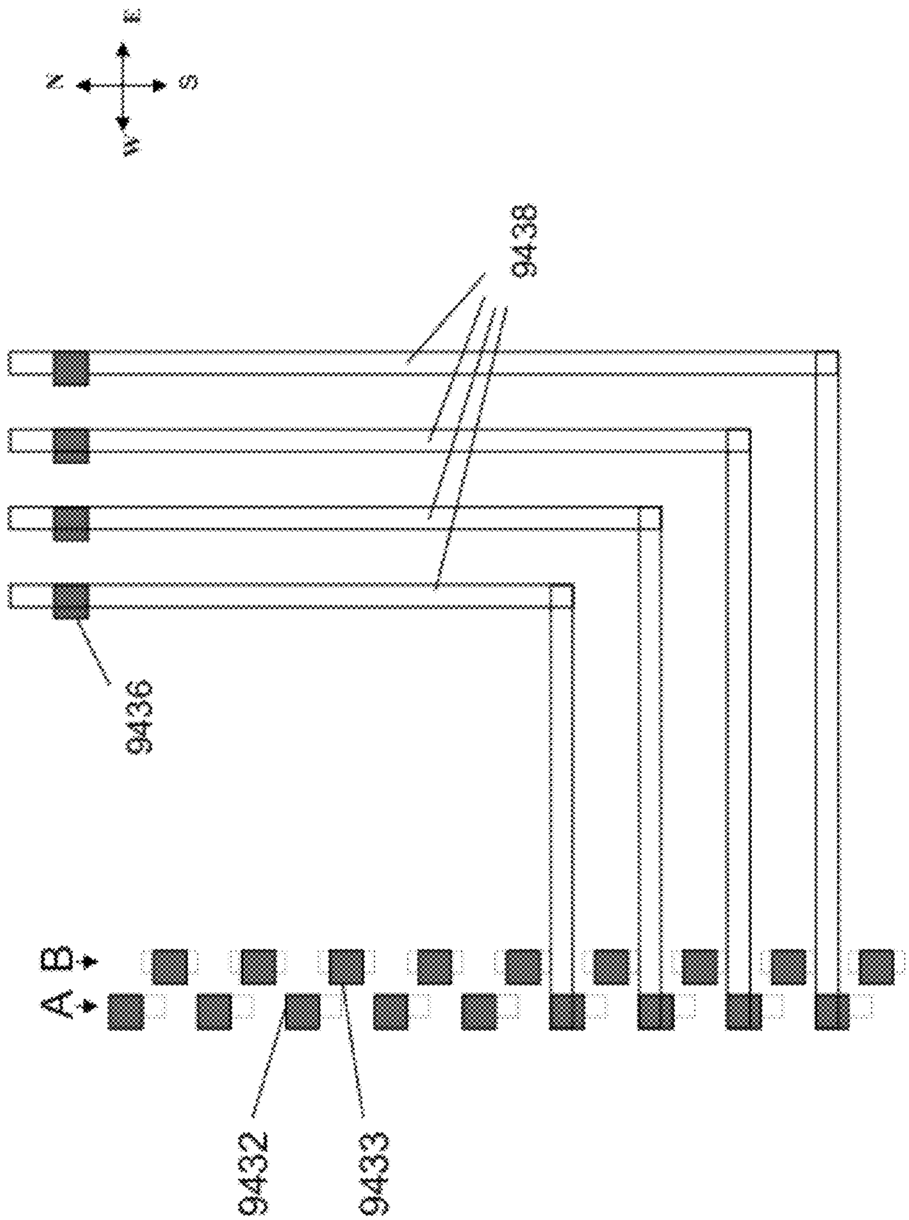

Substantially all the landing strips 9412 and 9413 of FIG. 94B may be routed by the internal routing of the top wafer thin layer 9312 to the bottom of the wafer next to the transistor layers. The location on the bottom of the wafer is illustrated in FIG. 93D as the upper side of the 9322 structure. Now new vias 9432 may be formed to connect the landing strips to the top surface of the bonded structure using conventional wafer processing steps. FIG. 94C illustrates all the via connections routed to the landing strips of FIG. 94B, arranged in row A 9432 and row B 9433. In addition, the vias 9436 for bringing in the signals may also be processed. All these vias may be aligned to the top wafer thin layer 9312.

As illustrated in FIG. 94C, a metal mask may now be used to connect, for example, four of the vias 9432 and 9433 to the four vias 9436 using metal strips 9438. This metal mask may be aligned to the top wafer thin layer 9312 in the East-West direction. This metal mask may also be aligned to the top wafer thin layer 9312 in the North-South direction but with a special offset that is based on the bonding misalignment in the North-South direction. The length of the metal structure metal strips 9438 in the North South direction may be enough to cover the worst case North-South direction bonding misalignment.

It should be stated again that embodiments of the invention could be applied to many applications other than programmable logic such a Graphics Processor which may include many repeating processing units. Other applications might include general logic design in 3D ASICs (Application Specific Integrated Circuits) or systems combining ASIC layers with layers comprising at least in part other special functions. Persons of ordinary skill in the art will appreciate that many more embodiments and combinations are possible by employing the inventive principles contained herein and such embodiments will readily suggest themselves to such skilled persons. Thus the invention is not to be limited in any way except by the appended claims.

Yet another alternative to implement 3D redundancy to improve yield by replacing a defective circuit may be by the use of Direct Write E-beam instead of a programmable connection.

An additional variation of the programmable 3D system may comprise a tiled array of programmable logic tiles connected with I/O structures that may be pre-fabricated on the base wafer 1402 of FIG. 14.

In yet an additional variation, the programmable 3D system may include a tiled array of programmable logic tiles connected with I/O structures that are pre-fabricated on top of the finished base wafer 1402 by using any of the techniques presented in conjunction, for example, to FIGS. 21-35 or FIGS. 39-40. In fact any of the alternative structures presented in FIG. 11 may be fabricated on top of each other by the 3D techniques presented in conjunction with, for example, FIGS. 21-35 or FIGS. 39-40. Accordingly, many variations of 3D programmable systems may be constructed with a limited set of masks by mixing different structures to form various 3D programmable systems by varying the amount and 3D position of logic and type of I/Os and type of memories and so forth.

Additional flexibility and reuse of masks may be achieved by utilizing, for example, only a portion of the full reticle exposure. Modern steppers may allow covering portions of the reticle and hence projecting only a portion of the reticle. Accordingly a portion of a mask set may be used for one function while another portion of that same mask set would be used for another function. For example, let the structure of FIG. 37 represent the logic portion of the end device of a 3D programmable system. On top of that 3×3 programmable tile structure I/O structures could be built utilizing process techniques according to, for example, FIGS. 21-35 or FIGS. 39-40. There may be a set of masks where various portions may provide for the overlay of different I/O structures; for example, one portion including simple I/Os, and another of Serializer/Deserializer (Ser/Des) I/Os. Each set may be designed to provide tiles of I/O that substantially perfectly overlay the programmable logic tiles. Then out of these two portions on one mask set, multiple variations of end systems could be produced, including one with all nine tiles as simple I/Os, another with SerDes overlaying tile (0,0) while simple I/Os may be overlaying the other eight tiles, another with SerDes overlaying tiles (0,0), (0,1) and (0,2) while simple I/Os may be overlaying the other 6 tiles, and so forth. In fact, if properly designed, multiples of layers could be fabricated one on top of the other offering a large variety of end products from a limited set of masks. Persons of ordinary skill in the art will appreciate that this technique can have applicability beyond programmable logic and may profitably be employed in the construction of many 3D ICs and 3D systems. Thus the scope of the invention is only to be limited by the appended claims.

In yet an additional alternative illustrative embodiment of the invention, the 3D antifuse Configurable System, may also include a Programming Die. In some cases of FPGA products, and primarily in antifuse-based products, there may be an external apparatus that may be used for the programming the device. In many cases it may be a user convenience to integrate this programming function into the FPGA device. This may result in a significant die overhead as the programming process may need higher voltages as well as control logic. The programmer function could be designed into a dedicated Programming Die. Such a Programmer Die could include the charge pump, to generate the higher programming voltage, and a controller with the associated programming to program the antifuse configurable dies within the 3D Configurable circuits, and the programming check circuits. The Programming Die might be fabricated using a lower cost older semiconductor process. An additional advantage of this 3D architecture of the Configurable System may be a high volume cost reduction option wherein the antifuse layer may be replaced with a custom layer and, therefore, the Programming Die could be removed from the 3D system for a more cost effective high volume production.

It will be appreciated by persons of ordinary skill in the art, that some embodiments of the invention may be using the term antifuse as used as the common name in the industry, but it may also refer, according to some embodiments, to any micro element that functions like a switch, meaning a micro element that initially may have highly resistive-OFF state, and electronically it could be made to switch to a very low resistance—ON state. It could also correspond to a device to switch ON-OFF multiple times—a re-programmable switch. As an example there may be new technologies being developed, such as the electro-statically actuated Metal-Droplet micro-switch introduced by C. J. Kim of UCLA micro & nano manufacturing lab, which may be compatible for integration onto CMOS chips.

It will be appreciated by persons skilled in the art that the present invention may not be limited to antifuse configurable logic and it can be applicable to other non-volatile configurable logic. An example for such application is the Flash based configurable logic. Flash programming may also need higher voltages, and having the programming transistors and the programming circuits in the base diffusion layer may reduce the overall density of the base diffusion layer. Using various illustrative embodiments of the invention may be useful and could allow a higher device density. It may therefore be suggested to build the programming transistors and the programming circuits, not as part of the diffusion layer, but according to one or more illustrative embodiments of the invention. In high volume production, one or more custom masks could be used to replace the function of the Flash programming and accordingly may save the need to add on the programming transistors and the programming circuits.

Unlike metal-to-metal antifuses that could be placed as part of the metal interconnection, Flash circuits may need to be fabricated in the base diffusion layers. As such it might be less efficient to have the programming transistor in a layer far above. An illustrative alternative embodiment of the invention may be to use Through-Silicon-Via 816 to connect the configurable logic device and its Flash devices to an underlying structure of Foundation layer 814 including the programming transistors.

In this document, various terms may have been used while generally referring to the element. For example, "house" may refer to the first mono-crystalline layer with its transistors and metal interconnection layer or layers. This first mono-crystalline layer may have also been referred to as the main wafer and sometimes as the acceptor wafer and sometimes as the base wafer.

Some embodiments of the invention may include alternative techniques to build IC (Integrated Circuit) devices including techniques and methods to construct 3D IC systems. Some embodiments of the invention may enable device solutions with far less power consumption than prior art. These device solutions could be very useful for the growing application of mobile electronic devices and mobile systems, such as, for example, mobile phones, smart phone, and cameras. For example, incorporating the 3D IC semiconductor devices according to some embodiments of the invention within these mobile electronic devices and mobile systems could provide superior mobile units that could operate much more efficiently and for a much longer time than with prior art technology.

Smart mobile systems may be greatly enhanced by complex electronics at a limited power budget. The 3D technology described in the multiple embodiments of the invention would allow the construction of low power high complexity mobile electronic systems. For example, it would be possible to integrate into a small form function a complex logic circuit with high density high speed memory utilizing some of the 3D DRAM embodiments of the invention and add some non-volatile 3D NAND charge trap or RRAM described in some embodiments of the invention.

In U.S. application Ser. No. 12/903,862, filed by some of the inventors and assigned to the same assignee, a 3D micro display and a 3D image sensor are presented. Integrating one or both of these with complex logic and or memory could be very effective for mobile system. Additionally, mobile systems could be customized to some specific market applications by integrating some embodiments of the invention.

Moreover, utilizing 3D programmable logic or 3D gate array as had been described in some embodiments of the invention could be very effective in forming flexible mobile systems.

The need to reduce power to allow effective use of limited battery energy and also the lightweight and small form factor derived by highly integrating functions with low waste of interconnect and substrate could be highly benefitted by the redundancy and repair idea of the 3D monolithic technology as has been presented in embodiments of the invention. This unique technology could enable a mobile device that would be lower cost to produce or would require lower power to operate or would provide a lower size or lighter carry weight, and combinations of these 3D monolithic technology features may provide a competitive or desirable mobile system.

Another unique market that may be addressed by some of the embodiments of the invention could be a street corner camera with supporting electronics. The 3D image sensor described in the application Ser. No. 12/903,862 would be very effective for day/night and multi-spectrum surveillance applications. The 3D image sensor could be supported by integrated logic and memory such as, for example, a monolithic 3D IC with a combination of image processing and image compression logic and memory, both high speed memory such as 3D DRAM and high density non-volatile memory such as 3D NAND or RRAM or other memory, and other combinations. This street corner camera application would require low power, low cost, and low size or any combination of these features, and could be highly benefitted from the 3D technologies described herein.

3D ICs according to some embodiments of the invention could enable electronic and semiconductor devices with much a higher performance as a result from the shorter interconnect as well as semiconductor devices with far more complexity via multiple levels of logic and providing the ability to repair or use redundancy. The achievable complexity of the semiconductor devices according to some embodiments of the invention could far exceed what may be practical with the prior art technology. These potential advantages could lead to more powerful computer systems and improved systems that have embedded computers.

Some embodiments of the invention may enable the design of state of the art electronic systems at a greatly reduced non-recurring engineering (NRE) cost by the use of high density 3D FPGAs or various forms of 3D array base ICs with reduced custom masks as described previously. These systems could be deployed in many products and in many market segments. Reduction of the NRE may enable new product family or application development and deployment early in the product lifecycle by lowering the risk of upfront investment prior to a market being developed. The above potential advantages may also be provided by various mixes such as reduced NRE using generic masks for layers of logic and other generic masks for layers of memories and building a very complex system using the repair technology to overcome the inherent yield limitation. Another form of mix could be building a 3D FPGA and add on it 3D layers of customizable logic and memory so the end system could have field programmable logic on top of the factory customized logic. There may be many ways to mix the many innovative elements to form 3D IC to support the need of an end system, including using multiple devices wherein more than one device incorporates elements of embodiments of the invention. An end system could benefit from a memory device utilizing embodiments of the invention 3D memory integrated together with a high performance 3D FPGA integrated together with high density 3D logic, and so forth. Using devices that can use one or multiple elements according to some embodiments of the invention may allow for better performance or lower power and other illustrative advantages resulting from the use of some embodiments of the invention to provide the end system with a competitive edge. Such end system could be electronic based products or other types of systems that may include some level of embedded electronics, such as, for example, cars, and remote controlled vehicles.

Commercial wireless mobile communications have been developed for almost thirty years, and play a special role in today's information and communication technology Industries. The mobile wireless terminal device has become part of our life, as well as the Internet, and the mobile wireless terminal device may continue to have a more important role on a worldwide basis. Currently, mobile (wireless) phones are undergoing much development to provide advanced functionality. The mobile phone network is a network such as a GSM, GPRS, or WCDMA, 3G and 4G standards, and the network may allow mobile phones to communicate with each other. The base station may be for transmitting (and receiving) information to the mobile phone.

A typical mobile phone system may include, for example, a processor, a flash memory, a static random access memory, a display, a removable memory, a radio frequency (RF) receiver/transmitter, an analog base band (ABB), a digital base band (DBB), an image sensor, a high-speed bi-directional interface, a keypad, a microphone, and a speaker. A typical mobile phone system may include a multiplicity of an element, for example, two or more static random access memories, two or more displays, two or more RF receiver/transmitters, and so on.

Conventional radios used in wireless communications, such as radios used in conventional cellular telephones, typically may include several discrete RF circuit components. Some receiver architectures may employ superhetrodyne techniques. In a superhetrodyne architecture an incoming signal may be frequency translated from its radio frequency (RF) to a lower intermediate frequency (IF). The signal at IF may be subsequently translated to baseband where further digital signal processing or demodulation may take place. Receiver designs may have multiple IF stages. The reason for using such a frequency translation scheme is that circuit design at the lower IF frequency may be more manageable for signal processing. It is at these IF frequencies that the selectivity of the receiver may be implemented, automatic gain control (AGC) may be introduced, etc.

A mobile phone's need of a high-speed data communication capability in addition to a speech communication capability has increased in recent years. In GSM (Global System for Mobile communications), one of European Mobile Communications Standards, GPRS (General Packet Radio Service) has been developed for speeding up data communication by allowing a plurality of time slot transmissions for one time slot transmission in the GSM with the multiplexing TDMA (Time Division Multiple Access) architecture. EDGE (Enhanced Data for GSM Evolution) architecture provides faster communications over GPRS.

4th Generation (4G) mobile systems aim to provide broadband wireless access with nominal data rates of 100 Mbit/s. 4G systems may be based on the 3GPP LTE (Long Term Evolution) cellular standard, WiMax or Flash-OFDM wireless metropolitan area network technologies. The radio interface in these systems may be based on all-IP packet switching, MIMO diversity, multi-carrier modulation schemes, Dynamic Channel Assignment (DCA) and channel-dependent scheduling.

Prior art such as U.S. application Ser. No. 12/871,984 may provide a description of a mobile device and its block-diagram.

It is understood that the use of specific component, device and/or parameter names (such as those of the executing utility/logic described herein) are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized. For example, as utilized herein, the following terms are generally defined:

(1) Mobile computing/communication device (MCD): is a device that may be a mobile communication device, such as a cell phone, or a mobile computer that performs wired and/or wireless communication via a connected wireless/wired network. In some embodiments, the MCD may include a combination of the functionality associated with both types of devices within a single standard device (e.g., a smart phones or personal digital assistant (PDA)) for use as both a communication device and a computing device.

A block diagram representation of an exemplary mobile computing device (MCD) is illustrated in FIG. 156, within which several of the features of the described embodiments may be implemented. MCD 15600 may be a desktop computer, a portable computing device, such as a laptop, personal digital assistant (PDA), a smart phone, and/or other types of electronic devices that may generally be considered processing devices. As illustrated, MCD 15600 may include at least one processor or central processing unit (CPU) 15602 which may be connected to system memory 15606 via system interconnect/bus 15604. CPU 15602 may include at least one digital signal processing unit (DSP). Also connected to system interconnect/bus 15604 may be input/output (I/O) controller 15615, which may provide connectivity and control for input devices, of which pointing device (or mouse) 15616 and keyboard 15617 are illustrated. I/O controller 15615 may also provide connectivity and control for output devices, of which display 15618 is illustrated. Additionally, a multimedia drive 15619 (e.g., compact disk read/write (CDRW) or digital video disk (DVD) drive) and USB (universal serial bus) port 15620 are illustrated, and may be coupled to I/O controller 15615. Multimedia drive 15619 and USB port 15620 may enable insertion of a removable storage device (e.g., optical disk or "thumb" drive) on which data/instructions/code may be stored and/or from which data/instructions/code may be retrieved. MCD 15600 may also include storage 15622, within/from which data/instructions/code may also be stored/retrieved. MCD 15600 may further include a global positioning system (GPS) or local position system (LPS) detection component 15624 by which MCD 15600 may be able to detect its current location (e.g., a geographical position) and movement of MCD 15600, in real time. MCD 15600 may include a network/communication interface 15625, by which MCD 15600 may connect to one or more second communication devices 15632 or to wireless service provider server 15637, or to a third party server 15638 via one or more access/external communication networks, of which a wireless Communication Network 15630 is provided as one example and the Internet 15636 is provided as a second example. It is appreciated that MCD 15600 may connect to third party server 15638 through an initial connection with Communication Network 15630, which in turn may connect to third party server 15638 via the Internet 15636.

In addition to the above described hardware components of MCD 15600, various features of the described embodiments may be completed/supported via software (or firmware) code or logic stored within system memory 15606 or other storage (e.g., storage 15622) and may be executed by CPU 15602. Thus, for example, illustrated within system memory 15606 are a number of software/firmware/logic components, including operating system (OS) 15608 (e.g., Microsoft Windows® or Windows Mobile®, trademarks of Microsoft Corp, or GNU®/Linux®, registered trademarks of the Free Software Foundation and The Linux Mark Institute, and AIX®, registered trademark of International Business Machines), and word processing and/or other application(s) 15609. Also illustrated are a plurality (four illustrated) software implemented utilities, each providing different one of the various functions (or advanced features) described herein. Including within these various functional utilities are: Simultaneous Text Waiting (STW) utility 15611, Dynamic Area Code Prepending (DACP) utility 15612, Advanced Editing and Interfacing (AEI) utility 15613 and Safe Texting Device Usage (STDU) utility 15614. In actual implementation and for simplicity in the following descriptions, each of these different functional utilities are assumed to be packaged together as sub-components of a general MCD utility 15610, and the various utilities are interchangeably referred to as MCD utility 15610 when describing the utilities within the figures and claims. For simplicity, the following description will refer to a single utility, namely MCD utility 15610. MCD utility 15610 may, in some embodiments, be combined with one or more other software modules, including for example, word processing application(s) 15609 and/or OS 15608 to provide a single executable component, which then may provide the collective functions of each individual software component when the corresponding combined code of the single executable component is executed by CPU 15602. Each separate utility 111/112/113/114 is illustrated and described as a standalone or separate software/firmware component/module, which provides specific functions, as described below. As a standalone component/module, MCD utility 15610 may be acquired as an off-the-shelf or after-market or downloadable enhancement to existing program applications or device functions, such as voice call waiting functionality (not shown) and user interactive applications with editable content, such as, for example, an application within the Windows Mobile® suite of applications. In at least one implementation, MCD utility 15610 may be downloaded from a server or website of a wireless provider (e.g., wireless provider server 15637) or a third party server 15638, and either installed on MCD 15600 or executed from the wireless provider server 15637 or third party server 156138.

CPU 15602 may execute MCD utility 15610 as well as OS 15608, which, in one embodiment, may support the user interface features of MCD utility 15610, such as generation of a graphical user interface (GUI), where required/supported within MCD utility code. In several of the described embodiments, MCD utility 15610 may generate/provide one or more GUIs to enable user interaction with, or manipulation of, functional features of MCD utility 15610 and/or of MCD 15600. MCD utility 15610 may, in certain embodiments, enable certain hardware and firmware functions and may thus be generally referred to as MCD logic.

Some of the functions supported and/or provided by MCD utility 15610 may be enabled as processing code/instructions/logic executing on DSP/CPU 15602 and/or other device hardware, and the processor thus may complete the implementation of those function(s). Among, for example, the software code/instructions/logic provided by MCD utility 15610, and which are specific to some of the described embodiments of the invention, may be code/logic for performing several (one or a plurality) of the following functions: (1) Simultaneous texting during ongoing voice communication providing a text waiting mode for both single number mobile communication devices and multiple number mobile communication devices; (2) Dynamic area code determination and automatic backfilling of area codes when a requested/desired voice or text communication is initiated without the area code while the mobile communication device is outside of its home-base area code toll area; (3) Enhanced editing functionality for applications on mobile computing devices; (4) Automatic toggle from manual texting mode to voice-to-text based communication mode on detection of high velocity movement of the mobile communication device; and (5) Enhanced e-mail notification system providing advanced e-mail notification via (sender or recipient directed) texting to a mobile communication device.

Utilizing monolithic 3D IC technology described herein and in related application Ser. Nos. 12/903,862, 12/903,847, 12/904,103 and 13/041,405 significant power and cost could be saved. Most of the elements in MCD 15600 could be integrated in one 3D IC. Some of the MCD 15600 elements may be logic functions which could utilize monolithic 3D transistors such as, for example, RCAT or Gate-Last. Some of the MCD 15600 elements are storage devices and could be integrated on a 3D non-volatile memory device, such as, for example, 3D NAND or 3D RRAM, or volatile memory such as, for example, 3D DRAM or SRAM formed from RCAT or gate-last transistors, as been described herein. Storage 15622 elements formed in monolithic 3D could be integrated on top or under a logic layer to reduce power and space. Keyboard 15617 could be integrated as a touch screen or combination of image sensor and some light projection and could utilize structures described in some of the above mentioned related applications. The Network Comm Interface 15625 could utilize another layer of silicon optimized for RF and gigahertz speed analog circuits or even may be integrated on substrates, such as GaN, that may be a better fit for such circuits. As more and more transistors might be integrated to achieve a high complexity 3D IC system there might be a need to use some embodiments of the invention such as what were called repair and redundancy so to achieve good product yield.

Some of the system elements including non-mobile elements, such as the 3rd Party Server 15638, might also make use of some embodiments of the 3D IC inventions including repair and redundancy to achieve good product yield for high complexity and large integration. Such large integration may reduce power and cost of the end product which is most attractive and most desired by the system end-use customers.

Some embodiments of the 3D IC invention could be used to integrate many of the MCD 15600 blocks or elements into one or a few devices. As various blocks get tightly integrated, much of the power required to transfer signals between these elements may be reduced and similarly costs associated with these connections may be saved. Form factor may be compacted as the space associated with the individual substrate and the associated connections may be reduced by use of some embodiments of the 3D IC invention. For mobile device these may be very important competitive advantages. Some of these blocks might be better processed in different process flow or wafer fab location. For example the DSP/CPU 15602 is a logic function that might use a logic process flow while the storage 15622 might better be done using a NAND Flash technology process flow or wafer fab. An important advantage of some of the embodiments of the monolithic 3D inventions may be to allow some of the layers in the 3D structure to be processed using a logic process flow while another layer in the 3D structure might utilize a memory process flow, and then some other function the modems of the GPS 15624 might use a high speed analog process flow or wafer fab. As those diverse functions may be structured in one device onto many different layers, these diverse functions could be very effectively and densely vertically interconnected.

Some embodiments of the invention may include alternative techniques to build IC (Integrated Circuit) devices including techniques and methods to construct 3D IC systems. Some embodiments of the invention may enable device solutions with far less power consumption than prior art, or with more functionality in a smaller physical footprint. These device solutions could be very useful for the growing application of Autonomous in vivo Electronic Medical (AEM) devices and AEM systems such as ingestible “camera pills,” implantable insulin dispensers, implantable heart monitoring and stimulating devices, and the like. One such ingestible “camera pill” is the Philips’ remote control “iPill”. For example, incorporating the 3D IC semiconductor devices according to some embodiments of the invention within these AEM devices and systems could provide superior autonomous units that could operate much more effectively and for a much longer time than with prior art technology. An example of prior art is illustrated in FIG. 190. Sophisticated AEM systems may be greatly enhanced by complex electronics with limited power budget. The 3D technology described in many of the embodiments of the invention would allow the construction of a low power high complexity AEM system. For example it would be possible to integrate into a small form function a complex logic circuit with high density high speed memory utilizing some of the 3D DRAM embodiments herein and to add some non-volatile 3D NAND charge trap or RRAM described in embodiments herein. Also in another application Ser. No. 12/903,862 filled by some of the inventors and assigned to the same assignee a 3D micro display and a 3D image sensor are presented. Integrating one or both to complex logic and or memory could be very effective for retinal implants. Additional AEM systems could be customized to some specific market applications. Utilizing 3D programmable logic or 3D gate array as has been described in some embodiments herein could be very effective. The need to reduce power to allow effective use of battery and also the light weight and small form factor derived by highly integrating functions with low waste of interconnect and substrate could benefit from the redundancy and repair idea of the 3D monolithic technology as has been presented in some of the inventive embodiments herein. This unique technology could enable disposable AEM devices that would be at a lower cost to produce and/or would require lower power to operate and/or would require lower size and/or lighter to carry and combination of these features to form a competitive or desirable AEM system.

3D ICs according to some embodiments of the invention could also enable electronic and semiconductor devices with a much higher performance due to the shorter interconnect as well as semiconductor devices with far more complexity via multiple levels of logic and providing the ability to repair or use redundancy. The achievable complexity of the semiconductor devices according to some embodiments of the invention could far exceed what may be practical with the prior art technology. These advantages could lead to more powerful computer systems and improved systems that have embedded computers.

Some embodiments of the invention may also enable the design of state of the art AEM systems at a greatly reduced non-recurring engineering (NRE) cost by the use of high density 3D FPGAs or various forms of 3D array based ICs with reduced custom masks as described in some inventive embodiments herein. These systems could be deployed in many products and in many market segments. Reduction of the NRE may enable new product family or application development and deployment early in the product lifecycle by lowering the risk of upfront investment prior to a market being developed. The above advantages may also be provided by various mixes such as reduced NRE using generic masks for layers of logic and other generic masks for layers of memories and building a very complex system using the repair technology to overcome the inherent yield limitation. Another form of mix could be building a 3D FPGA and add on it 3D layers of customizable logic and memory resulting in an end system that may have field programmable logic on top of the factory customized logic. There may be many ways to mix the many innovative elements herein to form a 3D IC to support the needs of an end system, including using multiple devices wherein more than one device incorporates elements of embodiments of the invention. An end system could benefit from memory devices utilizing embodiments of the invention of 3D memory together with high performance 3D FPGA together with high density 3D logic and so forth. Using devices that can use one or multiple elements according to some embodiments of the invention may allow for better performance or lower power and other illustrative advantages resulting from the use of some embodiments of the invention to provide the end system with a competitive edge. Such end system could be electronic based products or other types of medical systems that may include some level of embedded electronics, such as, for example, AEM devices that combine multi-function monitoring, multi drug dispensing, sophisticated power-saving telemetrics for communication, monitoring and control, etc.

AEM devices have been in use since the 1980s and have become part of our lives, moderating illnesses and prolonging life. A typical AEM system may include a logic processor, signal processor, volatile and non-volatile memory, specialized chemical, optical, and other sensors, specialized drug reservoirs and release mechanisms, specialized electrical excitation mechanisms, and radio frequency (RF) or acoustic receivers/transmitters, It may also include additional electronic and non-electronic sub-systems that may require additional processing resources to monitor and control, such as propulsion systems, immobilization systems, heating, ablation, etc.

Prior art such as U.S. Pat. No. 7,567,841 or U.S. Pat. No. 7,365,594 provide example descriptions of such autonomous in-vivo electronic medical devices and systems. It is understood that the use of specific component, device and/or parameter names described herein are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized. For example, as utilized herein, the following are generally defined:

AEM device: An Autonomous in-vivo Electronic Medical (AEM) device 19100, illustrated in FIG. 191, may include a sensing subsystem 19150, a processor 19102, a communication controller 19120, an antenna subsystem 19124, and a power subsystem 19170, all within a biologically-benign encapsulation 19101. Other subsystems an AEM may include some or all of therapy subsystem 19160, propulsion subsystem 19130, immobilization system 19132, an identifier element (ID) 19122 that uniquely identifies every instance of an AEM device, one or more signal processors 19104, program memory 19110, data memory 19112 and non-volatile storage 19114.

The sensing subsystem 19150 may include one or more of optical sensors, imaging cameras, biological or chemical sensors, as well as gravitational or magnetic ones. The therapy subsystem 19160 may include one or more of drug reservoirs, drug dispensers, drug refill ports, electrical or magnetic stimulation circuitry, and ablation tools. The power subsystem 19170 may include a battery and/or an RF induction pickup circuitry that allows remote powering and recharge of the AEM device. The antenna subsystem 19124 may include one or more antennae, operating either as an array or individually for distinct functions. The unique ID 191222 can operate through the communication controller 19120 as illustrated in FIG. 191, or independently as an RFID tag.

In addition to the above described hardware components of AEM device 19100, various features of the described embodiments may be completed/supported via software (or firmware) code or logic stored within program memory 19110 or other storage (e.g., data memory 19112) and executed by processor 19102 and signal processors 19104. Such software may be custom written for the device, or may include standard software components that are commercially available from software vendors.

One example of AEM device is a so-called “camera pill” that may be ingested by the patient and capture images of the digestive tract as it is traversed, and transmits the images to external equipment. Because such traversal may take an hour or more, a large number of images may need to be transmitted, possibly depleting its power source before the traversal through the digestive tract is completed. The ability to autonomously perform high quality image comparison and transmit only images with significant changes is important, yet often limited by the compute resources on-board the AEM device.

Another example of an AEM device is a retinal implant, which may have severe size limitations in order to minimize the device’s interference with vision. Similarly, cochlear implants may also impose strict size limitations. Those size limitations may impose severe constraints on the computing power and functionality available to the AEM device.

Many AEM devices may be implanted within the body through surgical procedures, and replacing their power supply may require surgical intervention. There is a strong interest in extending the battery life as much as possible through lowering the power consumption of the AEM device.

Utilizing monolithic 3D IC technology described here and in related application Ser. Nos. 12/903,862, 12/903,847, 12/904,103 13/098,997, and 13/041,405 significant power, physical footprint, and cost could be saved. Many of the elements in AEM device 19100 could be integrated in one 3D IC. Some of these elements are mostly logic functions which could use, for example, RCAT transistors or Gate-Last transistors. Some of the AEM device 19100 elements may be storage devices and could be integrated on another 3D non-volatile memory device, such as, for example, 3D NAND as has been described herein. Alternatively the storage elements, for example, program memory 19110, data memory 19112 and non-volatile storage 19114, could be integrated on top of or under a logic layer or layers to reduce power and space. Communication controller 19120 could similarly utilize another layer of silicon optimized for RF. Specialized sensors can be integrated on substrates, such as InP or Ge, that may be a better fit for such devices. As more and more transistors might be integrated into high complexity 3D IC systems there might be a need to use elements of the inventions such as what are described herein as repair and redundancy methods and techniques to achieve good product yield.

Some of the external systems communication with AEM devices might also make use of some embodiments of the 3D IC invention including repair and redundancy to achieve good product yield for high complexity and large integration. Such large integration may reduce power and cost of the end product which may be attractive to end customers.

The 3D IC invention could be used to integrate many of these blocks into one or multiple devices. As various blocks get tightly integrated much of the power required to communicate between these elements may be reduced, and similarly, costs associated with these connections may be saved, as well as the space associated with the individual substrate and the associated connections. For AEM devices these may be very important competitive advantages. Some of these blocks might be better processed in a different process flow and or with a different substrate. For example, processor 19102 is a logic function that might use a logic process flow while the non-volatile storage 19114 might better be done using NAND Flash technology. An important advantage of some of the monolithic 3D embodiments of the invention may be to allow some of the layers in the 3D structure to be processed using a logic process flow while others might utilize a memory process flow, and then some other function such as, for example, the communication controller 19120 might use a high speed analog flow. Additionally, as those functions may be structured in one device on different layers, they could be very effectively be vertically interconnected.

To improve the contact resistance of very small scaled contacts, the semiconductor industry employs various metal silicides, such as, for example, cobalt silicide, titanium silicide, tantalum silicide, and nickel silicide. The current advanced CMOS processes, such as, for example, 45 nm, 32 nm, and 22 nm, employ nickel silicides to improve deep submicron source and drain contact resistances. Background information on silicides utilized for contact resistance reduction can be found in “NiSi Salicide Technology for Scaled CMOS,” H. Iwai, et. al., Microelectronic Engineering, 60 (2002), pp 157-169; “Nickel vs. Cobalt Silicide integration for sub-50 nm CMOS”, B. Froment, et. al., IMEC ESS Circuits, 2003; and “65 and 45-nm Devices—an Overview”, D. James, Semicon West, July 2008, ctr_024377. To achieve the lowest nickel silicide contact and source/drain resistances, the nickel on silicon can be heated to about 450° C.

Thus it may be desirable to enable low resistances for process flows in this document where the post layer transfer temperature exposures may remain under about 400° C. due to metallization, such as, for example, copper and aluminum, and low-k dielectrics being present.

For junction-less transistors (JLTs), in particular, forming contacts can be a challenge. This may be because the doping of JLTs should be kept low (below about $0.5\text{-}5\times10^{19}/cm^3$ or so) to enable good transistor operation but should be kept high (above about $0.5\text{-}5\times10^{19}/cm^3$ or so) to enable low contact resistance. A technique to obtain low contact resistance at lower doping values may therefore be desirable. One such embodiment of the invention may be by utilizing silicides with different work-functions for n type JLTs than for p type JLTs to obtain low resistance at lower doping values. For example, high work function materials, including, such materials as, Palladium silicide, may be used to make contact to p-type JLTs and lower work-function materials, including, such as, Erbium silicide, may be used to make contact to n-type JLTs. These types of approaches are not generally used in the manufacturing of planar inversion-mode MOSFETs. This may be due to separate process steps and increased cost for forming separate contacts to n type and p type transistors on the same device layer. However, for 3D integrated approaches where p-type JLTs may be stacked above n-type JLTs and vice versa, it can be not costly to form silicides with uniquely optimized work functions for n type and p type transistors. Furthermore, for JLTs where contact resistance may be an issue, the additional cost of using separate silicides for n type and p type transistors on the same device layer may be acceptable.

The example process flow shown below may form a Recessed Channel Array Transistor (RCAT) with low contact resistance, but this or similar flows may be applied to other process flows and devices, such as, for example, S-RCAT, JLT, V-groove, JFET, bipolar, and replacement gate flows.

Figure 133A:
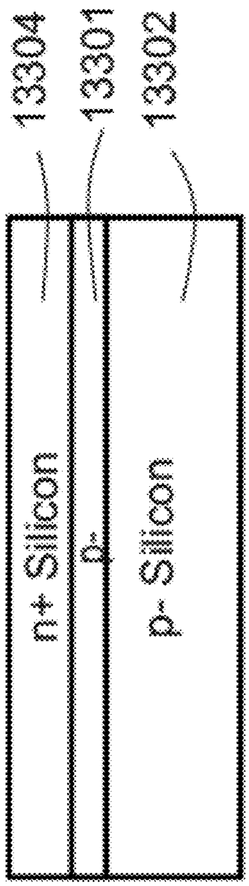

A planar n-channel Recessed Channel Array Transistor (RCAT) with metal silicide source & drain contacts suitable for a 3D IC may be constructed. As illustrated in FIG. 133A, a P− substrate donor wafer 13302 may be processed to include wafer sized layers of N+ doping 13304, and P− doping 13301 across the wafer. The N+ doped layer 13304 may be formed by ion implantation and thermal anneal. In addition, P− doped layer 13301 may have additional ion implantation and anneal processing to provide a different dopant level than P− substrate donor wafer 13302. P− doped layer 13301 may also have graded P− doping to mitigate transistor performance issues, such as, for example, short channel effects, after the RCAT may be formed. The layer stack may alternatively be formed by successive epitaxially deposited doped silicon layers of P− doping 13301 and N+ doping 13304, or by a combination of epitaxy and implantation. Annealing of implants and doping may utilize optical annealing techniques or types of Rapid Thermal Anneal (RTA or spike) or flash anneal.

Figure 133B:
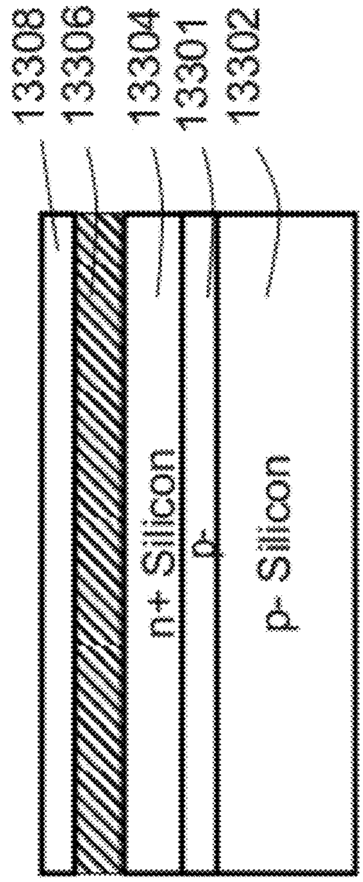

As illustrated in FIG. 133B, a silicon reactive metal, such as, for example, Nickel or Cobalt, may be deposited onto N+ doped layer 13304 and annealed, utilizing anneal techniques such as, for example, RTA, flash anneal, thermal, or optical, thus forming metal silicide layer 13306. The top surface of P− substrate donor wafer 13302 may be prepared for oxide wafer bonding with a deposition of an oxide to form oxide layer 13308.

Figure 133C:
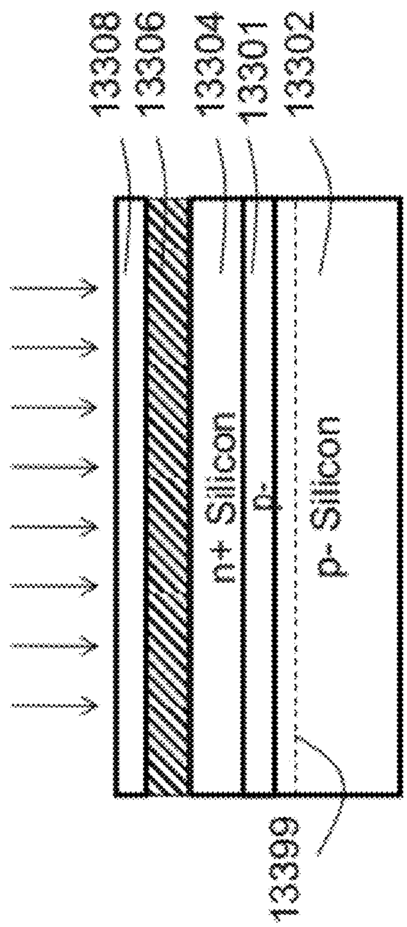

As illustrated in FIG. 133C, a layer transfer demarcation plane (shown as dashed line) 13399 may be formed by hydrogen implantation or other methods as previously described.

Figure 133D:
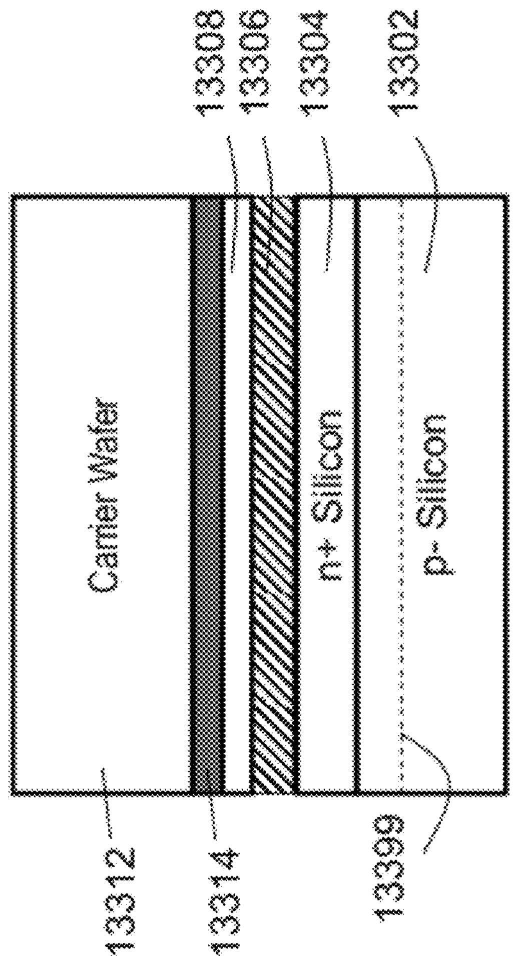

As illustrated in FIG. 133D P− substrate donor wafer 13302 with layer transfer demarcation plane 13399, P− doped layer 13301, N+ doped layer 13304, metal silicide layer 13306, and oxide layer 13308 may be temporarily bonded to carrier or holder substrate 13312 with a low temperature process that may facilitate a low temperature release. The carrier or holder substrate 13312 may be a glass substrate to enable state of the art optical alignment with the acceptor wafer. A temporary bond between the carrier or holder substrate 13312 and the P− substrate donor wafer 13302 may be made with a polymeric material, such as, for example, polyimide DuPont HD3007, which can be released at a later step by laser ablation, Ultra-Violet radiation exposure, or thermal decomposition, shown as adhesive layer 13314. Alternatively, a temporary bond may be made with uni-polar or bi-polar electrostatic technology such as, for example, the Apache tool from Beam Services Inc.

Figure 133E:
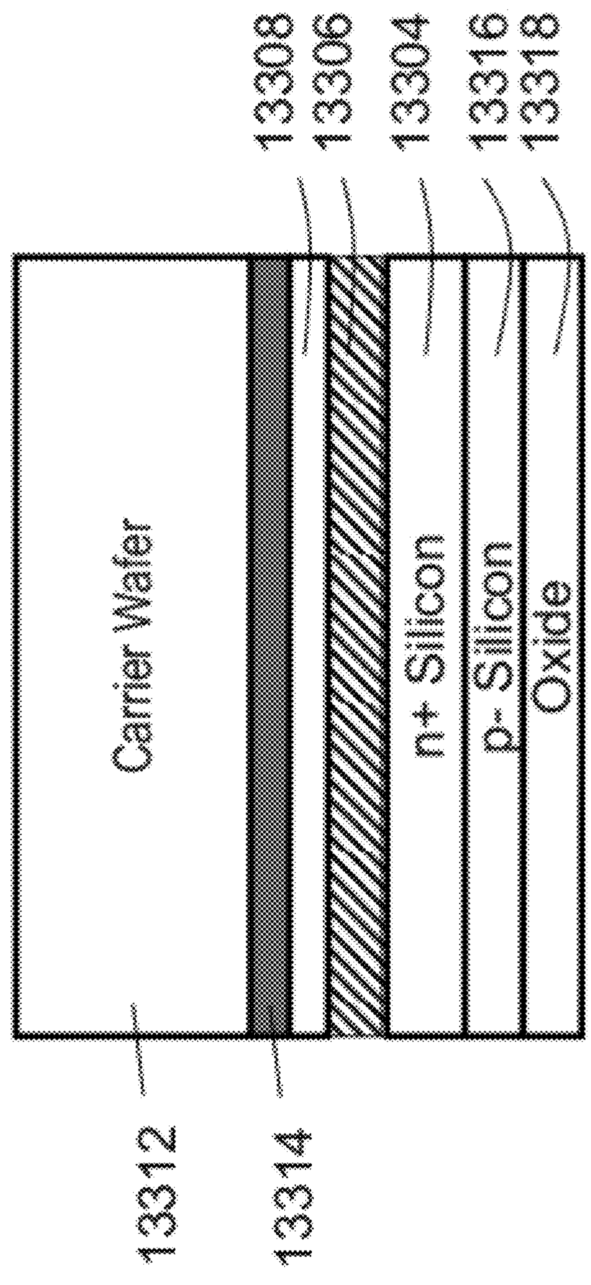

As illustrated in FIG. 133E, the portion of the P− substrate donor wafer 13302 that is below the layer transfer demarcation plane 13399 may be removed by cleaving or other processes as previously described, such as, for example, ion-cut or other methods. The remaining donor wafer P− doped layer 13301 may be thinned by chemical mechanical polishing (CMP) so that the P− layer 13316 may be formed to the desired thickness. Oxide layer 13318 may be deposited on the exposed surface of P− layer 13316.

Figure 133F:
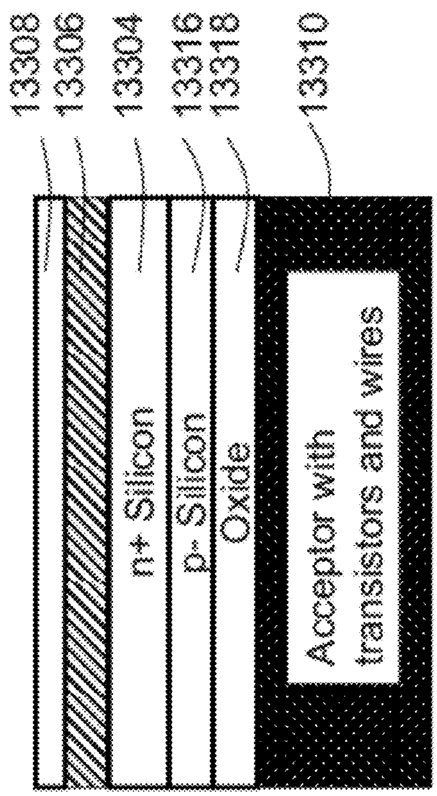

As illustrated in FIG. 133F, both the P− substrate donor wafer 13302 and acceptor substrate 13310 or wafer may be prepared for wafer bonding as previously described and then low temperature (less than about 400° C.) aligned and oxide to oxide bonded. Acceptor substrate 13310, as described previously, may include, for example, transistors, circuitry, metal, such as, for example, aluminum or copper, interconnect wiring, and through layer via metal interconnect strips or pads. The carrier or holder substrate 13312 may then be released using a low temperature process such as, for example, laser ablation. Oxide layer 13318, P− layer 13316, N+ doped layer 13304, metal silicide layer 13306, and oxide layer 13308 may have been layer transferred to acceptor substrate 13310. The top surface of oxide layer 13308 may be chemically or mechanically polished. Now RCAT transistors can be formed with low temperature (less than about 400° C.) processing and aligned to the acceptor substrate 13310 alignment marks (not shown).

Figure 133G:
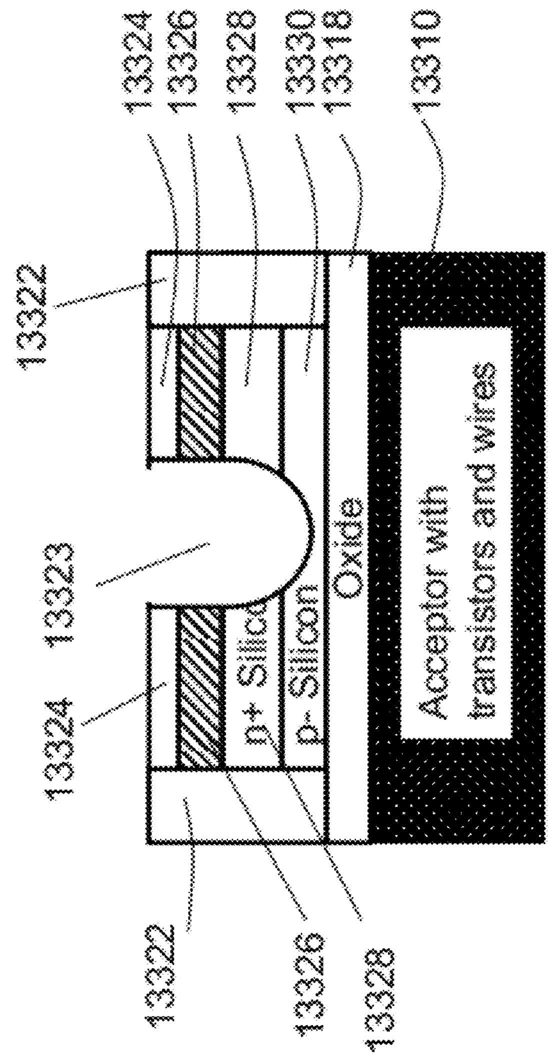

As illustrated in FIG. 133G, the transistor isolation regions 13322 may be formed by mask defining and then plasma/RIE etching oxide layer 13308, metal silicide layer 13306, N+ doped layer 13304, and P− layer 13316 to the top of oxide layer 13318. A low-temperature gap fill oxide may be deposited and chemically mechanically polished, with the oxide remaining in isolation regions 13322. Then the recessed channel 13323 may be mask defined and etched. The recessed channel surfaces and edges may be smoothed by wet chemical or plasma/RIE etching techniques to mitigate high field effects. These process steps may form oxide regions 13324, metal silicide source and drain regions 13326, N+ source and drain regions 13328 and P− channel region 13330.

Figure 133H:
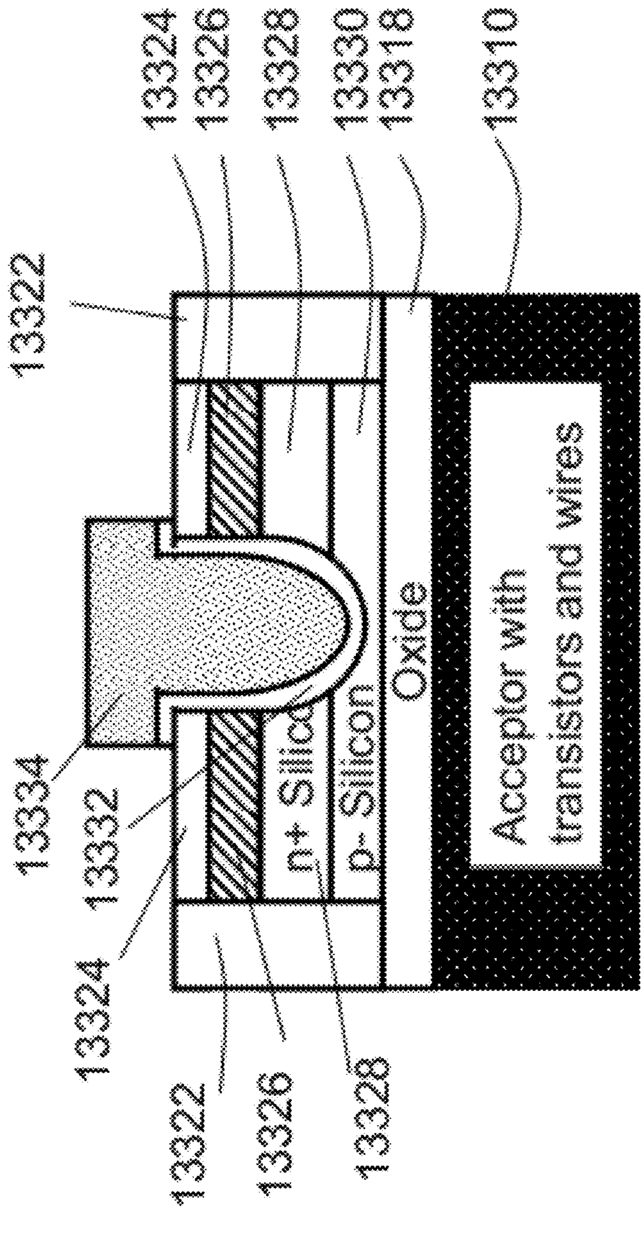

As illustrated in FIG. 133H, a gate dielectric 13332 may be formed and a gate metal material may be deposited. The gate dielectric 13332 may be an atomic layer deposited (ALD) gate dielectric that may be paired with a work function specific gate metal in the industry standard high k metal gate process schemes described previously. Or the gate dielectric 13332 may be formed with a low temperature oxide deposition or low temperature microwave plasma oxidation of the silicon surfaces and then a gate material such as, for example, tungsten or aluminum, may be deposited. The gate material may be chemically mechanically polished, and the gate area defined by masking and etching, thus forming gate electrode 13334.

Figure 133I:
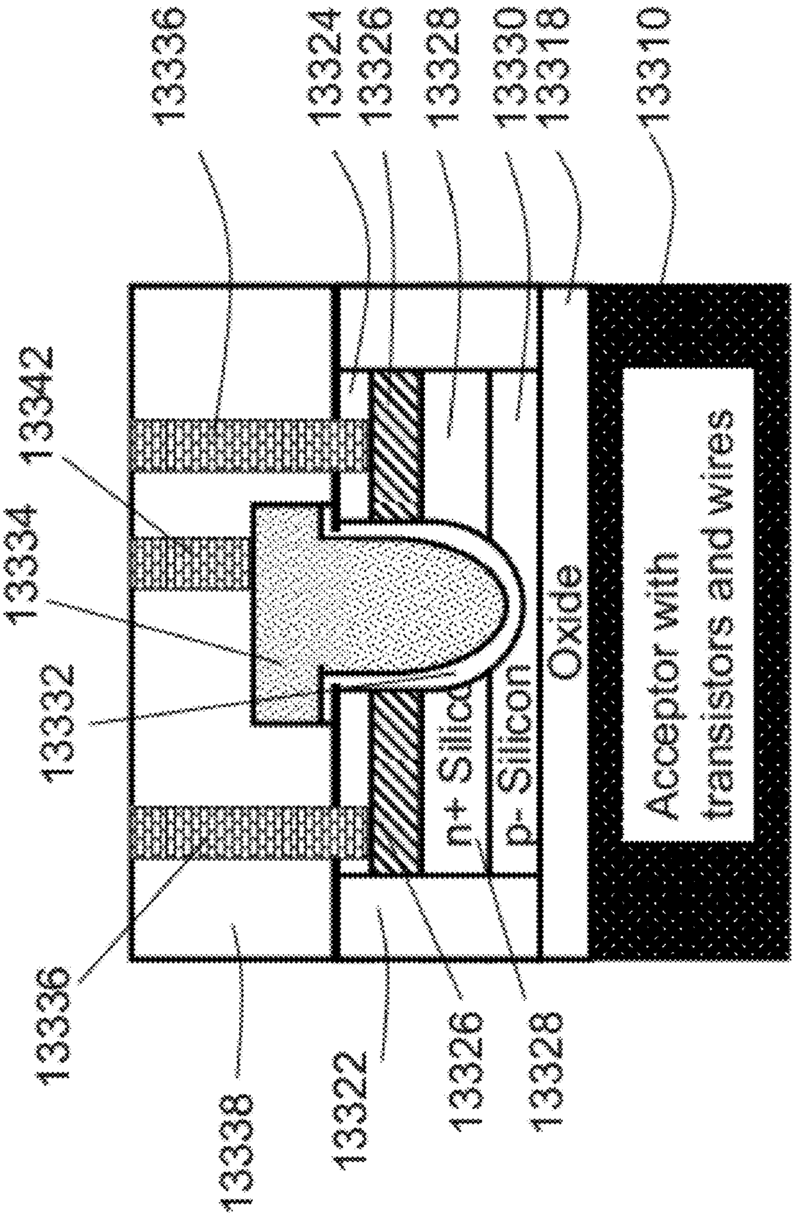

As illustrated in FIG. 133I, a low temperature thick oxide 13338 may be deposited and source, gate, and drain contacts, and through layer via (not shown) openings may be masked and etched preparing the transistors to be connected via metallization. Thus gate contact 13342 may connect to gate electrode 13334, and source & drain contacts 13336 may connect to metal silicide source and drain regions 13326.

Persons of ordinary skill in the art will appreciate that the illustrations in FIGS. 133A through 133I are exemplary only and are not drawn to scale. Such skilled persons will further appreciate that many variations may be possible such as, for example, the temporary carrier substrate may be replaced by a carrier wafer and a permanently bonded carrier wafer flow such as described in FIG. 40 may be employed. Many other modifications within the scope of illustrated embodiments of the invention will suggest themselves to such skilled persons after reading this specification. Thus the invention is to be limited only by the appended claims.

With the high density of layer to layer interconnection and the formation of memory devices & transistors that are enabled by embodiments in this document, novel FPGA (Field Programmable Gate Array) programming architectures and devices may be employed to create cost, area, and performance efficient 3D FPGAs. The pass transistor, or switch, and the memory device that may control the ON or OFF state of the pass transistor may reside in separate layers and may be connected by through layer vias (TLVs) to each other and the routing network metal lines, or the pass transistor and memory devices may reside in the same layer and TLVs may be utilized to connect to the network metal lines.

Figure 134A:
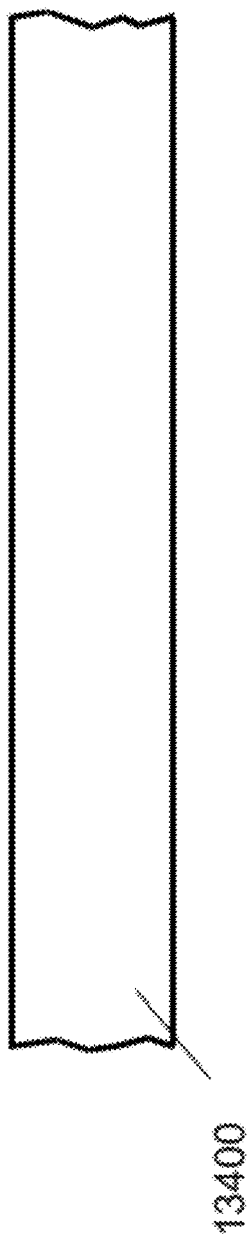

As illustrated in FIG. 134A, acceptor wafer 13400 may be processed to include logic circuits, analog circuits, and other devices, with metal interconnection and a metal configuration network to form the base FPGA. Acceptor wafer 13400 may also include configuration elements such as, for example, switches, pass transistors, memory elements, programming transistors, and may contain a foundation layer or layers as described previously.

Figure 134B:
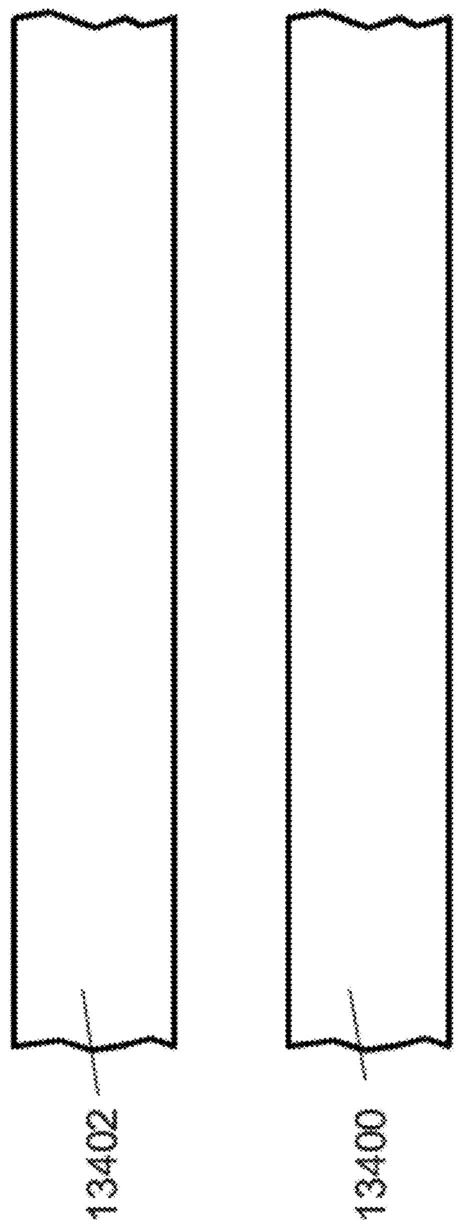

As illustrated in FIG. 134B, donor wafer 13402 may be preprocessed with a layer or layers of pass transistors or switches or partially formed pass transistors or switches. The pass transistors may be constructed utilizing the partial transistor process flows described previously, such as, for example, RCAT or JLT or others, or may utilize the replacement gate techniques, such as, for example, CMOS or CMOS N over P or gate array, with or without a carrier wafer, as described previously. Donor wafer 13402 and acceptor substrate 13400 and associated surfaces may be prepared for wafer bonding as previously described.

Figure 134C:
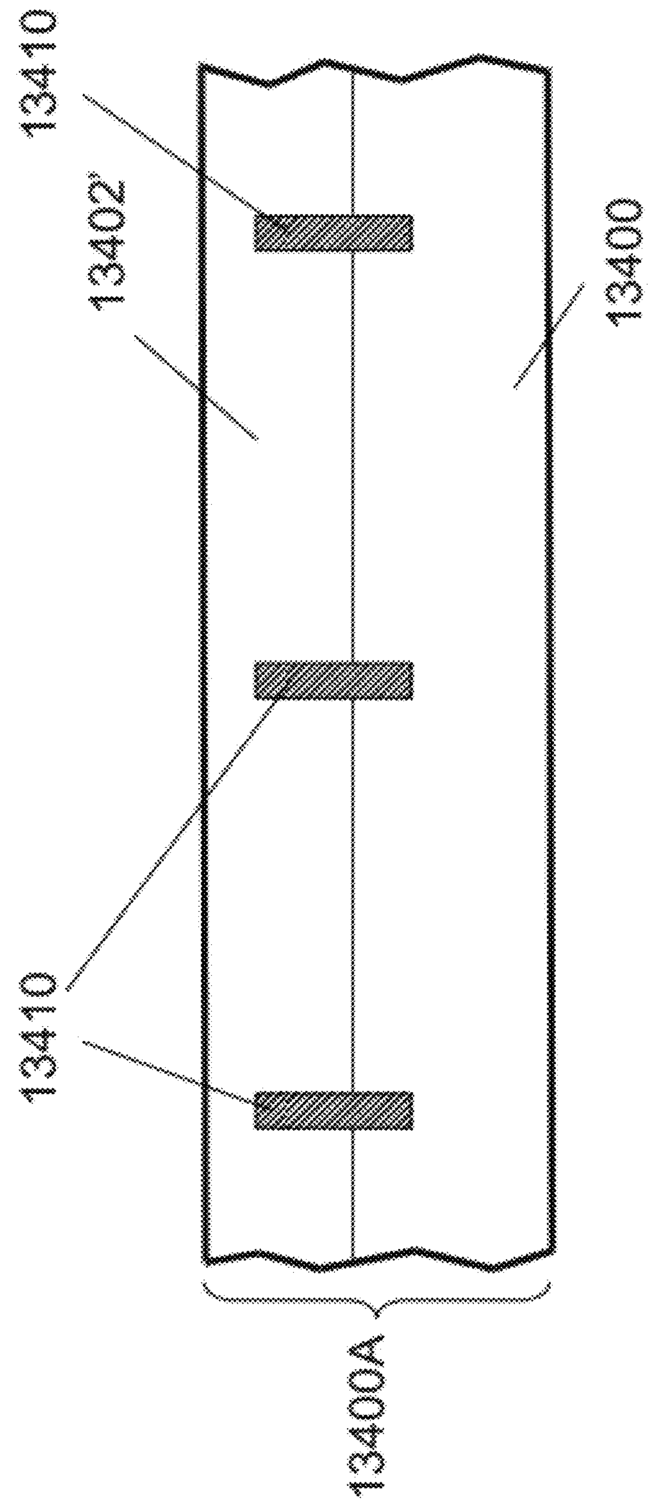

As illustrated in FIG. 134C, donor wafer 13402 and acceptor substrate 13400 may be bonded at a low temperature (less than about 400° C.) and a portion of donor wafer 13402 may be removed by cleaving and polishing, or other processes as previously described, such as, for example, ion-cut or other methods, thus forming the remaining pass transistor layer 13402'. Now transistors or portions of transistors may be formed or completed and may be aligned to the acceptor substrate 13400 alignment marks (not shown) as described previously. Thru layer vias (TLVs) 13410 may be formed as described previously and as well as interconnect and dielectric layers. Thus acceptor substrate with pass transistors 13400A may be formed, which may include acceptor substrate 13400, pass transistor layer 13402', and TLVs 13410.

Figure 134D:
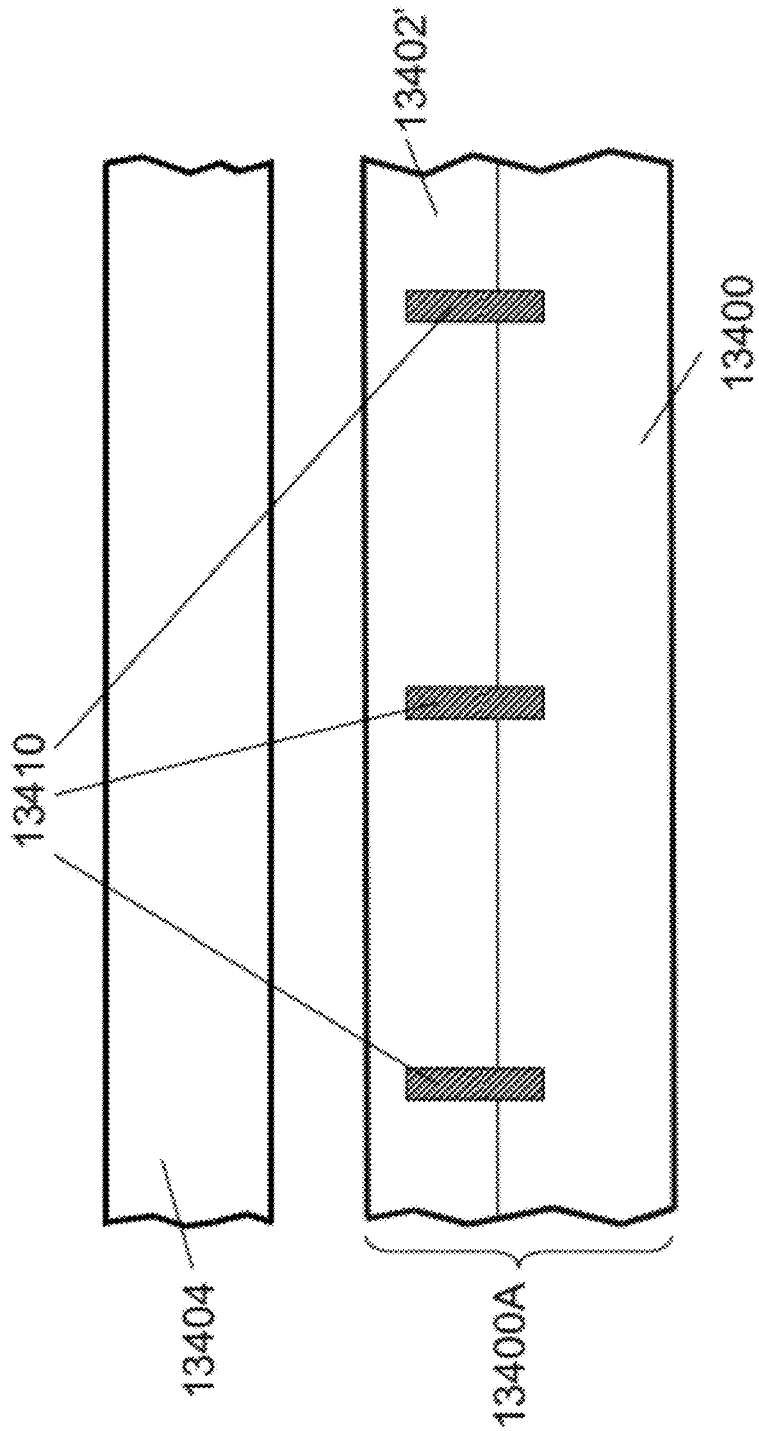

As illustrated in FIG. 134D, memory element donor wafer 13404 may be preprocessed with a layer or layers of memory elements or partially formed memory elements. The memory elements may be constructed utilizing the partial memory process flows described previously, such as, for example, RCAT DRAM, JLT, or others, or may utilize the replacement gate techniques, such as, for example, CMOS gate array to form SRAM elements, with or without a carrier wafer, as described previously, or may be constructed with non-volatile memory, such as, for example, R-RAM or FG Flash as described previously. Memory element donor wafer 13404 and acceptor substrate with pass transistors 13400A and associated surfaces may be prepared for wafer bonding as previously described.

Figure 134E:
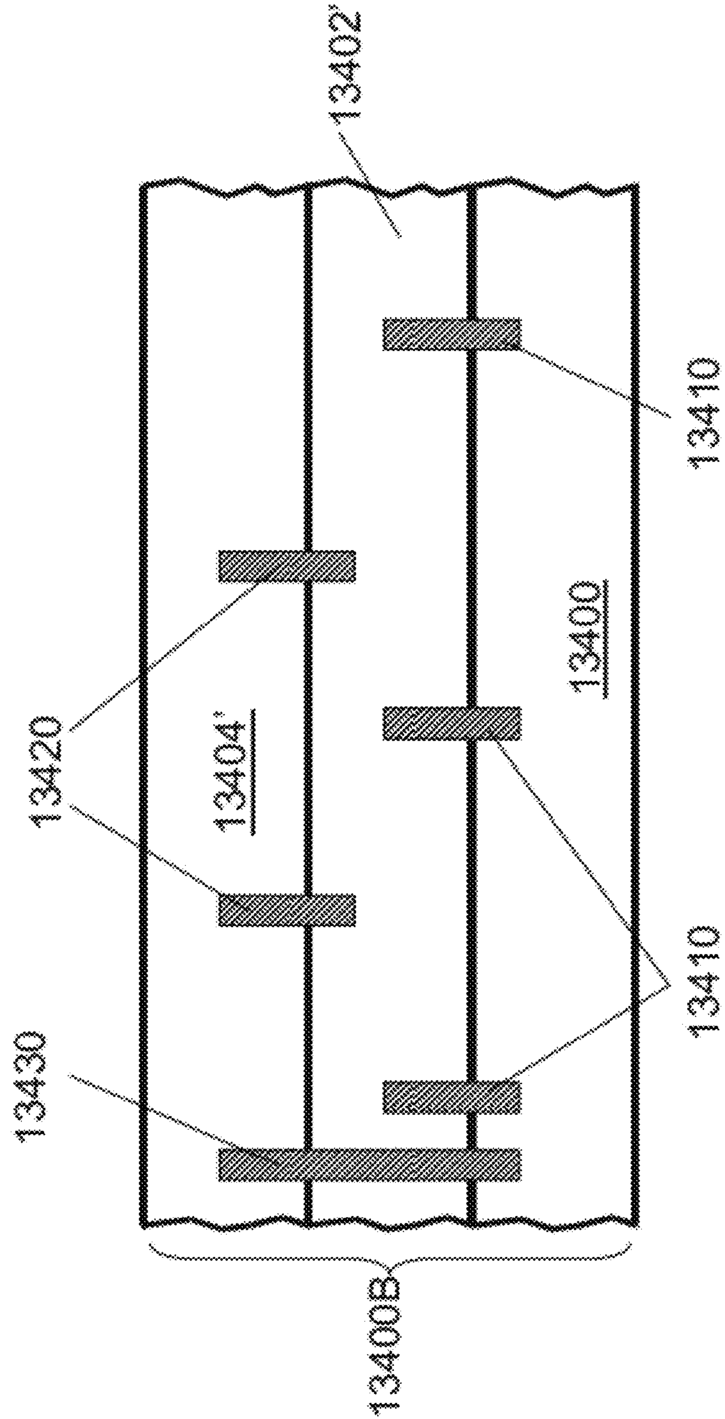

As illustrated in FIG. 134E, memory element donor wafer 13404 and acceptor substrate with pass transistors 13400A may be bonded at a low temperature (less than about 400° C.) and a portion of memory element donor wafer 13404 may be removed by cleaving and polishing, or other processes as previously described, such as, for example, ion-cut or other methods, thus forming the remaining memory element layer 13404'. Now memory elements & transistors or portions of memory elements & transistors may be formed or completed and may be aligned to the acceptor substrate with pass transistors 13400A alignment marks (not shown) as described previously. Memory to switch through layer vias 13420 and memory to acceptor through layer vias 13430 as well as interconnect and dielectric layers may be formed as described previously. Thus acceptor substrate with pass transistors and memory elements 13400B may be formed, which may include acceptor substrate 13400, pass transistor layer 13402', TLVs 13410, memory to switch through layer vias 13420, memory to acceptor through layer vias 13430, and memory element layer 13404'.

Figure 134F:
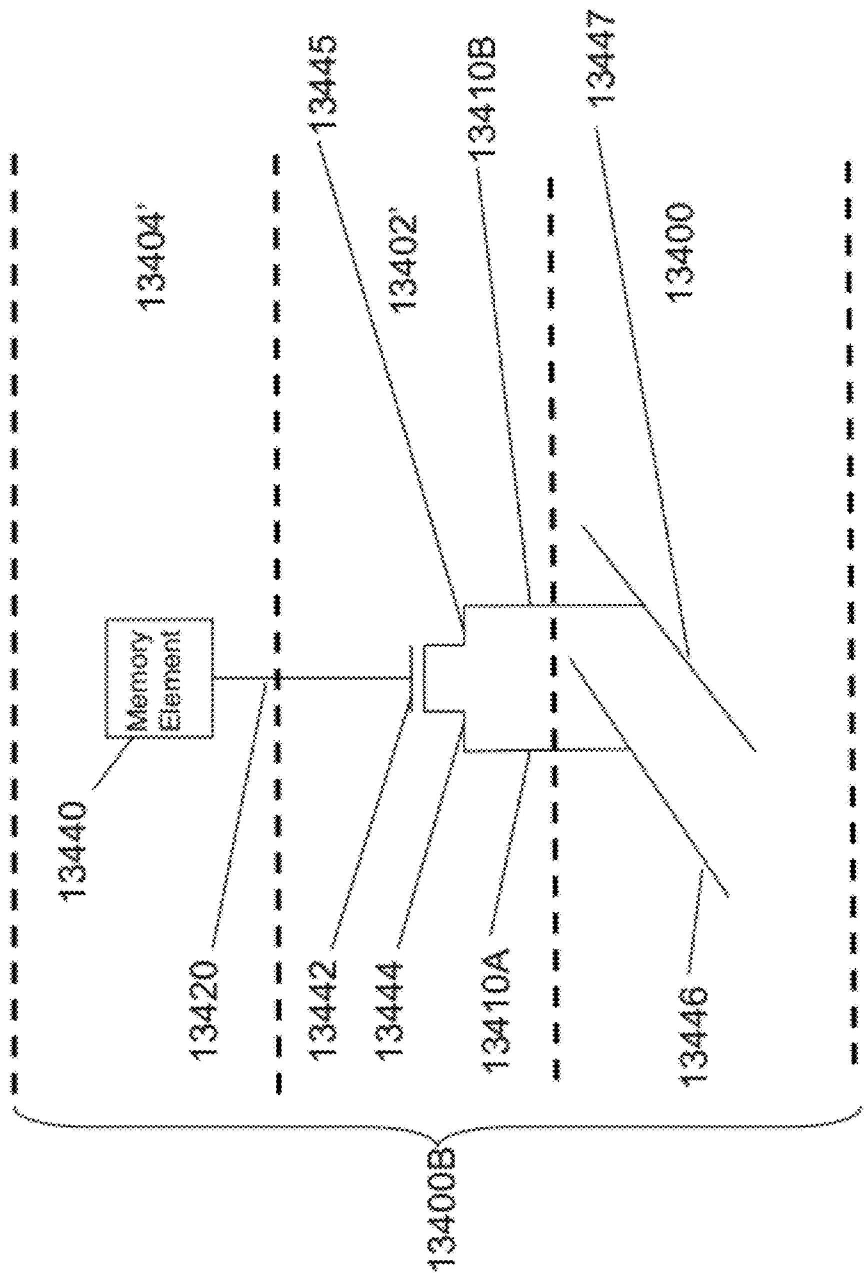

As illustrated in FIG. 134F, a simple schematic of illustrative elements of acceptor substrate with pass transistors and memory elements 13400B may be shown. An exemplary memory element 13440 residing in memory element layer 13404' may be electrically coupled to exemplary pass transistor gate 13442, residing in pass transistor layer 13402', with memory to switch through layer vias 13420. The pass transistor source 13444, residing in pass transistor layer 13402', may be electrically coupled to FPGA configuration network metal line 13446, residing in acceptor substrate 13400, with TLV 13410A. The pass transistor drain 13445, residing in pass transistor layer 13402', may be electrically coupled to FPGA configuration network metal line 13447, residing in acceptor substrate 13400, with TLV 13410B. The memory element 13440 may be programmed with signals from off chip, or above, within, or below the memory element layer 13404'. The memory element 13440 may also include an inverter configuration, wherein one memory cell, such as, for example, a FG Flash cell, may couple the gate of the pass transistor to power supply Vcc if turned on, and another FG Flash device may couple the gate of the pass transistor to ground if turned on. Thus, FPGA configuration network metal line 13446, which may be carrying the output signal from a logic element in acceptor substrate 13400, may be electrically coupled to FPGA configuration network metal line 13447, which may route to the input of a logic element elsewhere in acceptor substrate 13400.

Persons of ordinary skill in the art will appreciate that the illustrations in FIGS. 134A through 134F are exemplary only and are not drawn to scale. Such skilled persons will further appreciate that many variations may be possible such as, for example, the memory element layer 13404' may be constructed below pass transistor layer 13402'. Additionally, the pass transistor layer 13402' may include control and logic circuitry in addition to the pass transistors or switches. Moreover, the memory element layer 13404' may comprise control and logic circuitry in addition to the memory elements. Further, the pass transistor element may instead be a transmission gate, or may be an active drive type switch. Many other modifications within the scope of the illustrated embodiments of the invention will suggest themselves to such skilled persons after reading this specification. Thus the invention is to be limited only by the appended claims.

Figure 135A:
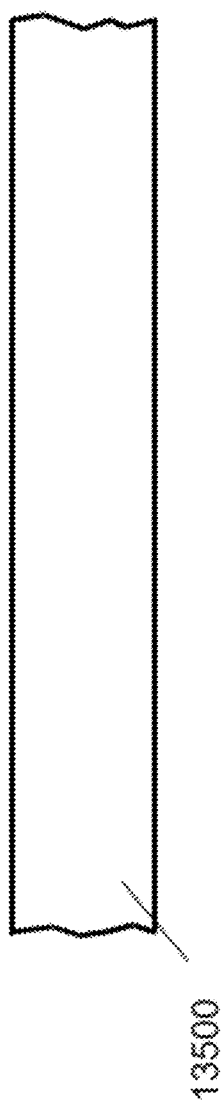

The pass transistor, or switch, and the memory device that controls the ON or OFF state of the pass transistor may reside in the same layer and TLVs may be utilized to connect to the network metal lines. As illustrated in FIG. 135A, acceptor substrate 13500 or wafer may be processed to include logic circuits, analog circuits, and other devices, with metal interconnection, such as copper or aluminum wiring, and a metal configuration network to form the base FPGA. Acceptor substrate 13500 may also include configuration elements such as, for example, switches, pass transistors, memory elements, programming transistors, and may contain a foundation layer or layers as described previously.

Figure 135B:
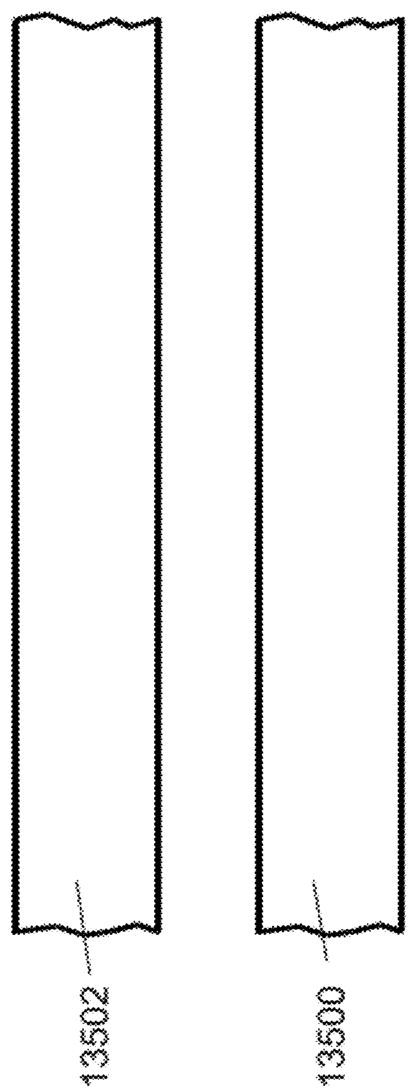

As illustrated in FIG. 135B, donor wafer 13502 may be preprocessed with a layer or layers of pass transistors or switches or partially formed pass transistors or switches. The pass transistors may be constructed utilizing the partial transistor process flows described previously, such as, for example, RCAT or JLT or others, or may utilize the replacement gate techniques, such as, for example, CMOS or CMOS N over P or CMOS gate array, with or without a carrier wafer, as described previously. Donor wafer 13502 may be preprocessed with a layer or layers of memory elements or partially formed memory elements. The memory elements may be constructed utilizing the partial memory process flows described previously, such as, for example, RCAT DRAM or others, or may utilize the replacement gate techniques, such as, for example, CMOS gate array to form SRAM elements, with or without a carrier wafer, as described previously. The memory elements may be formed simultaneously with the pass transistor, for example, such as, for example, by utilizing a CMOS gate array replacement gate process where a CMOS pass transistor and SRAM memory element, such as a 6-transistor cell, may be formed, or an RCAT pass transistor formed with an RCAT DRAM memory. Donor wafer 13502 and acceptor substrate 13500 and associated surfaces may be prepared for wafer bonding as previously described.

Figure 135C:
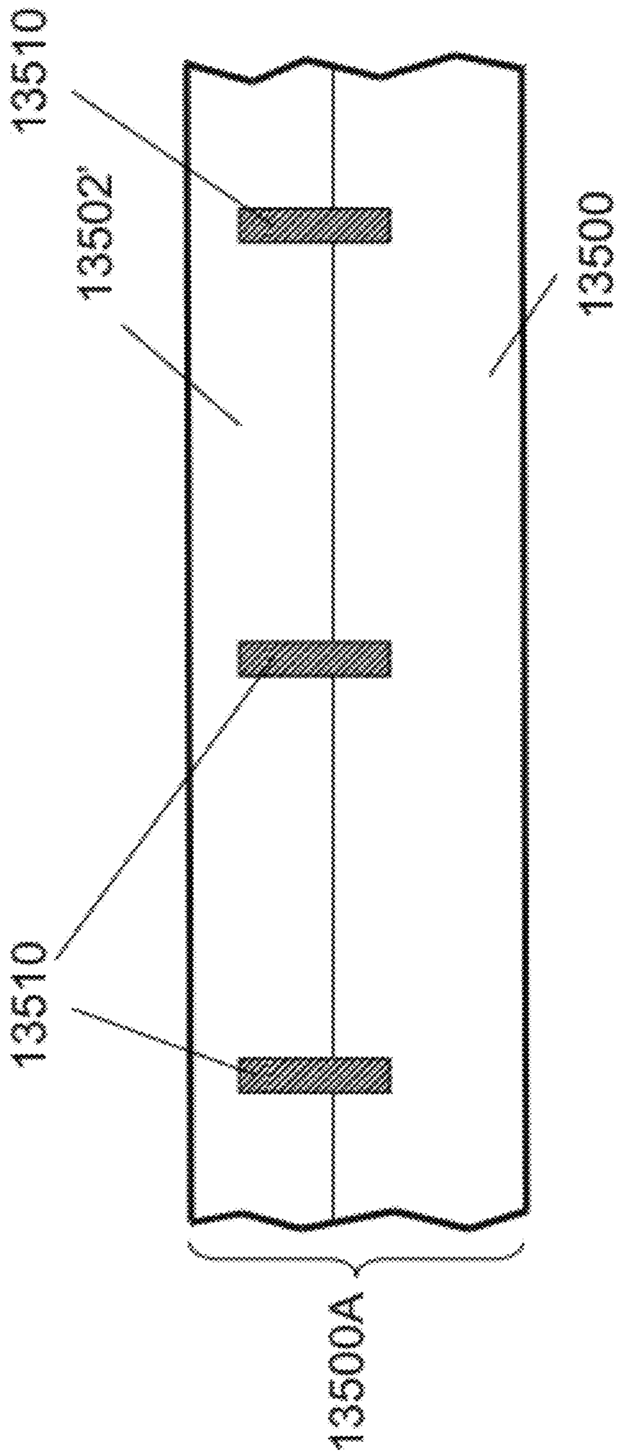

As illustrated in FIG. 135C, donor wafer 13502 and acceptor substrate 13500 may be bonded at a low temperature (less than about 400° C.) and a portion of donor wafer 13502 may be removed by cleaving and polishing, or other processes as previously described, such as, for example, ion-cut or other methods, thus forming the remaining pass transistor & memory layer 13502'. Now transistors or portions of transistors and memory elements may be formed or completed and may be aligned to the acceptor substrate 13500 alignment marks (not shown) as described previously. Thru layer vias (TLVs) 13510 may be formed as described previously. Thus acceptor substrate with pass transistors and memory elements 13500A may be formed, which may include acceptor substrate 13500, pass transistor & memory element layer 13502', and TLVs 13510.

Figure 135D:
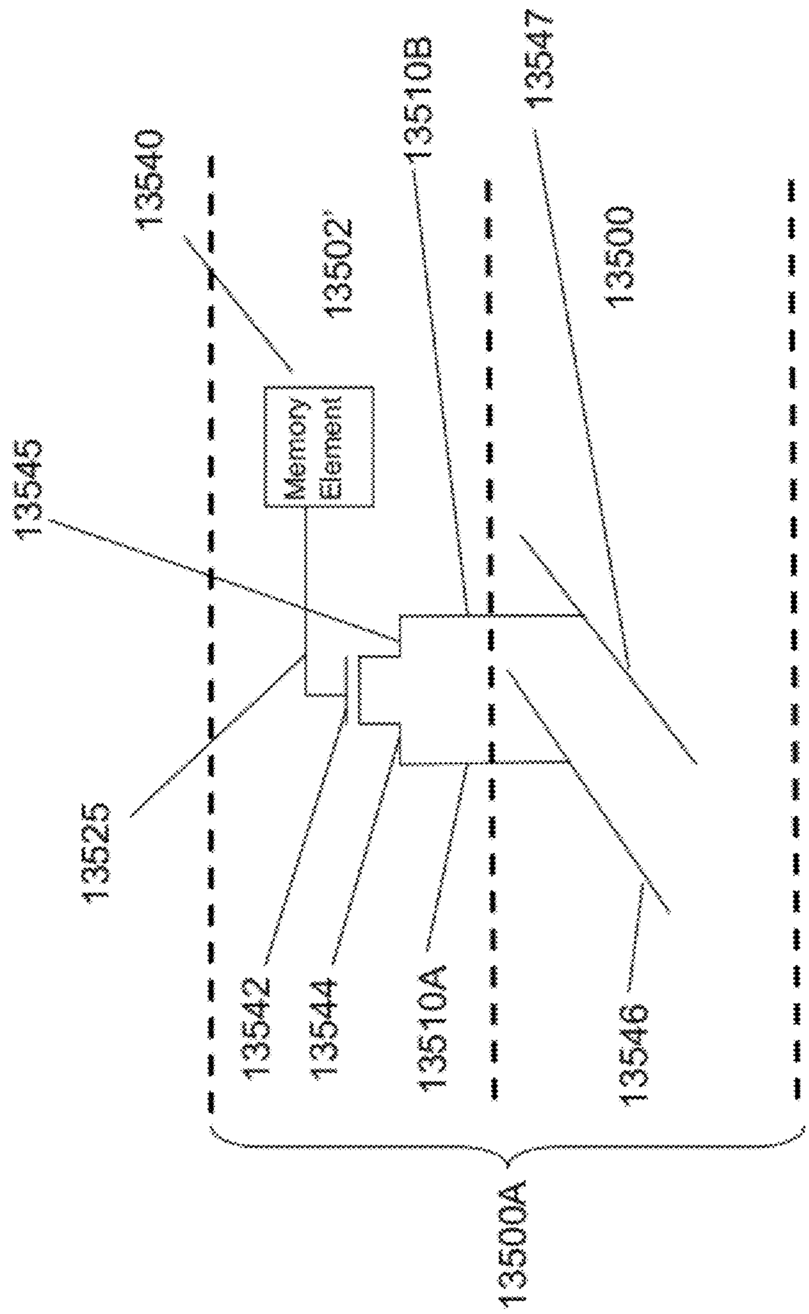

As illustrated in FIG. 135D, a simple schematic of illustrative elements of acceptor substrate with pass transistors & memory elements 13500A is shown. An exemplary memory element 13540 residing in pass transistor & memory layer 13502' may be electrically coupled to exemplary pass transistor gate 13542, also residing in pass transistor & memory layer 13502', with pass transistor & memory layer interconnect metallization 13525. The pass transistor source 13544, residing in pass transistor & memory layer 13502', may be electrically coupled to FPGA configuration network metal line 13546, residing in acceptor substrate 13500, with TLV 13510A. The pass transistor drain 13545, residing in pass transistor & memory layer 13502', may be electrically coupled to FPGA configuration network metal line 13547, residing in acceptor substrate 13500, with TLV 13510B. The memory element 13540 may be programmed with signals from off chip, or above, within, or below the pass transistor & memory layer 13502'. The memory element 13540 may also include an inverter configuration, wherein one memory cell, such as, for example, a FG Flash cell, may couple the gate of the pass transistor to power supply Vcc if turned on, and another FG Flash device may couple the gate of the pass transistor to ground if turned on. Thus, FPGA configuration network metal line 13546, which may be carrying the output signal from a logic element in acceptor substrate 13500, may be electrically coupled to FPGA configuration network metal line 13547, which may route to the input of a logic element elsewhere in acceptor substrate 13500.

Persons of ordinary skill in the art will appreciate that the illustrations in FIGS. 135A through 135D are exemplary only and are not drawn to scale. Such skilled persons will further appreciate that many variations may be possible such as, for example, the pass transistor & memory layer 13502' may include control and logic circuitry in addition to the pass transistors or switches and memory elements. Additionally, that the pass transistor element may instead be a transmission gate, or may be an active drive type switch. Many other modifications within the scope of the illustrated embodiments of the invention will suggest themselves to such skilled persons after reading this specification. Thus the invention is to be limited only by the appended claims.

As illustrated in FIG. 136, a non-volatile configuration switch with integrated floating gate (FG) Flash memory is shown. The control gate 13602 and floating gate 13604 may be common to both the sense transistor channel 13620 and the switch transistor channel 13610. Switch transistor source 13612 and switch transistor drain 13614 may be coupled to the FPGA configuration network metal lines. The sense transistor source 13622 and the sense transistor drain 13624 may be coupled to the program, erase, and read circuits. This integrated NVM switch has been utilized by FPGA maker Actel Corporation and is manufactured in a high temperature (greater than about 400° C.) 2D embedded FG flash process technology.

As illustrated in FIGS. 137A to 137G, a 1T NVM FPGA cell may be constructed with a single layer transfer of wafer sized doped layers and post layer transfer processing with a process flow that is suitable for 3D IC manufacturing. This cell may be programmed with signals from off chip, or above, within, or below the cell layer.

Figures 137A, 137B:
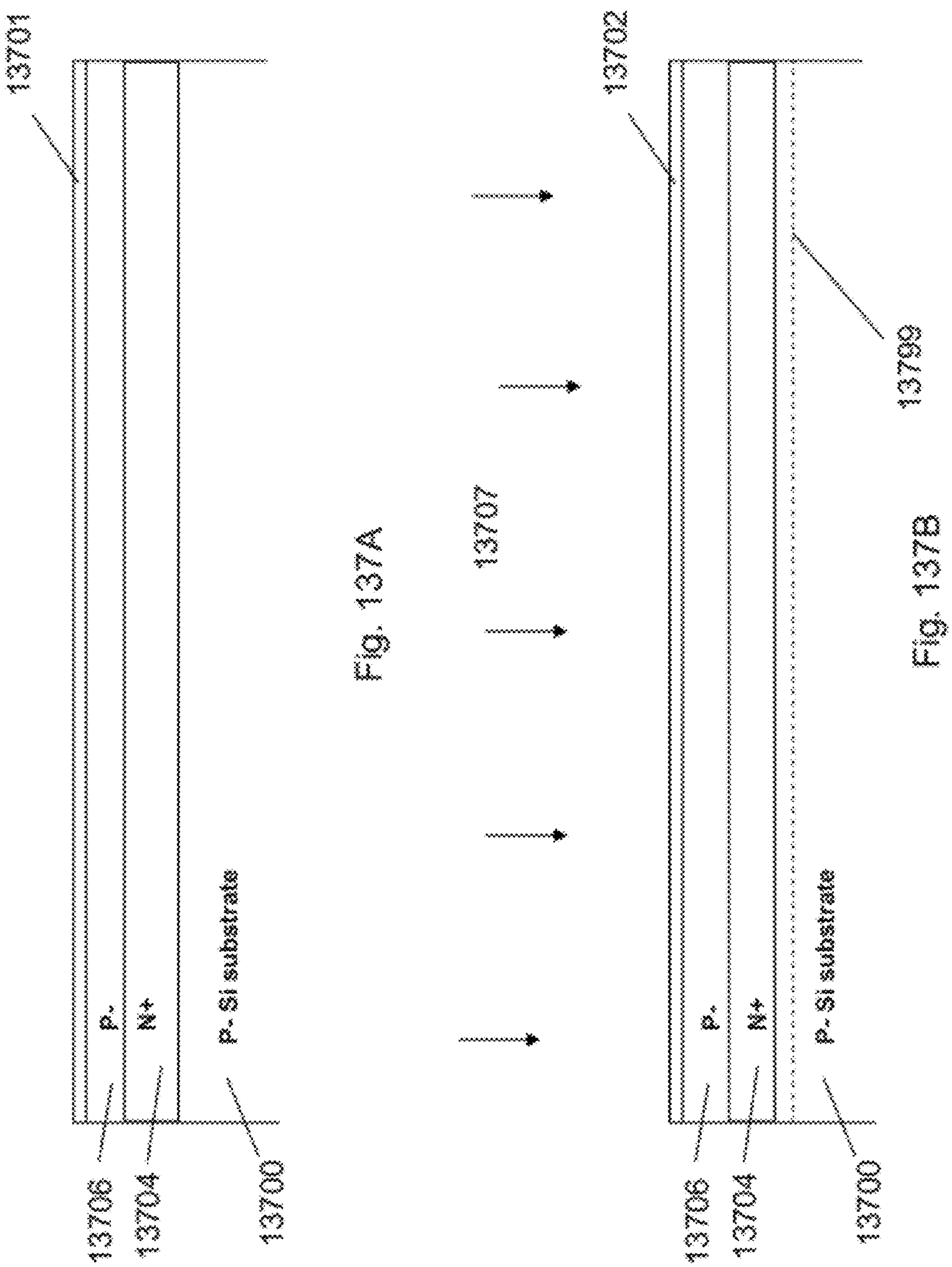

As illustrated in FIG. 137A, a P− substrate donor wafer 13700 may be processed to include two wafer sized layers of N+ doping 13704 and P− doping 13706. The P− doped layer 13706 may have the same or a different dopant concentration than the P− substrate donor wafer 13700. The doped layers may be formed by ion implantation and thermal anneal. The layer stack may alternatively be formed by successive epitaxially deposited doped silicon layers or by a combination of epitaxy and implantation and anneals. P− doped layer 13706 and N+ doped layer 13704 may also have graded doping to mitigate transistor performance issues, such as, for example, short channel effects, and enhance programming and erase efficiency. A screen oxide 13701 may be grown or deposited before an implant to protect the silicon from implant contamination and to provide an oxide surface for later wafer to wafer bonding. These processes may be done at temperatures above about 400° C. as the layer transfer to the processed substrate with metal interconnects has yet to be done.

As illustrated in FIG. 137B, the top surface of P− substrate donor wafer 13700 may be prepared for oxide wafer bonding with a deposition of an oxide or by thermal oxidation of the P− doped layer 13706 to form oxide layer 13702, or a re-oxidation of implant screen oxide 13701. A layer transfer demarcation plane 13799 (shown as a dashed line) may be formed in P− substrate donor wafer 13700 (shown) or N+ doped layer 13704 by hydrogen implantation 13707 or other methods as previously described. Both the P− substrate donor wafer 13700 and acceptor wafer 13710 may be prepared for wafer bonding as previously described and then low temperature (less than about 400° C.) bonded. The portion of the P− substrate donor wafer 13700 that may be above the layer transfer demarcation plane 13799 may be removed by cleaving and polishing, or other low temperature processes as previously described. This process of an ion implanted atomic species, such as, fro example, Hydrogen, forming a layer transfer demarcation plane, and subsequent cleaving or thinning, may be called 'ion-cut'. Acceptor wafer 13710 may have similar meanings as wafer 808 previously described with reference to FIG. 8.

Figure 137C:
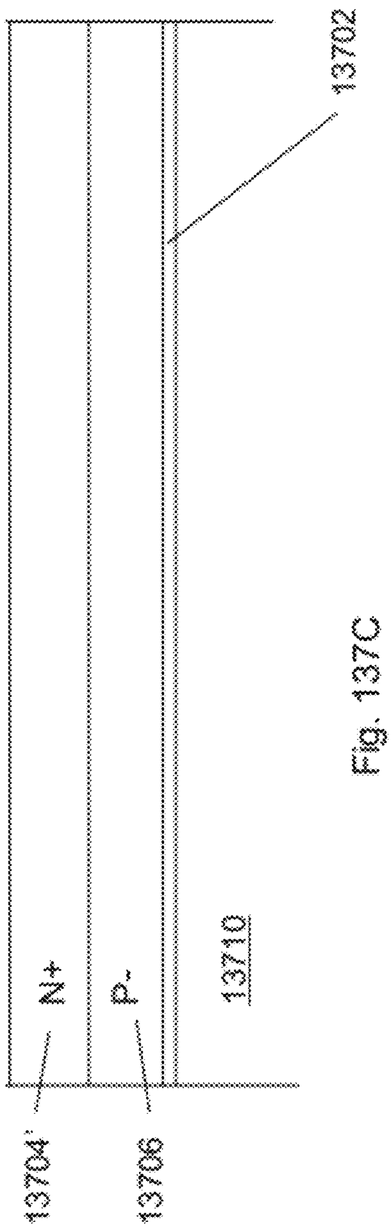

As illustrated in FIG. 137C, the remaining N+ doped layer 13704' and P− doped layer 13706, and oxide layer 13702 may have been layer transferred to acceptor wafer 13710. The top surface of N+ doped layer 13704' may be chemically or mechanically polished smooth and flat. Now FG and other transistors may be formed with low temperature (less than about 400° C.) processing and aligned to the acceptor wafer 13710 alignment marks (not shown). For illustration clarity, the oxide layers, such as, for example, oxide layer 13702, used to facilitate the wafer to wafer bond are not shown in subsequent drawings.

Figure 137D:
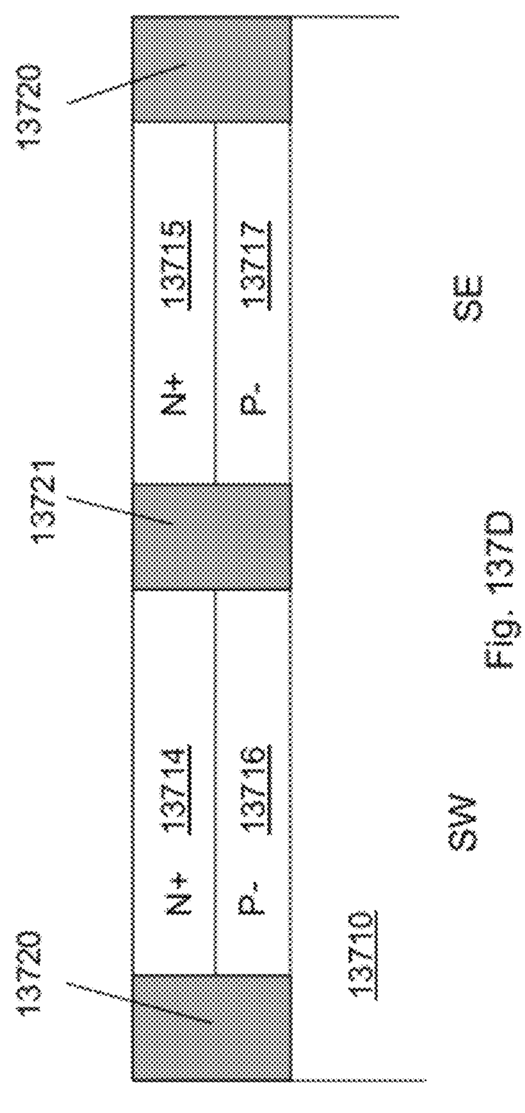

As illustrated in FIG. 137D, the transistor isolation regions may be lithographically defined and then formed by plasma/RIE etch removal of portions of N+ doped layer 13704' and P− doped layer 13706 to at least the top oxide of acceptor wafer 13710. Then a low-temperature gap fill oxide may be deposited and chemically mechanically polished, remaining in transistor isolation regions 13720 and SW-to-SE isolation region 13721. "SW' in the FIG. 137 illustrations denotes that portion of the illustration where the switch transistor may be formed, and 'SE' denotes that portion of the illustration where the sense transistor can be formed. Thus formed may be future SW transistor regions N+ doped 13714 and P− doped 13716, and future SE transistor regions N+ doped 13715, and P− doped 13717.

Figure 137E:
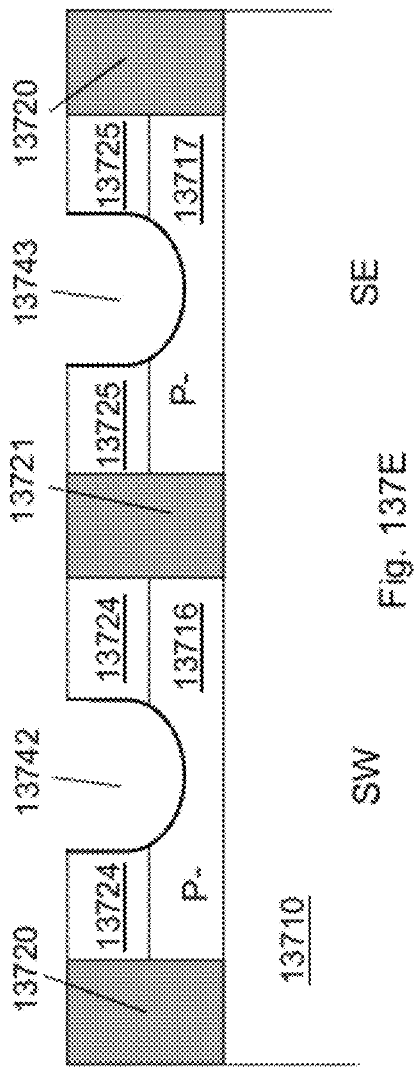

As illustrated in FIG. 137E, the SW recessed channel 13742 and SE recessed channel 13743 may be lithographically defined and etched, removing portions future SW transistor regions N+ doped 13714 and P− doped 13716, and future SE transistor regions N+ doped 13715, and P− doped 13717. The recessed channel surfaces and edges may be smoothed by wet chemical or plasma/RIE etching techniques to mitigate high field effects. The SW recessed channel 13742 and SE recessed channel 13743 may be mask defined and etched separately or at the same step. The SW channel width may be larger than the SE channel width. These process steps form SW source and drain regions 13724, SE source and drain regions 13725, SW transistor channel region 13716 and SE transistor channel region 13717.

Figure 137F:
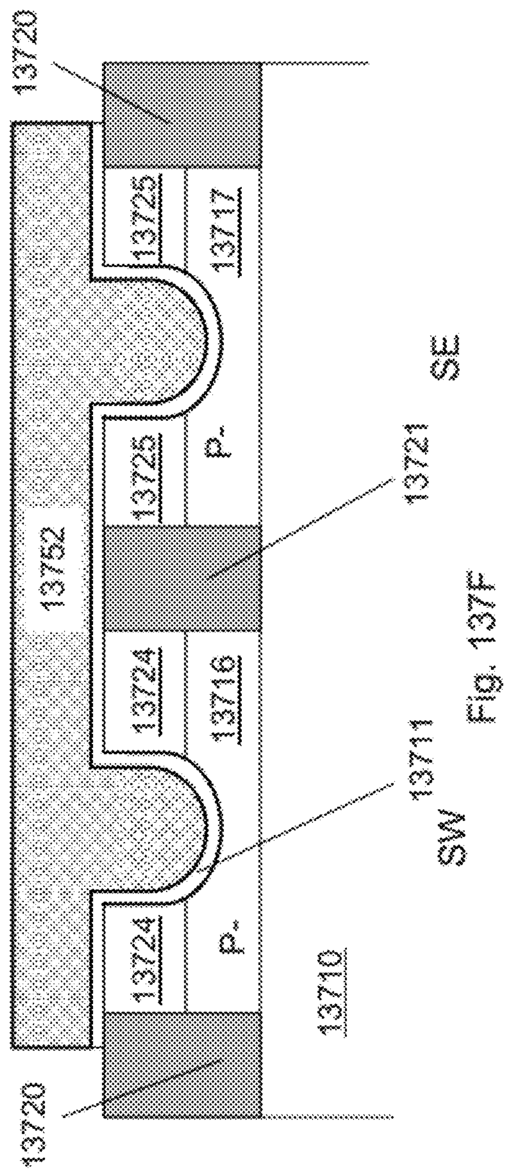

As illustrated in FIG. 137F, a tunneling dielectric 13711 may be formed and a floating gate material may be deposited. The tunneling dielectric 13711 may be an atomic layer deposited (ALD) dielectric. Or the tunneling dielectric 13711 may be formed with a low temperature oxide deposition or low temperature microwave plasma oxidation of the silicon surfaces. Then a floating gate material, such as, for example, doped poly-crystalline or amorphous silicon, may be deposited. Then the floating gate material may be chemically mechanically polished, and the floating gate 13752 may be partially or fully formed by lithographic definition and plasma/RIE etching.

Figure 137G:
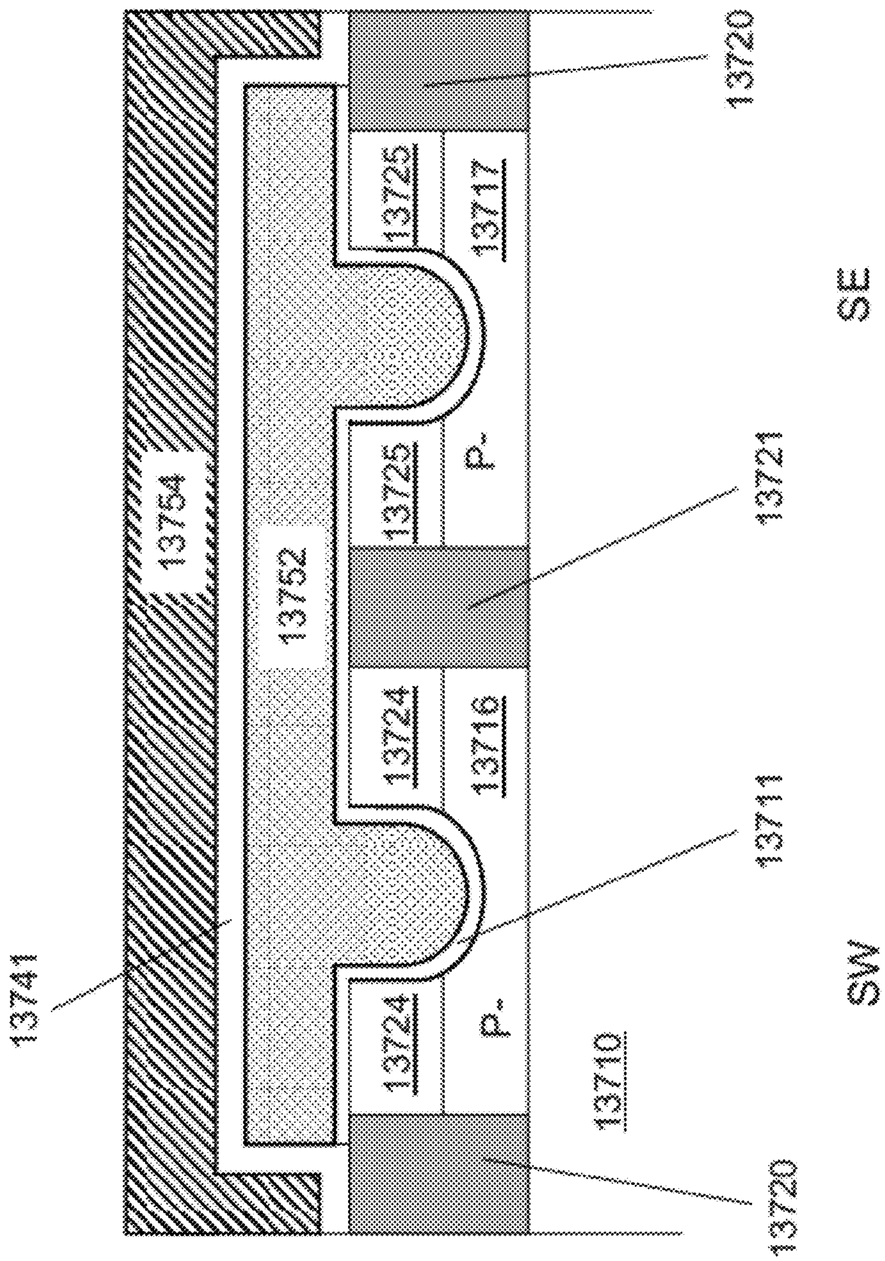

As illustrated in FIG. 137G, an inter-poly dielectric 13741 may be formed by either low temperature oxidation and depositions of a dielectric or layers of dielectrics, such as, for example, oxide-nitride-oxide (ONO) layers, and then a control gate material, such as, for example, doped poly-crystalline or amorphous silicon, may be deposited. The control gate material may be chemically mechanically polished, and the control gate 13754 may be formed by lithographic definition and plasma/RIE etching. The etching of control gate 13754 may also include etching portions of the inter-poly dielectric and portions of the floating gate 13752 in a self-aligned stack etch process. Logic transistors for control functions may be formed (not shown) utilizing 3D IC compatible methods described in the document, such as, for example, RCAT, V-groove, and contacts, including through layer vias, and interconnect metallization may be constructed. This flow may enable the formation of a mono-crystalline silicon 1T NVM FPGA configuration cell constructed in a single layer transfer of prefabricated wafer sized doped layers, which may be formed and connected to the underlying multi-metal layer semiconductor device without exposing the underlying devices to a high temperature.

Persons of ordinary skill in the art will appreciate that the illustrations in FIGS. 137A through 137G are exemplary only and are not drawn to scale. Such skilled persons will further appreciate that many variations may be possible such as, for example, the floating gate may include nano-crystals of silicon or other materials. Additionally, that a common well cell may be constructed by removing the SW-to-SE isolation region 13721. Moreover, that the slope of the recess of the channel transistor may be from zero to 180 degrees. Further, that logic transistors and devices may be constructed by using the control gate as the device gate. Additionally, that the logic device gate may be made separately from the control gate formation. Moreover, the 1T NVM FPGA configuration cell may be constructed with a charge trap technique NVM, a resistive memory technique, and may also have a junction-less SW or SE transistor construction. Many other modifications within the scope of the illustrated embodiments of the invention will suggest themselves to such skilled persons after reading this specification. Thus the invention is to be limited only by the appended claims.

It may be desirable to construct 2DICs with regions or 3DICs with layers or strata that may be of dissimilar materials, such as, for example, mono-crystalline silicon based state of the art (SOA) CMOS circuits integrated with, on a 2DIC wafer or integrated in a 3DIC stack, InP optoelectronic circuits, such as, for example, sensors, imagers, displays. These dissimilar materials may include substantially different crystal materials, for example, mono-crystalline silicon and InP. This heterogeneous integration has traditionally been difficult and may result from the substrate differences. The SOA CMOS circuits may be typically constructed at state of the art wafer fabs on large diameter, such as 300 mm, silicon wafers, and the desired SOA InP technology may be made on 2 to 4 inch diameter InP wafers at a much older wafer fab.

Some embodiments of the invention may solve this issue by creating a recess in the larger diameter wafer, bonding the smaller diameter wafer in that recess, and then either making 2DIC connections, or stacking 3DIC layers monolithically or with TSV technology. Some 3D IC embodiments of the invention are described in FIG. 157A-H and FIG. 158A-G, and some 2DIC embodiments of the invention are described in FIG. 159A-E.

Figure 157A:
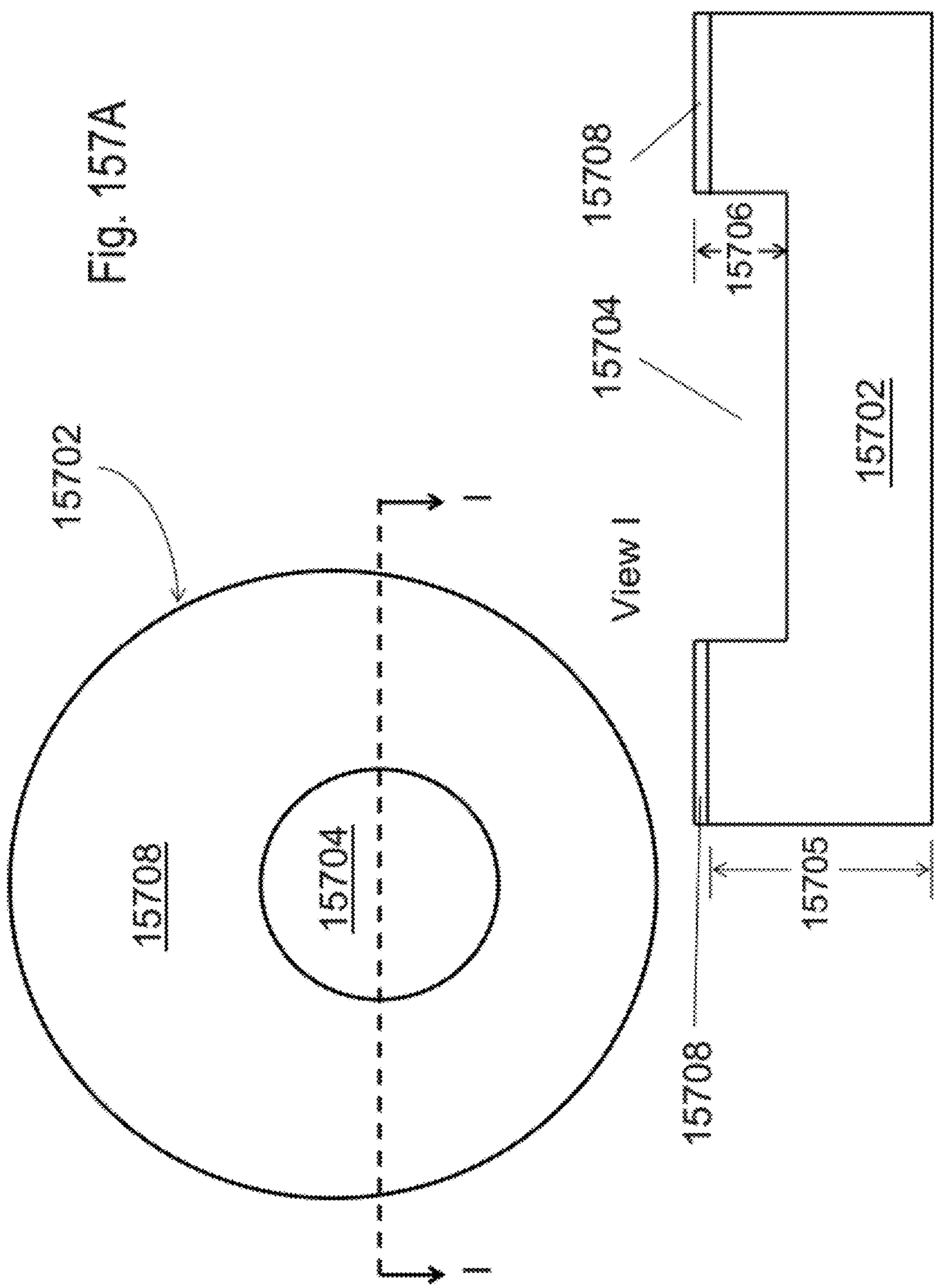

As illustrated in FIG. 157A, recess 15704 may be formed in larger diameter substrate 15702 by lithographic and etching methods. Larger diameter substrate 15702 may include, for example, 300 mm diameter mono-crystalline silicon wafer or may be a square or rectangular glass substrate. The diameter of recess 15704 may be substantially equal to the diameter of the smaller diameter substrate 15720 or may be greater.

Smaller diameter substrate 15720 may include, for example, 4 inch InP substrate with preprocessed circuitry, 2 inch Ge wafer with preprocessed circuitry, or a glass substrate with bonded mesas of preprocessed circuitry or elements, such as optics or electro optics. Larger diameter substrate 15702 may include substantially different crystal materials than smaller diameter substrate 15720. As illustrated in cross section I of FIG. 157A, larger diameter substrate 15702 with recess 15704 may be etched to recess depth 15706. Recess depth 15706 may be of substantially the same dimension as the thickness of smaller diameter substrate 15720. The thickness of smaller diameter substrate 15720 may be minimized by thinning processing such as, for example, back-grinding, CMP, or chemical etch, or by ion-cut and other layer transfer methods described herein, and thus recess depth 15706 may be minimized. For example, the thickness of smaller diameter substrate 15720 may be in the hundreds of microns as it may be processed in a smaller diameter substrate 15720 size friendly wafer fab to create circuitry and interconnect layer 15721, and then may be thinned to a tens of or single digit micron or below 1 micron thickness before integration into the recess 15704. Larger diameter substrate thickness 15705 may be substantially greater than the thickness of smaller diameter substrate 15720 or recess depth 15706. Lithographic imaging of recess 15704 may be accomplished by a database constructed mask, or the smaller diameter substrate 15720 or a surrogate may be utilized as a lithographic contact mask, and a resist image reversal process may be employed. Etching of recess 15704 may utilize dry etch techniques, such as, for example, plasma or reactive ion etching, or may utilize wet etching techniques, such as, for example, KOH. A masking layer or layers may be utilized to provide either a hard mask for dry etching, the hard mask may include materials such as silicon oxide and silicon nitride or carbon, or a selective etch mask for the wet etching, such as silicon dioxide. The masking layer after the recess etch is shown in FIG. 157A cross section I as recess masking regions 15708. Preparation for layer transfer may include the defect annealing methods of FIG. 184 through FIG. 188.

Figure 157B:
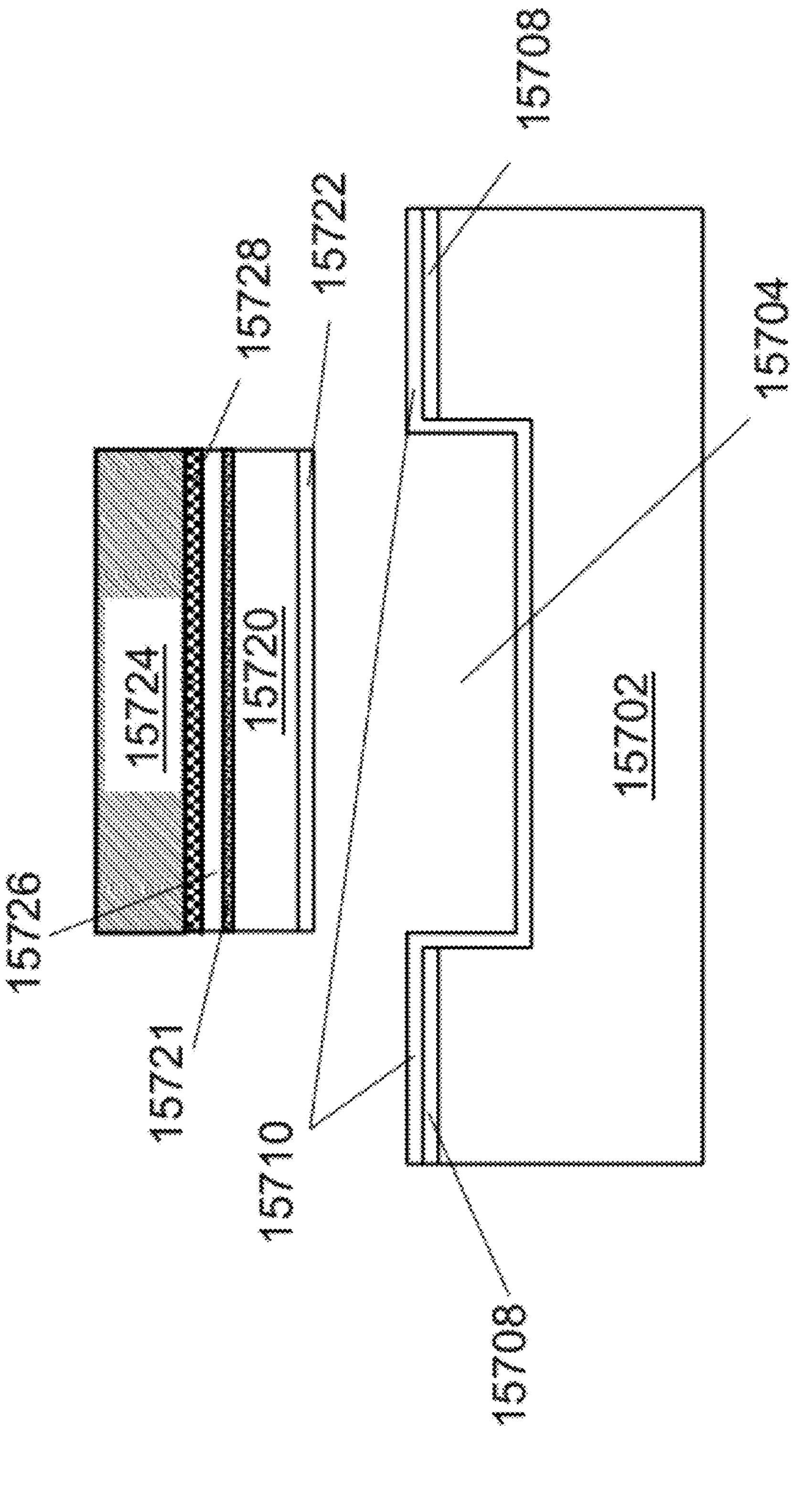

As illustrated in FIG. 157B, smaller diameter substrate 15720 with circuitry and interconnect layer 15721 may be prepared for bonding into recess 15704 by deposition of dielectric 15726, such as silicon oxides, attachment of carrier substrate 15724 with temporary attachment material 15728, and deposition of smaller wafer bonding oxide 15722. Circuitry and interconnect layer 15721 may include preprocessed circuitry, such as, for example, transistors, resistors and capacitors constructed in InP, and pre-processed interconnect, such as, for example, metal contacts, vias, and interconnect lines such as aluminum, copper, or tungsten, including metal strips for subsequent 3D through layer via connections. As described elsewhere in this document, carrier substrate 15724 may include, for example, a glass or silicon substrate or wafer, and temporary attachment material 15728 may include, for example, a polymeric adhesive that may release with optical means, such as, for example, laser ablation or exposure, or a thermal decomposition. Larger diameter substrate 15702 with recess 15704 and recess masking regions 15708 may be prepared for bonding by deposition of oxide 15710. The bottom surface of recess 15704 may be additionally prepared for bonding by planarizing with a liquid material, such as, for example spin on glass (SOG) oxides with a very light spin and/or shake to self-level the bottom of recess 15704, and then thermally cured and converted to silicon oxide, or a high temperature (greater than approximately 400° C.) polymeric adhesive material may be utilized to planarize and bond. This liquid material process may be utilized to form oxide 15710, or may be utilized in addition to the deposition of oxide 15710.

Figure 157C:
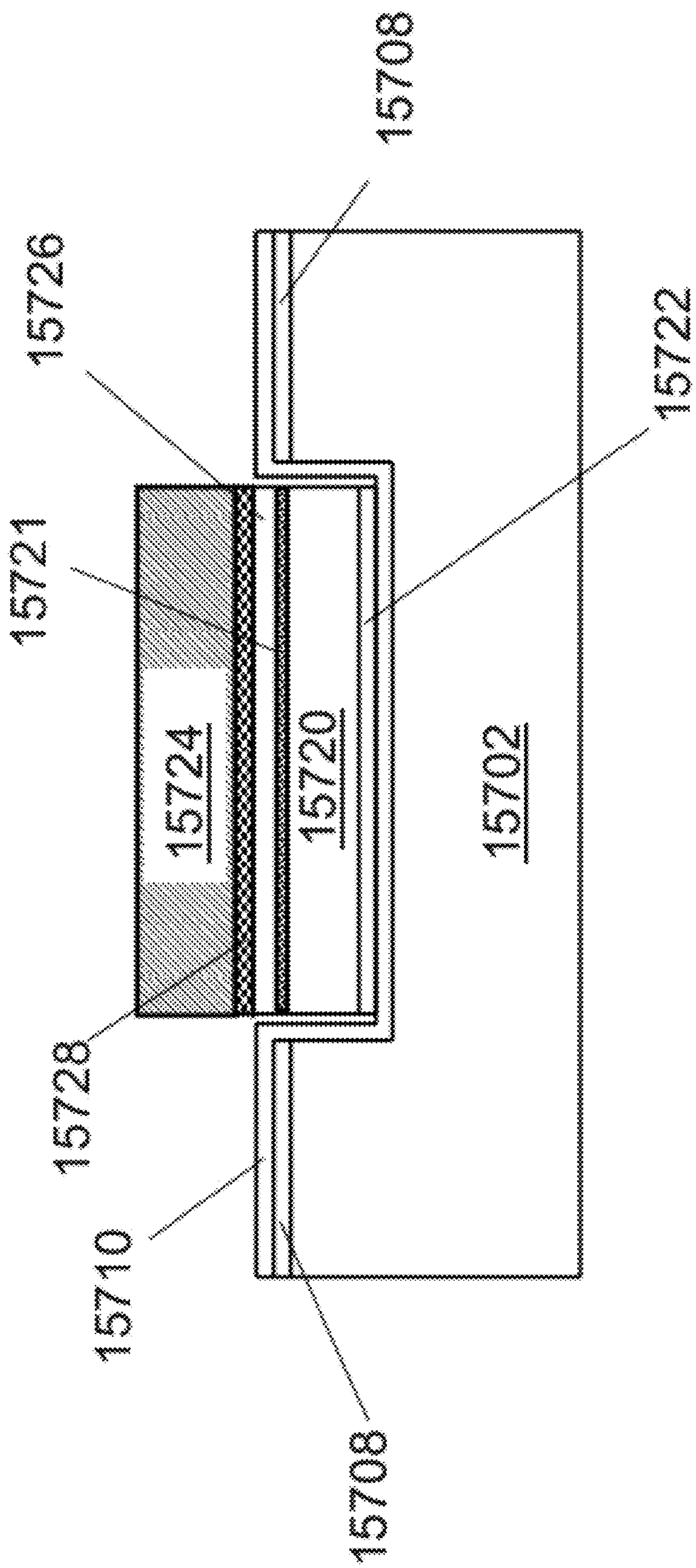

As illustrated in FIG. 157C, smaller diameter substrate 15720 may be bonded to the bottom of recess 15704 of larger diameter substrate 15702 by, for example, oxide to oxide bonding of oxide 15710 to smaller wafer bonding oxide 15722. The oxide to oxide bonding may utilize a low temperature (less than about 400° C.) bonding process. As described previously, the oxide surfaces may be prepared for bonding with treatments such as, for example, wet cleans such as $NH_4OH/H_2O_2$ solutions, and dry surface treatments such as fluorine plasmas or cluster surface implantation. Additionally, oxide 15710 or smaller wafer bonding oxide 15722 may include a stress relief layer, such as, for example, low k material such as carbon containing silicon oxides, or a layer of high temperature polymer, to mitigate the potential thermal expansion mismatch among smaller diameter substrate 15720 and larger diameter substrate 15702.

Figure 157D:
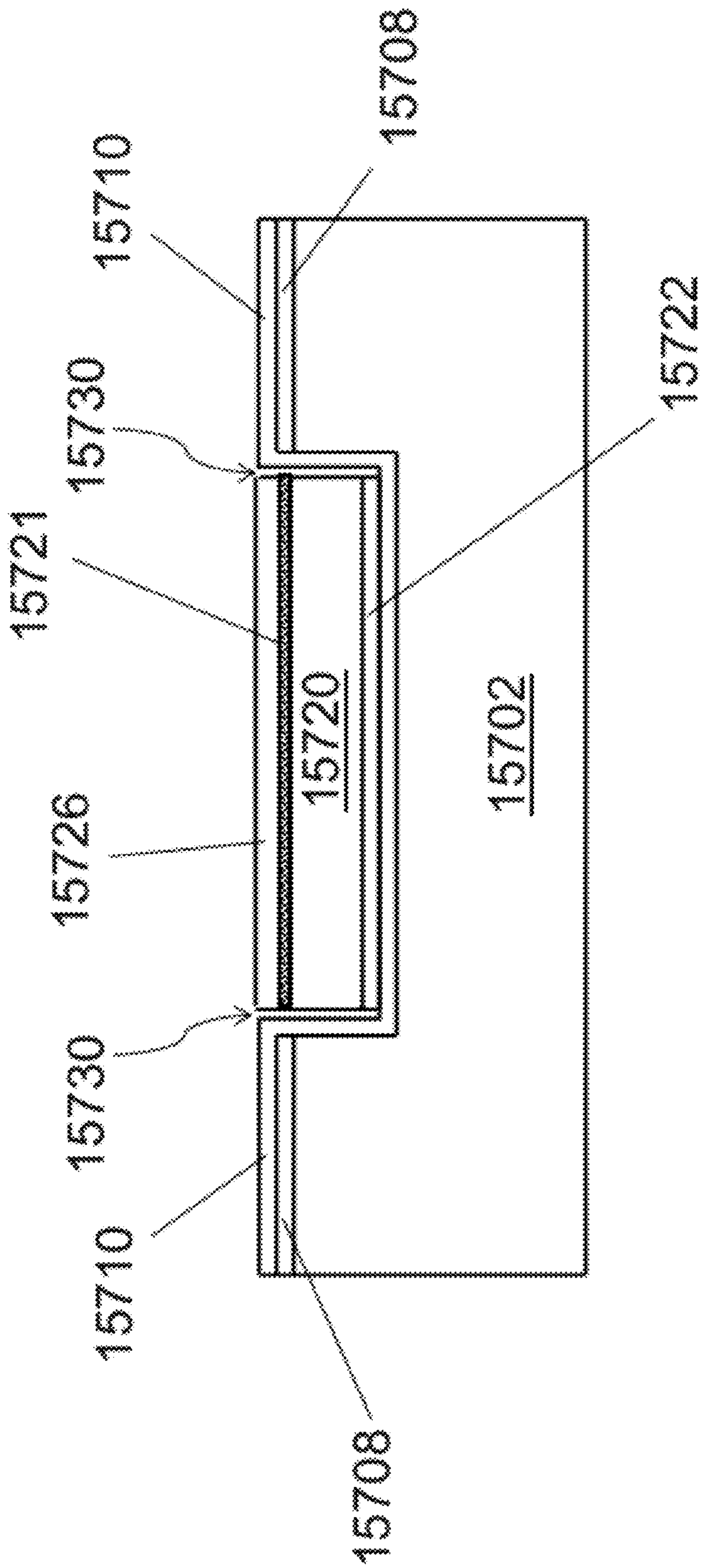

As illustrated in FIG. 157D, carrier substrate 15724 may be removed by optical means, such as, for example, laser ablation or exposure, or a thermal decomposition, of temporary attachment material 15728. Sidewall gaps 15730 are shown.

Figure 157E:
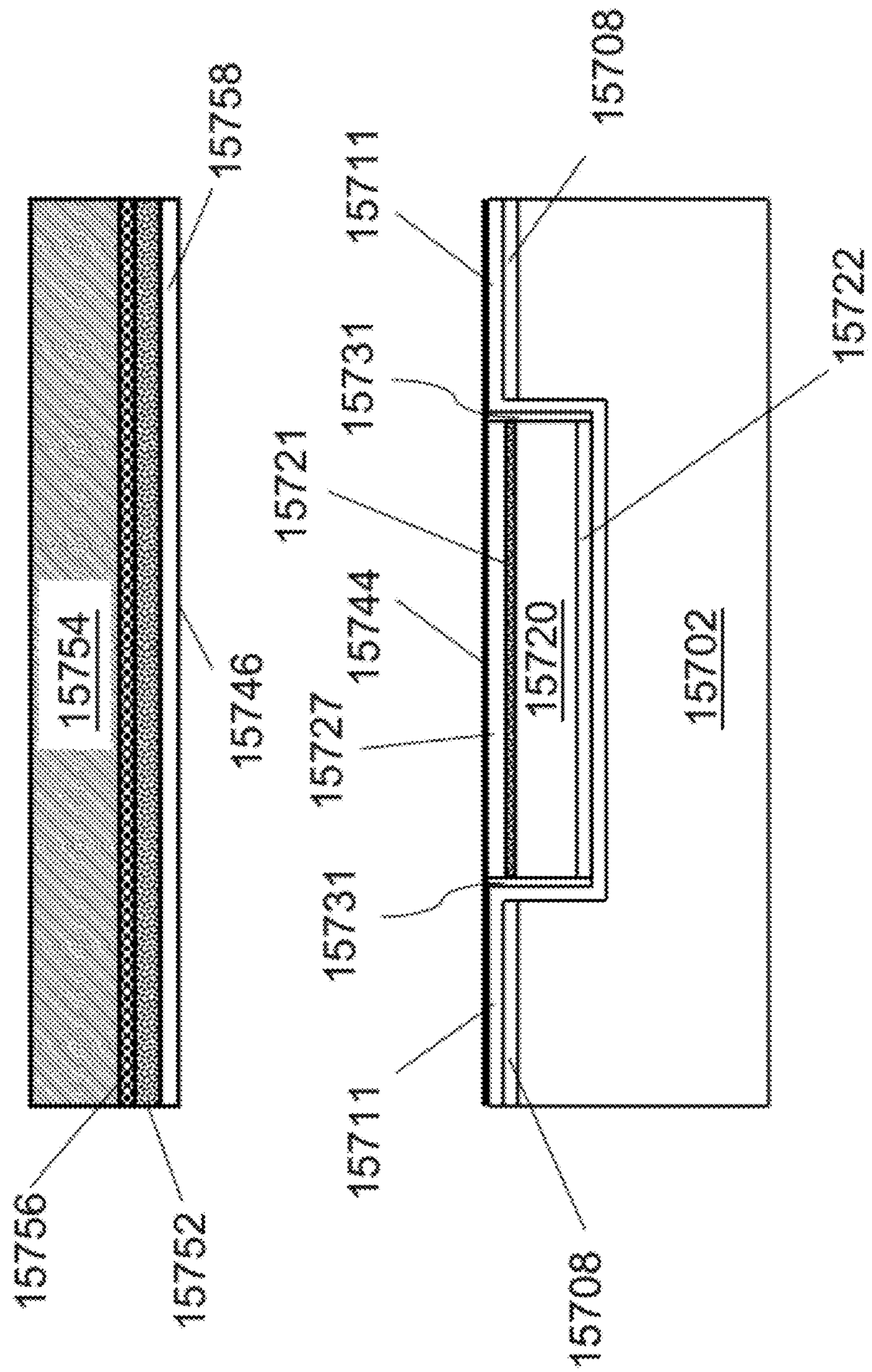

As illustrated in FIG. 157E, larger diameter substrate circuitry and interconnect layer 15752 may prepared for layer transfer to larger diameter substrate 15702 by attachment to larger diameter carrier substrate 15754 with attachment material 15756, and deposition of larger wafer bonding oxide 15758. As described elsewhere in this document, larger diameter carrier substrate 15754 may include, for example, a glass or silicon substrate or wafer, and attachment material 15756 may include, for example, oxide to oxide bonding and ion-cut methods, or a polymeric adhesive that may release with optical means, such as, for example, laser ablation or exposure, or a thermal decomposition. Surface 15746 may be treated with wet or dry treatments as described previously herein in preparation for oxide to oxide wafer bonding. This formation and preparation for layer transfer of larger diameter substrate circuitry and interconnect layer 15752 may utilize methods described previously herein, such as, for example, with respect to FIG. 70 (gate-last), FIG. 67 (RCAT), FIGS. 88 & 98 (DRAM), FIG. 101 (RRAM), and FIG. 82 (carrier substrate), and may include the defect annealing methods of FIG. 184 through FIG. 188. Larger diameter substrate circuitry and interconnect layer 15752 may include, for example, logic circuits, memory, doped layers of monocrystalline silicon for transistor formation, gate replacement dummy gate transistors, optical circuits, or 3D sub-stacks. The integrated unit of larger diameter substrate 15702 and smaller diameter substrate 15720 may be prepared for bonding to larger diameter substrate circuitry and interconnect layer 15752 by deposition, etch-back or CMP, and cure of fill and stress relieving material, such as, for example, SOG or high temperature polymers, into sidewall gaps 15730. This process may be repeated multiple times to substantially fill sidewall gaps 15730. Thus gap fills 15731 may be formed. The entire structure may be planarized by CMP of dielectric 15726, the top edge of gap fills 15731, and the top exposed portion of oxide 15710, thus forming dielectric region 15727, gap fills 15731, and oxide 15711 and combined surface 15744. An additional oxide may be deposited and other surface processing, such as plasma treatments, described previously herein, may be done to prepare for oxide to oxide wafer bonding. Combined surface 15746 may be treated with wet or dry treatments as described previously in preparation for oxide to oxide wafer bonding. Larger diameter substrate circuitry and interconnect layer 15752 may include substantially different crystal materials than smaller diameter substrate 15720.

Figure 157F:
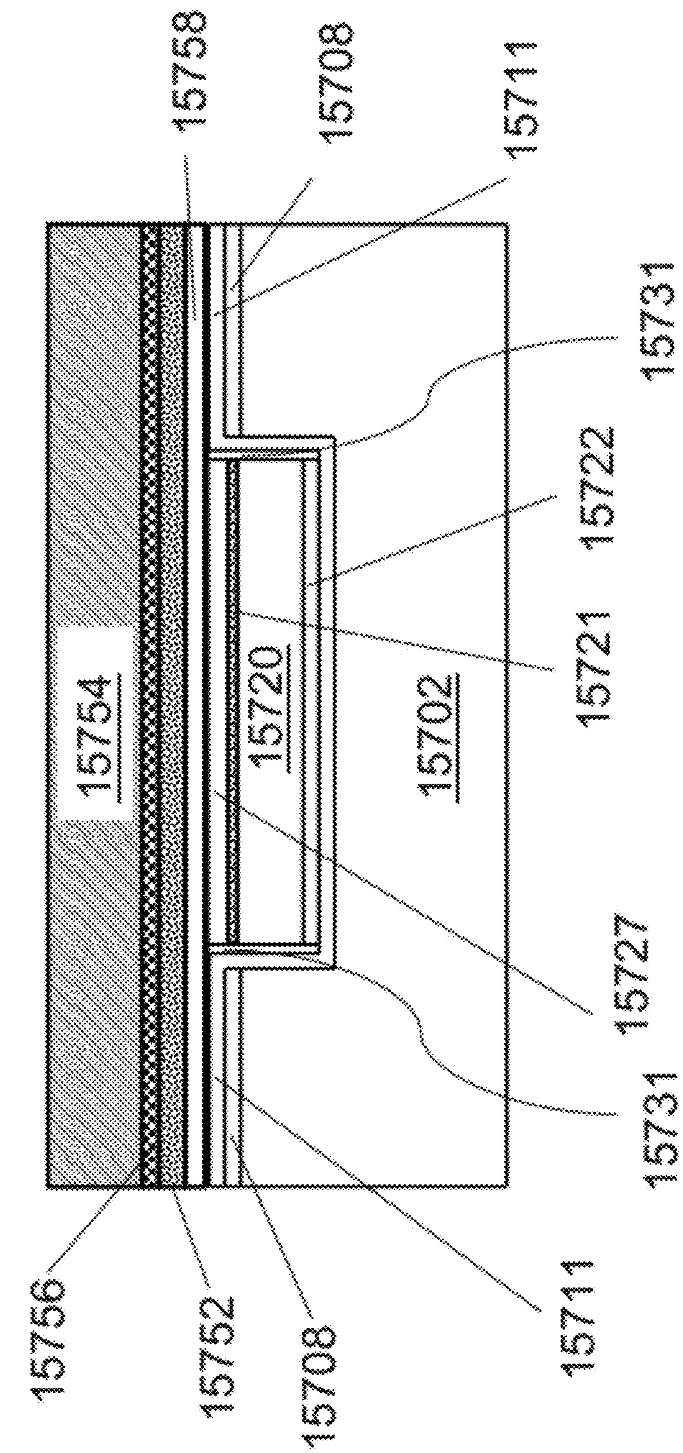

As illustrated in FIG. 157F, larger diameter substrate circuitry and interconnect layer 15752 at surface 15746 may be bonded to the integrated unit of larger diameter substrate 15702 and smaller diameter substrate 15720 at combined surface 15744 by, for example, oxide to oxide bonding of larger wafer bonding oxide 15758 to dielectric region 15727, gap fills 15731, and oxide 15711. Larger wafer bonding oxide 15758 and dielectric region 15727 may function as an isolation layer between larger diameter substrate circuitry and interconnect layer 15752 and smaller diameter substrate 15720 with circuitry and interconnect layer 15721.

Figure 157G:
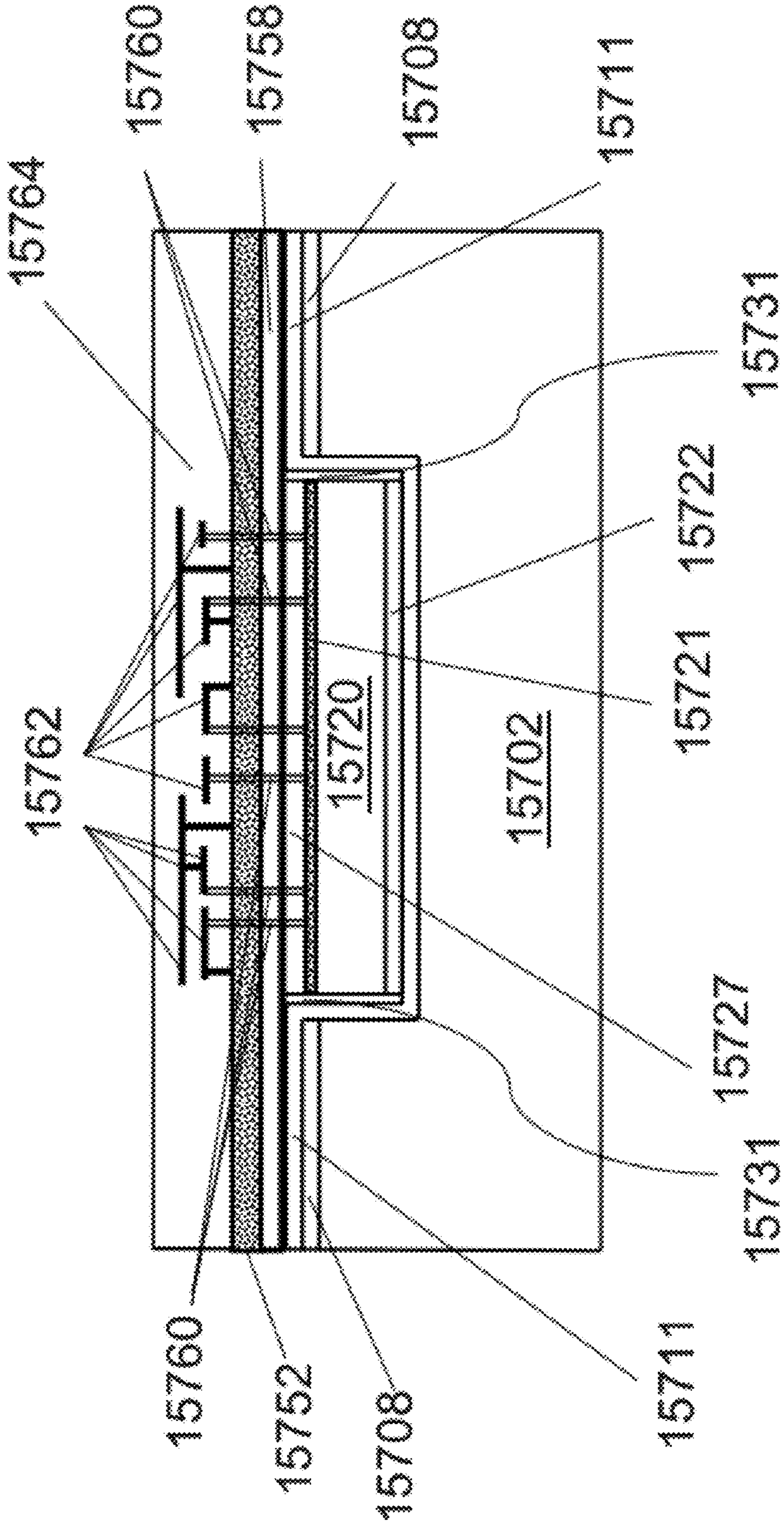

As illustrated in FIG. 157G, larger diameter carrier substrate 15754 may be removed by optical means, such as, for example, laser ablation or exposure, or a thermal decomposition, of attachment material 15756. Larger diameter substrate circuitry and interconnect layer 15752 may be further processed to form transistors, including etching steps, or complete partially completed transistors, and may form CMOS transistors, such as p-type and n-type transistors, as described elsewhere herein. Formation of through layer vias (TLVs) 15760, back end of line (BEOL) metallization 15762, such as, for example, copper or aluminum, and inter-metal dielectric 15764, may be accomplished as described elsewhere herein to electrically couple larger diameter substrate circuitry and interconnect layer 15752, which may include, for example, SOA CMOS circuits, with smaller diameter substrate 15720 circuitry and interconnect layer 15721, which may include, for example, InP optoelectronic circuits. Thermal contacts which may conduct heat but not electricity may be formed and utilized as described in FIG. 162 through FIG. 166. The 3DIC die or the smaller diameter substrate 15720 may be diced or cored as a discrete 3DIC chip or wafer respectively in preparation for packaging and assembly operations. Formation of through layer vias (TLVs) 15760 and back end of line (BEOL) metallization 15762 may be done at SOA design rules in SOA wafer fabs as processing may be done at the larger substrate diameter.

Figure 157H:
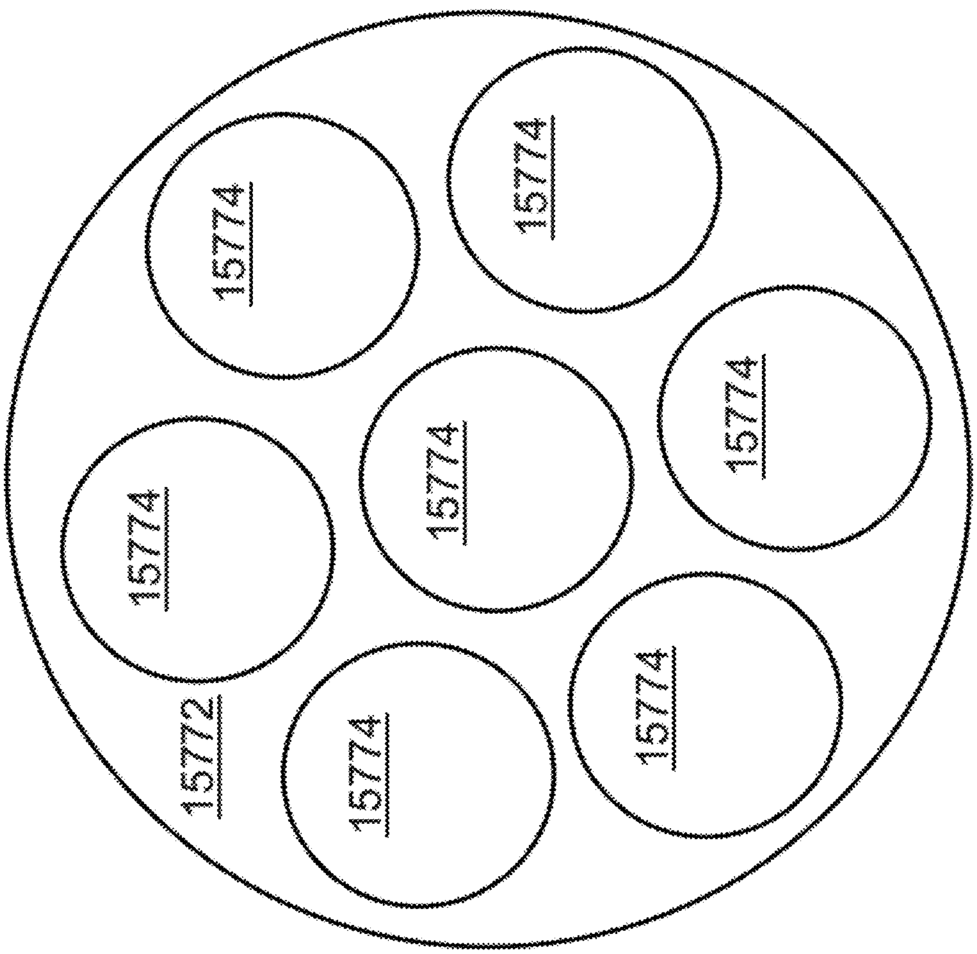

FIG. 157H illustrates wherein a multiplicity of recess 15774 may be formed within larger diameter substrate 15772 with methods described in FIG. 157A, and 3DIC integration of multiple smaller diameter substrates 15720 may be accomplished with methods described for FIG. 157.

Persons of ordinary skill in the art will appreciate that the illustrations in FIGS. 157A through 157H are exemplary only and are not drawn to scale. Such skilled persons will further appreciate that many variations may be possible such as, for example, the recess 15704 may have a shape other than a circle of smaller diameter substrate 15720, such as, for example, square or rectangular, polygonal. Additionally, recess depth 15706 may have a dimension greater than or less than the thickness of smaller diameter substrate 15720 to permit additive or subtractive planarization after bonding of smaller diameter substrate 15720 into recess 15704 and carrier substrate 15724 release, or adjustment for bonding adhesive thickness or other bonding processes and materials. Furthermore, circuitry and interconnect layer 15721 may not be preprocessed, and may thus be formed after the smaller diameter substrate 15720 may be bonded to larger diameter substrate 15702 and the carrier substrate 15724 may be removed. Moreover, placement and bonding of the smaller diameter substrate 15720 with circuitry and interconnect layer 15721 into recess 15704 may be accomplished with a method other than carrier substrate 15724 and attachment material 15728, such as, for example, vacuum pick and place, and then thermo-compression to form the oxide-oxide substrate to substrate bond. Further, planarization and leveling of the recess 15704 bottom as described in FIG. 157B may be accomplished by a touchup chemical mechanical polish (CMP), with a CMP head equal to or smaller than the diameter of the smaller wafer, of the recess 15704 bottom or may be accomplished by spin, spray, deposition of a high temperature (greater than about 400° C.) polymer adhesive and a flow bake. Moreover, larger diameter substrate 15702 may, for example, include two larger diameter silicon wafers that may be separated by an etch selective layer, which may include, for example, silicon or other oxides from wafer bonding or implant, highly doped P+ layer by bonding or implant, or a SiGe layer by bonding, thus the forming of recess 15704 by wet or dry etching may make use of the selectivity to oxide, for example, of a KOH solution, to provide a planar and well-controlled recess 15704 surface and depth for later bonding of smaller diameter substrate 15720. Additionally, carrier substrate 15724 may be attached and detached by other means, for example, oxide-oxide bonding and a ion-cut cleave, release cleave, and CMP touchup process flow. Moreover, sidewall gaps 15730 may be sealed at the top with a layer, such as silicon oxide, and left as an air fill gap. Additionally, planarization to form combined surface 15744 as described in FIG. 157E may include depositions and etch-back/CMPs of dielectrics, such as, for example, silicon dioxide or SOG. Further, larger diameter carrier substrate 15754 may be attached and detached by other means, for example, oxide-oxide bonding and an ion-cut cleave, release cleave, and CMP touchup process flow. Moreover, the 3DIC integration may be accomplished with Thru Silicon Via (TSV) technology, such as via-first, via-middle, or via-last schemes, instead of the monolithic scheme described in FIG. 157. Furthermore, larger diameter substrate 15702 may include preprocessed circuitry that may be electrically coupled to larger diameter substrate circuitry and interconnect layer 15752 with TLVs 15760 and back end of line (BEOL) metallization 15762 or TSVs and back end of line (BEOL) metallization 15762. Many other modifications within the scope of the illustrated embodiments of the invention will suggest themselves to such skilled persons after reading this specification. Thus the invention is to be limited only by the appended claims.

Figure 158A:
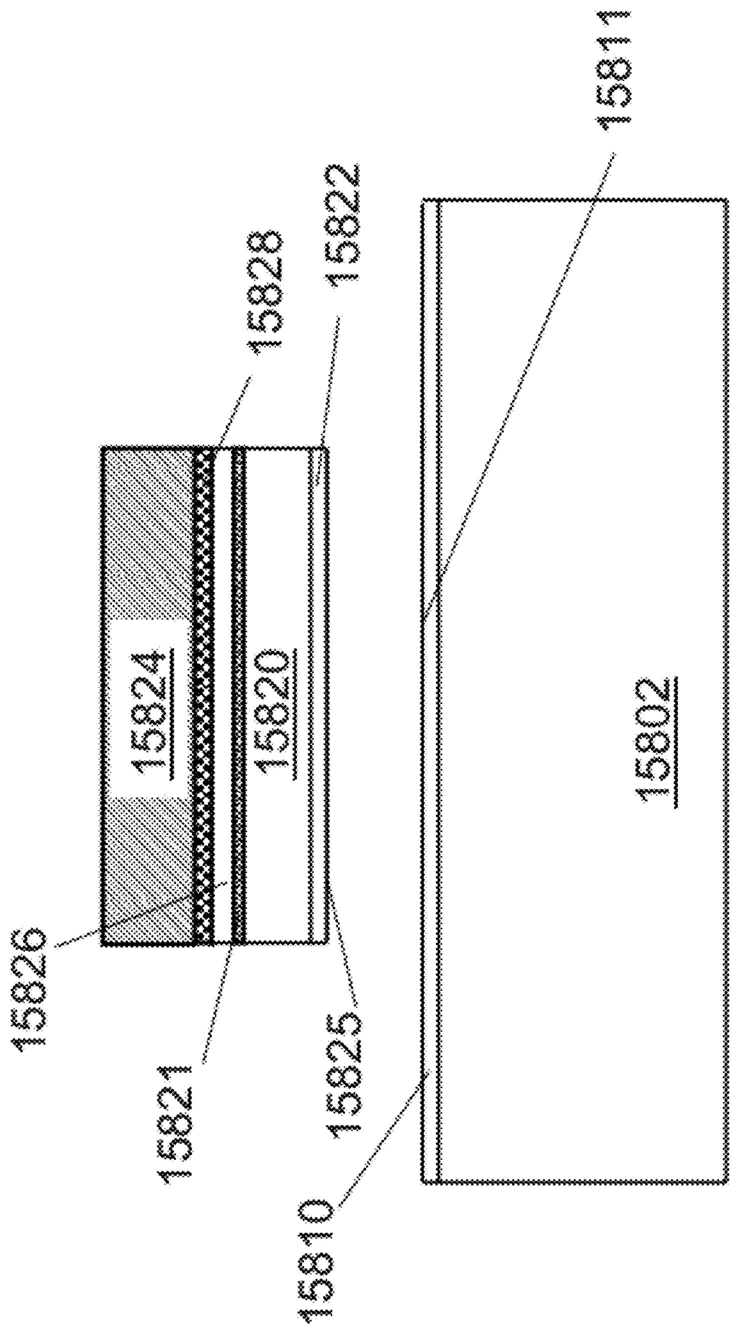

As illustrated in FIG. 158A, smaller diameter substrate 15820 with circuitry and interconnect layer 15821 may be prepared for bonding onto larger diameter substrate 15802 by deposition of dielectric 15826, such as silicon oxides, attachment of carrier substrate 15824 with temporary attachment material 15828, and deposition of smaller wafer bonding oxide 15822. Circuitry and interconnect layer 15821 may include preprocessed circuitry, such as, for example, transistors, resistors and capacitors constructed in InP, and preprocessed interconnect, such as, for example, metal contacts, vias, and interconnect lines such as aluminum, copper, or tungsten, including metal strips for subsequent 3D through layer via connections. As described elsewhere in this document, carrier substrate 15824 may include, for example, a glass or silicon substrate or wafer, and temporary attachment material 15828 may include, for example, a polymeric adhesive that may release with optical means, such as, for example, laser ablation or exposure, or a thermal decomposition. Larger diameter substrate 15802 may be prepared for bonding by deposition of oxide 15810. The thickness of smaller diameter substrate 15820 may be minimized by thinning processing such as, for example, back-grinding, CMP, or chemical etch, after or before attachment to carrier substrate 15824. Larger diameter substrate surface 15811 and smaller diameter substrate surface 15825 may be treated with wet or dry treatments as described previously herein in preparation for oxide to oxide wafer bonding. Larger diameter substrate 15802 may include, for example, 300 mm diameter monocrystalline silicon wafer or may be a square or rectangular glass substrate. Smaller diameter substrate 15820 may include, for example, 4 inch InP substrate with preprocessed circuitry, 2 inch Ge wafer with preprocessed circuitry, or a glass substrate with bonded mesas of preprocessed circuitry or elements, such as optics or electro optics. Larger diameter substrate 15802 may include substantially different crystal materials than smaller diameter substrate 15820.

Figure 158B:
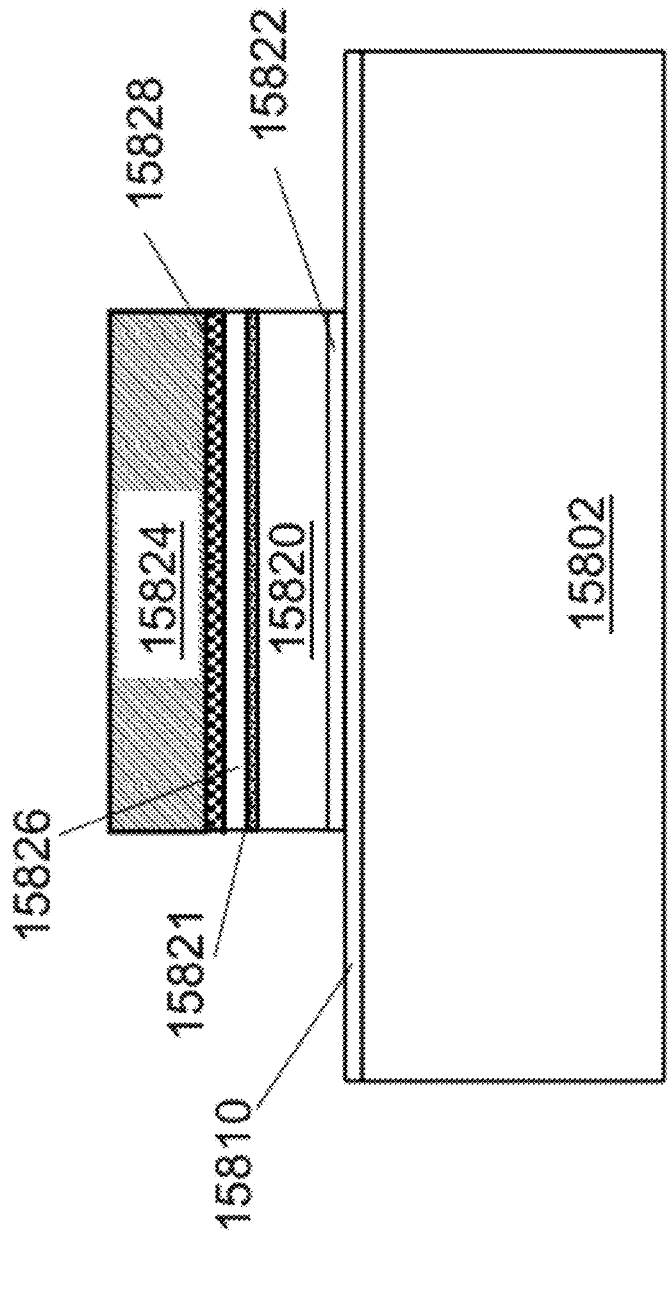

As illustrated in FIG. 158B, smaller diameter substrate 15820 at smaller diameter substrate surface 15825 may be bonded larger diameter substrate 15802 at larger diameter substrate surface 15811, by, for example, oxide to oxide bonding of oxide 15810 to smaller wafer bonding oxide 15822. The oxide to oxide bonding may utilize a low temperature (less than about 400° C.) bonding process. As described previously, the oxide surfaces may be prepared for bonding with treatments such as, for example, wet cleans such as $NH_4OH/H_2O_2$ solutions, and dry surface treatments such as fluorine plasmas or cluster surface implantation. Additionally, oxide 15810 or smaller wafer bonding oxide 15822 may include a stress relief layer, such as, for example, low k material such as carbon containing silicon oxides, or a layer of high temperature polymer, to mitigate the potential thermal expansion mismatch among smaller diameter substrate 15820 and larger diameter substrate 15802.

Figure 158C:
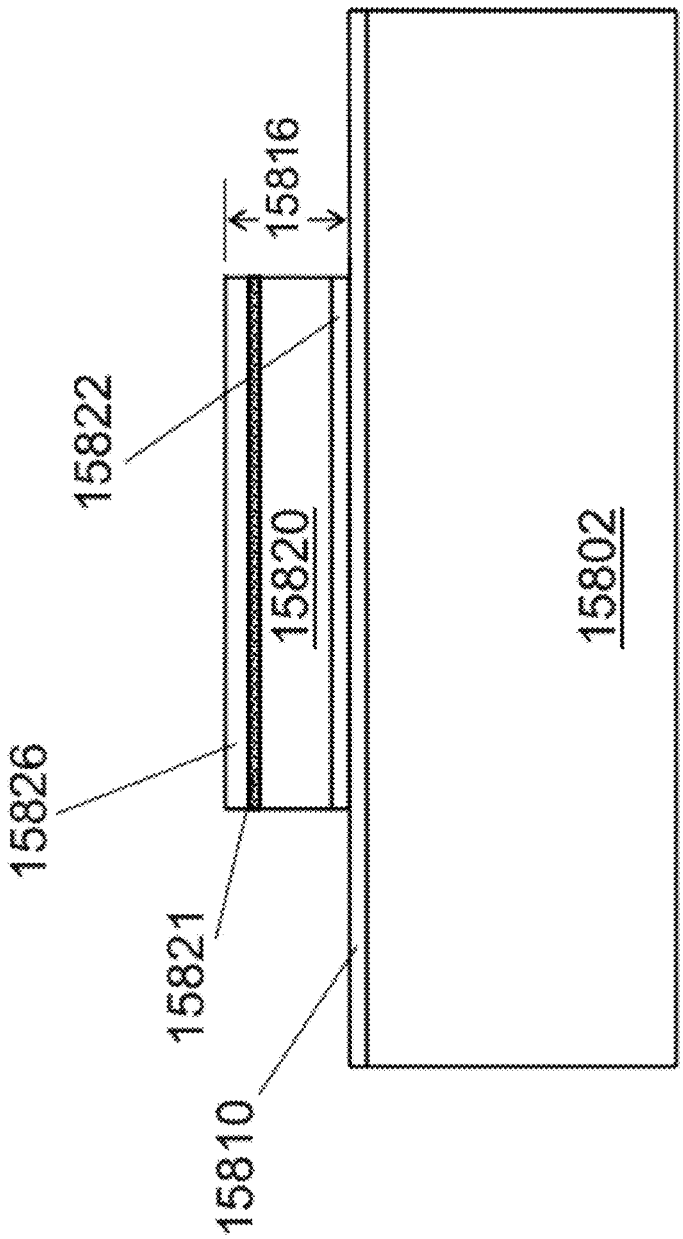

As illustrated in FIG. 158C, carrier substrate 15824 may be removed by optical means, such as, for example, laser ablation or exposure, or a thermal decomposition, of temporary attachment material 15828. Fill depth 15816 is shown and may be of substantially the same dimension as the thickness of the smaller diameter substrate 15820. The thickness of smaller diameter substrate 15820 may be minimized by thinning processing such as, for example, back-grinding, CMP, or chemical etch, or by ion-cut and other layer transfer methods described herein, and thus fill depth 15816 may be minimized. For example, the thickness of smaller diameter substrate 15820 may be in the hundreds of microns as it may be processed in a smaller diameter substrate 15820 size friendly wafer fab to create circuitry and interconnect layer 15821, and then may be thinned to a tens of or single digit micron or below 1 micron thickness before bonding and integration onto larger diameter substrate 15802.

Figure 158D:
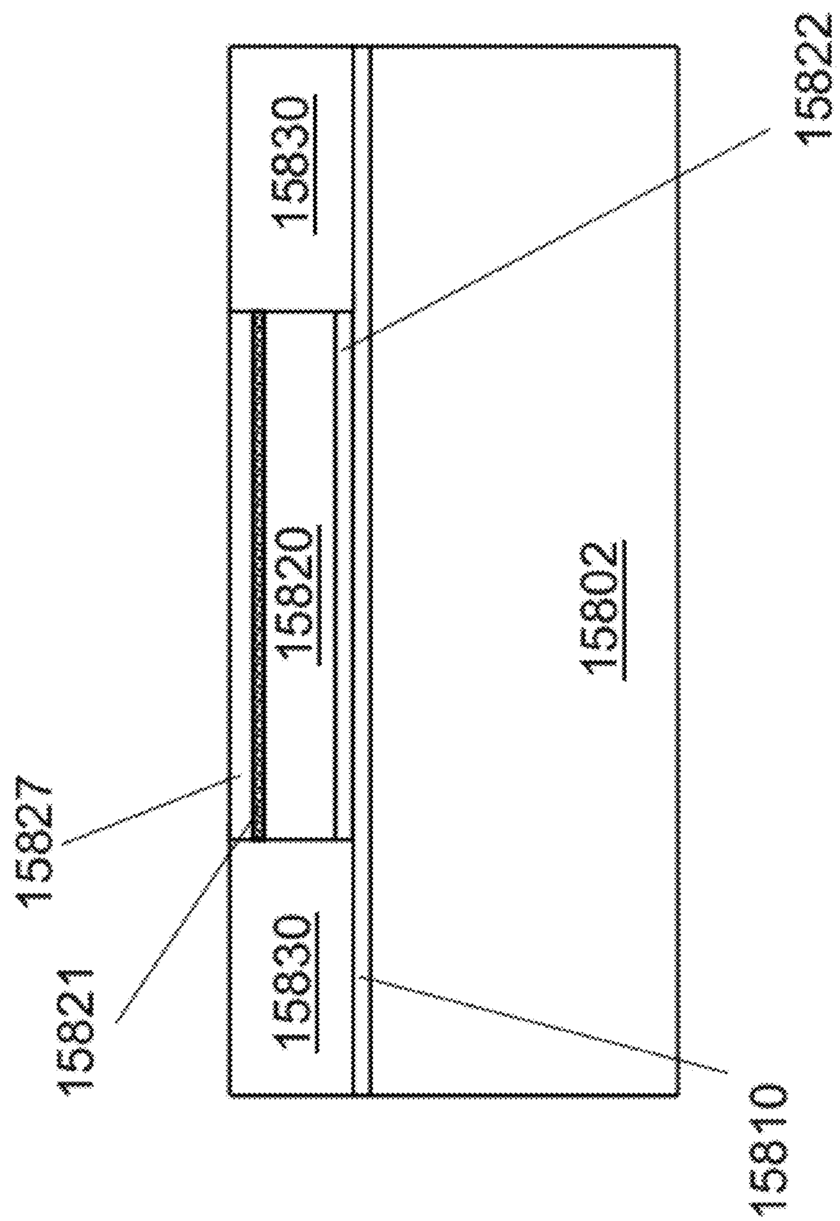

As illustrated in FIG. 158D, the integrated unit of larger diameter substrate 15802 and smaller diameter substrate 15820 may be prepared for future bonding to larger diameter substrate circuitry and interconnect layer 15852 by deposition, etch-back or CMP, and cure of fill and stress relieving material, such as, for example, SOG or high temperature polymers, into fill regions 15830. This process may be repeated multiple times to substantially fill-up and planarize fill regions 15830. Dielectric 15826 may serve as a CMP polish or etchback stop and may be thinned by the processing to fill-up and planarize fill regions 15830, thus forming dielectric region 15827.

Figure 158E:
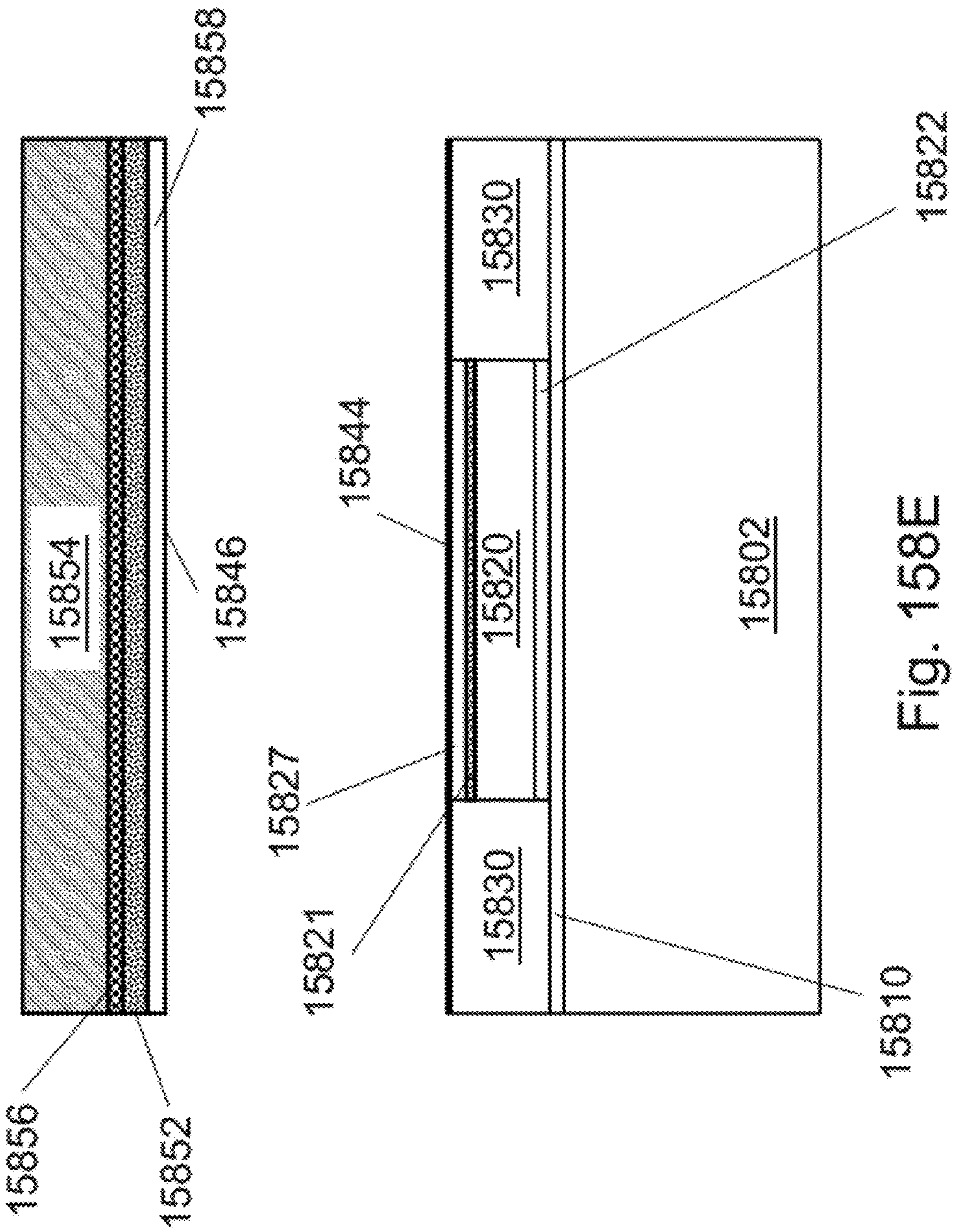

As illustrated in FIG. 158E, larger diameter substrate circuitry and interconnect layer 15852 may prepared for layer transfer to the prepared integrated unit of larger diameter substrate 15802 and smaller diameter substrate 15820 by attachment to larger diameter carrier substrate 15854 with attachment material 15856, and deposition of larger wafer bonding oxide 15858. As described elsewhere in this document, larger diameter carrier substrate 15754 may include, for example, a glass or silicon substrate or wafer, and attachment material 15756 may include, for example, oxide to oxide bonding and ion-cut methods, or a polymeric adhesive that may release with optical means, such as, for example, laser ablation or exposure, or a thermal decomposition. Surface 15846 may be treated with wet or dry treatments as described previously herein in preparation for oxide to oxide wafer bonding. This formation and preparation for layer transfer of larger diameter substrate circuitry and interconnect layer 15852 may utilize methods described previously herein, such as, for example, with respect to FIG. 70 (gate-last), FIG. 67 (RCAT), FIGS. 88 & 98 (DRAM), FIG. 101 (RRAM), and FIG. 82 (carrier substrate), and may include the defect annealing methods of FIG. 184 through FIG. 188. Larger diameter substrate circuitry and interconnect layer 15852 may include, for example, logic circuits, memory, doped layers of monocrystalline silicon for transistor formation, gate replacement dummy gate transistors, optical circuits, or 3D sub-stacks. The integrated unit of larger diameter substrate 15802 and smaller diameter substrate 15820 may be prepared for bonding by planarizing via CMP of dielectric region 15827 and fill regions 15830, thus forming combined surface 15844. An additional oxide may be deposited and other surface processing, such as plasma treatments, described previously herein, may be done to prepare for oxide to oxide wafer bonding. Combined surface 15846 may be treated with wet or dry treatments as described previously in preparation for oxide to oxide wafer bonding. Larger diameter substrate circuitry and interconnect layer 15852 may include substantially different crystal materials than smaller diameter substrate 15820.

Figure 158F:
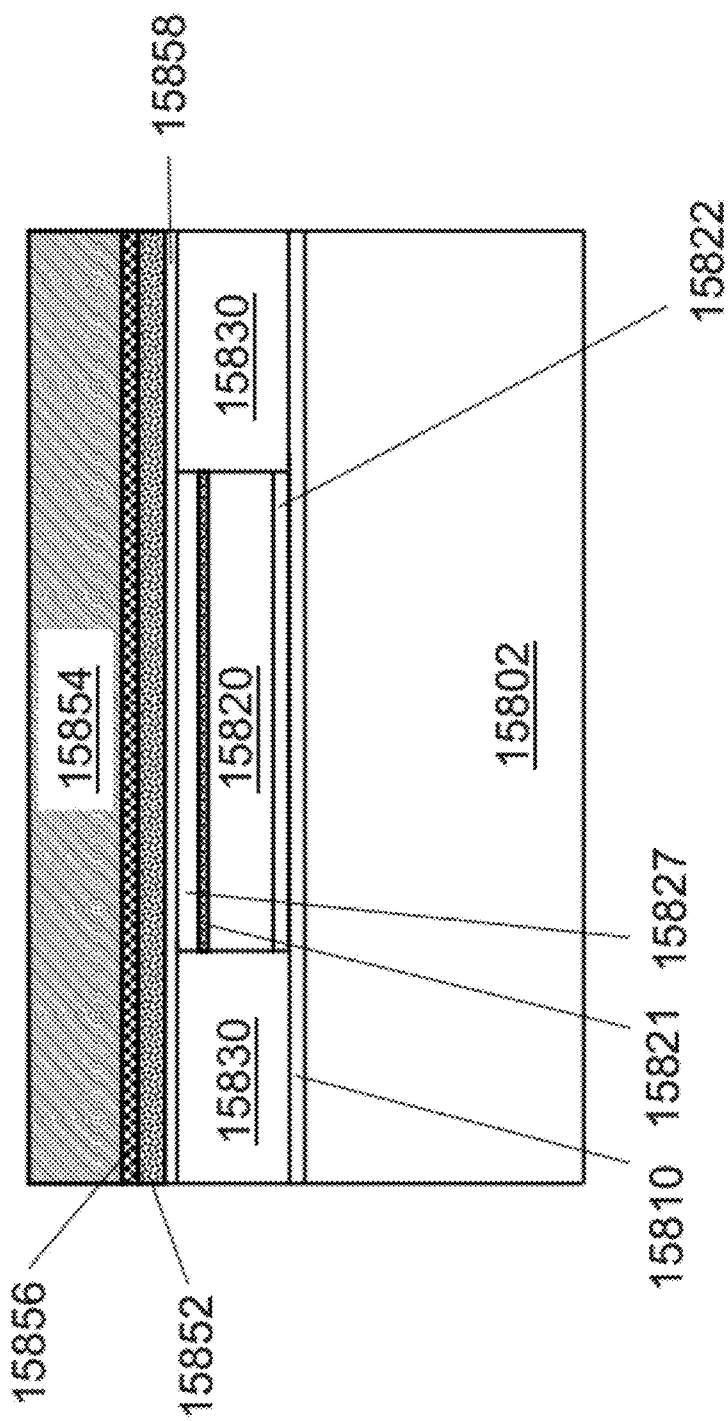

As illustrated in FIG. 158F, larger diameter substrate circuitry and interconnect layer 15852 at surface 15846 may be bonded to the integrated unit of larger diameter substrate 15802 and smaller diameter substrate 15820 at combined surface 15844 by, for example, oxide to oxide bonding of larger wafer bonding oxide 15858 to dielectric region 15827 and fill regions 15830. Larger wafer bonding oxide 15858 and dielectric region 15827 may function as an isolation layer between larger diameter substrate circuitry and interconnect layer 15852 and smaller diameter substrate 15820 with circuitry and interconnect layer 15821.

Figure 158G:
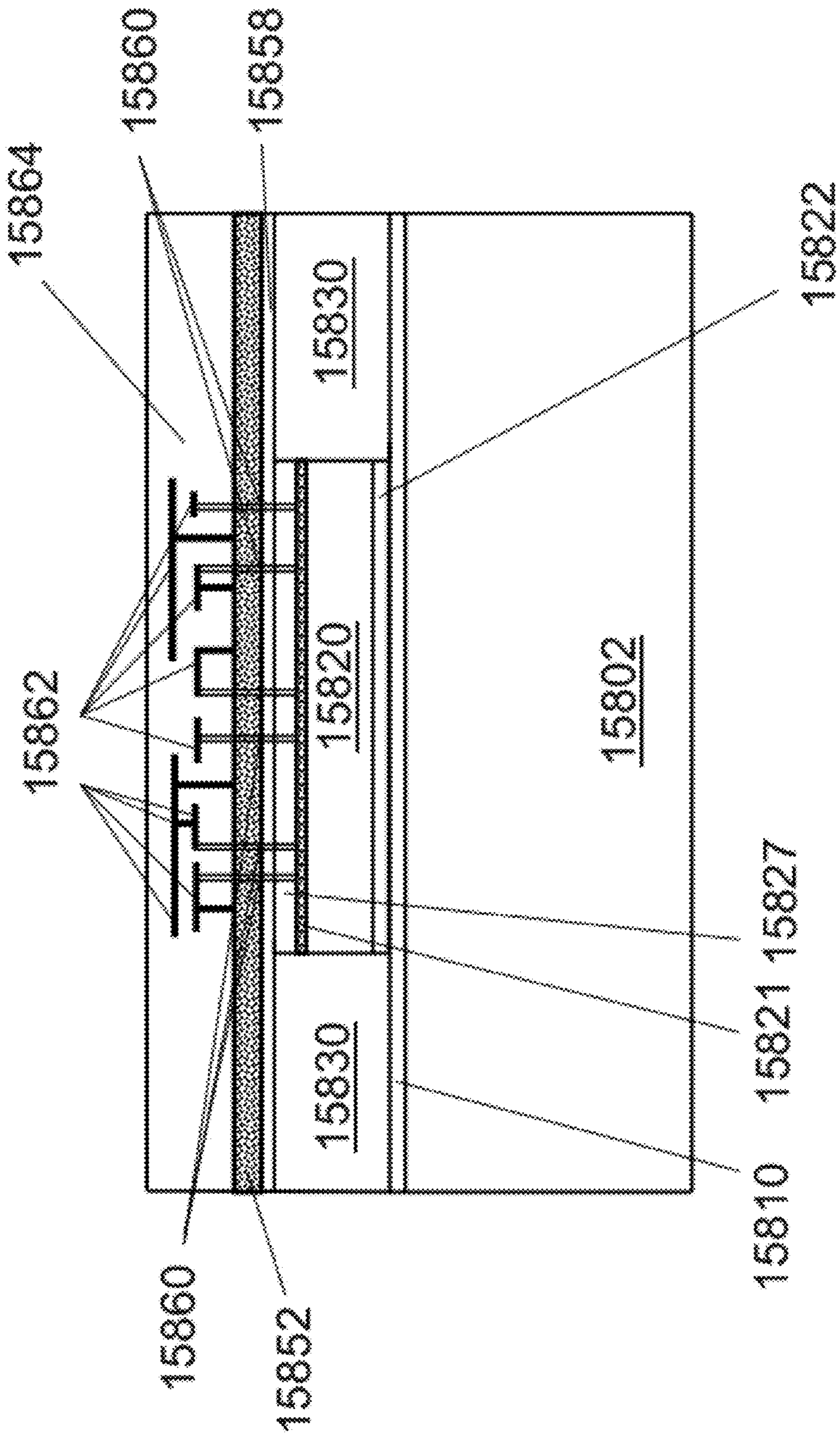

As illustrated in FIG. 158G, larger diameter carrier substrate 15854 may be removed by optical means, such as, for example, laser ablation or exposure, or a thermal decomposition, of attachment material 15856. Larger diameter substrate circuitry and interconnect layer 15852 may be further processed to form transistors, including etching steps, or complete partially completed transistors, and may form CMOS transistors, such as p-type and n-type transistors, as described elsewhere herein. Formation of through layer vias (TLVs) 15860, back end of line (BEOL) metallization 15862, such as, for example, copper or aluminum, and inter-metal dielectric 15864, may be accomplished as described elsewhere herein to electrically couple larger diameter substrate circuitry and interconnect layer 15852, which may include, for example, SOA CMOS circuits, with smaller diameter substrate 15820 circuitry and interconnect layer 15821, which may include, for example, InP optoelectronic circuits. Thermal contacts which may conduct heat but not electricity may be formed and utilized as described in FIG. 162 through FIG. 166. The 3DIC die or the smaller diameter substrate 15820 may be diced or cored as a discrete 3DIC chip or wafer respectively in preparation for packaging and assembly operations. Formation of through layer vias (TLVs) 15860 and back end of line (BEOL) metallization 15862 may be done at SOA design rules in SOA wafer fabs as processing may be done at the larger substrate diameter.

Persons of ordinary skill in the art will appreciate that the illustrations in FIGS. 158A through 158G are exemplary only and are not drawn to scale. Such skilled persons will further appreciate that many variations may be possible such as, for example, smaller diameter substrate 15820 may have a shape other than a circle, such as, for example, square or rectangular, polygonal. Moreover, fill depth 15816 may have a dimension greater than or less than the thickness of smaller diameter substrate 15820. Furthermore, circuitry and interconnect layer 15821 may not be preprocessed, and may thus be formed after the smaller diameter substrate 15820 may be bonded to larger diameter substrate 15802 and the carrier substrate 15824 may be removed. Moreover, placement and bonding of the smaller diameter substrate 15820 with circuitry and interconnect layer 15821 onto larger diameter substrate 15802 may be accomplished with a method other than carrier substrate 15824 and attachment material 15828, such as, for example, vacuum pick and place, and then thermo-compression to form the oxide-oxide substrate to substrate bond. Moreover, fill regions 15830 may be filled up with a hard mask frame of, for example, silicon or plastic, that may be pre-shaped as a negative image of one or more of smaller diameter substrate 15820. Furthermore, carrier substrate 15824 may be attached and detached by other means, for example, oxide-oxide bonding and a ion-cut cleave, release cleave, and CMP touchup process flow. Additionally, planarization to form combined surface 15844 as described in FIG. 158E may include depositions and etch-back/CMPs of dielectrics, such as, for example, silicon dioxide or SOG. Further, larger diameter carrier substrate 15854 may be attached and detached by other means, for example, oxide-oxide bonding and an ion-cut cleave, release cleave, and CMP touchup process flow. Furthermore, the 3DIC integration may be accomplished with Thru Silicon Via (TSV) technology, such as via-first, via-middle, or via-last schemes, instead of the monolithic scheme described in FIG. 158. Moreover, a multiplicity of smaller diameter substrate 15820 with circuitry and interconnect layer 15821 may be placed and bonded to a single larger diameter substrate 15802 and may form fill regions 15830 in-between some of the multiplicity of smaller diameter substrate 15820. Furthermore, larger diameter substrate 15802 may include preprocessed circuitry that may be electrically coupled to larger diameter substrate circuitry and interconnect layer 15852 with TLVs 15860 and back end of line (BEOL) metallization 15862 or TSVs and back end of line (BEOL) metallization 15862. Many other modifications within the scope of the illustrated embodiments of the invention will suggest themselves to such skilled persons after reading this specification. Thus the invention is to be limited only by the appended claims.

Figure 159A:
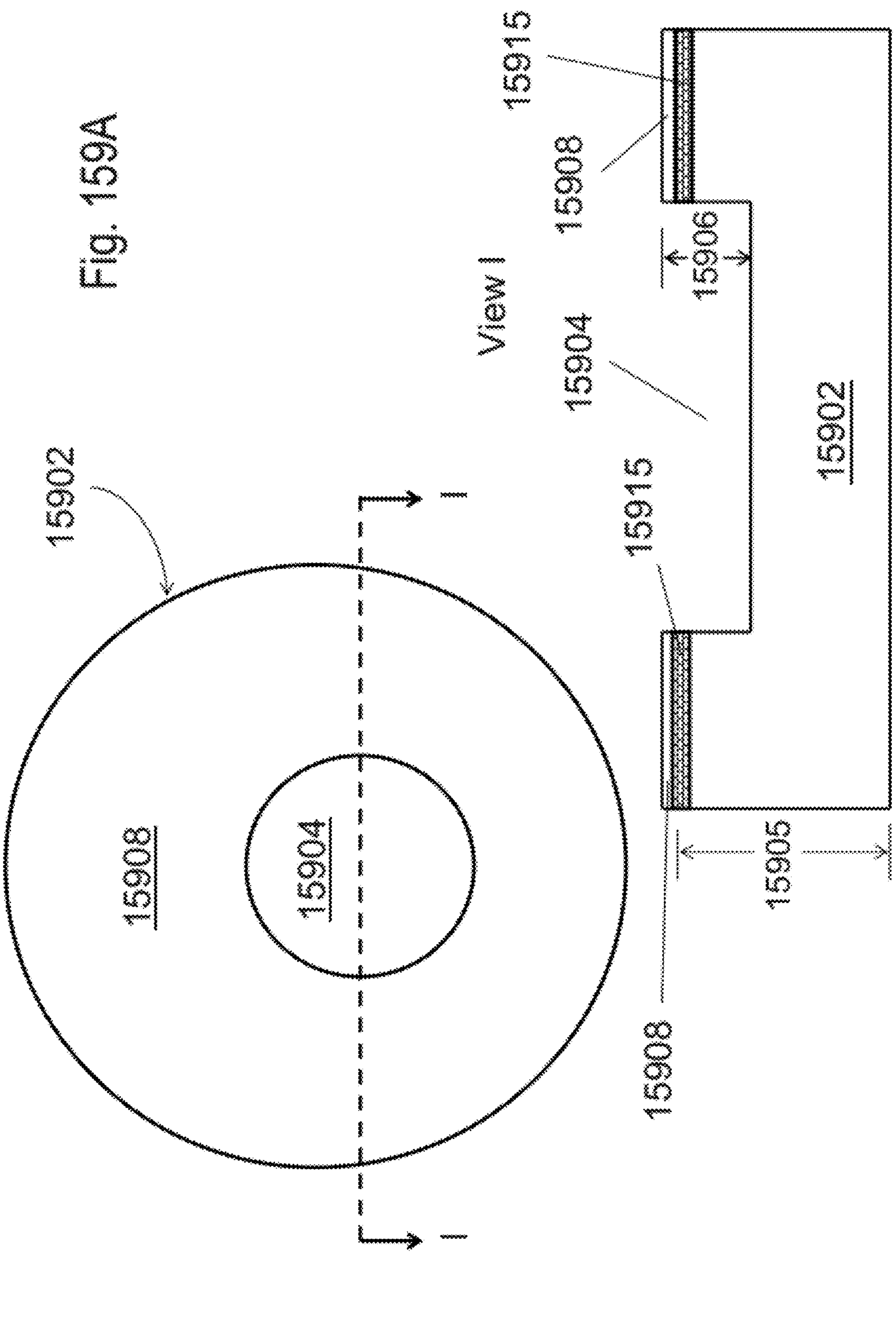

As illustrated in FIG. 159A, recess 15904 may be formed in larger diameter substrate 15902 by lithographic and etching methods. Larger diameter substrate 15902 may include, for example, 300 mm diameter mono-crystalline silicon wafer or may be a square or rectangular glass substrate. The diameter of recess 15904 may be substantially equal to the diameter of the smaller diameter substrate 15920 or may be greater. Smaller diameter substrate 15920 may include, for example, 4 inch InP substrate with preprocessed circuitry, 2 inch Ge wafer with preprocessed circuitry, or a glass substrate with bonded mesas of preprocessed circuitry or elements, such as optics or electro optics. As illustrated in cross section I of FIG. 159A, larger diameter substrate 15902 with recess 15904 may be etched to recess depth 15906. Recess depth 15906 may be of substantially the same dimension as the thickness of smaller diameter substrate 15920. The thickness of smaller diameter substrate 15920 may be minimized by thinning processing such as, for example, back-grinding, CMP, or chemical etch, or by ion-cut and other layer transfer methods described herein, and thus recess depth 15906 may be minimized. For example, the thickness of smaller diameter substrate 15920 may be in the hundreds of microns as it may be processed in a smaller diameter substrate 15920 size friendly wafer fab to create circuitry and interconnect layer 15921, and then may be thinned to a tens of or single digit micron or below 1 micron thickness before integration into the recess 15904. Larger diameter substrate thickness 15905 may be substantially greater than the thickness of smaller diameter substrate 15920 or recess depth 15906. Lithographic imaging of recess 15904 may be accomplished by a database constructed mask, or the smaller diameter substrate 15920 or a surrogate may be utilized as a lithographic contact mask, and a resist image reversal process may be employed. Etching of recess 15904 may utilize dry etch techniques, such as, for example, plasma or reactive ion etching, or may utilize wet etching techniques, such as, for example, KOH. A masking layer or layers may be utilized to provide either a hard mask for dry etching, the hard mask may include materials such as silicon oxide and silicon nitride or carbon, or a selective etch mask for the wet etching, such as silicon dioxide. The masking layer after the recess etch is shown in FIG. 159A cross section I as recess masking regions 15908. Larger diameter substrate 15902 may include larger substrate circuitry and interconnect regions 15915, which may be processed prior to the formation of recess 15904. Larger substrate circuitry and interconnect regions 15915 may include, for example, logic circuits or memory circuits, and may have been formed as a wafer sized layer of circuitry with preplanned 'white' areas for recess 15904 areas and design rule exclusion zones, or may be formed as a continuous array of circuits as described previously herein and described in related U.S. patent application Ser. No. 13/098,997 over the entire surface of larger diameter substrate 15902 and then regions of the continuous array may be etched out during the formation of the recess 15904 areas. Larger diameter substrate 15902 may include substantially different crystal materials than smaller diameter substrate 15920. Preparation for layer transfer may include the defect annealing methods of FIG. 184 through FIG. 188.

Figure 159B:
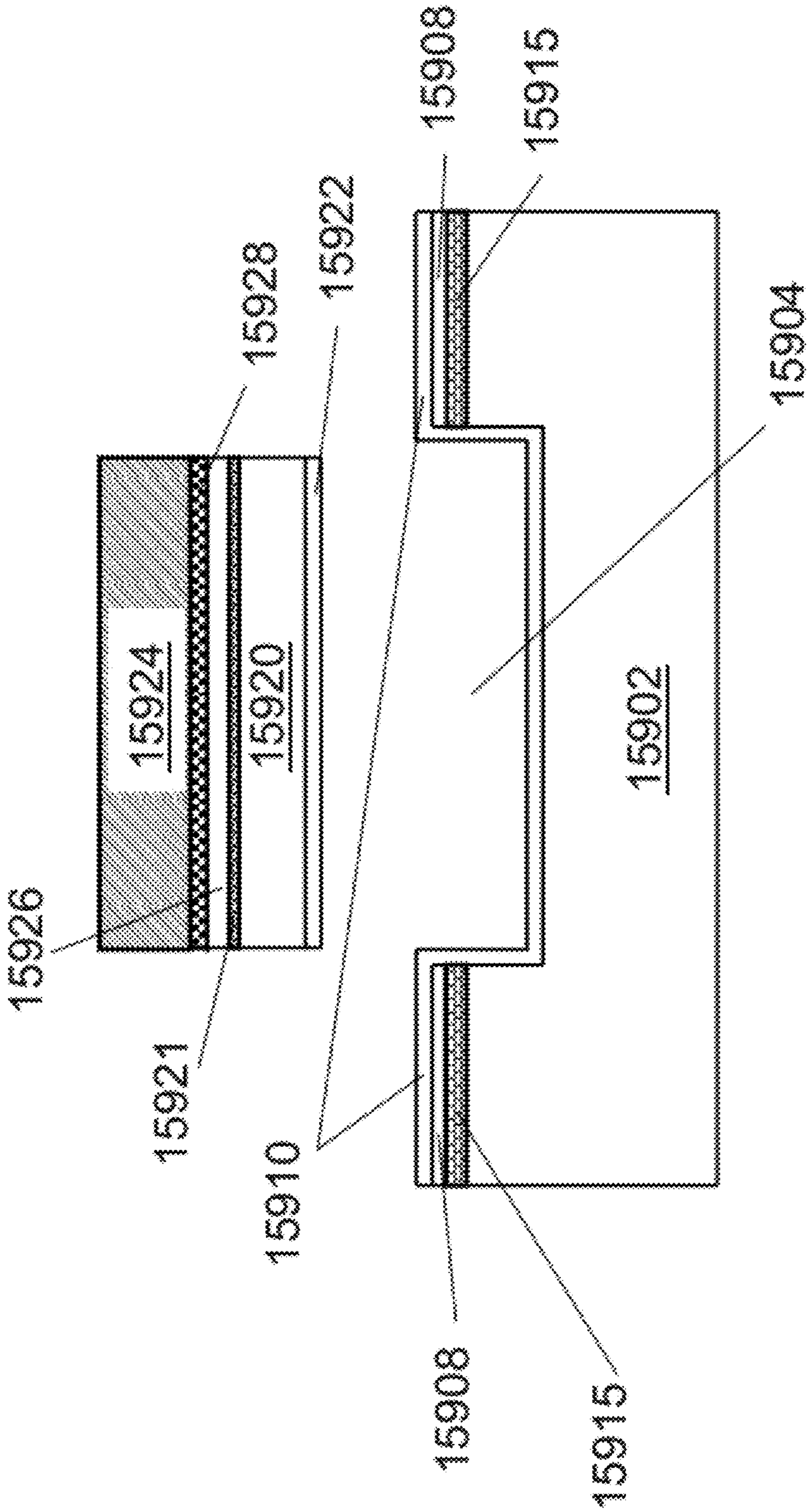

As illustrated in FIG. 159B, smaller diameter substrate 15920 with circuitry and interconnect layer 15921 may be prepared for bonding into recess 15904 by deposition of dielectric 15926, such as silicon oxides, attachment of carrier substrate 15924 with temporary attachment material 15928, and deposition of smaller wafer bonding oxide 15922. Circuitry and interconnect layer 15921 may include preprocessed circuitry, such as, for example, transistors, resistors and capacitors constructed in InP, and pre-processed interconnect, such as, for example, metal contacts, vias, and interconnect lines such as aluminum, copper, or tungsten, including metal strips for subsequent 3D through layer via connections. As described elsewhere in this document, carrier substrate 15924 may be a glass or silicon substrate and temporary attachment material 15928 may be a polymeric adhesive that may release with optical means, such as, for example, laser ablation or exposure, or a thermal decomposition. Larger diameter substrate 15902 with recess 15904, recess masking regions 15908, and larger substrate circuitry and interconnect regions 15915 may be prepared for bonding by deposition of oxide 15910. The bottom surface of recess 15904 may be additionally prepared for bonding by planarizing with a liquid material, such as, for example spin on glass (SOG) oxides with a very light spin and/or shake to self-level the bottom of recess 15904, and then thermally cured and converted to silicon oxide, or a high temperature (greater than approximately 400° C.) polymeric adhesive material may be utilized to planarize and bond. This liquid material process may be utilized to form oxide 15910, or may be utilized in addition to the deposition of oxide 15910.

Figure 159C:
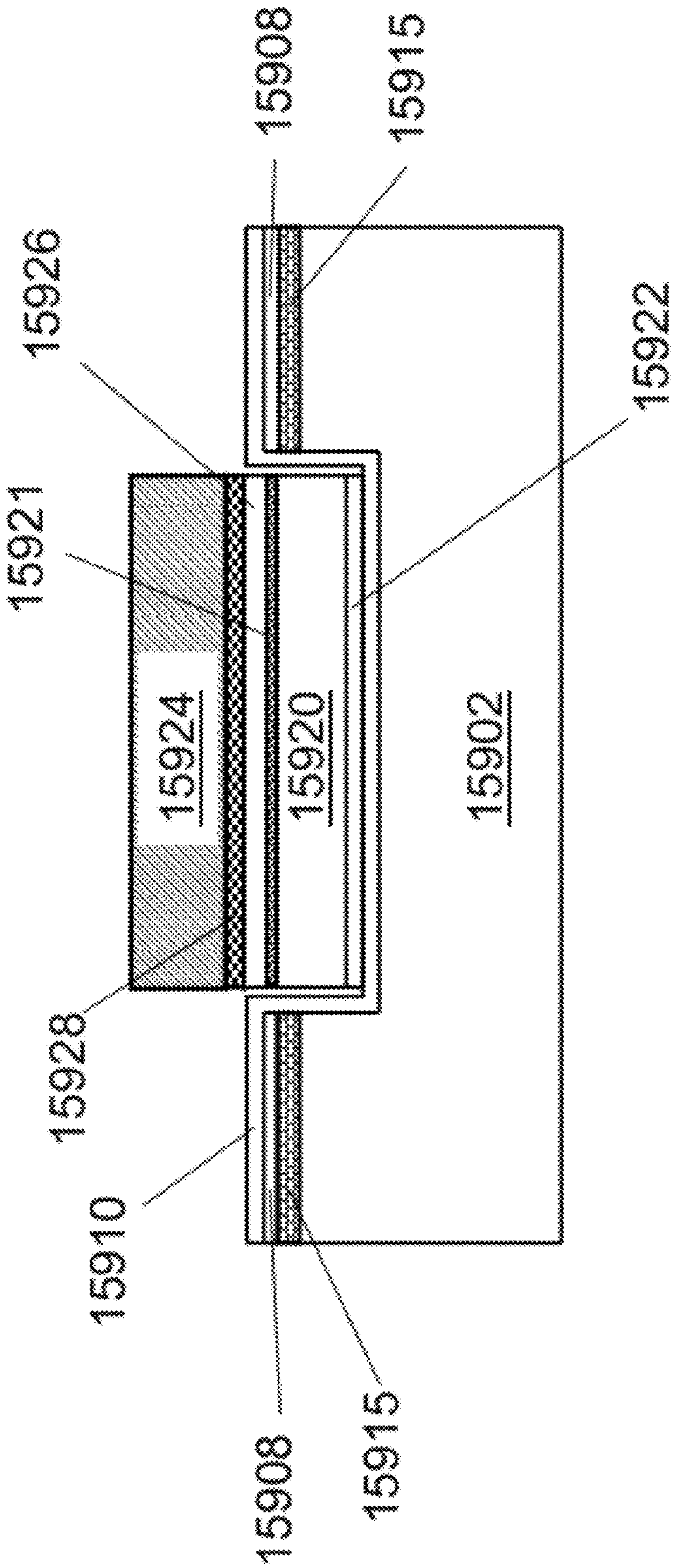

As illustrated in FIG. 159C, smaller diameter substrate 15920 may be bonded to the bottom of recess 15904 of larger diameter substrate 15902 by, for example, oxide to oxide bonding of oxide 15910 to smaller wafer bonding oxide 15922. The oxide to oxide bonding may utilize a low temperature (less than about 400° C.) bonding process. As described previously, the oxide surfaces may be prepared for bonding with treatments such as, for example, wet cleans such as $NH_4OH/H_2O_2$ solutions, and dry surface treatments such as fluorine plasmas or cluster surface implantation. Additionally, oxide 15910 or smaller wafer bonding oxide 15922 may include a stress relief layer, such as, for example, low k material such as carbon containing silicon oxides, or a layer of high temperature polymer, to mitigate the potential thermal expansion mismatch among smaller diameter substrate 15920 and larger diameter substrate 15902.

Figure 159D:
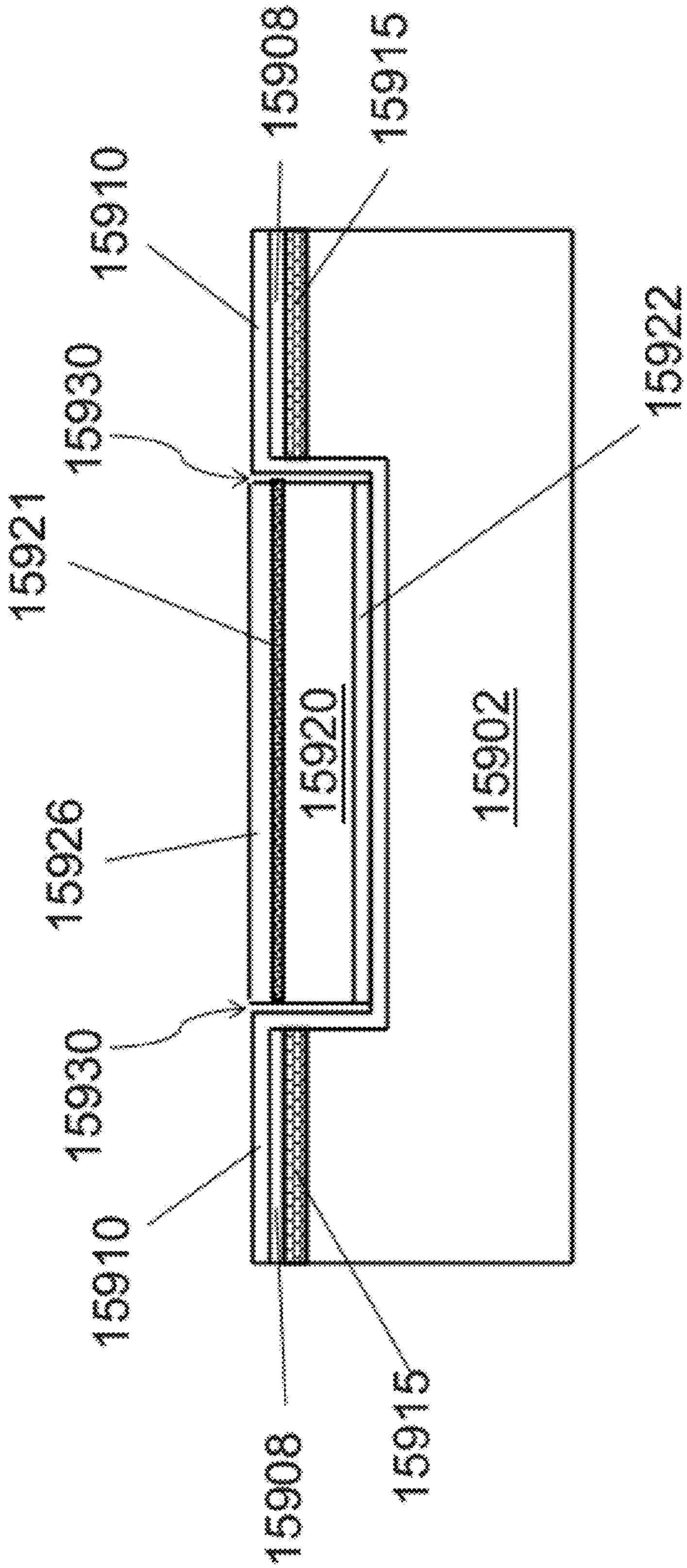

As illustrated in FIG. 159D, carrier substrate 15924 may be removed by optical means, such as, for example, laser ablation or exposure, or a thermal decomposition, of temporary attachment material 15928. Sidewall gaps 15930 are shown.

Figure 159E:
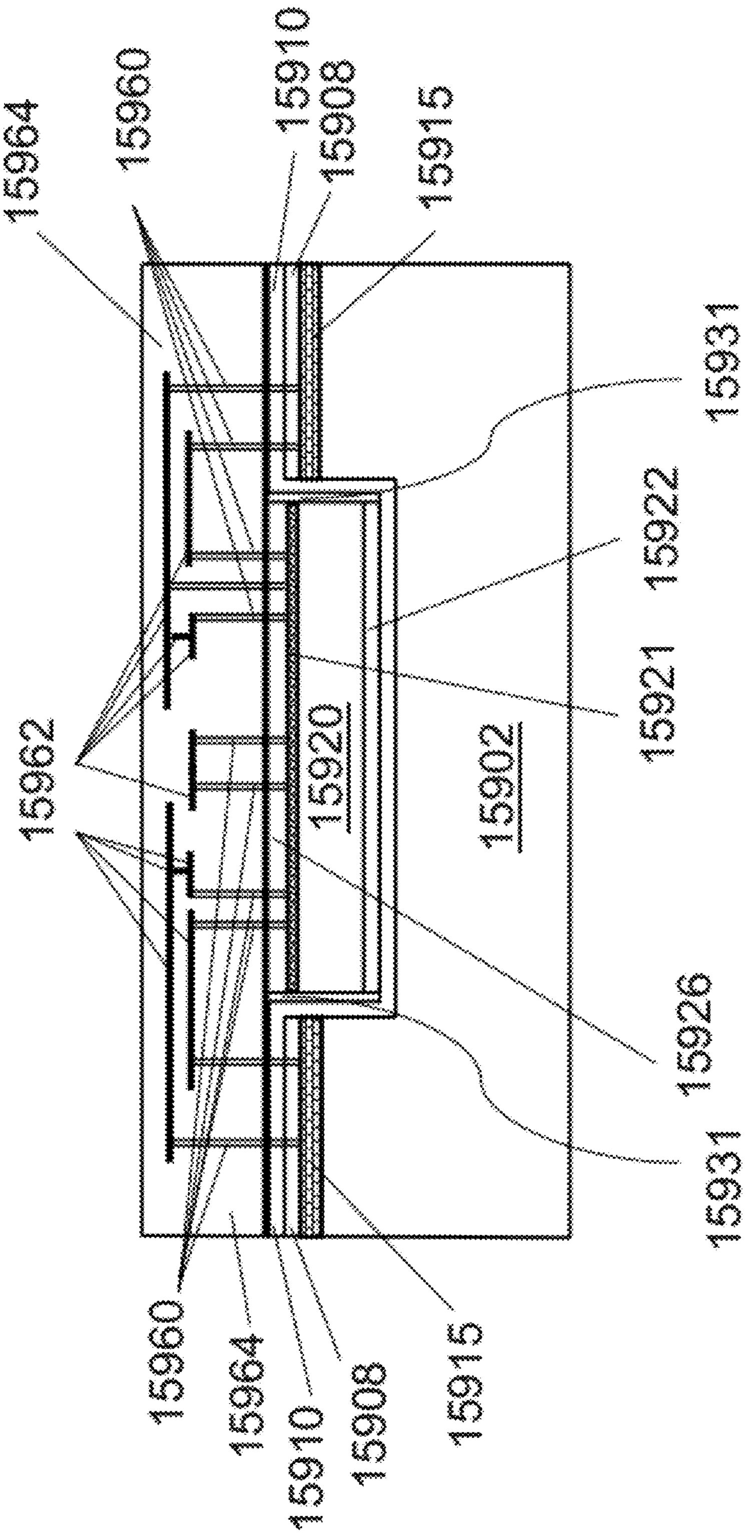

As illustrated in FIG. 159E, sidewall gaps may be filled by deposition, etch-back or CMP, and cure of fill and stress relieving material, such as, for example, SOG or high temperature polymers. This process may be repeated multiple times to substantially fill sidewall gaps 15930. Thus gap fills 15931 may be formed. Formation of contacts and vias 15960, back end of line (BEOL) metallization 15962, such as, for example, copper or aluminum, and inter-metal dielectric 15964, may be accomplished conventionally to electrically couple larger substrate circuitry and interconnect regions 15915, which may include, for example, SOA CMOS circuits, with smaller diameter substrate 15920 circuitry and interconnect layer 15921, which may include, for example, InP optoelectronic circuits. The 2DIC die or the smaller diameter substrate 15920 may be diced or cored as a discrete 2DIC chip or hetero-SOC wafer respectively in preparation for packaging and assembly operations. Formation of contacts and vias 15960 and back end of line (BEOL) metallization 15962 may be done at SOA design rules in SOA wafer fabs as processing may be done at the larger substrate diameter.

Persons of ordinary skill in the art will appreciate that the illustrations in FIGS. 159A through 159E are exemplary only and are not drawn to scale. Such skilled persons will further appreciate that many variations may be possible such as, for example, the recess 15904 may have a shape other than a circle of smaller diameter substrate 15920, such as, for example, square or rectangular, polygonal. Additionally, recess depth 15906 may have a dimension greater than or less than the thickness of smaller diameter substrate 15920 to permit additive or subtractive planarization after bonding of smaller diameter substrate 15920 into recess 15904 and carrier substrate 15924 release, or adjustment for bonding adhesive thickness or other bonding processes and materials. Furthermore, circuitry and interconnect layer 15921 may not be preprocessed, and may thus be formed after the smaller diameter substrate 15920 may be bonded to larger diameter substrate 15902 and the carrier substrate 15924 may be removed. Moreover, placement and bonding of the smaller diameter substrate 15920 with circuitry and interconnect layer 15921 into recess 15904 may be accomplished with a method other than carrier substrate 15924 and attachment material 15928, such as, for example, vacuum pick and place, and then thermo-compression to form the oxide-oxide substrate to substrate bond. Further, planarization and leveling of the recess 15904 bottom as described in FIG. 159B may be accomplished by a touchup chemical mechanical polish (CMP), with a CMP head equal to or smaller than the diameter of the smaller wafer, of the recess 15904 bottom or may be accomplished by spin, spray, deposition of a high temperature (greater than about 400° C.) polymer adhesive and a flow bake. Moreover, larger diameter substrate 15902 may, for example, include two larger diameter silicon wafers that may be separated by an etch selective layer, which may include, for example, silicon or other oxides from wafer bonding or implant, highly doped P+ layer by bonding or implant, or a SiGe layer by bonding, thus the forming of recess 15904 by wet or dry etching may make use of the selectivity to oxide, for example, of a KOH solution, to provide a planar and well-controlled recess 15904 surface and depth for later bonding of smaller diameter substrate 15920. Additionally, carrier substrate 15924 may be attached and detached by other means, for example, oxide-oxide bonding and a ion-cut cleave, release cleave, and CMP touchup process flow. Moreover, sidewall gaps 15930 may be sealed at the top with a layer, such as silicon oxide, and left as an air fill gap. Further, filling or sealing of the sidewall gaps 15930 may not be necessary to planarize and create stable contacts and vias 15960, back end of line (BEOL) metallization 15962, and inter-metal dielectric 15964. Moreover, a multiplicity of smaller diameter substrate 15920 with circuitry and interconnect layer 15921 may be placed and bonded to a single larger diameter substrate 15902. Further, a 3DIC may be added monolithically or with TSV methods after formation of the hetero-SOC 2D IC as described in FIG. 159. Many other modifications within the scope of the illustrated embodiments of the invention will suggest themselves to such skilled persons after reading this specification. Thus the invention is to be limited only by the appended claims.

In the process of layer transfer, an ion implantation may be utilized to form the layer transfer demarcation plane or 'cleave plane', for example, as described in FIG. 14 & FIG. 8 and utilized herein (sometimes called 'ion-cut' or 'smart cut'). Although the ion that may be implanted to form the layer demarcation plane may be a very light atom, such as Hydrogen, there may still be damage to the substrate or wafer, for example monocrystalline silicon, that the Hydrogen may be pass through on its way to forming the layer transfer demarcation plane. These damages may include, for example, broken bonds in the silicon lattice, and/or silicon atoms in an interstitial or substitutional sites within the monocrystalline lattice. Damage may also be suffered in the gate and gate dielectrics of pre-formed or partially formed transistors at the time of the ion-cut implant. It may be desirable to repair these defects so that the resultant transistors and circuits formed in the layer transferred may have the maximum performance and quality obtainable. Some of these methods and techniques may also be utilized to activate dopants in transferred layers before layer transfer and form transistors as well as other devices.

Figure 185A:
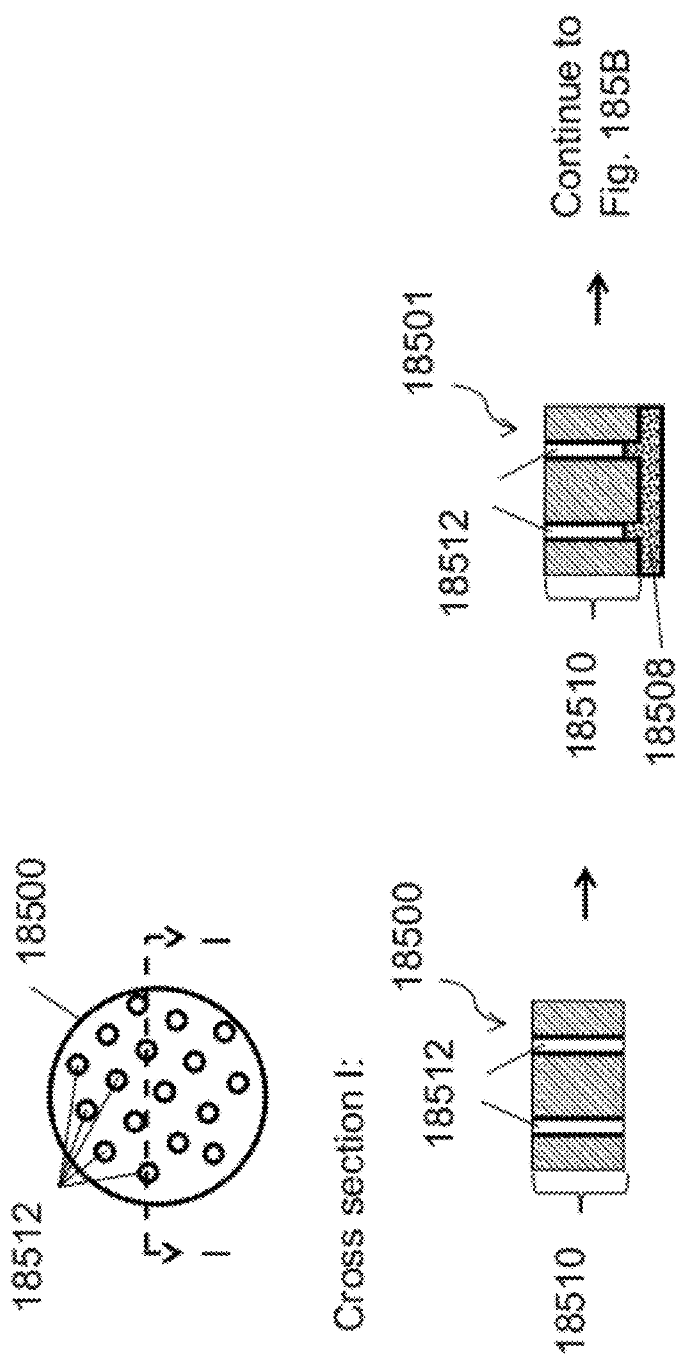

Some embodiments of the invention are described in FIGS. 184, 185A&B, 186, 187, 188, and 189. An advantage of some of the embodiments of the invention, such as, for example, relating to perforated carrier wafer liftoff techniques, may be that shear forces which may be involved with 3DIC integration, such as from CMP and/or cleaving processes, may be avoided.

Ion implantation damage repair and transferred layer annealing may utilize perforated carrier wafer liftoff techniques. The carrier wafer or substrate may be reusable. The transferred layer may have a pristine top surface with or without the damage repair anneal.

As illustrated in FIG. 184, perforated carrier substrate 18400 may include perforations 18412, which may cover a portion of the entire surface of perforated carrier substrate 18400. The portion by area of perforations 18412 that may cover the entire surface of perforated carrier substrate 18400 may range from about 5% to about 60%, typically in the range of about 10-20%. The nominal diameter of perforations 18412 may range from about 1 micron to about 200 microns, typically in the range of about 5 microns to about 50 microns. Perforations 18412 may be formed by lithographic and etching methods. As illustrated in cross section I of FIG. 184, perforated carrier substrate 18400 may include perforations 18412 which may extend substantially through carrier substrate 18410 and carrier substrate bonding oxide 18408. Carrier substrate 18410 may include, for example, monocrystalline silicon wafers, high temperature glass wafers, germanium wafers, InP wafers, or high temperature polymer substrates. Perforated carrier substrate 18400 may be utilized as and called carrier wafer or carrier substrate or carrier herein this document. Desired layer transfer substrate 18404 may be prepared for layer transfer by ion implantation of an atomic species, such as Hydrogen, which may form layer transfer demarcation plane 18406, represented by a dashed line in the illustration. Layer transfer substrate bonding oxide 18402 may be deposited on top of desired layer transfer substrate 18404. Layer transfer substrate bonding oxide 18402 may be deposited at temperatures below about 250° C. to minimize out-diffusion of the hydrogen that may have formed the layer transfer demarcation plane 18406. Layer transfer substrate bonding oxide 18402 may be deposited prior to the ion implantation, or may utilize a preprocessed oxide that may be part of desired layer transfer substrate 18404, for example, the ILD of a gate-last partial transistor layer. Desired layer transfer substrate 18404 may include any layer transfer devices and/or layer or layers contained herein this document, for example, the gate-last partial transistor layers, DRAM Si/SiO2 layers, sub-stack layers of circuitry, RCAT doped layers, or starting material doped monocrystalline silicon. Carrier substrate bonding oxide 18408 and layer transfer substrate bonding oxide 18402 may be prepared for oxide to oxide bonding, for example, for low temperature (less than about 400° C.) or high temperature (greater than about 400° C.) oxide to oxide bonding, as has been described elsewhere herein.

As illustrated in FIG. 184, perforated carrier substrate 18400 may be oxide to oxide bonded to desired layer transfer substrate 18404 at carrier substrate bonding oxide 18408 and layer transfer substrate bonding oxide 18402, thus forming cleaving structure 18490. Cleaving structure 18490 may include layer transfer substrate bonding oxide 18402, desired layer transfer substrate 18404, layer transfer demarcation plane 18406, carrier substrate bonding oxide 18408, carrier substrate 18410, and perforations 18412.

As illustrated in FIG. 184, cleaving structure 18490 may be cleaved at layer transfer demarcation plane 18406, removing a portion of desired layer transfer substrate 18404, and leaving desired transfer layer 18414, and may be defect annealed, thus forming defect annealed cleaved structure 18492. Defect annealed cleaved structure 18492 may include layer transfer substrate bonding oxide 18402, carrier substrate bonding oxide 18408, carrier substrate 18410, desired transfer layer 18414, and perforations 18412. The cleaving process may include thermal, mechanical, or other methods described elsewhere herein. Defect annealed cleaved structure 18492 may be annealed so to repair the defects in desired transfer layer 18414. The defect anneal may include a thermal exposure to temperatures above about 400° C. (a high temperature thermal anneal), including, for example, 600° C., 800° C., 900° C., 1000° C., 1050° C., 1100° C. and/or 1120° C. The defect anneal may include an optical anneal, including, for example, laser anneals, Rapid Thermal Anneal (RTA), flash anneal, and/or dual-beam laser spike anneals. The defect anneal ambient may include, for example, vacuum, high pressure (greater than about 760 torr), oxidizing atmospheres (such as oxygen or partial pressure oxygen), and/or reducing atmospheres (such as nitrogen or argon). The defect anneal may include Ultrasound Treatments (UST). The defect anneal may include microwave treatments. The defect anneal may include other defect reduction methods described herein this document. The defect anneal may repair defects, such as those caused by the ion-cut ion implantation, in transistor gate oxides or junctions and/or other devices such as capacitors which may be pre-formed and residing in desired transfer layer 18414 at the time of the ion-cut implant. The exposed ("bottom") surface of desired transfer layer 18414 may be chemically mechanically polished (CMP) or otherwise smoothed (utilized methods herein or in U.S. patent application Ser. No. 13/099,010) before and/or after the defect anneal.

As illustrated in FIG. 184, defect annealed cleaved structure 18492 may be oxide to oxide bonded to acceptor wafer or substrate 18420, thus forming 3D stacked layers with carrier wafer structure 18494. 3D stacked layers with carrier wafer structure 18494 may include acceptor wafer or substrate 18420, acceptor bonding oxide 18418, defect annealed cleaved structure bonding oxide 18416, desired transfer layer 18414, layer transfer substrate bonding oxide 18402, carrier substrate bonding oxide 18408, carrier substrate 18410, and perforations 18412. Acceptor bonding oxide 18418 may be deposited onto acceptor wafer or substrate 18420 and may be prepared for oxide to oxide bonding, for example, for low temperature (less than about 400° C.) or high temperature (greater than about 400° C.) oxide to oxide bonding, as has been described elsewhere herein. Defect annealed cleaved structure bonding oxide 18416 may deposited onto the desired transfer layer 18414 of defect annealed cleaved structure 18492, and may be prepared for oxide to oxide bonding, for example, for low temperature (less than about 400° C.) or high temperature (greater than about 400° C.) oxide to oxide bonding, as has been described elsewhere herein. Acceptor wafer or substrate 18420 may include layer or layers, or regions, of preprocessed circuitry, such as, for example, logic circuitry, microprocessors, MEMS, circuitry comprising transistors of various types, and other types of digital or analog circuitry including, but not limited to, the various embodiments described herein, such as gate last transistor formation. Acceptor wafer or substrate 18420 may include preprocessed metal interconnects including copper, aluminum, and/or tungsten, but not limited to, the various embodiments described herein, such as, for example, peripheral circuitry substrates for 3D DRAM or metal strips/pads for 3D interconnection with TLVs or TSVs. Acceptor wafer or substrate 18420 may include layer or layers of monocrystalline silicon that may be doped or undoped, including, but not limited to, the various embodiments described herein, such as, for example, for 3D DRAM, 3D NAND, or 3D RRAM formation. Acceptor wafer or substrate 18420 may include relatively inexpensive glass substrates, upon which partially or fully processed solar cells formed in monocrystalline silicon may be bonded. Acceptor wafer or substrate 18420 may include alignment marks, which may be utilized to form transistors in layers in the 3D stack, for example, desired transfer layer 18414, and the alignment marks may be used to form connections paths from transistors and transistor contacts within desired transfer layer 18414 to acceptor substrate circuitry or metal strips/pads within acceptor wafer or substrate 18420, by forming, for example, TLVs or TSVs. Acceptor bonding oxide 18418 and defect annealed cleaved structure bonding oxide 18416 may form an isolation layer between desired transfer layer 18414 and acceptor wafer or substrate 18420.

As illustrated in FIG. 184, carrier substrate 18410 with carrier substrate bonding oxide 18408 and perforations 18412, may be released ('lifted off') from the bond with acceptor wafer or substrate 18420, acceptor bonding oxide 18418, defect annealed cleaved structure bonding oxide 18416, desired transfer layer 18414, and layer transfer substrate bonding oxide 18402, thus forming 3D stacked layers structure 18496. 3D stacked layers structure 18496 may include acceptor wafer or substrate 18420, acceptor bonding oxide 18418, defect annealed cleaved structure bonding oxide 18416, and desired transfer layer 18414. The bond release, or debond, may utilize a wet chemical etch of the bonding oxides, such as layer transfer substrate bonding oxide 18402 and carrier substrate bonding oxide 18408, which may include, for example, 20:1 buffered H2O:HF, or vapor HF, or other debond/release etchants that may selectively etch the bonding oxides over the desired transfer layer 18414 and acceptor wafer or substrate 18420 material (which may include monocrystalline silicon). The debond/release etchant may substantially access the bonding oxides, such as layer transfer substrate bonding oxide 18402 and carrier substrate bonding oxide 18408, by travelling through perforations 18412. The debond/release etchant may be heated above room temperature to increase etch rates. The wafer edge sidewalls of acceptor bonding oxide 18418, defect annealed cleaved structure bonding oxide 18416, desired transfer layer 18414, and acceptor wafer or substrate 18420 may be protected from the debond/release etchant by a sidewall resist coating or other materials which do not etch quickly upon exposure to the debond/release etchant, such as, for example, silicon nitride or organic polymers such as wax or photoresist. 3D stacked layers structure 18496 may continue 3D processing the defect annealed desired transfer layer 18414 and acceptor wafer or substrate 18420 including, but not limited to, the various embodiments described herein, such as stacking Si/SiO2 layers as in 3D DRAM, 3D NAND, or RRAM formation, RCAT formation, continuous array and FPGA structures, gate array, memory blocks, solar cell completion, or gate last transistor completion formation, and may include forming transistors, for example, CMOS p-type and n-type transistors. Continued 3D processing may include forming junction-less transistors, replacement gate transistors, thin-side-up transistors, double gate transistors, horizontally oriented transistors, finfet transistors, DSS Schottky transistors, and/or trench MOSFET transistors as described by various embodiments herein. Continued 3D processing may include the custom function etching for a specific use as described, for example, in FIG. 183 and FIG. 84, and may include etching to form scribelines or dice lines. Continued 3D processing may include etching to form memory blocks, for example, as described in FIGS. 195, 196, 205-210. Continued 3D processing may include forming metal interconnects, such as, for example, aluminum or copper, within or on top of the defect annealed desired transfer layer 18414, and may include forming connections paths from transistors and transistor contacts within desired transfer layer 18414 to acceptor substrate circuitry or metal strips/pads within acceptor wafer or substrate 18420, by forming, for example, TLVs or TSVs. Thermal contacts which may conduct heat but not electricity may be formed and utilized as described in FIG. 162 through FIG. 166. Carrier substrate 18410 with perforations 18412 may be used again ('reused' or 'recycled') for the defect anneal process flow.

Persons of ordinary skill in the art will appreciate that the illustrations in FIG. 184 are exemplary and are not drawn to scale. Such skilled persons will further appreciate that many variations may be possible such as, for example, perforations 18412 may evenly cover the entire surface of perforated carrier substrate 18400 with substantially equal distances between perforations 18412, or may have unequal spacing and coverage, such as, less or more density of perforations 18412 near the wafer edge. Moreover, perforations 18412 may extend substantially through carrier substrate 18410 and not extend through carrier substrate bonding oxide 18408. Further, perforations 18412 may be formed in perforated carrier substrate 18400 by methods, for example, such as laser drilling or ion etching, such as Reactive Ion Etching (RIE). Moreover, the cross sectional cut shape of perforations 18412 may be tapered, with the widest diameter of the perforation towards where the etchant may be supplied, which may be accomplished by, for example, inductively coupled plasma (ICP) etching or vertically controlled shaped laser drilling. Further, perforations 18412 may have top view shapes other than circles; they may be oblong, ovals, squares, or rectangles for example, and may not be of uniform shape across the face of perforated carrier substrate 18400. Furthermore, perforations 18412 may include a material coating, such as thermal oxide, to enhance wicking of the debond/release etchant, and may include micro-roughening of the perforation interiors, by methods such as plasma or wet silicon etchants or ion bombardment, to enhance wicking of the debond/release etchant. Moreover, the thickness of carrier substrate 18410, such as, for example, the 750 micron nominal thickness of a 300 mm single crystal silicon wafer, may be adjusted to optimize the technical and operational trades of attributes such as, for example, debond etchant access and debond time, strength of carrier substrate 18410 to withstand thin film stresses, CMP shear forces, and the defect anneal thermal stresses, carrier substrate 18410 reuse/recycling lifetimes, and so on. Furthermore, preparation of desired layer transfer substrate 18404 for layer transfer may utilize flows and processes described herein this document. Moreover, bonding methods other than oxide to oxide, such as oxide to metal (Titanium/TiN) to oxide, or nitride to oxide, may be utilized. Further, acceptor wafer or substrate 18420 may include a wide variety of materials and constructions, for example, from undoped or doped single crystal silicon to 3D substacks. Furthermore, the exposed ("bottom") surface of desired transfer layer 18414 may be smoothed with techniques such as gas cluster ion beams, or radical oxidations utilizing, for example, the TEL SPA tool. Further, the exposed ("bottom") surface of desired transfer layer 18414 may be smoothed with "epi smoothing' techniques, whereby, for example, high temperature (about 900-1250° C.) etching with hydrogen or HCL may be coupled with epitaxial deposition of silicon. Moreover, the bond release etchant may include plasma etchant chemistries that are selective etchants to oxide and not silicon, such as, for example, CHF3 plasmas. Furthermore, a combination of etchant release and mechanical force may be employed to debond/release the carrier substrate 18410 from acceptor wafer or substrate 18420 and desired transfer layer 18414. Moreover, carrier substrate 18410 may be thermally oxidized before and/or after deposition of carrier substrate bonding oxide 18408 and/or before and/or after perforations 18412 are formed. Further, the total oxide thickness of carrier substrate bonding oxide 18408 plus layer transfer substrate bonding oxide 18402 may be adjusted to make technical and operational trades between attributes, for example, such as debond time, carrier wafer perforation spacing, and thin film stress, and the total oxide thickness may be about 1 micron or about 2 micron or about 5 microns or less than 1 micron. Moreover, the composition of carrier substrate bonding oxide 18408 and layer transfer substrate bonding oxide 18402 may be varied to increase lateral etch time; for example, by changing the vertical and/or lateral oxide density and/or doping with dopants carbon, boron, phosphorous, or by deposition rate and techniques such as PECVD, SACVD, APCVD, SOG spin & cure, and so on. Furthermore, carrier substrate bonding oxide 18408 and layer transfer substrate bonding oxide 18402 may include multiple layers of oxide and types of oxides (for example 'low-k'), and may have other thin layers inserted, such as, for example, silicon nitride, to speed lateral etching in HF solutions, or Titanium to speed lateral etch rates in hydrogen peroxide solutions. Further, the wafer edge sidewalls of acceptor bonding oxide 18418 and defect annealed cleaved structure bonding oxide 18416 may not need debond/release etchant protection; depending on the design and placement of perforations 18412, design/layout keep-out zones and edge bead considerations, and the type of debond/release etchant, the wafer edge undercut may not be harmful. Moreover, a debond/release etchant resistant material, such as silicon nitride, may be deposited over substantially all or some of the exposed surfaces of acceptor wafer or substrate 18420 prior to deposition of acceptor bonding oxide 18418. Further, desired layer transfer substrate 18404 may be an SOI or GeOI substrate base and, for example, an ion-cut process may be used to form layer transfer demarcation plane 18406 in the bulk substrate of the SOI wafer and cleaving proceeds as described in FIG. 184, or after bonding with the carrier the SOI wafer may be sacrificially etched/CMP'd off with no ion-cut implant and the damage repair may not be needed (described elsewhere herein). Many other modifications within the scope of the illustrated embodiments of the invention will suggest themselves to such skilled persons after reading this specification. Thus the invention is to be limited only by the appended claims.

Figure 185B:
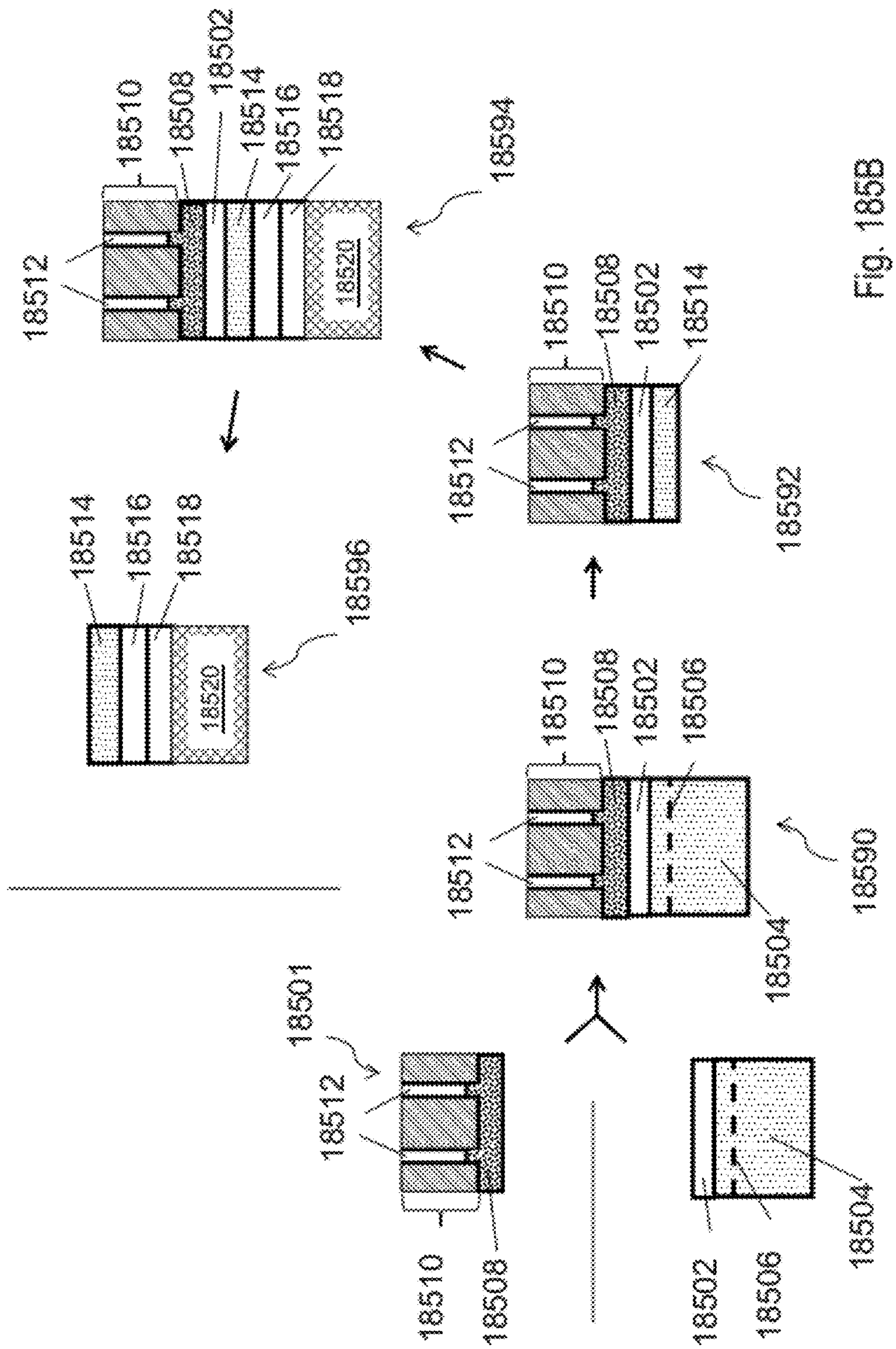

Defect annealed desired transfer layer 18414 may be of such thin thickness, for example, about 200 nm or less, that the cleaving process or post-cleaving processing such as chemical mechanical polishing may create persistent pre or post anneal defects in desired transfer layer 18414 due to the presence of perforations 18412. FIGS. 185A and 185B illustrate some embodiments of the invention wherein perforations 18412/18512 may be filled or partially filled to mitigate the potential defect production within desired transfer layer 18414/18514 as a result of the perforations and a process to repair potential defects which may be within desired transfer layer 18414/18514, for example, ion implant induced damages and defects. The carrier wafer or substrate may be reusable.

As illustrated in FIG. 185A, perforated carrier substrate 18500 may include perforations 18512, which may cover a portion of the entire surface of perforated carrier substrate 18500. The portion by area of perforations 18512 that may cover the entire surface of perforated carrier substrate 18500 may range from about 5% to about 60%, typically in the range of about 10-20%. The nominal diameter of perforations 18512 may range from about 1 micron to about 200 microns, typically in the range of about 5 microns to about 50 microns. Perforations 18512 may be formed by lithographic and etching methods. As illustrated in cross section I of FIG. 185, perforated carrier substrate 18500 may include perforations 18512 which may extend substantially through carrier substrate 18510. Carrier substrate 18510 may include, for example, monocrystalline silicon wafers, high temperature glass wafers, germanium wafers, InP wafers, or high temperature polymer substrates. Perforated carrier substrate 18500 may be utilized as and called carrier wafer or carrier substrate or carrier herein this document. Carrier substrate 18510 may be thermally oxidized and carrier substrate fill/bonding oxide 18508 may be deposited, thus forming partially filled perforated carrier substrate 18501. Carrier substrate fill/bonding oxide 18508 may be deposited such that the oxide may partially fill perforations 18512. Non-conformal or poorly-conformal deposition process(es) may be employed to encourage a partial fill of perforations 18512, including, for example, sputtered deposition, atmospheric pressure chemical vapor deposition (APCVD), plasma enhanced chemical vapor deposition PECVD depositions, low viscosity spin-on glass (SOG) spin coats at low speeds, and/or combinations or multiple applications. One or more layers may be annealed, including thermal (dry, wet oxidation) or optical methods, to densify the oxide. The shape of the perforations 18512 may be formed such that partial filling may be encouraged, for example, by etching sharp corners at the edge/surface where carrier substrate fill/bonding oxide 18508 may be deposited, by top view square shaped perforations rather than circular, by smaller sized perforation diameters. Carrier substrate fill/bonding oxide 18508 may be planarized in preparation for wafer bonding, which may include CMP.

As illustrated in FIG. 185B, desired layer transfer substrate 18504 may be prepared for layer transfer by ion implantation of an atomic species, such as Hydrogen, which may form layer transfer demarcation plane 18506, represented by a dashed line in the illustration. Layer transfer substrate bonding oxide 18502 may be deposited on top of desired layer transfer substrate 18504. Layer transfer substrate bonding oxide 18502 may be deposited at temperatures below about 250° C. to minimize out-diffusion of the hydrogen that may have formed the layer transfer demarcation plane 18506. Layer transfer substrate bonding oxide 18502 may be deposited prior to the ion implantation, or may utilize a preprocessed oxide that may be part of desired layer transfer substrate 18504, for example, the ILD of a gate-last partial transistor layer. Desired layer transfer substrate 18504 may include any layer transfer devices and/or layer or layers contained herein this document, for example, the gate-last partial transistor layers, DRAM Si/SiO2 layers, sub-stack layers of circuitry, RCAT doped layers, or starting material doped monocrystalline silicon. Carrier substrate fill/bonding oxide 18508 and layer transfer substrate bonding oxide 18502 may be prepared for oxide to oxide bonding, for example, for low temperature (less than about 400° C.) or high temperature (greater than about 400° C.) oxide to oxide bonding, as has been described elsewhere herein.

As illustrated in FIG. 185B, partially filled perforated carrier substrate 18501 may be oxide to oxide bonded to desired layer transfer substrate 18504 at carrier substrate fill/bonding oxide 18508 and layer transfer substrate bonding oxide 18502, thus forming cleaving structure 18590. Cleaving structure 18590 may include layer transfer substrate bonding oxide 18502, desired layer transfer substrate 18504, layer transfer demarcation plane 18506, carrier substrate fill/bonding oxide 18508, carrier substrate 18510, and perforations 18512. The partially filled perforations from carrier substrate fill/bonding oxide 18508 may provide optimized bonding performance.

As illustrated in FIG. 185B, cleaving structure 18590 may be cleaved at layer transfer demarcation plane 18506, removing a portion of desired layer transfer substrate 18504, and leaving desired transfer layer 18514, and may be defect annealed, thus forming defect annealed cleaved structure 18592. Defect annealed cleaved structure 18592 may include layer transfer substrate bonding oxide 18502, carrier substrate fill/bonding oxide 18508, carrier substrate 18510, desired transfer layer 18514, and perforations 18512. The cleaving process may include thermal, mechanical, or other methods described elsewhere herein. Defect annealed cleaved structure 18592 may be annealed so to repair the defects in desired transfer layer 18514. The defect anneal may include a thermal exposure to temperatures above about 400° C. (a high temperature thermal anneal), including, for example, 600° C., 800° C., 900° C., 1000° C., 1050° C., 1100° C. and/or 1120° C. The defect anneal may include an optical anneal, including, for example, laser anneals, Rapid Thermal Anneal (RTA), flash anneal, and/or dual-beam laser spike anneals. The defect anneal ambient may include, for example, vacuum, high pressure (greater than about 760 torr), oxidizing atmospheres (such as oxygen or partial pressure oxygen), and/or reducing atmospheres (such as nitrogen or argon). The defect anneal may include Ultrasound Treatments (UST). The defect anneal may include microwave treatments. The defect anneal may repair defects, such as those caused by the ion-cut ion implantation, in transistor gate oxides or junctions and/or other devices such as capacitors which may be pre-formed and residing in desired transfer layer 18414 at the time of the ion-cut implant. The defect anneal may include other defect reduction methods described herein this document. The exposed ("bottom") surface of desired transfer layer 18514 may be chemically mechanically polished (CMP) or otherwise smoothed (utilized methods herein or in U.S. patent application Ser. No. 13/099,010) before and/or after the defect anneal. The partially filled perforations from carrier substrate fill/bonding oxide 18508 may provide a reduction or substantial elimination of defects within desired transfer layer 18514 that may be induced by smoothing/thinning/planarizing techniques, such as, for example, CMP.

As illustrated in FIG. 185B, defect annealed cleaved structure 18592 may be oxide to oxide bonded to acceptor wafer or substrate 18520, thus forming 3D stacked layers with carrier wafer structure 18594. 3D stacked layers with carrier wafer structure 18594 may include acceptor wafer or substrate 18520, acceptor bonding oxide 18518, defect annealed cleaved structure bonding oxide 18516, desired transfer layer 18514, layer transfer substrate bonding oxide 18502, carrier substrate fill/bonding oxide 18508, carrier substrate 18510, and perforations 18512. Acceptor bonding oxide 18518 may be deposited onto acceptor wafer or substrate 18520 and may be prepared for oxide to oxide bonding, for example, for low temperature (less than about 400° C.) or high temperature (greater than about 400° C.) oxide to oxide bonding, as has been described elsewhere herein. Defect annealed cleaved structure bonding oxide 18516 may deposited onto the desired transfer layer 18514 of defect annealed cleaved structure 18592, and may be prepared for oxide to oxide bonding, for example, for low temperature (less than about 400° C.) or high temperature (greater than about 400° C.) oxide to oxide bonding, as has been described elsewhere herein. Acceptor wafer or substrate 18520 may include layer or layers, or regions, of preprocessed circuitry, such as, for example, logic circuitry, microprocessors, MEMS, circuitry comprising transistors of various types, and other types of digital or analog circuitry including, but not limited to, the various embodiments described herein, such as gate last transistor formation. Acceptor wafer or substrate 18520 may include preprocessed metal interconnects including copper, aluminum, and/or tungsten, but not limited to, the various embodiments described herein, such as, for example, peripheral circuitry substrates for 3D DRAM or metal strips/pads for 3D interconnection with TLVs or TSVs. Acceptor wafer or substrate 18520 may include layer or layers of monocrystalline silicon that may be doped or undoped, including, but not limited to, the various embodiments described herein, such as, for example, for 3D DRAM, 3D NAND, or 3D RRAM formation. Acceptor wafer or substrate 18520 may include relatively inexpensive glass substrates, upon which partially or fully processed solar cells made out of monocrystalline silicon may be bonded. Acceptor wafer or substrate 18520 may include alignment marks, which may be utilized to form transistors in layers in the 3D stack, for example, desired transfer layer 18514, and the alignment marks may be used to form connections paths from transistors and transistor contacts within desired transfer layer 18514 to acceptor substrate circuitry or metal strips/pads within acceptor wafer or substrate 18520, by forming, for example, TLVs or TSVs.

As illustrated in FIG. 185B, carrier substrate 18510 with carrier substrate fill/bonding oxide 18508 and perforations 18512, may be released ('lifted off') from the bond with acceptor wafer or substrate 18520, acceptor bonding oxide 18518, defect annealed cleaved structure bonding oxide 18516, desired transfer layer 18514, and layer transfer substrate bonding oxide 18502, thus forming 3D stacked layers structure 18596. 3D stacked layers structure 18596 may include acceptor wafer or substrate 18520, acceptor bonding oxide 18518, defect annealed cleaved structure bonding oxide 18516, and desired transfer layer 18514. The bond release, or debond, may utilize a wet chemical etch of the bonding oxides, such as layer transfer substrate bonding oxide 18502 and carrier substrate fill/bonding oxide 18508, which may include, for example, 20:1 buffered H2O:HF, or vapor HF, or other debond/release etchants that may selectively etch the bonding oxides over the desired transfer layer 18514 and acceptor wafer or substrate 18520 material (which may include monocrystalline silicon). The debond/release etchant may substantially access the bonding oxides, such as layer transfer substrate bonding oxide 18502 and carrier substrate fill/bonding oxide 18508, by travelling through perforations 18512. The debond/release etchant may be heated above room temperature to increase etch rates. The wafer edge sidewalls of acceptor bonding oxide 18518, defect annealed cleaved structure bonding oxide 18516, desired transfer layer 18514, and acceptor wafer or substrate 18520 may be protected from the debond/release etchant by a sidewall resist coating or other materials which do not etch quickly upon exposure to the debond/release etchant, such as, for example, silicon nitride or organic polymers such as wax or photoresist. 3D stacked layers structure 18596 may continue 3D processing the defect annealed desired transfer layer 18514 and acceptor wafer or substrate 18520 including, but not limited to, the various embodiments described herein, such as stacking Si/SiO2 layers as in 3D DRAM, 3D NAND, or RRAM formation, RCAT formation, continuous array and FPGA structures, gate array, memory blocks, solar cell completion, or gate last transistor completion formation, and may include forming transistors, for example, CMOS p-type and n-type transistors. Continued 3D processing may include forming junction-less transistors, replacement gate transistors, thin-side-up transistors, double gate transistors, horizontally oriented transistors, finfet transistors, DSS Schottky transistors, and/or trench MOSFET transistors as described by various embodiments herein. Continued 3D processing may include the custom function etching for a specific use as described, for example, in FIG. 183 and FIG. 84, and may include etching to form scribelines or dice lines. Continued 3D processing may include etching to form memory blocks, for example, as described in FIGS. 195, 196, 205-210. Continued 3D processing may include forming metal interconnects, such as, for example, aluminum or copper, within or on top of the defect annealed desired transfer layer 18514, and may include forming connections paths from transistors and transistor contacts within desired transfer layer 18514 to acceptor substrate circuitry or metal strips/pads within acceptor wafer or substrate 18520, by forming, for example, TLVs or TSVs. Thermal contacts which may conduct heat but not electricity may be formed and utilized as described in FIG. 162 through FIG. 166. Carrier substrate 18510 with perforations 18512 may be used again ('reused' or 'recycled') for the defect anneal process flow.

Persons of ordinary skill in the art will appreciate that the illustrations in FIGS. 185A and 185B are exemplary and are not drawn to scale. Such skilled persons will further appreciate that many variations may be possible such as, for example, perforations 18512 may evenly cover the entire surface of perforated carrier substrate 18500 with substantially equal distances between perforations 18512, or may have unequal spacing and coverage, such as, less or more density of perforations 18512 near the wafer edge. Further, perforations 18512 may be formed in perforated carrier substrate 18500 by methods, for example, such as laser drilling or ion etching, such as Reactive Ion Etching (RIE). Moreover, the cross sectional cut shape of perforations 18512 may be tapered, with the widest diameter of the perforation towards where the etchant may be supplied, which may be accomplished by, for example, inductively coupled plasma (ICP) etching or vertically controlled shaped laser drilling. Further, perforations 18512 may have top view shapes other than circles; they may be oblong, ovals, squares, or rectangles for example, and may not be of uniform shape across the face of perforated carrier substrate 18500. Furthermore, perforations 18512 may include a material coating, such as thermal oxide, to enhance wicking of the debond/release etchant, and may include micro-roughening of the perforation interiors, by methods such as plasma or wet silicon etchants or ion bombardment, to enhance wicking of the debond/release etchant. Moreover, the thickness of carrier substrate 18510, such as, for example, the 750 micron nominal thickness of a 300 mm single crystal silicon wafer, may be adjusted to optimize the technical and operational trades of attributes such as, for example, debond etchant access and debond time, strength of carrier substrate 18510 to withstand thin film stresses, CMP shear forces, and the defect anneal thermal stresses, carrier substrate 18510 reuse/recycling lifetimes, and so on. Furthermore, preparation of desired layer transfer substrate 18504 for layer transfer may utilize flows and processes described herein this document. Moreover, bonding methods other than oxide to oxide, such as oxide to metal (Titanium/TiN) to oxide, or nitride to oxide, may be utilized. Further, acceptor wafer or substrate 18520 may include a wide variety of materials and constructions, for example, from undoped or doped single crystal silicon to 3D sub-stacks. Furthermore, the exposed ("bottom") surface of desired transfer layer 18514 may be smoothed with techniques other than CMP, such as gas cluster ion beams, or radical oxidations utilizing, for example, the TEL SPA tool. Further, the exposed ("bottom") surface of desired transfer layer 18514 may be smoothed with "epi smoothing' techniques, whereby, for example, high temperature (about 900-1250° C.) etching with hydrogen or HCL may be coupled with epitaxial deposition of silicon. Moreover, the bond release etchant may include plasma etchant chemistries that are selective etchants to oxide and not silicon, such as, for example, CHF3 plasmas. Furthermore, a combination of etchant release and mechanical force may be employed to debond the carrier substrate 18510 from acceptor wafer or substrate 18520 and desired transfer layer 18514. Moreover, carrier substrate 18510 may be thermally oxidized before and/or after deposition of carrier substrate fill/bonding oxide 18508 and/or before and/or after perforations 18512 are formed. Further, the total oxide thickness of carrier substrate fill/bonding oxide 18508 plus layer transfer substrate bonding oxide 18502 may be adjusted to make technical and operational trades between attributes, for example, such as debond time, carrier wafer perforation spacing, defect (in desired transfer layer 18514) formation mitigation, and thin film stress, and the total oxide thickness may be about 1 micron or about 2 micron or about 5 microns or less than 1 micron. Moreover, the composition of carrier substrate fill/bonding oxide 18508 and layer transfer substrate bonding oxide 18502 may be varied to increase lateral etch time; for example, by changing the vertical and/or lateral oxide density and/or doping with dopants carbon, boron, phosphorous, or by deposition rate and techniques such as PECVD, SACVD, APCVD, SOG spin & cure, and so on. Furthermore, carrier substrate fill/bonding oxide 18508 and layer transfer substrate bonding oxide 18502 may include multiple layers of oxide and types of oxides (for example 'low-k'), and may have other thin layers inserted, such as, for example, silicon nitride, to speed lateral etching in HF solutions, or Titanium to speed lateral etch rates in hydrogen peroxide solutions. Moreover, carrier substrate fill/bonding oxide 18508 may include multiple layers wherein some layers may be optimized to partially fill perforations 18512 and others may be optimized to provide planarity and bondability. Furthermore, perforations 18512 may be filled substantially completely, and/or may be filled with material other than oxides, including, for example, polysilicon, germanium, or tungsten. Moreover, perforations 18512 may be filled by other steps and layers than carrier substrate fill/bonding oxide 18508. Further, the wafer edge sidewalls of acceptor bonding oxide 18518 and defect annealed cleaved structure bonding oxide 18516 may not need debond etchant protection; depending on the design and placement of perforations 18512, design/layout keep-out zones and edge bead considerations, and the type of debond etchant, the wafer edge undercut may not be harmful. Moreover, a debond/release etchant resistant material, such as silicon nitride, may be deposited over substantially all or some of the exposed surfaces of acceptor wafer or substrate 18420 prior to deposition of acceptor bonding oxide 18418. Further, desired layer transfer substrate 18504 may be an SOI or GeOI substrate base and, for example, an ion-cut process may be used to form layer transfer demarcation plane 18506 in the bulk substrate of the SOI wafer and cleaving proceeds as described in FIG. 185, or after bonding with the carrier the SOI wafer may be sacrificially etched/CMP'd off with no ion-cut implant and the damage repair may not be needed (described elsewhere herein). Many other modifications within the scope of the illustrated embodiments of the invention will suggest themselves to such skilled persons after reading this specification. Thus the invention is to be limited only by the appended claims.

Ion implantation damage repair and transferred layer annealing may utilize laser liftoff techniques. The carrier wafer or substrate may be reusable.

As illustrated in FIG. 186, carrier substrate 18600 may include optically transparent carrier substrate 18610 and carrier substrate bonding oxide 18608. Optically transparent carrier substrate 18610 may include wafers or substrates that are substantially transparent to the wavelengths of optical energy 18612 that may be utilized for liftoff, for example, sapphire or high temperature glass. Carrier substrate 18600 may be utilized as and called carrier wafer or carrier substrate or carrier herein this document. Carrier substrate bonding oxide 18608 may be deposited onto optically transparent carrier substrate 18610, or the material of the optically transparent carrier substrate 18610 may be utilized for the bonding. Desired layer transfer substrate 18604 may be prepared for layer transfer by ion implantation of an atomic species, such as Hydrogen, which may form layer transfer demarcation plane 18606, represented by a dashed line in the illustration. Layer transfer substrate bonding oxide 18602 may be deposited on top of desired layer transfer substrate 18604. Layer transfer substrate bonding oxide 18602 may be deposited at temperatures below about 250° C. to minimize outdiffusion of the hydrogen that may have formed the layer transfer demarcation plane 18606. Layer transfer substrate bonding oxide 18602 may be deposited prior to the ion implantation, or may utilize a preprocessed oxide that may be part of desired layer transfer substrate 18604, for example, the ILD of a gate-last partial transistor layer. Desired layer transfer substrate 18604 may include many of layer transfer devices and/or layer or layers contained herein this document, for example, DRAM Si/SiO2 layers, RCAT doped layers, or starting material doped monocrystalline silicon. Carrier substrate bonding oxide 18608 (or the surface of optically transparent carrier substrate 18610) and layer transfer substrate bonding oxide 18602 may be prepared for oxide to oxide bonding, for example, for low temperature (less than about 400° C.) or high temperature (greater than about 400° C.) oxide to oxide bonding, as has been described elsewhere herein.

As illustrated in FIG. 186, carrier substrate 18600 may be oxide to oxide bonded to desired layer transfer substrate 18604 at carrier substrate bonding oxide 18608 and layer transfer substrate bonding oxide 18602, thus forming cleaving structure 18690. Cleaving structure 18690 may include layer transfer substrate bonding oxide 18602, desired layer transfer substrate 18604, layer transfer demarcation plane 18606, carrier substrate bonding oxide 18608, and optically transparent carrier substrate 18610.

As illustrated in FIG. 186, cleaving structure 18690 may be cleaved at layer transfer demarcation plane 18606, removing a portion of desired layer transfer substrate 18604, and leaving desired transfer layer 18614, and may be defect annealed, thus forming defect annealed cleaved structure 18692. Defect annealed cleaved structure 18692 may include layer transfer substrate bonding oxide 18602, carrier substrate bonding oxide 18608, optically transparent carrier substrate 18610, and desired transfer layer 18614. The cleaving process may include thermal, mechanical, or other methods described elsewhere herein. Defect annealed cleaved structure 18692 may be annealed so to repair the defects in desired transfer layer 18614. The defect anneal may include a thermal exposure to temperatures above about 400° C. (a high temperature thermal anneal), including, for example, 600° C., 800° C., 900° C., 1000° C., 1050° C., 1100° C. and/or 1120° C. The defect anneal may include an optical anneal, including, for example, laser anneals, Rapid Thermal Anneal (RTA), flash anneal, and/or dual-beam laser spike anneals, which may be applied to desired transfer layer 18614 from the exposed surface and not through the optically transparent carrier substrate 18610. The defect anneal ambient may include, for example, vacuum, high pressure (greater than about 760 torr), oxidizing atmospheres (such as oxygen or partial pressure oxygen), and/or reducing atmospheres (such as nitrogen or argon). The defect anneal may include Ultrasound Treatments (UST). The defect anneal may include microwave treatments. The defect anneal may repair defects, such as those caused by the ion-cut ion implantation, in transistor gate oxides or junctions and/or other devices such as capacitors which may be pre-formed and residing in desired transfer layer 18414 at the time of the ion-cut implant. The defect anneal may include other defect reduction methods described herein this document. The exposed ("bottom") surface of desired transfer layer 18614 may be chemically mechanically polished (CMP) or otherwise smoothed (utilized methods herein or in U.S. patent application Ser. No. 13/099,010) before and/or after the defect anneal.

As illustrated in FIG. 186, defect annealed cleaved structure 18692 may be oxide to oxide bonded to acceptor wafer or substrate 18620, thus forming 3D stacked layers with carrier wafer structure 18694. 3D stacked layers with carrier wafer structure 18694 may include acceptor wafer or substrate 18620, acceptor bonding oxide 18618, defect annealed cleaved structure bonding oxide 18616, desired transfer layer 18614, layer transfer substrate bonding oxide 18602, carrier substrate bonding oxide 18608, and optically transparent carrier substrate 18610. Acceptor bonding oxide 18618 may be deposited onto acceptor wafer or substrate 18620 and may be prepared for oxide to oxide bonding, for example, for low temperature (less than about 400° C.) or high temperature (greater than about 400° C.) oxide to oxide bonding, as has been described elsewhere herein. Defect annealed cleaved structure bonding oxide 18616 may deposited onto the desired transfer layer 18614 of defect annealed cleaved structure 18692, and may be prepared for oxide to oxide bonding, for example, for low temperature (less than about 400° C.) or high temperature (greater than about 400° C.) oxide to oxide bonding, as has been described elsewhere herein. Acceptor wafer or substrate 18620 may include layer or layers, or regions, of preprocessed circuitry, such as, for example, logic circuitry, microprocessors, MEMS, circuitry comprising transistors of various types, and other types of digital or analog circuitry including, but not limited to, the various embodiments described herein, such as gate last transistor formation. Acceptor wafer or substrate 18620 may include preprocessed metal interconnects including copper, aluminum, and/or tungsten, but not limited to, the various embodiments described herein, such as, for example, peripheral circuitry substrates for 3D DRAM or metal strips/pads for 3D interconnection with TLVs or TSVs. Acceptor wafer or substrate 18620 may include layer or layers of monocrystalline silicon that may be doped or undoped, including, but not limited to, the various embodiments described herein, such as, for example, for 3D DRAM, 3D NAND, or 3D RRAM formation. Acceptor wafer or substrate 18620 may include relatively inexpensive glass substrates, upon which partially or fully processed solar cells formed in monocrystalline silicon may be bonded. Acceptor wafer or substrate 18620 may include alignment marks, which may be utilized to form transistors in layers in the 3D stack, for example, desired transfer layer 18614, and the alignment marks may be used to form connections paths from transistors and transistor contacts within desired transfer layer 18614 to acceptor substrate circuitry or metal strips/pads within acceptor wafer or substrate 18620, by forming, for example, TLVs or TSVs.

As illustrated in FIG. 186, optically transparent carrier substrate 18610 with carrier substrate bonding oxide 18608 and layer transfer substrate bonding oxide 18602, may be released ('lifted off') from the bond with desired transfer layer 18614, thus forming 3D stacked layers structure 18696. 3D stacked layers structure 18696 may include acceptor wafer or substrate 18620, acceptor bonding oxide 18618, defect annealed cleaved structure bonding oxide 18616, and desired transfer layer 18614. The bond release, or debond, may utilize a laser to shine optical energy 18612 through the optically transparent carrier substrate 18610 with carrier substrate bonding oxide 18608 and layer transfer substrate bonding oxide 18602 and a laser lift-off process may be conducted. Further details of the laser lift-off process are described in U.S. Pat. No. 6,071,795 by Nathan W. Cheung, Timothy D. Sands and William S. Wong ("Cheung"). Optical energy 18612 may be of the wavelength or wavelengths such that optically transparent carrier substrate 18610 with carrier substrate bonding oxide 18608 and layer transfer substrate bonding oxide 18602 may be substantially transparent and that the material of desired transfer layer 18614, such as monocrystalline silicon, may be substantially absorptive to the wavelengths of optical energy 18612. The laser to shine the optical energy 18612 may include, for example, a KrF pulsed excimer laser. A smoothing process, such as CMP or other methods described herein, may conducted to smooth and planarize the surface of desired transfer layer 18614. 3D stacked layers structure 18696 may continue 3D processing the defect annealed desired transfer layer 18614 and acceptor wafer or substrate 18620 including, but not limited to, the various embodiments described herein, such as stacking Si/SiO2 layers as in 3D DRAM, 3D NAND, or RRAM formation, RCAT formation, continuous array and FPGA structures, gate array, memory blocks, solar cell completion, or gate last transistor completion formation, and may include forming transistors, for example, CMOS p-type and n-type transistors. Continued 3D processing may include forming junction-less transistors, replacement gate transistors, thin-side-up transistors, double gate transistors, horizontally oriented transistors, finfet transistors, DSS Schottky transistors, and/or trench MOSFET transistors as described by various embodiments herein. Continued 3D processing may include the custom function etching for a specific use as described, for example, in FIG. 183 and FIG. 84, and may include etching to form scribelines or dice lines. Continued 3D processing may include etching to form memory blocks, for example, as described in FIGS. 195, 196, 205-210. Continued 3D processing may include forming metal interconnects, such as, for example, aluminum or copper, within or on top of the defect annealed desired transfer layer 18614, and may include forming connections paths from transistors and transistor contacts within desired transfer layer 18614 to acceptor substrate circuitry or metal strips/pads within acceptor wafer or substrate 18620, by forming, for example, TLVs or TSVs. Thermal contacts which may conduct heat but not electricity may be formed and utilized as described in FIG. 162 through FIG. 166. Optically transparent carrier substrate 18610 may be used again ('reused' or 'recycled') for the defect anneal process flow.

Persons of ordinary skill in the art will appreciate that the illustrations in FIG. 186 are exemplary and are not drawn to scale. Such skilled persons will further appreciate that many variations may be possible such as, for example, the thickness or composition of optically transparent carrier substrate 18610, such as, for example, the 750 micron nominal thickness of a 300 mm sapphire wafer or high temperature glass substrate, may be adjusted to optimize the technical and operational trades of attributes such as, for example, debond optical energy access and debond time, strength of optically transparent carrier substrate 18610 to withstand thin film stresses, CMP shear forces, and the defect anneal thermal stresses, optically transparent carrier substrate 18610 reuse/recycling lifetimes, and so on. Furthermore, preparation of desired layer transfer substrate 18604 for layer transfer may utilize flows and processes described herein this document. Moreover, bonding methods other than oxide to oxide, such as sapphire to oxide, oxide to metal (Titanium/TiN) to oxide, or nitride to oxide, may be utilized. Further, acceptor wafer or substrate 18620 may include a wide variety of materials and constructions, for example, from undoped or doped single crystal silicon to 3D sub-stacks. Furthermore, the exposed ("bottom") surface of desired transfer layer 18614 may be smoothed with techniques such as gas cluster ion beams, or radical oxidations utilizing, for example, the TEL SPA tool. Further, the exposed ("bottom") surface of desired transfer layer 18614 may be smoothed with "epi smoothing' techniques, whereby, for example, high temperature (about 900-1250° C.) etching with hydrogen or HCL may be coupled with epitaxial deposition of silicon. Furthermore, a combination of optical energy 18612 and mechanical force may be employed to debond/release the optically transparent carrier substrate 18610 from desired transfer layer 18614 and acceptor wafer or substrate 18620. Moreover, optically transparent carrier substrate 18610 may be thermally oxidized before and/or after deposition of carrier substrate bonding oxide 18608. Further, the total oxide thickness of carrier substrate bonding oxide 18608 plus layer transfer substrate bonding oxide 18602 may be adjusted to make technical and operational trades between attributes, for example, such as optical energy debond time, melt rate of desired transfer layer 18614, and thin film stress, and the total oxide thickness may be about 2 nm, or about 5 nm or about 10 nm or about 100 nm or less than 1 micron. Moreover, the optical defect anneal may be applied to desired transfer layer 18614 through the optically transparent carrier substrate 18610 if the wavelength or wavelengths of light are adjusted to absorbed in a layer or structure within desired transfer layer 18614 and not it's surface. Furthermore, for defect annealing below a polymer melting temperature, typically about 800° C., bonding of the optically transparent carrier substrate 18600 may utilize a polymer bond (instead of oxide to oxide bond) to desired layer transfer substrate 18604, thus forming a cleaving structure 18692 that may utilize an optical, such as a laser exposure, release ('lifted off') of the polymer bond after the moderate temperature defect anneal and permanent bonding to the acceptor wafer or substrate 18618. Further, desired layer transfer substrate 18404 may be an SOI or GeOI substrate base and, for example, an ion-cut process may be used to form layer transfer demarcation plane 18606 in the bulk substrate of the SOI wafer and cleaving proceeds as described in FIG. 186, or after bonding with the carrier the SOI wafer may be sacrificially etched/CMP'd off with no ion-cut implant and the damage repair may not be needed (described elsewhere herein). Many other modifications within the scope of the illustrated embodiments of the invention will suggest themselves to such skilled persons after reading this specification. Thus the invention is to be limited only by the appended claims.

Ion implantation damage repair and transferred layer annealing may utilize carrier wafer or substrate techniques wherein the carrier is sacrificed or not reusable.

As illustrated in FIG. 187, carrier substrate 18700 may include sacrificial carrier substrate 18710 and carrier substrate bonding oxide 18708. Sacrificial carrier substrate 18710 may include materials that provide sufficient strength and performance to enable successful and high yielding bonding, cleaving, and defect annealing, such as, for example, monocrystalline silicon. Sacrificial carrier substrate 18710 may include, for example, monocrystalline silicon wafers, high temperature glass wafers, germanium wafers, InP wafers, or high temperature polymer substrates. Carrier substrate bonding oxide 18708 may be deposited onto sacrificial carrier substrate 18710. Carrier substrate 18700 may be utilized as and called carrier wafer or carrier substrate or carrier herein this document. Desired layer transfer substrate 18704 may be prepared for layer transfer by ion implantation of an atomic species, such as Hydrogen, which may form layer transfer demarcation plane 18706, represented by a dashed line in the illustration. Layer transfer substrate bonding oxide 18702 may be deposited on top of desired layer transfer substrate 18704. Layer transfer substrate bonding oxide 18702 may be deposited at temperatures below about 250° C. to minimize out-diffusion of the hydrogen that may have formed the layer transfer demarcation plane 18706. Layer transfer substrate bonding oxide 18702 may be deposited prior to the ion implantation, or may utilize a preprocessed oxide that may be part of desired layer transfer substrate 18704, for example, the ILD of a gate-last partial transistor layer. Desired layer transfer substrate 18704 may include any layer transfer devices and/or layer or layers contained herein this document, for example, the gate-last partial transistor layers, DRAM Si/SiO2 layers, sub-stack layers of circuitry, RCAT doped layers, or starting material doped monocrystalline silicon. Carrier substrate bonding oxide 18708 and layer transfer substrate bonding oxide 18702 may be prepared for oxide to oxide bonding, for example, for low temperature (less than about 400° C.) or high temperature (greater than about 400° C.) oxide to oxide bonding, as has been described elsewhere herein.

As illustrated in FIG. 187, carrier substrate 18700 may be oxide to oxide bonded to desired layer transfer substrate 18704 at carrier substrate bonding oxide 18708 and layer transfer substrate bonding oxide 18702, thus forming cleaving structure 18790. Cleaving structure 18790 may include layer transfer substrate bonding oxide 18702, desired layer transfer substrate 18704, layer transfer demarcation plane 18706, carrier substrate bonding oxide 18708, and sacrificial carrier substrate 18710.

As illustrated in FIG. 187, cleaving structure 18790 may be cleaved at layer transfer demarcation plane 18706, removing a portion of desired layer transfer substrate 18704, and leaving desired transfer layer 18714, and may be defect annealed, thus forming defect annealed cleaved structure 18792. Defect annealed cleaved structure 18792 may include layer transfer substrate bonding oxide 18702, carrier substrate bonding oxide 18708, sacrificial carrier substrate 18710, and desired transfer layer 18714. The cleaving process may include thermal, mechanical, or other methods described elsewhere herein. Defect annealed cleaved structure 18792 may be annealed so to repair the defects in desired transfer layer 18714. The defect anneal may include a thermal exposure to temperatures above about 400° C. (a high temperature thermal anneal), including, for example, 600° C., 800° C., 900° C., 1000° C., 1050° C., 1100° C. and/or 1120° C. The defect anneal may include an optical anneal, including, for example, laser anneals, Rapid Thermal Anneal (RTA), flash anneal, and/or dual-beam laser spike anneals. The defect anneal ambient may include, for example, vacuum, high pressure (greater than about 760 torr), oxidizing atmospheres (such as oxygen or partial pressure oxygen), and/or reducing atmospheres (such as nitrogen or argon). The defect anneal may include Ultrasound Treatments (UST). The defect anneal may include microwave treatments. The defect anneal may repair defects, such as those caused by the ion-cut ion implantation, in transistor gate oxides or junctions and/or other devices such as capacitors which may be pre-formed and residing in desired transfer layer 18414 at the time of the ion-cut implant. The defect anneal may include other defect reduction methods described herein this document. The exposed ("bottom") surface of desired transfer layer 18714 may be chemically mechanically polished (CMP) or otherwise smoothed (utilized methods herein or in U.S. patent application Ser. No. 13/099,010) before and/or after the defect anneal.

As illustrated in FIG. 187, defect annealed cleaved structure 18792 may be oxide to oxide bonded to acceptor wafer or substrate 18720, thus forming 3D stacked layers with carrier wafer structure 18794. 3D stacked layers with carrier wafer structure 18794 may include acceptor wafer or substrate 18720, acceptor bonding oxide 18718, defect annealed cleaved structure bonding oxide 18716, desired transfer layer 18714, layer transfer substrate bonding oxide 18702, carrier substrate bonding oxide 18708, and sacrificial carrier substrate 18710. Acceptor bonding oxide 18718 may be deposited onto acceptor wafer or substrate 18720 and may be prepared for oxide to oxide bonding, for example, for low temperature (less than about 400° C.) or high temperature (greater than about 400° C.) oxide to oxide bonding, as has been described elsewhere herein. Defect annealed cleaved structure bonding oxide 18716 may deposited onto the desired transfer layer 18714 of defect annealed cleaved structure 18792, and may be prepared for oxide to oxide bonding, for example, for low temperature (less than about 400° C.) or high temperature (greater than about 400° C.) oxide to oxide bonding, as has been described elsewhere herein. Acceptor wafer or substrate 18720 may include layer or layers, or regions, of preprocessed circuitry, such as, for example, logic circuitry, microprocessors, MEMS, circuitry comprising transistors of various types, and other types of digital or analog circuitry including, but not limited to, the various embodiments described herein, such as gate last transistor formation. Acceptor wafer or substrate 18720 may include preprocessed metal interconnects including copper, aluminum, and/or tungsten, but not limited to, the various embodiments described herein, such as, for example, peripheral circuitry substrates for 3D DRAM or metal strips/pads for 3D interconnection with TLVs or TSVs. Acceptor wafer or substrate 18720 may include layer or layers of monocrystalline silicon that may be doped or undoped, including, but not limited to, the various embodiments described herein, such as, for example, for 3D DRAM, 3D NAND, or 3D RRAM formation. Acceptor wafer or substrate 18720 may include relatively inexpensive glass substrates, upon which partially or fully processed solar cells formed in monocrystalline silicon may be bonded. Acceptor wafer or substrate 18720 may include alignment marks, which may be utilized to form transistors in layers in the 3D stack, for example, desired transfer layer 18714, and the alignment marks may be used to form connections paths from transistors and transistor contacts within desired transfer layer 18714 to acceptor substrate circuitry or metal strips/pads within acceptor wafer or substrate 18720, by forming, for example, TLVs or TSVs.

As illustrated in FIG. 187, sacrificial carrier substrate 18710 may be sacrificially removed from acceptor wafer or substrate 18720, acceptor bonding oxide 18718, defect annealed cleaved structure bonding oxide 18716, desired transfer layer 18714, layer transfer substrate bonding oxide 18702 and carrier substrate bonding oxide 18708, thus forming 3D stacked layers structure 18796. 3D stacked layers structure 18796 may include acceptor wafer or substrate 18720, acceptor bonding oxide 18718, defect annealed cleaved structure bonding oxide 18716, desired transfer layer 18714, layer transfer substrate bonding oxide 18702 and carrier substrate bonding oxide 18708. The removal of sacrificial carrier substrate 18710 may utilize etching and removal processes, such as, for example, a chemical mechanical polish (CMP) of sacrificial carrier substrate 18710, a selective wet chemical etch of a monocrystalline silicon sacrificial carrier substrate 18710, alone or in combination. The wet chemical etch may include, for example, an 80° C. KOH solution, or other etchants that may selectively etch the material of sacrificial carrier substrate 18710, such as monocrystalline silicon, over the layer transfer substrate bonding oxide 18702 and carrier substrate bonding oxide 18708. The etchant may be heated above room temperature to increase etch rates. The wafer edge sidewalls of acceptor bonding oxide 18718, defect annealed cleaved structure bonding oxide 18716, desired transfer layer 18714, transfer substrate bonding oxide 18702, carrier substrate bonding oxide 18708, and acceptor wafer or substrate 18720 may be protected from the etchant by a sidewall resist coating or other materials which do not etch quickly upon exposure to the etchant, such as, for example, silicon oxide, or organic polymers such as wax or photoresist. 3D stacked layers structure 18796 may continue 3D processing the defect annealed desired transfer layer 18714 and acceptor wafer or substrate 18720 including, but not limited to, the various embodiments described herein, such as stacking Si/SiO2 layers as in 3D DRAM, 3D NAND, or RRAM formation, RCAT formation, continuous array and FPGA structures, gate array, memory blocks, solar cell completion, or gate last transistor completion formation, and may include forming transistors, for example, CMOS p-type and n-type transistors. Continued 3D processing may include forming junction-less transistors, replacement gate transistors, thin-side-up transistors, double gate transistors, horizontally oriented transistors, finfet transistors, DSS Schottky transistors, and/or trench MOSFET transistors as described by various embodiments herein. Continued 3D processing may include the custom function etching for a specific use as described, for example, in FIG. 183 and FIG. 84, and may include etching to form scribelines or dice lines. Continued 3D processing may include etching to form memory blocks, for example, as described in FIGS. 195, 196, 205-210. Continued 3D processing may include forming metal interconnects, such as, for example, aluminum or copper, within or on top of the defect annealed desired transfer layer 18714, and may include forming connections paths from transistors and transistor contacts within desired transfer layer 18714 to acceptor substrate circuitry or metal strips/pads within acceptor wafer or substrate 18720, by forming, for example, TLVs or TSVs. Thermal contacts which may conduct heat but not electricity may be formed and utilized as described in FIG. 162 through FIG. 166.

Persons of ordinary skill in the art will appreciate that the illustrations in FIG. 187 are exemplary and are not drawn to scale. Such skilled persons will further appreciate that many variations may be possible such as, for example, the thickness of sacrificial carrier substrate 18710, such as, for example, the 750 micron nominal thickness of a 300 mm single crystal silicon wafer, may be adjusted to optimize the technical and operational trades of attributes such as, for example, removal CMP/etchant time, strength of sacrificial carrier substrate 18710 to withstand thin film stresses, CMP shear forces, and the defect anneal thermal stresses, sacrificial carrier substrate 18710 reuse/recycling lifetimes, and so on. Furthermore, preparation of desired layer transfer substrate 18704 for layer transfer may utilize flows and processes described herein this document. Moreover, bonding methods other than oxide to oxide, such as oxide to metal (Titanium/TiN) to oxide, or nitride to oxide, may be utilized. Further, acceptor wafer or substrate 18720 may include a wide variety of materials and constructions, for example, from undoped or doped single crystal silicon to 3D sub-stacks. Furthermore, the exposed ("bottom") surface of desired transfer layer 18714 may be smoothed with techniques such as gas cluster ion beams, or radical oxidations utilizing, for example, the TEL SPA tool. Further, the exposed ("bottom") surface of desired transfer layer 18714 may be smoothed with "epi smoothing' techniques, whereby, for example, high temperature (about 900-1250° C.) etching with hydrogen or HCL may be coupled with epitaxial deposition of silicon. Moreover, the removal etchant may include plasma etchant chemistries that are selective etchants to silicon and not silicon oxide, such as, for example, chlorine plasmas. Further, the total oxide thickness of carrier substrate bonding oxide 18708 plus layer transfer substrate bonding oxide 18702 may be adjusted to make technical and operational trades between attributes, for example, such as deposition time, oxide stresses, bonding performance, and protection of the desired transferred layer 18714. Moreover, a removal etchant resistant material, such as silicon oxide, may be deposited and/or grown over substantially all or some of the exposed surfaces of acceptor wafer or substrate 18720 and desired transferred layer 18714, and prior to deposition of acceptor bonding oxide 18718. Further, desired layer transfer substrate 18704 may be an SOI or GeOI substrate base and, for example, an ion-cut process may be used to form layer transfer demarcation plane 18706 in the bulk substrate of the SOI wafer and cleaving proceeds as described in FIG. 187, or after bonding with the carrier the SOI wafer may be sacrificially etched/CMP'd off with no ion-cut implant and the damage repair may not be needed (described elsewhere herein). Many other modifications within the scope of the illustrated embodiments of the invention will suggest themselves to such skilled persons after reading this specification. Thus the invention is to be limited only by the appended claims.

Sonic energy, such as ultrasonic or megasonic radiation, may be utilized for ion implantation damage repair, transferred layer annealing, and annealing/activation of dopants. Sonic energy may be utilized in 3DIC carrier wafer process flows and methods such as FIGS. 184-187 or in direct layer transfer flows and methods herein. Sonic energy may be applied to 2DIC flows for ion implantation damage repair and annealing/activation. Sonic energy may provide for a very low temperature defect anneal, typically about room temperature (25° C.), or may be combined with thermal annealing, such as 250° C. Sonic energy may be combined with an induced tensile stress of the sample being subjected to the sonic energy, enhancing defect and/or dislocation movement, especially in single crystal materials, such as, for example, monocrystalline silicon.

Ultrasound Treatments (UST) may apply the sonic energy using longitudinal acoustic waves which may be introduced into a plate (transfer mass) from the rear side of the plate and may propagate perpendicular to the working surface upon which the layer or substrate to be annealed may be placed. Thus, the acoustic wave may propagate perpendicular to the to-be-annealed wafer or substrate surface. The sonic energy may first impinge on a sonic spreader, which may include a plate constructed of materials of greater or lesser density than the transfer mass, for example, copper or aluminum. The sonic spreader may be physically coupled to or may be integrated into the transfer mass. The UST frequency may be from 10 kHz to 30 MHz. The applied UST power or intensity may be from 0.2 W/cm$^2$ to 3 W/cm$^2$. The temperature of the layer or substrate being subjected to the UST may typically be about 250° C. to 400° C. After or at the end of the UST, the annealed wafer, layer, or substrate may be thermally quenched to room temperature, about 25° C. The duration of the UST may be typically 1 minute, but may range from 1 second to 4 hours. The UST ambient may include, for example, vacuum, high pressure (greater than about 760 torr), oxidizing atmospheres (such as oxygen or partial pressure oxygen), and/or reducing atmospheres (such as hydrogen and partial pressure hydrogen, nitrogen or argon), and may include liquid immersion, for example, in water or alcohol.

The UST frequency and transfer mass may be adjusted to create and optimize resonance within the to-be-annealed layer, wafer, or substrate. The to-be-annealed layer, wafer, or substrate may include, for example, desired transfer layer 18414 of FIG. 184. For example, the transfer mass may be adjusted to create and optimize resonance within the to-be-annealed layer, wafer or substrate by utilizing a thick and massive transfer mass, such as a plate or wafer slug of monocrystalline silicon or stainless steel about 10 cm thick and/or more than 10 times the mass of the to-be-annealed wafer or substrate. The sonic energy impinging on the massive transfer mass may be from sources including, for example, a sonic transducer, multiple electric or electronic hammers, fast moving solenoids, or water cavitation jets. The sonic energy may first impinge on a sonic spreader, which may include a plate constructed of materials of greater or lesser density than the massive transfer mass, for example, copper or aluminum. The sonic spreader may be physically coupled to or may be integrated into the massive transfer mass.

As illustrated in FIG. 188, an exemplary sonic energy anneal may be utilized as the defect anneal step in the process described in FIG. 148. After cleaving, defect annealed cleaved structure 18492 may include layer transfer substrate bonding oxide 18402, carrier substrate bonding oxide 18408, carrier substrate 18410, desired transfer layer 18414, and perforations 18412. Defect annealed cleaved structure 18492 may be annealed with a UST so to substantially repair the defects in desired transfer layer 18414. Transfer mass 18882 may be contacted or coupled to desired transfer layer 18414. Adhesives or protectant oxides may be applied or deposited. Sonic spreader 18884 may be coupled to or integrated into transfer mass 18882. Sonic energy transducer 18886 may be coupled to or integrated into sonic spreader 18884. The transfer mass may be adjusted to create and optimize resonance within desired transfer layer 18414. Sonic energy may be applied to anneal defects in desired transfer layer 18414. The exposed ("bottom") surface of desired transfer layer 18414 may be chemically mechanically polished (CMP) or otherwise smoothed (utilized methods herein or in U.S. patent application Ser. No. 13/099,010) before and/or after the defect anneal. The post defect anneal process may continue as described in FIG. 184.

Persons of ordinary skill in the art will appreciate that the illustrations in FIG. 188 are exemplary and are not drawn to scale and that modifications to the UST inventive embodiments may suggest themselves to such skilled persons. Such skilled persons will further appreciate that many variations may be possible such as, for example, the temperature of the layer or substrate being subjected to the UST may be less than about 250° C. or greater than about 400° C., up to and including about 900° C. Moreover, USTs may apply the sonic energy using planar deformation. Further, the UST transducers may utilize ring shaped piezoceramic construction which may produce radial oscillation modes. Furthermore, the UST frequency may be greater than 30 MHz, subject to transducer and transfer mass capability. Further, the applied UST power or intensity may be greater than 3 W/cm$^2$, subject to transducer and transfer mass capability. Moreover, a sonic spreader may not be necessary. Furthermore, processes other than process described in the FIG. 184 context and example above may be utilized, for example, FIG. 185, 186, 187. Many other modifications within the scope of the illustrated embodiments of the invention will suggest themselves to such skilled persons after reading this specification. Thus the invention is to be limited only by the appended claims.

Microwave radiation may be utilized for low temperature (overall wafer temperature less than about 400° C.) defect annealing and for low temperature (overall wafer temperature less than about 400° C.) dopant activation. In semiconductor materials, electrons move freely in response to the microwave electrical field and electric current results. The flow of the electrons will heat the material through resistive heating. The higher the resistance of the semiconductor material the higher the temperature it will reach. The average microwave power per unit volume is converted to heat; hence, a volumetric heating effect. An example of a commercial semiconductor material oriented microwave technology and machine is the Micro-Mode Microwave (M3) technology by DSG Technologies, Morgan Hill, Calif., USA, and may include reactor model Axom-200/300.

Low temperature (overall wafer temperature less than about 400° C.) dopant activation of ion-implanted dopants such as Arsenic may utilize microwave radiation exposures, such as, for example, a 4.2 kW M3 microwave applied for 10 minutes at about 400° C. wafer or substrate temperature. This technique may be utilized to create, for example, 3D or 2D DSS Schottky devices as described elsewhere herein.

Defect annealing of, for example, ion-implantation damage from ion-cut processes, may utilize microwave radiation exposures. The applied microwave power may typically be in the range of 1 kW to 10 kW, the duration may typically range from 1 minute to 20 minutes, and the wafer or substrate temperature may typically range from 200° C. to 700° C. This defect annealing process may be applied to standalone layers being layer transferred, for example, such as transfer layer 809 in FIG. 8C, or transferred silicon layer 1404 in FIG. 14, or transferred layer 2004 in FIG. 20, or n+ layer 6702 and p− layer 6703 in FIG. 67C, or the microwave defect annealing process may be applied to carrier wafer flows and transferred layers such as desired transfer layer 18414 in FIG. 148. Circuitry or other structures in the 3DIC stack that may need to be protected from the microwave radiation (whilst the desired transferred layer is being defect annealed or dopant activated) may be protected by a layer of conductive metal, such as, for example, copper or aluminum, which may be placed between the desired transferred layer and circuitry or other structures in the 3DIC stack, for example, the acceptor wafer circuitry and devices. The layer of conductive metal may be electrically floating, or may be electrically tied to the stack substrate or base wafer, and/or may be electrically tied to the machine ground.

Microwave radiation may also be utilized to cleave wafers or substrates at or near the ion-implanted layer demarcation plane as part of an ion-cut process.

Single beam and dual-beam laser spike anneals may be utilized for defect annealing and for dopant activation. The primary laser may be a high-power 10.6 μm-wavelength CO2 laser conditioned through a system of reflective optics to form a line beam at the layer, wafer, or substrate plane. P-polarization and Brewster angle may be controlled to minimize within-die reflectance variations and within-die temperature variations (pattern effects). The layer, wafer, or substrate may be sitting on a heated chuck, which scans the layer, wafer, or substrate under the CO2 laser beam. The annealing time, or dwell time, is defined as the duration for which a point on the silicon wafer is exposed to the beam, and can be varied by changing the stage speed. A single-beam laser spike anneal system may only use the primary CO2 laser. For the dual-beam laser spike anneal system, a secondary laser beam, or 'pre-heat beam', may be added. In general, the length of the preheat beam is the equal to or greater than the CO2 beam, and the width may be about an order of magnitude larger than that of the CO2 beam and may generally precede or partially overlap the CO2 beam. The secondary laser beam's dimensions, wavelength, angle, and polarization can be controlled and optimized for defect annealing or for dopant annealing/activation. An example of a commercial semiconductor material oriented single or dual-beam laser spike anneal technology and machine is the DB-LSA system of Ultratech Inc., San Jose, Calif., USA.

Dopant activation of ion-implanted dopants such as Boron may utilize a dual-beam laser spike exposure, such as, for example, a 800 microsecond primary CO2 dwell time, a pre-heat dwell time of 10 milliseconds, and a wafer or substrate chuck temperature of about 400° C. Forming nickel silicide, for example, may utilize lower chuck temperatures, such as 200° C., and lower preheat beam energies and dwell times, for example, 1 millisecond. This technique may be utilized to create, for example, 3D or 2D DSS Schottky devices as described elsewhere herein.

Defect annealing of, for example, ion-implantation damage from ion-cut processes, may utilize single or dual-beam laser spike anneal. The pre-heat dwell time may typically be about 5 milliseconds, and may be greater, and the wafer or substrate temperature may typically range from 200° C. to 700° C. for effective defect annealing. This defect annealing process may be applied to standalone layers being layer transferred, for example, such as transfer layer 809 in FIG. 8C, or transferred silicon layer 1404 in FIG. 14, or transferred layer 2004 in FIG. 20, or n+ layer 6702 and p− layer 6703 in FIG. 67C, or the single or dual-beam laser spike anneal defect annealing process may be applied to carrier wafer flows and transferred layers such as desired transfer layer 18414 in FIG. 148. Circuitry or other structures in the 3DIC stack that may need to be protected from the laser energy or heat (whilst the desired transferred layer is being defect annealed or dopant activated) may be protected by a layer or strips of optically reflective material, such as, for example, copper or aluminum, which may be placed between the desired transferred layer and circuitry or other structures in the 3DIC stack, for example, the acceptor wafer circuitry and devices. The thermal effect of the laser energy may be intentionally and may be locally enhanced, thus resulting in less exposure of sensitive portions of the 3D stack (such as acceptor wafer circuitry and interconnect) to the laser energy or thermal effects, by use optically absorptive materials, such as carbon, placed as layers or strips or portions of layers. These optically reflective and absorptive material uses are described in more detail elsewhere herein, for example, in relation to FIGS. 24E and 24E-1.

With reference to 'ion-cut' type layer transfer techniques, as defect production in the layer being implanted through, such as a desired (to be) transferred layer, may be approximately proportional to the ion dose, some embodiments of the invention minimize the ion implant dose that may be required for good cleaving (forming the layer transfer demarcation plane), and hence, lower the defect production.

The ion implant of an atomic species, such as Hydrogen, to create the damage regions approximately within the layer transfer demarcation plane may be implanted in two steps. First, the substrate being implanted may be heated to a temperature greater than about 100° C. and then a portion of the dose may be implanted. Then the substrate may be cooled and its temperature may be controlled to below about 50° C. for the remainder of the total dose of the implant. The high temp/low temp sequence reduces the temperature for cleaving, and may be traded for ion implant dose. For example, the same cleave temperature, such as about 350° C., that may be used for a single room temperature implant dose, may be similarly used for a two-step implantation, and may result in a significantly lower ion implant dose being required to promote a good cleave.

The angle of the ion implant with respect to the crystallographic orientation of the mono-crystalline material, such as, for example, single crystal silicon of <100> orientation, being implanted into may also be controlled so that knock-on collisions or influences will be minimized until near the ion stopping zone, the layer transfer demarcation plane. As well, the mono-crystalline substrate being implanted into may be cooled to within 50° C. of absolute zero to minimize atomic movement of the atoms in the crystalline substrate, and may minimize the atomic interactions between the ion implanted and atoms of the substrate until near the ion stopping zone.

Ion implantation damage from the ion-cut process may be avoided by thinning the layer transfer substrate of interest and implanting the atomic species, such as Hydrogen, from the backside (wafer or substrate side/face that is opposite of the face where the desired devices, circuitry, transfer layers reside. This thinning and ion-cut implanting from the back side is described in more detail elsewhere herein, for example, in relation to FIG. 93. As well, non-ion-cut methods may be utilized to layer transfer, such as described in FIG. 139 (buried oxide) and FIG. 140 (P+ doped layer etch stop).

The carrier wafer and ion-cut process flows and methods, for example, those described in FIGS. 184, 185, and 186, may be utilized to form many types of transistors on the desired transfer layer while still attached to the carrier wafer. An embodiment of the invention wherein the listed flows & methods may be utilized to form transistors may be described with FIG. 189.

As illustrated in FIG. 189, an exemplary transistor formation on desired transfer layer may be utilized in the process described in FIG. 184. After cleaving, defect annealed cleaved structure 18492 may include layer transfer substrate bonding oxide 18402, carrier substrate bonding oxide 18408, carrier substrate 18410, desired transfer layer 18414, and perforations 18412. Defect annealed cleaved structure 18492 may be annealed as described in FIG. 184. The exposed ("bottom") surface of desired transfer layer 18414 may be chemically mechanically polished (CMP) or otherwise smoothed (utilized methods herein or in U.S. patent application Ser. No. 13/099,010) before and/or after the defect anneal. Further processing may be done to create transistors and other semiconductor devices, for example, gate-last transistors, RCATs, MOSFET, and FinFets, in and above desired transfer layer 18414, thus forming transistor & device layer 18982. The maximum processing temperature may be about 1100° C. and may only be restricted by the thermal capability of the carrier substrate 18410 and the bonding. Thus device processed structure 18998 may be formed and may include transistor & device layer 18982, layer transfer substrate bonding oxide 18402, carrier substrate bonding oxide 18408, carrier substrate 18410, desired transfer layer 18414, and perforations 18412.

As illustrated in FIG. 189, device processed structure 18998 may proceed as described in FIG. 184 to form 3D stacked layers with carrier wafer structure 18494 and proceed as described in FIG. 184. Alternately, the transistor & device layer 18982 within desired transfer layer 18414 may be 'flipped' before bonding to acceptor wafer or substrate 18420 by attaching device processed structure 18998 to temporary carrier substrate 18990. The temporary attach and detach carrier process and procedures have been described in detail elsewhere herein. Carrier substrate 18410 with perforations 18412 may be debonded as described previously, such as in FIG. 148, and then desired transfer layer 18414 with transistor & device layer 18982 and temporary carrier substrate 18990 may be permanently bonded, for example with oxide to oxide bonding, to acceptor wafer or substrate 18420 utilizing acceptor bonding oxide 18418 and defect annealed cleaved structure bonding oxide 18416. Acceptor bonding oxide 18418 and defect annealed cleaved structure bonding oxide 18416 may be utilized as an isolation layer between desired transfer layer 18414 with transistor & device layer 18982 and acceptor wafer or substrate 18420. Temporary carrier substrate 18990 may be debonded/detached from desired transfer layer 18414 with transistor & device layer 18982, thus forming 3D stacked layers structure 18496, but now with transistor & device layer 18982. 3D stacked layers structure 18496 may continue 3D processing the defect annealed desired transfer layer 18414 with transistor & device layer 18982 and acceptor wafer or substrate 18420 including, but not limited to, the various embodiments described herein, such as stacking Si/SiO2 layers as in 3D DRAM, 3D NAND, or RRAM formation, RCAT formation, continuous array and FPGA structures, gate array, memory blocks, solar cell completion, or gate last transistor completion formation, and may include forming transistors, for example, CMOS p-type and n-type transistors. Continued 3D processing may include forming junction-less transistors, replacement gate transistors, thin-side-up transistors, double gate transistors, horizontally oriented transistors, finfet transistors, DSS Schottky transistors, and/or trench MOSFET transistors as described by various embodiments herein. Continued 3D processing may include the custom function etching for a specific use as described, for example, in FIG. 183 and FIG. 84, and may include etching to form scribelines or dice lines. Continued 3D processing may include etching to form memory blocks, for example, as described in FIGS. 195, 196, 205-210. Continued 3D processing may include forming metal interconnects, such as, for example, aluminum or copper, within or on top of the defect annealed desired transfer layer 18414, and may include forming connections paths from transistors and transistor contacts within desired transfer layer 18414 to acceptor substrate circuitry or metal strips/pads within acceptor wafer or substrate 18420, by forming, for example, TLVs or TSVs. Continued 3D processing may include custom function etching of continuous array structures as described herein, with reference to FIG. 183 & FIG. 84 discussions and illustrations and may include etching to form scribelines or dice lines. Continued 3D processing may include etching to form memory blocks, for example, as described in FIGS. 195, 196, 205-210. Thermal contacts which may conduct heat but not electricity may be formed and utilized as described in FIG. 162 through FIG. 166. Carrier substrate 18410 with perforations 18412 may be used again ('reused' or 'recycled') for the defect anneal process flow.

Persons of ordinary skill in the art will appreciate that the illustrations in FIG. 189 are exemplary and are not drawn to scale. Such skilled persons will further appreciate that many variations may be possible such as, for example, perforations 18412 may evenly cover the entire surface of perforated carrier substrate 18400 with substantially equal distances between perforations 18412, or may have unequal spacing and coverage, such as, less or more density of perforations 18412 near the wafer edge. Moreover, perforations 18412 may extend substantially through carrier substrate 18410 and not extend through carrier substrate bonding oxide 18408. Further, perforations 18412 may be formed in perforated carrier substrate 18400 by methods, for example, such as laser drilling or ion etching, such as Reactive Ion Etching (RIE). Moreover, the cross sectional cut shape of perforations 18412 may be tapered, with the widest diameter of the perforation towards where the etchant may be supplied, which may be accomplished by, for example, inductively coupled plasma (ICP) etching or vertically controlled shaped laser drilling. Further, perforations 18412 may have top view shapes other than circles; they may be oblong, ovals, squares, or rectangles for example, and may not be of uniform shape across the face of perforated carrier substrate 18400. Furthermore, perforations 18412 may include a material coating, such as thermal oxide, to enhance wicking of the debond/release etchant, and may include micro-roughening of the perforation interiors, by methods such as plasma or wet silicon etchants or ion bombardment, to enhance wicking of the debond/release etchant. Moreover, the thickness of carrier substrate 18410, such as, for example, the 750 micron nominal thickness of a 300 mm single crystal silicon wafer, may be adjusted to optimize the technical and operational trades of attributes such as, for example, debond etchant access and debond time, strength of carrier substrate 18410 to withstand thin film stresses, CMP shear forces, and the defect anneal thermal stresses, carrier substrate 18410 reuse/recycling lifetimes, and so on. Furthermore, preparation of desired layer transfer substrate 18404 for layer transfer may utilize flows and processes described herein this document. Moreover, bonding methods other than oxide to oxide, such as oxide to metal (Titanium/TiN) to oxide, or nitride to oxide, may be utilized. Further, acceptor wafer or substrate 18420 may include a wide variety of materials and constructions, for example, from undoped or doped single crystal silicon to 3D substacks. Furthermore, the exposed ("bottom") surface of desired transfer layer 18414 may be smoothed with techniques such as gas cluster ion beams, or radical oxidations utilizing, for example, the TEL SPA tool. Further, the exposed ("bottom") surface of desired transfer layer 18414 may be smoothed with "epi smoothing' techniques, whereby, for example, high temperature (about 900-1250° C.) etching with hydrogen or HCL may be coupled with epitaxial deposition of silicon. Moreover, the bond release etchant may include plasma etchant chemistries that are selective etchants to oxide and not silicon, such as, for example, CHF3 plasmas. Furthermore, a combination of etchant release and mechanical force may be employed to debond/release the carrier substrate 18410 from acceptor wafer or substrate 18420 and desired transfer layer 18414. Moreover, carrier substrate 18410 may be thermally oxidized before and/or after deposition of carrier substrate bonding oxide 18408 and/or before and/or after perforations 18412 are formed. Further, the total oxide thickness of carrier substrate bonding oxide 18408 plus layer transfer substrate bonding oxide 18402 may be adjusted to make technical and operational trades between attributes, for example, such as debond time, carrier wafer perforation spacing, and thin film stress, and the total oxide thickness may be about 1 micron or about 2 micron or about 5 microns or less than 1 micron. Moreover, the composition of carrier substrate bonding oxide 18408 and layer transfer substrate bonding oxide 18402 may be varied to increase lateral etch time; for example, by changing the vertical and/or lateral oxide density and/or doping with dopants carbon, boron, phosphorous, or by deposition rate and techniques such as PECVD, SACVD, APCVD, SOG spin & cure, and so on. Furthermore, carrier substrate bonding oxide 18408 and layer transfer substrate bonding oxide 18402 may include multiple layers of oxide and types of oxides (for example 'low-k'), and may have other thin layers inserted, such as, for example, silicon nitride, to speed lateral etching in HF solutions, or Titanium to speed lateral etch rates in hydrogen peroxide solutions. Further, the wafer edge sidewalls of acceptor bonding oxide 18418 and defect annealed cleaved structure bonding oxide 18416 may not need debond/release etchant protection; depending on the design and placement of perforations 18412, design/layout keep-out zones and edge bead considerations, and the type of debond/release etchant, the wafer edge undercut may not be harmful. Moreover, a debond/release etchant resistant material, such as silicon nitride, may be deposited over substantially all or some of the exposed surfaces of acceptor wafer or substrate 18420 prior to deposition of acceptor bonding oxide 18418. Further, desired layer transfer substrate 18404 may be an SOI or GeOI substrate base and, for example, an ion-cut process may be used to form layer transfer demarcation plane 18406 in the bulk substrate of the SOI wafer and cleaving proceeds as described in FIG. 184, or after bonding with the carrier the SOI wafer may be sacrificially etched/CMP'd off with no ion-cut implant and the damage repair may not be needed (described elsewhere herein). Many other modifications within the scope of the illustrated embodiments of the invention will suggest themselves to such skilled persons after reading this specification. Thus the invention is to be limited only by the appended claims.

FIG. 194 illustrates an embodiment of the invention wherein sub-threshold circuits may be stacked above or below a logic chip layer. The 3DIC illustrated in FIG. 194 may include input/output interconnect 19408, such as, for example, solder bumps and a packaging substrate 19402, logic layer 19406, and sub-threshold circuit layer 19404. The 3DIC may place logic layer 19406 above sub-threshold circuit layer 19404 and they may be connected with through layer vias (TLVs) as described elsewhere herein. Alternatively, the logic and sub-threshold layers may be swapped in position, for example, logic layer 19406 may be a sub-threshold circuit layer and sub-threshold circuit layer 19404 may be a logic layer. The sub-threshold circuit layer 19404 may include repeaters of a chip with level shifting of voltages done before and after each repeater stage or before and after some or all of the repeater stages in a certain path are traversed. Alternatively, the sub-threshold circuit layer may be used for SRAM. Alternatively, the sub-threshold circuit layer may be used for some part of the clock distribution, such as, for example, the last set of buffers driving latches in a clock distribution. Although the term sub-threshold is used for describing elements in FIG. 194, it will be obvious to one skilled in the art that similar approaches may be used when supply voltage for the stacked layers is slightly above the threshold voltage values and may be utilized to increase voltage toward the end of a clock cycle for a better latch. In addition, the sub-threshold circuit layer stacked above or below the logic layer may include optimized transistors that may have lower capacitance, for example, if it is used for clock distribution purposes.

FIG. 195 illustrates an exemplary top view of a prior art 2D integrated circuit 19506 which may have logic circuits 19504 (such as, for example, arithmetic logic units, instruction fetch units, and instruction decode units) as well as memory circuits such as SRAM blocks 19502. The SRAM blocks 19502 may be concentrated in one area of the chip (shown) or there may be significant amounts of SRAM in multiple areas of the chip. Typically, in many 2D integrated circuits, embedded memory blocks such as SRAM may consume a bigger percentage of chip area with every successive technology generation. Furthermore, some chips may use DRAM as an embedded memory in addition to SRAM or in place of SRAM. Hence, substantially all or portions of SRAM blocks 19502 may include DRAM memory.

FIG. 196 shows a prior art illustration of embedded memory that may be in a 3D stacked layer above or below a logic chip and may be electrically connected to the logic chip using through-silicon via (TSV) technology. With TSV technology, two chips or wafers or transistor layers may be constructed separately, and then may be attached to each other using bonding and electrical vertical connections between the two chips or wafers or transistor layers may be made with through-silicon vias (TSVs). This type of configuration may allow embedded memory to be built with its own optimized technology and the logic chip to be built with its own optimized technology, thereby potentially improving the system. The embedded memory could be a volatile memory such as DRAM and/or SRAM, or any other type of memory, such as non-volatile memory (NVM). The example illustrated in FIG. 196 may include transistor regions of a top chip 19602, interconnect dielectric regions of a top chip 19604, metal interconnect regions of a top chip 19606, solder bumps of a top chip 19608, interconnect dielectric regions of a bottom chip 19614, metal interconnect regions of a bottom chip 19616, through-silicon via 19612, dielectric regions surrounding a through-silicon via 19610, solder bumps of a bottom chip 19618, transistor regions of a bottom chip 19622, and packaging substrate 19620. The top chip may be a DRAM chip and the bottom chip may be a logic chip. Alternatively, the top chip may be a logic chip and the bottom chip may be a DRAM chip. Alternatively, SRAM may be used instead of DRAM in these configurations. The embedded memory elements such as DRAM may be built with an optimized for DRAM technology and may have optimized transistors, interconnect layers and other components such as capacitors.

FIG. 197 illustrates an embodiment of the invention, wherein monolithic 3D DRAM constructed with lithography steps shared among multiple memory layers may be stacked above or below a logic chip. DRAM, as well as SRAM and floating body DRAM, may be considered volatile memory, whereby the memory state may be substantially lost when supply power is removed. Monolithic 3D DRAM constructed with lithography steps shared among multiple memory layers (henceforth called M3DDRAM-LSSAMML) could be constructed using techniques, for example, described in co-pending published patent application 2011/0121366 (FIG. 98A-H to FIG. 100A-L). One configuration for 3D stack M3DDRAM-LSSAMML and logic 19710 may include logic chip 19704, M3DDRAM-LSSAMML chip 19706, solder bumps 19708, and packaging substrate 19702. M3DDRAM-LSSAMML chip 19706 may be placed above logic chip 19704, and logic chip 19704 may be coupled to packaging substrate 19702 via solder bumps 19708. A portion of or substantially the entirety of the logic chip 19704 and the M3DDRAM-LSSAMML chip 19706 may be processed separately on different wafers and then stacked atop each other using, for example, through-silicon via (TSV) stacking technology. This stacking may be done at the wafer-level or at the die-level or with a combination. Logic chip 19704 and the M3DDRAM-LSSAMML chip 19706 may be constructed in a monocrystalline layer or layers respectively. Another configuration for 3D stack M3DDRAM-LSSAMML and logic 19720 may include logic chip 19716, M3DDRAM-LSSAMML chip 19714, solder bumps 19718 and packaging substrate 19712. Logic chip 19716 may be placed above M3DDRAM-LSSAMML chip 19714, and M3DDRAM-LSSAMML chip 19714 may be coupled to packaging substrate 19712 via solder bumps 19718. A portion of or substantially the entirety of the logic chip 19716 and the M3DDRAM-LSSAMML chip 19714 may be processed separately on different wafers and then stacked atop each other using, for example, through-silicon via (TSV) stacking technology. This stacking may be done at the wafer-level or at the die-level or with a combination. The transistors in the monocrystalline layer or layers may be horizontally oriented, i.e., current flowing in substantially the horizontal direction in transistor channels, substantially between drain and source, which may be parallel to the largest face of the substrate or wafer. The source and drain of the horizontally oriented transistors may be within the same monocrystalline layer. A transferred monocrystalline layer may have a thickness of less than about 150 nm.

FIG. 198A-G illustrates an embodiment of the invention, wherein logic circuits and logic regions, which may be constructed in a monocrystalline layer, may be monolithically stacked with monolithic 3D DRAM constructed with lithography steps shared among multiple memory layers (M3DDRAM-LSSAMML), the memory layers or memory regions may be constructed in a monocrystalline layer or layers. The process flow for the silicon chip may include the following steps that may be in sequence from Step (1) to Step (5). When the same reference numbers are used in different drawing figures (among FIG. 198A-G), they may be used to indicate analogous, similar or identical structures to enhance the understanding of the invention by clarifying the relationships between the structures and embodiments presented in the various diagrams—particularly in relating analogous, similar or identical functionality to different physical structures.

Figure 198A:
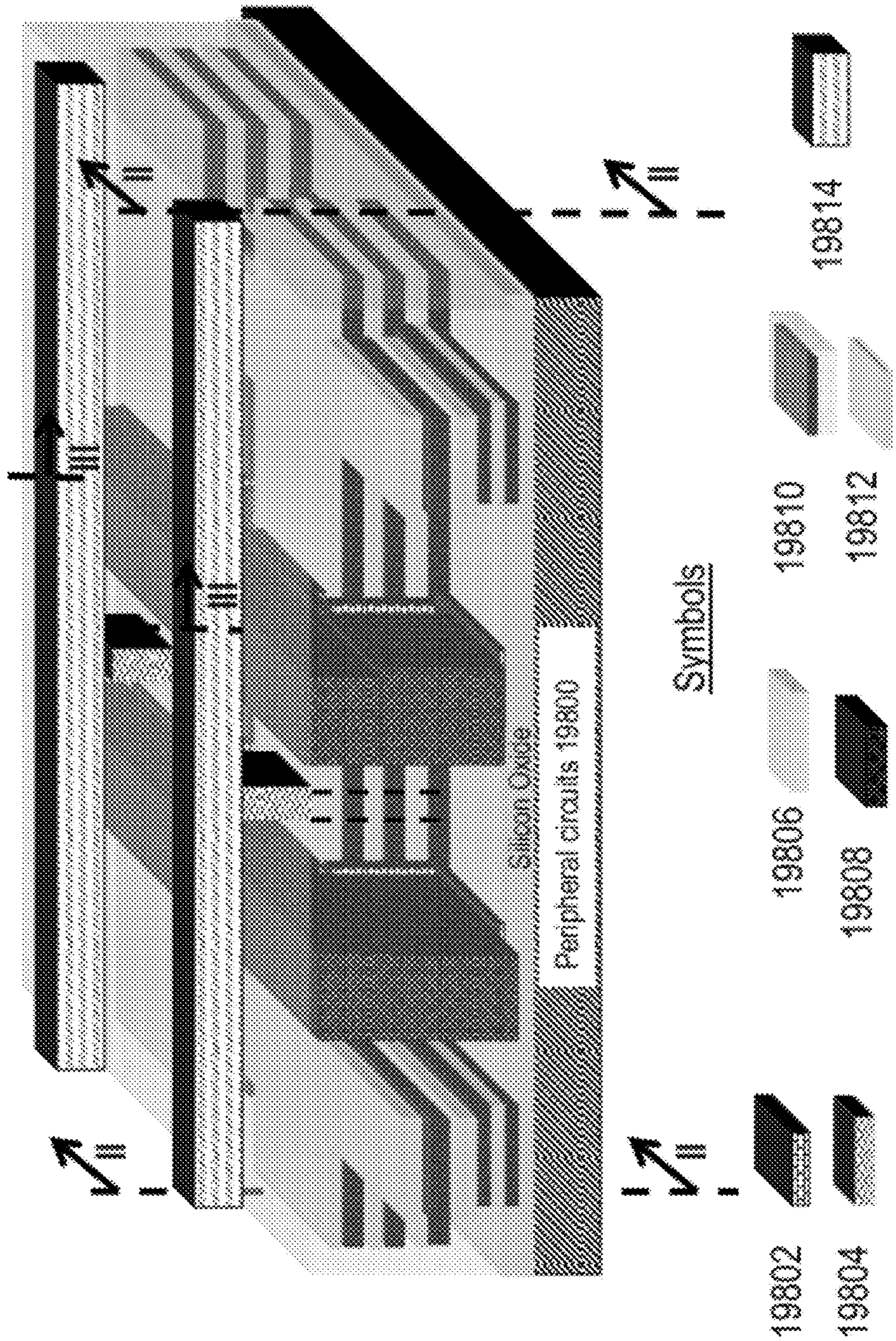
Figure 198B:
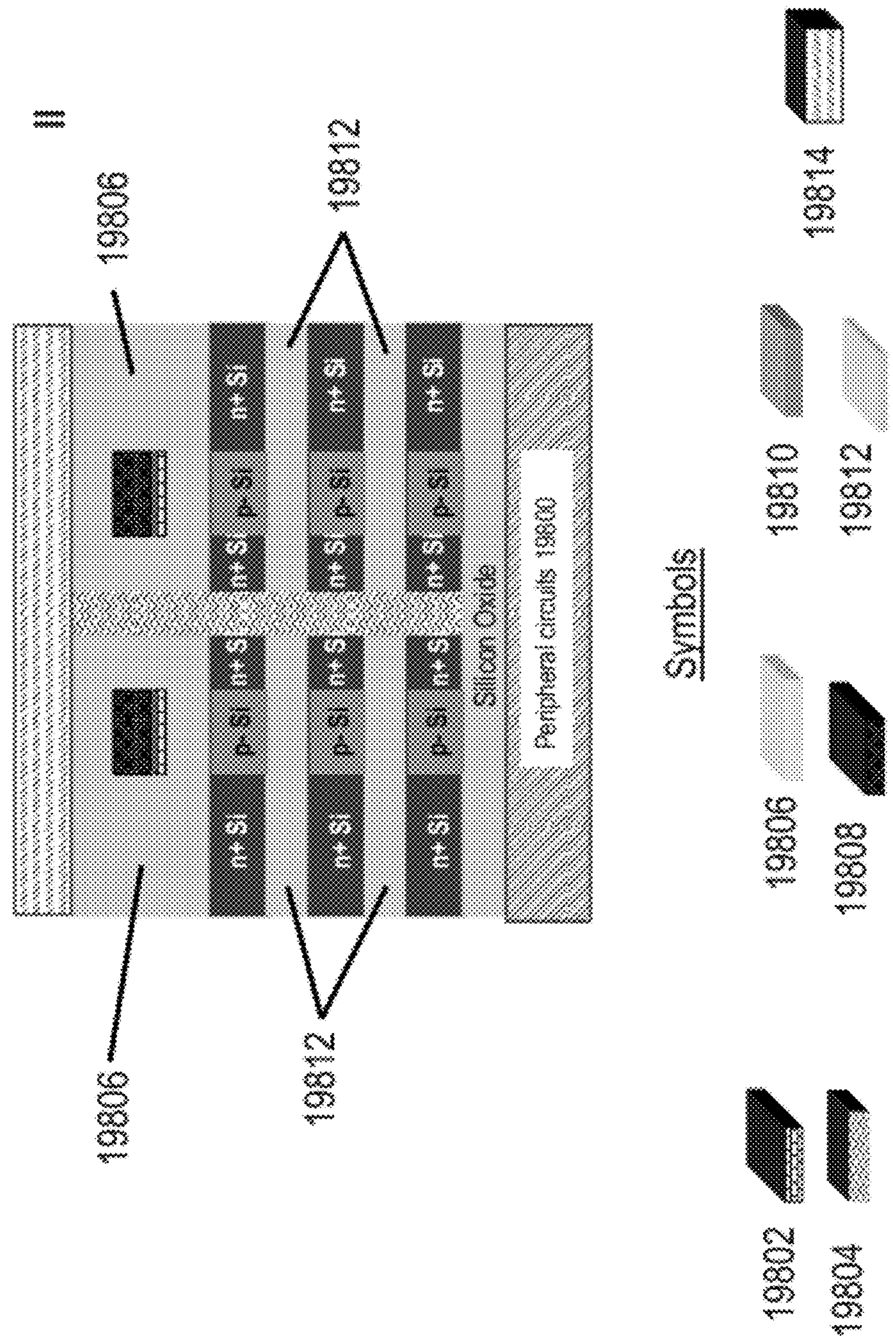
Figure 198C:
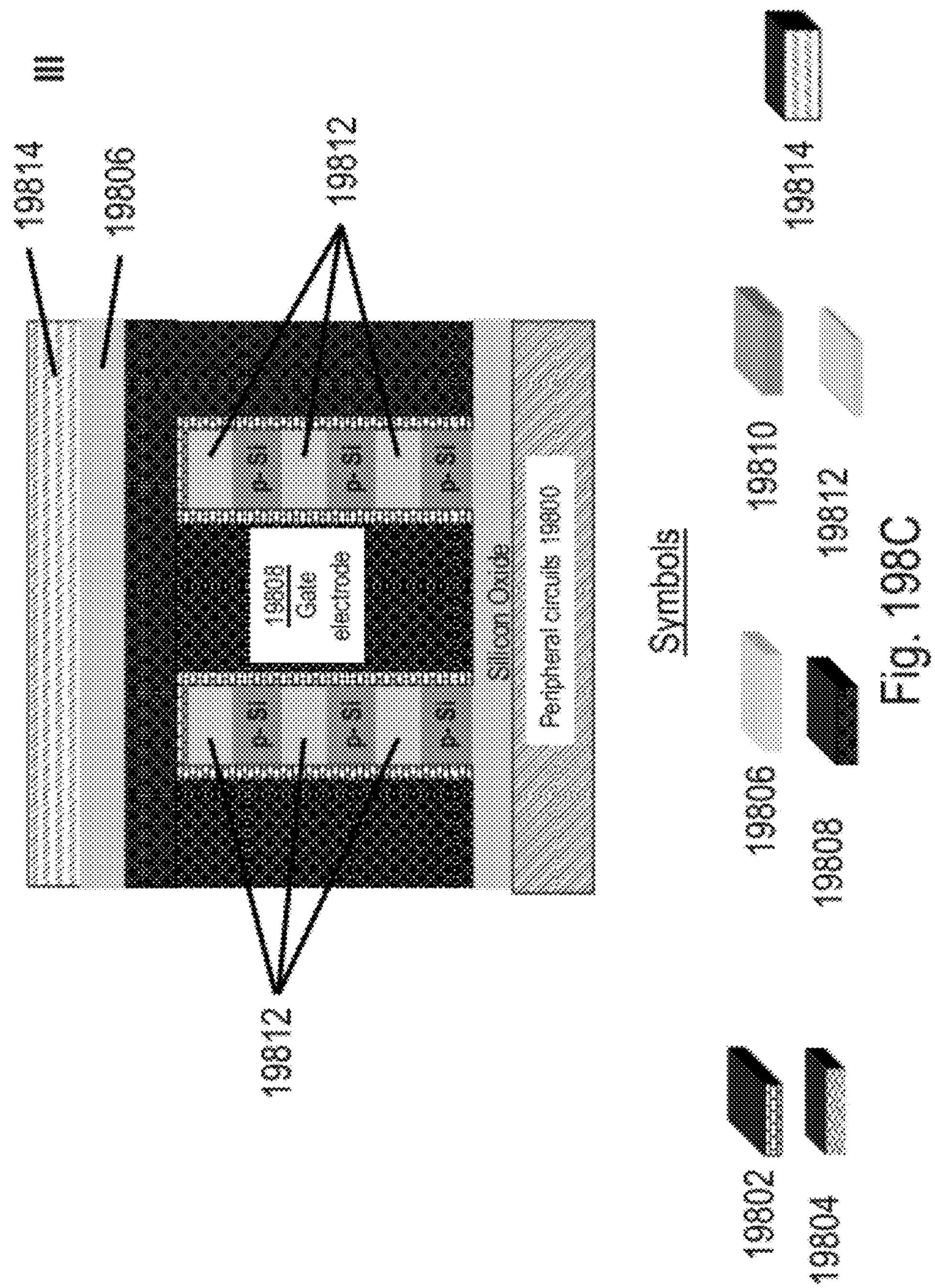
Figure 198D:
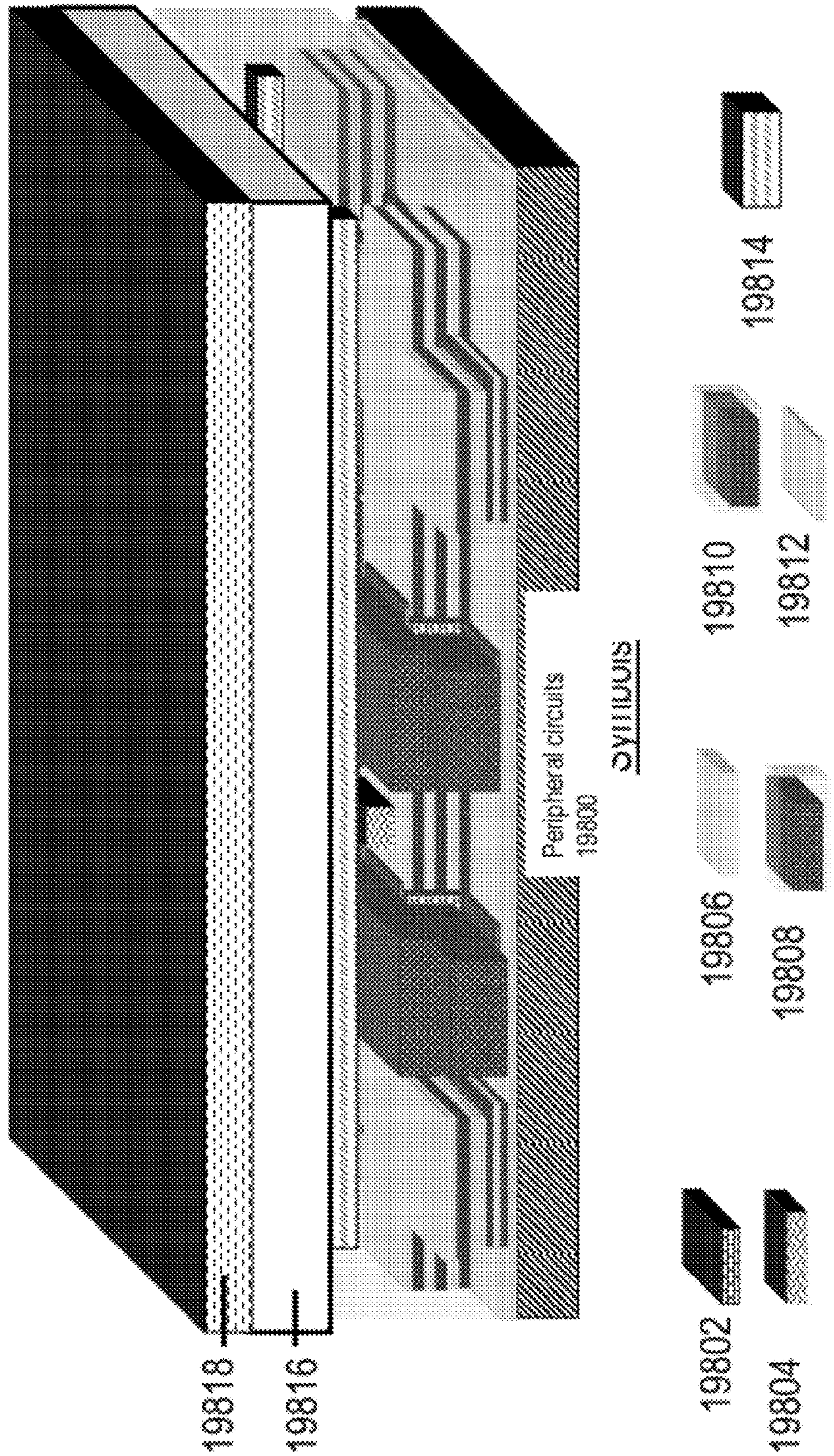
Figure 198E:
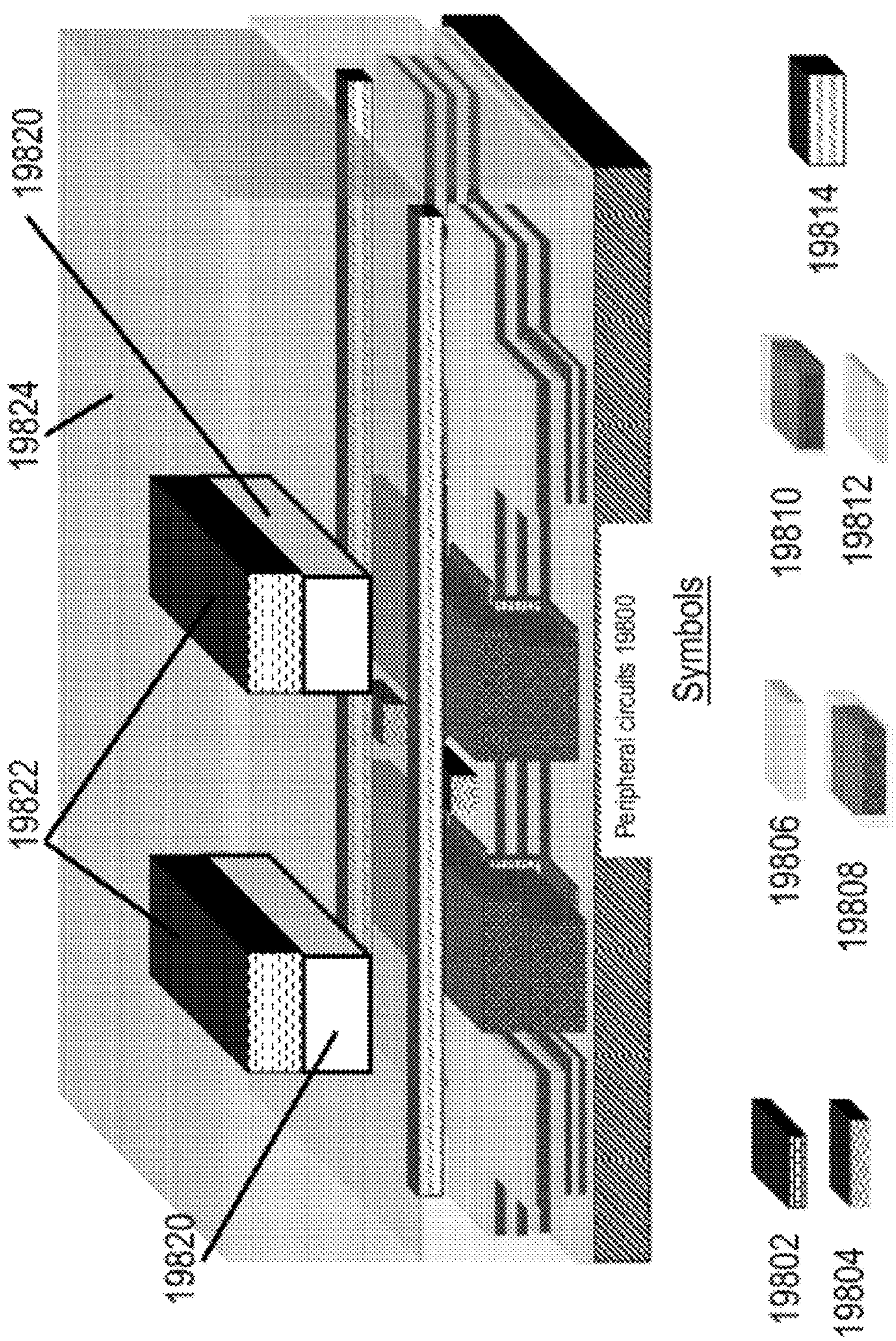

Step (1): This may be illustrated with FIG. 198A-C. FIG. 198A illustrates a three-dimensional view of an exemplary M3DDRAM-LSSAMML that may be constructed using techniques described in patent application 2011/0121366 (FIG. 98A-H to FIG. 100A-L). FIG. 198B illustrates a cross-sectional view along the II direction of FIG. 198A while FIG. 198C illustrates a cross-sectional view along the III direction of FIG. 198A. The legend of FIG. 198A-C may include gate dielectric 19802, conductive contact 19804, silicon dioxide 19806 (nearly transparent for illustrative clarity), gate electrode 19808, n+ doped silicon 19810, silicon dioxide 19812, and conductive bit lines 19814. The conductive bit lines 19814 may include metals, such as copper or aluminum, in their construction. The M3DDRAM-LSSAMML may be built on top of and coupled with vertical connections to peripheral circuits 19800 as described in patent application 2011/0092030. The DRAM may operate using the floating body effect. Further details of this constructed M3DDRAM-LSSAMML are provided in patent application 2011/0121366 (FIG. 98A-H to FIG. 100A-L).

Step (2): This may be illustrated with FIG. 198D. Activated p Silicon layer 19816 and activated n+ Silicon layer 19818 may be transferred atop the structure shown in FIG. 198A using a layer transfer technique, such as, for example, ion-cut. P Silicon layer 19816 and n+ Silicon layer 19818 may be constructed from monocrystalline silicon. Further details of layer transfer techniques and procedures are provided in patent application 2011/0121366. A transferred monocrystalline layer, such as silicon layer 19818, may have a thickness of less than about 150 nm.

Step (3): This may be illustrated with FIG. 198E. The p Silicon layer 19816 and the n+ Silicon layer 19818 that were shown in FIG. 198D may be lithographically defined and then etched to form monocrystalline semiconductor regions including p Silicon regions 19820 and n+ Silicon regions 19822. Silicon dioxide 19824 (nearly transparent for illustrative clarity) may be deposited and then planarized for dielectric isolation amongst adjacent monocrystalline semiconductor regions.

Figure 198F:
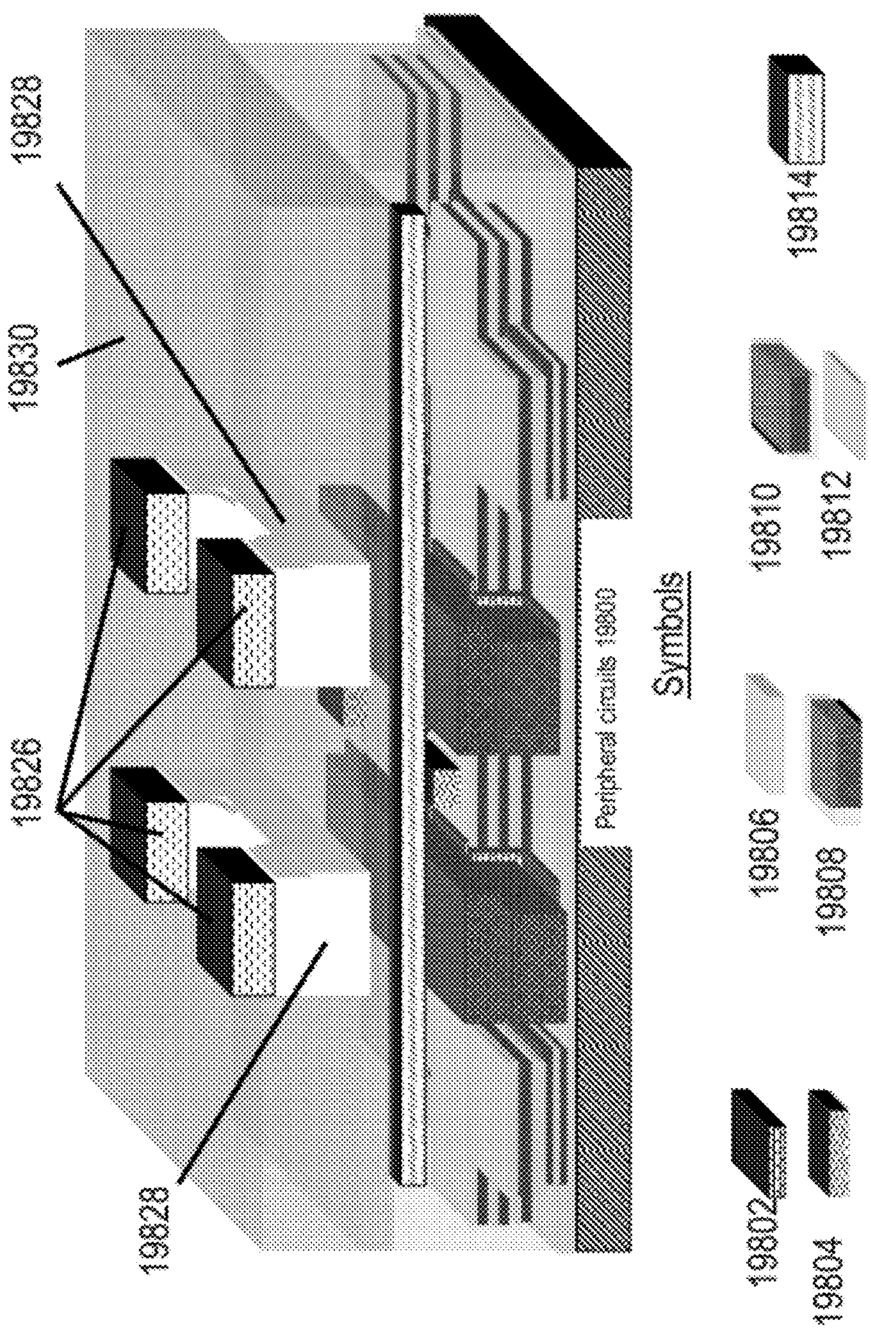
Figure 198G:
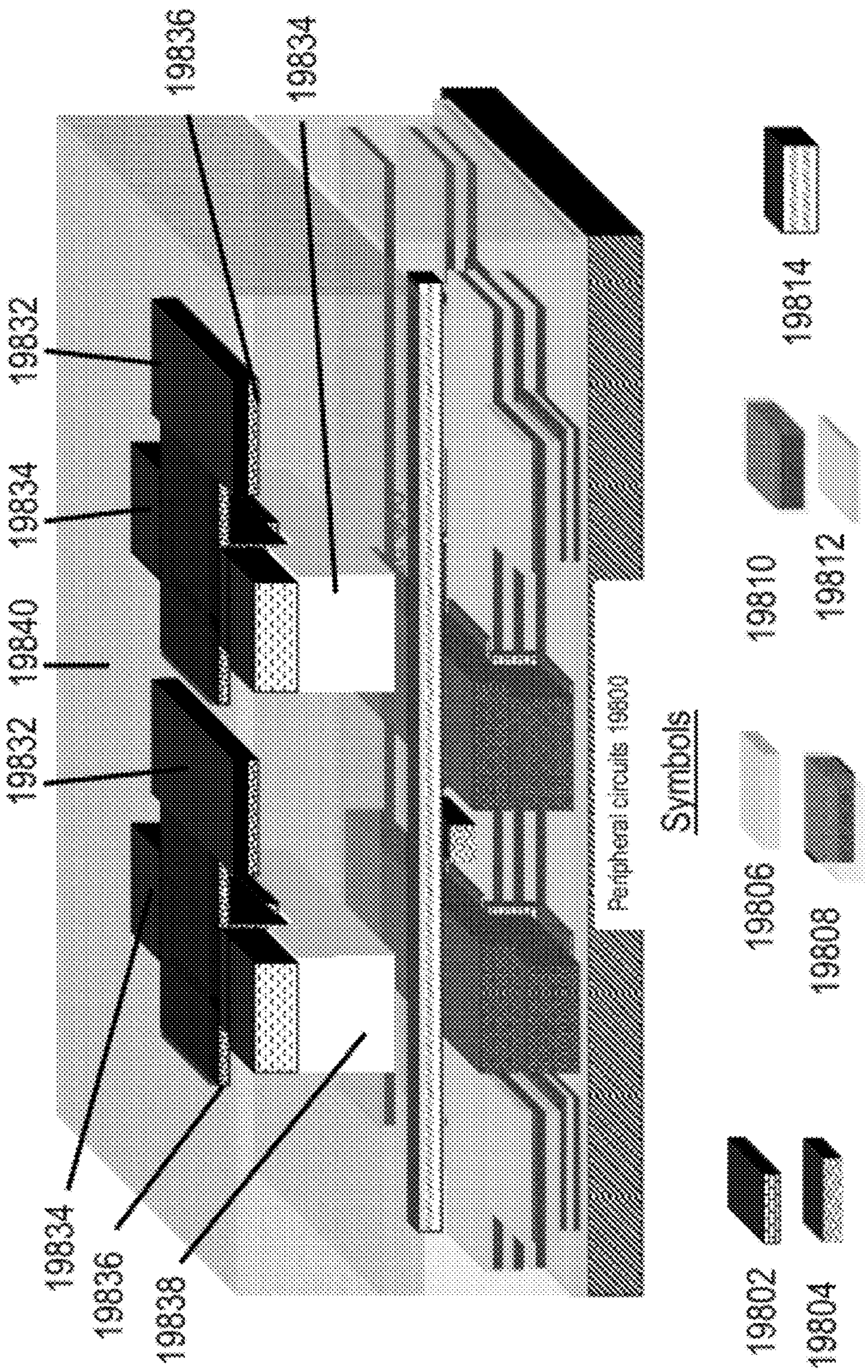

Step (4): This may be illustrated with FIG. 198F. The p Silicon regions 19820 and the n+ Silicon regions 19822 of FIG. 198E may be lithographically defined and etched with a carefully tuned etch recipe, thus forming a recessed channel structure such as shown in FIG. 198F and may include n+ source and drain Silicon regions 19826, p channel Silicon regions 19828, and oxide regions 19830 (nearly transparent for illustrative clarity). Clean processes may then be used to produce a smooth surface in the recessed channel.

Step (5): This may be illustrated with FIG. 198G. A low temperature (less than about 400° C.) gate dielectric and gate electrode, such as hafnium oxide and TiAlN respectively, may be deposited into the etched regions in FIG. 198F. A chemical mechanical polish process may be used to planarize the top of the gate stack. Then a lithography and etch process may be used to form the pattern shown in FIG. 198G, thus forming recessed channel transistors that may include gate dielectric regions 19836, gate electrode regions 19832, silicon dioxide regions 19840 (nearly transparent for illustrative clarity), n+ Silicon source and drain regions 19834, and p Silicon channel and body regions 19838.

A recessed channel transistor for logic circuits and logic regions may be formed monolithically atop a M3DDRAM-LSSAMML using the procedure shown in Step (1) to Step (5). The processes described in Step (1) to Step (5) do not expose the M3DDRAM-LSSAMML, and its associated metal bit lines 19814, to temperatures greater than about 400° C.

Persons of ordinary skill in the art will appreciate that the illustrations in FIGS. 198A through 198G are exemplary only and are not drawn to scale. Such skilled persons will further appreciate that many variations may be possible such as, for example, the recessed channels etched in FIG. 198F may instead be formed before p Silicon layer 19816 and n+ Silicon layer 19818 may be etched to form the dielectric isolation and p Silicon regions 19820 and n+ Silicon regions 19822. Moreover, various types of logic transistors can be stacked atop the M3DDRAM-LSSAMML without exposing the M3DDRAM-LSSAMML to temperatures greater than about 400° C., such as, for example, junction-less transistors, dopant segregated Schottky source-drain transistors, V-groove transistors, and replacement gate transistors. This is possible using procedures described in patent application 2011/0121366 (FIG. 98A-H to FIG. 100A-L). The memory regions may have horizontally oriented transistors and vertical connections between the memory and logic layers may have a radius of less than about 100 nm. These vertical connections may be vias, such as, for example, thru layer vias (TLVs), through the monocrystalline silicon layers connecting the stacked layers, for example, logic circuit regions within one monocrystalline layer to memory regions within another monocrystalline layer. Additional (eg. third or fourth) monocrystalline layers that may have memory regions may be added to the stack. Decoders and other driver circuits of said memory may be part of the stacked logic circuit layer or logic circuit regions. The memory regions may have replacement gate transistors, recessed channel transistors (RCATs), side-gated transistors, junction-less transistors or dopant-segregated Schottky Source-Drain transistors, which may be constructed using techniques described in patent applications 20110121366 and Ser. No. 13/099,010. Many other modifications within the scope of the illustrated embodiments of the invention will suggest themselves to such skilled persons after reading this specification. Thus the invention is to be limited only by the appended claims.

FIG. 199 illustrates an embodiment of the invention wherein different configurations for stacking embedded memory with logic circuits and logic regions may be realized. One stack configuration 19910 may include embedded memory solution 19906 made in a monocrystalline layer monolithically stacked atop the logic circuits 19904 made in a monocrystalline layer using monolithic 3D technologies and vertical connections described in patent applications 20110121366 and Ser. No. 13/099,010. Logic circuits 19904 may include metal layer or layers which may include metals such as copper or aluminum. Stack configuration 19910 may include input/output interconnect 19908, such as, for example, solder bumps and a packaging substrate 19902. Another stack configuration 19920 may include the logic circuits 19916 monolithically stacked atop the embedded memory solution 19914 using monolithic 3D technologies described in patent applications 20110121366 and Ser. No. 13/099,010. Embedded memory solution 19914 may include metal layer or layers which may include metals such as copper or aluminum. Stack configuration 19920 may include an input/output interconnect 19918, such as, for example, solder bumps and a packaging substrate 19912. The embedded memory solutions 19906 and 19914 may be a volatile memory, for example, SRAM. In this case, the transistors in SRAM blocks associated with embedded memory solutions 19906 and 19914 may be optimized differently than the transistors in logic circuits 19904 and 19916, and may, for example, have different threshold voltages, channel lengths and/or other parameters. The embedded memory solutions 19906 and 19914, if constructed, for example, as SRAM, may have, for example, just one device layer with 6 or 8 transistor SRAM. Alternatively, the embedded memory solutions 19906 and 19914 may have two device layers with pMOS and nMOS transistors of the SRAM constructed in monolithically stacked device layers using techniques described patent applications 20110121366 and Ser. No. 13/099,010. The transistors in the monocrystalline layer or layers may be horizontally oriented, i.e., current flowing in substantially the horizontal direction in transistor channels, substantially between drain and source, which may be parallel to the largest face of the substrate or wafer. The source and drain of the horizontally oriented transistors may be within the same monocrystalline layer. A transferred monocrystalline layer, such as logic circuits 19904, may have a thickness of less than about 150 nm.

Persons of ordinary skill in the art will appreciate that the illustrations in FIG. 199 are exemplary only and are not drawn to scale. Such skilled persons will further appreciate that many variations may be possible such as, for example, the embedded memory solutions 19906 and 19914, if constructed, for example, as SRAM, may be built with three monolithically stacked device layers for the SRAM with architectures similar to "The revolutionary and truly 3-dimensional 25F2 SRAM technology with the smallest S3 (stacked single-crystal Si) cell, 0.16 um2, and SSTFT (stacked single-crystal thin film transistor) for ultra high density SRAM", Symposium on VLSI Technology, 2004 by Soon-Moon Jung, et al. but implemented with technologies described in patent applications 20110121366 and Ser. No. 13/099,010. Moreover, the embedded memory solutions 19906 and 19914 may be embedded DRAM constructed with stacked capacitors and transistors. Further, the embedded memory solutions 19906 and 19914 may be embedded DRAM constructed with trench capacitors and transistors. Moreover, the embedded memory solutions 19906 and 19914 may be capacitor-less floating-body RAM. Further, the embedded memory solutions 19906 and 19914 may be a resistive memory, such as RRAM, Phase Change Memory or MRAM. Furthermore, the embedded memory solutions 19906 and 19914 may be a thyristor RAM. Moreover, the embedded memory solutions 19906 and 19914 may be a flash memory. Furthermore, embedded memory solutions 19906 and 19914 may have a different number of metal layers and different sizes of metal layers compared to those in logic circuits 19904 and 19916. This is because memory circuits typically perform well with fewer numbers of metal layers (compared to logic circuits). Many other modifications within the scope of the illustrated embodiments of the invention described herein will suggest themselves to such skilled persons after reading this specification. Thus the invention is to be limited only by the appended claims.

Many of the configurations described with FIG. 199 may represent an integrated device that may have a first monocrystalline layer that may have logic circuit layers and/or regions and a second monolithically stacked monocrystalline layer that may have memory regions. The memory regions may have horizontally oriented transistors and vertical connections between the memory and logic layers may have a radius of less than 100 nm. These vertical connections may be vias, such as, for example, thru layer vias (TLVs), through the monocrystalline silicon layers connecting the stacked layers, for example, logic circuit regions within one monocrystalline layer to memory regions within another monocrystalline layer. Additional (eg. third or fourth) monocrystalline layers that may have memory regions may be added to the stack. Decoders and other driver circuits of said memory may be part of the stacked logic circuit layer or logic circuit regions. The memory regions may have replacement gate transistors, recessed channel transistors (RCATs), side-gated transistors, junction-less transistors or dopant-segregated Schottky Source-Drain transistors, which may be constructed using techniques described in patent applications 20110121366 and Ser. No. 13/099,010.

FIG. 200A-J illustrates an embodiment of the invention, wherein a horizontally-oriented monolithic 3D DRAM array may be constructed and may have a capacitor in series with a transistor selector. No mask may utilized on a "per-memory-layer" basis for the monolithic 3D DRAM shown in FIG. 200A-J, and substantially all other masks may be shared among different layers. The process flow may include the following steps which may be in sequence from Step (A) to Step (H). When the same reference numbers are used in different drawing figures (among FIG. 200A-J), the reference numbers may be used to indicate analogous, similar or identical structures to enhance the understanding of the invention by clarifying the relationships between the structures and embodiments presented in the various diagrams—particularly in relating analogous, similar or identical functionality to different physical structures.

Figure 200A:
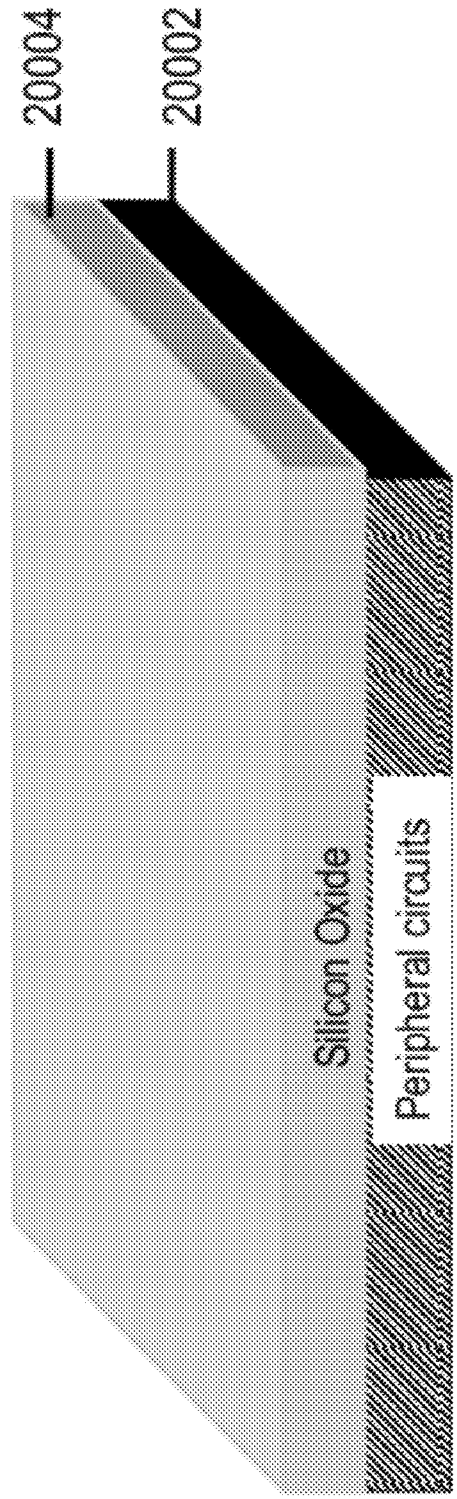

Step (A): Peripheral circuits 20002, which may include high temperature wiring, made with metals such as, for example, tungsten, and which may include logic circuit regions, may be constructed. Oxide layer 20004 may be deposited above peripheral circuits 20002. FIG. 200A shows a drawing illustration after Step (A).

Figure 200B:
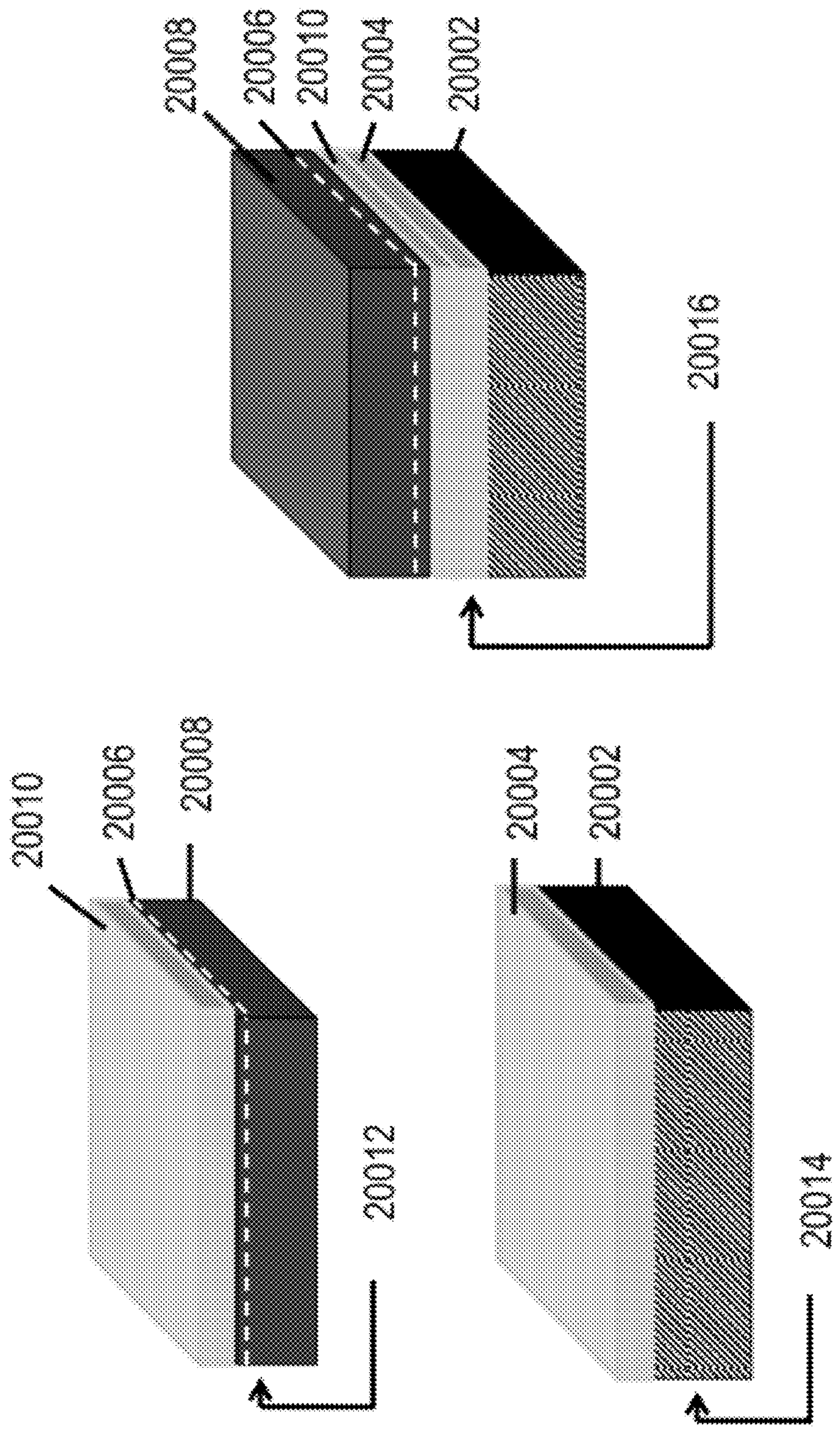

Step (B): FIG. 200B illustrates the structure after Step (B). N+ Silicon wafer 20008 may have an oxide layer 20010 grown or deposited above it. Hydrogen may be implanted into the n+ Silicon wafer 20008 to a certain depth indicated by hydrogen plane 20006. Alternatively, some other atomic species, such as Helium, may be (co-)implanted. Thus, top layer 20012 may be formed. The bottom layer 20014 may include the peripheral circuits 20002 with oxide layer 20004. The top layer 20012 may be flipped and bonded to the bottom layer 20014 using oxide-to-oxide bonding to form top and bottom stack 20016.

Figure 200C:
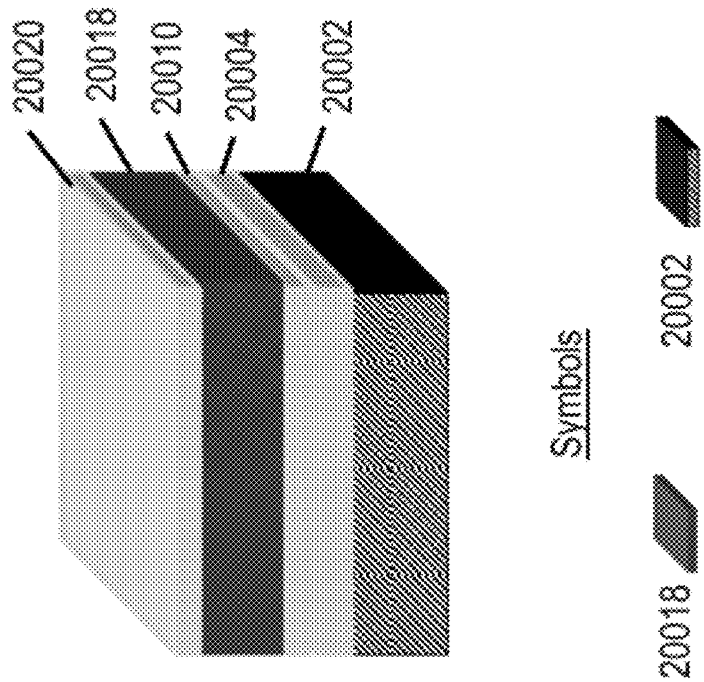

Step (C): FIG. 200C illustrates the structure after Step (C). The top and bottom stack 20016 may be cleaved at the hydrogen plane 20006 using methods including, for example, a thermal anneal or a sideways mechanical force. A CMP process may be conducted. Thus n+ Silicon layer 20018 may be formed. A layer of silicon oxide 20020 may be deposited atop the n+ Silicon layer 20018. At the end of this step, a single-crystal n+ Silicon layer 20018 may exist atop the peripheral circuits 20002, and this has been achieved using layer-transfer techniques.

Figure 200D:
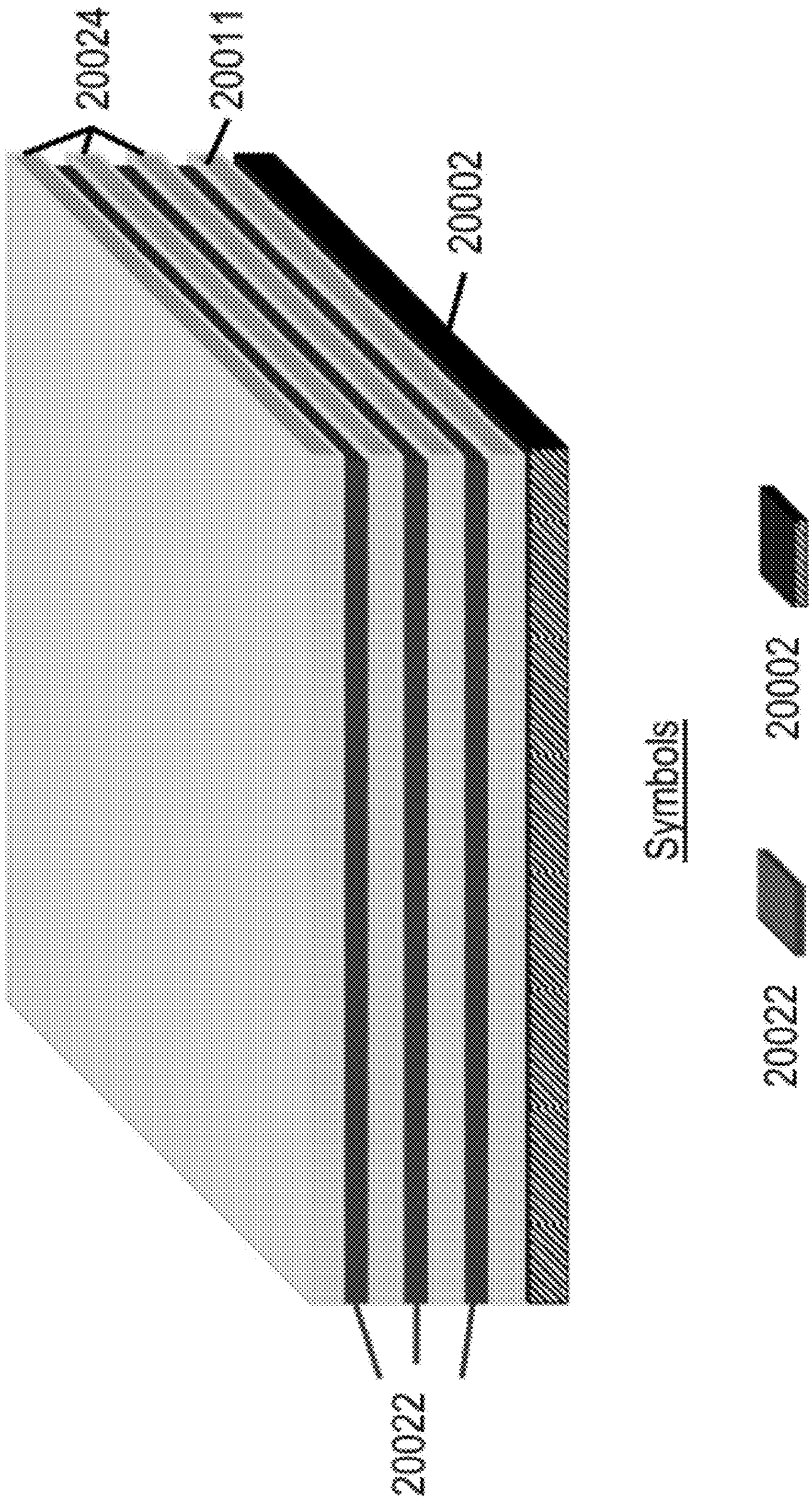

Step (D): FIG. 200D illustrates the structure after Step (D). Using methods similar to Step (B) and (C), multiple n+ silicon layers 20022 (now including n+ Silicon layer 20018) may be formed with associated silicon oxide layers 20024. Oxide layer 20004 and oxide layer 20010, which were previously oxide-oxide bonded, are now illustrated as oxide layer 20011.

Figure 200E:
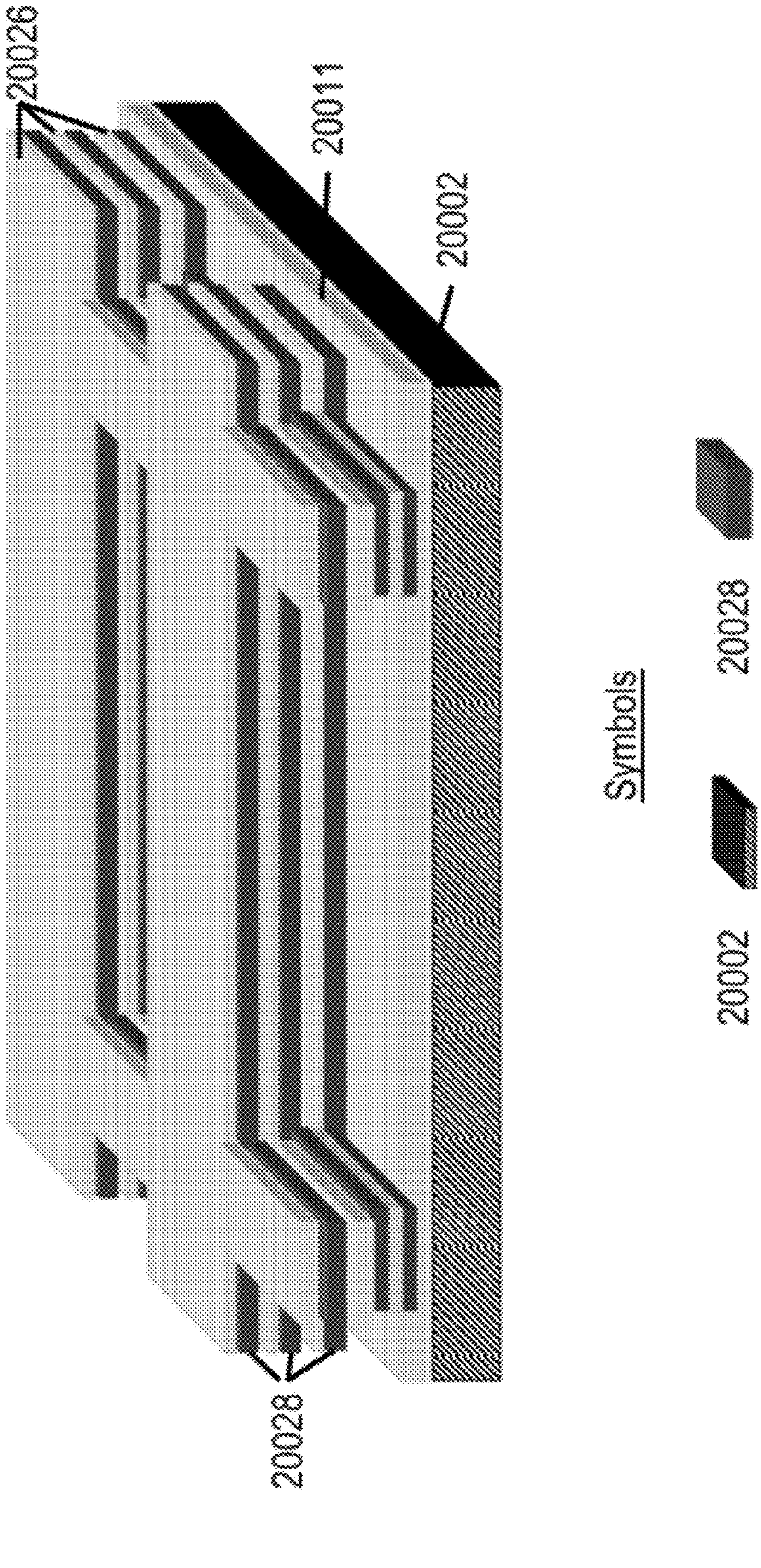

Step (E): FIG. 200E illustrates the structure after Step (E). Lithography and etch processes may then be utilized to make a structure as shown in the figure. The etch of multiple n+ silicon layers 20022 and associated silicon oxide layers 20024 may stop on oxide layer 20011 (shown), or may extend into and etch a portion of oxide layer 20011 (not shown). Thus exemplary patterned oxide regions 20026 and patterned n+ silicon regions 20028 may be formed.

Figure 200F:
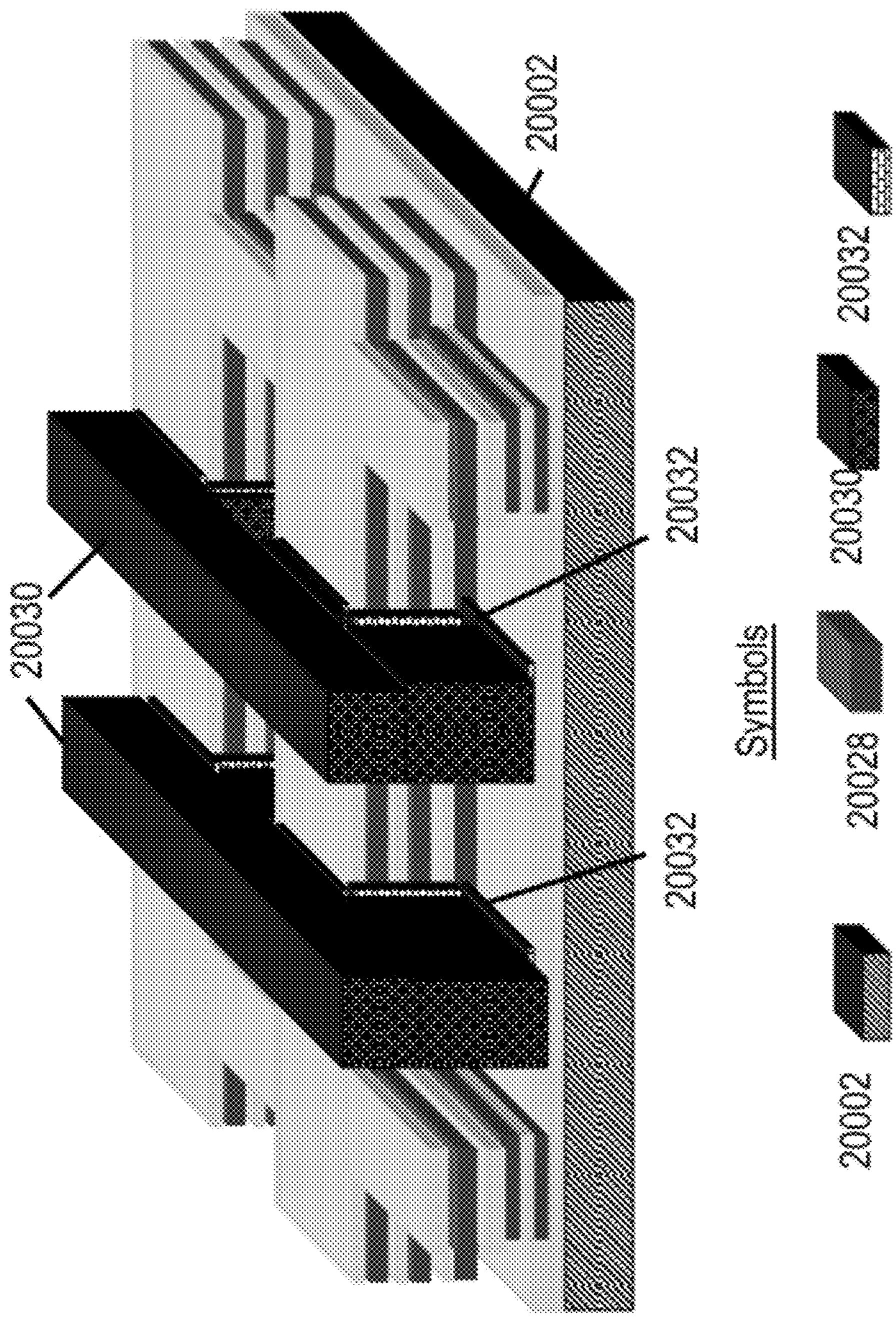

Step (F): FIG. 200F illustrates the structure after Step (F). A gate dielectric, such as, for example, silicon dioxide or hafnium oxides, and gate electrode, such as, for example, doped amorphous silicon or TiAlN, may be deposited and a CMP may be done to planarize the gate stack layers. Lithography and etch may be utilized to define the gate regions, thus gate dielectric regions 20032 and gate electrode regions 20030 may be formed.

Figure 200G:
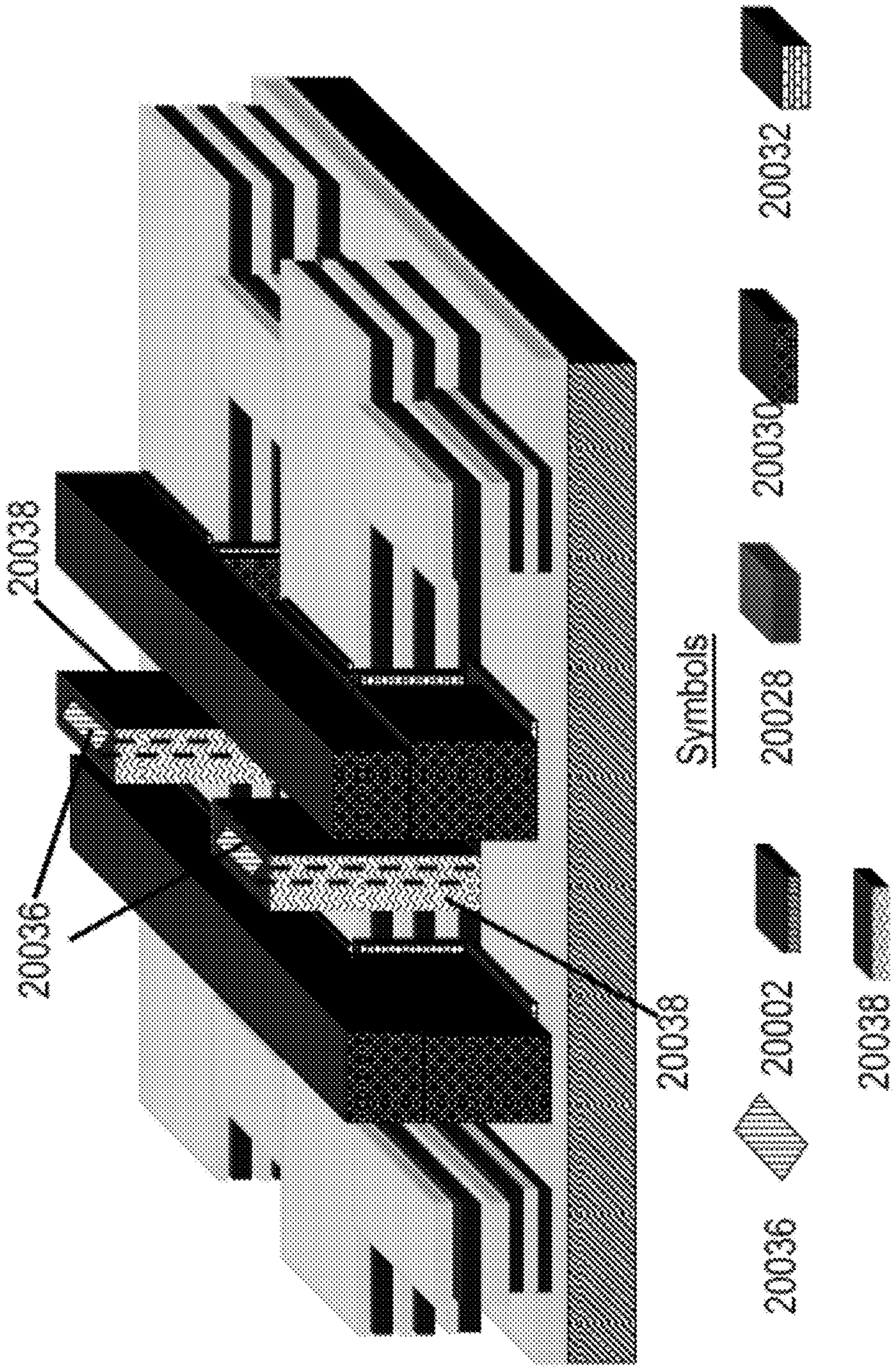

Step (G): FIG. 200G illustrates the structure after Step (G). A trench, for example two of which may be placed as shown in FIG. 200G, may be formed by lithography, etch and clean processes. A high dielectric constant material and then a metal electrode material may be deposited and polished with CMP. The metal electrode material may substantially fill the trenches. Thus high dielectric constant regions 20038 and metal electrode regions 20036 may be formed, which may substantially reside inside the exemplary two trenches. The high dielectric constant regions 20038 may be include materials such as, for example, hafnium oxide, titanium oxide, niobium oxide, zirconium oxide and any number of other possible materials with dielectric constants greater than or equal to 4. The DRAM capacitors may be defined by having the high dielectric constant regions 20038 in between the surfaces or edges of metal electrode regions 20036 and the associated stacks of n+ silicon regions 20028.

Figure 200H:
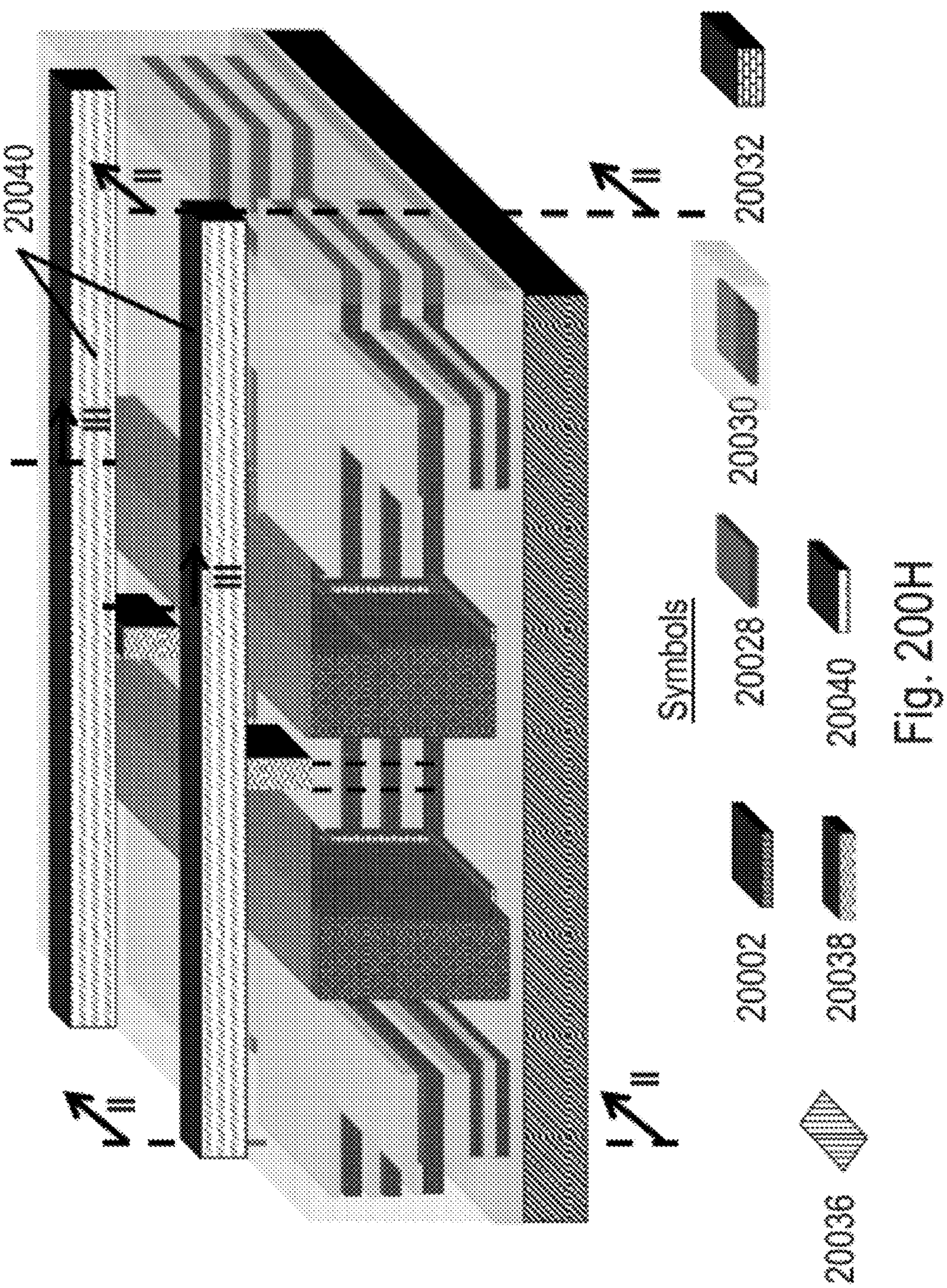

Step (H): FIG. 200H illustrates the structure after Step (H). A silicon oxide layer 20027 may then be deposited and planarized. The silicon oxide layer is shown transparent in the figure for clarity. Bit Lines 20040 may then be constructed. Contacts may then be made to Bit Lines, Word Lines and Source Lines of the memory array at its edges. Source Line contacts can be made into stair-like structures using techniques described in "Bit Cost Scalable Technology with Punch and Plug Process for Ultra High Density Flash Memory," VLSI Technology, 2007 IEEE Symposium on, vol., no., pp. 14-15, 12-14 Jun. 2007 by Tanaka, H.; Kido, M.; Yahashi, K.; Oomura, M.; et al., following which contacts can be constructed to them. Formation of stair-like structures for Source Lines could be done in steps prior to Step (H) as well. Vertical connections, for example, with TLVs, may be made to peripheral circuits 20002 (not shown).

Figure 200I:
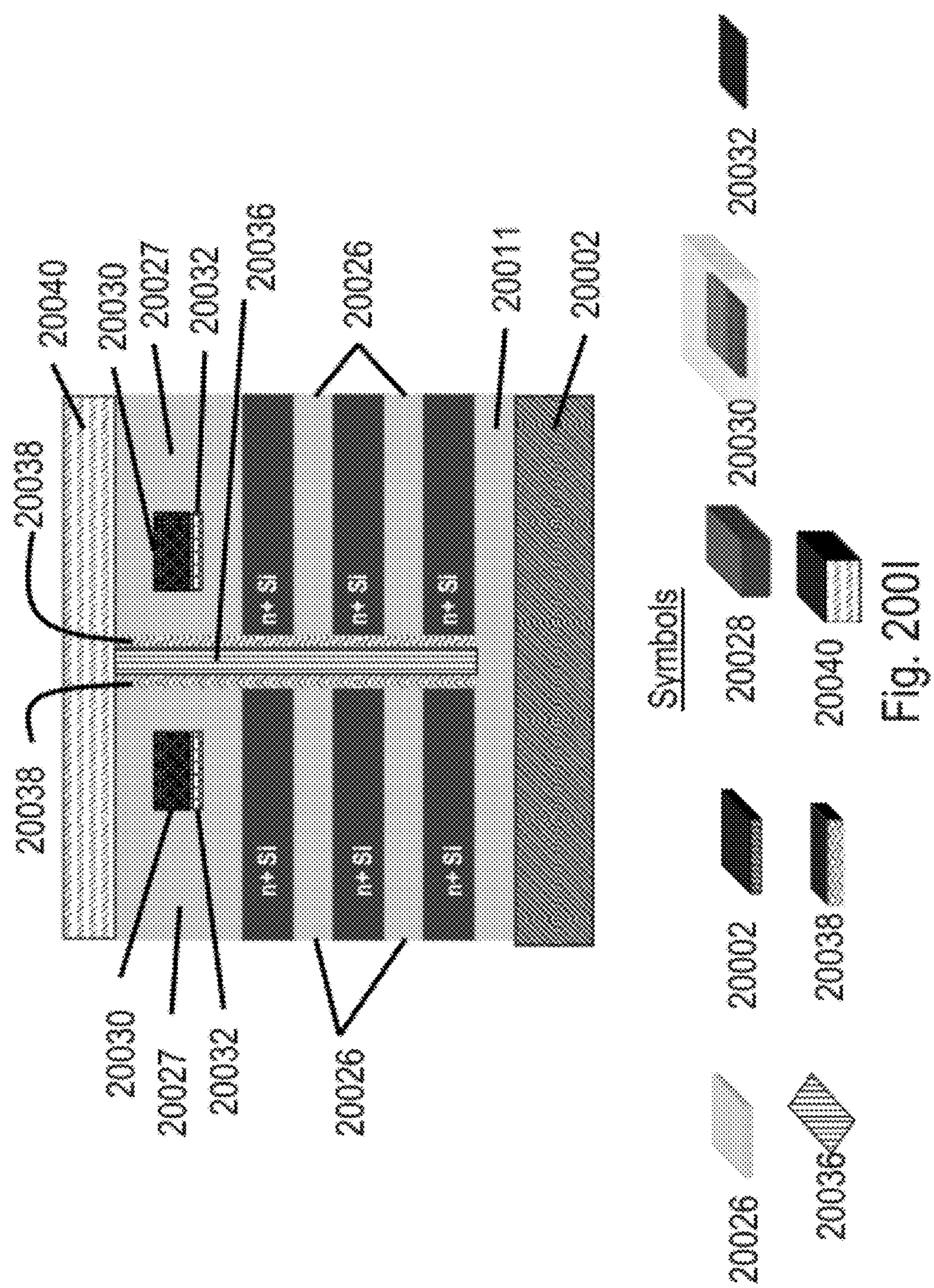
Figure 200J:
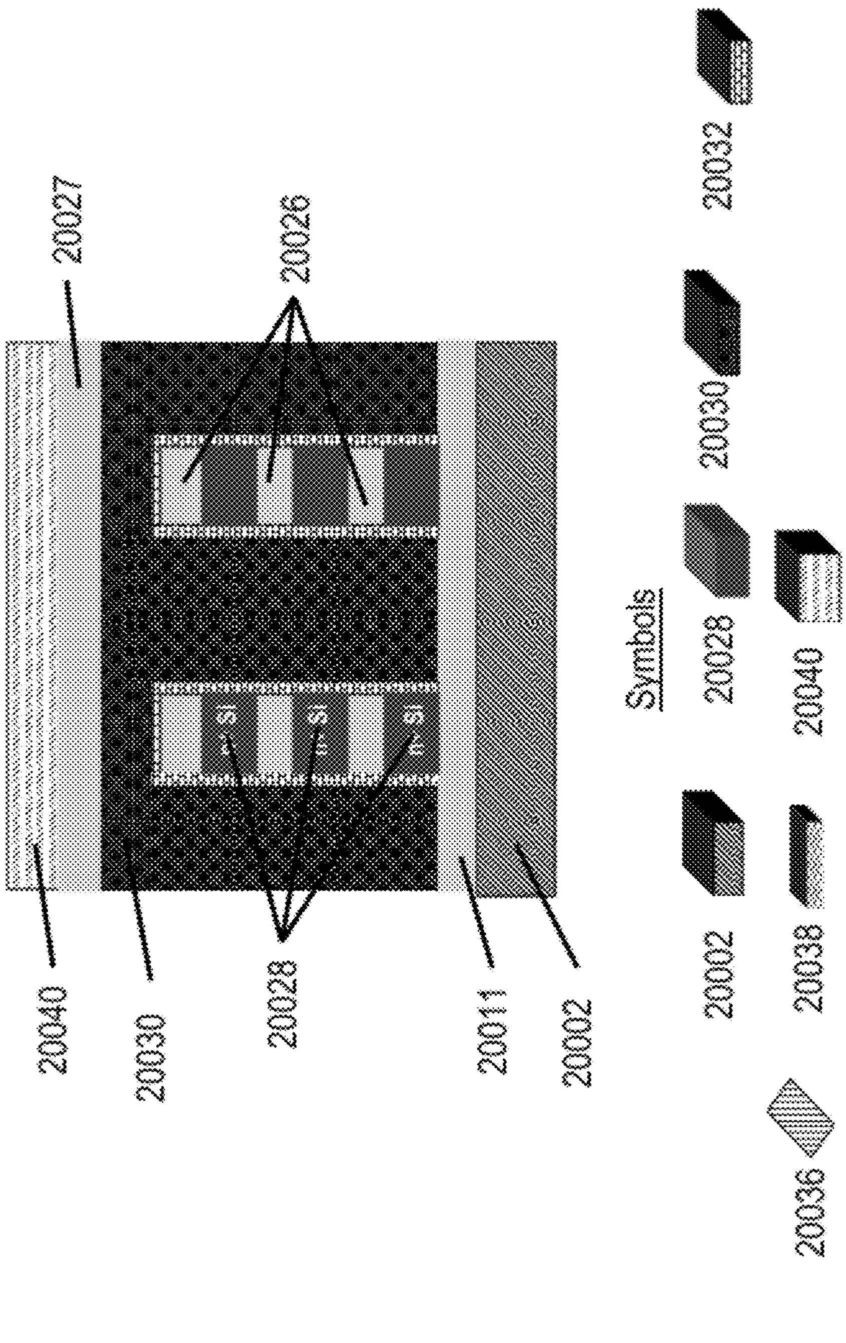

FIG. 200I and FIG. 200J show cross-sectional views of the exemplary memory array along FIG. 200H planes II and III respectively. Multiple junction-less transistors in series with capacitors constructed of high dielectric constant materials such as high dielectric constant regions 20038 can be observed in FIG. 200I.

A procedure for constructing a monolithic 3D DRAM has thus been described, with (1) horizontally-oriented transistors, (2) some of the memory cell control lines—e.g., source-lines SL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut. The transistors in the monocrystalline layer or layers may be horizontally oriented, i.e., current flowing in substantially the horizontal direction in transistor channels, substantially between drain and source, which may be parallel to the largest face of the substrate or wafer. The source and drain of the horizontally oriented transistors may be within the same monocrystalline layer. A transferred monocrystalline layer, such as n+ Silicon layer 20018, may have a thickness of less than about 150 nm.

Persons of ordinary skill in the art will appreciate that the illustrations in FIGS. 200A through 200J are exemplary only and are not drawn to scale. Such skilled persons will further appreciate that many variations may be possible such as, for example, layer transfer techniques other than the described hydrogen implant and ion-cut may be utilized. Moreover, while FIG. 200A-J described the procedure for forming a monolithic 3D DRAM with substantially all lithography steps shared among multiple memory layers, alternative procedures could be used. For example, procedures similar to those described in FIG. 33A-K, FIG. 34A-L and FIG. 35A-F of patent application Ser. No. 13/099,010 may be used to construct a monolithic 3D DRAM. The memory regions may have horizontally oriented transistors and vertical connections between the memory and logic/periphery layers may have a radius of less than 100 nm. These vertical connections may be vias, such as, for example, thru layer vias (TLVs), through the monocrystalline silicon layers connecting the stacked layers, for example, logic circuit regions within one monocrystalline layer to memory regions within another monocrystalline layer. Additional (e.g. third or fourth) monocrystalline layers that may have memory regions may be added to the stack. Decoders and other driver circuits of said memory may be part of the stacked logic circuit layer or logic circuit regions. Many other modifications within the scope of the illustrated embodiments of the invention will suggest themselves to such skilled persons after reading this specification. Thus the invention is to be limited only by the appended claims.

FIG. 223A-J illustrates an embodiment of the invention, wherein a horizontally-oriented monolithic 3D DRAM array may be constructed and may have a capacitor in series with a transistor selector. No mask may utilized on a "per-memory-layer" basis for the monolithic 3D DRAM shown in FIG. 223A-J, and substantially all other masks may be shared among different layers. The process flow may include the following steps which may be in sequence from Step (A) to Step (H). When the same reference numbers are used in different drawing figures (among FIG. 223A-J), the reference numbers may be used to indicate analogous, similar or identical structures to enhance the understanding of the invention by clarifying the relationships between the structures and embodiments presented in the various diagrams—particularly in relating analogous, similar or identical functionality to different physical structures.

Figure 223A:
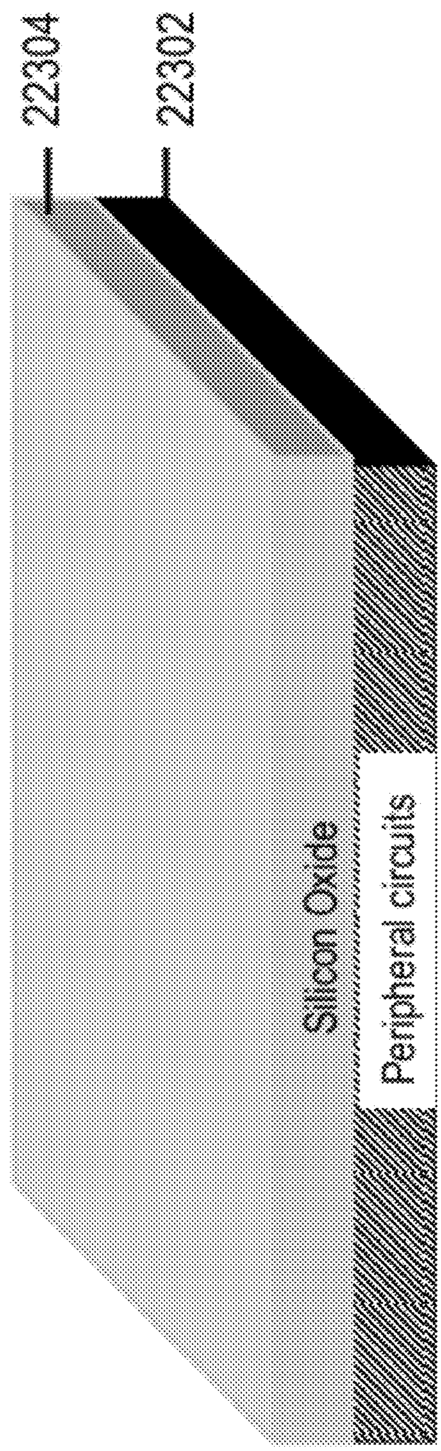

Step (A): Peripheral circuits 22302, which may include high temperature wiring, made with metals such as, for example, tungsten, and may include logic circuit regions, may be constructed. Oxide layer 22304 may be deposited above peripheral circuits 22302. FIG. 223A shows a drawing illustration after Step (A).

Figure 223B:
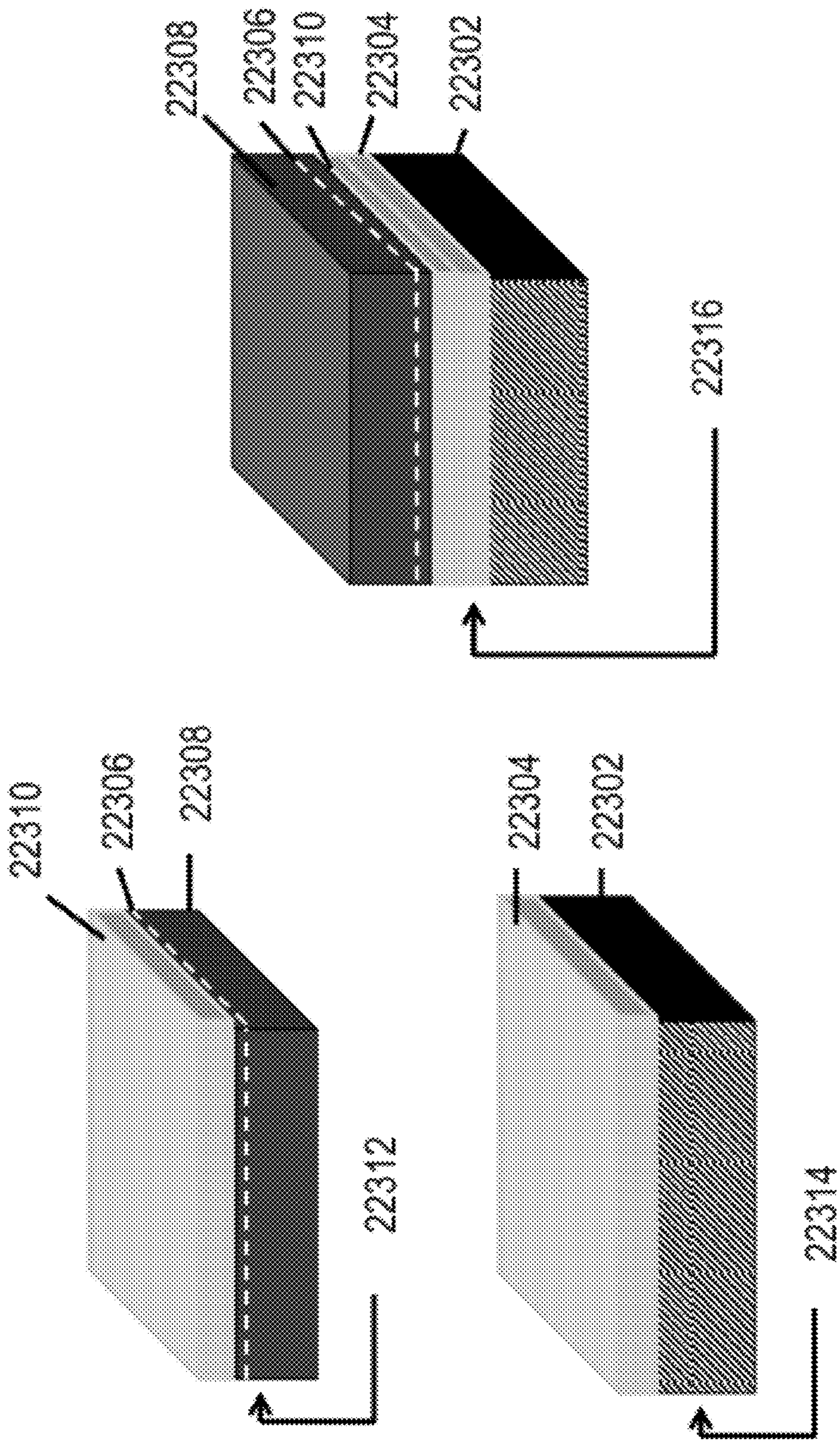

Step (B): FIG. 223B illustrates the structure after Step (B). N+ Silicon wafer 22308 may have an oxide layer 22310 grown or deposited above it. Hydrogen may be implanted into the n+ Silicon wafer 22308 to a certain depth indicated by hydrogen plane 22306. Alternatively, some other atomic species, such as Helium, may be (co-)implanted. Thus, top layer 22312 may be formed. The bottom layer 22314 may include the peripheral circuits 22302 with oxide layer 22304. The top layer 22312 may be flipped and bonded to the bottom layer 22314 using oxide-to-oxide bonding to form top and bottom stack 22316.

Figure 223C:
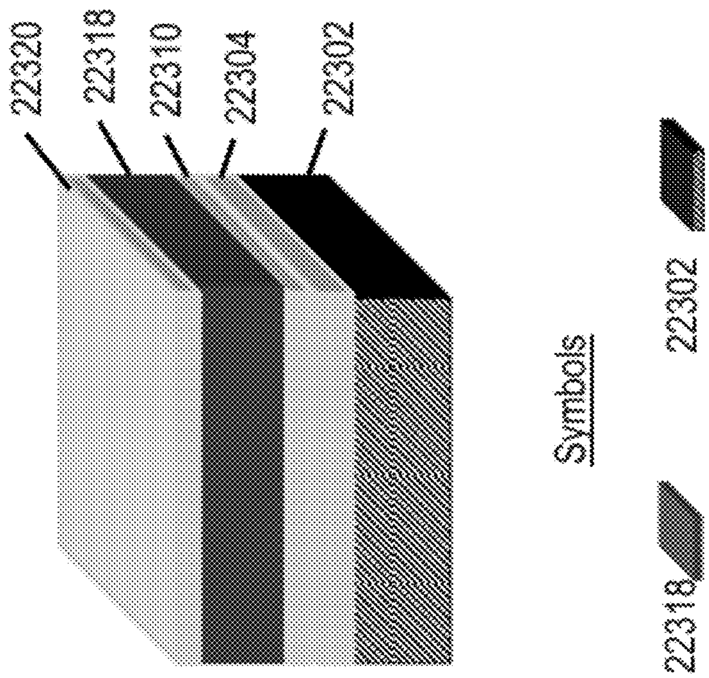

Step (C): FIG. 223C illustrates the structure after Step (C). The top and bottom stack 22316 may be cleaved at the hydrogen plane 22306 using methods including, for example, a thermal anneal or a sideways mechanical force. A CMP process may be conducted. Thus n+ Silicon layer 22318 may be formed. A layer of silicon oxide 22320 may be deposited atop the n+ Silicon layer 22318. At the end of this step, a single-crystal n+ Silicon layer 22318 may exist atop the peripheral circuits 22302, and this has been achieved using layer-transfer techniques.

Figure 223D:
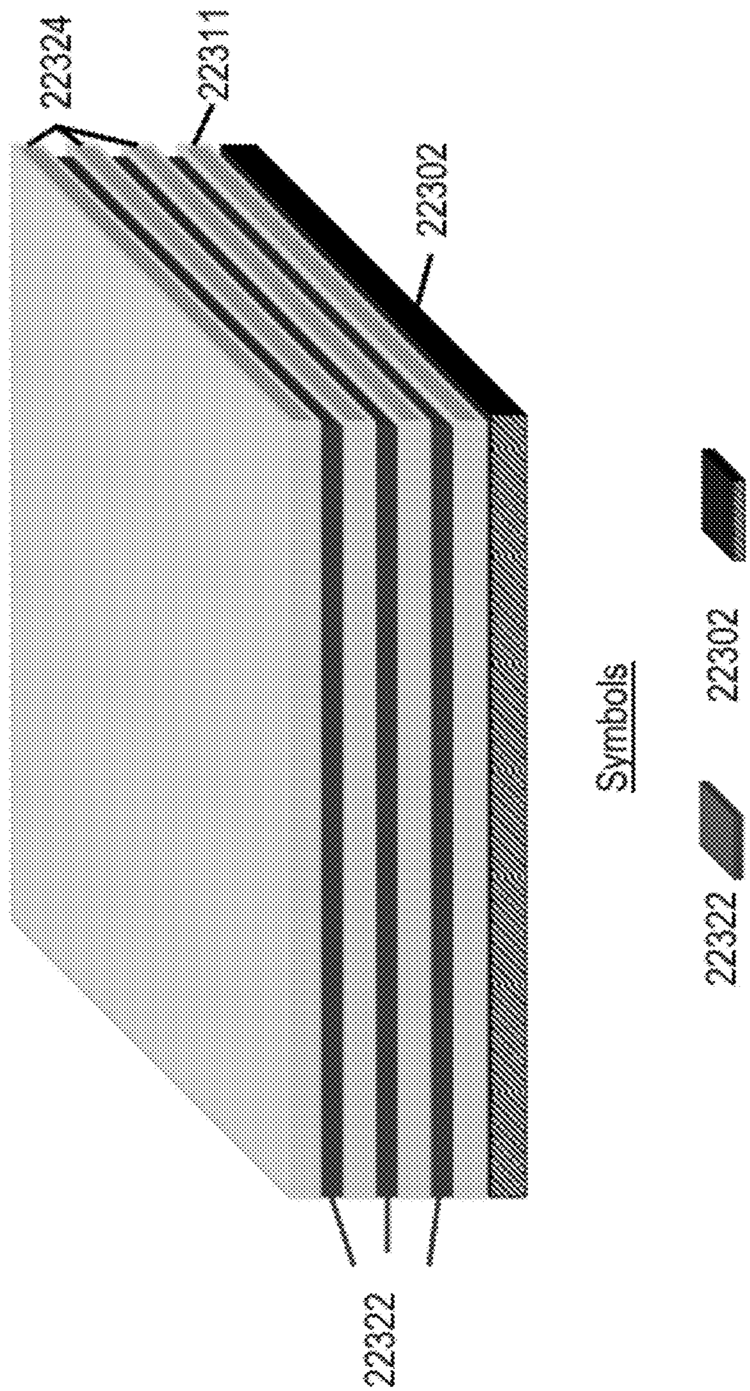

Step (D): FIG. 223D illustrates the structure after Step (D). Using methods similar to Step (B) and (C), multiple n+ silicon layers 22322 (now including n+ Silicon layer 22318) may be formed with associated silicon oxide layers 22324. Oxide layer 22304 and oxide layer 22310, which were previously oxide-oxide bonded, are now illustrated as oxide layer 22311.

Figure 223E:
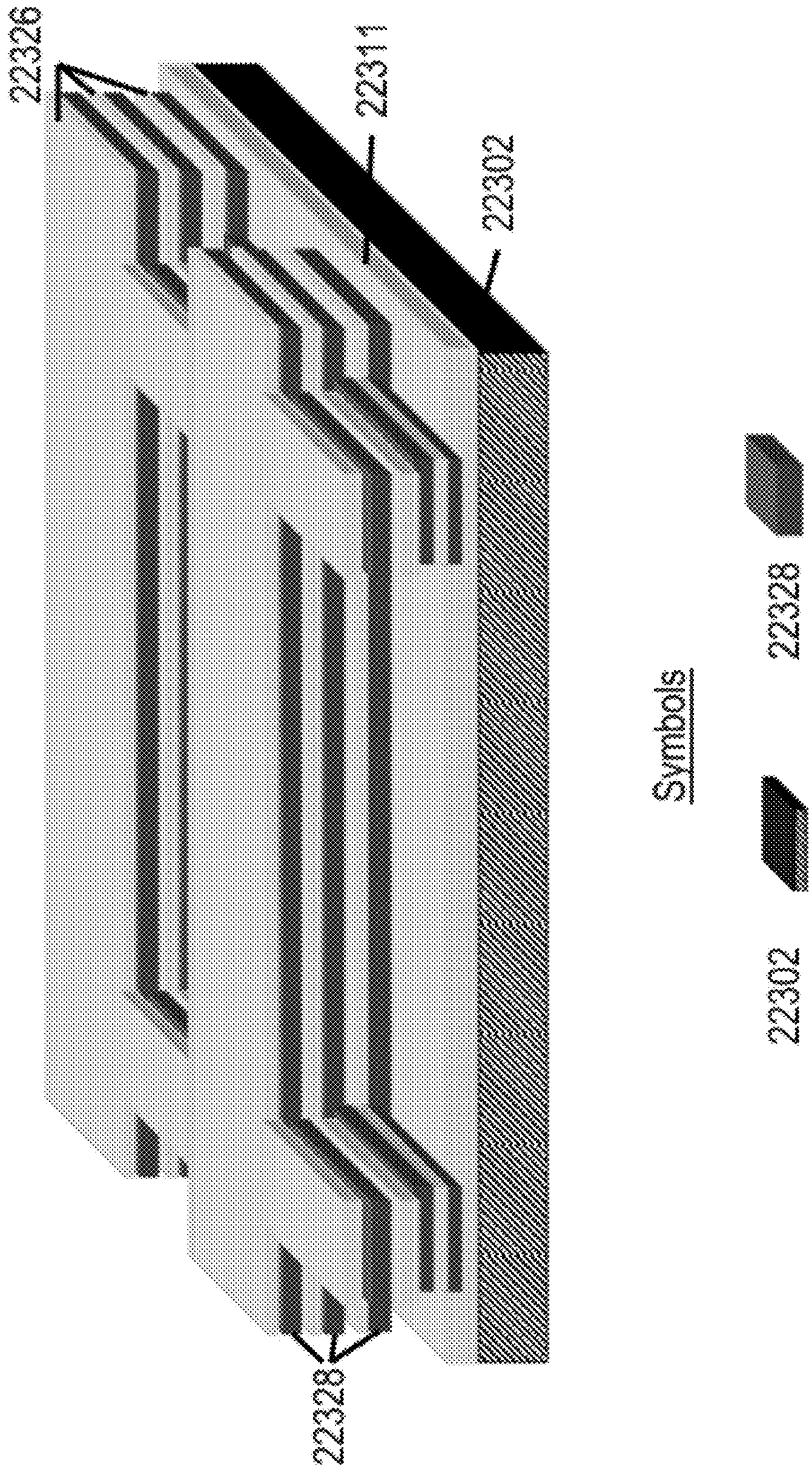

Step (E): FIG. 223E illustrates the structure after Step (E). Lithography and etch processes may then be utilized to make a structure as shown in the figure. The etch of multiple n+ silicon layers 22322 and associated silicon oxide layers 22324 may stop on oxide layer 22311 (shown), or may extend into and etch a portion of oxide layer 22311 (not shown). Thus exemplary patterned oxide regions 22326 and patterned n+ silicon regions 22328 may be formed.

Figure 223F:
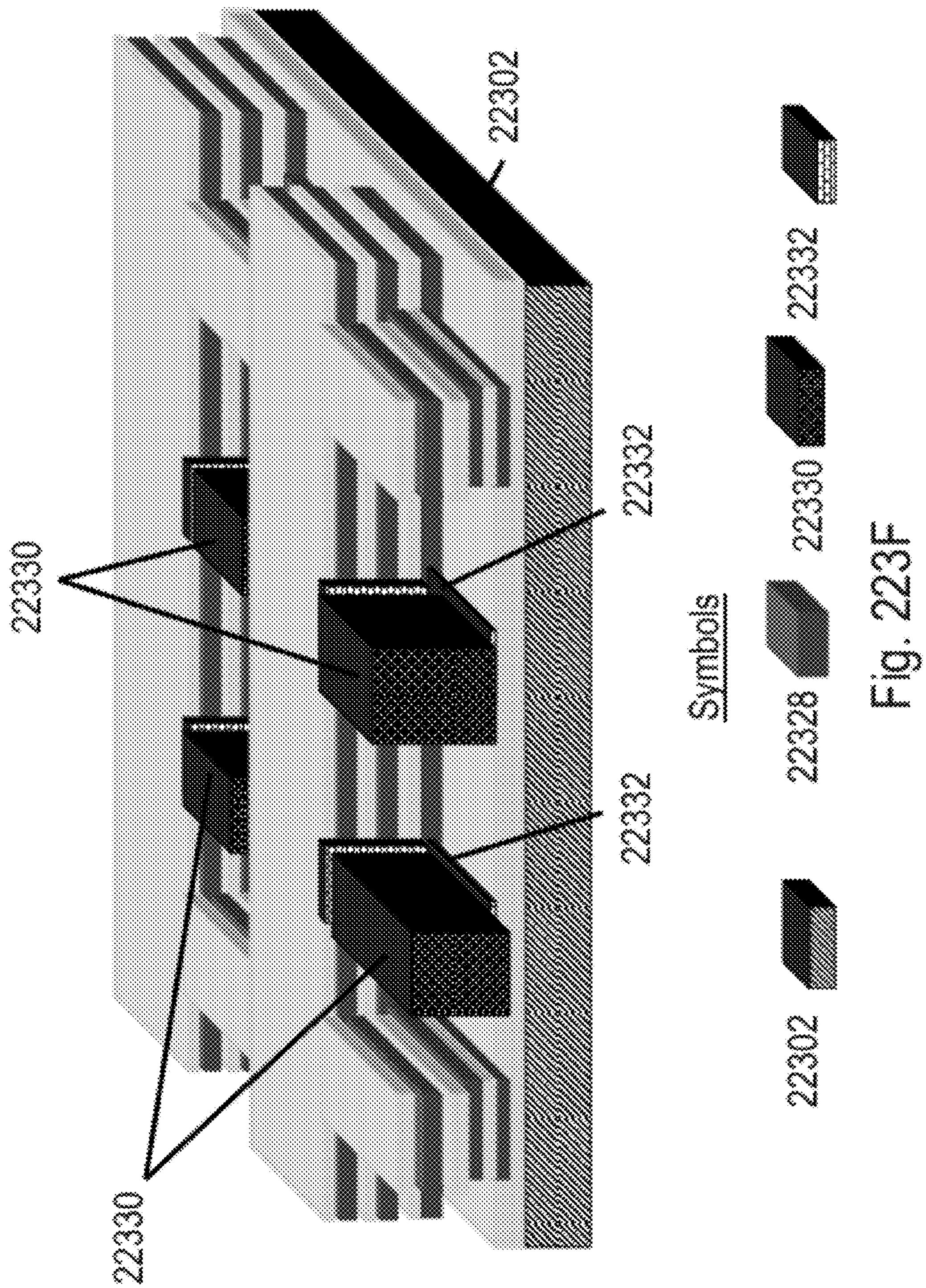

Step (F): FIG. 223F illustrates the structure after Step (F). A gate dielectric, such as, for example, silicon dioxide or hafnium oxides, and gate electrode, such as, for example, doped amorphous silicon or TiAlN, may be deposited and a CMP may be done to planarize the gate stack layers. Lithography and etch may be utilized to define the gate regions, thus gate dielectric regions 22332 and gate electrode regions 22330 may be formed.

Figure 223G:
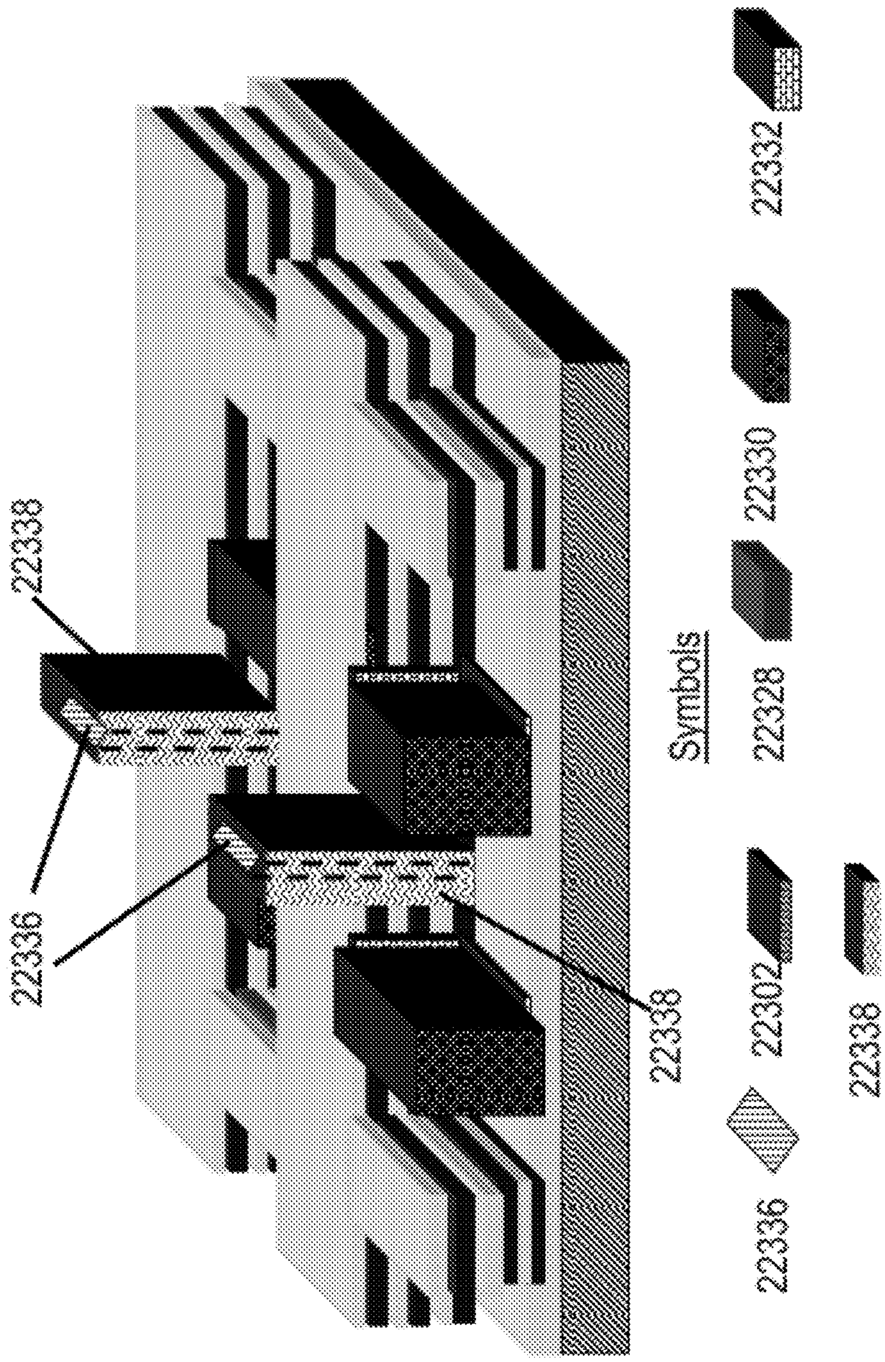

Step (G): FIG. 223G illustrates the structure after Step (G). A trench, for example two of which may be placed as shown in FIG. 223G, may be formed by lithography, etch and clean processes. A high dielectric constant material and then a metal electrode material may be deposited and polished with CMP. The metal electrode material may substantially fill the trenches. Thus high dielectric constant regions 22338 and metal electrode regions 22336 may be formed, which may substantially reside inside the exemplary two trenches. The high dielectric constant regions 22338 may be include materials such as, for example, hafnium oxide, titanium oxide, niobium oxide, zirconium oxide and any number of other possible materials with dielectric constants greater than or equal to 4. The DRAM capacitors may be defined by having the high dielectric constant regions 22338 in between the surfaces or edges of metal electrode regions 22336 and the associated stacks of n+ silicon regions 22328.

Figure 223H:
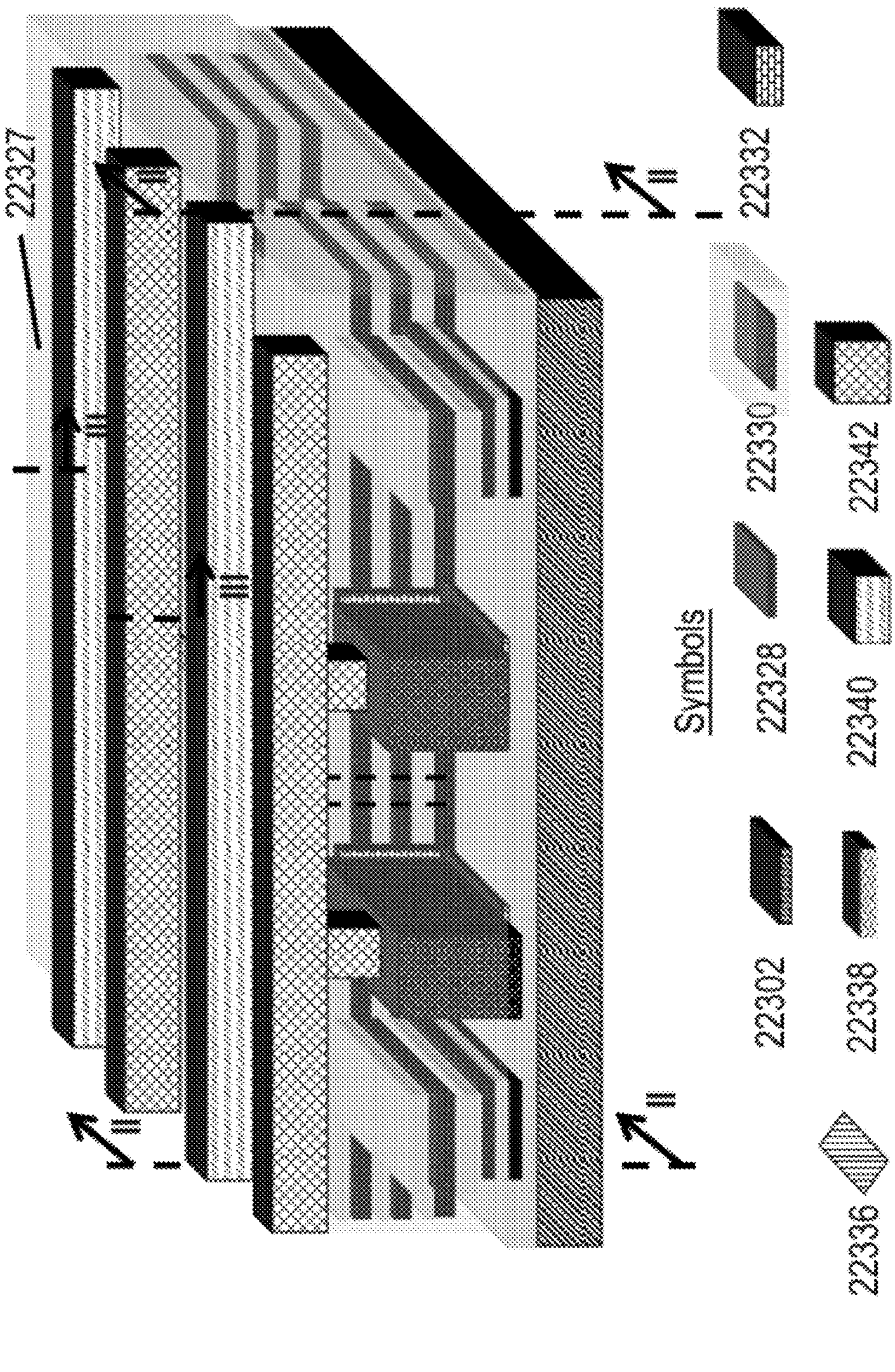

Step (H): FIG. 223H illustrates the structure after Step (H). A silicon oxide layer 22327 may then be deposited and planarized. The silicon oxide layer is shown partially transparent in the figure for clarity. Bit Lines 22340 may then be constructed. Word Lines 22342 may then be constructed. Contacts may then be made to Bit Lines, Word Lines and Source Lines of the memory array at its edges. Source Line contacts can be made into stair-like structures using techniques described in “Bit Cost Scalable Technology with Punch and Plug Process for Ultra High Density Flash Memory,” VLSI Technology, 2007 IEEE Symposium on, vol., no., pp. 14-15, 12-14 Jun. 2007 by Tanaka, H.; Kido, M.; Yahashi, K.; Oomura, M.; et al., following which contacts can be constructed to them. Formation of stair-like structures for Source Lines could be done in steps prior to Step (H) as well. Vertical connections may be made to peripheral circuits 22302.

Figure 223I:
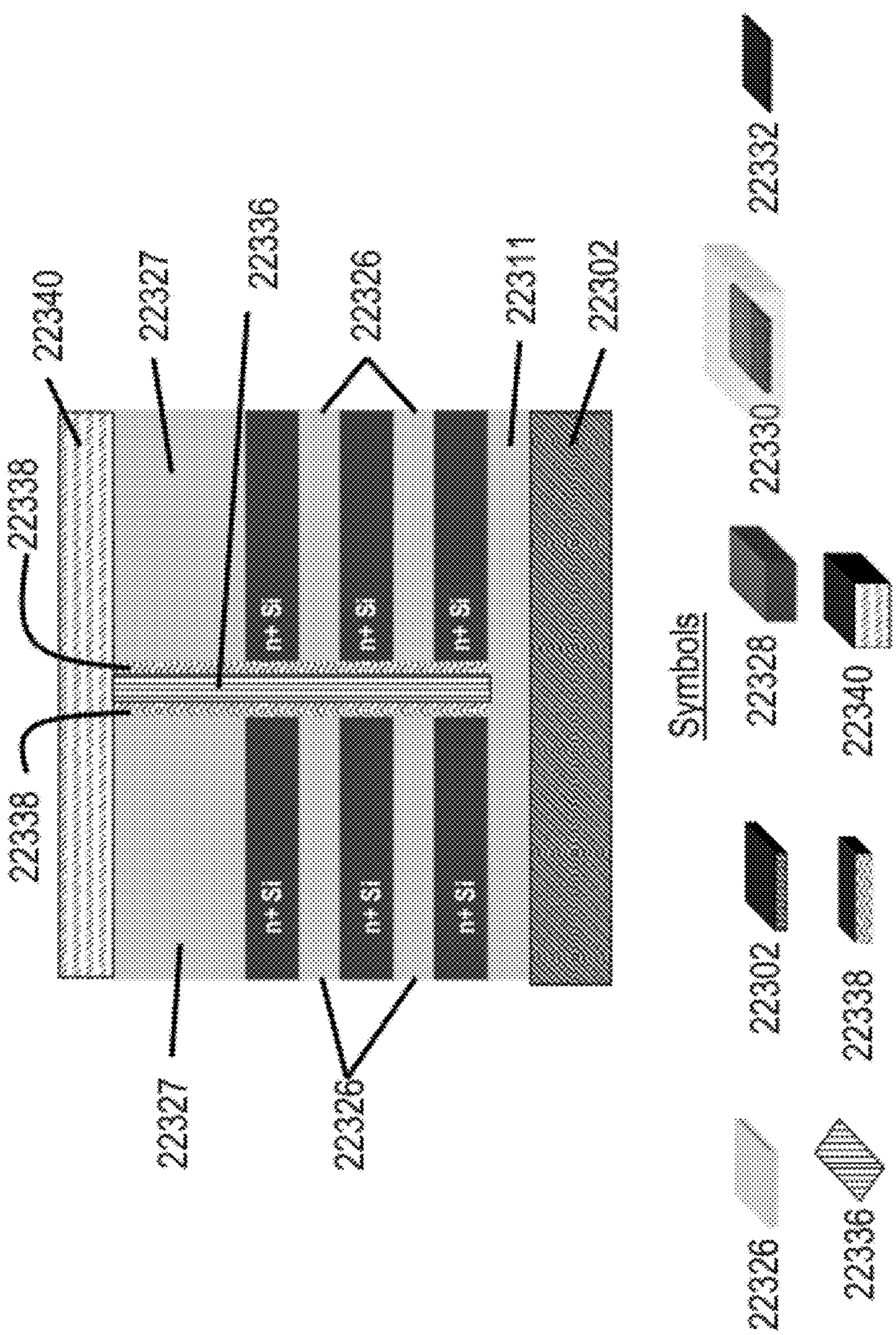
Figure 223J:
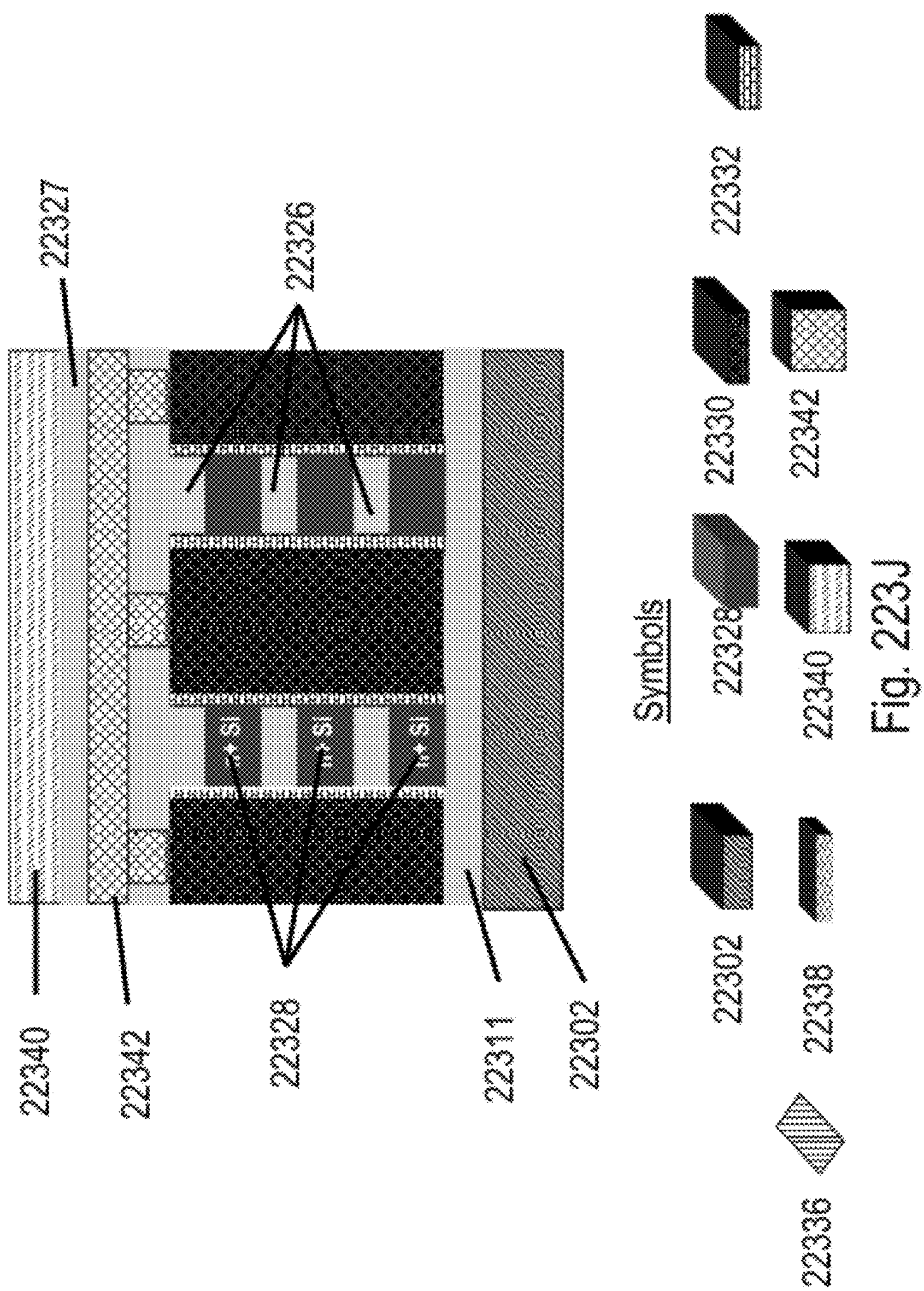

FIG. 223I and FIG. 223J show cross-sectional views of the exemplary memory array along FIG. 223H planes II and III respectively. Multiple junction-less transistors in series with capacitors constructed of high dielectric constant materials such as high dielectric constant regions 22338 can be observed in FIG. 223I.

A procedure for constructing a monolithic 3D DRAM has thus been described, with (1) horizontally-oriented transistors, (2) some of the memory cell control lines—e.g., source-lines SL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut. The transistors in the monocrystalline layer or layers may be horizontally oriented, i.e., current flowing in substantially the horizontal direction in transistor channels, substantially between drain and source, which may be parallel to the largest face of the substrate or wafer. The source and drain of the horizontally oriented transistors may be within the same monocrystalline layer. A transferred monocrystalline layer, such as n+ Silicon layer 22318, may have a thickness of less than about 150 nm.

Persons of ordinary skill in the art will appreciate that the illustrations in FIGS. 223A through 223J are exemplary only and are not drawn to scale. Such skilled persons will further appreciate that many variations may be possible such as, for example, layer transfer techniques other than the described hydrogen implant and ion-cut may be utilized. Moreover, while FIG. 223A-J described the procedure for forming a monolithic 3D DRAM with substantially all lithography steps shared among multiple memory layers, alternative procedures could be used. For example, procedures similar to those described in FIG. 33A-K, FIG. 34A-L and FIG. 35A-F of patent application Ser. No. 13/099,010 may be used to construct a monolithic 3D DRAM. The technique of making Word Lines perpendicular to the source-lines may be analogously used for flash memories, resistive memories and floating body DRAM with lithography steps shared among multiple memory layers. The memory regions may have horizontally oriented transistors and vertical connections between the memory and logic/periphery layers may have a radius of less than 100 nm. These vertical connections may be vias, such as, for example, thru layer vias (TLVs), through the monocrystalline silicon layers connecting the stacked layers, for example, logic circuit regions within one monocrystalline layer to memory regions within another monocrystalline layer. Many other modifications within the scope of the illustrated embodiments of the invention described herein will suggest themselves to such skilled persons after reading this specification. Thus the invention is to be limited only by the appended claims.

Over the past few years, the semiconductor industry has been actively pursuing floating-body RAM technologies as a replacement for conventional capacitor-based DRAM or as a replacement for embedded DRAM/SRAM. In these technologies, charge may be stored in the body region of a transistor instead of having a separate capacitor. This could have several potential advantages, including lower cost due to the lack of a capacitor, easier manufacturing and potentially scalability. There are many device structures, process technologies and operation modes possible for capacitor-less floating-body RAM. Some of these are included in "Floating-body SOI Memory: The Scaling Tournament", Book Chapter of Semiconductor-On-Insulator Materials for Nanoelectronics Applications, pp. 393-421, Springer Publishers, 2011 by M. Bawedin, S. Cristoloveanu, A. Hubert, K. H. Park and F. Martinez ("Bawedin").

FIG. 201 shows a prior art illustration of capacitor-based DRAM and capacitor-less floating-body RAM. A capacitor-based DRAM cell 20106 may be schematically illustrated and may include transistor 20102 coupled in series with capacitor 20104. The transistor 20102 may serve as a switch for the capacitor 20104, and may be ON while storing or reading charge in the capacitor 20104, but may be OFF while not performing these operations. One illustrative example capacitor-less floating-body RAM cell 20118 may include transistor source and drain regions 20112, gate dielectric 20110, gate electrode 20108, buried oxide 20116 and silicon region 20114. Charge may be stored in the transistor body region 20120. Various other structures and configurations of floating-body RAM may be possible, and are not illustrated in FIG. 201. In many configurations of floating-body RAM, a high (electric) field mechanism such as impact ionization, tunneling or some other phenomenon may be used while writing data to the memory cell. High-field mechanisms may be used while reading data from the memory cell. The capacitor-based DRAM cell 20106 may often operate at much lower electric fields compared to the floating-body RAM cell 20118.

Figure 202A:
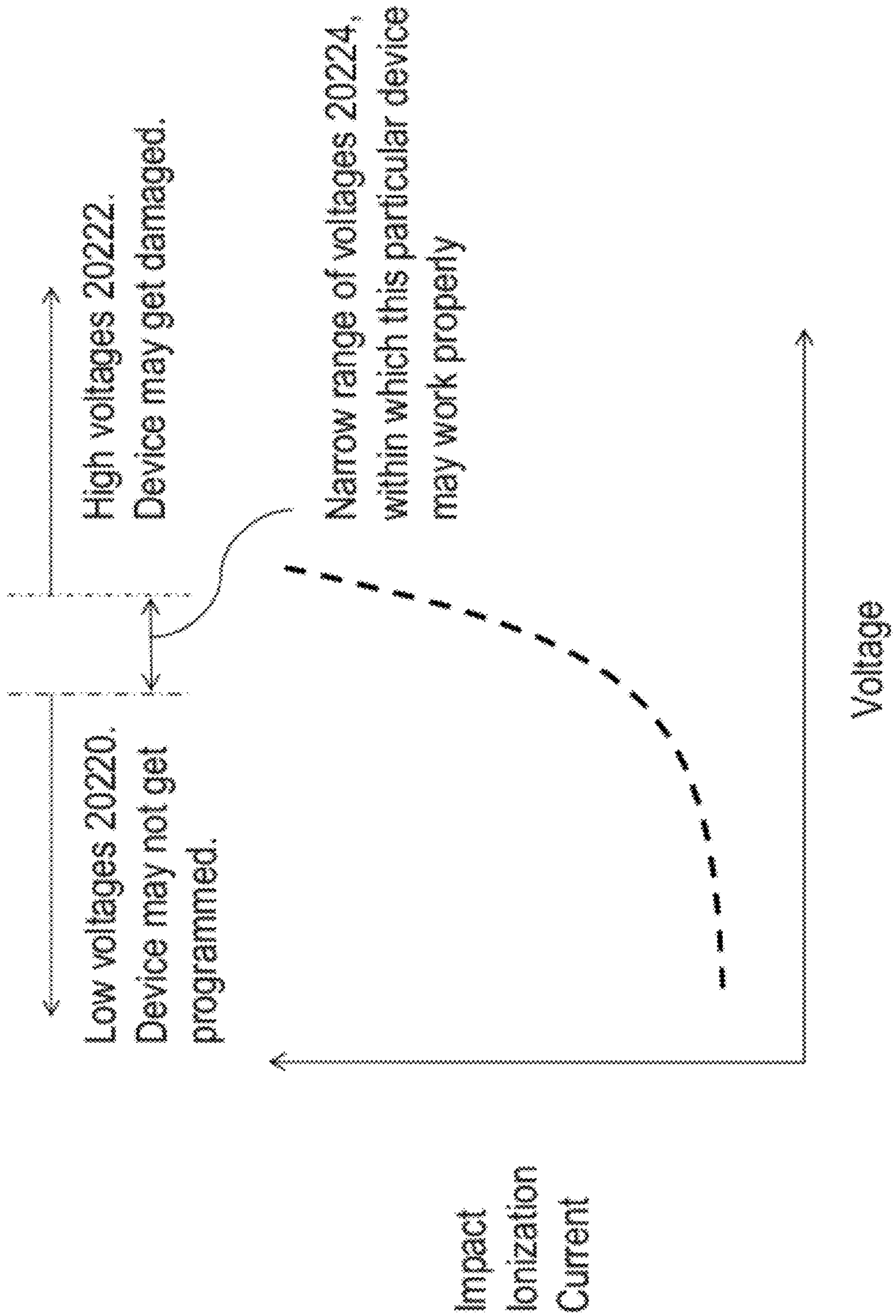
Figure 202B:
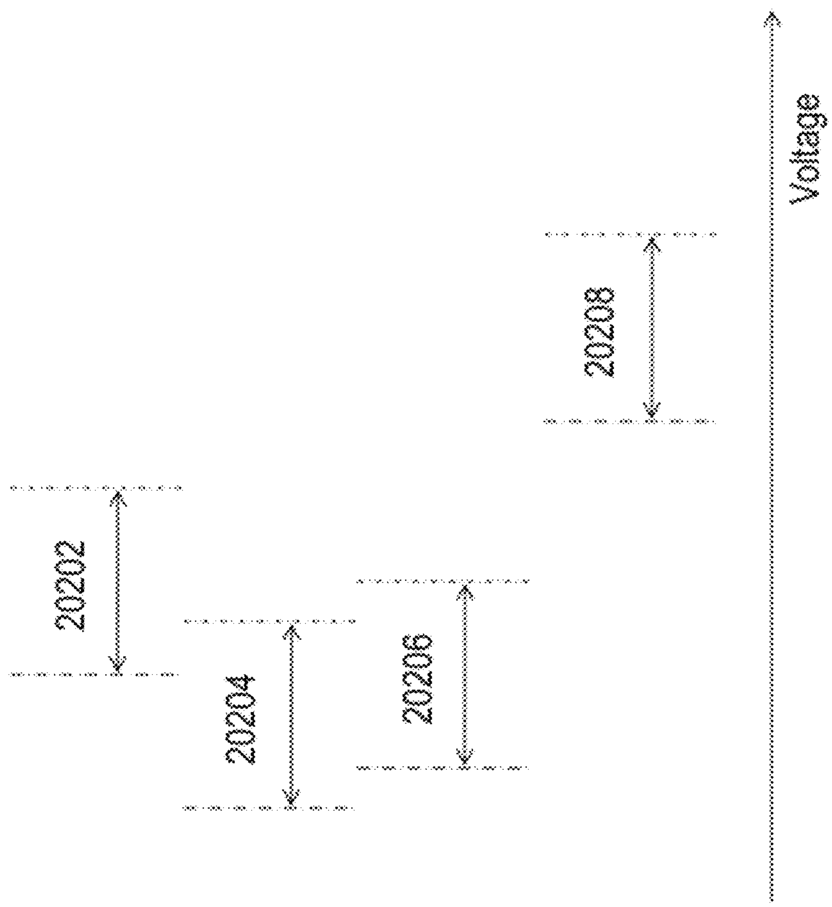

FIG. 202A-202B illustrates some of the potential challenges associated with possible high field effects in floating-body RAM. The Y axis of the graph shown in FIG. 202A may indicate current flowing through the cell during the write operation, which may, for example, consist substantially of impact ionization current. While impact ionization may be illustrated as the high field effect in FIG. 202A, some other high field effect may alternatively be present. The X axis of the graph shown in FIG. 202B may indicate some voltage applied to the memory cell. While using high field effects to write to the cell, some challenges may arise. At low voltages 20220, not enough impact ionization current may be generated while at high voltages 20222, the current generated may be exponentially higher and may damage the cell. The device may therefore work only at a narrow range of voltages 20224.

A challenge of having a device work across a narrow range of voltages is illustrated with FIG. 202B. In a memory array, for example, there may be millions or billions of memory cells, and each memory individual cell may have its own range of voltages between which it operates safely. Due to variations across a die or across a wafer, it may not be possible to find a single voltage that works well for substantially all members of a memory array. In the plot shown in FIG. 202B, four different memory cells may have their own range of "safe" operating voltages 20202, 20204, 20206 and 20208. Thus, it may not be possible to define a single voltage that can be used for writing substantially all cells in a memory array. While this example described the scenario with write operation, high field effects may make it potentially difficult to define and utilize a single voltage for reading substantially all cells in a memory array. Solutions to this potential problem may be required.

FIG. 203 illustrates an embodiment of the invention that describes how floating-body RAM chip 20310 may be managed wherein some memory cells within floating-body RAM chip 20310 may have been damaged due to mechanisms, such as, for example, high-field effects after multiple write or read cycles. For example, a cell rewritten a billion times may have been damaged more by high field effects than a cell rewritten a million times. As an illustrative example, floating-body RAM chip 20310 may include nine floating-body RAM blocks, 20301, 20302, 20303, 20304, 20305, 20306, 20307, 20308 and 20309. If it is detected, for example, that memory cells in floating-body RAM block 20305 may have degraded due to high-field effects and that redundancy and error control coding schemes may be unable to correct the error, the data within floating-body RAM block 20305 may be remapped in part or substantially in its entirety to floating-body RAM block 20308. Floating-body RAM block 20305 may not be used after this remapping event.

FIG. 204 illustrates an embodiment of the invention wherein an exemplary methodology for implementing the bad block management scheme may be described with respect to FIG. 203. For example, during a read operation 20400, if the number of errors increases beyond a certain threshold 20410, an algorithm may be activated. The first step of this algorithm may be to check or analyze the causation or some characteristic of the errors, for example, if the errors may be due to soft-errors or due to reliability issues because of high-field effects. Soft-errors may be transient errors and may not occur again and again in the field, while reliability issues due to high-field effects may occur again and again (in multiple conditions), and may occur in the same field or cell. Testing circuits may be present on the die, or on another die, which may be able to differentiate between soft errors and reliability issues in the field by utilizing the phenomenon or characteristic of the error in the previous sentence or by some other method. If the error may result from floating-body RAM reliability 20420, the contents of the block may be mapped and transferred to another block as described with respect to FIG. 203 and this block may not be reused again 20430. Alternatively, the bad block management scheme may use error control coding to correct the bad data 20440. As well, if the number of bit errors detected in 20410 does not cross a threshold, then the methodology may use error control coding to correct the bad data 20450. In all cases, the methodology may provide the user data about the error and correction 20460. The read operation may end 20499.

FIG. 205 illustrates an embodiment of the invention wherein wear leveling techniques and methodology may be utilized in floating body RAM. As an illustrative example, floating-body RAM chip 20510 may include nine floating-body RAM blocks 20501, 20502, 20503, 20504, 20505, 20506, 20507, 20508 and 20509. While writing data to floating-body RAM chip 20510, the writes may be controlled and mapped by circuits that may be present on the die, or on another die, such that substantially all floating-body RAM blocks, such as 20501-20509, may be exposed to an approximately similar number of write cycles. The leveling metric may utilize the programming voltage, total programming time, or read and disturb stresses to accomplish wear leveling, and the wear leveling may be applied at the cell level, or at a super-block (groups of blocks) level. This wear leveling may avoid the potential problem wherein some blocks may be accessed more frequently than others. This potential problem typically limits the number of times the chip can be written. There are several algorithms used in flash memories and hard disk drives that perform wear leveling. These techniques could be applied to floating-body RAM due to the high field effects which may be involved. Using these wear leveling procedures, the number of times a floating body RAM chip can be rewritten (i.e. its endurance) may improve.

Figure 206A:
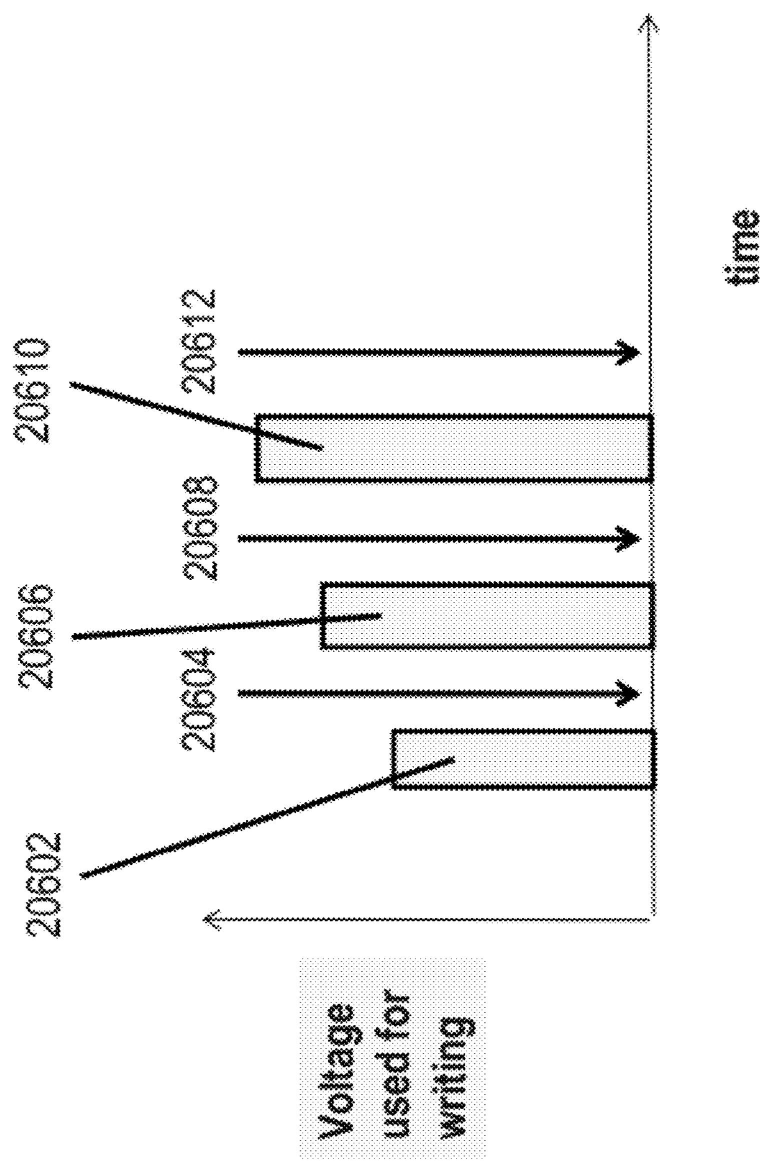
Figure 206B:
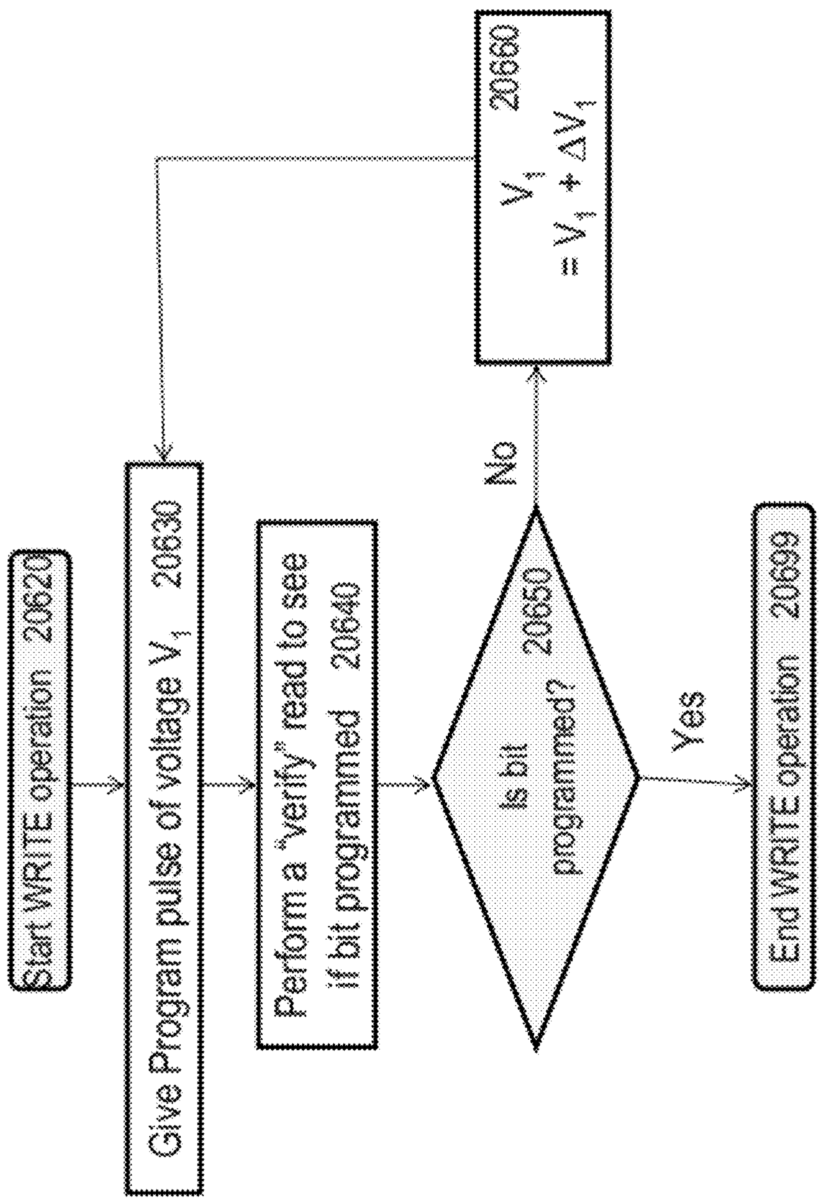

FIG. 206A-B illustrates an embodiment of the invention wherein incremental step pulse programming techniques and methodology may be utilized for floating-body RAM. The Y axis of the graph shown in FIG. 206A may indicate the voltage used for writing the floating-body RAM cell or array and the X axis of the graph shown in FIG. 206A may indicate time during the writing of a floating-body RAM cell or array. Instead of using a single pulse voltage for writing a floating-body RAM cell or array, multiple write voltage pulses, such as, initial write pulse 20602, second write pulse 20606 and third write pulse 20610, may be applied to a floating-body RAM cell or array. Write voltage pulses such as, initial write pulse 20602, second write pulse 20606 and third write pulse 20610, may have differing voltage levels and time durations ('pulse width'), or they may be similar. A "verify" read may be conducted after every write voltage pulse to detect if the memory cell has been successfully written with the previous write voltage pulse. A "verify" read operation may include voltage pulses and current reads. For example, after initial write pulse 20602, a "verify" read operation 20604 may be conducted. If the "verify" read operation 20604 has determined that the floating-body RAM cell or array has not finished storing the data, a second write pulse 20606 may be given followed by a second "verify" read operation 20608. Second write pulse 20606 may be of a higher voltage and/or time duration (shown) than that of initial write pulse 20602. If the second "verify" read operation 20608 has determined that the floating-body RAM cell or array has not finished storing the data, a third write pulse 20610 may be given followed by a third "verify" read operation 20612. Third write pulse 20610 may be of a higher voltage and/or time duration (shown) than that of initial write pulse 20602 or second write pulse 20606. This could continue until a combination of write pulse and verify operations indicate that the bit storage is substantially complete. The potential advantage of incremental step pulse programming schemes may be similar to those described with respect to FIG. 201 and FIG. 202A-202B as they may tackle the cell variability and other issues, such as effective versus applied write voltages.

FIG. 206B illustrates an embodiment of the invention wherein an exemplary methodology for implementing a write operation using incremental step pulse programming scheme may be described with respect to FIG. 206A. Although FIG. 206B illustrates an incremental step pulse programming scheme where subsequent write pulses may have higher voltages, the flow may be general and may apply to cases, for example, wherein subsequent write pulses may have higher time durations. Starting a write operation 20620, a write voltage pulse of voltage V1 may be given 20630 to the floating-body RAM cell or array, following which a verify read operation may be conducted 20640. If the verify read indicates that the bit of the floating-body RAM cell or array has been written 20650 satisfactorily, the write operation substantially completes 20699. Otherwise, the write voltage pulse magnitude may be increased (+ΔV1 shown) 20660 and further write pulses and verify read pulses may be given 20630 to the memory cell. This process may repeat until the bit is written satisfactorily.

Persons of ordinary skill in the art will appreciate that the illustrations in FIGS. 206A through 206B are exemplary only and are not drawn to scale. Such skilled persons will further appreciate that many variations may be possible such as, for example, pulses may utilize delivered current rather than measured or effective voltage, or some combination thereof. Moreover, multiple write pulses before a read verify operation may be done. Further, write pulses may have more complex shapes in voltage and time, such as, for example, ramped voltages, soaks or holds, or differing pulse widths. Furthermore, the write pulse may be of positive or negative voltage magnitude and there may be a mixture of unipolar or bipolar pulses within each pulse train. The write pulse or pulses may be between read verify operations. Further, ΔV1 may be of polarity to decrease the write program pulse voltage V1 magnitude. Moreover, an additional 'safety' write pulse may be utilized after the last successful read operation. Further, the verify read operation may utilize a read voltage pulse that may be of differing voltage and time shape than the write pulse, and may have a different polarity than the write pulse. Furthermore, the write pulse may be utilized for verify read purposes. Many other modifications within the scope of the illustrated embodiments of the invention described herein will suggest themselves to such skilled persons after reading this specification. Thus the invention is to be limited only by the appended claims.

FIG. 207 illustrates an embodiment of the invention wherein optimized and possibly different write voltages may be utilized for different dice across a wafer. As an illustrative example, wafer 20700 may include dice 20702, 20704, 20706, 20708, 20710, 20712, 20714, 20716, 20718, 20720, 20722 and 20724. Due to variations in process and device parameters across wafer 20700, which may be induced by, for example, manufacturing issues, each die, for example die 20702, on wafer 20700 may suitably operate at its own optimized write voltage. The optimized write voltage for die 20702 may be different than the optimized write voltage for die 20704, and so forth. During, for example, the test phase of wafer 20700 or individual dice, such as, for example, die 20702, tests may be conducted to determine the optimal write voltage for each die. This optimal write voltage may be stored on the floating body RAM die, such as die 20702, by using some type of non-volatile memory, such as, for example, metal or oxide fuse-able links, or intentional damage programming of floating-body RAM bits, or may be stored off-die, for example, on a different die within wafer 20700. Using an optimal write voltage for each die on a wafer may allow higher-speed, lower-power and more reliable floating-body RAM chips.

Persons of ordinary skill in the art will appreciate that the illustrations in FIG. 207 are exemplary only and are not drawn to scale. Such skilled persons will further appreciate that many variations may be possible such as, for example, while FIG. 207 discussed using optimal write voltages for each die on the wafer, each wafer in a wafer lot may have its own optimal write voltage that may be determined, for example, by tests conducted on circuits built on scribe lines of wafer 20700, a 'dummy' mini-array on wafer 20700, or a sample of floating-body RAM dice on wafer 20700. Moreover, interpolation or extrapolation of the test results from, such as, for example, scribe line built circuits or floating-body RAM dice, may be utilized to calculate and set the optimized programming voltage for untested dice. For example, optimized write voltages may be determined by testing and measurement of die 20702 and die 20722, and values of write voltages for die 20708 and die 20716 may be an interpolation calculation, such as, for example, to a linear scale. Many other modifications within the scope of the illustrated embodiments of the invention described herein will suggest themselves to such skilled persons after reading this specification. Thus the invention is to be limited only by the appended claims.

FIG. 208 illustrates an embodiment of the invention wherein optimized for different parts of a chip (or die) write voltages may be utilized. As an illustrative example, wafer 20800 may include chips 20802, 20804, 20806, 20808, 20810, 20812, 20814, 20816, 20818, 20820, 20822 and 20824. Each chip, such as, for example, chip 20812, may include a number of different parts or blocks, such as, for example, blocks 20826, 20828, 20830, 20832, 20834, 20836, 20838, 20840 and 20842. Each of these different parts or blocks may have its own optimized write voltage that may be determined by measurement of test circuits which may, for example, be built onto the memory die, within each block, or on another die. This optimal write voltage may be stored on the floating body RAM die, such as die 20802, by using some type of non-volatile memory, such as, for example, metal or oxide fuse-able links, or intentional damage programming of floating-body RAM bits, or may be stored off-die, for example, on a different die within wafer 20800, or may be stored within a block, such as block 20826.

FIG. 209 illustrates an embodiment of the invention wherein write voltages for floating-body RAM cells may be substantially or partly based on the distance of the memory cell from its write circuits. As an illustrative example, memory array portion 20900 may include bit-lines 20910, 20912, 20914 and 20916 and may include memory rows 20902, 20904, 20906 and 20908, and may include write driver circuits 20950. The memory row 20902 with memory cells may be farthest away from the write driver circuits 20950, and so, due to the large currents of floating-body RAM operation, may suffer a large IR drop along the wires. The memory row 20908 with memory cells may be closest to the write driver circuits 20950 and may have a low IR drop. Due to the IR drops, the voltage delivered to each memory cell of a row may not be the same, and may be significantly different. To tackle this issue, write voltages delivered to memory cells may be adjusted based on the distance from the write driver circuits. When the IR drop value may be known to be higher, which may be the scenario for memory cells farther away from the write driver circuits, higher write voltages may be used. When the IR drop may be lower, which may be the scenario for memory cells closer to the write driver circuits, lower write voltages may be used.

Write voltages may be tuned based on temperature at which a floating body RAM chip may be operating. This temperature based adjustment of write voltages may be useful since required write currents may be a function of the temperature at which a floating body RAM device may be operating. Furthermore, different portions of the chip or die may operate at different temperatures in, for example, an embedded memory application. Another embodiment of the invention may involve modulating the write voltage for different parts of a floating body RAM chip based on the temperatures at which the different parts of a floating body RAM chip operate. Refresh can be performed more frequently or less frequently for the floating body RAM by using its temperature history. This temperature history may be obtained by many methods, including, for example, by having reference cells and monitoring charge loss rates in these reference cells. These reference cells may be additional cells placed in memory arrays that may be written with known data. These reference cells may then be read periodically to monitor charge loss and thereby determine temperature history.

Figure 210A:
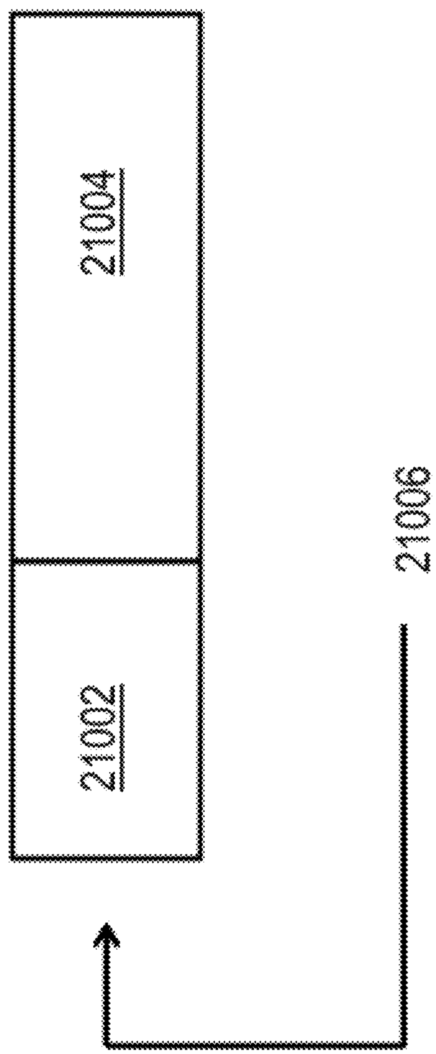
Figure 210B:
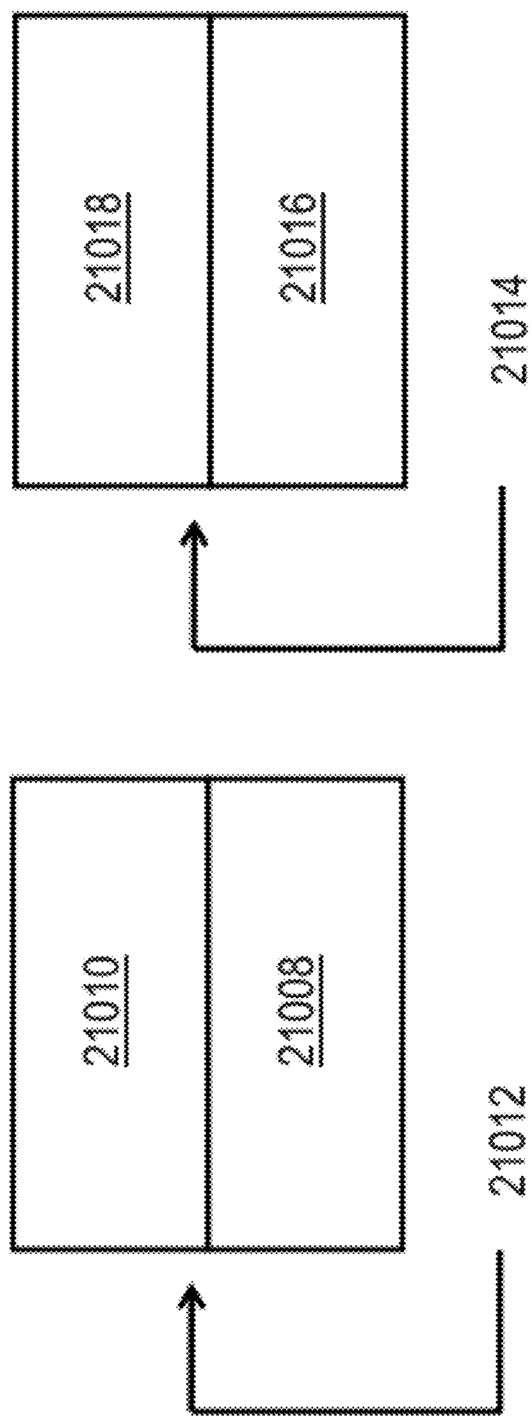
Figure 210C:
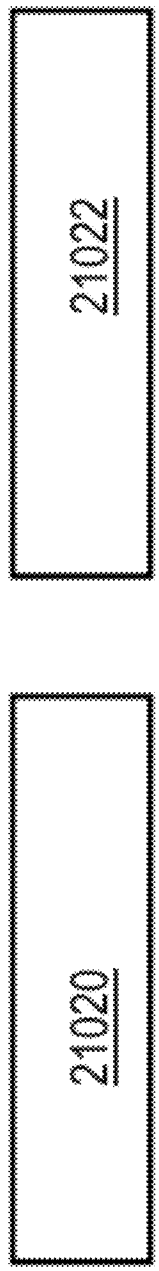

In FIG. 203 to FIG. 209, various techniques to improve floating-body RAM were described. Many of these techniques may involve addition of additional circuit functionality which may increase control of the memory arrays. This additional circuit functionality may be henceforth referred to as ‘controller circuits’ for the floating-body RAM array, or any other memory management type or memory regions described herein. FIG. 210A-C illustrates an embodiment of the invention where various configurations useful for controller functions are outlined. FIG. 210A illustrates a configuration wherein the controller circuits 21002 may be on the same chip 21006 as the memory arrays 21004. FIG. 210B illustrates a 3D configuration 21012 wherein the controller circuits may be present in a logic layer 21008 that may be stacked below the floating-body RAM layer 21010. As well, FIG. 210B illustrates an alternative 3D configuration 21014 wherein the controller circuits may be present in a logic layer 21018 that may be stacked above a floating-body RAM array 21016. 3D configuration 21012 and alternative 3D configuration 21014 may be constructed with 3D stacking techniques and methodologies, including, for example, monolithic or TSV. FIG. 210C illustrates yet another alternative configuration wherein the controller circuits may be present in a separate chip 21020 while the memory arrays may be present in floating-body chip 21022. The configurations described in FIG. 210A-C may include input-output interface circuits in the same chip or layer as the controller circuits. Alternatively, the input-output interface circuits may be present on the chip with floating-body memory arrays. The controller circuits in, for example, FIG. 210, may include memory management circuits that may extend the useable endurance of said memory, memory management circuits that may extend the proper functionality of said memory, memory management circuits that may control two independent memory blocks, memory management circuits that may modify the voltage of a write operation, and/or memory management circuits that may perform error correction and so on. Memory management circuits may include hardwired or soft coded algorithms.

Figure 211A:
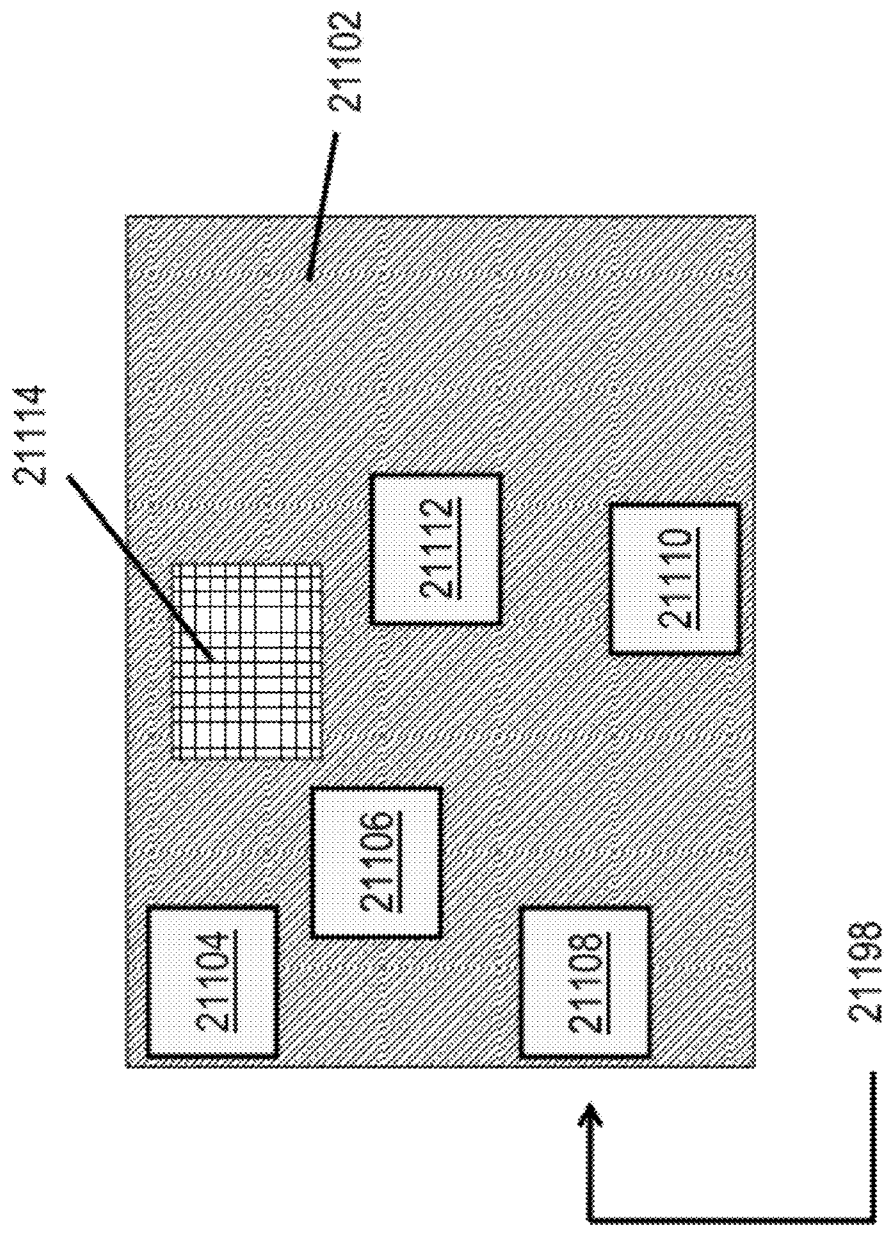
Figure 211B:
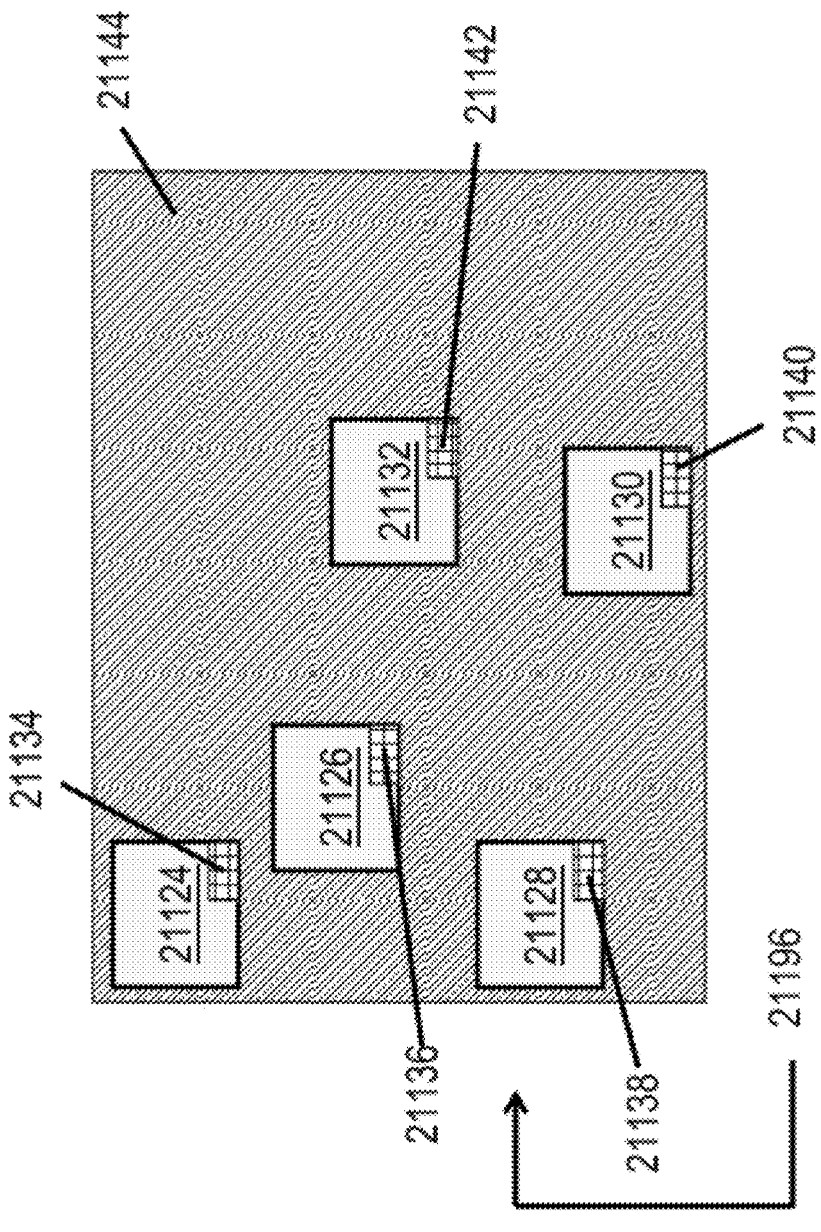

FIG. 211A-B illustrates an embodiment of the invention wherein controller functionality and architecture may be applied to applications including, for example, embedded memory. As an illustrated in FIG. 211A, embedded memory application die 21198 may include floating-body RAM blocks 21104, 21106, 21108, 21110 and 21112 spread across embedded memory application die 21198 and logic circuits or logic regions 21102. In an embodiment of the invention, the floating-body RAM blocks 21104, 21106, 21108, 21110 and 21112 may be coupled to and controlled by a central controller 21114. As illustrated in FIG. 211B, embedded memory application die 21196 may include floating-body RAM blocks 21124, 21126, 21128, 21130 and 21132 and associated memory controller circuits 21134, 21136, 21138, 21140 and 21142 respectively, and logic circuits or logic regions 21144. In an embodiment of the invention, the floating-body RAM blocks 21124, 21126, 21128, 21130 and 21132 may be coupled to and controlled by associated memory controller circuits 21134, 21136, 21138, 21140 and 21142 respectively.

FIG. 212 illustrates an embodiment of the invention wherein cache structure 21202 may be utilized in floating body RAM chip 21206 which may have logic circuits or logic regions 21244. The cache structure 21202 may have shorter block sizes and may be optimized to be faster than the floating-body RAM blocks 21204. For example, cache structure 21202 may be optimized for faster speed by the use of faster transistors with lower threshold voltages and channel lengths.

Furthermore, cache structure 21202 may be optimized for faster speed by using different voltages and operating conditions for cache structure 21202 than for the floating-body RAM blocks 21204.

Persons of ordinary skill in the art will appreciate that the illustrations in FIGS. 203 through 212 are exemplary only and are not drawn to scale. Such skilled persons will further appreciate that many variations may be possible such as, for example, many types of floating body RAM may be utilized and the invention may not be limited to any one particular configuration or type. For example, monolithic 3D floating-body RAM chips, 2D floating-body RAM chips, and floating-body RAM chips that might be 3D stacked with through-silicon via (TSV) technology may utilize the techniques illustrated with FIG. 203 to FIG. 212. Many other modifications within the scope of the illustrated embodiments of the invention described herein will suggest themselves to such skilled persons after reading this specification. Thus the invention is to be limited only by the appended claims.

FIG. 224 illustrates a floating-body RAM cell that may require lower voltages than previous cells and may operate without the use of high-field effects. In FIG. 224, 22402 may be a p-type substrate, 22404 may be an n-well region, 22406 may be a p+ region, 22408 may be a n+ region, 22410 may be a word-line, 22412 may be a gate dielectric, 22414 may be a p type region and 22416 may be a second n+ region. The device may be controlled with four terminals, represented by T1, T2, T3 and T4. Several bias schemes may be used with a device such as this one. Further details of this floating-body RAM cell and its bias schemes may be described in pending patent application 2011/0019482.

FIG. 225A-L illustrates an embodiment of the invention, wherein a horizontally-oriented monolithic 3D Floating-Body RAM array may be constructed that may not require high-field effects for write operations. One mask may utilized on a "per-memory-layer" basis for the monolithic 3D DRAM shown in FIG. 225A-L, and all other masks may be shared between different layers. The process flow may include the following steps which may be in sequence from Step (A) to Step (K). When the same reference numbers are used in different drawing figures (among FIG. 225A-K), the reference numbers may be used to indicate analogous, similar or identical structures to enhance the understanding of the invention by clarifying the relationships between the structures and embodiments presented in the various diagrams—particularly in relating analogous, similar or identical functionality to different physical structures.

Figure 225A:
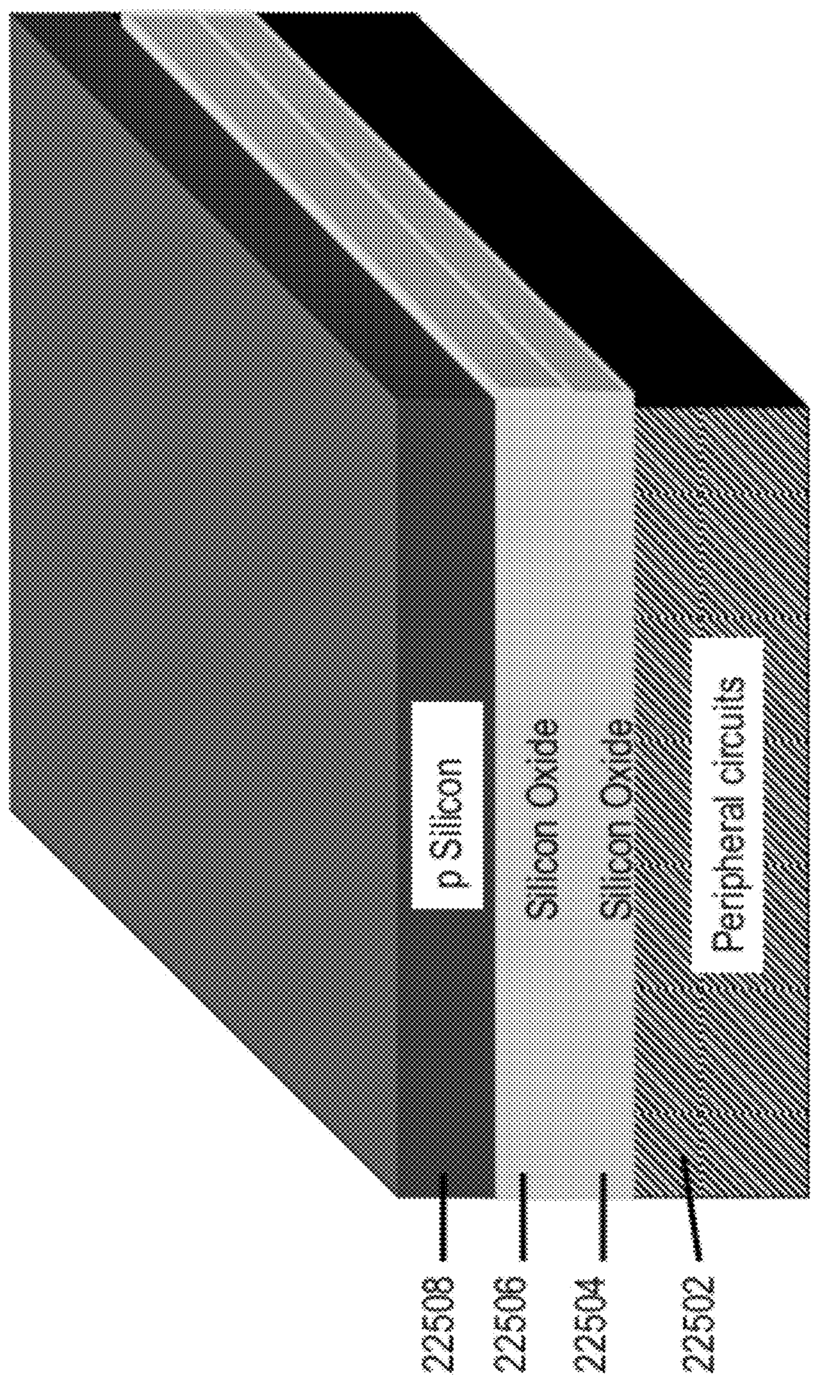

Step (A): FIG. 225A illustrates the structure after Step (A). Using procedures similar to those described in FIG. 223A-C, a monocrystalline p Silicon layer 22508 may be layer transferred atop peripheral circuits 22502. Peripheral circuits 22502 may utilize high temperature wiring (interconnect metal layers), made with metals, such as, for example, tungsten, and may include logic circuit regions. Oxide-to-oxide bonding between oxide layers 22504 and 22506 may be utilized for this transfer, in combination with ion-cut processes.

Figure 225B:
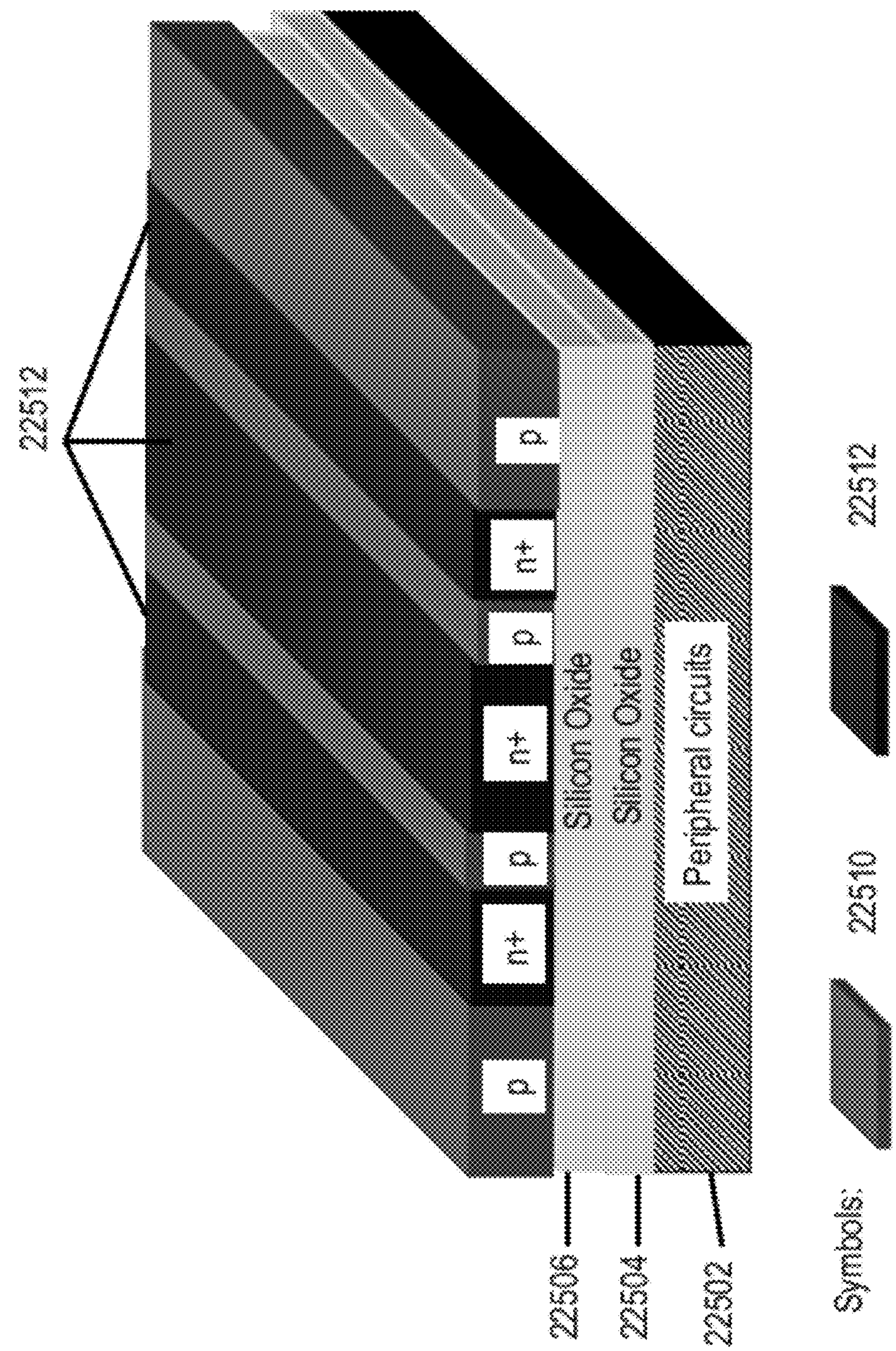

Step (B): FIG. 225B illustrates the structure after Step (B). Using a lithography step, implant processes and other process steps, n+ silicon regions 22512 may be formed. Thus p-silicon regions 22510 may be formed.

Figure 225C:
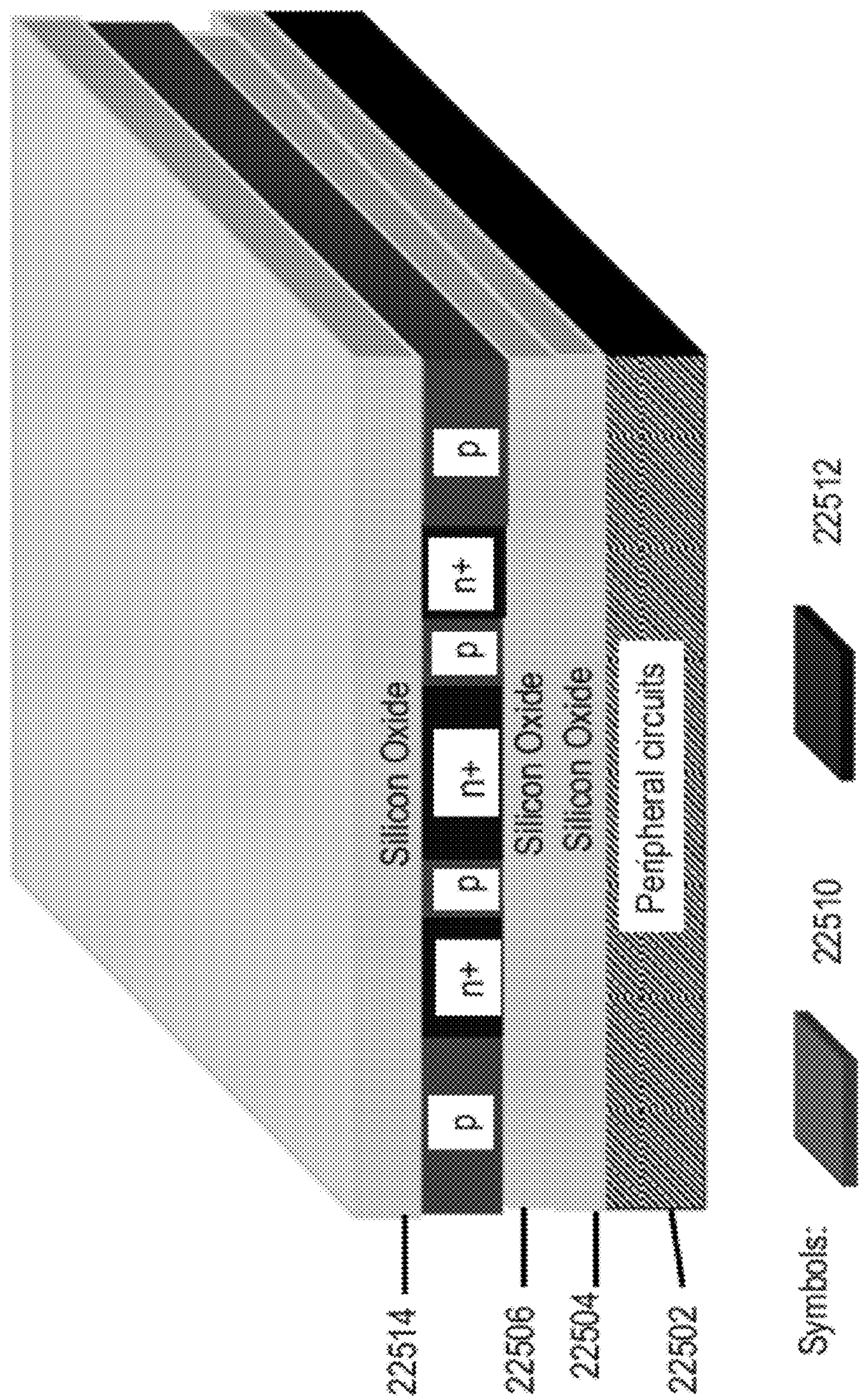

Step (C): FIG. 225C illustrates the structure after Step (C). An oxide layer 22514 may be deposited atop the structure shown in FIG. 225B.

Figure 225D:
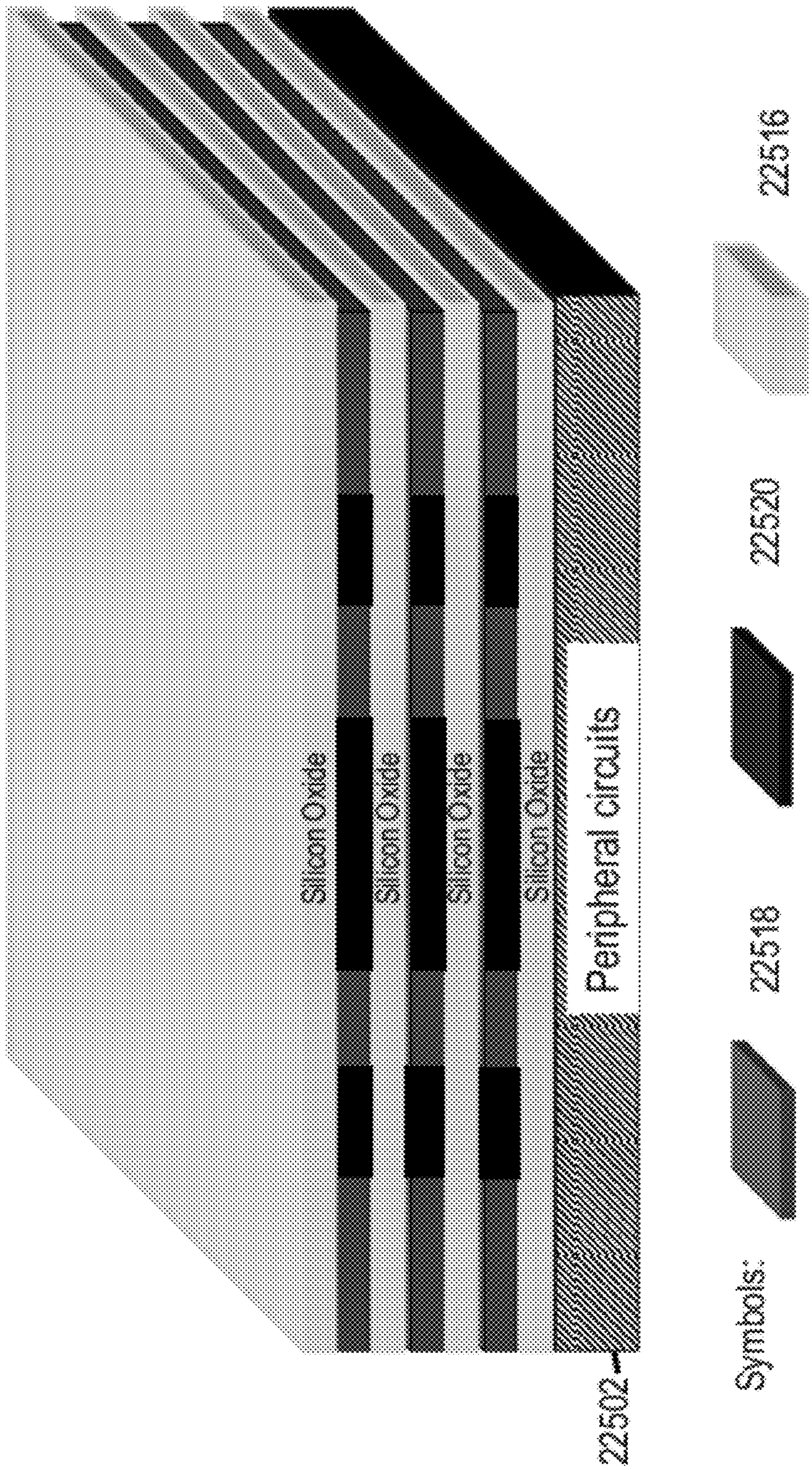

Step (D): FIG. 225D illustrates the structure after Step (D). Using methods similar to Steps (A), (B) and (C), multiple silicon layers having n+ silicon regions 22520 and p silicon regions 22518 may be formed with associated silicon oxide layers 22516. Oxide layer 22504 and oxide layer 22506, which were previously oxide-oxide bonded, are now illustrated as oxide layer 22516.

Figure 225E:
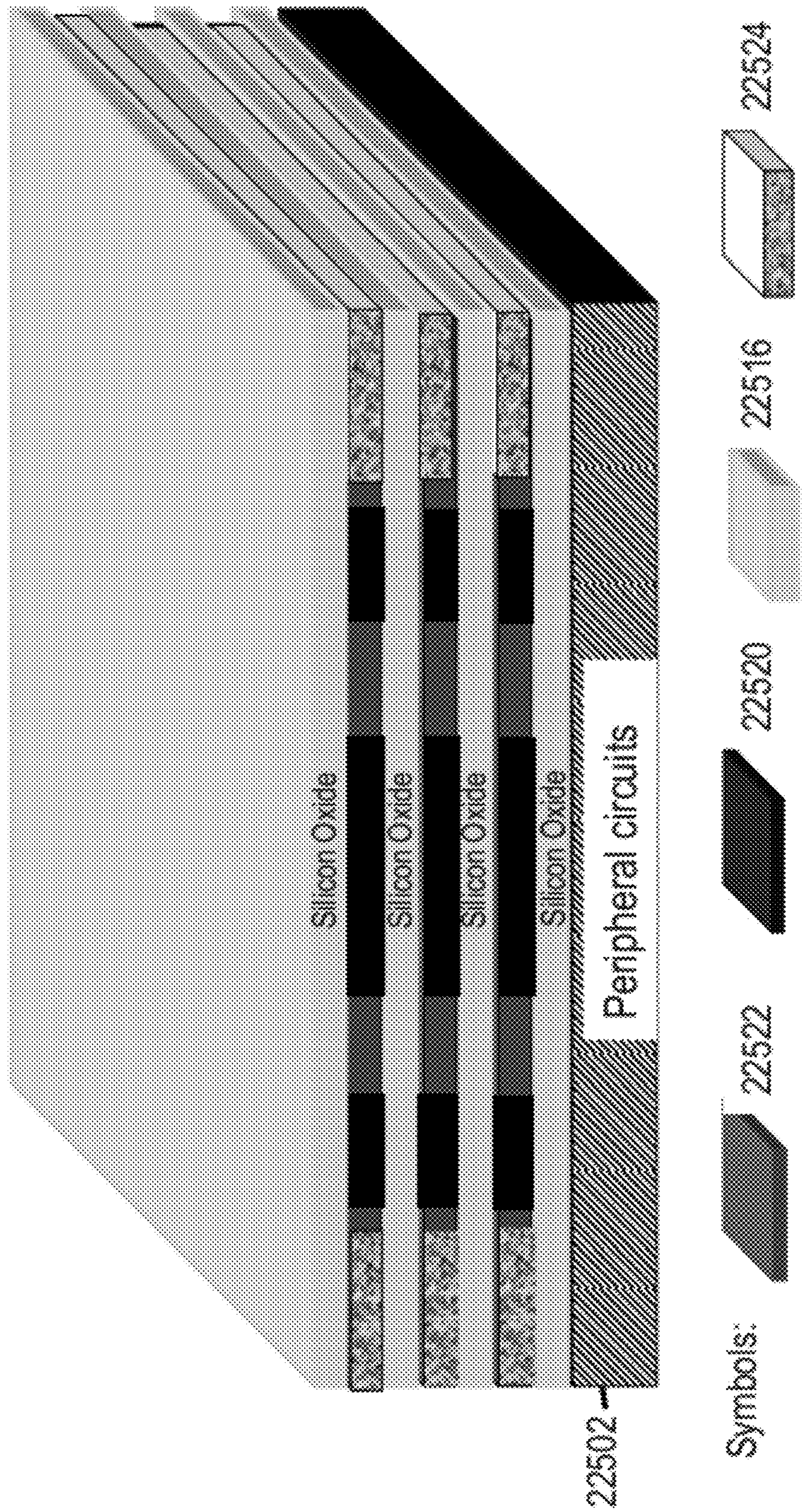

Step (E): FIG. 225E illustrates the structure after Step (E). Using lithography, multiple implant processes, and other steps such as resist strip, p+ silicon regions 22524 may be formed in multiple layers. 22522 may represent p silicon regions, 22520 may indicate n+ silicon regions and silicon oxide layers 22516. A Rapid Thermal Anneal (RTA) may be conducted to activate dopants in all layers. The multiple implant steps for forming p+ silicon regions 22524 may have different energies when doping each of the multiple silicon layers.

Figure 225F:
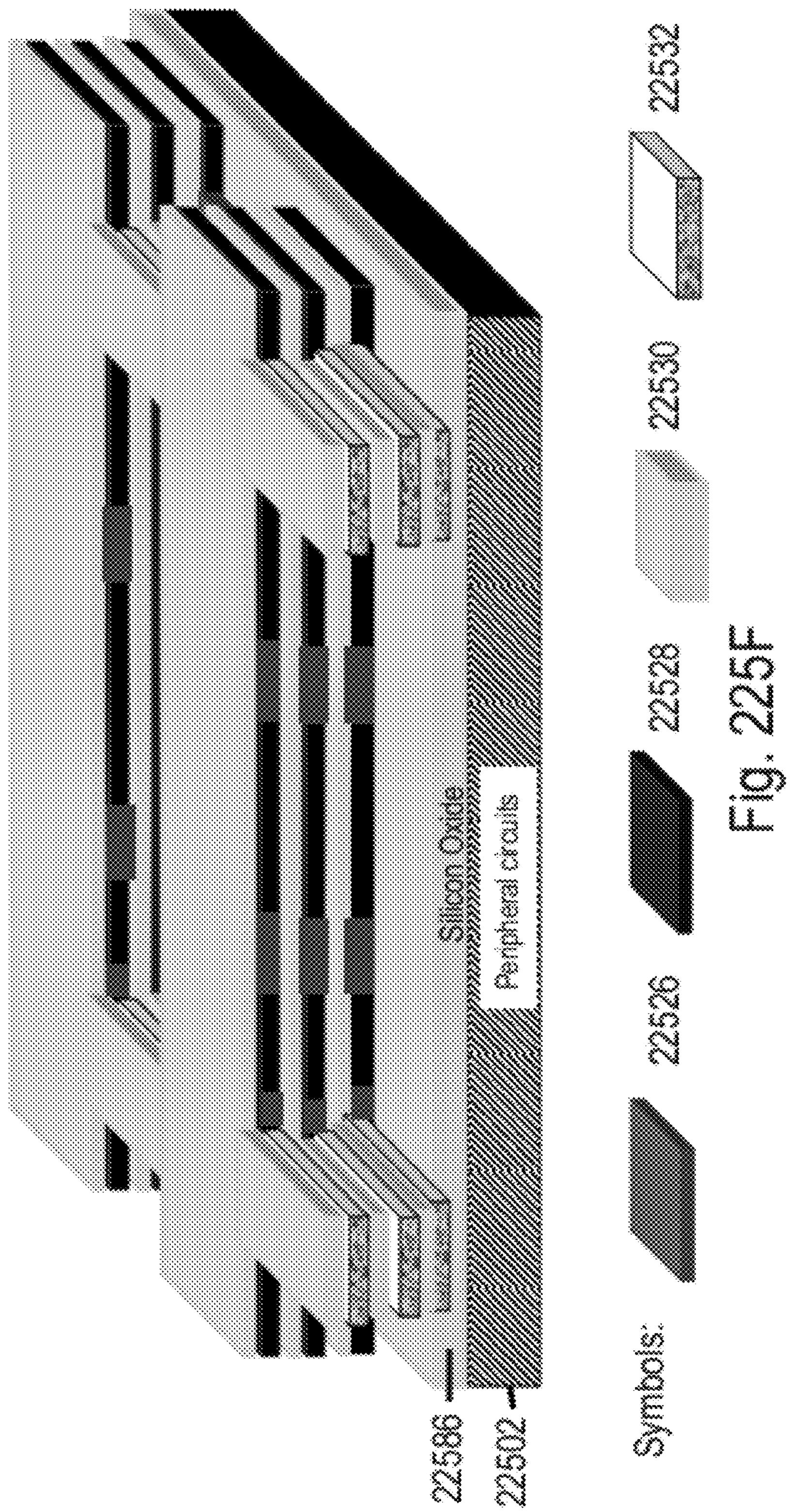

Step (F): FIG. 225F illustrates the structure after Step (F). Lithography and etch processes may then be utilized to make a structure as shown in the figure. The etch of multiple silicon layers and associated silicon oxide layers may stop on oxide layer 22586 (shown), or may extend into and etch a portion of oxide layer 22586 (not shown). Thus exemplary patterned oxide regions 22530 and patterned regions of n+ silicon 22528, p silicon 22526 and p+ silicon 22532 may be formed.

Figure 225G:
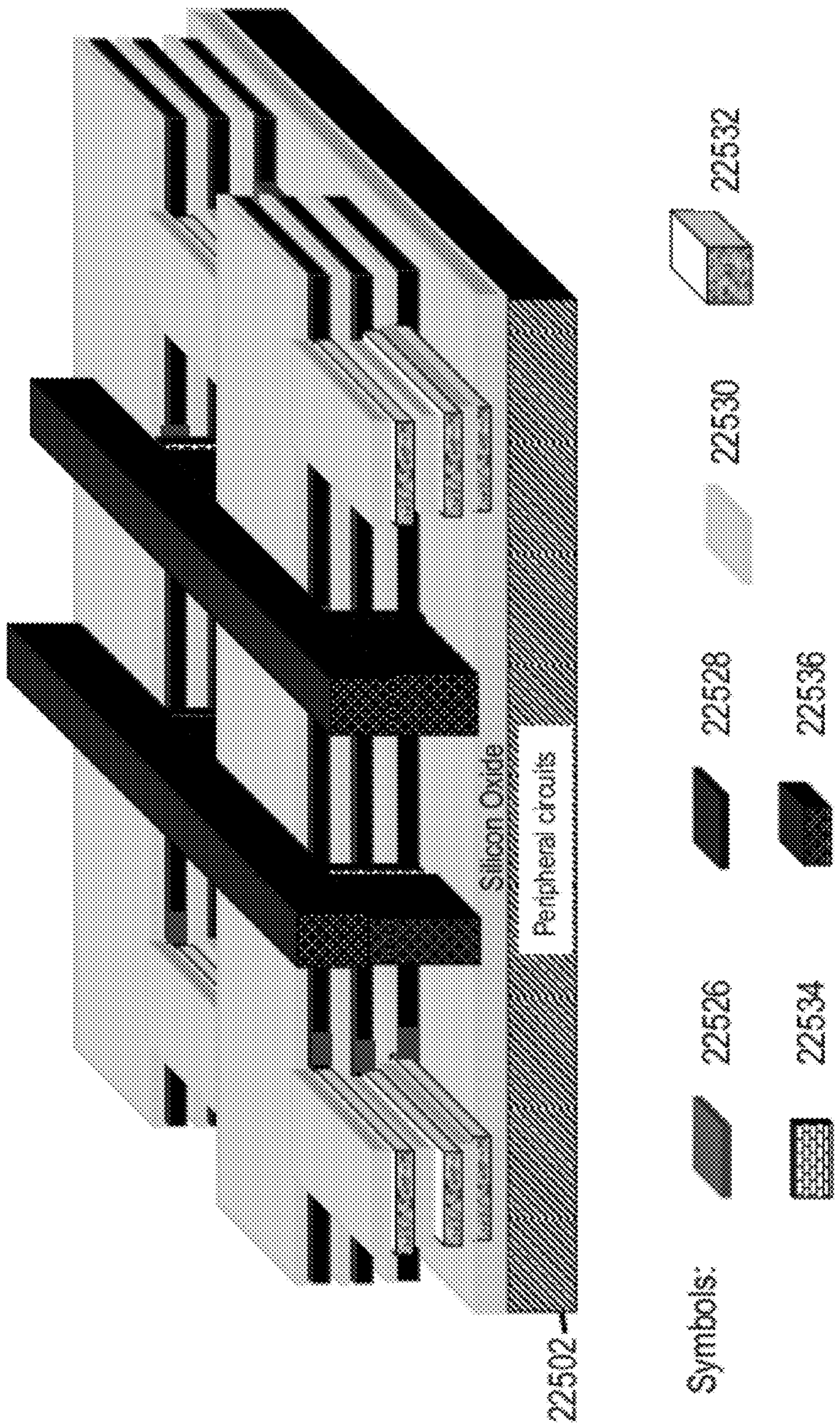

Step (G): FIG. 225G illustrates the structure after Step (G). A gate dielectric, such as, for example, silicon dioxide or hafnium oxides, and gate electrode, such as, for example, doped amorphous silicon or TiAlN, may be deposited and a CMP may be done to planarize the gate stack layers. Lithography and etch may be utilized to define the gate regions, thus gate dielectric regions 22534 and gate electrode regions 22536 may be formed.

Figure 225H:
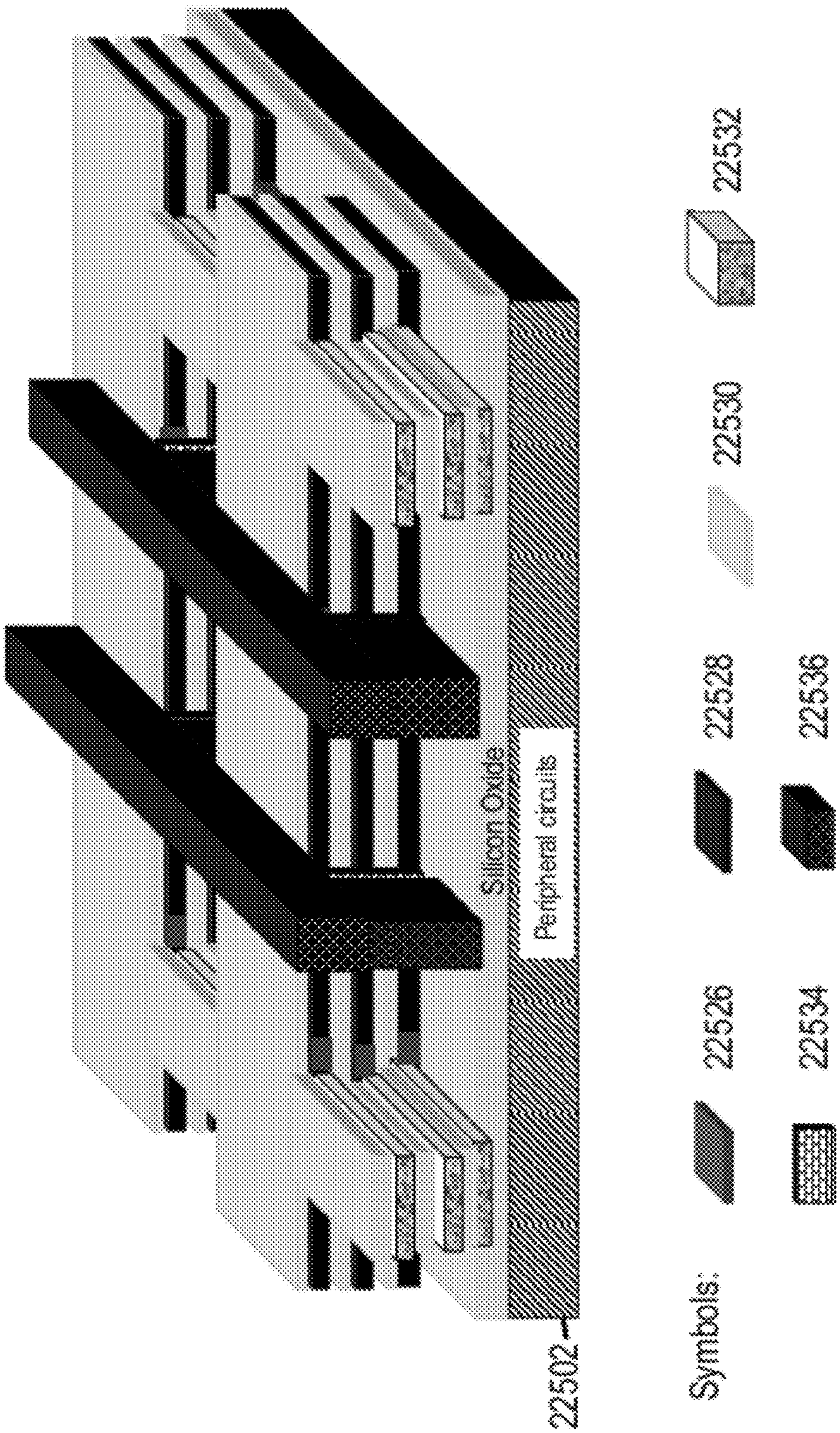

Step (H): FIG. 225H illustrates the structure after Step (H). Silicon dioxide (not shown) may be deposited and then planarized. In FIG. 225H and subsequent steps in the process flow, the overlying silicon dioxide regions may not be shown for clarity.

Figure 225I:
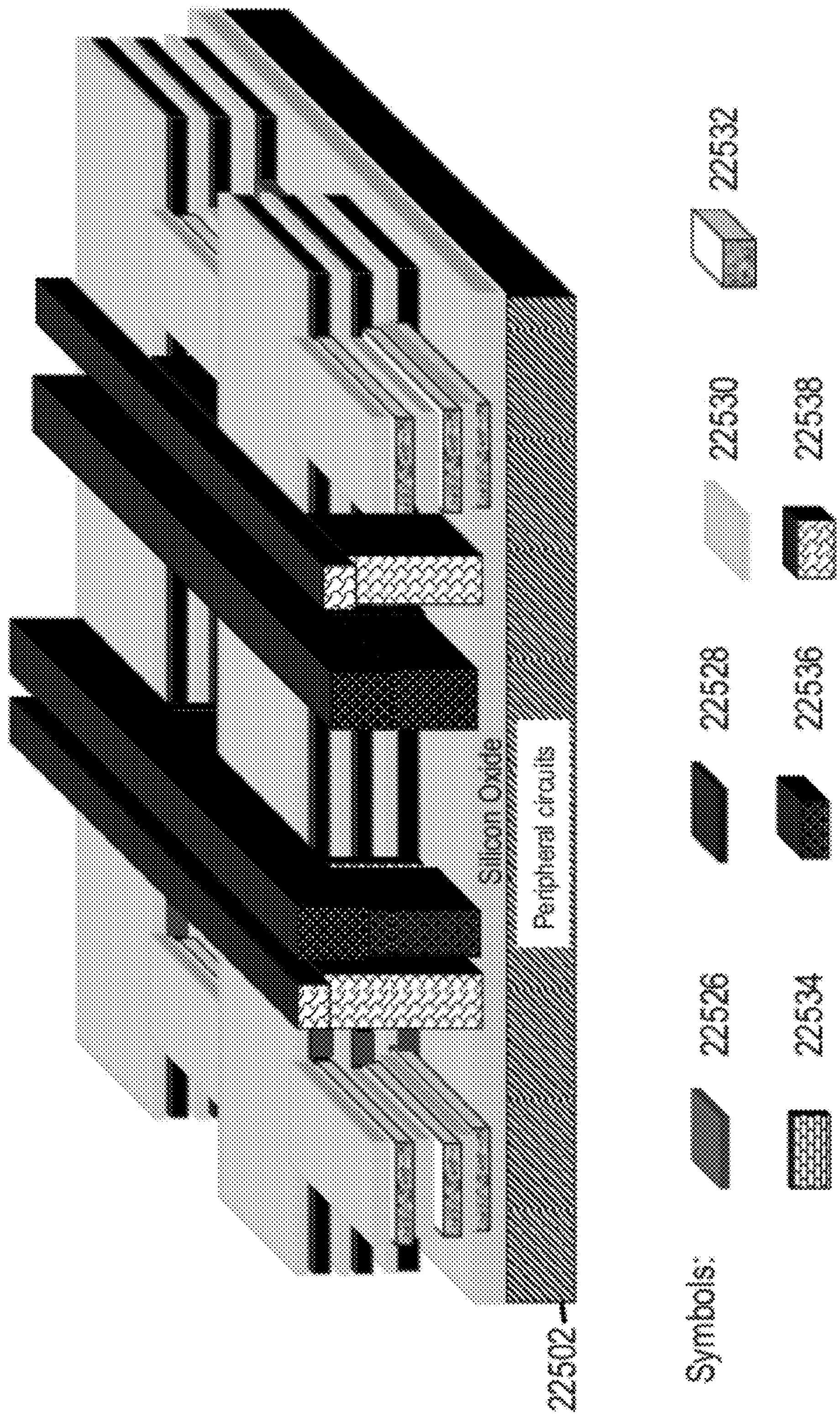

Step (I): FIG. 225I illustrates the structure after Step (I). Openings may be created within the (transparent) silicon oxide regions utilizing lithography and etch steps and other processes such as resist and residue cleaning A contact material which may include, such as, for example, metal silicide, may be formed in these openings following which a chemical mechanical polish step may be conducted to form conductive regions 22538.

Figure 225J:
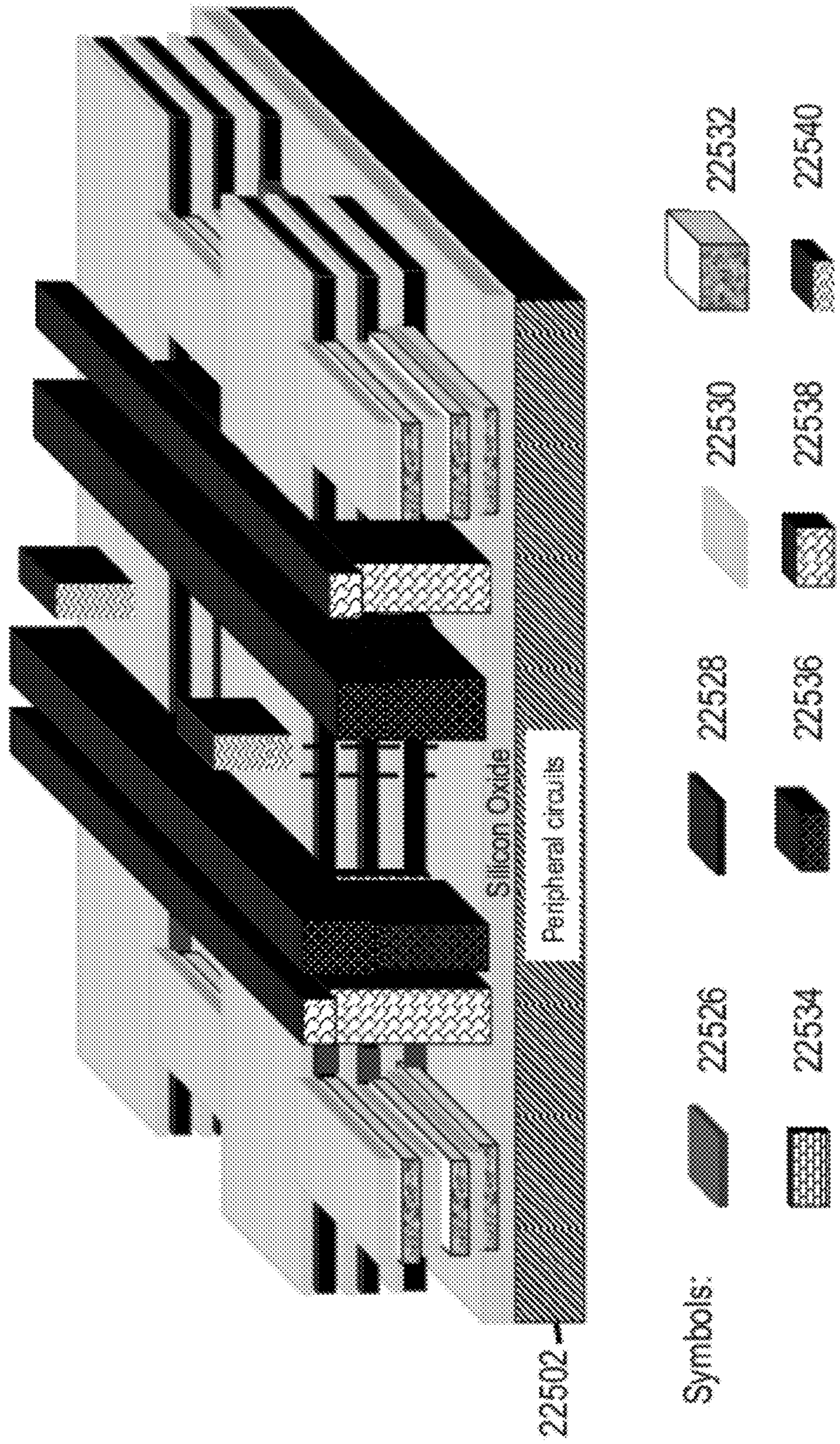

Step (J): FIG. 225J illustrates the structure after Step (J). A trench, for example two of which may be placed as shown in FIG. 225J, may be formed by lithography, etch and clean processes. The trench etch may etch multiple silicon layers and associated silicon oxide layers and may stop on oxide layer 22586 or may extend into and etch a portion of oxide layer 22586. A conductive contact material, such as aluminum, copper, tungsten and associated barrier metals, such as Ti/TiN, may then be filled in the trenches, thus forming conductive contact regions 22540.

Figure 225K:
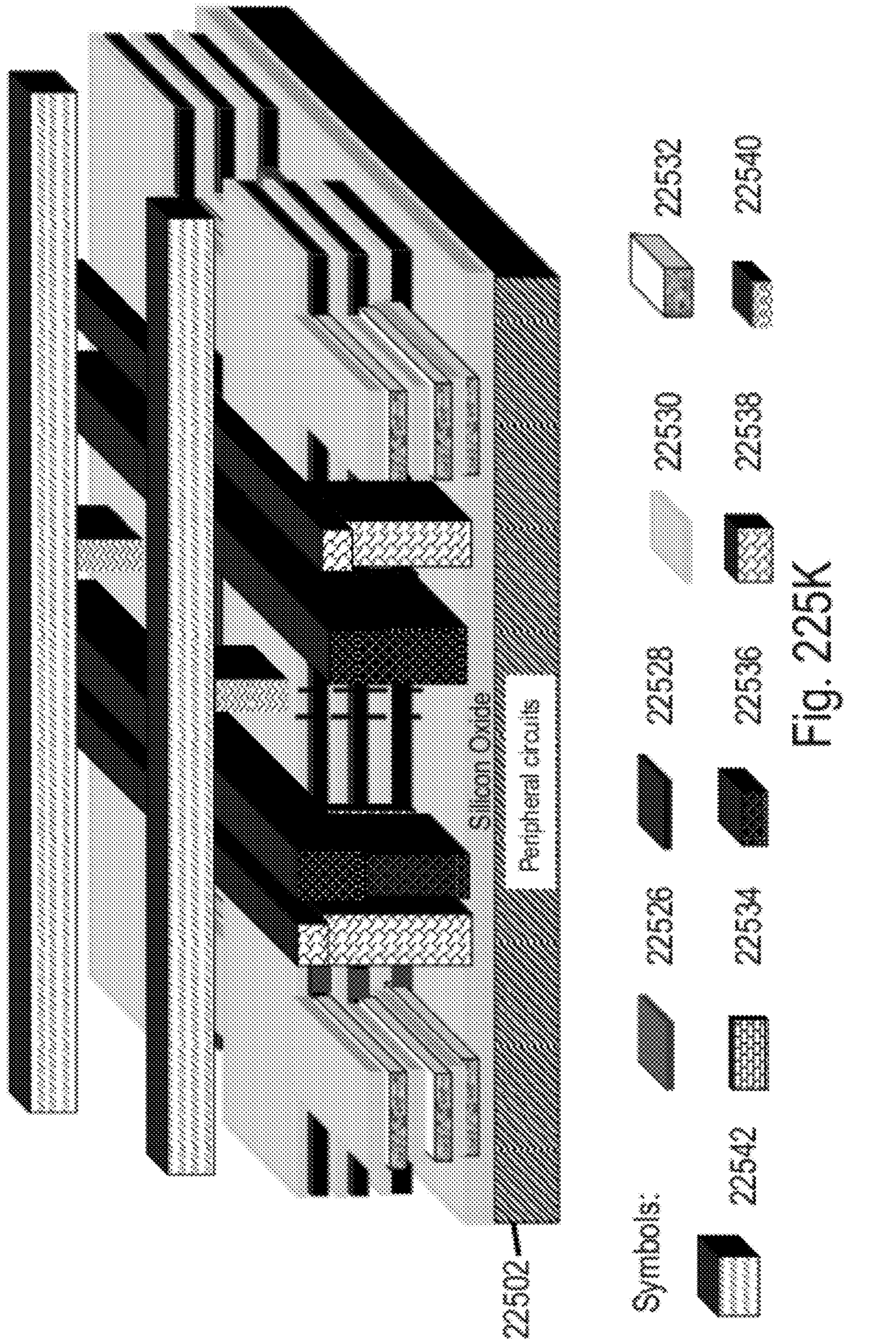

Step (K): FIG. 225K illustrates the structure after Step (K). Wiring 22542 may be formed. The terminals of memory cells may include conductive regions 22538, gate electrode regions 22536, p+ silicon regions 22532 and conductive contact regions 22540. Contacts may then be made to terminals of the memory array at its edges. Contacts to regions 22532 at the edges of the array can be made into stair-like structures using techniques described in "Bit Cost Scalable Technology with Punch and Plug Process for Ultra High Density Flash Memory," VLSI Technology, 2007 IEEE Symposium on, vol., no., pp. 14-15, 12-14 Jun. 2007 by Tanaka, H.; Kido, M.; Yahashi, K.; Oomura, M.; et al., following which contacts can be constructed to them. Formation of stair-like structures for regions 22532 at the edges of the array could be done in steps prior to Step (K) as well.

Figure 225L:
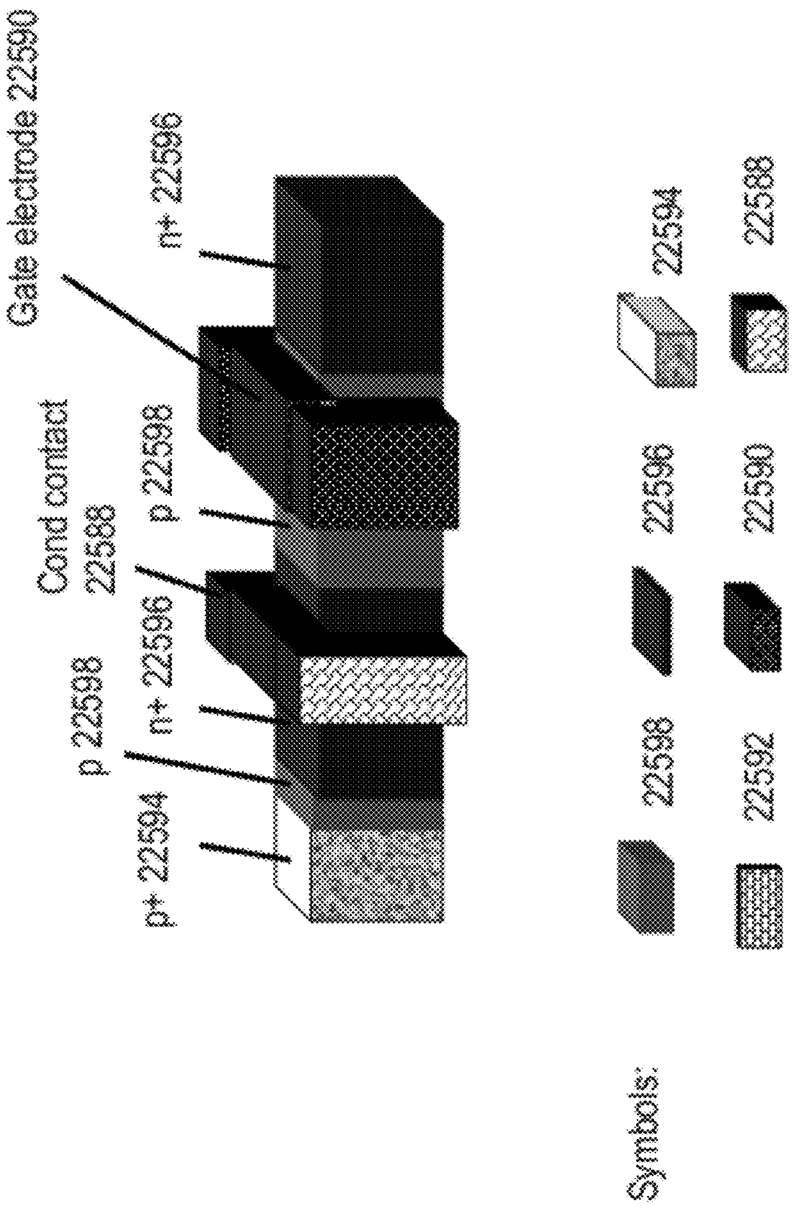

FIG. 225L illustrates a single cell of the memory array. p+ regions 22594, p regions 22598, n+ silicon regions 22596, gate dielectric regions 22592, gate electrode regions 22590 and conductive contact regions 22588 may be parts of the memory cell. This cell may be operated using bias schemes described in pending patent application 2011/0019482. Alternatively, some other bias scheme may be used.

A procedure for constructing a monolithic 3D DRAM has thus been described, with (1) horizontally-oriented transistors, (2) some of the memory cell control lines may be constructed of heavily doped silicon and embedded in the memory cell layer, (3) side gates simultaneously deposited over multiple memory layers for transistors, (4) monocrystalline (or single-crystal) silicon layers obtained by layer transfer techniques such as ion-cut, and (5) high-field effects may not be required for write operations. The transistors in the monocrystalline layer or layers may be horizontally oriented, i.e., current flowing in substantially the horizontal direction in transistor channels, substantially between drain and source, which may be parallel to the largest face of the substrate or wafer. The source and drain of the horizontally oriented transistors may be within the same monocrystalline layer. A transferred monocrystalline layer, such as p Silicon layer 22508, may have a thickness of less than about 150 nm.

Persons of ordinary skill in the art will appreciate that the illustrations in FIGS. 225A through 225L are exemplary only and are not drawn to scale. Such skilled persons will further appreciate that many variations may be possible such as, for example, layer transfer techniques other than the described hydrogen implant and ion-cut may be utilized. Moreover, while FIG. 225A-L described the procedure for forming a monolithic 3D DRAM with one mask per memory layer and all other masks may be shared among multiple memory layers, alternative procedures could be used. For example, p+ regions 22532 may be formed by using an additional lithography step on a "per-layer" basis that may not be shared among all memory layers. Alternatively, both p+ regions 22532 and n+ regions 22528 may be formed with multiple energy implants and masks shared among all memory layers. Alternatively, procedures similar to those described in patent application Ser. No. 13/099,010 may be used to construct the monolithic 3D DRAM. Alternatively, the directions of some or all of the wiring/terminals of the array may be perpendicular to the directions shown in FIG. 225A-K to enable easier biasing. The memory regions may have horizontally oriented transistors and vertical connections between the memory and logic/periphery layers may have a radius of less than 100 nm. These vertical connections may be vias, such as, for example, thru layer vias (TLVs), through the monocrystalline silicon layers connecting the stacked layers, for example, logic/periphery circuit regions within one monocrystalline layer to memory regions within another monocrystalline layer. Additional (e.g. third or fourth) monocrystalline layers that may have memory regions may be added to the stack. Decoders and other driver circuits of said memory may be part of the stacked logic circuit layer or logic circuit regions. Many other modifications within the scope of the illustrated embodiments of the invention will suggest themselves to such skilled persons after reading this specification. Thus the invention is to be limited only by the appended claims.

Refresh may be a key constraint with conventional capacitor-based DRAM. Floating-body RAM arrays may require better refresh schemes than capacitor-based DRAM due to the lower amount of charge they may store. Furthermore, with an auto-refresh scheme, floating-body RAM may be used in place of SRAM for many applications, in addition to being used as an embedded DRAM or standalone DRAM replacement.

FIG. 213 illustrates an embodiment of the invention wherein a dual-port refresh scheme may be utilized for capacitor-based DRAM. A capacitor-based DRAM cell 21300 may include capacitor 21310, select transistor 21302, and select transistor 21304. Select transistor 21302 may be coupled to bit-line 21320 at node 21306 and may be coupled to capacitor 21310 at node 21312. Select transistor 21304 may be coupled to bit-line 21321 at node 21308 and may be coupled to capacitor 21310 at node 21312. Refresh of the capacitor-based DRAM cell 21300 may be performed using the bit-line 21321 connected to node 21308, for example, and leaving the bit-line 21320 connected to node 21306 available for read or write, i.e., normal operation. This may tackle the key challenge that some memory arrays may be inaccessible for read or write during refresh operations. Circuits required for refresh logic may be placed on a logic region located either on the same layer as the memory, or on a stacked layer in the 3DIC. The refresh logic may include an access monitoring circuit that may allow refresh to be conducted while avoiding interference with the memory operation. The memory or memory regions may, for example, be partitioned such that one portion of the memory may be refreshed while another portion may be accessed for normal operation. The memory or memory regions may include a multiplicity of memory cells such as, for example, capacitor-based DRAM cell 21300.

Persons of ordinary skill in the art will appreciate that the illustrations in FIG. 213 are exemplary only and are not drawn to scale. Such skilled persons will further appreciate that many variations may be possible such as, for example, a dual-port refresh scheme may be used for standalone capacitor based DRAM, embedded capacitor based DRAM that may be on the same chip or on a stacked chip, and monolithic 3D DRAM with capacitors. Moreover, refresh of the capacitor-based DRAM cell 21300 may be performed using the bit-line 21320 connected to node 21306 and leaving the bit-line 21321 connected to node 21308 available for read or write. Many other modifications within the scope of the illustrated embodiments of the invention described herein will suggest themselves to such skilled persons after reading this specification. Thus the invention is to be limited only by the appended claims.

Other refresh schemes may be used for monolithic 3D DRAMs and for monolithic 3D floating-body RAMs similar to those described in US patent application 2011/0121366 and in FIG. 200A-J of this patent application. For example, refresh schemes similar to those described in "The ideal SoC memory: 1T-SRAM™," *Proceedings of the ASIC/SOC Conference*, pp. 32-36, 2000 by Wingyu Leung, Fu-Chieh Hsu and Jones, M.-E may be used for any type of floating-body RAM. Alternatively, these types of refresh schemes may be used for monolithic 3D DRAMs and for monolithic 3D floating body RAMs similar to those described in US patent application 2011/0121366 and in FIG. 200A-J of this patent application. Refresh schemes similar to those described in "Autonomous refresh of floating body cells", Proceedings of the Intl. Electron Devices Meeting, 2008 by Ohsawa, T.; Fukuda, R.; Higashi, T.; et al. may be used for monolithic 3D DRAMs and for monolithic 3D floating body RAMs similar to those described in US patent application 2011/0121366 and in FIG. 200A-J of this patent application.

FIG. 214 illustrates an embodiment of the invention in which a double gate device may be used for monolithic 3D floating-body RAM wherein one of the gates may utilize tunneling for write operations and the other gate may be biased to behave like a switch. As an illustrative example, nMOS double-gate DRAM cell 21400 may include n+ region 21402, n+ region 21410, oxide regions 21404 (partially shown for illustrative clarity), gate dielectric region 21408 and associated gate electrode region 21406, gate dielectric region 21416 and associated gate electrode region 21414, and p-type channel region 21412. nMOS double-gate DRAM cell 21400 may be formed utilizing the methods described in FIG. 200A-J of this patent application. For example, the gate stack including gate electrode region 21406 and gate dielectric region 21408 may be designed and electrically biased during write operations to allow tunneling into the p-type channel region 21412. The gate dielectric region 21408 thickness may be thinner than the mean free path for trapping, so that trapping phenomena may be reduced or eliminated.

Persons of ordinary skill in the art will appreciate that the illustrations in FIG. 214 are exemplary only and are not drawn to scale. Such skilled persons will further appreciate that many variations may be possible such as, for example, a pMOS transistor may be used in place of or in complement to nMOS double gate DRAM cell 21400. Moreover, nMOS double gate DRAM cell 21400 may be used such that one gate may be used for refresh operations while the other gate may be used for standard write and read operations. Furthermore, nMOS double-gate DRAM cell 21400 may be formed by method such as described in US patent application 20110121366. Many other modifications within the scope of the illustrated embodiments of the invention described herein will suggest themselves to such skilled persons after reading this specification. Thus the invention is to be limited only by the appended claims.

FIG. 215A illustrates a conventional chip with memory wherein peripheral circuits 21506 may substantially surround memory arrays 21504, and logic circuits or logic regions 21502 may be present on the die. Memory arrays 21504 may need to be organized to have long bit-lines and word-lines so that peripheral circuits 21506 may be small and the chip's array efficiency may be high. Due to the long bit-lines and word-lines, the energy and time needed for refresh operations may often be unacceptably high.

FIG. 215B illustrates an embodiment of the invention wherein peripheral circuits may be stacked monolithically above or below memory arrays using techniques described in patent application 2011/0121366, such as, for example, monolithic 3D stacking of memory and logic layers. Memory array stack 21522 may include memory array layer 21508 which may be monolithically stacked above peripheral circuit layer 21510. Memory array stack 21524 may include peripheral circuits 21512 which may be monolithically stacked above memory array layer 21514. Memory array stack 21522 and Memory array stack 21524 may have shorter bit-lines and word-lines than the configuration shown in FIG. 215A since reducing memory array size may not increase die size appreciably (since peripheral circuits may be located underneath the memory arrays). This may allow reduction in the time and energy needed for refresh.

FIG. 215C illustrates an embodiment of the invention wherein peripheral circuits may be monolithically stacked above and below memory array layer 21518 using techniques described in US patent application 2011/0121366, such as, for example, monolithic 3D stacking of memory and logic layers including vertical connections. 3D IC stack 21500 may include peripheral circuit layer 21520, peripheral circuit layer 21516, and memory array layer 21518. Memory array layer 21518 may be monolithically stacked on top of peripheral circuit layer 21516 and then peripheral circuit layer 21520 may then be monolithically stacked on top of memory array layer 21518. This configuration may have shorter bit-lines and word-lines than the configuration shown in FIG. 215A and may allow shorter bit-lines and word-lines than the configuration shown in FIG. 215B. 3D IC stack 21500 may allow reduction in the time and energy needed for refresh. A transferred monocrystalline layer, such as, for example, memory array layer 21518 and peripheral circuit layer 21520, may have a thickness of less than about 150 nm.

Persons of ordinary skill in the art will appreciate that the illustrations in FIGS. 215A through 215C are exemplary only and are not drawn to scale. Such skilled persons will further appreciate that many variations may be possible such as, for example, 3D IC stack may include, for example, two memory layers as well as two logic layers. Many other modifications within the scope of the illustrated embodiments of the invention described herein will suggest themselves to such skilled persons after reading this specification. Thus the invention is to be limited only by the appended claims.

FIG. 216 illustrates the cross-section of a floating body with embedded n layer NMOSFET 21600 with n+ source region 21604, n+ drain region 21606, p-well body 21608, gate metal and gate dielectric stack 21602, n layer/region 21610, and p substrate 21612. The n+ source region 21604, n+ drain region 21606, and p-well body 21608 may be of typical NMOSFET doping. As an embodiment of the invention, n layer/region 21610 may be formed by dopant ion implantation and dopant activation or by layer transfer below the p-well body 21608 of the floating body NMOSFET. Thus an NPN Bipolar Junction Transistor (BJT), referred hereafter as the embedded BJT, may be formed using the n+ source region 216014 as the emitter, the p-well body 21608 (floating) as the base, and the underlying n layer/region 21610 as the collector.

Figure 217A:
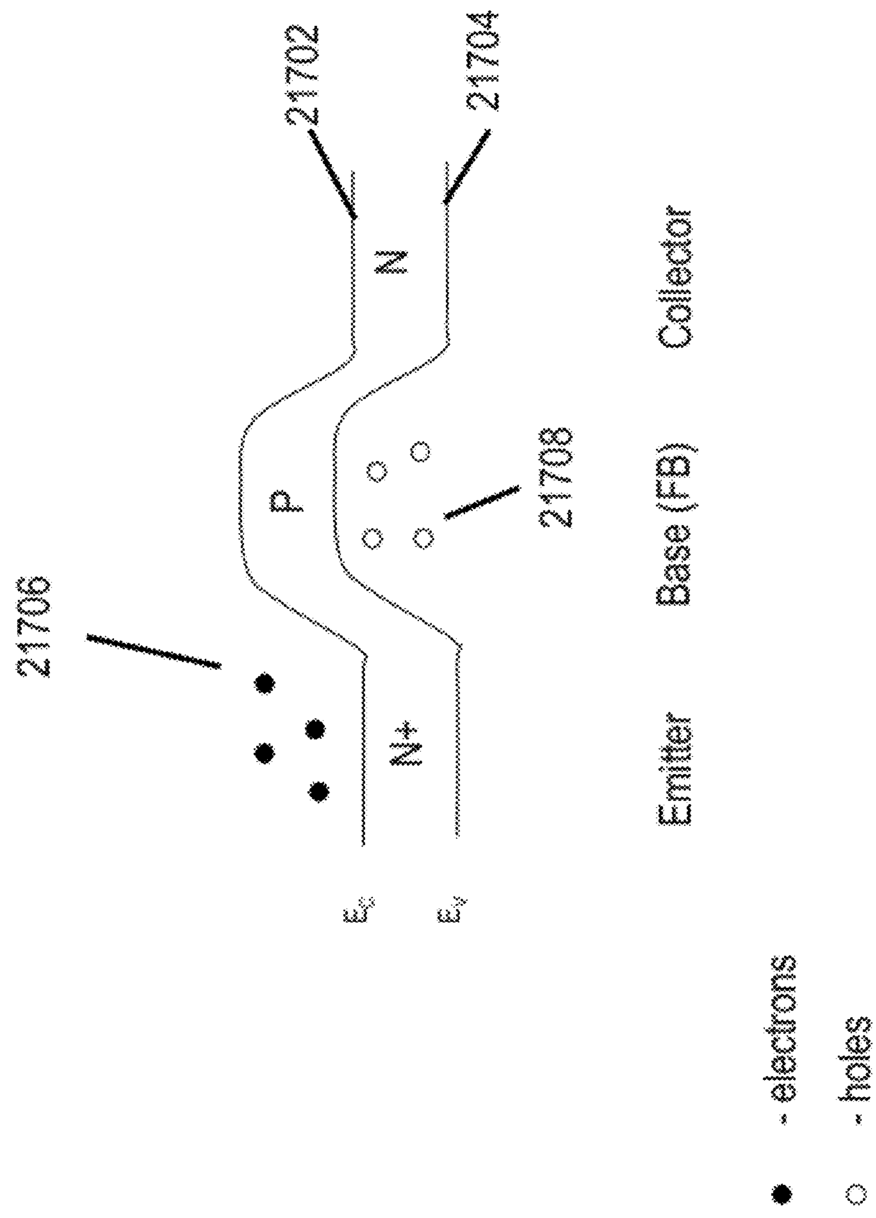
Figure 217B:
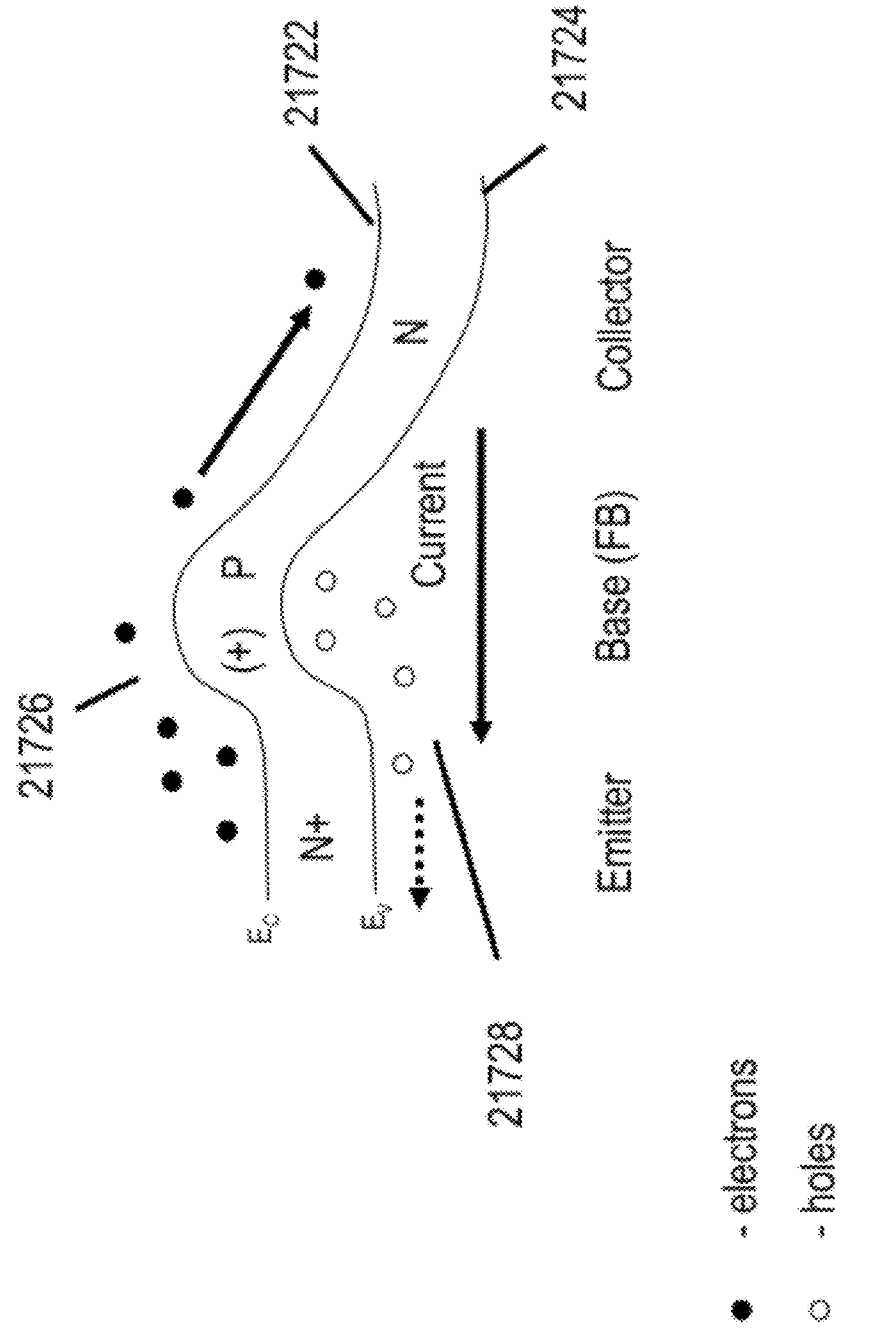
Figure 217C:
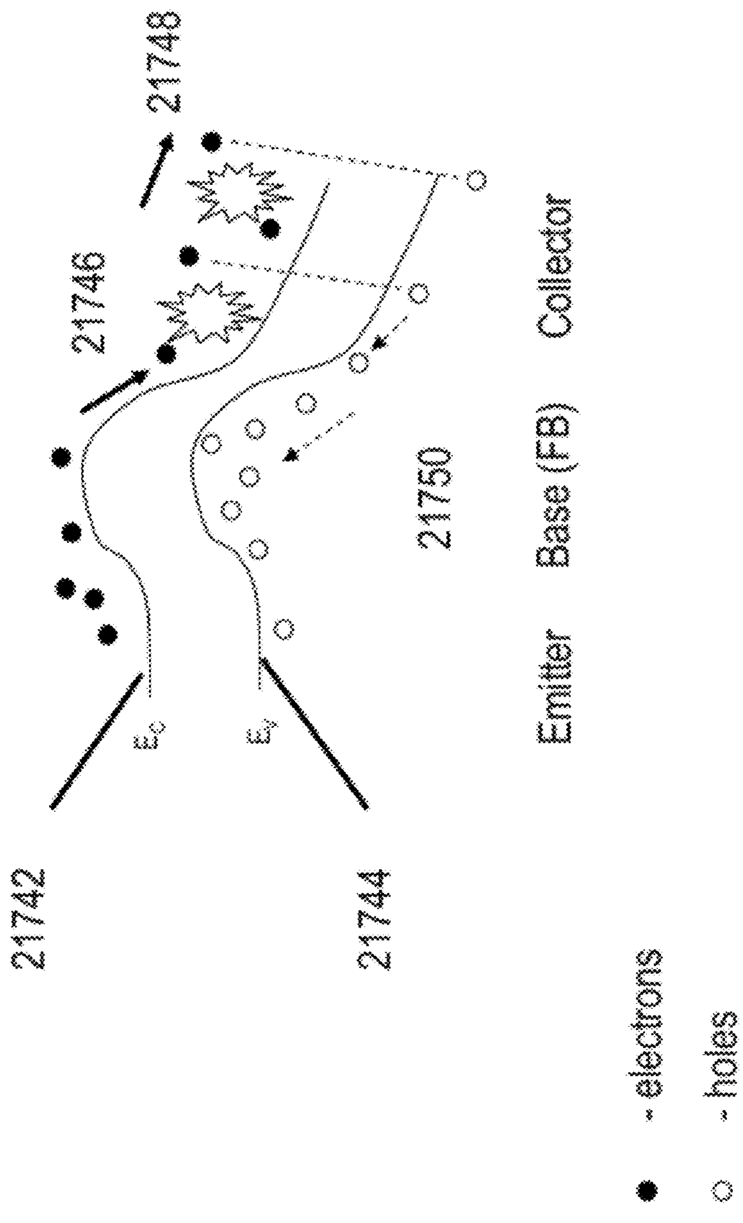

FIGS. 217A-C illustrate the behavior of the embedded BJT during the floating body operation, programming, and erase. The horizontal direction may indicate position within the transistor and the vertical direction may indicate the energy level of the electrons and holes and energy bands. "Emitter" in FIG. 217A-C may represent n+ source region 21604, "Base (FB)" in FIG. 217A-C may represent p-well body 21608 (floating), and "Collector" in FIG. 217A-C may represent n layer region/region 21610.

FIG. 217A illustrates the electronic band diagram of the embedded BJT when there may be only a small concentration of holes in the p-well body 21608. The conduction band 21702, valence band 21704, electrons 21706, and holes in p-well body 21708 are shown under this condition where there may be low hole concentration in the p-well body 21708, and the embedded BJT may remain turned off, with no current flowing through the BJT, regardless of collector bias.

FIG. 217B illustrates the electronic band diagram of the embedded BJT when there may be a significant concentration of holes in the p base region that may be enough to turn on the p-n diode formed by the p-well body 21708 and the emitter n+ source region 21704. The conduction band 21722, valence band 21724, electrons 21726, and holes 21728 are shown under this condition where there may be significant concentration of holes in the p-well body 21708, and the embedded BJT may turn on. The p-base region potential may allow electrons to flow from the emitter to the base, and the holes to flow from the base to the emitter. The electrons that arrive at the base and do not recombine may continue on to the collector and may then be swept towards the collector terminal by the collector reverse bias.

FIG. 217C illustrates the BJT band diagram with the impact ionization process 21746 which may create electron-hole pairs in the collector region given high enough collector bias to generate a field of at least approximately 1E6 V/cm in the said region. The BJT band diagram includes conduction band 21742, valence band 21744. The newly generated electrons flow in the direction of the collector terminal 21748, together with the original electrons, while the newly generated holes flow in the opposite direction towards the base/floating body 21750. This flow of holes into the base/floating body region acts to refresh the floating body such that they add to the hole population in the base/floating body 21750. Henceforth, this refresh scheme may be referred to as the "embedded BJT floating body refresh scheme".

In order to give favorable conditions for impact ionization to occur in the collector region, it may be desired to keep the BJT gain □=IC/IB as high as possible. Thus, the p-base/p-well body 21608 among the two n regions n+ source region 21604 and n+ drain region 21606 may be designed to be about 50 nm or thinner, and the p base/p-well body 21608 and collector n layer/region 21610 may be highly doped with a value greater than approximately 1E18/cm3 for providing a high electric field favorable to the impact ionization process.

Moreover, a heterostructure bipolar transistor (HBT) may be utilized in the floating body structure by using silicon for the emitter region material, such as n+ source region 21604 in FIG. 216, and SiGe for the base and collector regions, such as p-well body 21608 and the underlying n layer/region 21610 respectively, as shown in FIG. 216, thus giving a higher beta than a regular BJT.

FIG. 218 illustrates the energy band alignments of Silicon 21802 with bandgap of 1.1 eV, Si conduction band 21810, Si valence band 21812, and Germanium 21804 with bandgap of 0.7 eV, Ge conduction band 21820, Ge valence band 21822. The offset between the Si conduction band 21810 and the Ge conduction band 21820 may be −0.14 eV, and the offset between the Si Si valence band 21812 and the Ge valence band 21822 may be −0.26 eV. Persons of ordinary skill in the art will recognize that SiGe will have band offsets in its conduction and valence bands in linear proportion to the molar ratio of its Silicon and Germanium components. Thus, the HBT will have most of its band alignment offset in the valence band, thereby providing favorable conditions in terms of a valence band potential well for collecting and retaining holes.

Figure 219A:
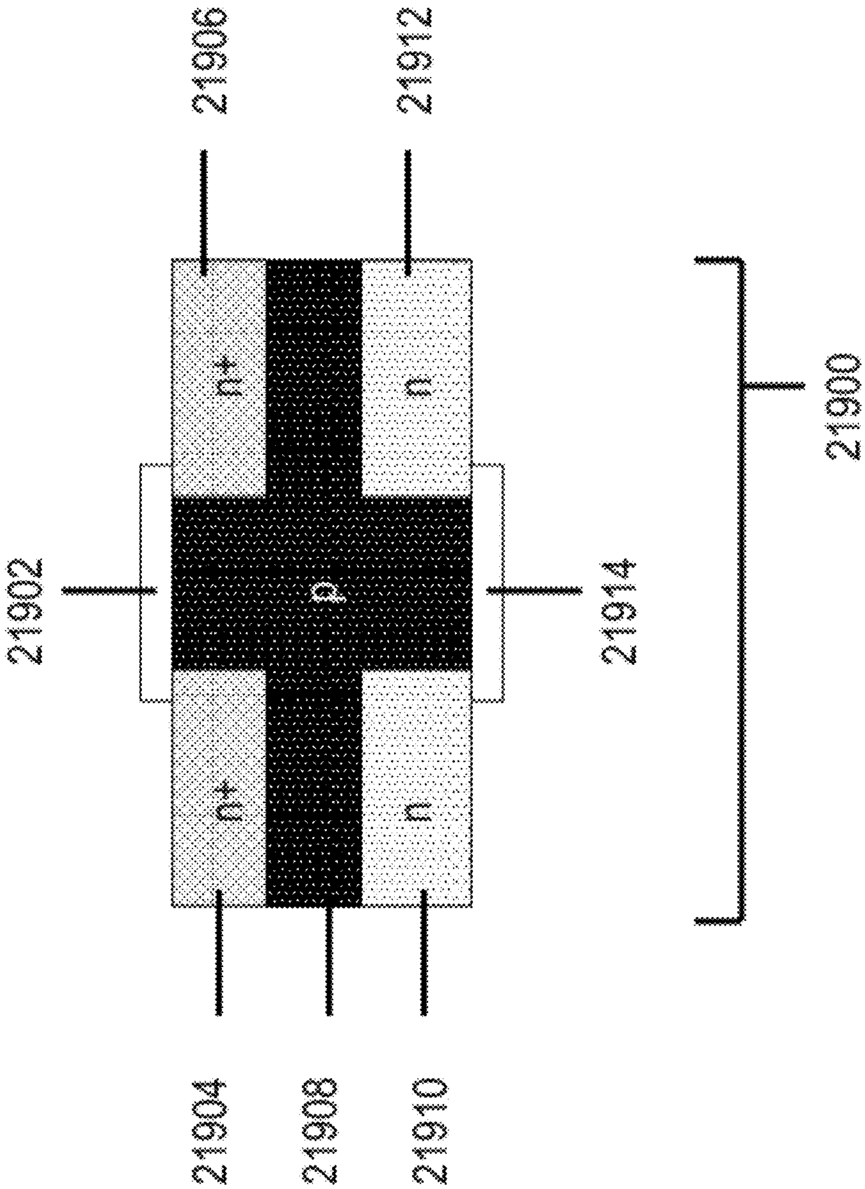

FIG. 219A illustrates the cross-section of a floating body NMOSFET 21900 with top gate metal and dielectric stack 21902 and bottom gate metal and dielectric stack 21914, source/emitter n+ region 21904, n+ drain region 21906, p floating body 21908, n collector region 21910, and second n collector region 21912.

As an embodiment of the invention, n collector region 21910 and second n collector region 21912 may be formed by dopant ion implantation and dopant activation, using the same mask (self-aligned) as for the source region 21904 and drain region 21906, but with higher implant energies.

The embedded BJT structure formed by source/emitter n+ region 21904, p floating body 21908, n collector region 21910 can be used for the embedded BJT floating body refreshing scheme as discussed above. The bottom gate metal and dielectric stack 21914 may be biased with a negative voltage to increase hole retention. The second n collector region 21912 may be utilized to further optimize hole generation, by acting together with n+ drain region 21906 and p floating body 21908 as another BJT substructure utilizing the embedded BJT floating body refresh scheme above. The bottom gate metal and dielectric stack 21914 can be used with the bottom MOSFET structure, including n collector region 21910, p floating body 21908, second n collector region 21912, and bottom gate and dielectric stack 21914, for hole generation.

Figure 219B:
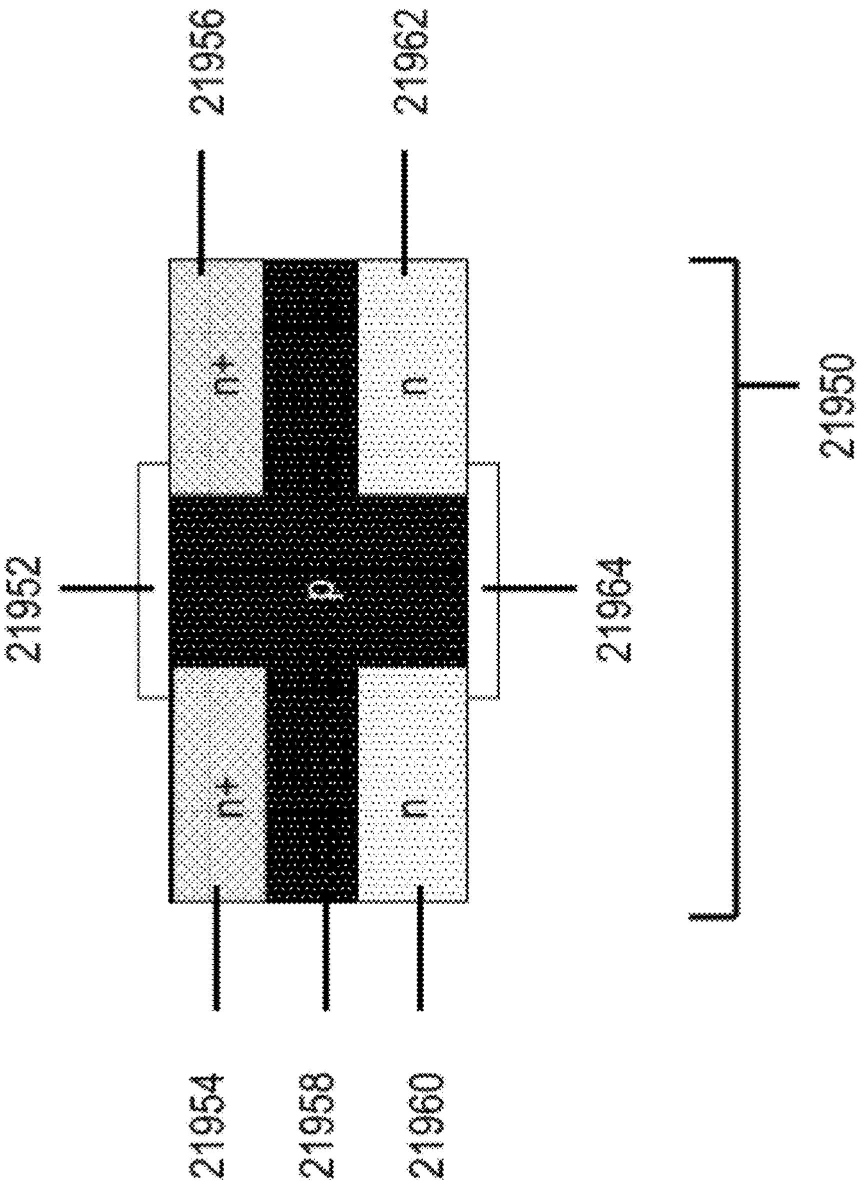

FIG. 219B illustrates the top view of an embodiment of the invention, the device 21950 including gate metal and dielectric stack 21952 formed on a side of the p floating body 21958, and second gate metal and dielectric stack 21964 formed on the opposite side of the p floating body 21958, source/emitter n+ region 21954, n+ drain region 21956, n collector region 21960, and second n collector region 21962.

The source/emitter n+ region 21954, n+ drain region 21956, n collector region 21960, and second n collector region 21962 may be formed via dopant ion implantation and dopant activation with the geometry defined using a lithographic mask.

The embedded BJT structure formed by source/emitter n+ region 21954, p floating body 21958, n collector region 21960 may be used for the embedded BJT floating body refresh scheme as discussed above. The second gate metal and dielectric stack 21964 may be biased with a negative voltage to increase hole retention. The second n collector region 21962 may be utilized to further optimize hole generation, by acting together with n+ drain region 21956 and p floating body 21958 as another BJT substructure utilizing the embedded BJT floating body refresh scheme above. The second gate metal and dielectric stack 21964 may be used with the second MOSFET substructure, which may include n collector region 21960, p floating body 21958, second n collector region 21962, and second gate and dielectric stack 21964, for hole generation.

FIG. 220 illustrates the cross-section of a FinFET floating body structure 22000 with surrounding gate dielectrics 22002 on three sides of the channel (only the top gate stack is shown), n+ source region 22004, n+ drain region 22006, p floating body 22008, and n collector region 22014 on the bottom side of the floating body 22008 insulated from the source and drain regions by oxide regions 22010 and 22012. A spacer patterning technology using a sacrificial layer and a chemical vapor deposition spacer layer developed by Y-K Choi et al (IEEE TED vol. 49 no. 3 2002) may be used to pattern the Silicon fin for the FinFET. As an embodiment of the invention, n collector region 22014 may be formed by dopant ion implantation and dopant activation, and oxide regions 22010 and 22012 may be formed by ion implantation of oxygen which, upon thermal anneal, may react with silicon to form the oxide.

The embedded BJT structure formed by n+ source region 22004 as emitter, p floating body 22008 as base, n collector region 22014 may be used for the embedded BJT floating body refresh scheme as discussed above.

FIG. 221 illustrates a back-to-back two-transistor configuration 22100 where n+ drain region 22106, n+ source/emitter region 22108, p floating body region 22112 and gate metal and dielectric stack 22102 may form a NMOSFET transistor used for the reading and programming p floating body region 22112 N+ source/emitter region 22108 as emitter, p floating body region 22112 as base, and n+ collector region 22110 may form a BJT transistor which may be used for the embedded BJT floating body refreshing scheme described above. The dummy gate and dielectric stack 22104 may remain unbiased, and the source/emitter region 22108 may be tied to ground during device operation. Using a conventional CMOS planar 2D flow, n+ drain region 22106, n+ source/emitter region 22108, and n+ collector region 22110 may be formed by a self-aligned to gate dopant ion implantation and thermal anneal, and the gate dielectrics of gate metal and dielectric stack 22102 and dummy gate metal and dielectric stack 22104 may be formed by oxide growth and/or deposition.

FIG. 222 illustrates a side-to-side two-transistor configuration 22200 where n+ drain region 22206, n+ source/emitter region 22208, p floating body region 22212 and gate metal and dielectric stack 22202 may form a NMOSFET transistor used for the reading and programming of the p floating body region 22212. N+ source/emitter region 22208 as emitter, p floating body region 22212 as base, and n+ collector 22210 may form a BJT transistor which may be used for the embedded BJT floating body refreshing scheme described above. The dummy gate and dielectric stack 22204 may remain unbiased, and the source/emitter region 22208 may be tied to ground during device operation. Using a conventional CMOS planar 2D flow, n+ drain region 22206, n+ source/emitter region 22208, and n+ collector region 22210 may be formed by a self-aligned to gate dopant ion implantation and thermal anneal, and the gate dielectrics of gate metal and dielectric stack 22202 and dummy gate metal and dielectric stack 22204 may be formed by oxide growth and/or deposition.

Persons of ordinary skill in the art will appreciate that the illustrations in FIGS. 216 through 222 are exemplary only and are not drawn to scale. Such skilled persons will further appreciate that many variations may be possible such as, for example, a PNP embedded BJT may be constructed by constructing p type regions in the place of the n type regions shown, and n type regions in the place of the p regions shown. Additionally, n layer/region 21610 may be a formed region. Moreover, n+ source region 21604, n+ drain region 21606, and p-well body 21608 doping concentrations may be factors of about 10 and 100 different than above. Further, gate metal and dielectric stacks, such as gate metal and dielectric stack 22202, may be formed with Hi-k oxides, such as, for example, hafnium oxides, and gate metals, such as, for example, TiAlN. Many other modifications within the scope of the invention described herein will suggest themselves to such skilled persons after reading this specification. Thus the invention is to be limited only by the appended claims.

As described previously, activating dopants in standard CMOS transistors at less than about 400° C.-450° C. may be a potential challenge. For some compound semiconductors, dopants can be activated at less than about 400° C. Some embodiments of the invention involve using such compound semiconductors, such as, for example, antimonides (e.g. InGaSb), for constructing 3D integrated circuits and chips.

The process flow shown in FIG. 228A-F describes an embodiment of the invention wherein techniques may be used that may lower activation temperature for dopants in silicon to less than about 450° C., and potentially even lower than about 400° C. The process flow could include the following steps that occur in sequence from Step (A) to Step (F). When the same reference numbers are used in different drawing figures (among FIG. 228A-F), they are used to indicate analogous, similar or identical structures to enhance the understanding of the present invention by clarifying the relationships between the structures and embodiments presented in the various diagrams—particularly in relating analogous, similar or identical functionality to different physical structures.

Figures 228A, 228B, 228C, 228D:
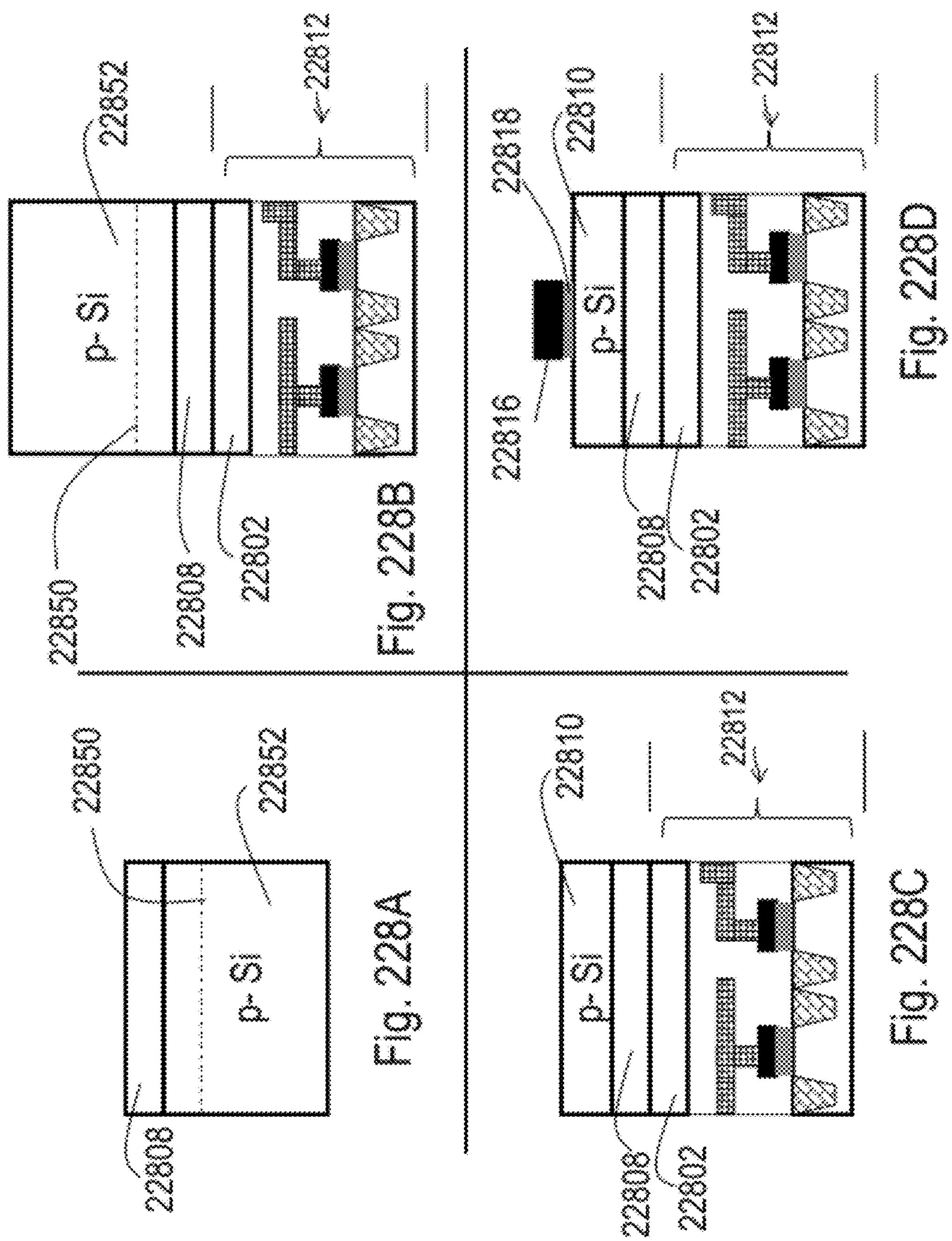

Step (A) is illustrated using FIG. 228A. A p− Silicon wafer 22852 with activated dopants may have an oxide layer 22808 deposited atop it. Hydrogen could be implanted into the wafer at a certain depth to form hydrogen plane 22850 indicated by a dotted line. Alternatively, helium could be used.

Step (B) is illustrated using FIG. 228B. A wafer with transistors and wires may have an oxide layer 22802 deposited atop it to form the structure 22812. The structure shown in FIG. 228A could be flipped and bonded to the structure 22812 using oxide-to-oxide bonding of oxide layer 22802 and oxide layer 22808.

Step (C) is illustrated using FIG. 228C. The structure shown in FIG. 228B could be cleaved at its hydrogen plane 22850 using a mechanical force, thus forming p− layer 22810. Alternatively, an anneal could be used. Following this, a CMP could be conducted to planarize the surface.

Step (D) is illustrated using FIG. 228D. Isolation regions (not shown) between transistors can be formed using a shallow trench isolation (STI) process. Following this, a gate dielectric 22818 and a gate electrode 22816 could be formed using deposition or growth, followed by a patterning and etch.

Figure 228F:
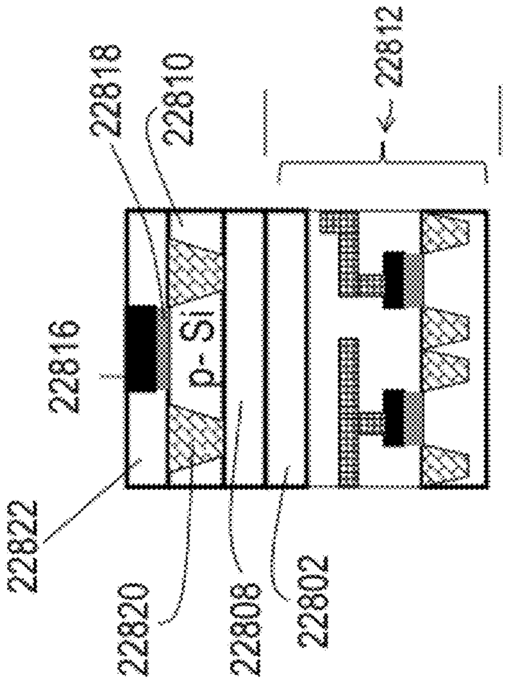
Figure 228E:
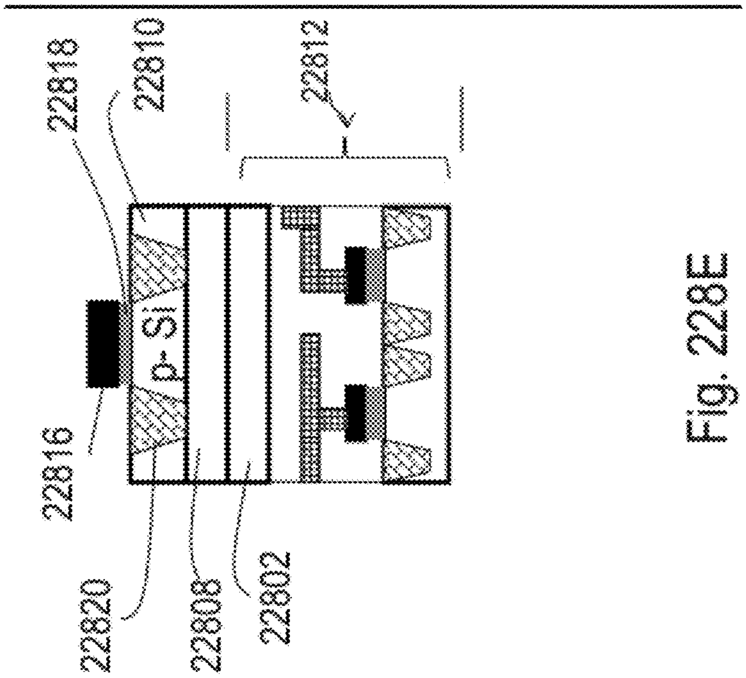

Step (E) is illustrated using FIG. 228E, and involves forming and activating source-drain regions. One or more of the following processes can be used for this step.

(i) A hydrogen plasma treatment, which may inject hydrogen into p− layer 22810, can be conducted, following which dopants for source and drain regions 22820 can be implanted. Following the implantation, an activation anneal can be performed using a rapid thermal anneal (RTA). Alternatively, an optical anneal, such as a laser anneal, could be used. Alternatively, a spike anneal or flash anneal could be used. Alternatively, a furnace anneal could be used. Hydrogen plasma treatment before source-drain dopant implantation is known to reduce temperatures for source-drain activation to be less than about 450° C. or even less than about 400° C. Further details of this process for forming and activating source-drain regions are described in "Mechanism of Dopant Activation Enhancement in Shallow Junctions by Hydrogen", Proceedings of the Materials Research Society, Spring 2005 by A. Vengurlekar, S. Ashok, Christine E. Kalnas, Win Ye. This embodiment of the invention advantageously uses this low-temperature source-drain formation technique in combination with layer transfer techniques and produces 3D integrated circuits and chips.

(ii) Alternatively, another process can be used for forming activated source-drain regions. Dopants for source and drain regions 22820 can be implanted, following which a hydrogen implantation can be conducted. Alternatively, some other atomic species can be used. An activation anneal can then be conducted using a RTA. Alternatively, a furnace anneal or spike anneal or laser anneal can be used. Hydrogen implantation is known to reduce temperatures required for the activation anneal. Further details of this process are described in U.S. Pat. No. 4,522,657. This embodiment of the invention advantageously uses this low-temperature source-drain formation technique in combination with layer transfer techniques and produces 3D integrated circuits and chips. PLAD (PLasma Assisted Doping) may also be utilized for hydrogen incorporation into the monocrystalline silicon, plasma immersion implantation of the desired dopant ions, and low temperature activation of the desired ions. The wafer or substrate may be heated, for example, typically 250° C. to 600° C. during the H PLAD.

While (i) and (ii) described two techniques of using hydrogen to lower anneal temperature requirements, various other methods of incorporating hydrogen to lower anneal temperatures could be used.

(iii) Alternatively, another process can be used for forming activated source-drain regions. The wafer could be heated up when implantation for source and drain regions 22820 is carried out. Due to this, the energetic implanted species is subjected to higher temperatures and can be activated at the same time as it is implanted. Further details of this process can be seen in U.S. Pat. No. 6,111,260. This embodiment of the invention advantageously uses this low-temperature source-drain formation technique in combination with layer transfer techniques and produces 3D integrated circuits and chips.

(iv) Alternatively, another process could be used for forming activated source-drain regions. Dopant segregation techniques (DST) may be utilized to efficiently modulate the source and drain Schottky barrier height for both p and n type junctions. These DSTs may utilized form a dopant segregated Schottky (DSS-Schottky) transistor. Metal or metals, such as platinum and nickel, may be deposited, and a silicide, such as Ni0.9Pt0.1Si, may formed by thermal treatment or an optical treatment, such as a laser anneal, following which dopants for source and drain regions 22820 may be implanted, such as arsenic and boron, and the dopant pile-up may be initiated by a low temperature post-silicidation activation step, such as a thermal treatment or an optical treatment, such as a laser anneal. An alternate DST is as follows: Metal or metals, such as platinum and nickel, may be deposited, following which dopants for source and drain regions 22820 may be implanted, such as arsenic and boron, followed by dopant segregation induced by the silicidation thermal budget wherein a silicide, such as Ni0.9Pt0.1Si, may formed by thermal treatment or an optical treatment, such as a laser anneal. Alternatively, dopants for source and drain regions 22820 may be implanted, such as arsenic and boron, following which metal or metals, such as platinum and nickel, may be deposited, and a silicide, such as Ni0.9Pt0.1Si, may formed by thermal treatment or an optical treatment, such as a laser anneal. Further details of these processes for forming dopant segregated source-drain regions are described in "Low Temperature Implementation of Dopant-Segregated Band-edger Metallic S/D junctions in Thin-Body SOI p-MOSFETs", Proceedings IEDM, 2007, pp 147-150, by G. Larrieu, et al.; "A Comparative Study of Two Different Schemes to Dopant Segregation at NiSi/Si and PtSi/Si Interfaces for Schottky Barrier Height Lowering", IEEE Transactions on Electron Devices, vol. 55, no. 1, January 2008, pp. 396-403, by Z. Qiu, et al.; and "High-k/Metal-Gate Fully Depleted SOI CMOS With Single-Silicide Schottky Source/Drain With Sub-30-nm Gate Length", IEEE Electron Device Letters, vol. 31, no. 4, April 2010, pp. 275-277, by M. H. Khater, et al. This embodiment of the invention advantageously uses this low-temperature source-drain formation technique in combination with layer transfer techniques and produces 3D integrated circuits and chips.

Step (F) is illustrated using FIG. 228F. An oxide layer 22822 may be deposited and polished with CMP. Following this, contacts, multiple levels of metalm, TLVs and/or TSVs, and other structures can be formed to obtain a 3D integrated circuit or chip. If desired, the original materials for the gate electrode 22816 and gate dielectric 22818 can be removed and replaced with a deposited gate dielectric and deposited gate electrode using a replacement gate process similar to the one described previously.

Persons of ordinary skill in the art will appreciate that the low temperature source-drain formation techniques described in FIG. 228, such as dopant segregation and DSS-Schottky transistors, may also be utilized to form other 3D structures in this document, including, but not limited to, floating body DRAM, junction-less transistors, RCATs, CMOS MOSFETS, resistive memory, charge trap memory, floating gate memory, SRAM, and Finfets. Thus the invention is to be limited only by the appended claims.

Figures 229A, 229B, 229C:
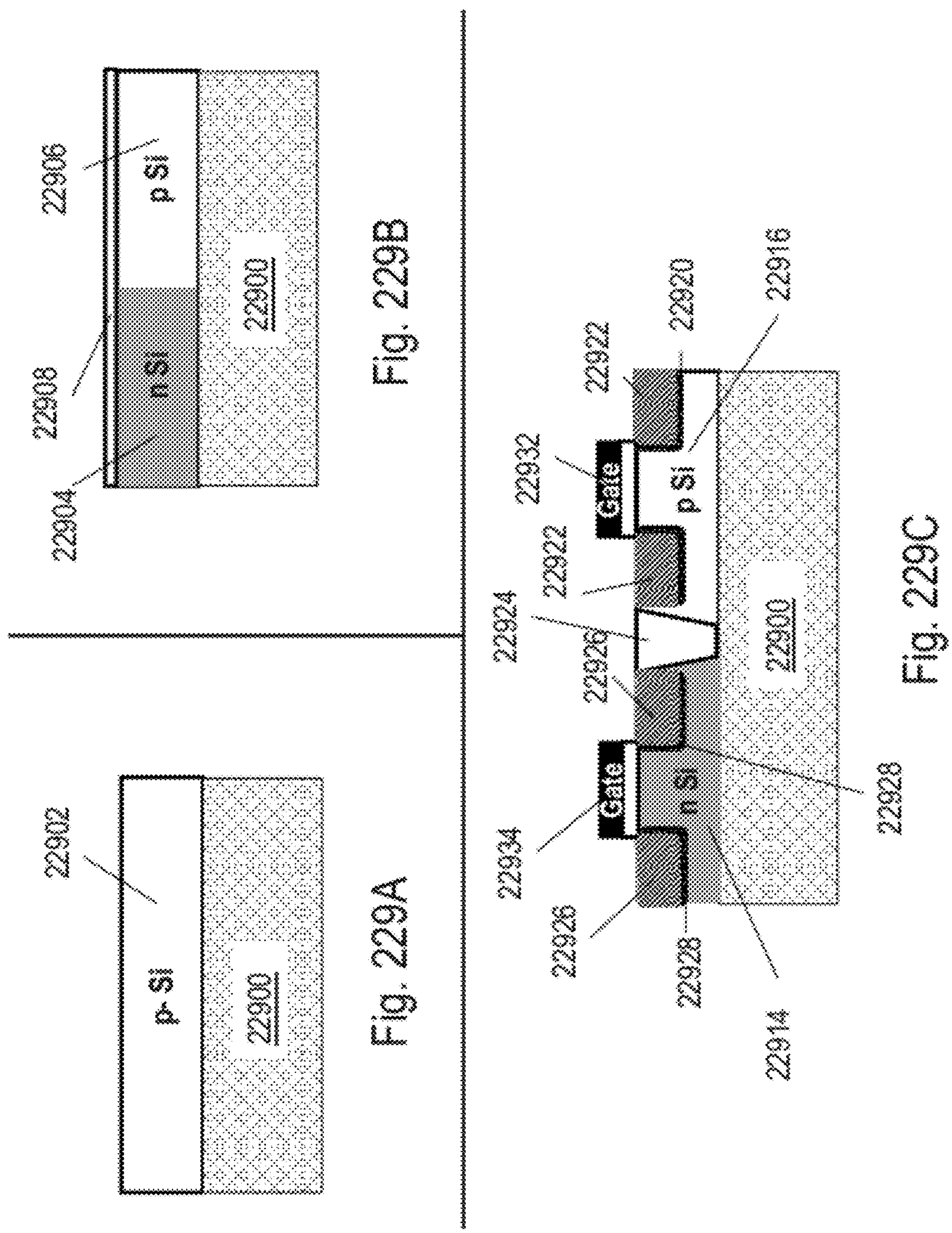

An alternate method to obtain low temperature 3D compatible CMOS transistors residing in the same device layer of silicon is illustrated in FIG. 229A-C. As illustrated in FIG. 229A, p− mono-crystalline silicon layer 22902 may be transferred onto a bottom layer of transistors and wires 22900 utilizing previously described layer transfer techniques. A doped and activated layer may be formed in or on the silicon wafer to create p− mono-crystalline silicon layer 22902 by processes such as, for example, implant and RTA or furnace activation, or epitaxial deposition and activation. As illustrated in FIG. 229C, n-type well regions 22904 and p-type well regions 22906 may be formed by conventional lithographic and ion implantation techniques. An oxide layer 22908 may be grown or deposited prior to or after the lithographic and ion implantation steps. The dopants may be activated with a short wavelength optical anneal, such as a 550 nm laser anneal system manufactured by Applied Materials, that will not heat up the bottom layer of transistors and wires 22900 beyond approximately 400° C., the temperature at which damage to the barrier metals containing the copper wiring of bottom layer of transistors and wires 22900 may occur. At this step in the process flow, there is very little structure pattern in the top layer of silicon, which allows the effective use of the shorter wavelength optical annealing systems, which are prone to pattern sensitivity issues thereby creating uneven heating. As illustrated in FIG. 229C, shallow trench regions 22924 may be formed, and conventional CMOS transistor formation methods with dopant segregation techniques, including those previously described such as the DSS Schottky transistor, may be utilized to construct CMOS transistors, including n-silicon regions 22914, P+ silicon regions 22928, silicide regions 22926, PMOS gate stacks 22934, p-silicon regions 22916, N+ silicon regions 22920, silicide regions 22922, and NMOS gate stacks 22932.

Persons of ordinary skill in the art will appreciate that the low temperature 3D compatible CMOS transistor formation method and techniques described in FIG. 229 may also utilize tungsten wiring for the bottom layer of transistors and wires 22900 thereby increasing the temperature tolerance of the optical annealing utilized in FIG. 229B or 229C. Moreover, absorber layers, such as amorphous carbon, reflective layers, such as aluminum, double beam (DB) techniques, or Brewster angle adjustments to the optical annealing may be utilized to optimize the implant activation and minimize the heating of lower device layers. Further, shallow trench regions 22924 may be formed prior to the optical annealing or ion-implantation steps. Furthermore, channel implants may be performed prior to the optical annealing so that transistor characteristics may be more tightly controlled. Moreover, one or more of the transistor channels may be undoped by layer transferring an undoped layer of mono-crystalline silicon in place of p− mono-crystalline silicon layer 22902. Further, the source and drain implants may be performed prior to the optical anneals. Moreover, the methods utilized in FIG. 229 may be applied to create other types of transistors, such as junction-less transistors or recessed channel transistors. Further, the FIG. 229 methods may be applied in conjunction with the hydrogen plasma activation techniques previously described in this document. Thus the invention is to be limited only by the appended claims.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. Further, any transferred layer or donor substrate or wafer preparation illustrated or discussed herein may include one or more undoped regions or layers of semiconductor material. Rather, the scope of the invention includes both combinations and sub-combinations of the various features described herein above as well as modifications and variations which would occur to such skilled persons upon reading the foregoing description. Thus the invention is to be limited only by the appended claims.

What is claimed is:

1. A method of manufacturing a semiconductor device, the method comprising:

providing a first monocrystalline layer comprising first semiconductor regions;

overlaying said first monocrystalline layer with at least one metal layer comprising aluminum or copper;

transferring a second monocrystalline layer comprising second semiconductor regions to a carrier;

annealing said second monocrystalline layer while on said carrier as part of forming at least one transistor on said second monocrystalline layer; and after said annealing, transferring said second monocrystalline layer to overlay said metal layer;

wherein said annealing comprises a thermal anneal which is greater than 400 degrees Centigrade and wherein said first and second semiconductor regions comprise ion implanted and activated dopants.

2. The method according to claim 1 wherein said at least one transistor comprises at least one p-type transistor and at least one n-type transistor.

3. The method according to claim 1 wherein said at least one transistor is one of:

(i) a recessed-channel transistor (RCAT);

(ii) a junction-less transistor;

(iii) a replacement-gate transistor;

(iv) a thin-side-up transistor;

(v) a double gate transistor;

(vi) a horizontally oriented transistor;

(vii) a finfet type transistor;

(viii) a Dopant Segregated Schottky (DSS-Schottky) transistor; or (ix) a trench MOSFET transistor.

4. The method according to claim 1 wherein said forming comprises etching.

5. The method according to claim 1, further comprising:

forming at least one heat removal connection that does not conduct electricity.

6. The method according to claim 1 wherein said annealing comprises one of an ultrasound annealing or an optical annealing or microwave treatments.

7. The method according to claim 1 wherein said semiconductor device is an field programmable gate array (FPGA).

8. The method according to claim 1 wherein said semiconductor device is a gate array.

9. The method according to claim 1 wherein said annealing comprises one of a vacuum, a pressure greater than 760 torr, oxidizing atmospheres, or reducing atmospheres.

10. The method according to claim 1 wherein a debond/release agent of said transferring of said second monocrystalline layer to overlay said metal layer comprises hydrofluoric acid.

11. The method according to claim 1 wherein said second monocrystalline layer comprises silicon.

12. The method according to claim 1 wherein said first monocrystalline layer comprises silicon.

* * * * *